US009680684B2

(12) United States Patent
Stadelmeier et al.

(10) Patent No.: US 9,680,684 B2
(45) Date of Patent: Jun. 13, 2017

(54) CODING AND MODULATION APPARATUS USING NON-UNIFORM CONSTELLATION

(71) Applicant: SONY CORPORATION, Tokyo (JP)

(72) Inventors: Lothar Stadelmeier, Stuttgart (DE); Nabil Sven Loghin, Freiburg (DE); Jan Zoellner, Braunschweig (DE)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/786,371

(22) PCT Filed: Apr. 29, 2014

(86) PCT No.: PCT/EP2014/058729

§ 371 (c)(1),
(2) Date: Oct. 22, 2015

(87) PCT Pub. No.: WO2014/177565

PCT Pub. Date: Nov. 6, 2014

(65) Prior Publication Data

US 2016/0080192 A1 Mar. 17, 2016

(30) Foreign Application Priority Data

Apr. 30, 2013 (EP) .................................... 13166015

(51) Int. Cl.
*H04L 27/36* (2006.01)
*H04L 27/34* (2006.01)
(Continued)

(52) U.S. Cl.
CPC ........ *H04L 27/3405* (2013.01); *H03M 13/25* (2013.01); *H03M 13/251* (2013.01);
(Continued)

(58) Field of Classification Search
CPC ... H04L 27/3405; H04L 1/0071; H04L 27/38; H04L 1/0003; H04L 1/0058;
(Continued)

(56) References Cited

U.S. PATENT DOCUMENTS 7,526,035 B2 * 4/2009 Suh ....................... H04L 1/0001 375/132
9,191,082 B2 * 11/2015 Choi .................... H04B 7/0413
(Continued)

FOREIGN PATENT DOCUMENTS

| | | |
|---|---|---|
| EP | 2 375 666 | 5/2012 |
| EP | 2 211 493 | 1/2013 |
| WO | 2010 078472 | 7/2010 |

OTHER PUBLICATIONS

International Search Report Issued Aug. 22, 2014 in PCT/EP2014/058729 filed Apr. 29, 2014.
(Continued)

*Primary Examiner* — Khanh C Tran
(74) *Attorney, Agent, or Firm* — Oblon, McClelland, Maier & Neustadt, L.L.P.

(57) ABSTRACT

A coding and modulation apparatus and method are presented. The apparatus (10) comprises an encoder (11) that encodes input data into cell words, and a modulator (12) that modulates said cell words into constellation values of a non-uniform constellation. The modulator (12) is configured to use, based on the total number M of constellation points of the constellation and the signal-to-noise ratio SNR in dB, a non-uniform constellation from a group of constellations comprising one or more constellations defined by a constellation position vector comprising a predetermined number of constellation positions, wherein in one or more constellation position vectors two or more constellation positions are
(Continued)

identical resulting from a condensation of preliminary constellation positions optimized before.

18 Claims, 12 Drawing Sheets

(51) Int. Cl.
*H03M 13/35* (2006.01)
*H04L 1/00* (2006.01)
*H04L 27/38* (2006.01)
*H03M 13/25* (2006.01)

(52) U.S. Cl.
CPC ....... *H03M 13/255* (2013.01); *H03M 13/356* (2013.01); *H04L 1/0003* (2013.01); *H04L 1/0008* (2013.01); *H04L 1/0058* (2013.01); *H04L 1/0071* (2013.01); *H04L 27/38* (2013.01)

(58) Field of Classification Search
CPC ... H04L 1/0008; H03M 13/356; H03M 13/25; H03M 13/251; H03M 13/255; H04B 7/0417; H04B 7/0623; H04B 7/0413; H04B 1/692; H04B 1/001
See application file for complete search history.

(56) References Cited

U.S. PATENT DOCUMENTS

2003/0053413 A1* 3/2003 Sawahashi ............. H04B 1/692 370/208
2005/0047517 A1* 3/2005 Georgios ............. H04B 7/0417 375/267
2007/0115864 A1* 5/2007 Bar-Ness ............. H04B 7/0623 370/278
2011/0274211 A1 11/2011 Ko et al.
2011/0280327 A1 11/2011 Ko et al.
2015/0049844 A1* 2/2015 Stott ..................... H04L 1/0041 375/298
2015/0163085 A1 6/2015 Stadelmeier et al.
2016/0204971 A1* 7/2016 Mouhouche ........ H04L 27/3483 370/207
2016/0345330 A1* 11/2016 Mouhouche ........ H04L 27/3483

OTHER PUBLICATIONS

Liu, Z. et al., "APSK Constellation with Gray Mapping", IEEE Communications Letters, vol. 15, No. 12, pp. 1271-1273, XP011389300, Dec. 2011.

* cited by examiner

CODING AND MODULATION APPARATUS USING NON-UNIFORM CONSTELLATION

BACKGROUND

Field of the Disclosure

The present disclosure relates to a coding and modulation apparatus and method. Further, the present disclosure relates to a transmission apparatus and method. Still further, the present disclosure relates to a computer program and a non-transitory computer-readable recording medium.

Description of Related Art

Modern communications systems typically employ, among other elements, a coding and modulation apparatus (as part of a transmission apparatus) and a decoding and demodulation apparatus (as part of a receiving apparatus). The coding and modulation apparatus is often part of a so called BICM (Bit Interleaved Coded Modulation) apparatus, which generally comprises (at the transmitter side) a serial concatenation of a FEC (Forward Error Correction) encoder, a bit interleaver, and a modulator, which uses spectral efficient modulation such as multilevel PAM (Pulse Amplitude Modulation), PSK (Phase Shift Keying), or QAM (Quadrature Amplitude Modulation). It should be noted that hereinafter, whenever QAM is mentioned it should be understood as a generally term covering PAM, PSK and QAM.

BICM allows for good performance over both non-fading and fading channels due to the use of the interleaver and/or the FEC encoder. It has a reasonable decoding complexity as opposed to multilevel coding (MLC) coding schemes and is thus used frequently in communications systems, such as in all DVB systems, powerline communications (e.g., Homeplug AV, DAB, LTE, WiFi, etc.).

Generally, the coding and modulation capacity, such as the BICM capacity in systems using a BICM apparatus, is considered as a target function, and it is desired to find optimum constellation points such that this capacity is maximized, often subject to a power normalization, i.e., the average power of the constellation points should be normalized to e.g. 1.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a coding and modulation apparatus and method providing an increased or even maximized coding and modulation capacity and, further, a reduced storage and demodulation capacity. It is a further object to provide a demodulation and decoding apparatus and method as well as a corresponding computer program for implementing said methods and a non-transitory computer-readable recording medium for implementing said methods.

According to an aspect there is provided a coding and modulation apparatus comprising an encoder that encodes input data into cell words, and a modulator that modulates said cell words into constellation values of a non-uniform constellation, wherein said modulator is configured to use, based on the total number M of constellation points of the constellation and the signal-to-noise ratio SNR in dB, a non-uniform constellation from a group of constellations comprising one or more constellations defined by a constellation position vector comprising a predetermined number of constellation positions, wherein in one or more constellation position vectors two or more constellation positions are identical resulting from a condensation of preliminary constellation positions optimized before.

According to a further aspect there is provided a transmission apparatus comprising a coding and modulation apparatus as proposed herein that encodes and modulates input data into constellation values, a converter that converts said constellation values into one or more transmission streams to be transmitted, and a transmitter that transmits said one or more transmission streams.

According to still further aspects corresponding methods, a computer program comprising program means for causing a computer to carry out the steps of the coding and modulation method disclosed herein, when said computer program is carried out on a computer, as well as a non-transitory computer-readable recording medium that stores therein a computer program product, which, when executed by a processor, causes the coding and modulation method disclosed herein to be performed are provided.

Preferred embodiments are defined in the dependent claims. It shall be understood that the claimed methods, the claimed computer program and the claimed computer-readable recording medium have similar and/or identical preferred embodiments as the claimed apparatus and as defined in the dependent claims.

One of the aspects of the disclosure is that the constellation points of the used constellations are not located on a regular grid with equidistant symbols, but rather on optimized locations, dependent on the channel characteristics, e.g., channel transition probabilities due to AWGN (Additive White Gaussian Noise), fading, etc. Further, the used constellation is selected (preferably in advance, but generally on the fly in other embodiments) dependent on the SNR (signal-to-noise ratio) and the desired total number of constellation points of the used constellation (and, in some embodiments, on the channel characteristics). A method how to find and optimize these non-uniform constellations (in the following called NUCs) will be explained below.

It should be noted that to every M-QAM, one can also think of the underlying sqrt(M)-PAM. Further, it should be noted that in other aspects the group of constellations defined in the claims comprises less constellations, e.g. only constellations for non-fading channels, only constellations for fading channels, only constellations for selected values of M, only constellation for M-QAM or sqrt(M)-PAM and/or constellations for less SNR values. In other words, less constellations may be contained in the group of constellations available for selection and subsequent use by the modulator, i.e. the group of constellations available for use by the modulator may comprise one or more of the constellations defined in the claims. Accordingly, the present disclosure is also directed to a coding and modulation apparatus and method that have a smaller group of constellations available for use (as explained above) and/or where less constellations are available for a particular value of M.

A QAM mapping consisting of M constellation points is denoted as M-QAM. If a (uniform or non-uniform) QAM allows separate encoding and decoding of each of its two dimensions ("inphase" and "quadrature phase" in the literature), then this QAM will be called a $N^2$-QAM. This implies that the constellation can be designed by two N-PAM constellations, one for each dimension. $N^2$-QAMs have significantly lower decoding complexity for ML-decoding, as only N constellation points have to be investigated, compared with $N^2$ points for the M-QAM, when $M=N^2$, but when the two dimensions cannot be separated (as is usually the case for N-PSK, e.g. 8-PSK, where 8 points are located on a unit circle). In addition QAM constellations that are completely defined by a single quadrant of the constellation will be called Q-QAM, with the other quadrants being derived from the first quadrant. E.g. normal uniform square QAM constellations (UC) are also Q-QAM constellations, due to their symmetry.

However, the constellation points of the QAM constellations according to embodiments considered in this disclosure are not located on a regular grid with equidistant symbols, but rather on optimized locations, dependent on the channel characteristics, e.g., channel transition probabilities due to AWGN, fading, etc.

According to the present disclosure an $N^2$-NUC optimization for non-fading AWGN channel based on N-PAM optimization is considered, combined with a dynamic reduction of the number of constellation points guaranteeing a well defined performance with respect to the performance of the $N^2$-NUC without reduction of the number of constellation points.

Constellation sizes up to 1024 k $N^2$-QAM will be considered, where large shaping gains are possible, especially in the high SNR region. By means of a dynamic reduction (also called condensation in the following) of constellation points that are close to each other, the number of constellations points and, thus, the required storage and decoding capacity can be significantly reduced. For example, the 1024 k $N^2$-QAMs constellation optimized for 20 dB SNR can be reduced from 1048576 to about 2000 constellation points without significant impact on the performance.

It should be noted that the constellation position vector w as defined in the claims directed to a preferred embodiment needs not necessarily contain the constellation points of the first quadrant of the constellation, but could also contain the constellation points of any of the four quadrants (expressed by the definition "of a first quadrant" in the claims). Due to the quadrant symmetry this leads to constellations with a different bit mapping but with identical performance. The constellation position vector w in the tables defined herein should therefore be considered as an example for all four symmetric constellations with different bit mapping but identical performance.

It is to be understood that both the foregoing general description of the disclosure and the following detailed description are exemplary, but are not restrictive, of the disclosure.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
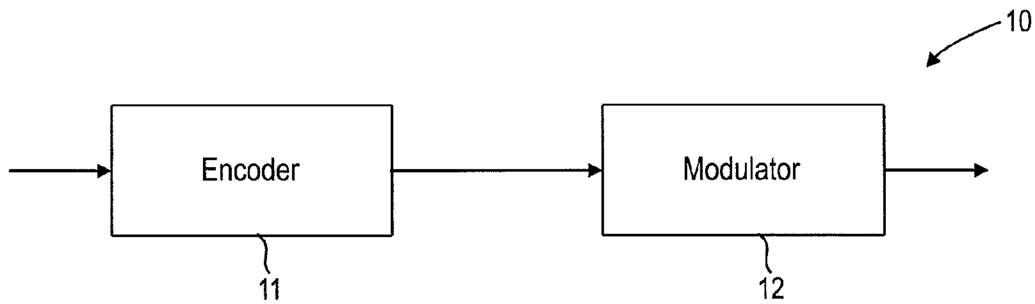
FIG. 1 shows an embodiment of a coding and modulation apparatus according to the present disclosure.

Referring now to the drawings, wherein like reference numerals designate identical or corresponding parts throughout the several views, FIG. 1 shows an embodiment of a coding and modulation apparatus 10 according to the present disclosure. It comprises an encoder 11 that encodes input data into cell words, and a modulator 12 that modulates said cell words into constellation values of a non-uniform constellation. Said modulator 12 is configured to use, based on the total number M of constellation points of the constellation and the signal-to-noise ratio SNR in dB, a non-uniform constellation from a group of constellations comprising one or more constellations defined by a constellation position vector comprising a predetermined number of constellation positions, wherein in one or more constellation position vectors two or more constellation positions are identical resulting from a condensation of preliminary constellation positions optimized before.

In a preferred embodiment the modulator 12 is configured to use, based on the total number M of constellation points of the constellation, the signal-to-noise ratio SNR in dB and the channel characteristics, a non-uniform constellation from a group of constellations comprising one or more of constellations defined by the constellation position vector u comprising a predetermined number v of constellation positions, wherein v=sqrt(M)/2−1. Details of those constellations will be explained in more detail below.

In another preferred embodiment the modulator 12 is configured to use, based on the total number M of constellation points of the constellation and the signal-to-noise ratio SNR in dB, a non-uniform constellation from a group of constellations comprising one or more of the following constellations, wherein the constellation points of the different quadrants of a constellation are defined by the constellation position vector $w_{0 \ldots b-1b-1}$, wherein b=M/4, wherein the constellation points of a first quadrant are defined as $x_{0 \ldots b-1}=$ the constellation points $x_{b \ldots 2b-1}$ of a second quadrant are defined as $x_{b \ldots 2b-1}=\text{conj}(w_{0 \ldots b-1})$, the constellation points $x_{3b \ldots 4b-1}$ of a third quadrant are defined as $x_{3b \ldots 4b-1}=w_{0 \ldots b-1}$, the constellation points $x_{2b \ldots 3b-1}$ of a fourth quadrant are defined as $x_{2b \ldots 3b-1}=-\text{conj}(w_{0 \ldots b-1})$, wherein conj is the complex conjugate, and wherein the constellation position vectors of the different constellations of the group of constellations will be explained in more detail below.

In other embodiments of the coding and modulation apparatus 10 additional elements may be provided, such as a BCH encoder, an LCPC encoder, a bit interleaver and/or a demultiplexer (for demultiplexing bits of encoded data into the cell words). Some or all of these elements may separate elements or may be part of the encoder 11. For instance, a BICM device as conventionally used in the transmission apparatus of a DVB system may be used as coding and modulation apparatus 10.

Figure 2:
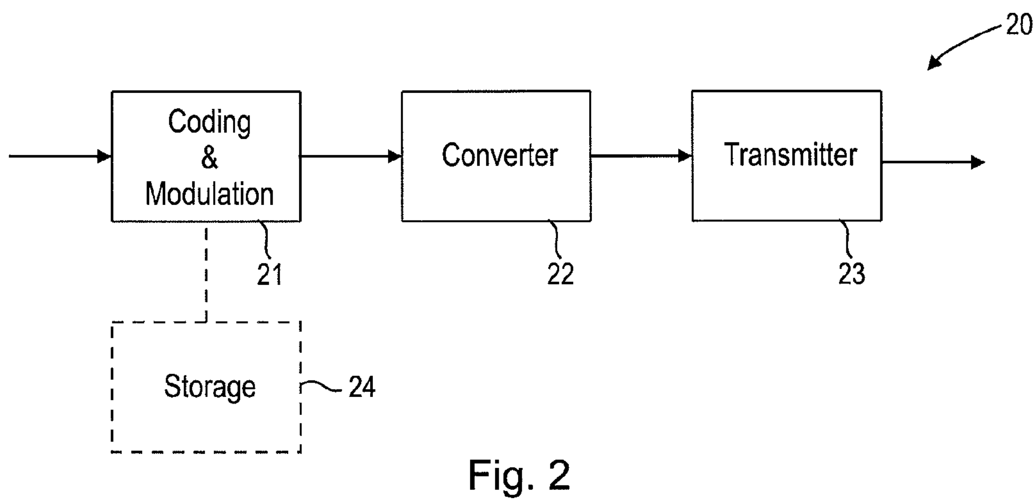
FIG. 2 shows an embodiment of a transmission apparatus according to the present disclosure.

FIG. 2 shows an embodiment of a transmission apparatus 20 according to the present disclosure comprising a coding and modulation apparatus 21 (referenced by 10 in FIG. 1) as proposed herein that encodes and modulates input data into constellation values, a converter 22 that converts said constellation values into one or more transmission streams to be transmitted, and a transmitter 23 that transmits said one or more transmission streams. In an exemplary embodiment the converter 22 may comprise one or more elements like a time, cell and/or frequency interleaver, a frame builder, an OFDM modulator, etc., as e.g. described in the various standards related to DVB. The constellations and the constellations values are generally predetermined and e.g. stored in a constellations storage 24 or retrieved from an external source.

In other embodiments of the transmission apparatus 20 addition elements may be provided, such as an input processing unit, a frame building unit and/or an OFDM generation unit as e.g. conventionally used in transmission apparatus of a DVB system.

Figure 3:
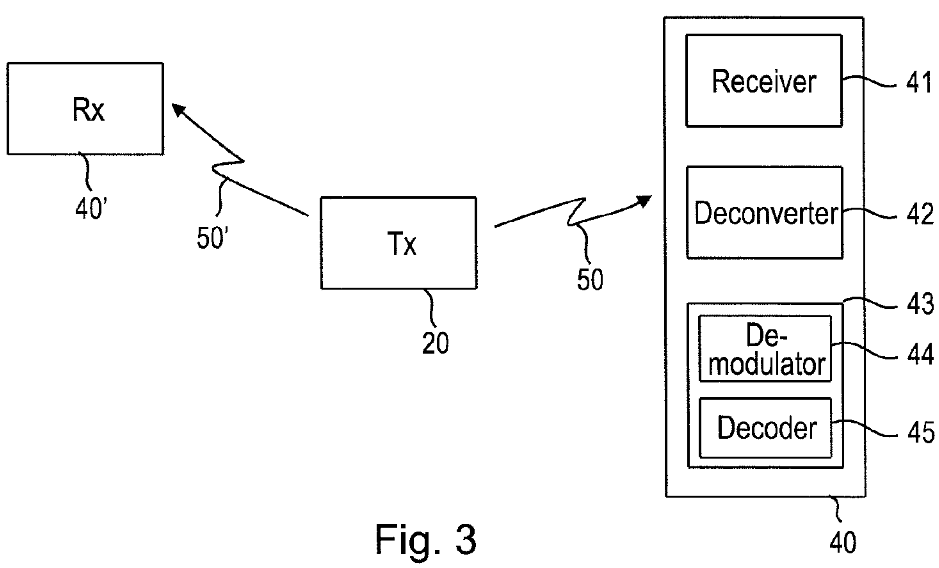
FIG. 3 shows an embodiment of a communications system according to the present disclosure.

FIG. 3 shows an embodiment of a communications system 30 according to the present disclosure comprising one (or more) transmission apparatus 20 (Tx) as shown in FIG. 2 and one or more receiving apparatus 40, 40' (Rx).

A receiving apparatus 40 generally comprises a receiver 41 that receives one or more transmission streams, a deconverter 42 that deconverts the received one or more transmission streams into constellation values, and a demodulation and decoding apparatus 43 that demodulates and decodes said constellation values into output data. The demodulation and decoding apparatus 43 generally comprises a demodulator 44 for demodulating constellation values of a non-uniform constellation into cell words, and a decoder 45 for decoding cell words into output data words, wherein based on the total number M of constellation points of the constellation, the signal-to-noise ratio in dB and the channel characteristics, a non-uniform constellation is selected from the group of constellations comprising the same predetermined constellations as used in the coding and modulation apparatus 10.

The preferred demodulation and decoding considers soft values as opposed to hard decided values (0 and 1). Soft values represent the continuously distributed received values (possibly after A/D conversion including quantization) by more than two states (as in the case of binary (hard) decision). The reason is that for hard decision, the NUCs are generally not optimal. Nowadays, BICM receivers typically are soft receivers anyway.

Generally, data (e.g. communications data, broadcast data, etc.) shall be transmitted from a transmission apparatus 20 to one or more of said receiving apparatus 40 over a transmission channel 50, 50'. The transmission channel 50, 50' can be unicast channel, multicast channel, a broadcast channel and may be employed as one-directional or bi-directional channel (i.e. having a return channel from the receiving apparatus to the transmission apparatus).

In an embodiment the modulator 12 is configured to use a non-uniform constellation based on the total number M of constellation points of the constellation, the required signal-to-noise ratio SNR for error free decoding in dB and the channel characteristics. In broadcasting applications the constellation is generally not selected dependent on the SNR in the receiver, but dependent on the SNR that is required for error free decoding with a used channel code (if a code is used, for example LDPC codes in case of DVB 2" generation transmission systems) for an expected channel characteristic, e.g., static reception or multipath fading.

The total number M of constellation points is generally selected according to the desired payload throughput jointly with the code rate of the FEC encoder. The SNR for error free decoding for typical channel characteristic is generally known, e.g. by simulation. In broadcasting the channel characteristics of the receivers are not known, i.e. a compromise is selected. For instance, in broadcasting for each code rate of the FEC encoder one non-uniform constellation is selected, optimized for an SNR that is a compromise for all channel characteristics.

The transmitter generally targets a certain scenario. For instance, a broadcast transmission over cable or satellite considers the channel to be just a non-fading AWGN (appropriate channel model), while a terrestrial broadcaster typically considers the channel to be a fading channel, e.g. with Rayleigh distribution, as several echoes are usually received.

In another embodiment the modulator 12 is configured to adaptively select a non-uniform constellation based on the total number M of constellation points of the constellation, the signal-to-noise ratio SNR in dB and the channel characteristics, wherein said signal-to-noise ratio SNR in dB and channel characteristics are received from a receiving device 40 to which data shall be transmitted. Such an adaptive selection of the constellation is generally only possible with a return channel in unicast environments. A non-uniform constellation may be adapted e.g. in time and/or frequency domain, e.g. for different OFDM subcarriers.

Depending on the SNR the optimum value for M and the code rate of the FEC encoder can be selected, which offers the highest throughput (equivalent to $C_B$). In other words, for a large SNR a high value of M is selected leading to a high data throughput (and vice versa).

The channel characteristics describe the statistical properties of the channel, e.g., the extent of the multipath propagation of the transmission channel between transmitter and receiver. If the channel is characterized by no multipath propagation, corresponding to the AWGN channel, the required SNR for error free decoding is relatively low, i.e. the NUC has to be selected accordingly for optimum performance. If the transmission channel is characterized by strong multipath propagation, the required SNR for error free reception is larger compared to a channel without multipath propagation, i.e. a NUC optimized for higher SNR has to be used. Further, the NUCs should be optimized taking the fading characteristics into account, as will be discussed below.

As mentioned above, the number M of the constellation points of the constellations is selected according to the desired payload throughput. Larger values of M allow for higher data throughput, but require a larger SNR for error free reception. This is further influenced by the code rate of the FEC encoder, if any FEC encoder is used.

Another explanation (which is closely related to the optimization task) is that for each SNR, optimized constellations are proposed for different M. The optimization target is the BICM capacity. For an expected SNR, say 15 dB of SNR should be guaranteed, M is chosen, for which the respective optimized NUC yields the largest BICM capacity. As a general rule it holds that for low SNR a low value of M should be selected and vice versa. But from a theoretical point of view, it turns out that high M is generally optimum, e.g., choosing M=4096 or M=1024 is preferred, because even for low SNR, the optimized NUC will "look (almost) like" a constellation with effectively smaller M, as several points will overlap. However, modulation and demodulation complexity increase with increasing M, so a tradeoff has to be considered.

As mentioned above known communications systems often employ among other blocks a so called BICM apparatus which may also be used as coding and modulation apparatus according to the present disclosure. The maximum possible capacity over a BICM apparatus is described by the BICM capacity $C_B$:

$$C_B = \sum_{i=0}^{m-1} E_{b,r_k}\left[\log_2 \frac{\sum_{x_l \in \mathbb{X}_b^i} p(r_k \mid s_k = x_l)}{p(r_k)}\right] = \int_{r_k \in \mathbb{C}} \sum_{i=0}^{m-1} \sum_{b=0}^{1} \sum_{x_i \in \mathbb{X}_b^i} \frac{1}{M} \cdot p(r_k \mid s_k = x_l) \log_2 \frac{\sum_{x_l \in \mathbb{X}_b^i} p(r_k \mid s_k = x_l)}{\frac{1}{M} \cdot \sum_{x_l' \in \mathbb{X}} p(r_k \mid s_k = x_l')} dr_k, \tag{1}$$

where I denotes the i-th bit label of the constellation point, and m is the total number of bits/QAM symbol point. Altogether the QAM constellation consists of $M=2^m$ constellation points, each assigned a particular bit label (00 . . . 00, 00 . . . 01, . . . , 11 . . . 11). In (1), E[.] denotes expectation operator, $p(r_k)$ is the probability density function (pdf) of the received symbols, $s_k$ is the transmitted symbol according to a particular bit label, k is the discrete time (or subcarrier index in case of OFDM modulation), $x_1$ is a particular symbol of the set of all constellation symbols, this set being denoted by $\mathbb{X}$ (=symbol alphabet, with cardinality $M=2^m$).

$p(r_k|s_k=x_1)$ is the likelihood function (transition probability—defined by the channel characteristics) that $r_k$ is received given the fact that $s_k=x_1$ was transmitted. The subset $\mathbb{X}_b^i$ includes all symbols from $\mathbb{X}$, where the i-th bit label is b (either b=0 or b=1).

As seen in (1), $C_B$ is a 2-dimensional integral. If only constellations are considered that can be split into two 1-dim. PAM constellations, it is easy to see that $$C_B(\text{2-dim.})=2\times C_B(\text{1-dim.}) \tag{2}$$

All investigated channels here include AWGN (only or after the fading channel). This can be described by the signal-to-noise ratio SNR, typically in dB:

$$\text{SNR}=10*\log_{10}(E_s/\sigma^2), \tag{3}$$

where $E_s$ is the average symbol power of the QAM constellation (typically normalized to 1), and $\sigma^2$ is the variance (=power) of the additive white Gaussian noise (which is assumed to be of zero-mean).

In (2), the 1-dimensional consideration for $C_B$ (1-dim.) uses an N-PAM constellation, which has only half the symbol power, if just the projection on the in-phase or quadrature-phase, respectively, is taken. However, if again a power normalization to 1 is considered, the noise variance by a factor of 2 is increased. Thus, to be more precise, the target function for the optimization process considered is given by $$C_B(\text{2-dim. at SNR}x)=2\times C_B(\text{1-dim. at SNR}x/2), \tag{4}$$

where the 1-dimensional PAM has normalized power 1, thus just half the SNR (here, in absolute values, i.e. not in dB) as explained above. The 1-dimensional BICM capacity is also computed according to (1), where the 2-dimensional integral becomes a 1-dimensional integral with $r_k \in \mathfrak{R}$, $\mathfrak{R}$ being the set of real numbers.

This equation (4) is optimized, given all degrees of freedom, namely the constellation points of the underlying 1-dim. constellation, subject to the power constraint, i.e.

$$\mathcal{P}_x = E_{s_k}[|s_k|^2] = E_{x_l}[|x_l|^2] = \frac{1}{M}\sum_{l=0}^{M-1} |x_l|^2 \overset{!}{=} 1 \tag{5}$$

Figure 4:
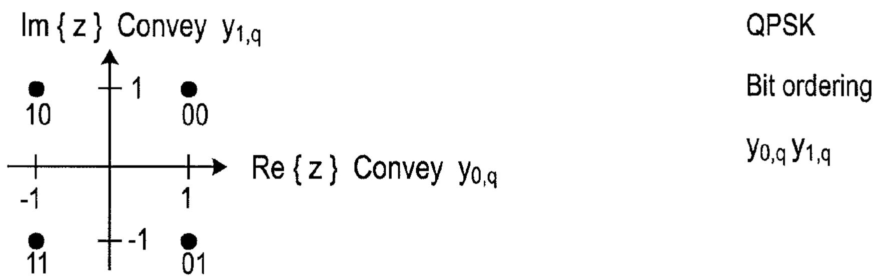
FIG. 4 shows a regular 4-QAM constellation as a simple example for a constellation.

For example, a regular 4-QAM consists of constellation points ($e^{j\pi/4}$, $e^{j7\pi/4}$, $e^{3\pi/4}$, $e^{j5\pi/4}$), as can be seen in FIG. 4. The average symbol power is 1 (all symbols are located on unit circle here). The above symbol vector ($e^{j\pi/4}$, $e^{j7\pi/4}$, $e^{3\pi/4}$, $e^{j5\pi/4}$) is to be understood such that the first entry ($e^{j\pi/4}$) belongs to the bit vector 00, the second entry ($e^{j7\pi/4}$) to 01 and so on, i.e. the entries belong to bit vectors with increasing values, where the first bit position is the most significant bit (MSB) and the last one the least significant bit (LSB). This 4-QAM is a particular case of an $N^2$-QAM, with N=2. Note that this definition (of being an $N^2$ QAM) does not only require $N^2$ being a square number ($N^2=2^2$), but also that the constellation is symmetrical and can be described by two independent N-PAM constellations, here a 2-PAM: the in-phase component (real-part of the complex symbols) is a 2-PAM with symbol vector (1/sqrt(2), −1/sqrt(2)) and describes the $1^{st}$ bit of the 4-QAM, whereas the quadrature-phase component (imaginary-part of the complex symbols) is the same 2-PAM, this time describing the $2^{nd}$ bit of the 4-QAM. Note further that the decomposition of the $N^2$-QAM into two N-PAMs is only possible if the bit labeling is according to binary reflected Gray mapping, which is typically applied (e.g. in DVB-systems).

The above example can be extended to higher order $N^2$-QAMs, with N>2. Then the underlying N-PAM describes for one component the 1st, 3rd, 5th and so on bit label, while for the other component it describes the 2nd, 4th, 6th and so on label.

Constellation shaping is generally known and has a long history. Only in recent years, constellations were investigated which maximize the BICM capacity $C_B$. In [6], the authors propose an heuristic approach to maximize $C_B$ by forcing the underlying PAM to approach a Gauss-like form (as is well known from Shannon's capacity theorem, the optimum constellation over the AWGN channel should have a Gaussian distribution; note that this means that there is an infinite number of continuously distributed input signals, having a Gaussian distribution, i.e., symbols with small power should occur more frequently than symbols with large power). There is no proof that this maximizes $C_B$, indeed those NUCs designed according to this method do not maximize $C_B$. The resulting NUCs are in general no $N^2$ NUCs, i.e., a 2-dimensional NUC was optimized, not the underlying PAM. However, in N. Muhammad, "Coding and modulation for spectral efficient transmission", Ph.D. dissertation, Universität Stuttgart, Institut für Nachrichtenübertragung, Pfaffenwaldring 47, 70569 Stuttgart, Germany, June 2006, the first time constellations have been directly optimized with respect to the target function $C_B$. For this method two differences to the current method occur:

- M-NUCs were proposed for M=8, 16, and 32. No higher order NUCs were investigated, as the optimization becomes very time consuming and the optimization algorithms became numerically unstable.
- The optimization algorithm was a hand-written gradient search algorithm, where both the BICM capacity and the gradient thereof consisted of improper integrals. No special care about either the numerical solution of the improper integral or the problematic integrants was considered. This consideration of these two issues is fundamental to obtain results for high order constellations, such as 1 k (i.e. 1024) NUC.

As described above, two problems arise when solving the optimization:

a) improper integral: integration border selection; and
b) integrant.

With respect to problem a) (improper integral: integration border selection), as seen in eq. (1), the BICM capacity involves an integral from −infinity to +infinity (=improper integral). Any numerical solution of this integral has to consider finite integration borders such as from −b to +b, with b sufficiently large. Matlab provides several functions for numerical integration, even for improper integrals, such as the function "quad", which internally optimizes the appropriate integration borders b. However, it has been observed that even these functions yield numerical instabilities and do not end up with the correct integral.

Figure 5A:
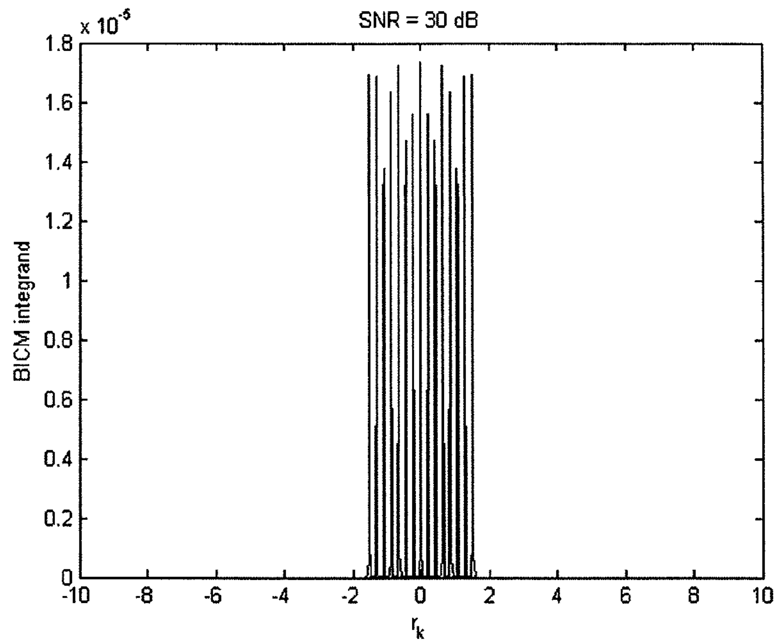
FIG. 5 shows diagrams depicting the integrant of the 1-dimensional BICM capacity function at 10 dB and at 30 dB SNR.
Figure 5B:
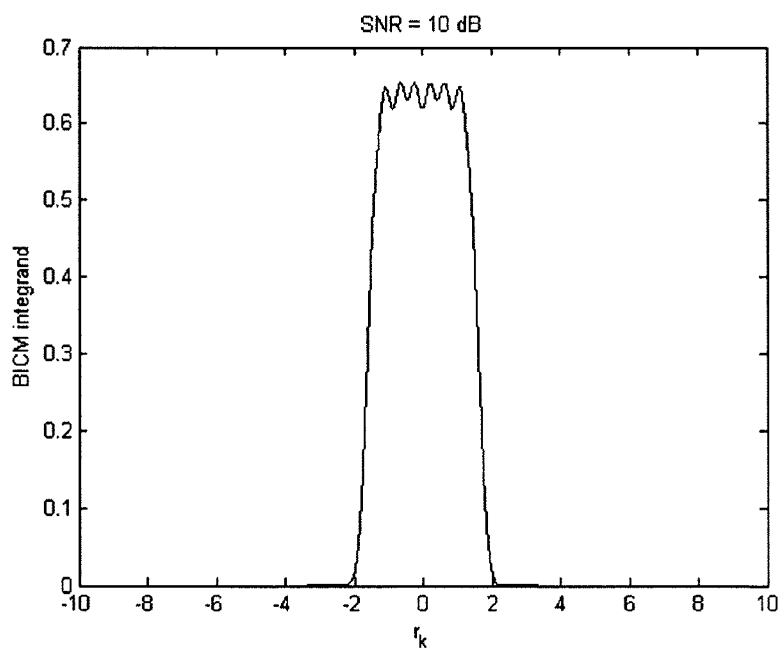

It can be observed that the integrant in (1) approaches 0 if the variable $r_k$ is sufficiently large (b→Inf). So a naïve approach would be to stepwise increase the variable $r_k$, until the integrant falls below a certain threshold (say $10^{-300}$ or if it even becomes exactly 0) and chose this value for the integration border b. However, it has further been observed that the integrant can take on very small values even before it converges to 0 for large variables, as can be seen in the two examples depicted in FIGS. 5A and 5B: the plot shown in FIG. 5B is the integrant of the 1-dimensional BICM capacity function, if a regular 32-PAM is used, at 10 dB SNR, while the plot shown in FIG. 5A 30 dB is considered.

Note that for 30 dB, many very small integrant values occur in the interval [−2,2] and any optimized integration border would be misleading in this interval. Thus, it is proposed to find the optimum (=numerically correct) integration border b as follows:

i) start with a large positive value S, iteratively reduce the value by decrements D, compute the integrant with this value as variable $r_k$, until the first non-zero value of the integrant is computed. If no non-zero integrant can be found before $r_k$=0, start again with a larger initial value S (say 10 times larger than before) and reduce D (say by factor of 10) to have a larger search interval and a finer granularity.

ii) As this search is time consuming, it is proposed to adjust the initial value S and the decrement D according to the SNR. If $\sigma^2$ is the noise variance of the 1-dimensional mapping (see eq. (3)), then as a good compromise $S=4000*\sigma^2$ and $D=50*\sigma^2$ has been chosen.

With respect to problem b) (integrant) it has further been observed that the integrant of the BICM capacity integral can cause numerical instabilities for large SNR values. As can be seen in eq. (1), the integrant consists of sums, including terms such as $$x*\log(x), x*\log(1/x), \text{ or } x*1/\log(x).$$

The value of x is e.g. the transition probability $p(r_k|s_k=x_1)$, or a pdf or includes parts thereof. The values of x become increasingly small (even approaching 0) if the SNR is very large, as the pdfs typically correspond to Gaussian distributions. Thus, the following limits might occur:

$$\lim_{\{x\to 0\}} x*\log(x), \lim_{\{x\to 0\}} x*\log(1/x), \text{ or } \lim_{\{x\to 0\}} x*1/\log(x).$$

Note that in theory, each limit converges to 0 (see l'Hospital's rule), but in a numerical computation, values such as + or − infinite or NaN ("not a number") will occur. Thus, the following is proposed: during the computation of each element (i.e., each addend in the integrant of (1)), the value has to be checked if it is finite (otherwise infinite or NaN), and replace it by 0 in case it is not finite. Only this way, reliable integration results can be obtained.

With the above considerations, $N^2$-NUCs have been optimized as one embodiment with $N^2$ being 16, 64, 256, 1024 (1 k), 4 k, 16 k, 64 k, 256 k and 1024 k. This means, the target function $C_B$ of the underlying 1-dimensional PAM is used and the degrees of freedom (the real-valued constellation points of the PAM) are optimized. Note that the PAM has only $N=\text{sqrt}(N^2)$ degrees of freedom (e.g. a 64-NUC is based on an 8-PAM). Due to symmetry, the negative constellation values are the same as their positive counterparts, such that only N/2 degrees of freedom remain. Finally, one more degree of freedom is lost due to the power normalization (5). The 64-NUC can thus be optimized by considering only 3 degrees of freedom ("dof", i.e., optimization variables).

The presented optimization is preferably based on the Matlab's fmincon function for constrained nonlinear optimization: the target function is the BICM capacity, the constraints are as follows:

- all dof (degrees of freedom)>0;
- all dof need to fulfill the power normalization, when the N-PAM is created based on them;
- the dof must occur in increasing order.

The function fmincon requires an initial set of dof, where the values were taken from a regular, i.e. uniform constellation, but a random mutation was applied on them. It is to be noted that the resulting values should still be in increasing order, otherwise the Gray bit labeling is not fulfilled any-more. The NUCs will be described by their degrees of freedom, e.g., a 64-NUC optimized for the AWGN channel at SNR=11.5 dB yields the following values (optimized degrees of freedom):

2.2794 4.6229 7.5291.

This means that the positive constellation values are 1 2.2794 4.6229 7.5291

(the 1 was redundant, due to the power normalization, which will be applied in the end). The underlying 1-dim. 8-PAM NUC is thus described by the symbol vector (1.6405 1.0073 0.2179 0.4967 −1.6405 −1.0073 −0.2179 −0.4967), where the values are already normalized to unit average power.

As described before, the first entry (1.6405) corresponds to the bit label 000, the next one (1.0073) to 001 and so on. The 2-dim. 64-NUC is then obtained by symmetry, where both in-phase and quadrature-phase component of the NUC are based on the 8-PAM NUC.

Figure 6A:
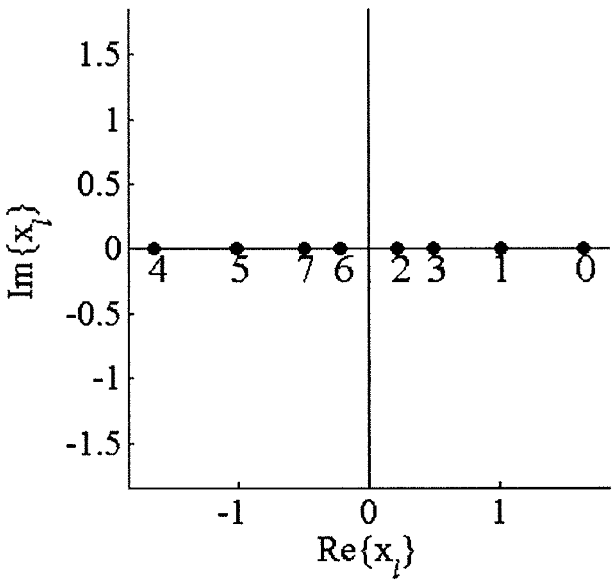
FIG. 6 shows a 8-PAM non-uniform constellation and a 64-QAM non-uniform constellation.
Figure 6B:
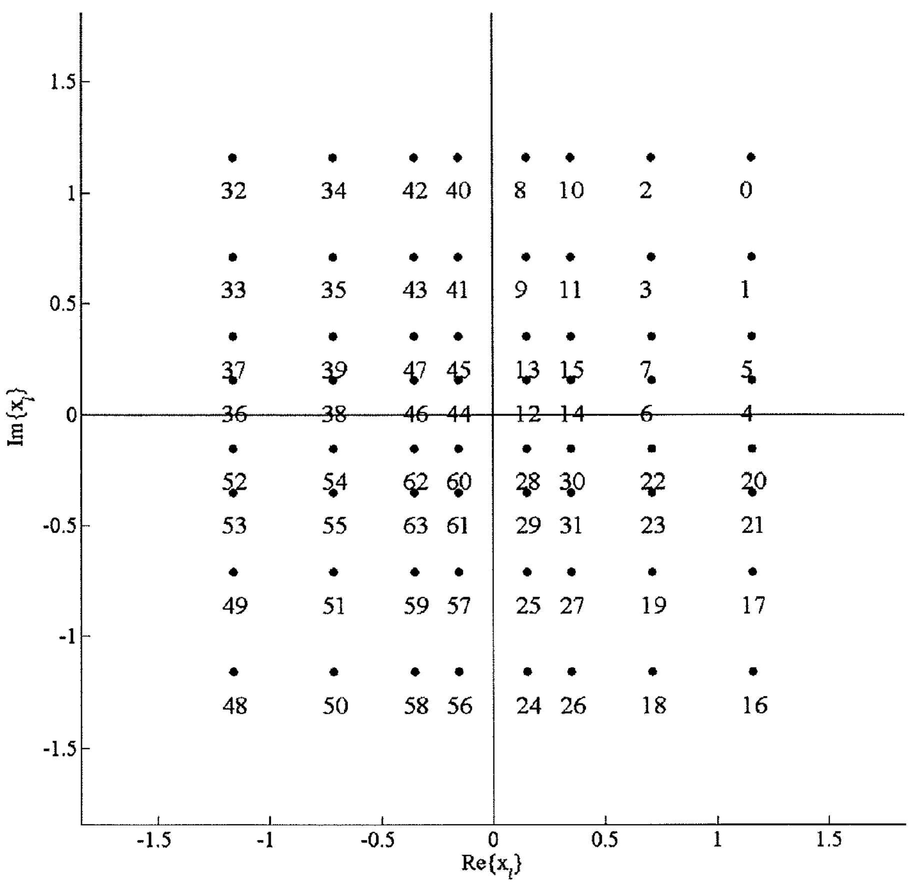

FIG. 6 depicts both 8-PAM NUC (FIG. 6A) and 64-QAM NUC (FIG. 6B). The bit labels are given in integer numbers (000→0, 001→1, 010→2 and so on).

The creation of the 2-dim. NUC based on the optimized degrees of freedom will be explained in more detail below.

Since the performance of NUCs depends on the SNR value they are optimized for, a thorough selection is preferably carried out depending on the (FEC) code rate to achieve optimum performance. If the channel characteristics are known, the required SNR value for FEC convergence can be determined by simulation. Then the NUC that has been optimized for this SNR value is chosen for best performance. If the SNR at the receiver is lower than this SNR decoding threshold, the constellation is not optimal. However, this is no drawback, since the BICM capacity is too low for successful decoding anyhow. On the other hand if the SNR at the receiver is clearly higher than the decoding threshold, a sufficient amount of BICM capacity for successful decoding is available, even though the NUC is suboptimal for this SNR range. Therefore, the NUC needs to be optimized for the SNR value at the waterfall region (i.e., decoding threshold for (quasi-) error free decoding) of the FEC. As the SNR value of the waterfall region depends on the code rate of the FEC, a different NUC is selected for each code rate.

The SNR value for (quasi-) error free decoding also depends on the channel characteristics of the receiver. For instance the required SNR for error free decoding of the DVB-T2 LDPC code in the AWGN channel is 0.8 dB, whereas 2.5 dB are required in the Rayleigh P1 multipath channel. The selected NUC for each code rate is thus not optimal in all channel environments and a tradeoff is necessary in a broadcasting environment that suits all (or most) users in the network. In a point-to-point network with return channel, the optimal NUC may be selected based on the measured channel characteristics in the receiver.

Currently, there exist no optimized constellations for fading channels. If the transmitter has no channel state information (CSI), but the receiver has perfect CSI (due to, e.g., pilot-based channel estimation), then the average BICM is the target function, which needs to be optimized for NUCs designed for fading channels. If the magnitude of the fading value for one QAM symbol is denoted as h (e.g. for a particular time instant and/or a particular subcarrier in case of OFDM), then the instantaneous BICM capacity is called $C_B(h)$ and given acc. to eq. (1). Note that the pdfs and transition probabilities in (1) are now different from the pure AWGN channel. E.g. in the AWGN case, the likelihood function $p(r_k|s_k=x_1)$ was given by a Gaussian distribution with zero-mean and variance $\sigma^2$. Now, for fading with the value h, the distribution is still Gaussian with zero-mean, but with instantaneous variance $\sigma^2/h^2$.

A good model for the fading statistics is given by a Rayleigh distribution of the fading magnitude h. Thus, the pdf of h is:

$$p(h)=h/\sigma_h^2 * \exp(-h^2/(2*\sigma_h^2)), \quad (6)$$

where $\sigma_h^2$ is the variance of the Rayleigh distribution. For a passive channel, i.e. one which on average neither attenuates nor magnifies the signal, $\sigma_h^2=\frac{1}{2}$. This means, that the average SNR over a fading channel is the same as of a non-fading channel.

Now, the average BICM capacity over many channel realizations is given by $$C_B=\int_0^\infty p(h)*Cb(h)dh, \quad (7)$$

i.e., the instantaneous BICM capacity as a function of h has to be multiplied by the pdf of h (see (6)) and integrated over all possible fading magnitudes (0 . . . infinity).

Again, an improper integral has to be solved. This time, the integrant of (7) converges to 0 due to the pdf of h. It was found that a sufficiently large upper limit for the integral in (7) is given by 38, independent of the instantaneous capacity $C_B(h)$. This enables faster optimization of (7). Results will be shown below for $N^2$-NUCs, $N^2$=16, 64, 256, 1024, 4096 and 16384.

The same principle regarding the selection of the NUC that has been described for static channels also holds for receivers experiencing fading channels, e.g., portable or mobile receivers. But since in fading channels the SNR in the receiver is varying due to the fading effect of the channel, the NUC cannot always operate at the optimum SNR. In general, the NUCs optimized for the fading channel perform better compared to the NUCs optimized for the non-fading channel when used at SNR values for which they are initially not optimized for, i.e. they perform better over broader SNR regions. Moreover, it was found that the NUCs optimized for the Rayleigh fading channel are good for most fading channels, e.g., with Rice distribution, with more than one echo component (e.g. TU6 channel) or with time- and frequency-selective fading with correlation. This is because the optimization considers the average of several channel instances/realizations.

In the following some more explanation is provided regarding the definition of the non-uniform QAM constellations. Each input cell word $(y_{0,q} \ldots y_{m-1,q})$ (i.e. provided to the modulator) shall be modulated using a non-uniform QAM constellation to give a constellation point $z_q$ prior to normalization, where m corresponds to the number of bits per QAM symbol $m=\log_2(M)$. It should be noted that the parameter q used here for discrete time or subcarrier index corresponds to the parameter k as used in the above. The exact values of the real and imaginary components $Re(z_q)$ and $Im(z_q)$ for each combination of the relevant input bits $y_{0 \ldots m-1,q}$ are given in the following tables for the various constellation sizes depending on the NUC position vector $u_{1 \ldots v}$, which defines the constellation point position of the non-uniform constellation. The length of the NUC position vector u is defined by $$v = \frac{\sqrt{M}}{2} - 1.$$

Figure 7:
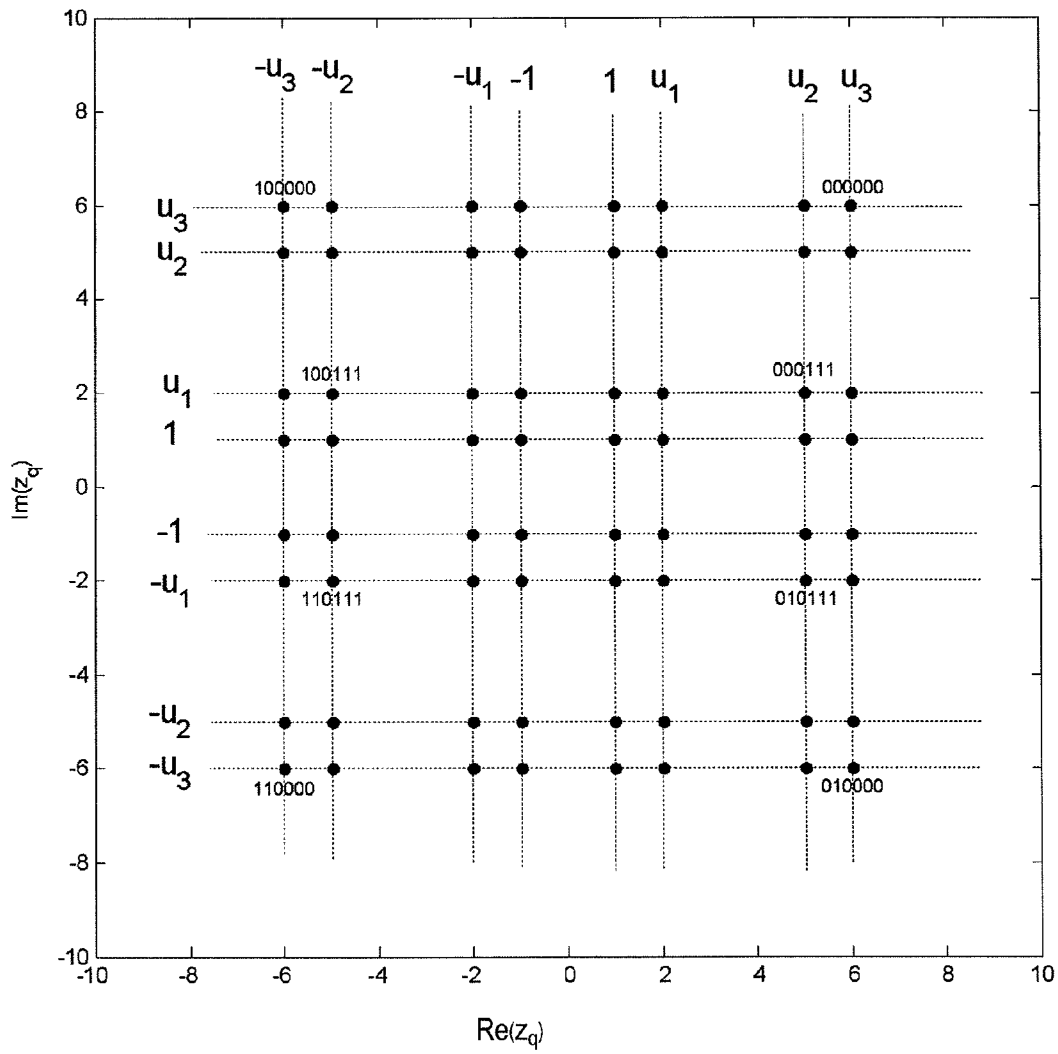
FIG. 7 shows a constellation for a 64-QAM non-uniform constellation generally defining the constellation points.

In one example, the corresponding constellation point $z_q$ for a 64-QAM NUC defined by the NUC position vector $(u_{1\ldots3})=(2,5,6)$ and the input cell word $(y_{0,q} \ldots y_{m-1,q}=(100111)$ is $Re(z_q)=-u_2=-5$ and $Im(z_q)=u_1=2$. The complete constellation for this NUC position vector is shown in FIG. 7 with exemplary input cell words marked at the corresponding constellation points.

The resulting constellation mapping (also called labeling) for the non-uniform constellations follows a binary reflected Gray-Mapping (labeling), i.e. neighboring constellation points differ in only one bit. The power of the constellation points $z_q$ is normalized such that the expectation value of the normalized constellation point $f_q$ equals 1, i.e. $E(|f_q|^2)=1$. For example, the normalized constellation value $f_q$ of a uniform 16-QAM constellation results by $$f_q = \frac{z_q}{\sqrt{10}}.$$

The following tables define the constellation position vectors (prior to power normalization) as well as the bit labelling of the data cell words to the constellation points.

Constellation Mapping for Real Part of 16-QAM

| | | | | | |
|---|---|---|---|---|---|
| $y_{0,q}$ | 1 | 1 | 0 | 0 | |
| $y_{2,q}$ | 0 | 1 | 1 | 0 | |
| $Re(z_q)$ | −3 | −1 | 1 | 3 | Uniform |
| | $-u_1$ | −1 | 1 | $-u_1$ | NUC |

Constellation Mapping for Imaginary Part of 16-QAM

| | | | | | |
|---|---|---|---|---|---|
| $y_{1,q}$ | 1 | 1 | 0 | 0 | |
| $y_{3,q}$ | 0 | 1 | 1 | 0 | |
| $Im(z_q)$ | −3 | −1 | 1 | 3 | Uniform |
| | $-u_1$ | −1 | 1 | $-u_1$ | NUC |

Constellation Mapping for Real Part of 64-QAM

| | | | | | | | | | |
|---|---|---|---|---|---|---|---|---|---|
| $y_{0,q}$ | 1 | 1 | 1 | 1 | 0 | 0 | 0 | 0 | |
| $y_{2,q}$ | 0 | 0 | 1 | 1 | 1 | 1 | 0 | 0 | |
| $y_{4,q}$ | 0 | 1 | 1 | 0 | 0 | 1 | 1 | 0 | |
| $Re(z_q)$ | −7 | −5 | −3 | −1 | 1 | 3 | 5 | 7 | Uniform |
| | $-u_3$ | $-u_2$ | $-u_1$ | −1 | 1 | $u_1$ | $u_2$ | $u_3$ | NUC |

Constellation Mapping for Imaginary Part of 64-QAM

| | | | | | | | | | |
|---|---|---|---|---|---|---|---|---|---|
| $y_{1,q}$ | 1 | 1 | 1 | 1 | 0 | 0 | 0 | 0 | |
| $y_{3,q}$ | 0 | 0 | 1 | 1 | 1 | 1 | 0 | 0 | |
| $y_{5,q}$ | 0 | 1 | 1 | 0 | 0 | 1 | 1 | 0 | |
| $Im(z_q)$ | −7 | −5 | −3 | −1 | 1 | 3 | 5 | 7 | Uniform |
| | $-u_3$ | $-u_2$ | $-u_1$ | −1 | 1 | $u_1$ | $u_2$ | $u_3$ | NUC |

Constellation Mapping for Real Part of 256-QAM

| | | | | | | | | | | | | | | | | | |
|---|---|---|---|---|---|---|---|---|---|---|---|---|---|---|---|---|---|
| $y_{0,q}$ | 1 | 1 | 1 | 1 | 1 | 1 | 1 | 1 | 0 | 0 | 0 | 0 | 0 | 0 | 0 | 0 | |
| $y_{2,q}$ | 0 | 0 | 0 | 0 | 1 | 1 | 1 | 1 | 1 | 1 | 1 | 1 | 0 | 0 | 0 | 0 | |
| $y_{4,q}$ | 0 | 0 | 1 | 1 | 1 | 1 | 0 | 0 | 0 | 0 | 1 | 1 | 1 | 1 | 0 | 0 | |
| $y_{6,q}$ | 0 | 1 | 1 | 0 | 0 | 1 | 1 | 0 | 0 | 1 | 1 | 0 | 0 | 1 | 1 | 0 | |
| $Re(z_q)$ | −15 | −13 | −11 | −9 | −7 | −5 | −3 | −1 | 1 | 3 | 5 | 7 | 9 | 11 | 13 | 15 | Uniform |
| | $-u_7$ | $-u_6$ | $-u_5$ | $-u_4$ | $-u_3$ | $-u_2$ | $-u_1$ | −1 | 1 | $u_1$ | $u_2$ | $u_3$ | $u_4$ | $u_5$ | $u_6$ | $u_7$ | NUC |

Constellation Mapping for Real Part of 256-QAM

| | | | | | | | | | | | | | | | | | |
|---|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 | |
| $y_{3,q}$ | 0 | 0 | 0 | 0 | 1 | 1 | 1 | 1 | 1 | 1 | 1 | 1 | 0 | 0 | 0 | 0 | |
| $y_{5,q}$ | 0 | 0 | 1 | 1 | 1 | 1 | 0 | 0 | 0 | 0 | 1 | 1 | 1 | 1 | 0 | 0 | |
| $y_{7,q}$ | 0 | 1 | 1 | 0 | 0 | 1 | 1 | 0 | 0 | 1 | 1 | 0 | 0 | 1 | 1 | 0 | |
| $Im(z_q)$ | −15 | −13 | −11 | −9 | −7 | −5 | −3 | −1 | 1 | 3 | 5 | 7 | 9 | 11 | 13 | 15 | Uniform |
| | $-u_7$ | $-u_6$ | $-u_5$ | $-u_4$ | $-u_3$ | $-u_2$ | $-u_1$ | −1 | 1 | $u_1$ | $u_2$ | $u_3$ | $u_4$ | $u_5$ | $u_6$ | $u_7$ | NUC |

Constellation Mapping for Real Part of 1024-QAM

| | | | | | | | | | | | | | | | | | |
|---|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 | |
| $y_{2,q}$ | 0 | 0 | 0 | 0 | 0 | 0 | 0 | 0 | 1 | 1 | 1 | 1 | 1 | 1 | 1 | 1 | |
| $y_{4,q}$ | 0 | 0 | 0 | 0 | 1 | 1 | 1 | 1 | 1 | 1 | 1 | 1 | 0 | 0 | 0 | 0 | |
| $y_{6,q}$ | 0 | 0 | 1 | 1 | 1 | 1 | 0 | 0 | 0 | 0 | 1 | 1 | 1 | 1 | 0 | 0 | |
| $y_{8,q}$ | 0 | 1 | 1 | 0 | 0 | 1 | 1 | 0 | 0 | 1 | 1 | 0 | 0 | 1 | 1 | 0 | |
| $Re(z_q)$ | −31 | −29 | −27 | −25 | −23 | −21 | −19 | −17 | −15 | −13 | −11 | −9 | −7 | −5 | −3 | −1 | Uniform |
| | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 | NUC |
| $y_{0,q}$ | 0 | 0 | 0 | 0 | 0 | 0 | 0 | 0 | 0 | 0 | 0 | 0 | 0 | 0 | 0 | 0 | |
| $y_{2,q}$ | 1 | 1 | 1 | 1 | 1 | 1 | 1 | 1 | 0 | 0 | 0 | 0 | 0 | 0 | 0 | 0 | |
| $y_{4,q}$ | 0 | 0 | 0 | 0 | 1 | 1 | 1 | 1 | 1 | 1 | 1 | 1 | 0 | 0 | 0 | 0 | |
| $y_{6,q}$ | 0 | 0 | 1 | 1 | 1 | 1 | 0 | 0 | 0 | 0 | 1 | 1 | 1 | 1 | 0 | 0 | |

-continued

| | | | | | | | | | | | | | | | | | |
|---|---|---|---|---|---|---|---|---|---|---|---|---|---|---|---|---|---|
| $y_{8,q}$ | 0 | 1 | 1 | 0 | 0 | 1 | 1 | 0 | 0 | 1 | 1 | 0 | 0 | 1 | 1 | 0 | |
| $Re(z_q)$ | 1 | 3 | 5 | 7 | 9 | 11 | 13 | 15 | 17 | 19 | 21 | 23 | 25 | 27 | 29 | 31 | Uniform |
| | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | NUC |

Constellation Mapping for Imaginary Part of 1024-QAM

| | | | | | | | | | | | | | | | | | |
|---|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 | |
| $y_{3,q}$ | 0 | 0 | 0 | 0 | 0 | 0 | 0 | 0 | 1 | 1 | 1 | 1 | 1 | 1 | 1 | 1 | |
| $y_{5,q}$ | 0 | 0 | 0 | 0 | 1 | 1 | 1 | 1 | 1 | 1 | 1 | 1 | 0 | 0 | 0 | 0 | |
| $y_{7,q}$ | 0 | 0 | 1 | 1 | 1 | 1 | 0 | 0 | 0 | 0 | 1 | 1 | 1 | 1 | 0 | 0 | |
| $y_{9,q}$ | 0 | 1 | 1 | 0 | 0 | 1 | 1 | 0 | 0 | 1 | 1 | 0 | 0 | 1 | 1 | 0 | |
| $Im(z_q)$ | −31 | −29 | −27 | −25 | −23 | −21 | −19 | −17 | −15 | −13 | −11 | −9 | −7 | −5 | −3 | −1 | Uniform |
| | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 | NUC |
| $y_{1,q}$ | 0 | 0 | 0 | 0 | 0 | 0 | 0 | 0 | 0 | 0 | 0 | 0 | 0 | 0 | 0 | 0 | |
| $y_{3,q}$ | 1 | 1 | 1 | 1 | 1 | 1 | 1 | 1 | 0 | 0 | 0 | 0 | 0 | 0 | 0 | 0 | |
| $y_{5,q}$ | 0 | 0 | 0 | 0 | 1 | 1 | 1 | 1 | 1 | 1 | 1 | 1 | 0 | 0 | 0 | 0 | |
| $y_{7,q}$ | 0 | 0 | 1 | 1 | 1 | 1 | 0 | 0 | 0 | 0 | 1 | 1 | 1 | 1 | 0 | 0 | |
| $y_{9,q}$ | 0 | 1 | 1 | 0 | 0 | 1 | 1 | 0 | 0 | 1 | 1 | 0 | 0 | 1 | 1 | 0 | |
| $Im(z_q)$ | 1 | 3 | 5 | 7 | 9 | 11 | 13 | 15 | 17 | 19 | 21 | 23 | 25 | 27 | 29 | 31 | Uniform |
| | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | NUC |

Constellation Mapping for Real Part of 4096-QAM

| | | | | | | | | | | | | | | | | | |
|---|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 | |
| $y_{2,q}$ | 0 | 0 | 0 | 0 | 0 | 0 | 0 | 0 | 0 | 0 | 0 | 0 | 0 | 0 | 0 | 0 | |
| $y_{4,q}$ | 0 | 0 | 0 | 0 | 0 | 0 | 0 | 0 | 1 | 1 | 1 | 1 | 1 | 1 | 1 | 1 | |
| $y_{6,q}$ | 0 | 0 | 0 | 0 | 1 | 1 | 1 | 1 | 1 | 1 | 1 | 1 | 0 | 0 | 0 | 0 | |
| $y_{8,q}$ | 0 | 0 | 1 | 1 | 1 | 1 | 0 | 0 | 0 | 0 | 1 | 1 | 1 | 1 | 0 | 0 | |
| $y_{10,q}$ | 0 | 1 | 1 | 0 | 0 | 1 | 1 | 0 | 0 | 1 | 1 | 0 | 0 | 1 | 1 | 0 | |
| $Re(z_q)$ | −63 | −61 | −59 | −57 | −55 | −53 | −51 | −49 | −47 | −45 | −43 | −41 | −39 | −37 | −35 | −33 | Uniform |
| | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ | NUC |
| $y_{0,q}$ | 1 | 1 | 1 | 1 | 1 | 1 | 1 | 1 | 1 | 1 | 1 | 1 | 1 | 1 | 1 | 1 | |
| $y_{2,q}$ | 1 | 1 | 1 | 1 | 1 | 1 | 1 | 1 | 1 | 1 | 1 | 1 | 1 | 1 | 1 | 1 | |
| $y_{4,q}$ | 1 | 1 | 1 | 1 | 1 | 1 | 1 | 1 | 0 | 0 | 0 | 0 | 0 | 0 | 0 | 0 | |
| $y_{6,q}$ | 0 | 0 | 0 | 0 | 1 | 1 | 1 | 1 | 1 | 1 | 1 | 1 | 0 | 0 | 0 | 0 | |
| $y_{8,q}$ | 0 | 0 | 1 | 1 | 1 | 1 | 0 | 0 | 0 | 0 | 1 | 1 | 1 | 1 | 0 | 0 | |
| $y_{10,q}$ | 0 | 1 | 1 | 0 | 0 | 1 | 1 | 0 | 0 | 1 | 1 | 0 | 0 | 1 | 1 | 0 | |
| $Re(z_q)$ | −31 | −29 | −27 | −25 | −23 | −21 | −19 | −17 | −15 | −13 | −11 | −9 | −7 | −5 | −3 | −1 | Uniform |
| | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 | NUC |
| $y_{0,q}$ | 0 | 0 | 0 | 0 | 0 | 0 | 0 | 0 | 0 | 0 | 0 | 0 | 0 | 0 | 0 | 0 | |
| $y_{2,q}$ | 1 | 1 | 1 | 1 | 1 | 1 | 1 | 1 | 1 | 1 | 1 | 1 | 1 | 1 | 1 | 1 | |
| $y_{4,q}$ | 0 | 0 | 0 | 0 | 0 | 0 | 0 | 0 | 1 | 1 | 1 | 1 | 1 | 1 | 1 | 1 | |
| $y_{6,q}$ | 0 | 0 | 0 | 0 | 1 | 1 | 1 | 1 | 1 | 1 | 1 | 1 | 0 | 0 | 0 | 0 | |
| $y_{8,q}$ | 0 | 0 | 1 | 1 | 1 | 1 | 0 | 0 | 0 | 0 | 1 | 1 | 1 | 1 | 0 | 0 | |
| $y_{10,q}$ | 0 | 1 | 1 | 0 | 0 | 1 | 1 | 0 | 0 | 1 | 1 | 0 | 0 | 1 | 1 | 0 | |
| $Re(z_q)$ | 1 | 3 | 5 | 7 | 9 | 11 | 13 | 15 | 17 | 19 | 21 | 23 | 25 | 27 | 29 | 31 | Uniform |
| | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | NUC |
| $y_{0,q}$ | 0 | 0 | 0 | 0 | 0 | 0 | 0 | 0 | 0 | 0 | 0 | 0 | 0 | 0 | 0 | 0 | |
| $y_{2,q}$ | 0 | 0 | 0 | 0 | 0 | 0 | 0 | 0 | 0 | 0 | 0 | 0 | 0 | 0 | 0 | 0 | |
| $y_{4,q}$ | 1 | 1 | 1 | 1 | 1 | 1 | 1 | 1 | 0 | 0 | 0 | 0 | 0 | 0 | 0 | 0 | |
| $y_{6,q}$ | 0 | 0 | 0 | 0 | 1 | 1 | 1 | 1 | 1 | 1 | 1 | 1 | 0 | 0 | 0 | 0 | |
| $y_{8,q}$ | 0 | 0 | 1 | 1 | 1 | 1 | 0 | 0 | 0 | 0 | 1 | 1 | 1 | 1 | 0 | 0 | |
| $y_{10,q}$ | 0 | 1 | 1 | 0 | 0 | 1 | 1 | 0 | 0 | 1 | 1 | 0 | 0 | 1 | 1 | 0 | |
| $Re(z_q)$ | 33 | 35 | 37 | 39 | 41 | 43 | 45 | 47 | 49 | 51 | 53 | 55 | 57 | 59 | 61 | 63 | Uniform |
| | $-u_{16}$ | $-u_{17}$ | $-u_{18}$ | $-u_{19}$ | $-u_{20}$ | $-u_{21}$ | $-u_{22}$ | $-u_{23}$ | $-u_{24}$ | $-u_{25}$ | $-u_{26}$ | $-u_{27}$ | $-u_{28}$ | $-u_{29}$ | $-u_{30}$ | $-u_{31}$ | NUC |

Constellation Mapping for Imaginary Part of 4096-QAM

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 0 | 0 | 0 | 0 | 0 | 0 | 0 | 0 |

-continued

| | | | | | | | | | | | | | | | | | |
|---|---|---|---|---|---|---|---|---|---|---|---|---|---|---|---|---|---|
| $y_{5,q}$ | 0 | 0 | 0 | 0 | 0 | 0 | 0 | 0 | 1 | 1 | 1 | 1 | 1 | 1 | 1 | 1 | |
| $y_{7,q}$ | 0 | 0 | 0 | 0 | 1 | 1 | 1 | 1 | 1 | 1 | 1 | 1 | 0 | 0 | 0 | 0 | |
| $y_{9,q}$ | 0 | 0 | 1 | 1 | 1 | 1 | 0 | 0 | 0 | 0 | 1 | 1 | 1 | 1 | 0 | 0 | |
| $y_{11,q}$ | 0 | 1 | 1 | 0 | 0 | 1 | 1 | 0 | 0 | 1 | 1 | 0 | 0 | 1 | 1 | 0 | |
| $Im(z_q)$ | −63 | −61 | −59 | −57 | −55 | −53 | −51 | −49 | −47 | −45 | −43 | −41 | −39 | −37 | −35 | −33 | Uniform |
| | $-u_{31}$ | $-u_{30}$ | $-u_{29}$ | $-u_{28}$ | $-u_{27}$ | $-u_{26}$ | $-u_{25}$ | $-u_{24}$ | $-u_{23}$ | $-u_{22}$ | $-u_{21}$ | $-u_{20}$ | $-u_{19}$ | $-u_{18}$ | $-u_{17}$ | $-u_{16}$ | NUC |
| $y_{1,q}$ | 1 | 1 | 1 | 1 | 1 | 1 | 1 | 1 | 1 | 1 | 1 | 1 | 1 | 1 | 1 | 1 | |
| $y_{3,q}$ | 1 | 1 | 1 | 1 | 1 | 1 | 1 | 1 | 1 | 1 | 1 | 1 | 1 | 1 | 1 | 1 | |
| $y_{5,q}$ | 1 | 1 | 1 | 1 | 1 | 1 | 1 | 1 | 0 | 0 | 0 | 0 | 0 | 0 | 0 | 0 | |
| $y_{7,q}$ | 0 | 0 | 0 | 0 | 1 | 1 | 1 | 1 | 1 | 1 | 1 | 1 | 0 | 0 | 0 | 0 | |
| $y_{9,q}$ | 0 | 0 | 1 | 1 | 1 | 1 | 0 | 0 | 0 | 0 | 1 | 1 | 1 | 1 | 0 | 0 | |
| $y_{11,q}$ | 0 | 1 | 1 | 0 | 0 | 1 | 1 | 0 | 0 | 1 | 1 | 0 | 0 | 1 | 1 | 0 | |
| $Im(z_q)$ | −31 | −29 | −27 | −25 | −23 | −21 | −19 | −17 | −15 | −13 | −11 | −9 | −7 | −5 | −3 | −1 | Uniform |
| | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | −1 | NUC |
| $y_{1,q}$ | 0 | 0 | 0 | 0 | 0 | 0 | 0 | 0 | 0 | 0 | 0 | 0 | 0 | 0 | 0 | 0 | |
| $y_{3,q}$ | 1 | 1 | 1 | 1 | 1 | 1 | 1 | 1 | 1 | 1 | 1 | 1 | 1 | 1 | 1 | 1 | |
| $y_{5,q}$ | 0 | 0 | 0 | 0 | 0 | 0 | 0 | 0 | 1 | 1 | 1 | 1 | 1 | 1 | 1 | 1 | |
| $y_{7,q}$ | 0 | 0 | 0 | 0 | 1 | 1 | 1 | 1 | 1 | 1 | 1 | 1 | 0 | 0 | 0 | 0 | |
| $y_{9,q}$ | 0 | 0 | 1 | 1 | 1 | 1 | 0 | 0 | 0 | 0 | 1 | 1 | 1 | 1 | 0 | 0 | |
| $y_{11,q}$ | 0 | 1 | 1 | 0 | 0 | 1 | 1 | 0 | 0 | 1 | 1 | 0 | 0 | 1 | 1 | 0 | |
| $Im(z_q)$ | 1 | 3 | 5 | 7 | 9 | 11 | 13 | 15 | 17 | 19 | 21 | 23 | 25 | 27 | 29 | 31 | Uniform |
| | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ | NUC |
| $y_{1,q}$ | 0 | 0 | 0 | 0 | 0 | 0 | 0 | 0 | 0 | 0 | 0 | 0 | 0 | 0 | 0 | 0 | |
| $y_{3,q}$ | 0 | 0 | 0 | 0 | 0 | 0 | 0 | 0 | 0 | 0 | 0 | 0 | 0 | 0 | 0 | 0 | |
| $y_{5,q}$ | 1 | 1 | 1 | 1 | 1 | 1 | 1 | 1 | 0 | 0 | 0 | 0 | 0 | 0 | 0 | 0 | |
| $y_{7,q}$ | 0 | 0 | 0 | 0 | 1 | 1 | 1 | 1 | 1 | 1 | 1 | 1 | 0 | 0 | 0 | 0 | |
| $y_{9,q}$ | 0 | 0 | 1 | 1 | 1 | 1 | 0 | 0 | 0 | 0 | 1 | 1 | 1 | 1 | 0 | 0 | |
| $y_{11,q}$ | 0 | 1 | 1 | 0 | 0 | 1 | 1 | 0 | 0 | 1 | 1 | 0 | 0 | 1 | 1 | 0 | |
| $Im(z_q)$ | 33 | 35 | 37 | 39 | 41 | 43 | 45 | 47 | 49 | 51 | 53 | 55 | 57 | 59 | 61 | 63 | Uniform |
| | $u_{16}$ | $u_{17}$ | $u_{18}$ | $u_{19}$ | $u_{20}$ | $u_{21}$ | $u_{22}$ | $u_{23}$ | $u_{24}$ | $u_{25}$ | $u_{26}$ | $u_{27}$ | $u_{28}$ | $u_{29}$ | $u_{30}$ | $u_{31}$ | NUC |

An example of the definition of the NUC position vectors obtained by use of the above described approach is provided for 64-QAM (optimized for a non-fading channel and for a fading channel). The signal-to-noise ratio (SNR) is always denoted in dB and corresponds to the average SNR in case of fading channels.

b1) 64-QAM or 8-PAM for a Non-Fading Channel

| SNR | 5 | 6 | 7 | 8 | 9 | 10 | 11 | 12 | 13 | 14 | 15 | 16 | 17 |
|---|---|---|---|---|---|---|---|---|---|---|---|---|---|
| $u_1$ | 1.0000 | 1.0022 | 1.0009 | 1.1945 | 1.4265 | 1.7169 | 2.0784 | 2.4886 | 2.8098 | 2.9798 | 3.0657 | 3.0895 | 3.0744 |
| $u_2$ | 2.6799 | 3.6839 | 3.7714 | 3.5638 | 3.6893 | 3.9984 | 4.4060 | 4.8482 | 5.2018 | 5.4093 | 5.5100 | 5.4881 | 5.3864 |
| $u_3$ | 3.4087 | 3.6839 | 3.7779 | 4.6322 | 5.4024 | 6.2400 | 7.1114 | 7.9262 | 8.4762 | 8.7005 | 8.7024 | 8.4935 | 8.1750 |

| SNR | 18 | 19 | 20 | 21 | 22 | 23 | 24 | 25 | 26 | 27 | 28 | 29 | 30 |
|---|---|---|---|---|---|---|---|---|---|---|---|---|---|
| $u_1$ | 3.0557 | 3.0409 | 3.0309 | 3.0244 | 3.0180 | 3.0140 | 3.0153 | 3.0107 | 3.0001 | 2.7744 | 2.2837 | 3.0137 | 1.9278 |
| $u_2$ | 5.2889 | 5.2157 | 5.1647 | 5.1260 | 5.0979 | 5.0766 | 5.0685 | 5.0403 | 5.0254 | 4.5265 | 3.3188 | 5.1307 | 3.2632 |
| $u_3$ | 7.8949 | 7.6816 | 7.5265 | 7.4114 | 7.3213 | 7.2517 | 7.2083 | 7.1286 | 7.1277 | 6.6760 | 5.0386 | 6.6178 | 4.4151 |

b2) 64-QAM or 8-PAM for a Fading Channel

| SNR | 5 | 6 | 7 | 8 | 9 | 10 | 11 | 12 | 13 | 14 | 15 | 16 | 17 |
|---|---|---|---|---|---|---|---|---|---|---|---|---|---|
| $u_1$ | 1.0353 | 1.1062 | 1.2092 | 1.3451 | 1.5409 | 1.8112 | 2.1208 | 2.3945 | 2.6067 | 2.7560 | 2.8505 | 2.9120 | 2.9496 |
| $u_2$ | 2.8206 | 2.9015 | 3.0799 | 3.2980 | 3.5826 | 3.9386 | 4.3237 | 4.6577 | 4.9074 | 5.0773 | 5.1674 | 5.2201 | 5.2393 |
| $u_3$ | 3.4534 | 3.9220 | 4.4154 | 4.9297 | 5.5069 | 6.1594 | 6.8108 | 7.3475 | 7.7177 | 7.9488 | 8.0398 | 8.0680 | 8.0538 |

| SNR | 18 | 19 | 20 | 21 | 22 | 23 | 24 | 25 | 26 | 27 | 28 | 29 | 30 |
|---|---|---|---|---|---|---|---|---|---|---|---|---|---|
| $u_1$ | 2.9751 | 2.9907 | 3.0032 | 3.0055 | 3.0126 | 3.0124 | 3.0136 | 3.0165 | 3.0156 | 3.0158 | 3.0160 | 3.0180 | 3.0183 |
| $u_2$ | 5.2491 | 5.2493 | 5.2489 | 5.2365 | 5.2375 | 5.2247 | 5.2182 | 5.2165 | 5.2098 | 5.2070 | 5.2040 | 5.2036 | 5.1995 |
| $u_3$ | 8.0217 | 7.9849 | 7.9528 | 7.9035 | 7.8862 | 7.8443 | 7.8194 | 7.8046 | 7.7839 | 7.7661 | 7.7620 | 7.7569 | 7.7566 |

In the following the Q-NUC optimization will be described, i.e. the optimization of a 2-dimensional constellation that is derived from a single quadrant. The above described optimization of a $N^2$-QAM requires the optimization of sqrt(M)/2-1 degrees of freedom. Since the optimization of a 2-dimensional QAM constellation has 2*M degrees of freedom (real and imaginary part of each constellation point) the optimization is significantly more time consuming. This is also caused by the need of calculating the BICM capacity during the optimization for the 2-dimensional case instead of the 1-dimensional case. Since the optimum 2D-constellations for the 16-QAM case are symmetric with respect to the different quadrants of the constellations, the following simplifications can be applied during the optimization: Only the first quadrant of the constellation is optimized during the constellation, reducing the degrees of freedom during the optimization from 2*M to M/2. From the first quadrant the remaining quadrants can be derived, leading to a so called QQAM constellation. However, care must be taken to ensure that the properties of the bit labeling of the constellation points are retained. If the first quadrant is Gray-Mapped, offering a maximum Hamming distance of 1, the same must be ensured for the remaining quadrants of the QQAM constellation. This is ensured by the algorithm defined below.

Figure 8:
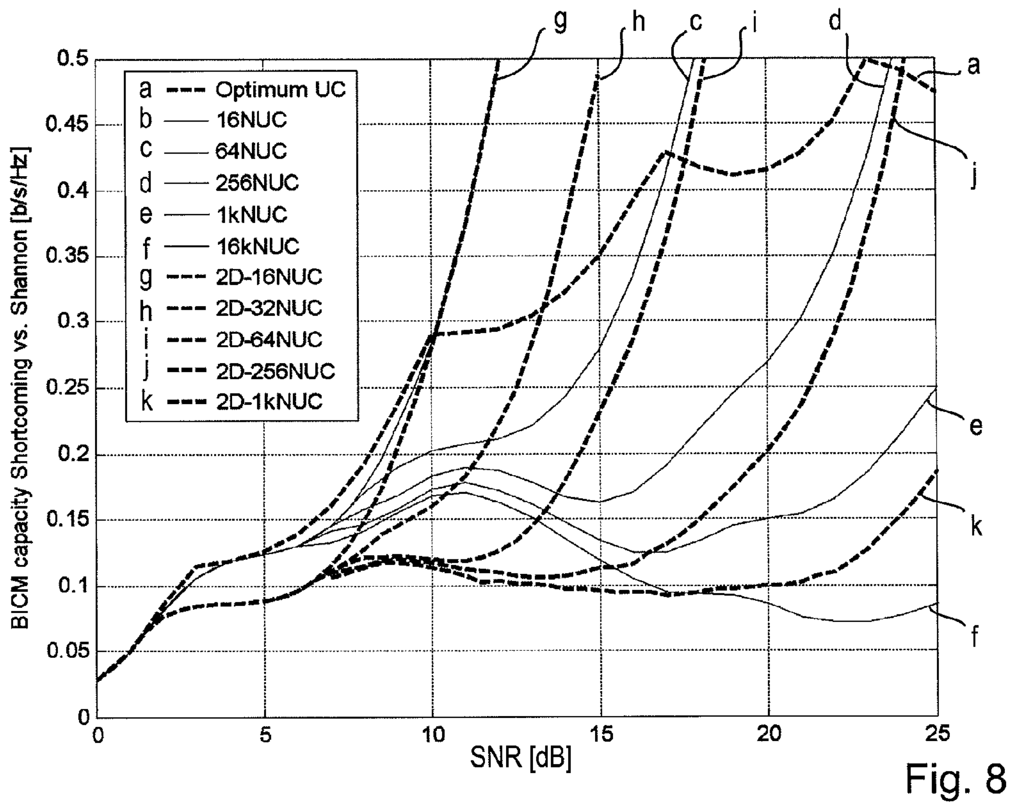
FIG. 8 shows a diagram illustrating the performance of non-uniform 16-QQAM, 32-QQAM, 64-QQAM, 256-QQAM and 1024-QQAM constellations compared to non-uniform $N^2$-QAM constellations, and, FIG. 9 shows a non-uniform 16-QQAM constellation.

To uniquely define a 16-QQAM only 8 real values are required, corresponding to 4 complex values representing the constellation points of the first quadrant. Based on the QQAM approach 16-QQAM, 32-QQAM, 64QQAM, 256-QQAM and 1024-QQAM constellations have been optimized, clearly outperforming the $N^2$-QAM constellations, especially in the low SNR regime. The performance of the 16-QQAM, 32-QQAM, 64-QQAM, 256-QQAM and 1024-QQAM constellations is depicted in FIG. 8. The presented QQAM optimization approach can be used for any channel condition, e.g. for the AWGN channel as well as for fading channels.

An example for the definition of the NUC position vectors obtained by use of the above described approach for obtaining QQAM constellations is provided for 16QQAM. The signal-to-noise ratio (SNR) is always denoted in dB and corresponds to the average SNR in case of fading channels.

16QQAM-AWGN channel

| | w | | | |
|---|---|---|---|---|
| SNR | w0 | w1 | w2 | w3 |
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i |
| 1.5 | 0.6921 + 0.8373i | 0.8373 + 0.6921i | 0.5853 + 0.6908i | 0.6908 + 0.5854i |
| 2 | 0.5879 + 0.4053i | 1.0566 + 0.6114i | 0.4053 + 0.5879i | 0.6114 + 1.0566i |
| 2.5 | 0.5354 + 0.3507i | 0.3507 + 0.5354i | 1.1217 + 0.5763i | 0.5763 + 1.1217i |
| 3 | 0.5551 + 1.1571i | 0.3189 + 0.5012i | 1.1571 + 0.5551i | 0.5012 + 0.3189i |
| 3.5 | 0.5410 + 1.1789i | 1.1789 + 0.5410i | 0.2981 + 0.4781i | 0.4781 + 0.2981i |
| 4 | 0.5309 + 1.1928i | 1.1928 + 0.5309i | 0.2842 + 0.4633i | 0.4633 + 0.2842i |
| 4.5 | 0.2752 + 0.4551i | 0.4551 + 0.2752i | 0.5232 + 1.2014i | 1.2014 + 0.5232i |
| 5 | 0.2696 + 0.4521i | 0.4521 + 0.2696i | 0.5169 + 1.2065i | 1.2065 + 0.5169i |
| 5.5 | 1.2092 + 0.5115i | 0.4530 + 0.2663i | 0.5115 + 1.2092i | 0.2663 + 0.4530i |
| 6 | 0.2642 + 0.4570i | 0.4570 + 0.2642i | 0.5067 + 1.2102i | 1.2102 + 0.5067i |
| 6.5 | 0.4634 + 0.2626i | 1.2100 + 0.5023i | 0.2626 + 0.4634i | 0.5023 + 1.2100i |
| 7 | 0.2606 + 0.4718i | 0.4718 + 0.2606i | 0.4984 + 1.2088i | 1.2088 + 0.4984i |
| 7.5 | 0.4951 + 1.2068i | 1.2068 + 0.4951i | 0.2575 + 0.4819i | 0.4819 + 0.2575i |
| 8 | 0.4925 + 1.2040i | 0.2530 + 0.4936i | 1.2040 + 0.4925i | 0.4936 + 0.2530i |
| 8.5 | 0.5061 + 0.2474i | 0.2474 + 0.5061i | 1.2007 + 0.4909i | 0.4909 + 1.2007i |
| 9 | 0.2472 + 0.5461i | 0.4910 + 0.2363i | 0.5032 + 1.2019i | 1.1908 + 0.4773i |
| 9.5 | 0.6186 + 0.2544i | 0.2213 + 0.4416i | 1.2080 + 0.5377i | 0.4487 + 1.1657i |
| 10 | 0.2173 + 0.4189i | 0.6578 + 0.2571i | 0.4326 + 1.1445i | 1.2088 + 0.5659i |
| 10.5 | 0.9576 + 0.2881i | 0.2881 + 0.2881i | 0.9576 + 0.9576i | 0.2881 + 0.9576i |
| 11 | 0.2918 + 0.2918i | 0.9565 + 0.2918i | 0.2918 + 0.9565i | 0.9565 + 0.9565i |
| 11.5 | 0.2949 − 0.2949i | 0.9555 − 0.2949i | 0.2949 − 0.9555i | 0.9555 − 0.9555i |
| 12 | 0.2976 − 0.2976i | 0.9547 − 0.2976i | 0.2976 − 0.9547i | 0.9547 − 0.9547i |
| 12.5 | 0.2999 − 0.2999i | 0.9540 − 0.2999i | 0.2999 − 0.9540i | 0.9540 − 0.9540i |
| 13 | 0.3018 − 0.3018i | 0.9534 − 0.3018i | 0.3018 − 0.9534i | 0.9534 − 0.9534i |
| 13.5 | 0.3035 − 0.3035i | 0.9528 − 0.3035i | 0.3035 − 0.9528i | 0.9528 − 0.9528i |
| 14 | 0.3050 − 0.3050i | 0.9523 − 0.3050i | 0.3050 − 0.9523i | 0.9523 − 0.9523i |
| 14.5 | 0.3063 − 0.3063i | 0.9519 − 0.3063i | 0.3063 − 0.9519i | 0.9519 − 0.9519i |
| 15 | 0.9516 + 0.9512i | 0.9516 + 0.3073i | 0.3074 + 0.9519i | 0.3075 + 0.3076i |

Next, a definition of the QQAM constellation shall be provided. Each input cell word ($y_0, \ldots, y_{m-1}$) shall be modulated using a non-uniform QQAM constellations to give a constellation point zq prior to normalization, where m corresponds to the number of bits per QAM symbol $m=\log_2(M)$. The vector of complex constellation points $x_{0 \ldots M-1}$ for all combinations of the input bits $y_{0 \ldots m-1}$ (corresponding to the decimal values 0 to M−1) are given in the above shown tables for the various constellation sizes depending on the QQAM position vector $w_{0 \ldots b-1}$, which defines the constellation point positions of a first quadrant of the non-uniform constellation. The length b of the QQAM position vector w is defined by b=M/4. The QQAM position vector defines a first quadrant of the constellation (e.g. representing the first quadrant of a cartesian coordinate system according to which the constellation is oriented), namely the constellation points with the decimal values 0 ($y_{0 \ldots m}$=0000) to b−1 ($y_{0 \ldots m}$=0011), while the constellation points of the remaining quadrants are derived as follows:

$$x_{0 \ldots b-1}=w_{0 \ldots b-1} \quad \text{(1. quadrant I)}$$

$$x_{b \ldots 2b-1}=\mathrm{conj}(w_{0 \ldots b-1}) \quad \text{(2. quadrant II)}$$

$$x_{2b \ldots 3b-1}=-\mathrm{conj}(w_{0 \ldots b-1}) \quad \text{(4. quadrant IV)}$$

$$x_{3b \ldots 4b-1}=w_{0 \ldots b-1} \quad \text{(3. quadrant III)}$$

with conj being the complex conjugate. For example, for SNR=2 dB, the corresponding constellation point $z_q$ for a 16-QQAM defined by the QQAM position vector ($w_{0 \ldots 3}$)=(0.5879+0.4053i, 1.0566+0.6114i, 0.4053+

Figure 9:
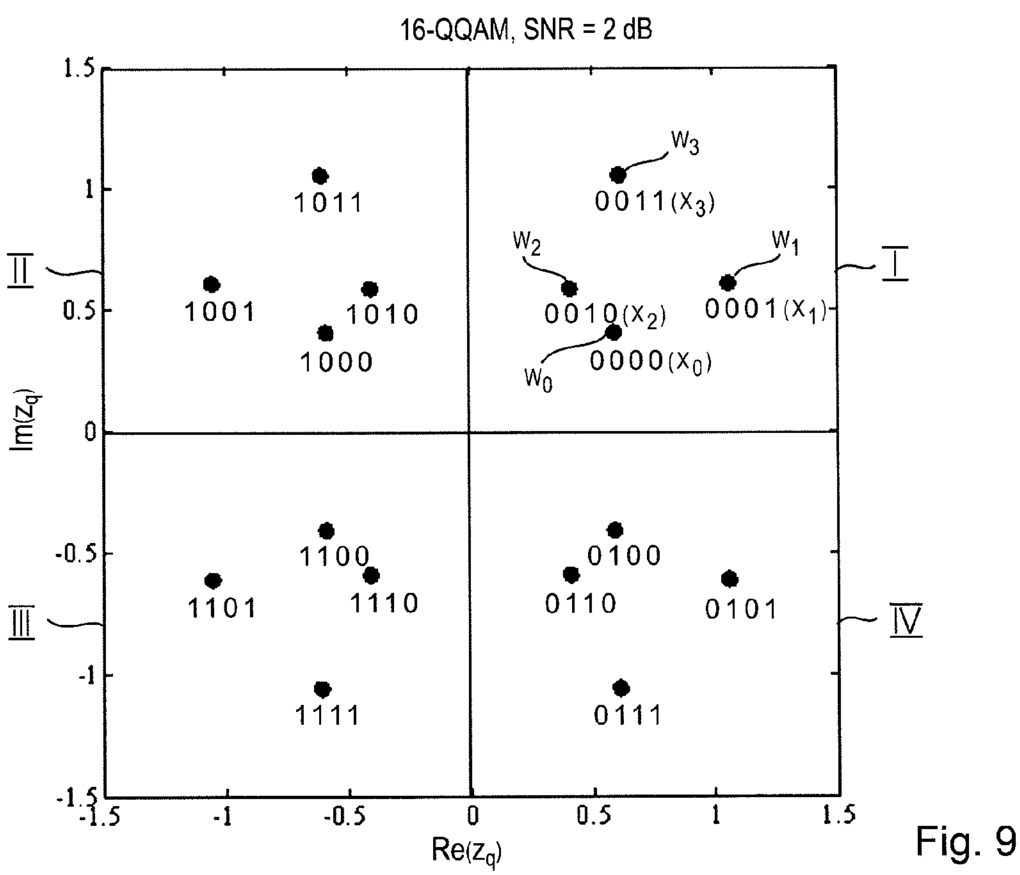

0.5879i, 0.6114+1.0566i) and the input cell word ($y_0 \ldots y_{m-1}$)=(1100) is $x_{12}=-w_0=-0.5879-0.4053i$. The complete constellation for this NUC position vector for SNR=2 dB for 16-QQAM is shown in the FIG. 9 with all input cell words marked at the corresponding constellation points.

As mentioned above the constellation position vector w as defined herein does not necessarily contain the constellation points of the first quadrant of the constellation, but could also contain the constellation points of any of the four quadrants. Due to the quadrant symmetry this leads to constellations with a different bit mapping but with identical performance. The constellation position vector w in the tables defined herein should therefore be considered as an example for all four symmetric constellations with different bit mapping but identical performance.

Figure 10:
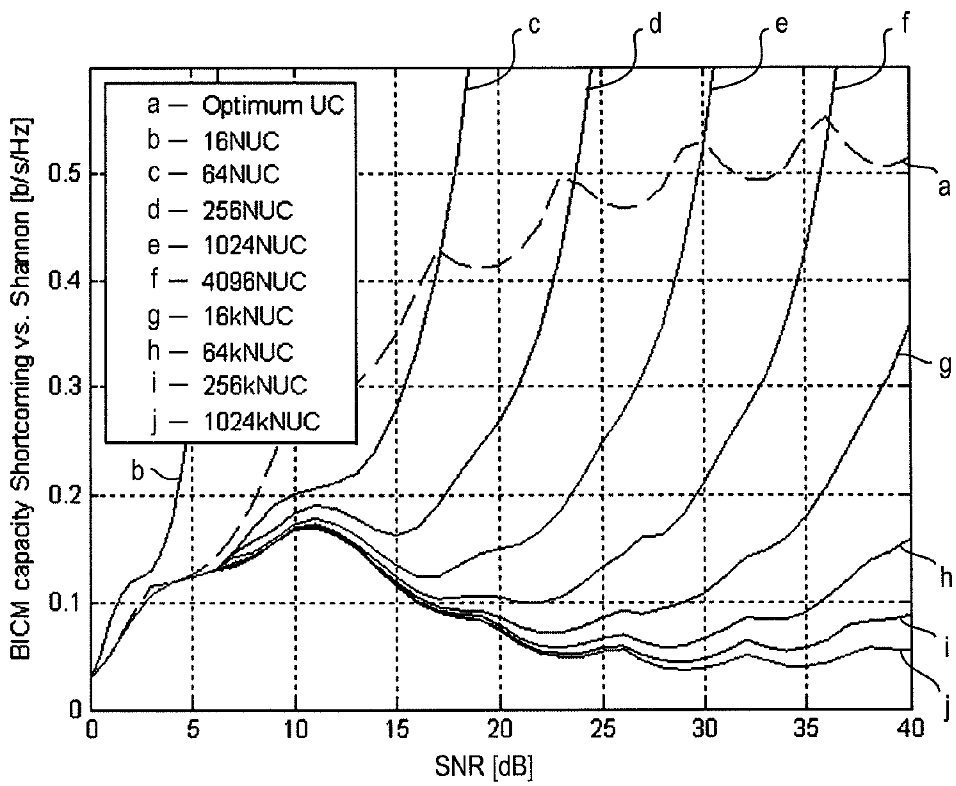
FIG. 10 shows a diagram illustrating the performance of non-uniform $N^2$-QAM constellations.

Using $N^2$-QAM constellations it is meaningful from an information theoretic point of view to use high constellation orders, since these constellations offer more degrees of freedom for the optimization and perform closer to the Shannon capacity as depicted in FIG. 10. However, with increasing constellation size the complexity for demapping in the receiver also increases. Since for large $N^2$-QAM constellations many constellation points are very close to each other in the complex plane it is proposed in Jonathan Stott, "CM and BICM limits for rectangular constellations", DVB document server, document TM-MIMO0007, Aug. 2012, to "condense" non-uniform constellations by means of forcing particular constellation points to have the same position before the optimization process, accepting a small performance loss compared to its "mother constellation". Such constellations are called there "ConQAM" (condensed QAM). This provides a reduced complexity during the optimization process, since fewer degrees of freedom have to be optimized and a reduced complexity for demapping in the receiver, due to the reduced number of "effective" constellation points. In the above mentioned document of Jonathan Stott a condensed 16 kQAM has been presented with only 3600 remaining constellation point positions, offering a good performance in the SNR region from 20 to 25 dB.

When the condensation is performed before the optimization, assumptions must be made, how a good performing constellation may look like (i.e. which particular points are condensed and which not). This requires a deep analysis for high constellation sizes. Based on these assumptions of the chosen structure of the constellation, the optimization is carried out over an SNR region with the corresponding number of constellation points (e.g. 3600 condensed constellation points instead of 16384). The drawback of this approach is that the optimal structure of the constellation practically changes for each SNR value, which cannot be taken into account. That is the resulting ConQAM constellation with a fixed number of constellations points is not optimal over a broad SNR range. Therefore different structures are herein derived and optimized.

An improved alternative to condensing the constellation before the optimization is the reduction of the constellation points after the optimization which is proposed according to the present disclosure. The optimization of all degrees of freedom of the $N^2$-QAM constellation is thus required, but several advantages are obtained. When performing the condensation after the optimization, a constellation requiring the minimum required number of constellation points can be derived to offer a desired performance. This allows for a seamless change of the required number of constellation points over the SNR range, which leads to a reduction of the number of constellation points compared to the approach proposed in the above mentioned document of Jonathan Stott. This approach will be called dynamic condensation, since it is carried out for each SNR point individually. This approach is outlined for the $N^2$-QAM case in the following.

Based on the mother PAM constellation with N constellation point positions, a constellation with reduced number of constellation points is derived. The following condensation algorithm is thus proposed according to an embodiment:

1) Sort all constellation points of the mother PAM in increasing order.
2) Create a new (empty) group of constellation points (the current group).
3) Iterate over all constellation points:
   - If the distance of the current constellation point to its neighbor is smaller than a predefined condensation threshold t:
     - add the constellation point to the current group
   - else
     - a) condense all constellation points from the current group (if the current group is not empty) to their average constellation point position (e.g. the arithmetic mean), i.e. all constellation points from that group have the same constellation point position now;
     - b) create a new (empty) group, which is now the current group.
   - end end
4) Restore the initial order of the constellation points (i.e. undo the sort operation from step 1)).

Figure 11:
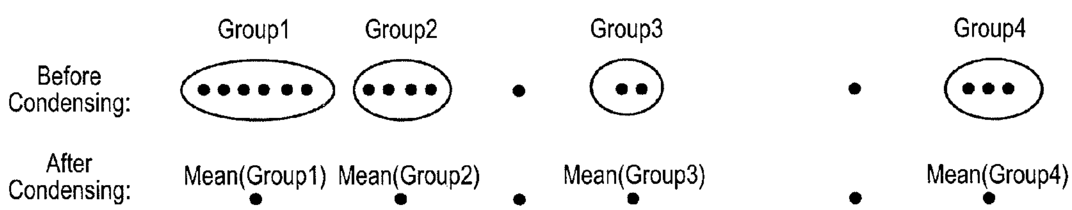
FIG. 11 shows an example for 1D condensing according to an embodiment of the present disclosure.

An example of the algorithm is shown in FIG. 11 for 17 constellation points of a PAM constellation: The constellation points with a distance smaller than the threshold t result in a group of constellation points, i.e. are condensed to a single constellation point position. In the end only 6 constellation points are remaining Of course, the algorithm can analogously be extended to the 2D-case as will be briefly explained below.

Figure 12:
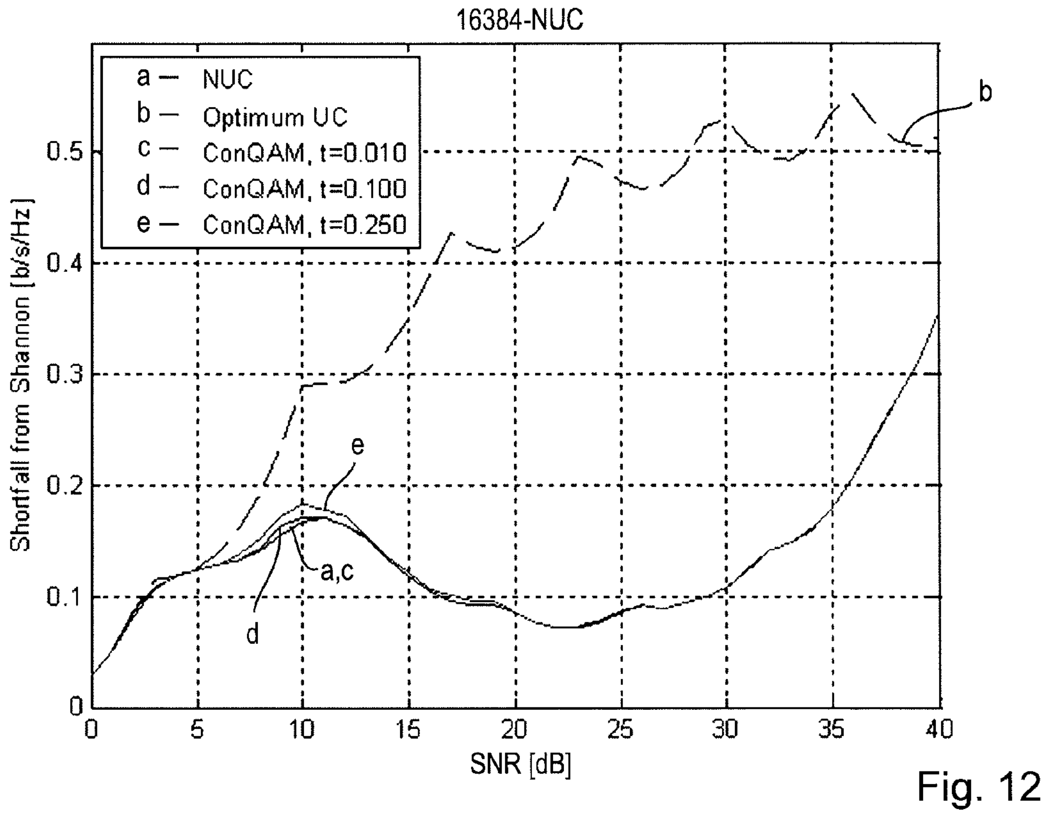
FIG. 12 shows a diagram illustrating the performance of condensed constellations after optimization with different thresholds t.

If this algorithm is directly applied to a particular constellation size with the same threshold t for the whole SNR range, for some SNR values the penalty of the resulting ConQAM is larger than for other SNR values. This is shown in FIG. 12 for a 16 k $N^2$-NUC constellation. At high SNR the condensed constellation with t=0.25 performs very close to its mother NUC with the full number of constellation points, however showing a performance penalty at 10 dB SNR.

Figure 13:
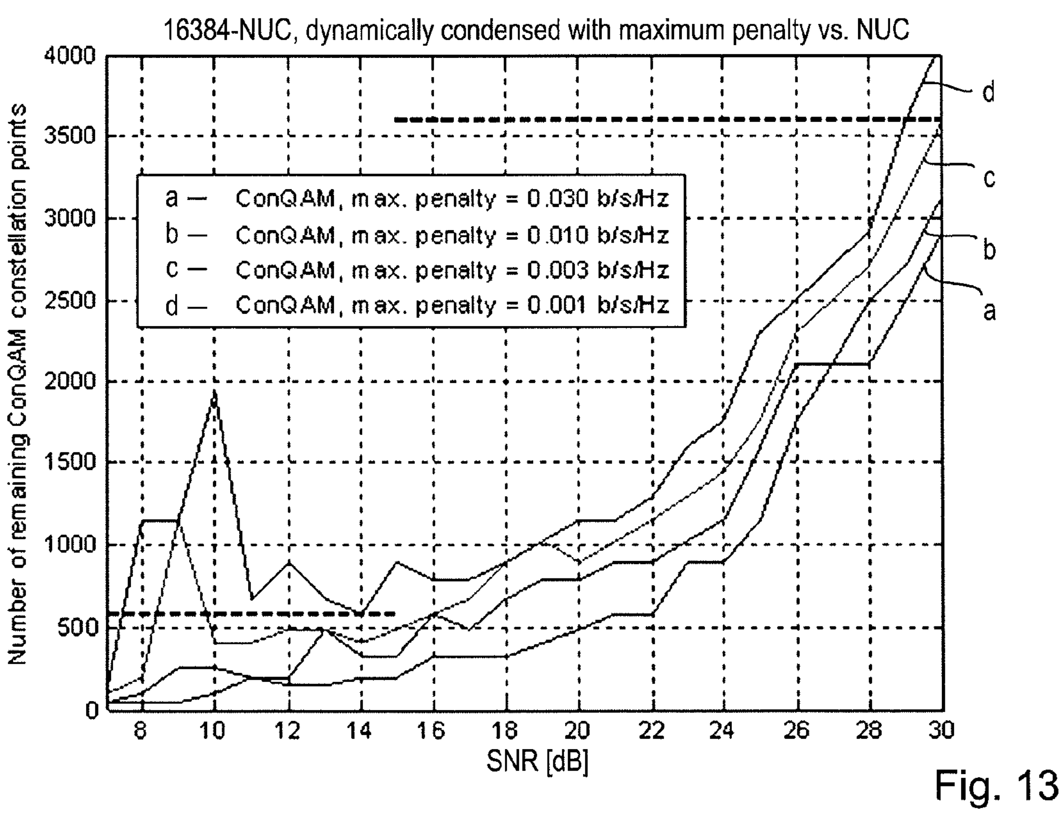
FIG. 13 shows a diagram illustrating the number of required constellation points of a 16 k $N^2$ non-uniform constellation.

Therefore, a better approach is to dynamically condense the constellation by choosing the threshold in a way that guarantees a maximum penalty of the condensed constellation with respect to its mother constellation. The condensation is then performed for several values of t, choosing the constellation with the lowest amount of constellation points that still fulfills the maximum penalty compared to its mother constellation. The required amount of constellation points of a dynamically condensed 16 k $N^2$-NUC guaranteed to not exceed a capacity loss of 0.001 b/s/Hz with respect to its mother constellation is shown in FIG. 13. In principle the number of required constellation points is increasing with higher SNR, with an exception at about 10 dB SNR.

The selection of the maximum penalty with respect to the BICM capacity of the mother constellation is a tradeoff between the performance of the resulting constellation and the number of remaining constellation points. In case of a small maximum penalty, the resulting constellation performs very close to its mother constellation, while the reduction of the number of constellation points is comparably small. In case of a higher maximum penalty, the resulting constellation performs slightly worse, but allows for a greater reduction of the number of constellation points. This is preferably considered when choosing a particular condensed constellation.

Figure 14:
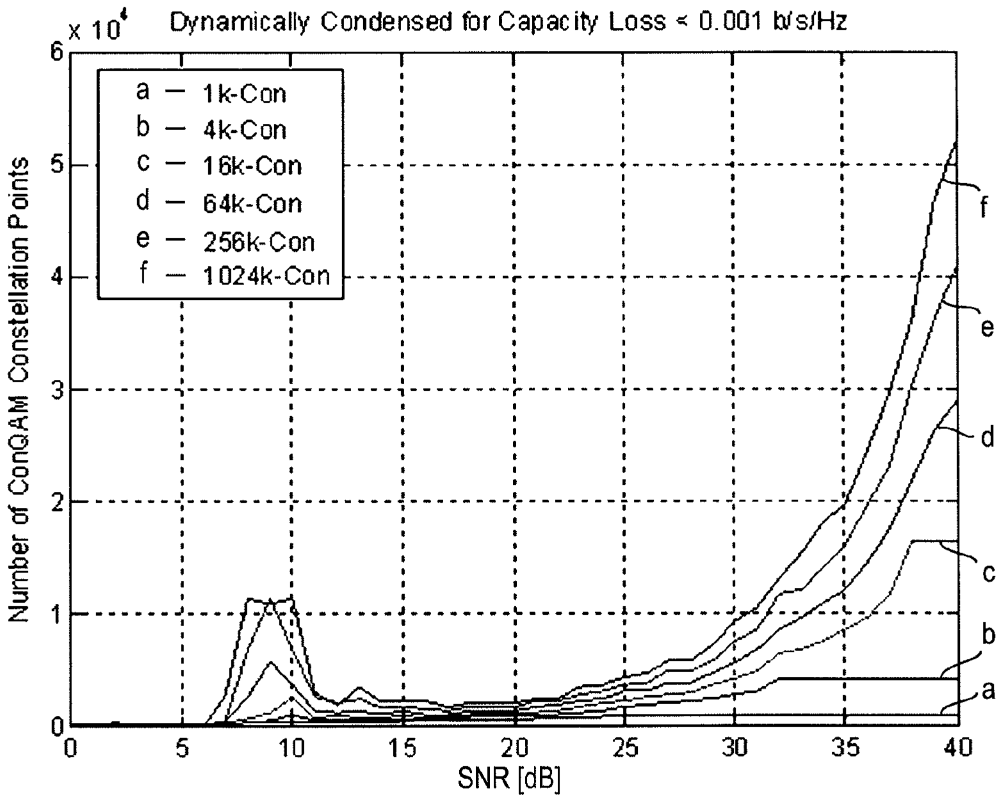
FIG. 14 shows a diagram illustrating the number of required constellation points of dynamically condensed QAM.

In FIG. 14 the resulting numbers of constellation points are compared with the numbers resulting from the static approach described in the above mentioned document of Jonathan Stott (indicated by the dashed line). The required number of constellation points of the dynamic approach is clearly lower, in addition guaranteeing a maximum performance penalty with respect to the mother constellation. This leads to a reduced number of constellation points, further reducing the complexity in the demapper.

Next, a definition of the condensed non-uniform $N^2$-QAM constellations shall be provided. The condensed constellations are defined in the same way by the NUC position vector $u_{1 \ldots v}$. The length of the NUC position vector u is still $$v = \frac{\sqrt{M}}{2} - 1,$$

which is however written in a condensed way in a vector c to reduce the size of the table. Instead of writing all elements of u, consecutive elements with the same value are written only once in the vector c, together with a multiplier describing the number of repetitions for the value. For example: The vector c=3×1.000, 4×2.852, 2×4.972, 2×5.531, 7.724, 8.140, 9.778, 12.105 describes a non-uniform 1024-$N^2$-QAM with the NUC position vector u=1.000, 1.000, 1.000, 2.852, 2.852, 2.852, 2.852, 4.972, 4.972, 5.531, 5.531, 7.724, 8.140, 9.778, 12.105.

In the following the definition of the condensed NUC position vectors for 1D NUC constellations obtained by use of the above described condensing approach is provided (for fading channels and for non-fading channels, and for two different penalties). The signal-to-noise ratio (SNR) is always denoted in dB and corresponds to the average SNR in case of fading channels.

a1) 64-QAM/8-PAM for the AWGN Channel (Maximum Penalty of 0.001 b/s/Hz)

0.0 dB: u=[3×1.000]
1.0 dB: u=[3×1.000]
2.0 dB: u=[0.735, 1.000, 1.485]
3.0 dB: u=[1.000, 2×2.265]
4.0 dB: u=[1.000, 2×2.842]
5.0 dB: u=[1.000, 2×3.337]
6.0 dB: u=[1.000, 2×3.672]
7.0 dB: u=[1.000, 2×3.774]

b1) 256-QAM/16-PAM for the AWGN Channel (Maximum Penalty of 0.001 b/s/Hz)

0.0 dB: u=[7×1.000]
1.0 dB: u=[7×1.000]
2.0 dB: u=[0.856, 0.650, 0.731, 1.000, 0.856, 1.222, 1.488]
3.0 dB: u=[3×1.000, 4×2.265]
4.0 dB: u=[3×1.000, 4×2.843]
5.0 dB: u=[3×1.000, 4×3.337]
6.0 dB: u=[3×1.000, 4×3.672]
7.0 dB: u=[3×1.000, 4×3.773]
8.0 dB: u=[1.000, 1.208, 1.000, 3.633, 3.258, 3.633, 5.360]
9.0 dB: u=[1.000, 1.284, 1.000, 3.634, 3.295, 3.634, 5.668]
10.0 dB: u=[1.000, 1.498, 1.335, 2×3.680, 4.472, 6.457]
11.0 dB: u=[1.000, 2×1.811, 3.971, 4.204, 5.712, 7.600]
12.0 dB: u=[1.000, 2×2.219, 4.347, 4.737, 6.667, 8.767]
13.0 dB: u=[1.000, 2×2.620, 4.719, 5.258, 7.485, 9.942]

14.0 dB: u=[1.000, 2×2.885, 4.980, 5.626, 8.030, 10.779]

c1) 1024-QAM/32-PAM for the AWGN Channel (Maximum Penalty of 0.001 b/s/Hz)

0.0 dB: u=[15×1.000]
1.0 dB: u=[15×1.000]
2.0 dB: u=[1.000, 2×0.901, 4×0.703, 2×1.000, 2×0.901, 1.335, 1.279, 1.455, 1.528]
3.0 dB: u=[7×1.000, 8×2.266]
4.0 dB: u=[7×1.000, 8×2.849]
5.0 dB: u=[7×1.000, 8×3.336]
6.0 dB: u=[7×1.000, 8×3.668]
7.0 dB: u=[7×1.000, 3.718, 3.300, 3.091, 3.300, 3.718, 3.300, 3.718, 5.583]
8.0 dB: u=[1.096, 1.205, 1.096, 1.205, 1.324, 1.205, 1.096, 4.305, 3.869, 3.666, 3.869, 4.305, 3.869, 4.305, 6.936]
9.0 dB: u=[1.000, 2×1.165, 2×1.360, 2×1.165, 2×4.032, 2×3.692, 2×4.032, 4.948, 7.121]
10.0 dB: u=[1.000, 2×1.219, 2×1.492, 2×1.219, 3.933, 4.288, 3.933, 3.690, 3.933, 4.288, 5.679, 7.550]
11.0 dB: u=[3×1.000, 4×1.827, 3.963, 4.112, 4.265, 4.112, 6.203, 5.835, 6.203, 8.623]
12.0 dB: u=[3×1.000, 4×2.254, 4.402, 4.576, 4.777, 4.576, 7.086, 6.839, 7.301, 9.870]
13.0 dB: u=[3×1.000, 4×2.605, 2×4.764, 2×5.165, 7.361, 7.583, 8.742, 11.047]
14.0 dB: u=[3×1.000, 4×2.852, 2×4.972, 2×5.531, 7.724, 8.140, 9.778, 12.105]
15.0 dB: u=[3×1.000, 2×2.931, 2×3.051, 2×5.104, 5.716, 5.814, 7.961, 8.482, 10.428, 12.892]
16.0 dB: u=[3×1.000, 2×2.974, 2×3.152, 2×5.173, 5.831, 6.002, 8.071, 8.636, 10.752, 13.319]
17.0 dB: u=[3×1.000, 2×2.951, 2×3.234, 2×5.161, 5.943, 6.163, 8.073, 8.669, 10.809, 13.379]
18.0 dB: u=[1.000, 2×1.226, 2×3.176, 2×3.747, 2×5.686, 6.923, 7.165, 9.065, 9.785, 12.083, 14.863]
19.0 dB: u=[1.000, 2×1.714, 2×3.689, 2×4.830, 2×6.860, 8.634, 8.952, 11.029, 12.021, 14.586, 17.762]
20.0 dB: u=[1.000, 2×2.547, 2×4.588, 2×6.419, 2×8.668, 10.896, 11.417, 13.777, 15.283, 18.195, 21.909]
21.0 dB: u=[1.000, 2×2.877, 2×4.945, 2×7.032, 9.280, 9.499, 11.722, 12.522, 14.875, 16.901, 19.832, 23.605]
22.0 dB: u=[1.000, 2×2.988, 2×5.065, 2×7.242, 9.445, 9.858, 11.970, 13.095, 15.312, 17.587, 20.467, 24.094]
23.0 dB: u=[1.000, 2×3.011, 2×5.091, 7.151, 7.425, 9.376, 10.130, 12.040, 13.561, 15.616, 17.939, 20.714, 24.127]
24.0 dB: u=[1.000, 2×3.017, 4.976, 5.229, 7.039, 7.672, 9.386, 10.592, 12.301, 14.031, 16.039, 18.330, 20.996, 24.207]

d1) 4096-QAM/32-PAM for the AWGN Channel (Maximum Penalty of 0.001 b/s/Hz)

0.0 dB: u=[31×1.000]
1.0 dB: u=[31×1.000]
2.0 dB: u=[15×1.000, 16×1.566]
3.0 dB: u=[15×1.000, 16×2.265]
4.0 dB: u=[15×1.000, 16×2.840]
5.0 dB: u=[15×1.000, 16×3.336]
6.0 dB: u=[15×1.000, 16×3.673]
7.0 dB: u=[15×1.000, 3.525, 3.931, 3.525, 3.321, 3.186, 3.321, 3.525, 3.321, 3.525, 3.931, 3.525, 3.321, 3.525, 3.931, 6.619, 3.931]
8.0 dB: u=[4×1.000, 1.104, 3×1.000, 1.104, 1.177, 1.104, 1.000, 1.104, 2×1.000, 4.116, 3.703, 3.508, 3.703, 3.508, 3.382, 3.508, 3.703, 4.116, 3.703, 3.508, 3.703, 4.116, 3.703, 4.116, 7.045]
9.0 dB: u=[1.000, 2×1.113, 2×1.244, 2×1.113, 2×1.244, 1.359, 1.417, 2×1.244, 2×1.113, 4.102, 4.573, 4.102, 3.833, 3.679, 3.833, 4.102, 3.833, 4.102, 4.573, 4.102, 3.833, 4.102, 4.573, 6.278, 8.039]

10.0 dB: u=[3×1.000, 4×1.111, 4×1.530, 4×1.367, 3.739, 3.831, 4.032, 3.911, 3.831, 3.911, 3.831, 3.739, 4.416, 4.655, 4.789, 4.606, 2×5.823, 6.640, 8.423]

11.0 dB: u=[7×1.000, 8×1.818, 2×3.970, 2×4.102, 2×4.235, 2×4.102, 6.038, 6.345, 5.947, 5.745, 6.038, 6.345, 7.640, 9.593]

12.0 dB: u=[7×1.000, 8×2.235, 2×4.392, 2×4.554, 2×4.735, 2×4.554, 6.942, 7.383, 6.942, 6.693, 6.942, 7.383, 8.823, 10.982]

13.0 dB: u=[7×1.000, 8×2.617, 4×4.814, 4×5.138, 7.415, 2×7.705, 7.415, 8.210, 8.760, 9.982, 12.237]

14.0 dB: u=[7×1.000, 8×2.850, 4×4.972, 4×5.521, 2×7.763, 2×8.079, 9.585, 9.912, 11.037, 13.294]

15.0 dB: u=[7×1.000, 4×2.928, 4×3.046, 4×5.103, 4×5.753, 2×7.981, 2×8.417, 10.138, 10.576, 11.955, 14.209]

16.0 dB: u=[7×1.000, 4×2.972, 4×3.145, 4×5.170, 2×5.823, 2×5.973, 2×8.065, 2×8.590, 10.431, 10.930, 12.610, 14.901]

17.0 dB: u=[7×1.000, 4×2.958, 4×3.220, 4×5.164, 2×5.918, 2×6.124, 2×8.062, 2×8.636, 10.521, 11.028, 12.897, 15.237]

18.0 dB: u=[3×1.000, 4×1.189, 4×3.142, 4×3.651, 4×5.593, 2×6.744, 2×6.971, 2×8.871, 9.455, 9.648, 11.569, 12.124, 14.220, 16.768]

19.0 dB: u=[3×1.000, 4×1.583, 4×3.546, 4×4.556, 4×6.550, 2×8.227, 2×8.504, 2×10.528, 11.281, 11.554, 13.629, 14.307, 16.686, 19.573]

20.0 dB: u=[3×1.000, 4×2.458, 4×4.492, 4×6.251, 4×8.473, 2×10.667, 2×11.113, 2×13.465, 14.623, 14.994, 17.348, 18.281, 21.118, 24.602]

21.0 dB: u=[3×1.000, 4×2.842, 4×4.906, 4×6.964, 4×9.303, 2×11.630, 2×12.349, 2×14.708, 16.380, 16.840, 19.124, 20.381, 23.243, 26.857]

22.0 dB: u=[3×1.000, 4×2.971, 4×5.048, 4×7.211, 2×9.432, 2×9.772, 2×11.925, 2×12.920, 2×15.175, 17.084, 17.716, 19.872, 21.565, 24.287, 27.805]

23.0 dB: u=[3×1.000, 4×3.008, 4×5.087, 2×7.172, 2×7.381, 2×9.393, 2×10.022, 2×11.988, 2×13.375, 15.346, 15.561, 17.434, 18.215, 20.268, 22.212, 24.831, 28.169]

24.0 dB: u=[3×1.000, 4×3.015, 2×5.007, 2×5.178, 2×7.069, 2×7.547, 2×9.337, 2×10.376, 2×12.134, 2×13.791, 15.616, 15.985, 17.760, 18.781, 20.693, 22.738, 25.267, 28.415]

25.0 dB: u=[3×1.000, 2×2.913, 2×3.130, 2×4.892, 2×5.384, 2×7.025, 2×7.968, 2×9.534, 2×10.914, 2×12.555, 14.212, 14.407, 16.054, 16.647, 18.303, 19.611, 21.420, 23.482, 25.937, 28.932]

26.0 dB: u=[1.000, 2×2.141, 2×4.125, 2×5.413, 2×7.372, 2×8.904, 2×10.870, 2×12.675, 2×14.736, 2×16.835, 2×19.148, 21.465, 21.902, 24.118, 25.242, 27.472, 29.544, 32.086, 35.010, 38.427, 42.552]

27.0 dB: u=[1.000, 2×2.790, 2×4.801, 2×6.655, 2×8.706, 2×10.682, 2×12.820, 2×14.977, 2×17.286, 2×19.711, 22.498, 22.182, 25.727, 24.851, 29.748, 28.013, 34.572, 32.089, 40.637, 37.412, 45.092, 49.504]

28.0 dB: u=[1.000, 2×2.952, 2×4.969, 2×6.972, 2×9.048, 2×11.145, 2×13.331, 2×15.586, 2×17.958, 20.313, 20.628, 22.838, 23.639, 25.745, 27.254, 29.338, 31.413, 33.756, 36.326, 39.189, 42.387, 46.003, 50.241]

29.0 dB: u=[1.000, 2×2.994, 2×5.014, 2×7.048, 2×9.124, 2×11.244, 2×13.431, 2×15.694, 17.879, 18.274, 20.259, 21.134, 23.005, 24.437, 26.277, 28.091, 30.092, 32.230, 34.555, 37.093, 39.868, 42.923, 46.331, 50.284]

30.0 dB: u=[1.000, 2×3.001, 2×5.017, 2×7.054, 2×9.124, 2×11.238, 13.270, 13.576, 15.421, 16.084, 17.796, 18.910, 20.535, 21.978, 23.627, 25.285, 27.064, 28.931, 30.927, 33.057, 35.346, 37.807, 40.470, 43.372, 46.582, 50.264]

31.0 dB: u=[1.000, 2×3.003, 2×5.020, 2×7.066, 8.953, 9.409, 11.049, 11.848, 13.368, 14.480, 15.939, 17.246, 18.719, 20.155, 21.693, 23.254, 24.898, 26.606, 28.405, 30.298, 32.300, 34.422, 36.678, 39.084, 41.662, 44.449, 47.509, 50.990]

e1) 16384-QAM/64-PAM for the AWGN Channel (Maximum Penalty of 0.001 b/s/Hz)

0.0 dB: u=[63×1.000]

1.0 dB: u=[63×1.000]

2.0 dB: u=[15×1.000, 16×0.857, 16×1.303, 16×1.605]

3.0 dB: u=[31×1.000, 32×2.177]

4.0 dB: u=[31×1.000, 32×2.836]

5.0 dB: u=[31×1.000, 32×3.333]

6.0 dB: u=[31×1.000, 32×3.673]

7.0 dB: u=[31×1.000, 4.090, 3.724, 3.530, 3.724, 3.530, 3.397, 3.530, 3.724, 3.530, 3.397, 3.293, 3.397, 3.530, 3.397, 3.530, 3.724, 4.090, 3.724, 3.530, 3.724, 3.530, 3.397, 3.530, 3.724, 4.090, 3.724, 3.530, 3.724, 4.090, 3.724, 4.090, 7.483]

8.0 dB: u=[9×1.000, 1.086, 1.119, 6×1.000, 1.086, 1.119, 1.192, 1.157, 1.086, 1.119, 2×1.000, 1.086, 1.119, 4×1.000, 3.919, 4.323, 3.813, 3.592, 3.433, 3.592, 3.813, 3.592, 3.433, 3.592, 3.433, 3.318, 3.433, 3.592, 3.813, 3.592, 3.919, 4.323, 3.813, 3.592, 3.433, 3.592, 3.813, 3.592, 3.919, 4.323, 3.813, 3.592, 3.919, 4.323, 6.290, 7.685]

9.0 dB: u=[3×1.000, 4×1.114, 4×1.248, 4×1.114, 4×1.248, 4×1.394, 4×1.248, 4×1.114, 4.104, 4.287, 4.682, 4.443, 3.991, 4.104, 2×3.847, 3.661, 3.724, 2×3.847, 3.991, 4.104, 2×3.847, 4.104, 4.287, 4.628, 4.443, 3.991, 4.104, 2×3.847, 4.104, 4.287, 4.682, 4.443, 6.435, 6.296, 7.265, 8.609]

10.0 dB: u=[7×1.000, 8×1.100, 8×1.533, 8×1.382, 2×3.757, 3.919, 3.867, 3.951, 4.006, 3.867, 3.817, 3.757, 3.817, 3.919, 3.867, 3.817, 3.867, 2×3.757, 4.469, 4.599, 4.706, 4.599, 4.749, 4.856, 4.803, 4.658, 6.929, 6.735, 5.877, 5.758, 5.657, 5.839, 7.481, 9.163]

11.0 dB: u=[15×1.000, 16×1.816, 4×3.966, 4×4.096, 4×4.227, 4×4.096, 5.966, 6.208, 6.437, 6.208, 5.830, 5.966, 5.830, 5.692, 5.966, 6.208, 6.437, 6.208, 2×7.705, 8.533, 10.365]

12.0 dB: u=[15×1.000, 16×2.236, 4×4.396, 4×4.557, 4×4.736, 4×4.557, 7.107, 6.911, 7.235, 7.468, 2×6.911, 6.667, 6.766, 7.107, 6.911, 7.235, 7.468, 8.912, 8.798, 11.825, 9.973]

13.0 dB: u=[15×1.000, 16×2.596, 8×4.762, 8×5.143, 2×7.305, 6×7.514, 8.446, 8.754, 8.991, 8.754, 9.766, 10.072, 11.163, 13.220]

14.0 dB: u=[15×1.000, 16×2.848, 8×4.966, 8×5.521, 2×7.743, 2×7.911, 2×8.096, 2×7.911, 9.701, 10.719, 10.201, 2×9.701, 10.719, 12.192, 14.614]

15.0 dB: u=[15×1.000, 8×2.930, 8×3.047, 8×5.104, 8×5.752, 4×7.992, 4×8.406, 10.133, 10.253, 10.611, 10.444, 11.671, 12.109, 13.242, 15.414]

16.0 dB: u=[15×1.000, 8×2.972, 8×3.143, 8×5.168, 8×5.893, 4×8.068, 4×8.577, 2×10.450, 2×10.871, 12.299, 12.764, 14.054, 16.196]

17.0 dB: u=[15×1.000, 8×2.961, 8×3.216, 8×5.166, 4×5.909, 4×6.110, 4×8.059, 4×8.622, 2×10.511, 2×10.986, 12.590, 13.067, 14.608, 16.752]

18.0 dB: u=[7×1.000, 8×1.177, 8×3.133, 8×3.621, 8×5.565, 4×6.685, 4×6.909, 4×8.812, 2×9.388, 2×9.565, 2×11.483, 2×12.019, 13.845, 14.347, 16.199, 18.548]

19.0 dB: u=[7×1.000, 8×1.532, 8×3.491, 8×4.447, 8×6.430, 4×8.063, 4×8.330, 4×10.331, 2×11.063, 2×11.316, 2×13.369, 13.926, 14.104, 16.092, 16.659, 18.836, 21.510]

20.0 dB: u=[7×1.000, 8×2.411, 8×4.441, 8×6.165, 8×8.372, 4×10.547, 4×10.967, 4×13.310, 2×14.421, 2×14.769, 2×17.128, 2×18.007, 20.513, 21.240, 23.934, 27.213]

21.0 dB: u=[7×1.000, 8×2.827, 8×4.888, 8×6.933, 8×9.263, 4×11.584, 4×12.274, 4×14.635, 2×16.276, 2×16.686, 2×18.998, 19.963, 20.339, 22.686, 23.583, 26.399, 29.858]

22.0 dB: u=[7×1.000, 8×2.965, 8×5.040, 8×7.196, 4×9.421, 4×9.742, 4×11.903, 4×12.865, 4×15.126, 2×17.021, 2×17.604, 2×19.770, 21.150, 21.593, 23.727, 24.888, 27.571, 30.969]

23.0 dB: u=[7×1.000, 8×3.005, 8×5.082, 4×7.176, 4×7.364, 4×9.397, 4×9.983, 4×11.967, 4×13.302, 2×15.294, 2×15.482, 2×17.361, 2×18.087, 2×20.145, 21.757, 22.329, 24.290, 25.813, 28.317, 31.558]

24.0 dB: u=[7×1.000, 8×3.015, 4×5.019, 4×5.165, 4×7.085, 4×7.515, 4×9.334, 4×10.309, 4×12.090, 4×13.714, 2×15.553, 2×15.876, 2×17.670, 2×18.604, 20.453, 20.612, 22.254, 22.927, 24.801, 26.551, 28.954, 32.025]

25.0 dB: u=[7×1.000, 4×2.931, 4×3.109, 4×4.911, 4×5.337, 4×7.016, 4×7.883, 4×9.478, 4×10.821, 4×12.467, 4×14.205, 2×15.954, 2×16.491, 2×18.159, 2×19.396, 21.080, 21.339, 22.964, 23.782, 25.568, 27.419, 29.759, 32.683]

26.0 dB: u=[3×1.000, 4×1.884, 4×3.855, 4×4.927, 4×6.843, 4×8.215, 4×10.105, 4×11.782, 4×13.738, 4×15.713, 4×17.893, 2×20.090, 2×20.456, 2×22.570, 2×23.555, 2×25.674, 2×27.571, 29.725, 30.253, 32.352, 33.735, 36.025, 38.572, 41.664, 45.470]

27.0 dB: u=[3×1.000, 4×2.745, 4×4.753, 4×6.566, 4×8.609, 4×10.551, 4×12.676, 4×14.803, 4×17.089, 4×19.483, 4×22.077, 2×24.582, 2×25.344, 2×27.649, 2×29.257, 2×31.590, 33.857, 34.166, 36.468, 37.390, 39.733, 41.723, 44.342, 47.359, 50.916, 55.220]

28.0 dB: u=[3×1.000, 4×2.934, 4×4.950, 4×6.934, 4×9.004, 4×11.085, 4×13.261, 4×15.500, 4×17.856, 4×20.345, 22.742, 2×23.379, 22.742, 26.883, 2×25.549, 26.883, 28.997, 2×30.983, 28.997, 36.152, 2×33.295, 35.579, 39.681, 41.897, 44.144, 38.325, 49.799, 46.784, 53.994, 58.160]

29.0 dB: u=[3×1.000, 4×2.988, 4×5.007, 4×7.036, 4×9.114, 4×11.232, 4×13.416, 4×15.675, 17.913, 2×18.177, 17.913, 20.929, 2×20.270, 20.929, 22.896, 2×24.145, 22.896, 27.774, 2×26.034, 27.774, 29.763, 2×31.861, 29.763, 37.351, 33.987, 34.372, 36.376, 41.043, 43.147, 45.453, 39.320, 50.968, 48.048, 54.910, 58.822]

30.0 dB: u=[3×1.000, 4×3.000, 4×5.016, 4×7.051, 4×9.121, 4×11.232, 4×13.405, 2×15.470, 2×15.881, 2×17.729, 2×18.570, 2×20.295, 2×21.595, 2×23.273, 2×24.873, 2×26.639, 2×28.470, 2×30.436, 32.392, 32.711, 34.547, 35.336, 37.104, 38.513, 40.306, 42.170, 44.245, 46.527, 49.052, 51.851, 54.998, 58.656]

31.0 dB: u=[3×1.000, 4×3.003, 4×5.019, 4×7.054, 4×9.125, 2×11.057, 2×11.477, 2×13.178, 2×13.960, 2×15.535, 2×16.677, 2×18.190, 2×19.557, 2×21.091, 2×22.613, 2×24.235, 2×25.904, 2×27.669, 2×29.524, 31.360, 31.656, 33.356, 34.068, 35.686, 36.918, 38.517, 40.116, 41.883, 43.779, 45.847, 48.096, 50.551, 53.249, 56.249, 59.711]

32.0 dB: u=[3×1.000, 2×2.865, 2×3.161, 2×4.833, 2×5.325, 2×6.878, 2×7.642, 2×9.090, 2×10.097, 2×11.482, 2×12.648, 2×14.021, 2×15.290, 2×16.687, 2×18.042, 2×19.489, 2×20.937, 2×22.460, 2×24.017, 2×25.645, 2×27.335, 2×29.110, 30.844, 31.130, 32.726, 33.383, 34.885, 35.997, 37.462, 38.884, 40.452, 42.102, 43.877, 45.783, 47.836, 50.050, 52.443, 55.051, 57.933, 61.231]

33.0 dB: u=[1.000, 2×2.762, 2×4.766, 2×6.547, 2×8.555, 2×10.371, 2×12.392, 2×14.256, 2×16.299, 2×18.227, 2×20.305, 2×22.314, 2×24.444, 2×26.544, 2×28.745, 2×30.954, 2×33.252, 2×35.590, 2×38.020, 2×40.522, 2×43.123, 2×45.824, 2×48.677, 51.283, 52.328, 54.547, 56.212, 58.368, 60.435, 62.704, 65.049, 67.558, 70.213, 73.046, 76.062, 79.283, 82.728, 86.428, 90.433, 94.832, 99.852]

34.0 dB: u=[1.000, 2×2.943, 2×4.950, 2×6.907, 2×8.928, 2×10.909, 2×12.948, 2×14.965, 2×17.043, 2×19.112, 2×21.236, 2×23.367, 2×25.550, 2×27.758, 2×30.021, 2×32.328, 2×34.694, 2×37.116, 2×39.612, 2×42.186, 2×44.868, 47.318, 48.209, 50.288, 51.721, 53.703, 55.498, 57.510, 59.526, 61.671, 63.886, 66.220, 68.665, 71.237, 73.948, 76.809, 79.828, 83.024, 86.409, 90.026, 93.913, 98.160, 102.946]

35.0 dB: u=[1.000, 2×2.994, 2×5.002, 2×7.004, 2×9.027, 2×11.050, 2×13.097, 2×15.150, 2×17.233, 2×19.328, 2×21.461, 2×23.614, 2×25.805, 2×28.030, 2×30.293, 2×32.600, 2×34.961, 2×37.382, 39.631, 40.214, 42.171, 43.208, 45.028, 46.443, 48.209, 49.842, 51.639, 53.417, 55.298, 57.211, 59.205, 61.266, 63.411, 65.644, 67.971, 70.400, 72.940, 75.594, 78.374, 81.287, 84.349, 87.577, 90.999, 94.654, 98.612, 103.054]

36.0 dB: u=[1.000, 2×2.999, 2×5.002, 2×7.009, 2×9.026, 2×11.051, 2×13.089, 2×15.141, 2×17.211, 2×19.300, 2×21.411, 2×23.547, 2×25.710, 2×27.910, 2×30.167, 32.203, 32.886, 34.599, 35.652, 37.258, 38.564, 40.135, 41.577, 43.166, 44.701, 46.334, 47.954, 49.649, 51.360, 53.135, 54.946, 56.821, 58.748, 60.741, 62.799, 64.931, 67.137, 69.424, 71.796, 74.259, 76.818, 79.482, 82.261, 85.166, 88.211, 91.422, 94.837, 98.522, 102.628]

37.0 dB: u=[1.000, 2×3.000, 2×5.000, 2×7.007, 2×9.021, 2×11.041, 2×13.073, 2×15.117, 2×17.179, 2×19.282, 21.172, 21.782, 23.368, 24.275, 25.758, 26.875, 28.304, 29.538, 30.962, 32.269, 33.704, 35.065, 36.522, 37.937, 39.428, 40.895, 42.428, 43.953, 45.536, 47.126, 48.764, 50.430, 52.143, 53.885, 55.680, 57.517, 59.408, 61.348, 63.347, 65.404, 67.519, 69.702, 71.955, 74.279, 76.680, 79.165, 81.738, 84.409, 87.195, 90.105, 93.161, 96.396, 99.876, 103.730]

f1) 65536-QAM/256-PAM for the AWGN channel (maximum penalty of 0.001 b/s/Hz)

0.0 dB: u=[127×1.000]

1.0 dB: u=[127×1.000]

2.0 dB: u=[31×1.000, 32×0.857, 32×1.303, 32×1.606]

3.0 dB: u=[63×1.000, 64×2.176]

4.0 dB: u=[63×1.000, 64×2.831]

5.0 dB: u=[63×1.000, 64×3.319]

6.0 dB: u=[63×1.000, 64×3.669]

7.0 dB: u=[63×1.000, 4.286, 4.177, 2×3.723, 2×3.520, 2×3.723, 2×3.520, 2×3.382, 2×3.520, 2×3.723, 2×3.520, 2×3.382, 2×3.274, 2×3.382, 2×3.520, 2×3.382, 2×3.520, 2×3.723, 4.177, 4.059, 2×3.723, 2×3.520, 2×3.723, 2×3.520, 2×3.382, 2×3.520, 2×3.723, 4.177, 4.059, 2×3.723, 2×3.520, 2×3.723, 4.059, 3.948, 2×3.723, 4.286, 4.059, 7.660, 7.196]

8.0 dB: u=[3×1.000, 4×1.065, 4×1.135, 4×1.065, 4×1.135, 4×1.210, 4×1.135, 4×1.065, 4×1.135, 4×1.210, 2×1.307, 2×1.271, 4×1.210, 4×1.135, 4×1.210, 4×1.135, 4×1.065, 4.396, 4.265, 4.661, 4.827, 4.217, 4.131, 3.934, 3.994, 2×3.769, 3.888, 3.934, 4.217, 4.131, 3.934, 3.994, 2×3.769, 3.888, 3.934, 2×3.769, 3.639, 3.667, 2×3.769, 3.888, 3.934, 4.217, 4.131, 3.934, 3.994, 4.357, 4.217, 4.612, 4.771, 4.217, 4.131, 3.934, 3.994, 2×3.769, 3.888, 3.934, 4.217, 4.131, 3.934, 3.994, 4.396, 4.265, 4.661, 4.827, 4.217, 4.131, 3.934, 3.994, 4.396, 4.265, 4.661, 4.827, 6.875, 7.071, 8.738, 7.997]

9.0 dB: u=[7×1.000, 8×1.114, 8×1.246, 8×1.114, 8×1.246, 8×1.394, 8×1.246, 8×1.114, 4.058, 4.007, 4.126, 4.204, 4.559, 4.473, 4.282, 4.368, 2×4.007, 4.085, 4.126, 3.926, 3.893, 3.811, 3.848, 3.675, 3.648, 3.701, 3.719, 2×3.848, 3.769, 3.793, 3.926, 3.893, 2×4.007, 3.848, 3.811, 3.742, 3.769, 4.126, 4.058, 4.204, 4.282, 4.645, 4.559, 4.368, 4.446, 4.058, 4.007, 4.126, 4.169, 3.960, 3.926, 2×3.848, 4.282, 4.204, 4.389, 4.473, 4.842, 4.760, 4.559, 4.645, 6.428, 6.464, 2×6.299, 7.158, 7.425, 9.044, 8.060]

10.0 dB: u=[15×1.000, 16×1.112, 16×1.529, 16×1.366, 8×3.826, 2×4.002, 4.037, 4.002, 20×3.826, 4.387, 4.444, 4.508, 4.444, 4.652, 4.726, 4.652, 4.576, 4.698, 4.757, 4.819, 4.757, 4.605, 4.652, 4.605, 4.552, 5.668, 5.840, 6.014, 2×5.840, 5.941, 5.840, 5.713, 6.644, 2×6.764, 6.700, 7.922, 7.573, 8.152, 9.850]

11.0 dB: u=[31×1.000, 32×1.819, 8×3.973, 8×4.103, 8×4.230, 8×4.103, 6.000, 5.830, 2×6.173, 6.413, 6.316, 2×6.173, 3×5.830, 6.000, 4×5.830, 6.173, 6.000, 6.173, 6.316, 6.504, 6.413, 6.173, 6.316, 7.762, 7.561, 7.659, 7.762, 8.638, 8.805, 11.102, 9.467]

12.0 dB: u=[31×1.000, 32×2.239, 8×4.397, 8×4.560, 8×4.739, 8×4.560, 2×6.948, 7.175, 6.948, 7.345, 7.494, 7.345, 7.175, 4×6.948, 4×6.722, 2×6.948, 7.175, 6.948, 7.345, 7.494, 7.345, 7.175, 8.683, 8.878, 9.017, 8.878, 10.325, 10.078, 10.753, 12.687]

13.0 dB: u=[31×1.000, 32×2.599, 16×4.765, 16×5.147, 4×7.309, 12×7.516, 8.421, 8.513, 8.788, 8.678, 8.887, 8.993, 8.788, 8.678, 9.724, 10.019, 10.214, 10.019, 2×11.216, 12.193, 14.175]

14.0 dB: u=[31×1.000, 32×2.847, 16×4.969, 16×5.523, 8×7.770, 8×8.065, 2×9.558, 2×9.779, 2×9.973, 2×9.779, 11.057, 10.738, 11.057, 11.311, 12.391, 12.095, 15.485, 13.454]

15.0 dB: u=[31×1.000, 16×2.926, 16×3.043, 16×5.098, 16×5.749, 8×7.982, 8×8.402, 2×10.142, 2×10.256, 2×10.567, 2×10.426, 11.656, 11.941, 12.206, 11.941, 12.910, 13.365, 14.441, 16.525]

16.0 dB: u=[31×1.000, 16×2.973, 16×3.142, 16×5.170, 16×5.895, 8×8.067, 8×8.580, 4×10.456, 4×10.857, 2×12.355, 12.790, 12.637, 13.762, 14.220, 15.329, 17.384]

17.0 dB: u=[31×1.000, 16×2.960, 16×3.214, 16×5.162, 8×5.904, 8×6.106, 8×8.053, 8×8.616, 4×10.508, 4×10.968, 2×12.598, 2×13.010, 14.298, 14.760, 16.006, 18.015]

18.0 dB: u=[15×1.000, 16×1.172, 16×3.130, 16×3.608, 16×5.555, 8×6.660, 8×6.884, 8×8.787, 4×9.363, 4×9.539, 4×11.454, 4×11.982, 2×13.799, 2×14.279, 15.850, 16.337, 17.921, 20.100]

19.0 dB: u=[15×1.000, 16×1.512, 16×3.469, 16×4.404, 16×6.382, 8×7.996, 8×8.261, 8×10.249, 4×10.981, 4×11.223, 4×13.268, 4×13.898, 2×15.960, 2×16.509, 18.400, 18.930, 20.886, 23.376]

20.0 dB: u=[15×1.000, 16×2.386, 16×4.414, 16×6.118, 16×8.317, 8×10.476, 8×10.886, 8×13.219, 4×14.316, 4×14.651, 4×17.007, 4×17.863, 2×20.355, 2×21.065, 23.436, 24.086, 26.592, 29.684]

21.0 dB: u=[15×1.000, 16×2.820, 16×4.880, 16×6.919, 16×9.246, 8×11.565, 8×12.244, 8×14.603, 4×16.218, 4×16.619, 4×18.933, 2×19.883, 2×20.235, 2×22.600, 23.316, 23.603, 25.960, 26.703, 29.412, 32.727]

22.0 dB: u=[15×1.000, 16×2.962, 16×5.037, 16×7.191, 8×9.420, 8×9.735, 8×11.900, 8×12.854, 8×15.118, 4×17.008, 4×17.575, 4×19.744, 21.506, 2×21.106, 21.506, 23.668, 24.921, 24.560, 23.668, 30.643, 27.984, 27.122, 33.921]

23.0 dB: u=[15×1.000, 16×3.005, 16×5.084, 8×7.181, 8×7.363, 8×9.405, 8×9.977, 8×11.970, 8×13.288, 4×15.288, 4×15.470, 4×17.349, 4×18.064, 4×20.124, 2×21.729, 2×22.257, 2×24.230, 25.455, 25.897, 27.844, 28.971, 31.440, 34.588]

24.0 dB: u=[15×1.000, 16×3.015, 16×5.093, 8×7.092, 8×7.505, 8×9.336, 8×10.290, 8×12.080, 8×13.695, 4×15.539, 4×15.847, 4×17.647, 4×18.557, 2×20.416, 2×20.561, 2×22.200, 2×22.835, 2×24.707, 26.150, 26.691, 28.485, 29.923, 32.234, 35.223]

25.0 dB: u=[15×1.000, 8×2.937, 8×3.101, 8×4.918, 8×5.319, 8×7.013, 8×7.850, 8×9.457, 8×10.784, 8×12.431, 4×14.084, 4×14.241, 4×15.914, 4×16.431, 4×18.103, 4×19.312, 2×21.003, 2×21.239, 2×22.865, 2×23.634, 25.351, 25.491, 26.977, 27.597, 29.327, 30.957, 33.192, 36.048]

26.0 dB: u=[7×1.000, 8×1.751, 8×3.715, 8×4.672, 8×6.564, 8×7.850, 8×9.697, 8×11.309, 8×13.208, 8×15.117, 8×17.229, 4×19.360, 4×19.701, 4×21.756, 4×22.685, 4×24.742, 4×26.554, 2×28.644, 2×29.115, 2×31.151, 2×32.415, 2×34.639, 36.730, 37.664, 39.858, 42.102, 44.969, 48.567]

27.0 dB: u=[7×1.000, 8×2.720, 8×4.728, 8×6.519, 8×8.560, 8×10.483, 8×12.601, 8×14.713, 8×16.990, 8×19.369, 4×21.831, 4×22.068, 4×24.451, 4×25.169, 4×27.482, 4×29.033, 4×31.365, 2×33.614, 2×33.889, 2×36.197, 2×37.046, 2×39.387, 2×41.287, 43.650, 44.168, 46.467, 47.908, 50.441, 53.239, 56.649, 60.853]

28.0 dB: u=[7×1.000, 8×2.928, 8×4.944, 8×6.920, 8×8.990, 8×11.065, 8×13.238, 8×15.473, 8×17.828, 8×20.314, 4×22.720, 4×23.310, 4×25.501, 4×26.777, 4×28.909, 4×30.873, 4×33.178, 2×35.463, 2×35.988, 2×38.173, 2×39.456, 2×41.675, 2×43.881, 46.184, 47.022, 49.238, 51.105, 53.590, 56.454, 59.836, 63.927]

29.0 dB: u=[7×1.000, 8×2.986, 8×5.004, 8×7.032, 8×9.109, 8×11.223, 8×13.408, 8×15.666, 8×18.031, 4×20.270, 4×20.866, 4×22.862, 4×24.045, 4×25.955, 4×27.666, 4×29.653, 4×31.738, 2×33.870, 2×34.214, 2×36.235, 2×37.137, 2×39.119, 2×40.782, 2×42.873, 44.936, 45.426, 47.419, 48.625, 50.667, 52.731, 55.171, 57.969, 61.203, 65.058]

30.0 dB: u=[7×1.000, 8×3.001, 8×5.020, 8×7.057, 8×9.131, 8×11.246, 8×13.421, 4×15.511, 4×15.856, 4×17.754, 4×18.499, 4×20.268, 4×21.504, 4×23.204, 4×24.782, 4×26.549, 4×28.369, 4×30.330, 4×32.432, 2×34.436, 2×35.132, 2×36.929, 2×38.256, 2×40.052, 2×41.875, 43.791, 44.084, 45.917, 46.719, 48.534, 50.063, 51.990, 54.102, 56.491, 59.187, 62.258, 65.870]

31.0 dB: u=[7×1.000, 8×3.003, 8×5.019, 8×7.054, 8×9.122, 4×11.083, 4×11.411, 4×13.173, 4×13.832, 4×15.460, 4×16.513, 4×18.052, 4×19.381, 4×20.921, 4×22.424, 4×24.042, 4×25.699, 4×27.454, 4×29.296, 2×31.145, 2×31.379, 2×33.117, 2×33.719, 2×35.368, 2×36.504, 2×38.110, 2×39.660, 2×41.401, 2×43.273, 45.088, 45.674, 47.329, 48.513, 50.173, 51.856, 53.758, 55.858, 58.191, 60.789, 63.713, 67.116]

32.0 dB: u=[7×1.000, 8×3.006, 4×4.882, 4×5.206, 4×6.874, 4×7.455, 4×8.995, 4×9.879, 4×11.320, 4×12.434, 4×13.833, 4×15.084, 4×16.495, 4×17.846, 4×19.301, 4×20.747, 4×22.273, 4×23.829, 4×25.460, 4×27.149, 4×28.924, 2×30.680, 2×30.909, 2×32.549, 2×33.106, 2×34.649, 2×35.673, 2×37.158, 2×38.541, 2×40.098,

2×41.722, 2×43.483, 45.193, 45.624, 47.191, 48.124, 49.644, 51.049, 52.674, 54.418, 56.330, 58.425, 60.723, 63.256, 66.083, 69.345]

33.0 dB: u=[3×1.000, 4×2.712, 4×4.714, 4×6.435, 4×8.443, 4×10.207, 4×12.226, 4×14.042, 4×16.079, 4×17.969, 4×20.039, 4×22.012, 4×24.125, 4×26.187, 4×28.366, 4×30.537, 4×32.808, 4×35.112, 4×37.514, 4×39.982, 4×42.543, 4×45.207, 4×48.003, 2×50.621, 2×51.414, 2×53.704, 2×55.153, 2×57.335, 2×59.292, 2×61.525, 2×63.798, 2×66.245, 2×68.838, 71.379, 71.892, 74.225, 75.393, 77.634, 79.518, 81.802, 84.144, 86.728, 89.497, 92.509, 95.768, 99.325, 103.203, 107.495, 112.416]

34.0 dB: u=[3×1.000, 4×2.925, 4×4.928, 4×6.864, 4×8.882, 4×10.844, 4×12.883, 4×14.882, 4×16.950, 4×18.995, 4×21.107, 4×23.219, 4×25.393, 4×27.583, 4×29.835, 4×32.125, 4×34.479, 4×36.888, 4×39.369, 4×41.925, 4×44.576, 2×47.066, 2×47.686, 2×49.882, 2×51.053, 2×53.110, 2×54.771, 2×56.793, 2×58.742, 2×60.857, 2×63.018, 2×65.307, 2×67.698, 2×70.232, 72.669, 73.235, 75.434, 76.617, 78.702, 80.475, 82.580, 84.717, 87.028, 89.485, 92.117, 94.936, 97.958, 101.203, 104.696, 108.486, 112.652, 117.394]

35.0 dB: u=[3×1.000, 4×2.984, 4×4.987, 4×6.980, 4×8.997, 4×11.011, 4×13.053, 4×15.099, 4×17.174, 4×19.263, 4×21.385, 4×23.530, 4×25.714, 4×27.928, 4×30.187, 4×32.490, 4×34.843, 4×37.251, 4×39.735, 2×42.025, 2×42.685, 2×44.664, 2×45.803, 2×47.654, 2×49.164, 2×50.979, 2×52.698, 2×54.564, 2×56.433, 2×58.403, 2×60.420, 2×62.532, 2×64.719, 2×67.010, 2×69.421, 71.662, 72.402, 74.352, 75.647, 77.507, 79.204, 81.118, 83.067, 85.144, 87.321, 89.634, 92.084, 94.688, 97.451, 100.380, 103.497, 106.828, 110.418, 114.336, 118.759]

36.0 dB: u=[3×1.000, 4×2.989, 4×4.993, 4×6.994, 4×8.995, 4×11.008, 4×13.043, 4×15.093, 4×17.158, 4×19.243, 4×21.356, 4×23.490, 4×25.650, 4×27.841, 4×30.070, 4×32.352, 2×34.445, 2×35.035, 2×36.831, 2×37.816, 2×39.484, 2×40.779, 2×42.392, 2×43.861, 2×45.497, 2×47.077, 2×48.747, 2×50.422, 2×52.167, 2×53.931, 2×55.770, 2×57.663, 2×59.621, 2×61.639, 2×63.727, 2×65.895, 67.940, 68.443, 70.252, 71.226, 72.922, 74.300, 75.964, 77.595, 79.344, 81.138, 83.037, 85.014, 87.092, 89.253, 91.537, 93.932, 96.465, 99.108, 101.914, 104.876, 108.021, 111.366, 115.037, 119.139]

37.0 dB: u=[3×1.000, 4×2.997, 4×4.999, 4×7.007, 4×9.024, 4×11.050, 4×13.079, 4×15.122, 4×17.181, 4×19.254, 4×21.355, 4×23.489, 2×25.434, 2×25.952, 2×27.628, 2×28.491, 2×30.036, 2×31.166, 2×32.647, 2×33.919, 2×35.392, 2×36.746, 2×38.224, 2×39.653, 2×41.171, 2×42.666, 2×44.228, 2×45.790, 2×47.404, 2×49.033, 2×50.711, 2×52.418, 2×54.177, 2×55.990, 2×57.840, 2×59.741, 2×61.705, 2×63.727, 65.629, 66.118, 67.778, 68.666, 70.226, 71.454, 72.968, 74.399, 75.939, 77.501, 79.147, 80.824, 82.585, 84.404, 86.299, 88.276, 90.339, 92.487, 94.730, 97.075, 99.520, 102.070, 104.762, 107.588, 110.586, 113.773, 117.223, 121.065]

38.0 dB: u=[3×1.000, 4×3.005, 4×5.009, 4×7.018, 4×9.035, 4×11.062, 2×12.915, 2×13.430, 2×15.010, 2×15.838, 2×17.310, 2×18.358, 2×19.754, 2×20.913, 2×22.250, 2×23.456, 2×24.787, 2×26.031, 2×27.410, 2×28.692, 2×30.072, 2×31.374, 2×32.766, 2×34.142, 2×35.581, 2×36.981, 2×38.440, 2×39.894, 2×41.388, 2×42.911, 2×44.446, 2×45.974, 2×47.559, 2×49.143, 2×50.785, 2×52.468, 2×54.185, 2×55.946, 2×57.729, 2×59.552, 2×61.410, 2×63.338, 65.129, 65.640, 67.190, 68.061, 69.490, 70.624, 72.051, 73.323, 74.748, 76.151, 77.669, 79.176, 80.748, 82.337, 83.995, 85.730, 87.490, 89.327, 91.257, 93.258, 95.308, 97.438, 99.656, 101.980, 104.390, 106.909, 109.574, 112.319, 115.237, 118.346, 121.697, 125.593]

39.0 dB: u=[1.000, 2×2.751, 2×4.747, 2×6.496, 2×8.486, 2×10.232, 2×12.231, 2×13.997, 2×15.998, 2×17.792, 2×19.801, 2×21.616, 2×23.631, 2×25.469, 2×27.492, 2×29.361, 2×31.393, 2×33.296, 2×35.349, 2×37.291, 2×39.360, 2×41.336, 2×43.420, 2×45.435, 2×47.548, 2×49.608, 2×51.754, 2×53.869, 2×56.063, 2×58.237, 2×60.470, 2×62.701, 2×64.988, 2×67.283, 2×69.626, 2×71.986, 2×74.402, 2×76.842, 2×79.328, 2×81.856, 2×84.445, 2×87.089, 2×89.779, 2×92.518, 2×95.321, 2×98.201, 2×101.204, 103.860, 105.067, 107.214, 108.859, 110.936, 112.827, 114.927, 116.964, 119.123, 121.275, 123.524, 125.798, 128.155, 130.567, 133.060, 135.620, 138.265, 140.991, 143.813, 146.722, 149.727, 152.824, 156.032, 159.353, 162.784, 166.332, 170.024, 173.856, 177.846, 182.017, 186.406, 191.051, 196.029, 201.527]

40.0 dB: u=[1.000, 2×2.968, 2×5.011, 2×7.027, 2×9.111, 2×11.119, 2×13.194, 2×15.207, 2×17.290, 2×19.326, 2×21.413, 2×23.450, 2×25.542, 2×27.597, 2×29.706, 2×31.783, 2×33.910, 2×36.005, 2×38.150, 2×40.263, 2×42.417, 2×44.591, 2×46.807, 2×49.019, 2×51.263, 2×53.505, 2×55.784, 2×58.072, 2×60.405, 2×62.733, 2×65.112, 2×67.506, 2×69.909, 2×72.329, 2×74.805, 2×77.307, 2×79.848, 2×82.426, 2×85.060, 2×87.718, 2×90.448, 2×93.242, 2×96.116, 98.718, 99.591, 101.733, 103.090, 105.112, 106.717, 108.719, 110.488, 112.474, 114.411, 116.467, 118.479, 120.599, 122.739, 124.950, 127.193, 129.496, 131.814, 134.178, 136.585, 139.086, 141.643, 144.315, 147.044, 149.863, 152.735, 155.692, 158.704, 161.825, 165.014, 168.299, 171.634, 175.110, 178.675, 182.371, 186.233, 190.233, 194.388, 198.750, 203.386, 208.349, 213.825]

g1) 262144-QAM/512-PAM for the AWGN Channel (Maximum Penalty of 0.001 b/s/Hz)

0.0 dB: u=[255×1.000]

1.0 dB: u=[255×1.000]

2.0 dB: u=[63×1.000, 64×0.857, 64×1.303, 64×1.606]

3.0 dB: u=[127×1.000, 128×2.176]

4.0 dB: u=[127×1.000, 128×2.828]

5.0 dB: u=[127×1.000, 128×3.320]

6.0 dB: u=[127×1.000, 128×3.670]

7.0 dB: u=[127×1.000, 8×3.947, 8×3.557, 8×3.337, 8×3.557, 12×3.337, 4×3.143, 8×3.337, 8×3.557, 8×3.947, 8×3.557, 8×3.337, 8×3.557, 8×3.947, 8×3.557, 8×3.947, 4×5.263, 7.660, 7.231, 7.040, 7.405]

8.0 dB: u=[3×1.000, 4×0.943, 6×1.000, 10×1.106, 4×1.000, 28×1.106, 4×1.000, 20×1.106, 2×1.267, 2×1.252, 2×1.210, 2×1.230, 6×1.106, 2×1.210, 24×1.106, 4×1.000, 4×1.106, 2×4.027, 2×4.123, 2×4.524, 2×4.349, 2×4.027, 2×4.123, 2×3.889, 2×3.812, 2×3.615, 2×3.651, 2×3.812, 2×3.736, 2×3.889, 2×3.977, 2×3.768, 2×3.707, 2×3.561, 2×3.615, 2×3.736, 2×3.676, 2×3.587, 2×3.615, 2×3.520, 2×3.486, 2×3.615, 2×3.676, 2×3.812, 2×3.768, 2×3.921, 2×4.027, 2×3.812, 2×3.736, 2×4.027, 2×4.193, 2×4.639, 2×4.445, 2×4.027, 2×4.145, 2×3.889, 2×3.812, 2×3.615, 2×3.676, 2×3.812, 2×3.768, 2×3.939, 2×4.027, 2×3.812, 2×3.736, 2×4.027, 2×4.162, 2×4.600, 2×4.412, 2×4.027, 2×4.123, 2×3.889, 2×3.812, 2×4.193, 2×4.373, 2×4.871, 2×4.676, 2×6.703, 2×6.571, 2×7.684, 8.471, 8.491]

9.0 dB: u=[15×1.000, 16×1.116, 16×1.253, 16×1.116, 16×1.253, 16×1.401, 16×1.253, 16×1.116, 4.064, 4.094, 2×4.139, 4.301, 4.340, 4.264, 4.233, 4.556, 4.598, 4.684, 4.640, 4.435, 4.476, 4.396, 4.363, 2×3.993, 4.041, 4.023, 2×4.139, 2×4.094, 2×3.915, 2×3.950, 3×3.864, 3.802, 3.648, 3.671, 6×3.720, 4×3.864, 4×3.802, 2×3.950, 2×3.993, 2×4.094, 4.064, 4.041, 2×3.864, 3.915, 3.864, 4×3.802, 2×4.094, 4.172, 4.139, 4.301, 4.340, 4.264, 4.233, 4.556, 4.598, 4.684, 4.640, 4.435, 4.476, 4.396, 4.363, 2×3.993, 4.041, 4.023, 2×4.139, 2×4.094, 2×3.915, 2×3.950, 3×3.864, 3.802, 4.139, 4.172, 4.233, 4.207, 4.396, 4.435, 4.340, 4.301, 4.660, 4.706, 4.793, 4.747, 4.537, 4.580, 4.498, 4.459, 6.404, 6.449, 6.485, 6.449, 6.347, 6.377, 6.347, 6.318, 7.465, 7.367, 7.202, 7.259, 8.254, 7.911, 8.572, 9.660]

10.0 dB: u=[31×1.000, 32×1.113, 32×1.526, 32×1.360, 8×3.762, 8×3.877, 2×3.996, 2×4.020, 2×4.045, 2×4.020, 24×3.877, 16×3.762, 2×4.372, 2×4.411, 2×4.477, 2×4.433, 2×4.638, 2×4.693, 2×4.605, 2×4.549, 2×4.693, 2×4.748, 2×4.804, 2×4.748, 2×4.605, 2×4.638, 2×4.580, 2×4.549, 5.708, 5.645, 5.798, 5.859, 6.006, 5.937, 5.798, 2×5.859, 5.798, 5.895, 5.937, 5.859, 5.798, 5.708, 5.753, 6.784, 6.643, 6.746, 6.859, 6.828, 6.746, 6.675, 6.784, 2×7.887, 7.587, 7.633, 8.134, 8.261, 10.507, 9.022]

11.0 dB: u=[63×1.000, 64×1.816, 16×3.970, 16×4.100, 16×4.229, 16×4.100, 4×5.873, 4×6.099, 4×6.305, 4×6.099, 12×5.873, 4×5.704, 4×6.099, 6.407, 3×6.305, 6.522, 6.459, 6.522, 6.590, 6.407, 3×6.305, 7.724, 7.525, 7.724, 7.904, 7.836, 7.724, 7.602, 7.724, 8.598, 8.549, 2×8.671, 9.536, 10.170, 11.840, 9.833]

12.0 dB: u=[63×1.000, 64×2.231, 16×4.387, 16×4.550, 16×4.729, 16×4.550, 4×6.806, 4×7.031, 4×7.305, 4×7.031, 4×6.806, 4×7.031, 4×6.806, 4×6.667, 4×7.031, 2×7.305, 2×7.031, 2×7.495, 2×7.574, 4×7.305, 8.613, 8.786, 8.930, 8.786, 8.930, 9.037, 8.930, 8.786, 10.001, 10.204, 10.145, 10.001, 11.011, 10.903, 11.673, 13.547]

13.0 dB: u=[63×1.000, 64×2.597, 32×4.765, 32×5.145, 8×7.311, 24×7.518, 2×8.428, 2×8.501, 4×8.725, 2×8.889, 2×8.974, 4×8.725, 9.719, 9.842, 10.134, 9.960, 10.134, 10.252, 10.058, 9.960, 11.011, 2×11.372, 11.177, 12.225, 12.296, 13.208, 15.101]

14.0 dB: u=[63×1.000, 64×2.845, 32×4.965, 32×5.519, 16×7.766, 16×8.055, 4×9.548, 4×9.781, 4×9.978, 4×9.781, 10.661, 10.803, 10.989, 10.803, 11.128, 11.269, 11.128, 10.989, 12.045, 12.310, 12.502, 12.310, 13.980, 13.589, 13.980, 16.380]

15.0 dB: u=[63×1.000, 32×2.927, 32×3.044, 32×5.101, 32×5.750, 16×7.983, 16×8.407, 8×10.192, 4×10.573, 4×10.441, 2×11.695, 2×11.938, 2×12.168, 2×11.938, 13.243, 12.933, 13.243, 13.504, 14.591, 14.274, 17.564, 15.583]

16.0 dB: u=[63×1.000, 32×2.972, 32×3.143, 32×5.169, 32×5.896, 16×8.069, 16×8.582, 8×10.457, 8×10.858, 4×12.369, 4×12.698, 13.754, 13.934, 14.289, 14.078, 15.039, 15.482, 16.504, 18.483]

17.0 dB: u=[63×1.000, 32×2.958, 32×3.211, 32×5.161, 16×5.901, 16×6.102, 16×8.051, 16×8.614, 8×10.503, 8×10.964, 4×12.593, 4×12.995, 2×14.330, 2×14.702, 16.168, 15.721, 19.168, 17.239]

18.0 dB: u=[31×1.000, 32×1.168, 32×3.124, 32×3.598, 32×5.538, 16×6.635, 16×6.858, 16×8.756, 8×9.328, 8×9.499, 8×11.412, 8×11.937, 4×13.759, 4×14.221, 2×15.819, 2×16.250, 18.040, 17.558, 21.402, 19.352]

19.0 dB: u=[31×1.000, 32×1.500, 32×3.456, 32×4.378, 32×6.353, 16×7.956, 16×8.220, 16×10.203, 8×10.927, 8×11.171, 8×13.206, 8×13.837, 4×15.887, 4×16.424, 2×18.302, 2×18.807, 20.987, 20.461, 25.040, 22.702]

20.0 dB: u=[31×1.000, 32×2.373, 32×4.399, 32×6.090, 32×8.284, 16×10.437, 16×10.846, 16×13.176, 8×14.259, 8×14.597, 8×16.947, 8×17.804, 4×20.278, 4×20.976, 2×23.328, 2×23.954, 26.141, 26.753, 29.044, 31.968]

21.0 dB: u=[31×1.000, 32×2.814, 32×4.875, 32×6.911, 32×9.236, 16×11.555, 16×12.232, 16×14.594, 8×16.207, 8×16.608, 8×18.921, 4×19.881, 4×20.211, 4×22.584, 2×23.284, 2×23.552, 2×25.918, 26.528, 26.743, 29.034, 29.701, 32.271, 35.440]

22.0 dB: u=[31×1.000, 32×2.962, 32×5.038, 32×7.192, 16×9.421, 16×9.730, 16×11.897, 16×12.838, 16×15.104, 8×16.985, 8×17.546, 8×19.715, 4×21.065, 4×21.458, 4×23.625, 4×24.678, 2×27.073, 27.750, 28.046, 30.270, 31.004, 33.592, 36.773]

23.0 dB: u=[31×1.000, 32×3.004, 32×5.080, 16×7.173, 16×7.351, 16×9.392, 16×9.957, 16×11.949, 16×13.259, 8×15.258, 8×15.436, 8×17.312, 8×18.020, 8×20.076, 4×21.673, 4×22.198, 4×24.166, 2×25.397, 2×25.786, 2×27.759, 28.615, 28.978, 30.980, 31.841, 34.296, 37.350]

24.0 dB: u=[31×1.000, 32×3.014, 16×5.023, 16×5.159, 16×7.091, 16×7.497, 16×9.330, 16×10.272, 16×12.064, 16×13.671, 8×15.517, 8×15.820, 8×17.622, 8×18.521, 4×20.385, 4×20.522, 4×22.155, 4×22.780, 4×24.646, 2×26.081, 2×26.589, 2×28.388, 29.563, 29.993, 31.769, 32.893, 35.174, 38.095]

25.0 dB: u=[31×1.000, 16×2.940, 16×3.098, 16×4.921, 16×5.312, 16×7.013, 16×7.837, 16×9.450, 16×10.770, 16×12.418, 8×14.070, 8×14.223, 8×15.900, 8×16.405, 8×18.082, 8×19.278, 4×20.973, 4×21.201, 4×22.827, 4×23.579, 4×25.364, 2×26.908, 2×27.491, 2×29.218, 30.551, 31.089, 32.749, 34.169, 36.333, 39.127]

26.0 dB: u=[15×1.000, 16×1.702, 16×3.663, 16×4.577, 16×6.460, 16×7.711, 16×9.543, 16×11.127, 16×13.004, 16×14.886, 16×16.970, 8×19.076, 8×19.408, 8×21.441, 8×22.350, 8×24.384, 8×26.166, 4×28.230, 4×28.684, 4×30.692, 4×31.919, 4×34.104, 2×36.154, 2×37.025, 2×39.192, 41.808, 41.055, 45.921, 43.913, 52.126, 48.648]

27.0 dB: u=[15×1.000, 16×2.712, 16×4.720, 16×6.502, 16×8.541, 16×10.457, 16×12.572, 16×14.678, 16×16.952, 16×19.327, 8×21.787, 8×22.018, 8×24.404, 8×25.107, 8×27.423, 8×28.953, 8×31.285, 4×33.527, 4×33.789, 4×36.101, 4×36.924, 4×39.264, 4×41.128, 2×43.494, 2×43.960, 2×46.262, 2×47.600, 49.983, 50.301, 52.511, 53.594, 56.099, 58.700, 61.998, 66.125]

28.0 dB: u=[15×1.000, 16×2.925, 16×4.941, 16×6.916, 16×8.986, 16×11.060, 16×13.234, 16×15.469, 16×17.825, 16×20.309, 8×22.722, 8×23.293, 8×25.494, 8×26.748, 8×28.887, 8×30.842, 8×33.144, 4×35.433, 4×35.931, 4×38.129, 4×39.369, 4×41.592, 4×43.771, 2×46.069, 2×46.857, 2×49.074, 2×50.879, 53.115, 53.656, 55.838, 57.297, 59.712, 62.427, 65.708, 69.732]

29.0 dB: u=[15×1.000, 16×2.986, 16×5.004, 16×7.031, 16×9.107, 16×11.222, 16×13.406, 16×15.664, 16×18.029, 8×20.275, 8×20.849, 8×22.859, 8×24.018, 8×25.937, 8×27.635, 8×29.625, 8×31.704, 4×33.840, 4×34.163, 4×36.195, 4×37.060, 4×39.052, 4×40.683, 4×42.770, 2×44.829, 2×45.277, 2×47.279, 2×48.412, 2×50.460, 2×52.488, 54.607, 55.423, 57.466, 59.252, 61.568, 64.245, 67.398, 71.190]

30.0 dB: u=[15×1.000, 16×3.000, 16×5.018, 16×7.055, 16×9.127, 16×11.242, 16×13.417, 8×15.516, 8×15.837, 8×17.752, 8×18.464, 8×20.249, 8×21.458, 8×23.166, 8×24.734, 8×26.502, 8×28.318, 8×30.275, 4×32.248, 4×32.494, 4×34.378, 4×35.040, 4×36.847, 4×38.139, 4×39.936, 4×41.741, 2×43.658, 2×43.918, 2×45.761, 2×46.504, 2×48.325, 2×49.795, 2×51.707, 53.582, 54.049, 55.870, 57.015, 58.892, 60.818, 63.085, 65.678, 68.671, 72.224]

31.0 dB: u=[15×1.000, 16×3.004, 16×5.022, 16×7.058, 16×9.127, 8×11.102, 8×11.399, 8×13.186, 8×13.802, 8×15.453, 8×16.471, 8×18.024, 8×19.340, 8×20.885, 8×22.385, 8×24.005, 8×25.661, 8×27.417, 8×29.257, 8×31.220, 4×33.083, 4×33.649, 4×35.315, 4×36.413, 4×38.029, 4×39.562, 4×41.296, 4×43.152, 45.493, 2×44.972, 45.493, 47.165, 2×48.274, 47.165, 51.578, 2×49.934, 51.578, 53.335, 56.033, 55.292, 53.603, 60.926, 59.134, 57.713, 62.892, 65.125, 67.640, 70.498, 73.850]

32.0 dB: u=[15×1.000, 16×3.005, 8×4.908, 8×5.161, 8×6.887, 8×7.370, 8×8.962, 8×9.757, 8×11.234, 8×12.302, 8×13.719, 8×14.955, 8×16.370, 8×17.714, 8×19.171, 8×20.614, 8×22.140, 8×23.693, 8×25.323, 8×27.010, 8×28.781, 8×30.645, 4×32.410, 4×32.908, 4×34.477, 4×35.442, 4×36.940, 4×38.292, 4×39.842, 4×41.448, 4×43.189, 2×45.289, 2×44.884, 2×47.764, 2×46.841, 53.997, 52.911, 2×49.337, 50.457, 50.853, 52.293, 54.790, 56.162, 57.253, 58.569, 59.839, 61.331, 62.910, 64.688, 66.658, 68.856, 71.307, 74.064, 77.281]

33.0 dB: u=[7×1.000, 8×2.671, 8×4.671, 8×6.365, 8×8.369, 8×10.104, 8×12.117, 8×13.910, 8×15.938, 8×17.803, 8×19.859, 8×21.807, 8×23.908, 8×25.954, 8×28.118, 8×30.273, 8×32.527, 8×34.812, 8×37.193, 8×39.640, 8×42.187, 8×44.830, 8×47.603, 4×50.209, 4×50.944, 4×53.244, 4×54.628, 4×56.810, 4×58.730, 4×60.946, 4×63.195, 4×65.615, 4×68.173, 4×70.932, 74.532, 2×73.509, 74.532, 76.790, 2×78.556, 76.790, 83.087, 2×80.809, 83.087, 85.598, 88.583, 88.088, 85.598, 94.351, 92.089, 90.910, 96.334, 98.719, 101.263, 104.055, 107.127, 110.507, 114.236, 118.403, 123.217]

34.0 dB: u=[7×1.000, 8×2.914, 8×4.916, 8×6.843, 8×8.857, 8×10.809, 8×12.844, 8×14.833, 8×16.899, 8×18.938, 8×21.048, 8×23.152, 8×25.320, 8×27.503, 8×29.750, 8×32.031, 8×34.378, 8×36.780, 8×39.256, 8×41.805, 8×44.445, 2×47.481, 4×46.956, 2×47.481, 2×49.726, 4×50.782, 2×49.726, 2×54.471, 4×52.878, 2×54.471, 2×56.502, 4×58.420, 2×56.502, 2×62.669, 4×60.526, 2×62.669, 2×64.944, 4×67.320, 2×64.944, 72.280, 72.752, 4×69.834, 72.752, 72.280, 76.035, 74.989, 79.841, 2×78.155, 79.841, 74.989, 76.035, 86.310, 88.727, 81.940, 2×84.029, 81.940, 88.727, 86.310, 93.788, 91.344, 100.837, 98.677, 96.943, 103.055, 91.344, 94.806, 110.962, 108.113, 105.490, 114.056, 117.423, 125.860, 121.784, 131.079]

35.0 dB: u=[7×1.000, 8×2.981, 8×4.987, 8×6.981, 8×9.003, 8×11.018, 8×13.062, 8×15.108, 8×17.187, 8×19.278, 8×21.406, 8×23.557, 8×25.746, 8×27.966, 8×30.232, 8×32.540, 8×34.900, 8×37.313, 8×39.797, 2×42.669, 4×42.122, 2×42.669, 2×44.713, 4×45.729, 2×44.713, 2×49.074, 4×47.629, 2×49.074, 2×50.909, 4×52.605, 2×50.909, 2×56.337, 4×54.478, 2×56.337, 2×58.305, 4×60.312, 2×58.305, 2×64.599, 4×62.418, 2×64.599, 2×66.884, 4×69.276, 2×66.884, 75.270, 74.142, 72.123, 2×71.548, 72.123, 74.142, 75.270, 77.176, 78.793, 80.702, 2×82.610, 80.702, 78.793, 77.176, 91.541, 89.091, 86.808, 2×84.662, 86.808, 89.091, 91.541, 94.774, 96.714, 102.167, 104.297, 106.543, 100.217, 98.282, 93.804, 109.837, 112.437, 115.236, 118.244, 121.484, 124.992, 128.852, 133.258]

36.0 dB: u=[7×1.000, 8×2.995, 8×4.999, 8×7.002, 8×9.018, 8×11.040, 8×13.080, 8×15.131, 8×17.204, 8×19.293, 8×21.407, 8×23.545, 8×25.713, 8×27.912, 8×30.149, 8×32.430, 4×34.571, 4×35.008, 4×36.899, 4×37.712, 4×39.460, 4×40.650, 4×42.307, 4×43.732, 4×45.378, 4×46.938, 4×48.623, 4×50.288, 4×52.040, 4×53.808, 4×55.649, 4×57.531, 4×59.484, 4×61.496, 4×63.583, 4×65.750, 2×67.835, 2×68.223, 2×70.106, 2×70.917, 2×72.674, 2×73.951, 2×75.641, 2×77.214, 2×78.951, 2×80.708, 2×82.571, 2×84.504, 2×86.538, 2×88.675, 90.723, 91.214, 93.050, 94.050, 95.786, 97.254, 98.989, 100.734, 102.613, 104.584, 106.689, 113.802, 111.288, 108.919, 120.898, 123.947, 117.440, 127.766, 131.367, 135.439]

37.0 dB: u=[7×1.000, 8×3.001, 8×5.008, 8×7.019, 8×9.038, 8×11.065, 8×13.103, 8×15.154, 8×17.220, 8×19.304, 8×21.411, 8×23.544, 4×25.544, 4×25.918, 4×27.690, 4×28.369, 4×30.004, 4×31.008, 4×32.542, 4×33.763, 4×35.259, 4×36.599, 4×38.099, 4×39.516, 4×41.044, 4×42.525, 4×44.090, 4×45.639, 4×47.255, 4×48.875, 4×50.555, 4×52.257, 4×54.014, 4×55.808, 4×57.656, 4×59.551, 4×61.505, 4×63.519, 4×65.615, 2×67.539, 2×68.172, 2×69.820, 2×70.876, 2×72.431, 2×73.781, 2×75.335, 2×76.852, 2×78.474, 2×80.123, 2×81.852, 2×83.635, 2×85.500, 2×87.443, 2×89.489, 92.010, 91.388, 94.747, 93.660, 97.737, 96.313, 103.229, 99.393, 100.814, 104.883, 106.781, 113.061, 110.859, 108.763, 116.322, 124.129, 121.377, 118.778, 127.812, 130.946, 134.362, 138.194]

38.0 dB: u=[7×1.000, 8×3.002, 8×5.006, 8×7.014, 8×9.029, 8×11.058, 4×12.967, 4×13.265, 4×14.976, 4×15.505, 4×17.085, 4×17.893, 4×19.361, 4×20.381, 4×21.786, 4×22.926, 4×24.309, 4×25.515, 4×26.897, 4×28.151, 4×29.543, 4×30.842, 4×32.252, 4×33.596, 4×35.028, 4×36.415, 4×37.872, 4×39.303, 4×40.792, 4×42.271, 4×43.801, 4×45.335, 4×46.913, 4×48.506, 4×50.143, 4×51.803, 4×53.503, 4×55.235, 4×57.011, 4×58.828, 4×60.693, 4×62.608, 64.448, 2×64.736, 64.448, 67.000, 2×66.403, 67.000, 68.541, 2×69.509, 68.541, 72.186, 2×70.960, 72.186, 73.620, 2×74.990, 73.620, 77.947, 2×76.468, 77.947, 79.500, 2×81.083, 79.500, 84.418, 2×82.728, 84.418, 86.174, 2×87.990, 86.174, 92.090, 2×89.885, 91.685, 94.487, 95.983, 97.152, 93.690, 103.036, 98.609, 99.994, 101.507, 106.325, 108.078, 109.911, 104.651, 118.138, 111.829, 113.835, 115.937, 128.074, 125.397, 122.861, 120.442, 131.362, 134.383, 137.650, 141.301]

39.0 dB: u=[3×1.000, 4×2.677, 4×4.676, 4×6.358, 4×8.358, 4×10.052, 4×12.052, 4×13.763, 4×15.766, 4×17.496, 4×19.500, 4×21.256, 4×23.265, 4×25.051, 4×27.068, 4×28.889, 4×30.915, 4×32.771, 4×34.811, 4×36.704, 4×38.758, 4×40.692, 4×42.764, 4×44.742, 4×46.842, 4×48.867, 4×50.993, 4×53.065, 4×55.226, 4×57.356, 4×59.561, 4×61.751, 4×64.007, 4×66.265, 4×68.580, 4×70.908, 4×73.288, 4×75.693, 4×78.153, 4×80.645, 4×83.188, 4×85.774, 4×88.419, 4×91.119, 4×93.883, 4×96.712, 4×99.628, 2×102.293, 2×103.123, 2×105.396, 2×106.752, 2×108.879, 2×110.615, 2×112.699, 2×114.641, 2×116.762, 2×118.842, 2×121.042, 2×123.251, 2×125.552, 2×127.896, 2×130.328, 2×132.821, 2×135.397, 2×138.050, 2×140.796, 2×143.654, 146.290, 147.139, 149.400, 150.834, 152.970, 154.819, 156.948, 159.021, 161.239, 163.484, 165.843, 168.269, 170.808, 173.443, 176.186, 179.044, 182.024, 185.122, 188.346, 191.701, 195.202, 198.865, 207.449, 203.418, 212.351, 216.874, 221.751, 227.179]

40.0 dB: u=[3×1.000, 4×2.884, 4×4.868, 4×6.787, 4×8.796, 4×10.733, 4×12.764, 4×14.718, 4×16.746, 4×18.729, 4×20.770, 4×22.741, 4×24.758, 4×26.707, 4×28.730, 4×30.714, 4×32.782, 4×34.846, 4×36.972, 4×39.076, 4×41.212, 4×43.297, 4×45.418, 4×47.511, 4×49.663, 4×51.833, 4×54.051, 4×56.276, 4×58.541, 4×60.809, 4×63.114, 4×65.423, 4×67.796, 4×70.179, 4×72.604, 4×75.028, 4×77.480, 4×79.962, 4×82.507, 4×85.100,

4×87.722, 4×90.373, 4×93.097, 4×95.894, 2×98.443, 2×99.192, 2×101.350, 2×102.593, 2×104.608, 2×106.201, 2×108.143, 2×109.900, 2×111.831, 2×113.740, 2×115.749, 2×117.768, 2×119.876, 2×122.014, 2×124.151, 2×126.386, 2×128.620, 2×130.937, 2×133.303, 2×135.790, 2×138.316, 2×140.941, 2×143.602, 146.738, 146.121, 150.043, 148.924, 153.674, 152.079, 157.452, 155.652, 161.396, 159.464, 165.590, 163.491, 170.087, 167.782, 174.837, 172.447, 179.889, 177.326, 185.223, 182.532, 190.913, 187.989, 201.138, 197.890, 194.755, 204.461, 219.958, 208.625, 212.291, 216.021, 229.420, 225.077, 234.685, 240.034]

h1) 1048576-QAM/1024-PAM for the AWGN Channel (Maximum Penalty of 0.001 b/s/Hz)

0.0 dB: u=[511×1.000]

1.0 dB: u=[511×1.000]

2.0 dB: u=[127×1.000, 128×0.857, 128×1.303, 128×1.606]

3.0 dB: u=[255×1.000, 256×2.208]

4.0 dB: u=[255×1.000, 256×2.826]

5.0 dB: u=[255×1.000, 256×3.322]

6.0 dB: u=[255×1.000, 256×3.655]

7.0 dB: u=[15×1.000, 16×1.042, 16×1.085, 16×1.042, 16×1.085, 16×1.132, 16×1.085, 16×1.042, 16×1.085, 16×1.132, 16×1.180, 16×1.132, 16×1.085, 16×1.132, 16×1.085, 16×1.042, 8×4.172, 8×4.337, 16×3.848, 16×3.643, 16×3.848, 16×3.643, 8×3.524, 8×3.434, 16×3.643, 16×3.848, 4.093, 7×4.172, 8×4.337, 16×3.848, 16×3.643, 16×3.848, 8×4.172, 8×4.337, 16×3.848, 4×4.172, 3×4.337, 4.172, 4×4.512, 3×4.449, 4.415, 6.206, 2×6.128, 6.206, 6.128, 2×6.063, 6.128, 7.861, 7.683, 7.630, 7.804, 8.180, 7.975, 8.038, 8.250]

8.0 dB: u=[7×1.000, 8×0.974, 8×1.000, 8×1.026, 128×1.120, 8×1.282, 8×1.251, 8×1.217, 8×1.251, 64×1.120, 8×4.221, 4×4.565, 4×4.467, 8×4.221, 4×4.070, 4×4.019, 8×3.764, 4×3.922, 4×3.888, 4×3.970, 4×4.019, 4×3.855, 4×3.820, 4×3.637, 4×3.660, 4×3.764, 4×3.712, 4×3.660, 4×3.688, 4×3.586, 4×3.548, 8×3.764, 4×3.888, 4×3.855, 4×3.922, 4×3.970, 4×3.820, 4×3.764, 4×4.120, 4×4.221, 4×4.467, 4.379, 4.394, 2×4.379, 8×4.221, 4×4.019, 4×3.970, 8×3.764, 4×3.888, 4×3.855, 4×3.922, 4×3.970, 4×3.820, 4×3.764, 8×4.221, 4×4.565, 4×4.467, 8×4.221, 4×4.070, 4×4.019, 4.607, 4.629, 4.650, 4.629, 4.780, 4.800, 4.780, 4.760, 5.098, 5.112, 5.126, 5.112, 5.002, 5.017, 5.002, 4.985, 6.840, 6.815, 6.793, 6.815, 6.670, 6.657, 6.670, 6.683, 7.999, 7.932, 7.848, 7.909, 8.622, 8.520, 8.662, 8.774]

9.0 dB: u=[7×1.000, 24×0.959, 8×1.086, 8×1.028, 16×1.086, 32×1.202, 32×1.086, 8×1.265, 24×1.202, 8×1.352, 8×1.316, 8×1.352, 8×1.389, 32×1.202, 32×1.086, 2×3.863, 2×3.890, 2×3.922, 2×3.890, 2×4.046, 2×4.076, 2×4.046, 2×4.006, 2×4.337, 2×4.377, 2×4.420, 2×4.377, 2×4.174, 2×4.212, 2×4.174, 2×4.142, 4×3.863, 2×3.890, 2×3.863, 6×4.006, 2×3.966, 8×3.797, 8×3.715, 8×3.546, 8×3.626, 8×3.715, 8×3.626, 2×3.760, 6×3.797, 2×3.863, 2×3.890, 4×3.863, 8×3.715, 8×3.626, 4×3.922, 2×3.966, 2×3.922, 2×4.109, 2×4.142, 2×4.109, 2×4.076, 2×4.420, 2×4.463, 2×4.506, 2×4.463, 2×4.251, 2×4.289, 2×4.251, 2×4.212, 2×3.890, 6×3.922, 2×4.006, 2×4.046, 4×4.006, 4×3.797, 2×3.863, 2×3.797, 8×3.715, 2×4.076, 2×4.109, 2×4.142, 2×4.109, 2×4.316, 2×4.359, 2×4.316, 2×4.274, 2×4.625, 2×4.667, 2×4.708, 2×4.667, 2×4.463, 2×4.506, 2×4.463, 2×4.420, 2×6.334, 2×6.314, 2×6.297, 2×6.314, 8×6.094, 2×7.098, 2×6.955, 2×6.850, 2×6.955, 8.208, 8.239, 7.823, 7.806, 8.239, 8.271, 8.980, 8.929]

10.0 dB: u=[63×1.000, 64×1.112, 64×1.524, 64×1.362, 8×3.752, 8×3.788, 4×3.842, 4×3.889, 8×3.842, 4×3.990, 4×4.007, 4×4.044, 4×4.025, 8×3.919, 8×3.889, 16×3.842, 8×3.919, 8×3.889, 16×3.788, 16×3.725, 4×4.370, 4×4.409, 4×4.478, 4×4.433, 4×4.646, 4×4.706, 4×4.610, 4×4.570, 4×4.706, 4×4.752, 4×4.812, 4×4.752, 4×4.610, 4×4.646, 4×4.570, 4×4.532, 2×5.618, 2×5.655, 2×5.829, 2×5.790, 2×5.921, 2×5.972, 2×5.829, 2×5.770, 4×5.829, 2×5.944, 2×5.921, 4×5.829, 2×5.736, 2×5.708, 6.703, 6.720, 6.813, 6.800, 6.913, 6.923, 2×6.844, 2×6.777, 2×6.844, 2×6.777, 2×6.703, 2×7.781, 2×7.821, 2×7.562, 2×7.515, 2×8.216, 2×8.176, 9.359, 9.273, 10.248, 10.472]

11.0 dB: u=[127×1.000, 128×1.815, 32×3.964, 32×4.094, 32×4.225, 32×4.094, 8×5.875, 8×6.103, 8×6.298, 8×6.103, 24×5.875, 8×5.702, 8×6.103, 8×6.298, 8×6.475, 8×6.298, 7.730, 2×7.585, 7.730, 7.843, 2×7.730, 7.927, 7.843, 4×7.730, 2×7.585, 7.730, 8.768, 8.628, 8.465, 2×8.628, 8.515, 8.628, 8.721, 9.588, 9.768, 9.725, 9.540, 10.271, 12.518, 11.033, 10.153]

12.0 dB: u=[127×1.000, 128×2.228, 32×4.389, 32×4.549, 32×4.726, 32×4.549, 16×6.920, 16×7.240, 16×6.920, 16×6.700, 8×6.920, 8×7.240, 8×7.506, 8×7.240, 2×8.599, 14×8.866, 10.189, 10.051, 10.189, 10.320, 10.189, 2×10.051, 10.189, 11.171, 10.965, 10.823, 10.965, 11.632, 11.557, 14.362, 12.624]

13.0 dB: u=[127×1.000, 128×2.598, 64×4.766, 64×5.145, 16×7.309, 48×7.514, 4×8.427, 4×8.515, 4×8.772, 4×8.678, 4×8.887, 4×8.979, 4×8.772, 4×8.678, 9.708, 9.766, 9.834, 9.766, 10.010, 10.162, 2×10.010, 2×10.162, 10.256, 10.162, 4×10.010, 10.952, 11.180, 11.420, 11.180, 11.266, 11.420, 11.266, 11.111, 12.106, 12.308, 12.414, 12.308, 13.720, 13.301, 13.720, 15.960]

14.0 dB: u=[127×1.000, 128×2.846, 64×4.967, 64×5.518, 32×7.766, 16×8.118, 16×8.002, 8×9.552, 8×9.774, 8×9.966, 8×9.774, 4×10.715, 4×11.023, 4×11.255, 4×11.023, 12.010, 12.218, 12.404, 12.218, 12.404, 12.541, 12.404, 12.218, 13.236, 13.491, 13.654, 13.491, 15.024, 14.630, 15.024, 17.348]

15.0 dB: u=[127×1.000, 64×2.926, 64×3.040, 64×5.095, 64×5.743, 32×7.972, 32×8.395, 16×10.173, 8×10.554, 8×10.426, 4×11.673, 4×11.909, 4×12.132, 4×11.909, 2×12.969, 2×13.252, 2×13.466, 2×13.252, 14.454, 14.148, 14.454, 14.679, 15.692, 15.415, 18.520, 16.638]

16.0 dB: u=[127×1.000, 64×2.973, 64×3.142, 64×5.170, 32×5.822, 32×5.970, 32×8.070, 32×8.582, 16×10.451, 16×10.857, 8×12.337, 8×12.696, 2×13.789, 2×13.934, 2×14.237, 2×14.080, 15.099, 15.391, 15.634, 15.391, 16.210, 16.651, 17.558, 19.523]

17.0 dB: u=[127×1.000, 64×2.961, 64×3.215, 64×5.166, 32×5.907, 32×6.111, 32×8.060, 32×8.623, 16×10.515, 16×10.976, 8×12.611, 8×13.005, 4×14.357, 4×14.706, 2×15.782, 2×16.136, 17.421, 16.990, 20.277, 18.421]

18.0 dB: u=[63×1.000, 64×1.166, 64×3.121, 64×3.593, 64×5.532, 32×6.626, 32×6.850, 32×8.746, 16×9.317, 16×9.488, 16×11.398, 16×11.921, 8×13.738, 8×14.201, 4×15.801, 4×16.218, 2×17.571, 2×17.971, 19.514, 19.028, 22.631, 20.661]

19.0 dB: u=[63×1.000, 64×1.509, 64×3.465, 64×4.392, 64×6.367, 32×7.972, 32×8.230, 32×10.218, 16×10.928, 16×11.176, 16×13.219, 16×13.851, 8×15.905, 8×16.449, 4×18.341, 4×18.839, 20.532, 2×21.012, 20.532, 24.454, 22.960, 22.455, 26.649]

20.0 dB: u=[63×1.000, 64×2.370, 64×4.396, 64×6.084, 64×8.276, 32×10.423, 32×10.825, 32×13.151, 16×14.224, 16×14.558, 16×16.910, 16×17.756, 8×20.238, 8×20.937, 4×23.291, 4×23.916, 2×26.093, 2×26.690, 29.263, 28.659, 34.095, 31.334]

21.0 dB: u=[63×1.000, 64×2.812, 64×4.871, 64×6.903, 64×9.230, 32×11.550, 32×12.224, 32×14.587,

16×16.198, 16×16.595, 16×18.914, 8×19.854, 8×20.197, 8×22.565, 4×23.278, 4×23.535, 4×25.891, 4×26.598, 2×28.992, 2×29.633, 31.900, 32.521, 34.952, 38.002]

22.0 dB: u=[63×1.000, 64×2.960, 64×5.036, 64×7.189, 32×9.418, 32×9.728, 32×11.896, 32×12.840, 32×15.109, 16×16.992, 16×17.557, 16×19.730, 8×21.086, 8×21.475, 8×23.641, 8×24.684, 4×27.071, 4×27.870, 2×30.240, 2×30.943, 33.247, 33.895, 36.386, 39.432]

23.0 dB: u=[63×1.000, 64×3.005, 64×5.083, 32×7.180, 32×7.357, 32×9.405, 32×9.964, 32×11.961, 32×13.262, 16×15.266, 16×15.441, 16×17.320, 16×18.021, 16×20.078, 8×21.668, 8×22.189, 8×24.163, 4×25.390, 4×25.790, 4×27.758, 2×28.641, 2×28.963, 2×30.991, 31.946, 31.637, 34.726, 33.992, 40.124, 37.140]

24.0 dB: u=[63×1.000, 64×3.015, 64×5.092, 32×7.094, 32×7.494, 32×9.333, 32×10.268, 32×12.064, 32×13.668, 16×15.514, 16×15.813, 16×17.613, 16×18.506, 8×20.367, 8×20.507, 8×22.137, 8×22.762, 8×24.626, 4×26.055, 4×26.559, 4×28.354, 2×29.531, 2×29.936, 2×31.731, 32.592, 33.013, 34.786, 35.751, 37.990, 40.849]

25.0 dB: u=[63×1.000, 32×2.941, 32×3.097, 32×4.922, 32×5.307, 32×7.010, 32×7.826, 32×9.442, 32×10.758, 32×12.406, 16×14.056, 16×14.209, 16×15.885, 16×16.393, 16×18.067, 16×19.263, 8×20.954, 8×21.181, 8×22.804, 8×23.552, 8×25.334, 4×26.869, 4×27.456, 4×29.178, 2×30.523, 2×31.026, 2×32.691, 33.837, 34.302, 35.924, 37.115, 39.212, 41.917]

26.0 dB: u=[31×1.000, 32×1.664, 32×3.624, 32×4.506, 32×6.383, 32×7.615, 32×9.436, 32×11.006, 32×12.870, 32×14.737, 32×16.802, 16×18.891, 16×19.216, 16×21.233, 16×22.126, 16×24.142, 16×25.897, 8×27.944, 8×28.381, 8×30.377, 8×31.576, 8×33.750, 4×35.780, 4×36.650, 4×38.790, 2×40.629, 2×41.351, 2×43.422, 45.060, 45.719, 47.720, 49.466, 52.091, 55.474]

27.0 dB: u=[31×1.000, 32×2.708, 32×4.716, 32×6.496, 32×8.536, 32×10.448, 32×12.563, 32×14.665, 32×16.936, 32×19.305, 16×21.761, 16×21.989, 16×24.375, 16×25.072, 16×27.390, 16×28.915, 16×31.249, 8×33.489, 8×33.747, 8×36.061, 8×36.872, 8×39.212, 8×41.056, 4×43.420, 4×43.890, 4×46.186, 4×47.528, 2×49.914, 2×50.204, 2×52.415, 2×53.444, 2×55.948, 58.127, 59.050, 61.472, 63.838, 67.021, 71.065]

28.0 dB: u=[31×1.000, 32×2.924, 32×4.940, 32×6.912, 32×8.981, 32×11.052, 32×13.223, 32×15.452, 32×17.802, 32×20.281, 16×22.691, 16×23.251, 16×25.455, 16×26.697, 16×28.838, 16×30.787, 16×33.087, 8×35.374, 8×35.865, 8×38.059, 8×39.285, 8×41.512, 8×43.686, 4×45.985, 4×46.750, 4×48.967, 4×50.738, 2×52.970, 2×53.481, 2×55.656, 2×57.051, 2×59.475, 61.778, 62.929, 65.318, 67.873, 71.052, 75.010]

29.0 dB: u=[31×1.000, 32×2.985, 32×5.003, 32×7.030, 32×9.106, 32×11.219, 32×13.403, 32×15.660, 32×18.024, 16×20.272, 16×20.833, 16×22.850, 16×23.996, 16×25.921, 16×27.619, 16×29.607, 16×31.684, 8×33.824, 8×34.135, 8×36.172, 8×37.017, 8×39.014, 8×40.629, 8×42.713, 4×44.770, 4×45.209, 4×47.213, 4×48.333, 4×50.376, 4×52.385, 2×54.500, 2×55.274, 2×57.312, 2×59.046, 61.107, 61.671, 63.693, 65.162, 67.411, 69.980, 73.056, 76.807]

30.0 dB: u=[31×1.000, 32×3.001, 32×5.019, 32×7.057, 32×9.131, 32×11.246, 32×13.419, 16×15.521, 16×15.831, 16×17.754, 16×18.448, 16×20.240, 16×21.435, 16×23.147, 16×24.710, 16×26.478, 16×28.292, 16×30.247, 8×32.223, 8×32.460, 8×34.350, 8×34.995, 8×36.808, 8×38.086, 8×39.885, 8×41.684, 4×43.602, 4×43.857, 4×45.704, 4×46.432, 4×48.255, 4×49.706, 4×51.609, 2×53.481, 2×53.912, 2×55.735, 2×56.816, 2×58.692, 60.449, 60.749, 62.556, 63.391, 65.260, 66.986, 69.144, 71.641, 74.559, 78.055]

31.0 dB: u=[31×1.000, 32×3.003, 32×5.018, 32×7.053, 32×9.120, 16×11.097, 16×11.381, 16×13.178, 16×13.772, 16×15.432, 16×16.431, 16×17.990, 16×19.299, 16×20.845, 16×22.342, 16×23.961, 16×25.615, 16×27.368, 16×29.207, 16×31.167, 8×33.030, 8×33.587, 8×35.254, 8×36.343, 8×37.960, 8×39.486, 8×41.216, 8×43.066, 4×44.886, 4×45.379, 4×47.056, 4×48.133, 4×49.794, 4×51.421, 2×53.177, 2×53.420, 2×55.111, 2×55.810, 2×57.490, 2×58.865, 2×60.642, 62.380, 62.859, 64.538, 65.669, 67.406, 69.233, 71.362, 73.794, 76.594, 79.911]

32.0 dB: u=[31×1.000, 32×3.005, 16×4.906, 16×5.162, 16×6.884, 16×7.371, 16×8.959, 16×9.758, 16×11.233, 16×12.303, 16×13.718, 16×14.953, 16×16.368, 16×17.713, 16×19.168, 16×20.611, 16×22.136, 16×23.689, 16×25.318, 16×27.005, 16×28.777, 16×30.641, 8×32.406, 8×32.911, 8×34.475, 8×35.447, 8×36.943, 8×38.299, 8×39.849, 8×41.458, 8×43.200, 4×44.914, 4×45.280, 4×46.866, 4×47.702, 4×49.237, 4×50.583, 4×52.185, 4×53.891, 2×55.585, 2×56.039, 2×57.609, 2×58.618, 2×60.179, 2×61.715, 63.362, 63.634, 65.211, 65.947, 67.522, 68.902, 70.603, 72.480, 74.597, 76.979, 79.680, 82.846]

33.0 dB: u=[15×1.000, 16×2.656, 16×4.659, 16×6.338, 16×8.339, 16×10.061, 16×12.073, 16×13.860, 16×15.884, 16×17.740, 16×19.787, 16×21.732, 16×23.829, 16×25.867, 16×28.025, 16×30.170, 16×32.420, 16×34.699, 16×37.075, 16×39.513, 16×42.050, 16×44.682, 16×47.447, 8×50.056, 8×50.753, 8×53.066, 8×54.403, 8×56.594, 8×58.485, 8×60.702, 8×62.933, 8×65.349, 8×67.888, 4×70.437, 4×70.835, 4×73.214, 4×74.193, 4×76.457, 4×78.198, 4×80.453, 4×82.713, 4×85.209, 2×87.700, 2×88.145, 2×90.484, 2×91.604, 2×93.875, 2×95.806, 2×98.139, 2×100.646, 103.126, 103.808, 106.101, 107.635, 109.922, 112.212, 114.848, 117.768, 120.987, 124.593, 128.669, 133.396]

34.0 dB: u=[15×1.000, 16×2.910, 16×4.914, 16×6.837, 16×8.852, 16×10.800, 16×12.835, 16×14.820, 16×16.886, 16×18.923, 16×21.032, 16×23.134, 16×25.302, 16×27.484, 16×29.731, 16×32.014, 16×34.363, 16×36.766, 16×39.245, 16×41.797, 16×44.442, 8×46.963, 8×47.466, 8×49.729, 8×50.752, 8×52.861, 8×54.433, 8×56.471, 8×58.382, 8×60.488, 8×62.626, 8×64.895, 8×67.262, 8×69.767, 8×72.434, 2×75.879, 4×74.910, 2×75.879, 2×78.018, 4×79.648, 2×78.018, 2×83.807, 4×81.746, 2×83.807, 2×86.066, 4×88.455, 2×86.066, 94.359, 93.474, 4×91.036, 93.474, 94.359, 96.532, 98.144, 100.316, 102.748, 102.097, 100.316, 98.144, 96.532, 110.726, 112.288, 107.629, 108.782, 104.829, 105.875, 114.329, 116.356, 118.648, 121.120, 123.844, 126.834, 130.110, 133.716, 137.733, 142.370]

35.0 dB: u=[15×1.000, 16×2.980, 16×4.986, 16×6.976, 16×8.995, 16×11.006, 16×13.047, 16×15.089, 16×17.165, 16×19.250, 16×21.373, 16×23.516, 16×25.698, 16×27.910, 16×30.169, 16×32.470, 16×34.824, 16×37.232, 16×39.709, 8×42.039, 8×42.549, 8×44.612, 8×45.583, 8×47.500, 8×48.917, 8×50.760, 8×52.445, 8×54.317, 8×56.169, 8×58.133, 8×60.138, 8×62.241, 8×64.416, 8×66.691, 8×69.074, 4×71.349, 4×71.882, 4×73.916, 4×74.991, 4×76.908, 4×78.487,

4×80.393, 4×82.276, 4×84.312, 4×86.433, 4×88.693, 4×91.106, 2×94.247, 2×93.357, 2×97.730, 2×96.194, 2×105.929, 2×99.672, 2×101.622, 2×103.709, 111.614, 110.607, 115.222, 113.576, 119.242, 117.235, 2×108.352, 130.818, 122.816, 125.254, 127.929, 134.631, 138.060, 141.862, 146.197]

36.0 dB: u=[15×1.000, 16×2.996, 16×4.999, 16×7.002, 16×9.020, 16×11.044, 16×13.083, 16×15.133, 16×17.204, 16×19.293, 16×21.407, 16×23.546, 16×25.715, 16×27.915, 16×30.151, 16×32.432, 8×34.584, 8×34.988, 8×36.904, 8×37.673, 8×39.442, 8×40.601, 8×42.272, 8×43.686, 8×45.338, 8×46.893, 8×48.581, 8×50.242, 8×51.994, 8×53.758, 8×55.598, 8×57.476, 8×59.426, 8×61.434, 8×63.520, 8×65.683, 8×67.948, 4×70.028, 4×70.770, 4×72.551, 4×73.776, 4×75.476, 4×77.022, 4×78.759, 4×80.501, 4×82.357, 4×84.279, 4×86.305, 4×88.431, 2×90.923, 2×90.491, 2×93.707, 2×92.787, 2×96.882, 2×95.464, 2×100.340, 2×98.620, 2×104.159, 2×102.204, 108.270, 108.694, 2×106.240, 113.253, 114.725, 110.551, 111.487, 120.208, 130.311, 116.502, 118.323, 123.098, 125.334, 127.738, 133.707, 136.690, 139.915, 143.462, 147.486]

37.0 dB: u=[15×1.000, 16×3.000, 16×5.004, 16×7.012, 16×9.028, 16×11.052, 16×13.087, 16×15.135, 16×17.199, 16×19.280, 16×21.382, 16×23.512, 8×25.525, 8×25.850, 8×27.654, 8×28.265, 8×29.928, 8×30.878, 8×32.429, 8×33.625, 8×35.127, 8×36.455, 8×37.956, 8×39.366, 8×40.891, 8×42.368, 8×43.933, 8×45.480, 8×47.097, 8×48.716, 8×50.392, 8×52.090, 8×53.843, 8×55.630, 8×57.471, 8×59.361, 8×61.312, 8×63.319, 8×65.405, 4×67.333, 4×67.921, 4×69.586, 4×70.600, 4×72.166, 4×73.494, 4×75.047, 4×76.552, 4×78.169, 4×79.809, 4×81.529, 4×83.305, 4×85.161, 4×87.094, 4×89.122, 2×91.026, 2×91.565, 2×93.241, 2×94.243, 2×95.824, 2×97.192, 2×98.780, 2×100.362, 2×102.058, 2×103.818, 2×105.680, 2×107.640, 109.526, 109.980, 111.676, 112.604, 114.212, 115.583, 117.197, 118.838, 120.607, 127.529, 129.752, 122.428, 134.624, 132.114, 125.459, 137.294, 140.142, 143.214, 146.566, 150.358]

38.0 dB: u=[15×1.000, 16×3.001, 16×5.004, 16×7.011, 16×9.026, 16×11.049, 16×13.093, 8×14.975, 8×15.399, 8×17.034, 8×17.729, 8×19.241, 8×20.190, 8×21.617, 8×22.723, 8×24.113, 8×25.304, 8×26.687, 8×27.932, 8×29.324, 8×30.614, 8×32.021, 8×33.354, 8×34.781, 8×36.158, 8×37.611, 8×39.035, 8×40.521, 8×41.994, 8×43.521, 8×45.051, 8×46.625, 8×48.214, 8×49.844, 8×51.499, 8×53.196, 8×54.926, 8×56.699, 8×58.511, 8×60.369, 8×62.276, 8×64.248, 4×66.601, 4×66.065, 4×69.076, 4×68.166, 4×71.736, 4×70.541, 4×74.526, 4×73.172, 4×77.460, 4×75.997, 4×80.568, 4×79.001, 4×83.880, 4×82.201, 4×87.425, 4×85.623, 4×91.268, 4×89.299, 96.378, 2×95.281, 96.378, 93.064, 2×93.763, 93.064, 102.183, 2×100.680, 102.183, 97.836, 2×99.185, 97.836, 108.930, 2×107.134, 108.930, 103.773, 2×105.413, 103.773, 117.128, 115.645, 114.686, 118.432, 110.824, 113.121, 112.603, 110.824, 130.377, 132.455, 126.519, 128.398, 119.932, 124.739, 123.054, 121.441, 137.552, 135.241, 140.525, 143.114, 145.868, 148.830, 152.056, 155.678]

39.0 dB: u=[7×1.000, 8×2.648, 8×4.650, 8×6.303, 8×8.307, 8×9.971, 8×11.973, 8×13.655, 8×15.660, 8×17.366, 8×19.374, 8×21.107, 8×23.117, 8×24.880, 8×26.897, 8×28.695, 8×30.719, 8×32.554, 8×34.589, 8×36.465, 8×38.514, 8×40.433, 8×42.501, 8×44.463, 8×46.555, 8×48.566, 8×50.684, 8×52.748, 8×54.903, 8×57.021, 8×59.216, 8×61.393, 8×63.637, 8×65.879, 8×68.182, 8×70.496, 8×72.865, 8×75.258, 8×77.702, 8×80.183, 8×82.718, 8×85.299, 8×87.936, 8×90.623, 8×93.368, 8×96.175, 8×99.064, 2×101.745, 4×102.436, 2×101.745, 2×105.992, 4×104.768, 2×105.992, 2×108.157, 4×109.818, 2×108.157, 2×113.809, 4×111.908, 2×113.809, 2×115.922, 4×117.978, 2×115.922, 2×122.348, 4×120.161, 2×122.348, 2×124.633, 4×126.954, 2×124.633, 2×131.821, 4×129.357, 2×131.821, 2×134.371, 4×137.001, 2×134.371, 2×142.546, 4×139.724, 2×142.546, 2×145.190, 2×149.459, 2×148.197, 2×145.876, 2×155.500, 2×153.382, 2×151.631, 2×157.538, 2×159.798, 2×161.874, 164.431, 2×167.000, 165.022, 172.094, 2×169.513, 172.094, 174.791, 2×177.621, 174.791, 183.383, 181.170, 180.221, 185.009, 187.167, 189.199, 191.353, 193.543, 195.863, 198.260, 200.786, 203.425, 206.198, 209.105, 212.158, 215.358, 218.720, 222.251, 225.964, 229.879, 234.024, 238.437, 243.252, 248.655]

40.0 dB: u=[7×1.000, 8×2.904, 8×4.905, 8×6.809, 8×8.808, 8×10.721, 8×12.724, 8×14.646, 8×16.657, 8×18.594, 8×20.616, 8×22.572, 8×24.607, 8×26.585, 8×28.635, 8×30.635, 8×32.699, 8×34.720, 8×36.804, 8×38.856, 8×40.965, 8×43.052, 8×45.192, 8×47.316, 8×49.488, 8×51.654, 8×53.862, 8×56.071, 8×58.318, 8×60.570, 8×62.862, 8×65.174, 8×67.526, 8×69.899, 8×72.310, 8×74.749, 8×77.227, 8×79.737, 8×82.287, 8×84.875, 8×87.508, 8×90.185, 8×92.915, 8×95.715, 4×99.021, 4×98.270, 4×102.436, 4×101.206, 4×106.055, 4×104.471, 4×109.800, 4×108.025, 4×113.679, 4×111.782, 4×117.691, 4×115.701, 4×121.865, 4×119.779, 4×126.220, 4×124.028, 4×130.790, 4×128.484, 4×135.590, 4×133.162, 4×140.652, 4×138.086, 4×146.023, 4×143.289, 2×152.750, 2×151.470, 2×149.292, 2×148.548, 2×160.400, 2×158.466, 2×156.471, 2×154.787, 2×164.555, 2×166.704, 2×168.896, 2×162.476, 2×178.475, 2×171.187, 2×173.535, 2×175.967, 2×183.795, 186.296, 187.103, 189.251, 190.597, 2×181.079, 207.690, 202.438, 192.632, 194.382, 196.405, 198.390, 200.572, 205.578, 218.005, 215.272, 223.827, 220.857, 230.164, 226.928, 212.648, 210.135, 237.031, 245.237, 241.382, 233.522, 250.244, 254.565, 264.978, 259.760]

a2) 64-QAM/8-PAM for the AWGN Channel (Maximum Penalty of 0.01 b/s/Hz)

0.0 dB: u=[3×1.000]
1.0 dB: u=[3×1.000]
2.0 dB: u=[3×1.000]
3.0 dB: u=[1.000, 2×2.265]
4.0 dB: u=[1.000, 2×2.842]
5.0 dB: u=[1.000, 2×3.337]
6.0 dB: u=[1.000, 2×3.672]
7.0 dB: u=[1.000, 2×3.774]
8.0 dB: u=[1.000, 2×3.734]

b2) 256-QAM/16-PAM for the AWGN Channel (Maximum Penalty of 0.01 b/s/Hz)

0.0 dB: u=[7×1.000]
1.0 dB: u=[7×1.000]
2.0 dB: u=[7×1.000]
3.0 dB: u=[3×1.000, 4×2.265]
4.0 dB: u=[3×1.000, 4×2.843]
5.0 dB: u=[3×1.000, 4×3.337]
6.0 dB: u=[3×1.000, 4×3.672]
7.0 dB: u=[3×1.000, 4×3.773]
8.0 dB: u=[3×1.000, 3.454, 3.097, 3.454, 5.095]
9.0 dB: u=[3×1.000, 3.393, 3.077, 3.393, 5.293]
10.0 dB: u=[1.000, 2×1.417, 2×3.680, 4.472, 6.457]
11.0 dB: u=[1.000, 2×1.811, 2×4.087, 5.712, 7.600]

12.0 dB: u=[1.000, 2×2.219, 2×4.542, 6.667, 8.767]
13.0 dB: u=[1.000, 2×2.620, 4.719, 5.258, 7.485, 9.942]
14.0 dB: u=[1.000, 2×2.885, 4.980, 5.626, 8.030, 10.779]
15.0 dB: u=[1.000, 2×3.018, 5.130, 5.838, 8.299, 11.178]
16.0 dB: u=[1.000, 2×3.079, 5.186, 5.980, 8.375, 11.244]
17.0 dB: u=[1.000, 2×3.099, 5.146, 6.168, 8.377, 11.143]

c2) 1024-QAM/32-PAM for the AWGN Channel (Maximum Penalty of 0.01 b/s/Hz)

0.0 dB: u=[15×1.000]
1.0 dB: u=[15×1.000]
2.0 dB: u=[15×1.000]
3.0 dB: u=[7×1.000, 8×2.266]
4.0 dB: u=[7×1.000, 8×2.849]
5.0 dB: u=[7×1.000, 8×3.336]
6.0 dB: u=[7×1.000, 8×3.668]
7.0 dB: u=[7×1.000, 3.718, 3×3.247, 3.718, 3.247, 3.718, 5.583]
8.0 dB: u=[7×1.000, 3.732, 3×3.310, 3.732, 3.310, 3.732, 6.013]
9.0 dB: u=[7×1.000, 2×3.439, 2×3.149, 2×3.439, 4.220, 6.073]
10.0 dB: u=[3×1.000, 2×1.302, 2×1.000, 3.432, 3.742, 3.432, 3.221, 3.432, 3.742, 4.956, 6.589]
11.0 dB: u=[3×1.000, 4×1.827, 4×4.113, 3×6.080, 8.623]
12.0 dB: u=[3×1.000, 4×2.254, 4×4.583, 3×7.075, 9.870]
13.0 dB: u=[3×1.000, 4×2.605, 4×4.964, 3×7.896, 11.047]
14.0 dB: u=[3×1.000, 4×2.852, 2×4.972, 2×5.531, 2×7.932, 9.778, 12.105]
15.0 dB: u=[3×1.000, 4×2.991, 2×5.104, 2×5.765, 7.961, 8.482, 10.428, 12.892]
16.0 dB: u=[3×1.000, 4×3.063, 2×5.173, 2×5.916, 8.071, 8.636, 10.752, 13.319]
17.0 dB: u=[3×1.000, 4×3.092, 2×5.161, 2×6.053, 8.073, 8.669, 10.809, 13.379]
18.0 dB: u=[3×1.000, 2×2.853, 2×3.366, 2×5.108, 2×6.328, 8.143, 8.790, 10.854, 13.351]
19.0 dB: u=[1.000, 2×1.714, 2×3.689, 2×4.830, 2×6.860, 2×8.793, 11.029, 12.021, 14.586, 17.762]
20.0 dB: u=[1.000, 2×2.547, 2×4.588, 2×6.419, 2×8.668, 2×11.156, 13.777, 15.283, 18.195, 21.909]
21.0 dB: u=[1.000, 2×2.877, 2×4.945, 2×7.032, 2×9.390, 2×12.122, 14.875, 16.901, 19.832, 23.605]
22.0 dB: u=[1.000, 2×2.988, 2×5.065, 2×7.242, 2×9.652, 11.970, 13.095, 15.312, 17.587, 20.467, 24.094]
23.0 dB: u=[1.000, 2×3.011, 2×5.091, 2×7.288, 9.376, 10.130, 12.040, 13.561, 15.616, 17.939, 20.714, 24.127]
24.0 dB: u=[1.000, 2×3.017, 2×5.102, 2×7.355, 9.386, 10.592, 12.301, 14.031, 16.039, 18.330, 20.996, 24.207]
25.0 dB: u=[1.000, 2×3.036, 4.849, 5.583, 7.098, 8.231, 9.725, 11.176, 12.812, 14.585, 16.570, 18.804, 21.359, 24.391]

d2) 4096-QAM/64-PAM for the AWGN Channel (Maximum Penalty of 0.01 b/s/Hz)

0.0 dB: u=[31×1.000]
1.0 dB: u=[31×1.000]
2.0 dB: u=[31×1.000]
3.0 dB: u=[15×1.000, 16×2.265]
4.0 dB: u=[15×1.000, 16×2.840]
5.0 dB: u=[15×1.000, 16×3.336]
6.0 dB: u=[15×1.000, 16×3.673]
7.0 dB: u=[15×1.000, 3.420, 3.931, 7×3.420, 3.931, 3×3.420, 3.931, 6.619, 3.931]
8.0 dB: u=[15×1.000, 3.969, 7×3.474, 3.969, 3×3.474, 3.969, 3.474, 3.969, 6.792]
9.0 dB: u=[15×1.000, 3.469, 3.867, 3.469, 3×3.215, 3.469, 3.215, 3.469, 3.867, 3.469, 3.215, 3.469, 3.867, 5.309, 6.798]
10.0 dB: u=[7×1.000, 8×1.372, 8×3.650, 4.183, 3×4.436, 2×5.516, 6.290, 7.980]
11.0 dB: u=[7×1.000, 8×1.818, 8×4.102, 6×6.077, 7.640, 9.593]
12.0 dB: u=[7×1.000, 8×2.235, 8×4.559, 6×7.047, 8.823, 10.982]
13.0 dB: u=[7×1.000, 8×2.617, 8×4.976, 4×7.560, 8.210, 8.760, 9.982, 12.237]
14.0 dB: u=[7×1.000, 8×2.850, 4×4.972, 4×5.521, 4×7.921, 2×9.749, 11.037, 13.294]
15.0 dB: u=[7×1.000, 8×2.987, 4×5.103, 4×5.753, 4×8.199, 2×10.357, 11.955, 14.209]
16.0 dB: u=[7×1.000, 8×3.058, 4×5.170, 4×5.898, 2×8.065, 2×8.590, 10.431, 10.930, 12.610, 14.901]
17.0 dB: u=[7×1.000, 8×3.089, 4×5.164, 4×6.021, 2×8.062, 2×8.636, 10.521, 11.028, 12.897, 15.237]
18.0 dB: u=[7×1.000, 4×2.871, 4×3.337, 4×5.111, 4×6.267, 2×8.107, 2×8.729, 10.572, 11.079, 12.994, 15.323]
19.0 dB: u=[3×1.000, 4×1.583, 4×3.546, 4×4.556, 4×6.550, 4×8.365, 2×10.528, 2×11.418, 13.629, 14.307, 16.686, 19.573]
20.0 dB: u=[3×1.000, 4×2.458, 4×4.492, 4×6.251, 4×8.473, 4×10.890, 2×13.465, 2×14.809, 2×17.814, 21.118, 24.602]
21.0 dB: u=[3×1.000, 4×2.842, 4×4.906, 4×6.964, 4×9.303, 2×11.630, 2×12.349, 2×14.708, 2×16.610, 19.124, 20.381, 23.243, 26.857]
22.0 dB: u=[3×1.000, 4×2.971, 4×5.048, 4×7.211, 4×9.602, 2×11.925, 2×12.920, 2×15.175, 2×17.400, 19.872, 21.565, 24.287, 27.805]
23.0 dB: u=[3×1.000, 4×3.008, 4×5.087, 4×7.277, 4×9.708, 2×11.988, 2×13.375, 2×15.453, 17.434, 18.215, 20.268, 22.212, 24.831, 28.169]
24.0 dB: u=[3×1.000, 4×3.015, 4×5.093, 4×7.308, 2×9.337, 2×10.376, 2×12.134, 2×13.791, 2×15.800, 17.760, 18.781, 20.693, 22.738, 25.267, 28.415]
25.0 dB: u=[3×1.000, 4×3.021, 4×5.138, 2×7.025, 2×7.968, 2×9.534, 2×10.914, 2×12.555, 2×14.309, 16.054, 16.647, 18.303, 19.611, 21.420, 23.482, 25.937, 28.932]
26.0 dB: u=[1.000, 2×2.141, 2×4.125, 2×5.413, 2×7.372, 2×8.904, 2×10.870, 2×12.675, 2×14.736, 2×16.835, 2×19.148, 2×21.683, 24.118, 25.242, 27.472, 29.544, 32.086, 35.010, 38.427, 42.552]
27.0 dB: u=[1.000, 2×2.790, 2×4.801, 2×6.655, 2×8.706, 2×10.682, 2×12.820, 2×14.977, 2×17.286, 2×19.711, 2×22.340, 2×25.289, 29.748, 28.013, 34.572, 32.089, 40.637, 37.412, 45.092, 49.504]
28.0 dB: u=[1.000, 2×2.952, 2×4.969, 2×6.972, 2×9.048, 2×11.145, 2×13.331, 2×15.586, 2×17.958, 2×20.470, 2×23.239, 25.745, 27.254, 29.338, 31.413, 33.756, 36.326, 39.189, 42.387, 46.003, 50.241]
29.0 dB: u=[1.000, 2×2.994, 2×5.014, 2×7.048, 2×9.124, 2×11.244, 2×13.431, 2×15.694, 2×18.076, 2×20.697, 23.005, 24.437, 26.277, 28.091, 30.092, 32.230, 34.555, 37.093, 39.868, 42.923, 46.331, 50.284]
30.0 dB: u=[1.000, 2×3.001, 2×5.017, 2×7.054, 2×9.124, 2×11.238, 2×13.423, 2×15.753, 17.796, 18.910, 20.535, 21.978, 23.627, 25.285, 27.064, 28.931, 30.927, 33.057, 35.346, 37.807, 40.470, 43.372, 46.582, 50.264]
31.0 dB: u=[1.000, 2×3.003, 2×5.020, 2×7.066, 2×9.181, 2×11.448, 13.368, 14.480, 15.939, 17.246, 18.719, 20.155, 21.693, 23.254, 24.898, 26.606, 28.405, 30.298, 32.300, 34.422, 36.678, 39.084, 41.662, 44.449, 47.509, 50.990]

e2) 16384-QAM/128-PAM for the AWGN Channel (Maximum Penalty of 0.01 b/s/Hz)

0.0 dB: u=[63×1.000]

1.0 dB: u=[63×1.000]

2.0 dB: u=[63×1.000]

3.0 dB: u=[31×1.000, 32×2.177]

4.0 dB: u=[31×1.000, 32×2.836]

5.0 dB: u=[31×1.000, 32×3.333]

6.0 dB: u=[31×1.000, 32×3.673]

7.0 dB: u=[31×1.000, 31×3.653, 7.483]

8.0 dB: u=[31×1.000, 3.523, 4.171, 15×3.523, 4.171, 7×3.523, 4.171, 3×3.523, 4.171, 6.068, 7.414]

9.0 dB: u=[31×1.000, 3.320, 3.683, 3.936, 3.683, 13×3.320, 3.683, 3.936, 3.683, 5×3.320, 3.683, 3.936, 3.683, 5.430, 5.313, 6.131, 7.265]

10.0 dB: u=[15×1.000, 16×1.388, 16×3.660, 8×4.456, 2×6.506, 4×5.507, 7.124, 8.725]

11.0 dB: u=[15×1.000, 16×1.816, 16×4.096, 12×6.080, 2×7.705, 8.533, 10.365]

12.0 dB: u=[15×1.000, 16×2.236, 16×4.562, 12×7.058, 2×8.855, 11.825, 9.973]

13.0 dB: u=[15×1.000, 16×2.596, 16×4.952, 8×7.462, 4×8.736, 9.766, 10.072, 11.163, 13.220]

14.0 dB: u=[15×1.000, 16×2.848, 8×4.966, 8×5.521, 8×7.915, 9.701, 10.719, 10.201, 2×9.701, 10.719, 12.192, 14.614]

15.0 dB: u=[15×1.000, 16×2.988, 8×5.104, 8×5.752, 8×8.199, 4×10.360, 2×11.890, 13.242, 15.414]

16.0 dB: u=[15×1.000, 16×3.057, 8×5.168, 8×5.893, 4×8.068, 4×8.577, 2×10.450, 2×10.871, 12.299, 12.764, 14.054, 16.196]

17.0 dB: u=[15×1.000, 16×3.088, 8×5.166, 8×6.009, 4×8.059, 4×8.622, 4×10.749, 12.590, 13.067, 14.608, 16.752]

18.0 dB: u=[15×1.000, 8×2.878, 8×3.327, 8×5.113, 8×6.245, 4×8.096, 4×8.707, 2×10.551, 2×11.043, 12.721, 13.182, 14.884, 17.042]

19.0 dB: u=[7×1.000, 8×1.532, 8×3.491, 8×4.447, 8×6.430, 8×8.197, 4×10.331, 4×11.189, 2×13.369, 2×14.015, 16.092, 16.659, 18.836, 21.510]

20.0 dB: u=[7×1.000, 8×2.411, 8×4.441, 8×6.165, 8×8.372, 8×10.757, 4×13.310, 4×14.595, 2×17.128, 2×18.007, 20.513, 21.240, 23.934, 27.213]

21.0 dB: u=[7×1.000, 8×2.827, 8×4.888, 8×6.933, 8×9.263, 4×11.584, 4×12.274, 4×14.635, 4×16.481, 2×18.998, 2×20.151, 22.686, 23.583, 26.399, 29.858]

22.0 dB: u=[7×1.000, 8×2.965, 8×5.040, 8×7.196, 8×9.582, 4×11.903, 4×12.865, 4×15.126, 4×17.313, 2×19.770, 2×21.371, 23.727, 24.888, 27.571, 30.969]

23.0 dB: u=[7×1.000, 8×3.005, 8×5.082, 8×7.270, 8×9.690, 4×11.967, 4×13.302, 4×15.388, 2×17.361, 2×18.087, 2×20.145, 2×22.043, 24.290, 25.813, 28.317, 31.558]

24.0 dB: u=[7×1.000, 8×3.015, 8×5.092, 8×7.300, 4×9.334, 4×10.309, 4×12.090, 4×13.714, 4×15.715, 2×17.670, 2×18.604, 2×20.533, 2×22.591, 24.801, 26.551, 28.954, 32.025]

25.0 dB: u=[7×1.000, 8×3.020, 8×5.124, 4×7.016, 4×7.883, 4×9.478, 4×10.821, 4×12.467, 4×14.205, 2×15.954, 2×16.491, 2×18.159, 2×19.396, 2×21.210, 22.964, 23.782, 25.568, 27.419, 29.759, 32.683]

26.0 dB: u=[3×1.000, 4×1.884, 4×3.855, 4×4.927, 4×6.843, 4×8.215, 4×10.105, 4×11.782, 4×13.738, 4×15.713, 4×17.893, 4×20.273, 2×22.570, 2×23.555, 2×25.674, 2×27.571, 2×29.989, 32.352, 33.735, 36.025, 38.572, 41.664, 45.470]

27.0 dB: u=[3×1.000, 4×2.745, 4×4.753, 4×6.566, 4×8.609, 4×10.551, 4×12.676, 4×14.803, 4×17.089, 4×19.483, 4×22.077, 4×24.963, 2×27.649, 2×29.257, 2×31.590, 2×34.012, 2×36.929, 39.733, 41.723, 44.342, 47.359, 50.916, 55.220]

28.0 dB: u=[3×1.000, 4×2.934, 4×4.950, 4×6.934, 4×9.004, 4×11.085, 4×13.261, 4×15.500, 4×17.856, 4×20.345, 4×23.061, 26.883, 2×25.549, 26.883, 28.997, 2×30.983, 28.997, 35.865, 2×33.295, 35.865, 39.681, 41.897, 44.144, 38.325, 49.799, 46.784, 53.994, 58.160]

29.0 dB: u=[3×1.000, 4×2.988, 4×5.007, 4×7.036, 4×9.114, 4×11.232, 4×13.416, 4×15.675, 4×18.045, 4×20.600, 22.896, 2×24.145, 22.896, 27.774, 2×26.034, 27.774, 29.763, 2×31.861, 29.763, 36.863, 2×34.180, 36.863, 41.043, 43.147, 45.453, 39.320, 50.968, 48.048, 54.910, 58.822]

30.0 dB: u=[3×1.000, 4×3.000, 4×5.016, 4×7.051, 4×9.121, 4×11.232, 4×13.405, 4×15.676, 4×18.150, 2×20.295, 2×21.595, 2×23.273, 2×24.873, 2×26.639, 2×28.470, 2×30.436, 2×32.551, 2×34.942, 37.104, 38.513, 40.306, 42.170, 44.245, 46.527, 49.052, 51.851, 54.998, 58.656]

31.0 dB: u=[3×1.000, 4×3.003, 4×5.019, 4×7.054, 4×9.125, 4×11.267, 4×13.569, 2×15.535, 2×16.677, 2×18.190, 2×19.557, 2×21.091, 2×22.613, 2×24.235, 2×25.904, 2×27.669, 2×29.524, 2×31.508, 2×33.712, 35.686, 36.918, 38.517, 40.116, 41.883, 43.779, 45.847, 48.096, 50.551, 53.249, 56.249, 59.711]

32.0 dB: u=[3×1.000, 4×3.013, 4×5.079, 4×7.260, 2×9.090, 2×10.097, 2×11.482, 2×12.648, 2×14.021, 2×15.290, 2×16.687, 2×18.042, 2×19.489, 2×20.937, 2×22.460, 2×24.017, 2×25.645, 2×27.335, 2×29.110, 2×30.987, 2×33.055, 34.885, 35.997, 37.462, 38.884, 40.452, 42.102, 43.877, 45.783, 47.836, 50.050, 52.443, 55.051, 57.933, 61.231]

33.0 dB: u=[1.000, 2×2.762, 2×4.766, 2×6.547, 2×8.555, 2×10.371, 2×12.392, 2×14.256, 2×16.299, 2×18.227, 2×20.305, 2×22.314, 2×24.444, 2×26.544, 2×28.745, 2×30.954, 2×33.252, 2×35.590, 2×38.020, 2×40.522, 2×43.123, 2×45.824, 2×48.677, 2×51.806, 54.547, 56.212, 58.368, 60.435, 62.704, 65.049, 67.558, 70.213, 73.046, 76.062, 79.283, 82.728, 86.428, 90.433, 94.832, 99.852]

34.0 dB: u=[1.000, 2×2.943, 2×4.950, 2×6.907, 2×8.928, 2×10.909, 2×12.948, 2×14.965, 2×17.043, 2×19.112, 2×21.236, 2×23.367, 2×25.550, 2×27.758, 2×30.021, 2×32.328, 2×34.694, 2×37.116, 2×39.612, 2×42.186, 2×44.868, 2×47.764, 2×51.004, 53.703, 55.498, 57.510, 59.526, 61.671, 63.886, 66.220, 68.665, 71.237, 73.948, 76.809, 79.828, 83.024, 86.409, 90.026, 93.913, 98.160, 102.946]

35.0 dB: u=[1.000, 2×2.994, 2×5.002, 2×7.004, 2×9.027, 2×11.050, 2×13.097, 2×15.150, 2×17.233, 2×19.328, 2×21.461, 2×23.614, 2×25.805, 2×28.030, 2×30.293, 2×32.600, 2×34.961, 2×37.382, 2×39.923, 2×42.690, 2×45.736, 48.209, 49.842, 51.639, 53.417, 55.298, 57.211, 59.205, 61.266, 63.411, 65.644, 67.971, 70.400, 72.940, 75.594, 78.374, 81.287, 84.349, 87.577, 90.999, 94.654, 98.612, 103.054]

36.0 dB: u=[1.000, 2×2.999, 2×5.002, 2×7.009, 2×9.026, 2×11.051, 2×13.089, 2×15.141, 2×17.211, 2×19.300, 2×21.411, 2×23.547, 2×25.710, 2×27.910, 2×30.167, 2×32.544, 2×35.125, 37.258, 38.564, 40.135, 41.577, 43.166, 44.701, 46.334, 47.954, 49.649, 51.360, 53.135, 54.946, 56.821, 58.748, 60.741, 62.799, 64.931, 67.137, 69.424, 71.796, 74.259, 76.818, 79.482, 82.261, 85.166, 88.211, 91.422, 94.837, 98.522, 102.628]

37.0 dB: u=[1.000, 2×3.000, 2×5.000, 2×7.007, 2×9.021, 2×11.041, 2×13.073, 2×15.117, 2×17.179, 2×19.282, 2×21.477, 2×23.822, 2×26.316, 28.304, 29.538, 30.962, 32.269, 33.704, 35.065, 36.522, 37.937, 39.428, 40.895, 42.428, 43.953, 45.536, 47.126, 48.764, 50.430, 52.143, 53.885, 55.680, 57.517, 59.408, 61.348, 63.347, 65.404, 67.519, 69.702, 71.955, 74.279, 76.680, 79.165, 81.738, 84.409, 87.195, 90.105, 93.161, 96.396, 99.876, 103.730]

f2) 65536-QAM/256-PAM for the AWGN Channel (Maximum Penalty of 0.01 b/s/Hz)

0.0 dB: u=[127×1.000]

1.0 dB: u=[127×1.000]

2.0 dB: u=[127×1.000]

3.0 dB: u=[63×1.000, 64×2.176]

4.0 dB: u=[63×1.000, 64×2.831]

5.0 dB: u=[63×1.000, 64×3.319]

6.0 dB: u=[63×1.000, 64×3.669]

7.0 dB: u=[63×1.000, 62×3.653, 2×7.428]

8.0 dB: u=[63×1.000, 2×3.524, 2×4.158, 30×3.524, 2×4.158, 14×3.524, 2×4.158, 6×3.524, 2×4.158, 6.043, 6.215, 7.680, 7.029]

9.0 dB: u=[39×1.000, 8×1.208, 16×1.000, 4×3.414, 3.949, 3.867, 3.709, 3.790, 27×3.414, 3.709, 4.025, 3.949, 3.790, 3.867, 8×3.414, 3.709, 3.414, 3.790, 3.867, 4.195, 4.124, 3.949, 4.025, 2×5.585, 2×5.457, 6.201, 6.432, 7.835, 6.982]

10.0 dB: u=[31×1.000, 32×1.371, 32×3.646, 16×4.371, 8×5.529, 4×6.363, 7.504, 7.172, 7.721, 9.329]

11.0 dB: u=[31×1.000, 32×1.819, 32×4.102, 24×6.089, 4×7.686, 2×8.970, 11.102, 8.970]

12.0 dB: u=[31×1.000, 32×2.239, 32×4.564, 24×7.060, 4×8.864, 2×10.201, 10.753, 12.687]

13.0 dB: u=[31×1.000, 32×2.599, 32×4.956, 16×7.464, 8×8.718, 4×9.994, 2×11.216, 12.193, 14.175]

14.0 dB: u=[31×1.000, 32×2.847, 16×4.969, 16×5.523, 16×7.918, 8×9.772, 4×11.041, 2×12.243, 15.485, 13.454]

15.0 dB: u=[31×1.000, 32×2.985, 16×5.098, 16×5.749, 16×8.192, 8×10.348, 4×11.936, 2×13.138, 14.441, 16.525]

16.0 dB: u=[31×1.000, 32×3.057, 16×5.170, 16×5.895, 8×8.067, 8×8.580, 8×10.657, 4×12.534, 2×13.991, 15.329, 17.384]

17.0 dB: u=[31×1.000, 32×3.087, 16×5.162, 16×6.005, 8×8.053, 8×8.616, 4×10.508, 4×10.968, 2×12.598, 2×13.010, 14.298, 14.760, 16.006, 18.015]

18.0 dB: u=[31×1.000, 16×2.882, 16×3.323, 16×5.115, 16×6.236, 8×8.092, 8×8.703, 4×10.548, 4×11.034, 2×12.707, 2×13.149, 14.596, 15.045, 16.504, 18.510]

19.0 dB: u=[15×1.000, 16×1.512, 16×3.469, 16×4.404, 16×6.382, 16×8.128, 8×10.249, 8×11.102, 4×13.268, 4×13.898, 4×16.235, 18.400, 18.930, 20.886, 23.376]

20.0 dB: u=[15×1.000, 16×2.386, 16×4.414, 16×6.118, 16×8.317, 16×10.681, 8×13.219, 8×14.484, 4×17.007, 4×17.863, 4×20.710, 23.436, 24.086, 26.592, 29.684]

21.0 dB: u=[15×1.000, 16×2.820, 16×4.880, 16×6.919, 16×9.246, 8×11.565, 8×12.244, 8×14.603, 8×16.419, 4×18.933, 4×20.059, 2×22.600, 2×23.459, 25.960, 26.703, 29.412, 32.727]

22.0 dB: u=[15×1.000, 16×2.962, 16×5.037, 16×7.191, 16×9.578, 8×11.900, 8×12.854, 8×15.118, 8×17.292, 4×19.744, 4×21.306, 23.668, 2×24.741, 23.668, 30.643, 27.984, 27.122, 33.921]

23.0 dB: u=[15×1.000, 16×3.005, 16×5.084, 16×7.272, 8×9.405, 8×9.977, 8×11.970, 8×13.288, 8×15.379, 4×17.349, 4×18.064, 4×20.124, 2×21.729, 2×22.257, 2×24.230, 2×25.676, 27.844, 28.971, 31.440, 34.588]

24.0 dB: u=[15×1.000, 16×3.015, 16×5.093, 16×7.299, 8×9.336, 8×10.290, 8×12.080, 8×13.695, 8×15.693, 4×17.647, 4×18.557, 4×20.488, 2×22.200, 2×22.835, 2×24.707, 2×26.420, 28.485, 29.923, 32.234, 35.223]

25.0 dB: u=[15×1.000, 16×3.019, 16×5.119, 8×7.013, 8×7.850, 8×9.457, 8×10.784, 8×12.431, 8×14.162, 8×16.173, 4×18.103, 4×19.312, 4×21.121, 2×22.865, 2×23.634, 2×25.421, 26.977, 27.597, 29.327, 30.957, 33.192, 36.048]

26.0 dB: u=[7×1.000, 8×1.751, 8×3.715, 8×4.672, 8×6.564, 8×7.850, 8×9.697, 8×11.309, 8×13.208, 8×15.117, 8×17.229, 8×19.530, 4×21.756, 4×22.685, 4×24.742, 4×26.554, 4×28.880, 2×31.151, 2×32.415, 2×34.639, 36.730, 37.664, 39.858, 42.102, 44.969, 48.567]

27.0 dB: u=[7×1.000, 8×2.720, 8×4.728, 8×6.519, 8×8.560, 8×10.483, 8×12.601, 8×14.713, 8×16.990, 8×19.369, 8×21.949, 8×24.810, 4×27.482, 4×29.033, 4×31.365, 4×33.752, 4×36.622, 2×39.387, 2×41.287, 2×43.909, 2×47.187, 50.441, 53.239, 56.649, 60.853]

28.0 dB: u=[7×1.000, 8×2.928, 8×4.944, 8×6.920, 8×8.990, 8×11.065, 8×13.238, 8×15.473, 8×17.828, 8×20.314, 8×23.015, 4×25.501, 4×26.777, 4×28.909, 4×30.873, 4×33.178, 4×35.725, 2×38.173, 2×39.456, 2×41.675, 2×43.881, 2×46.603, 49.238, 51.105, 53.590, 56.454, 59.836, 63.927]

29.0 dB: u=[7×1.000, 8×2.986, 8×5.004, 8×7.032, 8×9.109, 8×11.223, 8×13.408, 8×15.666, 8×18.031, 8×20.568, 4×22.862, 4×24.045, 4×25.955, 4×27.666, 4×29.653, 4×31.738, 4×34.042, 4×36.686, 2×39.119, 2×40.782, 2×42.873, 2×45.181, 47.419, 48.625, 50.667, 52.731, 55.171, 57.969, 61.203, 65.058]

30.0 dB: u=[7×1.000, 8×3.001, 8×5.020, 8×7.057, 8×9.131, 8×11.246, 8×13.421, 8×15.683, 8×18.127, 4×20.268, 4×21.504, 4×23.204, 4×24.782, 4×26.549, 4×28.369, 4×30.330, 4×32.432, 4×34.784, 2×36.929, 2×38.256, 2×40.052, 2×41.875, 2×43.937, 2×46.318, 48.534, 50.063, 51.990, 54.102, 56.491, 59.187, 62.258, 65.870]

31.0 dB: u=[7×1.000, 8×3.003, 8×5.019, 8×7.054, 8×9.122, 8×11.247, 8×13.502, 4×15.460, 4×16.513, 4×18.052, 4×19.381, 4×20.921, 4×22.424, 4×24.042, 4×25.699, 4×27.454, 4×29.296, 4×31.262, 4×33.418, 2×35.368, 2×36.504, 2×38.110, 2×39.660, 2×41.401, 2×43.273, 2×45.381, 47.329, 48.513, 50.173, 51.856, 53.758, 55.858, 58.191, 60.789, 63.713, 67.116]

32.0 dB: u=[7×1.000, 8×3.006, 8×5.044, 8×7.165, 4×8.995, 4×9.879, 4×11.320, 4×12.434, 4×13.833, 4×15.084, 4×16.495, 4×17.846, 4×19.301, 4×20.747, 4×22.273, 4×23.829, 4×25.460, 4×27.149, 4×28.924, 4×30.794, 4×32.828, 2×34.649, 2×35.673, 2×37.158, 2×38.541, 2×40.098, 2×41.722, 2×43.483, 2×45.409, 47.191, 48.124, 49.644, 51.049, 52.674, 54.418, 56.330, 58.425, 60.723, 63.256, 66.083, 69.345]

33.0 dB: u=[3×1.000, 4×2.712, 4×4.714, 4×6.435, 4×8.443, 4×10.207, 4×12.226, 4×14.042, 4×16.079, 4×17.969, 4×20.039, 4×22.012, 4×24.125, 4×26.187, 4×28.366, 4×30.537, 4×32.808, 4×35.112, 4×37.514, 4×39.982, 4×42.543, 4×45.207, 4×48.003, 4×51.017, 4×54.429, 2×57.335, 2×59.292, 2×61.525, 2×63.798, 2×66.245, 2×68.838, 2×71.635, 2×74.809, 77.634, 79.518, 81.802, 84.144, 86.728, 89.497, 92.509, 95.768, 99.325, 103.203, 107.495, 112.416]

34.0 dB: u=[3×1.000, 4×2.925, 4×4.928, 4×6.864, 4×8.882, 4×10.844, 4×12.883, 4×14.882, 4×16.950, 4×18.995, 4×21.107, 4×23.219, 4×25.393, 4×27.583, 4×29.835, 4×32.125, 4×34.479, 4×36.888, 4×39.369, 4×41.925, 4×44.576, 4×47.376, 4×50.468, 2×53.110, 2×54.771, 2×56.793, 2×58.742, 2×60.857, 2×63.018, 2×65.307, 2×67.698, 2×70.232, 2×72.952, 2×76.025, 78.702, 80.475, 82.580, 84.717, 87.028, 89.485, 92.117, 94.936, 97.958, 101.203, 104.696, 108.486, 112.652, 117.394]

35.0 dB: u=[3×1.000, 4×2.984, 4×4.987, 4×6.980, 4×8.997, 4×11.011, 4×13.053, 4×15.099, 4×17.174, 4×19.263, 4×21.385, 4×23.530, 4×25.714, 4×27.928, 4×30.187, 4×32.490, 4×34.843, 4×37.251, 4×39.735, 4×42.355, 4×45.234, 2×47.654, 2×49.164, 2×50.979, 2×52.698, 2×54.564, 2×56.433, 2×58.403, 2×60.420, 2×62.532, 2×64.719, 2×67.010, 2×69.421, 2×72.032, 74.352, 75.647, 77.507, 79.204, 81.118, 83.067, 85.144, 87.321, 89.634, 92.084, 94.688, 97.451, 100.380, 103.497, 106.828, 110.418, 114.336, 118.759]

36.0 dB: u=[3×1.000, 4×2.989, 4×4.993, 4×6.994, 4×8.995, 4×11.008, 4×13.043, 4×15.093, 4×17.158, 4×19.243, 4×21.356, 4×23.490, 4×25.650, 4×27.841, 4×30.070, 4×32.352, 4×34.740, 4×37.324, 2×39.484, 2×40.779, 2×42.392, 2×43.861, 2×45.497, 2×47.077, 2×48.747, 2×50.422, 2×52.167, 2×53.931, 2×55.770, 2×57.663, 2×59.621, 2×61.639, 2×63.727, 2×65.895, 2×68.191, 2×70.739, 72.922, 74.300, 75.964, 77.595, 79.344, 81.138, 83.037, 85.014, 87.092, 89.253, 91.537, 93.932, 96.465, 99.108, 101.914, 104.876, 108.021, 111.366, 115.037, 119.139]

37.0 dB: u=[3×1.000, 4×2.997, 4×4.999, 4×7.007, 4×9.024, 4×11.050, 4×13.079, 4×15.122, 4×17.181, 4×19.254, 4×21.355, 4×23.489, 4×25.693, 4×28.060, 4×30.601, 2×32.647, 2×33.919, 2×35.392, 2×36.746, 2×38.224, 2×39.653, 2×41.171, 2×42.666, 2×44.228, 2×45.790, 2×47.404, 2×49.033, 2×50.711, 2×52.418, 2×54.177, 2×55.990, 2×57.840, 2×59.741, 2×61.705, 2×63.727, 2×65.874, 2×68.222, 70.226, 71.454, 72.968, 74.399, 75.939, 77.501, 79.147, 80.824, 82.585, 84.404, 86.299, 88.276, 90.339, 92.487, 94.730, 97.075, 99.520, 102.070, 104.762, 107.588, 110.586, 113.773, 117.223, 121.065]

38.0 dB: u=[3×1.000, 4×3.005, 4×5.009, 4×7.018, 4×9.035, 4×11.062, 4×13.172, 4×15.424, 2×17.310, 2×18.358, 2×19.754, 2×20.913, 2×22.250, 2×23.456, 2×24.787, 2×26.031, 2×27.410, 2×28.692, 2×30.072, 2×31.374, 2×32.766, 2×34.142, 2×35.581, 2×36.981, 2×38.440, 2×39.894, 2×41.388, 2×42.911, 2×44.446, 2×45.974, 2×47.559, 2×49.143, 2×50.785, 2×52.468, 2×54.185, 2×55.946, 2×57.729, 2×59.552, 2×61.410, 2×63.338, 2×65.385, 2×67.626, 69.490, 70.624, 72.051, 73.323, 74.748, 76.151, 77.669, 79.176, 80.748, 82.337, 83.995, 85.730, 87.490, 89.327, 91.257, 93.258, 95.308, 97.438, 99.656, 101.980, 104.390, 106.909, 109.574, 112.319, 115.237, 118.346, 121.697, 125.593]

39.0 dB: u=[1.000, 2×2.751, 2×4.747, 2×6.496, 2×8.486, 2×10.232, 2×12.231, 2×13.997, 2×15.998, 2×17.792, 2×19.801, 2×21.616, 2×23.631, 2×25.469, 2×27.492, 2×29.361, 2×31.393, 2×33.296, 2×35.349, 2×37.291, 2×39.360, 2×41.336, 2×43.420, 2×45.435, 2×47.548, 2×49.608, 2×51.754, 2×53.869, 2×56.063, 2×58.237, 2×60.470, 2×62.701, 2×64.988, 2×67.283, 2×69.626, 2×71.986, 2×74.402, 2×76.842, 2×79.328, 2×81.856, 2×84.445, 2×87.089, 2×89.779, 2×92.518, 2×95.321, 2×98.201, 2×101.204, 2×104.464, 107.214, 108.859, 110.936, 112.827, 114.927, 116.964, 119.123, 121.275, 123.524, 125.798, 128.155, 130.567, 133.060, 135.620, 138.265, 140.991, 143.813, 146.722, 149.727, 152.824, 156.032, 159.353, 162.784, 166.332, 170.024, 173.856, 177.846, 182.017, 186.406, 191.051, 196.029, 201.527]

40.0 dB: u=[1.000, 2×2.968, 2×5.011, 2×7.027, 2×9.111, 2×11.119, 2×13.194, 2×15.207, 2×17.290, 2×19.326, 2×21.413, 2×23.450, 2×25.542, 2×27.597, 2×29.706, 2×31.783, 2×33.910, 2×36.005, 2×38.150, 2×40.263, 2×42.417, 2×44.591, 2×46.807, 2×49.019, 2×51.263, 2×53.505, 2×55.784, 2×58.072, 2×60.405, 2×62.733, 2×65.112, 2×67.506, 2×69.909, 2×72.329, 2×74.805, 2×77.307, 2×79.848, 2×82.426, 2×85.060, 2×87.718, 2×90.448, 2×93.242, 2×96.116, 2×99.155, 2×102.411, 105.112, 106.717, 108.719, 110.488, 112.474, 114.411, 116.467, 118.479, 120.599, 122.739, 124.950, 127.193, 129.496, 131.814, 134.178, 136.585, 139.086, 141.643, 144.315, 147.044, 149.863, 152.735, 155.692, 158.704, 161.825, 165.014, 168.299, 171.634, 175.110, 178.675, 182.371, 186.233, 190.233, 194.388, 198.750, 203.386, 208.349, 213.825]

g2) 262144-QAM/512-PAM for the AWGN Channel (Maximum Penalty of 0.01 b/s/Hz)

0.0 dB: u=[255×1.000]

1.0 dB: u=[255×1.000]

2.0 dB: u=[255×1.000]

3.0 dB: u=[127×1.000, 128×2.176]

4.0 dB: u=[127×1.000, 128×2.828]

5.0 dB: u=[127×1.000, 128×3.320]

6.0 dB: u=[127×1.000, 128×3.670]

7.0 dB: u=[127×1.000, 124×3.635, 4×7.334]

8.0 dB: u=[127×1.000, 4×3.519, 2×4.141, 2×4.023, 60×3.519, 2×4.246, 2×4.023, 28×3.519, 2×4.246, 2×4.023, 10×3.519, 2×4.023, 2×4.459, 2×4.246, 2×6.136, 2×6.016, 2×7.034, 2×7.764]

9.0 dB: u=[15×1.000, 16×1.116, 16×1.253, 16×1.116, 16×1.253, 16×1.401, 16×1.253, 16×1.116, 4×3.971, 4.301, 4.367, 2×4.239, 2×4.571, 2×4.669, 2×4.459, 2×4.367, 16×3.971, 8×3.705, 28×3.971, 4.301, 4.367, 2×4.239, 2×4.571, 2×4.669, 2×4.459, 2×4.367, 18×3.971, 2×4.239, 4.367, 4.459, 4.367, 4.301, 2×4.669, 4.793, 4.747, 2×4.571, 2×4.459, 6.404, 6.449, 6.485, 6.449, 4×6.347, 7.465, 7.367, 7.202, 7.259, 8.254, 7.911, 8.572, 9.660]

10.0 dB: u=[63×1.000, 64×1.366, 64×3.645, 32×4.350, 16×5.514, 8×6.396, 2×7.465, 2×7.203, 2×7.759, 9.944, 8.539]

11.0 dB: u=[63×1.000, 64×1.816, 64×4.100, 48×6.082, 8×7.720, 4×8.622, 2×9.846, 11.840, 9.846]

12.0 dB: u=[63×1.000, 64×2.231, 64×4.554, 48×7.043, 8×8.850, 4×10.088, 2×10.957, 11.673, 13.547]

13.0 dB: u=[63×1.000, 64×2.597, 64×4.955, 32×7.466, 16×8.711, 8×10.007, 4×11.233, 2×12.260, 13.208, 15.101]

14.0 dB: u=[63×1.000, 64×2.845, 32×4.965, 32×5.519, 32×7.910, 16×9.772, 8×10.971, 4×12.292, 3×13.850, 16.380]

15.0 dB: u=[63×1.000, 64×2.986, 32×5.101, 32×5.750, 32×8.195, 16×10.350, 8×11.935, 4×13.231, 2×14.432, 17.564, 15.583]

16.0 dB: u=[63×1.000, 64×3.057, 32×5.169, 32×5.896, 16×8.069, 16×8.582, 16×10.658, 8×12.533, 4×14.014, 2×15.260, 16.504, 18.483]

17.0 dB: u=[63×1.000, 64×3.085, 32×5.161, 32×6.002, 16×8.051, 16×8.614, 8×10.503, 8×10.964, 8×12.794, 4×14.516, 16.168, 15.721, 19.168, 17.239]

18.0 dB: u=[63×1.000, 32×2.883, 32×3.320, 32×5.110, 32×6.225, 16×8.080, 16×8.686, 8×10.530, 8×11.014, 4×12.696, 4×13.122, 2×14.596, 2×14.995, 16.645, 16.201, 19.748, 17.857]

19.0 dB: u=[31×1.000, 32×1.500, 32×3.456, 32×4.378, 32×6.353, 32×8.088, 16×10.203, 16×11.049, 8×13.206, 8×13.837, 8×16.156, 4×18.554, 20.987, 20.461, 25.040, 22.702]

20.0 dB: u=[31×1.000, 32×2.373, 32×4.399, 32×6.090, 32×8.284, 32×10.641, 16×13.176, 16×14.428, 8×16.947, 8×17.804, 8×20.627, 4×23.641, 26.141, 26.753, 29.044, 31.968]

21.0 dB: u=[31×1.000, 32×2.814, 32×4.875, 32×6.911, 32×9.236, 16×11.555, 16×12.232, 16×14.594, 16×16.408, 8×18.921, 8×20.046, 4×22.584, 4×23.418, 4×26.277, 29.034, 29.701, 32.271, 35.440]

22.0 dB: u=[31×1.000, 32×2.962, 32×5.038, 32×7.192, 32×9.575, 16×11.897, 16×12.838, 16×15.104, 16×17.266, 8×19.715, 8×21.262, 4×23.625, 4×24.678, 4×27.485, 2×30.637, 33.592, 36.773]

23.0 dB: u=[31×1.000, 32×3.004, 32×5.080, 32×7.262, 32×9.674, 16×11.949, 16×13.259, 16×15.347, 8×17.312, 8×18.020, 8×20.076, 8×21.936, 4×24.166, 4×25.592, 2×27.759, 2×28.797, 30.980, 31.841, 34.296, 37.350]

24.0 dB: u=[31×1.000, 32×3.014, 32×5.091, 32×7.294, 16×9.330, 16×10.272, 16×12.064, 16×13.671, 16×15.669, 8×17.622, 8×18.521, 8×20.454, 4×22.155, 4×22.780, 4×24.646, 4×26.335, 2×28.388, 2×29.778, 31.769, 32.893, 35.174, 38.095]

25.0 dB: u=[31×1.000, 32×3.019, 32×5.117, 16×7.013, 16×7.837, 16×9.450, 16×10.770, 16×12.418, 16×14.146, 16×16.153, 8×18.082, 8×19.278, 8×21.087, 4×22.827, 4×23.579, 4×25.364, 2×26.908, 2×27.491, 2×29.218, 2×30.820, 32.749, 34.169, 36.333, 39.127]

26.0 dB: u=[31×1.000, 16×2.711, 16×3.387, 16×4.781, 16×5.708, 16×7.063, 16×8.235, 16×9.625, 16×11.018, 16×12.561, 16×14.242, 8×15.870, 8×16.542, 8×18.048, 8×19.367, 8×21.063, 4×22.717, 4×23.625, 4×25.242, 2×26.760, 2×27.404, 2×29.008, 30.945, 30.387, 33.989, 32.503, 38.582, 36.007]

27.0 dB: u=[15×1.000, 16×2.712, 16×4.720, 16×6.502, 16×8.541, 16×10.457, 16×12.572, 16×14.678, 16×16.952, 16×19.327, 16×21.903, 16×24.756, 8×27.423, 8×28.953, 8×31.285, 8×33.658, 8×36.513, 4×39.264, 4×41.128, 4×43.727, 2×46.262, 2×47.600, 2×50.142, 2×53.052, 56.099, 58.700, 61.998, 66.125]

28.0 dB: u=[15×1.000, 16×2.925, 16×4.941, 16×6.916, 16×8.986, 16×11.060, 16×13.234, 16×15.469, 16×17.825, 16×20.309, 16×23.007, 8×25.494, 8×26.748, 8×28.887, 8×30.842, 8×33.144, 8×35.682, 4×38.129, 4×39.369, 4×41.592, 4×43.771, 4×46.463, 2×49.074, 2×50.879, 2×53.385, 55.838, 57.297, 59.712, 62.427, 65.708, 69.732]

29.0 dB: u=[15×1.000, 16×2.986, 16×5.004, 16×7.031, 16×9.107, 16×11.222, 16×13.406, 16×15.664, 16×18.029, 16×20.562, 8×22.859, 8×24.018, 8×25.937, 8×27.635, 8×29.625, 8×31.704, 8×34.002, 8×36.627, 4×39.052, 4×40.683, 4×42.770, 4×45.053, 2×47.279, 2×48.412, 2×50.460, 2×52.488, 2×55.015, 57.466, 59.252, 61.568, 64.245, 67.398, 71.190]

30.0 dB: u=[15×1.000, 16×3.000, 16×5.018, 16×7.055, 16×9.127, 16×11.242, 16×13.417, 16×15.676, 16×18.108, 8×20.249, 8×21.458, 8×23.166, 8×24.734, 8×26.502, 8×28.318, 8×30.275, 8×32.371, 8×34.709, 4×36.847, 4×38.139, 4×39.936, 4×41.741, 4×43.788, 4×46.132, 2×48.325, 2×49.795, 2×51.707, 2×53.816, 55.870, 57.015, 58.892, 60.818, 63.085, 65.678, 68.671, 72.224]

31.0 dB: u=[15×1.000, 16×3.004, 16×5.022, 16×7.058, 16×9.127, 16×11.251, 16×13.494, 8×15.453, 8×16.471, 8×18.024, 8×19.340, 8×20.885, 8×22.385, 8×24.005, 8×25.661, 8×27.417, 8×29.257, 8×31.220, 8×33.366, 4×35.315, 4×36.413, 4×38.029, 4×39.562, 4×41.296, 4×43.152, 4×45.233, 47.165, 2×48.274, 47.165, 51.578, 2×49.934, 51.578, 53.469, 2×55.662, 53.469, 60.926, 59.134, 57.713, 62.892, 65.125, 67.640, 70.498, 73.850]

32.0 dB: u=[15×1.000, 16×3.005, 16×5.035, 16×7.128, 8×8.962, 8×9.757, 8×11.234, 8×12.302, 8×13.719, 8×14.955, 8×16.370, 8×17.714, 8×19.171, 8×20.614, 8×22.140, 8×23.693, 8×25.323, 8×27.010, 8×28.781, 8×30.645, 8×32.659, 4×34.477, 4×35.442, 4×36.940, 4×38.292, 4×39.842, 4×41.448, 4×43.189, 4×45.087, 2×47.764, 2×46.841, 53.997, 52.602, 2×49.337, 2×50.655, 52.602, 54.790, 56.162, 57.253, 58.569, 59.839, 61.331, 62.910, 64.688, 66.658, 68.856, 71.307, 74.064, 77.281]

33.0 dB: u=[7×1.000, 8×2.671, 8×4.671, 8×6.365, 8×8.369, 8×10.104, 8×12.117, 8×13.910, 8×15.938, 8×17.803, 8×19.859, 8×21.807, 8×23.908, 8×25.954, 8×28.118, 8×30.273, 8×32.527, 8×34.812, 8×37.193, 8×39.640, 8×42.187, 8×44.830, 8×47.603, 8×50.576, 8×53.936, 4×56.810, 4×58.730, 4×60.946, 4×63.195, 4×65.615, 4×68.173, 4×70.932, 4×74.021, 76.790, 2×78.556, 76.790, 83.087, 2×80.809, 83.087, 85.598, 2×88.336, 85.598, 94.351, 2×91.499, 96.334, 98.719, 101.263, 104.055, 107.127, 110.507, 114.236, 118.403, 123.217]

34.0 dB: u=[7×1.000, 8×2.914, 8×4.916, 8×6.843, 8×8.857, 8×10.809, 8×12.844, 8×14.833, 8×16.899, 8×18.938, 8×21.048, 8×23.152, 8×25.320, 8×27.503, 8×29.750, 8×32.031, 8×34.378, 8×36.780, 8×39.256, 8×41.805, 8×44.445, 8×47.219, 8×50.254, 2×54.471, 4×52.878, 2×54.471, 2×56.502, 4×58.420, 2×56.502, 2×62.669, 4×60.526, 2×62.669, 2×64.944, 4×67.320, 2×64.944, 2×72.516, 4×69.834, 2×72.516, 2×75.512, 79.841, 2×78.155, 79.841, 2×75.512, 86.310, 88.727, 81.940, 2×84.029, 81.940, 88.727, 86.310, 94.297, 91.344, 100.837, 98.677, 96.943, 103.055, 91.344, 94.297, 110.962, 108.113, 105.490, 114.056, 117.423, 125.860, 121.784, 131.079]

35.0 dB: u=[7×1.000, 8×2.981, 8×4.987, 8×6.981, 8×9.003, 8×11.018, 8×13.062, 8×15.108, 8×17.187, 8×19.278, 8×21.406, 8×23.557, 8×25.746, 8×27.966, 8×30.232, 8×32.540, 8×34.900, 8×37.313, 8×39.797, 8×42.395, 8×45.221, 2×49.074, 4×47.629, 2×49.074, 2×50.909, 4×52.605, 2×50.909, 2×56.337, 4×54.478, 2×56.337, 2×58.305, 4×60.312, 2×58.305, 2×64.599, 4×62.418, 2×64.599, 2×66.884, 4×69.276, 2×66.884, 2×74.706, 4×71.836, 2×74.706, 77.176, 78.793, 80.702, 2×82.610, 80.702, 78.793, 77.176, 91.541, 89.091, 86.808, 2×84.662, 86.808, 89.091, 91.541, 94.289, 96.714, 102.167, 104.297, 106.543, 100.217, 98.282, 94.289, 109.837, 112.437, 115.236, 118.244, 121.484, 124.992, 128.852, 133.258]

36.0 dB: u=[7×1.000, 8×2.995, 8×4.999, 8×7.002, 8×9.018, 8×11.040, 8×13.080, 8×15.131, 8×17.204, 8×19.293, 8×21.407, 8×23.545, 8×25.713, 8×27.912, 8×30.149, 8×32.430, 8×34.789, 8×37.305, 8×40.055, 4×42.307, 4×43.732, 4×45.378, 4×46.938, 4×48.623, 4×50.288, 4×52.040, 4×53.808, 4×55.649, 4×57.531, 4×59.484, 4×61.496, 4×63.583, 4×65.750, 4×68.029, 4×70.512, 2×72.674, 2×73.951, 2×75.641, 2×77.214, 2×78.951, 2×80.708, 2×82.571, 2×84.504, 2×86.538, 2×88.675, 2×90.969, 2×93.550, 95.786, 97.254, 98.989, 100.734, 102.613, 104.584, 106.689, 113.802, 111.288, 108.919, 120.898, 123.947, 117.440, 127.766, 131.367, 135.439]

37.0 dB: u=[7×1.000, 8×3.001, 8×5.008, 8×7.019, 8×9.038, 8×11.065, 8×13.103, 8×15.154, 8×17.220, 8×19.304, 8×21.411, 8×23.544, 8×25.731, 8×28.030, 8×30.506, 4×32.542, 4×33.763, 4×35.259, 4×36.599, 4×38.099, 4×39.516, 4×41.044, 4×42.525, 4×44.090, 4×45.639, 4×47.255, 4×48.875, 4×50.555, 4×52.257, 4×54.014, 4×55.808, 4×57.656, 4×59.551, 4×61.505, 4×63.519, 4×65.615, 4×67.856, 4×70.348, 2×72.431, 2×73.781, 2×75.335, 2×76.852, 2×78.474, 2×80.123, 2×81.852, 2×83.635, 2×85.500, 2×87.443, 2×89.489, 2×91.699, 2×94.204, 97.737, 96.313, 103.229, 99.393, 100.814, 104.883, 106.781, 113.061, 110.859, 108.763, 116.322, 124.129, 121.377, 118.778, 127.812, 130.946, 134.362, 138.194]

38.0 dB: u=[7×1.000, 8×3.002, 8×5.006, 8×7.014, 8×9.029, 8×11.058, 8×13.116, 8×15.241, 8×17.489, 4×19.361, 4×20.381, 4×21.786, 4×22.926, 4×24.309, 4×25.515, 4×26.897, 4×28.151, 4×29.543, 4×30.842, 4×32.252, 4×33.596, 4×35.028, 4×36.415, 4×37.872, 4×39.303, 4×40.792, 4×42.271, 4×43.801, 4×45.335, 4×46.913, 4×48.506, 4×50.143, 4×51.803, 4×53.503, 4×55.235, 4×57.011, 4×58.828, 4×60.693, 4×62.608, 4×64.592, 4×66.702, 68.541, 2×69.509, 68.541, 72.186, 2×70.960, 72.186, 73.620, 2×74.990, 73.620, 77.947, 2×76.468, 77.947, 79.500, 2×81.083, 79.500, 84.418, 2×82.728, 84.418, 86.174, 2×87.990, 86.174, 91.887, 2×89.885, 91.887, 94.088, 95.983, 97.152, 94.088, 103.036, 98.609, 99.994, 101.507, 106.325, 108.078, 109.911, 104.651, 118.138, 111.829, 113.835, 115.937, 128.074, 125.397, 122.861, 120.442, 131.362, 134.383, 137.650, 141.301]

39.0 dB: u=[3×1.000, 4×2.677, 4×4.676, 4×6.358, 4×8.358, 4×10.052, 4×12.052, 4×13.763, 4×15.766, 4×17.496, 4×19.500, 4×21.256, 4×23.265, 4×25.051, 4×27.068, 4×28.889, 4×30.915, 4×32.771, 4×34.811, 4×36.704, 4×38.758, 4×40.692, 4×42.764, 4×44.742, 4×46.842, 4×48.867, 4×50.993, 4×53.065, 4×55.226, 4×57.356, 4×59.561, 4×61.751, 4×64.007, 4×66.265, 4×68.580, 4×70.908, 4×73.288, 4×75.693, 4×78.153, 4×80.645, 4×83.188, 4×85.774, 4×88.419, 4×91.119, 4×93.883, 4×96.712, 4×99.628, 4×102.708, 4×106.074, 2×108.879, 2×110.615, 2×112.699, 2×114.641, 2×116.762, 2×118.842, 2×121.042, 2×123.251, 2×125.552, 2×127.896, 2×130.328, 2×132.821, 2×135.397, 2×138.050, 2×140.796, 2×143.654, 2×146.715, 2×150.117, 152.970, 154.819, 156.948, 159.021, 161.239, 163.484, 165.843, 168.269, 170.808, 173.443, 176.186, 179.044, 182.024, 185.122, 188.346, 191.701, 195.202, 198.865, 207.449, 203.418, 212.351, 216.874, 221.751, 227.179]

40.0 dB: u=[3×1.000, 4×2.884, 4×4.868, 4×6.787, 4×8.796, 4×10.733, 4×12.764, 4×14.718, 4×16.746, 4×18.729, 4×20.770, 4×22.741, 4×24.758, 4×26.707, 4×28.730, 4×30.714, 4×32.782, 4×34.846, 4×36.972, 4×39.076, 4×41.212, 4×43.297, 4×45.418, 4×47.511, 4×49.663, 4×51.833, 4×54.051, 4×56.276, 4×58.541, 4×60.809, 4×63.114, 4×65.423, 4×67.796, 4×70.179, 4×72.604, 4×75.028, 4×77.480, 4×79.962, 4×82.507, 4×85.100, 4×87.722, 4×90.373, 4×93.097, 4×95.894, 4×98.818, 4×101.971, 2×104.608, 2×106.201, 2×108.143, 2×109.900, 2×111.831, 2×113.740, 2×115.749, 2×117.768, 2×119.876, 2×122.014, 2×124.151, 2×126.386, 2×128.620, 2×130.937, 2×133.303, 2×135.790, 2×138.316, 2×140.941, 2×143.602, 2×146.430, 2×149.483, 153.674, 152.079, 157.452, 155.652, 161.396, 159.464, 165.590, 163.491, 170.087, 167.782, 174.837, 172.447, 179.889, 177.326, 185.223, 182.532, 190.913, 187.989, 201.138, 197.890, 194.755, 204.461, 219.958, 208.625, 212.291, 216.021, 229.420, 225.077, 234.685, 240.034]

h2) 10485 76-QAM/1024-PAM for the AWGN Channel (Maximum Penalty of 0.01 b/s/Hz)

0.0 dB: u=[511×1.000]

1.0 dB: u=[511×1.000]

2.0 dB: u=[511×1.000]

3.0 dB: u=[255×1.000, 256×2.208]

4.0 dB: u=[255×1.000, 256×2.826]

5.0 dB: u=[255×1.000, 256×3.322]

6.0 dB: u=[255×1.000, 256×3.655]

7.0 dB: u=[255×1.000, 16×3.938, 112×3.442, 16×3.938, 48×3.442, 16×3.938, 16×3.442, 16×3.938, 8×5.643, 4×7.208, 7.561, 2×7.208, 7.561]

8.0 dB: u=[255×1.000, 8×3.505, 8×4.019, 120×3.505, 8×4.019, 56×3.505, 8×4.019, 16×3.505, 4×4.019, 4×4.263, 4×4.559, 4×4.460, 4×6.079, 4×5.949, 4×7.065, 7.707, 7.598, 7.707, 7.826]

9.0 dB: u=[159×1.000, 32×1.208, 64×1.000, 16×3.437, 4×3.854, 2×3.949, 2×3.854, 2×3.729, 2×3.763, 2×3.729, 34×3.437, 8×3.168, 72×3.437, 2×3.949, 2×3.987, 2×4.025, 2×3.987, 6×3.854, 2×3.763, 40×3.437, 8×3.854, 2×4.132, 2×4.169, 2×4.206, 2×4.169, 2×3.987, 2×4.025, 2×3.987, 2×3.949, 8×5.641, 8×5.444, 2×6.340, 2×6.213, 2×6.119, 2×6.213, 7.332, 7.360, 2×6.980, 7.360, 7.388, 8.022, 7.976]

10.0 dB: u=[127×1.000, 128×1.367, 128×3.647, 64×4.357, 32×5.506, 16×6.439, 4×7.389, 4×7.140, 4×7.763, 2×8.824, 9.706, 9.919]

11.0 dB: u=[127×1.000, 128×1.815, 128×4.094, 96×6.073, 16×7.721, 8×8.623, 5×9.841, 12.518, 11.033, 9.841]

12.0 dB: u=[127×1.000, 128×2.228, 128×4.553, 96×7.039, 16×8.833, 8×10.154, 6×11.185, 14.362, 12.624]

13.0 dB: u=[127×1.000, 128×2.598, 128×4.956, 64×7.463, 32×8.713, 16×10.003, 8×11.224, 4×12.284, 3×13.580, 15.960]

14.0 dB: u=[127×1.000, 128×2.846, 64×4.967, 64×5.518, 64×7.913, 32×9.767, 16×11.004, 8×12.302, 4×13.468, 3×14.893, 17.348]

15.0 dB: u=[127×1.000, 128×2.983, 64×5.095, 64×5.743, 64×8.183, 32×10.331, 16×11.906, 8×13.235, 4×14.434, 2×15.553, 18.520, 16.638]

16.0 dB: u=[127×1.000, 128×3.057, 64×5.170, 64×5.896, 32×8.070, 32×8.582, 32×10.654, 16×12.517, 8×14.010, 4×15.379, 2×16.431, 17.558, 19.523]

17.0 dB: u=[127×1.000, 128×3.088, 64×5.166, 64×6.009, 32×8.060, 32×8.623, 16×10.515, 16×10.976, 16×12.808, 8×14.532, 4×15.959, 17.421, 16.990, 20.277, 18.421]

18.0 dB: u=[127×1.000, 64×2.882, 64×3.317, 64×5.108, 64×6.221, 32×8.075, 32×8.681, 16×10.523, 16×11.006, 8×12.684, 8×13.112, 4×14.589, 4×14.974, 4×16.408, 18.017, 17.568, 20.895, 19.076]

19.0 dB: u=[63×1.000, 64×1.509, 64×3.465, 64×4.392, 64×6.367, 64×8.101, 32×10.218, 32×11.052, 16×13.219, 16×13.851, 16×16.177, 8×18.590, 4×20.772, 24.454, 22.960, 22.455, 26.649]

20.0 dB: u=[63×1.000, 64×2.370, 64×4.396, 64×6.084, 64×8.276, 64×10.624, 32×13.151, 32×14.391, 16×16.910, 16×17.756, 16×20.588, 8×23.604, 4×26.392, 29.263, 28.659, 34.095, 31.334]

21.0 dB: u=[63×1.000, 64×2.812, 64×4.871, 64×6.903, 64×9.230, 32×11.550, 32×12.224, 32×14.587, 32×16.397, 16×18.914, 16×20.025, 8×22.565, 8×23.406, 8×26.244, 4×29.313, 31.900, 32.521, 34.952, 38.002]

22.0 dB: u=[63×1.000, 64×2.960, 64×5.036, 64×7.189, 64×9.573, 32×11.896, 32×12.840, 32×15.109, 32×17.275, 16×19.730, 16×21.280, 8×23.641, 8×24.684, 8×27.470, 4×30.592, 2×33.571, 36.386, 39.432]

23.0 dB: u=[63×1.000, 64×3.005, 64×5.083, 64×7.269, 64×9.684, 32×11.961, 32×13.262, 32×15.353, 16×17.320, 16×18.021, 16×20.078, 16×21.928, 8×24.163, 8×25.590, 4×27.758, 4×28.802, 2×30.991, 2×31.791, 34.726, 33.992, 40.124, 37.140]

24.0 dB: u=[63×1.000, 64×3.015, 64×5.092, 64×7.294, 32×9.333, 32×10.268, 32×12.064, 32×13.668, 32×15.664, 16×17.613, 16×18.506, 16×20.437,

8×22.137, 8×22.762, 8×24.626, 8×26.307, 4×28.354, 4×29.733, 2×31.731, 2×32.802, 34.786, 35.751, 37.990, 40.849]

25.0 dB: u=[63×1.000, 64×3.019, 64×5.115, 32×7.010, 32×7.826, 32×9.442, 32×10.758, 32×12.406, 32×14.133, 32×16.139, 16×18.067, 16×19.263, 16×21.067, 8×22.804, 8×23.552, 8×25.334, 4×26.869, 4×27.456, 4×29.178, 4×30.774, 2×32.691, 2×34.070, 35.924, 37.115, 39.212, 41.917]

26.0 dB: u=[63×1.000, 32×2.720, 32×3.382, 32×4.792, 32×5.716, 32×7.083, 32×8.262, 32×9.661, 32×11.063, 32×12.613, 32×14.303, 16×15.939, 16×16.610, 16×18.123, 16×19.441, 16×21.141, 8×22.804, 8×23.703, 8×25.336, 4×26.860, 4×27.513, 4×29.119, 4×30.770, 2×32.596, 2×34.073, 35.822, 37.133, 39.103, 41.643]

27.0 dB: u=[31×1.000, 32×2.708, 32×4.716, 32×6.496, 32×8.536, 32×10.448, 32×12.563, 32×14.665, 32×16.936, 32×19.305, 32×21.875, 32×24.723, 16×27.390, 16×28.915, 16×31.249, 16×33.618, 16×36.467, 8×39.212, 8×41.056, 8×43.655, 4×46.186, 4×47.528, 4×50.059, 4×52.930, 2×55.948, 2×58.589, 61.472, 63.838, 67.021, 71.065]

28.0 dB: u=[31×1.000, 32×2.924, 32×4.940, 32×6.912, 32×8.981, 32×11.052, 32×13.223, 32×15.452, 32×17.802, 32×20.281, 32×22.971, 16×25.455, 16×26.697, 16×28.838, 16×30.787, 16×33.087, 16×35.619, 8×38.059, 8×39.285, 8×41.512, 8×43.686, 8×46.368, 4×48.967, 4×50.738, 4×53.225, 2×55.656, 2×57.051, 2×59.475, 2×62.354, 65.318, 67.873, 71.052, 75.010]

29.0 dB: u=[31×1.000, 32×2.985, 32×5.003, 32×7.030, 32×9.106, 32×11.219, 32×13.403, 32×15.660, 32×18.024, 32×20.553, 16×22.850, 16×23.996, 16×25.921, 16×27.619, 16×29.607, 16×31.684, 16×33.980, 16×36.595, 8×39.014, 8×40.629, 8×42.713, 8×44.990, 4×47.213, 4×48.333, 4×50.376, 4×52.385, 4×54.887, 2×57.312, 2×59.046, 2×61.389, 63.693, 65.162, 67.411, 69.980, 73.056, 76.807]

30.0 dB: u=[31×1.000, 32×3.001, 32×5.019, 32×7.057, 32×9.131, 32×11.246, 32×13.419, 32×15.676, 32×18.101, 16×20.240, 16×21.435, 16×23.147, 16×24.710, 16×26.478, 16×28.292, 16×30.247, 16×32.342, 16×34.673, 8×36.808, 8×38.086, 8×39.885, 8×41.684, 8×43.730, 8×46.068, 4×48.255, 4×49.706, 4×51.609, 4×53.696, 2×55.735, 2×56.816, 2×58.692, 2×60.599, 2×62.974, 65.260, 66.986, 69.144, 71.641, 74.559, 78.055]

31.0 dB: u=[31×1.000, 32×3.003, 32×5.018, 32×7.053, 32×9.120, 32×11.239, 32×13.475, 16×15.432, 16×16.431, 16×17.990, 16×19.299, 16×20.845, 16×22.342, 16×23.961, 16×25.615, 16×27.368, 16×29.207, 16×31.167, 16×33.309, 8×35.254, 8×36.343, 8×37.960, 8×39.486, 8×41.216, 8×43.066, 8×45.133, 4×47.056, 4×48.133, 4×49.794, 4×51.421, 4×53.299, 4×55.460, 2×57.490, 2×58.865, 2×60.642, 2×62.619, 64.538, 65.669, 67.406, 69.233, 71.362, 73.794, 76.594, 79.911]

32.0 dB: u=[31×1.000, 32×3.005, 32×5.034, 32×7.127, 16×8.959, 16×9.758, 16×11.233, 16×12.303, 16×13.718, 16×14.953, 16×16.368, 16×17.713, 16×19.168, 16×20.611, 16×22.136, 16×23.689, 16×25.318, 16×27.005, 16×28.777, 16×30.641, 16×32.658, 8×34.475, 8×35.447, 8×36.943, 8×38.299, 8×39.849, 8×41.458, 8×43.200, 8×45.097, 4×46.866, 4×47.702, 4×49.237, 4×50.583, 4×52.185, 4×53.891, 4×55.812, 2×57.609, 2×58.618, 2×60.179, 2×61.715, 2×63.498, 65.211, 65.947, 67.522, 68.902, 70.603, 72.480, 74.597, 76.979, 79.680, 82.846]

33.0 dB: u=[15×1.000, 16×2.656, 16×4.659, 16×6.338, 16×8.339, 16×10.061, 16×12.073, 16×13.860, 16×15.884, 16×17.740, 16×19.787, 16×21.732, 16×23.829, 16×25.867, 16×28.025, 16×30.170, 16×32.420, 16×34.699, 16×37.075, 16×39.513, 16×42.050, 16×44.682, 16×47.447, 16×50.404, 16×53.734, 8×56.594, 8×58.485, 8×60.702, 8×62.933, 8×65.349, 8×67.888, 8×70.636, 8×73.704, 4×76.457, 4×78.198, 4×80.453, 4×82.713, 4×85.209, 4×87.923, 4×91.044, 2×93.875, 2×95.806, 2×98.139, 2×100.646, 2×103.467, 2×106.868, 109.922, 112.212, 114.848, 117.768, 120.987, 124.593, 128.669, 133.396]

34.0 dB: u=[15×1.000, 16×2.910, 16×4.914, 16×6.837, 16×8.852, 16×10.800, 16×12.835, 16×14.820, 16×16.886, 16×18.923, 16×21.032, 16×23.134, 16×25.302, 16×27.484, 16×29.731, 16×32.014, 16×34.363, 16×36.766, 16×39.245, 16×41.797, 16×44.442, 16×47.215, 16×50.240, 8×52.861, 8×54.433, 8×56.471, 8×58.382, 8×60.488, 8×62.626, 8×64.895, 8×67.262, 8×69.767, 8×72.434, 8×75.395, 2×78.018, 4×79.648, 2×78.018, 2×83.807, 4×81.746, 2×83.807, 2×86.066, 4×88.455, 2×86.066, 2×93.917, 4×91.036, 2×93.917, 96.532, 98.144, 100.316, 2×102.422, 100.316, 98.144, 96.532, 110.726, 112.288, 2×108.206, 2×105.352, 114.329, 116.356, 118.648, 121.120, 123.844, 126.834, 130.110, 133.716, 137.733, 142.370]

35.0 dB: u=[15×1.000, 16×2.980, 16×4.986, 16×6.976, 16×8.995, 16×11.006, 16×13.047, 16×15.089, 16×17.165, 16×19.250, 16×21.373, 16×23.516, 16×25.698, 16×27.910, 16×30.169, 16×32.470, 16×34.824, 16×37.232, 16×39.709, 16×42.294, 16×45.098, 8×47.500, 8×48.917, 8×50.760, 8×52.445, 8×54.317, 8×56.169, 8×58.133, 8×60.138, 8×62.241, 8×64.416, 8×66.691, 8×69.074, 8×71.615, 8×74.454, 4×76.908, 4×78.487, 4×80.393, 4×82.276, 4×84.312, 4×86.433, 4×88.693, 4×91.106, 4×93.802, 2×97.730, 2×96.194, 2×105.929, 2×99.672, 2×101.622, 2×103.709, 2×111.110, 115.222, 113.576, 119.242, 117.235, 2×108.352, 130.818, 122.816, 125.254, 127.929, 134.631, 138.060, 141.862, 146.197]

36.0 dB: u=[15×1.000, 16×2.996, 16×4.999, 16×7.002, 16×9.020, 16×11.044, 16×13.083, 16×15.133, 16×17.204, 16×19.293, 16×21.407, 16×23.546, 16×25.715, 16×27.915, 16×30.151, 16×32.432, 16×34.786, 16×37.288, 16×40.022, 8×42.272, 8×43.686, 8×45.338, 8×46.893, 8×48.581, 8×50.242, 8×51.994, 8×53.758, 8×55.598, 8×57.476, 8×59.426, 8×61.434, 8×63.520, 8×65.683, 8×67.948, 8×70.399, 4×72.551, 4×73.776, 4×75.476, 4×77.022, 4×78.759, 4×80.501, 4×82.357, 4×84.279, 4×86.305, 4×88.431, 4×90.707, 4×93.247, 2×96.882, 2×95.464, 2×100.340, 2×98.620, 2×104.159, 2×102.204, 2×108.482, 2×106.240, 113.253, 114.725, 2×111.019, 120.208, 130.311, 116.502, 118.323, 123.098, 125.334, 127.738, 133.707, 136.690, 139.915, 143.462, 147.486]

37.0 dB: u=[15×1.000, 16×3.000, 16×5.004, 16×7.012, 16×9.028, 16×11.052, 16×13.087, 16×15.135, 16×17.199, 16×19.280, 16×21.382, 16×23.512, 16×25.687, 16×27.960, 16×30.403, 8×32.429, 8×33.625, 8×35.127, 8×36.455, 8×37.956, 8×39.366, 8×40.891, 8×42.368, 8×43.933, 8×45.480, 8×47.097, 8×48.716, 8×50.392, 8×52.090, 8×53.843, 8×55.630, 8×57.471, 8×59.361, 8×61.312, 8×63.319, 8×65.405, 8×67.627, 4×69.586, 4×70.600, 4×72.166, 4×73.494, 4×75.047,

4×76.552, 4×78.169, 4×79.809, 4×81.529, 4×83.305, 4×85.161, 4×87.094, 4×89.122, 4×91.296, 2×93.241, 2×94.243, 2×95.824, 2×97.192, 2×98.780, 2×100.362, 2×102.058, 2×103.818, 2×105.680, 2×107.640, 2×109.753, 2×112.140, 114.212, 115.583, 117.197, 118.838, 120.607, 127.529, 129.752, 122.428, 134.624, 132.114, 125.459, 137.294, 140.142, 143.214, 146.566, 150.358]

38.0 dB: u=[15×1.000, 16×3.001, 16×5.004, 16×7.011, 16×9.026, 16×11.049, 16×13.093, 16×15.187, 16×17.381, 16×19.715, 8×21.617, 8×22.723, 8×24.113, 8×25.304, 8×26.687, 8×27.932, 8×29.324, 8×30.614, 8×32.021, 8×33.354, 8×34.781, 8×36.158, 8×37.611, 8×39.035, 8×40.521, 8×41.994, 8×43.521, 8×45.051, 8×46.625, 8×48.214, 8×49.844, 8×51.499, 8×53.196, 8×54.926, 8×56.699, 8×58.511, 8×60.369, 8×62.276, 8×64.248, 8×66.333, 8×68.621, 4×71.736, 4×70.541, 4×74.526, 4×73.172, 4×77.460, 4×75.997, 4×80.568, 4×79.001, 4×83.880, 4×82.201, 4×87.425, 4×85.623, 4×91.268, 4×89.299, 96.378, 2×95.281, 96.378, 4×93.413, 102.183, 2×100.680, 102.183, 97.836, 2×99.185, 97.836, 108.930, 2×107.134, 108.930, 103.773, 2×105.413, 103.773, 117.128, 115.645, 114.686, 118.432, 110.824, 2×112.862, 110.824, 130.377, 132.455, 126.519, 128.398, 119.932, 124.739, 123.054, 121.441, 137.552, 135.241, 140.525, 143.114, 145.868, 148.830, 152.056, 155.678]

39.0 dB: u=[7×1.000, 8×2.648, 8×4.650, 8×6.303, 8×8.307, 8×9.971, 8×11.973, 8×13.655, 8×15.660, 8×17.366, 8×19.374, 8×21.107, 8×23.117, 8×24.880, 8×26.897, 8×28.695, 8×30.719, 8×32.554, 8×34.589, 8×36.465, 8×38.514, 8×40.433, 8×42.501, 8×44.463, 8×46.555, 8×48.566, 8×50.684, 8×52.748, 8×54.903, 8×57.021, 8×59.216, 8×61.393, 8×63.637, 8×65.879, 8×68.182, 8×70.496, 8×72.865, 8×75.258, 8×77.702, 8×80.183, 8×82.718, 8×85.299, 8×87.936, 8×90.623, 8×93.368, 8×96.175, 8×99.064, 8×102.091, 8×105.380, 2×108.157, 4×109.818, 2×108.157, 2×113.809, 4×111.908, 2×113.809, 2×115.922, 4×117.978, 2×115.922, 2×122.348, 4×120.161, 2×122.348, 2×124.633, 4×126.954, 2×124.633, 2×131.821, 4×129.357, 2×131.821, 2×134.371, 4×137.001, 2×134.371, 2×142.546, 4×139.724, 2×142.546, 2×145.533, 4×148.828, 2×145.533, 2×155.500, 2×153.382, 2×151.631, 2×157.538, 2×159.798, 2×161.874, 164.726, 2×167.000, 164.726, 172.094, 2×169.513, 172.094, 174.791, 2×177.621, 174.791, 183.383, 2×180.696, 185.009, 187.167, 189.199, 191.353, 193.543, 195.863, 198.260, 200.786, 203.425, 206.198, 209.105, 212.158, 215.358, 218.720, 222.251, 225.964, 229.879, 234.024, 238.437, 243.252, 248.655]

40.0 dB: u=[7×1.000, 8×2.904, 8×4.905, 8×6.809, 8×8.808, 8×10.721, 8×12.724, 8×14.646, 8×16.657, 8×18.594, 8×20.616, 8×22.572, 8×24.607, 8×26.585, 8×28.635, 8×30.635, 8×32.699, 8×34.720, 8×36.804, 8×38.856, 8×40.965, 8×43.052, 8×45.192, 8×47.316, 8×49.488, 8×51.654, 8×53.862, 8×56.071, 8×58.318, 8×60.570, 8×62.862, 8×65.174, 8×67.526, 8×69.899, 8×72.310, 8×74.749, 8×77.227, 8×79.737, 8×82.287, 8×84.875, 8×87.508, 8×90.185, 8×92.915, 8×95.715, 8×98.645, 8×101.821, 4×106.055, 4×104.471, 4×109.800, 4×108.025, 4×113.679, 4×111.782, 4×117.691, 4×115.701, 4×121.865, 4×119.779, 4×126.220, 4×124.028, 4×130.790, 4×128.484, 4×135.590, 4×133.162, 4×140.652, 4×138.086, 4×146.023, 4×143.289, 4×152.110, 4×148.920, 2×160.400, 2×158.466, 2×156.471, 2×154.787, 2×164.555, 2×166.704, 2×168.896, 2×162.476, 2×178.475, 2×171.187, 2×173.535, 2×175.967, 2×183.795, 2×186.699, 2×189.924, 2×181.079, 207.690, 202.438, 192.632, 194.382, 196.405, 198.390, 200.572, 205.578, 218.005, 215.272, 223.827, 220.857, 230.164, 226.928, 212.648, 210.135, 237.031, 245.237, 241.382, 233.522, 250.244, 254.565, 264.978, 259.760]

a3) 64-QAM/8-PAM for the Fading Channel (Maximum Penalty of 0.001 b/s/Hz)

5.0 dB: u=[1.000, 2×3.083]

6.0 dB: u=[1.000, 2×3.240]

7.0 dB: u=[1.000, 2×3.393]

b3) 256-QAM/16-PAM for the Fading Channel (Maximum Penalty of 0.001 b/s/Hz)

0.0 dB: u=[7×1.000]

1.0 dB: u=[7×1.000]

2.0 dB: u=[7×1.000]

3.0 dB: u=[3×1.000, 4×2.675]

4.0 dB: u=[3×1.000, 4×2.899]

5.0 dB: u=[3×1.000, 4×3.077]

6.0 dB: u=[3×1.000, 4×3.232]

7.0 dB: u=[3×1.000, 4×3.366]

8.0 dB: u=[1.000, 2×1.288, 2×3.209, 4.162, 5.461]

9.0 dB: u=[1.000, 2×1.471, 2×3.461, 4.743, 6.166]

10.0 dB: u=[1.000, 2×1.713, 3.675, 3.890, 5.355, 6.977]

11.0 dB: u=[1.000, 2×2.006, 3.998, 4.307, 5.999, 7.852]

12.0 dB: u=[1.000, 2×2.284, 4.294, 4.706, 6.575, 8.646]

13.0 dB: u=[1.000, 2×2.506, 4.519, 5.051, 7.031, 9.278]

14.0 dB: u=[1.000, 2×2.671, 4.672, 5.361, 7.387, 9.767]

c3) 1024-QAM/32-PAM for the Fading Channel (Maximum Penalty of 0.001 b/s/Hz)

0.0 dB: u=[15×1.000]

1.0 dB: u=[15×1.000]

2.0 dB: u=[15×1.000]

3.0 dB: u=[7×1.000, 8×2.673]

4.0 dB: u=[7×1.000, 8×2.900]

5.0 dB: u=[7×1.000, 8×3.077]

6.0 dB: u=[7×1.000, 3.260, 2.862, 2.674, 2.862, 3.260, 2.862, 3.260, 4.776]

7.0 dB: u=[7×1.000, 8×3.367]

8.0 dB: u=[3×1.000, 4×1.277, 4×3.196, 4.320, 4.119, 4.624, 6.099]

9.0 dB: u=[3×1.000, 4×1.447, 3.357, 3.433, 3.507, 3.433, 4.739, 4.679, 5.338, 6.826]

10.0 dB: u=[3×1.000, 4×1.687, 2×3.661, 2×3.838, 2×5.281, 6.185, 7.727]

11.0 dB: u=[3×1.000, 4×1.973, 2×3.970, 2×4.245, 2×5.887, 7.078, 8.716]

12.0 dB: u=[3×1.000, 4×2.247, 2×4.256, 2×4.639, 6.330, 6.563, 7.891, 9.664]

13.0 dB: u=[3×1.000, 4×2.471, 2×4.481, 2×4.985, 6.752, 7.064, 8.576, 10.487]

14.0 dB: u=[3×1.000, 4×2.641, 2×4.636, 2×5.287, 7.075, 7.471, 9.123, 11.160]

15.0 dB: u=[3×1.000, 2×2.667, 2×2.856, 2×4.735, 2×5.567, 7.329, 7.819, 9.561, 11.697]

16.0 dB: u=[3×1.000, 2×2.691, 2×3.024, 2×4.816, 2×5.850, 7.564, 8.177, 9.960, 12.173]

17.0 dB: u=[1.000, 2×1.275, 2×3.036, 2×3.678, 2×5.585, 6.858, 7.050, 8.846, 9.707, 11.731, 14.294]

18.0 dB: u=[1.000, 2×1.688, 2×3.524, 2×4.580, 2×6.633, 8.201, 8.517, 10.495, 11.664, 13.960, 16.926]

19.0 dB: u=[1.000, 2×2.089, 2×3.993, 2×5.386, 2×7.559, 9.335, 9.841, 11.923, 13.393, 15.894, 19.155]

20.0 dB: u=[1.000, 2×2.373, 2×4.326, 2×5.958, 2×8.201, 10.088, 10.867, 12.949, 14.665, 17.276, 20.696]

21.0 dB: u=[1.000, 2×2.565, 2×4.550, 2×6.340, 8.419, 8.859, 10.599, 11.681, 13.718, 15.610, 18.272, 21.752]

22.0 dB: u=[1.000, 2×2.690, 2×4.695, 6.438, 6.772, 8.619, 9.386, 11.054, 12.374, 14.383, 16.382, 19.059, 22.542]

23.0 dB: u=[1.000, 2×2.775, 2×4.814, 2×6.878, 8.895, 9.937, 11.565, 13.033, 15.030, 17.093, 19.763, 23.229]

24.0 dB: u=[1.000, 2×2.864, 2×4.959, 2×7.133, 9.125, 10.288, 11.866, 13.373, 15.311, 17.350, 19.939, 23.269]

d3) 4096-QAM/64-PAM for the fading channel (maximum penalty of 0.001 b/s/Hz)

0.0 dB: u=[31×1.000]

1.0 dB: u=[31×1.000]

2.0 dB: u=[31×1.000]

3.0 dB: u=[15×1.000, 16×2.675]

4.0 dB: u=[15×1.000, 16×2.898]

5.0 dB: u=[15×1.000, 3.369, 2.918, 2.664, 2.918, 3×2.664, 2.918, 3.369, 2.918, 2.664, 2.918, 3.369, 2.918, 3.369, 4.870]

6.0 dB: u=[15×1.000, 16×3.223]

7.0 dB: u=[15×1.000, 16×3.366]

8.0 dB: u=[15×1.000, 15×3.345, 5.928]

9.0 dB: u=[7×1.000, 8×1.442, 8×3.428, 4.684, 4.780, 2×4.684, 2×5.313, 6.120, 7.541]

10.0 dB: u=[7×1.000, 8×1.679, 4×3.659, 4×3.822, 4×5.278, 6.070, 6.147, 6.985, 8.502]

11.0 dB: u=[7×1.000, 8×1.968, 4×3.972, 4×4.232, 4×5.885, 2×6.996, 7.962, 9.577]

12.0 dB: u=[7×1.000, 8×2.239, 4×4.254, 4×4.618, 2×6.327, 2×6.529, 7.708, 7.886, 8.918, 10.607]

13.0 dB: u=[7×1.000, 8×2.463, 4×4.477, 4×4.961, 2×6.736, 2×7.024, 8.349, 8.589, 9.779, 11.539]

14.0 dB: u=[7×1.000, 8×2.632, 4×4.631, 4×5.261, 2×7.051, 2×7.427, 8.869, 9.164, 10.503, 12.342]

15.0 dB: u=[7×1.000, 4×2.664, 4×2.844, 4×4.729, 4×5.540, 2×7.299, 2×7.771, 9.289, 9.639, 11.111, 13.024]

16.0 dB: u=[7×1.000, 4×2.691, 4×3.004, 4×4.806, 4×5.815, 2×7.523, 2×8.113, 9.660, 10.080, 11.640, 13.624]

17.0 dB: u=[3×1.000, 4×1.237, 4×2.991, 4×3.585, 4×5.476, 2×6.712, 2×6.884, 2×8.655, 2×9.465, 11.175, 11.742, 13.536, 15.810]

18.0 dB: u=[3×1.000, 4×1.630, 4×3.456, 4×4.454, 4×6.486, 2×8.021, 2×8.301, 2×10.248, 2×11.346, 13.262, 14.048, 16.116, 18.766]

19.0 dB: u=[3×1.000, 4×2.039, 4×3.934, 4×5.283, 4×7.440, 2×9.195, 2×9.643, 2×11.708, 2×13.099, 15.174, 16.218, 18.497, 21.462]

20.0 dB: u=[3×1.000, 4×2.334, 4×4.280, 4×5.875, 4×8.105, 2×9.979, 2×10.678, 2×12.751, 14.218, 14.584, 16.565, 17.853, 20.240, 23.383]

21.0 dB: u=[3×1.000, 4×2.533, 4×4.513, 4×6.274, 2×8.369, 2×8.738, 2×10.496, 2×11.495, 2×13.520, 15.113, 15.646, 17.603, 19.097, 21.533, 24.754]

22.0 dB: u=[3×1.000, 4×2.666, 4×4.666, 2×6.412, 2×6.674, 2×8.564, 2×9.238, 2×10.918, 2×12.167, 2×14.155, 15.812, 16.579, 18.471, 20.125, 22.578, 25.825]

23.0 dB: u=[3×1.000, 4×2.756, 4×4.781, 2×6.499, 2×7.085, 2×8.797, 2×9.761, 2×11.392, 2×12.807, 14.610, 14.984, 16.507, 17.503, 19.342, 21.105, 23.567, 26.808]

24.0 dB: u=[3×1.000, 4×2.840, 4×4.925, 4×7.080, 2×9.088, 2×10.215, 2×11.808, 2×13.301, 2×15.306, 17.051, 18.203, 19.992, 21.802, 24.229, 27.402]

25.0 dB: u=[1.000, 2×1.927, 2×3.739, 2×4.745, 2×6.716, 2×7.883, 2×9.764, 2×11.180, 2×13.292, 2×14.998, 2×17.204, 19.131, 19.658, 21.729, 22.836, 24.799, 26.561, 29.019, 31.588, 34.934, 39.304]

26.0 dB: u=[1.000, 2×2.272, 2×4.131, 2×5.463, 2×7.474, 2×8.934, 2×10.913, 2×12.582, 2×14.800, 2×16.734, 2×19.110, 21.158, 22.084, 24.131, 25.563, 27.641, 29.643, 32.253, 35.037, 38.585, 43.181]

27.0 dB: u=[1.000, 2×2.495, 2×4.397, 2×5.943, 2×7.978, 2×9.634, 2×11.676, 2×13.512, 2×15.776, 2×17.880, 20.845, 20.029, 23.872, 22.613, 27.531, 25.886, 31.828, 29.681, 37.149, 34.504, 41.575, 46.004]

28.0 dB: u=[1.000, 2×2.644, 2×4.575, 2×6.259, 2×8.306, 2×10.087, 2×12.161, 2×14.121, 2×16.466, 2×18.812, 21.010, 22.161, 23.894, 25.357, 27.356, 29.140, 31.325, 33.555, 36.258, 39.186, 42.810, 47.455]

29.0 dB: u=[1.000, 2×2.736, 2×4.685, 2×6.458, 2×8.507, 2×10.386, 2×12.539, 2×14.702, 2×17.218, 19.225, 20.353, 22.053, 23.381, 25.117, 26.699, 28.693, 30.556, 32.759, 35.040, 37.747, 40.682, 44.278, 48.856]

30.0 dB: u=[1.000, 2×2.812, 2×4.789, 2×6.673, 2×8.791, 2×10.832, 2×13.096, 2×15.391, 17.420, 18.514, 20.002, 21.239, 22.885, 24.288, 26.000, 27.621, 29.574, 31.451, 33.625, 35.881, 38.523, 41.393, 44.879, 49.301]

31.0 dB: u=[1.000, 2×2.877, 2×4.867, 2×6.804, 8.505, 9.310, 10.538, 11.402, 12.732, 13.671, 14.960, 15.997, 17.414, 18.546, 19.949, 21.197, 22.741, 24.129, 25.752, 27.326, 29.165, 30.965, 33.013, 35.148, 37.617, 40.306, 43.543, 47.640]

e3) 16384-QAM/128-PAM for the Fading Channel (Maximum Penalty of 0.001 b/s/Hz)

0.0 dB: u=[63×1.000]

1.0 dB: u=[63×1.000]

2.0 dB: u=[63×1.000]

3.0 dB: u=[31×1.000, 32×2.677]

4.0 dB: u=[31×1.000, 32×2.901]

5.0 dB: u=[31×1.000, 32×3.072]

6.0 dB: u=[31×1.000, 32×3.223]

7.0 dB: u=[31×1.000, 32×3.361]

8.0 dB: u=[31×1.000, 30×3.343, 2×5.926]

9.0 dB: u=[15×1.000, 16×1.445, 16×3.435, 4.816, 4.904, 5.015, 4.904, 4×4.691, 5.015, 5.133, 5.218, 5.133, 2×6.158, 6.889, 8.215]

10.0 dB: u=[15×1.000, 16×1.681, 8×3.664, 8×3.822, 8×5.289, 6.060, 2×6.176, 6.060, 6.919, 6.988, 7.806, 9.262]

11.0 dB: u=[15×1.000, 16×1.961, 8×3.967, 8×4.222, 8×5.877, 4×6.992, 2×7.875, 8.842, 10.400]

12.0 dB: u=[15×1.000, 16×2.238, 8×4.256, 8×4.619, 4×6.341, 4×6.525, 7.680, 7.803, 7.924, 7.803, 8.733, 8.923, 9.874, 11.521]

13.0 dB: u=[15×1.000, 16×2.462, 8×4.475, 8×4.952, 4×6.739, 4×7.008, 2×8.355, 2×8.562, 9.560, 9.791, 10.822, 12.516]

14.0 dB: u=[15×1.000, 16×2.630, 8×4.628, 8×5.250, 4×7.043, 4×7.404, 2×8.851, 2×9.125, 10.269, 10.528, 11.673, 13.397]

15.0 dB: u=[15×1.000, 8×2.664, 8×2.840, 8×4.727, 8×5.532, 4×7.294, 4×7.754, 2×9.271, 2×9.611, 10.869, 11.166, 12.416, 14.189]

16.0 dB: u=[15×1.000, 8×2.692, 8×2.998, 8×4.803, 8×5.805, 4×7.516, 4×8.089, 2×9.629, 2×10.040, 11.381, 11.721, 13.080, 14.904]

17.0 dB: u=[7×1.000, 8×1.227, 8×2.979, 8×3.558, 8×5.448, 4×6.673, 4×6.837, 4×8.604, 4×9.394, 2×11.087, 2×11.637, 13.175, 13.607, 15.209, 17.291]

18.0 dB: u=[7×1.000, 8×1.610, 8×3.432, 8×4.409, 8×6.433, 4×7.954, 4×8.223, 4×10.162, 4×11.234, 2×13.127, 2×13.881, 15.642, 16.224, 18.107, 20.536]

19.0 dB: u=[7×1.000, 8×2.017, 8×3.908, 8×5.238, 8×7.389, 4×9.135, 4×9.566, 4×11.627, 4×12.994, 2×15.045, 2×16.039, 17.959, 18.733, 20.836, 23.567]

20.0 dB: u=[7×1.000, 8×2.318, 8×4.259, 8×5.840, 8×8.063, 4×9.929, 4×10.602, 4×12.673, 2×14.127, 2×14.460, 2×16.431, 2×17.661, 19.656, 20.650, 22.872, 25.794]

21.0 dB: u=[7×1.000, 8×2.522, 8×4.499, 8×6.250, 4×8.351, 4×8.698, 4×10.459, 4×11.427, 4×13.454, 2×15.039, 2×15.530, 2×17.478, 18.759, 19.085, 20.952, 22.151, 24.424, 27.437]

22.0 dB: u=[7×1.000, 8×2.657, 8×4.656, 8×6.523, 4×8.548, 4×9.191, 4×10.878, 4×12.100, 4×14.085, 2×15.733, 2×16.448, 2×18.329, 19.727, 20.182, 22.009, 23.379, 25.671, 28.719]

23.0 dB: u=[7×1.000, 8×2.746, 8×4.764, 4×6.484, 4×7.029, 4×8.756, 4×9.693, 4×11.322, 4×12.716, 2×14.523, 2×14.857, 2×16.384, 2×17.332, 2×19.152, 20.622, 21.261, 23.026, 24.538, 26.830, 29.880]

24.0 dB: u=[7×1.000, 8×2.831, 8×4.913, 4×6.637, 4×7.479, 4×9.070, 4×10.183, 4×11.783, 4×13.268, 4×15.261, 2×16.997, 2×18.113, 2×19.891, 21.395, 22.221, 23.919, 25.517, 27.792, 30.807]

25.0 dB: u=[3×1.000, 4×1.871, 4×3.677, 4×4.628, 4×6.592, 4×7.709, 4×9.570, 4×10.941, 4×13.032, 4×14.691, 4×16.863, 2×18.764, 2×19.226, 2×21.289, 2×22.316, 2×24.249, 2×25.941, 28.091, 28.652, 30.487, 31.838, 34.101, 36.367, 39.457, 43.533]

26.0 dB: u=[3×1.000, 4×2.233, 4×4.089, 4×5.383, 4×7.390, 4×8.812, 4×10.780, 4×12.416, 4×14.621, 4×16.520, 4×18.869, 2×20.894, 2×21.732, 2×23.785, 2×25.144, 2×27.192, 2×29.148, 31.380, 32.283, 34.191, 35.830, 38.237, 40.746, 44.054, 48.382]

27.0 dB: u=[3×1.000, 4×2.465, 4×4.359, 4×5.873, 4×7.903, 4×9.526, 4×11.556, 4×13.362, 4×15.615, 4×17.679, 19.826, 2×20.543, 19.826, 23.504, 2×22.321, 23.504, 25.509, 2×27.091, 25.509, 31.662, 2×29.203, 31.048, 34.810, 36.610, 38.360, 33.641, 41.609, 43.931, 47.280, 51.680]

28.0 dB: u=[3×1.000, 4×2.614, 4×4.533, 4×6.189, 4×8.225, 4×9.979, 4×12.042, 4×13.961, 4×16.263, 4×18.527, 2×20.693, 2×21.767, 2×23.490, 2×24.889, 2×26.863, 2×28.586, 2×30.755, 32.636, 33.596, 35.465, 36.882, 38.842, 40.789, 43.276, 45.959, 49.358, 53.746]

29.0 dB: u=[3×1.000, 4×2.716, 4×4.660, 4×6.413, 4×8.459, 4×10.304, 4×12.417, 4×14.509, 4×16.967, 2×18.939, 2×20.000, 2×21.702, 2×22.975, 2×24.695, 2×26.225, 2×28.193, 2×30.033, 2×32.315, 34.277, 35.472, 37.294, 38.852, 40.832, 42.855, 45.345, 48.058, 51.436, 55.795]

30.0 dB: u=[3×1.000, 4×2.790, 4×4.763, 4×6.623, 4×8.739, 4×10.761, 4×13.022, 4×15.309, 4×17.891, 2×19.935, 2×21.149, 2×22.820, 2×24.202, 2×25.927, 2×27.539, 2×29.524, 2×31.517, 2×33.945, 35.996, 37.328, 39.124, 40.764, 42.757, 44.816, 47.304, 50.013, 53.361, 57.647]

a4) 64-QAM/8-PAM for the fading channel (maximum penalty of 0.01 b/s/Hz)

5.0 dB: u=[1.000, 2×3.083]

6.0 dB: u=[1.000, 2×3.240]

7.0 dB: u=[1.000, 2×3.393]

b4) 256-QAM/16-PAM for the Fading Channel (Maximum Penalty of 0.01 b/s/Hz)

0.0 dB: u=[7×1.000]

1.0 dB: u=[7×1.000]

2.0 dB: u=[7×1.000]

3.0 dB: u=[3×1.000, 4×2.675]

4.0 dB: u=[3×1.000, 4×2.899]

5.0 dB: u=[3×1.000, 4×3.077]

6.0 dB: u=[3×1.000, 4×3.232]

7.0 dB: u=[3×1.000, 4×3.366]

8.0 dB: u=[3×1.000, 4×3.506]

9.0 dB: u=[1.000, 2×1.471, 2×3.461, 4.743, 6.166]

10.0 dB: u=[1.000, 2×1.713, 2×3.782, 5.355, 6.977]

11.0 dB: u=[1.000, 2×2.006, 2×4.153, 5.999, 7.852]

12.0 dB: u=[1.000, 2×2.284, 2×4.500, 6.575, 8.646]

13.0 dB: u=[1.000, 2×2.506, 4.519, 5.051, 7.031, 9.278]

14.0 dB: u=[1.000, 2×2.671, 4.672, 5.361, 7.387, 9.767]

15.0 dB: u=[1.000, 2×2.793, 4.772, 5.668, 7.689, 10.162]

16.0 dB: u=[1.000, 2×2.887, 4.858, 5.964, 7.960, 10.483]

17.0 dB: u=[1.000, 2×2.983, 4.948, 6.206, 8.165, 10.677]

c4) 1024-QAM/32-PAM for the Fading Channel (Maximum Penalty of 0.01 b/s/Hz)

0.0 dB: u=[15×1.000]

1.0 dB: u=[15×1.000]

2.0 dB: u=[15×1.000]

3.0 dB: u=[7×1.000, 8×2.673]

4.0 dB: u=[7×1.000, 8×2.900]

5.0 dB: u=[7×1.000, 8×3.077]

6.0 dB: u=[7×1.000, 3.260, 3×2.815, 3.260, 2.815, 3.260, 4.776]

7.0 dB: u=[7×1.000, 8×3.367]

8.0 dB: u=[7×1.000, 7×3.243, 5.357]

9.0 dB: u=[7×1.000, 7×3.326, 5.580]

10.0 dB: u=[3×1.000, 4×1.687, 4×3.750, 2×5.281, 6.185, 7.727]

11.0 dB: u=[3×1.000, 4×1.973, 4×4.107, 2×5.887, 7.078, 8.716]

12.0 dB: u=[3×1.000, 4×2.247, 4×4.447, 2×6.446, 7.891, 9.664]

13.0 dB: u=[3×1.000, 4×2.471, 2×4.481, 2×4.985, 2×6.908, 8.576, 10.487]

14.0 dB: u=[3×1.000, 4×2.641, 2×4.636, 2×5.287, 2×7.273, 9.123, 11.160]

15.0 dB: u=[3×1.000, 4×2.762, 2×4.735, 2×5.567, 2×7.574, 9.561, 11.697]

16.0 dB: u=[3×1.000, 4×2.857, 2×4.816, 2×5.850, 7.564, 8.177, 9.960, 12.173]

17.0 dB: u=[3×1.000, 4×2.951, 2×4.910, 2×6.113, 7.777, 8.534, 10.313, 12.566]

18.0 dB: u=[3×1.000, 2×2.622, 2×3.407, 2×4.935, 2×6.219, 7.808, 8.678, 10.386, 12.593]

19.0 dB: u=[1.000, 2×2.089, 2×3.993, 2×5.386, 2×7.559, 2×9.588, 11.923, 13.393, 15.894, 19.155]

20.0 dB: u=[1.000, 2×2.373, 2×4.326, 2×5.958, 2×8.201, 2×10.478, 12.949, 14.665, 17.276, 20.696]

21.0 dB: u=[1.000, 2×2.565, 2×4.550, 2×6.340, 2×8.639, 2×11.140, 13.718, 15.610, 18.272, 21.752]

22.0 dB: u=[1.000, 2×2.690, 2×4.695, 2×6.605, 2×9.002, 11.054, 12.374, 14.383, 16.382, 19.059, 22.542]

23.0 dB: u=[1.000, 2×2.775, 2×4.814, 2×6.878, 2×9.416, 11.565, 13.033, 15.030, 17.093, 19.763, 23.229]

24.0 dB: u=[1.000, 2×2.864, 2×4.959, 2×7.133, 9.125, 10.288, 11.866, 13.373, 15.311, 17.350, 19.939, 23.269]

25.0 dB: u=[1.000, 2×2.917, 4.585, 5.430, 6.684, 7.687, 9.100, 10.290, 11.788, 13.267, 15.095, 17.040, 19.470, 22.581]

d4) 4096-QAM/64-PAM for the Fading Channel (Maximum Penalty of 0.01 b/s/Hz)

0.0 dB: u=[31×1.000]

1.0 dB: u=[31×1.000]

2.0 dB: u=[31×1.000]

3.0 dB: u=[15×1.000, 16×2.675]

4.0 dB: u=[15×1.000, 16×2.898]

5.0 dB: u=[15×1.000, 3.369, 7×2.803, 3.369, 3×2.803, 3.369, 2.803, 3.369, 4.870]

6.0 dB: u=[15×1.000, 16×3.223]

7.0 dB: u=[15×1.000, 16×3.366]

8.0 dB: u=[15×1.000, 15×3.345, 5.928]

9.0 dB: u=[15×1.000, 15×3.440, 6.175]

10.0 dB: u=[7×1.000, 8×1.679, 8×3.741, 4×5.278, 2×6.109, 6.985, 8.502]

11.0 dB: u=[7×1.000, 8×1.968, 8×4.102, 4×5.885, 3×7.318, 9.577]

12.0 dB: u=[7×1.000, 8×2.239, 8×4.436, 7×7.175, 10.607]

13.0 dB: u=[7×1.000, 8×2.463, 4×4.477, 4×4.961, 4×6.880, 2×8.469, 9.779, 11.539]

14.0 dB: u=[7×1.000, 8×2.632, 4×4.631, 4×5.261, 4×7.239, 2×9.017, 10.503, 12.342]

15.0 dB: u=[7×1.000, 8×2.754, 4×4.729, 4×5.540, 2×7.299, 2×7.771, 2×9.464, 11.111, 13.024]

16.0 dB: u=[7×1.000, 8×2.847, 4×4.806, 4×5.815, 2×7.523, 2×8.113, 2×9.870, 11.640, 13.624]

17.0 dB: u=[7×1.000, 4×2.674, 4×3.204, 4×4.895, 4×6.077, 2×7.737, 2×8.461, 9.990, 10.497, 12.100, 14.134]

18.0 dB: u=[7×1.000, 4×2.628, 4×3.387, 4×4.931, 4×6.205, 2×7.792, 2×8.626, 2×10.382, 12.253, 14.268]

19.0 dB: u=[3×1.000, 4×2.039, 4×3.934, 4×5.283, 4×7.440, 4×9.419, 2×11.708, 2×13.099, 15.174, 16.218, 18.497, 21.462]

20.0 dB: u=[3×1.000, 4×2.334, 4×4.280, 4×5.875, 4×8.105, 4×10.328, 2×12.751, 2×14.401, 16.565, 17.853, 20.240, 23.383]

21.0 dB: u=[3×1.000, 4×2.533, 4×4.513, 4×6.274, 4×8.553, 2×10.496, 2×11.495, 2×13.520, 2×15.379, 17.603, 19.097, 21.533, 24.754]

22.0 dB: u=[3×1.000, 4×2.666, 4×4.666, 4×6.543, 4×8.901, 2×10.918, 2×12.167, 2×14.155, 2×16.195, 18.471, 20.125, 22.578, 25.825]

23.0 dB: u=[3×1.000, 4×2.756, 4×4.781, 4×6.792, 2×8.797, 2×9.761, 2×11.392, 2×12.807, 2×14.797, 16.507, 17.503, 19.342, 21.105, 23.567, 26.808]

24.0 dB: u=[3×1.000, 4×2.840, 4×4.925, 4×7.080, 2×9.088, 2×10.215, 2×11.808, 2×13.301, 2×15.306, 17.051, 18.203, 19.992, 21.802, 24.229, 27.402]

25.0 dB: u=[3×1.000, 4×2.898, 4×4.988, 2×6.671, 2×7.639, 2×9.082, 2×10.248, 2×11.755, 2×13.252, 2×15.225, 16.945, 18.149, 19.828, 21.583, 23.870, 26.856]

26.0 dB: u=[1.000, 2×2.272, 2×4.131, 2×5.463, 2×7.474, 2×8.934, 2×10.913, 2×12.582, 2×14.800, 2×16.734, 2×19.110, 2×21.621, 24.131, 25.563, 27.641, 29.643, 32.253, 35.037, 38.585, 43.181]

27.0 dB: u=[1.000, 2×2.495, 2×4.397, 2×5.943, 2×7.978, 2×9.634, 2×11.676, 2×13.512, 2×15.776, 2×17.880, 2×20.437, 23.872, 22.613, 27.531, 25.886, 31.828, 29.681, 37.149, 34.504, 41.575, 46.004]

28.0 dB: u=[1.000, 2×2.644, 2×4.575, 2×6.259, 2×8.306, 2×10.087, 2×12.161, 2×14.121, 2×16.466, 2×18.812, 2×21.586, 23.894, 25.357, 27.356, 29.140, 31.325, 33.555, 36.258, 39.186, 42.810, 47.455]

29.0 dB: u=[1.000, 2×2.736, 2×4.685, 2×6.458, 2×8.507, 2×10.386, 2×12.539, 2×14.702, 2×17.218, 2×19.789, 22.053, 23.381, 25.117, 26.699, 28.693, 30.556, 32.759, 35.040, 37.747, 40.682, 44.278, 48.856]

30.0 dB: u=[1.000, 2×2.812, 2×4.789, 2×6.673, 2×8.791, 2×10.832, 2×13.096, 2×15.391, 2×17.967, 2×20.621, 22.885, 24.288, 26.000, 27.621, 29.574, 31.451, 33.625, 35.881, 38.523, 41.393, 44.879, 49.301]

31.0 dB: u=[1.000, 2×2.877, 2×4.867, 2×6.804, 2×8.907, 2×10.970, 2×13.201, 14.960, 15.997, 17.414, 18.546, 19.949, 21.197, 22.741, 24.129, 25.752, 27.326, 29.165, 30.965, 33.013, 35.148, 37.617, 40.306, 43.543, 47.640]

e4) 16384-QAM/128-PAM for the Fading Channel (Maximum Penalty of 0.01 b/s/Hz)

0.0 dB: u=[63×1.000]

1.0 dB: u=[63×1.000]

2.0 dB: u=[63×1.000]

3.0 dB: u=[31×1.000, 32×2.677]

4.0 dB: u=[31×1.000, 32×2.901]

5.0 dB: u=[31×1.000, 32×3.072]

6.0 dB: u=[31×1.000, 32×3.223]

7.0 dB: u=[31×1.000, 32×3.361]

8.0 dB: u=[31×1.000, 30×3.343, 2×5.926]

9.0 dB: u=[15×1.000, 16×1.445, 16×3.435, 12×4.909, 2×6.158, 6.889, 8.215]

10.0 dB: u=[15×1.000, 16×1.681, 16×3.743, 8×5.289, 4×6.118, 2×6.954, 7.806, 9.262]

11.0 dB: u=[15×1.000, 16×1.961, 16×4.095, 15×6.638, 10.400]

12.0 dB: u=[15×1.000, 16×2.238, 16×4.438, 8×6.433, 4×7.802, 2×8.28, 9.874, 11.521]

13.0 dB: u=[15×1.000, 16×2.462, 8×4.475, 8×4.952, 8×6.873, 4×8.459, 2×9.675, 10.822, 12.516]

14.0 dB: u=[15×1.000, 16×2.630, 8×4.628, 8×5.250, 8×7.224, 4×8.988, 2×10.399, 11.673, 13.397]

15.0 dB: u=[15×1.000, 16×2.752, 8×4.727, 8×5.532, 4×7.294, 4×7.754, 4×9.441, 2×11.017, 12.416, 14.189]

16.0 dB: u=[15×1.000, 16×2.845, 8×4.803, 8×5.805, 4×7.516, 4×8.089, 4×9.835, 2×11.551, 13.080, 14.904]

17.0 dB: u=[15×1.000, 8×2.675, 8×3.195, 8×4.891, 8×6.066, 4×7.726, 4×8.435, 2×9.955, 2×10.449, 2×12.024, 13.656, 15.526]

18.0 dB: u=[7×1.000, 8×1.610, 8×3.432, 8×4.409, 8×6.433, 8×8.088, 4×10.162, 4×11.234, 2×13.127, 2×13.881, 2×15.933, 18.107, 20.536]

19.0 dB: u=[7×1.000, 8×2.017, 8×3.908, 8×5.238, 8×7.389, 8×9.351, 4×11.627, 4×12.994, 4×15.542, 2×18.346, 20.836, 23.567]

20.0 dB: u=[7×1.000, 8×2.318, 8×4.259, 8×5.840, 8×8.063, 8×10.266, 4×12.673, 4×14.294, 2×16.431, 2×17.661, 19.656, 20.650, 22.872, 25.794]

21.0 dB: u=[7×1.000, 8×2.522, 8×4.499, 8×6.250, 8×8.524, 4×10.459, 4×11.427, 4×13.454, 4×15.285, 2×17.478, 2×18.922, 20.952, 22.151, 24.424, 27.437]

22.0 dB: u=[7×1.000, 8×2.657, 8×4.656, 8×6.523, 8×8.870, 4×10.878, 4×12.100, 4×14.085, 4×16.090, 2×18.329, 2×19.955, 22.009, 23.379, 25.671, 28.719]

23.0 dB: u=[7×1.000, 8×2.746, 8×4.764, 8×6.757, 4×8.756, 4×9.693, 4×11.322, 4×12.716, 4×14.690, 2×16.384, 2×17.332, 2×19.152, 2×20.941, 23.026, 24.538, 26.830, 29.880]

24.0 dB: u=[7×1.000, 8×2.831, 8×4.913, 8×7.058, 4×9.070, 4×10.183, 4×11.783, 4×13.268, 4×15.261, 2×16.997, 2×18.113, 2×19.891, 2×21.808, 23.919, 25.517, 27.792, 30.807]

25.0 dB: u=[7×1.000, 8×2.893, 8×4.981, 4×6.667, 4×7.622, 4×9.079, 4×10.235, 4×11.748, 4×13.233, 4×15.189, 2×16.893, 2×18.072, 2×19.765, 21.239, 22.180, 23.756, 25.335, 27.488, 30.327]

26.0 dB: u=[3×1.000, 4×2.233, 4×4.089, 4×5.383, 4×7.390, 4×8.812, 4×10.780, 4×12.416, 4×14.621, 4×16.520, 4×18.869, 4×21.313, 2×23.785, 2×25.144, 2×27.192, 2×29.148, 2×31.831, 34.191, 35.830, 38.237, 40.746, 44.054, 48.382]

27.0 dB: u=[3×1.000, 4×2.465, 4×4.359, 4×5.873, 4×7.903, 4×9.526, 4×11.556, 4×13.362, 4×15.615, 4×17.679, 4×20.184, 4×22.912, 25.509, 2×27.091, 25.509, 31.355, 2×29.203, 31.355, 34.225, 36.610, 38.360, 34.225, 41.609, 43.931, 47.280, 51.680]

28.0 dB: u=[3×1.000, 4×2.614, 4×4.533, 4×6.189, 4×8.225, 4×9.979, 4×12.042, 4×13.961, 4×16.263, 4×18.527, 4×21.230, 2×23.490, 2×24.889, 2×26.863, 2×28.586, 2×30.755, 2×33.116, 35.465, 36.882, 38.842, 40.789, 43.276, 45.959, 49.358, 53.746]

29.0 dB: u=[3×1.000, 4×2.716, 4×4.660, 4×6.413, 4×8.459, 4×10.304, 4×12.417, 4×14.509, 4×16.967, 4×19.470, 2×21.702, 2×22.975, 2×24.695, 2×26.225, 2×28.193, 2×30.033, 2×32.315, 2×34.875, 37.294, 38.852, 40.832, 42.855, 45.345, 48.058, 51.436, 55.795]

30.0 dB: u=[3×1.000, 4×2.790, 4×4.763, 4×6.623, 4×8.739, 4×10.761, 4×13.022, 4×15.309, 4×17.891, 2×19.935, 2×21.149, 2×22.820, 2×24.202, 2×25.927, 2×27.539, 2×29.524, 2×31.517, 2×33.945, 35.996, 37.328, 39.124, 40.764, 42.757, 44.816, 47.304, 50.013, 53.361, 57.647]

Figure 15:
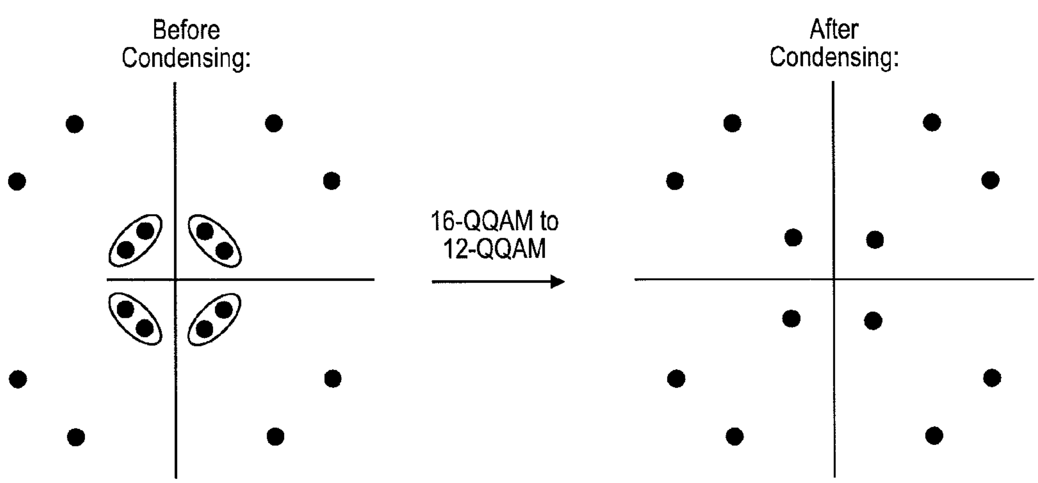
FIG. 15 shows an example for 2D condensing according to an embodiment of the present disclosure.

An embodiment for condensing for 2D NUC constellations will now be explained. An exemplary algorithm for said condensing is depicted in FIG. 15 is may comprise the following steps:

1) Select the first constellation point that has not been "processed".
2) Find all points that have not been "processed" with a Euclidian distance below threshold.
   Add these points to a "group".
   Flag these points as "processed".
3) For all new points in the "group" recursively repeat the Euclidian distance search until no new points are found.
4) Condense all points of the "group" to its average position.
5) Continue with 1) until all points of the constellation have been processed.

Figure 16:
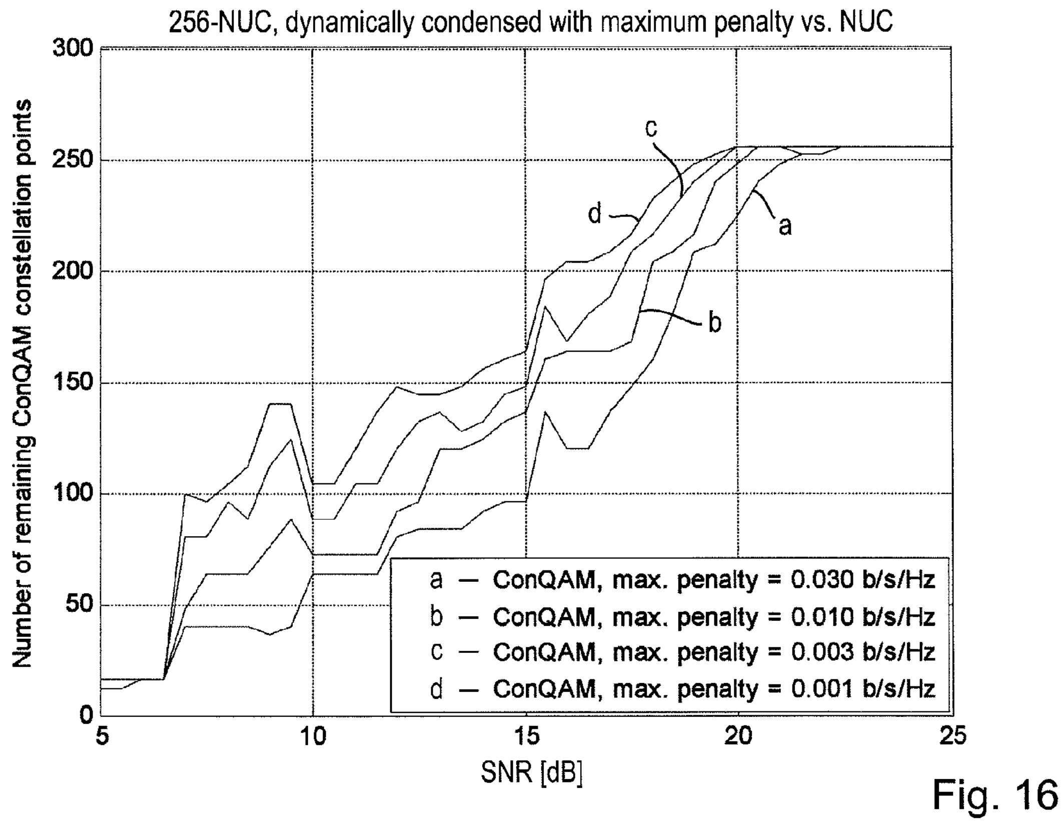
FIG. 16 shows a diagram illustrating the number of remaining ConQAM constellation points over SNR for a 2D condensed NUC.
Figure 17:
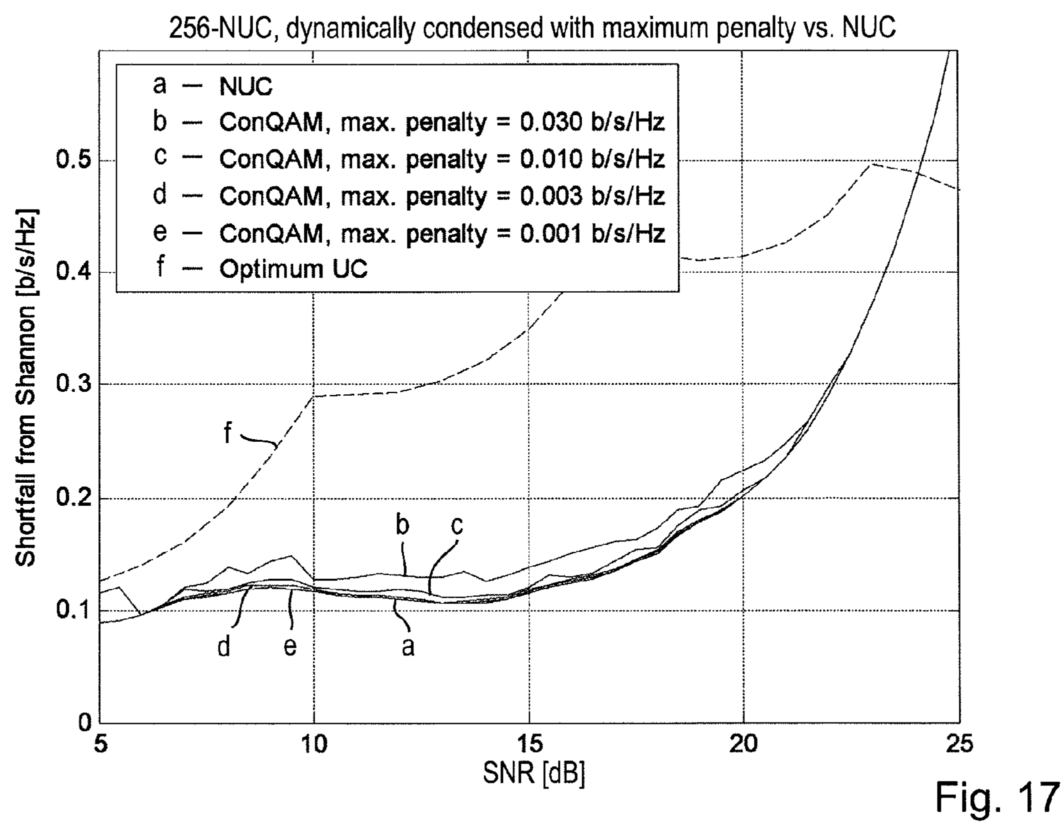
FIG. 17 shows a diagram illustrating the shortfall from Shannon over SNR for a 2D condensed NUC.

FIG. 16 shows a diagram illustrating the number of remaining ConQAM constellation points over SNR for 256-NUC, dynamically condensed with maximum penalty compared to a "normal" non-uniform constellation. FIG. 17 shows a diagram illustrating the shortfall from Shannon (in bits/second/Hertz) over SNR for 256-NUC, dynamically condensed with maximum penalty compared to a "normal" non-uniform constellation.

In the following the definition of the condensed NUC position vectors for 2D NUC constellations obtained by use of the above described condensing approach is provided (for fading channels and for non-fading channels, and for two different penalties). The signal-to-noise ratio (SNR) is always denoted in dB and corresponds to the average SNR in case of fading channels.

i1) 32QQAM with Max. Penalty=0.001 b/s/Hz—AWGN Channel

| SNR/w | w0 | w1 | w2 | w3 |
|---|---|---|---|---|
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i |
| 2 | 0.4053 + 0.5879i | 0.5879 + 0.4054i | 0.6114 + 1.0565i | 1.0566 + 0.6114i |
| 2.5 | 0.3507 + 0.5354i | 0.5354 + 0.3507i | 0.5763 + 1.1217i | 1.1217 + 0.5763i |
| 3 | 0.3189 + 0.5012i | 0.5012 + 0.3189i | 0.5551 + 1.1571i | 1.1571 + 0.5551i |
| 3.5 | 0.2980 + 0.4781i | 0.4781 + 0.2981i | 0.5410 + 1.1789i | 1.1789 + 0.5410i |
| 4 | 0.2842 + 0.4633i | 0.4633 + 0.2842i | 0.5309 + 1.1928i | 1.1928 + 0.5309i |
| 4.5 | 0.2752 + 0.4551i | 0.4551 + 0.2752i | 0.5232 + 1.2014i | 1.2014 + 0.5232i |
| 5 | 0.2696 + 0.4521i | 0.4521 + 0.2696i | 0.5169 + 1.2065i | 1.2065 + 0.5169i |
| 5.5 | 0.2663 + 0.4530i | 0.4530 + 0.2663i | 0.5115 + 1.2092i | 1.2092 + 0.5115i |
| 6 | 0.2642 + 0.4570i | 0.4570 + 0.2642i | 0.5067 + 1.2102i | 1.2102 + 0.5067i |
| 6.5 | 0.2626 + 0.4588i | 0.4588 + 0.2626i | 0.5028 + 1.2085i | 1.2085 + 0.5028i |
| 7 | 0.2602 + 0.4573i | 0.4572 + 0.2602i | 0.3595 + 1.2746i | 1.2746 + 0.3595i |
| 7.5 | 0.2410 + 0.4578i | 0.4577 + 0.2410i | 0.3211 + 1.2755i | 1.2755 + 0.3211i |
| 8 | 0.2351 + 0.4699i | 0.4699 + 0.2351i | 0.2957 + 1.2701i | 1.2701 + 0.2957i |
| 8.5 | 0.2270 + 0.3121i | 0.6255 + 0.2091i | 0.3173 + 1.3160i | 1.3378 + 0.3422i |
| 9 | 0.2117 + 0.2518i | 0.6564 + 0.1984i | 0.3463 + 1.3865i | 1.3392 + 0.3470i |
| 9.5 | 0.2014 + 0.2235i | 0.6716 + 0.1924i | 0.3533 + 1.4075i | 1.3374 + 0.3431i |
| 10 | 0.1946 + 0.2025i | 0.6811 + 0.1872i | 0.3555 + 1.4163i | 1.3323 + 0.3370i |
| 10.5 | 0.1917 + 0.1863i | 0.6885 + 0.1824i | 0.3554 + 1.4185i | 1.3247 + 0.3312i |
| 11 | 0.1929 + 0.1744i | 0.6963 + 0.1782i | 0.3541 + 1.4168i | 1.3162 + 0.3270i |
| 11.5 | 0.1978 + 0.1660i | 0.7046 + 0.1752i | 0.3521 + 1.4127i | 1.3074 + 0.3244i |
| 12 | 0.2047 + 0.1603i | 0.7126 + 0.1738i | 0.3499 + 1.4076i | 1.2978 + 0.3226i |
| 12.5 | 0.2121 + 0.1569i | 0.7185 + 0.1739i | 0.3478 + 1.4027i | 1.2867 + 0.3209i |
| 13 | 0.2187 + 0.1559i | 0.7211 + 0.1755i | 0.3459 + 1.3987i | 1.2734 + 0.3186i |
| 13.5 | 0.2234 + 0.1575i | 0.7198 + 0.1782i | 0.3442 + 1.3961i | 1.2579 + 0.3156i |
| 14 | 0.2261 + 0.1614i | 0.7147 + 0.1816i | 0.3425 + 1.3949i | 1.2405 + 0.3119i |
| 14.5 | 0.2113 + 0.1819i | 0.6590 + 0.1934i | 0.6163 + 1.2930i | 1.1691 + 0.2524i |
| 15 | 0.2082 + 0.1903i | 0.6467 + 0.1971i | 0.6624 + 1.2634i | 1.1455 + 0.2430i |

| SNR/w | w4 | w5 | w6 | w7 |
|---|---|---|---|---|
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i |
| 2 | 0.4053 + 0.5879i | 0.5879 + 0.4054i | 0.6114 + 1.0565i | 1.0566 + 0.6114i |
| 2.5 | 0.3507 + 0.5354i | 0.5354 + 0.3507i | 0.5763 + 1.1217i | 1.1217 + 0.5763i |
| 3 | 0.3189 + 0.5012i | 0.5012 + 0.3189i | 0.5551 + 1.1571i | 1.1571 + 0.5551i |
| 3.5 | 0.2980 + 0.4781i | 0.4781 + 0.2981i | 0.5410 + 1.1789i | 1.1789 + 0.5410i |
| 4 | 0.2842 + 0.4633i | 0.4633 + 0.2842i | 0.5309 + 1.1928i | 1.1928 + 0.5309i |
| 4.5 | 0.2752 + 0.4551i | 0.4551 + 0.2752i | 0.5232 + 1.2014i | 1.2014 + 0.5232i |
| 5 | 0.2696 + 0.4521i | 0.4521 + 0.2696i | 0.5169 + 1.2065i | 1.2065 + 0.5169i |
| 5.5 | 0.2663 + 0.4530i | 0.4530 + 0.2663i | 0.5115 + 1.2092i | 1.2092 + 0.5115i |
| 6 | 0.2642 + 0.4570i | 0.4570 + 0.2642i | 0.5067 + 1.2102i | 1.2102 + 0.5067i |
| 6.5 | 0.2626 + 0.4588i | 0.4588 + 0.2626i | 0.5028 + 1.2085i | 1.2085 + 0.5028i |
| 7 | 0.2602 + 0.4573i | 0.4572 + 0.2602i | 0.6396 + 1.1327i | 1.1327 + 0.6395i |
| 7.5 | 0.2728 + 0.4655i | 0.4655 + 0.2728i | 0.6715 + 1.1226i | 1.1226 + 0.6715i |

-continued

| | | | | |
|---|---|---|---|---|
| 8 | 0.2695 + 0.4698i | 0.4698 + 0.2695i | 0.6913 + 1.1190i | 1.1190 + 0.6913i |
| 8.5 | 0.2428 + 0.4444i | 0.5783 + 0.3109i | 0.4151 + 1.0074i | 1.0441 + 0.8436i |
| 9 | 0.2317 + 0.4565i | 0.6091 + 0.3434i | 0.3354 + 0.9582i | 0.9927 + 0.8356i |
| 9.5 | 0.2276 + 0.4678i | 0.6230 + 0.3674i | 0.3047 + 0.9383i | 0.9683 + 0.8393i |
| 10 | 0.2266 + 0.4818i | 0.6303 + 0.3928i | 0.2860 + 0.9269i | 0.9538 + 0.8460i |
| 10.5 | 0.2273 + 0.4949i | 0.6340 + 0.4191i | 0.2729 + 0.9204i | 0.9446 + 0.8543i |
| 11 | 0.2283 + 0.5036i | 0.6364 + 0.4437i | 0.2627 + 0.9170i | 0.9382 + 0.8637i |
| 11.5 | 0.2287 + 0.5076i | 0.6386 + 0.4654i | 0.2546 + 0.9154i | 0.9335 + 0.8738i |
| 12 | 0.2280 + 0.5086i | 0.6410 + 0.4845i | 0.2485 + 0.9154i | 0.9299 + 0.8841i |
| 12.5 | 0.2258 + 0.5089i | 0.6431 + 0.5018i | 0.2443 + 0.9172i | 0.9274 + 0.8949i |
| 13 | 0.2225 + 0.5103i | 0.6446 + 0.5183i | 0.2415 + 0.9207i | 0.9257 + 0.9059i |
| 13.5 | 0.2189 + 0.5139i | 0.6455 + 0.5346i | 0.2398 + 0.9259i | 0.9246 + 0.9174i |
| 14 | 0.2157 + 0.5201i | 0.6463 + 0.5505i | 0.2389 + 0.9324i | 0.9230 + 0.9294i |
| 14.5 | 0.2042 + 0.5736i | 0.6214 + 0.5984i | 0.2154 + 1.0277i | 1.0670 + 0.7825i |
| 15 | 0.2028 + 0.5942i | 0.6209 + 0.6087i | 0.2221 + 1.0561i | 1.0812 + 0.7572i |

j1) 64QQAM with Max. Penalty=0.001 b/s/Hz—AWGN Channel

| SNR/w | w0 | w1 | w2 | w3 |
|---|---|---|---|---|
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i |
| 2 | 1.0566 + 0.6114i | 1.0566 + 0.6114i | 0.5879 + 0.4053i | 0.5879 + 0.4053i |
| 2.5 | 1.1217 + 0.5763i | 1.1217 + 0.5763i | 1.1217 + 0.5763i | 1.1217 + 0.5763i |
| 3 | 0.5551 + 1.1571i | 0.3189 + 0.5012i | 1.1571 + 0.5551i | 0.5012 + 0.3189i |
| 3.5 | 1.1789 + 0.5410i | 1.1789 + 0.5410i | 1.1789 + 0.5410i | 1.1789 + 0.5410i |
| 4 | 0.2842 + 0.4633i | 0.2842 + 0.4633i | 0.5309 + 1.1928i | 0.5309 + 1.1928i |
| 4.5 | 0.5232 + 1.2014i | 0.5232 + 1.2014i | 0.5232 + 1.2014i | 0.5232 + 1.2014i |
| 5 | 1.2065 + 0.5169i | 1.2065 + 0.5169i | 1.2065 + 0.5169i | 1.2065 + 0.5169i |
| 5.5 | 1.2092 + 0.5115i | 1.2092 + 0.5115i | 1.2092 + 0.5115i | 1.2092 + 0.5115i |
| 6 | 0.2642 + 0.4570i | 0.2642 + 0.4570i | 0.2642 + 0.4570i | 0.2642 + 0.4570i |
| 6.5 | 0.5028 + 1.2085i | 0.5028 + 1.2085i | 0.5028 + 1.2085i | 0.5028 + 1.2085i |
| 7 | 0.3595 + 1.2746i | 0.6396 + 1.1327i | 0.3595 + 1.2746i | 0.6396 + 1.1327i |
| 7.5 | 0.7476 + 1.2181i | 0.5961 + 1.0258i | 0.3325 + 1.3887i | 0.3069 + 1.1510i |
| 8 | 0.3109 + 1.4253i | 0.7943 + 1.2523i | 0.2868 + 1.0998i | 0.5786 + 0.9799i |
| 8.5 | 1.6023 + 0.4387i | 1.0881 + 0.8753i | 0.4387 + 1.6023i | 0.8753 + 1.0881i |
| 9 | 0.4221 + 1.5951i | 1.5951 + 0.4221i | 0.8732 + 1.0971i | 1.0971 + 0.8732i |
| 9.5 | 0.8408 + 1.2670i | 0.5485 + 0.9136i | 0.2950 + 1.4844i | 0.2548 + 1.0308i |
| 10 | 1.2647 + 0.8443i | 1.4891 + 0.2935i | 0.9020 + 0.5498i | 1.0230 + 0.2451i |
| 10.5 | 0.2925 + 1.4892i | 0.8449 + 1.2622i | 0.2351 + 1.0196i | 0.5555 + 0.8926i |
| 11 | 0.8435 + 1.2594i | 0.5630 + 0.8851i | 0.2921 + 1.4867i | 0.2255 + 1.0193i |
| 11.5 | 0.2920 + 1.4827i | 0.8411 + 1.2563i | 0.2174 + 1.0211i | 0.5702 + 0.8798i |
| 12 | 0.2920 + 1.4781i | 0.8380 + 1.2527i | 0.2112 + 1.0242i | 0.5763 + 0.8768i |
| 12.5 | 0.2920 + 1.4732i | 0.8348 + 1.2487i | 0.2071 + 1.0283i | 0.5811 + 0.8760i |
| 13 | 0.2978 + 1.4669i | 0.8421 + 1.2355i | 0.2135 + 1.0389i | 0.6055 + 0.8654i |
| 13.5 | 1.4627 + 0.2996i | 1.0469 + 0.2187i | 1.2278 + 0.8422i | 0.8605 + 0.6179i |
| 14 | 0.2989 + 1.4602i | 0.8389 + 1.2232i | 0.2232 + 1.0534i | 0.6245 + 0.8593i |
| 14.5 | 0.2878 + 1.4388i | 0.8133 + 1.2150i | 0.2219 + 1.0386i | 0.6145 + 0.8494i |
| 15 | 0.9687 − 0.4488i | 0.1261 − 0.4193i | 0.6752 − 0.4269i | 0.3896 − 0.4201i |
| 15.5 | 0.9856 − 0.4661i | 0.1264 − 0.4145i | 0.6825 − 0.4329i | 0.3948 − 0.4179i |
| 16 | 1.0161 − 0.4912i | 0.1287 − 0.4061i | 0.6966 − 0.4427i | 0.4025 − 0.4142i |
| 16.5 | 1.0519 − 0.5188i | 0.1325 − 0.3998i | 0.7146 − 0.4532i | 0.4122 − 0.4120i |
| 17 | 1.0725 − 0.5328i | 0.1361 − 0.4023i | 0.7267 − 0.4592i | 0.4198 − 0.4151i |
| 17.5 | 1.0854 − 0.5394i | 0.1392 − 0.4078i | 0.7353 − 0.4623i | 0.4262 − 0.4205i |
| 18 | 1.0941 − 0.5424i | 0.1418 − 0.4131i | 0.7424 − 0.4645i | 0.4318 − 0.4266i |
| 18.5 | 1.0998 − 0.5430i | 0.1439 − 0.4173i | 0.7487 − 0.4666i | 0.4370 − 0.4325i |
| 19 | 1.1032 − 0.5410i | 0.1458 − 0.4204i | 0.7543 − 0.4691i | 0.4418 − 0.4382i |
| 19.5 | 1.1043 − 0.5346i | 0.1473 − 0.4225i | 0.7587 − 0.4731i | 0.4459 − 0.4435i |
| 20 | 1.1039 − 0.5232i | 0.1486 − 0.4237i | 0.7620 − 0.4802i | 0.4492 − 0.4482i |

| SNR/w | w4 | w5 | w6 | w7 |
|---|---|---|---|---|
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i |
| 2 | 0.6114 + 1.0566i | 0.6114 + 1.0566i | 0.4053 + 0.5879i | 0.4053 + 0.5879i |
| 2.5 | 0.5354 + 0.3507i | 0.5354 + 0.3507i | 0.5354 + 0.3507i | 0.5354 + 0.3507i |
| 3 | 0.5551 + 1.1571i | 0.3189 + 0.5012i | 1.1571 + 0.5551i | 0.5012 + 0.3189i |
| 3.5 | 0.4781 + 0.2981i | 0.4781 + 0.2981i | 0.4781 + 0.2981i | 0.4781 + 0.2981i |
| 4 | 0.2842 + 0.4633i | 0.2842 + 0.4633i | 0.5309 + 1.1928i | 0.5309 + 1.1928i |
| 4.5 | 1.2014 + 0.5232i | 1.2014 + 0.5232i | 1.2014 + 0.5232i | 1.2014 + 0.5232i |
| 5 | 0.5169 + 1.2065i | 0.5169 + 1.2065i | 0.5169 + 1.2065i | 0.5169 + 1.2065i |

-continued

| | | | | |
|---|---|---|---|---|
| 5.5 | 0.4530 + 0.2663i | 0.4530 + 0.2663i | 0.4530 + 0.2663i | 0.4530 + 0.2663i |
| 6 | 0.4570 + 0.2642i | 0.4570 + 0.2642i | 0.4570 + 0.2642i | 0.4570 + 0.2642i |
| 6.5 | 1.2085 + 0.5028i | 1.2085 + 0.5028i | 1.2085 + 0.5028i | 1.2085 + 0.5028i |
| 7 | 1.2746 + 0.3595i | 1.1327 + 0.6396i | 1.2746 + 0.3595i | 1.1327 + 0.6396i |
| 7.5 | 1.2181 + 0.7475i | 1.0258 + 0.5961i | 1.3887 + 0.3325i | 1.1510 + 0.3069i |
| 8 | 1.4253 + 0.3109i | 1.2523 + 0.7943i | 1.0998 + 0.2868i | 0.9799 + 0.5786i |
| 8.5 | 0.9239 + 0.2202i | 0.8454 + 0.3049i | 0.7818 + 0.2019i | 0.7540 + 0.2653i |
| 9 | 0.7823 + 0.2020i | 0.9288 + 0.2247i | 0.7537 + 0.2686i | 0.8479 + 0.3175i |
| 9.5 | 1.2670 + 0.8407i | 0.9136 + 0.5485i | 1.4844 + 0.2950i | 1.0308 + 0.2548i |
| 10 | 0.3072 + 0.1682i | 0.3072 + 0.1682i | 0.5944 + 0.3252i | 0.6401 + 0.2182i |
| 10.5 | 1.4892 + 0.2925i | 1.2622 + 0.8449i | 1.0196 + 0.2351i | 0.8926 + 0.5555i |
| 11 | 1.2594 + 0.8435i | 0.8851 + 0.5630i | 1.4867 + 0.2921i | 1.0193 + 0.2255i |
| 11.5 | 1.4827 + 0.2920i | 1.2563 + 0.8411i | 1.0211 + 0.2174i | 0.8798 + 0.5702i |
| 12 | 1.4781 + 0.2920i | 1.2527 + 0.8380i | 1.0242 + 0.2112i | 0.8768 + 0.5763i |
| 12.5 | 1.4732 + 0.2920i | 1.2487 + 0.8348i | 1.0283 + 0.2071i | 0.8760 + 0.5811i |
| 13 | 1.4685 + 0.2859i | 1.2516 + 0.8201i | 1.0279 + 0.1981i | 0.8857 + 0.5642i |
| 13.5 | 0.4106 + 0.1299i | 0.7441 + 0.1749i | 0.3822 + 0.1824i | 0.6160 + 0.4168i |
| 14 | 1.4560 + 0.2819i | 1.2434 + 0.8085i | 1.0319 + 0.1914i | 0.8945 + 0.5550i |
| 14.5 | 1.4656 + 0.2931i | 1.2278 + 0.8230i | 1.0649 + 0.2069i | 0.8971 + 0.5677i |
| 15 | 1.0304 − 0.1506i | 0.1248 − 0.1379i | 0.6647 − 0.1295i | 0.3769 − 0.1364i |
| 15.5 | 1.0366 − 0.1534i | 0.1272 − 0.1353i | 0.6796 − 0.1340i | 0.3877 − 0.1359i |
| 16 | 1.0441 − 0.1581i | 0.1321 − 0.1317i | 0.6995 − 0.1411i | 0.4035 − 0.1354i |
| 16.5 | 1.0500 − 0.1642i | 0.1374 − 0.1295i | 0.7170 − 0.1473i | 0.4185 − 0.1357i |
| 17 | 1.0501 − 0.1676i | 0.1398 − 0.1309i | 0.7233 − 0.1496i | 0.4246 − 0.1370i |
| 17.5 | 1.0474 − 0.1695i | 0.1407 − 0.1336i | 0.7243 − 0.1504i | 0.4265 − 0.1388i |
| 18 | 1.0439 − 0.1707i | 0.1411 − 0.1361i | 0.7235 − 0.1509i | 0.4269 − 0.1406i |
| 18.5 | 1.0405 − 0.1713i | 0.1414 − 0.1380i | 0.7224 − 0.1517i | 0.4269 − 0.1425i |
| 19 | 1.0373 − 0.1716i | 0.1414 − 0.1393i | 0.7213 − 0.1527i | 0.4267 − 0.1443i |
| 19.5 | 1.0338 − 0.1710i | 0.1414 − 0.1401i | 0.7201 − 0.1544i | 0.4264 − 0.1461i |
| 20 | 1.0304 − 0.1696i | 0.1413 − 0.1405i | 0.7193 − 0.1572i | 0.4263 − 0.1477i |

| SNR/w | w8 | w9 | w10 | w11 |
|---|---|---|---|---|
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i |
| 2 | 1.0566 + 0.6114i | 1.0566 + 0.6114i | 0.5879 + 0.4053i | 0.5879 + 0.4053i |
| 2.5 | 0.5763 + 1.1217i | 0.5763 + 1.1217i | 0.5763 + 1.1217i | 0.5763 + 1.1217i |
| 3 | 0.5551 + 1.1571i | 0.3189 + 0.5012i | 1.1571 + 0.5551i | 0.5012 + 0.3189i |
| 3.5 | 0.5410 + 1.1789i | 0.5410 + 1.1789i | 0.5410 + 1.1789i | 0.5410 + 1.1789i |
| 4 | 0.4633 + 0.2842i | 0.4633 + 0.2842i | 1.1928 + 0.5309i | 1.1928 + 0.5309i |
| 4.5 | 0.2752 + 0.4551i | 0.2752 + 0.4551i | 0.2752 + 0.4551i | 0.2752 + 0.4551i |
| 5 | 0.4521 + 0.2696i | 0.4521 + 0.2696i | 0.4521 + 0.2696i | 0.4521 + 0.2696i |
| 5.5 | 0.5115 + 1.2092i | 0.5115 + 1.2092i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i |
| 6.5 | 0.2626 + 0.4588i | 0.2626 + 0.4588i | 0.2626 + 0.4588i | 0.2626 + 0.4588i |
| 7 | 0.2602 + 0.4573i | 0.2602 + 0.4573i | 0.2602 + 0.4573i | 0.2602 + 0.4573i |
| 7.5 | 0.2376 + 0.4123i | 0.2685 + 0.4969i | 0.2376 + 0.4123i | 0.2685 + 0.4969i |
| 8 | 0.2193 + 0.3832i | 0.2193 + 0.3832i | 0.2478 + 0.5286i | 0.2937 + 0.5184i |
| 8.5 | 0.2019 + 0.7818i | 0.2653 + 0.7540i | 0.2202 + 0.9239i | 0.3049 + 0.8454i |
| 9 | 0.2247 + 0.9288i | 0.2020 + 0.7823i | 0.3175 + 0.8479i | 0.2686 + 0.7537i |
| 9.5 | 0.1758 + 0.3172i | 0.3159 + 0.5815i | 0.1758 + 0.3172i | 0.2278 + 0.6176i |
| 10 | 0.8443 + 1.2648i | 0.2935 + 1.4891i | 0.5498 + 0.9020i | 0.2451 + 1.0230i |
| 10.5 | 0.1635 + 0.3025i | 0.1635 + 0.3025i | 0.2075 + 0.6586i | 0.3354 + 0.6030i |
| 11 | 0.1606 + 0.3016i | 0.3460 + 0.6087i | 0.1606 + 0.3016i | 0.1969 + 0.6737i |
| 11.5 | 0.1583 + 0.3034i | 0.1583 + 0.3034i | 0.1871 + 0.6855i | 0.3563 + 0.6126i |
| 12 | 0.1560 + 0.3070i | 0.1560 + 0.3070i | 0.1789 + 0.6942i | 0.3657 + 0.6155i |
| 12.5 | 0.1393 + 0.3138i | 0.1671 + 0.3094i | 0.1720 + 0.7004i | 0.3741 + 0.6174i |
| 13 | 0.1338 + 0.3767i | 0.1752 + 0.3563i | 0.1756 + 0.7261i | 0.4023 + 0.6180i |
| 13.5 | 0.2831 + 1.4625i | 0.1935 + 1.0296i | 0.8124 + 1.2487i | 0.5574 + 0.8909i |
| 14 | 0.1266 + 0.4289i | 0.1907 + 0.3970i | 0.1717 + 0.7575i | 0.4261 + 0.6136i |
| 14.5 | 0.1177 + 0.4119i | 0.2516 + 0.3998i | 0.1559 + 0.7442i | 0.4328 + 0.5954i |
| 15 | 1.1704 − 0.7904i | 0.1452 − 0.7405i | 0.6932 − 0.8128i | 0.4017 − 0.7221i |
| 15.5 | 1.1580 − 0.8178i | 0.1416 − 0.7330i | 0.6913 − 0.8132i | 0.4018 − 0.7177i |
| 16 | 1.1306 − 0.8649i | 0.1385 − 0.7199i | 0.6874 − 0.8123i | 0.4017 − 0.7107i |
| 16.5 | 1.0952 − 0.9115i | 0.1369 − 0.7073i | 0.6868 − 0.8108i | 0.4044 − 0.7057i |
| 17 | 1.0771 − 0.9315i | 0.1373 − 0.7043i | 0.6956 − 0.8095i | 0.4114 − 0.7109i |
| 17.5 | 1.0693 − 0.9408i | 0.1388 − 0.7057i | 0.7092 − 0.8073i | 0.4197 − 0.7206i |
| 18 | 1.0666 − 0.9452i | 0.1406 − 0.7083i | 0.7229 − 0.8052i | 0.4275 − 0.7307i |
| 18.5 | 1.0673 − 0.9458i | 0.1425 − 0.7109i | 0.7349 − 0.8045i | 0.4344 − 0.7399i |
| 19 | 1.0720 − 0.9413i | 0.1445 − 0.7131i | 0.7452 − 0.8057i | 0.4404 − 0.7481i |
| 19.5 | 1.0847 − 0.9271i | 0.1467 − 0.7148i | 0.7552 − 0.8112i | 0.4463 − 0.7557i |
| 20 | 1.1043 − 0.9013i | 0.1491 − 0.7159i | 0.7655 − 0.8232i | 0.4529 − 0.7625i |

| SNR/w | w12 | w13 | w14 | w15 |
|---|---|---|---|---|
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |

-continued

| | | | | |
|---|---|---|---|---|
| 1 | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i |
| 2 | 0.6114 + 1.0566i | 0.6114 + 1.0566i | 0.4053 + 0.5879i | 0.4053 + 0.5879i |
| 2.5 | 0.3507 + 0.5354i | 0.3507 + 0.5354i | 0.3507 + 0.5354i | 0.3507 + 0.5354i |
| 3 | 0.5551 + 1.1571i | 0.3189 + 0.5012i | 1.1571 + 0.5551i | 0.5012 + 0.3189i |
| 3.5 | 0.2980 + 0.4781i | 0.2980 + 0.4781i | 0.2980 + 0.4781i | 0.2980 + 0.4781i |
| 4 | 0.4633 + 0.2842i | 0.4633 + 0.2842i | 1.1928 + 0.5309i | 1.1928 + 0.5309i |
| 4.5 | 0.4551 + 0.2752i | 0.4551 + 0.2752i | 0.4551 + 0.2752i | 0.4551 + 0.2752i |
| 5 | 0.2696 + 0.4521i | 0.2696 + 0.4521i | 0.2696 + 0.4521i | 0.2696 + 0.4521i |
| 5.5 | 0.2663 + 0.4530i | 0.2663 + 0.4530i | 0.2663 + 0.4530i | 0.2663 + 0.4530i |
| 6 | 1.2102 + 0.5067i | 1.2102 + 0.5067i | 1.2102 + 0.5067i | 1.2102 + 0.5067i |
| 6.5 | 0.4588 + 0.2626i | 0.4588 + 0.2626i | 0.4588 + 0.2626i | 0.4588 + 0.2626i |
| 7 | 0.4573 + 0.2602i | 0.4573 + 0.2602i | 0.4573 + 0.2602i | 0.4573 + 0.2602i |
| 7.5 | 0.4123 + 0.2376i | 0.4969 + 0.2685i | 0.4123 + 0.2376i | 0.4969 + 0.2685i |
| 8 | 0.3832 + 0.2193i | 0.3832 + 0.2193i | 0.5286 + 0.2478i | 0.5184 + 0.2937i |
| 8.5 | 0.2686 + 0.2686i | 0.2686 + 0.2686i | 0.2686 + 0.2686i | 0.2686 + 0.2686i |
| 9 | 0.2668 + 0.2584i | 0.2668 + 0.2584i | 0.2668 + 0.2584i | 0.2660 + 0.2913i |
| 9.5 | 0.3172 + 0.1758i | 0.5815 + 0.3159i | 0.3172 + 0.1758i | 0.6176 + 0.2278i |
| 10 | 0.1682 + 0.3072i | 0.1682 + 0.3072i | 0.3252 + 0.5944i | 0.2182 + 0.6401i |
| 10.5 | 0.3025 + 0.1635i | 0.3025 + 0.1635i | 0.6586 + 0.2075i | 0.6030 + 0.3354i |
| 11 | 0.3016 + 0.1606i | 0.6087 + 0.3460i | 0.3016 + 0.1606i | 0.6737 + 0.1969i |
| 11.5 | 0.3034 + 0.1583i | 0.3034 + 0.1583i | 0.6855 + 0.1871i | 0.6126 + 0.3563i |
| 12 | 0.3070 + 0.1560i | 0.3070 + 0.1560i | 0.6942 + 0.1789i | 0.6155 + 0.3657i |
| 12.5 | 0.3138 + 0.1393i | 0.3094 + 0.1671i | 0.7004 + 0.1720i | 0.6174 + 0.3741i |
| 13 | 0.2730 + 0.1455i | 0.2730 + 0.1455i | 0.6840 + 0.1578i | 0.6145 + 0.3555i |
| 13.5 | 0.1413 + 0.2555i | 0.1488 + 0.6759i | 0.1413 + 0.2555i | 0.3493 + 0.6111i |
| 14 | 0.2461 + 0.1402i | 0.2461 + 0.1402i | 0.6735 + 0.1418i | 0.6085 + 0.3483i |
| 14.5 | 0.1678 + 0.1166i | 0.3325 + 0.1582i | 0.7408 + 0.1355i | 0.6200 + 0.3227i |
| 15 | 1.4580 − 0.2741i | 0.1644 − 1.0798i | 0.7344 − 1.2171i | 0.2867 − 1.4419i |
| 15.5 | 1.4529 − 0.2702i | 0.1686 − 1.0718i | 0.7097 − 1.2125i | 0.2732 − 1.4375i |
| 16 | 1.4516 − 0.2578i | 0.1689 − 1.0567i | 0.6750 − 1.2072i | 0.2558 − 1.4247i |
| 16.5 | 1.4480 − 0.2403i | 0.1677 − 1.0405i | 0.6406 − 1.1995i | 0.2402 − 1.4087i |
| 17 | 1.4380 − 0.2294i | 0.1680 − 1.0338i | 0.6220 − 1.1896i | 0.2326 − 1.3986i |
| 17.5 | 1.4261 − 0.2216i | 0.1682 − 1.0316i | 0.6106 − 1.1783i | 0.2287 − 1.3914i |
| 18 | 1.4143 − 0.2157i | 0.1685 − 1.0310i | 0.6029 − 1.1680i | 0.2262 − 1.3855i |
| 18.5 | 1.4036 − 0.2110i | 0.1691 − 1.0309i | 0.5971 − 1.1599i | 0.2240 − 1.3805i |
| 19 | 1.3941 − 0.2072i | 0.1697 − 1.0309i | 0.5918 − 1.1539i | 0.2216 − 1.3761i |
| 19.5 | 1.3857 − 0.2033i | 0.1703 − 1.0305i | 0.5851 − 1.1507i | 0.2181 − 1.3721i |
| 20 | 1.3785 − 0.1990i | 0.1705 − 1.0293i | 0.5745 − 1.1503i | 0.2128 − 1.3684i |

k1) 256QQAM with Max. Penalty=0.001 b/s/Hz—AWGN Channel

| SNR/ w | w0 | w1 | w2 | w3 |
|---|---|---|---|---|
| 5 | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i |
| 6 | 1.2102 + 0.5067i | 1.2102 + 0.5067i | 1.2102 + 0.5067i | 1.2102 + 0.5067i |
| 6.5 | 1.2085 + 0.5028i | 1.2085 + 0.5028i | 1.2085 + 0.5028i | 1.2085 + 0.5028i |
| 7 | 1.1322 + 0.6970i | 1.0432 + 0.6178i | 1.5234 + 1.0871i | 1.1322 + 0.6970i |
| 7.5 | 0.2588 + 0.4732i | 0.2411 + 0.4249i | 0.5864 + 1.0293i | 0.6595 + 1.1198i |
| 8 | 0.3565 + 1.7813i | 0.3059 + 1.2626i | 0.3059 + 1.2626i | 0.2962 + 1.1484i |
| 8.5 | 0.3488 + 1.7914i | 0.2880 + 1.2587i | 0.2880 + 1.2587i | 0.2788 + 1.1468i |
| 9 | 1.6414 + 0.6837i | 0.9335 + 0.8803i | 0.2681 + 1.4953i | 0.7270 + 0.9501i |
| 9.5 | 1.6327 + 0.6734i | 0.9469 + 0.8771i | 0.2526 + 1.4830i | 0.7372 + 0.9369i |
| 10 | 1.7476 − 0.3437i | 1.4280 − 0.2830i | 1.0127 − 0.2440i | 1.0127 − 0.2440i |
| 10.5 | 1.7549 − 0.3495i | 1.4293 − 0.2804i | 1.0027 − 0.2346i | 1.0027 − 0.2346i |
| 11 | 0.3538 + 1.7624i | 0.2788 + 1.4265i | 0.2788 + 1.4265i | 0.2610 + 1.3647i |
| 11.5 | 0.3289 + 1.4165i | 0.3556 + 1.7714i | 0.2605 + 1.3630i | 0.2302 + 1.4276i |
| 12 | 0.6800 + 1.6926i | 0.3911 + 1.3645i | 0.2191 + 1.7524i | 0.2274 + 1.4208i |
| 12.5 | 0.7085 + 1.6630i | 0.4337 + 1.3632i | 0.2265 + 1.7707i | 0.2214 + 1.4346i |
| 13 | 0.7232 + 1.6427i | 0.4625 + 1.3572i | 0.2367 + 1.7836i | 0.2081 + 1.4453i |
| 13.5 | 0.7280 + 1.6384i | 0.4787 + 1.3492i | 0.2417 + 1.7872i | 0.1966 + 1.4478i |
| 14 | 0.6852 + 1.6631i | 0.4978 + 1.3396i | 0.2241 + 1.7611i | 0.1891 + 1.4343i |
| 14.5 | 0.6850 + 1.6565i | 0.5110 + 1.3346i | 0.2284 + 1.7618i | 0.1836 + 1.4363i |
| 15 | 1.1831 + 1.3352i | 1.5548 + 0.8930i | 1.0563 + 0.9473i | 1.1944 + 0.8535i |
| 15.5 | 1.3333 + 1.1727i | 0.9525 + 1.0450i | 0.8764 + 1.5619i | 0.8595 + 1.2191i |
| 16 | 1.0693 + 1.3695i | 1.6456 + 0.7233i | 1.0401 + 0.9844i | 1.3351 + 0.9489i |
| 16.5 | 1.3185 + 1.1655i | 1.0729 + 0.9416i | 0.9781 + 1.3517i | 0.9292 + 0.9707i |
| 17 | 1.1514 + 1.3474i | 1.3447 + 1.0136i | 0.9323 + 1.1378i | 0.9510 + 0.9427i |
| 17.5 | 1.1159 + 1.3726i | 1.3078 + 1.0458i | 0.9051 + 1.1657i | 0.9509 + 0.9581i |
| 18 | 1.1058 + 1.3496i | 1.2204 + 1.0180i | 0.8713 + 1.1743i | 0.9189 + 0.9604i |
| 18.5 | 1.1022 + 1.3396i | 1.2102 + 1.0122i | 0.8669 + 1.1800i | 0.9153 + 0.9665i |
| 19 | 1.5817 + 0.4283i | 1.4894 + 0.1404i | 1.4735 + 0.7375i | 1.2229 + 0.6531i |
| 19.5 | 0.8375 + 1.4782i | 1.3271 + 0.8728i | 1.1494 + 1.1881i | 1.0720 + 0.8655i |

-continued

| | | | | |
|---|---|---|---|---|
| 20 | 1.1577 + 1.2607i | 1.2132 + 0.9665i | 0.8650 + 1.2652i | 0.9371 + 1.0167i |
| 20.5 | 1.1623 + 1.2367i | 1.2152 + 0.9464i | 0.8671 + 1.2704i | 0.9416 + 1.0203i |
| 21 | 1.1584 + 1.2194i | 1.2110 + 0.9332i | 0.8614 + 1.2738i | 0.9374 + 1.0274i |
| 21.5 | 1.1541 + 1.1980i | 1.2082 + 0.9192i | 0.8523 + 1.2778i | 0.9253 + 1.0390i |
| 22 | 1.1564 + 1.1321i | 1.2409 + 0.8772i | 0.8304 + 1.2958i | 0.8902 + 1.0738i |
| 22.5 | 1.1672 + 1.0989i | 1.2422 + 0.8522i | 0.8024 + 1.2971i | 0.8967 + 1.0878i |
| 23 | 1.2322 + 1.0269i | 1.4082 + 0.7080i | 0.7782 + 1.3193i | 0.9660 + 1.1333i |
| 23.5 | 1.1616 + 1.0595i | 1.2384 + 0.8218i | 0.7696 + 1.2863i | 0.8965 + 1.0947i |
| 24 | 1.2424 + 0.9493i | 1.2834 + 0.7245i | 0.9545 + 1.2183i | 1.0015 + 1.0002i |
| 24.5 | 1.2328 + 0.9369i | 1.2653 + 0.7160i | 0.9349 + 1.2178i | 0.9989 + 1.0051i |
| 25 | 1.2245 + 0.9258i | 1.2535 + 0.7077i | 0.9208 + 1.2133i | 0.9969 + 1.0052i |
| 25.5 | 1.2171 + 0.9128i | 1.2413 + 0.6969i | 0.9105 + 1.2064i | 0.9951 + 1.0017i |
| 26 | 1.2103 + 0.9014i | 1.2323 + 0.6874i | 0.9022 + 1.1987i | 0.9925 + 0.9967i |

| SNR/ w | w4 | w5 | w6 | w7 |
|---|---|---|---|---|
| 5 | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i |
| 6 | 0.4570 + 0.2642i | 0.4570 + 0.2642i | 0.4570 + 0.2642i | 0.4570 + 0.2642i |
| 6.5 | 1.2085 + 0.5028i | 1.2085 + 0.5028i | 1.2085 + 0.5028i | 1.2085 + 0.5028i |
| 7 | 1.2925 + 0.3605i | 1.1736 + 0.3521i | 1.6996 + 0.3860i | 1.2925 + 0.3605i |
| 7.5 | 0.2753 + 0.5196i | 0.2588 + 0.4732i | 0.5525 + 0.9862i | 0.5864 + 1.0293i |
| 8 | 1.0099 + 1.5146i | 0.6749 + 1.1091i | 0.6749 + 1.1091i | 0.6000 + 1.0201i |
| 8.5 | 1.0152 + 1.5168i | 0.6879 + 1.1023i | 0.6879 + 1.1023i | 0.6127 + 1.0130i |
| 9 | 1.8682 + 0.2925i | 0.8579 + 0.9067i | 0.3433 + 1.4695i | 0.6978 + 1.0003i |
| 9.5 | 1.8490 + 0.2874i | 0.8644 + 0.9027i | 0.3370 + 1.4511i | 0.7054 + 0.9892i |
| 10 | 1.4280 − 0.2830i | 1.3530 − 0.2686i | 1.0127 − 0.2440i | 1.0415 − 0.2449i |
| 10.5 | 1.4293 − 0.2804i | 1.3614 − 0.2635i | 1.0027 − 0.2346i | 1.0372 − 0.2356i |
| 11 | 0.9952 + 1.4965i | 0.8098 + 1.2072i | 0.8098 + 1.2072i | 0.7783 + 1.1510i |
| 11.5 | 0.7692 + 1.2350i | 1.0007 + 1.5057i | 0.7800 + 1.1485i | 0.8472 + 1.1728i |
| 12 | 0.8678 + 1.2487i | 0.7275 + 1.1667i | 0.8747 + 1.0470i | 0.7930 + 1.0406i |
| 12.5 | 0.8829 + 1.2345i | 0.7423 + 1.1546i | 0.9077 + 1.0034i | 0.8363 + 0.9971i |
| 13 | 0.8955 + 1.2316i | 0.7485 + 1.1494i | 0.9349 + 0.9699i | 0.8724 + 0.9626i |
| 13.5 | 0.9185 + 1.2490i | 0.7448 + 1.1524i | 0.9536 + 0.9516i | 0.8912 + 0.9461i |
| 14 | 1.0300 + 1.3532i | 0.7389 + 1.1771i | 0.9797 + 0.9598i | 0.8864 + 0.9798i |
| 14.5 | 1.0485 + 1.3578i | 0.7448 + 1.1781i | 0.9923 + 0.9464i | 0.9014 + 0.9717i |
| 15 | 1.7139 + 0.2236i | 1.4688 + 0.5085i | 0.9846 + 0.6522i | 1.0982 + 0.6252i |
| 15.5 | 1.2665 + 0.7890i | 1.0238 + 0.8157i | 1.0119 + 0.5685i | 1.0066 + 0.6087i |
| 16 | 1.6696 + 0.1992i | 1.4116 + 0.4773i | 0.9912 + 0.6923i | 1.1625 + 0.6341i |
| 16.5 | 1.4986 + 0.8198i | 1.2084 + 0.6881i | 0.9265 + 0.5535i | 0.9824 + 0.6211i |
| 17 | 1.2112 + 0.5426i | 1.2864 + 0.7311i | 0.9873 + 0.5679i | 0.9676 + 0.7289i |
| 17.5 | 1.2112 + 0.5506i | 1.3032 + 0.7544i | 0.9969 + 0.5672i | 0.9755 + 0.7547i |
| 18 | 1.2283 + 0.6284i | 1.4576 + 0.8033i | 1.0010 + 0.6008i | 0.9350 + 0.7635i |
| 18.5 | 1.2205 + 0.6352i | 1.4496 + 0.8012i | 0.9972 + 0.5981i | 0.9328 + 0.7745i |
| 19 | 1.0586 + 0.3317i | 1.2553 + 0.3125i | 0.9114 + 0.4575i | 1.0349 + 0.5768i |
| 19.5 | 1.5541 + 0.6145i | 1.2416 + 0.5886i | 0.9113 + 0.4993i | 1.0207 + 0.6225i |
| 20 | 1.2341 + 0.6321i | 1.4507 + 0.7875i | 0.9999 + 0.6438i | 0.9509 + 0.8111i |
| 20.5 | 1.2263 + 0.6212i | 1.4418 + 0.7638i | 0.9979 + 0.6457i | 0.9519 + 0.8158i |
| 21 | 1.2218 + 0.6145i | 1.4309 + 0.7504i | 0.9986 + 0.6549i | 0.9484 + 0.8261i |
| 21.5 | 1.2200 + 0.6057i | 1.4217 + 0.7371i | 1.0021 + 0.6678i | 0.9448 + 0.8412i |
| 22 | 1.2195 + 0.5872i | 1.4329 + 0.6862i | 1.0077 + 0.6857i | 0.9610 + 0.8761i |
| 22.5 | 1.2134 + 0.5744i | 1.4239 + 0.6620i | 1.0091 + 0.6909i | 0.9644 + 0.8828i |
| 23 | 1.4427 + 0.4179i | 1.1837 + 0.7680i | 0.9625 + 0.7036i | 0.9821 + 0.8987i |
| 23.5 | 1.1989 + 0.5582i | 1.4012 + 0.6249i | 1.0129 + 0.6976i | 0.9657 + 0.8860i |
| 24 | 1.1739 + 0.5257i | 1.3794 + 0.4917i | 1.0065 + 0.6128i | 1.0346 + 0.7930i |
| 24.5 | 1.1766 + 0.5132i | 1.3771 + 0.4884i | 1.0162 + 0.6131i | 1.0287 + 0.7970i |
| 25 | 1.1757 + 0.5047i | 1.3715 + 0.4846i | 1.0198 + 0.6112i | 1.0268 + 0.7962i |
| 25.5 | 1.1707 + 0.4940i | 1.3617 + 0.4870i | 1.0203 + 0.6063i | 1.0247 + 0.7923i |
| 26 | 1.1677 + 0.4847i | 1.3547 + 0.4862i | 1.0215 + 0.6013i | 1.0233 + 0.7878i |

| SNR/ w | w8 | w9 | w10 | w11 |
|---|---|---|---|---|
| 5 | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i |
| 6 | 1.2102 + 0.5067i | 1.2102 + 0.5067i | 1.2102 + 0.5067i | 1.2102 + 0.5067i |
| 6.5 | 1.2085 + 0.5028i | 1.2085 + 0.5028i | 1.2085 + 0.5028i | 1.2085 + 0.5028i |
| 7 | 1.0432 + 0.6178i | 0.9995 + 0.5797i | 1.1322 + 0.6970i | 1.0432 + 0.6178i |
| 7.5 | 0.4732 + 0.2588i | 0.4249 + 0.2411i | 1.0293 + 0.5865i | 1.1198 + 0.6595i |
| 8 | 0.3059 + 1.2626i | 0.2962 + 1.1484i | 0.2962 + 1.1484i | 0.2917 + 1.0949i |
| 8.5 | 0.2880 + 1.2587i | 0.2788 + 1.1468i | 0.2788 + 1.1468i | 0.2750 + 1.0951i |
| 9 | 1.5505 + 1.0696i | 0.9759 + 0.9428i | 0.3350 + 1.5307i | 0.7461 + 0.9896i |
| 9.5 | 1.5654 + 1.1053i | 0.9822 + 0.9424i | 0.3199 + 1.5216i | 0.7507 + 0.9792i |
| 10 | 1.4799 − 0.9890i | 1.2150 − 0.8088i | 0.8943 − 0.5436i | 0.8943 − 0.5436i |
| 10.5 | 1.4880 − 0.9918i | 1.2116 − 0.8109i | 0.8807 − 0.5437i | 0.8807 − 0.5437i |
| 11 | 0.2244 + 0.9784i | 0.2257 + 1.0057i | 0.2257 + 1.0057i | 0.2268 + 1.0350i |
| 11.5 | 0.2175 + 1.0013i | 0.2159 + 0.9723i | 0.2194 + 1.0327i | 0.2175 + 1.0013i |
| 12 | 0.2098 + 0.9768i | 0.2241 + 1.0454i | 0.1858 + 0.9878i | 0.1901 + 1.0659i |

-continued

| | | | | |
|---|---|---|---|---|
| 12.5 | 0.2230 + 0.9899i | 0.2479 + 1.0582i | 0.1802 + 1.0070i | 0.1891 + 1.0869i |
| 13 | 0.2408 + 0.9979i | 0.2750 + 1.0662i | 0.1741 + 1.0211i | 0.1849 + 1.1031i |
| 13.5 | 0.2553 + 0.9993i | 0.2988 + 1.0689i | 0.1656 + 1.0288i | 0.1779 + 1.1140i |
| 14 | 0.2659 + 0.9951i | 0.3199 + 1.0652i | 0.1586 + 1.0330i | 0.1732 + 1.1198i |
| 14.5 | 0.2918 + 0.9977i | 0.3457 + 1.0677i | 0.1513 + 1.0448i | 0.1608 + 1.1366i |
| 15 | 0.7901 + 1.2547i | 0.5814 + 1.0118i | 0.8074 + 1.0302i | 0.6237 + 1.0012i |
| 15.5 | 0.2231 + 1.7092i | 0.6616 + 0.9740i | 0.5030 + 1.4567i | 0.6230 + 1.1163i |
| 16 | 0.7189 + 1.2484i | 0.5519 + 1.0360i | 0.8125 + 0.9999i | 0.6001 + 0.9735i |
| 16.5 | 0.5954 + 1.6721i | 0.6356 + 0.9282i | 0.6612 + 1.3085i | 0.6870 + 0.9890i |
| 17 | 0.7916 + 1.5326i | 0.5781 + 0.9103i | 0.6737 + 1.2261i | 0.6488 + 0.9682i |
| 17.5 | 0.7546 + 1.5371i | 0.5791 + 0.9008i | 0.6529 + 1.2248i | 0.6563 + 0.9619i |
| 18 | 0.7460 + 1.5301i | 0.5607 + 0.8951i | 0.6305 + 1.2208i | 0.6414 + 0.9625i |
| 18.5 | 0.7388 + 1.5187i | 0.5534 + 0.8948i | 0.6245 + 1.2171i | 0.6469 + 0.9671i |
| 19 | 1.0419 + 1.2518i | 0.8657 + 1.0272i | 1.2891 + 1.0296i | 1.0567 + 0.8727i |
| 19.5 | 0.6600 + 1.2390i | 0.6575 + 0.9736i | 0.8905 + 1.1414i | 0.8571 + 0.9152i |
| 20 | 0.5458 + 1.2087i | 0.5280 + 0.9935i | 0.6621 + 1.4483i | 0.7224 + 0.9905i |
| 20.5 | 0.5495 + 1.2117i | 0.5295 + 0.9994i | 0.6564 + 1.4451i | 0.7273 + 1.0021i |
| 21 | 0.5460 + 1.2127i | 0.5252 + 1.0028i | 0.6465 + 1.4397i | 0.7242 + 1.0131i |
| 21.5 | 0.5373 + 1.2128i | 0.5165 + 1.0048i | 0.6343 + 1.4321i | 0.7152 + 1.0245i |
| 22 | 0.5187 + 1.2127i | 0.4960 + 1.0047i | 0.6102 + 1.4243i | 0.6926 + 1.0375i |
| 22.5 | 0.5099 + 1.2100i | 0.4914 + 1.0072i | 0.5898 + 1.4201i | 0.6910 + 1.0470i |
| 23 | 0.5427 + 1.2003i | 0.5813 + 1.0089i | 0.5291 + 1.4273i | 0.7630 + 1.0578i |
| 23.5 | 0.4976 + 1.2018i | 0.4821 + 1.0103i | 0.5648 + 1.4016i | 0.6826 + 1.0558i |
| 24 | 0.5286 + 1.2013i | 0.6120 + 1.0209i | 0.7270 + 1.2479i | 0.7961 + 1.0299i |
| 24.5 | 0.5158 + 1.1967i | 0.6077 + 1.0231i | 0.7117 + 1.2419i | 0.7917 + 1.0319i |
| 25 | 0.5056 + 1.1921i | 0.6041 + 1.0245i | 0.7005 + 1.2353i | 0.7883 + 1.0319i |
| 25.5 | 0.4973 + 1.1878i | 0.6009 + 1.0255i | 0.6921 + 1.2284i | 0.7855 + 1.0302i |
| 26 | 0.4905 + 1.1842i | 0.5982 + 1.0262i | 0.6854 + 1.2221i | 0.7829 + 1.0274i |

| SNR/w | w12 | w13 | w14 | w15 |
|---|---|---|---|---|
| 5 | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i |
| 6 | 0.4570 + 0.2642i | 0.4570 + 0.2642i | 0.4570 + 0.2642i | 0.4570 + 0.2642i |
| 6.5 | 1.2085 + 0.5028i | 1.2085 + 0.5028i | 1.2085 + 0.5028i | 1.2085 + 0.5028i |
| 7 | 1.1736 + 0.3521i | 1.1130 + 0.3476i | 1.2925 + 0.3605i | 1.1736 + 0.3521i |
| 7.5 | 0.5196 + 0.2753i | 0.4732 + 0.2588i | 0.9862 + 0.5525i | 1.0293 + 0.5865i |
| 8 | 0.6749 + 1.1091i | 0.6000 + 1.0201i | 0.6000 + 1.0201i | 0.5650 + 0.9791i |
| 8.5 | 0.6879 + 1.1023i | 0.6127 + 1.0130i | 0.6127 + 1.0130i | 0.5775 + 0.9727i |
| 9 | 1.1886 + 1.6606i | 0.8973 + 0.9758i | 0.4528 + 1.5320i | 0.7212 + 1.0496i |
| 9.5 | 1.1323 + 1.6866i | 0.8963 + 0.9732i | 0.4510 + 1.5195i | 0.7234 + 1.0425i |
| 10 | 1.2150 − 0.8088i | 1.1516 − 0.7656i | 0.8943 − 0.5436i | 0.9155 − 0.5630i |
| 10.5 | 1.2116 − 0.8109i | 1.1516 − 0.7744i | 0.8807 − 0.5437i | 0.9058 − 0.5674i |
| 11 | 0.5343 + 0.8558i | 0.5530 + 0.8761i | 0.5530 + 0.8761i | 0.5730 + 0.8975i |
| 11.5 | 0.5578 + 0.8655i | 0.5381 + 0.8437i | 0.5789 + 0.8889i | 0.5578 + 0.8655i |
| 12 | 0.5547 + 0.8312i | 0.5479 + 0.8651i | 0.6073 + 0.8182i | 0.5955 + 0.8420i |
| 12.5 | 0.5702 + 0.8176i | 0.5659 + 0.8534i | 0.6286 + 0.8049i | 0.6286 + 0.8049i |
| 13 | 0.5789 + 0.8090i | 0.5764 + 0.8491i | 0.6485 + 0.7846i | 0.6485 + 0.7846i |
| 13.5 | 0.5802 + 0.8040i | 0.5788 + 0.8534i | 0.6616 + 0.7612i | 0.6574 + 0.7871i |
| 14 | 0.5806 + 0.7935i | 0.5791 + 0.8600i | 0.6672 + 0.7597i | 0.6655 + 0.7988i |
| 14.5 | 0.5795 + 0.7993i | 0.5814 + 0.8684i | 0.6777 + 0.7528i | 0.6798 + 0.7908i |
| 15 | 0.6052 + 0.6617i | 0.5759 + 0.7150i | 0.7056 + 0.6773i | 0.6439 + 0.7138i |
| 15.5 | 0.6633 + 0.6064i | 0.6841 + 0.7162i | 0.7194 + 0.5707i | 0.7211 + 0.6351i |
| 16 | 0.6062 + 0.6558i | 0.5673 + 0.7044i | 0.7357 + 0.7025i | 0.6195 + 0.7364i |
| 16.5 | 0.6139 + 0.5878i | 0.6161 + 0.6843i | 0.7069 + 0.5730i | 0.6968 + 0.6615i |
| 17 | 0.6008 + 0.5904i | 0.5968 + 0.6937i | 0.7280 + 0.5839i | 0.7207 + 0.6853i |
| 17.5 | 0.5998 + 0.5837i | 0.5965 + 0.6939i | 0.7601 + 0.5787i | 0.7439 + 0.6985i |
| 18 | 0.5848 + 0.5763i | 0.5797 + 0.7001i | 0.7518 + 0.5786i | 0.7339 + 0.7041i |
| 18.5 | 0.5816 + 0.5744i | 0.5746 + 0.7125i | 0.7634 + 0.5763i | 0.7384 + 0.7224i |
| 19 | 0.6260 + 0.6701i | 0.7308 + 0.8371i | 0.7597 + 0.5841i | 0.8864 + 0.7205i |
| 19.5 | 0.6106 + 0.5775i | 0.6382 + 0.7572i | 0.7620 + 0.5398i | 0.8086 + 0.7221i |
| 20 | 0.5909 + 0.6140i | 0.5567 + 0.7928i | 0.7623 + 0.6325i | 0.7410 + 0.7994i |
| 20.5 | 0.5962 + 0.6217i | 0.5627 + 0.8030i | 0.7674 + 0.6377i | 0.7457 + 0.8086i |
| 21 | 0.6013 + 0.6294i | 0.5660 + 0.8106i | 0.7730 + 0.6458i | 0.7464 + 0.8190i |
| 21.5 | 0.6073 + 0.6384i | 0.5684 + 0.8175i | 0.7801 + 0.6568i | 0.7459 + 0.8311i |
| 22 | 0.6194 + 0.6507i | 0.5744 + 0.8249i | 0.7952 + 0.6762i | 0.7540 + 0.8498i |
| 22.5 | 0.6271 + 0.6619i | 0.5827 + 0.8346i | 0.8016 + 0.6867i | 0.7612 + 0.8629i |
| 23 | 0.6294 + 0.6610i | 0.6110 + 0.8310i | 0.7906 + 0.6835i | 0.7844 + 0.8645i |
| 23.5 | 0.6404 + 0.6801i | 0.5954 + 0.8500i | 0.8128 + 0.7021i | 0.7699 + 0.8797i |
| 24 | 0.6617 + 0.6693i | 0.6621 + 0.8401i | 0.8310 + 0.6617i | 0.8389 + 0.8357i |
| 24.5 | 0.6714 + 0.6767i | 0.6662 + 0.8463i | 0.8411 + 0.6694i | 0.8402 + 0.8434i |
| 25 | 0.6790 + 0.6831i | 0.6702 + 0.8514i | 0.8475 + 0.6749i | 0.8427 + 0.8479i |
| 25.5 | 0.6850 + 0.6886i | 0.6728 + 0.8554i | 0.8517 + 0.6775i | 0.8443 + 0.8495i |
| 26 | 0.6911 + 0.6930i | 0.6740 + 0.8584i | 0.8561 + 0.6778i | 0.8451 + 0.8492i |

-continued

| SNR/w | w16 | w17 | w18 | w19 |
|---|---|---|---|---|
| 5 | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i |
| 6 | 0.5067 + 1.2102i | 0.5067 + 1.2102i | 0.5067 + 1.2102i | 0.5067 + 1.2102i |
| 6.5 | 0.4588 + 0.2626i | 0.4588 + 0.2626i | 0.4588 + 0.2626i | 0.4588 + 0.2626i |
| 7 | 0.4468 + 0.2453i | 0.4880 + 0.2600i | 0.4066 + 0.2304i | 0.4468 + 0.2453i |
| 7.5 | 0.2411 + 0.4249i | 0.2236 + 0.3788i | 0.6595 + 1.1198i | 0.9931 + 1.5130i |
| 8 | 1.7813 + 0.3565i | 1.2626 + 0.3059i | 1.2626 + 0.3059i | 1.1484 + 0.2962i |
| 8.5 | 1.7914 + 0.3488i | 1.2587 + 0.2880i | 1.2587 + 0.2880i | 1.1468 + 0.2788i |
| 9 | 1.1513 + 0.2749i | 0.9582 + 0.3853i | 0.9227 + 0.2153i | 0.8467 + 0.3088i |
| 9.5 | 1.1819 + 0.2793i | 0.9635 + 0.4036i | 0.9143 + 0.2124i | 0.8374 + 0.3155i |
| 10 | 0.3146 − 0.1705i | 0.3146 − 0.1705i | 0.6218 − 0.2169i | 0.6218 − 0.2169i |
| 10.5 | 0.3056 − 0.1640i | 0.3056 − 0.1640i | 0.6406 − 0.2071i | 0.6406 − 0.2071i |
| 11 | 1.7631 + 0.3541i | 1.4266 + 0.2789i | 1.4266 + 0.2789i | 1.3649 + 0.2609i |
| 11.5 | 1.4190 + 0.3287i | 1.7739 + 0.3559i | 1.3649 + 0.2600i | 1.4293 + 0.2298i |
| 12 | 1.4070 + 0.1790i | 1.7227 + 0.2900i | 1.3246 + 0.2562i | 1.3636 + 0.3654i |
| 12.5 | 1.4067 + 0.1623i | 1.7386 + 0.2869i | 1.3213 + 0.2614i | 1.3555 + 0.3818i |
| 13 | 1.4076 + 0.1477i | 1.7480 + 0.2870i | 1.3169 + 0.2677i | 1.3479 + 0.3950i |
| 13.5 | 1.4079 + 0.1358i | 1.7492 + 0.2856i | 1.3108 + 0.2733i | 1.3393 + 0.4031i |
| 14 | 1.3832 + 0.1273i | 1.7176 + 0.2506i | 1.2890 + 0.2587i | 1.3115 + 0.3882i |
| 14.5 | 1.3830 + 0.1182i | 1.7146 + 0.2469i | 1.2824 + 0.2560i | 1.3020 + 0.3885i |
| 15 | 0.9728 + 0.1097i | 0.9728 + 0.1097i | 0.9203 + 0.1683i | 0.9203 + 0.1683i |
| 15.5 | 1.7803 + 0.2282i | 1.4175 + 0.1304i | 1.0142 + 0.1107i | 1.0875 + 0.1106i |
| 16 | 0.9770 + 0.1124i | 0.9770 + 0.1124i | 0.9145 + 0.1775i | 0.9145 + 0.1775i |
| 16.5 | 1.6501 + 0.1602i | 1.3265 + 0.1294i | 0.9609 + 0.1136i | 1.0472 + 0.1153i |
| 17 | 1.3221 + 0.1224i | 1.6557 + 0.1780i | 1.0381 + 0.1026i | 0.9427 + 0.1024i |
| 17.5 | 1.3275 + 0.1269i | 1.6476 + 0.1778i | 1.0687 + 0.1009i | 0.9443 + 0.0988i |
| 18 | 1.3214 + 0.1348i | 1.6192 + 0.1568i | 1.0864 + 0.1085i | 0.9690 + 0.1136i |
| 18.5 | 1.3267 + 0.1381i | 1.6139 + 0.1586i | 1.1074 + 0.1075i | 0.9719 + 0.1124i |
| 19 | 0.8818 + 0.0863i | 0.8598 + 0.0671i | 0.6659 + 0.0819i | 0.6786 + 0.1287i |
| 19.5 | 1.5486 + 0.1257i | 1.2666 + 0.1072i | 0.9028 + 0.1029i | 1.0498 + 0.1027i |
| 20 | 1.5281 + 0.1441i | 1.2566 + 0.1120i | 0.9743 + 0.0673i | 1.0261 + 0.1720i |
| 20.5 | 1.5048 + 0.1396i | 1.2429 + 0.1109i | 0.9704 + 0.0648i | 1.0197 + 0.1762i |
| 21 | 1.4884 + 0.1372i | 1.2362 + 0.1109i | 0.9743 + 0.0635i | 1.0194 + 0.1825i |
| 21.5 | 1.4742 + 0.1349i | 1.2309 + 0.1105i | 0.9796 + 0.0634i | 1.0198 + 0.1891i |
| 22 | 1.4534 + 0.1259i | 1.2190 + 0.1086i | 0.9789 + 0.0639i | 1.0144 + 0.1947i |
| 22.5 | 1.4370 + 0.1217i | 1.2104 + 0.1069i | 0.9794 + 0.0652i | 1.0117 + 0.2003i |
| 23 | 1.1919 + 0.0896i | 1.4034 + 0.1266i | 1.0017 + 0.0743i | 0.9909 + 0.2196i |
| 23.5 | 1.4070 + 0.1153i | 1.1945 + 0.1045i | 0.9784 + 0.0686i | 1.0093 + 0.2102i |
| 24 | 1.1265 + 0.0892i | 1.3157 + 0.0959i | 0.9524 + 0.0776i | 0.9403 + 0.2321i |
| 24.5 | 1.1278 + 0.0893i | 1.3152 + 0.0946i | 0.9556 + 0.0782i | 0.9422 + 0.2341i |
| 25 | 1.1316 + 0.0895i | 1.3173 + 0.0939i | 0.9608 + 0.0790i | 0.9429 + 0.2357i |
| 25.5 | 1.1477 + 0.0888i | 1.3330 + 0.0946i | 0.9772 + 0.0808i | 0.9387 + 0.2361i |
| 26 | 1.1595 + 0.0882i | 1.3430 + 0.0950i | 0.9894 + 0.0820i | 0.9367 + 0.2358i |

| SNR/w | w20 | w21 | w22 | w23 |
|---|---|---|---|---|
| 5 | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i |
| 6 | 0.2642 + 0.4570i | 0.2642 + 0.4570i | 0.2642 + 0.4570i | 0.2642 + 0.4570i |
| 6.5 | 0.4588 + 0.2626i | 0.4588 + 0.2626i | 0.4588 + 0.2626i | 0.4588 + 0.2626i |
| 7 | 0.4468 + 0.2453i | 0.4880 + 0.2600i | 0.4066 + 0.2304i | 0.4468 + 0.2453i |
| 7.5 | 0.2588 + 0.4732i | 0.2411 + 0.4249i | 0.5864 + 1.0293i | 0.6595 + 1.1198i |
| 8 | 1.5146 + 1.0099i | 1.1091 + 0.6749i | 1.1091 + 0.6749i | 1.0201 + 0.6000i |
| 8.5 | 1.5168 + 1.0152i | 1.1023 + 0.6879i | 1.1023 + 0.6879i | 1.0130 + 0.6127i |
| 9 | 1.1613 + 0.2336i | 0.9349 + 0.3518i | 0.9227 + 0.2153i | 0.8467 + 0.3088i |
| 9.5 | 1.2076 + 0.2313i | 0.9381 + 0.3697i | 0.9143 + 0.2124i | 0.8374 + 0.3155i |
| 10 | 0.3146 − 0.1705i | 0.3146 − 0.1705i | 0.6218 − 0.2169i | 0.6218 − 0.2169i |
| 10.5 | 0.3056 − 0.1640i | 0.3056 − 0.1640i | 0.6406 − 0.2071i | 0.6406 − 0.2071i |
| 11 | 1.4961 + 0.9954i | 1.2072 + 0.8100i | 1.2072 + 0.8100i | 1.1510 + 0.7784i |
| 11.5 | 1.2376 + 0.7681i | 1.5057 + 1.0025i | 1.1507 + 0.7776i | 1.1738 + 0.8449i |
| 12 | 1.3708 + 1.2834i | 1.6701 + 0.8403i | 1.1614 + 0.7909i | 1.2241 + 0.7367i |
| 12.5 | 1.3728 + 1.2802i | 1.6730 + 0.8349i | 1.1629 + 0.7604i | 1.2237 + 0.7169i |
| 13 | 1.3698 + 1.2765i | 1.6671 + 0.8318i | 1.1603 + 0.7369i | 1.2208 + 0.7017i |
| 13.5 | 1.3733 + 1.2596i | 1.6601 + 0.8198i | 1.1559 + 0.7249i | 1.2163 + 0.6897i |
| 14 | 1.4490 + 1.1367i | 1.6791 + 0.7233i | 1.1637 + 0.7318i | 1.2117 + 0.6596i |
| 14.5 | 1.4514 + 1.1095i | 1.6674 + 0.7048i | 1.1614 + 0.7220i | 1.2096 + 0.6442i |
| 15 | 1.3276 + 0.1371i | 1.2605 + 0.2607i | 0.9657 + 0.4185i | 1.0313 + 0.4086i |
| 15.5 | 1.5669 + 0.6281i | 1.3668 + 0.3723i | 1.0160 + 0.3423i | 1.0838 + 0.3367i |
| 16 | 1.3198 + 0.1175i | 1.2383 + 0.2709i | 0.9483 + 0.4442i | 1.0242 + 0.4164i |
| 16.5 | 1.6046 + 0.4875i | 1.2991 + 0.3994i | 0.9506 + 0.3440i | 1.0402 + 0.3427i |
| 17 | 1.2802 + 0.3500i | 1.5980 + 0.5501i | 0.9903 + 0.3365i | 0.9340 + 0.2929i |
| 17.5 | 1.2837 + 0.3590i | 1.5920 + 0.5468i | 1.0024 + 0.3379i | 0.9388 + 0.2809i |
| 18 | 1.2847 + 0.3887i | 1.5877 + 0.4787i | 1.0252 + 0.3747i | 0.9593 + 0.3085i |
| 18.5 | 1.2798 + 0.3928i | 1.5690 + 0.4783i | 1.0323 + 0.3791i | 0.9610 + 0.2983i |
| 19 | 0.9883 + 0.2131i | 1.1539 + 0.0898i | 0.7883 + 0.3358i | 0.7109 + 0.2753i |

-continued

| | | | | |
|---|---|---|---|---|
| 19.5 | 1.4788 + 0.3590i | 1.2369 + 0.3451i | 0.9051 + 0.3205i | 1.0533 + 0.3050i |
| 20 | 1.4715 + 0.4355i | 1.2435 + 0.3351i | 0.9816 + 0.4825i | 1.0252 + 0.3371i |
| 20.5 | 1.4594 + 0.4244i | 1.2338 + 0.3332i | 0.9790 + 0.4840i | 1.0192 + 0.3364i |
| 21 | 1.4526 + 0.4196i | 1.2302 + 0.3337i | 0.9804 + 0.4906i | 1.0189 + 0.3404i |
| 21.5 | 1.4461 + 0.4142i | 1.2279 + 0.3323i | 0.9827 + 0.4998i | 1.0202 + 0.3467i |
| 22 | 1.4356 + 0.3854i | 1.2194 + 0.3249i | 0.9844 + 0.5115i | 1.0179 + 0.3535i |
| 22.5 | 1.4268 + 0.3730i | 1.2148 + 0.3198i | 0.9818 + 0.5182i | 1.0172 + 0.3596i |
| 23 | 1.2082 + 0.5145i | 1.2105 + 0.3132i | 1.0055 + 0.5362i | 1.0096 + 0.3698i |
| 23.5 | 1.4123 + 0.3539i | 1.2076 + 0.3137i | 0.9768 + 0.5294i | 1.0171 + 0.3701i |
| 24 | 1.4948 + 0.2501i | 1.2660 + 0.2959i | 0.9649 + 0.4426i | 1.0812 + 0.3131i |
| 24.5 | 1.4851 + 0.2508i | 1.2669 + 0.2917i | 0.9719 + 0.4412i | 1.0855 + 0.3077i |
| 25 | 1.4766 + 0.2540i | 1.2666 + 0.2886i | 0.9763 + 0.4381i | 1.0887 + 0.3028i |
| 25.5 | 1.4686 + 0.2702i | 1.2647 + 0.2863i | 0.9779 + 0.4321i | 1.0881 + 0.2935i |
| 26 | 1.4613 + 0.2782i | 1.2637 + 0.2839i | 0.9800 + 0.4265i | 1.0889 + 0.2858i |

| SNR/ w | w24 | w25 | w26 | w27 |
|---|---|---|---|---|
| 5 | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i |
| 6 | 0.5067 + 1.2102i | 0.5067 + 1.2102i | 0.5067 + 1.2102i | 0.5067 + 1.2102i |
| 6.5 | 0.4588 + 0.2626i | 0.4588 + 0.2626i | 0.4588 + 0.2626i | 0.4588 + 0.2626i |
| 7 | 0.4880 + 0.2600i | 0.5211 + 0.2931i | 0.4468 + 0.2453i | 0.4880 + 0.2600i |
| 7.5 | 0.4249 + 0.2411i | 0.3788 + 0.2236i | 1.1198 + 0.6595i | 1.5130 + 0.9931i |
| 8 | 1.2626 + 0.3059i | 1.1484 + 0.2962i | 1.1484 + 0.2962i | 1.0949 + 0.2917i |
| 8.5 | 1.2587 + 0.2880i | 1.1468 + 0.2788i | 1.1468 + 0.2788i | 1.0951 + 0.2750i |
| 9 | 0.9919 + 0.2437i | 0.9006 + 0.3666i | 0.8684 + 0.2080i | 0.8187 + 0.2931i |
| 9.5 | 1.0016 + 0.2399i | 0.8985 + 0.3753i | 0.8605 + 0.2013i | 0.8101 + 0.2923i |
| 10 | 0.3146 − 0.1705i | 0.3146 − 0.1705i | 0.5800 − 0.3158i | 0.5800 − 0.3158i |
| 10.5 | 0.3056 − 0.1640i | 0.3056 − 0.1640i | 0.5895 − 0.3251i | 0.5895 − 0.3251i |
| 11 | 0.9785 + 0.2245i | 1.0059 + 0.2257i | 1.0059 + 0.2257i | 1.0352 + 0.2267i |
| 11.5 | 1.0013 + 0.2166i | 0.9721 + 0.2149i | 1.0331 + 0.2184i | 1.0013 + 0.2166i |
| 12 | 0.9769 + 0.1863i | 0.9452 + 0.2057i | 1.0100 + 0.2182i | 0.9795 + 0.2417i |
| 12.5 | 0.9683 + 0.1724i | 0.9333 + 0.1897i | 1.0041 + 0.2062i | 0.9683 + 0.2269i |
| 13 | 0.9630 + 0.1618i | 0.9257 + 0.1770i | 1.0010 + 0.1965i | 0.9611 + 0.2140i |
| 13.5 | 0.9601 + 0.1547i | 0.9220 + 0.1683i | 1.0004 + 0.1894i | 0.9581 + 0.2045i |
| 14 | 0.9469 + 0.1512i | 0.9124 + 0.1673i | 0.9890 + 0.1827i | 0.9504 + 0.2018i |
| 14.5 | 0.9396 + 0.1469i | 0.9065 + 0.1618i | 0.9886 + 0.1761i | 0.9486 + 0.1944i |
| 15 | 0.6366 + 0.1410i | 0.6366 + 0.1410i | 0.6534 + 0.1501i | 0.6366 + 0.1410i |
| 15.5 | 0.6290 + 0.1097i | 0.6290 + 0.1097i | 0.7380 + 0.1117i | 0.7116 + 0.1105i |
| 16 | 0.6325 + 0.1361i | 0.6325 + 0.1361i | 0.6562 + 0.1495i | 0.6562 + 0.1495i |
| 16.5 | 0.5984 + 0.1101i | 0.5984 + 0.1101i | 0.7207 + 0.1103i | 0.6832 + 0.1122i |
| 17 | 0.5882 + 0.1166i | 0.5882 + 0.1166i | 0.6682 + 0.1069i | 0.7042 + 0.1111i |
| 17.5 | 0.5867 + 0.1202i | 0.5867 + 0.1202i | 0.6742 + 0.1025i | 0.7217 + 0.1106i |
| 18 | 0.5972 + 0.1204i | 0.5972 + 0.1204i | 0.7244 + 0.0980i | 0.7655 + 0.1162i |
| 18.5 | 0.5961 + 0.1025i | 0.5964 + 0.1417i | 0.7314 + 0.0890i | 0.7775 + 0.1184i |
| 19 | 0.4061 + 0.0799i | 0.4265 + 0.2175i | 0.4641 + 0.0772i | 0.4884 + 0.1954i |
| 19.5 | 0.5082 + 0.0656i | 0.5265 + 0.1285i | 0.7398 + 0.0890i | 0.6724 + 0.1233i |
| 20 | 0.6423 + 0.0698i | 0.6358 + 0.1904i | 0.8003 + 0.0754i | 0.8009 + 0.2018i |
| 20.5 | 0.6384 + 0.0678i | 0.6332 + 0.1948i | 0.7968 + 0.0730i | 0.8000 + 0.2036i |
| 21 | 0.6429 + 0.0675i | 0.6384 + 0.1981i | 0.8011 + 0.0721i | 0.8064 + 0.2059i |
| 21.5 | 0.6501 + 0.0680i | 0.6464 + 0.2016i | 0.8075 + 0.0719i | 0.8146 + 0.2088i |
| 22 | 0.6546 + 0.0693i | 0.6531 + 0.2062i | 0.8096 + 0.0722i | 0.8191 + 0.2122i |
| 22.5 | 0.6581 + 0.0702i | 0.6580 + 0.2095i | 0.8121 + 0.0727i | 0.8228 + 0.2154i |
| 23 | 0.6613 + 0.0692i | 0.6601 + 0.2094i | 0.8231 + 0.0709i | 0.8202 + 0.2164i |
| 23.5 | 0.6618 + 0.0721i | 0.6653 + 0.2161i | 0.8148 + 0.0743i | 0.8285 + 0.2219i |
| 24 | 0.6277 + 0.0697i | 0.6260 + 0.2109i | 0.7852 + 0.0706i | 0.7804 + 0.2127i |
| 24.5 | 0.6341 + 0.0711i | 0.6317 + 0.2150i | 0.7905 + 0.0716i | 0.7839 + 0.2154i |
| 25 | 0.6408 + 0.0723i | 0.6355 + 0.2186i | 0.7969 + 0.0724i | 0.7860 + 0.2176i |
| 25.5 | 0.6523 + 0.0731i | 0.6352 + 0.2218i | 0.8115 + 0.0731i | 0.7837 + 0.2189i |
| 26 | 0.6622 + 0.0739i | 0.6337 + 0.2246i | 0.8231 + 0.0739i | 0.7818 + 0.2196i |

| SNR/ w | w28 | w29 | w30 | w31 |
|---|---|---|---|---|
| 5 | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i |
| 6 | 0.2642 + 0.4570i | 0.2642 + 0.4570i | 0.2642 + 0.4570i | 0.2642 + 0.4570i |
| 6.5 | 0.4588 + 0.2626i | 0.4588 + 0.2626i | 0.4588 + 0.2626i | 0.4588 + 0.2626i |
| 7 | 0.4880 + 0.2600i | 0.5344 + 0.2543i | 0.4468 + 0.2453i | 0.4880 + 0.2600i |
| 7.5 | 0.4732 + 0.2588i | 0.4249 + 0.2411i | 1.0293 + 0.5865i | 1.1198 + 0.6595i |
| 8 | 1.1091 + 0.6749i | 1.0201 + 0.6000i | 1.0201 + 0.6000i | 0.9791 + 0.5650i |
| 8.5 | 1.1023 + 0.6879i | 1.0130 + 0.6127i | 1.0130 + 0.6127i | 0.9727 + 0.5775i |
| 9 | 0.9919 + 0.2437i | 0.8825 + 0.3368i | 0.8684 + 0.2080i | 0.8187 + 0.2931i |
| 9.5 | 1.0016 + 0.2399i | 0.8803 + 0.3458i | 0.8605 + 0.2013i | 0.8101 + 0.2923i |
| 10 | 0.3146 − 0.1705i | 0.3146 − 0.1705i | 0.5800 − 0.3158i | 0.5800 − 0.3158i |
| 10.5 | 0.3056 − 0.1640i | 0.3056 − 0.1640i | 0.5895 − 0.3251i | 0.5895 − 0.3251i |
| 11 | 0.8559 + 0.5343i | 0.8762 + 0.5531i | 0.8762 + 0.5531i | 0.8976 + 0.5730i |
| 11.5 | 0.8669 + 0.5549i | 0.8450 + 0.5352i | 0.8906 + 0.5760i | 0.8669 + 0.5549i |

-continued

| | | | | |
|---|---|---|---|---|
| 12 | 0.8236 + 0.4847i | 0.8236 + 0.4847i | 0.8798 + 0.5374i | 0.8798 + 0.5374i |
| 12.5 | 0.8172 + 0.4564i | 0.8172 + 0.4564i | 0.8727 + 0.5122i | 0.8727 + 0.5122i |
| 13 | 0.8114 + 0.4387i | 0.8114 + 0.4387i | 0.8656 + 0.4956i | 0.8656 + 0.4956i |
| 13.5 | 0.8069 + 0.4342i | 0.8069 + 0.4342i | 0.8601 + 0.4908i | 0.8601 + 0.4908i |
| 14 | 0.8010 + 0.4478i | 0.8010 + 0.4478i | 0.8569 + 0.5016i | 0.8569 + 0.5016i |
| 14.5 | 0.8013 + 0.4424i | 0.8013 + 0.4424i | 0.8556 + 0.4991i | 0.8556 + 0.4991i |
| 15 | 0.6009 + 0.4054i | 0.6009 + 0.4054i | 0.6631 + 0.4203i | 0.6466 + 0.4063i |
| 15.5 | 0.6382 + 0.3325i | 0.6300 + 0.3171i | 0.7230 + 0.3385i | 0.7071 + 0.3272i |
| 16 | 0.6041 + 0.4194i | 0.6041 + 0.4194i | 0.6844 + 0.4315i | 0.6536 + 0.4074i |
| 16.5 | 0.6014 + 0.3528i | 0.5903 + 0.3283i | 0.7010 + 0.3475i | 0.6697 + 0.3280i |
| 17 | 0.5954 + 0.3748i | 0.5987 + 0.3416i | 0.7073 + 0.3701i | 0.7192 + 0.3275i |
| 17.5 | 0.5959 + 0.3826i | 0.5970 + 0.3410i | 0.7339 + 0.3759i | 0.7430 + 0.3188i |
| 18 | 0.5947 + 0.3818i | 0.5970 + 0.3304i | 0.7535 + 0.3905i | 0.7704 + 0.3249i |
| 18.5 | 0.5953 + 0.3915i | 0.5975 + 0.3225i | 0.7649 + 0.4029i | 0.7817 + 0.3156i |
| 19 | 0.5409 + 0.5182i | 0.4759 + 0.3755i | 0.6422 + 0.4556i | 0.5543 + 0.3409i |
| 19.5 | 0.5700 + 0.4187i | 0.5429 + 0.2967i | 0.7319 + 0.3429i | 0.6646 + 0.2744i |
| 20 | 0.6132 + 0.4606i | 0.6264 + 0.3286i | 0.7906 + 0.4757i | 0.8007 + 0.3342i |
| 20.5 | 0.6160 + 0.4668i | 0.6266 + 0.3299i | 0.7913 + 0.4796i | 0.8013 + 0.3338i |
| 21 | 0.6220 + 0.4731i | 0.6327 + 0.3327i | 0.7953 + 0.4864i | 0.8070 + 0.3371i |
| 21.5 | 0.6296 + 0.4809i | 0.6412 + 0.3374i | 0.8008 + 0.4955i | 0.8141 + 0.3431i |
| 22 | 0.6400 + 0.4925i | 0.6498 + 0.3451i | 0.8073 + 0.5082i | 0.8199 + 0.3516i |
| 22.5 | 0.6452 + 0.5010i | 0.6552 + 0.3508i | 0.8087 + 0.5167i | 0.8230 + 0.3582i |
| 23 | 0.6479 + 0.5023i | 0.6570 + 0.3532i | 0.8160 + 0.5191i | 0.8231 + 0.3662i |
| 23.5 | 0.6524 + 0.5156i | 0.6640 + 0.3620i | 0.8099 + 0.5313i | 0.8291 + 0.3705i |
| 24 | 0.6444 + 0.5097i | 0.6285 + 0.3572i | 0.8056 + 0.5017i | 0.7792 + 0.3548i |
| 24.5 | 0.6537 + 0.5167i | 0.6360 + 0.3632i | 0.8156 + 0.5101i | 0.7875 + 0.3608i |
| 25 | 0.6614 + 0.5229i | 0.6414 + 0.3685i | 0.8234 + 0.5160i | 0.7936 + 0.3653i |
| 25.5 | 0.6674 + 0.5284i | 0.6441 + 0.3734i | 0.8292 + 0.5189i | 0.7961 + 0.3682i |
| 26 | 0.6739 + 0.5331i | 0.6474 + 0.3777i | 0.8353 + 0.5198i | 0.7994 + 0.3695i |

| SNR/ w | w32 | w33 | w34 | w35 |
|---|---|---|---|---|
| 5 | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i |
| 6 | 1.2102 + 0.5067i | 1.2102 + 0.5067i | 1.2102 + 0.5067i | 1.2102 + 0.5067i |
| 6.5 | 0.5028 + 1.2085i | 0.5028 + 1.2085i | 0.5028 + 1.2085i | 0.5028 + 1.2085i |
| 7 | 0.5818 + 1.1302i | 0.5321 + 1.0488i | 0.7162 + 1.3338i | 0.5818 + 1.1302i |
| 7.5 | 0.2588 + 0.4732i | 0.2411 + 0.4249i | 0.3175 + 1.1489i | 0.3279 + 1.2665i |
| 8 | 0.2167 + 0.3748i | 0.2357 + 0.4259i | 0.2357 + 0.4259i | 0.2549 + 0.4795i |
| 8.5 | 0.2088 + 0.3720i | 0.2294 + 0.4290i | 0.2294 + 0.4290i | 0.2299 + 0.4909i |
| 9 | 0.1853 + 0.6815i | 0.2599 + 0.6790i | 0.1918 + 0.8048i | 0.2852 + 0.7636i |
| 9.5 | 0.1820 + 0.6851i | 0.2619 + 0.6777i | 0.1923 + 0.8151i | 0.2969 + 0.7633i |
| 10 | 0.3437 − 1.7476i | 0.2830 − 1.4280i | 0.2440 − 1.0127i | 0.2440 − 1.0127i |
| 10.5 | 0.3495 − 1.7549i | 0.2804 − 1.4293i | 0.2346 − 1.0027i | 0.2346 − 1.0027i |
| 11 | 0.1598 + 0.3010i | 0.1598 + 0.3010i | 0.1598 + 0.3010i | 0.1598 + 0.3010i |
| 11.5 | 0.1564 + 0.3007i | 0.1564 + 0.3007i | 0.1564 + 0.3007i | 0.1564 + 0.3007i |
| 12 | 0.1373 + 0.3307i | 0.1373 + 0.3307i | 0.1373 + 0.3307i | 0.1373 + 0.3307i |
| 12.5 | 0.1302 + 0.3786i | 0.1302 + 0.3786i | 0.1302 + 0.3786i | 0.1302 + 0.3786i |
| 13 | 0.1252 + 0.4124i | 0.1252 + 0.4124i | 0.1252 + 0.4124i | 0.1252 + 0.4124i |
| 13.5 | 0.1217 + 0.4285i | 0.1217 + 0.4285i | 0.1217 + 0.4285i | 0.1217 + 0.4285i |
| 14 | 0.1184 + 0.4351i | 0.1184 + 0.4351i | 0.1184 + 0.4351i | 0.1184 + 0.4351i |
| 14.5 | 0.1157 + 0.4495i | 0.1157 + 0.4495i | 0.1157 + 0.4495i | 0.1157 + 0.4495i |
| 15 | 0.2366 + 1.7925i | 0.1132 + 1.0217i | 0.1343 + 1.4263i | 0.1131 + 1.0934i |
| 15.5 | 0.1106 + 0.9815i | 0.1744 + 0.9230i | 0.1106 + 0.9815i | 0.1744 + 0.9230i |
| 16 | 0.1430 + 1.4001i | 0.1156 + 1.1081i | 0.1884 + 1.7333i | 0.1078 + 1.0066i |
| 16.5 | 0.1053 + 1.2977i | 0.1293 + 0.9737i | 0.1785 + 1.2326i | 0.1473 + 0.9932i |
| 17 | 0.1490 + 1.6173i | 0.1183 + 0.9591i | 0.1303 + 1.3054i | 0.1236 + 1.0413i |
| 17.5 | 0.1411 + 1.5896i | 0.1170 + 0.9512i | 0.1278 + 1.2852i | 0.1257 + 1.0327i |
| 18 | 0.1396 + 1.5775i | 0.1131 + 0.9418i | 0.1242 + 1.2789i | 0.1226 + 1.0347i |
| 18.5 | 0.1401 + 1.5712i | 0.1104 + 0.9411i | 0.1233 + 1.2808i | 0.1220 + 1.0474i |
| 19 | 0.1202 + 1.4352i | 0.0996 + 1.2052i | 0.2171 + 1.6874i | 0.2773 + 1.1812i |
| 19.5 | 0.1542 + 1.5593i | 0.0710 + 0.9899i | 0.1176 + 1.2799i | 0.1750 + 1.0404i |
| 20 | 0.1167 + 1.2700i | 0.0962 + 1.0708i | 0.1297 + 1.5321i | 0.0883 + 0.8994i |
| 20.5 | 0.1161 + 1.2756i | 0.0974 + 1.0790i | 0.1295 + 1.5298i | 0.0884 + 0.9064i |
| 21 | 0.1140 + 1.2762i | 0.0978 + 1.0812i | 0.1280 + 1.5231i | 0.0867 + 0.9060i |
| 21.5 | 0.1108 + 1.2731i | 0.0977 + 1.0794i | 0.1256 + 1.5126i | 0.0853 + 0.9029i |
| 22 | 0.1045 + 1.2645i | 0.0959 + 1.0725i | 0.1201 + 1.4962i | 0.0871 + 0.8987i |
| 22.5 | 0.1015 + 1.2588i | 0.0952 + 1.0704i | 0.1161 + 1.4831i | 0.0884 + 0.8992i |
| 23 | 0.1141 + 1.4950i | 0.0679 + 0.9023i | 0.1059 + 1.2572i | 0.1019 + 1.0664i |
| 23.5 | 0.0985 + 1.2520i | 0.0938 + 1.0710i | 0.1114 + 1.4628i | 0.0905 + 0.9054i |
| 24 | 0.0901 + 1.1911i | 0.0801 + 1.0038i | 0.1106 + 1.4060i | 0.2328 + 0.9654i |
| 24.5 | 0.0894 + 1.1877i | 0.0808 + 1.0036i | 0.1074 + 1.3967i | 0.2340 + 0.9604i |
| 25 | 0.0890 + 1.1877i | 0.0816 + 1.0065i | 0.1053 + 1.3909i | 0.2349 + 0.9570i |
| 25.5 | 0.0889 + 1.1889i | 0.0823 + 1.0105i | 0.1037 + 1.3867i | 0.2355 + 0.9547i |
| 26 | 0.0888 + 1.1903i | 0.0829 + 1.0145i | 0.1023 + 1.3833i | 0.2357 + 0.9536i |

-continued

| SNR/ w | w36 | w37 | w38 | w39 |
|---|---|---|---|---|
| 5 | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i |
| 6 | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i |
| 7 | 0.3631 + 1.2644i | 0.3443 + 1.1417i | 0.4291 + 1.7565i | 0.3631 + 1.2644i |
| 7.5 | 0.2753 + 0.5196i | 0.2588 + 0.4732i | 0.3124 + 1.0924i | 0.3175 + 1.1489i |
| 8 | 0.2167 + 0.3748i | 0.2357 + 0.4259i | 0.2357 + 0.4259i | 0.2549 + 0.4795i |
| 8.5 | 0.2088 + 0.3720i | 0.2294 + 0.4290i | 0.2294 + 0.4290i | 0.2708 + 0.4861i |
| 9 | 0.1853 + 0.6815i | 0.2599 + 0.6790i | 0.1918 + 0.8048i | 0.2852 + 0.7636i |
| 9.5 | 0.1820 + 0.6851i | 0.2619 + 0.6777i | 0.1923 + 0.8151i | 0.2969 + 0.7633i |
| 10 | 0.2830 − 1.4280i | 0.2686 − 1.3530i | 0.2440 − 1.0127i | 0.2449 − 1.0415i |
| 10.5 | 0.2804 − 1.4293i | 0.2635 − 1.3614i | 0.2346 − 1.0027i | 0.2356 − 1.0372i |
| 11 | 0.1598 + 0.3010i | 0.1598 + 0.3010i | 0.1598 + 0.3010i | 0.1598 + 0.3010i |
| 11.5 | 0.1564 + 0.3007i | 0.1564 + 0.3007i | 0.1564 + 0.3007i | 0.1564 + 0.3007i |
| 12 | 0.1645 + 0.3236i | 0.1645 + 0.3236i | 0.1645 + 0.3236i | 0.1645 + 0.3236i |
| 12.5 | 0.1661 + 0.3606i | 0.1661 + 0.3606i | 0.1661 + 0.3606i | 0.1661 + 0.3606i |
| 13 | 0.1684 + 0.3861i | 0.1684 + 0.3861i | 0.1684 + 0.3861i | 0.1684 + 0.3861i |
| 13.5 | 0.1708 + 0.3974i | 0.1708 + 0.3974i | 0.1708 + 0.3974i | 0.1708 + 0.3974i |
| 14 | 0.1716 + 0.4008i | 0.1716 + 0.4008i | 0.1716 + 0.4008i | 0.1716 + 0.4008i |
| 14.5 | 0.1754 + 0.4094i | 0.1754 + 0.4094i | 0.1754 + 0.4094i | 0.1754 + 0.4094i |
| 15 | 0.1115 + 0.6331i | 0.1142 + 0.7348i | 0.1115 + 0.6331i | 0.1120 + 0.7126i |
| 15.5 | 0.1357 + 0.6326i | 0.1479 + 0.6548i | 0.1357 + 0.6326i | 0.1479 + 0.6548i |
| 16 | 0.1070 + 0.6209i | 0.1080 + 0.7000i | 0.1070 + 0.6209i | 0.1060 + 0.7438i |
| 16.5 | 0.1172 + 0.6177i | 0.1219 + 0.7208i | 0.1172 + 0.6177i | 0.1219 + 0.7208i |
| 17 | 0.1097 + 0.6047i | 0.1122 + 0.7387i | 0.1097 + 0.6047i | 0.1188 + 0.7034i |
| 17.5 | 0.1073 + 0.5955i | 0.1100 + 0.7473i | 0.1073 + 0.5955i | 0.1221 + 0.7136i |
| 18 | 0.1041 + 0.5771i | 0.1063 + 0.7507i | 0.1041 + 0.5771i | 0.1223 + 0.7129i |
| 18.5 | 0.0863 + 0.5683i | 0.1030 + 0.7613i | 0.1177 + 0.5704i | 0.1259 + 0.7175i |
| 19 | 0.0839 + 0.8147i | 0.0834 + 0.9964i | 0.1971 + 0.8041i | 0.2436 + 0.9839i |
| 19.5 | 0.0755 + 0.6559i | 0.0799 + 0.8133i | 0.1865 + 0.6474i | 0.2027 + 0.8117i |
| 20 | 0.0749 + 0.5327i | 0.0612 + 0.6589i | 0.1829 + 0.5465i | 0.1233 + 0.7216i |
| 20.5 | 0.0720 + 0.5415i | 0.0591 + 0.6728i | 0.1883 + 0.5570i | 0.1297 + 0.7318i |
| 21 | 0.0704 + 0.5429i | 0.0574 + 0.6772i | 0.1921 + 0.5608i | 0.1353 + 0.7334i |
| 21.5 | 0.0694 + 0.5429i | 0.0559 + 0.6795i | 0.1945 + 0.5628i | 0.1410 + 0.7326i |
| 22 | 0.0687 + 0.5451i | 0.0549 + 0.6836i | 0.1961 + 0.5662i | 0.1487 + 0.7336i |
| 22.5 | 0.0685 + 0.5510i | 0.0545 + 0.6912i | 0.1980 + 0.5732i | 0.1557 + 0.7375i |
| 23 | 0.0653 + 0.5841i | 0.0662 + 0.7419i | 0.2015 + 0.5913i | 0.1899 + 0.7378i |
| 23.5 | 0.0693 + 0.5689i | 0.0563 + 0.7102i | 0.2034 + 0.5915i | 0.1695 + 0.7506i |
| 24 | 0.0680 + 0.6561i | 0.0697 + 0.8236i | 0.2070 + 0.6480i | 0.2108 + 0.8051i |
| 24.5 | 0.0695 + 0.6593i | 0.0707 + 0.8259i | 0.2118 + 0.6478i | 0.2131 + 0.8017i |
| 25 | 0.0709 + 0.6644i | 0.0718 + 0.8309i | 0.2160 + 0.6470i | 0.2150 + 0.7989i |
| 25.5 | 0.0721 + 0.6705i | 0.0727 + 0.8369i | 0.2196 + 0.6455i | 0.2165 + 0.7966i |
| 26 | 0.0732 + 0.6770i | 0.0737 + 0.8430i | 0.2228 + 0.6437i | 0.2175 + 0.7949i |

| SNR/ w | w40 | w41 | w42 | w43 |
|---|---|---|---|---|
| 5 | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i |
| 6 | 1.2102 + 0.5067i | 1.2102 + 0.5067i | 1.2102 + 0.5067i | 1.2102 + 0.5067i |
| 6.5 | 0.5028 + 1.2085i | 0.5028 + 1.2085i | 0.5028 + 1.2085i | 0.5028 + 1.2085i |
| 7 | 0.5321 + 1.0488i | 0.5054 + 1.0028i | 0.5818 + 1.1302i | 0.5321 + 1.0488i |
| 7.5 | 0.4732 + 0.2588i | 0.4249 + 0.2411i | 1.1489 + 0.3175i | 1.2665 + 0.3279i |
| 8 | 0.2357 + 0.4259i | 0.2549 + 0.4795i | 0.2549 + 0.4795i | 0.2486 + 0.5341i |
| 8.5 | 0.2294 + 0.4290i | 0.2299 + 0.4909i | 0.2299 + 0.4909i | 0.2411 + 0.5508i |
| 9 | 0.1853 + 0.6815i | 0.2599 + 0.6790i | 0.1918 + 0.8048i | 0.2852 + 0.7636i |
| 9.5 | 0.1820 + 0.6851i | 0.2619 + 0.6777i | 0.1923 + 0.8151i | 0.2969 + 0.7633i |
| 10 | 0.9890 − 1.4799i | 0.8088 − 1.2150i | 0.5436 − 0.8943i | 0.5436 − 0.8943i |
| 10.5 | 0.9918 − 1.4880i | 0.8109 − 1.2116i | 0.5437 − 0.8807i | 0.5437 − 0.8807i |
| 11 | 0.1969 + 0.6553i | 0.1969 + 0.6553i | 0.1969 + 0.6553i | 0.1969 + 0.6553i |
| 11.5 | 0.1877 + 0.6663i | 0.1877 + 0.6663i | 0.1877 + 0.6663i | 0.1877 + 0.6663i |
| 12 | 0.1786 + 0.6836i | 0.1786 + 0.6836i | 0.1786 + 0.6836i | 0.1786 + 0.6836i |
| 12.5 | 0.1783 + 0.7098i | 0.1783 + 0.7098i | 0.1783 + 0.7098i | 0.1783 + 0.7098i |
| 13 | 0.1775 + 0.7313i | 0.1775 + 0.7313i | 0.1775 + 0.7313i | 0.1775 + 0.7313i |
| 13.5 | 0.1744 + 0.7444i | 0.1744 + 0.7444i | 0.1744 + 0.7444i | 0.1744 + 0.7444i |
| 14 | 0.1772 + 0.7474i | 0.1772 + 0.7474i | 0.1516 + 0.7621i | 0.1772 + 0.7474i |
| 14.5 | 0.1898 + 0.7577i | 0.1898 + 0.7577i | 0.1474 + 0.7693i | 0.1474 + 0.7693i |
| 15 | 0.6334 + 1.5624i | 0.3445 + 1.0222i | 0.3767 + 1.3678i | 0.3375 + 1.0864i |
| 15.5 | 0.1266 + 1.3390i | 0.4298 + 0.9537i | 0.2698 + 1.2595i | 0.4136 + 1.0326i |
| 16 | 0.4307 + 1.3657i | 0.3427 + 1.0736i | 0.5886 + 1.6752i | 0.3211 + 0.9921i |
| 16.5 | 0.2029 + 1.6229i | 0.4061 + 0.9419i | 0.4138 + 1.2839i | 0.3981 + 0.9966i |
| 17 | 0.4551 + 1.5890i | 0.3688 + 0.9394i | 0.3994 + 1.2831i | 0.3584 + 1.0296i |
| 17.5 | 0.4310 + 1.5685i | 0.3749 + 0.9291i | 0.3899 + 1.2664i | 0.3578 + 1.0211i |
| 18 | 0.4257 + 1.5553i | 0.3653 + 0.9212i | 0.3793 + 1.2595i | 0.3474 + 1.0247i |
| 18.5 | 0.4244 + 1.5436i | 0.3639 + 0.9208i | 0.3774 + 1.2582i | 0.3430 + 1.0368i |
| 19 | 0.7690 + 1.4112i | 0.6649 + 1.1380i | 0.4761 + 1.4765i | 0.4596 + 1.1970i |

-continued

| | | | | |
|---|---|---|---|---|
| 19.5 | 0.4619 + 1.4871i | 0.4964 + 0.9866i | 0.3490 + 1.2589i | 0.3490 + 1.0371i |
| 20 | 0.3324 + 1.2294i | 0.3300 + 1.0062i | 0.3879 + 1.4978i | 0.2451 + 0.8999i |
| 20.5 | 0.3324 + 1.2302i | 0.3334 + 1.0155i | 0.3846 + 1.4868i | 0.2478 + 0.9074i |
| 21 | 0.3284 + 1.2285i | 0.3320 + 1.0206i | 0.3786 + 1.4755i | 0.2471 + 0.9090i |
| 21.5 | 0.3217 + 1.2283i | 0.3261 + 1.0269i | 0.3716 + 1.4663i | 0.2470 + 0.9085i |
| 22 | 0.3100 + 1.2397i | 0.3058 + 1.0469i | 0.3607 + 1.4682i | 0.2567 + 0.9079i |
| 22.5 | 0.3044 + 1.2443i | 0.3002 + 1.0568i | 0.3505 + 1.4648i | 0.2617 + 0.9117i |
| 23 | 0.3452 + 1.1540i | 0.4129 + 0.9793i | 0.3125 + 1.3457i | 0.2563 + 0.9501i |
| 23.5 | 0.2993 + 1.2594i | 0.2906 + 1.0772i | 0.3403 + 1.4686i | 0.2690 + 0.9234i |
| 24 | 0.4884 + 1.4147i | 0.4408 + 0.9883i | 0.2990 + 1.3047i | 0.3098 + 1.1123i |
| 24.5 | 0.4818 + 1.4041i | 0.4361 + 0.9895i | 0.2934 + 1.3012i | 0.3024 + 1.1113i |
| 25 | 0.4778 + 1.3940i | 0.4318 + 0.9909i | 0.2896 + 1.2989i | 0.2959 + 1.1112i |
| 25.5 | 0.4747 + 1.3846i | 0.4279 + 0.9924i | 0.2865 + 1.2969i | 0.2905 + 1.1114i |
| 26 | 0.4711 + 1.3764i | 0.4242 + 0.9942i | 0.2836 + 1.2952i | 0.2860 + 1.1119i |

| SNR/ w | w44 | w45 | w46 | w47 |
|---|---|---|---|---|
| 5 | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i |
| 6 | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i |
| 7 | 0.3443 + 1.1417i | 0.3344 + 1.0806i | 0.3631 + 1.2644i | 0.3443 + 1.1417i |
| 7.5 | 0.5196 + 0.2753i | 0.4732 + 0.2588i | 1.0924 + 0.3124i | 1.1489 + 0.3175i |
| 8 | 0.2357 + 0.4259i | 0.2549 + 0.4795i | 0.2549 + 0.4795i | 0.2969 + 0.5272i |
| 8.5 | 0.2294 + 0.4290i | 0.2708 + 0.4861i | 0.2708 + 0.4861i | 0.2980 + 0.5370i |
| 9 | 0.1853 + 0.6815i | 0.2599 + 0.6790i | 0.1918 + 0.8048i | 0.2852 + 0.7636i |
| 9.5 | 0.1820 + 0.6851i | 0.2619 + 0.6777i | 0.1923 + 0.8151i | 0.2969 + 0.7633i |
| 10 | 0.8088 − 1.2150i | 0.7657 − 1.1516i | 0.5436 − 0.8943i | 0.5630 − 0.9155i |
| 10.5 | 0.8109 − 1.2116i | 0.7744 − 1.1516i | 0.5437 − 0.8807i | 0.5674 − 0.9058i |
| 11 | 0.3348 + 0.5953i | 0.3348 + 0.5953i | 0.3348 + 0.5953i | 0.3348 + 0.5953i |
| 11.5 | 0.3449 + 0.5981i | 0.3449 + 0.5981i | 0.3449 + 0.5981i | 0.3449 + 0.5981i |
| 12 | 0.3585 + 0.6001i | 0.3585 + 0.6001i | 0.3585 + 0.6001i | 0.3585 + 0.6001i |
| 12.5 | 0.3778 + 0.6041i | 0.3778 + 0.6041i | 0.3778 + 0.6041i | 0.3778 + 0.6041i |
| 13 | 0.3914 + 0.6049i | 0.3914 + 0.6049i | 0.3914 + 0.6049i | 0.3914 + 0.6049i |
| 13.5 | 0.3995 + 0.6028i | 0.3995 + 0.6028i | 0.3995 + 0.6028i | 0.3995 + 0.6028i |
| 14 | 0.4023 + 0.5991i | 0.4023 + 0.5991i | 0.4023 + 0.5991i | 0.4023 + 0.5991i |
| 14.5 | 0.4096 + 0.6004i | 0.4096 + 0.6004i | 0.4096 + 0.6004i | 0.4089 + 0.5826i |
| 15 | 0.3247 + 0.6377i | 0.3307 + 0.7164i | 0.3247 + 0.6377i | 0.3307 + 0.7164i |
| 15.5 | 0.4146 + 0.6068i | 0.4236 + 0.6703i | 0.4011 + 0.5965i | 0.4047 + 0.6466i |
| 16 | 0.3296 + 0.6232i | 0.3421 + 0.6984i | 0.3115 + 0.6358i | 0.3204 + 0.7350i |
| 16.5 | 0.3744 + 0.6031i | 0.3838 + 0.6977i | 0.3484 + 0.6000i | 0.3571 + 0.6873i |
| 17 | 0.3706 + 0.5982i | 0.3667 + 0.7052i | 0.3292 + 0.5917i | 0.3315 + 0.6797i |
| 17.5 | 0.3781 + 0.5910i | 0.3716 + 0.7091i | 0.3216 + 0.5867i | 0.3245 + 0.6863i |
| 18 | 0.3805 + 0.5765i | 0.3633 + 0.7147i | 0.3133 + 0.5726i | 0.3120 + 0.6868i |
| 18.5 | 0.3915 + 0.5705i | 0.3623 + 0.7269i | 0.3080 + 0.5673i | 0.3034 + 0.6934i |
| 19 | 0.4764 + 0.7356i | 0.5686 + 0.9186i | 0.3592 + 0.7734i | 0.4125 + 0.9576i |
| 19.5 | 0.4558 + 0.6134i | 0.4773 + 0.7891i | 0.3323 + 0.6317i | 0.3411 + 0.8066i |
| 20 | 0.4353 + 0.5950i | 0.4122 + 0.7607i | 0.3109 + 0.5751i | 0.2807 + 0.7485i |
| 20.5 | 0.4435 + 0.6045i | 0.4193 + 0.7714i | 0.3125 + 0.5857i | 0.2831 + 0.7571i |
| 21 | 0.4494 + 0.6106i | 0.4225 + 0.7777i | 0.3144 + 0.5907i | 0.2838 + 0.7596i |
| 21.5 | 0.4549 + 0.6160i | 0.4247 + 0.7818i | 0.3170 + 0.5938i | 0.2850 + 0.7600i |
| 22 | 0.4631 + 0.6208i | 0.4319 + 0.7788i | 0.3205 + 0.5962i | 0.2904 + 0.7595i |
| 22.5 | 0.4705 + 0.6290i | 0.4380 + 0.7857i | 0.3259 + 0.6027i | 0.2955 + 0.7625i |
| 23 | 0.4782 + 0.6393i | 0.4531 + 0.8051i | 0.3394 + 0.6131i | 0.3093 + 0.7816i |
| 23.5 | 0.4846 + 0.6443i | 0.4495 + 0.7999i | 0.3381 + 0.6175i | 0.3079 + 0.7726i |
| 24 | 0.5034 + 0.6582i | 0.5007 + 0.8232i | 0.3521 + 0.6461i | 0.3534 + 0.7992i |
| 24.5 | 0.5119 + 0.6637i | 0.5063 + 0.8279i | 0.3591 + 0.6480i | 0.3581 + 0.8012i |
| 25 | 0.5190 + 0.6693i | 0.5110 + 0.8331i | 0.3652 + 0.6503i | 0.3620 + 0.8038i |
| 25.5 | 0.5249 + 0.6752i | 0.5140 + 0.8384i | 0.3704 + 0.6529i | 0.3647 + 0.8068i |
| 26 | 0.5308 + 0.6813i | 0.5155 + 0.8438i | 0.3755 + 0.6565i | 0.3664 + 0.8105i |

| SNR/ w | w48 | w49 | w50 | w51 |
|---|---|---|---|---|
| 5 | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i |
| 6.5 | 0.2626 + 0.4588i | 0.2626 + 0.4588i | 0.2626 + 0.4588i | 0.2626 + 0.4588i |
| 7 | 0.2515 + 0.4210i | 0.2719 + 0.4652i | 0.2350 + 0.3745i | 0.2515 + 0.4210i |
| 7.5 | 0.2411 + 0.4249i | 0.2236 + 0.3788i | 0.3279 + 1.2665i | 0.3690 + 1.7569i |
| 8 | 0.3748 + 0.2167i | 0.4259 + 0.2357i | 0.4259 + 0.2357i | 0.4795 + 0.2549i |
| 8.5 | 0.3720 + 0.2088i | 0.4290 + 0.2294i | 0.4290 + 0.2294i | 0.4909 + 0.2299i |
| 9 | 0.2497 + 0.2245i | 0.2893 + 0.2371i | 0.2893 + 0.2371i | 0.3356 + 0.2412i |
| 9.5 | 0.2419 + 0.2216i | 0.2871 + 0.2459i | 0.2958 + 0.2095i | 0.3444 + 0.2369i |
| 10 | 0.1705 − 0.3146i | 0.1705 − 0.3146i | 0.2169 − 0.6218i | 0.2169 − 0.6218i |
| 10.5 | 0.1640 − 0.3056i | 0.1640 − 0.3056i | 0.2071 − 0.6406i | 0.2071 − 0.6406i |
| 11 | 0.3012 + 0.1597i | 0.3012 + 0.1597i | 0.3012 + 0.1597i | 0.3012 + 0.1597i |
| 11.5 | 0.2975 + 0.1563i | 0.2975 + 0.1563i | 0.2975 + 0.1563i | 0.2975 + 0.1563i |

-continued

| | | | | |
|---|---|---|---|---|
| 12 | 0.2707 + 0.1533i | 0.2707 + 0.1533i | 0.2707 + 0.1533i | 0.2707 + 0.1533i |
| 12.5 | 0.2453 + 0.1484i | 0.2453 + 0.1484i | 0.2453 + 0.1484i | 0.2453 + 0.1484i |
| 13 | 0.2294 + 0.1447i | 0.2294 + 0.1447i | 0.2294 + 0.1447i | 0.2294 + 0.1447i |
| 13.5 | 0.2219 + 0.1422i | 0.2219 + 0.1422i | 0.2219 + 0.1422i | 0.2219 + 0.1422i |
| 14 | 0.2153 + 0.1266i | 0.2153 + 0.1266i | 0.2153 + 0.1266i | 0.2153 + 0.1266i |
| 14.5 | 0.2086 + 0.1249i | 0.2086 + 0.1249i | 0.2086 + 0.1249i | 0.2086 + 0.1249i |
| 15 | 0.1241 + 0.1182i | 0.1241 + 0.1182i | 0.1241 + 0.1182i | 0.1241 + 0.1182i |
| 15.5 | 0.1165 + 0.1237i | 0.1165 + 0.1237i | 0.1165 + 0.1237i | 0.1165 + 0.1237i |
| 16 | 0.1248 + 0.1142i | 0.1248 + 0.1142i | 0.1248 + 0.1142i | 0.1248 + 0.1142i |
| 16.5 | 0.1124 + 0.1192i | 0.1124 + 0.1192i | 0.1124 + 0.1192i | 0.1124 + 0.1192i |
| 17 | 0.1157 + 0.1157i | 0.1157 + 0.1157i | 0.1157 + 0.1157i | 0.1157 + 0.1157i |
| 17.5 | 0.1169 + 0.1143i | 0.1169 + 0.1143i | 0.1169 + 0.1143i | 0.1169 + 0.1143i |
| 18 | 0.1033 + 0.1105i | 0.1033 + 0.1105i | 0.1339 + 0.1101i | 0.1339 + 0.1101i |
| 18.5 | 0.0939 + 0.0943i | 0.0946 + 0.1241i | 0.1446 + 0.0939i | 0.1449 + 0.1242i |
| 19 | 0.0786 + 0.0928i | 0.0849 + 0.2753i | 0.0786 + 0.0928i | 0.0849 + 0.2753i |
| 19.5 | 0.0951 + 0.0766i | 0.0782 + 0.2154i | 0.0951 + 0.0766i | 0.1213 + 0.2125i |
| 20 | 0.0713 + 0.0697i | 0.0711 + 0.1478i | 0.2060 + 0.0687i | 0.2046 + 0.1520i |
| 20.5 | 0.0696 + 0.0636i | 0.0695 + 0.1639i | 0.2051 + 0.0633i | 0.2044 + 0.1665i |
| 21 | 0.0696 + 0.0610i | 0.0696 + 0.1698i | 0.2077 + 0.0610i | 0.2073 + 0.1721i |
| 21.5 | 0.0707 + 0.0595i | 0.0706 + 0.1722i | 0.2119 + 0.0599i | 0.2114 + 0.1748i |
| 22 | 0.0723 + 0.0588i | 0.0719 + 0.1737i | 0.2166 + 0.0598i | 0.2155 + 0.1775i |
| 22.5 | 0.0730 + 0.0592i | 0.0727 + 0.1768i | 0.2188 + 0.0604i | 0.2178 + 0.1809i |
| 23 | 0.0720 + 0.0615i | 0.0717 + 0.1851i | 0.2162 + 0.0625i | 0.2153 + 0.1881i |
| 23.5 | 0.0735 + 0.0614i | 0.0734 + 0.1846i | 0.2204 + 0.0628i | 0.2198 + 0.1888i |
| 24 | 0.0668 + 0.0698i | 0.0669 + 0.2101i | 0.2012 + 0.0697i | 0.2017 + 0.2100i |
| 24.5 | 0.0679 + 0.0704i | 0.0679 + 0.2120i | 0.2045 + 0.0702i | 0.2048 + 0.2113i |
| 25 | 0.0687 + 0.0711i | 0.0686 + 0.2143i | 0.2073 + 0.0705i | 0.2070 + 0.2122i |
| 25.5 | 0.0699 + 0.0718i | 0.0690 + 0.2167i | 0.2111 + 0.0703i | 0.2080 + 0.2118i |
| 26 | 0.0711 + 0.0728i | 0.0687 + 0.2202i | 0.2153 + 0.0697i | 0.2074 + 0.2103i |

| SNR/ w | w52 | w53 | w54 | w55 |
|---|---|---|---|---|
| 5 | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i |
| 6 | 0.2642 + 0.4570i | 0.2642 + 0.4570i | 0.2642 + 0.4570i | 0.2642 + 0.4570i |
| 6.5 | 0.2626 + 0.4588i | 0.2626 + 0.4588i | 0.2626 + 0.4588i | 0.2626 + 0.4588i |
| 7 | 0.2515 + 0.4210i | 0.2515 + 0.4210i | 0.2350 + 0.3745i | 0.2515 + 0.4210i |
| 7.5 | 0.2588 + 0.4732i | 0.2411 + 0.4249i | 0.3175 + 1.1489i | 0.3279 + 1.2665i |
| 8 | 0.3748 + 0.2167i | 0.4259 + 0.2357i | 0.4259 + 0.2357i | 0.4795 + 0.2549i |
| 8.5 | 0.3720 + 0.2088i | 0.4290 + 0.2294i | 0.4290 + 0.2294i | 0.4861 + 0.2708i |
| 9 | 0.2497 + 0.2245i | 0.2893 + 0.2371i | 0.2893 + 0.2371i | 0.3356 + 0.2412i |
| 9.5 | 0.2419 + 0.2216i | 0.2871 + 0.2459i | 0.2958 + 0.2095i | 0.3444 + 0.2369i |
| 10 | 0.1705 − 0.3146i | 0.1705 − 0.3146i | 0.2169 − 0.6218i | 0.2169 − 0.6218i |
| 10.5 | 0.1640 − 0.3056i | 0.1640 − 0.3056i | 0.2071 − 0.6406i | 0.2071 − 0.6406i |
| 11 | 0.3012 + 0.1597i | 0.3012 + 0.1597i | 0.3012 + 0.1597i | 0.3012 + 0.1597i |
| 11.5 | 0.2975 + 0.1563i | 0.2975 + 0.1563i | 0.2975 + 0.1563i | 0.2975 + 0.1563i |
| 12 | 0.2707 + 0.1533i | 0.2707 + 0.1533i | 0.2707 + 0.1533i | 0.2707 + 0.1533i |
| 12.5 | 0.2453 + 0.1484i | 0.2453 + 0.1484i | 0.2453 + 0.1484i | 0.2453 + 0.1484i |
| 13 | 0.2294 + 0.1447i | 0.2294 + 0.1447i | 0.2294 + 0.1447i | 0.2294 + 0.1447i |
| 13.5 | 0.2219 + 0.1422i | 0.2219 + 0.1422i | 0.2219 + 0.1422i | 0.2219 + 0.1422i |
| 14 | 0.2218 + 0.1534i | 0.2218 + 0.1534i | 0.2218 + 0.1534i | 0.2218 + 0.1534i |
| 14.5 | 0.2149 + 0.1561i | 0.2149 + 0.1561i | 0.2149 + 0.1561i | 0.2149 + 0.1561i |
| 15 | 0.1177 + 0.3603i | 0.1177 + 0.3603i | 0.1177 + 0.3603i | 0.1177 + 0.3603i |
| 15.5 | 0.1236 + 0.3719i | 0.1236 + 0.3719i | 0.1236 + 0.3719i | 0.1236 + 0.3719i |
| 16 | 0.1150 + 0.3690i | 0.1163 + 0.3424i | 0.1150 + 0.3690i | 0.1163 + 0.3424i |
| 16.5 | 0.1139 + 0.3829i | 0.1135 + 0.3525i | 0.1139 + 0.3829i | 0.1135 + 0.3525i |
| 17 | 0.1113 + 0.3773i | 0.1134 + 0.3400i | 0.1113 + 0.3773i | 0.1134 + 0.3400i |
| 17.5 | 0.1111 + 0.3793i | 0.1143 + 0.3320i | 0.1111 + 0.3793i | 0.1143 + 0.3320i |
| 18 | 0.0984 + 0.3716i | 0.1017 + 0.3147i | 0.1253 + 0.3759i | 0.1301 + 0.3177i |
| 18.5 | 0.0911 + 0.3755i | 0.0942 + 0.3061i | 0.1336 + 0.3799i | 0.1399 + 0.3092i |
| 19 | 0.0877 + 0.6350i | 0.0977 + 0.4554i | 0.1446 + 0.6281i | 0.0977 + 0.4554i |
| 19.5 | 0.0760 + 0.5036i | 0.0772 + 0.3648i | 0.1642 + 0.4957i | 0.1421 + 0.3594i |
| 20 | 0.0715 + 0.3878i | 0.0710 + 0.2879i | 0.1957 + 0.3967i | 0.2012 + 0.2903i |
| 20.5 | 0.0700 + 0.4057i | 0.0696 + 0.2929i | 0.1995 + 0.4139i | 0.2029 + 0.2955i |
| 21 | 0.0698 + 0.4114i | 0.0697 + 0.2939i | 0.2034 + 0.4201i | 0.2063 + 0.2971i |
| 21.5 | 0.0701 + 0.4134i | 0.0705 + 0.2935i | 0.2066 + 0.4231i | 0.2100 + 0.2979i |
| 22 | 0.0704 + 0.4157i | 0.0713 + 0.2939i | 0.2086 + 0.4265i | 0.2132 + 0.3001i |
| 22.5 | 0.0710 + 0.4212i | 0.0721 + 0.2976i | 0.2107 + 0.4330i | 0.2155 + 0.3047i |
| 23 | 0.0692 + 0.4430i | 0.0709 + 0.3116i | 0.2088 + 0.4508i | 0.2131 + 0.3169i |
| 23.5 | 0.0720 + 0.4369i | 0.0730 + 0.3094i | 0.2145 + 0.4495i | 0.2184 + 0.3170i |
| 24 | 0.0675 + 0.5006i | 0.0672 + 0.3530i | 0.2047 + 0.4981i | 0.2028 + 0.3524i |
| 24.5 | 0.0689 + 0.5043i | 0.0683 + 0.3561i | 0.2088 + 0.4995i | 0.2060 + 0.3542i |
| 25 | 0.0701 + 0.5091i | 0.0690 + 0.3598i | 0.2121 + 0.5000i | 0.2083 + 0.3552i |
| 25.5 | 0.0711 + 0.5149i | 0.0694 + 0.3642i | 0.2146 + 0.4990i | 0.2095 + 0.3547i |
| 26 | 0.0722 + 0.5215i | 0.0699 + 0.3698i | 0.2171 + 0.4970i | 0.2104 + 0.3528i |

-continued

| SNR/ w | w56 | w57 | w58 | w59 |
|---|---|---|---|---|
| 5 | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i |
| 6.5 | 0.2626 + 0.4588i | 0.2626 + 0.4588i | 0.2626 + 0.4588i | 0.2626 + 0.4588i |
| 7 | 0.2719 + 0.4652i | 0.2897 + 0.4968i | 0.2515 + 0.4210i | 0.2719 + 0.4652i |
| 7.5 | 0.4249 + 0.2411i | 0.3788 + 0.2236i | 1.2665 + 0.3279i | 1.7569 + 0.3690i |
| 8 | 0.4259 + 0.2357i | 0.4795 + 0.2549i | 0.4795 + 0.2549i | 0.5341 + 0.2486i |
| 8.5 | 0.4290 + 0.2294i | 0.4909 + 0.2299i | 0.4909 + 0.2299i | 0.5508 + 0.2411i |
| 9 | 0.2497 + 0.2245i | 0.2893 + 0.2371i | 0.2979 + 0.2152i | 0.3356 + 0.2412i |
| 9.5 | 0.2419 + 0.2216i | 0.2871 + 0.2459i | 0.2958 + 0.2095i | 0.3444 + 0.2369i |
| 10 | 0.1705 − 0.3146i | 0.1705 − 0.3146i | 0.3158 − 0.5800i | 0.3158 − 0.5800i |
| 10.5 | 0.1640 − 0.3056i | 0.1640 − 0.3056i | 0.3251 − 0.5895i | 0.3251 − 0.5895i |
| 11 | 0.6554 + 0.1969i | 0.6554 + 0.1969i | 0.6554 + 0.1969i | 0.6554 + 0.1969i |
| 11.5 | 0.6652 + 0.1867i | 0.6652 + 0.1867i | 0.6652 + 0.1867i | 0.6652 + 0.1867i |
| 12 | 0.6459 + 0.1725i | 0.6459 + 0.1725i | 0.6459 + 0.1725i | 0.6459 + 0.1725i |
| 12.5 | 0.6281 + 0.1582i | 0.6281 + 0.1582i | 0.6281 + 0.1582i | 0.6281 + 0.1582i |
| 13 | 0.6132 + 0.1477i | 0.6132 + 0.1477i | 0.6132 + 0.1477i | 0.6132 + 0.1477i |
| 13.5 | 0.6060 + 0.1399i | 0.6060 + 0.1399i | 0.6060 + 0.1399i | 0.6060 + 0.1399i |
| 14 | 0.6035 + 0.1350i | 0.6035 + 0.1350i | 0.6035 + 0.1350i | 0.6035 + 0.1350i |
| 14.5 | 0.5956 + 0.1287i | 0.5956 + 0.1287i | 0.5956 + 0.1287i | 0.5956 + 0.1287i |
| 15 | 0.3683 + 0.1249i | 0.3683 + 0.1249i | 0.3683 + 0.1249i | 0.3683 + 0.1249i |
| 15.5 | 0.3709 + 0.1155i | 0.3709 + 0.1155i | 0.3479 + 0.1171i | 0.3479 + 0.1171i |
| 16 | 0.3766 + 0.1242i | 0.3766 + 0.1242i | 0.3766 + 0.1242i | 0.3766 + 0.1242i |
| 16.5 | 0.3535 + 0.1156i | 0.3535 + 0.1156i | 0.3317 + 0.1131i | 0.3535 + 0.1156i |
| 17 | 0.3704 + 0.1194i | 0.3704 + 0.1194i | 0.3390 + 0.1174i | 0.3390 + 0.1174i |
| 17.5 | 0.3791 + 0.1202i | 0.3791 + 0.1202i | 0.3376 + 0.1170i | 0.3376 + 0.1170i |
| 18 | 0.4012 + 0.1159i | 0.4012 + 0.1159i | 0.3338 + 0.1122i | 0.3338 + 0.1122i |
| 18.5 | 0.4172 + 0.0983i | 0.4129 + 0.1333i | 0.3295 + 0.0948i | 0.3269 + 0.1276i |
| 19 | 0.2391 + 0.0872i | 0.2587 + 0.2558i | 0.2391 + 0.0872i | 0.2587 + 0.2558i |
| 19.5 | 0.3357 + 0.0722i | 0.3554 + 0.1787i | 0.2645 + 0.0759i | 0.2773 + 0.1974i |
| 20 | 0.4915 + 0.0675i | 0.4864 + 0.1749i | 0.3507 + 0.0674i | 0.3479 + 0.1618i |
| 20.5 | 0.4886 + 0.0646i | 0.4846 + 0.1827i | 0.3469 + 0.0633i | 0.3450 + 0.1729i |
| 21 | 0.4930 + 0.0636i | 0.4893 + 0.1869i | 0.3495 + 0.0617i | 0.3478 + 0.1777i |
| 21.5 | 0.5002 + 0.0638i | 0.4966 + 0.1905i | 0.3552 + 0.0612i | 0.3533 + 0.1810i |
| 22 | 0.5063 + 0.0651i | 0.5034 + 0.1956i | 0.3611 + 0.0619i | 0.3592 + 0.1852i |
| 22.5 | 0.5098 + 0.0662i | 0.5076 + 0.1992i | 0.3641 + 0.0628i | 0.3625 + 0.1888i |
| 23 | 0.5089 + 0.0667i | 0.5074 + 0.2012i | 0.3614 + 0.0643i | 0.3600 + 0.1938i |
| 23.5 | 0.5134 + 0.0686i | 0.5133 + 0.2063i | 0.3668 + 0.0653i | 0.3660 + 0.1965i |
| 24 | 0.4796 + 0.0697i | 0.4800 + 0.2104i | 0.3382 + 0.0697i | 0.3390 + 0.2100i |
| 24.5 | 0.4861 + 0.0706i | 0.4859 + 0.2131i | 0.3435 + 0.0702i | 0.3439 + 0.2114i |
| 25 | 0.4922 + 0.0714i | 0.4900 + 0.2154i | 0.3482 + 0.0705i | 0.3474 + 0.2123i |
| 25.5 | 0.5014 + 0.0721i | 0.4909 + 0.2174i | 0.3548 + 0.0706i | 0.3488 + 0.2127i |
| 26 | 0.5101 + 0.0730i | 0.4897 + 0.2198i | 0.3616 + 0.0709i | 0.3479 + 0.2135i |

| SNR/ w | w60 | w61 | w62 | w63 |
|---|---|---|---|---|
| 5 | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i |
| 6 | 0.2642 + 0.4570i | 0.2642 + 0.4570i | 0.2642 + 0.4570i | 0.2642 + 0.4570i |
| 6.5 | 0.2626 + 0.4588i | 0.2626 + 0.4588i | 0.2626 + 0.4588i | 0.2626 + 0.4588i |
| 7 | 0.2515 + 0.4210i | 0.2719 + 0.4652i | 0.2515 + 0.4210i | 0.2515 + 0.4210i |
| 7.5 | 0.4732 + 0.2588i | 0.4249 + 0.2411i | 1.1489 + 0.3175i | 1.2665 + 0.3279i |
| 8 | 0.4259 + 0.2357i | 0.4795 + 0.2549i | 0.4795 + 0.2549i | 0.5272 + 0.2969i |
| 8.5 | 0.4290 + 0.2294i | 0.4861 + 0.2708i | 0.4861 + 0.2708i | 0.5370 + 0.2980i |
| 9 | 0.2497 + 0.2245i | 0.2893 + 0.2371i | 0.2979 + 0.2152i | 0.3356 + 0.2412i |
| 9.5 | 0.2419 + 0.2216i | 0.2871 + 0.2459i | 0.2958 + 0.2095i | 0.3444 + 0.2369i |
| 10 | 0.1705 − 0.3146i | 0.1705 − 0.3146i | 0.3158 − 0.5800i | 0.3158 − 0.5800i |
| 10.5 | 0.1640 − 0.3056i | 0.1640 − 0.3056i | 0.3251 − 0.5895i | 0.3251 − 0.5895i |
| 11 | 0.5954 + 0.3347i | 0.5954 + 0.3347i | 0.5954 + 0.3347i | 0.5954 + 0.3347i |
| 11.5 | 0.5982 + 0.3424i | 0.5982 + 0.3424i | 0.5982 + 0.3424i | 0.5982 + 0.3424i |
| 12 | 0.5863 + 0.3220i | 0.5863 + 0.3220i | 0.5863 + 0.3220i | 0.5863 + 0.3220i |
| 12.5 | 0.5785 + 0.3055i | 0.5785 + 0.3055i | 0.5785 + 0.3055i | 0.5785 + 0.3055i |
| 13 | 0.5707 + 0.2977i | 0.5707 + 0.2977i | 0.5707 + 0.2977i | 0.5707 + 0.2977i |
| 13.5 | 0.5660 + 0.3001i | 0.5660 + 0.3001i | 0.5660 + 0.3001i | 0.5660 + 0.3001i |
| 14 | 0.5609 + 0.3115i | 0.5609 + 0.3115i | 0.5609 + 0.3115i | 0.5609 + 0.3115i |
| 14.5 | 0.5560 + 0.3155i | 0.5560 + 0.3155i | 0.5560 + 0.3155i | 0.5560 + 0.3155i |
| 15 | 0.3492 + 0.3785i | 0.3492 + 0.3785i | 0.3492 + 0.3785i | 0.3492 + 0.3785i |
| 15.5 | 0.3870 + 0.3484i | 0.3870 + 0.3484i | 0.3707 + 0.3564i | 0.3707 + 0.3564i |
| 16 | 0.3486 + 0.3874i | 0.3591 + 0.3689i | 0.3486 + 0.3874i | 0.3591 + 0.3689i |
| 16.5 | 0.3530 + 0.3734i | 0.3698 + 0.3435i | 0.3530 + 0.3734i | 0.3436 + 0.3473i |
| 17 | 0.3747 + 0.3766i | 0.3717 + 0.3453i | 0.3348 + 0.3800i | 0.3339 + 0.3472i |
| 17.5 | 0.3834 + 0.3812i | 0.3805 + 0.3416i | 0.3287 + 0.3836i | 0.3290 + 0.3417i |
| 18 | 0.3940 + 0.3783i | 0.3941 + 0.3266i | 0.3224 + 0.3797i | 0.3242 + 0.3257i |
| 18.5 | 0.4055 + 0.3867i | 0.4070 + 0.3192i | 0.3165 + 0.3859i | 0.3192 + 0.3168i |
| 19 | 0.3841 + 0.5754i | 0.3150 + 0.4197i | 0.3139 + 0.6000i | 0.2782 + 0.4299i |

-continued

| | | | | |
|---|---|---|---|---|
| 19.5 | 0.4211 + 0.4555i | 0.3908 + 0.3235i | 0.3141 + 0.4762i | 0.2975 + 0.3417i |
| 20 | 0.4601 + 0.4402i | 0.4756 + 0.3132i | 0.3316 + 0.4177i | 0.3417 + 0.2995i |
| 20.5 | 0.4639 + 0.4505i | 0.4766 + 0.3165i | 0.3324 + 0.4313i | 0.3406 + 0.3039i |
| 21 | 0.4697 + 0.4569i | 0.4820 + 0.3193i | 0.3355 + 0.4373i | 0.3439 + 0.3060i |
| 21.5 | 0.4764 + 0.4630i | 0.4895 + 0.3231i | 0.3397 + 0.4416i | 0.3490 + 0.3083i |
| 22 | 0.4850 + 0.4713i | 0.4975 + 0.3302i | 0.3439 + 0.4470i | 0.3544 + 0.3131i |
| 22.5 | 0.4912 + 0.4790i | 0.5027 + 0.3358i | 0.3482 + 0.4545i | 0.3582 + 0.3185i |
| 23 | 0.4951 + 0.4835i | 0.5034 + 0.3391i | 0.3505 + 0.4649i | 0.3566 + 0.3265i |
| 23.5 | 0.5011 + 0.4924i | 0.5105 + 0.3465i | 0.3558 + 0.4698i | 0.3634 + 0.3304i |
| 24 | 0.4925 + 0.5035i | 0.4833 + 0.3548i | 0.3463 + 0.4979i | 0.3414 + 0.3526i |
| 24.5 | 0.5003 + 0.5082i | 0.4895 + 0.3586i | 0.3523 + 0.4998i | 0.3464 + 0.3545i |
| 25 | 0.5068 + 0.5129i | 0.4941 + 0.3621i | 0.3574 + 0.5015i | 0.3500 + 0.3558i |
| 25.5 | 0.5120 + 0.5180i | 0.4965 + 0.3657i | 0.3613 + 0.5034i | 0.3518 + 0.3569i |
| 26 | 0.5175 + 0.5233i | 0.4992 + 0.3698i | 0.3655 + 0.5062i | 0.3537 + 0.3587i |

l1) 1 kQQAM with Max. Penalty=0.001 b/s/Hz—AWGN Channel

| SNR/w | w0 | w1 | w2 | w3 |
|---|---|---|---|---|
| 7 | 1.2470 + 1.8367i | 0.6834 + 1.2111i | 0.4280 + 2.1615i | 0.3795 + 1.3685i |
| 7.5 | 1.2147 + 1.7841i | 0.9775 + 1.4975i | 0.4075 + 2.1185i | 0.3773 + 1.7335i |
| 8 | 0.3978 + 2.0885i | 0.3528 + 1.7466i | 0.3367 + 1.5749i | 0.3329 + 1.5346i |
| 8.5 | 0.3944 + 2.0732i | 0.3348 + 1.7139i | 0.3252 + 1.6265i | 0.3149 + 1.5557i |
| 9 | 2.0688 + 0.3931i | 1.5226 + 0.3041i | 1.5226 + 0.3041i | 1.4130 + 0.2910i |
| 9.5 | 2.0659 + 0.4001i | 1.5258 + 0.3016i | 1.5258 + 0.3016i | 1.4155 + 0.2850i |
| 10 | 2.0614 + 0.4082i | 1.5259 + 0.3010i | 1.5259 + 0.3010i | 1.4442 + 0.2855i |
| 10.5 | 2.0377 + 0.5960i | 1.4218 + 0.2924i | 1.8845 + 0.2992i | 1.4573 + 0.2727i |
| 11 | 2.0390 + 0.5892i | 1.9449 + 0.9829i | 2.1322 + 0.2257i | 1.6928 + 1.3984i |
| 11.5 | 2.0197 + 0.5915i | 1.9273 + 0.9738i | 2.1141 + 0.2170i | 1.6778 + 1.3854i |
| 12 | 1.9956 + 0.5790i | 1.9068 + 0.9328i | 2.0896 + 0.2054i | 1.6925 + 1.3344i |
| 12.5 | 2.1158 + 0.2551i | 1.9736 + 0.7598i | 1.2067 + 1.7622i | 1.7509 + 1.2633i |
| 13 | 1.1348 + 1.8042i | 1.5056 + 1.4947i | 1.8256 + 0.9213i | 1.6326 + 1.1112i |
| 13.5 | 2.1871 + 0.3000i | 1.8533 + 0.9857i | 1.1098 + 1.7333i | 1.5930 + 1.5042i |
| 14 | 1.2483 + 1.5217i | 0.1461 + 1.4775i | 1.0118 + 1.6410i | 0.7721 + 1.8992i |
| 14.5 | 1.3062 + 1.5059i | 0.1503 + 1.4749i | 1.0464 + 1.6055i | 0.8162 + 1.8855i |
| 15 | 1.4903 + 1.1383i | 0.9110 + 1.4937i | 1.4109 + 1.4171i | 1.1243 + 1.6910i |
| 15.5 | 1.3441 + 1.0864i | 1.6500 + 1.0447i | 1.3102 + 1.2118i | 1.5763 + 1.4126i |
| 16 | 1.3350 + 1.1084i | 1.4475 + 0.9747i | 1.5607 + 1.3993i | 1.7541 + 1.0489i |
| 16.5 | 1.2147 + 1.5219i | 1.5401 + 1.3313i | 1.1978 + 1.2058i | 1.2559 + 1.1577i |
| 17 | 1.2118 + 1.5215i | 1.5329 + 1.3209i | 1.1917 + 1.2081i | 1.2568 + 1.1617i |
| 17.5 | 1.2108 + 1.5244i | 1.5290 + 1.3088i | 1.1858 + 1.2120i | 1.2645 + 1.1672i |
| 18 | 1.2082 + 1.5168i | 1.5240 + 1.3020i | 1.1811 + 1.2092i | 1.2761 + 1.1672i |
| 18.5 | 1.7580 + 0.8556i | 1.4723 + 0.8642i | 1.6081 + 1.1548i | 1.3616 + 0.9559i |
| 19 | 1.7624 + 0.8434i | 1.4961 + 0.8499i | 1.5901 + 1.1466i | 1.3710 + 0.9545i |
| 19.5 | 1.7721 + 0.9602i | 1.5439 + 0.8692i | 1.5357 + 1.2087i | 1.3865 + 0.9588i |
| 20 | 1.1090 + 1.6424i | 1.3041 + 1.4291i | 0.8414 + 1.7420i | 1.0620 + 1.3420i |
| 20.5 | 1.5361 + 1.2929i | 1.7337 + 0.8357i | 1.2780 + 1.4499i | 1.2622 + 1.2031i |
| 21 | 1.1920 + 1.4825i | 1.1801 + 1.2582i | 1.4681 + 1.3237i | 1.1055 + 1.1254i |
| 21.5 | 1.3352 + 1.3968i | 1.5544 + 1.1632i | 1.1041 + 1.4991i | 1.0921 + 1.2512i |
| 22 | 1.1448 + 1.4301i | 1.2314 + 1.2283i | 1.3851 + 1.4301i | 1.1791 + 1.0727i |
| 22.5 | 1.3571 + 1.4599i | 1.6063 + 1.1774i | 1.1068 + 1.5873i | 1.2491 + 1.2384i |
| 23 | 1.2474 + 1.3969i | 1.4038 + 1.1579i | 1.0418 + 1.5521i | 1.2120 + 1.1649i |
| 23.5 | 1.3740 + 1.3412i | 1.5419 + 1.1137i | 1.0721 + 1.4824i | 1.1453 + 1.2860i |
| 24 | 1.3790 + 1.2726i | 1.2140 + 1.1908i | 1.1518 + 1.3905i | 1.5627 + 1.0245i |
| 24.5 | 1.2961 + 1.3306i | 1.5578 + 1.0359i | 0.8364 + 1.6008i | 1.1053 + 1.2451i |
| 25 | 1.2369 + 1.3509i | 1.5739 + 0.9502i | 0.8752 + 1.5743i | 1.0781 + 1.2268i |
| 25.5 | 1.1981 + 1.3312i | 1.4448 + 1.0547i | 1.0785 + 1.4777i | 1.3216 + 0.9567i |
| 26 | 1.3600 + 1.2363i | 1.4725 + 1.0370i | 0.8236 + 1.5404i | 1.1012 + 1.2158i |
| 26.5 | 1.2790 + 1.2022i | 1.4224 + 1.0247i | 0.8336 + 1.4661i | 1.1191 + 1.1349i |
| 27 | 1.3272 + 1.2196i | 1.3559 + 1.0732i | 1.0028 + 1.3882i | 1.0375 + 1.2417i |
| 27.5 | 1.2847 + 1.1501i | 1.3344 + 1.0100i | 0.9562 + 1.3726i | 0.9853 + 1.2319i |
| 28 | 1.2471 + 1.1326i | 1.3598 + 1.0114i | 0.9946 + 1.3891i | 1.0600 + 1.1563i |

| SNR/w | w4 | w5 | w6 | w7 |
|---|---|---|---|---|
| 7 | 0.6834 + 1.2111i | 0.6203 + 1.1269i | 0.3795 + 1.3685i | 0.3664 + 1.2524i |
| 7.5 | 0.6871 + 1.1551i | 0.7107 + 1.1845i | 0.3340 + 1.3132i | 0.3394 + 1.3455i |
| 8 | 1.1912 + 1.7585i | 0.9886 + 1.4907i | 0.8852 + 1.3630i | 0.8567 + 1.3285i |
| 8.5 | 1.1771 + 1.7502i | 0.9699 + 1.4579i | 0.9225 + 1.3957i | 0.8771 + 1.3353i |
| 9 | 1.5226 + 0.3041i | 1.4130 + 0.2910i | 1.4130 + 0.2910i | 1.3541 + 0.2851i |
| 9.5 | 1.5258 + 0.3016i | 1.4155 + 0.2850i | 1.4155 + 0.2850i | 1.4155 + 0.2850i |
| 10 | 1.5259 + 0.3010i | 1.4442 + 0.2855i | 1.4442 + 0.2855i | 1.3999 + 0.2768i |
| 10.5 | 1.5221 + 0.3248i | 1.4218 + 0.2924i | 1.5822 + 0.2893i | 1.4573 + 0.2727i |
| 11 | 0.6643 + 1.9775i | 0.9378 + 1.8902i | 0.2768 + 2.1985i | 1.3588 + 1.7046i |
| 11.5 | 0.6565 + 1.9726i | 0.9379 + 1.8778i | 0.2618 + 2.1756i | 1.3509 + 1.6828i |

-continued

| | | | | |
|---|---|---|---|---|
| 12 | 0.6557 + 1.9767i | 0.9827 + 1.8677i | 0.2501 + 2.1554i | 1.3795 + 1.6301i |
| 12.5 | 0.4696 + 1.4431i | 0.4534 + 1.4338i | 0.5999 + 1.4947i | 0.5550 + 1.4555i |
| 13 | 1.6003 + 0.1353i | 1.6516 + 0.1238i | 2.0062 + 0.5266i | 2.0128 + 0.1983i |
| 13.5 | 0.5540 + 1.3961i | 0.5317 + 1.3797i | 0.6814 + 1.4935i | 0.6040 + 1.4250i |
| 14 | 0.5249 + 1.3438i | 0.4746 + 1.3690i | 0.6571 + 1.4190i | 0.6040 + 1.4423i |
| 14.5 | 0.5385 + 1.3224i | 0.4757 + 1.3733i | 0.7020 + 1.4249i | 0.6369 + 1.4730i |
| 15 | 1.0821 + 1.1204i | 0.9502 + 1.2140i | 1.0380 + 1.0923i | 0.9559 + 1.1435i |
| 15.5 | 0.9974 + 1.0754i | 0.9256 + 1.0475i | 0.9974 + 1.0754i | 0.9256 + 1.0475i |
| 16 | 1.0500 + 0.9792i | 1.0135 + 0.9798i | 0.9647 + 0.9464i | 0.9496 + 0.9596i |
| 16.5 | 1.8450 + 0.9334i | 1.5494 + 0.9965i | 1.1978 + 0.9549i | 1.2537 + 0.9642i |
| 17 | 1.8374 + 0.9409i | 1.5357 + 0.9911i | 1.1881 + 0.9512i | 1.2485 + 0.9597i |
| 17.5 | 1.8238 + 0.9430i | 1.5237 + 0.9832i | 1.1800 + 0.9524i | 1.2475 + 0.9593i |
| 18 | 1.8137 + 0.9371i | 1.5194 + 0.9786i | 1.1750 + 0.9549i | 1.2506 + 0.9591i |
| 18.5 | 1.6322 + 0.6294i | 1.4250 + 0.6945i | 1.1917 + 0.7017i | 1.2482 + 0.7340i |
| 19 | 1.6320 + 0.6089i | 1.4335 + 0.6810i | 1.2009 + 0.7014i | 1.2596 + 0.7328i |
| 19.5 | 1.4330 + 0.5782i | 1.4962 + 0.6937i | 1.2677 + 0.6543i | 1.2934 + 0.7411i |
| 20 | 1.3469 + 1.1420i | 1.6140 + 1.1270i | 1.1259 + 1.0802i | 1.0687 + 1.1589i |
| 20.5 | 1.4523 + 0.7959i | 1.5055 + 0.9923i | 1.2671 + 0.8392i | 1.2824 + 1.0044i |
| 21 | 1.5435 + 0.9938i | 1.3407 + 1.0511i | 1.1841 + 0.8772i | 1.1708 + 0.9914i |
| 21.5 | 1.3845 + 0.9402i | 1.3310 + 1.1297i | 1.2245 + 0.9236i | 1.1581 + 1.0783i |
| 22 | 1.5570 + 0.9357i | 1.4463 + 1.1297i | 1.3343 + 0.9131i | 1.1627 + 0.9172i |
| 22.5 | 1.5617 + 0.8881i | 1.4366 + 1.0501i | 1.2716 + 0.8875i | 1.2361 + 1.0472i |
| 23 | 1.3678 + 0.8860i | 1.5336 + 0.9857i | 1.2086 + 0.8597i | 1.2130 + 1.0083i |
| 23.5 | 1.3865 + 0.9633i | 1.3170 + 1.1167i | 1.1954 + 0.9088i | 1.1762 + 1.0540i |
| 24 | 1.3824 + 0.8840i | 1.3211 + 1.0410i | 1.1686 + 0.8903i | 1.1570 + 1.0107i |
| 24.5 | 1.3744 + 0.9233i | 1.3731 + 1.1025i | 1.2130 + 0.9446i | 1.2096 + 1.1104i |
| 25 | 1.3726 + 1.0001i | 1.3629 + 1.1723i | 1.2107 + 0.9621i | 1.1961 + 1.1184i |
| 25.5 | 1.5082 + 0.8231i | 1.2653 + 1.1488i | 1.1548 + 0.9162i | 1.1687 + 1.0355i |
| 26 | 1.3405 + 0.9099i | 1.2954 + 1.0600i | 1.2050 + 0.8913i | 1.1575 + 1.0871i |
| 26.5 | 1.3645 + 0.8540i | 1.2671 + 1.0236i | 1.2289 + 0.8713i | 1.1326 + 0.9925i |
| 27 | 1.4394 + 0.9027i | 1.0528 + 1.0954i | 1.2910 + 0.9298i | 1.1738 + 1.1370i |
| 27.5 | 1.5330 + 0.7517i | 1.0098 + 1.0854i | 1.1767 + 0.9824i | 1.1243 + 1.1021i |
| 28 | 1.4990 + 0.7151i | 1.0049 + 1.0334i | 1.2249 + 0.9302i | 1.1234 + 1.0412i |

| SNR/w | w8 | w9 | w10 | w11 |
|---|---|---|---|---|
| 7 | 0.6834 + 1.2111i | 0.6203 + 1.1269i | 0.3795 + 1.3685i | 0.3664 + 1.2524i |
| 7.5 | 0.6871 + 1.1551i | 0.7107 + 1.1845i | 0.3340 + 1.3132i | 0.3394 + 1.3455i |
| 8 | 0.3053 + 1.2660i | 0.3053 + 1.2660i | 0.3053 + 1.2660i | 0.3053 + 1.2660i |
| 8.5 | 0.2755 + 1.1100i | 0.2755 + 1.1100i | 0.2755 + 1.1100i | 0.2755 + 1.1100i |
| 9 | 1.5226 + 0.3041i | 1.4130 + 0.2910i | 1.4130 + 0.2910i | 1.3541 + 0.2851i |
| 9.5 | 1.5258 + 0.3016i | 1.4155 + 0.2850i | 1.4155 + 0.2850i | 1.4155 + 0.2850i |
| 10 | 1.5259 + 0.3010i | 1.4442 + 0.2855i | 1.4442 + 0.2855i | 1.3999 + 0.2768i |
| 10.5 | 1.4218 + 0.2924i | 1.3860 + 0.2687i | 1.4573 + 0.2727i | 1.3860 + 0.2687i |
| 11 | 0.2694 + 1.5131i | 0.2666 + 1.4804i | 0.2206 + 1.5281i | 0.2221 + 1.4905i |
| 11.5 | 0.2762 + 1.5039i | 0.2735 + 1.4726i | 0.2175 + 1.5226i | 0.2194 + 1.4854i |
| 12 | 0.2854 + 1.4955i | 0.2803 + 1.4638i | 0.2140 + 1.5186i | 0.2152 + 1.4801i |
| 12.5 | 0.1259 + 1.6593i | 0.1270 + 1.7379i | 0.7712 + 2.0048i | 0.2871 + 2.1268i |
| 13 | 1.3969 + 0.5361i | 1.3969 + 0.5361i | 1.4747 + 0.6396i | 1.4392 + 0.6354i |
| 13.5 | 0.1154 + 1.5910i | 0.1145 + 1.6518i | 0.7071 + 2.0121i | 0.2331 + 2.0568i |
| 14 | 0.1319 + 1.6053i | 0.1497 + 1.5552i | 0.1917 + 2.0093i | 0.4128 + 1.8626i |
| 14.5 | 0.1282 + 1.6465i | 0.1597 + 1.5527i | 0.1959 + 2.0115i | 0.4545 + 1.8615i |
| 15 | 0.1724 + 2.0081i | 0.7788 + 1.5257i | 0.5016 + 1.9561i | 0.7186 + 1.7492i |
| 15.5 | 1.0823 + 1.6174i | 0.7196 + 1.5112i | 0.8215 + 1.8773i | 0.6957 + 1.5465i |
| 16 | 1.1791 + 1.3117i | 0.9549 + 1.3540i | 1.1769 + 1.6347i | 0.9200 + 1.4356i |
| 16.5 | 0.9383 + 1.3523i | 0.8697 + 1.2142i | 0.9874 + 1.2241i | 0.9264 + 1.1757i |
| 17 | 0.9377 + 1.3662i | 0.8598 + 1.2150i | 0.9907 + 1.2238i | 0.9170 + 1.1772i |
| 17.5 | 0.9391 + 1.3812i | 0.8495 + 1.2161i | 0.9970 + 1.2255i | 0.9056 + 1.1802i |
| 18 | 0.9438 + 1.3828i | 0.8433 + 1.2138i | 1.0046 + 1.2199i | 0.8973 + 1.1788i |
| 18.5 | 1.1693 + 1.2798i | 1.1128 + 1.0938i | 1.3758 + 1.3185i | 1.1973 + 1.0256i |
| 19 | 1.1743 + 1.2715i | 1.1163 + 1.0948i | 1.3788 + 1.3352i | 1.2168 + 1.0183i |
| 19.5 | 1.2327 + 1.2807i | 1.1357 + 1.0702i | 1.2398 + 1.5594i | 1.2320 + 0.9996i |
| 20 | 0.6577 + 1.4430i | 0.7012 + 1.2781i | 0.8212 + 1.5008i | 0.8660 + 1.3198i |
| 20.5 | 0.9929 + 1.4515i | 0.9693 + 1.2162i | 0.9174 + 1.6990i | 1.0885 + 1.1841i |
| 21 | 0.9434 + 1.4728i | 0.9500 + 1.2899i | 0.9423 + 1.7074i | 0.9504 + 1.1268i |
| 21.5 | 0.8934 + 1.0735i | 0.8717 + 1.1114i | 0.9076 + 1.4446i | 0.9079 + 1.2674i |
| 22 | 0.9594 + 1.3673i | 0.9220 + 1.1877i | 0.9343 + 1.6326i | 1.0387 + 1.1184i |
| 22.5 | 0.8991 + 1.3062i | 0.8949 + 1.1654i | 1.0334 + 1.3983i | 1.0685 + 1.1889i |
| 23 | 0.8457 + 1.3352i | 0.8766 + 1.1938i | 1.0182 + 1.3610i | 1.0395 + 1.2129i |
| 23.5 | 0.8918 + 1.3385i | 0.8706 + 1.1982i | 0.8699 + 1.5126i | 1.0232 + 1.1858i |
| 24 | 0.9437 + 1.3080i | 0.8750 + 1.1648i | 0.9760 + 1.4721i | 1.0245 + 1.1502i |
| 24.5 | 0.9028 + 1.2861i | 0.9293 + 1.1520i | 0.8365 + 1.4219i | 1.0395 + 1.4368i |
| 25 | 0.8829 + 1.2606i | 0.9138 + 1.1340i | 0.8454 + 1.3942i | 1.0180 + 1.3974i |
| 25.5 | 0.7345 + 1.4935i | 0.9225 + 1.1907i | 0.8959 + 1.4840i | 0.9694 + 1.3246i |
| 26 | 0.8946 + 1.3593i | 0.9389 + 1.2209i | 1.0235 + 1.4279i | 1.1745 + 1.3460i |
| 26.5 | 0.8398 + 1.2923i | 0.9326 + 1.1801i | 0.9612 + 1.3780i | 1.0603 + 1.2681i |
| 27 | 0.8712 + 1.2714i | 0.9051 + 1.1465i | 0.8569 + 1.4350i | 1.1634 + 1.3187i |

-continued

| | | | | |
|---|---|---|---|---|
| 27.5 | 0.8145 + 1.3026i | 0.8485 + 1.1849i | 0.7985 + 1.4488i | 1.1193 + 1.2690i |
| 28 | 0.9261 + 1.2557i | 0.9064 + 1.1434i | 0.8489 + 1.3711i | 1.1138 + 1.2723i |

| SNR/w | w12 | w13 | w14 | w15 |
|---|---|---|---|---|
| 7 | 0.6203 + 1.1269i | 0.5879 + 1.0807i | 0.3664 + 1.2524i | 0.3587 + 1.1911i |
| 7.5 | 0.6229 + 1.0763i | 0.6321 + 1.0878i | 0.3243 + 1.2106i | 0.3243 + 1.2106i |
| 8 | 0.6782 + 1.1122i | 0.6782 + 1.1122i | 0.6782 + 1.1122i | 0.6782 + 1.1122i |
| 8.5 | 0.5891 + 0.9828i | 0.5891 + 0.9828i | 0.5891 + 0.9828i | 0.5891 + 0.9828i |
| 9 | 1.4130 + 0.2910i | 1.3541 + 0.2851i | 1.3541 + 0.2851i | 1.3541 + 0.2851i |
| 9.5 | 1.4155 + 0.2850i | 1.4155 + 0.2850i | 1.4155 + 0.2850i | 1.3603 + 0.2772i |
| 10 | 1.4442 + 0.2855i | 1.3999 + 0.2768i | 1.3999 + 0.2768i | 1.3999 + 0.2768i |
| 10.5 | 1.4218 + 0.2924i | 1.3860 + 0.2687i | 1.4573 + 0.2727i | 1.3860 + 0.2687i |
| 11 | 0.3240 + 1.5996i | 0.3139 + 1.5353i | 0.2481 + 1.6183i | 0.2508 + 1.5412i |
| 11.5 | 0.3318 + 1.5889i | 0.3211 + 1.5250i | 0.2441 + 1.6117i | 0.2476 + 1.5333i |
| 12 | 0.3402 + 1.5829i | 0.3241 + 1.5142i | 0.2375 + 1.6120i | 0.2398 + 1.5271i |
| 12.5 | 0.3253 + 1.5363i | 0.3253 + 1.5363i | 0.5495 + 1.5637i | 0.4968 + 1.5173i |
| 13 | 1.4954 + 0.3520i | 1.4954 + 0.3520i | 1.5164 + 0.4919i | 1.4763 + 0.4841i |
| 13.5 | 0.3267 + 1.5289i | 0.3267 + 1.5289i | 0.5457 + 1.6384i | 0.4754 + 1.5699i |
| 14 | 0.4746 + 1.3690i | 0.4232 + 1.4126i | 0.5659 + 1.3830i | 0.5277 + 1.4369i |
| 14.5 | 0.5001 + 1.3385i | 0.4346 + 1.4163i | 0.5932 + 1.3889i | 0.5460 + 1.4894i |
| 15 | 0.9055 + 1.0616i | 0.8665 + 1.1704i | 0.9034 + 1.0402i | 0.8738 + 1.1071i |
| 15.5 | 0.9231 + 1.2709i | 0.8160 + 1.2862i | 0.9126 + 1.2412i | 0.8126 + 1.2668i |
| 16 | 0.9718 + 1.0622i | 0.9278 + 1.1107i | 0.9134 + 1.0069i | 0.8947 + 1.0639i |
| 16.5 | 0.8953 + 0.9296i | 0.8826 + 0.9589i | 0.9598 + 0.9439i | 0.9383 + 0.9662i |
| 17 | 0.8927 + 0.9249i | 0.8786 + 0.9565i | 0.9605 + 0.9419i | 0.9339 + 0.9669i |
| 17.5 | 0.8919 + 0.9238i | 0.8751 + 0.9580i | 0.9650 + 0.9445i | 0.9298 + 0.9718i |
| 18 | 0.8923 + 0.9236i | 0.8728 + 0.9592i | 0.9729 + 0.9487i | 0.9271 + 0.9762i |
| 18.5 | 0.9845 + 0.7965i | 1.0167 + 0.8742i | 1.0414 + 0.7718i | 1.0742 + 0.8464i |
| 19 | 0.9937 + 0.7969i | 1.0293 + 0.8865i | 1.0541 + 0.7706i | 1.0917 + 0.8547i |
| 19.5 | 1.0121 + 0.7959i | 1.0506 + 0.8804i | 1.0895 + 0.7549i | 1.1392 + 0.8268i |
| 20 | 0.8139 + 1.0062i | 0.7661 + 1.1278i | 0.8943 + 1.0255i | 0.8877 + 1.1417i |
| 20.5 | 0.9646 + 0.8840i | 0.9671 + 1.0103i | 1.0896 + 0.8706i | 1.0906 + 1.0064i |
| 21 | 0.9076 + 0.8486i | 0.8989 + 0.9010i | 1.0276 + 0.8623i | 0.9660 + 0.9752i |
| 21.5 | 0.8877 + 0.9231i | 0.8877 + 0.9231i | 1.0506 + 0.9108i | 1.0442 + 0.9272i |
| 22 | 0.8615 + 0.8877i | 0.8791 + 1.0284i | 0.9391 + 0.8804i | 1.0097 + 0.9542i |
| 22.5 | 0.9101 + 0.9127i | 0.9056 + 1.0351i | 1.0634 + 0.9074i | 1.0737 + 1.0418i |
| 23 | 0.9092 + 0.9223i | 0.9015 + 1.0480i | 1.0580 + 0.9038i | 1.0534 + 1.0422i |
| 23.5 | 0.8968 + 0.9242i | 0.8841 + 1.0548i | 1.0408 + 0.9107i | 1.0278 + 1.0448i |
| 24 | 0.8778 + 0.9006i | 0.8693 + 1.0265i | 1.0051 + 0.8991i | 1.0075 + 1.0190i |
| 24.5 | 1.0384 + 1.0284i | 0.9141 + 1.0040i | 1.0741 + 0.9112i | 0.9432 + 0.8972i |
| 25 | 1.0318 + 1.0219i | 0.9035 + 0.9954i | 1.0712 + 0.9074i | 0.9395 + 0.8888i |
| 25.5 | 0.9279 + 0.9107i | 1.0693 + 1.1756i | 1.0319 + 0.9222i | 1.0107 + 1.0471i |
| 26 | 1.0293 + 0.8852i | 0.9361 + 0.9368i | 1.1008 + 0.9458i | 1.0205 + 1.0570i |
| 26.5 | 1.0358 + 0.8637i | 0.9582 + 0.9419i | 1.1285 + 0.8265i | 1.0066 + 1.0375i |
| 27 | 1.0441 + 0.9494i | 0.9580 + 1.0356i | 1.1718 + 0.9809i | 0.9066 + 0.9385i |
| 27.5 | 1.1199 + 0.7168i | 0.8978 + 1.0853i | 1.0728 + 0.9252i | 0.9727 + 0.9570i |
| 28 | 1.1308 + 0.8070i | 0.9002 + 1.0336i | 1.1114 + 0.9086i | 0.8336 + 0.9681i |

| SNR/w | w16 | w17 | w18 | w19 |
|---|---|---|---|---|
| 7 | 0.6834 + 1.2111i | 0.6203 + 1.1269i | 0.3795 + 1.3685i | 0.3664 + 1.2524i |
| 7.5 | 0.6871 + 1.1551i | 0.7107 + 1.1845i | 0.3340 + 1.3132i | 0.3394 + 1.3455i |
| 8 | 0.3053 + 1.2660i | 0.3053 + 1.2660i | 0.3053 + 1.2660i | 0.3053 + 1.2660i |
| 8.5 | 0.2955 + 1.3421i | 0.2955 + 1.3421i | 0.2955 + 1.3421i | 0.2955 + 1.3421i |
| 9 | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i |
| 10 | 1.0164 + 0.2442i | 1.0164 + 0.2442i | 1.0164 + 0.2442i | 1.0164 + 0.2442i |
| 10.5 | 1.0031 + 0.2326i | 1.0031 + 0.2326i | 1.0031 + 0.2326i | 1.0031 + 0.2326i |
| 11 | 0.8209 + 1.1647i | 0.8631 + 1.1979i | 0.8476 + 1.1522i | 0.9045 + 1.1940i |
| 11.5 | 0.8190 + 1.1650i | 0.8549 + 1.2031i | 0.8518 + 1.1493i | 0.9105 + 1.1942i |
| 12 | 0.8205 + 1.1674i | 0.8519 + 1.2156i | 0.8575 + 1.1454i | 0.9208 + 1.1932i |
| 12.5 | 1.0349 + 1.1222i | 1.0575 + 1.1030i | 1.1779 + 1.3115i | 1.3201 + 1.2209i |
| 13 | 1.0794 + 0.1887i | 1.0794 + 0.1887i | 1.0461 + 0.2119i | 1.0461 + 0.2119i |
| 13.5 | 1.1489 + 1.1197i | 1.3661 + 1.0778i | 1.1464 + 1.2789i | 1.3152 + 1.1853i |
| 14 | 1.1284 + 1.1433i | 1.0498 + 1.0225i | 1.0822 + 1.1063i | 1.0498 + 1.0225i |
| 14.5 | 1.1639 + 1.1492i | 1.0803 + 1.0201i | 1.1094 + 1.1262i | 1.0803 + 1.0201i |
| 15 | 1.3865 + 0.8444i | 1.3175 + 0.7494i | 1.2334 + 0.7081i | 1.2326 + 0.6778i |
| 15.5 | 1.2987 + 0.8102i | 1.2995 + 0.7667i | 1.2080 + 0.7457i | 1.2075 + 0.7166i |
| 16 | 1.2983 + 0.7167i | 1.3470 + 0.7459i | 1.2062 + 0.6208i | 1.2062 + 0.6208i |
| 16.5 | 1.4219 + 0.5556i | 1.4219 + 0.5556i | 1.2462 + 0.5855i | 1.2462 + 0.5855i |
| 17 | 1.4330 + 0.5504i | 1.4330 + 0.5504i | 1.2436 + 0.5789i | 1.2436 + 0.5789i |
| 17.5 | 1.4418 + 0.5395i | 1.4326 + 0.5576i | 1.2382 + 0.5741i | 1.2382 + 0.5741i |
| 18 | 1.4431 + 0.5367i | 1.4307 + 0.5570i | 1.2285 + 0.5660i | 1.2370 + 0.5724i |
| 18.5 | 1.3930 + 0.3640i | 1.3485 + 0.3893i | 1.1570 + 0.4271i | 1.1803 + 0.4223i |
| 19 | 1.3739 + 0.3510i | 1.3309 + 0.3746i | 1.1467 + 0.4140i | 1.1679 + 0.4096i |
| 19.5 | 1.3536 + 0.3475i | 1.2950 + 0.3231i | 1.1495 + 0.3917i | 1.1495 + 0.3917i |
| 20 | 1.7660 + 0.7375i | 1.4962 + 0.6907i | 1.2173 + 0.6961i | 1.2519 + 0.6976i |
| 20.5 | 1.4038 + 0.4647i | 1.3690 + 0.4405i | 1.1991 + 0.4770i | 1.1991 + 0.4770i |

-continued

| | | | | |
|---|---|---|---|---|
| 21 | 1.4522 + 0.5679i | 1.6057 + 0.5378i | 1.3175 + 0.5452i | 1.1940 + 0.5550i |
| 21.5 | 1.4604 + 0.5935i | 1.7875 + 0.3980i | 1.2674 + 0.5839i | 1.7463 + 0.6216i |
| 22 | 1.4439 + 0.5853i | 1.6108 + 0.5303i | 1.3004 + 0.5868i | 1.1846 + 0.5909i |
| 22.5 | 1.5607 + 0.5647i | 1.7514 + 0.6378i | 1.1625 + 0.5397i | 1.2356 + 0.5517i |
| 23 | 1.6061 + 0.5652i | 1.8194 + 0.5891i | 1.1596 + 0.5779i | 1.2454 + 0.5628i |
| 23.5 | 1.2583 + 0.6069i | 1.7469 + 0.5762i | 1.1684 + 0.6129i | 1.5785 + 0.4968i |
| 24 | 1.3854 + 0.6727i | 1.2630 + 0.5854i | 1.2543 + 0.7381i | 1.1484 + 0.5860i |
| 24.5 | 1.1699 + 0.6085i | 1.6812 + 0.6256i | 1.1989 + 0.6932i | 1.5850 + 0.4763i |
| 25 | 1.2811 + 0.6537i | 1.5886 + 0.4923i | 1.1525 + 0.6181i | 1.7297 + 0.3433i |
| 25.5 | 1.4469 + 0.5411i | 1.3690 + 0.6538i | 1.3128 + 0.5092i | 1.2090 + 0.5803i |
| 26 | 1.4116 + 0.5752i | 1.5736 + 0.6220i | 1.1918 + 0.6209i | 1.5623 + 0.4562i |
| 26.5 | 1.5874 + 0.4394i | 1.5767 + 0.6137i | 1.1624 + 0.5760i | 1.2819 + 0.5439i |
| 27 | 1.5345 + 0.4449i | 1.5144 + 0.5973i | 1.2543 + 0.5426i | 1.3709 + 0.5896i |
| 27.5 | 1.4370 + 0.4627i | 1.4958 + 0.5797i | 1.2388 + 0.5368i | 1.3470 + 0.5780i |
| 28 | 1.5172 + 0.4779i | 1.4228 + 0.5698i | 1.2002 + 0.5259i | 1.2996 + 0.5704i |

| SNR/w | w20 | w21 | w22 | w23 |
|---|---|---|---|---|
| 7 | 0.6203 + 1.1269i | 0.5879 + 1.0807i | 0.3664 + 1.2524i | 0.3587 + 1.1911i |
| 7.5 | 0.6229 + 1.0763i | 0.6229 + 1.0763i | 0.3243 + 1.2106i | 0.3243 + 1.2106i |
| 8 | 0.6782 + 1.1122i | 0.6782 + 1.1122i | 0.6782 + 1.1122i | 0.6782 + 1.1122i |
| 8.5 | 0.7434 + 1.1699i | 0.7434 + 1.1699i | 0.7434 + 1.1699i | 0.7434 + 1.1699i |
| 9 | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i |
| 10 | 1.0164 + 0.2442i | 1.0164 + 0.2442i | 1.0164 + 0.2442i | 1.0164 + 0.2442i |
| 10.5 | 1.0031 + 0.2326i | 1.0031 + 0.2326i | 1.0031 + 0.2326i | 1.0031 + 0.2326i |
| 11 | 0.8352 + 1.2130i | 0.8916 + 1.2840i | 0.8631 + 1.1979i | 0.9532 + 1.2725i |
| 11.5 | 0.8549 + 1.2031i | 0.8940 + 1.2944i | 0.8549 + 1.2031i | 0.9695 + 1.2795i |
| 12 | 0.8519 + 1.2156i | 0.9156 + 1.3204i | 0.8862 + 1.1870i | 1.0082 + 1.2910i |
| 12.5 | 0.8168 + 1.1703i | 0.8081 + 1.1502i | 0.8190 + 1.2572i | 0.7967 + 1.2204i |
| 13 | 1.1379 + 0.1590i | 1.1379 + 0.1590i | 1.0794 + 0.1887i | 1.0794 + 0.1887i |
| 13.5 | 0.8070 + 1.1957i | 0.7685 + 1.1750i | 0.8426 + 1.2622i | 0.7882 + 1.2129i |
| 14 | 0.7910 + 1.1369i | 0.7773 + 1.1014i | 0.8015 + 1.1742i | 0.7910 + 1.1369i |
| 14.5 | 0.7981 + 1.1326i | 0.7835 + 1.0949i | 0.8181 + 1.1797i | 0.7981 + 1.1326i |
| 15 | 1.1515 + 0.8590i | 1.1372 + 0.8042i | 1.1030 + 0.8243i | 1.1126 + 0.7761i |
| 15.5 | 1.0197 + 0.8347i | 0.9995 + 0.8192i | 1.0227 + 0.8236i | 1.0064 + 0.8103i |
| 16 | 1.0914 + 0.7539i | 1.0914 + 0.7539i | 1.0638 + 0.7215i | 1.0638 + 0.7215i |
| 16.5 | 1.6092 + 0.6786i | 1.5059 + 0.7313i | 1.2179 + 0.7344i | 1.2443 + 0.7444i |
| 17 | 1.6365 + 0.6778i | 1.5001 + 0.7492i | 1.2113 + 0.7399i | 1.2434 + 0.7494i |
| 17.5 | 1.6542 + 0.6753i | 1.4909 + 0.7585i | 1.2045 + 0.7465i | 1.2417 + 0.7541i |
| 18 | 1.6573 + 0.6715i | 1.4814 + 0.7623i | 1.1998 + 0.7521i | 1.2414 + 0.7575i |
| 18.5 | 1.5455 + 0.4576i | 1.3962 + 0.5257i | 1.1551 + 0.5306i | 1.1835 + 0.5235i |
| 19 | 1.5317 + 0.4427i | 1.3896 + 0.5168i | 1.1598 + 0.5415i | 1.1880 + 0.5295i |
| 19.5 | 1.4933 + 0.4426i | 1.7116 + 0.5868i | 1.1818 + 0.5280i | 1.1608 + 0.5011i |
| 20 | 1.3547 + 0.9559i | 1.4932 + 0.8746i | 1.1716 + 0.9087i | 1.1490 + 0.8711i |
| 20.5 | 1.4531 + 0.6314i | 1.6329 + 0.5542i | 1.2411 + 0.6786i | 1.2092 + 0.6296i |
| 21 | 1.4469 + 0.7784i | 1.6981 + 0.7459i | 1.2631 + 0.7452i | 1.1908 + 0.6751i |
| 21.5 | 1.4419 + 0.7605i | 1.6376 + 0.8704i | 1.2514 + 0.7312i | 1.1983 + 0.7401i |
| 22 | 1.4889 + 0.7419i | 1.7240 + 0.7079i | 1.3086 + 0.7519i | 1.1714 + 0.7584i |
| 22.5 | 1.4933 + 0.7257i | 1.3820 + 0.6548i | 1.2027 + 0.7601i | 1.2562 + 0.6724i |
| 23 | 1.5850 + 0.7789i | 1.4301 + 0.6629i | 1.1633 + 0.7212i | 1.3024 + 0.6774i |
| 23.5 | 1.6073 + 0.8302i | 1.4743 + 0.6934i | 1.1800 + 0.7580i | 1.3289 + 0.7757i |
| 24 | 1.5471 + 0.7468i | 1.6867 + 0.5760i | 1.1344 + 0.7766i | 1.1028 + 0.6774i |
| 24.5 | 1.5370 + 0.8085i | 1.4838 + 0.6414i | 1.2190 + 0.8012i | 1.3611 + 0.7212i |
| 25 | 1.6454 + 0.6927i | 1.4737 + 0.6267i | 1.3158 + 0.8304i | 1.4511 + 0.7770i |
| 25.5 | 1.5706 + 0.6441i | 1.3251 + 0.7695i | 1.1678 + 0.8071i | 1.1961 + 0.6963i |
| 26 | 1.5497 + 0.8311i | 1.4238 + 0.7455i | 1.1749 + 0.7608i | 1.2959 + 0.7280i |
| 26.5 | 1.5158 + 0.8040i | 1.4253 + 0.6800i | 1.2447 + 0.7358i | 1.3051 + 0.6448i |
| 27 | 1.4385 + 0.7521i | 1.1966 + 0.7287i | 1.3082 + 0.8079i | 1.2925 + 0.6791i |
| 27.5 | 1.4133 + 0.8583i | 1.2565 + 0.6932i | 1.2710 + 0.8408i | 1.3720 + 0.7047i |
| 28 | 1.4031 + 0.8380i | 1.2168 + 0.6822i | 1.2773 + 0.8086i | 1.3336 + 0.6909i |

| SNR/w | w24 | w25 | w26 | w27 |
|---|---|---|---|---|
| 7 | 0.6203 + 1.1269i | 0.5879 + 1.0807i | 0.3664 + 1.2524i | 0.3587 + 1.1911i |
| 7.5 | 0.6229 + 1.0763i | 0.6229 + 1.0763i | 0.3243 + 1.2106i | 0.3243 + 1.2106i |
| 8 | 0.2956 + 1.1569i | 0.2956 + 1.1569i | 0.2956 + 1.1569i | 0.2956 + 1.1569i |
| 8.5 | 0.2755 + 1.1100i | 0.2755 + 1.1100i | 0.2755 + 1.1100i | 0.2755 + 1.1100i |
| 9 | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i |
| 10 | 1.0164 + 0.2442i | 1.0164 + 0.2442i | 1.0164 + 0.2442i | 1.0164 + 0.2442i |
| 10.5 | 1.0031 + 0.2326i | 1.0293 + 0.2313i | 1.0031 + 0.2326i | 1.0293 + 0.2313i |
| 11 | 0.7302 + 1.2048i | 0.7302 + 1.2048i | 0.7488 + 1.1658i | 0.7590 + 1.1929i |
| 11.5 | 0.7137 + 1.2023i | 0.7187 + 1.2368i | 0.7457 + 1.1655i | 0.7536 + 1.1934i |
| 12 | 0.6924 + 1.2241i | 0.6952 + 1.2615i | 0.7337 + 1.1858i | 0.7337 + 1.1858i |
| 12.5 | 0.9604 + 1.0447i | 0.9604 + 1.0447i | 0.9810 + 1.0802i | 0.9810 + 1.0802i |
| 13 | 1.1056 + 0.2714i | 1.1056 + 0.2714i | 1.0741 + 0.2873i | 1.0741 + 0.2873i |
| 13.5 | 0.9715 + 0.9809i | 0.9715 + 0.9809i | 0.9715 + 0.9809i | 0.9715 + 0.9809i |
| 14 | 0.9635 + 0.9170i | 0.9635 + 0.9170i | 0.9635 + 0.9170i | 0.9635 + 0.9170i |

-continued

| | | | | |
|---|---|---|---|---|
| 14.5 | 0.9763 + 0.8886i | 0.9763 + 0.8886i | 0.9763 + 0.8886i | 0.9763 + 0.8886i |
| 15 | 0.9975 + 0.6035i | 0.9975 + 0.6035i | 1.0268 + 0.6029i | 1.0268 + 0.6029i |
| 15.5 | 0.9962 + 0.5714i | 0.9962 + 0.5714i | 1.0275 + 0.5734i | 1.0275 + 0.5734i |
| 16 | 0.9553 + 0.5302i | 0.9553 + 0.5302i | 0.9922 + 0.5305i | 0.9922 + 0.5305i |
| 16.5 | 0.9292 + 0.5928i | 0.9292 + 0.5928i | 0.9946 + 0.5942i | 0.9946 + 0.5942i |
| 17 | 0.9244 + 0.5890i | 0.9244 + 0.5890i | 0.9955 + 0.5891i | 0.9955 + 0.5891i |
| 17.5 | 0.9226 + 0.5846i | 0.9226 + 0.5846i | 0.9985 + 0.5838i | 0.9985 + 0.5838i |
| 18 | 0.9216 + 0.5798i | 0.9216 + 0.5798i | 1.0034 + 0.5785i | 1.0034 + 0.5785i |
| 18.5 | 0.8679 + 0.5021i | 0.8679 + 0.5021i | 0.9292 + 0.4862i | 0.9292 + 0.4862i |
| 19 | 0.8747 + 0.4890i | 0.8747 + 0.4890i | 0.9383 + 0.4703i | 0.9383 + 0.4703i |
| 19.5 | 0.8811 + 0.4849i | 0.8811 + 0.4849i | 0.9429 + 0.4612i | 0.9429 + 0.4612i |
| 20 | 0.9236 + 0.6522i | 0.9236 + 0.6522i | 1.0425 + 0.6633i | 1.0275 + 0.6768i |
| 20.5 | 0.9223 + 0.5412i | 0.9223 + 0.5412i | 1.0283 + 0.5133i | 1.0283 + 0.5133i |
| 21 | 0.8935 + 0.5656i | 0.8935 + 0.5656i | 0.9979 + 0.5557i | 1.0380 + 0.5582i |
| 21.5 | 0.9084 + 0.5872i | 0.9084 + 0.5872i | 1.0628 + 0.5825i | 1.0458 + 0.5901i |
| 22 | 0.8887 + 0.5713i | 0.8887 + 0.5713i | 1.0106 + 0.5766i | 1.0532 + 0.5907i |
| 22.5 | 0.8932 + 0.5737i | 0.9001 + 0.5987i | 1.0483 + 0.5684i | 1.0223 + 0.6001i |
| 23 | 0.8951 + 0.5381i | 0.9020 + 0.5765i | 1.0480 + 0.5500i | 1.0052 + 0.5823i |
| 23.5 | 0.8979 + 0.5389i | 0.9021 + 0.5899i | 1.0570 + 0.5654i | 1.0095 + 0.5968i |
| 24 | 0.8946 + 0.5174i | 0.8865 + 0.5769i | 0.9939 + 0.5077i | 1.0334 + 0.5527i |
| 24.5 | 1.0545 + 0.6208i | 0.8992 + 0.5849i | 1.0410 + 0.5398i | 0.9570 + 0.5335i |
| 25 | 0.8835 + 0.5791i | 0.8749 + 0.6592i | 1.0400 + 0.6364i | 0.9662 + 0.6804i |
| 25.5 | 0.9398 + 0.5123i | 0.9446 + 0.5967i | 1.0491 + 0.4947i | 1.0814 + 0.5792i |
| 26 | 1.0266 + 0.5732i | 0.9271 + 0.6038i | 1.0759 + 0.6299i | 0.9204 + 0.6524i |
| 26.5 | 1.0181 + 0.6445i | 0.9222 + 0.6468i | 1.0522 + 0.5581i | 0.9366 + 0.5502i |
| 27 | 1.0119 + 0.5802i | 0.9632 + 0.6574i | 1.1374 + 0.5920i | 1.0660 + 0.6825i |
| 27.5 | 1.1048 + 0.5047i | 0.9732 + 0.6687i | 1.1360 + 0.5830i | 1.0261 + 0.6028i |
| 28 | 1.0788 + 0.4957i | 0.9727 + 0.6831i | 1.1083 + 0.5853i | 1.0158 + 0.6073i |

| SNR/w | w28 | w29 | w30 | w31 |
|---|---|---|---|---|
| 7 | 0.5879 + 1.0807i | 0.5639 + 1.0452i | 0.3587 + 1.1911i | 0.3527 + 1.1449i |
| 7.5 | 0.5841 + 1.0273i | 0.5841 + 1.0273i | 0.3172 + 1.1461i | 0.3172 + 1.1461i |
| 8 | 0.6067 + 1.0261i | 0.6067 + 1.0261i | 0.6067 + 1.0261i | 0.6067 + 1.0261i |
| 8.5 | 0.5891 + 0.9828i | 0.5891 + 0.9828i | 0.5891 + 0.9828i | 0.5891 + 0.9828i |
| 9 | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i |
| 10 | 1.0164 + 0.2442i | 1.0164 + 0.2442i | 1.0164 + 0.2442i | 1.0382 + 0.2450i |
| 10.5 | 1.0031 + 0.2326i | 1.0293 + 0.2313i | 1.0031 + 0.2326i | 1.0293 + 0.2313i |
| 11 | 0.7253 + 1.2394i | 0.7446 + 1.2677i | 0.7590 + 1.1929i | 0.7753 + 1.2277i |
| 11.5 | 0.7187 + 1.2368i | 0.7308 + 1.2798i | 0.7536 + 1.1934i | 0.7681 + 1.2301i |
| 12 | 0.6952 + 1.2615i | 0.7079 + 1.3063i | 0.7325 + 1.2081i | 0.7461 + 1.2415i |
| 12.5 | 0.8312 + 1.1010i | 0.8312 + 1.1010i | 0.8168 + 1.1703i | 0.8081 + 1.1502i |
| 13 | 1.1622 + 0.2335i | 1.1622 + 0.2335i | 1.1096 + 0.2493i | 1.1056 + 0.2714i |
| 13.5 | 0.8534 + 1.0513i | 0.8534 + 1.0513i | 0.8534 + 1.0513i | 0.8375 + 1.0599i |
| 14 | 0.7713 + 1.0701i | 0.7757 + 1.0506i | 0.7773 + 1.1014i | 0.7713 + 1.0701i |
| 14.5 | 0.7653 + 1.0721i | 0.7855 + 1.0474i | 0.7835 + 1.0949i | 0.7855 + 1.0474i |
| 15 | 0.9769 + 0.7204i | 0.9891 + 0.6850i | 0.9769 + 0.7204i | 0.9891 + 0.6850i |
| 15.5 | 0.9712 + 0.6224i | 0.9712 + 0.6224i | 0.9889 + 0.6205i | 0.9889 + 0.6205i |
| 16 | 0.9525 + 0.5999i | 0.9525 + 0.5999i | 0.9722 + 0.5994i | 0.9722 + 0.5994i |
| 16.5 | 0.9211 + 0.6843i | 0.9211 + 0.6843i | 0.9838 + 0.6926i | 0.9838 + 0.6926i |
| 17 | 0.9162 + 0.6919i | 0.9162 + 0.6919i | 0.9842 + 0.6988i | 0.9842 + 0.6988i |
| 17.5 | 0.9135 + 0.7046i | 0.9135 + 0.7046i | 0.9860 + 0.7101i | 0.9860 + 0.7101i |
| 18 | 0.9135 + 0.7246i | 0.9105 + 0.7117i | 0.9949 + 0.7304i | 0.9857 + 0.7145i |
| 18.5 | 0.9128 + 0.6119i | 0.9005 + 0.5846i | 0.9747 + 0.5858i | 0.9613 + 0.5607i |
| 19 | 0.9282 + 0.6231i | 0.9148 + 0.5935i | 0.9892 + 0.5958i | 0.9748 + 0.5681i |
| 19.5 | 0.9477 + 0.6399i | 0.9358 + 0.6096i | 1.0163 + 0.6040i | 1.0042 + 0.5748i |
| 20 | 0.8720 + 0.8422i | 0.8881 + 0.8007i | 0.9559 + 0.8772i | 0.9855 + 0.8360i |
| 20.5 | 0.9508 + 0.7322i | 0.9459 + 0.6833i | 1.0638 + 0.7179i | 1.0587 + 0.6626i |
| 21 | 0.9006 + 0.7223i | 0.8935 + 0.7037i | 1.0274 + 0.7211i | 1.0515 + 0.6813i |
| 21.5 | 0.8996 + 0.7455i | 0.8996 + 0.7455i | 1.0446 + 0.7454i | 1.0526 + 0.7376i |
| 22 | 0.8774 + 0.7307i | 0.8698 + 0.6919i | 0.9792 + 0.7557i | 1.0444 + 0.7361i |
| 22.5 | 0.9017 + 0.7879i | 0.9044 + 0.7215i | 1.0636 + 0.7751i | 1.0312 + 0.7129i |
| 23 | 0.9122 + 0.8113i | 0.8977 + 0.7054i | 1.0333 + 0.7739i | 0.9929 + 0.6941i |
| 23.5 | 0.8981 + 0.7978i | 0.9002 + 0.7040i | 1.0453 + 0.7856i | 1.0004 + 0.7110i |
| 24 | 0.8883 + 0.7796i | 0.8934 + 0.6762i | 0.9999 + 0.7892i | 1.0024 + 0.6743i |
| 24.5 | 1.0118 + 0.6978i | 0.9039 + 0.7061i | 1.0649 + 0.7904i | 0.9378 + 0.8081i |
| 25 | 1.1689 + 0.7806i | 0.8574 + 0.7588i | 1.0682 + 0.7758i | 0.9493 + 0.7863i |
| 25.5 | 0.9376 + 0.7957i | 0.9469 + 0.6888i | 1.0478 + 0.7966i | 1.0645 + 0.6841i |
| 26 | 1.0128 + 0.7985i | 0.9004 + 0.8291i | 1.0612 + 0.7235i | 0.9050 + 0.7337i |
| 26.5 | 1.0179 + 0.7432i | 0.9097 + 0.7340i | 1.1323 + 0.7123i | 0.9024 + 0.8172i |
| 27 | 1.0530 + 0.8275i | 0.9525 + 0.7602i | 1.1564 + 0.8642i | 0.9247 + 0.8497i |
| 27.5 | 1.0533 + 0.7823i | 0.9559 + 0.7668i | 1.1523 + 0.8406i | 0.9478 + 0.8579i |
| 28 | 1.0912 + 0.7187i | 0.9908 + 0.7740i | 1.0145 + 0.8889i | 0.9211 + 0.9015i |

| SNR/w | w32 | w33 | w34 | w35 |
|---|---|---|---|---|
| 7 | 0.6834 + 1.2111i | 0.6203 + 1.1269i | 0.3795 + 1.3685i | 0.3664 + 1.2524i |
| 7.5 | 0.6871 + 1.1551i | 0.7107 + 1.1845i | 0.3340 + 1.3132i | 0.3394 + 1.3455i |

-continued

| | | | | |
|---|---|---|---|---|
| 8 | 0.3053 + 1.2660i | 0.3053 + 1.2660i | 0.3053 + 1.2660i | 0.3053 + 1.2660i |
| 8.5 | 0.2955 + 1.3421i | 0.2955 + 1.3421i | 0.2955 + 1.3421i | 0.2955 + 1.3421i |
| 9 | 1.7494 + 1.1716i | 1.3087 + 0.8633i | 1.3087 + 0.8633i | 1.2190 + 0.7954i |
| 9.5 | 1.7496 + 1.1695i | 1.3032 + 0.8658i | 1.3032 + 0.8658i | 1.2262 + 0.8104i |
| 10 | 1.7476 + 1.1668i | 1.2968 + 0.8651i | 1.2968 + 0.8651i | 1.2277 + 0.8183i |
| 10.5 | 1.6826 + 1.1762i | 1.2393 + 0.8297i | 1.3288 + 0.9046i | 1.1987 + 0.8027i |
| 11 | 0.2043 + 0.9827i | 0.2043 + 0.9827i | 0.2043 + 0.9827i | 0.2043 + 0.9827i |
| 11.5 | 0.1944 + 0.9833i | 0.1944 + 0.9833i | 0.1944 + 0.9833i | 0.1944 + 0.9833i |
| 12 | 0.1843 + 0.9833i | 0.1843 + 0.9833i | 0.1843 + 0.9833i | 0.1843 + 0.9833i |
| 12.5 | 0.1863 + 1.0692i | 0.1863 + 1.0692i | 0.2022 + 1.0451i | 0.2022 + 1.0451i |
| 13 | 1.0982 + 1.2299i | 1.1688 + 1.2296i | 1.1143 + 1.0869i | 1.2060 + 1.1004i |
| 13.5 | 0.2092 + 1.0869i | 0.2092 + 1.0869i | 0.2194 + 1.0533i | 0.2194 + 1.0533i |
| 14 | 0.1509 + 1.1139i | 0.1370 + 1.1552i | 0.1619 + 1.0634i | 0.1619 + 1.0634i |
| 14.5 | 0.1449 + 1.1327i | 0.1306 + 1.1877i | 0.1503 + 1.0734i | 0.1416 + 1.0974i |
| 15 | 0.1591 + 1.5394i | 0.4955 + 1.3775i | 0.2019 + 1.5174i | 0.4551 + 1.3944i |
| 15.5 | 0.1274 + 1.6424i | 0.2983 + 1.5080i | 0.1465 + 1.6140i | 0.3069 + 1.5179i |
| 16 | 0.3712 + 1.7894i | 0.5775 + 1.3833i | 0.5311 + 1.7286i | 0.5825 + 1.4596i |
| 16.5 | 0.9790 + 1.7611i | 0.5632 + 1.2042i | 0.6550 + 1.8625i | 0.5632 + 1.2042i |
| 17 | 0.9719 + 1.7576i | 0.5632 + 1.2036i | 0.6484 + 1.8669i | 0.5632 + 1.2036i |
| 17.5 | 0.9596 + 1.7576i | 0.5628 + 1.2012i | 0.6359 + 1.8638i | 0.5628 + 1.2012i |
| 18 | 0.9565 + 1.7467i | 0.5597 + 1.1973i | 0.6376 + 1.8550i | 0.5597 + 1.1973i |
| 18.5 | 0.8180 + 1.4853i | 0.7467 + 1.2574i | 0.8969 + 1.7495i | 0.7299 + 1.1971i |
| 19 | 0.8131 + 1.4757i | 0.7498 + 1.2637i | 0.8853 + 1.7279i | 0.7348 + 1.1948i |
| 19.5 | 0.8222 + 1.7689i | 0.7329 + 1.2092i | 0.7753 + 1.4943i | 0.7495 + 1.2497i |
| 20 | 0.5491 + 1.7035i | 0.4164 + 1.1274i | 0.3416 + 1.3191i | 0.4000 + 1.1739i |
| 20.5 | 0.5496 + 1.8328i | 0.5969 + 1.1973i | 0.5741 + 1.4423i | 0.6003 + 1.2412i |
| 21 | 0.5908 + 1.4191i | 0.6104 + 1.2526i | 0.4486 + 1.8391i | 0.6140 + 1.1685i |
| 21.5 | 0.5651 + 1.6424i | 0.5819 + 1.1504i | 0.5713 + 1.4458i | 0.5849 + 1.2696i |
| 22 | 0.6243 + 1.4649i | 0.5939 + 1.3037i | 0.4047 + 1.8156i | 0.5830 + 1.2010i |
| 22.5 | 0.6526 + 1.7382i | 0.5201 + 1.1584i | 0.5875 + 1.5167i | 0.5606 + 1.2579i |
| 23 | 0.6244 + 1.6853i | 0.5396 + 1.1646i | 0.5897 + 1.4912i | 0.5627 + 1.2896i |
| 23.5 | 0.5088 + 1.7163i | 0.5473 + 1.1551i | 0.5636 + 1.4803i | 0.5544 + 1.2433i |
| 24 | 0.6364 + 1.6353i | 0.5959 + 1.1661i | 0.6239 + 1.4562i | 0.6065 + 1.3009i |
| 24.5 | 0.6032 + 1.6635i | 0.5024 + 1.1613i | 0.6020 + 1.2960i | 0.5939 + 1.1667i |
| 25 | 0.6389 + 1.6546i | 0.4853 + 1.1426i | 0.5804 + 1.3364i | 0.5604 + 1.2030i |
| 25.5 | 0.5812 + 1.5932i | 0.5105 + 1.2487i | 0.5473 + 1.4117i | 0.5765 + 1.1450i |
| 26 | 0.4991 + 1.5686i | 0.5486 + 1.1925i | 0.6897 + 1.1182i | 0.6481 + 1.2195i |
| 26.5 | 0.5345 + 1.6138i | 0.5130 + 1.1337i | 0.6387 + 1.0936i | 0.5568 + 1.2390i |
| 27 | 0.4015 + 1.5842i | 0.5558 + 1.2016i | 0.6111 + 1.3403i | 0.6382 + 1.1360i |
| 27.5 | 0.4096 + 1.5974i | 0.5213 + 1.2084i | 0.5614 + 1.3474i | 0.6135 + 1.1429i |
| 28 | 0.4374 + 1.5965i | 0.6091 + 1.1608i | 0.5915 + 1.3566i | 0.6593 + 1.2473i |

| SNR/w | w36 | w37 | w38 | w39 |
|---|---|---|---|---|
| 7 | 0.6203 + 1.1269i | 0.5879 + 1.0807i | 0.3664 + 1.2524i | 0.3587 + 1.1911i |
| 7.5 | 0.6229 + 1.0763i | 0.6229 + 1.0763i | 0.3243 + 1.2106i | 0.3243 + 1.2106i |
| 8 | 0.6782 + 1.1122i | 0.6782 + 1.1122i | 0.6782 + 1.1122i | 0.6782 + 1.1122i |
| 8.5 | 0.7434 + 1.1699i | 0.7434 + 1.1699i | 0.7434 + 1.1699i | 0.7434 + 1.1699i |
| 9 | 1.3087 + 0.8633i | 1.2190 + 0.7954i | 1.2190 + 0.7954i | 1.1712 + 0.7580i |
| 9.5 | 1.3032 + 0.8658i | 1.2262 + 0.8104i | 1.2262 + 0.8104i | 1.1846 + 0.7800i |
| 10 | 1.2968 + 0.8651i | 1.2277 + 0.8183i | 1.2277 + 0.8183i | 1.1900 + 0.7931i |
| 10.5 | 1.2989 + 0.8614i | 1.1987 + 0.8027i | 1.2393 + 0.8297i | 1.1987 + 0.8027i |
| 11 | 0.2043 + 0.9827i | 0.2043 + 0.9827i | 0.2043 + 0.9827i | 0.2043 + 0.9827i |
| 11.5 | 0.1944 + 0.9833i | 0.1944 + 0.9833i | 0.1944 + 0.9833i | 0.1944 + 0.9833i |
| 12 | 0.1843 + 0.9833i | 0.1843 + 0.9833i | 0.1843 + 0.9833i | 0.1843 + 0.9833i |
| 12.5 | 0.2423 + 1.1255i | 0.2423 + 1.1255i | 0.2559 + 1.0868i | 0.2559 + 1.0868i |
| 13 | 0.9857 + 0.9531i | 0.9857 + 0.9531i | 0.9857 + 0.9531i | 1.0052 + 0.9448i |
| 13.5 | 0.3028 + 1.1187i | 0.3028 + 1.1187i | 0.3020 + 1.0794i | 0.3020 + 1.0794i |
| 14 | 0.3071 + 1.0781i | 0.3071 + 1.0781i | 0.3099 + 1.0456i | 0.3099 + 1.0456i |
| 14.5 | 0.3398 + 1.0875i | 0.3398 + 1.0875i | 0.3282 + 1.0466i | 0.3282 + 1.0466i |
| 15 | 0.6309 + 0.9869i | 0.6163 + 1.0795i | 0.6309 + 0.9869i | 0.6182 + 1.0532i |
| 15.5 | 0.6484 + 0.9762i | 0.6532 + 0.9960i | 0.6484 + 0.9762i | 0.6532 + 0.9960i |
| 16 | 0.6562 + 0.9352i | 0.6470 + 0.9934i | 0.6707 + 0.9278i | 0.6653 + 0.9679i |
| 16.5 | 0.5726 + 0.9159i | 0.5700 + 0.9781i | 0.5726 + 0.9159i | 0.5700 + 0.9781i |
| 17 | 0.5708 + 0.9120i | 0.5693 + 0.9768i | 0.5708 + 0.9120i | 0.5693 + 0.9768i |
| 17.5 | 0.5682 + 0.9084i | 0.5682 + 0.9765i | 0.5682 + 0.9084i | 0.5682 + 0.9765i |
| 18 | 0.5627 + 0.9080i | 0.5638 + 0.9795i | 0.5627 + 0.9080i | 0.5638 + 0.9795i |
| 18.5 | 0.6496 + 0.9248i | 0.6665 + 0.9821i | 0.6496 + 0.9248i | 0.6737 + 1.0037i |
| 19 | 0.6625 + 0.9215i | 0.6785 + 0.9845i | 0.6625 + 0.9215i | 0.6873 + 1.0091i |
| 19.5 | 0.6759 + 0.9245i | 0.6976 + 1.0138i | 0.6759 + 0.9245i | 0.6976 + 1.0138i |
| 20 | 0.5011 + 0.8954i | 0.4761 + 0.9710i | 0.5011 + 0.8954i | 0.4761 + 0.9710i |
| 20.5 | 0.6155 + 0.9153i | 0.6053 + 1.0278i | 0.6155 + 0.9153i | 0.6226 + 1.0166i |
| 21 | 0.5778 + 0.8980i | 0.5844 + 1.0085i | 0.5778 + 0.8980i | 0.5989 + 1.0366i |
| 21.5 | 0.5230 + 0.8818i | 0.5536 + 1.0212i | 0.5383 + 0.8832i | 0.5512 + 0.9689i |
| 22 | 0.5691 + 0.9002i | 0.5564 + 1.0225i | 0.5691 + 0.9002i | 0.5732 + 1.0495i |
| 22.5 | 0.5384 + 0.8854i | 0.5343 + 1.0408i | 0.5671 + 0.8932i | 0.5685 + 1.0088i |
| 23 | 0.5300 + 0.8893i | 0.5385 + 1.0557i | 0.5662 + 0.9004i | 0.5719 + 1.0071i |
| 23.5 | 0.5327 + 0.8892i | 0.5348 + 1.0466i | 0.5758 + 0.8987i | 0.5771 + 1.0111i |
| 24 | 0.5237 + 0.8675i | 0.5685 + 1.0623i | 0.5644 + 0.8873i | 0.5725 + 0.9911i |

-continued

| | | | | |
|---|---|---|---|---|
| 24.5 | 0.5099 + 0.9139i | 0.5036 + 1.0359i | 0.5855 + 0.9120i | 0.5903 + 1.0334i |
| 25 | 0.4874 + 0.9257i | 0.4845 + 1.0420i | 0.5645 + 0.9258i | 0.5744 + 1.0392i |
| 25.5 | 0.5751 + 0.8885i | 0.5696 + 0.9833i | 0.6604 + 0.8996i | 0.6267 + 1.0328i |
| 26 | 0.6050 + 0.9119i | 0.5370 + 0.9447i | 0.6526 + 1.0254i | 0.5772 + 1.0462i |
| 26.5 | 0.6269 + 0.8981i | 0.4851 + 1.0350i | 0.6143 + 0.9936i | 0.5184 + 0.9539i |
| 27 | 0.5330 + 0.8941i | 0.4820 + 1.1330i | 0.6037 + 0.9226i | 0.6160 + 1.0341i |
| 27.5 | 0.5637 + 0.8891i | 0.4831 + 1.1158i | 0.6283 + 0.9257i | 0.6504 + 1.0330i |
| 28 | 0.5376 + 0.9041i | 0.6008 + 1.0615i | 0.6254 + 0.8954i | 0.6315 + 0.9789i |

| SNR/w | w40 | w41 | w42 | w43 |
|---|---|---|---|---|
| 7 | 0.6203 + 1.1269i | 0.5879 + 1.0807i | 0.3664 + 1.2524i | 0.3587 + 1.1911i |
| 7.5 | 0.6229 + 1.0763i | 0.6229 + 1.0763i | 0.3243 + 1.2106i | 0.3243 + 1.2106i |
| 8 | 0.2956 + 1.1569i | 0.2956 + 1.1569i | 0.2956 + 1.1569i | 0.2956 + 1.1569i |
| 8.5 | 0.2755 + 1.1100i | 0.2755 + 1.1100i | 0.2755 + 1.1100i | 0.2755 + 1.1100i |
| 9 | 1.3087 + 0.8633i | 1.2190 + 0.7954i | 1.2190 + 0.7954i | 1.1712 + 0.7580i |
| 9.5 | 1.3032 + 0.8658i | 1.2262 + 0.8104i | 1.2262 + 0.8104i | 1.1846 + 0.7800i |
| 10 | 1.2968 + 0.8651i | 1.2277 + 0.8183i | 1.2277 + 0.8183i | 1.1900 + 0.7931i |
| 10.5 | 1.2393 + 0.8297i | 1.1987 + 0.8027i | 1.2393 + 0.8297i | 1.1745 + 0.7815i |
| 11 | 0.1932 + 1.0799i | 0.1932 + 1.0799i | 0.1932 + 1.0799i | 0.1932 + 1.0799i |
| 11.5 | 0.1889 + 1.0783i | 0.1889 + 1.0783i | 0.1889 + 1.0783i | 0.1889 + 1.0783i |
| 12 | 0.1847 + 1.0766i | 0.1847 + 1.0766i | 0.1847 + 1.0766i | 0.1847 + 1.0766i |
| 12.5 | 0.1663 + 1.1062i | 0.1663 + 1.1062i | 0.1863 + 1.0692i | 0.1863 + 1.0692i |
| 13 | 1.1262 + 0.8094i | 1.1262 + 0.8094i | 1.1733 + 0.8217i | 1.1733 + 0.8217i |
| 13.5 | 0.1493 + 1.1587i | 0.1493 + 1.1587i | 0.1688 + 1.0929i | 0.1688 + 1.0929i |
| 14 | 0.1509 + 1.1139i | 0.1370 + 1.1552i | 0.1619 + 1.0634i | 0.1557 + 1.0801i |
| 14.5 | 0.1449 + 1.1327i | 0.1306 + 1.1877i | 0.1503 + 1.0734i | 0.1416 + 1.0974i |
| 15 | 0.1729 + 1.6258i | 0.5301 + 1.4133i | 0.2360 + 1.5834i | 0.4835 + 1.4383i |
| 15.5 | 0.1783 + 2.0138i | 0.4786 + 1.4270i | 0.4591 + 1.9026i | 0.4793 + 1.4490i |
| 16 | 0.1615 + 1.9642i | 0.6491 + 1.3361i | 0.8166 + 1.8585i | 0.6677 + 1.3884i |
| 16.5 | 0.7602 + 1.4834i | 0.6457 + 1.2464i | 0.6704 + 1.5226i | 0.6234 + 1.2436i |
| 17 | 0.7674 + 1.4916i | 0.6480 + 1.2445i | 0.6589 + 1.5275i | 0.6222 + 1.2437i |
| 17.5 | 0.7728 + 1.4984i | 0.6519 + 1.2427i | 0.6465 + 1.5284i | 0.6233 + 1.2445i |
| 18 | 0.7831 + 1.4978i | 0.6594 + 1.2395i | 0.6418 + 1.5205i | 0.6278 + 1.2472i |
| 18.5 | 1.0099 + 1.3939i | 0.9240 + 1.1657i | 1.1966 + 1.6143i | 0.8847 + 1.1340i |
| 19 | 1.0089 + 1.3854i | 0.9317 + 1.1639i | 1.1714 + 1.6030i | 0.8884 + 1.1335i |
| 19.5 | 1.0472 + 1.3158i | 0.9601 + 1.1483i | 0.9672 + 1.4659i | 0.9033 + 1.1563i |
| 20 | 0.5008 + 1.4978i | 0.5599 + 1.2077i | 0.4017 + 1.3861i | 0.4910 + 1.2146i |
| 20.5 | 0.8136 + 1.4139i | 0.8016 + 1.2232i | 0.6965 + 1.5705i | 0.7525 + 1.2015i |
| 21 | 0.7412 + 1.4650i | 0.7761 + 1.2729i | 0.6892 + 1.6914i | 0.7846 + 1.1451i |
| 21.5 | 0.7899 + 1.6946i | 0.7179 + 1.1320i | 0.7344 + 1.4506i | 0.7296 + 1.2738i |
| 22 | 0.7843 + 1.4333i | 0.7705 + 1.2498i | 0.7026 + 1.7278i | 0.7003 + 1.1772i |
| 22.5 | 0.7634 + 1.3802i | 0.7514 + 1.1770i | 0.8230 + 1.5535i | 0.6680 + 1.2094i |
| 23 | 0.7407 + 1.4100i | 0.7168 + 1.1622i | 0.8274 + 1.5617i | 0.6629 + 1.2434i |
| 23.5 | 0.6960 + 1.6848i | 0.7272 + 1.1865i | 0.7086 + 1.4468i | 0.6649 + 1.2963i |
| 24 | 0.8224 + 1.6271i | 0.7310 + 1.1523i | 0.7840 + 1.4334i | 0.7347 + 1.2858i |
| 24.5 | 0.6380 + 1.4769i | 0.8075 + 1.1341i | 0.7223 + 1.3126i | 0.7056 + 1.1575i |
| 25 | 0.6810 + 1.4782i | 0.7864 + 1.1315i | 0.7113 + 1.3095i | 0.6760 + 1.1703i |
| 25.5 | 0.7834 + 1.3291i | 0.7989 + 1.1836i | 0.6586 + 1.3212i | 0.6790 + 1.1822i |
| 26 | 0.6326 + 1.5030i | 0.8468 + 1.1407i | 0.7209 + 1.3784i | 0.7653 + 1.2445i |
| 26.5 | 0.6623 + 1.5103i | 0.7938 + 1.1419i | 0.6742 + 1.3558i | 0.6837 + 1.2238i |
| 27 | 0.6819 + 1.4965i | 0.7875 + 1.1320i | 0.7367 + 1.3484i | 0.7100 + 1.2226i |
| 27.5 | 0.6106 + 1.5039i | 0.7463 + 1.1465i | 0.6780 + 1.3719i | 0.6672 + 1.2405i |
| 28 | 0.6738 + 1.4981i | 0.7958 + 1.1175i | 0.7244 + 1.3669i | 0.7701 + 1.2287i |

| SNR/w | w44 | w45 | w46 | w47 |
|---|---|---|---|---|
| 7 | 0.5879 + 1.0807i | 0.5639 + 1.0452i | 0.3587 + 1.1911i | 0.3527 + 1.1449i |
| 7.5 | 0.5841 + 1.0273i | 0.5841 + 1.0273i | 0.3172 + 1.1461i | 0.3172 + 1.1461i |
| 8 | 0.6067 + 1.0261i | 0.6067 + 1.0261i | 0.6067 + 1.0261i | 0.6067 + 1.0261i |
| 8.5 | 0.5891 + 0.9828i | 0.5891 + 0.9828i | 0.5891 + 0.9828i | 0.5891 + 0.9828i |
| 9 | 1.2190 + 0.7954i | 1.1712 + 0.7580i | 1.1712 + 0.7580i | 1.1712 + 0.7580i |
| 9.5 | 1.2262 + 0.8104i | 1.1846 + 0.7800i | 1.1846 + 0.7800i | 1.1846 + 0.7800i |
| 10 | 1.2277 + 0.8183i | 1.1900 + 0.7931i | 1.1900 + 0.7931i | 1.1900 + 0.7931i |
| 10.5 | 1.2393 + 0.8297i | 1.1745 + 0.7815i | 1.1987 + 0.8027i | 1.1745 + 0.7815i |
| 11 | 0.1932 + 1.0799i | 0.1932 + 1.0799i | 0.1932 + 1.0799i | 0.1932 + 1.0799i |
| 11.5 | 0.1889 + 1.0783i | 0.1889 + 1.0783i | 0.1889 + 1.0783i | 0.1889 + 1.0783i |
| 12 | 0.1847 + 1.0766i | 0.1847 + 1.0766i | 0.1847 + 1.0766i | 0.1847 + 1.0766i |
| 12.5 | 0.2130 + 1.1610i | 0.2130 + 1.1610i | 0.2342 + 1.1053i | 0.2342 + 1.1053i |
| 13 | 1.0310 + 0.8384i | 1.0310 + 0.8384i | 1.0310 + 0.8384i | 1.0615 + 0.8309i |
| 13.5 | 0.2304 + 1.1738i | 0.2304 + 1.1738i | 0.2452 + 1.1060i | 0.2452 + 1.1060i |
| 14 | 0.3071 + 1.0781i | 0.2999 + 1.1047i | 0.3099 + 1.0456i | 0.3071 + 1.0781i |
| 14.5 | 0.3398 + 1.0875i | 0.3322 + 1.1034i | 0.3282 + 1.0466i | 0.3282 + 1.0466i |
| 15 | 0.6591 + 0.9884i | 0.6402 + 1.0789i | 0.6591 + 0.9884i | 0.6440 + 1.0511i |
| 15.5 | 0.6150 + 1.0563i | 0.6104 + 1.1350i | 0.6150 + 1.0563i | 0.6104 + 1.1350i |
| 16 | 0.6653 + 0.9679i | 0.6648 + 1.0542i | 0.6824 + 0.9524i | 0.6765 + 1.0248i |
| 16.5 | 0.6561 + 0.9154i | 0.6510 + 0.9712i | 0.6561 + 0.9154i | 0.6510 + 0.9712i |
| 17 | 0.6691 + 0.9104i | 0.6658 + 0.9655i | 0.6484 + 0.9120i | 0.6467 + 0.9704i |
| 17.5 | 0.6755 + 0.9070i | 0.6746 + 0.9631i | 0.6527 + 0.9083i | 0.6539 + 0.9681i |

-continued

| | | | | |
|---|---|---|---|---|
| 18 | 0.6851 + 0.9061i | 0.6860 + 0.9628i | 0.6615 + 0.9070i | 0.6657 + 0.9671i |
| 18.5 | 0.8199 + 0.8642i | 0.8521 + 0.9294i | 0.8199 + 0.8642i | 0.8357 + 0.9478i |
| 19 | 0.8416 + 0.8560i | 0.8693 + 0.9355i | 0.8242 + 0.8659i | 0.8475 + 0.9550i |
| 19.5 | 0.8620 + 0.8605i | 0.8955 + 0.9529i | 0.8317 + 0.8718i | 0.8608 + 0.9652i |
| 20 | 0.6741 + 0.9583i | 0.6244 + 1.0551i | 0.6448 + 0.9428i | 0.6008 + 1.0207i |
| 20.5 | 0.8142 + 0.9002i | 0.8183 + 1.0236i | 0.7650 + 0.9052i | 0.7689 + 1.0279i |
| 21 | 0.7382 + 0.8775i | 0.7685 + 0.9477i | 0.7062 + 0.8840i | 0.7561 + 1.0136i |
| 21.5 | 0.7376 + 0.9029i | 0.7043 + 0.9821i | 0.6765 + 0.8832i | 0.6698 + 0.9341i |
| 22 | 0.7420 + 0.8972i | 0.7590 + 1.0320i | 0.7021 + 0.8941i | 0.7000 + 1.0561i |
| 22.5 | 0.7721 + 0.9026i | 0.7530 + 1.0356i | 0.6926 + 0.8983i | 0.6827 + 1.0183i |
| 23 | 0.7852 + 0.9095i | 0.7666 + 1.0370i | 0.6839 + 0.9059i | 0.6837 + 1.0019i |
| 23.5 | 0.7845 + 0.9168i | 0.7512 + 1.0593i | 0.6918 + 0.9051i | 0.6794 + 1.0148i |
| 24 | 0.7779 + 0.8837i | 0.7423 + 1.0272i | 0.6821 + 0.8793i | 0.6766 + 0.9745i |
| 24.5 | 0.7675 + 0.8980i | 0.7992 + 1.0027i | 0.6777 + 0.9081i | 0.6881 + 1.0255i |
| 25 | 0.7607 + 0.9150i | 0.7845 + 1.0125i | 0.6564 + 0.9256i | 0.6660 + 1.0394i |
| 25.5 | 0.8334 + 0.9240i | 0.8389 + 1.0490i | 0.7408 + 0.9196i | 0.7235 + 1.0449i |
| 26 | 0.6935 + 0.8959i | 0.8740 + 1.0322i | 0.7256 + 0.9768i | 0.8038 + 0.9722i |
| 26.5 | 0.7039 + 0.8883i | 0.8594 + 1.0384i | 0.7255 + 0.9867i | 0.8205 + 0.9417i |
| 27 | 0.7563 + 0.9153i | 0.7455 + 1.0248i | 0.6815 + 0.9082i | 0.8338 + 1.0015i |
| 27.5 | 0.7683 + 0.9391i | 0.7867 + 1.0395i | 0.7004 + 0.9076i | 0.8788 + 0.9640i |
| 28 | 0.7924 + 0.8491i | 0.7061 + 1.0819i | 0.7163 + 0.8855i | 0.7346 + 0.9830i |

| SNR/w | w48 | w49 | w50 | w51 |
|---|---|---|---|---|
| 7 | 0.6203 + 1.1269i | 0.5879 + 1.0807i | 0.3664 + 1.2524i | 0.3587 + 1.1911i |
| 7.5 | 0.6229 + 1.0763i | 0.6229 + 1.0763i | 0.3243 + 1.2106i | 0.3243 + 1.2106i |
| 8 | 0.2956 + 1.1569i | 0.2956 + 1.1569i | 0.2956 + 1.1569i | 0.2956 + 1.1569i |
| 8.5 | 0.2874 + 1.2418i | 0.2874 + 1.2418i | 0.2874 + 1.2418i | 0.2874 + 1.2418i |
| 9 | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i |
| 10 | 0.8968 + 0.5459i | 0.8968 + 0.5459i | 0.8968 + 0.5459i | 0.8968 + 0.5459i |
| 10.5 | 0.8830 + 0.5450i | 0.8830 + 0.5450i | 0.8830 + 0.5450i | 0.8830 + 0.5450i |
| 11 | 0.4984 + 0.8939i | 0.4984 + 0.8939i | 0.4984 + 0.8939i | 0.4984 + 0.8939i |
| 11.5 | 0.5081 + 0.8838i | 0.5081 + 0.8838i | 0.5081 + 0.8838i | 0.5081 + 0.8838i |
| 12 | 0.5146 + 0.8768i | 0.5146 + 0.8768i | 0.5146 + 0.8768i | 0.5146 + 0.8768i |
| 12.5 | 0.5822 + 0.8338i | 0.5822 + 0.8338i | 0.5822 + 0.8338i | 0.5822 + 0.8338i |
| 13 | 0.7986 + 0.5929i | 0.7986 + 0.5929i | 0.7986 + 0.5929i | 0.7986 + 0.5929i |
| 13.5 | 0.5892 + 0.8018i | 0.5892 + 0.8018i | 0.5892 + 0.8018i | 0.5892 + 0.8018i |
| 14 | 0.6534 + 0.7300i | 0.6534 + 0.7300i | 0.6534 + 0.7300i | 0.6534 + 0.7300i |
| 14.5 | 0.6604 + 0.7151i | 0.6604 + 0.7151i | 0.6604 + 0.7151i | 0.6604 + 0.7151i |
| 15 | 0.6517 + 0.5928i | 0.6517 + 0.5928i | 0.6517 + 0.5928i | 0.6517 + 0.5928i |
| 15.5 | 0.6528 + 0.6065i | 0.6528 + 0.6065i | 0.6528 + 0.6065i | 0.6528 + 0.6065i |
| 16 | 0.6288 + 0.5806i | 0.6288 + 0.5806i | 0.6288 + 0.5806i | 0.6288 + 0.5806i |
| 16.5 | 0.5868 + 0.5877i | 0.5868 + 0.5877i | 0.5868 + 0.5877i | 0.5868 + 0.5877i |
| 17 | 0.5837 + 0.5846i | 0.5837 + 0.5846i | 0.5837 + 0.5846i | 0.5837 + 0.5846i |
| 17.5 | 0.5794 + 0.5798i | 0.5794 + 0.5798i | 0.5794 + 0.5798i | 0.5794 + 0.5798i |
| 18 | 0.5719 + 0.5736i | 0.5719 + 0.5736i | 0.5719 + 0.5736i | 0.5719 + 0.5736i |
| 18.5 | 0.5557 + 0.5937i | 0.5557 + 0.5937i | 0.5557 + 0.5937i | 0.5557 + 0.5937i |
| 19 | 0.5631 + 0.5896i | 0.5631 + 0.5896i | 0.5631 + 0.5896i | 0.5631 + 0.5896i |
| 19.5 | 0.5710 + 0.5915i | 0.5710 + 0.5915i | 0.5710 + 0.5915i | 0.5710 + 0.5915i |
| 20 | 0.5822 + 0.5765i | 0.5822 + 0.5765i | 0.5822 + 0.5765i | 0.5822 + 0.5765i |
| 20.5 | 0.5822 + 0.5821i | 0.5822 + 0.5821i | 0.5822 + 0.5821i | 0.5822 + 0.5821i |
| 21 | 0.5616 + 0.5634i | 0.5616 + 0.5634i | 0.5616 + 0.5634i | 0.5616 + 0.5634i |
| 21.5 | 0.5495 + 0.5732i | 0.5495 + 0.5732i | 0.5693 + 0.5746i | 0.5693 + 0.5746i |
| 22 | 0.5609 + 0.5487i | 0.5607 + 0.5707i | 0.5609 + 0.5487i | 0.5607 + 0.5707i |
| 22.5 | 0.5470 + 0.5539i | 0.5476 + 0.5769i | 0.5738 + 0.5571i | 0.5742 + 0.5796i |
| 23 | 0.5438 + 0.5498i | 0.5380 + 0.5928i | 0.5956 + 0.5500i | 0.5895 + 0.5949i |
| 23.5 | 0.5420 + 0.5404i | 0.5426 + 0.5844i | 0.5959 + 0.5394i | 0.5992 + 0.5846i |
| 24 | 0.5255 + 0.5297i | 0.5242 + 0.5894i | 0.5852 + 0.5291i | 0.5854 + 0.5881i |
| 24.5 | 0.5320 + 0.5316i | 0.5261 + 0.6108i | 0.5951 + 0.5356i | 0.5905 + 0.6148i |
| 25 | 0.5351 + 0.5313i | 0.5235 + 0.6126i | 0.6088 + 0.5413i | 0.5929 + 0.6237i |
| 25.5 | 0.5530 + 0.5469i | 0.5591 + 0.6248i | 0.6363 + 0.5402i | 0.6435 + 0.6188i |
| 26 | 0.5591 + 0.5670i | 0.5177 + 0.6201i | 0.6098 + 0.6293i | 0.5253 + 0.6674i |
| 26.5 | 0.5260 + 0.5793i | 0.4902 + 0.6512i | 0.5918 + 0.6233i | 0.5219 + 0.6802i |
| 27 | 0.5743 + 0.5517i | 0.6712 + 0.5573i | 0.5951 + 0.5922i | 0.6584 + 0.6238i |
| 27.5 | 0.5592 + 0.5829i | 0.7089 + 0.5603i | 0.6120 + 0.5818i | 0.6742 + 0.6278i |
| 28 | 0.5735 + 0.5443i | 0.6544 + 0.5617i | 0.5761 + 0.6045i | 0.6223 + 0.6342i |

| SNR/w | w52 | w53 | w54 | w55 |
|---|---|---|---|---|
| 7 | 0.5879 + 1.0807i | 0.5639 + 1.0452i | 0.3587 + 1.1911i | 0.3527 + 1.1449i |
| 7.5 | 0.5841 + 1.0273i | 0.5841 + 1.0273i | 0.3172 + 1.1461i | 0.3172 + 1.1461i |
| 8 | 0.6067 + 1.0261i | 0.6067 + 1.0261i | 0.6067 + 1.0261i | 0.6067 + 1.0261i |
| 8.5 | 0.6771 + 1.0898i | 0.6771 + 1.0898i | 0.6771 + 1.0898i | 0.6771 + 1.0898i |
| 9 | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i |
| 10 | 0.8968 + 0.5459i | 0.8968 + 0.5459i | 0.8968 + 0.5459i | 0.8968 + 0.5459i |
| 10.5 | 0.8830 + 0.5450i | 0.8830 + 0.5450i | 0.8830 + 0.5450i | 0.8830 + 0.5450i |
| 11 | 0.4984 + 0.8939i | 0.4984 + 0.8939i | 0.4984 + 0.8939i | 0.4984 + 0.8939i |

-continued

| | | | | |
|---|---|---|---|---|
| 11.5 | 0.5081 + 0.8838i | 0.5081 + 0.8838i | 0.5081 + 0.8838i | 0.5081 + 0.8838i |
| 12 | 0.5146 + 0.8768i | 0.5146 + 0.8768i | 0.5146 + 0.8768i | 0.5146 + 0.8768i |
| 12.5 | 0.5794 + 0.8826i | 0.5794 + 0.8826i | 0.5794 + 0.8826i | 0.5794 + 0.8826i |
| 13 | 0.7914 + 0.6293i | 0.7914 + 0.6293i | 0.7914 + 0.6293i | 0.7914 + 0.6293i |
| 13.5 | 0.5764 + 0.8728i | 0.5764 + 0.8728i | 0.5764 + 0.8728i | 0.5764 + 0.8728i |
| 14 | 0.6037 + 0.8242i | 0.6037 + 0.8242i | 0.6037 + 0.8242i | 0.6037 + 0.8242i |
| 14.5 | 0.5990 + 0.8291i | 0.5990 + 0.8291i | 0.5990 + 0.8291i | 0.5990 + 0.8291i |
| 15 | 0.6549 + 0.6778i | 0.6542 + 0.6594i | 0.6549 + 0.6778i | 0.6549 + 0.6778i |
| 15.5 | 0.6768 + 0.7164i | 0.6768 + 0.7164i | 0.6768 + 0.7164i | 0.6768 + 0.7164i |
| 16 | 0.6488 + 0.6716i | 0.6474 + 0.6572i | 0.6513 + 0.6860i | 0.6488 + 0.6716i |
| 16.5 | 0.5855 + 0.6757i | 0.5855 + 0.6757i | 0.5855 + 0.6757i | 0.5808 + 0.6625i |
| 17 | 0.5802 + 0.6871i | 0.5821 + 0.6661i | 0.5802 + 0.6871i | 0.5821 + 0.6661i |
| 17.5 | 0.5757 + 0.6938i | 0.5776 + 0.6710i | 0.5757 + 0.6938i | 0.5776 + 0.6710i |
| 18 | 0.5682 + 0.7054i | 0.5699 + 0.6832i | 0.5682 + 0.7054i | 0.5699 + 0.6832i |
| 18.5 | 0.5979 + 0.7540i | 0.5916 + 0.7334i | 0.5979 + 0.7540i | 0.5916 + 0.7334i |
| 19 | 0.6124 + 0.7561i | 0.6046 + 0.7329i | 0.6124 + 0.7561i | 0.6046 + 0.7329i |
| 19.5 | 0.6265 + 0.7635i | 0.6170 + 0.7357i | 0.6265 + 0.7635i | 0.6170 + 0.7357i |
| 20 | 0.5421 + 0.7458i | 0.5485 + 0.7213i | 0.5421 + 0.7458i | 0.5485 + 0.7213i |
| 20.5 | 0.6018 + 0.7641i | 0.5972 + 0.7267i | 0.6018 + 0.7641i | 0.5972 + 0.7267i |
| 21 | 0.5660 + 0.7470i | 0.5633 + 0.7034i | 0.5660 + 0.7470i | 0.5633 + 0.7034i |
| 21.5 | 0.5331 + 0.7428i | 0.5381 + 0.7072i | 0.5541 + 0.7458i | 0.5596 + 0.7108i |
| 22 | 0.5638 + 0.7634i | 0.5616 + 0.6982i | 0.5638 + 0.7634i | 0.5616 + 0.6982i |
| 22.5 | 0.5425 + 0.7656i | 0.5443 + 0.7009i | 0.5719 + 0.7641i | 0.5718 + 0.7017i |
| 23 | 0.5352 + 0.7741i | 0.5370 + 0.6971i | 0.5807 + 0.7810i | 0.5873 + 0.6984i |
| 23.5 | 0.5405 + 0.7778i | 0.5435 + 0.6909i | 0.5919 + 0.7808i | 0.5973 + 0.6934i |
| 24 | 0.5232 + 0.7731i | 0.5221 + 0.6867i | 0.5850 + 0.7703i | 0.5860 + 0.6850i |
| 24.5 | 0.5146 + 0.8039i | 0.5192 + 0.7047i | 0.5858 + 0.8006i | 0.5865 + 0.7049i |
| 25 | 0.4978 + 0.8117i | 0.5101 + 0.7078i | 0.5655 + 0.8168i | 0.5769 + 0.7155i |
| 25.5 | 0.5711 + 0.7972i | 0.5652 + 0.7099i | 0.6605 + 0.7964i | 0.6520 + 0.7038i |
| 26 | 0.6050 + 0.8173i | 0.5282 + 0.8134i | 0.6187 + 0.7290i | 0.5315 + 0.7314i |
| 26.5 | 0.6218 + 0.8082i | 0.5542 + 0.8063i | 0.6169 + 0.7217i | 0.5205 + 0.7582i |
| 27 | 0.5523 + 0.8038i | 0.5626 + 0.7109i | 0.6275 + 0.8020i | 0.6357 + 0.7064i |
| 27.5 | 0.5700 + 0.8032i | 0.5742 + 0.7097i | 0.6450 + 0.8012i | 0.6522 + 0.7089i |
| 28 | 0.5404 + 0.8158i | 0.5418 + 0.7248i | 0.6162 + 0.8123i | 0.6016 + 0.7162i |

| SNR/w | w56 | w57 | w58 | w59 |
|---|---|---|---|---|
| 7 | 0.5879 + 1.0807i | 0.5639 + 1.0452i | 0.3587 + 1.1911i | 0.3527 + 1.1449i |
| 7.5 | 0.5841 + 1.0273i | 0.5841 + 1.0273i | 0.3172 + 1.1461i | 0.3172 + 1.1461i |
| 8 | 0.2909 + 1.1021i | 0.2909 + 1.1021i | 0.2909 + 1.1021i | 0.2909 + 1.1021i |
| 8.5 | 0.2747 + 1.0834i | 0.2747 + 1.0834i | 0.2747 + 1.0834i | 0.2755 + 1.1100i |
| 9 | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i |
| 10 | 0.8968 + 0.5459i | 0.8968 + 0.5459i | 0.8968 + 0.5459i | 0.8968 + 0.5459i |
| 10.5 | 0.8830 + 0.5450i | 0.8830 + 0.5450i | 0.8830 + 0.5450i | 0.8999 + 0.5564i |
| 11 | 0.4913 + 0.9328i | 0.4913 + 0.9328i | 0.4913 + 0.9328i | 0.4913 + 0.9328i |
| 11.5 | 0.5036 + 0.9211i | 0.5036 + 0.9211i | 0.5036 + 0.9211i | 0.5036 + 0.9211i |
| 12 | 0.5099 + 0.9157i | 0.5099 + 0.9157i | 0.5099 + 0.9157i | 0.5099 + 0.9157i |
| 12.5 | 0.6107 + 0.8306i | 0.6107 + 0.8306i | 0.5822 + 0.8338i | 0.5822 + 0.8338i |
| 13 | 0.8552 + 0.5879i | 0.8552 + 0.5879i | 0.8552 + 0.5879i | 0.8552 + 0.5879i |
| 13.5 | 0.6385 + 0.7909i | 0.6385 + 0.7909i | 0.6385 + 0.7909i | 0.6385 + 0.7909i |
| 14 | 0.6962 + 0.7427i | 0.6962 + 0.7427i | 0.6962 + 0.7427i | 0.6962 + 0.7427i |
| 14.5 | 0.7109 + 0.7314i | 0.7109 + 0.7314i | 0.7109 + 0.7314i | 0.7109 + 0.7314i |
| 15 | 0.7167 + 0.5928i | 0.7167 + 0.5928i | 0.7167 + 0.5928i | 0.7167 + 0.5928i |
| 15.5 | 0.7040 + 0.5764i | 0.7040 + 0.5764i | 0.7040 + 0.5764i | 0.7040 + 0.5764i |
| 16 | 0.6902 + 0.5639i | 0.6902 + 0.5639i | 0.6902 + 0.5639i | 0.6902 + 0.5639i |
| 16.5 | 0.6882 + 0.5903i | 0.6882 + 0.5903i | 0.6652 + 0.5898i | 0.6652 + 0.5898i |
| 17 | 0.6969 + 0.5874i | 0.6969 + 0.5874i | 0.6701 + 0.5868i | 0.6701 + 0.5868i |
| 17.5 | 0.7105 + 0.5831i | 0.7105 + 0.5831i | 0.6825 + 0.5824i | 0.6825 + 0.5824i |
| 18 | 0.7231 + 0.5776i | 0.7231 + 0.5776i | 0.6951 + 0.5766i | 0.6951 + 0.5766i |
| 18.5 | 0.6936 + 0.5549i | 0.6936 + 0.5549i | 0.6745 + 0.5607i | 0.6745 + 0.5607i |
| 19 | 0.7049 + 0.5452i | 0.7049 + 0.5452i | 0.7049 + 0.5452i | 0.7049 + 0.5452i |
| 19.5 | 0.7309 + 0.5392i | 0.7309 + 0.5392i | 0.7123 + 0.5455i | 0.7123 + 0.5455i |
| 20 | 0.7648 + 0.6193i | 0.7648 + 0.6193i | 0.7282 + 0.6105i | 0.7282 + 0.6105i |
| 20.5 | 0.7708 + 0.5641i | 0.7708 + 0.5641i | 0.7318 + 0.5689i | 0.7318 + 0.5689i |
| 21 | 0.7480 + 0.5637i | 0.7480 + 0.5637i | 0.7021 + 0.5632i | 0.7021 + 0.5632i |
| 21.5 | 0.7644 + 0.5865i | 0.7644 + 0.5865i | 0.7017 + 0.5836i | 0.7017 + 0.5836i |
| 22 | 0.7478 + 0.5605i | 0.7478 + 0.5605i | 0.6930 + 0.5581i | 0.6930 + 0.5581i |
| 22.5 | 0.7671 + 0.5696i | 0.7648 + 0.5926i | 0.6970 + 0.5663i | 0.6951 + 0.5891i |
| 23 | 0.7870 + 0.5451i | 0.7912 + 0.6039i | 0.7025 + 0.5494i | 0.7033 + 0.6027i |
| 23.5 | 0.7963 + 0.5341i | 0.7903 + 0.5944i | 0.7035 + 0.5353i | 0.7033 + 0.5871i |
| 24 | 0.7772 + 0.5242i | 0.7811 + 0.5804i | 0.6843 + 0.5275i | 0.6854 + 0.5855i |
| 24.5 | 0.7677 + 0.5362i | 0.7985 + 0.5994i | 0.6876 + 0.5405i | 0.6898 + 0.6182i |
| 25 | 0.7836 + 0.5649i | 0.7723 + 0.6495i | 0.6941 + 0.5537i | 0.6818 + 0.6387i |
| 25.5 | 0.8260 + 0.5243i | 0.8354 + 0.6026i | 0.7272 + 0.5323i | 0.7357 + 0.6102i |
| 26 | 0.7207 + 0.5888i | 0.8167 + 0.5761i | 0.6922 + 0.6311i | 0.8130 + 0.6488i |
| 26.5 | 0.7502 + 0.6146i | 0.8241 + 0.6346i | 0.6717 + 0.6243i | 0.8549 + 0.5585i |
| 27 | 0.8564 + 0.5757i | 0.8744 + 0.6584i | 0.7873 + 0.6025i | 0.7483 + 0.6489i |

-continued

| | | | | |
|---|---|---|---|---|
| 27.5 | 0.8715 + 0.5878i | 0.8831 + 0.6759i | 0.8064 + 0.6168i | 0.7632 + 0.6612i |
| 28 | 0.8185 + 0.6598i | 0.8890 + 0.6878i | 0.7513 + 0.6619i | 0.6922 + 0.6583i |

| SNR/w | w60 | w61 | w62 | w63 |
|---|---|---|---|---|
| 7 | 0.5639 + 1.0452i | 0.5639 + 1.0452i | 0.3527 + 1.1449i | 0.3527 + 1.1449i |
| 7.5 | 0.5583 + 0.9946i | 0.5841 + 1.0273i | 0.3121 + 1.1042i | 0.3172 + 1.1461i |
| 8 | 0.5711 + 0.9836i | 0.5711 + 0.9836i | 0.5711 + 0.9836i | 0.5711 + 0.9836i |
| 8.5 | 0.5714 + 0.9632i | 0.5714 + 0.9632i | 0.5714 + 0.9632i | 0.5891 + 0.9828i |
| 9 | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i |
| 10 | 0.8968 + 0.5459i | 0.8968 + 0.5459i | 0.8968 + 0.5459i | 0.9130 + 0.5610i |
| 10.5 | 0.8830 + 0.5450i | 0.8999 + 0.5564i | 0.8830 + 0.5450i | 0.8999 + 0.5564i |
| 11 | 0.4913 + 0.9328i | 0.4913 + 0.9328i | 0.4913 + 0.9328i | 0.4913 + 0.9328i |
| 11.5 | 0.5036 + 0.9211i | 0.5036 + 0.9211i | 0.5036 + 0.9211i | 0.5036 + 0.9211i |
| 12 | 0.5099 + 0.9157i | 0.5099 + 0.9157i | 0.5099 + 0.9157i | 0.5099 + 0.9157i |
| 12.5 | 0.6070 + 0.8755i | 0.6070 + 0.8755i | 0.5794 + 0.8826i | 0.5794 + 0.8826i |
| 13 | 0.8390 + 0.6247i | 0.8390 + 0.6247i | 0.8390 + 0.6247i | 0.8390 + 0.6247i |
| 13.5 | 0.6259 + 0.8459i | 0.6259 + 0.8459i | 0.6259 + 0.8459i | 0.6259 + 0.8459i |
| 14 | 0.6037 + 0.8242i | 0.6258 + 0.8266i | 0.6037 + 0.8242i | 0.6258 + 0.8266i |
| 14.5 | 0.6231 + 0.8370i | 0.6231 + 0.8370i | 0.5990 + 0.8291i | 0.6231 + 0.8370i |
| 15 | 0.7125 + 0.6806i | 0.7146 + 0.6593i | 0.7125 + 0.6806i | 0.7125 + 0.6806i |
| 15.5 | 0.7116 + 0.6428i | 0.7116 + 0.6428i | 0.7116 + 0.6428i | 0.7116 + 0.6428i |
| 16 | 0.6998 + 0.6407i | 0.7027 + 0.6248i | 0.6979 + 0.6575i | 0.6998 + 0.6407i |
| 16.5 | 0.6842 + 0.6771i | 0.6842 + 0.6771i | 0.6620 + 0.6763i | 0.6620 + 0.6763i |
| 17 | 0.6917 + 0.6826i | 0.6917 + 0.6826i | 0.6633 + 0.6909i | 0.6679 + 0.6719i |
| 17.5 | 0.6999 + 0.7005i | 0.7059 + 0.6818i | 0.6721 + 0.6991i | 0.6780 + 0.6793i |
| 18 | 0.7106 + 0.7122i | 0.7172 + 0.6953i | 0.6817 + 0.7109i | 0.6885 + 0.6928i |
| 18.5 | 0.7448 + 0.6967i | 0.7338 + 0.6742i | 0.7448 + 0.6967i | 0.7338 + 0.6742i |
| 19 | 0.7679 + 0.6989i | 0.7563 + 0.6729i | 0.7679 + 0.6989i | 0.7563 + 0.6729i |
| 19.5 | 0.7983 + 0.7050i | 0.7854 + 0.6754i | 0.7757 + 0.7137i | 0.7639 + 0.6838i |
| 20 | 0.7212 + 0.7993i | 0.7274 + 0.7651i | 0.6876 + 0.7938i | 0.6932 + 0.7604i |
| 20.5 | 0.7986 + 0.7490i | 0.7922 + 0.7061i | 0.7530 + 0.7531i | 0.7483 + 0.7113i |
| 21 | 0.7422 + 0.7346i | 0.7472 + 0.7039i | 0.6990 + 0.7343i | 0.7011 + 0.7006i |
| 21.5 | 0.7565 + 0.7484i | 0.7593 + 0.7277i | 0.6893 + 0.7521i | 0.6917 + 0.7266i |
| 22 | 0.7418 + 0.7491i | 0.7413 + 0.6938i | 0.6950 + 0.7561i | 0.6917 + 0.6959i |
| 22.5 | 0.7699 + 0.7757i | 0.7684 + 0.7133i | 0.6931 + 0.7729i | 0.6933 + 0.7088i |
| 23 | 0.7851 + 0.8112i | 0.7935 + 0.7088i | 0.6966 + 0.7929i | 0.7030 + 0.7082i |
| 23.5 | 0.7903 + 0.7972i | 0.7922 + 0.6992i | 0.6988 + 0.7924i | 0.7016 + 0.6975i |
| 24 | 0.7824 + 0.7742i | 0.7823 + 0.6813i | 0.6846 + 0.7745i | 0.6870 + 0.6835i |
| 24.5 | 0.7690 + 0.8026i | 0.8002 + 0.7097i | 0.6815 + 0.7942i | 0.6898 + 0.7018i |
| 25 | 0.7471 + 0.8318i | 0.7654 + 0.7459i | 0.6548 + 0.8214i | 0.6666 + 0.7271i |
| 25.5 | 0.8363 + 0.7982i | 0.8396 + 0.6938i | 0.7479 + 0.7978i | 0.7438 + 0.6972i |
| 26 | 0.7083 + 0.8179i | 0.8062 + 0.8263i | 0.7032 + 0.7252i | 0.8007 + 0.7286i |
| 26.5 | 0.7192 + 0.7846i | 0.8042 + 0.7367i | 0.6819 + 0.7074i | 0.8326 + 0.8445i |
| 27 | 0.7885 + 0.8284i | 0.8377 + 0.7472i | 0.7063 + 0.8058i | 0.7323 + 0.7227i |
| 27.5 | 0.8096 + 0.8448i | 0.8499 + 0.7616i | 0.7229 + 0.8172i | 0.7483 + 0.7350i |
| 28 | 0.7947 + 0.7648i | 0.8894 + 0.7813i | 0.7012 + 0.7888i | 0.6735 + 0.7261i |

| SNR/w | w64 | w65 | w66 | w67 |
|---|---|---|---|---|
| 7 | 1.8365 + 1.2473i | 1.2111 + 0.6836i | 2.1615 + 0.4280i | 1.3685 + 0.3795i |
| 7.5 | 1.7843 + 1.2148i | 1.5010 + 0.9781i | 2.1191 + 0.4071i | 1.7374 + 0.3777i |
| 8 | 2.0885 + 0.3978i | 1.7466 + 0.3528i | 1.5750 + 0.3367i | 1.5346 + 0.3328i |
| 8.5 | 2.0732 + 0.3944i | 1.7141 + 0.3348i | 1.6263 + 0.3252i | 1.5557 + 0.3149i |
| 9 | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i |
| 11 | 1.5407 + 0.3365i | 1.4255 + 0.3224i | 1.5424 + 0.2759i | 1.4191 + 0.2826i |
| 11.5 | 1.5505 + 0.3455i | 1.4293 + 0.3268i | 1.5574 + 0.2658i | 1.4239 + 0.2730i |
| 12 | 1.5615 + 0.3581i | 1.4382 + 0.3463i | 1.5777 + 0.2407i | 1.4295 + 0.2590i |
| 12.5 | 1.6796 + 0.2609i | 1.6231 + 0.3777i | 1.4866 + 0.2567i | 1.4695 + 0.3056i |
| 13 | 0.4298 + 0.1206i | 0.4298 + 0.1206i | 0.4298 + 0.1206i | 0.4298 + 0.1206i |
| 13.5 | 1.7821 + 0.2022i | 1.7069 + 0.6226i | 1.6649 + 0.2207i | 1.6075 + 0.4960i |
| 14 | 1.5804 + 1.3865i | 2.1260 + 0.2205i | 1.8405 + 1.0633i | 2.0446 + 0.6571i |
| 14.5 | 1.6382 + 1.3165i | 2.0902 + 0.1960i | 1.8765 + 0.9757i | 2.0346 + 0.5849i |
| 15 | 1.8736 + 0.9301i | 2.1142 + 0.3056i | 1.3497 + 0.1188i | 1.3497 + 0.1188i |
| 15.5 | 1.6897 + 0.1409i | 1.7447 + 0.1440i | 1.4161 + 0.1190i | 1.4047 + 0.1209i |
| 16 | 1.6775 + 0.1331i | 1.6321 + 0.1195i | 1.3567 + 0.1125i | 1.3567 + 0.1125i |
| 16.5 | 1.4483 + 0.1058i | 1.5082 + 0.1076i | 1.2511 + 0.1063i | 1.2511 + 0.1063i |
| 17 | 1.4531 + 0.1045i | 1.5085 + 0.1072i | 1.2484 + 0.1046i | 1.2484 + 0.1046i |
| 17.5 | 1.4543 + 0.1049i | 1.5074 + 0.1080i | 1.2478 + 0.1028i | 1.2478 + 0.1028i |
| 18 | 1.4513 + 0.1053i | 1.5036 + 0.1079i | 1.2538 + 0.1005i | 1.2393 + 0.1002i |
| 18.5 | 1.4335 + 0.0772i | 1.3407 + 0.0725i | 1.1059 + 0.0808i | 1.1384 + 0.0788i |
| 19 | 1.4268 + 0.0758i | 1.3215 + 0.0692i | 1.0950 + 0.0758i | 1.1342 + 0.0740i |
| 19.5 | 1.4256 + 0.0701i | 1.2941 + 0.0652i | 1.0723 + 0.0704i | 1.1247 + 0.0692i |
| 20 | 1.9230 + 0.1724i | 1.4387 + 0.0640i | 1.2248 + 0.0751i | 1.2729 + 0.0732i |
| 20.5 | 1.4461 + 0.0954i | 1.3740 + 0.1022i | 1.2110 + 0.0728i | 1.2392 + 0.0857i |

-continued

| | | | | |
|---|---|---|---|---|
| 21 | 1.3631 + 0.0520i | 1.8339 + 0.1330i | 1.1991 + 0.0634i | 1.1476 + 0.0664i |
| 21.5 | 1.6991 + 0.0948i | 1.9089 + 0.1361i | 1.1209 + 0.0616i | 1.1513 + 0.0504i |
| 22 | 1.3605 + 0.0520i | 1.8286 + 0.1178i | 1.2193 + 0.0642i | 1.1598 + 0.0644i |
| 22.5 | 1.6912 + 0.0798i | 1.4055 + 0.0597i | 1.1376 + 0.0545i | 1.2506 + 0.0551i |
| 23 | 1.7275 + 0.0857i | 1.4188 + 0.0423i | 1.1857 + 0.0607i | 1.2751 + 0.0595i |
| 23.5 | 1.4664 + 0.0626i | 1.6566 + 0.0991i | 1.3043 + 0.0474i | 1.1711 + 0.0454i |
| 24 | 1.5037 + 0.0710i | 1.3591 + 0.0502i | 1.1808 + 0.0443i | 1.2467 + 0.0983i |
| 24.5 | 1.5376 + 0.0755i | 1.7254 + 0.0875i | 1.3836 + 0.0522i | 1.2524 + 0.0657i |
| 25 | 1.5306 + 0.0744i | 1.6915 + 0.1083i | 1.3846 + 0.0555i | 1.2679 + 0.0610i |
| 25.5 | 1.5775 + 0.2201i | 1.6203 + 0.0729i | 1.1822 + 0.0559i | 1.2916 + 0.0458i |
| 26 | 1.4357 + 0.0696i | 1.5824 + 0.0779i | 1.3020 + 0.0505i | 1.1807 + 0.0541i |
| 26.5 | 1.4441 + 0.0577i | 1.5851 + 0.0770i | 1.3160 + 0.0502i | 1.2061 + 0.0559i |
| 27 | 1.4179 + 0.0644i | 1.5639 + 0.0718i | 1.2943 + 0.0443i | 1.1861 + 0.0531i |
| 27.5 | 1.4359 + 0.0589i | 1.5791 + 0.0680i | 1.3202 + 0.0508i | 1.2143 + 0.0516i |
| 28 | 1.3893 + 0.0618i | 1.5163 + 0.0570i | 1.2840 + 0.0506i | 1.1933 + 0.0574i |

| SNR/w | w68 | w69 | w70 | w71 |
|---|---|---|---|---|
| 7 | 1.2111 + 0.6836i | 1.1269 + 0.6205i | 1.3685 + 0.3795i | 1.2525 + 0.3664i |
| 7.5 | 1.1547 + 0.6858i | 1.1852 + 0.7101i | 1.3117 + 0.3337i | 1.3460 + 0.3393i |
| 8 | 1.7585 + 1.1911i | 1.4907 + 0.9885i | 1.3631 + 0.8851i | 1.3286 + 0.8566i |
| 8.5 | 1.7503 + 1.1771i | 1.4580 + 0.9699i | 1.3957 + 0.9225i | 1.3353 + 0.8771i |
| 9 | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i |
| 11 | 1.3823 + 0.2915i | 1.3352 + 0.2806i | 1.3834 + 0.2624i | 1.3278 + 0.2554i |
| 11.5 | 1.3848 + 0.2966i | 1.3395 + 0.2921i | 1.3880 + 0.2554i | 1.3345 + 0.2523i |
| 12 | 1.3838 + 0.2941i | 1.3406 + 0.2949i | 1.3933 + 0.2286i | 1.3447 + 0.2356i |
| 12.5 | 1.3481 + 0.2491i | 1.3458 + 0.2730i | 1.3263 + 0.2454i | 1.3245 + 0.2658i |
| 13 | 0.4298 + 0.1206i | 0.4298 + 0.1206i | 0.4298 + 0.1206i | 0.4298 + 0.1206i |
| 13.5 | 1.5379 + 0.2267i | 1.4650 + 0.3647i | 1.5187 + 0.2429i | 1.4650 + 0.3647i |
| 14 | 1.6304 + 0.2123i | 1.7090 + 0.2082i | 1.6062 + 0.2504i | 1.6575 + 0.2608i |
| 14.5 | 1.6080 + 0.1998i | 1.6865 + 0.1947i | 1.5872 + 0.2316i | 1.6395 + 0.2404i |
| 15 | 1.7111 + 0.1507i | 1.7593 + 0.1621i | 1.4137 + 0.1224i | 1.4137 + 0.1224i |
| 15.5 | 1.9715 + 0.6222i | 2.0540 + 0.2400i | 1.3565 + 0.1259i | 1.3565 + 0.1259i |
| 16 | 1.9896 + 0.2026i | 1.9730 + 0.5695i | 1.3013 + 0.1147i | 1.3013 + 0.1147i |
| 16.5 | 2.0481 + 0.1978i | 1.7457 + 0.1177i | 1.1891 + 0.1088i | 1.1891 + 0.1088i |
| 17 | 2.0518 + 0.1917i | 1.7527 + 0.1170i | 1.1874 + 0.1093i | 1.1874 + 0.1093i |
| 17.5 | 2.0450 + 0.1840i | 1.7515 + 0.1165i | 1.1867 + 0.1106i | 1.1867 + 0.1106i |
| 18 | 2.0343 + 0.1812i | 1.7462 + 0.1147i | 1.1849 + 0.1124i | 1.1849 + 0.1124i |
| 18.5 | 1.6706 + 0.1002i | 1.9444 + 0.1347i | 1.0666 + 0.0829i | 1.0666 + 0.0829i |
| 19 | 1.6492 + 0.0990i | 1.9145 + 0.1300i | 1.0506 + 0.0781i | 1.0506 + 0.0781i |
| 19.5 | 1.6348 + 0.0961i | 1.8944 + 0.1321i | 1.0262 + 0.0737i | 1.0262 + 0.0737i |
| 20 | 1.6851 + 0.1131i | 1.4739 + 0.1668i | 1.2330 + 0.2173i | 1.2857 + 0.2110i |
| 20.5 | 1.6304 + 0.0979i | 1.8780 + 0.1229i | 1.1036 + 0.0880i | 1.1036 + 0.0880i |
| 21 | 1.4080 + 0.1199i | 1.6121 + 0.0933i | 1.2253 + 0.1727i | 1.1607 + 0.1854i |
| 21.5 | 1.5161 + 0.0821i | 1.3698 + 0.0855i | 1.1545 + 0.1540i | 1.2377 + 0.1156i |
| 22 | 1.4249 + 0.1170i | 1.6056 + 0.0877i | 1.2333 + 0.1806i | 1.1693 + 0.1944i |
| 22.5 | 1.5794 + 0.1910i | 1.4051 + 0.1749i | 1.1445 + 0.1725i | 1.2429 + 0.1635i |
| 23 | 1.5834 + 0.1747i | 1.4232 + 0.1559i | 1.1749 + 0.1749i | 1.2918 + 0.1822i |
| 23.5 | 1.4135 + 0.1717i | 1.5496 + 0.2588i | 1.2755 + 0.1587i | 1.1759 + 0.1394i |
| 24 | 1.5451 + 0.2150i | 1.7164 + 0.1072i | 1.3895 + 0.2257i | 1.2198 + 0.1964i |
| 24.5 | 1.5831 + 0.2354i | 1.4320 + 0.2269i | 1.1755 + 0.2097i | 1.2871 + 0.1867i |
| 25 | 1.4621 + 0.1953i | 1.3400 + 0.2355i | 1.1762 + 0.2323i | 1.2439 + 0.1711i |
| 25.5 | 1.4605 + 0.1876i | 1.4494 + 0.0655i | 1.1852 + 0.1643i | 1.3065 + 0.1507i |
| 26 | 1.3893 + 0.1877i | 1.2727 + 0.2084i | 1.1282 + 0.2339i | 1.1761 + 0.1587i |
| 26.5 | 1.4166 + 0.1663i | 1.3051 + 0.2007i | 1.1730 + 0.2374i | 1.2080 + 0.1543i |
| 27 | 1.4462 + 0.1886i | 1.3139 + 0.1830i | 1.5847 + 0.2617i | 1.2070 + 0.1573i |
| 27.5 | 1.4507 + 0.1735i | 1.3288 + 0.1906i | 1.5715 + 0.2387i | 1.2136 + 0.1561i |
| 28 | 1.4329 + 0.1769i | 1.3157 + 0.1870i | 1.5739 + 0.1994i | 1.2085 + 0.1678i |

| SNR/w | w72 | w73 | w74 | w75 |
|---|---|---|---|---|
| 7 | 1.2111 + 0.6836i | 1.1269 + 0.6205i | 1.3685 + 0.3795i | 1.2525 + 0.3664i |
| 7.5 | 1.1547 + 0.6858i | 1.1852 + 0.7101i | 1.3117 + 0.3337i | 1.3460 + 0.3393i |
| 8 | 1.2660 + 0.3053i | 1.2660 + 0.3053i | 1.2660 + 0.3053i | 1.2660 + 0.3053i |
| 8.5 | 1.1099 + 0.2755i | 1.1099 + 0.2755i | 1.1099 + 0.2755i | 1.1099 + 0.2755i |
| 9 | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i |
| 11 | 1.3823 + 0.2915i | 1.3352 + 0.2806i | 1.3834 + 0.2624i | 1.3352 + 0.2806i |
| 11.5 | 1.3848 + 0.2966i | 1.3395 + 0.2921i | 1.3880 + 0.2554i | 1.3345 + 0.2523i |
| 12 | 1.3733 + 0.3193i | 1.3344 + 0.3196i | 1.3766 + 0.2535i | 1.3339 + 0.2600i |
| 12.5 | 1.3712 + 0.2039i | 1.3574 + 0.2268i | 1.3430 + 0.2021i | 1.3340 + 0.2218i |
| 13 | 0.4298 + 0.1206i | 0.4298 + 0.1206i | 0.4298 + 0.1206i | 0.4298 + 0.1206i |
| 13.5 | 1.2747 + 0.1449i | 1.2485 + 0.1724i | 1.2747 + 0.1449i | 1.2485 + 0.1724i |
| 14 | 1.2372 + 0.1421i | 1.2372 + 0.1421i | 1.2372 + 0.1421i | 1.2372 + 0.1421i |

-continued

| | | | | |
|---|---|---|---|---|
| 14.5 | 1.2212 + 0.1365i | 1.2212 + 0.1365i | 1.2212 + 0.1365i | 1.2212 + 0.1365i |
| 15 | 1.0145 + 0.1170i | 1.0145 + 0.1170i | 1.0847 + 0.1181i | 1.0847 + 0.1181i |
| 15.5 | 1.0016 + 0.1116i | 1.0016 + 0.1116i | 1.0677 + 0.1135i | 1.0677 + 0.1135i |
| 16 | 0.9484 + 0.1042i | 0.9484 + 0.1042i | 1.0145 + 0.1061i | 1.0145 + 0.1061i |
| 16.5 | 0.9120 + 0.1119i | 0.9120 + 0.1119i | 0.9723 + 0.1111i | 0.9723 + 0.1111i |
| 17 | 0.9068 + 0.1115i | 0.9068 + 0.1115i | 0.9684 + 0.1102i | 0.9684 + 0.1102i |
| 17.5 | 0.9046 + 0.1109i | 0.9046 + 0.1109i | 0.9587 + 0.1031i | 0.9587 + 0.1031i |
| 18 | 0.9005 + 0.1000i | 0.9005 + 0.1000i | 0.9590 + 0.0977i | 0.9590 + 0.0977i |
| 18.5 | 0.7943 + 0.1008i | 0.7943 + 0.1008i | 0.8518 + 0.0927i | 0.8518 + 0.0927i |
| 19 | 0.7712 + 0.0834i | 0.7712 + 0.0834i | 0.8286 + 0.0797i | 0.8286 + 0.0797i |
| 19.5 | 0.7513 + 0.0751i | 0.7513 + 0.0751i | 0.8059 + 0.0713i | 0.8059 + 0.0713i |
| 20 | 0.9936 + 0.0741i | 0.9936 + 0.0741i | 1.0658 + 0.0746i | 1.0658 + 0.0746i |
| 20.5 | 0.8402 + 0.0679i | 0.8402 + 0.0679i | 0.8803 + 0.0565i | 0.8803 + 0.0565i |
| 21 | 0.8976 + 0.0632i | 0.8976 + 0.0632i | 0.9963 + 0.0649i | 1.0165 + 0.0658i |
| 21.5 | 0.8981 + 0.0684i | 0.8981 + 0.0684i | 0.9890 + 0.0680i | 0.9749 + 0.0663i |
| 22 | 0.9042 + 0.0625i | 0.9042 + 0.0625i | 1.0170 + 0.0646i | 1.0368 + 0.0643i |
| 22.5 | 0.8885 + 0.0624i | 0.8885 + 0.0624i | 1.0235 + 0.0603i | 0.9860 + 0.0649i |
| 23 | 0.8931 + 0.0565i | 0.8931 + 0.0565i | 1.0522 + 0.0581i | 1.0206 + 0.0501i |
| 23.5 | 0.9003 + 0.0604i | 0.9003 + 0.0604i | 1.0088 + 0.0553i | 1.0449 + 0.0537i |
| 24 | 0.9256 + 0.0605i | 0.9256 + 0.0605i | 1.0609 + 0.0650i | 1.0478 + 0.0699i |
| 24.5 | 0.9591 + 0.0547i | 0.9357 + 0.0599i | 1.0686 + 0.0690i | 1.1345 + 0.0491i |
| 25 | 0.9630 + 0.0520i | 0.9218 + 0.0598i | 1.0488 + 0.0488i | 1.1469 + 0.0461i |
| 25.5 | 0.8699 + 0.0500i | 0.9203 + 0.0513i | 1.0902 + 0.0567i | 1.0070 + 0.0499i |
| 26 | 0.9159 + 0.0417i | 0.9301 + 0.0926i | 1.0176 + 0.0319i | 1.0715 + 0.0679i |
| 26.5 | 0.9403 + 0.0431i | 0.9115 + 0.0762i | 1.0176 + 0.0326i | 1.1072 + 0.0445i |
| 27 | 0.9113 + 0.0415i | 0.8658 + 0.0784i | 0.9957 + 0.0565i | 1.0840 + 0.0474i |
| 27.5 | 0.9440 + 0.0418i | 0.8706 + 0.0464i | 1.0192 + 0.0503i | 1.1107 + 0.0449i |
| 28 | 0.8988 + 0.0380i | 0.9745 + 0.0468i | 1.0860 + 0.0321i | 1.0493 + 0.0829i |

| SNR/w | w76 | w77 | w78 | w79 |
|---|---|---|---|---|
| 7 | 1.1269 + 0.6205i | 1.0807 + 0.5881i | 1.2525 + 0.3664i | 1.1912 + 0.3587i |
| 7.5 | 1.0763 + 0.6220i | 1.0882 + 0.6314i | 1.2101 + 0.3241i | 1.2101 + 0.3241i |
| 8 | 1.1122 + 0.6781i | 1.1122 + 0.6781i | 1.1122 + 0.6781i | 1.1122 + 0.6781i |
| 8.5 | 0.9827 + 0.5890i | 0.9827 + 0.5890i | 0.9827 + 0.5890i | 0.9827 + 0.5890i |
| 9 | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i |
| 11 | 1.3147 + 0.2720i | 1.2904 + 0.2600i | 1.3278 + 0.2554i | 1.2904 + 0.2600i |
| 11.5 | 1.3066 + 0.2759i | 1.3066 + 0.2759i | 1.3345 + 0.2523i | 1.2978 + 0.2447i |
| 12 | 1.3016 + 0.2902i | 1.3016 + 0.2902i | 1.3070 + 0.2383i | 1.3070 + 0.2383i |
| 12.5 | 1.2853 + 0.2129i | 1.2853 + 0.2129i | 1.2853 + 0.2129i | 1.2853 + 0.2129i |
| 13 | 0.4298 + 0.1206i | 0.4298 + 0.1206i | 0.4298 + 0.1206i | 0.4298 + 0.1206i |
| 13.5 | 1.2956 + 0.1735i | 1.2711 + 0.2104i | 1.2956 + 0.1735i | 1.2711 + 0.2104i |
| 14 | 1.3006 + 0.1843i | 1.3006 + 0.1843i | 1.3006 + 0.1843i | 1.3006 + 0.1843i |
| 14.5 | 1.2805 + 0.1825i | 1.2805 + 0.1825i | 1.2805 + 0.1825i | 1.2805 + 0.1825i |
| 15 | 1.0145 + 0.1170i | 1.0145 + 0.1170i | 1.0847 + 0.1181i | 1.0847 + 0.1181i |
| 15.5 | 1.0016 + 0.1116i | 1.0016 + 0.1116i | 1.0796 + 0.1116i | 1.0796 + 0.1116i |
| 16 | 0.9484 + 0.1042i | 0.9484 + 0.1042i | 1.0300 + 0.1036i | 1.0300 + 0.1036i |
| 16.5 | 0.9120 + 0.1119i | 0.9120 + 0.1119i | 0.9723 + 0.1111i | 0.9723 + 0.1111i |
| 17 | 0.9068 + 0.1115i | 0.9068 + 0.1115i | 0.9684 + 0.1102i | 0.9684 + 0.1102i |
| 17.5 | 0.9046 + 0.1109i | 0.9046 + 0.1109i | 0.9766 + 0.1146i | 0.9766 + 0.1146i |
| 18 | 0.9087 + 0.1213i | 0.9087 + 0.1213i | 0.9793 + 0.1171i | 0.9793 + 0.1171i |
| 18.5 | 0.7943 + 0.1008i | 0.7943 + 0.1008i | 0.8696 + 0.0989i | 0.8518 + 0.0927i |
| 19 | 0.7825 + 0.1088i | 0.7825 + 0.1088i | 0.8566 + 0.0950i | 0.8566 + 0.0950i |
| 19.5 | 0.7661 + 0.1128i | 0.7661 + 0.1128i | 0.8403 + 0.0944i | 0.8403 + 0.0944i |
| 20 | 0.9872 + 0.2147i | 0.9872 + 0.2147i | 1.0768 + 0.2182i | 1.0565 + 0.2169i |
| 20.5 | 0.8610 + 0.1536i | 0.8610 + 0.1536i | 0.9491 + 0.1152i | 0.9491 + 0.1152i |
| 21 | 0.8957 + 0.1794i | 0.8957 + 0.1794i | 0.9955 + 0.1822i | 1.0207 + 0.1845i |
| 21.5 | 0.9033 + 0.2029i | 0.9033 + 0.2029i | 1.0095 + 0.1899i | 0.9885 + 0.1918i |
| 22 | 0.9022 + 0.1856i | 0.9022 + 0.1856i | 1.0172 + 0.1896i | 1.0422 + 0.1915i |
| 22.5 | 0.8899 + 0.1872i | 0.8899 + 0.1872i | 1.0287 + 0.1810i | 0.9915 + 0.1807i |
| 23 | 0.8908 + 0.1680i | 0.8908 + 0.1680i | 1.0456 + 0.1748i | 1.0122 + 0.1779i |
| 23.5 | 0.9091 + 0.1794i | 0.9091 + 0.1794i | 1.0295 + 0.1733i | 1.0590 + 0.1616i |
| 24 | 0.9252 + 0.1819i | 0.9088 + 0.1757i | 1.0378 + 0.1928i | 1.0895 + 0.1956i |
| 24.5 | 0.9170 + 0.1776i | 0.9298 + 0.1782i | 1.0723 + 0.1843i | 1.0268 + 0.2010i |
| 25 | 0.9571 + 0.1742i | 0.9240 + 0.1503i | 1.0655 + 0.1717i | 1.1358 + 0.1228i |
| 25.5 | 0.8680 + 0.1530i | 0.9206 + 0.1491i | 1.0838 + 0.1610i | 1.0009 + 0.1570i |
| 26 | 0.9294 + 0.2082i | 0.9297 + 0.1559i | 1.0424 + 0.2248i | 1.0467 + 0.1461i |
| 26.5 | 0.9539 + 0.2438i | 0.9401 + 0.1658i | 1.0737 + 0.2562i | 1.0556 + 0.1522i |
| 27 | 0.9122 + 0.1735i | 0.8662 + 0.1446i | 1.0072 + 0.1528i | 1.1002 + 0.1441i |
| 27.5 | 0.9170 + 0.1714i | 0.8778 + 0.1234i | 1.0092 + 0.1421i | 1.1104 + 0.1311i |
| 28 | 0.9289 + 0.1655i | 0.8389 + 0.2190i | 1.0132 + 0.1785i | 1.1095 + 0.1470i |

| SNR/w | w80 | w81 | w82 | w83 |
|---|---|---|---|---|
| 7 | 1.2111 + 0.6836i | 1.1269 + 0.6205i | 1.3685 + 0.3795i | 1.2525 + 0.3664i |
| 7.5 | 1.1547 + 0.6858i | 1.1852 + 0.7101i | 1.3117 + 0.3337i | 1.3460 + 0.3393i |

-continued

| | | | | |
|---|---|---|---|---|
| 8 | 1.2660 + 0.3053i | 1.2660 + 0.3053i | 1.2660 + 0.3053i | 1.2660 + 0.3053i |
| 8.5 | 1.3421 + 0.2955i | 1.3421 + 0.2955i | 1.3421 + 0.2955i | 1.3421 + 0.2955i |
| 9 | 0.5708 + 0.2334i | 0.5708 + 0.2334i | 0.5708 + 0.2334i | 0.5708 + 0.2334i |
| 9.5 | 0.6013 + 0.2261i | 0.6013 + 0.2261i | 0.6013 + 0.2261i | 0.6013 + 0.2261i |
| 10 | 0.6259 + 0.2172i | 0.6259 + 0.2172i | 0.6259 + 0.2172i | 0.6259 + 0.2172i |
| 10.5 | 0.6430 + 0.2081i | 0.6430 + 0.2081i | 0.6430 + 0.2081i | 0.6430 + 0.2081i |
| 11 | 1.1604 + 0.7831i | 1.1959 + 0.8017i | 1.1467 + 0.8044i | 1.1797 + 0.8257i |
| 11.5 | 1.1686 + 0.7844i | 1.2056 + 0.8024i | 1.1407 + 0.8086i | 1.1823 + 0.8348i |
| 12 | 1.1697 + 0.7849i | 1.2122 + 0.7997i | 1.1329 + 0.8240i | 1.1781 + 0.8474i |
| 12.5 | 1.2313 + 0.7226i | 1.3069 + 0.7502i | 1.2313 + 0.7226i | 1.3069 + 0.7502i |
| 13 | 0.7594 + 0.1711i | 0.7594 + 0.1711i | 0.7594 + 0.1711i | 0.7594 + 0.1711i |
| 13.5 | 1.1992 + 0.7044i | 1.3555 + 0.7570i | 1.1832 + 0.6735i | 1.3044 + 0.7014i |
| 14 | 1.3895 + 0.9370i | 1.3266 + 0.8316i | 1.4268 + 0.9110i | 1.3266 + 0.8316i |
| 14.5 | 1.4191 + 0.9375i | 1.3416 + 0.8265i | 1.4455 + 0.8881i | 1.3416 + 0.8265i |
| 15 | 1.6166 + 0.6733i | 1.5327 + 0.5881i | 1.3344 + 0.4056i | 1.3372 + 0.4255i |
| 15.5 | 1.4949 + 0.5621i | 1.4771 + 0.5677i | 1.3463 + 0.3922i | 1.3447 + 0.4029i |
| 16 | 1.4894 + 0.4824i | 1.5041 + 0.5324i | 1.3069 + 0.3665i | 1.3069 + 0.3665i |
| 16.5 | 1.4385 + 0.3455i | 1.4852 + 0.3323i | 1.2393 + 0.3381i | 1.2393 + 0.3381i |
| 17 | 1.4458 + 0.3440i | 1.4918 + 0.3307i | 1.2352 + 0.3414i | 1.2352 + 0.3414i |
| 17.5 | 1.4472 + 0.3429i | 1.4936 + 0.3303i | 1.2319 + 0.3447i | 1.2319 + 0.3447i |
| 18 | 1.4449 + 0.3401i | 1.4915 + 0.3280i | 1.2294 + 0.3473i | 1.2294 + 0.3473i |
| 18.5 | 1.4077 + 0.2179i | 1.3384 + 0.2148i | 1.1187 + 0.2595i | 1.1404 + 0.2530i |
| 19 | 1.3931 + 0.2132i | 1.3188 + 0.2086i | 1.1044 + 0.2532i | 1.1283 + 0.2456i |
| 19.5 | 1.3981 + 0.2090i | 1.2948 + 0.1953i | 1.0785 + 0.2426i | 1.1091 + 0.2350i |
| 20 | 1.7815 + 0.4751i | 1.4947 + 0.5250i | 1.2330 + 0.5211i | 1.2924 + 0.5254i |
| 20.5 | 1.4528 + 0.2817i | 1.3601 + 0.2817i | 1.1691 + 0.3120i | 1.2009 + 0.2917i |
| 21 | 1.9010 + 0.4585i | 1.6938 + 0.3559i | 1.2752 + 0.4149i | 1.1803 + 0.4240i |
| 21.5 | 1.5210 + 0.4295i | 1.3922 + 0.3763i | 1.2275 + 0.4595i | 1.2578 + 0.4012i |
| 22 | 1.8348 + 0.3993i | 1.5329 + 0.3997i | 1.3013 + 0.4349i | 1.1899 + 0.4442i |
| 22.5 | 1.5888 + 0.4053i | 1.4083 + 0.4183i | 1.1560 + 0.4261i | 1.2651 + 0.4195i |
| 23 | 1.6211 + 0.3847i | 1.4209 + 0.4485i | 1.1797 + 0.4135i | 1.2791 + 0.4462i |
| 23.5 | 1.3219 + 0.5378i | 1.3808 + 0.4436i | 1.1930 + 0.4695i | 1.2166 + 0.4068i |
| 24 | 1.4544 + 0.5247i | 1.2839 + 0.5031i | 1.3919 + 0.3970i | 1.2020 + 0.4350i |
| 24.5 | 1.2528 + 0.5442i | 1.3771 + 0.4900i | 1.1779 + 0.4401i | 1.2795 + 0.4047i |
| 25 | 1.2983 + 0.5282i | 1.4160 + 0.4599i | 1.1643 + 0.5224i | 1.1475 + 0.4397i |
| 25.5 | 1.2159 + 0.4133i | 1.5064 + 0.3808i | 1.1497 + 0.3852i | 1.3705 + 0.3603i |
| 26 | 1.2978 + 0.5029i | 1.3930 + 0.4106i | 1.1805 + 0.5049i | 1.1527 + 0.4078i |
| 26.5 | 1.4481 + 0.5040i | 1.3937 + 0.4028i | 1.1626 + 0.4656i | 1.2689 + 0.4386i |
| 27 | 1.3902 + 0.4354i | 1.2902 + 0.3800i | 1.1890 + 0.4695i | 1.1811 + 0.3714i |
| 27.5 | 1.3263 + 0.4151i | 1.4095 + 0.3204i | 1.2199 + 0.4281i | 1.1604 + 0.3543i |
| 28 | 1.3867 + 0.4311i | 1.4607 + 0.3299i | 1.2745 + 0.4347i | 1.1818 + 0.3938i |

| SNR/w | w84 | w85 | w86 | w87 |
|---|---|---|---|---|
| 7 | 1.1269 + 0.6205i | 1.0807 + 0.5881i | 1.2525 + 0.3664i | 1.1912 + 0.3587i |
| 7.5 | 1.0763 + 0.6220i | 1.0763 + 0.6220i | 1.2101 + 0.3241i | 1.2101 + 0.3241i |
| 8 | 1.1122 + 0.6781i | 1.1122 + 0.6781i | 1.1122 + 0.6781i | 1.1122 + 0.6781i |
| 8.5 | 1.1699 + 0.7434i | 1.1699 + 0.7434i | 1.1699 + 0.7434i | 1.1699 + 0.7434i |
| 9 | 0.5708 + 0.2334i | 0.5708 + 0.2334i | 0.5708 + 0.2334i | 0.5708 + 0.2334i |
| 9.5 | 0.6013 + 0.2261i | 0.6013 + 0.2261i | 0.6013 + 0.2261i | 0.6013 + 0.2261i |
| 10 | 0.6259 + 0.2172i | 0.6259 + 0.2172i | 0.6259 + 0.2172i | 0.6259 + 0.2172i |
| 10.5 | 0.6430 + 0.2081i | 0.6430 + 0.2081i | 0.6430 + 0.2081i | 0.6430 + 0.2081i |
| 11 | 1.1335 + 0.7681i | 1.1604 + 0.7831i | 1.1335 + 0.7681i | 1.1467 + 0.8044i |
| 11.5 | 1.1400 + 0.7694i | 1.1686 + 0.7844i | 1.1407 + 0.8086i | 1.1407 + 0.8086i |
| 12 | 1.1397 + 0.7686i | 1.1697 + 0.7849i | 1.1329 + 0.8240i | 1.1329 + 0.8240i |
| 12.5 | 1.1708 + 0.6384i | 1.2017 + 0.6448i | 1.1708 + 0.6384i | 1.2017 + 0.6448i |
| 13 | 0.7594 + 0.1711i | 0.7594 + 0.1711i | 0.7594 + 0.1711i | 0.7594 + 0.1711i |
| 13.5 | 1.1698 + 0.5970i | 1.2444 + 0.5981i | 1.1698 + 0.5970i | 1.2444 + 0.5981i |
| 14 | 1.4740 + 0.5832i | 1.4740 + 0.5832i | 1.5083 + 0.5866i | 1.5083 + 0.5866i |
| 14.5 | 1.4809 + 0.5569i | 1.4809 + 0.5569i | 1.5092 + 0.5616i | 1.5092 + 0.5616i |
| 15 | 1.6400 + 0.4397i | 1.6400 + 0.4397i | 1.3800 + 0.3572i | 1.3800 + 0.3572i |
| 15.5 | 1.6403 + 0.5309i | 1.5852 + 0.5183i | 1.3431 + 0.3554i | 1.3431 + 0.3554i |
| 16 | 1.5903 + 0.4644i | 1.6566 + 0.5241i | 1.2875 + 0.3247i | 1.2875 + 0.3247i |
| 16.5 | 1.8518 + 0.4951i | 1.6966 + 0.3427i | 1.1870 + 0.3055i | 1.1870 + 0.3055i |
| 17 | 1.8705 + 0.5044i | 1.7104 + 0.3345i | 1.1851 + 0.3028i | 1.1851 + 0.3028i |
| 17.5 | 1.8868 + 0.5097i | 1.7156 + 0.3328i | 1.1839 + 0.2997i | 1.1839 + 0.2997i |
| 18 | 1.8862 + 0.5096i | 1.7134 + 0.3314i | 1.1821 + 0.2956i | 1.1821 + 0.2956i |
| 18.5 | 1.6531 + 0.2935i | 1.9314 + 0.4196i | 1.0809 + 0.2390i | 1.0809 + 0.2390i |
| 19 | 1.6349 + 0.2879i | 1.9151 + 0.4067i | 1.0632 + 0.2197i | 1.0632 + 0.2197i |
| 19.5 | 1.5971 + 0.2809i | 1.8304 + 0.3832i | 1.0382 + 0.2045i | 1.0382 + 0.2045i |
| 20 | 1.6486 + 0.3169i | 1.4854 + 0.3471i | 1.2402 + 0.3648i | 1.3024 + 0.3616i |
| 20.5 | 1.6350 + 0.2881i | 1.8444 + 0.4201i | 1.1109 + 0.2285i | 1.1109 + 0.2285i |
| 21 | 1.4242 + 0.2749i | 1.5512 + 0.2768i | 1.2791 + 0.3004i | 1.1734 + 0.3075i |
| 21.5 | 1.5387 + 0.2494i | 1.3855 + 0.2443i | 1.1759 + 0.2690i | 1.2344 + 0.2704i |
| 22 | 1.4158 + 0.2489i | 1.5984 + 0.2593i | 1.2925 + 0.3015i | 1.1810 + 0.3192i |
| 22.5 | 1.8004 + 0.3093i | 1.3843 + 0.2805i | 1.1504 + 0.2971i | 1.2457 + 0.2926i |
| 23 | 1.7497 + 0.3033i | 1.4218 + 0.3117i | 1.1757 + 0.2963i | 1.2821 + 0.2953i |
| 23.5 | 1.7837 + 0.3062i | 1.3978 + 0.3365i | 1.2218 + 0.2650i | 1.2151 + 0.3021i |
| 24 | 1.5721 + 0.3834i | 1.7484 + 0.3285i | 1.3331 + 0.3099i | 1.2153 + 0.3093i |

-continued

| | | | | |
|---|---|---|---|---|
| 24.5 | 1.7543 + 0.3201i | 1.4294 + 0.3521i | 1.1682 + 0.3125i | 1.2881 + 0.3079i |
| 25 | 1.5155 + 0.3070i | 1.3432 + 0.3541i | 1.1465 + 0.2989i | 1.2191 + 0.3646i |
| 25.5 | 1.7393 + 0.2807i | 1.6490 + 0.4561i | 1.1846 + 0.2701i | 1.3033 + 0.2639i |
| 26 | 1.6859 + 0.2482i | 1.3072 + 0.3236i | 1.5221 + 0.2723i | 1.1975 + 0.3375i |
| 26.5 | 1.6732 + 0.2462i | 1.3551 + 0.3008i | 1.5213 + 0.2743i | 1.2473 + 0.3399i |
| 27 | 1.4284 + 0.3107i | 1.2970 + 0.2793i | 1.0892 + 0.2786i | 1.1782 + 0.2634i |
| 27.5 | 1.5775 + 0.4006i | 1.2854 + 0.2866i | 1.0929 + 0.2569i | 1.1834 + 0.2541i |
| 28 | 1.6162 + 0.3509i | 1.3455 + 0.2946i | 1.1478 + 0.2771i | 1.2386 + 0.2982i |

| SNR/w | w88 | w89 | w90 | w91 |
|---|---|---|---|---|
| 7 | 1.1269 + 0.6205i | 1.0807 + 0.5881i | 1.2525 + 0.3664i | 1.1912 + 0.3587i |
| 7.5 | 1.0763 + 0.6220i | 1.0763 + 0.6220i | 1.2101 + 0.3241i | 1.2101 + 0.3241i |
| 8 | 1.1569 + 0.2955i | 1.1569 + 0.2955i | 1.1569 + 0.2955i | 1.1569 + 0.2955i |
| 8.5 | 1.1099 + 0.2755i | 1.1099 + 0.2755i | 1.1099 + 0.2755i | 1.1099 + 0.2755i |
| 9 | 0.5708 + 0.2334i | 0.5708 + 0.2334i | 0.5708 + 0.2334i | 0.5708 + 0.2334i |
| 9.5 | 0.6013 + 0.2261i | 0.6013 + 0.2261i | 0.6013 + 0.2261i | 0.6013 + 0.2261i |
| 10 | 0.6259 + 0.2172i | 0.6259 + 0.2172i | 0.6259 + 0.2172i | 0.6259 + 0.2172i |
| 10.5 | 0.6430 + 0.2081i | 0.6430 + 0.2081i | 0.6430 + 0.2081i | 0.6430 + 0.2081i |
| 11 | 1.1162 + 0.7425i | 1.1335 + 0.7681i | 1.1162 + 0.7425i | 1.1335 + 0.7681i |
| 11.5 | 1.1344 + 0.7387i | 1.1344 + 0.7387i | 1.1094 + 0.7540i | 1.1400 + 0.7694i |
| 12 | 1.1393 + 0.7213i | 1.1700 + 0.7305i | 1.1113 + 0.7527i | 1.1397 + 0.7686i |
| 12.5 | 1.1331 + 0.7163i | 1.1603 + 0.7237i | 1.1464 + 0.7012i | 1.1764 + 0.7112i |
| 13 | 0.7594 + 0.1711i | 0.7594 + 0.1711i | 0.7594 + 0.1711i | 0.7594 + 0.1711i |
| 13.5 | 1.0884 + 0.6773i | 1.1194 + 0.6718i | 1.0884 + 0.6773i | 1.1194 + 0.6718i |
| 14 | 1.1382 + 0.6389i | 1.1382 + 0.6389i | 1.1382 + 0.6389i | 1.1382 + 0.6389i |
| 14.5 | 1.1302 + 0.6266i | 1.1336 + 0.6433i | 1.1302 + 0.6266i | 1.1302 + 0.6266i |
| 15 | 1.0121 + 0.3496i | 1.0121 + 0.3496i | 1.0742 + 0.3535i | 1.0742 + 0.3535i |
| 15.5 | 1.0001 + 0.3453i | 1.0001 + 0.3453i | 1.0651 + 0.3506i | 1.0651 + 0.3506i |
| 16 | 0.9502 + 0.3185i | 0.9502 + 0.3185i | 1.0160 + 0.3216i | 1.0160 + 0.3216i |
| 16.5 | 0.9218 + 0.3707i | 0.9218 + 0.3707i | 0.9838 + 0.3658i | 0.9838 + 0.3658i |
| 17 | 0.9164 + 0.3736i | 0.9164 + 0.3736i | 0.9815 + 0.3696i | 0.9815 + 0.3696i |
| 17.5 | 0.9142 + 0.3769i | 0.9142 + 0.3769i | 0.9815 + 0.3740i | 0.9815 + 0.3740i |
| 18 | 0.9141 + 0.3832i | 0.9141 + 0.3832i | 0.9843 + 0.3807i | 0.9843 + 0.3807i |
| 18.5 | 0.8242 + 0.3278i | 0.8242 + 0.3278i | 0.8872 + 0.3145i | 0.8872 + 0.3145i |
| 19 | 0.8215 + 0.3242i | 0.8215 + 0.3242i | 0.8868 + 0.3103i | 0.8868 + 0.3103i |
| 19.5 | 0.8200 + 0.3300i | 0.8200 + 0.3300i | 0.8835 + 0.3126i | 0.8835 + 0.3126i |
| 20 | 0.9529 + 0.5004i | 0.9529 + 0.5004i | 1.0693 + 0.5130i | 1.0495 + 0.5116i |
| 20.5 | 0.8941 + 0.3936i | 0.8941 + 0.3936i | 0.9867 + 0.3771i | 0.9867 + 0.3771i |
| 21 | 0.8921 + 0.4264i | 0.8921 + 0.4264i | 0.9966 + 0.4266i | 1.0364 + 0.4264i |
| 21.5 | 0.9111 + 0.4525i | 0.9111 + 0.4525i | 1.0760 + 0.4526i | 1.0560 + 0.4480i |
| 22 | 0.8945 + 0.4361i | 0.8945 + 0.4361i | 1.0147 + 0.4454i | 1.0566 + 0.4440i |
| 22.5 | 0.8928 + 0.4472i | 0.8928 + 0.4472i | 1.0333 + 0.4413i | 0.9986 + 0.4359i |
| 23 | 0.9063 + 0.4225i | 0.9063 + 0.4225i | 1.0477 + 0.4197i | 1.0225 + 0.4080i |
| 23.5 | 0.9127 + 0.4335i | 0.9265 + 0.4155i | 1.0590 + 0.4526i | 1.0475 + 0.4190i |
| 24 | 0.8972 + 0.4131i | 0.8745 + 0.3937i | 1.0109 + 0.4143i | 1.0972 + 0.4234i |
| 24.5 | 0.8620 + 0.4205i | 0.8885 + 0.4188i | 1.0696 + 0.4404i | 0.9798 + 0.4306i |
| 25 | 0.9102 + 0.5075i | 0.9170 + 0.4303i | 1.0241 + 0.5303i | 1.0328 + 0.4412i |
| 25.5 | 0.9146 + 0.4349i | 0.9045 + 0.3595i | 1.0466 + 0.3967i | 0.9891 + 0.3453i |
| 26 | 1.0272 + 0.4905i | 1.0257 + 0.4280i | 0.9434 + 0.4788i | 0.9114 + 0.4552i |
| 26.5 | 0.9902 + 0.3600i | 0.9588 + 0.3951i | 1.0628 + 0.4448i | 0.9496 + 0.4697i |
| 27 | 1.0478 + 0.5049i | 1.0616 + 0.4245i | 0.9563 + 0.4822i | 0.9741 + 0.4130i |
| 27.5 | 1.0559 + 0.4504i | 1.0285 + 0.3785i | 0.9708 + 0.5009i | 0.9399 + 0.4335i |
| 28 | 0.9950 + 0.4764i | 0.9740 + 0.4084i | 0.9094 + 0.5124i | 0.9401 + 0.5713i |

| SNR/w | w92 | w93 | w94 | w95 |
|---|---|---|---|---|
| 7 | 1.0807 + 0.5881i | 1.0452 + 0.5641i | 1.1912 + 0.3587i | 1.1450 + 0.3528i |
| 7.5 | 1.0274 + 0.5831i | 1.0274 + 0.5831i | 1.1457 + 0.3170i | 1.1457 + 0.3170i |
| 8 | 1.0261 + 0.6066i | 1.0261 + 0.6066i | 1.0261 + 0.6066i | 1.0261 + 0.6066i |
| 8.5 | 0.9827 + 0.5890i | 0.9827 + 0.5890i | 0.9827 + 0.5890i | 0.9827 + 0.5890i |
| 9 | 0.5708 + 0.2334i | 0.5708 + 0.2334i | 0.5708 + 0.2334i | 0.5708 + 0.2334i |
| 9.5 | 0.6013 + 0.2261i | 0.6013 + 0.2261i | 0.6013 + 0.2261i | 0.6013 + 0.2261i |
| 10 | 0.6259 + 0.2172i | 0.6259 + 0.2172i | 0.6259 + 0.2172i | 0.6259 + 0.2172i |
| 10.5 | 0.6430 + 0.2081i | 0.6430 + 0.2081i | 0.6430 + 0.2081i | 0.6430 + 0.2081i |
| 11 | 1.1162 + 0.7425i | 1.1162 + 0.7425i | 1.0969 + 0.7444i | 1.1162 + 0.7425i |
| 11.5 | 1.1344 + 0.7387i | 1.1344 + 0.7387i | 1.1094 + 0.7540i | 1.1344 + 0.7387i |
| 12 | 1.1393 + 0.7213i | 1.1393 + 0.7213i | 1.1113 + 0.7527i | 1.1113 + 0.7527i |
| 12.5 | 1.1226 + 0.6493i | 1.1226 + 0.6493i | 1.1335 + 0.6333i | 1.1335 + 0.6333i |
| 13 | 0.7594 + 0.1711i | 0.7594 + 0.1711i | 0.7594 + 0.1711i | 0.7594 + 0.1711i |
| 13.5 | 1.0988 + 0.5976i | 1.1314 + 0.5794i | 1.0988 + 0.5976i | 1.1314 + 0.5794i |
| 14 | 1.2255 + 0.5065i | 1.2255 + 0.5065i | 1.2255 + 0.5065i | 1.2255 + 0.5065i |
| 14.5 | 1.2166 + 0.4913i | 1.2166 + 0.4913i | 1.2166 + 0.4913i | 1.2166 + 0.4913i |
| 15 | 1.0077 + 0.3323i | 1.0121 + 0.3496i | 1.0679 + 0.3346i | 1.0742 + 0.3535i |
| 15.5 | 1.0001 + 0.3324i | 1.0001 + 0.3324i | 1.0654 + 0.3327i | 1.0654 + 0.3327i |
| 16 | 0.9532 + 0.3048i | 0.9532 + 0.3048i | 1.0227 + 0.3047i | 1.0227 + 0.3047i |
| 16.5 | 0.9232 + 0.3415i | 0.9232 + 0.3415i | 0.9856 + 0.3333i | 0.9856 + 0.3333i |
| 17 | 0.9180 + 0.3375i | 0.9180 + 0.3375i | 0.9849 + 0.3298i | 0.9849 + 0.3298i |
| 17.5 | 0.9156 + 0.3305i | 0.9156 + 0.3305i | 0.9860 + 0.3236i | 0.9860 + 0.3236i |

-continued

| | | | | |
|---|---|---|---|---|
| 18 | 0.9151 + 0.3225i | 0.9151 + 0.3225i | 0.9886 + 0.3165i | 0.9886 + 0.3165i |
| 18.5 | 0.8214 + 0.2859i | 0.8214 + 0.2859i | 0.8935 + 0.2752i | 0.8935 + 0.2752i |
| 19 | 0.8108 + 0.2681i | 0.8108 + 0.2681i | 0.8869 + 0.2553i | 0.8869 + 0.2553i |
| 19.5 | 0.7990 + 0.2581i | 0.7990 + 0.2581i | 0.8734 + 0.2424i | 0.8734 + 0.2424i |
| 20 | 0.9736 + 0.3595i | 0.9736 + 0.3595i | 1.0786 + 0.3657i | 1.0560 + 0.3643i |
| 20.5 | 0.8765 + 0.2771i | 0.8765 + 0.2771i | 0.9717 + 0.2599i | 0.9717 + 0.2599i |
| 21 | 0.8935 + 0.3049i | 0.8935 + 0.3049i | 0.9947 + 0.3071i | 1.0286 + 0.3083i |
| 21.5 | 0.9102 + 0.3318i | 0.9102 + 0.3318i | 1.0507 + 0.3110i | 1.0342 + 0.3202i |
| 22 | 0.8991 + 0.3102i | 0.8991 + 0.3102i | 1.0146 + 0.3155i | 1.0502 + 0.3176i |
| 22.5 | 0.8913 + 0.3120i | 0.8913 + 0.3120i | 1.0329 + 0.3081i | 0.9965 + 0.3137i |
| 23 | 0.8923 + 0.2934i | 0.8923 + 0.2934i | 1.0507 + 0.2866i | 1.0098 + 0.2870i |
| 23.5 | 0.9208 + 0.2970i | 0.9208 + 0.2970i | 1.0587 + 0.2866i | 1.0664 + 0.3012i |
| 24 | 0.9184 + 0.2920i | 0.8887 + 0.2934i | 1.0221 + 0.3073i | 1.1006 + 0.3080i |
| 24.5 | 0.8874 + 0.2941i | 0.9092 + 0.3033i | 1.0686 + 0.3238i | 1.0059 + 0.3162i |
| 25 | 0.9443 + 0.2680i | 0.9308 + 0.3404i | 1.0467 + 0.2771i | 1.0251 + 0.3580i |
| 25.5 | 0.8628 + 0.2351i | 0.8976 + 0.2659i | 1.0804 + 0.2637i | 0.9941 + 0.2617i |
| 26 | 0.9236 + 0.2785i | 0.8965 + 0.3421i | 1.0143 + 0.3002i | 0.9068 + 0.3854i |
| 26.5 | 0.8975 + 0.2987i | 0.8675 + 0.3774i | 1.1092 + 0.3451i | 0.8734 + 0.4346i |
| 27 | 0.9128 + 0.2490i | 0.9100 + 0.3284i | 1.0094 + 0.2429i | 0.9848 + 0.3374i |
| 27.5 | 0.9282 + 0.2534i | 0.9606 + 0.3233i | 1.0203 + 0.2262i | 0.9167 + 0.3776i |
| 28 | 1.0045 + 0.2913i | 1.0508 + 0.3677i | 1.0666 + 0.2494i | 0.8323 + 0.4476i |

| SNR/w | w96 | w97 | w98 | w99 |
|---|---|---|---|---|
| 7 | 1.2111 + 0.6836i | 1.1269 + 0.6205i | 1.3685 + 0.3795i | 1.2525 + 0.3664i |
| 7.5 | 1.1547 + 0.6858i | 1.1852 + 0.7101i | 1.3117 + 0.3337i | 1.3460 + 0.3393i |
| 8 | 1.2660 + 0.3053i | 1.2660 + 0.3053i | 1.2660 + 0.3053i | 1.2660 + 0.3053i |
| 8.5 | 1.3421 + 0.2955i | 1.3421 + 0.2955i | 1.3421 + 0.2955i | 1.3421 + 0.2955i |
| 9 | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i |
| 11 | 0.9711 + 0.2223i | 0.9711 + 0.2223i | 0.9711 + 0.2223i | 0.9711 + 0.2223i |
| 11.5 | 0.9636 + 0.2130i | 0.9636 + 0.2130i | 0.9636 + 0.2130i | 0.9636 + 0.2130i |
| 12 | 0.9592 + 0.2058i | 0.9592 + 0.2058i | 0.9592 + 0.2058i | 0.9592 + 0.2058i |
| 12.5 | 0.9033 + 0.1775i | 0.9033 + 0.1775i | 0.9033 + 0.1775i | 0.9033 + 0.1775i |
| 13 | 0.4057 + 0.1622i | 0.4057 + 0.1622i | 0.4057 + 0.1622i | 0.4057 + 0.1622i |
| 13.5 | 0.8721 + 0.1617i | 0.8721 + 0.1617i | 0.8721 + 0.1617i | 0.8721 + 0.1617i |
| 14 | 0.8530 + 0.1539i | 0.8530 + 0.1539i | 0.8530 + 0.1539i | 0.8530 + 0.1539i |
| 14.5 | 0.8411 + 0.1470i | 0.8411 + 0.1470i | 0.8411 + 0.1470i | 0.8411 + 0.1470i |
| 15 | 0.6390 + 0.1131i | 0.6390 + 0.1131i | 0.6390 + 0.1131i | 0.6390 + 0.1131i |
| 15.5 | 0.6324 + 0.1096i | 0.6324 + 0.1096i | 0.6222 + 0.1093i | 0.6222 + 0.1093i |
| 16 | 0.5915 + 0.1102i | 0.5915 + 0.1102i | 0.5812 + 0.1101i | 0.5812 + 0.1101i |
| 16.5 | 0.5897 + 0.1157i | 0.5897 + 0.1157i | 0.5897 + 0.1157i | 0.5897 + 0.1157i |
| 17 | 0.5857 + 0.1156i | 0.5857 + 0.1156i | 0.5857 + 0.1156i | 0.5857 + 0.1156i |
| 17.5 | 0.5809 + 0.1157i | 0.5809 + 0.1157i | 0.5809 + 0.1157i | 0.5809 + 0.1157i |
| 18 | 0.5752 + 0.1044i | 0.5752 + 0.1044i | 0.5752 + 0.1044i | 0.5752 + 0.1044i |
| 18.5 | 0.4996 + 0.0925i | 0.4996 + 0.0925i | 0.4996 + 0.0925i | 0.4996 + 0.0925i |
| 19 | 0.4795 + 0.0818i | 0.4795 + 0.0818i | 0.4795 + 0.0818i | 0.4795 + 0.0818i |
| 19.5 | 0.4652 + 0.0749i | 0.4652 + 0.0749i | 0.4652 + 0.0749i | 0.4652 + 0.0749i |
| 20 | 0.6612 + 0.0694i | 0.6612 + 0.0694i | 0.6612 + 0.0694i | 0.6612 + 0.0694i |
| 20.5 | 0.5376 + 0.0651i | 0.5376 + 0.0651i | 0.5376 + 0.0651i | 0.5376 + 0.0651i |
| 21 | 0.5658 + 0.0610i | 0.5658 + 0.0610i | 0.5658 + 0.0610i | 0.5658 + 0.0610i |
| 21.5 | 0.5850 + 0.0617i | 0.5850 + 0.0617i | 0.5957 + 0.0622i | 0.5957 + 0.0622i |
| 22 | 0.5591 + 0.0583i | 0.5591 + 0.0583i | 0.5836 + 0.0583i | 0.5836 + 0.0583i |
| 22.5 | 0.5596 + 0.0585i | 0.5596 + 0.0585i | 0.5842 + 0.0598i | 0.5842 + 0.0598i |
| 23 | 0.5548 + 0.0623i | 0.5548 + 0.0623i | 0.5823 + 0.0593i | 0.5823 + 0.0593i |
| 23.5 | 0.5463 + 0.0579i | 0.5463 + 0.0579i | 0.5973 + 0.0581i | 0.5973 + 0.0581i |
| 24 | 0.5320 + 0.0551i | 0.5320 + 0.0551i | 0.5979 + 0.0547i | 0.5979 + 0.0547i |
| 24.5 | 0.5336 + 0.0530i | 0.5336 + 0.0530i | 0.6137 + 0.0524i | 0.6137 + 0.0524i |
| 25 | 0.5579 + 0.0562i | 0.5579 + 0.0562i | 0.6376 + 0.0520i | 0.6378 + 0.0621i |
| 25.5 | 0.5118 + 0.0433i | 0.5128 + 0.0705i | 0.5870 + 0.0440i | 0.5879 + 0.0655i |
| 26 | 0.5288 + 0.0400i | 0.5857 + 0.0687i | 0.4820 + 0.0208i | 0.6310 + 0.0929i |
| 26.5 | 0.5532 + 0.0309i | 0.5478 + 0.0912i | 0.6447 + 0.0402i | 0.6376 + 0.0755i |
| 27 | 0.5645 + 0.0293i | 0.5775 + 0.0917i | 0.4254 + 0.0322i | 0.6367 + 0.1004i |
| 27.5 | 0.5689 + 0.0303i | 0.5769 + 0.0968i | 0.4283 + 0.0333i | 0.6371 + 0.1067i |
| 28 | 0.5612 + 0.0506i | 0.5718 + 0.1142i | 0.4988 + 0.0234i | 0.6505 + 0.1199i |

| SNR/w | w100 | w101 | w102 | w103 |
|---|---|---|---|---|
| 7 | 1.1269 + 0.6205i | 1.0807 + 0.5881i | 1.2525 + 0.3664i | 1.1912 + 0.3587i |
| 7.5 | 1.0763 + 0.6220i | 1.0763 + 0.6220i | 1.2101 + 0.3241i | 1.2101 + 0.3241i |
| 8 | 1.1122 + 0.6781i | 1.1122 + 0.6781i | 1.1122 + 0.6781i | 1.1122 + 0.6781i |
| 8.5 | 1.1699 + 0.7434i | 1.1699 + 0.7434i | 1.1699 + 0.7434i | 1.1699 + 0.7434i |
| 9 | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i |
| 11 | 0.9711 + 0.2223i | 0.9711 + 0.2223i | 0.9711 + 0.2223i | 0.9711 + 0.2223i |

-continued

| | | | | |
|---|---|---|---|---|
| 11.5 | 0.9636 + 0.2130i | 0.9636 + 0.2130i | 0.9636 + 0.2130i | 0.9792 + 0.2085i |
| 12 | 0.9592 + 0.2058i | 0.9592 + 0.2058i | 0.9592 + 0.2058i | 0.9780 + 0.2025i |
| 12.5 | 0.9260 + 0.1773i | 0.9260 + 0.1773i | 0.9260 + 0.1773i | 0.9260 + 0.1773i |
| 13 | 0.4057 + 0.1622i | 0.4057 + 0.1622i | 0.4057 + 0.1622i | 0.4057 + 0.1622i |
| 13.5 | 0.8721 + 0.1617i | 0.8721 + 0.1617i | 0.8721 + 0.1617i | 0.8721 + 0.1617i |
| 14 | 0.8530 + 0.1539i | 0.8530 + 0.1539i | 0.8530 + 0.1539i | 0.8530 + 0.1539i |
| 14.5 | 0.8411 + 0.1470i | 0.8411 + 0.1470i | 0.8411 + 0.1470i | 0.8411 + 0.1470i |
| 15 | 0.6390 + 0.1131i | 0.6390 + 0.1131i | 0.6390 + 0.1131i | 0.6390 + 0.1131i |
| 15.5 | 0.6324 + 0.1096i | 0.6324 + 0.1096i | 0.6222 + 0.1093i | 0.6222 + 0.1093i |
| 16 | 0.5915 + 0.1102i | 0.5915 + 0.1102i | 0.5812 + 0.1101i | 0.5812 + 0.1101i |
| 16.5 | 0.5897 + 0.1157i | 0.5897 + 0.1157i | 0.5897 + 0.1157i | 0.5897 + 0.1157i |
| 17 | 0.5857 + 0.1156i | 0.5857 + 0.1156i | 0.5857 + 0.1156i | 0.5857 + 0.1156i |
| 17.5 | 0.5809 + 0.1157i | 0.5809 + 0.1157i | 0.5809 + 0.1157i | 0.5809 + 0.1157i |
| 18 | 0.5747 + 0.1252i | 0.5747 + 0.1252i | 0.5747 + 0.1252i | 0.5747 + 0.1252i |
| 18.5 | 0.5003 + 0.1452i | 0.5003 + 0.1452i | 0.5003 + 0.1452i | 0.5003 + 0.1452i |
| 19 | 0.4840 + 0.1638i | 0.4840 + 0.1638i | 0.4840 + 0.1638i | 0.4840 + 0.1638i |
| 19.5 | 0.4737 + 0.1800i | 0.4737 + 0.1800i | 0.4737 + 0.1800i | 0.4737 + 0.1800i |
| 20 | 0.6532 + 0.1712i | 0.6532 + 0.1712i | 0.6532 + 0.1712i | 0.6532 + 0.1712i |
| 20.5 | 0.5422 + 0.1817i | 0.5422 + 0.1817i | 0.5422 + 0.1817i | 0.5422 + 0.1817i |
| 21 | 0.5650 + 0.1728i | 0.5650 + 0.1728i | 0.5650 + 0.1728i | 0.5650 + 0.1728i |
| 21.5 | 0.5791 + 0.1814i | 0.5791 + 0.1814i | 0.5913 + 0.1828i | 0.5913 + 0.1828i |
| 22 | 0.5576 + 0.1733i | 0.5576 + 0.1733i | 0.5809 + 0.1737i | 0.5809 + 0.1737i |
| 22.5 | 0.5597 + 0.1807i | 0.5597 + 0.1807i | 0.5835 + 0.1806i | 0.5835 + 0.1806i |
| 23 | 0.5476 + 0.1727i | 0.5476 + 0.1727i | 0.5856 + 0.1752i | 0.5856 + 0.1752i |
| 23.5 | 0.5451 + 0.1746i | 0.5451 + 0.1746i | 0.5954 + 0.1757i | 0.5954 + 0.1757i |
| 24 | 0.5320 + 0.1673i | 0.5320 + 0.1673i | 0.5958 + 0.1663i | 0.5958 + 0.1663i |
| 24.5 | 0.5351 + 0.1608i | 0.5351 + 0.1608i | 0.6123 + 0.1597i | 0.6123 + 0.1597i |
| 25 | 0.5575 + 0.1766i | 0.5575 + 0.1624i | 0.6391 + 0.1800i | 0.6390 + 0.1629i |
| 25.5 | 0.5211 + 0.1908i | 0.5175 + 0.1547i | 0.5970 + 0.1831i | 0.5933 + 0.1507i |
| 26 | 0.5798 + 0.2126i | 0.5801 + 0.1655i | 0.6572 + 0.2101i | 0.6463 + 0.1533i |
| 26.5 | 0.5674 + 0.2153i | 0.5589 + 0.1584i | 0.6549 + 0.1897i | 0.6259 + 0.1463i |
| 27 | 0.5594 + 0.2218i | 0.5685 + 0.1676i | 0.6391 + 0.2359i | 0.6415 + 0.1699i |
| 27.5 | 0.5690 + 0.2288i | 0.5706 + 0.1684i | 0.6484 + 0.2299i | 0.6440 + 0.1694i |
| 28 | 0.5646 + 0.2390i | 0.5722 + 0.1799i | 0.6434 + 0.2525i | 0.6497 + 0.1851i |

| SNR/w | w104 | w105 | w106 | w107 |
|---|---|---|---|---|
| 7 | 1.1269 + 0.6205i | 1.0807 + 0.5881i | 1.2525 + 0.3664i | 1.1912 + 0.3587i |
| 7.5 | 1.0763 + 0.6220i | 1.0763 + 0.6220i | 1.2101 + 0.3241i | 1.2101 + 0.3241i |
| 8 | 1.1569 + 0.2955i | 1.1569 + 0.2955i | 1.1569 + 0.2955i | 1.1569 + 0.2955i |
| 8.5 | 1.1099 + 0.2755i | 1.1099 + 0.2755i | 1.1099 + 0.2755i | 1.1099 + 0.2755i |
| 9 | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i |
| 11 | 0.9711 + 0.2223i | 0.9711 + 0.2223i | 0.9711 + 0.2223i | 0.9711 + 0.2223i |
| 11.5 | 0.9636 + 0.2130i | 0.9636 + 0.2130i | 0.9636 + 0.2130i | 0.9636 + 0.2130i |
| 12 | 0.9592 + 0.2058i | 0.9592 + 0.2058i | 0.9592 + 0.2058i | 0.9780 + 0.2025i |
| 12.5 | 0.9260 + 0.1773i | 0.9260 + 0.1773i | 0.9260 + 0.1773i | 0.9260 + 0.1773i |
| 13 | 0.4057 + 0.1622i | 0.4057 + 0.1622i | 0.4057 + 0.1622i | 0.4057 + 0.1622i |
| 13.5 | 0.9385 + 0.1544i | 0.9385 + 0.1544i | 0.9385 + 0.1544i | 0.9385 + 0.1544i |
| 14 | 0.9435 + 0.1570i | 0.9435 + 0.1570i | 0.9435 + 0.1570i | 0.9435 + 0.1570i |
| 14.5 | 0.9336 + 0.1519i | 0.9336 + 0.1519i | 0.9336 + 0.1519i | 0.9336 + 0.1519i |
| 15 | 0.7343 + 0.1137i | 0.7343 + 0.1137i | 0.7176 + 0.1148i | 0.7176 + 0.1148i |
| 15.5 | 0.7311 + 0.1109i | 0.7311 + 0.1109i | 0.7060 + 0.1113i | 0.7060 + 0.1113i |
| 16 | 0.6870 + 0.1081i | 0.6870 + 0.1081i | 0.6603 + 0.1090i | 0.6603 + 0.1090i |
| 16.5 | 0.6798 + 0.1147i | 0.6798 + 0.1147i | 0.6798 + 0.1147i | 0.6798 + 0.1147i |
| 17 | 0.6913 + 0.1153i | 0.6913 + 0.1153i | 0.6701 + 0.1153i | 0.6701 + 0.1153i |
| 17.5 | 0.6999 + 0.1154i | 0.6999 + 0.1154i | 0.6778 + 0.1153i | 0.6778 + 0.1153i |
| 18 | 0.7126 + 0.1042i | 0.7126 + 0.1042i | 0.6920 + 0.1041i | 0.6920 + 0.1041i |
| 18.5 | 0.6081 + 0.0946i | 0.6081 + 0.0946i | 0.5851 + 0.0940i | 0.5851 + 0.0940i |
| 19 | 0.5973 + 0.0837i | 0.5973 + 0.0837i | 0.5724 + 0.0828i | 0.5724 + 0.0828i |
| 19.5 | 0.5855 + 0.0749i | 0.5855 + 0.0749i | 0.5626 + 0.0743i | 0.5626 + 0.0743i |
| 20 | 0.8398 + 0.0712i | 0.8398 + 0.0712i | 0.8161 + 0.0705i | 0.8161 + 0.0705i |
| 20.5 | 0.6828 + 0.0657i | 0.6828 + 0.0657i | 0.6828 + 0.0657i | 0.6828 + 0.0657i |
| 21 | 0.7538 + 0.0616i | 0.7538 + 0.0616i | 0.7099 + 0.0612i | 0.7099 + 0.0612i |
| 21.5 | 0.7661 + 0.0663i | 0.7661 + 0.0663i | 0.7313 + 0.0656i | 0.7313 + 0.0656i |
| 22 | 0.7749 + 0.0604i | 0.7749 + 0.0604i | 0.7105 + 0.0596i | 0.7105 + 0.0596i |
| 22.5 | 0.7668 + 0.0619i | 0.7668 + 0.0619i | 0.7061 + 0.0610i | 0.7061 + 0.0610i |
| 23 | 0.7676 + 0.0577i | 0.7676 + 0.0577i | 0.6978 + 0.0604i | 0.6978 + 0.0604i |
| 23.5 | 0.7905 + 0.0600i | 0.7905 + 0.0600i | 0.7024 + 0.0596i | 0.7024 + 0.0596i |
| 24 | 0.8058 + 0.0559i | 0.8058 + 0.0559i | 0.7006 + 0.0544i | 0.7006 + 0.0544i |
| 24.5 | 0.8228 + 0.0536i | 0.8228 + 0.0536i | 0.7137 + 0.0524i | 0.7137 + 0.0524i |
| 25 | 0.8167 + 0.0476i | 0.8301 + 0.0596i | 0.7280 + 0.0514i | 0.7263 + 0.0640i |
| 25.5 | 0.7861 + 0.0463i | 0.7641 + 0.0537i | 0.6743 + 0.0499i | 0.6743 + 0.0499i |
| 26 | 0.8256 + 0.0420i | 0.6508 + 0.0265i | 0.7670 + 0.0378i | 0.7001 + 0.0587i |
| 26.5 | 0.8065 + 0.0845i | 0.8269 + 0.0473i | 0.7329 + 0.0868i | 0.7278 + 0.0424i |
| 27 | 0.7854 + 0.0273i | 0.7838 + 0.0820i | 0.6971 + 0.0252i | 0.6977 + 0.0837i |

-continued

| | | | | |
|---|---|---|---|---|
| 27.5 | 0.7633 + 0.0268i | 0.7892 + 0.0699i | 0.6869 + 0.0273i | 0.6979 + 0.0911i |
| 28 | 0.8172 + 0.0455i | 0.7772 + 0.1040i | 0.7246 + 0.0275i | 0.7114 + 0.0993i |

| SNR/w | w108 | w109 | w110 | w111 |
|---|---|---|---|---|
| 7 | 1.0807 + 0.5881i | 1.0452 + 0.5641i | 1.1912 + 0.3587i | 1.1450 + 0.3528i |
| 7.5 | 1.0274 + 0.5831i | 1.0274 + 0.5831i | 1.1457 + 0.3170i | 1.1457 + 0.3170i |
| 8 | 1.0261 + 0.6066i | 1.0261 + 0.6066i | 1.0261 + 0.6066i | 1.0261 + 0.6066i |
| 8.5 | 0.9827 + 0.5890i | 0.9827 + 0.5890i | 0.9827 + 0.5890i | 0.9827 + 0.5890i |
| 9 | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i |
| 11 | 0.9711 + 0.2223i | 0.9846 + 0.2158i | 0.9846 + 0.2158i | 0.9846 + 0.2158i |
| 11.5 | 0.9792 + 0.2085i | 0.9792 + 0.2085i | 0.9792 + 0.2085i | 0.9792 + 0.2085i |
| 12 | 0.9780 + 0.2025i | 0.9780 + 0.2025i | 0.9780 + 0.2025i | 0.9780 + 0.2025i |
| 12.5 | 0.9511 + 0.1764i | 0.9511 + 0.1764i | 0.9511 + 0.1764i | 0.9511 + 0.1764i |
| 13 | 0.4057 + 0.1622i | 0.4057 + 0.1622i | 0.4057 + 0.1622i | 0.4057 + 0.1622i |
| 13.5 | 0.9385 + 0.1544i | 0.9385 + 0.1544i | 0.9385 + 0.1544i | 0.9385 + 0.1544i |
| 14 | 0.9435 + 0.1570i | 0.9435 + 0.1570i | 0.9435 + 0.1570i | 0.9435 + 0.1570i |
| 14.5 | 0.9336 + 0.1519i | 0.9336 + 0.1519i | 0.9336 + 0.1519i | 0.9336 + 0.1519i |
| 15 | 0.7343 + 0.1137i | 0.7343 + 0.1137i | 0.7343 + 0.1137i | 0.7176 + 0.1148i |
| 15.5 | 0.7311 + 0.1109i | 0.7311 + 0.1109i | 0.7060 + 0.1113i | 0.7060 + 0.1113i |
| 16 | 0.6870 + 0.1081i | 0.6870 + 0.1081i | 0.6603 + 0.1090i | 0.6603 + 0.1090i |
| 16.5 | 0.6798 + 0.1147i | 0.6798 + 0.1147i | 0.6663 + 0.1171i | 0.6663 + 0.1171i |
| 17 | 0.6913 + 0.1153i | 0.6913 + 0.1153i | 0.6701 + 0.1153i | 0.6701 + 0.1153i |
| 17.5 | 0.6999 + 0.1154i | 0.6999 + 0.1154i | 0.6778 + 0.1153i | 0.6778 + 0.1153i |
| 18 | 0.7109 + 0.1261i | 0.7109 + 0.1261i | 0.6899 + 0.1256i | 0.6899 + 0.1256i |
| 18.5 | 0.6066 + 0.1339i | 0.6066 + 0.1339i | 0.5834 + 0.1361i | 0.5834 + 0.1361i |
| 19 | 0.6004 + 0.1436i | 0.6004 + 0.1436i | 0.5758 + 0.1473i | 0.5758 + 0.1473i |
| 19.5 | 0.5954 + 0.1545i | 0.5954 + 0.1545i | 0.5727 + 0.1589i | 0.5727 + 0.1589i |
| 20 | 0.8325 + 0.1977i | 0.8325 + 0.1977i | 0.8062 + 0.1936i | 0.8062 + 0.1936i |
| 20.5 | 0.6888 + 0.1733i | 0.6888 + 0.1733i | 0.6888 + 0.1733i | 0.6888 + 0.1733i |
| 21 | 0.7518 + 0.1748i | 0.7518 + 0.1748i | 0.7082 + 0.1738i | 0.7082 + 0.1738i |
| 21.5 | 0.7671 + 0.1949i | 0.7671 + 0.1949i | 0.7259 + 0.1919i | 0.7259 + 0.1919i |
| 22 | 0.7716 + 0.1792i | 0.7716 + 0.1792i | 0.7083 + 0.1767i | 0.7083 + 0.1767i |
| 22.5 | 0.7649 + 0.1855i | 0.7649 + 0.1855i | 0.7041 + 0.1839i | 0.7041 + 0.1839i |
| 23 | 0.7752 + 0.1744i | 0.7752 + 0.1744i | 0.6976 + 0.1776i | 0.6976 + 0.1776i |
| 23.5 | 0.7921 + 0.1808i | 0.7921 + 0.1808i | 0.7011 + 0.1782i | 0.7011 + 0.1782i |
| 24 | 0.7978 + 0.1683i | 0.7978 + 0.1683i | 0.6964 + 0.1646i | 0.6964 + 0.1646i |
| 24.5 | 0.8117 + 0.1648i | 0.8117 + 0.1648i | 0.7096 + 0.1603i | 0.7096 + 0.1603i |
| 25 | 0.8267 + 0.1863i | 0.8324 + 0.1581i | 0.7321 + 0.1829i | 0.7299 + 0.1621i |
| 25.5 | 0.7796 + 0.1574i | 0.7610 + 0.1390i | 0.6803 + 0.1757i | 0.6806 + 0.1462i |
| 26 | 0.8174 + 0.1879i | 0.8223 + 0.1559i | 0.7337 + 0.1934i | 0.7270 + 0.1387i |
| 26.5 | 0.8099 + 0.1836i | 0.8587 + 0.1711i | 0.7310 + 0.1812i | 1.0556 + 0.1522i |
| 27 | 0.7918 + 0.2254i | 0.7850 + 0.1575i | 0.7135 + 0.2418i | 0.7115 + 0.1638i |
| 27.5 | 0.8189 + 0.2114i | 0.8022 + 0.1410i | 0.7337 + 0.2230i | 0.7228 + 0.1574i |
| 28 | 0.8716 + 0.1301i | 0.8012 + 0.1702i | 0.7245 + 0.2595i | 0.7276 + 0.1914i |

| SNR/w | w112 | w113 | w114 | w115 |
|---|---|---|---|---|
| 7 | 1.1269 + 0.6205i | 1.0807 + 0.5881i | 1.2525 + 0.3664i | 1.1912 + 0.3587i |
| 7.5 | 1.0763 + 0.6220i | 1.0763 + 0.6220i | 1.2101 + 0.3241i | 1.2101 + 0.3241i |
| 8 | 1.1569 + 0.2955i | 1.1569 + 0.2955i | 1.1569 + 0.2955i | 1.1569 + 0.2955i |
| 8.5 | 1.2418 + 0.2874i | 1.2418 + 0.2874i | 1.2418 + 0.2874i | 1.2418 + 0.2874i |
| 9 | 0.5474 + 0.2991i | 0.5474 + 0.2991i | 0.5474 + 0.2991i | 0.5474 + 0.2991i |
| 9.5 | 0.5682 + 0.3084i | 0.5682 + 0.3084i | 0.5682 + 0.3084i | 0.5682 + 0.3084i |
| 10 | 0.5832 + 0.3180i | 0.5832 + 0.3180i | 0.5832 + 0.3180i | 0.5832 + 0.3180i |
| 10.5 | 0.5923 + 0.3291i | 0.5923 + 0.3291i | 0.5923 + 0.3291i | 0.5923 + 0.3291i |
| 11 | 0.8423 + 0.5603i | 0.8423 + 0.5603i | 0.8423 + 0.5603i | 0.8423 + 0.5603i |
| 11.5 | 0.8325 + 0.5654i | 0.8325 + 0.5654i | 0.8325 + 0.5654i | 0.8325 + 0.5654i |
| 12 | 0.8216 + 0.5765i | 0.8216 + 0.5765i | 0.8216 + 0.5765i | 0.8216 + 0.5765i |
| 12.5 | 0.8199 + 0.5095i | 0.8199 + 0.5095i | 0.8199 + 0.5095i | 0.8199 + 0.5095i |
| 13 | 0.6241 + 0.3850i | 0.6241 + 0.3850i | 0.6241 + 0.3850i | 0.6241 + 0.3850i |
| 13.5 | 0.8068 + 0.4612i | 0.8068 + 0.4612i | 0.8068 + 0.4612i | 0.8068 + 0.4612i |
| 14 | 0.7991 + 0.4480i | 0.7991 + 0.4480i | 0.7991 + 0.4480i | 0.7991 + 0.4480i |
| 14.5 | 0.7896 + 0.4435i | 0.7896 + 0.4435i | 0.7896 + 0.4435i | 0.7896 + 0.4435i |
| 15 | 0.6440 + 0.3324i | 0.6440 + 0.3324i | 0.6440 + 0.3324i | 0.6440 + 0.3324i |
| 15.5 | 0.6322 + 0.3309i | 0.6322 + 0.3309i | 0.6322 + 0.3309i | 0.6322 + 0.3309i |
| 16 | 0.5983 + 0.3420i | 0.5983 + 0.3420i | 0.5983 + 0.3420i | 0.5983 + 0.3420i |
| 16.5 | 0.5902 + 0.3641i | 0.5902 + 0.3641i | 0.5902 + 0.3641i | 0.5902 + 0.3641i |
| 17 | 0.5863 + 0.3677i | 0.5863 + 0.3677i | 0.5863 + 0.3677i | 0.5863 + 0.3677i |
| 17.5 | 0.5812 + 0.3725i | 0.5812 + 0.3725i | 0.5812 + 0.3725i | 0.5812 + 0.3725i |
| 18 | 0.5743 + 0.3784i | 0.5743 + 0.3784i | 0.5743 + 0.3784i | 0.5743 + 0.3784i |
| 18.5 | 0.5248 + 0.4147i | 0.5248 + 0.4147i | 0.5248 + 0.4147i | 0.5248 + 0.4147i |
| 19 | 0.5240 + 0.4309i | 0.5240 + 0.4309i | 0.5240 + 0.4309i | 0.5240 + 0.4309i |
| 19.5 | 0.5263 + 0.4439i | 0.5263 + 0.4439i | 0.5263 + 0.4439i | 0.5263 + 0.4439i |
| 20 | 0.6133 + 0.4297i | 0.6133 + 0.4297i | 0.6133 + 0.4297i | 0.6133 + 0.4297i |
| 20.5 | 0.5665 + 0.4387i | 0.5665 + 0.4387i | 0.5665 + 0.4387i | 0.5665 + 0.4387i |

-continued

| | | | | |
|---|---|---|---|---|
| 21 | 0.5624 + 0.4230i | 0.5624 + 0.4230i | 0.5624 + 0.4230i | 0.5624 + 0.4230i |
| 21.5 | 0.5602 + 0.4348i | 0.5602 + 0.4348i | 0.5773 + 0.4365i | 0.5773 + 0.4365i |
| 22 | 0.5524 + 0.4197i | 0.5524 + 0.4197i | 0.5726 + 0.4192i | 0.5726 + 0.4192i |
| 22.5 | 0.5503 + 0.4300i | 0.5503 + 0.4300i | 0.5786 + 0.4315i | 0.5786 + 0.4315i |
| 23 | 0.5455 + 0.4271i | 0.5455 + 0.4271i | 0.5873 + 0.4287i | 0.5873 + 0.4287i |
| 23.5 | 0.5420 + 0.4303i | 0.5423 + 0.4132i | 0.5947 + 0.4316i | 0.5945 + 0.4140i |
| 24 | 0.5281 + 0.4273i | 0.5287 + 0.3983i | 0.5871 + 0.4265i | 0.5877 + 0.3978i |
| 24.5 | 0.5365 + 0.4381i | 0.5382 + 0.3853i | 0.5982 + 0.4418i | 0.6015 + 0.3864i |
| 25 | 0.5453 + 0.4454i | 0.5502 + 0.3898i | 0.6234 + 0.4539i | 0.6307 + 0.3941i |
| 25.5 | 0.5461 + 0.4689i | 0.5406 + 0.4028i | 0.6279 + 0.4619i | 0.6209 + 0.3959i |
| 26 | 0.5698 + 0.4829i | 0.5665 + 0.4039i | 0.6267 + 0.4766i | 0.6435 + 0.4035i |
| 26.5 | 0.5542 + 0.5035i | 0.5680 + 0.4220i | 0.6136 + 0.5202i | 0.6338 + 0.4274i |
| 27 | 0.5772 + 0.4729i | 0.6966 + 0.5064i | 0.6313 + 0.4262i | 0.6900 + 0.4641i |
| 27.5 | 0.5441 + 0.4997i | 0.7312 + 0.5058i | 0.6143 + 0.4752i | 0.6785 + 0.4286i |
| 28 | 0.5732 + 0.4753i | 0.7131 + 0.5308i | 0.6412 + 0.4359i | 0.6970 + 0.4732i |

| SNR/w | w116 | w117 | w118 | w119 |
|---|---|---|---|---|
| 7 | 1.0807 + 0.5881i | 1.0452 + 0.5641i | 1.1912 + 0.3587i | 1.1450 + 0.3528i |
| 7.5 | 1.0274 + 0.5831i | 1.0274 + 0.5831i | 1.1457 + 0.3170i | 1.1457 + 0.3170i |
| 8 | 1.0261 + 0.6066i | 1.0261 + 0.6066i | 1.0261 + 0.6066i | 1.0261 + 0.6066i |
| 8.5 | 1.0898 + 0.6771i | 1.0898 + 0.6771i | 1.0898 + 0.6771i | 1.0898 + 0.6771i |
| 9 | 0.5474 + 0.2991i | 0.5474 + 0.2991i | 0.5474 + 0.2991i | 0.5474 + 0.2991i |
| 9.5 | 0.5682 + 0.3084i | 0.5682 + 0.3084i | 0.5682 + 0.3084i | 0.5682 + 0.3084i |
| 10 | 0.5832 + 0.3180i | 0.5832 + 0.3180i | 0.5832 + 0.3180i | 0.5832 + 0.3180i |
| 10.5 | 0.5923 + 0.3291i | 0.5923 + 0.3291i | 0.5923 + 0.3291i | 0.5923 + 0.3291i |
| 11 | 0.8423 + 0.5603i | 0.8423 + 0.5603i | 0.8423 + 0.5603i | 0.8423 + 0.5603i |
| 11.5 | 0.8325 + 0.5654i | 0.8325 + 0.5654i | 0.8325 + 0.5654i | 0.8325 + 0.5654i |
| 12 | 0.8216 + 0.5765i | 0.8216 + 0.5765i | 0.8216 + 0.5765i | 0.8216 + 0.5765i |
| 12.5 | 0.8373 + 0.5007i | 0.8373 + 0.5007i | 0.8373 + 0.5007i | 0.8373 + 0.5007i |
| 13 | 0.6241 + 0.3850i | 0.6241 + 0.3850i | 0.6241 + 0.3850i | 0.6241 + 0.3850i |
| 13.5 | 0.8068 + 0.4612i | 0.8068 + 0.4612i | 0.8068 + 0.4612i | 0.8152 + 0.4479i |
| 14 | 0.8004 + 0.4148i | 0.8004 + 0.4148i | 0.8004 + 0.4148i | 0.8004 + 0.4148i |
| 14.5 | 0.7936 + 0.4044i | 0.7936 + 0.4044i | 0.7936 + 0.4044i | 0.7936 + 0.4044i |
| 15 | 0.6440 + 0.3324i | 0.6440 + 0.3324i | 0.6440 + 0.3324i | 0.6440 + 0.3324i |
| 15.5 | 0.6320 + 0.3157i | 0.6320 + 0.3157i | 0.6320 + 0.3157i | 0.6320 + 0.3157i |
| 16 | 0.5967 + 0.3234i | 0.5967 + 0.3234i | 0.5967 + 0.3234i | 0.5967 + 0.3234i |
| 16.5 | 0.5899 + 0.3417i | 0.5899 + 0.3417i | 0.5899 + 0.3417i | 0.5899 + 0.3417i |
| 17 | 0.5859 + 0.3394i | 0.5859 + 0.3394i | 0.5859 + 0.3394i | 0.5859 + 0.3394i |
| 17.5 | 0.5808 + 0.3357i | 0.5808 + 0.3357i | 0.5808 + 0.3357i | 0.5808 + 0.3357i |
| 18 | 0.5745 + 0.3275i | 0.5745 + 0.3275i | 0.5745 + 0.3275i | 0.5745 + 0.3275i |
| 18.5 | 0.5114 + 0.3280i | 0.5114 + 0.3280i | 0.5114 + 0.3280i | 0.5114 + 0.3280i |
| 19 | 0.5018 + 0.3260i | 0.5018 + 0.3260i | 0.5018 + 0.3260i | 0.5018 + 0.3260i |
| 19.5 | 0.4971 + 0.3267i | 0.4971 + 0.3267i | 0.4971 + 0.3267i | 0.4971 + 0.3267i |
| 20 | 0.6352 + 0.3103i | 0.6352 + 0.3103i | 0.6352 + 0.3103i | 0.6352 + 0.3103i |
| 20.5 | 0.5531 + 0.3135i | 0.5531 + 0.3135i | 0.5531 + 0.3135i | 0.5531 + 0.3135i |
| 21 | 0.5636 + 0.2986i | 0.5636 + 0.2986i | 0.5636 + 0.2986i | 0.5636 + 0.2986i |
| 21.5 | 0.5700 + 0.3071i | 0.5700 + 0.3071i | 0.5846 + 0.3087i | 0.5846 + 0.3087i |
| 22 | 0.5550 + 0.2935i | 0.5550 + 0.2935i | 0.5768 + 0.2944i | 0.5768 + 0.2944i |
| 22.5 | 0.5550 + 0.3043i | 0.5550 + 0.3043i | 0.5808 + 0.3056i | 0.5808 + 0.3056i |
| 23 | 0.5487 + 0.2990i | 0.5487 + 0.2990i | 0.5880 + 0.2980i | 0.5880 + 0.2980i |
| 23.5 | 0.5434 + 0.2954i | 0.5434 + 0.2954i | 0.5939 + 0.2963i | 0.5939 + 0.2963i |
| 24 | 0.5310 + 0.2798i | 0.5310 + 0.2903i | 0.5922 + 0.2794i | 0.5917 + 0.2898i |
| 24.5 | 0.5370 + 0.2654i | 0.5375 + 0.2877i | 0.6082 + 0.2642i | 0.6073 + 0.2878i |
| 25 | 0.5562 + 0.2716i | 0.5549 + 0.3013i | 0.6389 + 0.2737i | 0.6372 + 0.3073i |
| 25.5 | 0.5286 + 0.2713i | 0.5338 + 0.3241i | 0.6051 + 0.2663i | 0.6111 + 0.3180i |
| 26 | 0.5791 + 0.2819i | 0.5732 + 0.3319i | 0.6629 + 0.2838i | 0.6557 + 0.3430i |
| 26.5 | 0.5765 + 0.2788i | 0.5763 + 0.3431i | 0.6576 + 0.2694i | 0.6479 + 0.3478i |
| 27 | 0.5461 + 0.2809i | 0.5401 + 0.3444i | 0.6216 + 0.3057i | 0.5842 + 0.3465i |
| 27.5 | 0.5678 + 0.2914i | 0.5691 + 0.3548i | 0.6493 + 0.2928i | 0.6423 + 0.3564i |
| 28 | 0.5488 + 0.2953i | 0.5454 + 0.3628i | 0.6317 + 0.3194i | 0.5938 + 0.3612i |

| SNR/w | w120 | w121 | w122 | w123 |
|---|---|---|---|---|
| 7 | 1.0807 + 0.5881i | 1.0452 + 0.5641i | 1.1912 + 0.3587i | 1.1450 + 0.3528i |
| 7.5 | 1.0274 + 0.5831i | 1.0274 + 0.5831i | 1.1457 + 0.3170i | 1.1457 + 0.3170i |
| 8 | 1.1020 + 0.2908i | 1.1020 + 0.2908i | 1.1020 + 0.2908i | 1.1020 + 0.2908i |
| 8.5 | 1.0834 + 0.2747i | 1.0834 + 0.2747i | 1.0834 + 0.2747i | 1.1099 + 0.2755i |
| 9 | 0.5474 + 0.2991i | 0.5474 + 0.2991i | 0.5474 + 0.2991i | 0.5474 + 0.2991i |
| 9.5 | 0.5682 + 0.3084i | 0.5682 + 0.3084i | 0.5682 + 0.3084i | 0.5682 + 0.3084i |
| 10 | 0.5832 + 0.3180i | 0.5832 + 0.3180i | 0.5832 + 0.3180i | 0.5832 + 0.3180i |
| 10.5 | 0.5923 + 0.3291i | 0.5923 + 0.3291i | 0.5923 + 0.3291i | 0.5923 + 0.3291i |
| 11 | 0.8423 + 0.5603i | 0.8423 + 0.5603i | 0.8423 + 0.5603i | 0.8423 + 0.5603i |
| 11.5 | 0.8325 + 0.5654i | 0.8325 + 0.5654i | 0.8325 + 0.5654i | 0.8325 + 0.5654i |
| 12 | 0.8216 + 0.5765i | 0.8348 + 0.5590i | 0.8216 + 0.5765i | 0.8216 + 0.5765i |
| 12.5 | 0.8267 + 0.5267i | 0.8199 + 0.5095i | 0.8199 + 0.5095i | 0.8199 + 0.5095i |
| 13 | 0.6241 + 0.3850i | 0.6241 + 0.3850i | 0.6241 + 0.3850i | 0.6241 + 0.3850i |
| 13.5 | 0.8271 + 0.4933i | 0.8271 + 0.4933i | 0.8271 + 0.4933i | 0.8271 + 0.4933i |
| 14 | 0.8721 + 0.4834i | 0.8721 + 0.4834i | 0.8721 + 0.4834i | 0.8721 + 0.4834i |

-continued

| | | | | |
|---|---|---|---|---|
| 14.5 | 0.8681 + 0.4817i | 0.8681 + 0.4817i | 0.8681 + 0.4817i | 0.8681 + 0.4817i |
| 15 | 0.7298 + 0.3374i | 0.7298 + 0.3374i | 0.7298 + 0.3374i | 0.7298 + 0.3374i |
| 15.5 | 0.7191 + 0.3382i | 0.7191 + 0.3382i | 0.7002 + 0.3406i | 0.7002 + 0.3406i |
| 16 | 0.6879 + 0.3355i | 0.6879 + 0.3355i | 0.6678 + 0.3387i | 0.6678 + 0.3387i |
| 16.5 | 0.6909 + 0.3652i | 0.6909 + 0.3652i | 0.6696 + 0.3643i | 0.6696 + 0.3643i |
| 17 | 0.6985 + 0.3688i | 0.6985 + 0.3688i | 0.6741 + 0.3677i | 0.6741 + 0.3677i |
| 17.5 | 0.7102 + 0.3730i | 0.7102 + 0.3730i | 0.6848 + 0.3721i | 0.6848 + 0.3721i |
| 18 | 0.7224 + 0.3798i | 0.7224 + 0.3798i | 0.6977 + 0.3787i | 0.6977 + 0.3787i |
| 18.5 | 0.6468 + 0.3779i | 0.6468 + 0.3779i | 0.6242 + 0.3848i | 0.6242 + 0.3848i |
| 19 | 0.6612 + 0.3808i | 0.6612 + 0.3808i | 0.6402 + 0.3895i | 0.6402 + 0.3895i |
| 19.5 | 0.6725 + 0.3895i | 0.6725 + 0.3895i | 0.6533 + 0.3984i | 0.6533 + 0.3984i |
| 20 | 0.7959 + 0.4709i | 0.7959 + 0.4709i | 0.7609 + 0.4630i | 0.7609 + 0.4630i |
| 20.5 | 0.7475 + 0.4190i | 0.7475 + 0.4190i | 0.7128 + 0.4242i | 0.7128 + 0.4242i |
| 21 | 0.7483 + 0.4245i | 0.7483 + 0.4245i | 0.7037 + 0.4239i | 0.7037 + 0.4239i |
| 21.5 | 0.7656 + 0.4486i | 0.7656 + 0.4486i | 0.7088 + 0.4464i | 0.7088 + 0.4464i |
| 22 | 0.7603 + 0.4266i | 0.7603 + 0.4266i | 0.6987 + 0.4225i | 0.6987 + 0.4225i |
| 22.5 | 0.7670 + 0.4425i | 0.7670 + 0.4425i | 0.7000 + 0.4383i | 0.7000 + 0.4383i |
| 23 | 0.7810 + 0.4229i | 0.7810 + 0.4229i | 0.6975 + 0.4436i | 0.7082 + 0.4208i |
| 23.5 | 0.7984 + 0.4234i | 0.7931 + 0.4034i | 0.7006 + 0.4317i | 0.7002 + 0.4120i |
| 24 | 0.7750 + 0.4250i | 0.7798 + 0.3969i | 0.6858 + 0.4247i | 0.6867 + 0.3966i |
| 24.5 | 0.7755 + 0.4408i | 0.7713 + 0.3997i | 0.6867 + 0.4431i | 0.6891 + 0.3906i |
| 25 | 0.7995 + 0.4820i | 0.8171 + 0.4128i | 0.7102 + 0.4660i | 0.7219 + 0.4003i |
| 25.5 | 0.8154 + 0.4444i | 0.8041 + 0.3748i | 0.7181 + 0.4538i | 0.7090 + 0.3874i |
| 26 | 0.7109 + 0.5267i | 0.7933 + 0.4911i | 0.6853 + 0.4989i | 0.7434 + 0.4295i |
| 26.5 | 0.7330 + 0.5364i | 0.7626 + 0.4705i | 0.6735 + 0.5353i | 0.7029 + 0.4406i |
| 27 | 0.8413 + 0.5029i | 0.8110 + 0.4476i | 0.6888 + 0.3768i | 0.7429 + 0.4148i |
| 27.5 | 0.8444 + 0.5124i | 0.7991 + 0.4492i | 0.6143 + 0.4752i | 0.7216 + 0.4137i |
| 28 | 0.8115 + 0.5747i | 0.9164 + 0.3766i | 0.7047 + 0.3807i | 0.7428 + 0.4237i |

| SNR/w | w124 | w125 | w126 | w127 |
|---|---|---|---|---|
| 7 | 1.0452 + 0.5641i | 1.0452 + 0.5641i | 1.1450 + 0.3528i | 1.1450 + 0.3528i |
| 7.5 | 0.9947 + 0.5573i | 1.0274 + 0.5831i | 1.1037 + 0.3118i | 1.1457 + 0.3170i |
| 8 | 0.9836 + 0.5710i | 0.9836 + 0.5710i | 0.9836 + 0.5710i | 0.9836 + 0.5710i |
| 8.5 | 0.9632 + 0.5714i | 0.9632 + 0.5714i | 0.9632 + 0.5714i | 0.9827 + 0.5890i |
| 9 | 0.5474 + 0.2991i | 0.5474 + 0.2991i | 0.5474 + 0.2991i | 0.5474 + 0.2991i |
| 9.5 | 0.5682 + 0.3084i | 0.5682 + 0.3084i | 0.5682 + 0.3084i | 0.5682 + 0.3084i |
| 10 | 0.5832 + 0.3180i | 0.5832 + 0.3180i | 0.5832 + 0.3180i | 0.5832 + 0.3180i |
| 10.5 | 0.5923 + 0.3291i | 0.5923 + 0.3291i | 0.5923 + 0.3291i | 0.5923 + 0.3291i |
| 11 | 0.8423 + 0.5603i | 0.8529 + 0.5456i | 0.8423 + 0.5603i | 0.8423 + 0.5603i |
| 11.5 | 0.8325 + 0.5654i | 0.8450 + 0.5501i | 0.8325 + 0.5654i | 0.8325 + 0.5654i |
| 12 | 0.8216 + 0.5765i | 0.8348 + 0.5590i | 0.8216 + 0.5765i | 0.8216 + 0.5765i |
| 12.5 | 0.8430 + 0.5170i | 0.8373 + 0.5007i | 0.8373 + 0.5007i | 0.8373 + 0.5007i |
| 13 | 0.6241 + 0.3850i | 0.6241 + 0.3850i | 0.6241 + 0.3850i | 0.6241 + 0.3850i |
| 13.5 | 0.8271 + 0.4933i | 0.8409 + 0.4757i | 0.8409 + 0.4757i | 0.8409 + 0.4757i |
| 14 | 0.8761 + 0.4396i | 0.8761 + 0.4396i | 0.8761 + 0.4396i | 0.8761 + 0.4396i |
| 14.5 | 0.8755 + 0.4298i | 0.8755 + 0.4298i | 0.8755 + 0.4298i | 0.8755 + 0.4298i |
| 15 | 0.7298 + 0.3374i | 0.7298 + 0.3374i | 0.7194 + 0.3284i | 0.7194 + 0.3284i |
| 15.5 | 0.7225 + 0.3243i | 0.7225 + 0.3243i | 0.7028 + 0.3263i | 0.7028 + 0.3263i |
| 16 | 0.6878 + 0.3189i | 0.6878 + 0.3189i | 0.6669 + 0.3214i | 0.6669 + 0.3214i |
| 16.5 | 0.6898 + 0.3424i | 0.6898 + 0.3424i | 0.6688 + 0.3416i | 0.6688 + 0.3416i |
| 17 | 0.6964 + 0.3397i | 0.6964 + 0.3397i | 0.6724 + 0.3390i | 0.6724 + 0.3390i |
| 17.5 | 0.7068 + 0.3349i | 0.7068 + 0.3349i | 0.6820 + 0.3345i | 0.6820 + 0.3345i |
| 18 | 0.7189 + 0.3270i | 0.7189 + 0.3270i | 0.6951 + 0.3266i | 0.6951 + 0.3266i |
| 18.5 | 0.6273 + 0.3124i | 0.6273 + 0.3124i | 0.6029 + 0.3154i | 0.6029 + 0.3154i |
| 19 | 0.6298 + 0.3011i | 0.6298 + 0.3011i | 0.6058 + 0.3058i | 0.6058 + 0.3058i |
| 19.5 | 0.6322 + 0.2957i | 0.6322 + 0.2957i | 0.6103 + 0.3011i | 0.6103 + 0.3011i |
| 20 | 0.8165 + 0.3382i | 0.8165 + 0.3382i | 0.7854 + 0.3329i | 0.7854 + 0.3329i |
| 20.5 | 0.7235 + 0.2994i | 0.7235 + 0.2994i | 0.6941 + 0.3018i | 0.6941 + 0.3018i |
| 21 | 0.7494 + 0.3007i | 0.7494 + 0.3007i | 0.7055 + 0.2997i | 0.7055 + 0.2997i |
| 21.5 | 0.7665 + 0.3224i | 0.7665 + 0.3224i | 0.7166 + 0.3187i | 0.7166 + 0.3187i |
| 22 | 0.7666 + 0.3018i | 0.7666 + 0.3018i | 0.7041 + 0.2986i | 0.7041 + 0.2986i |
| 22.5 | 0.7664 + 0.3107i | 0.7664 + 0.3107i | 0.7025 + 0.3102i | 0.7025 + 0.3102i |
| 23 | 0.7756 + 0.2985i | 0.7756 + 0.2985i | 0.6967 + 0.2986i | 0.6967 + 0.2986i |
| 23.5 | 0.7952 + 0.2982i | 0.7952 + 0.2982i | 0.6980 + 0.2962i | 0.6980 + 0.2962i |
| 24 | 0.7814 + 0.2774i | 0.7870 + 0.2866i | 0.6913 + 0.2777i | 0.6908 + 0.2880i |
| 24.5 | 0.7962 + 0.2783i | 0.7862 + 0.2937i | 0.7010 + 0.2666i | 0.6990 + 0.2890i |
| 25 | 0.8339 + 0.2736i | 0.8318 + 0.3245i | 0.7325 + 0.2751i | 0.7307 + 0.3150i |
| 25.5 | 0.7836 + 0.2479i | 0.7852 + 0.2984i | 0.6906 + 0.2579i | 0.6979 + 0.3074i |
| 26 | 0.8119 + 0.2687i | 0.8144 + 0.3360i | 0.7394 + 0.2759i | 0.7571 + 0.3617i |
| 26.5 | 0.8089 + 0.2759i | 0.7900 + 0.3695i | 0.7325 + 0.2706i | 0.7251 + 0.3586i |
| 27 | 0.8225 + 0.2737i | 0.8412 + 0.3609i | 0.7112 + 0.3146i | 0.7703 + 0.3556i |
| 27.5 | 0.8351 + 0.2795i | 0.8172 + 0.3610i | 0.7372 + 0.2864i | 0.7394 + 0.3488i |
| 28 | 0.9347 + 0.2772i | 0.8627 + 0.3189i | 0.7327 + 0.3199i | 0.8033 + 0.3671i |

| SNR/w | w128 | w129 | w130 | w131 |
|---|---|---|---|---|
| 7 | 0.2420 + 0.4138i | 0.2420 + 0.4138i | 0.2420 + 0.4138i | 0.2420 + 0.4138i |
| 7.5 | 0.2280 + 0.4017i | 0.2280 + 0.4017i | 0.2280 + 0.4017i | 0.2164 + 0.3766i |

-continued

| | | | | |
|---|---|---|---|---|
| 8 | 0.2188 + 0.3795i | 0.2188 + 0.3795i | 0.2188 + 0.3795i | 0.2188 + 0.3795i |
| 8.5 | 0.2067 + 0.3753i | 0.2067 + 0.3753i | 0.2067 + 0.3753i | 0.2067 + 0.3753i |
| 9 | 0.3931 + 2.0687i | 0.3041 + 1.5225i | 0.3041 + 1.5225i | 0.2910 + 1.4129i |
| 9.5 | 0.4001 + 2.0659i | 0.3016 + 1.5258i | 0.3016 + 1.5258i | 0.2850 + 1.4155i |
| 10 | 0.4076 + 2.0613i | 0.3009 + 1.5258i | 0.3009 + 1.5258i | 0.2854 + 1.4442i |
| 10.5 | 0.4367 + 2.0633i | 0.3041 + 1.5241i | 0.3041 + 1.5241i | 0.2857 + 1.4497i |
| 11 | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i |
| 12.5 | 0.1262 + 0.3791i | 0.1262 + 0.3791i | 0.1262 + 0.3791i | 0.1262 + 0.3791i |
| 13 | 0.7072 + 1.7916i | 0.3938 + 1.5314i | 0.5480 + 1.7046i | 0.3789 + 1.5583i |
| 13.5 | 0.1166 + 0.4366i | 0.1166 + 0.4366i | 0.1166 + 0.4366i | 0.1166 + 0.4366i |
| 14 | 0.1152 + 0.4655i | 0.1152 + 0.4655i | 0.1152 + 0.4655i | 0.1152 + 0.4655i |
| 14.5 | 0.1124 + 0.4809i | 0.1124 + 0.4809i | 0.1124 + 0.4809i | 0.1124 + 0.4809i |
| 15 | 0.1089 + 0.9337i | 0.1089 + 0.9337i | 0.1089 + 0.9337i | 0.1089 + 0.9337i |
| 15.5 | 0.1085 + 0.9312i | 0.1085 + 0.9312i | 0.1085 + 0.9312i | 0.1085 + 0.9312i |
| 16 | 0.1059 + 1.1569i | 0.1438 + 1.1408i | 0.1040 + 1.1819i | 0.1450 + 1.1564i |
| 16.5 | 0.0972 + 1.5339i | 0.1100 + 1.2587i | 0.1342 + 1.7892i | 0.1127 + 1.2073i |
| 17 | 0.0983 + 1.5325i | 0.1102 + 1.2536i | 0.1311 + 1.7918i | 0.1116 + 1.2028i |
| 17.5 | 0.0987 + 1.5243i | 0.1109 + 1.2478i | 0.1257 + 1.7839i | 0.1117 + 1.1979i |
| 18 | 0.1006 + 1.5247i | 0.1086 + 1.2380i | 0.1242 + 1.7780i | 0.1086 + 1.1943i |
| 18.5 | 0.0767 + 1.5118i | 0.0870 + 1.3422i | 0.1944 + 2.0287i | 0.0901 + 1.2929i |
| 19 | 0.0744 + 1.4981i | 0.0851 + 1.3326i | 0.1794 + 2.0056i | 0.0874 + 1.2840i |
| 19.5 | 0.0752 + 1.5337i | 0.0955 + 1.3157i | 0.1184 + 1.4863i | 0.0955 + 1.3157i |
| 20 | 0.1316 + 1.8965i | 0.0766 + 1.0786i | 0.0714 + 1.3185i | 0.0721 + 1.1636i |
| 20.5 | 0.0626 + 1.4912i | 0.0683 + 1.1894i | 0.0906 + 1.3933i | 0.0705 + 1.2277i |
| 21 | 0.0566 + 1.3765i | 0.0634 + 1.2157i | 0.1312 + 1.8435i | 0.0646 + 1.1619i |
| 21.5 | 0.0769 + 1.6079i | 0.0600 + 1.1808i | 0.0696 + 1.4311i | 0.0605 + 1.2664i |
| 22 | 0.0510 + 1.3552i | 0.0609 + 1.2217i | 0.1064 + 1.8045i | 0.0551 + 1.1486i |
| 22.5 | 0.0791 + 1.6235i | 0.0595 + 1.1619i | 0.0601 + 1.4463i | 0.0547 + 1.2748i |
| 23 | 0.0749 + 1.6355i | 0.0569 + 1.1877i | 0.0706 + 1.4379i | 0.0637 + 1.3045i |
| 23.5 | 0.0477 + 1.8317i | 0.0474 + 1.1599i | 0.0728 + 1.4375i | 0.0610 + 1.3181i |
| 24 | 0.0878 + 1.7221i | 0.0632 + 1.2393i | 0.0735 + 1.5241i | 0.0421 + 1.3702i |
| 24.5 | 0.0895 + 1.7536i | 0.0613 + 1.3638i | 0.0760 + 1.5470i | 0.0501 + 1.2243i |
| 25 | 0.0931 + 1.7166i | 0.0566 + 1.3482i | 0.0751 + 1.5225i | 0.0462 + 1.2117i |
| 25.5 | 0.0758 + 1.6507i | 0.0505 + 1.3310i | 0.0710 + 1.4902i | 0.0549 + 1.2097i |
| 26 | 0.0601 + 1.4639i | 0.0558 + 1.3274i | 0.1068 + 1.6195i | 0.0328 + 1.1706i |
| 26.5 | 0.0683 + 1.5203i | 0.0701 + 1.3841i | 0.0850 + 1.6726i | 0.0362 + 1.2588i |
| 27 | 0.0637 + 1.4870i | 0.0530 + 1.3497i | 0.0764 + 1.6418i | 0.0536 + 1.2353i |
| 27.5 | 0.0628 + 1.3974i | 0.0561 + 1.2894i | 0.0641 + 1.5359i | 0.1283 + 1.2196i |
| 28 | 0.0586 + 1.3727i | 0.1555 + 1.3034i | 0.0663 + 1.5122i | 0.1473 + 1.1900i |

| SNR/w | w132 | w133 | w134 | w135i |
|---|---|---|---|---|
| 7 | 0.2420 + 0.4138i | 0.2556 + 0.4501i | 0.2420 + 0.4138i | 0.2556 + 0.4501i |
| 7.5 | 0.2420 + 0.4261i | 0.2420 + 0.4261i | 0.2420 + 0.4261i | 0.2280 + 0.4017i |
| 8 | 0.2188 + 0.3795i | 0.2188 + 0.3795i | 0.2188 + 0.3795i | 0.2188 + 0.3795i |
| 8.5 | 0.2067 + 0.3753i | 0.2067 + 0.3753i | 0.2067 + 0.3753i | 0.2067 + 0.3753i |
| 9 | 0.3041 + 1.5225i | 0.2910 + 1.4129i | 0.2910 + 1.4129i | 0.2850 + 1.3540i |
| 9.5 | 0.3016 + 1.5258i | 0.2850 + 1.4155i | 0.2850 + 1.4155i | 0.2850 + 1.4155i |
| 10 | 0.3009 + 1.5258i | 0.2854 + 1.4442i | 0.2854 + 1.4442i | 0.2768 + 1.3998i |
| 10.5 | 0.3041 + 1.5241i | 0.2857 + 1.4497i | 0.2857 + 1.4497i | 0.2756 + 1.4128i |
| 11 | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i |
| 12.5 | 0.1262 + 0.3791i | 0.1262 + 0.3791i | 0.1262 + 0.3791i | 0.1262 + 0.3791i |
| 13 | 0.1726 + 1.2844i | 0.1953 + 1.3258i | 0.1726 + 1.2844i | 0.1953 + 1.3258i |
| 13.5 | 0.1166 + 0.4366i | 0.1166 + 0.4366i | 0.1166 + 0.4366i | 0.1166 + 0.4366i |
| 14 | 0.1152 + 0.4655i | 0.1152 + 0.4655i | 0.1152 + 0.4655i | 0.1152 + 0.4655i |
| 14.5 | 0.1124 + 0.4809i | 0.1124 + 0.4809i | 0.1124 + 0.4809i | 0.1124 + 0.4809i |
| 15 | 0.1557 + 0.8813i | 0.1557 + 0.8813i | 0.1557 + 0.8813i | 0.1557 + 0.8813i |
| 15.5 | 0.1630 + 0.8872i | 0.1630 + 0.8872i | 0.1630 + 0.8872i | 0.1630 + 0.8872i |
| 16 | 0.1528 + 0.9550i | 0.1668 + 0.9656i | 0.1528 + 0.9550i | 0.1668 + 0.9656i |
| 16.5 | 0.1134 + 0.9196i | 0.1137 + 0.9858i | 0.1134 + 0.9196i | 0.1137 + 0.9858i |
| 17 | 0.1130 + 0.9150i | 0.1137 + 0.9836i | 0.1130 + 0.9150i | 0.1137 + 0.9836i |
| 17.5 | 0.1131 + 0.9127i | 0.1143 + 0.9836i | 0.1131 + 0.9127i | 0.1143 + 0.9836i |
| 18 | 0.1042 + 0.9141i | 0.1072 + 0.9814i | 0.1042 + 0.9141i | 0.1055 + 0.9946i |
| 18.5 | 0.0881 + 1.0369i | 0.0875 + 1.1126i | 0.0881 + 1.0369i | 0.0875 + 1.1126i |
| 19 | 0.0808 + 1.0409i | 0.0820 + 1.1126i | 0.0808 + 1.0409i | 0.0820 + 1.1126i |
| 19.5 | 0.0762 + 1.0479i | 0.0803 + 1.1289i | 0.0762 + 1.0479i | 0.0803 + 1.1289i |
| 20 | 0.0703 + 0.7860i | 0.0676 + 0.8645i | 0.0703 + 0.7860i | 0.0683 + 0.8425i |
| 20.5 | 0.0650 + 0.9379i | 0.0667 + 1.0256i | 0.0650 + 0.9379i | 0.0667 + 1.0256i |
| 21 | 0.0641 + 0.9102i | 0.0644 + 1.0160i | 0.0641 + 0.9102i | 0.0644 + 1.0160i |
| 21.5 | 0.0589 + 0.8958i | 0.0594 + 1.0467i | 0.0589 + 0.8958i | 0.0594 + 1.0150i |
| 22 | 0.0634 + 0.8931i | 0.0605 + 0.9972i | 0.0634 + 0.8931i | 0.0583 + 1.0193i |
| 22.5 | 0.0600 + 0.8898i | 0.0596 + 1.0378i | 0.0600 + 0.8898i | 0.0611 + 0.9993i |
| 23 | 0.0532 + 0.8809i | 0.0510 + 1.0772i | 0.0502 + 0.9016i | 0.0557 + 1.0136i |
| 23.5 | 0.0574 + 0.8705i | 0.0537 + 1.0431i | 0.0579 + 0.8886i | 0.0564 + 0.9856i |
| 24 | 0.0570 + 0.9140i | 0.0611 + 1.1293i | 0.0580 + 0.9491i | 0.0593 + 1.0507i |

-continued

| | | | | |
|---|---|---|---|---|
| 24.5 | 0.0488 + 0.9067i | 0.0467 + 1.0086i | 0.0503 + 0.8690i | 0.0466 + 1.1053i |
| 25 | 0.0474 + 0.9022i | 0.0455 + 0.9995i | 0.0493 + 0.8602i | 0.0444 + 1.0970i |
| 25.5 | 0.0438 + 0.9415i | 0.0377 + 1.0346i | 0.0846 + 0.9291i | 0.0622 + 1.1023i |
| 26 | 0.0577 + 0.8856i | 0.0286 + 0.8791i | 0.0642 + 0.9670i | 0.0431 + 1.0429i |
| 26.5 | 0.0544 + 0.9100i | 0.0513 + 0.9841i | 0.0324 + 1.1232i | 0.0576 + 1.0610i |
| 27 | 0.0420 + 0.9016i | 0.0378 + 0.9756i | 0.0444 + 1.1113i | 0.0805 + 1.0397i |
| 27.5 | 0.0408 + 0.9054i | 0.0369 + 0.9810i | 0.0341 + 1.1435i | 0.0589 + 1.0577i |
| 28 | 0.0359 + 0.9236i | 0.0375 + 1.0235i | 0.0402 + 1.2339i | 0.0477 + 1.1266i |

| SNR/w | w136 | w137 | w138 | w139 |
|---|---|---|---|---|
| 7 | 0.2420 + 0.4138i | 0.2556 + 0.4501i | 0.2420 + 0.4138i | 0.2556 + 0.4501i |
| 7.5 | 0.2420 + 0.4261i | 0.2420 + 0.4261i | 0.2280 + 0.4017i | 0.2280 + 0.4017i |
| 8 | 0.2367 + 0.4280i | 0.2367 + 0.4280i | 0.2367 + 0.4280i | 0.2367 + 0.4280i |
| 8.5 | 0.2302 + 0.4919i | 0.2302 + 0.4919i | 0.2302 + 0.4919i | 0.2302 + 0.4919i |
| 9 | 0.3041 + 1.5225i | 0.2910 + 1.4129i | 0.2910 + 1.4129i | 0.2850 + 1.3540i |
| 9.5 | 0.3016 + 1.5258i | 0.2850 + 1.4155i | 0.2850 + 1.4155i | 0.2850 + 1.4155i |
| 10 | 0.3009 + 1.5258i | 0.2854 + 1.4442i | 0.2854 + 1.4442i | 0.2768 + 1.3998i |
| 10.5 | 0.3041 + 1.5241i | 0.2857 + 1.4497i | 0.2857 + 1.4497i | 0.2756 + 1.4128i |
| 11 | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i |
| 12.5 | 0.1262 + 0.3791i | 0.1262 + 0.3791i | 0.1262 + 0.3791i | 0.1262 + 0.3791i |
| 13 | 0.2783 + 2.0929i | 0.2668 + 1.5463i | 0.2047 + 1.8160i | 0.2333 + 1.6150i |
| 13.5 | 0.1166 + 0.4366i | 0.1166 + 0.4366i | 0.1166 + 0.4366i | 0.1166 + 0.4366i |
| 14 | 0.1152 + 0.4655i | 0.1152 + 0.4655i | 0.1152 + 0.4655i | 0.1152 + 0.4655i |
| 14.5 | 0.1124 + 0.4809i | 0.1124 + 0.4809i | 0.1124 + 0.4809i | 0.1124 + 0.4809i |
| 15 | 0.1089 + 0.9337i | 0.1089 + 0.9337i | 0.1089 + 0.9337i | 0.1089 + 0.9337i |
| 15.5 | 0.1085 + 0.9483i | 0.1085 + 0.9312i | 0.1085 + 0.9483i | 0.1085 + 0.9312i |
| 16 | 0.1059 + 1.1569i | 0.1438 + 1.1408i | 0.1040 + 1.1819i | 0.1450 + 1.1564i |
| 16.5 | 0.1003 + 1.4730i | 0.1100 + 1.2587i | 0.2016 + 2.0694i | 0.1127 + 1.2073i |
| 17 | 0.0998 + 1.4730i | 0.1102 + 1.2536i | 0.2013 + 2.0723i | 0.1116 + 1.2028i |
| 17.5 | 0.0988 + 1.4659i | 0.1109 + 1.2478i | 0.1973 + 2.0632i | 0.1117 + 1.1979i |
| 18 | 0.0991 + 1.4625i | 0.1137 + 1.2538i | 0.1977 + 2.0538i | 0.1157 + 1.2020i |
| 18.5 | 0.1910 + 1.5579i | 0.2343 + 1.3492i | 0.1431 + 1.7701i | 0.2372 + 1.2959i |
| 19 | 0.2005 + 1.5419i | 0.2412 + 1.3402i | 0.1377 + 1.7502i | 0.2448 + 1.2861i |
| 19.5 | 0.1545 + 1.7181i | 0.2624 + 1.2819i | 0.2850 + 1.5423i | 0.2677 + 1.3192i |
| 20 | 0.0990 + 1.6597i | 0.0805 + 1.0463i | 0.0744 + 1.4636i | 0.0766 + 1.0786i |
| 20.5 | 0.1248 + 1.6210i | 0.1954 + 1.1793i | 0.2104 + 1.4066i | 0.1960 + 1.2212i |
| 21 | 0.1464 + 1.4100i | 0.1799 + 1.2274i | 0.0916 + 1.6132i | 0.1856 + 1.1690i |
| 21.5 | 0.1329 + 1.8110i | 0.1785 + 1.1792i | 0.1881 + 1.4135i | 0.1836 + 1.2632i |
| 22 | 0.0760 + 1.4947i | 0.1660 + 1.1960i | 0.1932 + 1.6270i | 0.1685 + 1.1538i |
| 22.5 | 0.1993 + 1.7519i | 0.1777 + 1.1663i | 0.1733 + 1.4310i | 0.1704 + 1.2820i |
| 23 | 0.0964 + 1.7933i | 0.1763 + 1.1862i | 0.1993 + 1.4336i | 0.1869 + 1.2930i |
| 23.5 | 0.2224 + 1.7477i | 0.1587 + 1.1598i | 0.0786 + 1.6259i | 0.1644 + 1.2701i |
| 24 | 0.2059 + 1.3214i | 0.1962 + 1.2278i | 0.2073 + 1.4403i | 0.2541 + 1.5814i |
| 24.5 | 0.3255 + 1.7591i | 0.1702 + 1.3294i | 0.2212 + 1.6117i | 0.1562 + 1.2055i |
| 25 | 0.3472 + 1.7040i | 0.1573 + 1.3131i | 0.2161 + 1.5686i | 0.1468 + 1.1983i |
| 25.5 | 0.2337 + 1.6652i | 0.2321 + 1.1730i | 0.2083 + 1.5062i | 0.1547 + 1.2132i |
| 26 | 0.3076 + 1.5930i | 0.1352 + 1.2642i | 0.2100 + 1.4742i | 0.1117 + 1.1707i |
| 26.5 | 0.2675 + 1.6286i | 0.1335 + 1.3004i | 0.2245 + 1.4893i | 0.1429 + 1.2032i |
| 27 | 0.2178 + 1.5591i | 0.1947 + 1.1461i | 0.1887 + 1.4107i | 0.1532 + 1.2458i |
| 27.5 | 0.2076 + 1.6180i | 0.2354 + 1.1287i | 0.1770 + 1.4782i | 0.1619 + 1.1335i |
| 28 | 0.2491 + 1.5678i | 0.2319 + 1.0829i | 0.1797 + 1.4545i | 0.1551 + 1.0959i |

| SNR/w | w140 | w141 | w142 | w143 |
|---|---|---|---|---|
| 7 | 0.2556 + 0.4501i | 0.2556 + 0.4501i | 0.2556 + 0.4501i | 0.2556 + 0.4501i |
| 7.5 | 0.2648 + 0.4537i | 0.2648 + 0.4537i | 0.2379 + 0.4490i | 0.2420 + 0.4261i |
| 8 | 0.2367 + 0.4280i | 0.2367 + 0.4280i | 0.2367 + 0.4280i | 0.2367 + 0.4280i |
| 8.5 | 0.2709 + 0.4857i | 0.2709 + 0.4857i | 0.2709 + 0.4857i | 0.2709 + 0.4857i |
| 9 | 0.2910 + 1.4129i | 0.2850 + 1.3540i | 0.2850 + 1.3540i | 0.2850 + 1.3540i |
| 9.5 | 0.2850 + 1.4155i | 0.2850 + 1.4155i | 0.2850 + 1.4155i | 0.2772 + 1.3604i |
| 10 | 0.2854 + 1.4442i | 0.2768 + 1.3998i | 0.2768 + 1.3998i | 0.2768 + 1.3998i |
| 10.5 | 0.2857 + 1.4497i | 0.2756 + 1.4128i | 0.2857 + 1.4497i | 0.2756 + 1.4128i |
| 11 | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i |
| 12.5 | 0.1262 + 0.3791i | 0.1262 + 0.3791i | 0.1262 + 0.3791i | 0.1262 + 0.3791i |
| 13 | 0.1726 + 1.2844i | 0.1953 + 1.3258i | 0.1726 + 1.2844i | 0.1790 + 1.3480i |
| 13.5 | 0.1166 + 0.4366i | 0.1166 + 0.4366i | 0.1166 + 0.4366i | 0.1166 + 0.4366i |
| 14 | 0.1152 + 0.4655i | 0.1152 + 0.4655i | 0.1152 + 0.4655i | 0.1152 + 0.4655i |
| 14.5 | 0.1124 + 0.4809i | 0.1124 + 0.4809i | 0.1124 + 0.4809i | 0.1124 + 0.4809i |
| 15 | 0.1557 + 0.8813i | 0.1557 + 0.8813i | 0.1557 + 0.8813i | 0.1557 + 0.8813i |
| 15.5 | 0.1645 + 0.8964i | 0.1630 + 0.8872i | 0.1645 + 0.8964i | 0.1630 + 0.8872i |
| 16 | 0.1528 + 0.9550i | 0.1668 + 0.9656i | 0.1528 + 0.9550i | 0.1668 + 0.9656i |
| 16.5 | 0.1134 + 0.9196i | 0.1137 + 0.9858i | 0.1134 + 0.9196i | 0.1137 + 0.9858i |
| 17 | 0.1130 + 0.9150i | 0.1137 + 0.9836i | 0.1130 + 0.9150i | 0.1137 + 0.9836i |
| 17.5 | 0.1131 + 0.9127i | 0.1143 + 0.9836i | 0.1131 + 0.9127i | 0.1143 + 0.9836i |

-continued

| | | | | |
|---|---|---|---|---|
| 18 | 0.1192 + 0.9118i | 0.1211 + 0.9760i | 0.1192 + 0.9118i | 0.1191 + 0.9891i |
| 18.5 | 0.1908 + 1.0283i | 0.2028 + 1.0935i | 0.1908 + 1.0283i | 0.2073 + 1.1122i |
| 19 | 0.2107 + 1.0297i | 0.2201 + 1.0924i | 0.2107 + 1.0297i | 0.2243 + 1.1127i |
| 19.5 | 0.2186 + 1.0320i | 0.2321 + 1.1085i | 0.2186 + 1.0320i | 0.2321 + 1.1085i |
| 20 | 0.1218 + 0.7966i | 0.1017 + 0.8881i | 0.1218 + 0.7966i | 0.1070 + 0.8657i |
| 20.5 | 0.1871 + 0.9324i | 0.1917 + 1.0185i | 0.1871 + 0.9324i | 0.1917 + 1.0185i |
| 21 | 0.1852 + 0.9092i | 0.1864 + 1.0088i | 0.1852 + 0.9092i | 0.1871 + 1.0292i |
| 21.5 | 0.1684 + 0.8948i | 0.1728 + 1.0462i | 0.1684 + 0.8948i | 0.1721 + 1.0147i |
| 22 | 0.1862 + 0.8964i | 0.1808 + 1.0223i | 0.1862 + 0.8964i | 0.1808 + 1.0223i |
| 22.5 | 0.1781 + 0.8873i | 0.1775 + 1.0391i | 0.1781 + 0.8873i | 0.1776 + 0.9980i |
| 23 | 0.1577 + 0.8931i | 0.1678 + 1.0712i | 0.1577 + 0.8931i | 0.1592 + 1.0127i |
| 23.5 | 0.1723 + 0.8716i | 0.1654 + 1.0555i | 0.1712 + 0.8911i | 0.1690 + 0.9911i |
| 24 | 0.1734 + 0.9105i | 0.1853 + 1.1204i | 0.1736 + 0.9440i | 0.1790 + 1.0453i |
| 24.5 | 0.1514 + 0.9059i | 0.1398 + 1.0100i | 0.1508 + 0.8749i | 0.1427 + 1.0977i |
| 25 | 0.1475 + 0.9016i | 0.1353 + 1.0028i | 0.1463 + 0.8662i | 0.1358 + 1.0939i |
| 25.5 | 0.2051 + 0.9488i | 0.2157 + 1.0645i | 0.1608 + 0.9436i | 0.1497 + 1.0697i |
| 26 | 0.1697 + 0.9111i | 0.1855 + 1.0551i | 0.1491 + 0.9425i | 0.1223 + 1.0684i |
| 26.5 | 0.1579 + 0.9322i | 0.1592 + 1.0119i | 0.1815 + 0.8811i | 0.1547 + 1.1064i |
| 27 | 0.2220 + 0.9109i | 0.2132 + 1.0386i | 0.1577 + 0.9120i | 0.1514 + 1.0025i |
| 27.5 | 0.2094 + 0.9195i | 0.2160 + 1.0223i | 0.1473 + 0.9211i | 0.1402 + 1.0282i |
| 28 | 0.2134 + 0.9134i | 0.2284 + 0.9984i | 0.1399 + 0.9185i | 0.1422 + 1.0060i |

| SNR/w | w144 | w145 | w146 | w147 |
|---|---|---|---|---|
| 7 | 0.2420 + 0.4138i | 0.2556 + 0.4501i | 0.2420 + 0.4138i | 0.2556 + 0.4501i |
| 7.5 | 0.2420 + 0.4261i | 0.2420 + 0.4261i | 0.2420 + 0.4261i | 0.2280 + 0.4017i |
| 8 | 0.2367 + 0.4280i | 0.2367 + 0.4280i | 0.2367 + 0.4280i | 0.2367 + 0.4280i |
| 8.5 | 0.2203 + 0.3946i | 0.2067 + 0.3753i | 0.2203 + 0.3946i | 0.2067 + 0.3753i |
| 9 | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i |
| 10 | 0.2441 + 1.0164i | 0.2441 + 1.0164i | 0.2441 + 1.0164i | 0.2441 + 1.0164i |
| 10.5 | 0.2321 + 1.0073i | 0.2321 + 1.0073i | 0.2321 + 1.0073i | 0.2321 + 1.0073i |
| 11 | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i |
| 12.5 | 0.1570 + 0.3698i | 0.1570 + 0.3698i | 0.1570 + 0.3698i | 0.1570 + 0.3698i |
| 13 | 0.1639 + 0.8829i | 0.1639 + 0.8829i | 0.1639 + 0.8829i | 0.1639 + 0.8829i |
| 13.5 | 0.1613 + 0.4107i | 0.1613 + 0.4107i | 0.1613 + 0.4107i | 0.1613 + 0.4107i |
| 14 | 0.1677 + 0.4235i | 0.1677 + 0.4235i | 0.1677 + 0.4235i | 0.1677 + 0.4235i |
| 14.5 | 0.1694 + 0.4317i | 0.1694 + 0.4317i | 0.1694 + 0.4317i | 0.1694 + 0.4317i |
| 15 | 0.1386 + 0.6110i | 0.1386 + 0.6110i | 0.1386 + 0.6110i | 0.1386 + 0.6110i |
| 15.5 | 0.1374 + 0.6149i | 0.1374 + 0.6149i | 0.1374 + 0.6149i | 0.1374 + 0.6149i |
| 16 | 0.1233 + 0.6305i | 0.1233 + 0.6305i | 0.1233 + 0.6305i | 0.1233 + 0.6305i |
| 16.5 | 0.1119 + 0.5862i | 0.1119 + 0.5862i | 0.1119 + 0.5862i | 0.1119 + 0.5862i |
| 17 | 0.1116 + 0.5832i | 0.1116 + 0.5832i | 0.1116 + 0.5832i | 0.1116 + 0.5832i |
| 17.5 | 0.1111 + 0.5789i | 0.1111 + 0.5789i | 0.1111 + 0.5789i | 0.1111 + 0.5789i |
| 18 | 0.1015 + 0.5717i | 0.1015 + 0.5717i | 0.1015 + 0.5717i | 0.1015 + 0.5717i |
| 18.5 | 0.0945 + 0.6545i | 0.0945 + 0.6545i | 0.0945 + 0.6545i | 0.0945 + 0.6545i |
| 19 | 0.0846 + 0.6736i | 0.0846 + 0.6736i | 0.0846 + 0.6736i | 0.0846 + 0.6736i |
| 19.5 | 0.0756 + 0.6874i | 0.0756 + 0.6874i | 0.0756 + 0.6874i | 0.0756 + 0.6874i |
| 20 | 0.0686 + 0.4786i | 0.0686 + 0.4786i | 0.0686 + 0.4786i | 0.0686 + 0.4786i |
| 20.5 | 0.0633 + 0.6036i | 0.0633 + 0.6036i | 0.0633 + 0.6036i | 0.0633 + 0.6036i |
| 21 | 0.0612 + 0.5785i | 0.0612 + 0.5785i | 0.0612 + 0.5785i | 0.0612 + 0.5785i |
| 21.5 | 0.0581 + 0.5423i | 0.0579 + 0.5611i | 0.0581 + 0.5423i | 0.0579 + 0.5611i |
| 22 | 0.0593 + 0.5614i | 0.0595 + 0.5811i | 0.0593 + 0.5614i | 0.0595 + 0.5811i |
| 22.5 | 0.0588 + 0.5488i | 0.0585 + 0.5738i | 0.0588 + 0.5488i | 0.0585 + 0.5738i |
| 23 | 0.0592 + 0.5283i | 0.0572 + 0.5601i | 0.0592 + 0.5283i | 0.0572 + 0.5601i |
| 23.5 | 0.0579 + 0.5297i | 0.0582 + 0.5729i | 0.0579 + 0.5297i | 0.0582 + 0.5729i |
| 24 | 0.0551 + 0.5330i | 0.0552 + 0.6012i | 0.0551 + 0.5330i | 0.0552 + 0.6012i |
| 24.5 | 0.0588 + 0.5230i | 0.0585 + 0.5848i | 0.0588 + 0.5230i | 0.0585 + 0.5848i |
| 25 | 0.0574 + 0.5122i | 0.0570 + 0.5825i | 0.0574 + 0.5122i | 0.0570 + 0.5825i |
| 25.5 | 0.0438 + 0.5661i | 0.0416 + 0.6480i | 0.0669 + 0.5658i | 0.0677 + 0.6466i |
| 26 | 0.0362 + 0.5516i | 0.0352 + 0.6211i | 0.0930 + 0.5503i | 0.0944 + 0.6214i |
| 26.5 | 0.0319 + 0.5344i | 0.0328 + 0.6243i | 0.0702 + 0.5348i | 0.0709 + 0.6199i |
| 27 | 0.0308 + 0.5613i | 0.0315 + 0.6418i | 0.0874 + 0.5600i | 0.0899 + 0.6395i |
| 27.5 | 0.0313 + 0.5647i | 0.0315 + 0.6436i | 0.0920 + 0.5643i | 0.0922 + 0.6441i |
| 28 | 0.0301 + 0.5655i | 0.0298 + 0.6462i | 0.0886 + 0.5661i | 0.0881 + 0.6466i |

| SNR/w | w148 | w149 | w150 | w151 |
|---|---|---|---|---|
| 7 | 0.2556 + 0.4501i | 0.2556 + 0.4501i | 0.2556 + 0.4501i | 0.2556 + 0.4501i |
| 7.5 | 0.2648 + 0.4537i | 0.2648 + 0.4537i | 0.2379 + 0.4490i | 0.2379 + 0.4490i |
| 8 | 0.2367 + 0.4280i | 0.2367 + 0.4280i | 0.2367 + 0.4280i | 0.2367 + 0.4280i |
| 8.5 | 0.2203 + 0.3946i | 0.2203 + 0.3946i | 0.2203 + 0.3946i | 0.2203 + 0.3946i |
| 9 | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i |
| 10 | 0.2441 + 1.0164i | 0.2441 + 1.0164i | 0.2441 + 1.0164i | 0.2441 + 1.0164i |
| 10.5 | 0.2321 + 1.0073i | 0.2321 + 1.0073i | 0.2321 + 1.0073i | 0.2334 + 1.0266i |
| 11 | 0.1545 + 0.2823i | 0.1545 + 0.2823i | 0.1545 + 0.2823i | 0.1545 + 0.2823i |

-continued

| | | | | |
|---|---|---|---|---|
| 11.5 | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i |
| 12.5 | 0.1570 + 0.3698i | 0.1570 + 0.3698i | 0.1570 + 0.3698i | 0.1570 + 0.3698i |
| 13 | 0.1563 + 0.9531i | 0.1563 + 0.9531i | 0.1563 + 0.9531i | 0.1563 + 0.9531i |
| 13.5 | 0.1613 + 0.4107i | 0.1613 + 0.4107i | 0.1613 + 0.4107i | 0.1613 + 0.4107i |
| 14 | 0.1677 + 0.4235i | 0.1677 + 0.4235i | 0.1677 + 0.4235i | 0.1677 + 0.4235i |
| 14.5 | 0.1694 + 0.4317i | 0.1694 + 0.4317i | 0.1694 + 0.4317i | 0.1694 + 0.4317i |
| 15 | 0.1475 + 0.6274i | 0.1475 + 0.6274i | 0.1475 + 0.6274i | 0.1475 + 0.6274i |
| 15.5 | 0.1484 + 0.6322i | 0.1484 + 0.6322i | 0.1484 + 0.6322i | 0.1484 + 0.6322i |
| 16 | 0.1305 + 0.7061i | 0.1305 + 0.7061i | 0.1305 + 0.7061i | 0.1305 + 0.7061i |
| 16.5 | 0.1120 + 0.6858i | 0.1121 + 0.6631i | 0.1120 + 0.6858i | 0.1121 + 0.6631i |
| 17 | 0.1115 + 0.6931i | 0.1117 + 0.6678i | 0.1115 + 0.6931i | 0.1117 + 0.6678i |
| 17.5 | 0.1111 + 0.7043i | 0.1113 + 0.6783i | 0.1111 + 0.7043i | 0.1113 + 0.6783i |
| 18 | 0.1014 + 0.7157i | 0.1017 + 0.6908i | 0.1014 + 0.7157i | 0.1017 + 0.6908i |
| 18.5 | 0.0919 + 0.8514i | 0.0921 + 0.8282i | 0.0919 + 0.8514i | 0.0921 + 0.8282i |
| 19 | 0.0812 + 0.8671i | 0.0812 + 0.8456i | 0.0812 + 0.8671i | 0.0812 + 0.8456i |
| 19.5 | 0.0736 + 0.8802i | 0.0737 + 0.8541i | 0.0736 + 0.8802i | 0.0737 + 0.8541i |
| 20 | 0.0683 + 0.6269i | 0.0678 + 0.6031i | 0.0683 + 0.6269i | 0.0678 + 0.6031i |
| 20.5 | 0.0638 + 0.7848i | 0.0635 + 0.7547i | 0.0638 + 0.7848i | 0.0635 + 0.7547i |
| 21 | 0.0626 + 0.7673i | 0.0622 + 0.7241i | 0.0626 + 0.7673i | 0.0622 + 0.7241i |
| 21.5 | 0.0579 + 0.7549i | 0.0575 + 0.6950i | 0.0579 + 0.7549i | 0.0575 + 0.6950i |
| 22 | 0.0617 + 0.7653i | 0.0609 + 0.7080i | 0.0617 + 0.7653i | 0.0609 + 0.7080i |
| 22.5 | 0.0597 + 0.7658i | 0.0589 + 0.6968i | 0.0597 + 0.7658i | 0.0589 + 0.6968i |
| 23 | 0.0523 + 0.7605i | 0.0530 + 0.6770i | 0.0523 + 0.7605i | 0.0530 + 0.6770i |
| 23.5 | 0.0573 + 0.7643i | 0.0571 + 0.6803i | 0.0573 + 0.7643i | 0.0571 + 0.6803i |
| 24 | 0.0559 + 0.8129i | 0.0555 + 0.7029i | 0.0566 + 0.8015i | 0.0555 + 0.7029i |
| 24.5 | 0.0535 + 0.7638i | 0.0578 + 0.6777i | 0.0545 + 0.7749i | 0.0578 + 0.6777i |
| 25 | 0.0515 + 0.7571i | 0.0570 + 0.6711i | 0.0541 + 0.7704i | 0.0570 + 0.6711i |
| 25.5 | 0.0422 + 0.8329i | 0.0420 + 0.7408i | 0.0806 + 0.8359i | 0.0735 + 0.7378i |
| 26 | 0.0501 + 0.7778i | 0.0354 + 0.7025i | 0.0941 + 0.7686i | 0.0950 + 0.6968i |
| 26.5 | 0.0401 + 0.8246i | 0.0334 + 0.7183i | 0.0928 + 0.7983i | 0.0787 + 0.7149i |
| 27 | 0.0368 + 0.8194i | 0.0314 + 0.7259i | 0.0953 + 0.8062i | 0.0929 + 0.7245i |
| 27.5 | 0.0347 + 0.8220i | 0.0302 + 0.7280i | 0.0933 + 0.8100i | 0.0920 + 0.7282i |
| 28 | 0.0319 + 0.8305i | 0.0282 + 0.7314i | 0.0870 + 0.8145i | 0.0878 + 0.7323i |

| SNR/w | w152 | w153 | w154 | w155 |
|---|---|---|---|---|
| 7 | 0.2556 + 0.4501i | 0.2556 + 0.4501i | 0.2556 + 0.4501i | 0.2556 + 0.4501i |
| 7.5 | 0.2648 + 0.4537i | 0.2648 + 0.4537i | 0.2379 + 0.4490i | 0.2420 + 0.4261i |
| 8 | 0.2367 + 0.4780i | 0.2367 + 0.4780i | 0.2367 + 0.4780i | 0.2367 + 0.4780i |
| 8.5 | 0.2360 + 0.5215i | 0.2360 + 0.5215i | 0.2360 + 0.5215i | 0.2360 + 0.5215i |
| 9 | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i |
| 10 | 0.2441 + 1.0164i | 0.2441 + 1.0164i | 0.2441 + 1.0164i | 0.2441 + 1.0164i |
| 10.5 | 0.2321 + 1.0073i | 0.2321 + 1.0073i | 0.2321 + 1.0073i | 0.2334 + 1.0266i |
| 11 | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i |
| 12.5 | 0.1570 + 0.3698i | 0.1570 + 0.3698i | 0.1570 + 0.3698i | 0.1570 + 0.3698i |
| 13 | 0.1639 + 0.8829i | 0.1639 + 0.8829i | 0.1639 + 0.8829i | 0.1639 + 0.8829i |
| 13.5 | 0.1613 + 0.4107i | 0.1613 + 0.4107i | 0.1613 + 0.4107i | 0.1613 + 0.4107i |
| 14 | 0.1677 + 0.4235i | 0.1677 + 0.4235i | 0.1677 + 0.4235i | 0.1677 + 0.4235i |
| 14.5 | 0.1694 + 0.4317i | 0.1694 + 0.4317i | 0.1694 + 0.4317i | 0.1694 + 0.4317i |
| 15 | 0.1386 + 0.6110i | 0.1386 + 0.6110i | 0.1386 + 0.6110i | 0.1386 + 0.6110i |
| 15.5 | 0.1374 + 0.6149i | 0.1374 + 0.6149i | 0.1374 + 0.6149i | 0.1374 + 0.6149i |
| 16 | 0.1233 + 0.6305i | 0.1233 + 0.6305i | 0.1233 + 0.6305i | 0.1233 + 0.6305i |
| 16.5 | 0.1119 + 0.5862i | 0.1119 + 0.5862i | 0.1119 + 0.5862i | 0.1119 + 0.5862i |
| 17 | 0.1116 + 0.5832i | 0.1116 + 0.5832i | 0.1116 + 0.5832i | 0.1116 + 0.5832i |
| 17.5 | 0.1111 + 0.5789i | 0.1111 + 0.5789i | 0.1111 + 0.5789i | 0.1111 + 0.5789i |
| 18 | 0.1198 + 0.5719i | 0.1198 + 0.5719i | 0.1198 + 0.5719i | 0.1198 + 0.5719i |
| 18.5 | 0.1260 + 0.6530i | 0.1260 + 0.6530i | 0.1260 + 0.6530i | 0.1260 + 0.6530i |
| 19 | 0.1415 + 0.6692i | 0.1415 + 0.6692i | 0.1415 + 0.6692i | 0.1415 + 0.6692i |
| 19.5 | 0.1571 + 0.6805i | 0.1571 + 0.6805i | 0.1571 + 0.6805i | 0.1571 + 0.6805i |
| 20 | 0.1756 + 0.4881i | 0.1756 + 0.4881i | 0.1756 + 0.4881i | 0.1756 + 0.4881i |
| 20.5 | 0.1741 + 0.6024i | 0.1741 + 0.6024i | 0.1741 + 0.6024i | 0.1741 + 0.6024i |
| 21 | 0.1729 + 0.5763i | 0.1729 + 0.5763i | 0.1729 + 0.5763i | 0.1729 + 0.5763i |
| 21.5 | 0.1683 + 0.5443i | 0.1675 + 0.5619i | 0.1683 + 0.5443i | 0.1675 + 0.5619i |
| 22 | 0.1766 + 0.5583i | 0.1770 + 0.5787i | 0.1766 + 0.5583i | 0.1770 + 0.5787i |
| 22.5 | 0.1728 + 0.5468i | 0.1729 + 0.5691i | 0.1728 + 0.5468i | 0.1729 + 0.5691i |
| 23 | 0.1711 + 0.5337i | 0.1696 + 0.5727i | 0.1711 + 0.5337i | 0.1696 + 0.5727i |
| 23.5 | 0.1756 + 0.5324i | 0.1748 + 0.5753i | 0.1756 + 0.5324i | 0.1748 + 0.5753i |
| 24 | 0.1665 + 0.5324i | 0.1666 + 0.5983i | 0.1665 + 0.5324i | 0.1666 + 0.5983i |
| 24.5 | 0.1768 + 0.5229i | 0.1754 + 0.5881i | 0.1768 + 0.5229i | 0.1754 + 0.5881i |
| 25 | 0.1816 + 0.5127i | 0.1789 + 0.5856i | 0.1653 + 0.5129i | 0.1653 + 0.5854i |
| 25.5 | 0.1867 + 0.5642i | 0.1899 + 0.6415i | 0.1514 + 0.5651i | 0.1527 + 0.6436i |
| 26 | 0.2234 + 0.5457i | 0.2245 + 0.6191i | 0.1645 + 0.5475i | 0.1657 + 0.6192i |
| 26.5 | 0.1889 + 0.5296i | 0.1889 + 0.6067i | 0.1371 + 0.5320i | 0.1410 + 0.6135i |
| 27 | 0.2121 + 0.5552i | 0.2127 + 0.6337i | 0.1515 + 0.5573i | 0.1534 + 0.6358i |

-continued

| | | | | |
|---|---|---|---|---|
| 27.5 | 0.2181 + 0.5647i | 0.2174 + 0.6442i | 0.1553 + 0.5644i | 0.1553 + 0.6440i |
| 28 | 0.2101 + 0.5674i | 0.2108 + 0.6469i | 0.1492 + 0.5671i | 0.1491 + 0.6469i |

| SNR/w | w156 | w157 | w158 | w159 |
|---|---|---|---|---|
| 7 | 0.2556 + 0.4501i | 0.2688 + 0.4861i | 0.2556 + 0.4501i | 0.2688 + 0.4861i |
| 7.5 | 0.2798 + 0.4856i | 0.2798 + 0.4856i | 0.2466 + 0.4825i | 0.2466 + 0.4825i |
| 8 | 0.2728 + 0.4786i | 0.2728 + 0.4786i | 0.2728 + 0.4786i | 0.2728 + 0.4786i |
| 8.5 | 0.2843 + 0.5113i | 0.2843 + 0.5113i | 0.2843 + 0.5113i | 0.2843 + 0.5113i |
| 9 | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i |
| 10 | 0.2441 + 1.0164i | 0.2441 + 1.0164i | 0.2441 + 1.0164i | 0.2450 + 1.0381i |
| 10.5 | 0.2321 + 1.0073i | 0.2334 + 1.0266i | 0.2321 + 1.0073i | 0.2334 + 1.0266i |
| 11 | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i |
| 12.5 | 0.1570 + 0.3698i | 0.1570 + 0.3698i | 0.1570 + 0.3698i | 0.1570 + 0.3698i |
| 13 | 0.1563 + 0.9531i | 0.1563 + 0.9531i | 0.1563 + 0.9531i | 0.1563 + 0.9531i |
| 13.5 | 0.1613 + 0.4107i | 0.1613 + 0.4107i | 0.1613 + 0.4107i | 0.1613 + 0.4107i |
| 14 | 0.1677 + 0.4235i | 0.1677 + 0.4235i | 0.1677 + 0.4235i | 0.1677 + 0.4235i |
| 14.5 | 0.1694 + 0.4317i | 0.1694 + 0.4317i | 0.1694 + 0.4317i | 0.1694 + 0.4317i |
| 15 | 0.1475 + 0.6274i | 0.1386 + 0.6110i | 0.1475 + 0.6274i | 0.1475 + 0.6274i |
| 15.5 | 0.1484 + 0.6322i | 0.1484 + 0.6322i | 0.1484 + 0.6322i | 0.1484 + 0.6322i |
| 16 | 0.1305 + 0.7061i | 0.1305 + 0.7061i | 0.1305 + 0.7061i | 0.1305 + 0.7061i |
| 16.5 | 0.1120 + 0.6858i | 0.1121 + 0.6631i | 0.1120 + 0.6858i | 0.1121 + 0.6631i |
| 17 | 0.1115 + 0.6931i | 0.1117 + 0.6678i | 0.1115 + 0.6931i | 0.1117 + 0.6678i |
| 17.5 | 0.1111 + 0.7043i | 0.1113 + 0.6783i | 0.1111 + 0.7043i | 0.1113 + 0.6783i |
| 18 | 0.1189 + 0.7162i | 0.1194 + 0.6916i | 0.1189 + 0.7162i | 0.1194 + 0.6916i |
| 18.5 | 0.1528 + 0.8453i | 0.1485 + 0.8227i | 0.1528 + 0.8453i | 0.1485 + 0.8227i |
| 19 | 0.1770 + 0.8573i | 0.1723 + 0.8358i | 0.1770 + 0.8573i | 0.1723 + 0.8358i |
| 19.5 | 0.1912 + 0.8683i | 0.1870 + 0.8435i | 0.1912 + 0.8683i | 0.1870 + 0.8435i |
| 20 | 0.1516 + 0.6364i | 0.1554 + 0.6129i | 0.1516 + 0.6364i | 0.1554 + 0.6129i |
| 20.5 | 0.1809 + 0.7811i | 0.1801 + 0.7517i | 0.1809 + 0.7811i | 0.1801 + 0.7517i |
| 21 | 0.1790 + 0.7657i | 0.1773 + 0.7216i | 0.1790 + 0.7657i | 0.1773 + 0.7216i |
| 21.5 | 0.1651 + 0.7527i | 0.1644 + 0.6950i | 0.1651 + 0.7527i | 0.1644 + 0.6950i |
| 22 | 0.1819 + 0.7649i | 0.1802 + 0.7051i | 0.1819 + 0.7649i | 0.1802 + 0.7051i |
| 22.5 | 0.1742 + 0.7575i | 0.1714 + 0.6942i | 0.1742 + 0.7575i | 0.1714 + 0.6942i |
| 23 | 0.1663 + 0.7694i | 0.1695 + 0.6852i | 0.1663 + 0.7694i | 0.1695 + 0.6852i |
| 23.5 | 0.1727 + 0.7650i | 0.1738 + 0.6824i | 0.1727 + 0.7650i | 0.1738 + 0.6824i |
| 24 | 0.1701 + 0.8091i | 0.1674 + 0.7005i | 0.1680 + 0.7988i | 0.1674 + 0.7005i |
| 24.5 | 0.1686 + 0.7746i | 0.1713 + 0.6822i | 0.1623 + 0.7828i | 0.1713 + 0.6822i |
| 25 | 0.1672 + 0.7680i | 0.1731 + 0.6769i | 0.1580 + 0.7784i | 0.1632 + 0.6743i |
| 25.5 | 0.2004 + 0.8274i | 0.1939 + 0.7293i | 0.1615 + 0.8311i | 0.1553 + 0.7315i |
| 26 | 0.1857 + 0.8119i | 0.2191 + 0.7001i | 0.1638 + 0.7891i | 0.1706 + 0.6989i |
| 26.5 | 0.2034 + 0.7668i | 0.1936 + 0.6930i | 0.1697 + 0.8030i | 0.1474 + 0.6948i |
| 27 | 0.2191 + 0.8143i | 0.2146 + 0.7189i | 0.1560 + 0.8180i | 0.1570 + 0.7210i |
| 27.5 | 0.2141 + 0.8228i | 0.2166 + 0.7312i | 0.1515 + 0.8243i | 0.1561 + 0.7276i |
| 28 | 0.2083 + 0.8201i | 0.2103 + 0.7318i | 0.1448 + 0.8276i | 0.1494 + 0.7302i |

| SNR/w | w160 | w161 | w162 | w163 |
|---|---|---|---|---|
| 7 | 0.2420 + 0.4138i | 0.2556 + 0.4501i | 0.2420 + 0.4138i | 0.2556 + 0.4501i |
| 7.5 | 0.2420 + 0.4261i | 0.2420 + 0.4261i | 0.2420 + 0.4261i | 0.2280 + 0.4017i |
| 8 | 0.2367 + 0.4280i | 0.2367 + 0.4280i | 0.2367 + 0.4280i | 0.2367 + 0.4280i |
| 8.5 | 0.2203 + 0.3946i | 0.2067 + 0.3753i | 0.2203 + 0.3946i | 0.2067 + 0.3753i |
| 9 | 1.1715 + 1.7495i | 0.8632 + 1.3087i | 0.8632 + 1.3087i | 0.7953 + 1.2190i |
| 9.5 | 1.1695 + 1.7496i | 0.8657 + 1.3032i | 0.8657 + 1.3032i | 0.8104 + 1.2262i |
| 10 | 1.1664 + 1.7479i | 0.8650 + 1.2969i | 0.8650 + 1.2969i | 0.8182 + 1.2278i |
| 10.5 | 1.1809 + 1.7123i | 0.8481 + 1.2650i | 0.8751 + 1.2974i | 0.8165 + 1.2154i |
| 11 | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i |
| 13 | 0.7692 + 1.3337i | 0.7085 + 1.2812i | 0.7085 + 1.2812i | 0.6679 + 1.2607i |
| 13.5 | 0.1645 + 0.7701i | 0.1645 + 0.7701i | 0.1645 + 0.7701i | 0.1645 + 0.7701i |
| 14 | 0.1569 + 0.7809i | 0.1569 + 0.7809i | 0.1569 + 0.7809i | 0.1569 + 0.7809i |
| 14.5 | 0.1484 + 0.7976i | 0.1484 + 0.7976i | 0.1484 + 0.7976i | 0.1484 + 0.7976i |
| 15 | 0.1527 + 1.2540i | 0.2569 + 1.1882i | 0.1527 + 1.2540i | 0.2569 + 1.1882i |
| 15.5 | 0.1242 + 1.2740i | 0.1858 + 1.2756i | 0.1242 + 1.2740i | 0.1858 + 1.2756i |
| 16 | 0.1921 + 1.5489i | 0.3864 + 1.3049i | 0.2042 + 1.4748i | 0.3684 + 1.3253i |
| 16.5 | 0.2958 + 1.5189i | 0.3521 + 1.2456i | 0.3869 + 1.6973i | 0.3623 + 1.2204i |
| 17 | 0.2880 + 1.5187i | 0.3502 + 1.2404i | 0.3847 + 1.7131i | 0.3630 + 1.2154i |
| 17.5 | 0.2810 + 1.5145i | 0.3493 + 1.2344i | 0.3774 + 1.7181i | 0.3651 + 1.2097i |
| 18 | 0.2793 + 1.5139i | 0.3515 + 1.2341i | 0.3797 + 1.7225i | 0.3661 + 1.2067i |
| 18.5 | 0.6224 + 1.5379i | 0.5759 + 1.3142i | 0.6038 + 1.8517i | 0.5605 + 1.2517i |
| 19 | 0.6136 + 1.5287i | 0.5785 + 1.3124i | 0.6082 + 1.8229i | 0.5656 + 1.2442i |
| 19.5 | 0.5093 + 1.8272i | 0.5718 + 1.2403i | 0.5904 + 1.5365i | 0.5797 + 1.3019i |
| 20 | 0.3901 + 1.8592i | 0.2655 + 1.0853i | 0.2151 + 1.3209i | 0.2464 + 1.1466i |
| 20.5 | 0.3779 + 1.6732i | 0.4566 + 1.1811i | 0.4323 + 1.4599i | 0.4535 + 1.2331i |

-continued

| | | | | |
|---|---|---|---|---|
| 21 | 0.4425 + 1.4246i | 0.4497 + 1.2508i | 0.4339 + 1.6179i | 0.4486 + 1.1809i |
| 21.5 | 0.4335 + 1.8289i | 0.4421 + 1.1662i | 0.4338 + 1.4210i | 0.4422 + 1.2638i |
| 22 | 0.4811 + 1.5692i | 0.4285 + 1.2414i | 0.4113 + 1.4351i | 0.4373 + 1.2159i |
| 22.5 | 0.4404 + 1.7644i | 0.4091 + 1.1667i | 0.4579 + 1.4331i | 0.4310 + 1.2944i |
| 23 | 0.4242 + 1.7554i | 0.4248 + 1.1691i | 0.4472 + 1.4475i | 0.4330 + 1.2938i |
| 23.5 | 0.3933 + 1.5893i | 0.4100 + 1.1638i | 0.4356 + 1.4074i | 0.4278 + 1.2731i |
| 24 | 0.4643 + 1.6633i | 0.4653 + 1.1815i | 0.4746 + 1.4795i | 0.4874 + 1.3073i |
| 24.5 | 0.4614 + 1.3869i | 0.4192 + 1.2422i | 0.4295 + 1.5513i | 0.3583 + 1.1597i |
| 25 | 0.5062 + 1.5466i | 0.3909 + 1.1806i | 0.4561 + 1.3999i | 0.4328 + 1.2778i |
| 25.5 | 0.4109 + 1.6213i | 0.4201 + 1.1814i | 0.4176 + 1.4698i | 0.4725 + 1.1133i |
| 26 | 0.5441 + 1.3586i | 0.4659 + 1.1498i | 0.4319 + 1.4062i | 0.4167 + 1.2626i |
| 26.5 | 0.5122 + 1.4464i | 0.4081 + 1.1447i | 0.4495 + 1.3429i | 0.4100 + 1.2413i |
| 27 | 0.5155 + 1.4738i | 0.4056 + 1.2349i | 0.4154 + 1.4035i | 0.4713 + 1.3098i |
| 27.5 | 0.4528 + 1.4608i | 0.3983 + 1.2179i | 0.3506 + 1.3699i | 0.4330 + 1.3116i |
| 28 | 0.5059 + 1.4670i | 0.5266 + 1.2312i | 0.4108 + 1.2036i | 0.4382 + 1.3162i |

| SNR/w | w164 | w165 | w166 | w167 |
|---|---|---|---|---|
| 7 | 0.2556 + 0.4501i | 0.2556 + 0.4501i | 0.2556 + 0.4501i | 0.2556 + 0.4501i |
| 7.5 | 0.2648 + 0.4537i | 0.2648 + 0.4537i | 0.2379 + 0.4490i | 0.2420 + 0.4261i |
| 8 | 0.2367 + 0.4280i | 0.2367 + 0.4280i | 0.2367 + 0.4280i | 0.2367 + 0.4280i |
| 8.5 | 0.2203 + 0.3946i | 0.2203 + 0.3946i | 0.2203 + 0.3946i | 0.2203 + 0.3946i |
| 9 | 0.8632 + 1.3087i | 0.7953 + 1.2190i | 0.7953 + 1.2190i | 0.7580 + 1.1712i |
| 9.5 | 0.8657 + 1.3032i | 0.8104 + 1.2262i | 0.8104 + 1.2262i | 0.7800 + 1.1846i |
| 10 | 0.8650 + 1.2969i | 0.8182 + 1.2278i | 0.8182 + 1.2278i | 0.7929 + 1.1900i |
| 10.5 | 0.8751 + 1.2974i | 0.8165 + 1.2154i | 0.8165 + 1.2154i | 0.8165 + 1.2154i |
| 11 | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i |
| 13 | 0.6595 + 1.1351i | 0.6299 + 1.1538i | 0.6595 + 1.1351i | 0.6299 + 1.1538i |
| 13.5 | 0.1645 + 0.7701i | 0.1645 + 0.7701i | 0.1645 + 0.7701i | 0.1645 + 0.7701i |
| 14 | 0.1952 + 0.7703i | 0.1952 + 0.7703i | 0.1952 + 0.7703i | 0.1952 + 0.7703i |
| 14.5 | 0.2008 + 0.7827i | 0.2008 + 0.7827i | 0.2008 + 0.7827i | 0.2008 + 0.7827i |
| 15 | 0.4008 + 0.9524i | 0.3978 + 0.9920i | 0.4008 + 0.9524i | 0.3978 + 0.9920i |
| 15.5 | 0.4131 + 0.9507i | 0.4099 + 0.9681i | 0.4131 + 0.9507i | 0.4099 + 0.9681i |
| 16 | 0.4234 + 0.9406i | 0.4252 + 0.9919i | 0.4234 + 0.9406i | 0.4242 + 0.9783i |
| 16.5 | 0.3449 + 0.9161i | 0.3458 + 0.9807i | 0.3449 + 0.9161i | 0.3458 + 0.9807i |
| 17 | 0.3550 + 0.9126i | 0.3547 + 0.9796i | 0.3550 + 0.9126i | 0.3547 + 0.9796i |
| 17.5 | 0.3605 + 0.9099i | 0.3588 + 0.9801i | 0.3605 + 0.9099i | 0.3588 + 0.9801i |
| 18 | 0.3645 + 0.9102i | 0.3621 + 0.9814i | 0.3645 + 0.9102i | 0.3621 + 0.9814i |
| 18.5 | 0.4811 + 0.9781i | 0.5006 + 1.0392i | 0.4811 + 0.9781i | 0.5083 + 1.0631i |
| 19 | 0.5036 + 0.9733i | 0.5206 + 1.0374i | 0.5036 + 0.9733i | 0.5276 + 1.0642i |
| 19.5 | 0.5185 + 0.9693i | 0.5389 + 1.0616i | 0.5185 + 0.9693i | 0.5341 + 1.0394i |
| 20 | 0.3484 + 0.8442i | 0.3291 + 0.9137i | 0.3484 + 0.8442i | 0.3291 + 0.9137i |
| 20.5 | 0.4614 + 0.9212i | 0.4616 + 1.0134i | 0.4614 + 0.9212i | 0.4616 + 1.0134i |
| 21 | 0.4403 + 0.9042i | 0.4459 + 1.0172i | 0.4403 + 0.9042i | 0.4455 + 1.0429i |
| 21.5 | 0.4033 + 0.8880i | 0.4226 + 1.0373i | 0.4033 + 0.8880i | 0.4137 + 1.0009i |
| 22 | 0.4303 + 0.8997i | 0.4341 + 1.0375i | 0.4303 + 0.8997i | 0.4339 + 1.0572i |
| 22.5 | 0.4161 + 0.8850i | 0.4141 + 1.0322i | 0.4161 + 0.8850i | 0.4086 + 0.9927i |
| 23 | 0.4215 + 0.8941i | 0.4122 + 1.0484i | 0.4042 + 0.9066i | 0.3988 + 1.0072i |
| 23.5 | 0.4283 + 0.8857i | 0.4150 + 1.0457i | 0.4074 + 0.8987i | 0.3988 + 1.0007i |
| 24 | 0.4237 + 0.8868i | 0.4439 + 1.0768i | 0.4137 + 0.9183i | 0.4296 + 1.0142i |
| 24.5 | 0.4108 + 0.9173i | 0.4097 + 1.0235i | 0.3699 + 0.9056i | 0.3567 + 1.0552i |
| 25 | 0.3985 + 0.9191i | 0.3847 + 1.0408i | 0.3554 + 0.9098i | 0.3375 + 1.0392i |
| 25.5 | 0.4845 + 0.8904i | 0.4948 + 0.9831i | 0.4139 + 0.8984i | 0.4391 + 1.0220i |
| 26 | 0.4195 + 0.9309i | 0.4592 + 1.0189i | 0.3573 + 0.9441i | 0.3828 + 1.0426i |
| 26.5 | 0.3605 + 0.9756i | 0.3812 + 1.0530i | 0.3762 + 0.9043i | 0.4593 + 0.9010i |
| 27 | 0.4513 + 0.9439i | 0.4491 + 1.0353i | 0.4185 + 0.8835i | 0.5363 + 1.0313i |
| 27.5 | 0.4947 + 0.9196i | 0.4801 + 1.0177i | 0.4268 + 0.9033i | 0.5624 + 1.0275i |
| 28 | 0.4826 + 1.1077i | 0.5122 + 1.0210i | 0.4263 + 0.9068i | 0.4319 + 0.9952i |

| SNR/w | w168 | w169 | w170 | w171 |
|---|---|---|---|---|
| 7 | 0.2556 + 0.4501i | 0.2556 + 0.4501i | 0.2556 + 0.4501i | 0.2556 + 0.4501i |
| 7.5 | 0.2648 + 0.4537i | 0.2648 + 0.4537i | 0.2379 + 0.4490i | 0.2420 + 0.4261i |
| 8 | 0.2367 + 0.4780i | 0.2367 + 0.4780i | 0.2367 + 0.4780i | 0.2367 + 0.4780i |
| 8.5 | 0.2360 + 0.5215i | 0.2360 + 0.5215i | 0.2360 + 0.5215i | 0.2360 + 0.5215i |
| 9 | 0.8632 + 1.3087i | 0.7953 + 1.2190i | 0.7953 + 1.2190i | 0.7580 + 1.1712i |
| 9.5 | 0.8657 + 1.3032i | 0.8104 + 1.2262i | 0.8104 + 1.2262i | 0.7800 + 1.1846i |
| 10 | 0.8650 + 1.2969i | 0.8182 + 1.2278i | 0.8182 + 1.2278i | 0.7929 + 1.1900i |
| 10.5 | 0.8751 + 1.2974i | 0.8165 + 1.2154i | 0.8165 + 1.2154i | 0.7914 + 1.1834i |
| 11 | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i |
| 13 | 0.6468 + 1.1775i | 0.6155 + 1.1833i | 0.6299 + 1.1538i | 0.6155 + 1.1833i |
| 13.5 | 0.1645 + 0.7701i | 0.1645 + 0.7701i | 0.1645 + 0.7701i | 0.1645 + 0.7701i |
| 14 | 0.1569 + 0.7809i | 0.1569 + 0.7809i | 0.1569 + 0.7809i | 0.1569 + 0.7809i |

-continued

| | | | | |
|---|---|---|---|---|
| 14.5 | 0.1484 + 0.7976i | 0.1484 + 0.7976i | 0.1484 + 0.7976i | 0.1484 + 0.7976i |
| 15 | 0.1570 + 1.2336i | 0.2569 + 1.1882i | 0.1570 + 1.2336i | 0.2569 + 1.1882i |
| 15.5 | 0.1936 + 1.1915i | 0.2544 + 1.2145i | 0.1936 + 1.1915i | 0.2544 + 1.2145i |
| 16 | 0.1202 + 1.5524i | 0.3902 + 1.2699i | 0.1458 + 1.4668i | 0.3679 + 1.2863i |
| 16.5 | 0.3396 + 1.4835i | 0.3411 + 1.2758i | 0.4480 + 1.5575i | 0.3521 + 1.2456i |
| 17 | 0.3338 + 1.4825i | 0.3376 + 1.2735i | 0.4573 + 1.5560i | 0.3502 + 1.2404i |
| 17.5 | 0.3287 + 1.4767i | 0.3347 + 1.2698i | 0.4622 + 1.5494i | 0.3493 + 1.2344i |
| 18 | 0.3273 + 1.4723i | 0.3301 + 1.2672i | 0.4716 + 1.5416i | 0.3419 + 1.2255i |
| 18.5 | 0.4160 + 1.5551i | 0.4079 + 1.3496i | 0.3930 + 1.7342i | 0.4025 + 1.2867i |
| 19 | 0.4096 + 1.5434i | 0.4091 + 1.3422i | 0.3868 + 1.7355i | 0.4051 + 1.2765i |
| 19.5 | 0.1896 + 1.9476i | 0.4173 + 1.2630i | 0.4293 + 1.5290i | 0.4215 + 1.3193i |
| 20 | 0.2891 + 1.6189i | 0.2191 + 1.0576i | 0.2287 + 1.4492i | 0.2175 + 1.0907i |
| 20.5 | 0.1559 + 1.8551i | 0.3285 + 1.1781i | 0.3245 + 1.4116i | 0.3282 + 1.2302i |
| 21 | 0.2900 + 1.4178i | 0.3085 + 1.2507i | 0.2645 + 1.6046i | 0.3133 + 1.1795i |
| 21.5 | 0.3087 + 1.6359i | 0.3076 + 1.1747i | 0.3096 + 1.4426i | 0.3112 + 1.2557i |
| 22 | 0.2306 + 1.3849i | 0.2809 + 1.2390i | 0.2905 + 1.4691i | 0.2945 + 1.1903i |
| 22.5 | 0.3278 + 1.6041i | 0.2970 + 1.1686i | 0.3037 + 1.4425i | 0.2970 + 1.2912i |
| 23 | 0.2943 + 1.6238i | 0.2952 + 1.1812i | 0.3204 + 1.4563i | 0.3158 + 1.2876i |
| 23.5 | 0.2662 + 1.5264i | 0.2867 + 1.1635i | 0.2847 + 1.3880i | 0.2871 + 1.2790i |
| 24 | 0.3157 + 1.8053i | 0.3327 + 1.2080i | 0.3481 + 1.4263i | 0.3796 + 1.3103i |
| 24.5 | 0.3338 + 1.3906i | 0.2893 + 1.2934i | 0.2719 + 1.4925i | 0.2628 + 1.1826i |
| 25 | 0.2741 + 1.3971i | 0.2823 + 1.2733i | 0.3404 + 1.4960i | 0.2496 + 1.1769i |
| 25.5 | 0.3610 + 1.3165i | 0.3191 + 1.2022i | 0.2929 + 1.4100i | 0.2095 + 1.3211i |
| 26 | 0.2562 + 1.3168i | 0.2416 + 1.2052i | 0.3169 + 1.4056i | 0.3353 + 1.1847i |
| 26.5 | 0.3891 + 1.5208i | 0.2212 + 1.3291i | 0.3380 + 1.3952i | 0.2946 + 1.2451i |
| 27 | 0.2908 + 1.3146i | 0.2866 + 1.2128i | 0.3054 + 1.4311i | 0.3265 + 1.1340i |
| 27.5 | 0.2183 + 1.3371i | 0.2840 + 1.2244i | 0.2932 + 1.4680i | 0.3445 + 1.1098i |
| 28 | 0.2888 + 1.3750i | 0.2811 + 1.1589i | 0.3632 + 1.4529i | 0.3464 + 1.0908i |
| SNR/w | w172 | w173 | w174 | w175 |
| 7 | 0.2556 + 0.4501i | 0.2688 + 0.4861i | 0.2556 + 0.4501i | 0.2688 + 0.4861i |
| 7.5 | 0.2798 + 0.4856i | 0.2798 + 0.4856i | 0.2466 + 0.4825i | 0.2466 + 0.4825i |
| 8 | 0.2728 + 0.4786i | 0.2728 + 0.4786i | 0.2728 + 0.4786i | 0.2728 + 0.4786i |
| 8.5 | 0.2843 + 0.5113i | 0.2843 + 0.5113i | 0.2843 + 0.5113i | 0.2843 + 0.5113i |
| 9 | 0.7953 + 1.2190i | 0.7580 + 1.1712i | 0.7580 + 1.1712i | 0.7580 + 1.1712i |
| 9.5 | 0.8104 + 1.2262i | 0.7800 + 1.1846i | 0.7800 + 1.1846i | 0.7800 + 1.1846i |
| 10 | 0.8182 + 1.2278i | 0.7929 + 1.1900i | 0.7929 + 1.1900i | 0.7929 + 1.1900i |
| 10.5 | 0.8165 + 1.2154i | 0.7914 + 1.1834i | 0.8165 + 1.2154i | 0.7914 + 1.1834i |
| 11 | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i |
| 13 | 0.6140 + 1.1075i | 0.5905 + 1.1221i | 0.6140 + 1.1075i | 0.5905 + 1.1221i |
| 13.5 | 0.1645 + 0.7701i | 0.1645 + 0.7701i | 0.1645 + 0.7701i | 0.1645 + 0.7701i |
| 14 | 0.1952 + 0.7703i | 0.1952 + 0.7703i | 0.1952 + 0.7703i | 0.1952 + 0.7703i |
| 14.5 | 0.2008 + 0.7827i | 0.2008 + 0.7827i | 0.2008 + 0.7827i | 0.2008 + 0.7827i |
| 15 | 0.4008 + 0.9524i | 0.3978 + 0.9920i | 0.4008 + 0.9524i | 0.3978 + 0.9920i |
| 15.5 | 0.3970 + 0.9978i | 0.3992 + 1.0300i | 0.3970 + 0.9978i | 0.3992 + 1.0300i |
| 16 | 0.4206 + 0.9517i | 0.4279 + 1.0067i | 0.4234 + 0.9406i | 0.4252 + 0.9919i |
| 16.5 | 0.3299 + 0.9123i | 0.3314 + 0.9729i | 0.3449 + 0.9161i | 0.3458 + 0.9807i |
| 17 | 0.3299 + 0.9104i | 0.3304 + 0.9742i | 0.3299 + 0.9104i | 0.3304 + 0.9742i |
| 17.5 | 0.3285 + 0.9077i | 0.3284 + 0.9738i | 0.3285 + 0.9077i | 0.3284 + 0.9738i |
| 18 | 0.3213 + 0.9082i | 0.3211 + 0.9756i | 0.3213 + 0.9082i | 0.3211 + 0.9756i |
| 18.5 | 0.3601 + 1.0064i | 0.3708 + 1.0708i | 0.3601 + 1.0064i | 0.3752 + 1.0942i |
| 19 | 0.3667 + 1.0053i | 0.3772 + 1.0686i | 0.3667 + 1.0053i | 0.3819 + 1.0940i |
| 19.5 | 0.3717 + 1.0035i | 0.3894 + 1.0902i | 0.3717 + 1.0035i | 0.3841 + 1.0703i |
| 20 | 0.2615 + 0.8212i | 0.2469 + 0.9073i | 0.2615 + 0.8212i | 0.2501 + 0.8885i |
| 20.5 | 0.3234 + 0.9257i | 0.3269 + 1.0213i | 0.3234 + 0.9257i | 0.3259 + 1.0022i |
| 21 | 0.3142 + 0.9074i | 0.3155 + 1.0127i | 0.3142 + 0.9074i | 0.3156 + 1.0365i |
| 21.5 | 0.2873 + 0.8921i | 0.2967 + 1.0444i | 0.2873 + 0.8921i | 0.2940 + 1.0120i |
| 22 | 0.3077 + 0.9000i | 0.3077 + 1.0367i | 0.3077 + 0.9000i | 0.3077 + 1.0367i |
| 22.5 | 0.2944 + 0.8820i | 0.2944 + 1.0396i | 0.2944 + 0.8820i | 0.2951 + 0.9957i |
| 23 | 0.2803 + 0.8960i | 0.2822 + 1.0584i | 0.2803 + 0.8960i | 0.2794 + 1.0101i |
| 23.5 | 0.2863 + 0.8736i | 0.2818 + 1.0582i | 0.2905 + 0.8919i | 0.2853 + 0.9967i |
| 24 | 0.2893 + 0.9032i | 0.3123 + 1.1027i | 0.2959 + 0.9319i | 0.3029 + 1.0334i |
| 24.5 | 0.2548 + 0.9166i | 0.2364 + 1.0101i | 0.2759 + 0.8967i | 0.2549 + 1.0649i |
| 25 | 0.2423 + 0.9140i | 0.2246 + 1.0063i | 0.2679 + 0.8905i | 0.2459 + 1.0740i |
| 25.5 | 0.2809 + 0.9302i | 0.3045 + 1.0609i | 0.3388 + 0.9217i | 0.3581 + 1.0225i |
| 26 | 0.2478 + 0.9328i | 0.2466 + 1.0790i | 0.2813 + 0.9406i | 0.3161 + 1.0751i |
| 26.5 | 0.2695 + 0.9684i | 0.2704 + 1.0530i | 0.2713 + 0.8960i | 0.2536 + 1.1406i |
| 27 | 0.2959 + 0.9159i | 0.3072 + 1.0000i | 0.3513 + 0.8854i | 0.3357 + 1.0591i |
| 27.5 | 0.2843 + 0.9156i | 0.2866 + 1.0054i | 0.3594 + 0.9169i | 0.3648 + 1.0180i |
| 28 | 0.2807 + 0.8996i | 0.2837 + 1.2544i | 0.3472 + 0.9117i | 0.3452 + 1.0021i |
| SNR/w | w176 | w177 | w178 | w179 |
| 7 | 0.2556 + 0.4501i | 0.2556 + 0.4501i | 0.2556 + 0.4501i | 0.2556 + 0.4501i |
| 7.5 | 0.2648 + 0.4537i | 0.2648 + 0.4537i | 0.2379 + 0.4490i | 0.2379 + 0.4490i |

-continued

| | | | | |
|---|---|---|---|---|
| 8 | 0.2367 + 0.4780i | 0.2367 + 0.4780i | 0.2367 + 0.4780i | 0.2367 + 0.4780i |
| 8.5 | 0.2136 + 0.4205i | 0.2136 + 0.4205i | 0.2136 + 0.4205i | 0.2136 + 0.4205i |
| 9 | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i |
| 10 | 0.5458 + 0.8968i | 0.5458 + 0.8968i | 0.5458 + 0.8968i | 0.5458 + 0.8968i |
| 10.5 | 0.5391 + 0.8844i | 0.5391 + 0.8844i | 0.5391 + 0.8844i | 0.5391 + 0.8844i |
| 11 | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i |
| 12 | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i |
| 13 | 0.4551 + 0.8187i | 0.4551 + 0.8187i | 0.4551 + 0.8187i | 0.4551 + 0.8187i |
| 13.5 | 0.3865 + 0.6258i | 0.3865 + 0.6258i | 0.3865 + 0.6258i | 0.3865 + 0.6258i |
| 14 | 0.4134 + 0.5965i | 0.4134 + 0.5965i | 0.4134 + 0.5965i | 0.4134 + 0.5965i |
| 14.5 | 0.4221 + 0.5881i | 0.4221 + 0.5881i | 0.4221 + 0.5881i | 0.4221 + 0.5881i |
| 15 | 0.4021 + 0.5894i | 0.4021 + 0.5894i | 0.4021 + 0.5894i | 0.4021 + 0.5894i |
| 15.5 | 0.4122 + 0.5978i | 0.4122 + 0.5978i | 0.4122 + 0.5978i | 0.4122 + 0.5978i |
| 16 | 0.3855 + 0.6021i | 0.3855 + 0.6021i | 0.3855 + 0.6021i | 0.3855 + 0.6021i |
| 16.5 | 0.3578 + 0.5859i | 0.3578 + 0.5859i | 0.3578 + 0.5859i | 0.3578 + 0.5859i |
| 17 | 0.3611 + 0.5832i | 0.3611 + 0.5832i | 0.3611 + 0.5832i | 0.3611 + 0.5832i |
| 17.5 | 0.3651 + 0.5790i | 0.3651 + 0.5790i | 0.3651 + 0.5790i | 0.3651 + 0.5790i |
| 18 | 0.3699 + 0.5726i | 0.3699 + 0.5726i | 0.3699 + 0.5726i | 0.3699 + 0.5726i |
| 18.5 | 0.3738 + 0.6263i | 0.3738 + 0.6263i | 0.3738 + 0.6263i | 0.3738 + 0.6263i |
| 19 | 0.3971 + 0.6302i | 0.3971 + 0.6302i | 0.3971 + 0.6302i | 0.3971 + 0.6302i |
| 19.5 | 0.4169 + 0.6347i | 0.4169 + 0.6347i | 0.4169 + 0.6347i | 0.4169 + 0.6347i |
| 20 | 0.4344 + 0.5383i | 0.4344 + 0.5383i | 0.4344 + 0.5383i | 0.4344 + 0.5383i |
| 20.5 | 0.4336 + 0.5920i | 0.4336 + 0.5920i | 0.4336 + 0.5920i | 0.4336 + 0.5920i |
| 21 | 0.4211 + 0.5673i | 0.4211 + 0.5673i | 0.4211 + 0.5673i | 0.4211 + 0.5673i |
| 21.5 | 0.4157 + 0.5569i | 0.4140 + 0.5692i | 0.4157 + 0.5569i | 0.4140 + 0.5692i |
| 22 | 0.4241 + 0.5508i | 0.4245 + 0.5736i | 0.4241 + 0.5508i | 0.4245 + 0.5736i |
| 22.5 | 0.4200 + 0.5512i | 0.4202 + 0.5729i | 0.4200 + 0.5512i | 0.4202 + 0.5729i |
| 23 | 0.4301 + 0.5423i | 0.4186 + 0.5838i | 0.4101 + 0.5411i | 0.4186 + 0.5838i |
| 23.5 | 0.4342 + 0.5380i | 0.4337 + 0.5823i | 0.4125 + 0.5369i | 0.4121 + 0.5813i |
| 24 | 0.4240 + 0.5305i | 0.4224 + 0.5909i | 0.3960 + 0.5305i | 0.3944 + 0.5911i |
| 24.5 | 0.4394 + 0.5271i | 0.4335 + 0.6041i | 0.4041 + 0.5255i | 0.3995 + 0.6013i |
| 25 | 0.4499 + 0.5230i | 0.4394 + 0.6025i | 0.3970 + 0.5187i | 0.3924 + 0.5977i |
| 25.5 | 0.4713 + 0.5531i | 0.4766 + 0.6300i | 0.4019 + 0.5558i | 0.4036 + 0.6329i |
| 26 | 0.4704 + 0.5396i | 0.4557 + 0.6111i | 0.4115 + 0.5347i | 0.4241 + 0.6454i |
| 26.5 | 0.4616 + 0.5519i | 0.4251 + 0.6479i | 0.3986 + 0.5420i | 0.3877 + 0.6124i |
| 27 | 0.4932 + 0.5555i | 0.4800 + 0.6280i | 0.4144 + 0.5520i | 0.4124 + 0.6261i |
| 27.5 | 0.4887 + 0.5809i | 0.4812 + 0.6491i | 0.4174 + 0.5692i | 0.4122 + 0.6478i |
| 28 | 0.4885 + 0.5615i | 0.4738 + 0.6399i | 0.4131 + 0.5615i | 0.4096 + 0.6374i |

| SNR/w | w180 | w181 | w182 | w183 |
|---|---|---|---|---|
| 7 | 0.2556 + 0.4501i | 0.2688 + 0.4861i | 0.2556 + 0.4501i | 0.2688 + 0.4861i |
| 7.5 | 0.2798 + 0.4856i | 0.2798 + 0.4856i | 0.2466 + 0.4825i | 0.2466 + 0.4825i |
| 8 | 0.2728 + 0.4786i | 0.2728 + 0.4786i | 0.2728 + 0.4786i | 0.2728 + 0.4786i |
| 8.5 | 0.2397 + 0.4224i | 0.2397 + 0.4224i | 0.2397 + 0.4224i | 0.2397 + 0.4224i |
| 9 | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i |
| 10 | 0.5458 + 0.8968i | 0.5458 + 0.8968i | 0.5458 + 0.8968i | 0.5458 + 0.8968i |
| 10.5 | 0.5391 + 0.8844i | 0.5391 + 0.8844i | 0.5391 + 0.8844i | 0.5528 + 0.8984i |
| 11 | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i |
| 12 | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i |
| 13 | 0.4745 + 0.8449i | 0.4745 + 0.8449i | 0.4745 + 0.8449i | 0.4745 + 0.8449i |
| 13.5 | 0.3865 + 0.6258i | 0.3865 + 0.6258i | 0.3865 + 0.6258i | 0.3865 + 0.6258i |
| 14 | 0.4041 + 0.6182i | 0.4134 + 0.5965i | 0.4041 + 0.6182i | 0.4041 + 0.6182i |
| 14.5 | 0.4077 + 0.6193i | 0.4077 + 0.6193i | 0.4077 + 0.6193i | 0.4077 + 0.6193i |
| 15 | 0.4095 + 0.6418i | 0.4095 + 0.6418i | 0.4095 + 0.6418i | 0.4095 + 0.6418i |
| 15.5 | 0.4180 + 0.6562i | 0.4180 + 0.6562i | 0.4180 + 0.6562i | 0.4180 + 0.6562i |
| 16 | 0.3969 + 0.6876i | 0.3922 + 0.6761i | 0.3969 + 0.6876i | 0.3922 + 0.6761i |
| 16.5 | 0.3567 + 0.6823i | 0.3573 + 0.6612i | 0.3567 + 0.6823i | 0.3573 + 0.6612i |
| 17 | 0.3602 + 0.6889i | 0.3606 + 0.6651i | 0.3602 + 0.6889i | 0.3606 + 0.6651i |
| 17.5 | 0.3652 + 0.6978i | 0.3653 + 0.6726i | 0.3652 + 0.6978i | 0.3653 + 0.6726i |
| 18 | 0.3697 + 0.7105i | 0.3695 + 0.6865i | 0.3697 + 0.7105i | 0.3695 + 0.6865i |
| 18.5 | 0.4213 + 0.8009i | 0.4146 + 0.7796i | 0.4213 + 0.8009i | 0.4146 + 0.7796i |
| 19 | 0.4522 + 0.8036i | 0.4450 + 0.7814i | 0.4522 + 0.8036i | 0.4450 + 0.7814i |
| 19.5 | 0.4731 + 0.8087i | 0.4650 + 0.7840i | 0.4731 + 0.8087i | 0.4650 + 0.7840i |
| 20 | 0.3929 + 0.6967i | 0.3997 + 0.6745i | 0.3929 + 0.6967i | 0.3997 + 0.6745i |
| 20.5 | 0.4503 + 0.7711i | 0.4474 + 0.7391i | 0.4503 + 0.7711i | 0.4474 + 0.7391i |
| 21 | 0.4296 + 0.7571i | 0.4265 + 0.7104i | 0.4296 + 0.7571i | 0.4265 + 0.7104i |
| 21.5 | 0.4039 + 0.7447i | 0.4048 + 0.6984i | 0.4039 + 0.7447i | 0.4048 + 0.6984i |
| 22 | 0.4277 + 0.7656i | 0.4269 + 0.7001i | 0.4277 + 0.7656i | 0.4269 + 0.7001i |
| 22.5 | 0.4166 + 0.7523i | 0.4191 + 0.6937i | 0.4166 + 0.7523i | 0.4191 + 0.6937i |
| 23 | 0.4105 + 0.7806i | 0.4110 + 0.6931i | 0.4105 + 0.7806i | 0.4110 + 0.6931i |
| 23.5 | 0.4306 + 0.7737i | 0.4345 + 0.6883i | 0.4114 + 0.7705i | 0.4132 + 0.6878i |
| 24 | 0.4145 + 0.7848i | 0.4190 + 0.6893i | 0.3922 + 0.7799i | 0.3915 + 0.6903i |

-continued

| | | | | |
|---|---|---|---|---|
| 24.5 | 0.4210 + 0.8001i | 0.4255 + 0.7005i | 0.3823 + 0.8003i | 0.3916 + 0.6976i |
| 25 | 0.4127 + 0.8016i | 0.4248 + 0.6985i | 0.3717 + 0.7989i | 0.3841 + 0.6928i |
| 25.5 | 0.4825 + 0.7991i | 0.4804 + 0.7133i | 0.4063 + 0.8041i | 0.4045 + 0.7167i |
| 26 | 0.4123 + 0.8520i | 0.4554 + 0.8028i | 0.3640 + 0.8375i | 0.4184 + 0.7393i |
| 26.5 | 0.3594 + 0.7678i | 0.3969 + 0.7243i | 0.3707 + 0.8267i | 0.4482 + 0.8030i |
| 27 | 0.4851 + 0.7848i | 0.4912 + 0.6997i | 0.4214 + 0.7951i | 0.4128 + 0.7066i |
| 27.5 | 0.4949 + 0.8030i | 0.4972 + 0.7169i | 0.4243 + 0.8140i | 0.4168 + 0.7278i |
| 28 | 0.4750 + 0.8030i | 0.4772 + 0.7164i | 0.4136 + 0.8164i | 0.4073 + 0.7216i |

| SNR/w | w184 | w185 | w186 | w187 |
|---|---|---|---|---|
| 7 | 0.2556 + 0.4501i | 0.2688 + 0.4861i | 0.2556 + 0.4501i | 0.2688 + 0.4861i |
| 7.5 | 0.2798 + 0.4856i | 0.2798 + 0.4856i | 0.2466 + 0.4825i | 0.2466 + 0.4825i |
| 8 | 0.2478 + 0.5293i | 0.2478 + 0.5293i | 0.2478 + 0.5293i | 0.2478 + 0.5293i |
| 8.5 | 0.2412 + 0.5504i | 0.2412 + 0.5504i | 0.2412 + 0.5504i | 0.2412 + 0.5504i |
| 9 | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i |
| 10 | 0.5458 + 0.8968i | 0.5458 + 0.8968i | 0.5458 + 0.8968i | 0.5458 + 0.8968i |
| 10.5 | 0.5391 + 0.8844i | 0.5391 + 0.8844i | 0.5391 + 0.8844i | 0.5528 + 0.8984i |
| 11 | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i |
| 12 | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i |
| 13 | 0.4551 + 0.8187i | 0.4551 + 0.8187i | 0.4551 + 0.8187i | 0.4551 + 0.8187i |
| 13.5 | 0.3865 + 0.6258i | 0.3865 + 0.6258i | 0.3865 + 0.6258i | 0.3865 + 0.6258i |
| 14 | 0.4134 + 0.5965i | 0.4134 + 0.5965i | 0.4134 + 0.5965i | 0.4134 + 0.5965i |
| 14.5 | 0.4221 + 0.5881i | 0.4221 + 0.5881i | 0.4221 + 0.5881i | 0.4221 + 0.5881i |
| 15 | 0.4021 + 0.5894i | 0.4021 + 0.5894i | 0.4021 + 0.5894i | 0.4021 + 0.5894i |
| 15.5 | 0.4020 + 0.5898i | 0.4020 + 0.5898i | 0.4020 + 0.5898i | 0.4020 + 0.5898i |
| 16 | 0.3700 + 0.6026i | 0.3700 + 0.6026i | 0.3700 + 0.6026i | 0.3700 + 0.6026i |
| 16.5 | 0.3341 + 0.5863i | 0.3341 + 0.5863i | 0.3341 + 0.5863i | 0.3341 + 0.5863i |
| 17 | 0.3312 + 0.5837i | 0.3312 + 0.5837i | 0.3312 + 0.5837i | 0.3312 + 0.5837i |
| 17.5 | 0.3255 + 0.5796i | 0.3255 + 0.5796i | 0.3255 + 0.5796i | 0.3255 + 0.5796i |
| 18 | 0.3175 + 0.5728i | 0.3175 + 0.5728i | 0.3175 + 0.5728i | 0.3175 + 0.5728i |
| 18.5 | 0.3101 + 0.6373i | 0.3101 + 0.6373i | 0.3101 + 0.6373i | 0.3101 + 0.6373i |
| 19 | 0.3093 + 0.6504i | 0.3093 + 0.6504i | 0.3093 + 0.6504i | 0.3093 + 0.6504i |
| 19.5 | 0.3091 + 0.6604i | 0.3091 + 0.6604i | 0.3091 + 0.6604i | 0.3091 + 0.6604i |
| 20 | 0.3126 + 0.5103i | 0.3126 + 0.5103i | 0.3126 + 0.5103i | 0.3126 + 0.5103i |
| 20.5 | 0.3061 + 0.5984i | 0.3061 + 0.5984i | 0.3061 + 0.5984i | 0.3061 + 0.5984i |
| 21 | 0.2981 + 0.5721i | 0.2981 + 0.5721i | 0.2981 + 0.5721i | 0.2981 + 0.5721i |
| 21.5 | 0.2900 + 0.5487i | 0.2889 + 0.5640i | 0.2900 + 0.5487i | 0.2889 + 0.5640i |
| 22 | 0.2987 + 0.5542i | 0.2992 + 0.5758i | 0.2987 + 0.5542i | 0.2992 + 0.5758i |
| 22.5 | 0.2930 + 0.5479i | 0.2919 + 0.5689i | 0.2930 + 0.5479i | 0.2919 + 0.5689i |
| 23 | 0.2895 + 0.5356i | 0.2897 + 0.5764i | 0.2895 + 0.5356i | 0.2897 + 0.5764i |
| 23.5 | 0.2961 + 0.5344i | 0.2953 + 0.5790i | 0.2961 + 0.5344i | 0.2953 + 0.5790i |
| 24 | 0.2837 + 0.5315i | 0.2827 + 0.5939i | 0.2837 + 0.5315i | 0.2827 + 0.5939i |
| 24.5 | 0.2883 + 0.5234i | 0.2856 + 0.5937i | 0.3044 + 0.5238i | 0.3004 + 0.5947i |
| 25 | 0.2775 + 0.5141i | 0.2762 + 0.5902i | 0.3082 + 0.5152i | 0.3024 + 0.5920i |
| 25.5 | 0.2691 + 0.5602i | 0.2701 + 0.6365i | 0.3232 + 0.5582i | 0.3244 + 0.6346i |
| 26 | 0.2972 + 0.5451i | 0.2990 + 0.6252i | 0.3472 + 0.5423i | 0.3491 + 0.6333i |
| 26.5 | 0.2596 + 0.5290i | 0.2589 + 0.5985i | 0.3256 + 0.5326i | 0.3154 + 0.6039i |
| 27 | 0.2766 + 0.5536i | 0.2777 + 0.6319i | 0.3404 + 0.5532i | 0.3419 + 0.6283i |
| 27.5 | 0.2828 + 0.5653i | 0.2811 + 0.6456i | 0.3483 + 0.5665i | 0.3451 + 0.6465i |
| 28 | 0.2732 + 0.5668i | 0.2746 + 0.6455i | 0.3392 + 0.5659i | 0.3408 + 0.6410i |

| SNR/w | w188 | w189 | w190 | w191 |
|---|---|---|---|---|
| 7 | 0.2688 + 0.4861i | 0.2688 + 0.4861i | 0.2688 + 0.4861i | 0.2688 + 0.4861i |
| 7.5 | 0.2943 + 0.5156i | 0.2943 + 0.5156i | 0.2548 + 0.5168i | 0.2548 + 0.5168i |
| 8 | 0.2953 + 0.5229i | 0.2953 + 0.5229i | 0.2953 + 0.5229i | 0.2953 + 0.5229i |
| 8.5 | 0.2977 + 0.5358i | 0.2977 + 0.5358i | 0.2977 + 0.5358i | 0.2977 + 0.5358i |
| 9 | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i |
| 10 | 0.5458 + 0.8968i | 0.5458 + 0.8968i | 0.5458 + 0.8968i | 0.5609 + 0.9130i |
| 10.5 | 0.5391 + 0.8844i | 0.5528 + 0.8984i | 0.5391 + 0.8844i | 0.5528 + 0.8984i |
| 11 | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i |
| 12 | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i |
| 13 | 0.4745 + 0.8449i | 0.4745 + 0.8449i | 0.4745 + 0.8449i | 0.4745 + 0.8449i |
| 13.5 | 0.3865 + 0.6258i | 0.3865 + 0.6258i | 0.3865 + 0.6258i | 0.3865 + 0.6258i |
| 14 | 0.4041 + 0.6182i | 0.4041 + 0.6182i | 0.4041 + 0.6182i | 0.4041 + 0.6182i |
| 14.5 | 0.4077 + 0.6193i | 0.4077 + 0.6193i | 0.4077 + 0.6193i | 0.4077 + 0.6193i |
| 15 | 0.4095 + 0.6418i | 0.4095 + 0.6418i | 0.4095 + 0.6418i | 0.4095 + 0.6418i |
| 15.5 | 0.4040 + 0.6378i | 0.4040 + 0.6378i | 0.4040 + 0.6378i | 0.4040 + 0.6378i |
| 16 | 0.3812 + 0.6855i | 0.3767 + 0.6745i | 0.3812 + 0.6855i | 0.3767 + 0.6745i |
| 16.5 | 0.3336 + 0.6838i | 0.3340 + 0.6625i | 0.3336 + 0.6838i | 0.3340 + 0.6625i |
| 17 | 0.3314 + 0.6911i | 0.3315 + 0.6671i | 0.3314 + 0.6911i | 0.3315 + 0.6671i |
| 17.5 | 0.3273 + 0.7010i | 0.3269 + 0.6758i | 0.3273 + 0.7010i | 0.3269 + 0.6758i |

-continued

| | | | | |
|---|---|---|---|---|
| 18 | 0.3195 + 0.7134i | 0.3188 + 0.6894i | 0.3195 + 0.7134i | 0.3188 + 0.6894i |
| 18.5 | 0.3320 + 0.8235i | 0.3288 + 0.8011i | 0.3320 + 0.8235i | 0.3288 + 0.8011i |
| 19 | 0.3368 + 0.8329i | 0.3327 + 0.8107i | 0.3368 + 0.8329i | 0.3327 + 0.8107i |
| 19.5 | 0.3403 + 0.8413i | 0.3355 + 0.8173i | 0.3403 + 0.8413i | 0.3355 + 0.8173i |
| 20 | 0.2869 + 0.6641i | 0.2910 + 0.6411i | 0.2869 + 0.6641i | 0.2910 + 0.6411i |
| 20.5 | 0.3158 + 0.7762i | 0.3144 + 0.7466i | 0.3158 + 0.7762i | 0.3144 + 0.7466i |
| 21 | 0.3058 + 0.7624i | 0.3034 + 0.7165i | 0.3058 + 0.7624i | 0.3034 + 0.7165i |
| 21.5 | 0.2841 + 0.7489i | 0.2837 + 0.6957i | 0.2841 + 0.7489i | 0.2837 + 0.6957i |
| 22 | 0.3037 + 0.7640i | 0.3024 + 0.7019i | 0.3037 + 0.7640i | 0.3024 + 0.7019i |
| 22.5 | 0.2931 + 0.7505i | 0.2913 + 0.6920i | 0.2931 + 0.7505i | 0.2913 + 0.6920i |
| 23 | 0.2851 + 0.7771i | 0.2883 + 0.6891i | 0.2851 + 0.7771i | 0.2883 + 0.6891i |
| 23.5 | 0.2950 + 0.7690i | 0.2948 + 0.6849i | 0.2950 + 0.7690i | 0.2948 + 0.6849i |
| 24 | 0.2824 + 0.8027i | 0.2808 + 0.6950i | 0.2887 + 0.7921i | 0.2808 + 0.6950i |
| 24.5 | 0.2707 + 0.7847i | 0.2797 + 0.6898i | 0.2836 + 0.7930i | 0.2941 + 0.6900i |
| 25 | 0.2637 + 0.7785i | 0.2724 + 0.6839i | 0.2799 + 0.7900i | 0.2944 + 0.6840i |
| 25.5 | 0.2749 + 0.8226i | 0.2718 + 0.7235i | 0.3274 + 0.8149i | 0.3244 + 0.7213i |
| 26 | 0.2628 + 0.8162i | 0.2862 + 0.7117i | 0.2961 + 0.8194i | 0.3367 + 0.7232i |
| 26.5 | 0.2797 + 0.7660i | 0.2874 + 0.6779i | 0.2816 + 0.8277i | 0.2874 + 0.6779i |
| 27 | 0.2818 + 0.8033i | 0.2795 + 0.7152i | 0.3469 + 0.7986i | 0.3449 + 0.7116i |
| 27.5 | 0.2821 + 0.8240i | 0.2808 + 0.7321i | 0.3509 + 0.8188i | 0.3469 + 0.7317i |
| 28 | 0.2773 + 0.8163i | 0.2760 + 0.7294i | 0.3462 + 0.8141i | 0.3422 + 0.7259i |

| SNR/w | w192 | w193 | w194 | w195 |
|---|---|---|---|---|
| 7 | 0.4139 + 0.2420i | 0.4139 + 0.2420i | 0.4139 + 0.2420i | 0.4139 + 0.2420i |
| 7.5 | 0.4026 + 0.2281i | 0.4026 + 0.2281i | 0.4026 + 0.2281i | 0.3757 + 0.2165i |
| 8 | 0.3795 + 0.2188i | 0.3795 + 0.2188i | 0.3795 + 0.2188i | 0.3795 + 0.2188i |
| 8.5 | 0.3753 + 0.2067i | 0.3753 + 0.2067i | 0.3753 + 0.2067i | 0.3753 + 0.2067i |
| 9 | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i |
| 11 | 0.3224 + 0.1541i | 0.3224 + 0.1541i | 0.3224 + 0.1541i | 0.3224 + 0.1541i |
| 11.5 | 0.3192 + 0.1479i | 0.3192 + 0.1479i | 0.3192 + 0.1479i | 0.3192 + 0.1479i |
| 12 | 0.3251 + 0.1434i | 0.3251 + 0.1434i | 0.3251 + 0.1434i | 0.3251 + 0.1434i |
| 12.5 | 0.2482 + 0.1424i | 0.2482 + 0.1424i | 0.2482 + 0.1424i | 0.2482 + 0.1424i |
| 13 | 0.1494 + 0.2215i | 0.1494 + 0.2215i | 0.1494 + 0.2215i | 0.1494 + 0.2215i |
| 13.5 | 0.2205 + 0.1335i | 0.2205 + 0.1335i | 0.2205 + 0.1335i | 0.2205 + 0.1335i |
| 14 | 0.2029 + 0.1317i | 0.2029 + 0.1317i | 0.2029 + 0.1317i | 0.2029 + 0.1317i |
| 14.5 | 0.1977 + 0.1305i | 0.1977 + 0.1305i | 0.1977 + 0.1305i | 0.1977 + 0.1305i |
| 15 | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i |
| 16 | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i |
| 18 | 0.1031 + 0.1019i | 0.1031 + 0.1019i | 0.1031 + 0.1019i | 0.1031 + 0.1019i |
| 18.5 | 0.0961 + 0.0854i | 0.0961 + 0.0854i | 0.0961 + 0.0854i | 0.0961 + 0.0854i |
| 19 | 0.0921 + 0.0770i | 0.0921 + 0.0770i | 0.0921 + 0.0770i | 0.0921 + 0.0770i |
| 19.5 | 0.0905 + 0.0748i | 0.0905 + 0.0748i | 0.0905 + 0.0748i | 0.0905 + 0.0748i |
| 20 | 0.0723 + 0.0768i | 0.0723 + 0.0768i | 0.0723 + 0.0768i | 0.0723 + 0.0768i |
| 20.5 | 0.0636 + 0.0660i | 0.0636 + 0.0660i | 0.0636 + 0.0660i | 0.0636 + 0.0660i |
| 21 | 0.0606 + 0.0613i | 0.0606 + 0.0613i | 0.0606 + 0.0613i | 0.0606 + 0.0613i |
| 21.5 | 0.0624 + 0.0575i | 0.0624 + 0.0575i | 0.0624 + 0.0575i | 0.0624 + 0.0575i |
| 22 | 0.0583 + 0.0591i | 0.0583 + 0.0591i | 0.0583 + 0.0591i | 0.0583 + 0.0591i |
| 22.5 | 0.0593 + 0.0592i | 0.0593 + 0.0592i | 0.0593 + 0.0592i | 0.0593 + 0.0592i |
| 23 | 0.0597 + 0.0546i | 0.0597 + 0.0546i | 0.0597 + 0.0546i | 0.0597 + 0.0546i |
| 23.5 | 0.0579 + 0.0565i | 0.0579 + 0.0565i | 0.0579 + 0.0565i | 0.0579 + 0.0565i |
| 24 | 0.0568 + 0.0565i | 0.0568 + 0.0565i | 0.0568 + 0.0565i | 0.0568 + 0.0565i |
| 24.5 | 0.0562 + 0.0569i | 0.0562 + 0.0569i | 0.0562 + 0.0569i | 0.0562 + 0.0569i |
| 25 | 0.0497 + 0.0540i | 0.0497 + 0.0540i | 0.0650 + 0.0541i | 0.0650 + 0.0541i |
| 25.5 | 0.0539 + 0.0400i | 0.0526 + 0.0822i | 0.0539 + 0.0400i | 0.0526 + 0.0822i |
| 26 | 0.0344 + 0.0341i | 0.0353 + 0.0840i | 0.0901 + 0.0333i | 0.0896 + 0.0834i |
| 26.5 | 0.0350 + 0.0336i | 0.0344 + 0.0721i | 0.0994 + 0.0336i | 0.0982 + 0.0745i |
| 27 | 0.0312 + 0.0312i | 0.0315 + 0.0893i | 0.0899 + 0.0311i | 0.0893 + 0.0896i |
| 27.5 | 0.0321 + 0.0316i | 0.0320 + 0.0923i | 0.0944 + 0.0317i | 0.0944 + 0.0924i |
| 28 | 0.0325 + 0.0301i | 0.0319 + 0.0893i | 0.0962 + 0.0306i | 0.0959 + 0.0901i |

| SNR/w | w196 | w197 | w198 | w199 |
|---|---|---|---|---|
| 7 | 0.4139 + 0.2420i | 0.4502 + 0.2556i | 0.4139 + 0.2420i | 0.4502 + 0.2556i |
| 7.5 | 0.4284 + 0.2422i | 0.4284 + 0.2422i | 0.4026 + 0.2281i | 0.4026 + 0.2281i |
| 8 | 0.3795 + 0.2188i | 0.3795 + 0.2188i | 0.3795 + 0.2188i | 0.3795 + 0.2188i |
| 8.5 | 0.3753 + 0.2067i | 0.3753 + 0.2067i | 0.3753 + 0.2067i | 0.3753 + 0.2067i |
| 9 | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i |
| 11 | 0.3224 + 0.1541i | 0.3224 + 0.1541i | 0.3224 + 0.1541i | 0.3224 + 0.1541i |

-continued

| | | | | |
|---|---|---|---|---|
| 11.5 | 0.3192 + 0.1479i | 0.3192 + 0.1479i | 0.3192 + 0.1479i | 0.3192 + 0.1479i |
| 12 | 0.3251 + 0.1434i | 0.3251 + 0.1434i | 0.3251 + 0.1434i | 0.3251 + 0.1434i |
| 12.5 | 0.2482 + 0.1424i | 0.2482 + 0.1424i | 0.2482 + 0.1424i | 0.2482 + 0.1424i |
| 13 | 0.1494 + 0.2215i | 0.1494 + 0.2215i | 0.1494 + 0.2215i | 0.1494 + 0.2215i |
| 13.5 | 0.2205 + 0.1335i | 0.2205 + 0.1335i | 0.2205 + 0.1335i | 0.2205 + 0.1335i |
| 14 | 0.2029 + 0.1317i | 0.2029 + 0.1317i | 0.2029 + 0.1317i | 0.2029 + 0.1317i |
| 14.5 | 0.1977 + 0.1305i | 0.1977 + 0.1305i | 0.1977 + 0.1305i | 0.1977 + 0.1305i |
| 15 | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i |
| 16 | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i |
| 18 | 0.1029 + 0.1208i | 0.1029 + 0.1208i | 0.1029 + 0.1208i | 0.1029 + 0.1208i |
| 18.5 | 0.0971 + 0.1780i | 0.0971 + 0.1780i | 0.0971 + 0.1780i | 0.0971 + 0.1780i |
| 19 | 0.0938 + 0.2028i | 0.0938 + 0.2028i | 0.0938 + 0.2028i | 0.0938 + 0.2028i |
| 19.5 | 0.0927 + 0.2157i | 0.0927 + 0.2157i | 0.0927 + 0.2157i | 0.0927 + 0.2157i |
| 20 | 0.0721 + 0.1102i | 0.0721 + 0.1102i | 0.0721 + 0.1102i | 0.0721 + 0.1102i |
| 20.5 | 0.0638 + 0.1878i | 0.0638 + 0.1878i | 0.0638 + 0.1878i | 0.0638 + 0.1878i |
| 21 | 0.0605 + 0.1754i | 0.0605 + 0.1754i | 0.0605 + 0.1754i | 0.0605 + 0.1754i |
| 21.5 | 0.0619 + 0.1651i | 0.0619 + 0.1651i | 0.0619 + 0.1651i | 0.0619 + 0.1651i |
| 22 | 0.0583 + 0.1759i | 0.0583 + 0.1759i | 0.0583 + 0.1759i | 0.0583 + 0.1759i |
| 22.5 | 0.0611 + 0.1735i | 0.0611 + 0.1735i | 0.0611 + 0.1735i | 0.0611 + 0.1735i |
| 23 | 0.0589 + 0.1642i | 0.0589 + 0.1642i | 0.0589 + 0.1642i | 0.0589 + 0.1642i |
| 23.5 | 0.0585 + 0.1710i | 0.0585 + 0.1710i | 0.0585 + 0.1710i | 0.0585 + 0.1710i |
| 24 | 0.0567 + 0.1703i | 0.0567 + 0.1703i | 0.0567 + 0.1703i | 0.0567 + 0.1703i |
| 24.5 | 0.0565 + 0.1714i | 0.0565 + 0.1714i | 0.0565 + 0.1714i | 0.0565 + 0.1714i |
| 25 | 0.0499 + 0.1635i | 0.0499 + 0.1635i | 0.0646 + 0.1633i | 0.0646 + 0.1633i |
| 25.5 | 0.0548 + 0.2082i | 0.0533 + 0.1620i | 0.0548 + 0.2082i | 0.0533 + 0.1620i |
| 26 | 0.0350 + 0.2090i | 0.0359 + 0.1529i | 0.0840 + 0.2107i | 0.0864 + 0.1532i |
| 26.5 | 0.0332 + 0.1857i | 0.0337 + 0.1391i | 0.0949 + 0.1879i | 0.0967 + 0.1405i |
| 27 | 0.0313 + 0.2132i | 0.0316 + 0.1532i | 0.0877 + 0.2140i | 0.0886 + 0.1536i |
| 27.5 | 0.0316 + 0.2186i | 0.0319 + 0.1557i | 0.0930 + 0.2195i | 0.0936 + 0.1565i |
| 28 | 0.0317 + 0.2134i | 0.0317 + 0.1511i | 0.0943 + 0.2132i | 0.0949 + 0.1513i |

| SNR/w | w200 | w201 | w202 | w203 |
|---|---|---|---|---|
| 7 | 0.4139 + 0.2420i | 0.4502 + 0.2556i | 0.4139 + 0.2420i | 0.4502 + 0.2556i |
| 7.5 | 0.4284 + 0.2422i | 0.4284 + 0.2422i | 0.4026 + 0.2281i | 0.4026 + 0.2281i |
| 8 | 0.4279 + 0.2367i | 0.4279 + 0.2367i | 0.4279 + 0.2367i | 0.4279 + 0.2367i |
| 8.5 | 0.4919 + 0.2302i | 0.4919 + 0.2302i | 0.4919 + 0.2302i | 0.4919 + 0.2302i |
| 9 | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i |
| 11 | 0.3224 + 0.1541i | 0.3224 + 0.1541i | 0.3224 + 0.1541i | 0.3224 + 0.1541i |
| 11.5 | 0.3192 + 0.1479i | 0.3192 + 0.1479i | 0.3192 + 0.1479i | 0.3192 + 0.1479i |
| 12 | 0.3251 + 0.1434i | 0.3251 + 0.1434i | 0.3251 + 0.1434i | 0.3251 + 0.1434i |
| 12.5 | 0.2482 + 0.1424i | 0.2482 + 0.1424i | 0.2482 + 0.1424i | 0.2482 + 0.1424i |
| 13 | 0.1494 + 0.2215i | 0.1494 + 0.2215i | 0.1494 + 0.2215i | 0.1494 + 0.2215i |
| 13.5 | 0.2205 + 0.1335i | 0.2205 + 0.1335i | 0.2205 + 0.1335i | 0.2205 + 0.1335i |
| 14 | 0.2029 + 0.1317i | 0.2029 + 0.1317i | 0.2029 + 0.1317i | 0.2029 + 0.1317i |
| 14.5 | 0.1977 + 0.1305i | 0.1977 + 0.1305i | 0.1977 + 0.1305i | 0.1977 + 0.1305i |
| 15 | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i |
| 16 | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i |
| 18 | 0.1236 + 0.1019i | 0.1236 + 0.1019i | 0.1236 + 0.1019i | 0.1236 + 0.1019i |
| 18.5 | 0.0961 + 0.0854i | 0.0961 + 0.0854i | 0.0961 + 0.0854i | 0.0961 + 0.0854i |
| 19 | 0.0921 + 0.0770i | 0.0921 + 0.0770i | 0.0921 + 0.0770i | 0.0921 + 0.0770i |
| 19.5 | 0.0905 + 0.0748i | 0.0905 + 0.0748i | 0.0905 + 0.0748i | 0.0905 + 0.0748i |
| 20 | 0.2104 + 0.0757i | 0.2104 + 0.0757i | 0.2104 + 0.0757i | 0.2104 + 0.0757i |
| 20.5 | 0.1593 + 0.0657i | 0.1593 + 0.0657i | 0.1593 + 0.0657i | 0.1593 + 0.0657i |
| 21 | 0.1708 + 0.0613i | 0.1708 + 0.0613i | 0.1708 + 0.0613i | 0.1708 + 0.0613i |
| 21.5 | 0.1850 + 0.0578i | 0.1850 + 0.0578i | 0.1850 + 0.0578i | 0.1850 + 0.0578i |
| 22 | 0.1740 + 0.0587i | 0.1740 + 0.0587i | 0.1740 + 0.0587i | 0.1740 + 0.0587i |
| 22.5 | 0.1798 + 0.0568i | 0.1798 + 0.0568i | 0.1798 + 0.0568i | 0.1798 + 0.0568i |
| 23 | 0.1753 + 0.0566i | 0.1753 + 0.0566i | 0.1753 + 0.0566i | 0.1753 + 0.0566i |
| 23.5 | 0.1751 + 0.0567i | 0.1751 + 0.0567i | 0.1751 + 0.0567i | 0.1751 + 0.0567i |
| 24 | 0.1711 + 0.0565i | 0.1711 + 0.0565i | 0.1711 + 0.0565i | 0.1711 + 0.0565i |
| 24.5 | 0.1692 + 0.0568i | 0.1692 + 0.0568i | 0.1692 + 0.0568i | 0.1692 + 0.0568i |
| 25 | 0.1878 + 0.0537i | 0.1878 + 0.0537i | 0.1620 + 0.0538i | 0.1620 + 0.0538i |
| 25.5 | 0.1715 + 0.0412i | 0.1727 + 0.0826i | 0.1516 + 0.0410i | 0.1518 + 0.0833i |
| 26 | 0.2200 + 0.0335i | 0.2157 + 0.0862i | 0.1605 + 0.0334i | 0.1594 + 0.0842i |
| 26.5 | 0.2312 + 0.0326i | 0.2301 + 0.0822i | 0.1675 + 0.0333i | 0.1669 + 0.0781i |
| 27 | 0.2133 + 0.0321i | 0.2124 + 0.0917i | 0.1539 + 0.0316i | 0.1528 + 0.0907i |

-continued

| | | | | |
|---|---|---|---|---|
| 27.5 | 0.2220 + 0.0325i | 0.2205 + 0.0962i | 0.1593 + 0.0316i | 0.1585 + 0.0936i |
| 28 | 0.2272 + 0.0295i | 0.2268 + 0.0890i | 0.1609 + 0.0303i | 0.1613 + 0.0901i |

| SNR/w | w204 | w205 | w206 | w207 |
|---|---|---|---|---|
| 7 | 0.4502 + 0.2556i | 0.4502 + 0.2556i | 0.4502 + 0.2556i | 0.4502 + 0.2556i |
| 7.5 | 0.4532 + 0.2648i | 0.4532 + 0.2648i | 0.4500 + 0.2383i | 0.4284 + 0.2422i |
| 8 | 0.4279 + 0.2367i | 0.4279 + 0.2367i | 0.4279 + 0.2367i | 0.4279 + 0.2367i |
| 8.5 | 0.4857 + 0.2709i | 0.4857 + 0.2709i | 0.4857 + 0.2709i | 0.4857 + 0.2709i |
| 9 | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i |
| 11 | 0.3224 + 0.1541i | 0.3224 + 0.1541i | 0.3224 + 0.1541i | 0.3224 + 0.1541i |
| 11.5 | 0.3192 + 0.1479i | 0.3192 + 0.1479i | 0.3192 + 0.1479i | 0.3192 + 0.1479i |
| 12 | 0.3251 + 0.1434i | 0.3251 + 0.1434i | 0.3251 + 0.1434i | 0.3251 + 0.1434i |
| 12.5 | 0.2482 + 0.1424i | 0.2482 + 0.1424i | 0.2482 + 0.1424i | 0.2482 + 0.1424i |
| 13 | 0.1494 + 0.2215i | 0.1494 + 0.2215i | 0.1494 + 0.2215i | 0.1494 + 0.2215i |
| 13.5 | 0.2205 + 0.1335i | 0.2205 + 0.1335i | 0.2205 + 0.1335i | 0.2205 + 0.1335i |
| 14 | 0.2029 + 0.1317i | 0.2029 + 0.1317i | 0.2029 + 0.1317i | 0.2029 + 0.1317i |
| 14.5 | 0.1977 + 0.1305i | 0.1977 + 0.1305i | 0.1977 + 0.1305i | 0.1977 + 0.1305i |
| 15 | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i |
| 16 | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i |
| 18 | 0.1234 + 0.1209i | 0.1234 + 0.1209i | 0.1234 + 0.1209i | 0.1234 + 0.1209i |
| 18.5 | 0.0971 + 0.1780i | 0.0971 + 0.1780i | 0.0971 + 0.1780i | 0.0971 + 0.1780i |
| 19 | 0.0938 + 0.2028i | 0.0938 + 0.2028i | 0.0938 + 0.2028i | 0.0938 + 0.2028i |
| 19.5 | 0.0927 + 0.2157i | 0.0927 + 0.2157i | 0.0927 + 0.2157i | 0.0927 + 0.2157i |
| 20 | 0.2094 + 0.1154i | 0.2094 + 0.1154i | 0.2094 + 0.1154i | 0.2094 + 0.1154i |
| 20.5 | 0.1613 + 0.1873i | 0.1613 + 0.1873i | 0.1613 + 0.1873i | 0.1613 + 0.1873i |
| 21 | 0.1705 + 0.1750i | 0.1705 + 0.1750i | 0.1705 + 0.1750i | 0.1705 + 0.1750i |
| 21.5 | 0.1832 + 0.1667i | 0.1832 + 0.1667i | 0.1832 + 0.1667i | 0.1832 + 0.1667i |
| 22 | 0.1739 + 0.1750i | 0.1739 + 0.1750i | 0.1739 + 0.1750i | 0.1739 + 0.1750i |
| 22.5 | 0.1797 + 0.1737i | 0.1797 + 0.1737i | 0.1797 + 0.1737i | 0.1797 + 0.1737i |
| 23 | 0.1746 + 0.1655i | 0.1746 + 0.1655i | 0.1746 + 0.1655i | 0.1746 + 0.1655i |
| 23.5 | 0.1756 + 0.1709i | 0.1756 + 0.1709i | 0.1756 + 0.1709i | 0.1756 + 0.1709i |
| 24 | 0.1709 + 0.1707i | 0.1709 + 0.1707i | 0.1709 + 0.1707i | 0.1709 + 0.1707i |
| 24.5 | 0.1703 + 0.1710i | 0.1703 + 0.1710i | 0.1703 + 0.1710i | 0.1703 + 0.1710i |
| 25 | 0.1869 + 0.1626i | 0.1869 + 0.1626i | 0.1621 + 0.1626i | 0.1621 + 0.1626i |
| 25.5 | 0.1745 + 0.2087i | 0.1743 + 0.1629i | 0.1532 + 0.2079i | 0.1527 + 0.1612i |
| 26 | 0.2057 + 0.2111i | 0.2090 + 0.1567i | 0.1533 + 0.2109i | 0.1556 + 0.1545i |
| 26.5 | 0.2213 + 0.2007i | 0.2267 + 0.1480i | 0.1613 + 0.1940i | 0.1643 + 0.1434i |
| 27 | 0.2111 + 0.2173i | 0.2112 + 0.1563i | 0.1511 + 0.2158i | 0.1520 + 0.1548i |
| 27.5 | 0.2186 + 0.2223i | 0.2194 + 0.1603i | 0.1562 + 0.2208i | 0.1568 + 0.1579i |
| 28 | 0.2228 + 0.2150i | 0.2255 + 0.1519i | 0.1587 + 0.2135i | 0.1605 + 0.1517i |

| SNR/w | w208 | w209 | w210 | w211 |
|---|---|---|---|---|
| 7 | 0.4139 + 0.2420i | 0.4502 + 0.2556i | 0.4139 + 0.2420i | 0.4502 + 0.2556i |
| 7.5 | 0.4284 + 0.2422i | 0.4284 + 0.2422i | 0.4284 + 0.2422i | 0.4026 + 0.2281i |
| 8 | 0.4279 + 0.2367i | 0.4279 + 0.2367i | 0.4279 + 0.2367i | 0.4279 + 0.2367i |
| 8.5 | 0.3946 + 0.2203i | 0.3753 + 0.2067i | 0.3946 + 0.2203i | 0.3753 + 0.2067i |
| 9 | 0.2334 + 0.5708i | 0.2334 + 0.5708i | 0.2334 + 0.5708i | 0.2334 + 0.5708i |
| 9.5 | 0.2261 + 0.6013i | 0.2261 + 0.6013i | 0.2261 + 0.6013i | 0.2261 + 0.6013i |
| 10 | 0.2172 + 0.6259i | 0.2172 + 0.6259i | 0.2172 + 0.6259i | 0.2172 + 0.6259i |
| 10.5 | 0.2071 + 0.6433i | 0.2071 + 0.6433i | 0.2071 + 0.6433i | 0.2071 + 0.6433i |
| 11 | 0.3107 + 0.1761i | 0.3107 + 0.1761i | 0.3107 + 0.1761i | 0.3107 + 0.1761i |
| 11.5 | 0.3058 + 0.1740i | 0.3058 + 0.1740i | 0.3058 + 0.1740i | 0.3058 + 0.1740i |
| 12 | 0.3089 + 0.1735i | 0.3089 + 0.1735i | 0.3089 + 0.1735i | 0.3089 + 0.1735i |
| 12.5 | 0.2451 + 0.1663i | 0.2451 + 0.1663i | 0.2451 + 0.1663i | 0.2451 + 0.1663i |
| 13 | 0.1500 + 0.5903i | 0.1500 + 0.5903i | 0.1500 + 0.5903i | 0.1500 + 0.5903i |
| 13.5 | 0.2162 + 0.1596i | 0.2162 + 0.1596i | 0.2162 + 0.1596i | 0.2162 + 0.1596i |
| 14 | 0.2037 + 0.1615i | 0.2037 + 0.1615i | 0.2037 + 0.1615i | 0.2037 + 0.1615i |
| 14.5 | 0.1955 + 0.1660i | 0.1955 + 0.1660i | 0.1955 + 0.1660i | 0.1955 + 0.1660i |
| 15 | 0.1264 + 0.3535i | 0.1264 + 0.3535i | 0.1264 + 0.3535i | 0.1264 + 0.3535i |
| 15.5 | 0.1246 + 0.3613i | 0.1246 + 0.3613i | 0.1246 + 0.3613i | 0.1246 + 0.3613i |
| 16 | 0.1145 + 0.3867i | 0.1145 + 0.3867i | 0.1145 + 0.3867i | 0.1145 + 0.3867i |
| 16.5 | 0.1132 + 0.3584i | 0.1132 + 0.3584i | 0.1132 + 0.3584i | 0.1132 + 0.3584i |
| 17 | 0.1128 + 0.3620i | 0.1128 + 0.3620i | 0.1128 + 0.3620i | 0.1128 + 0.3620i |
| 17.5 | 0.1124 + 0.3668i | 0.1124 + 0.3668i | 0.1124 + 0.3668i | 0.1124 + 0.3668i |
| 18 | 0.1020 + 0.3721i | 0.1020 + 0.3721i | 0.1020 + 0.3721i | 0.1020 + 0.3721i |
| 18.5 | 0.1033 + 0.4748i | 0.1033 + 0.4748i | 0.1033 + 0.4748i | 0.1033 + 0.4748i |
| 19 | 0.0880 + 0.5037i | 0.0880 + 0.5037i | 0.0880 + 0.5037i | 0.0880 + 0.5037i |
| 19.5 | 0.0798 + 0.5209i | 0.0798 + 0.5209i | 0.0798 + 0.5209i | 0.0798 + 0.5209i |
| 20 | 0.0700 + 0.3244i | 0.0700 + 0.3244i | 0.0700 + 0.3244i | 0.0700 + 0.3244i |
| 20.5 | 0.0631 + 0.4551i | 0.0631 + 0.4551i | 0.0631 + 0.4551i | 0.0631 + 0.4551i |

-continued

| | | | | |
|---|---|---|---|---|
| 21 | 0.0606 + 0.4318i | 0.0606 + 0.4318i | 0.0606 + 0.4318i | 0.0606 + 0.4318i |
| 21.5 | 0.0595 + 0.4083i | 0.0595 + 0.4083i | 0.0595 + 0.4083i | 0.0595 + 0.4083i |
| 22 | 0.0587 + 0.4286i | 0.0587 + 0.4286i | 0.0587 + 0.4286i | 0.0587 + 0.4286i |
| 22.5 | 0.0573 + 0.4196i | 0.0573 + 0.4196i | 0.0573 + 0.4196i | 0.0573 + 0.4196i |
| 23 | 0.0552 + 0.4065i | 0.0552 + 0.4065i | 0.0552 + 0.4065i | 0.0552 + 0.4065i |
| 23.5 | 0.0583 + 0.4211i | 0.0587 + 0.4058i | 0.0583 + 0.4211i | 0.0587 + 0.4058i |
| 24 | 0.0556 + 0.4321i | 0.0558 + 0.3996i | 0.0556 + 0.4321i | 0.0558 + 0.3996i |
| 24.5 | 0.0583 + 0.4291i | 0.0581 + 0.3963i | 0.0583 + 0.4291i | 0.0581 + 0.3963i |
| 25 | 0.0517 + 0.4253i | 0.0513 + 0.3805i | 0.0633 + 0.4254i | 0.0636 + 0.3805i |
| 25.5 | 0.0466 + 0.4869i | 0.0531 + 0.4193i | 0.0662 + 0.4850i | 0.0531 + 0.4193i |
| 26 | 0.0351 + 0.4808i | 0.0342 + 0.4146i | 0.0899 + 0.4781i | 0.0857 + 0.4137i |
| 26.5 | 0.0318 + 0.4522i | 0.0321 + 0.3789i | 0.0739 + 0.4533i | 0.0796 + 0.3824i |
| 27 | 0.0308 + 0.4850i | 0.0311 + 0.4144i | 0.0873 + 0.4850i | 0.0875 + 0.4142i |
| 27.5 | 0.0311 + 0.4893i | 0.0313 + 0.4189i | 0.0920 + 0.4897i | 0.0921 + 0.4194i |
| 28 | 0.0302 + 0.4887i | 0.0304 + 0.4150i | 0.0892 + 0.4889i | 0.0900 + 0.4153i |

| SNR/w | w212 | w213 | w214 | w215 |
|---|---|---|---|---|
| 7 | 0.4502 + 0.2556i | 0.4502 + 0.2556i | 0.4502 + 0.2556i | 0.4502 + 0.2556i |
| 7.5 | 0.4532 + 0.2648i | 0.4532 + 0.2648i | 0.4500 + 0.2383i | 0.4284 + 0.2422i |
| 8 | 0.4279 + 0.2367i | 0.4279 + 0.2367i | 0.4279 + 0.2367i | 0.4279 + 0.2367i |
| 8.5 | 0.3946 + 0.2203i | 0.3946 + 0.2203i | 0.3946 + 0.2203i | 0.3946 + 0.2203i |
| 9 | 0.2334 + 0.5708i | 0.2334 + 0.5708i | 0.2334 + 0.5708i | 0.2334 + 0.5708i |
| 9.5 | 0.2261 + 0.6013i | 0.2261 + 0.6013i | 0.2261 + 0.6013i | 0.2261 + 0.6013i |
| 10 | 0.2172 + 0.6259i | 0.2172 + 0.6259i | 0.2172 + 0.6259i | 0.2172 + 0.6259i |
| 10.5 | 0.2071 + 0.6433i | 0.2071 + 0.6433i | 0.2071 + 0.6433i | 0.2071 + 0.6433i |
| 11 | 0.3107 + 0.1761i | 0.3107 + 0.1761i | 0.3107 + 0.1761i | 0.3107 + 0.1761i |
| 11.5 | 0.3058 + 0.1740i | 0.3058 + 0.1740i | 0.3058 + 0.1740i | 0.3058 + 0.1740i |
| 12 | 0.3089 + 0.1735i | 0.3089 + 0.1735i | 0.3089 + 0.1735i | 0.3089 + 0.1735i |
| 12.5 | 0.2451 + 0.1663i | 0.2451 + 0.1663i | 0.2451 + 0.1663i | 0.2451 + 0.1663i |
| 13 | 0.1500 + 0.5903i | 0.1500 + 0.5903i | 0.1500 + 0.5903i | 0.1500 + 0.5903i |
| 13.5 | 0.2162 + 0.1596i | 0.2162 + 0.1596i | 0.2162 + 0.1596i | 0.2162 + 0.1596i |
| 14 | 0.2037 + 0.1615i | 0.2037 + 0.1615i | 0.2037 + 0.1615i | 0.2037 + 0.1615i |
| 14.5 | 0.1955 + 0.1660i | 0.1955 + 0.1660i | 0.1955 + 0.1660i | 0.1955 + 0.1660i |
| 15 | 0.1264 + 0.3535i | 0.1264 + 0.3535i | 0.1264 + 0.3535i | 0.1264 + 0.3535i |
| 15.5 | 0.1246 + 0.3613i | 0.1246 + 0.3613i | 0.1246 + 0.3613i | 0.1246 + 0.3613i |
| 16 | 0.1139 + 0.3666i | 0.1139 + 0.3666i | 0.1139 + 0.3666i | 0.1139 + 0.3666i |
| 16.5 | 0.1134 + 0.3351i | 0.1134 + 0.3351i | 0.1134 + 0.3351i | 0.1134 + 0.3351i |
| 17 | 0.1130 + 0.3327i | 0.1130 + 0.3327i | 0.1130 + 0.3327i | 0.1130 + 0.3327i |
| 17.5 | 0.1127 + 0.3280i | 0.1127 + 0.3280i | 0.1127 + 0.3280i | 0.1127 + 0.3280i |
| 18 | 0.1022 + 0.3196i | 0.1022 + 0.3196i | 0.1022 + 0.3196i | 0.1022 + 0.3196i |
| 18.5 | 0.0995 + 0.3488i | 0.0995 + 0.3488i | 0.0995 + 0.3488i | 0.0995 + 0.3488i |
| 19 | 0.0946 + 0.3591i | 0.0946 + 0.3591i | 0.0946 + 0.3591i | 0.0946 + 0.3591i |
| 19.5 | 0.0825 + 0.3687i | 0.0825 + 0.3687i | 0.0825 + 0.3687i | 0.0825 + 0.3687i |
| 20 | 0.0714 + 0.2590i | 0.0714 + 0.2590i | 0.0714 + 0.2590i | 0.0714 + 0.2590i |
| 20.5 | 0.0635 + 0.3220i | 0.0635 + 0.3220i | 0.0635 + 0.3220i | 0.0635 + 0.3220i |
| 21 | 0.0605 + 0.3029i | 0.0605 + 0.3029i | 0.0605 + 0.3029i | 0.0605 + 0.3029i |
| 21.5 | 0.0610 + 0.2852i | 0.0610 + 0.2852i | 0.0610 + 0.2852i | 0.0610 + 0.2852i |
| 22 | 0.0588 + 0.2997i | 0.0588 + 0.2997i | 0.0588 + 0.2997i | 0.0588 + 0.2997i |
| 22.5 | 0.0591 + 0.2925i | 0.0591 + 0.2925i | 0.0591 + 0.2925i | 0.0591 + 0.2925i |
| 23 | 0.0586 + 0.2809i | 0.0586 + 0.2809i | 0.0586 + 0.2809i | 0.0586 + 0.2809i |
| 23.5 | 0.0586 + 0.2893i | 0.0586 + 0.2893i | 0.0586 + 0.2893i | 0.0586 + 0.2893i |
| 24 | 0.0564 + 0.2825i | 0.0563 + 0.2941i | 0.0564 + 0.2825i | 0.0563 + 0.2941i |
| 24.5 | 0.0571 + 0.2816i | 0.0572 + 0.2955i | 0.0571 + 0.2816i | 0.0572 + 0.2955i |
| 25 | 0.0504 + 0.2667i | 0.0503 + 0.2885i | 0.0643 + 0.2665i | 0.0640 + 0.2883i |
| 25.5 | 0.0559 + 0.2861i | 0.0548 + 0.3407i | 0.0559 + 0.2861i | 0.0548 + 0.3407i |
| 26 | 0.0349 + 0.2807i | 0.0346 + 0.3432i | 0.0827 + 0.2816i | 0.0843 + 0.3431i |
| 26.5 | 0.0325 + 0.2516i | 0.0330 + 0.3088i | 0.0908 + 0.2538i | 0.0850 + 0.3119i |
| 27 | 0.0307 + 0.2794i | 0.0310 + 0.3456i | 0.0863 + 0.2798i | 0.0866 + 0.3448i |
| 27.5 | 0.0314 + 0.2837i | 0.0311 + 0.3499i | 0.0926 + 0.2848i | 0.0919 + 0.3507i |
| 28 | 0.0313 + 0.2777i | 0.0307 + 0.3444i | 0.0933 + 0.2782i | 0.0916 + 0.3449i |

| SNR/w | w216 | w217 | w218 | w219 |
|---|---|---|---|---|
| 7 | 0.4502 + 0.2556i | 0.4502 + 0.2556i | 0.4502 + 0.2556i | 0.4502 + 0.2556i |
| 7.5 | 0.4532 + 0.2648i | 0.4532 + 0.2648i | 0.4500 + 0.2383i | 0.4284 + 0.2422i |
| 8 | 0.4779 + 0.2367i | 0.4779 + 0.2367i | 0.4779 + 0.2367i | 0.4779 + 0.2367i |
| 8.5 | 0.5214 + 0.2360i | 0.5214 + 0.2360i | 0.5214 + 0.2360i | 0.5214 + 0.2360i |
| 9 | 0.2334 + 0.5708i | 0.2334 + 0.5708i | 0.2334 + 0.5708i | 0.2334 + 0.5708i |
| 9.5 | 0.2261 + 0.6013i | 0.2261 + 0.6013i | 0.2261 + 0.6013i | 0.2261 + 0.6013i |
| 10 | 0.2172 + 0.6259i | 0.2172 + 0.6259i | 0.2172 + 0.6259i | 0.2172 + 0.6259i |
| 10.5 | 0.2071 + 0.6433i | 0.2071 + 0.6433i | 0.2071 + 0.6433i | 0.2071 + 0.6433i |
| 11 | 0.3107 + 0.1761i | 0.3224 + 0.1541i | 0.3107 + 0.1761i | 0.3107 + 0.1761i |
| 11.5 | 0.3058 + 0.1740i | 0.3058 + 0.1740i | 0.3058 + 0.1740i | 0.3058 + 0.1740i |
| 12 | 0.3089 + 0.1735i | 0.3089 + 0.1735i | 0.3089 + 0.1735i | 0.3089 + 0.1735i |
| 12.5 | 0.2451 + 0.1663i | 0.2451 + 0.1663i | 0.2451 + 0.1663i | 0.2451 + 0.1663i |
| 13 | 0.1500 + 0.5903i | 0.1500 + 0.5903i | 0.1500 + 0.5903i | 0.1500 + 0.5903i |
| 13.5 | 0.2162 + 0.1596i | 0.2162 + 0.1596i | 0.2162 + 0.1596i | 0.2162 + 0.1596i |
| 14 | 0.2037 + 0.1615i | 0.2037 + 0.1615i | 0.2037 + 0.1615i | 0.2037 + 0.1615i |

-continued

| | | | | |
|---|---|---|---|---|
| 14.5 | 0.1955 + 0.1660i | 0.1955 + 0.1660i | 0.1955 + 0.1660i | 0.1955 + 0.1660i |
| 15 | 0.1264 + 0.3535i | 0.1264 + 0.3535i | 0.1264 + 0.3535i | 0.1264 + 0.3535i |
| 15.5 | 0.1246 + 0.3613i | 0.1246 + 0.3613i | 0.1246 + 0.3613i | 0.1246 + 0.3613i |
| 16 | 0.1145 + 0.3867i | 0.1145 + 0.3867i | 0.1145 + 0.3867i | 0.1145 + 0.3867i |
| 16.5 | 0.1132 + 0.3584i | 0.1132 + 0.3584i | 0.1132 + 0.3584i | 0.1132 + 0.3584i |
| 17 | 0.1128 + 0.3620i | 0.1128 + 0.3620i | 0.1128 + 0.3620i | 0.1128 + 0.3620i |
| 17.5 | 0.1124 + 0.3668i | 0.1124 + 0.3668i | 0.1124 + 0.3668i | 0.1124 + 0.3668i |
| 18 | 0.1216 + 0.3721i | 0.1216 + 0.3721i | 0.1216 + 0.3721i | 0.1216 + 0.3721i |
| 18.5 | 0.1033 + 0.4748i | 0.1033 + 0.4748i | 0.1033 + 0.4748i | 0.1033 + 0.4748i |
| 19 | 0.1195 + 0.5020i | 0.1195 + 0.5020i | 0.1195 + 0.5020i | 0.1195 + 0.5020i |
| 19.5 | 0.1298 + 0.5175i | 0.1298 + 0.5175i | 0.1298 + 0.5175i | 0.1298 + 0.5175i |
| 20 | 0.1950 + 0.3354i | 0.1950 + 0.3354i | 0.1950 + 0.3354i | 0.1950 + 0.3354i |
| 20.5 | 0.1682 + 0.4544i | 0.1682 + 0.4544i | 0.1682 + 0.4544i | 0.1682 + 0.4544i |
| 21 | 0.1707 + 0.4303i | 0.1707 + 0.4303i | 0.1707 + 0.4303i | 0.1707 + 0.4303i |
| 21.5 | 0.1741 + 0.4109i | 0.1741 + 0.4109i | 0.1741 + 0.4109i | 0.1741 + 0.4109i |
| 22 | 0.1749 + 0.4271i | 0.1749 + 0.4271i | 0.1749 + 0.4271i | 0.1749 + 0.4271i |
| 22.5 | 0.1745 + 0.4185i | 0.1745 + 0.4185i | 0.1745 + 0.4185i | 0.1745 + 0.4185i |
| 23 | 0.1713 + 0.4102i | 0.1713 + 0.4102i | 0.1713 + 0.4102i | 0.1713 + 0.4102i |
| 23.5 | 0.1755 + 0.4225i | 0.1758 + 0.4068i | 0.1755 + 0.4225i | 0.1758 + 0.4068i |
| 24 | 0.1684 + 0.4315i | 0.1690 + 0.4003i | 0.1684 + 0.4315i | 0.1690 + 0.4003i |
| 24.5 | 0.1760 + 0.4292i | 0.1752 + 0.3947i | 0.1760 + 0.4292i | 0.1752 + 0.3947i |
| 25 | 0.1829 + 0.4260i | 0.1836 + 0.3794i | 0.1638 + 0.4261i | 0.1632 + 0.3797i |
| 25.5 | 0.1841 + 0.4843i | 0.1829 + 0.4186i | 0.1522 + 0.4849i | 0.1542 + 0.4185i |
| 26 | 0.2196 + 0.4716i | 0.2157 + 0.4087i | 0.1610 + 0.4748i | 0.1570 + 0.4119i |
| 26.5 | 0.1932 + 0.4577i | 0.1997 + 0.3933i | 0.1389 + 0.4551i | 0.1435 + 0.3873i |
| 27 | 0.2118 + 0.4809i | 0.2110 + 0.4119i | 0.1507 + 0.4836i | 0.1502 + 0.4134i |
| 27.5 | 0.2186 + 0.4902i | 0.2189 + 0.4202i | 0.1557 + 0.4902i | 0.1557 + 0.4197i |
| 28 | 0.2101 + 0.4919i | 0.2114 + 0.4198i | 0.1496 + 0.4906i | 0.1510 + 0.4173i |

| SNR/w | w220 | w221 | w222 | w223 |
|---|---|---|---|---|
| 7 | 0.4502 + 0.2556i | 0.4862 + 0.2687i | 0.4502 + 0.2556i | 0.4862 + 0.2687i |
| 7.5 | 0.4852 + 0.2798i | 0.4852 + 0.2798i | 0.4819 + 0.2466i | 0.4819 + 0.2466i |
| 8 | 0.4786 + 0.2728i | 0.4786 + 0.2728i | 0.4786 + 0.2728i | 0.4786 + 0.2728i |
| 8.5 | 0.5113 + 0.2843i | 0.5113 + 0.2843i | 0.5113 + 0.2843i | 0.5113 + 0.2843i |
| 9 | 0.2334 + 0.5708i | 0.2334 + 0.5708i | 0.2334 + 0.5708i | 0.2334 + 0.5708i |
| 9.5 | 0.2261 + 0.6013i | 0.2261 + 0.6013i | 0.2261 + 0.6013i | 0.2261 + 0.6013i |
| 10 | 0.2172 + 0.6259i | 0.2172 + 0.6259i | 0.2172 + 0.6259i | 0.2172 + 0.6259i |
| 10.5 | 0.2071 + 0.6433i | 0.2071 + 0.6433i | 0.2071 + 0.6433i | 0.2071 + 0.6433i |
| 11 | 0.3107 + 0.1761i | 0.3107 + 0.1761i | 0.3107 + 0.1761i | 0.3107 + 0.1761i |
| 11.5 | 0.3058 + 0.1740i | 0.3058 + 0.1740i | 0.3058 + 0.1740i | 0.3058 + 0.1740i |
| 12 | 0.3089 + 0.1735i | 0.3089 + 0.1735i | 0.3089 + 0.1735i | 0.3089 + 0.1735i |
| 12.5 | 0.2451 + 0.1663i | 0.2451 + 0.1663i | 0.2451 + 0.1663i | 0.2451 + 0.1663i |
| 13 | 0.1500 + 0.5903i | 0.1500 + 0.5903i | 0.1500 + 0.5903i | 0.1500 + 0.5903i |
| 13.5 | 0.2162 + 0.1596i | 0.2162 + 0.1596i | 0.2162 + 0.1596i | 0.2162 + 0.1596i |
| 14 | 0.2037 + 0.1615i | 0.2037 + 0.1615i | 0.2037 + 0.1615i | 0.2037 + 0.1615i |
| 14.5 | 0.1955 + 0.1660i | 0.1955 + 0.1660i | 0.1955 + 0.1660i | 0.1955 + 0.1660i |
| 15 | 0.1264 + 0.3535i | 0.1264 + 0.3535i | 0.1264 + 0.3535i | 0.1264 + 0.3535i |
| 15.5 | 0.1246 + 0.3613i | 0.1246 + 0.3613i | 0.1246 + 0.3613i | 0.1246 + 0.3613i |
| 16 | 0.1139 + 0.3666i | 0.1139 + 0.3666i | 0.1139 + 0.3666i | 0.1139 + 0.3666i |
| 16.5 | 0.1134 + 0.3351i | 0.1134 + 0.3351i | 0.1134 + 0.3351i | 0.1134 + 0.3351i |
| 17 | 0.1130 + 0.3327i | 0.1130 + 0.3327i | 0.1130 + 0.3327i | 0.1130 + 0.3327i |
| 17.5 | 0.1127 + 0.3280i | 0.1127 + 0.3280i | 0.1127 + 0.3280i | 0.1127 + 0.3280i |
| 18 | 0.1222 + 0.3198i | 0.1222 + 0.3198i | 0.1222 + 0.3198i | 0.1222 + 0.3198i |
| 18.5 | 0.0995 + 0.3488i | 0.0995 + 0.3488i | 0.0995 + 0.3488i | 0.0995 + 0.3488i |
| 19 | 0.1078 + 0.3588i | 0.1078 + 0.3588i | 0.0946 + 0.3591i | 0.0946 + 0.3591i |
| 19.5 | 0.1126 + 0.3677i | 0.1126 + 0.3677i | 0.1126 + 0.3677i | 0.1126 + 0.3677i |
| 20 | 0.2030 + 0.2636i | 0.2030 + 0.2636i | 0.2030 + 0.2636i | 0.2030 + 0.2636i |
| 20.5 | 0.1644 + 0.3218i | 0.1644 + 0.3218i | 0.1644 + 0.3218i | 0.1644 + 0.3218i |
| 21 | 0.1703 + 0.3021i | 0.1703 + 0.3021i | 0.1703 + 0.3021i | 0.1703 + 0.3021i |
| 21.5 | 0.1795 + 0.2874i | 0.1795 + 0.2874i | 0.1795 + 0.2874i | 0.1795 + 0.2874i |
| 22 | 0.1738 + 0.2981i | 0.1738 + 0.2981i | 0.1738 + 0.2981i | 0.1738 + 0.2981i |
| 22.5 | 0.1777 + 0.2932i | 0.1777 + 0.2932i | 0.1777 + 0.2932i | 0.1777 + 0.2932i |
| 23 | 0.1741 + 0.2862i | 0.1741 + 0.2862i | 0.1741 + 0.2862i | 0.1741 + 0.2862i |
| 23.5 | 0.1762 + 0.2899i | 0.1762 + 0.2899i | 0.1762 + 0.2899i | 0.1762 + 0.2899i |
| 24 | 0.1703 + 0.2831i | 0.1701 + 0.2943i | 0.1703 + 0.2831i | 0.1701 + 0.2943i |
| 24.5 | 0.1723 + 0.2806i | 0.1728 + 0.2950i | 0.1723 + 0.2806i | 0.1728 + 0.2950i |
| 25 | 0.1852 + 0.2652i | 0.1851 + 0.2880i | 0.1620 + 0.2653i | 0.1622 + 0.2879i |
| 25.5 | 0.1779 + 0.2862i | 0.1807 + 0.3418i | 0.1534 + 0.2865i | 0.1548 + 0.3424i |
| 26 | 0.2054 + 0.2809i | 0.2094 + 0.3380i | 0.1524 + 0.2824i | 0.1543 + 0.3418i |
| 26.5 | 0.2147 + 0.2666i | 0.2083 + 0.3257i | 0.1555 + 0.2607i | 0.1493 + 0.3184i |
| 27 | 0.2109 + 0.2819i | 0.2107 + 0.3441i | 0.1498 + 0.2809i | 0.1497 + 0.3442i |
| 27.5 | 0.2185 + 0.2872i | 0.2190 + 0.3526i | 0.1559 + 0.2865i | 0.1554 + 0.3519i |
| 28 | 0.2183 + 0.2814i | 0.2142 + 0.3497i | 0.1566 + 0.2788i | 0.1537 + 0.3467i |

| SNR/w | w224 | w225 | w226 | w227 |
|---|---|---|---|---|
| 7 | 0.4139 + 0.2420i | 0.4502 + 0.2556i | 0.4139 + 0.2420i | 0.4502 + 0.2556i |
| 7.5 | 0.4284 + 0.2422i | 0.4284 + 0.2422i | 0.4284 + 0.2422i | 0.4026 + 0.2281i |

-continued

| | | | | |
|---|---|---|---|---|
| 8 | 0.4279 + 0.2367i | 0.4279 + 0.2367i | 0.4279 + 0.2367i | 0.4279 + 0.2367i |
| 8.5 | 0.3946 + 0.2203i | 0.3753 + 0.2067i | 0.3946 + 0.2203i | 0.3753 + 0.2067i |
| 9 | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i |
| 15 | 0.3733 + 0.1159i | 0.3733 + 0.1159i | 0.3733 + 0.1159i | 0.3733 + 0.1159i |
| 15.5 | 0.3717 + 0.1138i | 0.3717 + 0.1138i | 0.3717 + 0.1138i | 0.3717 + 0.1138i |
| 16 | 0.3478 + 0.1172i | 0.3478 + 0.1172i | 0.3478 + 0.1172i | 0.3478 + 0.1172i |
| 16.5 | 0.3638 + 0.1141i | 0.3638 + 0.1141i | 0.3638 + 0.1141i | 0.3638 + 0.1141i |
| 17 | 0.3668 + 0.1139i | 0.3668 + 0.1139i | 0.3668 + 0.1139i | 0.3668 + 0.1139i |
| 17.5 | 0.3713 + 0.1139i | 0.3713 + 0.1139i | 0.3713 + 0.1139i | 0.3713 + 0.1139i |
| 18 | 0.3770 + 0.1032i | 0.3770 + 0.1032i | 0.3770 + 0.1032i | 0.3770 + 0.1032i |
| 18.5 | 0.3136 + 0.0880i | 0.3136 + 0.0880i | 0.3136 + 0.0880i | 0.3136 + 0.0880i |
| 19 | 0.3047 + 0.0779i | 0.3047 + 0.0779i | 0.3047 + 0.0779i | 0.3047 + 0.0779i |
| 19.5 | 0.3016 + 0.0738i | 0.3016 + 0.0738i | 0.3016 + 0.0738i | 0.3016 + 0.0738i |
| 20 | 0.5049 + 0.0708i | 0.5049 + 0.0708i | 0.5049 + 0.0708i | 0.5049 + 0.0708i |
| 20.5 | 0.4001 + 0.0654i | 0.4001 + 0.0654i | 0.4001 + 0.0654i | 0.4001 + 0.0654i |
| 21 | 0.4216 + 0.0611i | 0.4216 + 0.0611i | 0.4216 + 0.0611i | 0.4216 + 0.0611i |
| 21.5 | 0.4460 + 0.0597i | 0.4460 + 0.0597i | 0.4460 + 0.0597i | 0.4460 + 0.0597i |
| 22 | 0.4254 + 0.0584i | 0.4254 + 0.0584i | 0.4254 + 0.0584i | 0.4254 + 0.0584i |
| 22.5 | 0.4316 + 0.0602i | 0.4316 + 0.0602i | 0.4316 + 0.0602i | 0.4316 + 0.0602i |
| 23 | 0.4302 + 0.0540i | 0.4302 + 0.0540i | 0.4302 + 0.0540i | 0.4302 + 0.0540i |
| 23.5 | 0.4370 + 0.0576i | 0.4370 + 0.0576i | 0.4157 + 0.0570i | 0.4157 + 0.0570i |
| 24 | 0.4312 + 0.0561i | 0.4312 + 0.0561i | 0.4003 + 0.0563i | 0.4003 + 0.0563i |
| 24.5 | 0.4391 + 0.0544i | 0.4391 + 0.0544i | 0.3936 + 0.0550i | 0.3936 + 0.0550i |
| 25 | 0.4741 + 0.0555i | 0.4741 + 0.0555i | 0.4096 + 0.0551i | 0.4096 + 0.0551i |
| 25.5 | 0.4328 + 0.0417i | 0.4336 + 0.0744i | 0.3744 + 0.0411i | 0.3745 + 0.0772i |
| 26 | 0.4870 + 0.0884i | 0.4896 + 0.1188i | 0.4269 + 0.0476i | 0.4149 + 0.1052i |
| 26.5 | 0.4824 + 0.0289i | 0.4857 + 0.0919i | 0.4205 + 0.0350i | 0.4205 + 0.0961i |
| 27 | 0.5079 + 0.0438i | 0.5036 + 0.1009i | 0.4254 + 0.0322i | 0.4167 + 0.1021i |
| 27.5 | 0.5112 + 0.0414i | 0.5049 + 0.1036i | 0.4283 + 0.0333i | 0.4231 + 0.1059i |
| 28 | 0.6043 + 0.0218i | 0.5006 + 0.1245i | 0.4388 + 0.0377i | 0.4351 + 0.1002i |

| SNR/w | w228 | w229 | w230 | w231 |
|---|---|---|---|---|
| 7 | 0.4502 + 0.2556i | 0.4502 + 0.2556i | 0.4502 + 0.2556i | 0.4502 + 0.2556i |
| 7.5 | 0.4532 + 0.2648i | 0.4532 + 0.2648i | 0.4500 + 0.2383i | 0.4284 + 0.2422i |
| 8 | 0.4279 + 0.2367i | 0.4279 + 0.2367i | 0.4279 + 0.2367i | 0.4279 + 0.2367i |
| 8.5 | 0.3946 + 0.2203i | 0.3946 + 0.2203i | 0.3946 + 0.2203i | 0.3946 + 0.2203i |
| 9 | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i |
| 15 | 0.3733 + 0.1159i | 0.3733 + 0.1159i | 0.3733 + 0.1159i | 0.3733 + 0.1159i |
| 15.5 | 0.3717 + 0.1138i | 0.3717 + 0.1138i | 0.3717 + 0.1138i | 0.3717 + 0.1138i |
| 16 | 0.3478 + 0.1172i | 0.3478 + 0.1172i | 0.3478 + 0.1172i | 0.3478 + 0.1172i |
| 16.5 | 0.3638 + 0.1141i | 0.3638 + 0.1141i | 0.3638 + 0.1141i | 0.3638 + 0.1141i |
| 17 | 0.3668 + 0.1139i | 0.3668 + 0.1139i | 0.3668 + 0.1139i | 0.3668 + 0.1139i |
| 17.5 | 0.3713 + 0.1139i | 0.3713 + 0.1139i | 0.3713 + 0.1139i | 0.3713 + 0.1139i |
| 18 | 0.3769 + 0.1228i | 0.3769 + 0.1228i | 0.3769 + 0.1228i | 0.3769 + 0.1228i |
| 18.5 | 0.3169 + 0.1649i | 0.3169 + 0.1649i | 0.3169 + 0.1649i | 0.3169 + 0.1649i |
| 19 | 0.3114 + 0.1880i | 0.3114 + 0.1880i | 0.3114 + 0.1880i | 0.3114 + 0.1880i |
| 19.5 | 0.3110 + 0.2020i | 0.3110 + 0.2020i | 0.3110 + 0.2020i | 0.3110 + 0.2020i |
| 20 | 0.4994 + 0.1471i | 0.4994 + 0.1471i | 0.4994 + 0.1471i | 0.4994 + 0.1471i |
| 20.5 | 0.4035 + 0.1848i | 0.4035 + 0.1848i | 0.4035 + 0.1848i | 0.4035 + 0.1848i |
| 21 | 0.4212 + 0.1733i | 0.4212 + 0.1733i | 0.4212 + 0.1733i | 0.4212 + 0.1733i |
| 21.5 | 0.4424 + 0.1748i | 0.4424 + 0.1748i | 0.4424 + 0.1748i | 0.4424 + 0.1748i |
| 22 | 0.4248 + 0.1721i | 0.4248 + 0.1721i | 0.4248 + 0.1721i | 0.4248 + 0.1721i |
| 22.5 | 0.4324 + 0.1762i | 0.4324 + 0.1762i | 0.4324 + 0.1762i | 0.4324 + 0.1762i |
| 23 | 0.4255 + 0.1756i | 0.4255 + 0.1756i | 0.4255 + 0.1756i | 0.4255 + 0.1756i |
| 23.5 | 0.4362 + 0.1725i | 0.4362 + 0.1725i | 0.4153 + 0.1725i | 0.4153 + 0.1725i |
| 24 | 0.4310 + 0.1694i | 0.4310 + 0.1694i | 0.4005 + 0.1699i | 0.4005 + 0.1699i |

-continued

| | | | | |
|---|---|---|---|---|
| 24.5 | 0.4411 + 0.1644i | 0.4411 + 0.1644i | 0.3963 + 0.1660i | 0.3963 + 0.1660i |
| 25 | 0.4731 + 0.1733i | 0.4733 + 0.1614i | 0.4082 + 0.1712i | 0.4080 + 0.1602i |
| 25.5 | 0.4411 + 0.1978i | 0.4377 + 0.1570i | 0.3822 + 0.2018i | 0.3792 + 0.1581i |
| 26 | 0.4977 + 0.2069i | 0.4981 + 0.1758i | 0.4158 + 0.2122i | 0.4119 + 0.1755i |
| 26.5 | 0.4899 + 0.2242i | 0.4866 + 0.1642i | 0.4194 + 0.2229i | 0.4216 + 0.1624i |
| 27 | 0.4840 + 0.2135i | 0.4940 + 0.1581i | 0.4139 + 0.2120i | 0.4156 + 0.1554i |
| 27.5 | 0.4951 + 0.2253i | 0.4990 + 0.1631i | 0.4241 + 0.2243i | 0.4237 + 0.1622i |
| 28 | 0.4847 + 0.2316i | 0.4930 + 0.1739i | 0.4142 + 0.2270i | 0.4205 + 0.1632i |

| SNR/w | w232 | w233 | w234 | w235 |
|---|---|---|---|---|
| 7 | 0.4502 + 0.2556i | 0.4502 + 0.2556i | 0.4502 + 0.2556i | 0.4502 + 0.2556i |
| 7.5 | 0.4532 + 0.2648i | 0.4532 + 0.2648i | 0.4500 + 0.2383i | 0.4284 + 0.2422i |
| 8 | 0.4779 + 0.2367i | 0.4779 + 0.2367i | 0.4779 + 0.2367i | 0.4779 + 0.2367i |
| 8.5 | 0.5214 + 0.2360i | 0.5214 + 0.2360i | 0.5214 + 0.2360i | 0.5214 + 0.2360i |
| 9 | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i |
| 15 | 0.3586 + 0.1164i | 0.3586 + 0.1164i | 0.3733 + 0.1159i | 0.3733 + 0.1159i |
| 15.5 | 0.3502 + 0.1152i | 0.3502 + 0.1152i | 0.3502 + 0.1152i | 0.3502 + 0.1152i |
| 16 | 0.3271 + 0.1181i | 0.3271 + 0.1181i | 0.3271 + 0.1181i | 0.3271 + 0.1181i |
| 16.5 | 0.3406 + 0.1138i | 0.3406 + 0.1138i | 0.3406 + 0.1138i | 0.3406 + 0.1138i |
| 17 | 0.3375 + 0.1135i | 0.3375 + 0.1135i | 0.3375 + 0.1135i | 0.3375 + 0.1135i |
| 17.5 | 0.3328 + 0.1134i | 0.3328 + 0.1134i | 0.3328 + 0.1134i | 0.3328 + 0.1134i |
| 18 | 0.3244 + 0.1028i | 0.3244 + 0.1028i | 0.3244 + 0.1028i | 0.3244 + 0.1028i |
| 18.5 | 0.2821 + 0.0875i | 0.2821 + 0.0875i | 0.2821 + 0.0875i | 0.2821 + 0.0875i |
| 19 | 0.2681 + 0.0776i | 0.2681 + 0.0776i | 0.2681 + 0.0776i | 0.2681 + 0.0776i |
| 19.5 | 0.2598 + 0.0741i | 0.2598 + 0.0741i | 0.2598 + 0.0741i | 0.2598 + 0.0741i |
| 20 | 0.3583 + 0.0733i | 0.3583 + 0.0733i | 0.3583 + 0.0733i | 0.3583 + 0.0733i |
| 20.5 | 0.2886 + 0.0655i | 0.2886 + 0.0655i | 0.2886 + 0.0655i | 0.2886 + 0.0655i |
| 21 | 0.2964 + 0.0612i | 0.2964 + 0.0612i | 0.2964 + 0.0612i | 0.2964 + 0.0612i |
| 21.5 | 0.3136 + 0.0587i | 0.3136 + 0.0587i | 0.3136 + 0.0587i | 0.3136 + 0.0587i |
| 22 | 0.2965 + 0.0583i | 0.2965 + 0.0583i | 0.2965 + 0.0583i | 0.2965 + 0.0583i |
| 22.5 | 0.3044 + 0.0585i | 0.3044 + 0.0585i | 0.3044 + 0.0585i | 0.3044 + 0.0585i |
| 23 | 0.3002 + 0.0559i | 0.3002 + 0.0559i | 0.3002 + 0.0559i | 0.3002 + 0.0559i |
| 23.5 | 0.2968 + 0.0565i | 0.2968 + 0.0565i | 0.2968 + 0.0565i | 0.2968 + 0.0565i |
| 24 | 0.2835 + 0.0565i | 0.2835 + 0.0565i | 0.2947 + 0.0565i | 0.2947 + 0.0565i |
| 24.5 | 0.2767 + 0.0562i | 0.2767 + 0.0562i | 0.2962 + 0.0561i | 0.2962 + 0.0561i |
| 25 | 0.2793 + 0.0538i | 0.2793 + 0.0538i | 0.3242 + 0.0543i | 0.3242 + 0.0543i |
| 25.5 | 0.2565 + 0.0404i | 0.2580 + 0.0815i | 0.2933 + 0.0406i | 0.2942 + 0.0808i |
| 26 | 0.2912 + 0.0349i | 0.2858 + 0.0896i | 0.3531 + 0.0375i | 0.3456 + 0.0944i |
| 26.5 | 0.2981 + 0.0330i | 0.2963 + 0.0873i | 0.3583 + 0.0345i | 0.3569 + 0.0932i |
| 27 | 0.2788 + 0.0329i | 0.2765 + 0.0939i | 0.3366 + 0.0360i | 0.3386 + 0.0968i |
| 27.5 | 0.2859 + 0.0343i | 0.2847 + 0.0994i | 0.3429 + 0.0370i | 0.3476 + 0.1015i |
| 28 | 0.2966 + 0.0296i | 0.2938 + 0.0892i | 0.3680 + 0.0313i | 0.3621 + 0.0922i |

| SNR/w | w236 | w237 | w238 | w239 |
|---|---|---|---|---|
| 7 | 0.4502 + 0.2556i | 0.4862 + 0.2687i | 0.4502 + 0.2556i | 0.4862 + 0.2687i |
| 7.5 | 0.4852 + 0.2798i | 0.4852 + 0.2798i | 0.4819 + 0.2466i | 0.4819 + 0.2466i |
| 8 | 0.4786 + 0.2728i | 0.4786 + 0.2728i | 0.4786 + 0.2728i | 0.4786 + 0.2728i |
| 8.5 | 0.5113 + 0.2843i | 0.5113 + 0.2843i | 0.5113 + 0.2843i | 0.5113 + 0.2843i |
| 9 | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i |
| 15 | 0.3586 + 0.1164i | 0.3586 + 0.1164i | 0.3733 + 0.1159i | 0.3733 + 0.1159i |
| 15.5 | 0.3502 + 0.1152i | 0.3502 + 0.1152i | 0.3502 + 0.1152i | 0.3502 + 0.1152i |
| 16 | 0.3271 + 0.1181i | 0.3271 + 0.1181i | 0.3271 + 0.1181i | 0.3271 + 0.1181i |
| 16.5 | 0.3406 + 0.1138i | 0.3406 + 0.1138i | 0.3406 + 0.1138i | 0.3406 + 0.1138i |
| 17 | 0.3375 + 0.1135i | 0.3375 + 0.1135i | 0.3375 + 0.1135i | 0.3375 + 0.1135i |
| 17.5 | 0.3328 + 0.1134i | 0.3328 + 0.1134i | 0.3328 + 0.1134i | 0.3328 + 0.1134i |

-continued

| | | | | |
|---|---|---|---|---|
| 18 | 0.3243 + 0.1222i | 0.3243 + 0.1222i | 0.3243 + 0.1222i | 0.3243 + 0.1222i |
| 18.5 | 0.2844 + 0.1675i | 0.2844 + 0.1675i | 0.2844 + 0.1675i | 0.2844 + 0.1675i |
| 19 | 0.2719 + 0.1922i | 0.2719 + 0.1922i | 0.2719 + 0.1922i | 0.2719 + 0.1922i |
| 19.5 | 0.2641 + 0.2070i | 0.2641 + 0.2070i | 0.2641 + 0.2070i | 0.2641 + 0.2070i |
| 20 | 0.3557 + 0.1281i | 0.3557 + 0.1281i | 0.3557 + 0.1281i | 0.3557 + 0.1281i |
| 20.5 | 0.2903 + 0.1864i | 0.2903 + 0.1864i | 0.2903 + 0.1864i | 0.2903 + 0.1864i |
| 21 | 0.2961 + 0.1741i | 0.2961 + 0.1741i | 0.2961 + 0.1741i | 0.2961 + 0.1741i |
| 21.5 | 0.3109 + 0.1701i | 0.3109 + 0.1701i | 0.3109 + 0.1701i | 0.3109 + 0.1701i |
| 22 | 0.2961 + 0.1740i | 0.2961 + 0.1740i | 0.2961 + 0.1740i | 0.2961 + 0.1740i |
| 22.5 | 0.3022 + 0.1743i | 0.3022 + 0.1743i | 0.3022 + 0.1743i | 0.3022 + 0.1743i |
| 23 | 0.3008 + 0.1679i | 0.3008 + 0.1679i | 0.3008 + 0.1679i | 0.3008 + 0.1679i |
| 23.5 | 0.2971 + 0.1712i | 0.2971 + 0.1712i | 0.2971 + 0.1712i | 0.2971 + 0.1712i |
| 24 | 0.2833 + 0.1706i | 0.2833 + 0.1706i | 0.2943 + 0.1705i | 0.2943 + 0.1705i |
| 24.5 | 0.2786 + 0.1694i | 0.2786 + 0.1694i | 0.2982 + 0.1688i | 0.2982 + 0.1688i |
| 25 | 0.2785 + 0.1682i | 0.2782 + 0.1581i | 0.3224 + 0.1691i | 0.3224 + 0.1588i |
| 25.5 | 0.2624 + 0.2089i | 0.2607 + 0.1620i | 0.3016 + 0.2071i | 0.2979 + 0.1608i |
| 26 | 0.2776 + 0.2130i | 0.2797 + 0.1616i | 0.3388 + 0.2141i | 0.3395 + 0.1659i |
| 26.5 | 0.2863 + 0.2090i | 0.2920 + 0.1540i | 0.3512 + 0.2175i | 0.3553 + 0.1593i |
| 27 | 0.2771 + 0.2176i | 0.2758 + 0.1577i | 0.3431 + 0.2153i | 0.3406 + 0.1566i |
| 27.5 | 0.2852 + 0.2242i | 0.2849 + 0.1629i | 0.3535 + 0.2247i | 0.3513 + 0.1631i |
| 28 | 0.2866 + 0.2178i | 0.2907 + 0.1527i | 0.3496 + 0.2221i | 0.3560 + 0.1554i |

| SNR/w | w240 | w241 | w242 | w243 |
|---|---|---|---|---|
| 7 | 0.4502 + 0.2556i | 0.4502 + 0.2556i | 0.4502 + 0.2556i | 0.4502 + 0.2556i |
| 7.5 | 0.4532 + 0.2648i | 0.4532 + 0.2648i | 0.4500 + 0.2383i | 0.4284 + 0.2422i |
| 8 | 0.4779 + 0.2367i | 0.4779 + 0.2367i | 0.4779 + 0.2367i | 0.4779 + 0.2367i |
| 8.5 | 0.4205 + 0.2136i | 0.4205 + 0.2136i | 0.4205 + 0.2136i | 0.4205 + 0.2136i |
| 9 | 0.2991 + 0.5474i | 0.2991 + 0.5474i | 0.2991 + 0.5474i | 0.2991 + 0.5474i |
| 9.5 | 0.3084 + 0.5682i | 0.3084 + 0.5682i | 0.3084 + 0.5682i | 0.3084 + 0.5682i |
| 10 | 0.3180 + 0.5832i | 0.3180 + 0.5832i | 0.3180 + 0.5832i | 0.3180 + 0.5832i |
| 10.5 | 0.3254 + 0.5943i | 0.3254 + 0.5943i | 0.3254 + 0.5943i | 0.3254 + 0.5943i |
| 11 | 0.5725 + 0.3558i | 0.5725 + 0.3558i | 0.5725 + 0.3558i | 0.5725 + 0.3558i |
| 11.5 | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i |
| 13.5 | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i |
| 14.5 | 0.5355 + 0.3122i | 0.5355 + 0.3122i | 0.5355 + 0.3122i | 0.5355 + 0.3122i |
| 15 | 0.3853 + 0.3413i | 0.3853 + 0.3413i | 0.3853 + 0.3413i | 0.3853 + 0.3413i |
| 15.5 | 0.3892 + 0.3462i | 0.3892 + 0.3462i | 0.3892 + 0.3462i | 0.3892 + 0.3462i |
| 16 | 0.3619 + 0.3680i | 0.3619 + 0.3680i | 0.3619 + 0.3680i | 0.3619 + 0.3680i |
| 16.5 | 0.3610 + 0.3609i | 0.3610 + 0.3609i | 0.3610 + 0.3609i | 0.3610 + 0.3609i |
| 17 | 0.3641 + 0.3646i | 0.3641 + 0.3646i | 0.3641 + 0.3646i | 0.3641 + 0.3646i |
| 17.5 | 0.3683 + 0.3694i | 0.3683 + 0.3694i | 0.3683 + 0.3694i | 0.3683 + 0.3694i |
| 18 | 0.3739 + 0.3746i | 0.3739 + 0.3746i | 0.3739 + 0.3746i | 0.3739 + 0.3746i |
| 18.5 | 0.3414 + 0.4506i | 0.3414 + 0.4506i | 0.3414 + 0.4506i | 0.3414 + 0.4506i |
| 19 | 0.3529 + 0.4716i | 0.3529 + 0.4716i | 0.3529 + 0.4716i | 0.3529 + 0.4716i |
| 19.5 | 0.3681 + 0.4838i | 0.3681 + 0.4838i | 0.3681 + 0.4838i | 0.3681 + 0.4838i |
| 20 | 0.4657 + 0.3917i | 0.4657 + 0.3917i | 0.4657 + 0.3917i | 0.4657 + 0.3917i |
| 20.5 | 0.4208 + 0.4471i | 0.4208 + 0.4471i | 0.4208 + 0.4471i | 0.4208 + 0.4471i |
| 21 | 0.4198 + 0.4245i | 0.4198 + 0.4245i | 0.4198 + 0.4245i | 0.4198 + 0.4245i |
| 21.5 | 0.4260 + 0.4246i | 0.4260 + 0.4246i | 0.4260 + 0.4246i | 0.4260 + 0.4246i |
| 22 | 0.4231 + 0.4203i | 0.4231 + 0.4203i | 0.4231 + 0.4203i | 0.4231 + 0.4203i |
| 22.5 | 0.4230 + 0.4251i | 0.4230 + 0.4251i | 0.4230 + 0.4251i | 0.4230 + 0.4251i |
| 23 | 0.4230 + 0.4229i | 0.4230 + 0.4229i | 0.4230 + 0.4229i | 0.4153 + 0.4120i |
| 23.5 | 0.4341 + 0.4277i | 0.4342 + 0.4101i | 0.4135 + 0.4270i | 0.4137 + 0.4098i |
| 24 | 0.4266 + 0.4286i | 0.4273 + 0.3997i | 0.3987 + 0.4288i | 0.3992 + 0.3999i |
| 24.5 | 0.4441 + 0.4330i | 0.4456 + 0.3871i | 0.4061 + 0.4315i | 0.4061 + 0.3880i |
| 25 | 0.4605 + 0.4369i | 0.4656 + 0.3853i | 0.4012 + 0.4314i | 0.4034 + 0.3820i |
| 25.5 | 0.4659 + 0.4740i | 0.4613 + 0.4078i | 0.3989 + 0.4774i | 0.3958 + 0.4114i |
| 26 | 0.4896 + 0.4720i | 0.4932 + 0.4049i | 0.4193 + 0.4606i | 0.4242 + 0.4025i |
| 26.5 | 0.4795 + 0.4819i | 0.4925 + 0.4148i | 0.4080 + 0.4687i | 0.4168 + 0.4091i |
| 27 | 0.4961 + 0.4776i | 0.4761 + 0.4203i | 0.4122 + 0.4857i | 0.4125 + 0.4173i |
| 27.5 | 0.4894 + 0.4920i | 0.4859 + 0.4203i | 0.4207 + 0.4950i | 0.4201 + 0.4209i |
| 28 | 0.4912 + 0.4863i | 0.4759 + 0.4288i | 0.4092 + 0.4951i | 0.4078 + 0.4275i |

| SNR/w | w244 | w245 | w246 | w247 |
|---|---|---|---|---|
| 7 | 0.4502 + 0.2556i | 0.4862 + 0.2687i | 0.4502 + 0.2556i | 0.4862 + 0.2687i |
| 7.5 | 0.4852 + 0.2798i | 0.4852 + 0.2798i | 0.4819 + 0.2466i | 0.4819 + 0.2466i |
| 8 | 0.4786 + 0.2728i | 0.4786 + 0.2728i | 0.4786 + 0.2728i | 0.4786 + 0.2728i |
| 8.5 | 0.4223 + 0.2397i | 0.4223 + 0.2397i | 0.4223 + 0.2397i | 0.4223 + 0.2397i |
| 9 | 0.2991 + 0.5474i | 0.2991 + 0.5474i | 0.2991 + 0.5474i | 0.2991 + 0.5474i |
| 9.5 | 0.3084 + 0.5682i | 0.3084 + 0.5682i | 0.3084 + 0.5682i | 0.3084 + 0.5682i |
| 10 | 0.3180 + 0.5832i | 0.3180 + 0.5832i | 0.3180 + 0.5832i | 0.3180 + 0.5832i |
| 10.5 | 0.3254 + 0.5943i | 0.3254 + 0.5943i | 0.3254 + 0.5943i | 0.3254 + 0.5943i |
| 11 | 0.5725 + 0.3558i | 0.5725 + 0.3558i | 0.5725 + 0.3558i | 0.5725 + 0.3558i |

-continued

| | | | | |
|---|---|---|---|---|
| 11.5 | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i |
| 13.5 | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i |
| 14.5 | 0.5355 + 0.3122i | 0.5355 + 0.3122i | 0.5355 + 0.3122i | 0.5355 + 0.3122i |
| 15 | 0.3853 + 0.3413i | 0.3853 + 0.3413i | 0.3853 + 0.3413i | 0.3853 + 0.3413i |
| 15.5 | 0.3844 + 0.3362i | 0.3844 + 0.3362i | 0.3844 + 0.3362i | 0.3844 + 0.3362i |
| 16 | 0.3595 + 0.3485i | 0.3595 + 0.3485i | 0.3595 + 0.3485i | 0.3595 + 0.3485i |
| 16.5 | 0.3616 + 0.3383i | 0.3616 + 0.3383i | 0.3616 + 0.3383i | 0.3616 + 0.3383i |
| 17 | 0.3649 + 0.3361i | 0.3649 + 0.3361i | 0.3649 + 0.3361i | 0.3649 + 0.3361i |
| 17.5 | 0.3696 + 0.3321i | 0.3696 + 0.3321i | 0.3696 + 0.3321i | 0.3696 + 0.3321i |
| 18 | 0.3754 + 0.3235i | 0.3754 + 0.3235i | 0.3754 + 0.3235i | 0.3754 + 0.3235i |
| 18.5 | 0.3269 + 0.3401i | 0.3269 + 0.3401i | 0.3269 + 0.3401i | 0.3269 + 0.3401i |
| 19 | 0.3284 + 0.3442i | 0.3284 + 0.3442i | 0.3284 + 0.3442i | 0.3284 + 0.3442i |
| 19.5 | 0.3345 + 0.3493i | 0.3345 + 0.3493i | 0.3345 + 0.3493i | 0.3345 + 0.3493i |
| 20 | 0.4846 + 0.2895i | 0.4846 + 0.2895i | 0.4846 + 0.2895i | 0.4846 + 0.2895i |
| 20.5 | 0.4110 + 0.3182i | 0.4110 + 0.3182i | 0.4110 + 0.3182i | 0.4110 + 0.3182i |
| 21 | 0.4204 + 0.2992i | 0.4204 + 0.2992i | 0.4204 + 0.2992i | 0.4204 + 0.2992i |
| 21.5 | 0.4352 + 0.2986i | 0.4352 + 0.2986i | 0.4352 + 0.2986i | 0.4352 + 0.2986i |
| 22 | 0.4238 + 0.2942i | 0.4238 + 0.2942i | 0.4238 + 0.2942i | 0.4238 + 0.2942i |
| 22.5 | 0.4273 + 0.2986i | 0.4273 + 0.2986i | 0.4273 + 0.2986i | 0.4273 + 0.2986i |
| 23 | 0.4298 + 0.2903i | 0.4298 + 0.2903i | 0.4298 + 0.2903i | 0.4169 + 0.2947i |
| 23.5 | 0.4351 + 0.2929i | 0.4351 + 0.2929i | 0.4145 + 0.2921i | 0.4145 + 0.2921i |
| 24 | 0.4297 + 0.2819i | 0.4296 + 0.2923i | 0.4004 + 0.2823i | 0.4005 + 0.2927i |
| 24.5 | 0.4435 + 0.2703i | 0.4444 + 0.2897i | 0.4008 + 0.2724i | 0.4020 + 0.2908i |
| 25 | 0.4711 + 0.2693i | 0.4704 + 0.2957i | 0.4060 + 0.2680i | 0.4057 + 0.2929i |
| 25.5 | 0.4488 + 0.2770i | 0.4545 + 0.3309i | 0.3879 + 0.2805i | 0.3914 + 0.3357i |
| 26 | 0.4987 + 0.2781i | 0.4969 + 0.3245i | 0.4217 + 0.2807i | 0.4195 + 0.3226i |
| 26.5 | 0.4942 + 0.2865i | 0.4967 + 0.3440i | 0.4169 + 0.2892i | 0.4181 + 0.3435i |
| 27 | 0.4776 + 0.2777i | 0.4790 + 0.3514i | 0.4145 + 0.2787i | 0.4149 + 0.3453i |
| 27.5 | 0.4953 + 0.2912i | 0.5006 + 0.3617i | 0.4249 + 0.2903i | 0.4218 + 0.3534i |
| 28 | 0.4796 + 0.2942i | 0.4808 + 0.3655i | 0.4118 + 0.2932i | 0.4092 + 0.3590i |

| SNR/w | w248 | w249 | w250 | w251 |
|---|---|---|---|---|
| 7 | 0.4502 + 0.2556i | 0.4862 + 0.2687i | 0.4502 + 0.2556i | 0.4862 + 0.2687i |
| 7.5 | 0.4852 + 0.2798i | 0.4852 + 0.2798i | 0.4819 + 0.2466i | 0.4819 + 0.2466i |
| 8 | 0.5292 + 0.2478i | 0.5292 + 0.2478i | 0.5292 + 0.2478i | 0.5292 + 0.2478i |
| 8.5 | 0.5504 + 0.2412i | 0.5504 + 0.2412i | 0.5504 + 0.2412i | 0.5504 + 0.2412i |
| 9 | 0.2991 + 0.5474i | 0.2991 + 0.5474i | 0.2991 + 0.5474i | 0.2991 + 0.5474i |
| 9.5 | 0.3084 + 0.5682i | 0.3084 + 0.5682i | 0.3084 + 0.5682i | 0.3084 + 0.5682i |
| 10 | 0.3180 + 0.5832i | 0.3180 + 0.5832i | 0.3180 + 0.5832i | 0.3180 + 0.5832i |
| 10.5 | 0.3254 + 0.5943i | 0.3254 + 0.5943i | 0.3254 + 0.5943i | 0.3254 + 0.5943i |
| 11 | 0.5725 + 0.3558i | 0.5725 + 0.3558i | 0.5725 + 0.3558i | 0.5725 + 0.3558i |
| 11.5 | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i |
| 13.5 | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i |
| 14.5 | 0.5355 + 0.3122i | 0.5355 + 0.3122i | 0.5355 + 0.3122i | 0.5355 + 0.3122i |
| 15 | 0.3853 + 0.3413i | 0.3853 + 0.3413i | 0.3853 + 0.3413i | 0.3853 + 0.3413i |
| 15.5 | 0.3737 + 0.3509i | 0.3737 + 0.3509i | 0.3737 + 0.3509i | 0.3737 + 0.3509i |
| 16 | 0.3440 + 0.3723i | 0.3440 + 0.3723i | 0.3440 + 0.3723i | 0.3440 + 0.3723i |
| 16.5 | 0.3370 + 0.3602i | 0.3370 + 0.3602i | 0.3370 + 0.3602i | 0.3370 + 0.3602i |
| 17 | 0.3338 + 0.3637i | 0.3338 + 0.3637i | 0.3338 + 0.3637i | 0.3338 + 0.3637i |
| 17.5 | 0.3283 + 0.3681i | 0.3283 + 0.3681i | 0.3283 + 0.3681i | 0.3283 + 0.3681i |
| 18 | 0.3203 + 0.3731i | 0.3203 + 0.3731i | 0.3203 + 0.3731i | 0.3203 + 0.3731i |
| 18.5 | 0.2964 + 0.4577i | 0.2964 + 0.4577i | 0.2964 + 0.4577i | 0.2964 + 0.4577i |
| 19 | 0.2905 + 0.4851i | 0.2905 + 0.4851i | 0.2905 + 0.4851i | 0.2905 + 0.4851i |
| 19.5 | 0.2875 + 0.5020i | 0.2875 + 0.5020i | 0.2875 + 0.5020i | 0.2875 + 0.5020i |
| 20 | 0.3343 + 0.3601i | 0.3343 + 0.3601i | 0.3343 + 0.3601i | 0.3343 + 0.3601i |
| 20.5 | 0.2984 + 0.4519i | 0.2984 + 0.4519i | 0.2984 + 0.4519i | 0.2984 + 0.4519i |
| 21 | 0.2958 + 0.4274i | 0.2958 + 0.4274i | 0.2958 + 0.4274i | 0.2958 + 0.4274i |
| 21.5 | 0.2982 + 0.4164i | 0.2982 + 0.4164i | 0.2982 + 0.4164i | 0.2982 + 0.4164i |
| 22 | 0.2967 + 0.4234i | 0.2967 + 0.4234i | 0.2967 + 0.4234i | 0.2967 + 0.4234i |
| 22.5 | 0.2956 + 0.4208i | 0.2956 + 0.4208i | 0.2956 + 0.4208i | 0.2956 + 0.4208i |
| 23 | 0.2959 + 0.4148i | 0.2959 + 0.4148i | 0.2959 + 0.4148i | 0.2959 + 0.4148i |
| 23.5 | 0.2965 + 0.4249i | 0.2963 + 0.4079i | 0.2965 + 0.4249i | 0.2963 + 0.4079i |
| 24 | 0.2813 + 0.4303i | 0.2816 + 0.4007i | 0.2913 + 0.4304i | 0.2918 + 0.4007i |
| 24.5 | 0.2876 + 0.4295i | 0.2869 + 0.3918i | 0.3057 + 0.4296i | 0.3056 + 0.3912i |
| 25 | 0.2771 + 0.4268i | 0.2768 + 0.3791i | 0.3135 + 0.4278i | 0.3155 + 0.3799i |
| 25.5 | 0.2679 + 0.4831i | 0.2671 + 0.4177i | 0.3196 + 0.4813i | 0.3153 + 0.4153i |
| 26 | 0.2901 + 0.4652i | 0.2841 + 0.4025i | 0.3477 + 0.4578i | 0.3484 + 0.3989i |
| 26.5 | 0.2625 + 0.4607i | 0.2678 + 0.3993i | 0.3331 + 0.4633i | 0.3357 + 0.4044i |
| 27 | 0.2775 + 0.4791i | 0.2786 + 0.4104i | 0.3419 + 0.4815i | 0.3447 + 0.4116i |

-continued

| | | | | |
|---|---|---|---|---|
| 27.5 | 0.2845 + 0.4908i | 0.2855 + 0.4209i | 0.3510 + 0.4925i | 0.3519 + 0.4213i |
| 28 | 0.2735 + 0.4926i | 0.2751 + 0.4223i | 0.3391 + 0.4945i | 0.3402 + 0.4252i |

| SNR/w | w252 | w253 | w254 | w255 |
|---|---|---|---|---|
| 7 | 0.4862 + 0.2687i | 0.4862 + 0.2687i | 0.4862 + 0.2687i | 0.4862 + 0.2687i |
| 7.5 | 0.5153 + 0.2942i | 0.5153 + 0.2942i | 0.5163 + 0.2548i | 0.5163 + 0.2548i |
| 8 | 0.5229 + 0.2953i | 0.5229 + 0.2953i | 0.5229 + 0.2953i | 0.5229 + 0.2953i |
| 8.5 | 0.5358 + 0.2977i | 0.5358 + 0.2977i | 0.5358 + 0.2977i | 0.5358 + 0.2977i |
| 9 | 0.2991 + 0.5474i | 0.2991 + 0.5474i | 0.2991 + 0.5474i | 0.2991 + 0.5474i |
| 9.5 | 0.3084 + 0.5682i | 0.3084 + 0.5682i | 0.3084 + 0.5682i | 0.3084 + 0.5682i |
| 10 | 0.3180 + 0.5832i | 0.3180 + 0.5832i | 0.3180 + 0.5832i | 0.3180 + 0.5832i |
| 10.5 | 0.3254 + 0.5943i | 0.3254 + 0.5943i | 0.3254 + 0.5943i | 0.3254 + 0.5943i |
| 11 | 0.5725 + 0.3558i | 0.5725 + 0.3558i | 0.5725 + 0.3558i | 0.5725 + 0.3558i |
| 11.5 | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i |
| 13.5 | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i |
| 14.5 | 0.5222 + 0.2983i | 0.5222 + 0.2983i | 0.5222 + 0.2983i | 0.5222 + 0.2983i |
| 15 | 0.3716 + 0.3378i | 0.3716 + 0.3378i | 0.3716 + 0.3378i | 0.3716 + 0.3378i |
| 15.5 | 0.3686 + 0.3433i | 0.3686 + 0.3433i | 0.3686 + 0.3433i | 0.3737 + 0.3509i |
| 16 | 0.3412 + 0.3528i | 0.3412 + 0.3528i | 0.3412 + 0.3528i | 0.3412 + 0.3528i |
| 16.5 | 0.3376 + 0.3376i | 0.3376 + 0.3376i | 0.3376 + 0.3376i | 0.3376 + 0.3376i |
| 17 | 0.3347 + 0.3351i | 0.3347 + 0.3351i | 0.3347 + 0.3351i | 0.3347 + 0.3351i |
| 17.5 | 0.3296 + 0.3307i | 0.3296 + 0.3307i | 0.3296 + 0.3307i | 0.3296 + 0.3307i |
| 18 | 0.3218 + 0.3219i | 0.3218 + 0.3219i | 0.3218 + 0.3219i | 0.3218 + 0.3219i |
| 18.5 | 0.2889 + 0.3422i | 0.2889 + 0.3422i | 0.2889 + 0.3422i | 0.2889 + 0.3422i |
| 19 | 0.2795 + 0.3492i | 0.2795 + 0.3492i | 0.2795 + 0.3492i | 0.2795 + 0.3492i |
| 19.5 | 0.2736 + 0.3578i | 0.2736 + 0.3578i | 0.2736 + 0.3578i | 0.2736 + 0.3578i |
| 20 | 0.3464 + 0.2743i | 0.3464 + 0.2743i | 0.3464 + 0.2743i | 0.3464 + 0.2743i |
| 20.5 | 0.2937 + 0.3207i | 0.2937 + 0.3207i | 0.2937 + 0.3207i | 0.2937 + 0.3207i |
| 21 | 0.2956 + 0.3006i | 0.2956 + 0.3006i | 0.2956 + 0.3006i | 0.2956 + 0.3006i |
| 21.5 | 0.3055 + 0.2919i | 0.3055 + 0.2919i | 0.3055 + 0.2919i | 0.3055 + 0.2919i |
| 22 | 0.2960 + 0.2956i | 0.2960 + 0.2956i | 0.2960 + 0.2956i | 0.2960 + 0.2956i |
| 22.5 | 0.3008 + 0.2941i | 0.3008 + 0.2941i | 0.3008 + 0.2941i | 0.3008 + 0.2941i |
| 23 | 0.2939 + 0.2903i | 0.2939 + 0.2903i | 0.2939 + 0.2903i | 0.2939 + 0.2903i |
| 23.5 | 0.2968 + 0.2905i | 0.2968 + 0.2905i | 0.2968 + 0.2905i | 0.2968 + 0.2905i |
| 24 | 0.2830 + 0.2835i | 0.2828 + 0.2942i | 0.2936 + 0.2832i | 0.2935 + 0.2939i |
| 24.5 | 0.2822 + 0.2778i | 0.2830 + 0.2935i | 0.3018 + 0.2769i | 0.3025 + 0.2928i |
| 25 | 0.2772 + 0.2653i | 0.2769 + 0.2887i | 0.3198 + 0.2662i | 0.3190 + 0.2899i |
| 25.5 | 0.2642 + 0.2859i | 0.2656 + 0.3405i | 0.3076 + 0.2846i | 0.3109 + 0.3393i |
| 26 | 0.2773 + 0.2828i | 0.2787 + 0.3328i | 0.3433 + 0.2843i | 0.3468 + 0.3291i |
| 26.5 | 0.2800 + 0.2739i | 0.2750 + 0.3327i | 0.3456 + 0.2833i | 0.3396 + 0.3394i |
| 27 | 0.2784 + 0.2816i | 0.2788 + 0.3435i | 0.3453 + 0.2801i | 0.3462 + 0.3431i |
| 27.5 | 0.2848 + 0.2876i | 0.2849 + 0.3525i | 0.3530 + 0.2885i | 0.3520 + 0.3524i |
| 28 | 0.2814 + 0.2854i | 0.2775 + 0.3535i | 0.3445 + 0.2894i | 0.3418 + 0.3566i |

i2) 32QQAM with Max. Penalty=0.01 b/s/Hz—AWGN Channel

| SNR/w | w0 | w1 | w2 | w3 | w4 | w5 | w6 | w7 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i |
| 2 | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i |
| 2.5 | 0.3507 + 0.5354i | 0.5354 + 0.3507i | 0.5763 + 1.1217i | 1.1217 + 0.5763i | 0.3507 + 0.5354i | 0.5354 + 0.3507i | 0.5763 + 1.1217i | 1.1217 + 0.5763i |
| 3 | 0.3189 + 0.5012i | 0.5012 + 0.3189i | 0.5551 + 1.1571i | 1.1571 + 0.5551i | 0.3189 + 0.5012i | 0.5012 + 0.3189i | 0.5551 + 1.1571i | 1.1571 + 0.5551i |
| 3.5 | 0.2980 + 0.4781i | 0.4781 + 0.2981i | 0.5410 + 1.1789i | 1.1789 + 0.5410i | 0.2980 + 0.4781i | 0.4781 + 0.2981i | 0.5410 + 1.1789i | 1.1789 + 0.5410i |
| 4 | 0.2842 + 0.4633i | 0.4633 + 0.2842i | 0.5309 + 1.1928i | 1.1928 + 0.5309i | 0.2842 + 0.4633i | 0.4633 + 0.2842i | 0.5309 + 1.1928i | 1.1928 + 0.5309i |
| 4.5 | 0.2752 + 0.4551i | 0.4551 + 0.2752i | 0.5232 + 1.2014i | 1.2014 + 0.5232i | 0.2752 + 0.4551i | 0.4551 + 0.2752i | 0.5232 + 1.2014i | 1.2014 + 0.5232i |

-continued

| SNR/w | w0 | w1 | w2 | w3 | w4 | w5 | w6 | w7 |
|---|---|---|---|---|---|---|---|---|
| 5 | 0.2696 + 0.4521i | 0.4521 + 0.2696i | 0.5169 + 1.2065i | 1.2065 + 0.5169i | 0.2696 + 0.4521i | 0.4521 + 0.2696i | 0.5169 + 1.2065i | 1.2065 + 0.5169i |
| 5.5 | 0.2663 + 0.4530i | 0.4530 + 0.2663i | 0.5115 + 1.2092i | 1.2092 + 0.5115i | 0.2663 + 0.4530i | 0.4530 + 0.2663i | 0.5115 + 1.2092i | 1.2092 + 0.5115i |
| 6 | 0.2642 + 0.4570i | 0.4570 + 0.2642i | 0.5067 + 1.2102i | 1.2102 + 0.5067i | 0.2642 + 0.4570i | 0.4570 + 0.2642i | 0.5067 + 1.2102i | 1.2102 + 0.5067i |
| 6.5 | 0.2626 + 0.4588i | 0.4588 + 0.2626i | 0.5028 + 1.2085i | 1.2085 + 0.5028i | 0.2626 + 0.4588i | 0.4588 + 0.2626i | 0.5028 + 1.2085i | 1.2085 + 0.5028i |
| 7 | 0.2602 + 0.4573i | 0.4572 + 0.2602i | 0.3595 + 1.2746i | 1.2746 + 0.3595i | 0.2602 + 0.4573i | 0.4572 + 0.2602i | 0.6396 + 1.1327i | 1.1327 + 0.6395i |
| 7.5 | 0.2569 + 0.4616i | 0.4616 + 0.2569i | 0.3211 + 1.2755i | 1.2755 + 0.3211i | 0.2569 + 0.4616i | 0.4616 + 0.2569i | 0.6715 + 1.1226i | 1.1226 + 0.6715i |
| 8 | 0.2523 + 0.4699i | 0.4699 + 0.2523i | 0.2957 + 1.2701i | 1.2701 + 0.2957i | 0.2523 + 0.4699i | 0.4699 + 0.2523i | 0.6913 + 1.1190i | 1.1190 + 0.6913i |
| 8.5 | 0.2349 + 0.3783i | 0.6019 + 0.2600i | 0.3173 + 1.3160i | 1.3378 + 0.3422i | 0.2349 + 0.3783i | 0.6019 + 0.2600i | 0.4151 + 1.0074i | 1.0441 + 0.8436i |
| 9 | 0.2117 + 0.2518i | 0.6564 + 0.1984i | 0.3463 + 1.3865i | 1.3392 + 0.3470i | 0.2317 + 0.4565i | 0.6091 + 0.3434i | 0.3354 + 0.9582i | 0.9927 + 0.8356i |
| 9.5 | 0.2014 + 0.2235i | 0.6716 + 0.1924i | 0.3533 + 1.4075i | 1.3374 + 0.3431i | 0.2276 + 0.4678i | 0.6230 + 0.3674i | 0.3047 + 0.9383i | 0.9683 + 0.8393i |
| 10 | 0.1946 + 0.2025i | 0.6811 + 0.1872i | 0.3555 + 1.4163i | 1.3323 + 0.3370i | 0.2266 + 0.4818i | 0.6303 + 0.3928i | 0.2860 + 0.9269i | 0.9538 + 0.8460i |
| 10.5 | 0.1917 + 0.1863i | 0.6885 + 0.1824i | 0.3554 + 1.4185i | 1.3247 + 0.3312i | 0.2273 + 0.4949i | 0.6340 + 0.4191i | 0.2729 + 0.9204i | 0.9446 + 0.8543i |
| 11 | 0.1929 + 0.1744i | 0.6963 + 0.1782i | 0.3541 + 1.4168i | 1.3162 + 0.3270i | 0.2283 + 0.5036i | 0.6364 + 0.4437i | 0.2627 + 0.9170i | 0.9382 + 0.8637i |
| 11.5 | 0.1978 + 0.1660i | 0.7046 + 0.1752i | 0.3521 + 1.4127i | 1.3074 + 0.3244i | 0.2287 + 0.5076i | 0.6386 + 0.4654i | 0.2546 + 0.9154i | 0.9335 + 0.8738i |
| 12 | 0.2047 + 0.1603i | 0.7126 + 0.1738i | 0.3499 + 1.4076i | 1.2978 + 0.3226i | 0.2280 + 0.5086i | 0.6410 + 0.4845i | 0.2485 + 0.9154i | 0.9299 + 0.8841i |
| 12.5 | 0.2121 + 0.1569i | 0.7185 + 0.1739i | 0.3478 + 1.4027i | 1.2867 + 0.3209i | 0.2258 + 0.5089i | 0.6431 + 0.5018i | 0.2443 + 0.9172i | 0.9274 + 0.8949i |
| 13 | 0.2187 + 0.1559i | 0.7211 + 0.1755i | 0.3459 + 1.3987i | 1.2734 + 0.3186i | 0.2225 + 0.5103i | 0.6446 + 0.5183i | 0.2415 + 0.9207i | 0.9257 + 0.9059i |
| 13.5 | 0.2234 + 0.1575i | 0.7198 + 0.1782i | 0.3442 + 1.3961i | 1.2579 + 0.3156i | 0.2189 + 0.5139i | 0.6455 + 0.5346i | 0.2398 + 0.9259i | 0.9246 + 0.9174i |
| 14 | 0.2261 + 0.1614i | 0.7147 + 0.1816i | 0.3425 + 1.3949i | 1.2405 + 0.3119i | 0.2157 + 0.5201i | 0.6463 + 0.5505i | 0.2389 + 0.9324i | 0.9230 + 0.9294i |
| 14.5 | 0.2113 + 0.1819i | 0.6590 + 0.1934i | 0.6163 + 1.2930i | 1.1691 + 0.2524i | 0.2042 + 0.5736i | 0.6214 + 0.5984i | 0.2154 + 1.0277i | 1.0670 + 0.7825i |
| 15 | 0.2082 + 0.1903i | 0.6467 + 0.1971i | 0.6624 + 1.2634i | 1.1455 + 0.2430i | 0.2028 + 0.5942i | 0.6209 + 0.6087i | 0.2221 + 1.0561i | 1.0812 + 0.7572i |

j2) 64QQAM with Max. Penalty=0.01 b/s/Hz—AWGN Channel

| SNR/w | w0 | w1 | w2 | w3 | w4 | w5 | w6 | w7 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i |
| 2 | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i |
| 2.5 | 1.1217 + 0.5763i | 1.1217 + 0.5763i | 1.1217 + 0.5763i | 1.1217 + 0.5763i | 0.5354 + 0.3507i | 0.5354 + 0.3507i | 0.5354 + 0.3507i | 0.5354 + 0.3507i |
| 3 | 0.5551 + 1.1571i | 0.3189 + 0.5012i | 1.1571 + 0.5551i | 0.5012 + 0.3189i | 0.5551 + 1.1571i | 0.3189 + 0.5012i | 1.1571 + 0.5551i | 0.5012 + 0.3189i |
| 3.5 | 1.1789 + 0.5410i | 1.1789 + 0.5410i | 1.1789 + 0.5410i | 1.1789 + 0.5410i | 0.4781 + 0.2981i | 0.4781 + 0.2981i | 0.4781 + 0.2981i | 0.4781 + 0.2981i |
| 4 | 0.2842 + 0.4633i | 0.2842 + 0.4633i | 0.5309 + 1.1928i | 0.5309 + 1.1928i | 0.2842 + 0.4633i | 0.2842 + 0.4633i | 0.5309 + 1.1928i | 0.5309 + 1.1928i |
| 4.5 | 0.5232 + 1.2014i | 0.5232 + 1.2014i | 0.5232 + 1.2014i | 0.5232 + 1.2014i | 1.2014 + 0.5232i | 1.2014 + 0.5232i | 1.2014 + 0.5232i | 1.2014 + 0.5232i |
| 5 | 1.2065 + 0.5169i | 1.2065 + 0.5169i | 1.2065 + 0.5169i | 1.2065 + 0.5169i | 0.5169 + 1.2065i | 0.5169 + 1.2065i | 0.5169 + 1.2065i | 0.5169 + 1.2065i |
| 5.5 | 1.2092 + 0.5115i | 1.2092 + 0.5115i | 1.2092 + 0.5115i | 1.2092 + 0.5115i | 0.4530 + 0.2663i | 0.4530 + 0.2663i | 0.4530 + 0.2663i | 0.4530 + 0.2663i |

-continued

| | | | | | | | | |
|---|---|---|---|---|---|---|---|---|
| 6 | 0.2642 + 0.4570i | 0.2642 + 0.4570i | 0.2642 + 0.4570i | 0.2642 + 0.4570i | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i | 1.2085 + 0.5028i | 1.2085 + 0.5028i | 1.2085 + 0.5028i | 1.2085 + 0.5028i |
| 7 | 0.3595 + 1.2746i | 0.6396 + 1.1327i | 0.3595 + 1.2746i | 0.6396 + 1.1327i | 1.2746 + 0.3595i | 1.1327 + 0.6396i | 1.2746 + 0.3595i | 1.1327 + 0.6396i |
| 7.5 | 0.7476 + 1.2181i | 0.5961 + 1.0258i | 0.3325 + 1.3887i | 0.3069 + 1.1510i | 1.2181 + 0.7475i | 1.0258 + 0.5961i | 1.3887 + 0.3325i | 1.1510 + 0.3069i |
| 8 | 0.3109 + 1.4253i | 0.7943 + 1.2523i | 0.2868 + 1.0998i | 0.5786 + 0.9799i | 1.4253 + 0.3109i | 1.2523 + 0.7943i | 1.0998 + 0.2868i | 0.9799 + 0.5786i |
| 8.5 | 1.6023 + 0.4387i | 1.0881 + 0.8753i | 0.4387 + 1.6023i | 0.8753 + 1.0881i | 0.8846 + 0.2625i | 0.8846 + 0.2625i | 0.7679 + 0.2336i | 0.7679 + 0.2336i |
| 9 | 0.4221 + 1.5951i | 1.5951 + 0.4221i | 0.8732 + 1.0971i | 1.0971 + 0.8732i | 0.7946 + 0.2627i | 0.9288 + 0.2247i | 0.7946 + 0.2627i | 0.7946 + 0.2627i |
| 9.5 | 0.8408 + 1.2670i | 0.5485 + 0.9136i | 0.2950 + 1.4844i | 0.2548 + 1.0308i | 1.2670 + 0.8407i | 0.9136 + 0.5485i | 1.4844 + 0.2950i | 1.0308 + 0.2548i |
| 10 | 1.2647 + 0.8443i | 1.4891 + 0.2935i | 0.9020 + 0.5498i | 1.0230 + 0.2451i | 0.3072 + 0.1682i | 0.3072 + 0.1682i | 0.6173 + 0.2717i | 0.6173 + 0.2717i |
| 10.5 | 0.2925 + 1.4892i | 0.8449 + 1.2622i | 0.2351 + 1.0196i | 0.5555 + 0.8926i | 1.4892 + 0.2925i | 1.2622 + 0.8449i | 1.0196 + 0.2351i | 0.8926 + 0.5555i |
| 11 | 0.8435 + 1.2594i | 0.5630 + 0.8851i | 0.2921 + 1.4867i | 0.2255 + 1.0193i | 1.2594 + 0.8435i | 0.8851 + 0.5630i | 1.4867 + 0.2921i | 1.0193 + 0.2255i |
| 11.5 | 0.2920 + 1.4827i | 0.8411 + 1.2563i | 0.2174 + 1.0211i | 0.5702 + 0.8798i | 1.4827 + 0.2920i | 1.2563 + 0.8411i | 1.0211 + 0.2174i | 0.8798 + 0.5702i |
| 12 | 0.2920 + 1.4781i | 0.8380 + 1.2527i | 0.2112 + 1.0242i | 0.5763 + 0.8768i | 1.4781 + 0.2920i | 1.2527 + 0.8380i | 1.0242 + 0.2112i | 0.8768 + 0.5763i |
| 12.5 | 0.2920 + 1.4732i | 0.8348 + 1.2487i | 0.2071 + 1.0283i | 0.5811 + 0.8760i | 1.4732 + 0.2920i | 1.2487 + 0.8348i | 1.0283 + 0.2071i | 0.8760 + 0.5811i |
| 13 | 0.2978 + 1.4669i | 0.8421 + 1.2355i | 0.2135 + 1.0389i | 0.6055 + 0.8654i | 1.4685 + 0.2859i | 1.2516 + 0.8201i | 1.0279 + 0.1981i | 0.8857 + 0.5642i |
| 13.5 | 1.4627 + 0.2996i | 1.0469 + 0.2187i | 1.2278 + 0.8422i | 0.8605 + 0.6179i | 0.3964 + 0.1561i | 0.7441 + 0.1749i | 0.3964 + 0.1561i | 0.6160 + 0.4168i |
| 14 | 0.2989 + 1.4602i | 0.8389 + 1.2232i | 0.2232 + 1.0534i | 0.6245 + 0.8593i | 1.4560 + 0.2819i | 1.2434 + 0.8085i | 1.0319 + 0.1914i | 0.8945 + 0.5550i |
| 14.5 | 0.2878 + 1.4388i | 0.8133 + 1.2150i | 0.2219 + 1.0386i | 0.6145 + 0.8494i | 1.4656 + 0.2931i | 1.2278 + 0.8230i | 1.0649 + 0.2069i | 0.8971 + 0.5677i |
| 15 | 0.9687 − 0.4488i | 0.1261 − 0.4193i | 0.6752 − 0.4269i | 0.3896 − 0.4201i | 1.0304 − 0.1506i | 0.1248 − 0.1379i | 0.6647 − 0.1295i | 0.3769 − 0.1364i |
| 15.5 | 0.9856 − 0.4661i | 0.1264 − 0.4145i | 0.6825 − 0.4329i | 0.3948 − 0.4179i | 1.0366 − 0.1534i | 0.1272 − 0.1353i | 0.6796 − 0.1340i | 0.3877 − 0.1359i |
| 16 | 1.0161 − 0.4912i | 0.1287 − 0.4061i | 0.6966 − 0.4427i | 0.4025 − 0.4142i | 1.0441 − 0.1581i | 0.1321 − 0.1317i | 0.6995 − 0.1411i | 0.4035 − 0.1354i |
| 16.5 | 1.0519 − 0.5188i | 0.1325 − 0.3998i | 0.7146 − 0.4532i | 0.4122 − 0.4120i | 1.0500 − 0.1642i | 0.1374 − 0.1295i | 0.7170 − 0.1473i | 0.4185 − 0.1357i |
| 17 | 1.0725 − 0.5328i | 0.1361 − 0.4023i | 0.7267 − 0.4592i | 0.4198 − 0.4151i | 1.0501 − 0.1676i | 0.1398 − 0.1309i | 0.7233 − 0.1496i | 0.4246 − 0.1370i |
| 17.5 | 1.0854 − 0.5394i | 0.1392 − 0.4078i | 0.7353 − 0.4623i | 0.4262 − 0.4205i | 1.0474 − 0.1695i | 0.1407 − 0.1336i | 0.7243 − 0.1504i | 0.4265 − 0.1388i |
| 18 | 1.0941 − 0.5424i | 0.1418 − 0.4131i | 0.7424 − 0.4645i | 0.4318 − 0.4266i | 1.0439 − 0.1707i | 0.1411 − 0.1361i | 0.7235 − 0.1509i | 0.4269 − 0.1406i |
| 18.5 | 1.0998 − 0.5430i | 0.1439 − 0.4173i | 0.7487 − 0.4666i | 0.4370 − 0.4325i | 1.0405 − 0.1713i | 0.1414 − 0.1380i | 0.7224 − 0.1517i | 0.4269 − 0.1425i |
| 19 | 1.1032 − 0.5410i | 0.1458 − 0.4204i | 0.7543 − 0.4691i | 0.4418 − 0.4382i | 1.0373 − 0.1716i | 0.1414 − 0.1393i | 0.7213 − 0.1527i | 0.4267 − 0.1443i |
| 19.5 | 1.1043 − 0.5346i | 0.1473 − 0.4225i | 0.7587 − 0.4731i | 0.4459 − 0.4435i | 1.0338 − 0.1710i | 0.1414 − 0.1401i | 0.7201 − 0.1544i | 0.4264 − 0.1461i |
| 20 | 1.1039 − 0.5232i | 0.1486 − 0.4237i | 0.7620 − 0.4802i | 0.4492 − 0.4482i | 1.0304 − 0.1696i | 0.1413 − 0.1405i | 0.7193 − 0.1572i | 0.4263 − 0.1477i |

| SNR/w | w8 | w9 | w10 | w11 | w12 | w13 | w14 | w15 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i |
| 2 | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i |
| 2.5 | 0.5763 + 1.1217i | 0.5763 + 1.1217i | 0.5763 + 1.1217i | 0.5763 + 1.1217i | 0.3507 + 0.5354i | 0.3507 + 0.5354i | 0.3507 + 0.5354i | 0.3507 + 0.5354i |
| 3 | 0.5551 + 1.1571i | 0.3189 + 0.5012i | 1.1571 + 0.5551i | 0.5012 + 0.3189i | 0.5551 + 1.1571i | 0.3189 + 0.5012i | 1.1571 + 0.5551i | 0.5012 + 0.3189i |
| 3.5 | 0.5410 + 1.1789i | 0.5410 + 1.1789i | 0.5410 + 1.1789i | 0.5410 + 1.1789i | 0.2980 + 0.4781i | 0.2980 + 0.4781i | 0.2980 + 0.4781i | 0.2980 + 0.4781i |

-continued

| | | | | | | | | |
|---|---|---|---|---|---|---|---|---|
| 4 | 0.4633 + 0.2842i | 0.4633 + 0.2842i | 1.1928 + 0.5309i | 1.1928 + 0.5309i | 0.4633 + 0.2842i | 0.4633 + 0.2842i | 1.1928 + 0.5309i | 1.1928 + 0.5309i |
| 4.5 | 0.2752 + 0.4551i | 0.2752 + 0.4551i | 0.2752 + 0.4551i | 0.2752 + 0.4551i | 0.4551 + 0.2752i | 0.4551 + 0.2752i | 0.4551 + 0.2752i | 0.4551 + 0.2752i |
| 5 | 0.4521 + 0.2696i | 0.4521 + 0.2696i | 0.4521 + 0.2696i | 0.4521 + 0.2696i | 0.2696 + 0.4521i | 0.2696 + 0.4521i | 0.2696 + 0.4521i | 0.2696 + 0.4521i |
| 5.5 | 0.5115 + 1.2092i | 0.5115 + 1.2092i | 0.5115 + 1.2092i | 0.5115 + 1.2092i | 0.2663 + 0.4530i | 0.2663 + 0.4530i | 0.2663 + 0.4530i | 0.2663 + 0.4530i |
| 6 | 0.5067 + 1.2102i | 0.5067 + 1.2102i | 0.5067 + 1.2102i | 0.5067 + 1.2102i | 1.2102 + 0.5067i | 1.2102 + 0.5067i | 1.2102 + 0.5067i | 1.2102 + 0.5067i |
| 6.5 | 0.2626 + 0.4588i | 0.2626 + 0.4588i | 0.2626 + 0.4588i | 0.2626 + 0.4588i | 0.4588 + 0.2626i | 0.4588 + 0.2626i | 0.4588 + 0.2626i | 0.4588 + 0.2626i |
| 7 | 0.2602 + 0.4573i | 0.2602 + 0.4573i | 0.2602 + 0.4573i | 0.2602 + 0.4573i | 0.4573 + 0.2602i | 0.4573 + 0.2602i | 0.4573 + 0.2602i | 0.4573 + 0.2602i |
| 7.5 | 0.2530 + 0.4546i | 0.2530 + 0.4546i | 0.2530 + 0.4546i | 0.2530 + 0.4546i | 0.4546 + 0.2530i | 0.4546 + 0.2530i | 0.4546 + 0.2530i | 0.4546 + 0.2530i |
| 8 | 0.2450 + 0.4533i | 0.2450 + 0.4533i | 0.2450 + 0.4533i | 0.2450 + 0.4533i | 0.4533 + 0.2450i | 0.4533 + 0.2450i | 0.4533 + 0.2450i | 0.4533 + 0.2450i |
| 8.5 | 0.2574 + 0.7937i | 0.2574 + 0.7937i | 0.2202 + 0.9239i | 0.2574 + 0.7937i | 0.2686 + 0.2686i | 0.2686 + 0.2686i | 0.2686 + 0.2686i | 0.2686 + 0.2686i |
| 9 | 0.2711 + 0.8883i | 0.2353 + 0.7680i | 0.2711 + 0.8883i | 0.2353 + 0.7680i | 0.2666 + 0.2666i | 0.2666 + 0.2666i | 0.2666 + 0.2666i | 0.2666 + 0.2666i |
| 9.5 | 0.1758 + 0.3172i | 0.2719 + 0.5996i | 0.1758 + 0.3172i | 0.2719 + 0.5996i | 0.3172 + 0.1758i | 0.5996 + 0.2719i | 0.3172 + 0.1758i | 0.5996 + 0.2719i |
| 10 | 0.8443 + 1.2648i | 0.2935 + 1.4891i | 0.5498 + 0.9020i | 0.2451 + 1.0230i | 0.1682 + 0.3072i | 0.1682 + 0.3072i | 0.2717 + 0.6173i | 0.2717 + 0.6173i |
| 10.5 | 0.1635 + 0.3025i | 0.1635 + 0.3025i | 0.2075 + 0.6586i | 0.3354 + 0.6030i | 0.3025 + 0.1635i | 0.3025 + 0.1635i | 0.6586 + 0.2075i | 0.6030 + 0.3354i |
| 1i | 0.1606 + 0.3016i | 0.3460 + 0.6087i | 0.1606 + 0.3016i | 0.1969 + 0.6737i | 0.3016 + 0.1606i | 0.6087 + 0.3460i | 0.3016 + 0.1606i | 0.6737 + 0.1969i |
| 11.5 | 0.1583 + 0.3034i | 0.1583 + 0.3034i | 0.1871 + 0.6855i | 0.3563 + 0.6126i | 0.3034 + 0.1583i | 0.3034 + 0.1583i | 0.6855 + 0.1871i | 0.6126 + 0.3563i |
| 12 | 0.1560 + 0.3070i | 0.1560 + 0.3070i | 0.1789 + 0.6942i | 0.3657 + 0.6155i | 0.3070 + 0.1560i | 0.3070 + 0.1560i | 0.6942 + 0.1789i | 0.6155 + 0.3657i |
| 12.5 | 0.1532 + 0.3116i | 0.1532 + 0.3116i | 0.1720 + 0.7004i | 0.3741 + 0.6174i | 0.3116 + 0.1532i | 0.3116 + 0.1532i | 0.7004 + 0.1720i | 0.6174 + 0.3741i |
| 13 | 0.1545 + 0.3665i | 0.1545 + 0.3665i | 0.1756 + 0.7261i | 0.4023 + 0.6180i | 0.2730 + 0.1455i | 0.2730 + 0.1455i | 0.6840 + 0.1578i | 0.6145 + 0.3555i |
| 13.5 | 0.2831 + 1.4625i | 0.1935 + 1.0296i | 0.8124 + 1.2487i | 0.5574 + 0.8909i | 0.1413 + 0.2555i | 0.1488 + 0.6759i | 0.1413 + 0.2555i | 0.3493 + 0.6111i |
| 14 | 0.1587 + 0.4130i | 0.1587 + 0.4130i | 0.1717 + 0.7575i | 0.4261 + 0.6136i | 0.2461 + 0.1402i | 0.2461 + 0.1402i | 0.6735 + 0.1418i | 0.6085 + 0.3483i |
| 14.5 | 0.1177 + 0.4119i | 0.2516 + 0.3998i | 0.1559 + 0.7442i | 0.4328 + 0.5954i | 0.1678 + 0.1166i | 0.3325 + 0.1582i | 0.7408 + 0.1355i | 0.6200 + 0.3227i |
| 15 | 1.1704 − 0.7904i | 0.1452 − 0.7405i | 0.6932 − 0.8128i | 0.4017 − 0.7221i | 1.4580 − 0.2741i | 0.1644 − 1.0798i | 0.7344 − 1.2171i | 0.2867 − 1.4419i |
| 15.5 | 1.1580 − 0.8178i | 0.1416 − 0.7330i | 0.6913 − 0.8132i | 0.4018 − 0.7177i | 1.4529 − 0.2702i | 0.1686 − 1.0718i | 0.7097 − 1.2125i | 0.2732 − 1.4375i |
| 16 | 1.1306 − 0.8649i | 0.1385 − 0.7199i | 0.6874 − 0.8123i | 0.4017 − 0.7107i | 1.4516 − 0.2578i | 0.1689 − 1.0567i | 0.6750 − 1.2072i | 0.2558 − 1.4247i |
| 16.5 | 1.0952 − 0.9115i | 0.1369 − 0.7073i | 0.6868 − 0.8108i | 0.4044 − 0.7057i | 1.4480 − 0.2403i | 0.1677 − 1.0405i | 0.6406 − 1.1995i | 0.2402 − 1.4087i |
| 17 | 1.0771 − 0.9315i | 0.1373 − 0.7043i | 0.6956 − 0.8095i | 0.4114 − 0.7109i | 1.4380 − 0.2294i | 0.1680 − 1.0338i | 0.6220 − 1.1896i | 0.2326 − 1.3986i |
| 17.5 | 1.0693 − 0.9408i | 0.1388 − 0.7057i | 0.7092 − 0.8073i | 0.4197 − 0.7206i | 1.4261 − 0.2216i | 0.1682 − 1.0316i | 0.6106 − 1.1783i | 0.2287 − 1.3914i |
| 18 | 1.0666 − 0.9452i | 0.1406 − 0.7083i | 0.7229 − 0.8052i | 0.4275 − 0.7307i | 1.4143 − 0.2157i | 0.1685 − 1.0310i | 0.6029 − 1.1680i | 0.2262 − 1.3855i |
| 18.5 | 1.0673 − 0.9458i | 0.1425 − 0.7109i | 0.7349 − 0.8045i | 0.4344 − 0.7399i | 1.4036 − 0.2110i | 0.1691 − 1.0309i | 0.5971 − 1.1599i | 0.2240 − 1.3805i |
| 19 | 1.0720 − 0.9413i | 0.1445 − 0.7131i | 0.7452 − 0.8057i | 0.4404 − 0.7481i | 1.3941 − 0.2072i | 0.1697 − 1.0309i | 0.5918 − 1.1539i | 0.2216 − 1.3761i |
| 19.5 | 1.0847 − 0.9271i | 0.1467 − 0.7148i | 0.7552 − 0.8112i | 0.4463 − 0.7557i | 1.3857 − 0.2033i | 0.1703 − 1.0305i | 0.5851 − 1.1507i | 0.2181 − 1.3721i |
| 20 | 1.1043 − 0.9013i | 0.1491 − 0.7159i | 0.7655 − 0.8232i | 0.4529 − 0.7625i | 1.3785 − 0.1990i | 0.1705 − 1.0293i | 0.5745 − 1.1503i | 0.2128 − 1.3684i |

k2) 256QQAM with Max. Penalty=0.01 b/s/Hz—AWGN Channel

| SNR/ w | w0 | w1 | w2 | w3 | w4 | w5 | w6 | w7 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |

-continued

| | | | | | | | | |
|---|---|---|---|---|---|---|---|---|
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i |
| 7 | 1.0751 + 0.6463i | 1.0751 + 0.6463i | 1.5234 + 1.0871i | 1.0751 + 0.6463i | 1.2330 + 0.3563i | 1.2330 + 0.3563i | 1.6996 + 0.3860i | 1.2330 + 0.3563i |
| 7.5 | 0.2521 + 0.4541i | 0.2521 + 0.4541i | 0.5780 + 1.0186i | 0.6595 + 1.1198i | 0.2521 + 0.4541i | 0.2521 + 0.4541i | 0.5780 + 1.0186i | 0.5780 + 1.0186i |
| 8 | 0.3565 + 1.7813i | 0.3059 + 1.2626i | 0.3059 + 1.2626i | 0.2951 + 1.1350i | 1.0099 + 1.5146i | 0.6749 + 1.1091i | 0.6749 + 1.1091i | 0.5912 + 1.0099i |
| 8.5 | 0.3488 + 1.7914i | 0.2880 + 1.2587i | 0.2880 + 1.2587i | 0.2778 + 1.1339i | 1.0152 + 1.5168i | 0.6879 + 1.1023i | 0.6879 + 1.1023i | 0.6039 + 1.0029i |
| 9 | 1.6414 + 0.6837i | 0.9224 + 0.9099i | 0.3155 + 1.4985i | 0.7236 + 0.9800i | 1.8682 + 0.2925i | 0.9224 + 0.9099i | 0.3155 + 1.4985i | 0.7236 + 0.9800i |
| 9.5 | 1.6327 + 0.6734i | 0.9312 + 0.9074i | 0.2863 + 1.5023i | 0.7311 + 0.9685i | 1.8490 + 0.2874i | 0.9312 + 0.9074i | 0.3370 + 1.4511i | 0.7311 + 0.9685i |
| 10 | 1.7476 − 0.3437i | 1.4030 − 0.2782i | 1.0199 − 0.2443i | 1.0199 − 0.2443i | 1.4030 − 0.2782i | 1.4030 − 0.2782i | 1.0199 − 0.2443i | 1.0199 − 0.2443i |
| 10.5 | 1.7549 − 0.3495i | 1.4067 − 0.2747i | 1.0113 − 0.2349i | 1.0113 − 0.2349i | 1.4067 − 0.2747i | 1.4067 − 0.2747i | 1.0113 − 0.2349i | 1.0113 − 0.2349i |
| 11 | 0.3538 + 1.7624i | 0.2729 + 1.4059i | 0.2729 + 1.4059i | 0.2729 + 1.4059i | 0.9952 + 1.4965i | 0.7993 + 1.1885i | 0.7993 + 1.1885i | 0.7993 + 1.1885i |
| 11.5 | 0.2732 + 1.4024i | 0.3556 + 1.7714i | 0.2732 + 1.4024i | 0.2732 + 1.4024i | 0.7988 + 1.1854i | 1.0007 + 1.5057i | 0.7988 + 1.1854i | 0.7988 + 1.1854i |
| 12 | 0.6800 + 1.6926i | 0.3911 + 1.3645i | 0.2191 + 1.7524i | 0.2274 + 1.4208i | 0.8678 + 1.2487i | 0.7275 + 1.1667i | 0.8338 + 1.0438i | 0.8338 + 1.0438i |
| 12.5 | 0.7085 + 1.6630i | 0.4337 + 1.3632i | 0.2265 + 1.7707i | 0.2214 + 1.4346i | 0.8829 + 1.2345i | 0.7423 + 1.1546i | 0.8720 + 1.0003i | 0.8720 + 1.0003i |
| 13 | 0.7232 + 1.6427i | 0.4625 + 1.3572i | 0.2367 + 1.7836i | 0.2081 + 1.4453i | 0.8955 + 1.2316i | 0.7485 + 1.1494i | 0.9036 + 0.9662i | 0.9036 + 0.9662i |
| 13.5 | 0.7280 + 1.6384i | 0.4787 + 1.3492i | 0.2417 + 1.7872i | 0.1966 + 1.4478i | 0.9185 + 1.2490i | 0.7448 + 1.1524i | 0.9224 + 0.9489i | 0.9224 + 0.9489i |
| 14 | 0.6852 + 1.6631i | 0.4978 + 1.3396i | 0.2241 + 1.7611i | 0.1891 + 1.4343i | 1.0300 + 1.3532i | 0.7389 + 1.1771i | 0.9797 + 0.9598i | 0.8864 + 0.9798i |
| 14.5 | 0.6850 + 1.6565i | 0.5110 + 1.3346i | 0.2284 + 1.7618i | 0.1836 + 1.4363i | 1.0485 + 1.3578i | 0.7448 + 1.1781i | 0.9923 + 0.9464i | 0.9014 + 0.9717i |
| 15 | 1.1831 + 1.3352i | 1.5548 + 0.8930i | 1.0563 + 0.9473i | 1.1944 + 0.8535i | 1.7139 + 0.2236i | 1.4688 + 0.5085i | 0.9846 + 0.6522i | 1.0982 + 0.6252i |
| 15.5 | 1.3333 + 1.1727i | 0.9525 + 1.0450i | 0.8764 + 1.5619i | 0.8595 + 1.2191i | 1.2665 + 0.7890i | 1.0238 + 0.8157i | 1.0093 + 0.5886i | 1.0093 + 0.5886i |
| 16 | 1.0693 + 1.3695i | 1.6456 + 0.7233i | 1.0401 + 0.9844i | 1.3351 + 0.9489i | 1.6696 + 0.1992i | 1.4116 + 0.4773i | 0.9912 + 0.6923i | 1.1625 + 0.6341i |
| 16.5 | 1.3185 + 1.1655i | 1.0729 + 0.9416i | 0.9781 + 1.3517i | 0.9292 + 0.9707i | 1.4986 + 0.8198i | 1.2084 + 0.6881i | 0.9265 + 0.5535i | 0.9824 + 0.6211i |
| 17 | 1.1514 + 1.3474i | 1.3447 + 1.0136i | 0.9323 + 1.1378i | 0.9510 + 0.9427i | 1.2112 + 0.5426i | 1.2864 + 0.7311i | 0.9873 + 0.5679i | 0.9676 + 0.7289i |
| 17.5 | 1.1159 + 1.3726i | 1.3078 + 1.0458i | 0.9051 + 1.1657i | 0.9509 + 0.9581i | 1.2112 + 0.5506i | 1.3032 + 0.7544i | 0.9969 + 0.5672i | 0.9755 + 0.7547i |
| 18 | 1.1058 + 1.3496i | 1.2204 + 1.0180i | 0.8713 + 1.1743i | 0.9189 + 0.9604i | 1.2283 + 0.6284i | 1.4576 + 0.8033i | 1.0010 + 0.6008i | 0.9350 + 0.7635i |
| 18.5 | 1.1022 + 1.3396i | 1.2102 + 1.0122i | 0.8669 + 1.1800i | 0.9153 + 0.9665i | 1.2205 + 0.6352i | 1.4496 + 0.8012i | 0.9972 + 0.5981i | 0.9328 + 0.7745i |
| 19 | 1.5817 + 0.4283i | 1.4894 + 0.1404i | 1.4735 + 0.7375i | 1.2229 + 0.6531i | 1.0586 + 0.3317i | 1.2553 + 0.3125i | 0.9114 + 0.4575i | 1.0349 + 0.5768i |
| 19.5 | 0.8375 + 1.4782i | 1.3271 + 0.8728i | 1.1494 + 1.1881i | 1.0720 + 0.8655i | 1.5541 + 0.6145i | 1.2416 + 0.5886i | 0.9113 + 0.4993i | 1.0207 + 0.6225i |
| 20 | 1.1577 + 1.2607i | 1.2132 + 0.9665i | 0.8650 + 1.2652i | 0.9371 + 1.0167i | 1.2341 + 0.6321i | 1.4507 + 0.7875i | 0.9999 + 0.6438i | 0.9509 + 0.8111i |
| 20.5 | 1.1623 + 1.2367i | 1.2152 + 0.9464i | 0.8671 + 1.2704i | 0.9416 + 1.0203i | 1.2263 + 0.6212i | 1.4418 + 0.7638i | 0.9979 + 0.6457i | 0.9519 + 0.8158i |
| 21 | 1.1584 + 1.2194i | 1.2110 + 0.9332i | 0.8614 + 1.2738i | 0.9374 + 1.0274i | 1.2218 + 0.6145i | 1.4309 + 0.7504i | 0.9986 + 0.6549i | 0.9484 + 0.8261i |
| 21.5 | 1.1541 + 1.1980i | 1.2082 + 0.9192i | 0.8523 + 1.2778i | 0.9253 + 1.0390i | 1.2200 + 0.6057i | 1.4217 + 0.7371i | 1.0021 + 0.6678i | 0.9448 + 0.8412i |
| 22 | 1.1564 + 1.1321i | 1.2409 + 0.8772i | 0.8304 + 1.2958i | 0.8902 + 1.0738i | 1.2195 + 0.5872i | 1.4329 + 0.6862i | 1.0077 + 0.6857i | 0.9610 + 0.8761i |
| 22.5 | 1.1672 + 1.0989i | 1.2422 + 0.8522i | 0.8024 + 1.2971i | 0.8967 + 1.0878i | 1.2134 + 0.5744i | 1.4239 + 0.6620i | 1.0091 + 0.6909i | 0.9644 + 0.8828i |
| 23 | 1.2322 + 1.0269i | 1.4082 + 0.7080i | 0.7782 + 1.3193i | 0.9660 + 1.1333i | 1.4427 + 0.4179i | 1.1837 + 0.7680i | 0.9625 + 0.7036i | 0.9821 + 0.8987i |
| 23.5 | 1.1616 + 1.0595i | 1.2384 + 0.8218i | 0.7696 + 1.2863i | 0.8965 + 1.0947i | 1.1989 + 0.5582i | 1.4012 + 0.6249i | 1.0129 + 0.6976i | 0.9657 + 0.8860i |
| 24 | 1.2424 + 0.9493i | 1.2834 + 0.7245i | 0.9545 + 1.2183i | 1.0015 + 1.0002i | 1.1739 + 0.5257i | 1.3794 + 0.4917i | 1.0065 + 0.6128i | 1.0346 + 0.7930i |
| 24.5 | 1.2328 + 0.9369i | 1.2653 + 0.7160i | 0.9349 + 1.2178i | 0.9989 + 1.0051i | 1.1766 + 0.5132i | 1.3771 + 0.4884i | 1.0162 + 0.6131i | 1.0287 + 0.7970i |

-continued

| | | | | | | | | |
|---|---|---|---|---|---|---|---|---|
| 25 | 1.2245 + 0.9258i | 1.2535 + 0.7077i | 0.9208 + 1.2133i | 0.9969 + 1.0052i | 1.1757 + 0.5047i | 1.3715 + 0.4846i | 1.0198 + 0.6112i | 1.0268 + 0.7962i |
| 25.5 | 1.2171 + 0.9128i | 1.2413 + 0.6969i | 0.9105 + 1.2064i | 0.9951 + 1.0017i | 1.1707 + 0.4940i | 1.3617 + 0.4870i | 1.0203 + 0.6063i | 1.0247 + 0.7923i |
| 26 | 1.2103 + 0.9014i | 1.2323 + 0.6874i | 0.9022 + 1.1987i | 0.9925 + 0.9967i | 1.1677 + 0.4847i | 1.3547 + 0.4862i | 1.0215 + 0.6013i | 1.0233 + 0.7878i |

| SNR/w | w8 | w9 | w10 | w11 | w12 | w13 | w14 | w15 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i |
| 7 | 1.0751 + 0.6463i | 1.0751 + 0.6463i | 1.0751 + 0.6463i | 1.0751 + 0.6463i | 1.2330 + 0.3563i | 1.1130 + 0.3476i | 1.2330 + 0.3563i | 1.2330 + 0.3563i |
| 7.5 | 0.4541 + 0.2521i | 0.4541 + 0.2521i | 1.0186 + 0.5780i | 1.1198 + 0.6595i | 0.4541 + 0.2521i | 0.4541 + 0.2521i | 1.0186 + 0.5780i | 1.0186 + 0.5780i |
| 8 | 0.3059 + 1.2626i | 0.2951 + 1.1350i | 0.2951 + 1.1350i | 0.2951 + 1.1350i | 0.6749 + 1.1091i | 0.5912 + 1.0099i | 0.5912 + 1.0099i | 0.5912 + 1.0099i |
| 8.5 | 0.2880 + 1.2587i | 0.2778 + 1.1339i | 0.2778 + 1.1339i | 0.2778 + 1.1339i | 0.6879 + 1.1023i | 0.6039 + 1.0029i | 0.6039 + 1.0029i | 0.6039 + 1.0029i |
| 9 | 1.5505 + 1.0696i | 0.9224 + 0.9099i | 0.3155 + 1.4985i | 0.7236 + 0.9800i | 1.1886 + 1.6606i | 0.8973 + 0.9758i | 0.4528 + 1.5320i | 0.7212 + 1.0496i |
| 9.5 | 1.5654 + 1.1053i | 0.9312 + 0.9074i | 0.2863 + 1.5023i | 0.7311 + 0.9685i | 1.1323 + 1.6866i | 0.8963 + 0.9732i | 0.4510 + 1.5195i | 0.7234 + 1.0425i |
| 10 | 1.4799 − 0.9890i | 1.1939 − 0.7944i | 0.8996 − 0.5484i | 0.8996 − 0.5484i | 1.1939 − 0.7944i | 1.1939 − 0.7944i | 0.8996 − 0.5484i | 0.8996 − 0.5484i |
| 10.5 | 1.4880 − 0.9918i | 1.1916 − 0.7987i | 0.8869 − 0.5497i | 0.8869 − 0.5497i | 1.1916 − 0.7987i | 1.1916 − 0.7987i | 0.8869 − 0.5497i | 0.8869 − 0.5497i |
| 11 | 0.2256 + 1.0062i | 0.2256 + 1.0062i | 0.2256 + 1.0062i | 0.2256 + 1.0062i | 0.5533 + 0.8764i | 0.5533 + 0.8764i | 0.5533 + 0.8764i | 0.5533 + 0.8764i |
| 11.5 | 0.2176 + 1.0019i | 0.2176 + 1.0019i | 0.2176 + 1.0019i | 0.2176 + 1.0019i | 0.5582 + 0.8659i | 0.5582 + 0.8659i | 0.5582 + 0.8659i | 0.5582 + 0.8659i |
| 12 | 0.2025 + 1.0190i | 0.2025 + 1.0190i | 0.2025 + 1.0190i | 0.2025 + 1.0190i | 0.5763 + 0.8391i | 0.5763 + 0.8391i | 0.5763 + 0.8391i | 0.5763 + 0.8391i |
| 12.5 | 0.2101 + 1.0355i | 0.2101 + 1.0355i | 0.2101 + 1.0355i | 0.2101 + 1.0355i | 0.5983 + 0.8202i | 0.5983 + 0.8202i | 0.5983 + 0.8202i | 0.5983 + 0.8202i |
| 13 | 0.2408 + 0.9979i | 0.2750 + 1.0662i | 0.1741 + 1.0211i | 0.1849 + 1.1031i | 0.6002 + 0.8180i | 0.6002 + 0.8180i | 0.6515 + 0.7734i | 0.6002 + 0.8180i |
| 13.5 | 0.2553 + 0.9993i | 0.2988 + 1.0689i | 0.1656 + 1.0288i | 0.1779 + 1.1140i | 0.5795 + 0.8287i | 0.5795 + 0.8287i | 0.6595 + 0.7742i | 0.6595 + 0.7742i |
| 14 | 0.2659 + 0.9951i | 0.3199 + 1.0652i | 0.1586 + 1.0330i | 0.1732 + 1.1198i | 0.5798 + 0.8268i | 0.5798 + 0.8268i | 0.6663 + 0.7792i | 0.6663 + 0.7792i |
| 14.5 | 0.2918 + 0.9977i | 0.3457 + 1.0677i | 0.1513 + 1.0448i | 0.1608 + 1.1366i | 0.5795 + 0.7993i | 0.5814 + 0.8684i | 0.6788 + 0.7718i | 0.6788 + 0.7718i |
| 15 | 0.7901 + 1.2547i | 0.6026 + 1.0065i | 0.8074 + 1.0302i | 0.6026 + 1.0065i | 0.6083 + 0.6968i | 0.6083 + 0.6968i | 0.7056 + 0.6773i | 0.6083 + 0.6968i |
| 15.5 | 0.2231 + 1.7092i | 0.6616 + 0.9740i | 0.5030 + 1.4567i | 0.6230 + 1.1163i | 0.7013 + 0.6041i | 0.6841 + 0.7162i | 0.7013 + 0.6041i | 0.7013 + 0.6041i |
| 16 | 0.7189 + 1.2484i | 0.5519 + 1.0360i | 0.8125 + 0.9999i | 0.6001 + 0.9735i | 0.5867 + 0.6801i | 0.5867 + 0.6801i | 0.7357 + 0.7025i | 0.6195 + 0.7364i |
| 16.5 | 0.5954 + 1.6721i | 0.6356 + 0.9282i | 0.6612 + 1.3085i | 0.6870 + 0.9890i | 0.6139 + 0.5878i | 0.6161 + 0.6843i | 0.7069 + 0.5730i | 0.6968 + 0.6615i |
| 17 | 0.7916 + 1.5326i | 0.5781 + 0.9103i | 0.6737 + 1.2261i | 0.6488 + 0.9682i | 0.6008 + 0.5904i | 0.5968 + 0.6937i | 0.7280 + 0.5839i | 0.7207 + 0.6853i |
| 17.5 | 0.7546 + 1.5371i | 0.5791 + 0.9008i | 0.6529 + 1.2248i | 0.6563 + 0.9619i | 0.5998 + 0.5837i | 0.5965 + 0.6939i | 0.7601 + 0.5787i | 0.7439 + 0.6985i |
| 18 | 0.7460 + 1.5301i | 0.5607 + 0.8951i | 0.6305 + 1.2208i | 0.6414 + 0.9625i | 0.5848 + 0.5763i | 0.5797 + 0.7001i | 0.7518 + 0.5786i | 0.7339 + 0.7041i |
| 18.5 | 0.7388 + 1.5187i | 0.5534 + 0.8948i | 0.6245 + 1.2171i | 0.6469 + 0.9671i | 0.5816 + 0.5744i | 0.5746 + 0.7125i | 0.7634 + 0.5763i | 0.7384 + 0.7224i |
| 19 | 1.0419 + 1.2518i | 0.8657 + 1.0272i | 1.2891 + 1.0296i | 1.0567 + 0.8727i | 0.6260 + 0.6701i | 0.7308 + 0.8371i | 0.7597 + 0.5841i | 0.8864 + 0.7205i |
| 19.5 | 0.6600 + 1.2390i | 0.6575 + 0.9736i | 0.8905 + 1.1414i | 0.8571 + 0.9152i | 0.6106 + 0.5775i | 0.6382 + 0.7572i | 0.7620 + 0.5398i | 0.8086 + 0.7221i |
| 20 | 0.5458 + 1.2087i | 0.5280 + 0.9935i | 0.6621 + 1.4483i | 0.7224 + 0.9905i | 0.5909 + 0.6140i | 0.5567 + 0.7928i | 0.7623 + 0.6325i | 0.7410 + 0.7994i |
| 20.5 | 0.5495 + 1.2117i | 0.5295 + 0.9994i | 0.6564 + 1.4451i | 0.7273 + 1.0021i | 0.5962 + 0.6217i | 0.5627 + 0.8030i | 0.7674 + 0.6377i | 0.7457 + 0.8086i |
| 21 | 0.5460 + 1.2127i | 0.5252 + 1.0028i | 0.6465 + 1.4397i | 0.7242 + 1.0131i | 0.6013 + 0.6294i | 0.5660 + 0.8106i | 0.7730 + 0.6458i | 0.7464 + 0.8190i |
| 21.5 | 0.5373 + 1.2128i | 0.5165 + 1.0048i | 0.6343 + 1.4321i | 0.7152 + 1.0245i | 0.6073 + 0.6384i | 0.5684 + 0.8175i | 0.7801 + 0.6568i | 0.7459 + 0.8311i |

-continued

| | | | | | | | | |
|---|---|---|---|---|---|---|---|---|
| 22 | 0.5187 + 1.2127i | 0.4960 + 1.0047i | 0.6102 + 1.4243i | 0.6926 + 1.0375i | 0.6194 + 0.6507i | 0.5744 + 0.8249i | 0.7952 + 0.6762i | 0.7540 + 0.8498i |
| 22.5 | 0.5099 + 1.2100i | 0.4914 + 1.0072i | 0.5898 + 1.4201i | 0.6910 + 1.0470i | 0.6271 + 0.6619i | 0.5827 + 0.8346i | 0.8016 + 0.6867i | 0.7612 + 0.8629i |
| 23 | 0.5427 + 1.2003i | 0.5813 + 1.0089i | 0.5291 + 1.4273i | 0.7630 + 1.0578i | 0.6294 + 0.6610i | 0.6110 + 0.8310i | 0.7906 + 0.6835i | 0.7844 + 0.8645i |
| 23.5 | 0.4976 + 1.2018i | 0.4821 + 1.0103i | 0.5648 + 1.4016i | 0.6826 + 1.0558i | 0.6404 + 0.6801i | 0.5954 + 0.8500i | 0.8128 + 0.7021i | 0.7699 + 0.8797i |
| 24 | 0.5286 + 1.2013i | 0.6120 + 1.0209i | 0.7270 + 1.2479i | 0.7961 + 1.0299i | 0.6617 + 0.6693i | 0.6621 + 0.8401i | 0.8310 + 0.6617i | 0.8389 + 0.8357i |
| 24.5 | 0.5158 + 1.1967i | 0.6077 + 1.0231i | 0.7117 + 1.2419i | 0.7917 + 1.0319i | 0.6714 + 0.6767i | 0.6662 + 0.8463i | 0.8411 + 0.6694i | 0.8402 + 0.8434i |
| 25 | 0.5056 + 1.1921i | 0.6041 + 1.0245i | 0.7005 + 1.2353i | 0.7883 + 1.0319i | 0.6790 + 0.6831i | 0.6702 + 0.8514i | 0.8475 + 0.6749i | 0.8427 + 0.8479i |
| 25.5 | 0.4973 + 1.1878i | 0.6009 + 1.0255i | 0.6921 + 1.2284i | 0.7855 + 1.0302i | 0.6850 + 0.6886i | 0.6728 + 0.8554i | 0.8517 + 0.6775i | 0.8443 + 0.8495i |
| 26 | 0.4905 + 1.1842i | 0.5982 + 1.0262i | 0.6854 + 1.2221i | 0.7829 + 1.0274i | 0.6911 + 0.6930i | 0.6740 + 0.8584i | 0.8561 + 0.6778i | 0.8451 + 0.8492i |

| SNR/ w | w16 | w17 | w18 | w19 | w20 | w21 | w22 | w23 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i |
| 7 | 0.4673 + 0.2525i | 0.4673 + 0.2525i | 0.4673 + 0.2525i | 0.4673 + 0.2525i | 0.4673 + 0.2525i | 0.4673 + 0.2525i | 0.4673 + 0.2525i | 0.4673 + 0.2525i |
| 7.5 | 0.2521 + 0.4541i | 0.2521 + 0.4541i | 0.6595 + 1.1198i | 0.9931 + 1.5130i | 0.2521 + 0.4541i | 0.2521 + 0.4541i | 0.5780 + 1.0186i | 0.6595 + 1.1198i |
| 8 | 1.7813 + 0.3565i | 1.2626 + 0.3059i | 1.2626 + 0.3059i | 1.1350 + 0.2951i | 1.5146 + 1.0099i | 1.1091 + 0.6749i | 1.1091 + 0.6749i | 1.0099 + 0.5912i |
| 8.5 | 1.7914 + 0.3488i | 1.2587 + 0.2880i | 1.2587 + 0.2880i | 1.1339 + 0.2778i | 1.5168 + 1.0152i | 1.1023 + 0.6879i | 1.1023 + 0.6879i | 1.0029 + 0.6039i |
| 9 | 1.1563 + 0.2542i | 0.9312 + 0.3679i | 0.9277 + 0.2224i | 0.8427 + 0.3081i | 1.1563 + 0.2542i | 0.9312 + 0.3679i | 0.9277 + 0.2224i | 0.8427 + 0.3081i |
| 9.5 | 1.1947 + 0.2553i | 0.9334 + 0.3829i | 0.9095 + 0.2111i | 0.8351 + 0.3123i | 1.1947 + 0.2553i | 0.9334 + 0.3829i | 0.9095 + 0.2111i | 0.8351 + 0.3123i |
| 10 | 0.3146 − 0.1705i | 0.3146 − 0.1705i | 0.6218 − 0.2169i | 0.6218 − 0.2169i | 0.3146 − 0.1705i | 0.3146 − 0.1705i | 0.6218 − 0.2169i | 0.6218 − 0.2169i |
| 10.5 | 0.3056 − 0.1640i | 0.3056 − 0.1640i | 0.6406 − 0.2071i | 0.6406 − 0.2071i | 0.3056 − 0.1640i | 0.3056 − 0.1640i | 0.6406 − 0.2071i | 0.6406 − 0.2071i |
| 11 | 1.7631 + 0.3541i | 1.4060 + 0.2729i | 1.4060 + 0.2729i | 1.4060 + 0.2729i | 1.4961 + 0.9954i | 1.1885 + 0.7994i | 1.1885 + 0.7994i | 1.1885 + 0.7994i |
| 11.5 | 1.4044 + 0.2728i | 1.7739 + 0.3559i | 1.4044 + 0.2728i | 1.4044 + 0.2728i | 1.1874 + 0.7969i | 1.5057 + 1.0025i | 1.1874 + 0.7969i | 1.1874 + 0.7969i |
| 12 | 1.3658 + 0.2176i | 1.7227 + 0.2900i | 1.3658 + 0.2176i | 1.3636 + 0.3654i | 1.3708 + 1.2834i | 1.6701 + 0.8403i | 1.1927 + 0.7638i | 1.1927 + 0.7638i |
| 12.5 | 1.4067 + 0.1623i | 1.7386 + 0.2869i | 1.3213 + 0.2614i | 1.3555 + 0.3818i | 1.3728 + 1.2802i | 1.6730 + 0.8349i | 1.1933 + 0.7386i | 1.1933 + 0.7386i |
| 13 | 1.4076 + 0.1477i | 1.7480 + 0.2870i | 1.3169 + 0.2677i | 1.3479 + 0.3950i | 1.3698 + 1.2765i | 1.6671 + 0.8318i | 1.1603 + 0.7369i | 1.2208 + 0.7017i |
| 13.5 | 1.4079 + 0.1358i | 1.7492 + 0.2856i | 1.3108 + 0.2733i | 1.3393 + 0.4031i | 1.3733 + 1.2596i | 1.6601 + 0.8198i | 1.1559 + 0.7249i | 1.2163 + 0.6897i |
| 14 | 1.3832 + 0.1273i | 1.7176 + 0.2506i | 1.2890 + 0.2587i | 1.3115 + 0.3882i | 1.4490 + 1.1367i | 1.6791 + 0.7233i | 1.1637 + 0.7318i | 1.2117 + 0.6596i |
| 14.5 | 1.3830 + 0.1182i | 1.7146 + 0.2469i | 1.2824 + 0.2560i | 1.3020 + 0.3885i | 1.4514 + 1.1095i | 1.6674 + 0.7048i | 1.1614 + 0.7220i | 1.2096 + 0.6442i |
| 15 | 0.9728 + 0.1097i | 0.9728 + 0.1097i | 0.9203 + 0.1683i | 0.9203 + 0.1683i | 1.3276 + 0.1371i | 1.2605 + 0.2607i | 0.9985 + 0.4136i | 0.9985 + 0.4136i |
| 15.5 | 1.7803 + 0.2282i | 1.4175 + 0.1304i | 1.0142 + 0.1107i | 1.0875 + 0.1106i | 1.5669 + 0.6281i | 1.3668 + 0.3723i | 1.0499 + 0.3395i | 1.0499 + 0.3395i |
| 16 | 0.9770 + 0.1124i | 0.9770 + 0.1124i | 0.9145 + 0.1775i | 0.9145 + 0.1775i | 1.3198 + 0.1175i | 1.2383 + 0.2709i | 0.9483 + 0.4442i | 1.0242 + 0.4164i |
| 16.5 | 1.6501 + 0.1602i | 1.3265 + 0.1294i | 0.9609 + 0.1136i | 1.0472 + 0.1153i | 1.6046 + 0.4875i | 1.2991 + 0.3994i | 0.9506 + 0.3440i | 1.0402 + 0.3427i |
| 17 | 1.3221 + 0.1224i | 1.6557 + 0.1780i | 1.0381 + 0.1026i | 0.9427 + 0.1024i | 1.2802 + 0.3500i | 1.5980 + 0.5501i | 0.9903 + 0.3365i | 0.9340 + 0.2929i |
| 17.5 | 1.3275 + 0.1269i | 1.6476 + 0.1778i | 1.0687 + 0.1009i | 0.9443 + 0.0988i | 1.2837 + 0.3590i | 1.5920 + 0.5468i | 1.0024 + 0.3379i | 0.9388 + 0.2809i |
| 18 | 1.3214 + 0.1348i | 1.6192 + 0.1568i | 1.0864 + 0.1085i | 0.9690 + 0.1136i | 1.2847 + 0.3887i | 1.5877 + 0.4787i | 1.0252 + 0.3747i | 0.9593 + 0.3085i |
| 18.5 | 1.3267 + 0.1381i | 1.6139 + 0.1586i | 1.1074 + 0.1075i | 0.9719 + 0.1124i | 1.2798 + 0.3928i | 1.5690 + 0.4783i | 1.0323 + 0.3791i | 0.9610 + 0.2983i |

-continued

| | | | | | | | | |
|---|---|---|---|---|---|---|---|---|
| 19 | 0.8708 + 0.0767i | 0.8708 + 0.0767i | 0.6723 + 0.1053i | 0.6723 + 0.1053i | 0.9883 + 0.2131i | 1.1539 + 0.0898i | 0.7883 + 0.3358i | 0.7109 + 0.2753i |
| 19.5 | 1.5486 + 0.1257i | 1.2666 + 0.1072i | 0.9028 + 0.1029i | 1.0498 + 0.1027i | 1.4788 + 0.3590i | 1.2369 + 0.3451i | 0.9051 + 0.3205i | 1.0533 + 0.3050i |
| 20 | 1.5281 + 0.1441i | 1.2566 + 0.1120i | 0.9743 + 0.0673i | 1.0261 + 0.1720i | 1.4715 + 0.4355i | 1.2435 + 0.3351i | 0.9816 + 0.4825i | 1.0252 + 0.3371i |
| 20.5 | 1.5048 + 0.1396i | 1.2429 + 0.1109i | 0.9704 + 0.0648i | 1.0197 + 0.1762i | 1.4594 + 0.4244i | 1.2338 + 0.3332i | 0.9790 + 0.4840i | 1.0192 + 0.3364i |
| 21 | 1.4884 + 0.1372i | 1.2362 + 0.1109i | 0.9743 + 0.0635i | 1.0194 + 0.1825i | 1.4526 + 0.4196i | 1.2302 + 0.3337i | 0.9804 + 0.4906i | 1.0189 + 0.3404i |
| 21.5 | 1.4742 + 0.1349i | 1.2309 + 0.1105i | 0.9796 + 0.0634i | 1.0198 + 0.1891i | 1.4461 + 0.4142i | 1.2279 + 0.3323i | 0.9827 + 0.4998i | 1.0202 + 0.3467i |
| 22 | 1.4534 + 0.1259i | 1.2190 + 0.1086i | 0.9789 + 0.0639i | 1.0144 + 0.1947i | 1.4356 + 0.3854i | 1.2194 + 0.3249i | 0.9844 + 0.5115i | 1.0179 + 0.3535i |
| 22.5 | 1.4370 + 0.1217i | 1.2104 + 0.1069i | 0.9794 + 0.0652i | 1.0117 + 0.2003i | 1.4268 + 0.3730i | 1.2148 + 0.3198i | 0.9818 + 0.5182i | 1.0172 + 0.3596i |
| 23 | 1.1919 + 0.0896i | 1.4034 + 0.1266i | 1.0017 + 0.0743i | 0.9909 + 0.2196i | 1.2082 + 0.5145i | 1.2105 + 0.3132i | 1.0055 + 0.5362i | 1.0096 + 0.3698i |
| 23.5 | 1.4070 + 0.1153i | 1.1945 + 0.1045i | 0.9784 + 0.0686i | 1.0093 + 0.2102i | 1.4123 + 0.3539i | 1.2076 + 0.3137i | 0.9768 + 0.5294i | 1.0171 + 0.3701i |
| 24 | 1.1265 + 0.0892i | 1.3157 + 0.0959i | 0.9524 + 0.0776i | 0.9403 + 0.2321i | 1.4948 + 0.2501i | 1.2660 + 0.2959i | 0.9649 + 0.4426i | 1.0812 + 0.3131i |
| 24.5 | 1.1278 + 0.0893i | 1.3152 + 0.0946i | 0.9556 + 0.0782i | 0.9422 + 0.2341i | 1.4851 + 0.2508i | 1.2669 + 0.2917i | 0.9719 + 0.4412i | 1.0855 + 0.3077i |
| 25 | 1.1316 + 0.0895i | 1.3173 + 0.0939i | 0.9608 + 0.0790i | 0.9429 + 0.2357i | 1.4766 + 0.2540i | 1.2666 + 0.2886i | 0.9763 + 0.4381i | 1.0887 + 0.3028i |
| 25.5 | 1.1477 + 0.0888i | 1.3330 + 0.0946i | 0.9772 + 0.0808i | 0.9387 + 0.2361i | 1.4686 + 0.2702i | 1.2647 + 0.2863i | 0.9779 + 0.4321i | 1.0881 + 0.2935i |
| 26 | 1.1595 + 0.0882i | 1.3430 + 0.0950i | 0.9894 + 0.0820i | 0.9367 + 0.2358i | 1.4613 + 0.2782i | 1.2637 + 0.2839i | 0.9800 + 0.4265i | 1.0889 + 0.2858i |

| SNR/w | w24 | w25 | w26 | w27 | w28 | w29 | w30 | w31 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i |
| 7 | 0.4673 + 0.2525i | 0.4673 + 0.2525i | 0.4673 + 0.2525i | 0.4673 + 0.2525i | 0.4673 + 0.2525i | 0.4673 + 0.2525i | 0.4673 + 0.2525i | 0.4673 + 0.2525i |
| 7.5 | 0.4541 + 0.2521i | 0.4541 + 0.2521i | 1.1198 + 0.6595i | 1.5130 + 0.9931i | 0.4541 + 0.2521i | 0.4541 + 0.2521i | 1.0186 + 0.5780i | 1.1198 + 0.6595i |
| 8 | 1.2626 + 0.3059i | 1.1350 + 0.2951i | 1.1350 + 0.2951i | 1.1350 + 0.2951i | 1.1091 + 0.6749i | 1.0099 + 0.5912i | 1.0099 + 0.5912i | 1.0099 + 0.5912i |
| 8.5 | 1.2587 + 0.2880i | 1.1339 + 0.2778i | 1.1339 + 0.2778i | 1.1339 + 0.2778i | 1.1023 + 0.6879i | 1.0029 + 0.6039i | 1.0029 + 0.6039i | 1.0029 + 0.6039i |
| 9 | 0.9277 + 0.2224i | 0.9312 + 0.3679i | 0.9277 + 0.2224i | 0.8427 + 0.3081i | 0.9277 + 0.2224i | 0.8427 + 0.3081i | 0.9277 + 0.2224i | 0.8427 + 0.3081i |
| 9.5 | 1.0053 + 0.2519i | 0.9334 + 0.3829i | 0.9095 + 0.2111i | 0.8351 + 0.3123i | 0.9095 + 0.2111i | 0.8351 + 0.3123i | 0.9095 + 0.2111i | 0.8351 + 0.3123i |
| 10 | 0.3146 − 0.1705i | 0.3146 − 0.1705i | 0.5800 − 0.3158i | 0.5800 − 0.3158i | 0.3146 − 0.1705i | 0.3146 − 0.1705i | 0.5800 − 0.3158i | 0.5800 − 0.3158i |
| 10.5 | 0.3056 − 0.1640i | 0.3056 − 0.1640i | 0.5895 − 0.3251i | 0.5895 − 0.3251i | 0.3056 − 0.1640i | 0.3056 − 0.1640i | 0.5895 − 0.3251i | 0.5895 − 0.3251i |
| 11 | 1.0064 + 0.2256i | 1.0064 + 0.2256i | 1.0064 + 0.2256i | 1.0064 + 0.2256i | 0.8765 + 0.5534i | 0.8765 + 0.5534i | 0.8765 + 0.5534i | 0.8765 + 0.5534i |
| 11.5 | 1.0019 + 0.2166i | 1.0019 + 0.2166i | 1.0019 + 0.2166i | 1.0019 + 0.2166i | 0.8673 + 0.5553i | 0.8673 + 0.5553i | 0.8673 + 0.5553i | 0.8673 + 0.5553i |
| 12 | 0.9779 + 0.2130i | 0.9779 + 0.2130i | 0.9779 + 0.2130i | 0.9779 + 0.2130i | 0.8517 + 0.5110i | 0.8517 + 0.5110i | 0.8517 + 0.5110i | 0.8517 + 0.5110i |
| 12.5 | 0.9685 + 0.1988i | 0.9685 + 0.1988i | 0.9685 + 0.1988i | 0.9685 + 0.1988i | 0.8450 + 0.4843i | 0.8450 + 0.4843i | 0.8450 + 0.4843i | 0.8450 + 0.4843i |
| 13 | 0.9627 + 0.1873i | 0.9627 + 0.1873i | 0.9627 + 0.1873i | 0.9627 + 0.1873i | 0.8114 + 0.4387i | 0.8114 + 0.4387i | 0.8656 + 0.4956i | 0.8656 + 0.4956i |
| 13.5 | 0.9601 + 0.1792i | 0.9601 + 0.1792i | 0.9601 + 0.1792i | 0.9601 + 0.1792i | 0.8069 + 0.4342i | 0.8069 + 0.4342i | 0.8601 + 0.4908i | 0.8601 + 0.4908i |
| 14 | 0.9497 + 0.1757i | 0.9497 + 0.1757i | 0.9497 + 0.1757i | 0.9497 + 0.1757i | 0.8010 + 0.4478i | 0.8010 + 0.4478i | 0.8569 + 0.5016i | 0.8569 + 0.5016i |
| 14.5 | 0.9458 + 0.1698i | 0.9458 + 0.1698i | 0.9458 + 0.1698i | 0.9458 + 0.1698i | 0.8013 + 0.4424i | 0.8013 + 0.4424i | 0.8556 + 0.4991i | 0.8556 + 0.4991i |
| 15 | 0.6408 + 0.1433i | 0.6408 + 0.1433i | 0.6408 + 0.1433i | 0.6408 + 0.1433i | 0.6279 + 0.4093i | 0.6279 + 0.4093i | 0.6279 + 0.4093i | 0.6279 + 0.4093i |
| 15.5 | 0.6290 + 0.1097i | 0.6290 + 0.1097i | 0.7248 + 0.1111i | 0.7248 + 0.1111i | 0.6341 + 0.3248i | 0.6341 + 0.3248i | 0.7151 + 0.3328i | 0.7151 + 0.3328i |

-continued

| | | | | | | | | |
|---|---|---|---|---|---|---|---|---|
| 16 | 0.6443 + 0.1428i | 0.6443 + 0.1428i | 0.6443 + 0.1428i | 0.6443 + 0.1428i | 0.6206 + 0.4154i | 0.6206 + 0.4154i | 0.6844 + 0.4315i | 0.6206 + 0.4154i |
| 16.5 | 0.5984 + 0.1101i | 0.5984 + 0.1101i | 0.7019 + 0.1112i | 0.7019 + 0.1112i | 0.5958 + 0.3406i | 0.5958 + 0.3406i | 0.6854 + 0.3378i | 0.6854 + 0.3378i |
| 17 | 0.5882 + 0.1166i | 0.5882 + 0.1166i | 0.6862 + 0.1090i | 0.6862 + 0.1090i | 0.5970 + 0.3582i | 0.5970 + 0.3582i | 0.7132 + 0.3488i | 0.7132 + 0.3488i |
| 17.5 | 0.5867 + 0.1202i | 0.5867 + 0.1202i | 0.6979 + 0.1065i | 0.6979 + 0.1065i | 0.5964 + 0.3618i | 0.5964 + 0.3618i | 0.7385 + 0.3474i | 0.7385 + 0.3474i |
| 18 | 0.5972 + 0.1204i | 0.5972 + 0.1204i | 0.7450 + 0.1071i | 0.7450 + 0.1071i | 0.5959 + 0.3561i | 0.5959 + 0.3561i | 0.7535 + 0.3905i | 0.7704 + 0.3249i |
| 18.5 | 0.5962 + 0.1221i | 0.5962 + 0.1221i | 0.7314 + 0.0890i | 0.7775 + 0.1184i | 0.5953 + 0.3915i | 0.5975 + 0.3225i | 0.7649 + 0.4029i | 0.7817 + 0.3156i |
| 19 | 0.4351 + 0.0785i | 0.4574 + 0.2064i | 0.4351 + 0.0785i | 0.4574 + 0.2064i | 0.5409 + 0.5182i | 0.4759 + 0.3755i | 0.6422 + 0.4556i | 0.5543 + 0.3409i |
| 19.5 | 0.5174 + 0.0970i | 0.5174 + 0.0970i | 0.7398 + 0.0890i | 0.6724 + 0.1233i | 0.5700 + 0.4187i | 0.5429 + 0.2967i | 0.7319 + 0.3429i | 0.6646 + 0.2744i |
| 20 | 0.6423 + 0.0698i | 0.6358 + 0.1904i | 0.8003 + 0.0754i | 0.8009 + 0.2018i | 0.6132 + 0.4606i | 0.6264 + 0.3286i | 0.7906 + 0.4757i | 0.8007 + 0.3342i |
| 20.5 | 0.6384 + 0.0678i | 0.6332 + 0.1948i | 0.7968 + 0.0730i | 0.8000 + 0.2036i | 0.6160 + 0.4668i | 0.6266 + 0.3299i | 0.7913 + 0.4796i | 0.8013 + 0.3338i |
| 21 | 0.6429 + 0.0675i | 0.6384 + 0.1981i | 0.8011 + 0.0721i | 0.8064 + 0.2059i | 0.6220 + 0.4731i | 0.6327 + 0.3327i | 0.7953 + 0.4864i | 0.8070 + 0.3371i |
| 21.5 | 0.6501 + 0.0680i | 0.6464 + 0.2016i | 0.8075 + 0.0719i | 0.8146 + 0.2088i | 0.6296 + 0.4809i | 0.6412 + 0.3374i | 0.8008 + 0.4955i | 0.8141 + 0.3431i |
| 22 | 0.6546 + 0.0693i | 0.6531 + 0.2062i | 0.8096 + 0.0722i | 0.8191 + 0.2122i | 0.6400 + 0.4925i | 0.6498 + 0.3451i | 0.8073 + 0.5082i | 0.8199 + 0.3516i |
| 22.5 | 0.6581 + 0.0702i | 0.6580 + 0.2095i | 0.8121 + 0.0727i | 0.8228 + 0.2154i | 0.6452 + 0.5010i | 0.6552 + 0.3508i | 0.8087 + 0.5167i | 0.8230 + 0.3582i |
| 23 | 0.6613 + 0.0692i | 0.6601 + 0.2094i | 0.8231 + 0.0709i | 0.8202 + 0.2164i | 0.6479 + 0.5023i | 0.6570 + 0.3532i | 0.8160 + 0.5191i | 0.8231 + 0.3662i |
| 23.5 | 0.6618 + 0.0721i | 0.6653 + 0.2161i | 0.8148 + 0.0743i | 0.8285 + 0.2219i | 0.6524 + 0.5156i | 0.6640 + 0.3620i | 0.8099 + 0.5313i | 0.8291 + 0.3705i |
| 24 | 0.6277 + 0.0697i | 0.6260 + 0.2109i | 0.7852 + 0.0706i | 0.7804 + 0.2127i | 0.6444 + 0.5097i | 0.6285 + 0.3572i | 0.8056 + 0.5017i | 0.7792 + 0.3548i |
| 24.5 | 0.6341 + 0.0711i | 0.6317 + 0.2150i | 0.7905 + 0.0716i | 0.7839 + 0.2154i | 0.6537 + 0.5167i | 0.6360 + 0.3632i | 0.8156 + 0.5101i | 0.7875 + 0.3608i |
| 25 | 0.6408 + 0.0723i | 0.6355 + 0.2186i | 0.7969 + 0.0724i | 0.7860 + 0.2176i | 0.6614 + 0.5229i | 0.6414 + 0.3685i | 0.8234 + 0.5160i | 0.7936 + 0.3653i |
| 25.5 | 0.6523 + 0.0731i | 0.6352 + 0.2218i | 0.8115 + 0.0731i | 0.7837 + 0.2189i | 0.6674 + 0.5284i | 0.6441 + 0.3734i | 0.8292 + 0.5189i | 0.7961 + 0.3682i |
| 26 | 0.6622 + 0.0739i | 0.6337 + 0.2246i | 0.8231 + 0.0739i | 0.7818 + 0.2196i | 0.6739 + 0.5331i | 0.6474 + 0.3777i | 0.8353 + 0.5198i | 0.7994 + 0.3695i |

| SNR/ w | w32 | w33 | w34 | w35 | w36 | w37 | w38 | w39 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i |
| 7 | 0.5496 + 1.0771i | 0.5496 + 1.0771i | 0.7162 + 1.3338i | 0.5496 + 1.0771i | 0.3537 + 1.2031i | 0.3537 + 1.2031i | 0.4291 + 1.7565i | 0.3537 + 1.2031i |
| 7.5 | 0.2521 + 0.4541i | 0.2521 + 0.4541i | 0.3162 + 1.1348i | 0.3279 + 1.2665i | 0.2521 + 0.4541i | 0.2521 + 0.4541i | 0.3162 + 1.1348i | 0.3162 + 1.1348i |
| 8 | 0.2309 + 0.4131i | 0.2309 + 0.4131i | 0.2309 + 0.4131i | 0.2594 + 0.4923i | 0.2309 + 0.4131i | 0.2309 + 0.4131i | 0.2309 + 0.4131i | 0.2594 + 0.4923i |
| 8.5 | 0.2243 + 0.4147i | 0.2243 + 0.4147i | 0.2243 + 0.4147i | 0.2552 + 0.5023i | 0.2243 + 0.4147i | 0.2243 + 0.4147i | 0.2243 + 0.4147i | 0.2552 + 0.5023i |
| 9 | 0.2226 + 0.6803i | 0.2226 + 0.6803i | 0.1918 + 0.8048i | 0.2852 + 0.7636i | 0.2226 + 0.6803i | 0.2226 + 0.6803i | 0.1918 + 0.8048i | 0.2852 + 0.7636i |
| 9.5 | 0.2158 + 0.6823i | 0.2158 + 0.6823i | 0.1923 + 0.8151i | 0.2969 + 0.7633i | 0.2158 + 0.6823i | 0.2158 + 0.6823i | 0.1923 + 0.8151i | 0.2969 + 0.7633i |
| 10 | 0.3437 − 1.7476i | 0.2782 − 1.4030i | 0.2443 − 1.0199i | 0.2443 − 1.0199i | 0.2782 − 1.4030i | 0.2782 − 1.4030i | 0.2443 − 1.0199i | 0.2443 − 1.0199i |
| 10.5 | 0.3495 − 1.7549i | 0.2747 − 1.4067i | 0.2349 − 1.0113i | 0.2349 − 1.0113i | 0.2747 − 1.4067i | 0.2747 − 1.4067i | 0.2349 − 1.0113i | 0.2349 − 1.0113i |
| 11 | 0.1598 + 0.3010i | 0.1598 + 0.3010i | 0.1598 + 0.3010i | 0.1598 + 0.3010i | 0.1598 + 0.3010i | 0.1598 + 0.3010i | 0.1598 + 0.3010i | 0.1598 + 0.3010i |
| 11.5 | 0.1564 + 0.3007i | 0.1564 + 0.3007i | 0.1564 + 0.3007i | 0.1564 + 0.3007i | 0.1564 + 0.3007i | 0.1564 + 0.3007i | 0.1564 + 0.3007i | 0.1564 + 0.3007i |
| 12 | 0.1509 + 0.3272i | 0.1509 + 0.3272i | 0.1509 + 0.3272i | 0.1509 + 0.3272i | 0.1509 + 0.3272i | 0.1509 + 0.3272i | 0.1509 + 0.3272i | 0.1509 + 0.3272i |
| 12.5 | 0.1481 + 0.3696i | 0.1481 + 0.3696i | 0.1481 + 0.3696i | 0.1481 + 0.3696i | 0.1481 + 0.3696i | 0.1481 + 0.3696i | 0.1481 + 0.3696i | 0.1481 + 0.3696i |

-continued

| | | | | | | | | |
|---|---|---|---|---|---|---|---|---|
| 13 | 0.1468 + 0.3993i | 0.1468 + 0.3993i | 0.1468 + 0.3993i | 0.1468 + 0.3993i | 0.1468 + 0.3993i | 0.1468 + 0.3993i | 0.1468 + 0.3993i | 0.1468 + 0.3993i |
| 13.5 | 0.1463 + 0.4129i | 0.1463 + 0.4129i | 0.1463 + 0.4129i | 0.1463 + 0.4129i | 0.1463 + 0.4129i | 0.1463 + 0.4129i | 0.1463 + 0.4129i | 0.1463 + 0.4129i |
| 14 | 0.1450 + 0.4179i | 0.1450 + 0.4179i | 0.1450 + 0.4179i | 0.1450 + 0.4179i | 0.1450 + 0.4179i | 0.1450 + 0.4179i | 0.1450 + 0.4179i | 0.1450 + 0.4179i |
| 14.5 | 0.1157 + 0.4495i | 0.1157 + 0.4495i | 0.1157 + 0.4495i | 0.1157 + 0.4495i | 0.1754 + 0.4094i | 0.1754 + 0.4094i | 0.1754 + 0.4094i | 0.1754 + 0.4094i |
| 15 | 0.2366 + 1.7925i | 0.1132 + 1.0217i | 0.1343 + 1.4263i | 0.1131 + 1.0934i | 0.1115 + 0.6331i | 0.1131 + 0.7237i | 0.1115 + 0.6331i | 0.1131 + 0.7237i |
| 15.5 | 0.1106 + 0.9815i | 0.1744 + 0.9230i | 0.1106 + 0.9815i | 0.1744 + 0.9230i | 0.1418 + 0.6437i | 0.1418 + 0.6437i | 0.1418 + 0.6437i | 0.1418 + 0.6437i |
| 16 | 0.1430 + 1.4001i | 0.1156 + 1.1081i | 0.1884 + 1.7333i | 0.1078 + 1.0066i | 0.1070 + 0.6209i | 0.1070 + 0.7219i | 0.1070 + 0.6209i | 0.1070 + 0.7219i |
| 16.5 | 0.1053 + 1.2977i | 0.1383 + 0.9835i | 0.1785 + 1.2326i | 0.1383 + 0.9835i | 0.1172 + 0.6177i | 0.1219 + 0.7208i | 0.1172 + 0.6177i | 0.1219 + 0.7208i |
| 17 | 0.1490 + 1.6173i | 0.1183 + 0.9591i | 0.1303 + 1.3054i | 0.1236 + 1.0413i | 0.1097 + 0.6047i | 0.1155 + 0.7211i | 0.1097 + 0.6047i | 0.1155 + 0.7211i |
| 17.5 | 0.1411 + 1.5896i | 0.1170 + 0.9512i | 0.1278 + 1.2852i | 0.1257 + 1.0327i | 0.1073 + 0.5955i | 0.1161 + 0.7305i | 0.1073 + 0.5955i | 0.1161 + 0.7305i |
| 18 | 0.1396 + 1.5775i | 0.1131 + 0.9418i | 0.1242 + 1.2789i | 0.1226 + 1.0347i | 0.1041 + 0.5771i | 0.1143 + 0.7318i | 0.1041 + 0.5771i | 0.1143 + 0.7318i |
| 18.5 | 0.1401 + 1.5712i | 0.1104 + 0.9411i | 0.1233 + 1.2808i | 0.1220 + 1.0474i | 0.1020 + 0.5694i | 0.1145 + 0.7394i | 0.1020 + 0.5694i | 0.1145 + 0.7394i |
| 19 | 0.1202 + 1.4352i | 0.0996 + 1.2052i | 0.2171 + 1.6874i | 0.2773 + 1.1812i | 0.0839 + 0.8147i | 0.0834 + 0.9964i | 0.1971 + 0.8041i | 0.2436 + 0.9839i |
| 19.5 | 0.1542 + 1.5593i | 0.0710 + 0.9899i | 0.1176 + 1.2799i | 0.1750 + 1.0404i | 0.0755 + 0.6559i | 0.0799 + 0.8133i | 0.1865 + 0.6474i | 0.2027 + 0.8117i |
| 20 | 0.1167 + 1.2700i | 0.0962 + 1.0708i | 0.1297 + 1.5321i | 0.0883 + 0.8994i | 0.0749 + 0.5327i | 0.0612 + 0.6589i | 0.1829 + 0.5465i | 0.1233 + 0.7216i |
| 20.5 | 0.1161 + 1.2756i | 0.0974 + 1.0790i | 0.1295 + 1.5298i | 0.0884 + 0.9064i | 0.0720 + 0.5415i | 0.0591 + 0.6728i | 0.1883 + 0.5570i | 0.1297 + 0.7318i |
| 21 | 0.1140 + 1.2762i | 0.0978 + 1.0812i | 0.1280 + 1.5231i | 0.0867 + 0.9060i | 0.0704 + 0.5429i | 0.0574 + 0.6772i | 0.1921 + 0.5608i | 0.1353 + 0.7334i |
| 21.5 | 0.1108 + 1.2731i | 0.0977 + 1.0794i | 0.1256 + 1.5126i | 0.0853 + 0.9029i | 0.0694 + 0.5429i | 0.0985 + 0.7061i | 0.1945 + 0.5628i | 0.0985 + 0.7061i |
| 22 | 0.1045 + 1.2645i | 0.0959 + 1.0725i | 0.1201 + 1.4962i | 0.0871 + 0.8987i | 0.0687 + 0.5451i | 0.1018 + 0.7086i | 0.1961 + 0.5662i | 0.1018 + 0.7086i |
| 22.5 | 0.1015 + 1.2588i | 0.0952 + 1.0704i | 0.1161 + 1.4831i | 0.0884 + 0.8992i | 0.0685 + 0.5510i | 0.0545 + 0.6912i | 0.1980 + 0.5732i | 0.1557 + 0.7375i |
| 23 | 0.1141 + 1.4950i | 0.0679 + 0.9023i | 0.1059 + 1.2572i | 0.1019 + 1.0664i | 0.0653 + 0.5841i | 0.0662 + 0.7419i | 0.2015 + 0.5913i | 0.1899 + 0.7378i |
| 23.5 | 0.0985 + 1.2520i | 0.0938 + 1.0710i | 0.1114 + 1.4628i | 0.0905 + 0.9054i | 0.0693 + 0.5689i | 0.0563 + 0.7102i | 0.2034 + 0.5915i | 0.1695 + 0.7506i |
| 24 | 0.0901 + 1.1911i | 0.0801 + 1.0038i | 0.1106 + 1.4060i | 0.2328 + 0.9654i | 0.0680 + 0.6561i | 0.0697 + 0.8236i | 0.2070 + 0.6480i | 0.2108 + 0.8051i |
| 24.5 | 0.0894 + 1.1877i | 0.0808 + 1.0036i | 0.1074 + 1.3967i | 0.2340 + 0.9604i | 0.0695 + 0.6593i | 0.0707 + 0.8259i | 0.2118 + 0.6478i | 0.2131 + 0.8017i |
| 25 | 0.0890 + 1.1877i | 0.0816 + 1.0065i | 0.1053 + 1.3909i | 0.2349 + 0.9570i | 0.0709 + 0.6644i | 0.0718 + 0.8309i | 0.2160 + 0.6470i | 0.2150 + 0.7989i |
| 25.5 | 0.0889 + 1.1889i | 0.0823 + 1.0105i | 0.1037 + 1.3867i | 0.2355 + 0.9547i | 0.0721 + 0.6705i | 0.0727 + 0.8369i | 0.2196 + 0.6455i | 0.2165 + 0.7966i |
| 26 | 0.0888 + 1.1903i | 0.0829 + 1.0145i | 0.1023 + 1.3833i | 0.2357 + 0.9536i | 0.0732 + 0.6770i | 0.0737 + 0.8430i | 0.2228 + 0.6437i | 0.2175 + 0.7949i |

| SNR/w | w40 | w41 | w42 | w43 | w44 | w45 | w46 | w47 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i |
| 7 | 0.5496 + 1.0771i | 0.5496 + 1.0771i | 0.5496 + 1.0771i | 0.5496 + 1.0771i | 0.3537 + 1.2031i | 0.3344 + 1.0806i | 0.3537 + 1.2031i | 0.3537 + 1.2031i |
| 7.5 | 0.4541 + 0.2521i | 0.4541 + 0.2521i | 1.1348 + 0.3162i | 1.2665 + 0.3279i | 0.4541 + 0.2521i | 0.4541 + 0.2521i | 1.1348 + 0.3162i | 1.1348 + 0.3162i |
| 8 | 0.2309 + 0.4131i | 0.2594 + 0.4923i | 0.2594 + 0.4923i | 0.2594 + 0.4923i | 0.2309 + 0.4131i | 0.2594 + 0.4923i | 0.2594 + 0.4923i | 0.2594 + 0.4923i |
| 8.5 | 0.2243 + 0.4147i | 0.2552 + 0.5023i | 0.2552 + 0.5023i | 0.2552 + 0.5023i | 0.2243 + 0.4147i | 0.2552 + 0.5023i | 0.2552 + 0.5023i | 0.2552 + 0.5023i |
| 9 | 0.2226 + 0.6803i | 0.2226 + 0.6803i | 0.1918 + 0.8048i | 0.2852 + 0.7636i | 0.2226 + 0.6803i | 0.2226 + 0.6803i | 0.1918 + 0.8048i | 0.2852 + 0.7636i |
| 9.5 | 0.2158 + 0.6823i | 0.2158 + 0.6823i | 0.1923 + 0.8151i | 0.2969 + 0.7633i | 0.2158 + 0.6823i | 0.2653 + 0.6756i | 0.1923 + 0.8151i | 0.2969 + 0.7633i |

-continued

| | | | | | | | | |
|---|---|---|---|---|---|---|---|---|
| 10 | 0.9890 − 1.4799i | 0.7944 − 1.1939i | 0.5484 − 0.8996i | 0.5484 − 0.8996i | 0.7944 − 1.1939i | 0.7944 − 1.1939i | 0.5484 − 0.8996i | 0.5484 − 0.8996i |
| 10.5 | 0.9918 − 1.4880i | 0.7987 − 1.1916i | 0.5497 − 0.8869i | 0.5497 − 0.8869i | 0.7987 − 1.1916i | 0.7987 − 1.1916i | 0.5497 − 0.8869i | 0.5497 − 0.8869i |
| 11 | 0.1969 + 0.6553i | 0.1969 + 0.6553i | 0.1969 + 0.6553i | 0.1969 + 0.6553i | 0.3348 + 0.5953i | 0.3348 + 0.5953i | 0.3348 + 0.5953i | 0.3348 + 0.5953i |
| 11.5 | 0.1877 + 0.6663i | 0.1877 + 0.6663i | 0.1877 + 0.6663i | 0.1877 + 0.6663i | 0.3449 + 0.5981i | 0.3449 + 0.5981i | 0.3449 + 0.5981i | 0.3449 + 0.5981i |
| 12 | 0.1786 + 0.6836i | 0.1786 + 0.6836i | 0.1786 + 0.6836i | 0.1786 + 0.6836i | 0.3585 + 0.6001i | 0.3585 + 0.6001i | 0.3585 + 0.6001i | 0.3585 + 0.6001i |
| 12.5 | 0.1783 + 0.7098i | 0.1783 + 0.7098i | 0.1783 + 0.7098i | 0.1783 + 0.7098i | 0.3778 + 0.6041i | 0.3778 + 0.6041i | 0.3778 + 0.6041i | 0.3778 + 0.6041i |
| 13 | 0.1775 + 0.7313i | 0.1775 + 0.7313i | 0.1775 + 0.7313i | 0.1775 + 0.7313i | 0.3914 + 0.6049i | 0.3914 + 0.6049i | 0.3914 + 0.6049i | 0.3914 + 0.6049i |
| 13.5 | 0.1744 + 0.7444i | 0.1744 + 0.7444i | 0.1744 + 0.7444i | 0.1744 + 0.7444i | 0.3995 + 0.6028i | 0.3995 + 0.6028i | 0.3995 + 0.6028i | 0.3995 + 0.6028i |
| 14 | 0.1708 + 0.7511i | 0.1708 + 0.7511i | 0.1708 + 0.7511i | 0.1708 + 0.7511i | 0.4023 + 0.5991i | 0.4023 + 0.5991i | 0.4023 + 0.5991i | 0.4023 + 0.5991i |
| 14.5 | 0.1686 + 0.7635i | 0.1686 + 0.7635i | 0.1686 + 0.7635i | 0.1686 + 0.7635i | 0.4094 + 0.5960i | 0.4094 + 0.5960i | 0.4094 + 0.5960i | 0.4094 + 0.5960i |
| 15 | 0.6334 + 1.5624i | 0.3410 + 1.0543i | 0.3767 + 1.3678i | 0.3410 + 1.0543i | 0.3247 + 0.6377i | 0.3307 + 0.7164i | 0.3247 + 0.6377i | 0.3307 + 0.7164i |
| 15.5 | 0.1266 + 1.3390i | 0.4298 + 0.9537i | 0.2698 + 1.2595i | 0.4136 + 1.0326i | 0.4110 + 0.6301i | 0.4110 + 0.6301i | 0.4110 + 0.6301i | 0.4110 + 0.6301i |
| 16 | 0.4307 + 1.3657i | 0.3427 + 1.0736i | 0.5886 + 1.6752i | 0.3211 + 0.9921i | 0.3205 + 0.6295i | 0.3313 + 0.7167i | 0.3205 + 0.6295i | 0.3313 + 0.7167i |
| 16.5 | 0.2029 + 1.6229i | 0.4021 + 0.9693i | 0.4138 + 1.2839i | 0.4021 + 0.9693i | 0.3614 + 0.6015i | 0.3705 + 0.6925i | 0.3614 + 0.6015i | 0.3705 + 0.6925i |
| 17 | 0.4551 + 1.5890i | 0.3688 + 0.9394i | 0.3994 + 1.2831i | 0.3584 + 1.0296i | 0.3499 + 0.5950i | 0.3491 + 0.6925i | 0.3499 + 0.5950i | 0.3491 + 0.6925i |
| 17.5 | 0.4310 + 1.5685i | 0.3749 + 0.9291i | 0.3899 + 1.2664i | 0.3578 + 1.0211i | 0.3498 + 0.5889i | 0.3481 + 0.6977i | 0.3498 + 0.5889i | 0.3481 + 0.6977i |
| 18 | 0.4257 + 1.5553i | 0.3653 + 0.9212i | 0.3793 + 1.2595i | 0.3474 + 1.0247i | 0.3805 + 0.5765i | 0.3633 + 0.7147i | 0.3133 + 0.5726i | 0.3120 + 0.6868i |
| 18.5 | 0.4244 + 1.5436i | 0.3639 + 0.9208i | 0.3774 + 1.2582i | 0.3430 + 1.0368i | 0.3915 + 0.5705i | 0.3623 + 0.7269i | 0.3080 + 0.5673i | 0.3034 + 0.6934i |
| 19 | 0.7690 + 1.4112i | 0.6649 + 1.1380i | 0.4761 + 1.4765i | 0.4596 + 1.1970i | 0.4764 + 0.7356i | 0.5686 + 0.9186i | 0.3592 + 0.7734i | 0.4125 + 0.9576i |
| 19.5 | 0.4619 + 1.4871i | 0.4964 + 0.9866i | 0.3490 + 1.2589i | 0.3490 + 1.0371i | 0.4558 + 0.6134i | 0.4773 + 0.7891i | 0.3323 + 0.6317i | 0.3411 + 0.8066i |
| 20 | 0.3324 + 1.2294i | 0.3300 + 1.0062i | 0.3879 + 1.4978i | 0.2451 + 0.8999i | 0.4353 + 0.5950i | 0.4122 + 0.7607i | 0.3109 + 0.5751i | 0.2807 + 0.7485i |
| 20.5 | 0.3324 + 1.2302i | 0.3334 + 1.0155i | 0.3846 + 1.4868i | 0.2478 + 0.9074i | 0.4435 + 0.6045i | 0.4193 + 0.7714i | 0.3125 + 0.5857i | 0.2831 + 0.7571i |
| 21 | 0.3284 + 1.2285i | 0.3320 + 1.0206i | 0.3786 + 1.4755i | 0.2471 + 0.9090i | 0.4494 + 0.6106i | 0.4225 + 0.7777i | 0.3144 + 0.5907i | 0.2838 + 0.7596i |
| 21.5 | 0.3217 + 1.2283i | 0.3261 + 1.0269i | 0.3716 + 1.4663i | 0.2470 + 0.9085i | 0.4549 + 0.6160i | 0.4247 + 0.7818i | 0.3170 + 0.5938i | 0.2850 + 0.7600i |
| 22 | 0.3100 + 1.2397i | 0.3058 + 1.0469i | 0.3607 + 1.4682i | 0.2567 + 0.9079i | 0.4631 + 0.6208i | 0.4319 + 0.7788i | 0.3205 + 0.5962i | 0.2904 + 0.7595i |
| 22.5 | 0.3044 + 1.2443i | 0.3002 + 1.0568i | 0.3505 + 1.4648i | 0.2617 + 0.9117i | 0.4705 + 0.6290i | 0.4380 + 0.7857i | 0.3259 + 0.6027i | 0.2955 + 0.7625i |
| 23 | 0.3452 + 1.1540i | 0.4129 + 0.9793i | 0.3125 + 1.3457i | 0.2563 + 0.9501i | 0.4782 + 0.6393i | 0.4531 + 0.8051i | 0.3394 + 0.6131i | 0.3093 + 0.7816i |
| 23.5 | 0.2993 + 1.2594i | 0.2906 + 1.0772i | 0.3403 + 1.4686i | 0.2690 + 0.9234i | 0.4846 + 0.6443i | 0.4495 + 0.7999i | 0.3381 + 0.6175i | 0.3079 + 0.7726i |
| 24 | 0.4884 + 1.4147i | 0.4408 + 0.9883i | 0.2990 + 1.3047i | 0.3098 + 1.1123i | 0.5034 + 0.6582i | 0.5007 + 0.8232i | 0.3521 + 0.6461i | 0.3534 + 0.7992i |
| 24.5 | 0.4818 + 1.4041i | 0.4361 + 0.9895i | 0.2934 + 1.3012i | 0.3024 + 1.1113i | 0.5119 + 0.6637i | 0.5063 + 0.8279i | 0.3591 + 0.6480i | 0.3581 + 0.8012i |
| 25 | 0.4778 + 1.3940i | 0.4318 + 0.9909i | 0.2896 + 1.2989i | 0.2959 + 1.1112i | 0.5190 + 0.6693i | 0.5110 + 0.8331i | 0.3652 + 0.6503i | 0.3620 + 0.8038i |
| 25.5 | 0.4747 + 1.3846i | 0.4279 + 0.9924i | 0.2865 + 1.2969i | 0.2905 + 1.1114i | 0.5249 + 0.6752i | 0.5140 + 0.8384i | 0.3704 + 0.6529i | 0.3647 + 0.8068i |
| 26 | 0.4711 + 1.3764i | 0.4242 + 0.9942i | 0.2836 + 1.2952i | 0.2860 + 1.1119i | 0.5308 + 0.6813i | 0.5155 + 0.8438i | 0.3755 + 0.6565i | 0.3664 + 0.8105i |

| SNR/w | w48 | w49 | w50 | w51 | w52 | w53 | w54 | w55 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i |

-continued

| | | | | | | | | |
|---|---|---|---|---|---|---|---|---|
| 7 | 0.2569 + 0.4310i | 0.2569 + 0.4310i | 0.2569 + 0.4310i | 0.2569 + 0.4310i | 0.2569 + 0.4310i | 0.2569 + 0.4310i | 0.2569 + 0.4310i | 0.2569 + 0.4310i |
| 7.5 | 0.2521 + 0.4541i | 0.2153 + 0.3744i | 0.3279 + 1.2665i | 0.3690 + 1.7569i | 0.2521 + 0.4541i | 0.2521 + 0.4541i | 0.3162 + 1.1348i | 0.3279 + 1.2665i |
| 8 | 0.4131 + 0.2309i | 0.4131 + 0.2309i | 0.4131 + 0.2309i | 0.4923 + 0.2594i | 0.4131 + 0.2309i | 0.4131 + 0.2309i | 0.4131 + 0.2309i | 0.4923 + 0.2594i |
| 8.5 | 0.4147 + 0.2243i | 0.4147 + 0.2243i | 0.4147 + 0.2243i | 0.5023 + 0.2552i | 0.4147 + 0.2243i | 0.4147 + 0.2243i | 0.4147 + 0.2243i | 0.5023 + 0.2552i |
| 9 | 0.2776 + 0.2292i | 0.2776 + 0.2292i | 0.2776 + 0.2292i | 0.3356 + 0.2412i | 0.2776 + 0.2292i | 0.2776 + 0.2292i | 0.2776 + 0.2292i | 0.3356 + 0.2412i |
| 9.5 | 0.2749 + 0.2257i | 0.2749 + 0.2257i | 0.2749 + 0.2257i | 0.3444 + 0.2369i | 0.2749 + 0.2257i | 0.2749 + 0.2257i | 0.2749 + 0.2257i | 0.3444 + 0.2369i |
| 10 | 0.1705 − 0.3146i | 0.1705 − 0.3146i | 0.2169 − 0.6218i | 0.2169 − 0.6218i | 0.1705 − 0.3146i | 0.1705 − 0.3146i | 0.2169 − 0.6218i | 0.2169 − 0.6218i |
| 10.5 | 0.1640 − 0.3056i | 0.1640 − 0.3056i | 0.2071 − 0.6406i | 0.2071 − 0.6406i | 0.1640 − 0.3056i | 0.1640 − 0.3056i | 0.2071 − 0.6406i | 0.2071 − 0.6406i |
| 11 | 0.3012 + 0.1597i | 0.3012 + 0.1597i | 0.3012 + 0.1597i | 0.3012 + 0.1597i | 0.3012 + 0.1597i | 0.3012 + 0.1597i | 0.3012 + 0.1597i | 0.3012 + 0.1597i |
| 11.5 | 0.2975 + 0.1563i | 0.2975 + 0.1563i | 0.2975 + 0.1563i | 0.2975 + 0.1563i | 0.2975 + 0.1563i | 0.2975 + 0.1563i | 0.2975 + 0.1563i | 0.2975 + 0.1563i |
| 12 | 0.2707 + 0.1533i | 0.2707 + 0.1533i | 0.2707 + 0.1533i | 0.2707 + 0.1533i | 0.2707 + 0.1533i | 0.2707 + 0.1533i | 0.2707 + 0.1533i | 0.2707 + 0.1533i |
| 12.5 | 0.2453 + 0.1484i | 0.2453 + 0.1484i | 0.2453 + 0.1484i | 0.2453 + 0.1484i | 0.2453 + 0.1484i | 0.2453 + 0.1484i | 0.2453 + 0.1484i | 0.2453 + 0.1484i |
| 13 | 0.2294 + 0.1447i | 0.2294 + 0.1447i | 0.2294 + 0.1447i | 0.2294 + 0.1447i | 0.2294 + 0.1447i | 0.2294 + 0.1447i | 0.2294 + 0.1447i | 0.2294 + 0.1447i |
| 13.5 | 0.2219 + 0.1422i | 0.2219 + 0.1422i | 0.2219 + 0.1422i | 0.2219 + 0.1422i | 0.2219 + 0.1422i | 0.2219 + 0.1422i | 0.2219 + 0.1422i | 0.2219 + 0.1422i |
| 14 | 0.2185 + 0.1400i | 0.2185 + 0.1400i | 0.2185 + 0.1400i | 0.2185 + 0.1400i | 0.2185 + 0.1400i | 0.2185 + 0.1400i | 0.2185 + 0.1400i | 0.2185 + 0.1400i |
| 14.5 | 0.2118 + 0.1405i | 0.2118 + 0.1405i | 0.2118 + 0.1405i | 0.2118 + 0.1405i | 0.2118 + 0.1405i | 0.2118 + 0.1405i | 0.2118 + 0.1405i | 0.2118 + 0.1405i |
| 15 | 0.1241 + 0.1182i | 0.1241 + 0.1182i | 0.1241 + 0.1182i | 0.1241 + 0.1182i | 0.1177 + 0.3603i | 0.1177 + 0.3603i | 0.1177 + 0.3603i | 0.1177 + 0.3603i |
| 15.5 | 0.1165 + 0.1237i | 0.1165 + 0.1237i | 0.1165 + 0.1237i | 0.1165 + 0.1237i | 0.1236 + 0.3719i | 0.1236 + 0.3719i | 0.1236 + 0.3719i | 0.1236 + 0.3719i |
| 16 | 0.1248 + 0.1142i | 0.1248 + 0.1142i | 0.1248 + 0.1142i | 0.1248 + 0.1142i | 0.1157 + 0.3557i | 0.1157 + 0.3557i | 0.1157 + 0.3557i | 0.1157 + 0.3557i |
| 16.5 | 0.1124 + 0.1192i | 0.1124 + 0.1192i | 0.1124 + 0.1192i | 0.1124 + 0.1192i | 0.1137 + 0.3677i | 0.1137 + 0.3677i | 0.1137 + 0.3677i | 0.1137 + 0.3677i |
| 17 | 0.1157 + 0.1157i | 0.1157 + 0.1157i | 0.1157 + 0.1157i | 0.1157 + 0.1157i | 0.1124 + 0.3586i | 0.1124 + 0.3586i | 0.1124 + 0.3586i | 0.1124 + 0.3586i |
| 17.5 | 0.1169 + 0.1143i | 0.1169 + 0.1143i | 0.1169 + 0.1143i | 0.1169 + 0.1143i | 0.1127 + 0.3556i | 0.1127 + 0.3556i | 0.1127 + 0.3556i | 0.1127 + 0.3556i |
| 18 | 0.1186 + 0.1103i | 0.1186 + 0.1103i | 0.1186 + 0.1103i | 0.1186 + 0.1103i | 0.1118 + 0.3737i | 0.1159 + 0.3162i | 0.1118 + 0.3737i | 0.1159 + 0.3162i |
| 18.5 | 0.1110 + 0.1041i | 0.1110 + 0.1041i | 0.1110 + 0.1041i | 0.1449 + 0.1242i | 0.1124 + 0.3777i | 0.1170 + 0.3077i | 0.1124 + 0.3777i | 0.1170 + 0.3077i |
| 19 | 0.0786 + 0.0928i | 0.0849 + 0.2753i | 0.0786 + 0.0928i | 0.0849 + 0.2753i | 0.1162 + 0.6316i | 0.0977 + 0.4554i | 0.1162 + 0.6316i | 0.0977 + 0.4554i |
| 19.5 | 0.0951 + 0.0766i | 0.0997 + 0.2139i | 0.0951 + 0.0766i | 0.0997 + 0.2139i | 0.0760 + 0.5036i | 0.1097 + 0.3621i | 0.1642 + 0.4957i | 0.1097 + 0.3621i |
| 20 | 0.0712 + 0.1087i | 0.0712 + 0.1087i | 0.2053 + 0.1104i | 0.2053 + 0.1104i | 0.0715 + 0.3878i | 0.0710 + 0.2879i | 0.1957 + 0.3967i | 0.2012 + 0.2903i |
| 20.5 | 0.0696 + 0.0636i | 0.0695 + 0.1639i | 0.2051 + 0.0633i | 0.2044 + 0.1665i | 0.0700 + 0.4057i | 0.0696 + 0.2929i | 0.1995 + 0.4139i | 0.2029 + 0.2955i |
| 21 | 0.0696 + 0.0610i | 0.0696 + 0.1698i | 0.2077 + 0.0610i | 0.2073 + 0.1721i | 0.0698 + 0.4114i | 0.0697 + 0.2939i | 0.2034 + 0.4201i | 0.2063 + 0.2971i |
| 21.5 | 0.0707 + 0.0595i | 0.0706 + 0.1722i | 0.2119 + 0.0599i | 0.2114 + 0.1748i | 0.0701 + 0.4134i | 0.0705 + 0.2935i | 0.2066 + 0.4231i | 0.2100 + 0.2979i |
| 22 | 0.0723 + 0.0588i | 0.0719 + 0.1737i | 0.2166 + 0.0598i | 0.2155 + 0.1775i | 0.0704 + 0.4157i | 0.0713 + 0.2939i | 0.2086 + 0.4265i | 0.2132 + 0.3001i |
| 22.5 | 0.0730 + 0.0592i | 0.0727 + 0.1768i | 0.2188 + 0.0604i | 0.2178 + 0.1809i | 0.0710 + 0.4212i | 0.0721 + 0.2976i | 0.2107 + 0.4330i | 0.2155 + 0.3047i |
| 23 | 0.0720 + 0.0615i | 0.0717 + 0.1851i | 0.2162 + 0.0625i | 0.2153 + 0.1881i | 0.0692 + 0.4430i | 0.0709 + 0.3116i | 0.2088 + 0.4508i | 0.2131 + 0.3169i |
| 23.5 | 0.0735 + 0.0614i | 0.0734 + 0.1846i | 0.2204 + 0.0628i | 0.2198 + 0.1888i | 0.0720 + 0.4369i | 0.0730 + 0.3094i | 0.2145 + 0.4495i | 0.2184 + 0.3170i |
| 24 | 0.0668 + 0.0698i | 0.0669 + 0.2101i | 0.2012 + 0.0697i | 0.2017 + 0.2100i | 0.0675 + 0.5006i | 0.0672 + 0.3530i | 0.2047 + 0.4981i | 0.2028 + 0.3524i |
| 24.5 | 0.0679 + 0.0704i | 0.0679 + 0.2120i | 0.2045 + 0.0702i | 0.2048 + 0.2113i | 0.0689 + 0.5043i | 0.0683 + 0.3561i | 0.2088 + 0.4995i | 0.2060 + 0.3542i |
| 25 | 0.0687 + 0.0711i | 0.0686 + 0.2143i | 0.2073 + 0.0705i | 0.2070 + 0.2122i | 0.0701 + 0.5091i | 0.0690 + 0.3598i | 0.2121 + 0.5000i | 0.2083 + 0.3552i |
| 25.5 | 0.0699 + 0.0718i | 0.0690 + 0.2167i | 0.2111 + 0.0703i | 0.2080 + 0.2118i | 0.0711 + 0.5149i | 0.0694 + 0.3642i | 0.2146 + 0.4990i | 0.2095 + 0.3547i |
| 26 | 0.0711 + 0.0728i | 0.0687 + 0.2202i | 0.2153 + 0.0697i | 0.2074 + 0.2103i | 0.0722 + 0.5215i | 0.0699 + 0.3698i | 0.2171 + 0.4970i | 0.2104 + 0.3528i |

-continued

| SNR/w | w56 | w57 | w58 | w59 | w60 | w61 | w62 | w63 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i |
| 7 | 0.2569 + 0.4310i | 0.2569 + 0.4310i | 0.2569 + 0.4310i | 0.2569 + 0.4310i | 0.2569 + 0.4310i | 0.2569 + 0.4310i | 0.2569 + 0.4310i | 0.2569 + 0.4310i |
| 7.5 | 0.4541 + 0.2521i | 0.3744 + 0.2153i | 1.2665 + 0.3279i | 1.7569 + 0.3690i | 0.4541 + 0.2521i | 0.4541 + 0.2521i | 1.1348 + 0.3162i | 1.2665 + 0.3279i |
| 8 | 0.4131 + 0.2309i | 0.4923 + 0.2594i | 0.4923 + 0.2594i | 0.4923 + 0.2594i | 0.4131 + 0.2309i | 0.4923 + 0.2594i | 0.4923 + 0.2594i | 0.4923 + 0.2594i |
| 8.5 | 0.4147 + 0.2243i | 0.5023 + 0.2552i | 0.5023 + 0.2552i | 0.5023 + 0.2552i | 0.4147 + 0.2243i | 0.5023 + 0.2552i | 0.5023 + 0.2552i | 0.5023 + 0.2552i |
| 9 | 0.2776 + 0.2292i | 0.2776 + 0.2292i | 0.2776 + 0.2292i | 0.3356 + 0.2412i | 0.2776 + 0.2292i | 0.2776 + 0.2292i | 0.2776 + 0.2292i | 0.3356 + 0.2412i |
| 9.5 | 0.2749 + 0.2257i | 0.2749 + 0.2257i | 0.2749 + 0.2257i | 0.3444 + 0.2369i | 0.2749 + 0.2257i | 0.2749 + 0.2257i | 0.2749 + 0.2257i | 0.3444 + 0.2369i |
| 10 | 0.1705 − 0.3146i | 0.1705 − 0.3146i | 0.3158 − 0.5800i | 0.3158 − 0.5800i | 0.1705 − 0.3146i | 0.1705 − 0.3146i | 0.3158 − 0.5800i | 0.3158 − 0.5800i |
| 10.5 | 0.1640 − 0.3056i | 0.1640 − 0.3056i | 0.3251 − 0.5895i | 0.3251 − 0.5895i | 0.1640 − 0.3056i | 0.1640 − 0.3056i | 0.3251 − 0.5895i | 0.3251 − 0.5895i |
| 11 | 0.6554 + 0.1969i | 0.6554 + 0.1969i | 0.6554 + 0.1969i | 0.6554 + 0.1969i | 0.5954 + 0.3347i | 0.5954 + 0.3347i | 0.5954 + 0.3347i | 0.5954 + 0.3347i |
| 11.5 | 0.6652 + 0.1867i | 0.6652 + 0.1867i | 0.6652 + 0.1867i | 0.6652 + 0.1867i | 0.5982 + 0.3424i | 0.5982 + 0.3424i | 0.5982 + 0.3424i | 0.5982 + 0.3424i |
| 12 | 0.6459 + 0.1725i | 0.6459 + 0.1725i | 0.6459 + 0.1725i | 0.6459 + 0.1725i | 0.5863 + 0.3220i | 0.5863 + 0.3220i | 0.5863 + 0.3220i | 0.5863 + 0.3220i |
| 12.5 | 0.6281 + 0.1582i | 0.6281 + 0.1582i | 0.6281 + 0.1582i | 0.6281 + 0.1582i | 0.5785 + 0.3055i | 0.5785 + 0.3055i | 0.5785 + 0.3055i | 0.5785 + 0.3055i |
| 13 | 0.6132 + 0.1477i | 0.6132 + 0.1477i | 0.6132 + 0.1477i | 0.6132 + 0.1477i | 0.5707 + 0.2977i | 0.5707 + 0.2977i | 0.5707 + 0.2977i | 0.5707 + 0.2977i |
| 13.5 | 0.6060 + 0.1399i | 0.6060 + 0.1399i | 0.6060 + 0.1399i | 0.6060 + 0.1399i | 0.5660 + 0.3001i | 0.5660 + 0.3001i | 0.5660 + 0.3001i | 0.5660 + 0.3001i |
| 14 | 0.6035 + 0.1350i | 0.6035 + 0.1350i | 0.6035 + 0.1350i | 0.6035 + 0.1350i | 0.5609 + 0.3115i | 0.5609 + 0.3115i | 0.5609 + 0.3115i | 0.5609 + 0.3115i |
| 14.5 | 0.5956 + 0.1287i | 0.5956 + 0.1287i | 0.5956 + 0.1287i | 0.5956 + 0.1287i | 0.5560 + 0.3155i | 0.5560 + 0.3155i | 0.5560 + 0.3155i | 0.5560 + 0.3155i |
| 15 | 0.3683 + 0.1249i | 0.3683 + 0.1249i | 0.3683 + 0.1249i | 0.3683 + 0.1249i | 0.3492 + 0.3785i | 0.3492 + 0.3785i | 0.3492 + 0.3785i | 0.3492 + 0.3785i |
| 15.5 | 0.3594 + 0.1163i | 0.3594 + 0.1163i | 0.3594 + 0.1163i | 0.3594 + 0.1163i | 0.3789 + 0.3524i | 0.3789 + 0.3524i | 0.3789 + 0.3524i | 0.3789 + 0.3524i |
| 16 | 0.3766 + 0.1242i | 0.3766 + 0.1242i | 0.3766 + 0.1242i | 0.3766 + 0.1242i | 0.3539 + 0.3781i | 0.3539 + 0.3781i | 0.3539 + 0.3781i | 0.3539 + 0.3781i |
| 16.5 | 0.3481 + 0.1150i | 0.3481 + 0.1150i | 0.3481 + 0.1150i | 0.3481 + 0.1150i | 0.3549 + 0.3594i | 0.3549 + 0.3594i | 0.3549 + 0.3594i | 0.3549 + 0.3594i |
| 17 | 0.3547 + 0.1184i | 0.3547 + 0.1184i | 0.3547 + 0.1184i | 0.3547 + 0.1184i | 0.3538 + 0.3623i | 0.3538 + 0.3623i | 0.3538 + 0.3623i | 0.3538 + 0.3623i |
| 17.5 | 0.3583 + 0.1186i | 0.3583 + 0.1186i | 0.3583 + 0.1186i | 0.3583 + 0.1186i | 0.3554 + 0.3620i | 0.3554 + 0.3620i | 0.3554 + 0.3620i | 0.3554 + 0.3620i |
| 18 | 0.4012 + 0.1159i | 0.4012 + 0.1159i | 0.3338 + 0.1122i | 0.3338 + 0.1122i | 0.3941 + 0.3525i | 0.3941 + 0.3525i | 0.3224 + 0.3797i | 0.3242 + 0.3257i |
| 18.5 | 0.4150 + 0.1158i | 0.4150 + 0.1158i | 0.3282 + 0.1112i | 0.3282 + 0.1112i | 0.4055 + 0.3867i | 0.4070 + 0.3192i | 0.3165 + 0.3859i | 0.3192 + 0.3168i |
| 19 | 0.2391 + 0.0872i | 0.2587 + 0.2558i | 0.2391 + 0.0872i | 0.2587 + 0.2558i | 0.3841 + 0.5754i | 0.2966 + 0.4248i | 0.3139 + 0.6000i | 0.2966 + 0.4248i |
| 19.5 | 0.3357 + 0.0722i | 0.3554 + 0.1787i | 0.2645 + 0.0759i | 0.2773 + 0.1974i | 0.4211 + 0.4555i | 0.3908 + 0.3235i | 0.3141 + 0.4762i | 0.2975 + 0.3417i |
| 20 | 0.4915 + 0.0675i | 0.4864 + 0.1749i | 0.3507 + 0.0674i | 0.3479 + 0.1618i | 0.4601 + 0.4402i | 0.4756 + 0.3132i | 0.3316 + 0.4177i | 0.3417 + 0.2995i |
| 20.5 | 0.4886 + 0.0646i | 0.4846 + 0.1827i | 0.3469 + 0.0633i | 0.3450 + 0.1729i | 0.4639 + 0.4505i | 0.4766 + 0.3165i | 0.3324 + 0.4313i | 0.3406 + 0.3039i |
| 21 | 0.4930 + 0.0636i | 0.4893 + 0.1869i | 0.3495 + 0.0617i | 0.3478 + 0.1777i | 0.4697 + 0.4569i | 0.4820 + 0.3193i | 0.3355 + 0.4373i | 0.3439 + 0.3060i |
| 21.5 | 0.5002 + 0.0638i | 0.4966 + 0.1905i | 0.3552 + 0.0612i | 0.3533 + 0.1810i | 0.4764 + 0.4630i | 0.4895 + 0.3231i | 0.3397 + 0.4416i | 0.3490 + 0.3083i |
| 22 | 0.5063 + 0.0651i | 0.5034 + 0.1956i | 0.3611 + 0.0619i | 0.3592 + 0.1852i | 0.4850 + 0.4713i | 0.4975 + 0.3302i | 0.3439 + 0.4470i | 0.3544 + 0.3131i |
| 22.5 | 0.5098 + 0.0662i | 0.5076 + 0.1992i | 0.3641 + 0.0628i | 0.3625 + 0.1888i | 0.4912 + 0.4790i | 0.5027 + 0.3358i | 0.3482 + 0.4545i | 0.3582 + 0.3185i |
| 23 | 0.5089 + 0.0667i | 0.5074 + 0.2012i | 0.3614 + 0.0643i | 0.3600 + 0.1938i | 0.4951 + 0.4835i | 0.5034 + 0.3391i | 0.3505 + 0.4649i | 0.3566 + 0.3265i |
| 23.5 | 0.5134 + 0.0686i | 0.5133 + 0.2063i | 0.3668 + 0.0653i | 0.3660 + 0.1965i | 0.5011 + 0.4924i | 0.5105 + 0.3465i | 0.3558 + 0.4698i | 0.3634 + 0.3304i |

-continued

| | | | | | | | | |
|---|---|---|---|---|---|---|---|---|
| 24 | 0.4796 + 0.0697i | 0.4800 + 0.2104i | 0.3382 + 0.0697i | 0.3390 + 0.2100i | 0.4925 + 0.5035i | 0.4833 + 0.3548i | 0.3463 + 0.4979i | 0.3414 + 0.3526i |
| 24.5 | 0.4861 + 0.0706i | 0.4859 + 0.2131i | 0.3435 + 0.0702i | 0.3439 + 0.2114i | 0.5003 + 0.5082i | 0.4895 + 0.3586i | 0.3523 + 0.4998i | 0.3464 + 0.3545i |
| 25 | 0.4922 + 0.0714i | 0.4900 + 0.2154i | 0.3482 + 0.0705i | 0.3474 + 0.2123i | 0.5068 + 0.5129i | 0.4941 + 0.3621i | 0.3574 + 0.5015i | 0.3500 + 0.3558i |
| 25.5 | 0.5014 + 0.0721i | 0.4909 + 0.2174i | 0.3548 + 0.0706i | 0.3488 + 0.2127i | 0.5120 + 0.5180i | 0.4965 + 0.3657i | 0.3613 + 0.5034i | 0.3518 + 0.3569i |
| 26 | 0.5101 + 0.0730i | 0.4897 + 0.2198i | 0.3616 + 0.0709i | 0.3479 + 0.2135i | 0.5175 + 0.5233i | 0.4992 + 0.3698i | 0.3655 + 0.5062i | 0.3537 + 0.3587i |

l2) 1 kQQAM with Max. Penalty=0.01 b/s/Hz—AWGN Channel

| SNR/w | w0 | w1 | w2 | w3 | w4 | w5 | w6 | w7 |
|---|---|---|---|---|---|---|---|---|
| 7 | 1.2470 + 1.8367i | 0.6413 + 1.1550i | 0.4280 + 2.1615i | 0.3707 + 1.2911i | 0.6413 + 1.1550i | 0.6413 + 1.1550i | 0.3707 + 1.2911i | 0.3707 + 1.2911i |
| 7.5 | 1.2147 + 1.7841i | 0.9775 + 1.4975i | 0.4075 + 2.1185i | 0.3773 + 1.7335i | 0.6538 + 1.1143i | 0.6538 + 1.1143i | 0.3292 + 1.2581i | 0.3292 + 1.2581i |
| 8 | 0.3978 + 2.0885i | 0.3528 + 1.7466i | 0.3348 + 1.5547i | 0.3348 + 1.5547i | 1.1912 + 1.7585i | 0.9886 + 1.4907i | 0.8710 + 1.3458i | 0.8710 + 1.3458i |
| 8.5 | 0.3944 + 2.0732i | 0.3300 + 1.6702i | 0.3300 + 1.6702i | 0.3149 + 1.5557i | 1.1771 + 1.7502i | 0.9462 + 1.4268i | 0.9462 + 1.4268i | 0.8771 + 1.3353i |
| 9 | 2.0688 + 0.3931i | 1.4568 + 0.2962i | 1.4568 + 0.2962i | 1.4568 + 0.2962i | 1.4568 + 0.2962i | 1.4568 + 0.2962i | 1.4568 + 0.2962i | 1.3541 + 0.2851i |
| 9.5 | 2.0659 + 0.4001i | 1.4703 + 0.2931i | 1.4703 + 0.2931i | 1.4703 + 0.2931i | 1.4703 + 0.2931i | 1.4703 + 0.2931i | 1.4703 + 0.2931i | 1.3831 + 0.2804i |
| 10 | 2.0614 + 0.4082i | 1.4563 + 0.2877i | 1.4563 + 0.2877i | 1.4563 + 0.2877i | 1.4563 + 0.2877i | 1.4563 + 0.2877i | 1.4563 + 0.2877i | 1.4563 + 0.2877i |
| 10.5 | 2.0377 + 0.5960i | 1.4217 + 0.2779i | 1.8845 + 0.2992i | 1.4217 + 0.2779i | 1.5221 + 0.3248i | 1.4217 + 0.2779i | 1.5822 + 0.2893i | 1.4217 + 0.2779i |
| 11 | 2.0390 + 0.5892i | 1.9449 + 0.9829i | 2.1322 + 0.2257i | 1.6928 + 1.3984i | 0.6643 + 1.9775i | 0.9378 + 1.8902i | 0.2768 + 2.1985i | 1.3588 + 1.7046i |
| 11.5 | 2.0197 + 0.5915i | 1.9273 + 0.9738i | 2.1141 + 0.2170i | 1.6778 + 1.3854i | 0.6565 + 1.9726i | 0.9379 + 1.8778i | 0.2618 + 2.1756i | 1.3509 + 1.6828i |
| 12 | 1.9956 + 0.5790i | 1.9068 + 0.9328i | 2.0896 + 0.2054i | 1.6925 + 1.3344i | 0.6557 + 1.9767i | 0.9827 + 1.8677i | 0.2501 + 2.1554i | 1.3795 + 1.6301i |
| 12.5 | 2.1158 + 0.2551i | 1.9736 + 0.7598i | 1.2067 + 1.7622i | 1.7509 + 1.2633i | 0.4937 + 1.4624i | 0.4937 + 1.4624i | 0.5747 + 1.5292i | 0.4937 + 1.4624i |
| 13 | 1.1348 + 1.8042i | 1.5056 + 1.4947i | 1.8256 + 0.9213i | 1.6326 + 1.1112i | 1.6260 + 0.1296i | 1.6260 + 0.1296i | 2.0062 + 0.5266i | 2.0128 + 0.1983i |
| 13.5 | 2.1871 + 0.3000i | 1.8533 + 0.9857i | 1.1098 + 1.7333i | 1.5930 + 1.5042i | 0.5632 + 1.4003i | 0.5632 + 1.4003i | 0.6814 + 1.4935i | 0.5632 + 1.4003i |
| 14 | 1.2483 + 1.5217i | 0.1461 + 1.4775i | 1.0118 + 1.6410i | 0.7721 + 1.8992i | 0.5100 + 1.3662i | 0.5100 + 1.3662i | 0.6306 + 1.4306i | 0.6306 + 1.4306i |
| 14.5 | 1.3062 + 1.5059i | 0.1503 + 1.4749i | 1.0464 + 1.6055i | 0.8162 + 1.8855i | 0.5193 + 1.3304i | 0.4552 + 1.3948i | 0.7020 + 1.4249i | 0.6369 + 1.4730i |
| 15 | 1.4903 + 1.1383i | 0.9110 + 1.4937i | 1.4109 + 1.4171i | 1.1243 + 1.6910i | 1.0600 + 1.1063i | 0.9502 + 1.2140i | 1.0600 + 1.1063i | 0.9559 + 1.1435i |
| 15.5 | 1.3441 + 1.0864i | 1.6500 + 1.0447i | 1.3102 + 1.2118i | 1.5763 + 1.4126i | 0.9974 + 1.0754i | 0.9256 + 1.0475i | 0.9974 + 1.0754i | 0.9256 + 1.0475i |
| 16 | 1.3350 + 1.1084i | 1.4475 + 0.9747i | 1.5607 + 1.3993i | 1.7541 + 1.0489i | 1.0500 + 0.9792i | 1.0135 + 0.9798i | 0.9572 + 0.9530i | 0.9572 + 0.9530i |
| 16.5 | 1.2147 + 1.5219i | 1.5401 + 1.3313i | 1.1978 + 1.2058i | 1.2559 + 1.1577i | 1.8450 + 0.9334i | 1.5494 + 0.9965i | 1.1978 + 0.9549i | 1.2537 + 0.9642i |
| 17 | 1.2118 + 1.5215i | 1.5329 + 1.3209i | 1.1917 + 1.2081i | 1.2568 + 1.1617i | 1.8374 + 0.9409i | 1.5357 + 0.9911i | 1.1881 + 0.9512i | 1.2485 + 0.9597i |
| 17.5 | 1.2108 + 1.5244i | 1.5290 + 1.3088i | 1.1858 + 1.2120i | 1.2645 + 1.1672i | 1.8238 + 0.9430i | 1.5237 + 0.9832i | 1.1800 + 0.9524i | 1.2475 + 0.9593i |
| 18 | 1.2082 + 1.5168i | 1.5240 + 1.3020i | 1.1811 + 1.2092i | 1.2761 + 1.1672i | 1.8137 + 0.9371i | 1.5194 + 0.9786i | 1.1750 + 0.9549i | 1.2506 + 0.9591i |
| 18.5 | 1.7580 + 0.8556i | 1.4723 + 0.8642i | 1.6081 + 1.1548i | 1.3616 + 0.9559i | 1.6322 + 0.6294i | 1.4250 + 0.6945i | 1.1917 + 0.7017i | 1.2482 + 0.7340i |
| 19 | 1.7624 + 0.8434i | 1.4961 + 0.8499i | 1.5901 + 1.1466i | 1.3710 + 0.9545i | 1.6320 + 0.6089i | 1.4335 + 0.6810i | 1.2009 + 0.7014i | 1.2596 + 0.7328i |
| 19.5 | 1.7721 + 0.9602i | 1.5439 + 0.8692i | 1.5357 + 1.2087i | 1.3865 + 0.9588i | 1.4330 + 0.5782i | 1.4962 + 0.6937i | 1.2677 + 0.6543i | 1.2934 + 0.7411i |
| 20 | 1.1090 + 1.6424i | 1.3041 + 1.4291i | 0.8414 + 1.7420i | 1.0620 + 1.3420i | 1.3469 + 1.1420i | 1.6140 + 1.1270i | 1.1259 + 1.0802i | 1.0687 + 1.1589i |
| 20.5 | 1.5361 + 1.2929i | 1.7337 + 0.8357i | 1.2780 + 1.4499i | 1.2622 + 1.2031i | 1.4523 + 0.7959i | 1.5055 + 0.9923i | 1.2671 + 0.8392i | 1.2824 + 1.0044i |
| 21 | 1.1920 + 1.4825i | 1.1801 + 1.2582i | 1.4681 + 1.3237i | 1.1055 + 1.1254i | 1.5435 + 0.9938i | 1.3407 + 1.0511i | 1.1841 + 0.8772i | 1.1708 + 0.9914i |

-continued

| SNR/w | w8 | w9 | w10 | w11 | w12 | w13 | w14 | w15 |
|---|---|---|---|---|---|---|---|---|
| 21.5 | 1.3352 + 1.3968i | 1.5544 + 1.1632i | 1.1041 + 1.4991i | 1.0921 + 1.2512i | 1.3845 + 0.9402i | 1.3310 + 1.1297i | 1.2245 + 0.9236i | 1.1581 + 1.0783i |
| 22 | 1.1448 + 1.4301i | 1.2314 + 1.2283i | 1.3851 + 1.4301i | 1.1791 + 1.0727i | 1.5570 + 0.9357i | 1.4463 + 1.1297i | 1.3343 + 0.9131i | 1.1627 + 0.9172i |
| 22.5 | 1.3571 + 1.4599i | 1.6063 + 1.1774i | 1.1068 + 1.5873i | 1.2491 + 1.2384i | 1.5617 + 0.8881i | 1.4366 + 1.0501i | 1.2716 + 0.8875i | 1.2361 + 1.0472i |
| 23 | 1.2474 + 1.3969i | 1.4038 + 1.1579i | 1.0418 + 1.5521i | 1.2120 + 1.1649i | 1.3678 + 0.8860i | 1.5336 + 0.9857i | 1.2086 + 0.8597i | 1.2130 + 1.0083i |
| 23.5 | 1.3740 + 1.3412i | 1.5419 + 1.1137i | 1.0721 + 1.4824i | 1.1453 + 1.2860i | 1.3865 + 0.9633i | 1.3170 + 1.1167i | 1.1954 + 0.9088i | 1.1762 + 1.0540i |
| 24 | 1.3790 + 1.2726i | 1.2140 + 1.1908i | 1.1518 + 1.3905i | 1.5627 + 1.0245i | 1.3824 + 0.8840i | 1.3211 + 1.0410i | 1.1686 + 0.8903i | 1.1570 + 1.0107i |
| 24.5 | 1.2961 + 1.3306i | 1.5578 + 1.0359i | 0.8364 + 1.6008i | 1.1053 + 1.2451i | 1.3744 + 0.9233i | 1.3731 + 1.1025i | 1.2130 + 0.9446i | 1.2096 + 1.1104i |
| 25 | 1.2369 + 1.3509i | 1.5739 + 0.9502i | 0.8752 + 1.5743i | 1.0781 + 1.2268i | 1.3726 + 1.0001i | 1.3629 + 1.1723i | 1.2107 + 0.9621i | 1.1961 + 1.1184i |
| 25.5 | 1.1981 + 1.3312i | 1.4448 + 1.0547i | 1.0785 + 1.4777i | 1.3216 + 0.9567i | 1.5082 + 0.8231i | 1.2653 + 1.1488i | 1.1548 + 0.9162i | 1.1687 + 1.0355i |
| 26 | 1.3600 + 1.2363i | 1.4725 + 1.0370i | 0.8236 + 1.5404i | 1.1012 + 1.2158i | 1.3405 + 0.9099i | 1.2954 + 1.0600i | 1.2050 + 0.8913i | 1.1575 + 1.0871i |
| 26.5 | 1.2790 + 1.2022i | 1.4224 + 1.0247i | 0.8336 + 1.4661i | 1.1191 + 1.1349i | 1.3645 + 0.8540i | 1.2671 + 1.0236i | 1.2289 + 0.8713i | 1.1326 + 0.9925i |
| 27 | 1.3272 + 1.2196i | 1.3559 + 1.0732i | 1.0028 + 1.3882i | 1.0375 + 1.2417i | 1.4394 + 0.9027i | 1.0528 + 1.0954i | 1.2910 + 0.9298i | 1.1738 + 1.1370i |
| 27.5 | 1.2847 + 1.1501i | 1.3344 + 1.0100i | 0.9562 + 1.3726i | 0.9853 + 1.2319i | 1.5330 + 0.7517i | 1.0098 + 1.0854i | 1.1767 + 0.9824i | 1.1243 + 1.1021i |
| 28 | 1.2471 + 1.1326i | 1.3598 + 1.0114i | 0.9946 + 1.3891i | 1.0600 + 1.1563i | 1.4990 + 0.7151i | 1.0049 + 1.0334i | 1.2249 + 0.9302i | 1.1234 + 1.04121 |

| SNR/w | w8 | w9 | w10 | w11 | w12 | w13 | w14 | w15 |
|---|---|---|---|---|---|---|---|---|
| 7 | 0.6413 + 1.1550i | 0.6413 + 1.1550i | 0.3707 + 1.2911i | 0.3707 + 1.2911i | 0.6413 + 1.1550i | 0.5789 + 1.0674i | 0.3707 + 1.2911i | 0.3565 + 1.1738i |
| 7.5 | 0.6538 + 1.1143i | 0.6538 + 1.1143i | 0.3292 + 1.2581i | 0.3292 + 1.2581i | 0.6538 + 1.1143i | 0.6538 + 1.1143i | 0.3292 + 1.2581i | 0.3292 + 1.2581i |
| 8 | 0.3053 + 1.2660i | 0.3053 + 1.2660i | 0.3053 + 1.2660i | 0.3053 + 1.2660i | 0.6782 + 1.1122i | 0.6782 + 1.1122i | 0.6782 + 1.1122i | 0.6782 + 1.1122i |
| 8.5 | 0.2766 + 1.1195i | 0.2766 + 1.1195i | 0.2766 + 1.1195i | 0.2766 + 1.1195i | 0.5908 + 0.9851i | 0.5908 + 0.9851i | 0.5908 + 0.9851i | 0.5908 + 0.9851i |
| 9 | 1.4568 + 0.2962i | 1.4568 + 0.2962i | 1.4568 + 0.2962i | 1.3541 + 0.2851i | 1.4568 + 0.2962i | 1.3541 + 0.2851i | 1.3541 + 0.2851i | 1.3541 + 0.2851i |
| 9.5 | 1.4703 + 0.2931i | 1.4703 + 0.2931i | 1.4703 + 0.2931i | 1.3831 + 0.2804i | 1.4703 + 0.2931i | 1.3831 + 0.2804i | 1.3831 + 0.2804i | 1.3831 + 0.2804i |
| 10 | 1.4563 + 0.2877i | 1.4563 + 0.2877i | 1.4563 + 0.2877i | 1.4563 + 0.2877i | 1.4563 + 0.2877i | 1.4563 + 0.2877i | 1.4563 + 0.2877i | 1.3798 + 0.2727i |
| 10.5 | 1.4217 + 0.2779i | 1.4217 + 0.2779i | 1.4217 + 0.2779i | 1.4217 + 0.2779i | 1.4217 + 0.2779i | 1.4217 + 0.2779i | 1.4217 + 0.2779i | 1.4217 + 0.2779i |
| 11 | 0.2573 + 1.5147i | 0.2573 + 1.5147i | 0.2573 + 1.5147i | 0.2573 + 1.5147i | 0.3240 + 1.5996i | 0.2573 + 1.5147i | 0.2481 + 1.6183i | 0.2573 + 1.5147i |
| 11.5 | 0.2664 + 1.5304i | 0.2664 + 1.5304i | 0.2664 + 1.5304i | 0.2664 + 1.5304i | 0.2664 + 1.5304i | 0.2664 + 1.5304i | 0.2664 + 1.5304i | 0.2664 + 1.5304i |
| 12 | 0.2671 + 1.5243i | 0.2671 + 1.5243i | 0.2671 + 1.5243i | 0.2671 + 1.5243i | 0.2671 + 1.5243i | 0.2671 + 1.5243i | 0.2671 + 1.5243i | 0.2671 + 1.5243i |
| 12.5 | 0.1264 + 1.6986i | 0.1264 + 1.6986i | 0.7712 + 2.0048i | 0.2871 + 2.1268i | 0.3253 + 1.5363i | 0.3253 + 1.5363i | 0.5747 + 1.5292i | 0.4937 + 1.4624i |
| 13 | 1.3969 + 0.5361i | 1.3969 + 0.5361i | 1.4570 + 0.6375i | 1.4570 + 0.6375i | 1.4954 + 0.3520i | 1.4954 + 0.3520i | 1.4964 + 0.4880i | 1.4964 + 0.4880i |
| 13.5 | 0.1150 + 1.6214i | 0.1150 + 1.6214i | 0.7071 + 2.0121i | 0.2331 + 2.0568i | 0.3267 + 1.5289i | 0.3267 + 1.5289i | 0.5457 + 1.6384i | 0.4754 + 1.5699i |
| 14 | 0.1408 + 1.5802i | 0.1408 + 1.5802i | 0.1917 + 2.0093i | 0.4128 + 1.8626i | 0.5100 + 1.3662i | 0.4232 + 1.4126i | 0.5100 + 1.3662i | 0.5277 + 1.4369i |
| 14.5 | 0.1282 + 1.6465i | 0.1597 + 1.5527i | 0.1959 + 2.0115i | 0.4545 + 1.8615i | 0.5193 + 1.3304i | 0.4552 + 1.3948i | 0.5932 + 1.3889i | 0.5460 + 1.4894i |
| 15 | 0.1724 + 2.0081i | 0.7788 + 1.5257i | 0.5016 + 1.9561i | 0.7186 + 1.7492i | 0.8942 + 1.0696i | 0.8665 + 1.1704i | 0.8942 + 1.0696i | 0.8942 + 1.0696i |
| 15.5 | 1.0823 + 1.6174i | 0.7196 + 1.5112i | 0.8215 + 1.8773i | 0.6957 + 1.5465i | 0.9178 + 1.2561i | 0.8143 + 1.2765i | 0.9178 + 1.2561i | 0.8143 + 1.2765i |
| 16 | 1.1791 + 1.3117i | 0.9549 + 1.3540i | 1.1769 + 1.6347i | 0.9200 + 1.4356i | 0.9718 + 1.0622i | 0.9278 + 1.1107i | 0.9134 + 1.0069i | 0.8947 + 1.0639i |
| 16.5 | 0.9383 + 1.3523i | 0.8697 + 1.2142i | 0.9874 + 1.2241i | 0.9264 + 1.1757i | 0.8889 + 0.9443i | 0.8889 + 0.9443i | 0.9490 + 0.9550i | 0.9490 + 0.9550i |
| 17 | 0.9377 + 1.3662i | 0.8598 + 1.2150i | 0.9907 + 1.2238i | 0.9170 + 1.1772i | 0.8857 + 0.9407i | 0.8857 + 0.9407i | 0.9605 + 0.9419i | 0.9339 + 0.9669i |
| 17.5 | 0.9391 + 1.3812i | 0.8495 + 1.2161i | 0.9970 + 1.2255i | 0.9056 + 1.1802i | 0.8919 + 0.9238i | 0.8751 + 0.9580i | 0.9650 + 0.9445i | 0.9298 + 0.9718i |
| 18 | 0.9438 + 1.3828i | 0.8433 + 1.2138i | 1.0046 + 1.2199i | 0.8973 + 1.1788i | 0.8923 + 0.9236i | 0.8728 + 0.9592i | 0.9729 + 0.9487i | 0.9271 + 0.9762i |
| 18.5 | 1.1693 + 1.2798i | 1.1128 + 1.0938i | 1.3758 + 1.3185i | 1.1973 + 1.0256i | 0.9845 + 0.7965i | 1.0167 + 0.8742i | 1.0414 + 0.7718i | 1.0742 + 0.8464i |

-continued

| | | | | | | | | |
|---|---|---|---|---|---|---|---|---|
| 19 | 1.1743 + 1.2715i | 1.1163 + 1.0948i | 1.3788 + 1.3352i | 1.2168 + 1.0183i | 0.9937 + 0.7969i | 1.0293 + 0.8865i | 1.0541 + 0.7706i | 1.0917 + 0.8547i |
| 19.5 | 1.2327 + 1.2807i | 1.1357 + 1.0702i | 1.2398 + 1.5594i | 1.2320 + 0.9996i | 1.0121 + 0.7959i | 1.0506 + 0.8804i | 1.0895 + 0.7549i | 1.1392 + 0.8268i |
| 20 | 0.6577 + 1.4430i | 0.7012 + 1.2781i | 0.8212 + 1.5008i | 0.8660 + 1.3198i | 0.8139 + 1.0062i | 0.7661 + 1.1278i | 0.8943 + 1.0255i | 0.8877 + 1.1417i |
| 20.5 | 0.9929 + 1.4515i | 0.9693 + 1.2162i | 0.9174 + 1.6990i | 1.0885 + 1.1841i | 0.9646 + 0.8840i | 0.9671 + 1.0103i | 1.0896 + 0.8706i | 1.0906 + 1.0064i |
| 21 | 0.9434 + 1.4728i | 0.9500 + 1.2899i | 0.9423 + 1.7074i | 0.9504 + 1.1268i | 0.9076 + 0.8486i | 0.8989 + 0.9010i | 1.0276 + 0.8623i | 0.9660 + 0.9752i |
| 21.5 | 0.8934 + 1.0735i | 0.8717 + 1.1114i | 0.9076 + 1.4446i | 0.9079 + 1.2674i | 0.8877 + 0.9231i | 0.8877 + 0.9231i | 1.0474 + 0.9190i | 1.0474 + 0.9190i |
| 22 | 0.9594 + 1.3673i | 0.9220 + 1.1877i | 0.9343 + 1.6326i | 1.0387 + 1.1184i | 0.8615 + 0.8877i | 0.8791 + 1.0284i | 0.9391 + 0.8804i | 1.0097 + 0.9542i |
| 22.5 | 0.8991 + 1.3062i | 0.8949 + 1.1654i | 1.0334 + 1.3983i | 1.0685 + 1.1889i | 0.9101 + 0.9127i | 0.9056 + 1.0351i | 1.0634 + 0.9074i | 1.0737 + 1.0418i |
| 23 | 0.8457 + 1.3352i | 0.8766 + 1.1938i | 1.0182 + 1.3610i | 1.0395 + 1.2129i | 0.9092 + 0.9223i | 0.9015 + 1.0480i | 1.0580 + 0.9038i | 1.0534 + 1.0422i |
| 23.5 | 0.8918 + 1.3385i | 0.8706 + 1.1982i | 0.8699 + 1.5126i | 1.0232 + 1.1858i | 0.8968 + 0.9242i | 0.8841 + 1.0548i | 1.0408 + 0.9107i | 1.0278 + 1.0448i |
| 24 | 0.9437 + 1.3080i | 0.8750 + 1.1648i | 0.9760 + 1.4721i | 1.0245 + 1.1502i | 0.8778 + 0.9006i | 0.8693 + 1.0265i | 1.0051 + 0.8991i | 1.0075 + 1.0190i |
| 24.5 | 0.9028 + 1.2861i | 0.9293 + 1.1520i | 0.8365 + 1.4219i | 1.0395 + 1.4368i | 1.0384 + 1.0284i | 0.9141 + 1.0040i | 1.0741 + 0.9112i | 0.9432 + 0.8972i |
| 25 | 0.8829 + 1.2606i | 0.9138 + 1.1340i | 0.8454 + 1.3942i | 1.0180 + 1.3974i | 1.0318 + 1.0219i | 0.9035 + 0.9954i | 1.0712 + 0.9074i | 0.9395 + 0.8888i |
| 25.5 | 0.7345 + 1.4935i | 0.9225 + 1.1907i | 0.8959 + 1.4840i | 0.9694 + 1.3246i | 0.9279 + 0.9107i | 1.0693 + 1.1756i | 1.0319 + 0.9222i | 1.0107 + 1.0471i |
| 26 | 0.8946 + 1.3593i | 0.9389 + 1.2209i | 1.0235 + 1.4279i | 1.1745 + 1.3460i | 1.0293 + 0.8852i | 0.9361 + 0.9368i | 1.1008 + 0.9458i | 1.0205 + 1.0570i |
| 26.5 | 0.8398 + 1.2923i | 0.9326 + 1.1801i | 0.9612 + 1.3780i | 1.0603 + 1.2681i | 1.0358 + 0.8637i | 0.9582 + 0.9419i | 1.1285 + 0.8265i | 1.0066 + 1.0375i |
| 27 | 0.8712 + 1.2714i | 0.9051 + 1.1465i | 0.8569 + 1.4350i | 1.1634 + 1.3187i | 1.0441 + 0.9494i | 0.9580 + 1.0356i | 1.1718 + 0.9809i | 0.9066 + 0.9385i |
| 27.5 | 0.8145 + 1.3026i | 0.8485 + 1.1849i | 0.7985 + 1.4488i | 1.1193 + 1.2690i | 1.1199 + 0.7168i | 0.8978 + 1.0853i | 1.0728 + 0.9252i | 0.9727 + 0.9570i |
| 28 | 0.9261 + 1.2557i | 0.9064 + 1.1434i | 0.8489 + 1.3711i | 1.1138 + 1.2723i | 1.1308 + 0.8070i | 0.9002 + 1.0336i | 1.1114 + 0.9086i | 0.8336 + 0.96811 |

| SNR/w | w16 | w17 | w18 | w19 | w20 | w21 | w22 | w23 |
|---|---|---|---|---|---|---|---|---|
| 7 | 0.6413 + 1.1550i | 0.6413 + 1.1550i | 0.3707 + 1.2911i | 0.3707 + 1.2911i | 0.6413 + 1.1550i | 0.5789 + 1.0674i | 0.3707 + 1.2911i | 0.3565 + 1.1738i |
| 7.5 | 0.6538 + 1.1143i | 0.6538 + 1.1143i | 0.3292 + 1.2581i | 0.3292 + 1.2581i | 0.6538 + 1.1143i | 0.6538 + 1.1143i | 0.3292 + 1.2581i | 0.3292 + 1.2581i |
| 8 | 0.3053 + 1.2660i | 0.3053 + 1.2660i | 0.3053 + 1.2660i | 0.3053 + 1.2660i | 0.6782 + 1.1122i | 0.6782 + 1.1122i | 0.6782 + 1.1122i | 0.6782 + 1.1122i |
| 8.5 | 0.2939 + 1.3233i | 0.2939 + 1.3233i | 0.2939 + 1.3233i | 0.2939 + 1.3233i | 0.7259 + 1.1487i | 0.7259 + 1.1487i | 0.7259 + 1.1487i | 0.7259 + 1.1487i |
| 9 | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i |
| 10 | 1.0178 + 0.2442i | 1.0178 + 0.2442i | 1.0178 + 0.2442i | 1.0178 + 0.2442i | 1.0178 + 0.2442i | 1.0178 + 0.2442i | 1.0178 + 0.2442i | 1.0178 + 0.2442i |
| 10.5 | 1.0097 + 0.2323i | 1.0097 + 0.2323i | 1.0097 + 0.2323i | 1.0097 + 0.2323i | 1.0097 + 0.2323i | 1.0097 + 0.2323i | 1.0097 + 0.2323i | 1.0097 + 0.2323i |
| 11 | 0.8326 + 1.1852i | 0.8326 + 1.1852i | 0.8326 + 1.1852i | 0.9045 + 1.1940i | 0.8326 + 1.1852i | 0.9224 + 1.2782i | 0.8326 + 1.1852i | 0.9224 + 1.2782i |
| 11.5 | 0.8003 + 1.1940i | 0.8003 + 1.1940i | 0.8003 + 1.1940i | 0.8003 + 1.1940i | 0.8003 + 1.1940i | 0.9318 + 1.2869i | 0.8003 + 1.1940i | 0.9318 + 1.2869i |
| 12 | 0.8135 + 1.1945i | 0.8135 + 1.1945i | 0.8135 + 1.1945i | 0.8135 + 1.1945i | 0.8135 + 1.1945i | 0.9619 + 1.3057i | 0.8135 + 1.1945i | 0.9619 + 1.3057i |
| 12.5 | 0.9959 + 1.0791i | 0.9959 + 1.0791i | 1.1779 + 1.3115i | 1.3201 + 1.2209i | 0.8160 + 1.1651i | 0.8160 + 1.1651i | 0.8160 + 1.1651i | 0.8160 + 1.1651i |
| 13 | 1.0742 + 0.2040i | 1.0742 + 0.2040i | 1.0742 + 0.2040i | 1.0742 + 0.2040i | 1.1379 + 0.1590i | 1.1379 + 0.1590i | 1.0742 + 0.2040i | 1.0742 + 0.2040i |
| 13.5 | 1.1489 + 1.1197i | 1.3661 + 1.0778i | 1.1464 + 1.2789i | 1.3152 + 1.1853i | 0.7879 + 1.1946i | 0.7879 + 1.1946i | 0.8426 + 1.2622i | 0.7879 + 1.1946i |
| 14 | 1.1053 + 1.1248i | 1.0498 + 1.0225i | 1.1053 + 1.1248i | 1.0498 + 1.0225i | 0.7876 + 1.1302i | 0.7876 + 1.1302i | 0.7876 + 1.1302i | 0.7876 + 1.1302i |
| 14.5 | 1.1367 + 1.1377i | 1.0803 + 1.0201i | 1.1367 + 1.1377i | 1.0803 + 1.0201i | 0.7911 + 1.1178i | 0.7911 + 1.1178i | 0.7911 + 1.1178i | 0.7911 + 1.1178i |
| 15 | 1.3865 + 0.8444i | 1.3175 + 0.7494i | 1.2330 + 0.6930i | 1.2330 + 0.6930i | 1.1306 + 0.8292i | 1.1306 + 0.8292i | 1.1306 + 0.8292i | 1.1126 + 0.7761i |
| 15.5 | 1.2987 + 0.8102i | 1.2995 + 0.7667i | 1.2077 + 0.7311i | 1.2077 + 0.7311i | 1.0121 + 0.8220i | 1.0121 + 0.8220i | 1.0121 + 0.8220i | 1.0121 + 0.8220i |

-continued

| | | | | | | | | |
|---|---|---|---|---|---|---|---|---|
| 16 | 1.2983 + 0.7167i | 1.3470 + 0.7459i | 1.2062 + 0.6208i | 1.2062 + 0.6208i | 1.0914 + 0.7539i | 1.0914 + 0.7539i | 1.0638 + 0.7215i | 1.0638 + 0.7215i |
| 16.5 | 1.4219 + 0.5556i | 1.4219 + 0.5556i | 1.2462 + 0.5855i | 1.2462 + 0.5855i | 1.6092 + 0.6786i | 1.5059 + 0.7313i | 1.2311 + 0.7394i | 1.2311 + 0.7394i |
| 17 | 1.4330 + 0.5504i | 1.4330 + 0.5504i | 1.2436 + 0.5789i | 1.2436 + 0.5789i | 1.6365 + 0.6778i | 1.5001 + 0.7492i | 1.2274 + 0.7447i | 1.2274 + 0.7447i |
| 17.5 | 1.4372 + 0.5485i | 1.4372 + 0.5485i | 1.2382 + 0.5741i | 1.2382 + 0.5741i | 1.6542 + 0.6753i | 1.4909 + 0.7585i | 1.2045 + 0.7465i | 1.2417 + 0.7541i |
| 18 | 1.4369 + 0.5468i | 1.4369 + 0.5468i | 1.2328 + 0.5692i | 1.2328 + 0.5692i | 1.6573 + 0.6715i | 1.4814 + 0.7623i | 1.1998 + 0.7521i | 1.2414 + 0.7575i |
| 18.5 | 1.3930 + 0.3640i | 1.3485 + 0.3893i | 1.1687 + 0.4247i | 1.1687 + 0.4247i | 1.5455 + 0.4576i | 1.3962 + 0.5257i | 1.1693 + 0.5271i | 1.1693 + 0.5271i |
| 19 | 1.3739 + 0.3510i | 1.3309 + 0.3746i | 1.1573 + 0.4118i | 1.1573 + 0.4118i | 1.5317 + 0.4427i | 1.3896 + 0.5168i | 1.1739 + 0.5355i | 1.1739 + 0.5355i |
| 19.5 | 1.3536 + 0.3475i | 1.2950 + 0.3231i | 1.1495 + 0.3917i | 1.1495 + 0.3917i | 1.4933 + 0.4426i | 1.7116 + 0.5868i | 1.1713 + 0.5146i | 1.1713 + 0.5146i |
| 20 | 1.7660 + 0.7375i | 1.4962 + 0.6907i | 1.2346 + 0.6969i | 1.2346 + 0.6969i | 1.3547 + 0.9559i | 1.4932 + 0.8746i | 1.1716 + 0.9087i | 1.1490 + 0.8711i |
| 20.5 | 1.3864 + 0.4526i | 1.3864 + 0.4526i | 1.1991 + 0.4770i | 1.1991 + 0.4770i | 1.4531 + 0.6314i | 1.6329 + 0.5542i | 1.2252 + 0.6541i | 1.2252 + 0.6541i |
| 21 | 1.4522 + 0.5679i | 1.6057 + 0.5378i | 1.3175 + 0.5452i | 1.1940 + 0.5550i | 1.4469 + 0.7784i | 1.6981 + 0.7459i | 1.2631 + 0.7452i | 1.1908 + 0.6751i |
| 21.5 | 1.4604 + 0.5935i | 1.7875 + 0.3980i | 1.2674 + 0.5839i | 1.7463 + 0.6216i | 1.4419 + 0.7605i | 1.6376 + 0.8704i | 1.2514 + 0.7312i | 1.1983 + 0.7401i |
| 22 | 1.4439 + 0.5853i | 1.6108 + 0.5303i | 1.3004 + 0.5868i | 1.1846 + 0.5909i | 1.4889 + 0.7419i | 1.7240 + 0.7079i | 1.3086 + 0.7519i | 1.1714 + 0.7584i |
| 22.5 | 1.5607 + 0.5647i | 1.7514 + 0.6378i | 1.1625 + 0.5397i | 1.2356 + 0.5517i | 1.4933 + 0.7257i | 1.3820 + 0.6548i | 1.2027 + 0.7601i | 1.2562 + 0.6724i |
| 23 | 1.6061 + 0.5652i | 1.8194 + 0.5891i | 1.1596 + 0.5779i | 1.2454 + 0.5628i | 1.5850 + 0.7789i | 1.4301 + 0.6629i | 1.1633 + 0.7212i | 1.3024 + 0.6774i |
| 23.5 | 1.2583 + 0.6069i | 1.7469 + 0.5762i | 1.1684 + 0.6129i | 1.5785 + 0.4968i | 1.6073 + 0.8302i | 1.4743 + 0.6934i | 1.1800 + 0.7580i | 1.3289 + 0.7757i |
| 24 | 1.3854 + 0.6727i | 1.2630 + 0.5854i | 1.2543 + 0.7381i | 1.1484 + 0.5860i | 1.5471 + 0.7468i | 1.6867 + 0.5760i | 1.1344 + 0.7766i | 1.1028 + 0.6774i |
| 24.5 | 1.1699 + 0.6085i | 1.6812 + 0.6256i | 1.1989 + 0.6932i | 1.5850 + 0.4763i | 1.5370 + 0.8085i | 1.4838 + 0.6414i | 1.2190 + 0.8012i | 1.3611 + 0.7212i |
| 25 | 1.2811 + 0.6537i | 1.5886 + 0.4923i | 1.1525 + 0.6181i | 1.7297 + 0.3433i | 1.6454 + 0.6927i | 1.4737 + 0.6267i | 1.3158 + 0.8304i | 1.4511 + 0.7770i |
| 25.5 | 1.4469 + 0.5411i | 1.3690 + 0.6538i | 1.3128 + 0.5092i | 1.2090 + 0.5803i | 1.5706 + 0.6441i | 1.3251 + 0.7695i | 1.1678 + 0.8071i | 1.1961 + 0.6963i |
| 26 | 1.4116 + 0.5752i | 1.5736 + 0.6220i | 1.1918 + 0.6209i | 1.5623 + 0.4562i | 1.5497 + 0.8311i | 1.4238 + 0.7455i | 1.1749 + 0.7608i | 1.2959 + 0.7280i |
| 26.5 | 1.5874 + 0.4394i | 1.5767 + 0.6137i | 1.1624 + 0.5760i | 1.2819 + 0.5439i | 1.5158 + 0.8040i | 1.4253 + 0.6800i | 1.2447 + 0.7358i | 1.3051 + 0.6448i |
| 27 | 1.5345 + 0.4449i | 1.5144 + 0.5973i | 1.2543 + 0.5426i | 1.3709 + 0.5896i | 1.4385 + 0.7521i | 1.1966 + 0.7287i | 1.3082 + 0.8079i | 1.2925 + 0.6791i |
| 27.5 | 1.4370 + 0.4627i | 1.4958 + 0.5797i | 1.2388 + 0.5368i | 1.3470 + 0.5780i | 1.4133 + 0.8583i | 1.2565 + 0.6932i | 1.2710 + 0.8408i | 1.3720 + 0.7047i |
| 28 | 1.5172 + 0.4779i | 1.4228 + 0.5698i | 1.2002 + 0.5259i | 1.2996 + 0.5704i | 1.4031 + 0.8380i | 1.2168 + 0.6822i | 1.2773 + 0.8086i | 1.3336 + 0.69091 |

| SNR/w | w24 | w25 | w26 | w27 | w28 | w29 | w30 | w31 |
|---|---|---|---|---|---|---|---|---|
| 7 | 0.6413 + 1.1550i | 0.5789 + 1.0674i | 0.3707 + 1.2911i | 0.3565 + 1.1738i | 0.5789 + 1.0674i | 0.5789 + 1.0674i | 0.3565 + 1.1738i | 0.3565 + 1.1738i |
| 7.5 | 0.6538 + 1.1143i | 0.6538 + 1.1143i | 0.3292 + 1.2581i | 0.3292 + 1.2581i | 0.5815 + 1.0241i | 0.5815 + 1.0241i | 0.3167 + 1.1419i | 0.3167 + 1.1419i |
| 8 | 0.2944 + 1.1432i | 0.2944 + 1.1432i | 0.2944 + 1.1432i | 0.2944 + 1.1432i | 0.5978 + 1.0154i | 0.5978 + 1.0154i | 0.5978 + 1.0154i | 0.5978 + 1.0154i |
| 8.5 | 0.2766 + 1.1195i | 0.2766 + 1.1195i | 0.2766 + 1.1195i | 0.2766 + 1.1195i | 0.5908 + 0.9851i | 0.5908 + 0.9851i | 0.5908 + 0.9851i | 0.5908 + 0.9851i |
| 9 | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i |
| 10 | 1.0178 + 0.2442i | 1.0178 + 0.2442i | 1.0178 + 0.2442i | 1.0178 + 0.2442i | 1.0178 + 0.2442i | 1.0178 + 0.2442i | 1.0178 + 0.2442i | 1.0178 + 0.2442i |
| 10.5 | 1.0097 + 0.2323i | 1.0097 + 0.2323i | 1.0097 + 0.2323i | 1.0097 + 0.2323i | 1.0097 + 0.2323i | 1.0097 + 0.2323i | 1.0097 + 0.2323i | 1.0097 + 0.2323i |
| 11 | 0.7437 + 1.2072i | 0.7437 + 1.2072i | 0.7437 + 1.2072i | 0.8326 + 1.1852i | 0.7437 + 1.2072i | 0.7446 + 1.2677i | 0.7437 + 1.2072i | 0.7437 + 1.2072i |
| 11.5 | 0.8003 + 1.1940i | 0.8003 + 1.1940i | 0.8003 + 1.1940i | 0.8003 + 1.1940i | 0.7226 + 1.2640i | 0.7226 + 1.2640i | 0.8003 + 1.1940i | 0.8003 + 1.1940i |
| 12 | 0.6977 + 1.2633i | 0.6977 + 1.2633i | 0.8135 + 1.1945i | 0.8135 + 1.1945i | 0.6977 + 1.2633i | 0.6977 + 1.2633i | 0.8135 + 1.1945i | 0.8135 + 1.1945i |
| 12.5 | 0.9959 + 1.0791i | 0.9959 + 1.0791i | 0.9959 + 1.0791i | 0.9959 + 1.0791i | 0.8160 + 1.1651i | 0.8160 + 1.1651i | 0.8160 + 1.1651i | 0.8160 + 1.1651i |

-continued

| | | | | | | | | |
|---|---|---|---|---|---|---|---|---|
| 13 | 1.1043 + 0.2710i | 1.1043 + 0.2710i | 1.1043 + 0.2710i | 1.1043 + 0.2710i | 1.1641 + 0.2297i | 1.1043 + 0.2710i | 1.0742 + 0.2040i | 1.1043 + 0.2710i |
| 13.5 | 0.9715 + 0.9809i | 0.9715 + 0.9809i | 0.9715 + 0.9809i | 0.9715 + 0.9809i | 0.8494 + 1.0534i | 0.8494 + 1.0534i | 0.8494 + 1.0534i | 0.8494 + 1.0534i |
| 14 | 0.9635 + 0.9170i | 0.9635 + 0.9170i | 0.9635 + 0.9170i | 0.9635 + 0.9170i | 0.7728 + 1.0636i | 0.7728 + 1.0636i | 0.7876 + 1.1302i | 0.7728 + 1.0636i |
| 14.5 | 0.9763 + 0.8886i | 0.9763 + 0.8886i | 0.9763 + 0.8886i | 0.9763 + 0.8886i | 0.7911 + 1.1178i | 0.7855 + 1.0474i | 0.7911 + 1.1178i | 0.7855 + 1.0474i |
| 15 | 1.0121 + 0.6032i | 1.0121 + 0.6032i | 1.0121 + 0.6032i | 1.0121 + 0.6032i | 0.9830 + 0.7027i | 0.9830 + 0.7027i | 0.9830 + 0.7027i | 0.9830 + 0.7027i |
| 15.5 | 1.0118 + 0.5724i | 1.0118 + 0.5724i | 1.0118 + 0.5724i | 1.0118 + 0.5724i | 0.9801 + 0.6215i | 0.9801 + 0.6215i | 0.9801 + 0.6215i | 0.9801 + 0.6215i |
| 16 | 0.9674 + 0.5299i | 0.9674 + 0.5299i | 0.9929 + 0.5319i | 0.9674 + 0.5299i | 0.9624 + 0.5996i | 0.9624 + 0.5996i | 0.9624 + 0.5996i | 0.9624 + 0.5996i |
| 16.5 | 0.9292 + 0.5928i | 0.9292 + 0.5928i | 0.9946 + 0.5942i | 0.9946 + 0.5942i | 0.9211 + 0.6843i | 0.9211 + 0.6843i | 0.9838 + 0.6926i | 0.9838 + 0.6926i |
| 17 | 0.9244 + 0.5890i | 0.9244 + 0.5890i | 0.9955 + 0.5891i | 0.9955 + 0.5891i | 0.9162 + 0.6919i | 0.9162 + 0.6919i | 0.9842 + 0.6988i | 0.9842 + 0.6988i |
| 17.5 | 0.9226 + 0.5846i | 0.9226 + 0.5846i | 0.9985 + 0.5838i | 0.9985 + 0.5838i | 0.9135 + 0.7046i | 0.9135 + 0.7046i | 0.9860 + 0.7101i | 0.9860 + 0.7101i |
| 18 | 0.9216 + 0.5798i | 0.9216 + 0.5798i | 1.0034 + 0.5785i | 1.0034 + 0.5785i | 0.9120 + 0.7182i | 0.9120 + 0.7182i | 0.9903 + 0.7224i | 0.9903 + 0.7224i |
| 18.5 | 0.8679 + 0.5021i | 0.8679 + 0.5021i | 0.9292 + 0.4862i | 0.9292 + 0.4862i | 0.9067 + 0.5983i | 0.9067 + 0.5983i | 0.9680 + 0.5733i | 0.9680 + 0.5733i |
| 19 | 0.8747 + 0.4890i | 0.8747 + 0.4890i | 0.9383 + 0.4703i | 0.9383 + 0.4703i | 0.9215 + 0.6083i | 0.9215 + 0.6083i | 0.9820 + 0.5819i | 0.9820 + 0.5819i |
| 19.5 | 0.8811 + 0.4849i | 0.8811 + 0.4849i | 0.9429 + 0.4612i | 0.9429 + 0.4612i | 0.9418 + 0.6248i | 0.9418 + 0.6248i | 1.0102 + 0.5894i | 1.0102 + 0.5894i |
| 20 | 0.9236 + 0.6522i | 0.9236 + 0.6522i | 1.0350 + 0.6700i | 1.0350 + 0.6700i | 0.8720 + 0.8422i | 0.8881 + 0.8007i | 0.9559 + 0.8772i | 0.9855 + 0.8360i |
| 20.5 | 0.9223 + 0.5412i | 0.9223 + 0.5412i | 1.0283 + 0.5133i | 1.0283 + 0.5133i | 0.9484 + 0.7077i | 0.9484 + 0.7077i | 1.0612 + 0.6903i | 1.0612 + 0.6903i |
| 21 | 0.8935 + 0.5656i | 0.8935 + 0.5656i | 0.9979 + 0.5557i | 1.0380 + 0.5582i | 0.8971 + 0.7130i | 0.8971 + 0.7130i | 1.0274 + 0.7211i | 1.0515 + 0.6813i |
| 21.5 | 0.9084 + 0.5872i | 0.9084 + 0.5872i | 1.0543 + 0.5863i | 1.0543 + 0.5863i | 0.8996 + 0.7455i | 0.8996 + 0.7455i | 1.0486 + 0.7415i | 1.0486 + 0.7415i |
| 22 | 0.8887 + 0.5713i | 0.8887 + 0.5713i | 1.0106 + 0.5766i | 1.0532 + 0.5907i | 0.8774 + 0.7307i | 0.8698 + 0.6919i | 0.9792 + 0.7557i | 1.0444 + 0.7361i |
| 22.5 | 0.8966 + 0.5862i | 0.8966 + 0.5862i | 1.0483 + 0.5684i | 1.0223 + 0.6001i | 0.9017 + 0.7879i | 0.9044 + 0.7215i | 1.0636 + 0.7751i | 1.0312 + 0.7129i |
| 23 | 0.8951 + 0.5381i | 0.9020 + 0.5765i | 1.0480 + 0.5500i | 1.0052 + 0.5823i | 0.9122 + 0.8113i | 0.8977 + 0.7054i | 1.0333 + 0.7739i | 0.9929 + 0.6941i |
| 23.5 | 0.8979 + 0.5389i | 0.9021 + 0.5899i | 1.0570 + 0.5654i | 1.0095 + 0.5968i | 0.8981 + 0.7978i | 0.9002 + 0.7040i | 1.0453 + 0.7856i | 1.0004 + 0.7110i |
| 24 | 0.8946 + 0.5174i | 0.8865 + 0.5769i | 0.9939 + 0.5077i | 1.0334 + 0.5527i | 0.8883 + 0.7796i | 0.8934 + 0.6762i | 0.9999 + 0.7892i | 1.0024 + 0.6743i |
| 24.5 | 1.0545 + 0.6208i | 0.8992 + 0.5849i | 1.0410 + 0.5398i | 0.9570 + 0.5335i | 1.0118 + 0.6978i | 0.9039 + 0.7061i | 1.0649 + 0.7904i | 0.9378 + 0.8081i |
| 25 | 0.8835 + 0.5791i | 0.8749 + 0.6592i | 1.0400 + 0.6364i | 0.9662 + 0.6804i | 1.1689 + 0.7806i | 0.8574 + 0.7588i | 1.0682 + 0.7758i | 0.9493 + 0.7863i |
| 25.5 | 0.9398 + 0.5123i | 0.9446 + 0.5967i | 1.0491 + 0.4947i | 1.0814 + 0.5792i | 0.9376 + 0.7957i | 0.9469 + 0.6888i | 1.0478 + 0.7966i | 1.0645 + 0.6841i |
| 26 | 1.0266 + 0.5732i | 0.9271 + 0.6038i | 1.0759 + 0.6299i | 0.9204 + 0.6524i | 1.0128 + 0.7985i | 0.9004 + 0.8291i | 1.0612 + 0.7235i | 0.9050 + 0.7337i |
| 26.5 | 1.0181 + 0.6445i | 0.9222 + 0.6468i | 1.0522 + 0.5581i | 0.9366 + 0.5502i | 1.0179 + 0.7432i | 0.9097 + 0.7340i | 1.1323 + 0.7123i | 0.9024 + 0.8172i |
| 27 | 1.0119 + 0.5802i | 0.9632 + 0.6574i | 1.1374 + 0.5920i | 1.0660 + 0.6825i | 1.0530 + 0.8275i | 0.9525 + 0.7602i | 1.1564 + 0.8642i | 0.9247 + 0.8497i |
| 27.5 | 1.1048 + 0.5047i | 0.9732 + 0.6687i | 1.1360 + 0.5830i | 1.0261 + 0.6028i | 1.0533 + 0.7823i | 0.9559 + 0.7668i | 1.1523 + 0.8406i | 0.9478 + 0.8579i |
| 28 | 1.0788 + 0.4957i | 0.9727 + 0.6831i | 1.1083 + 0.5853i | 1.0158 + 0.6073i | 1.0912 + 0.7187i | 0.9908 + 0.7740i | 1.0145 + 0.8889i | 0.9211 + 0.90151 |

| SNR/w | w32 | w33 | w34 | w35 | w36 | w37 | w38 | w39 |
|---|---|---|---|---|---|---|---|---|
| 7 | 0.6413 + 1.1550i | 0.6413 + 1.1550i | 0.3707 + 1.2911i | 0.3707 + 1.2911i | 0.6413 + 1.1550i | 0.5789 + 1.0674i | 0.3707 + 1.2911i | 0.3565 + 1.1738i |
| 7.5 | 0.6538 + 1.1143i | 0.6538 + 1.1143i | 0.3292 + 1.2581i | 0.3292 + 1.2581i | 0.6538 + 1.1143i | 0.6538 + 1.1143i | 0.3292 + 1.2581i | 0.3292 + 1.2581i |
| 8 | 0.3053 + 1.2660i | 0.3053 + 1.2660i | 0.3053 + 1.2660i | 0.3053 + 1.2660i | 0.6782 + 1.1122i | 0.6782 + 1.1122i | 0.6782 + 1.1122i | 0.6782 + 1.1122i |
| 8.5 | 0.2939 + 1.3233i | 0.2939 + 1.3233i | 0.2939 + 1.3233i | 0.2939 + 1.3233i | 0.7259 + 1.1487i | 0.7259 + 1.1487i | 0.7259 + 1.1487i | 0.7259 + 1.1487i |
| 9 | 1.7494 + 1.1716i | 1.2549 + 0.8225i | 1.2549 + 0.8225i | 1.2549 + 0.8225i | 1.2549 + 0.8225i | 1.2549 + 0.8225i | 1.2549 + 0.8225i | 1.1712 + 0.7580i |
| 9.5 | 1.7496 + 1.1695i | 1.2570 + 0.8325i | 1.2570 + 0.8325i | 1.2570 + 0.8325i | 1.2570 + 0.8325i | 1.2570 + 0.8325i | 1.2570 + 0.8325i | 1.1846 + 0.7800i |
| 10 | 1.7476 + 1.1668i | 1.2379 + 0.8253i | 1.2379 + 0.8253i | 1.2379 + 0.8253i | 1.2379 + 0.8253i | 1.2379 + 0.8253i | 1.2379 + 0.8253i | 1.2379 + 0.8253i |

-continued

| | | | | | | | | |
|---|---|---|---|---|---|---|---|---|
| 10.5 | 1.6826 + 1.1762i | 1.2263 + 0.8203i | 1.3288 + 0.9046i | 1.2263 + 0.8203i | 1.2263 + 0.8203i | 1.2263 + 0.8203i | 1.2263 + 0.8203i | 1.2263 + 0.8203i |
| 11 | 0.2043 + 0.9827i | 0.2043 + 0.9827i | 0.2043 + 0.9827i | 0.2043 + 0.9827i | 0.2043 + 0.9827i | 0.2043 + 0.9827i | 0.2043 + 0.9827i | 0.2043 + 0.9827i |
| 11.5 | 0.1917 + 1.0308i | 0.1917 + 1.0308i | 0.1917 + 1.0308i | 0.1917 + 1.0308i | 0.1917 + 1.0308i | 0.1917 + 1.0308i | 0.1917 + 1.0308i | 0.1917 + 1.0308i |
| 12 | 0.1845 + 1.0300i | 0.1845 + 1.0300i | 0.1845 + 1.0300i | 0.1845 + 1.0300i | 0.1845 + 1.0300i | 0.1845 + 1.0300i | 0.1845 + 1.0300i | 0.1845 + 1.0300i |
| 12.5 | 0.2108 + 1.0960i | 0.2108 + 1.0960i | 0.2108 + 1.0960i | 0.2108 + 1.0960i | 0.2108 + 1.0960i | 0.2108 + 1.0960i | 0.2108 + 1.0960i | 0.2108 + 1.0960i |
| 13 | 1.0982 + 1.2299i | 1.1688 + 1.2296i | 1.1143 + 1.0869i | 1.2060 + 1.1004i | 0.9905 + 0.9511i | 0.9905 + 0.9511i | 0.9905 + 0.9511i | 0.9905 + 0.9511i |
| 13.5 | 0.2107 + 1.0848i | 0.2107 + 1.0848i | 0.2107 + 1.0848i | 0.2107 + 1.0848i | 0.3024 + 1.0991i | 0.3024 + 1.0991i | 0.3024 + 1.0991i | 0.3024 + 1.0991i |
| 14 | 0.1522 + 1.1010i | 0.1522 + 1.1010i | 0.1522 + 1.1010i | 0.1522 + 1.1010i | 0.3073 + 1.0692i | 0.3073 + 1.0692i | 0.3073 + 1.0692i | 0.3073 + 1.0692i |
| 14.5 | 0.1419 + 1.1228i | 0.1419 + 1.1228i | 0.1419 + 1.1228i | 0.1419 + 1.1228i | 0.3330 + 1.0690i | 0.3330 + 1.0690i | 0.3330 + 1.0690i | 0.3330 + 1.0690i |
| 15 | 0.1805 + 1.5284i | 0.4911 + 1.4059i | 0.1805 + 1.5284i | 0.4911 + 1.4059i | 0.6404 + 1.0091i | 0.6282 + 1.0792i | 0.6404 + 1.0091i | 0.6404 + 1.0091i |
| 15.5 | 0.1369 + 1.6282i | 0.3026 + 1.5129i | 0.1369 + 1.6282i | 0.3026 + 1.5129i | 0.6508 + 0.9861i | 0.6508 + 0.9861i | 0.6508 + 0.9861i | 0.6508 + 0.9861i |
| 16 | 0.3712 + 1.7894i | 0.5775 + 1.3833i | 0.5311 + 1.7286i | 0.5825 + 1.4596i | 0.6693 + 0.9448i | 0.6549 + 0.9826i | 0.6693 + 0.9448i | 0.6549 + 0.9826i |
| 16.5 | 0.9790 + 1.7611i | 0.5632 + 1.2042i | 0.6550 + 1.8625i | 0.5632 + 1.2042i | 0.5726 + 0.9159i | 0.5700 + 0.9781i | 0.5726 + 0.9159i | 0.5700 + 0.9781i |
| 17 | 0.9719 + 1.7576i | 0.5632 + 1.2036i | 0.6484 + 1.8669i | 0.5632 + 1.2036i | 0.5708 + 0.9120i | 0.5693 + 0.9768i | 0.5708 + 0.9120i | 0.5693 + 0.9768i |
| 17.5 | 0.9596 + 1.7576i | 0.5628 + 1.2012i | 0.6359 + 1.8638i | 0.5628 + 1.2012i | 0.5682 + 0.9084i | 0.5682 + 0.9765i | 0.5682 + 0.9084i | 0.5682 + 0.9765i |
| 18 | 0.9565 + 1.7467i | 0.5597 + 1.1973i | 0.6376 + 1.8550i | 0.5597 + 1.1973i | 0.5627 + 0.9080i | 0.5638 + 0.9795i | 0.5627 + 0.9080i | 0.5638 + 0.9795i |
| 18.5 | 0.8180 + 1.4853i | 0.7467 + 1.2574i | 0.8969 + 1.7495i | 0.7299 + 1.1971i | 0.6496 + 0.9248i | 0.6701 + 0.9929i | 0.6496 + 0.9248i | 0.6701 + 0.9929i |
| 19 | 0.8131 + 1.4757i | 0.7498 + 1.2637i | 0.8853 + 1.7279i | 0.7348 + 1.1948i | 0.6625 + 0.9215i | 0.6829 + 0.9968i | 0.6625 + 0.9215i | 0.6829 + 0.9968i |
| 19.5 | 0.8222 + 1.7689i | 0.7329 + 1.2092i | 0.7753 + 1.4943i | 0.7495 + 1.2497i | 0.6759 + 0.9245i | 0.6976 + 1.0138i | 0.6759 + 0.9245i | 0.6976 + 1.0138i |
| 20 | 0.5491 + 1.7035i | 0.4164 + 1.1274i | 0.3416 + 1.3191i | 0.4000 + 1.1739i | 0.5011 + 0.8954i | 0.4761 + 0.9710i | 0.5011 + 0.8954i | 0.4761 + 0.9710i |
| 20.5 | 0.5496 + 1.8328i | 0.5986 + 1.2193i | 0.5741 + 1.4423i | 0.5986 + 1.2193i | 0.6155 + 0.9153i | 0.6139 + 1.0222i | 0.6155 + 0.9153i | 0.6139 + 1.0222i |
| 21 | 0.5908 + 1.4191i | 0.6104 + 1.2526i | 0.4486 + 1.8391i | 0.6140 + 1.1685i | 0.5778 + 0.8980i | 0.5917 + 1.0226i | 0.5778 + 0.8980i | 0.5917 + 1.0226i |
| 21.5 | 0.5651 + 1.6424i | 0.5819 + 1.1504i | 0.5713 + 1.4458i | 0.5849 + 1.2696i | 0.5307 + 0.8825i | 0.5536 + 1.0212i | 0.5307 + 0.8825i | 0.5512 + 0.9689i |
| 22 | 0.6243 + 1.4649i | 0.5939 + 1.3037i | 0.4047 + 1.8156i | 0.5830 + 1.2010i | 0.5691 + 0.9002i | 0.5648 + 1.0360i | 0.5691 + 0.9002i | 0.5648 + 1.0360i |
| 22.5 | 0.6526 + 1.7382i | 0.5201 + 1.1584i | 0.5875 + 1.5167i | 0.5606 + 1.2579i | 0.5528 + 0.8893i | 0.5343 + 1.0408i | 0.5528 + 0.8893i | 0.5685 + 1.0088i |
| 23 | 0.6244 + 1.6853i | 0.5396 + 1.1646i | 0.5897 + 1.4912i | 0.5627 + 1.2896i | 0.5300 + 0.8893i | 0.5385 + 1.0557i | 0.5662 + 0.9004i | 0.5719 + 1.0071i |
| 23.5 | 0.5088 + 1.7163i | 0.5473 + 1.1551i | 0.5636 + 1.4803i | 0.5544 + 1.2433i | 0.5327 + 0.8892i | 0.5348 + 1.0466i | 0.5758 + 0.8987i | 0.5771 + 1.0111i |
| 24 | 0.6364 + 1.6353i | 0.5959 + 1.1661i | 0.6239 + 1.4562i | 0.6065 + 1.3009i | 0.5237 + 0.8675i | 0.5685 + 1.0623i | 0.5644 + 0.8873i | 0.5725 + 0.9911i |
| 24.5 | 0.6032 + 1.6635i | 0.5024 + 1.1613i | 0.6020 + 1.2960i | 0.5939 + 1.1667i | 0.5099 + 0.9139i | 0.5036 + 1.0359i | 0.5855 + 0.9120i | 0.5903 + 1.0334i |
| 25 | 0.6389 + 1.6546i | 0.4853 + 1.1426i | 0.5804 + 1.3364i | 0.5604 + 1.2030i | 0.4874 + 0.9257i | 0.4845 + 1.0420i | 0.5645 + 0.9258i | 0.5744 + 1.0392i |
| 25.5 | 0.5812 + 1.5932i | 0.5105 + 1.2487i | 0.5473 + 1.4117i | 0.5765 + 1.1450i | 0.5751 + 0.8885i | 0.5696 + 0.9833i | 0.6604 + 0.8996i | 0.6267 + 1.0328i |
| 26 | 0.4991 + 1.5686i | 0.5486 + 1.1925i | 0.6897 + 1.1182i | 0.6481 + 1.2195i | 0.6050 + 0.9119i | 0.5370 + 0.9447i | 0.6526 + 1.0254i | 0.5772 + 1.0462i |
| 26.5 | 0.5345 + 1.6138i | 0.5130 + 1.1337i | 0.6387 + 1.0936i | 0.5568 + 1.2390i | 0.6269 + 0.8981i | 0.4851 + 1.0350i | 0.6143 + 0.9936i | 0.5184 + 0.9539i |
| 27 | 0.4015 + 1.5842i | 0.5558 + 1.2016i | 0.6111 + 1.3403i | 0.6382 + 1.1360i | 0.5330 + 0.8941i | 0.4820 + 1.1330i | 0.6037 + 0.9226i | 0.6160 + 1.0341i |
| 27.5 | 0.4096 + 1.5974i | 0.5213 + 1.2084i | 0.5614 + 1.3474i | 0.6135 + 1.1429i | 0.5637 + 0.8891i | 0.4831 + 1.1158i | 0.6283 + 0.9257i | 0.6504 + 1.0330i |
| 28 | 0.4374 + 1.5965i | 0.6091 + 1.1608i | 0.5915 + 1.3566i | 0.6593 + 1.2473i | 0.5376 + 0.9041i | 0.6008 + 1.0615i | 0.6254 + 0.8954i | 0.6315 + 0.97891 |

| SNR/w | w40 | w41 | w42 | w43 | w44 | w45 | w46 | w47 |
|---|---|---|---|---|---|---|---|---|
| 7 | 0.6413 + 1.1550i | 0.5789 + 1.0674i | 0.3707 + 1.2911i | 0.3565 + 1.1738i | 0.5789 + 1.0674i | 0.5789 + 1.0674i | 0.3565 + 1.1738i | 0.3565 + 1.1738i |
| 7.5 | 0.6538 + 1.1143i | 0.6538 + 1.1143i | 0.3292 + 1.2581i | 0.3292 + 1.2581i | 0.5815 + 1.0241i | 0.5815 + 1.0241i | 0.3167 + 1.1419i | 0.3167 + 1.1419i |

-continued

| | | | | | | | | |
|---|---|---|---|---|---|---|---|---|
| 8 | 0.2944 + 1.1432i | 0.2944 + 1.1432i | 0.2944 + 1.1432i | 0.2944 + 1.1432i | 0.5978 + 1.0154i | 0.5978 + 1.0154i | 0.5978 + 1.0154i | 0.5978 + 1.0154i |
| 8.5 | 0.2766 + 1.1195i | 0.2766 + 1.1195i | 0.2766 + 1.1195i | 0.2766 + 1.1195i | 0.5908 + 0.9851i | 0.5908 + 0.9851i | 0.5908 + 0.9851i | 0.5908 + 0.9851i |
| 9 | 1.2549 + 0.8225i | 1.2549 + 0.8225i | 1.2549 + 0.8225i | 1.1712 + 0.7580i | 1.2549 + 0.8225i | 1.1712 + 0.7580i | 1.1712 + 0.7580i | 1.1712 + 0.7580i |
| 9.5 | 1.2570 + 0.8325i | 1.2570 + 0.8325i | 1.2570 + 0.8325i | 1.1846 + 0.7800i | 1.2570 + 0.8325i | 1.1846 + 0.7800i | 1.1846 + 0.7800i | 1.1846 + 0.7800i |
| 10 | 1.2379 + 0.8253i | 1.2379 + 0.8253i | 1.2379 + 0.8253i | 1.2379 + 0.8253i | 1.2379 + 0.8253i | 1.2379 + 0.8253i | 1.2379 + 0.8253i | 1.1727 + 0.7818i |
| 10.5 | 1.2263 + 0.8203i | 1.2263 + 0.8203i | 1.2263 + 0.8203i | 1.1745 + 0.7815i | 1.2263 + 0.8203i | 1.1745 + 0.7815i | 1.2263 + 0.8203i | 1.1745 + 0.7815i |
| 11 | 0.1932 + 1.0799i | 0.1932 + 1.0799i | 0.1932 + 1.0799i | 0.1932 + 1.0799i | 0.1932 + 1.0799i | 0.1932 + 1.0799i | 0.1932 + 1.0799i | 0.1932 + 1.0799i |
| 11.5 | 0.1917 + 1.0308i | 0.1917 + 1.0308i | 0.1917 + 1.0308i | 0.1917 + 1.0308i | 0.1917 + 1.0308i | 0.1917 + 1.0308i | 0.1917 + 1.0308i | 0.1917 + 1.0308i |
| 12 | 0.1845 + 1.0300i | 0.1845 + 1.0300i | 0.1845 + 1.0300i | 0.1845 + 1.0300i | 0.1845 + 1.0300i | 0.1845 + 1.0300i | 0.1845 + 1.0300i | 0.1845 + 1.0300i |
| 12.5 | 0.2108 + 1.0960i | 0.2108 + 1.0960i | 0.2108 + 1.0960i | 0.2108 + 1.0960i | 0.2108 + 1.0960i | 0.2108 + 1.0960i | 0.2108 + 1.0960i | 0.2108 + 1.0960i |
| 13 | 1.1188 + 0.8173i | 1.1188 + 0.8173i | 1.1188 + 0.8173i | 1.1853 + 0.8237i | 1.0310 + 0.8384i | 1.0310 + 0.8384i | 1.0310 + 0.8384i | 1.1188 + 0.8173i |
| 13.5 | 0.1493 + 1.1587i | 0.1493 + 1.1587i | 0.2107 + 1.0848i | 0.2107 + 1.0848i | 0.2304 + 1.1738i | 0.2304 + 1.1738i | 0.2107 + 1.0848i | 0.2107 + 1.0848i |
| 14 | 0.1522 + 1.1010i | 0.1522 + 1.1010i | 0.1522 + 1.1010i | 0.1522 + 1.1010i | 0.3073 + 1.0692i | 0.3073 + 1.0692i | 0.3073 + 1.0692i | 0.3073 + 1.0692i |
| 14.5 | 0.1419 + 1.1228i | 0.1419 + 1.1228i | 0.1419 + 1.1228i | 0.1419 + 1.1228i | 0.3330 + 1.0690i | 0.3330 + 1.0690i | 0.3330 + 1.0690i | 0.3330 + 1.0690i |
| 15 | 0.1729 + 1.6258i | 0.4911 + 1.4059i | 0.2360 + 1.5834i | 0.4911 + 1.4059i | 0.6404 + 1.0091i | 0.6282 + 1.0792i | 0.6404 + 1.0091i | 0.6404 + 1.0091i |
| 15.5 | 0.1783 + 2.0138i | 0.4789 + 1.4380i | 0.4591 + 1.9026i | 0.4789 + 1.4380i | 0.6150 + 1.0563i | 0.6104 + 1.1350i | 0.6150 + 1.0563i | 0.6104 + 1.1350i |
| 16 | 0.1615 + 1.9642i | 0.6491 + 1.3361i | 0.8166 + 1.8585i | 0.6677 + 1.3884i | 0.6693 + 0.9448i | 0.6706 + 1.0395i | 0.6693 + 0.9448i | 0.6706 + 1.0395i |
| 16.5 | 0.7602 + 1.4834i | 0.6346 + 1.2450i | 0.6704 + 1.5226i | 0.6346 + 1.2450i | 0.6561 + 0.9154i | 0.6510 + 0.9712i | 0.6561 + 0.9154i | 0.6510 + 0.9712i |
| 17 | 0.7674 + 1.4916i | 0.6351 + 1.2441i | 0.6589 + 1.5275i | 0.6351 + 1.2441i | 0.6588 + 0.9112i | 0.6562 + 0.9680i | 0.6588 + 0.9112i | 0.6562 + 0.9680i |
| 17.5 | 0.7728 + 1.4984i | 0.6376 + 1.2436i | 0.6465 + 1.5284i | 0.6376 + 1.2436i | 0.6641 + 0.9076i | 0.6642 + 0.9656i | 0.6641 + 0.9076i | 0.6642 + 0.9656i |
| 18 | 0.7831 + 1.4978i | 0.6436 + 1.2433i | 0.6418 + 1.5205i | 0.6436 + 1.2433i | 0.6733 + 0.9065i | 0.6758 + 0.9650i | 0.6733 + 0.9065i | 0.6758 + 0.9650i |
| 18.5 | 1.0099 + 1.3939i | 0.9240 + 1.1657i | 1.1966 + 1.6143i | 0.8847 + 1.1340i | 0.8199 + 0.8642i | 0.8439 + 0.9386i | 0.8199 + 0.8642i | 0.8439 + 0.9386i |
| 19 | 1.0089 + 1.3854i | 0.9317 + 1.1639i | 1.1714 + 1.6030i | 0.8884 + 1.1335i | 0.8329 + 0.8609i | 0.8584 + 0.9453i | 0.8329 + 0.8609i | 0.8584 + 0.9453i |
| 19.5 | 1.0472 + 1.3158i | 0.9601 + 1.1483i | 0.9672 + 1.4659i | 0.9033 + 1.1563i | 0.8469 + 0.8661i | 0.8955 + 0.9529i | 0.8469 + 0.8661i | 0.8608 + 0.9652i |
| 20 | 0.5008 + 1.4978i | 0.5599 + 1.2077i | 0.4017 + 1.3861i | 0.4910 + 1.2146i | 0.6594 + 0.9506i | 0.6244 + 1.0551i | 0.6594 + 0.9506i | 0.6008 + 1.0207i |
| 20.5 | 0.8136 + 1.4139i | 0.7771 + 1.2124i | 0.6965 + 1.5705i | 0.7771 + 1.2124i | 0.7896 + 0.9027i | 0.7936 + 1.0257i | 0.7896 + 0.9027i | 0.7936 + 1.0257i |
| 21 | 0.7412 + 1.4650i | 0.7761 + 1.2729i | 0.6892 + 1.6914i | 0.7846 + 1.1451i | 0.7222 + 0.8808i | 0.7685 + 0.9477i | 0.7222 + 0.8808i | 0.7561 + 1.0136i |
| 21.5 | 0.7899 + 1.6946i | 0.7179 + 1.1320i | 0.7344 + 1.4506i | 0.7296 + 1.2738i | 0.7376 + 0.9029i | 0.7043 + 0.9821i | 0.6765 + 0.8832i | 0.6698 + 0.9341i |
| 22 | 0.7843 + 1.4333i | 0.7705 + 1.2498i | 0.7026 + 1.7278i | 0.7003 + 1.1772i | 0.7420 + 0.8972i | 0.7590 + 1.0320i | 0.7021 + 0.8941i | 0.7000 + 1.0561i |
| 22.5 | 0.7634 + 1.3802i | 0.7514 + 1.1770i | 0.8230 + 1.5535i | 0.6680 + 1.2094i | 0.7721 + 0.9026i | 0.7530 + 1.0356i | 0.6926 + 0.8983i | 0.6827 + 1.0183i |
| 23 | 0.7407 + 1.4100i | 0.7168 + 1.1622i | 0.8274 + 1.5617i | 0.6629 + 1.2434i | 0.7852 + 0.9095i | 0.7666 + 1.0370i | 0.6839 + 0.9059i | 0.6837 + 1.0019i |
| 23.5 | 0.6960 + 1.6848i | 0.7272 + 1.1865i | 0.7086 + 1.4468i | 0.6649 + 1.2963i | 0.7845 + 0.9168i | 0.7512 + 1.0593i | 0.6918 + 0.9051i | 0.6794 + 1.0148i |
| 24 | 0.8224 + 1.6271i | 0.7310 + 1.1523i | 0.7840 + 1.4334i | 0.7347 + 1.2858i | 0.7779 + 0.8837i | 0.7423 + 1.0272i | 0.6821 + 0.8793i | 0.6766 + 0.9745i |
| 24.5 | 0.6380 + 1.4769i | 0.8075 + 1.1341i | 0.7223 + 1.3126i | 0.7056 + 1.1575i | 0.7675 + 0.8980i | 0.7992 + 1.0027i | 0.6777 + 0.9081i | 0.6881 + 1.0255i |
| 25 | 0.6810 + 1.4782i | 0.7864 + 1.1315i | 0.7113 + 1.3095i | 0.6760 + 1.1703i | 0.7607 + 0.9150i | 0.7845 + 1.0125i | 0.6564 + 0.9256i | 0.6660 + 1.0394i |
| 25.5 | 0.7834 + 1.3291i | 0.7989 + 1.1836i | 0.6586 + 1.3212i | 0.6790 + 1.1822i | 0.8334 + 0.9240i | 0.8389 + 1.0490i | 0.7408 + 0.9196i | 0.7235 + 1.0449i |
| 26 | 0.6326 + 1.5030i | 0.8468 + 1.1407i | 0.7209 + 1.3784i | 0.7653 + 1.2445i | 0.6935 + 0.8959i | 0.8740 + 1.0322i | 0.7256 + 0.9768i | 0.8038 + 0.9722i |
| 26.5 | 0.6623 + 1.5103i | 0.7938 + 1.1419i | 0.6742 + 1.3558i | 0.6837 + 1.2238i | 0.7039 + 0.8883i | 0.8594 + 1.0384i | 0.7255 + 0.9867i | 0.8205 + 0.9417i |
| 27 | 0.6819 + 1.4965i | 0.7875 + 1.1320i | 0.7367 + 1.3484i | 0.7100 + 1.2226i | 0.7563 + 0.9153i | 0.7455 + 1.0248i | 0.6815 + 0.9082i | 0.8338 + 1.0015i |

-continued

| | | | | | | | | |
|---|---|---|---|---|---|---|---|---|
| 27.5 | 0.6106 + 1.5039i | 0.7463 + 1.1465i | 0.6780 + 1.3719i | 0.6672 + 1.2405i | 0.7683 + 0.9391i | 0.7867 + 1.0395i | 0.7004 + 0.9076i | 0.8788 + 0.9640i |
| 28 | 0.6738 + 1.4981i | 0.7958 + 1.1175i | 0.7244 + 1.3669i | 0.7701 + 1.2287i | 0.7924 + 0.8491i | 0.7061 + 1.0819i | 0.7163 + 0.8855i | 0.7346 + 0.98301 |

| SNR/w | w48 | w49 | w50 | w51 | w52 | w53 | w54 | w55 |
|---|---|---|---|---|---|---|---|---|
| 7 | 0.6413 + 1.1550i | 0.5789 + 1.0674i | 0.3707 + 1.2911i | 0.3565 + 1.1738i | 0.5789 + 1.0674i | 0.5789 + 1.0674i | 0.3565 + 1.1738i | 0.3565 + 1.1738i |
| 7.5 | 0.6538 + 1.1143i | 0.6538 + 1.1143i | 0.3292 + 1.2581i | 0.3292 + 1.2581i | 0.5815 + 1.0241i | 0.5815 + 1.0241i | 0.3167 + 1.1419i | 0.3167 + 1.1419i |
| 8 | 0.2944 + 1.1432i | 0.2944 + 1.1432i | 0.2944 + 1.1432i | 0.2944 + 1.1432i | 0.5978 + 1.0154i | 0.5978 + 1.0154i | 0.5978 + 1.0154i | 0.5978 + 1.0154i |
| 8.5 | 0.2766 + 1.1195i | 0.2939 + 1.3233i | 0.2766 + 1.1195i | 0.2939 + 1.3233i | 0.5908 + 0.9851i | 0.7259 + 1.1487i | 0.7259 + 1.1487i | 0.7259 + 1.1487i |
| 9 | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i |
| 10 | 0.8978 + 0.5469i | 0.8978 + 0.5469i | 0.8978 + 0.5469i | 0.8978 + 0.5469i | 0.8978 + 0.5469i | 0.8978 + 0.5469i | 0.8978 + 0.5469i | 0.8978 + 0.5469i |
| 10.5 | 0.8862 + 0.5471i | 0.8862 + 0.5471i | 0.8862 + 0.5471i | 0.8862 + 0.5471i | 0.8862 + 0.5471i | 0.8862 + 0.5471i | 0.8862 + 0.5471i | 0.8862 + 0.5471i |
| 11 | 0.4948 + 0.9134i | 0.4948 + 0.9134i | 0.4948 + 0.9134i | 0.4948 + 0.9134i | 0.4948 + 0.9134i | 0.4948 + 0.9134i | 0.4948 + 0.9134i | 0.4948 + 0.9134i |
| 11.5 | 0.5059 + 0.9024i | 0.5059 + 0.9024i | 0.5059 + 0.9024i | 0.5059 + 0.9024i | 0.5059 + 0.9024i | 0.5059 + 0.9024i | 0.5059 + 0.9024i | 0.5059 + 0.9024i |
| 12 | 0.5122 + 0.8962i | 0.5122 + 0.8962i | 0.5122 + 0.8962i | 0.5122 + 0.8962i | 0.5122 + 0.8962i | 0.5122 + 0.8962i | 0.5122 + 0.8962i | 0.5122 + 0.8962i |
| 12.5 | 0.5878 + 0.8569i | 0.5878 + 0.8569i | 0.5878 + 0.8569i | 0.5878 + 0.8569i | 0.5878 + 0.8569i | 0.5878 + 0.8569i | 0.5878 + 0.8569i | 0.5878 + 0.8569i |
| 13 | 0.8210 + 0.6087i | 0.8210 + 0.6087i | 0.8210 + 0.6087i | 0.8210 + 0.6087i | 0.8210 + 0.6087i | 0.8210 + 0.6087i | 0.8210 + 0.6087i | 0.8210 + 0.6087i |
| 13.5 | 0.6179 + 0.8129i | 0.6179 + 0.8129i | 0.6179 + 0.8129i | 0.6179 + 0.8129i | 0.5764 + 0.8728i | 0.5764 + 0.8728i | 0.5764 + 0.8728i | 0.5764 + 0.8728i |
| 14 | 0.6748 + 0.7364i | 0.6748 + 0.7364i | 0.6748 + 0.7364i | 0.6748 + 0.7364i | 0.6092 + 0.8248i | 0.6092 + 0.8248i | 0.6092 + 0.8248i | 0.6092 + 0.8248i |
| 14.5 | 0.6856 + 0.7232i | 0.6856 + 0.7232i | 0.6856 + 0.7232i | 0.6856 + 0.7232i | 0.6080 + 0.8320i | 0.6080 + 0.8320i | 0.6080 + 0.8320i | 0.6080 + 0.8320i |
| 15 | 0.6809 + 0.6002i | 0.6809 + 0.6002i | 0.6809 + 0.6002i | 0.6809 + 0.6002i | 0.6881 + 0.6763i | 0.6809 + 0.6002i | 0.6881 + 0.6763i | 0.6881 + 0.6763i |
| 15.5 | 0.6528 + 0.6065i | 0.6528 + 0.6065i | 0.6528 + 0.6065i | 0.6528 + 0.6065i | 0.6768 + 0.7164i | 0.6768 + 0.7164i | 0.6768 + 0.7164i | 0.6768 + 0.7164i |
| 16 | 0.6288 + 0.5806i | 0.6288 + 0.5806i | 0.6288 + 0.5806i | 0.6288 + 0.5806i | 0.6491 + 0.6716i | 0.6491 + 0.6716i | 0.6491 + 0.6716i | 0.6491 + 0.6716i |
| 16.5 | 0.5868 + 0.5877i | 0.5868 + 0.5877i | 0.5868 + 0.5877i | 0.5868 + 0.5877i | 0.5843 + 0.6724i | 0.5843 + 0.6724i | 0.5843 + 0.6724i | 0.5843 + 0.6724i |
| 17 | 0.5837 + 0.5846i | 0.5837 + 0.5846i | 0.5837 + 0.5846i | 0.5837 + 0.5846i | 0.5812 + 0.6766i | 0.5812 + 0.6766i | 0.5812 + 0.6766i | 0.5812 + 0.6766i |
| 17.5 | 0.5794 + 0.5798i | 0.5794 + 0.5798i | 0.5794 + 0.5798i | 0.5794 + 0.5798i | 0.5767 + 0.6824i | 0.5767 + 0.6824i | 0.5767 + 0.6824i | 0.5767 + 0.6824i |
| 18 | 0.5719 + 0.5736i | 0.5719 + 0.5736i | 0.5719 + 0.5736i | 0.5719 + 0.5736i | 0.5690 + 0.6943i | 0.5690 + 0.6943i | 0.5690 + 0.6943i | 0.5690 + 0.6943i |
| 18.5 | 0.5557 + 0.5937i | 0.5557 + 0.5937i | 0.5557 + 0.5937i | 0.5557 + 0.5937i | 0.5947 + 0.7437i | 0.5947 + 0.7437i | 0.5947 + 0.7437i | 0.5947 + 0.7437i |
| 19 | 0.5631 + 0.5896i | 0.5631 + 0.5896i | 0.5631 + 0.5896i | 0.5631 + 0.5896i | 0.6085 + 0.7445i | 0.6085 + 0.7445i | 0.6085 + 0.7445i | 0.6085 + 0.7445i |
| 19.5 | 0.5710 + 0.5915i | 0.5710 + 0.5915i | 0.5710 + 0.5915i | 0.5710 + 0.5915i | 0.6218 + 0.7496i | 0.6218 + 0.7496i | 0.6218 + 0.7496i | 0.6218 + 0.7496i |
| 20 | 0.5822 + 0.5765i | 0.5822 + 0.5765i | 0.5822 + 0.5765i | 0.5822 + 0.5765i | 0.5453 + 0.7335i | 0.5453 + 0.7335i | 0.5453 + 0.7335i | 0.5453 + 0.7335i |
| 20.5 | 0.5822 + 0.5821i | 0.5822 + 0.5821i | 0.5822 + 0.5821i | 0.5822 + 0.5821i | 0.5995 + 0.7454i | 0.5995 + 0.7454i | 0.5995 + 0.7454i | 0.5995 + 0.7454i |
| 21 | 0.5616 + 0.5634i | 0.5616 + 0.5634i | 0.5616 + 0.5634i | 0.5616 + 0.5634i | 0.5660 + 0.7470i | 0.5633 + 0.7034i | 0.5660 + 0.7470i | 0.5633 + 0.7034i |
| 21.5 | 0.5594 + 0.5739i | 0.5594 + 0.5739i | 0.5594 + 0.5739i | 0.5594 + 0.5739i | 0.5418 + 0.7319i | 0.5418 + 0.7319i | 0.5418 + 0.7319i | 0.5596 + 0.7108i |
| 22 | 0.5608 + 0.5597i | 0.5608 + 0.5597i | 0.5608 + 0.5597i | 0.5608 + 0.5597i | 0.5638 + 0.7634i | 0.5616 + 0.6982i | 0.5638 + 0.7634i | 0.5616 + 0.6982i |
| 22.5 | 0.5561 + 0.5626i | 0.5561 + 0.5626i | 0.5561 + 0.5626i | 0.5742 + 0.5796i | 0.5572 + 0.7649i | 0.5581 + 0.7013i | 0.5572 + 0.7649i | 0.5581 + 0.7013i |
| 23 | 0.5438 + 0.5498i | 0.5380 + 0.5928i | 0.5956 + 0.5500i | 0.5895 + 0.5949i | 0.5352 + 0.7741i | 0.5370 + 0.6971i | 0.5807 + 0.7810i | 0.5873 + 0.6984i |
| 23.5 | 0.5420 + 0.5404i | 0.5426 + 0.5844i | 0.5959 + 0.5394i | 0.5992 + 0.5846i | 0.5405 + 0.7778i | 0.5435 + 0.6909i | 0.5919 + 0.7808i | 0.5973 + 0.6934i |
| 24 | 0.5255 + 0.5297i | 0.5242 + 0.5894i | 0.5852 + 0.5291i | 0.5854 + 0.5881i | 0.5232 + 0.7731i | 0.5221 + 0.6867i | 0.5850 + 0.7703i | 0.5860 + 0.6850i |
| 24.5 | 0.5320 + 0.5316i | 0.5261 + 0.6108i | 0.5951 + 0.5356i | 0.5905 + 0.6148i | 0.5146 + 0.8039i | 0.5192 + 0.7047i | 0.5858 + 0.8006i | 0.5865 + 0.7049i |

-continued

| | | | | | | | | |
|---|---|---|---|---|---|---|---|---|
| 25 | 0.5351 + 0.5313i | 0.5235 + 0.6126i | 0.6088 + 0.5413i | 0.5929 + 0.6237i | 0.4978 + 0.8117i | 0.5101 + 0.7078i | 0.5655 + 0.8168i | 0.5769 + 0.7155i |
| 25.5 | 0.5530 + 0.5469i | 0.5591 + 0.6248i | 0.6363 + 0.5402i | 0.6435 + 0.6188i | 0.5711 + 0.7972i | 0.5652 + 0.7099i | 0.6605 + 0.7964i | 0.6520 + 0.7038i |
| 26 | 0.5591 + 0.5670i | 0.5177 + 0.6201i | 0.6098 + 0.6293i | 0.5253 + 0.6674i | 0.6050 + 0.8173i | 0.5282 + 0.8134i | 0.6187 + 0.7290i | 0.5315 + 0.7314i |
| 26.5 | 0.5260 + 0.5793i | 0.4902 + 0.6512i | 0.5918 + 0.6233i | 0.5219 + 0.6802i | 0.6218 + 0.8082i | 0.5542 + 0.8063i | 0.6169 + 0.7217i | 0.5205 + 0.7582i |
| 27 | 0.5743 + 0.5517i | 0.6712 + 0.5573i | 0.5951 + 0.5922i | 0.6584 + 0.6238i | 0.5523 + 0.8038i | 0.5626 + 0.7109i | 0.6275 + 0.8020i | 0.6357 + 0.7064i |
| 27.5 | 0.5592 + 0.5829i | 0.7089 + 0.5603i | 0.6120 + 0.5818i | 0.6742 + 0.6278i | 0.5700 + 0.8032i | 0.5742 + 0.7097i | 0.6450 + 0.8012i | 0.6522 + 0.7089i |
| 28 | 0.5735 + 0.5443i | 0.6544 + 0.5617i | 0.5761 + 0.6045i | 0.6223 + 0.6342i | 0.5404 + 0.8158i | 0.5418 + 0.7248i | 0.6162 + 0.8123i | 0.6016 + 0.71621 |

| SNR/w | w56 | w57 | w58 | w59 | w60 | w61 | w62 | w63 |
|---|---|---|---|---|---|---|---|---|
| 7 | 0.5789 + 1.0674i | 0.5789 + 1.0674i | 0.3565 + 1.1738i | 0.3565 + 1.1738i | 0.5789 + 1.0674i | 0.5789 + 1.0674i | 0.3565 + 1.1738i | 0.3565 + 1.1738i |
| 7.5 | 0.5815 + 1.0241i | 0.5815 + 1.0241i | 0.3167 + 1.1419i | 0.3167 + 1.1419i | 0.5815 + 1.0241i | 0.5815 + 1.0241i | 0.3167 + 1.1419i | 0.3167 + 1.1419i |
| 8 | 0.2944 + 1.1432i | 0.2944 + 1.1432i | 0.2944 + 1.1432i | 0.2944 + 1.1432i | 0.5978 + 1.0154i | 0.5978 + 1.0154i | 0.5978 + 1.0154i | 0.5978 + 1.0154i |
| 8.5 | 0.2766 + 1.1195i | 0.2766 + 1.1195i | 0.2766 + 1.1195i | 0.2766 + 1.1195i | 0.5908 + 0.9851i | 0.5908 + 0.9851i | 0.5908 + 0.9851i | 0.5908 + 0.9851i |
| 9 | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i |
| 10 | 0.8978 + 0.5469i | 0.8978 + 0.5469i | 0.8978 + 0.5469i | 0.8978 + 0.5469i | 0.8978 + 0.5469i | 0.8978 + 0.5469i | 0.8978 + 0.5469i | 0.8978 + 0.5469i |
| 10.5 | 0.8862 + 0.5471i | 0.8862 + 0.5471i | 0.8862 + 0.5471i | 0.8862 + 0.5471i | 0.8862 + 0.5471i | 0.8862 + 0.5471i | 0.8862 + 0.5471i | 0.8862 + 0.5471i |
| 11 | 0.4948 + 0.9134i | 0.4948 + 0.9134i | 0.4948 + 0.9134i | 0.4948 + 0.9134i | 0.4948 + 0.9134i | 0.4948 + 0.9134i | 0.4948 + 0.9134i | 0.4948 + 0.9134i |
| 11.5 | 0.5059 + 0.9024i | 0.5059 + 0.9024i | 0.5059 + 0.9024i | 0.5059 + 0.9024i | 0.5059 + 0.9024i | 0.5059 + 0.9024i | 0.5059 + 0.9024i | 0.5059 + 0.9024i |
| 12 | 0.5122 + 0.8962i | 0.5122 + 0.8962i | 0.5122 + 0.8962i | 0.5122 + 0.8962i | 0.5122 + 0.8962i | 0.5122 + 0.8962i | 0.5122 + 0.8962i | 0.5122 + 0.8962i |
| 12.5 | 0.5878 + 0.8569i | 0.5878 + 0.8569i | 0.5878 + 0.8569i | 0.5878 + 0.8569i | 0.5878 + 0.8569i | 0.5878 + 0.8569i | 0.5878 + 0.8569i | 0.5878 + 0.8569i |
| 13 | 0.8210 + 0.6087i | 0.8210 + 0.6087i | 0.8210 + 0.6087i | 0.8210 + 0.6087i | 0.8210 + 0.6087i | 0.8210 + 0.6087i | 0.8210 + 0.6087i | 0.8210 + 0.6087i |
| 13.5 | 0.6179 + 0.8129i | 0.6179 + 0.8129i | 0.6179 + 0.8129i | 0.6179 + 0.8129i | 0.6179 + 0.8129i | 0.6179 + 0.8129i | 0.6179 + 0.8129i | 0.6179 + 0.8129i |
| 14 | 0.6748 + 0.7364i | 0.6748 + 0.7364i | 0.6748 + 0.7364i | 0.6748 + 0.7364i | 0.6092 + 0.8248i | 0.6092 + 0.8248i | 0.6092 + 0.8248i | 0.6092 + 0.8248i |
| 14.5 | 0.6856 + 0.7232i | 0.6856 + 0.7232i | 0.6856 + 0.7232i | 0.6856 + 0.7232i | 0.6080 + 0.8320i | 0.6080 + 0.8320i | 0.6080 + 0.8320i | 0.6080 + 0.8320i |
| 15 | 0.6809 + 0.6002i | 0.6809 + 0.6002i | 0.6809 + 0.6002i | 0.6809 + 0.6002i | 0.6881 + 0.6763i | 0.6881 + 0.6763i | 0.6881 + 0.6763i | 0.6881 + 0.6763i |
| 15.5 | 0.7040 + 0.5764i | 0.7040 + 0.5764i | 0.7040 + 0.5764i | 0.7040 + 0.5764i | 0.7116 + 0.6428i | 0.7116 + 0.6428i | 0.7116 + 0.6428i | 0.7116 + 0.6428i |
| 16 | 0.6902 + 0.5639i | 0.6902 + 0.5639i | 0.6902 + 0.5639i | 0.6902 + 0.5639i | 0.7001 + 0.6410i | 0.7001 + 0.6410i | 0.7001 + 0.6410i | 0.7001 + 0.6410i |
| 16.5 | 0.6767 + 0.5900i | 0.6767 + 0.5900i | 0.6767 + 0.5900i | 0.6767 + 0.5900i | 0.6731 + 0.6767i | 0.6731 + 0.6767i | 0.6731 + 0.6767i | 0.6731 + 0.6767i |
| 17 | 0.6835 + 0.5871i | 0.6835 + 0.5871i | 0.6835 + 0.5871i | 0.6835 + 0.5871i | 0.6787 + 0.6820i | 0.6787 + 0.6820i | 0.6787 + 0.6820i | 0.6787 + 0.6820i |
| 17.5 | 0.6965 + 0.5828i | 0.6965 + 0.5828i | 0.6965 + 0.5828i | 0.6965 + 0.5828i | 0.6890 + 0.6902i | 0.6890 + 0.6902i | 0.6890 + 0.6902i | 0.6890 + 0.6902i |
| 18 | 0.7091 + 0.5771i | 0.7091 + 0.5771i | 0.7091 + 0.5771i | 0.7091 + 0.5771i | 0.6995 + 0.7028i | 0.6995 + 0.7028i | 0.6995 + 0.7028i | 0.6995 + 0.7028i |
| 18.5 | 0.6841 + 0.5578i | 0.6841 + 0.5578i | 0.6841 + 0.5578i | 0.6841 + 0.5578i | 0.7393 + 0.6855i | 0.7393 + 0.6855i | 0.7393 + 0.6855i | 0.7393 + 0.6855i |
| 19 | 0.7049 + 0.5452i | 0.7049 + 0.5452i | 0.7049 + 0.5452i | 0.7049 + 0.5452i | 0.7621 + 0.6859i | 0.7621 + 0.6859i | 0.7621 + 0.6859i | 0.7621 + 0.6859i |
| 19.5 | 0.7216 + 0.5424i | 0.7216 + 0.5424i | 0.7216 + 0.5424i | 0.7216 + 0.5424i | 0.7864 + 0.6980i | 0.7864 + 0.6980i | 0.7864 + 0.6980i | 0.7639 + 0.6838i |
| 20 | 0.7648 + 0.6193i | 0.7648 + 0.6193i | 0.7282 + 0.6105i | 0.7282 + 0.6105i | 0.7121 + 0.7861i | 0.7121 + 0.7861i | 0.7121 + 0.7861i | 0.6932 + 0.7604i |
| 20.5 | 0.7513 + 0.5665i | 0.7513 + 0.5665i | 0.7513 + 0.5665i | 0.7513 + 0.5665i | 0.7730 + 0.7299i | 0.7730 + 0.7299i | 0.7730 + 0.7299i | 0.7730 + 0.7299i |
| 21 | 0.7480 + 0.5637i | 0.7480 + 0.5637i | 0.7021 + 0.5632i | 0.7021 + 0.5632i | 0.7447 + 0.7193i | 0.7447 + 0.7193i | 0.7001 + 0.7175i | 0.7001 + 0.7175i |
| 21.5 | 0.7644 + 0.5865i | 0.7644 + 0.5865i | 0.7017 + 0.5836i | 0.7017 + 0.5836i | 0.7579 + 0.7381i | 0.7579 + 0.7381i | 0.6905 + 0.7394i | 0.6905 + 0.7394i |
| 22 | 0.7478 + 0.5605i | 0.7478 + 0.5605i | 0.6930 + 0.5581i | 0.6930 + 0.5581i | 0.7418 + 0.7491i | 0.7413 + 0.6938i | 0.6950 + 0.7561i | 0.6917 + 0.6959i |

-continued

| | | | | | | | | |
|---|---|---|---|---|---|---|---|---|
| 22.5 | 0.7660 + 0.5811i | 0.7660 + 0.5811i | 0.6961 + 0.5777i | 0.6961 + 0.5777i | 0.7699 + 0.7757i | 0.7684 + 0.7133i | 0.6931 + 0.7729i | 0.6933 + 0.7088i |
| 23 | 0.7870 + 0.5451i | 0.7912 + 0.6039i | 0.7025 + 0.5494i | 0.7033 + 0.6027i | 0.7851 + 0.8112i | 0.7935 + 0.7088i | 0.6966 + 0.7929i | 0.7030 + 0.7082i |
| 23.5 | 0.7963 + 0.5341i | 0.7903 + 0.5944i | 0.7035 + 0.5353i | 0.7033 + 0.5871i | 0.7903 + 0.7972i | 0.7922 + 0.6992i | 0.6988 + 0.7924i | 0.7016 + 0.6975i |
| 24 | 0.7772 + 0.5242i | 0.7811 + 0.5804i | 0.6843 + 0.5275i | 0.6854 + 0.5855i | 0.7824 + 0.7742i | 0.7823 + 0.6813i | 0.6846 + 0.7745i | 0.6870 + 0.6835i |
| 24.5 | 0.7677 + 0.5362i | 0.7985 + 0.5994i | 0.6876 + 0.5405i | 0.6898 + 0.6182i | 0.7690 + 0.8026i | 0.8002 + 0.7097i | 0.6815 + 0.7942i | 0.6898 + 0.7018i |
| 25 | 0.7836 + 0.5649i | 0.7723 + 0.6495i | 0.6941 + 0.5537i | 0.6818 + 0.6387i | 0.7471 + 0.8318i | 0.7654 + 0.7459i | 0.6548 + 0.8214i | 0.6666 + 0.7271i |
| 25.5 | 0.8260 + 0.5243i | 0.8354 + 0.6026i | 0.7272 + 0.5323i | 0.7357 + 0.6102i | 0.8363 + 0.7982i | 0.8396 + 0.6938i | 0.7479 + 0.7978i | 0.7438 + 0.6972i |
| 26 | 0.7207 + 0.5888i | 0.8167 + 0.5761i | 0.6922 + 0.6311i | 0.8130 + 0.6488i | 0.7083 + 0.8179i | 0.8062 + 0.8263i | 0.7032 + 0.7252i | 0.8007 + 0.7286i |
| 26.5 | 0.7502 + 0.6146i | 0.8241 + 0.6346i | 0.6717 + 0.6243i | 0.8549 + 0.5585i | 0.7192 + 0.7846i | 0.8042 + 0.7367i | 0.6819 + 0.7074i | 0.8326 + 0.8445i |
| 27 | 0.8564 + 0.5757i | 0.8744 + 0.6584i | 0.7873 + 0.6025i | 0.7483 + 0.6489i | 0.7885 + 0.8284i | 0.8377 + 0.7472i | 0.7063 + 0.8058i | 0.7323 + 0.7227i |
| 27.5 | 0.8715 + 0.5878i | 0.8831 + 0.6759i | 0.8064 + 0.6168i | 0.7632 + 0.6612i | 0.8096 + 0.8448i | 0.8499 + 0.7616i | 0.7229 + 0.8172i | 0.7483 + 0.7350i |
| 28 | 0.8185 + 0.6598i | 0.8890 + 0.6878i | 0.7513 + 0.6619i | 0.6922 + 0.6583i | 0.7947 + 0.7648i | 0.8894 + 0.7813i | 0.7012 + 0.7888i | 0.6735 + 0.72611 |

| SNR/w | w64 | w65 | w66 | w67 | w68 | w69 | w70 | w71 |
|---|---|---|---|---|---|---|---|---|
| 7 | 1.8365 + 1.2473i | 1.1550 + 0.6415i | 2.1615 + 0.4280i | 1.2912 + 0.3708i | 1.1550 + 0.6415i | 1.1550 + 0.6415i | 1.2912 + 0.3708i | 1.2912 + 0.3708i |
| 7.5 | 1.7843 + 1.2148i | 1.5010 + 0.9781i | 2.1191 + 0.4071i | 1.7374 + 0.3777i | 1.1144 + 0.6528i | 1.1144 + 0.6528i | 1.2576 + 0.3290i | 1.2576 + 0.3290i |
| 8 | 2.0885 + 0.3978i | 1.7466 + 0.3528i | 1.5548 + 0.3348i | 1.5548 + 0.3348i | 1.7585 + 1.1911i | 1.4907 + 0.9885i | 1.3458 + 0.8709i | 1.3458 + 0.8709i |
| 8.5 | 2.0732 + 0.3944i | 1.6702 + 0.3300i | 1.6702 + 0.3300i | 1.5557 + 0.3149i | 1.7503 + 1.1771i | 1.4268 + 0.9462i | 1.4268 + 0.9462i | 1.3353 + 0.8771i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 1.5415 + 0.3062i | 1.4023 + 0.2970i | 1.5415 + 0.3062i | 1.4023 + 0.2970i | 1.4023 + 0.2970i | 1.3323 + 0.2669i | 1.3323 + 0.2669i | 1.3323 + 0.2669i |
| 11.5 | 1.5124 + 0.3127i | 1.5124 + 0.3127i | 1.5124 + 0.3127i | 1.3555 + 0.2725i | 1.3555 + 0.2725i | 1.3555 + 0.2725i | 1.3555 + 0.2725i | 1.3555 + 0.2725i |
| 12 | 1.5258 + 0.3150i | 1.5258 + 0.3150i | 1.5258 + 0.3150i | 1.3581 + 0.2718i | 1.3581 + 0.2718i | 1.3581 + 0.2718i | 1.3581 + 0.2718i | 1.3581 + 0.2718i |
| 12.5 | 1.6796 + 0.2609i | 1.6231 + 0.3777i | 1.4424 + 0.2554i | 1.4424 + 0.2554i | 1.3200 + 0.2305i | 1.3200 + 0.2305i | 1.3200 + 0.2305i | 1.3200 + 0.2305i |
| 13 | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i |
| 13.5 | 1.7821 + 0.2022i | 1.7069 + 0.6226i | 1.6649 + 0.2207i | 1.6075 + 0.4960i | 1.5283 + 0.2348i | 1.4650 + 0.3647i | 1.5283 + 0.2348i | 1.4650 + 0.3647i |
| 14 | 1.5804 + 1.3865i | 2.1260 + 0.2205i | 1.8405 + 1.0633i | 2.0446 + 0.6571i | 1.6314 + 0.2412i | 1.7090 + 0.2082i | 1.6314 + 0.2412i | 1.6314 + 0.2412i |
| 14.5 | 1.6382 + 1.3165i | 2.0902 + 0.1960i | 1.8765 + 0.9757i | 2.0346 + 0.5849i | 1.6116 + 0.2239i | 1.6865 + 0.1947i | 1.6116 + 0.2239i | 1.6116 + 0.2239i |
| 15 | 1.8736 + 0.9301i | 2.1142 + 0.3056i | 1.3817 + 0.1206i | 1.3817 + 0.1206i | 1.7352 + 0.1564i | 1.7352 + 0.1564i | 1.3817 + 0.1206i | 1.3817 + 0.1206i |
| 15.5 | 1.6897 + 0.1409i | 1.7447 + 0.1440i | 1.4104 + 0.1200i | 1.4104 + 0.1200i | 1.9715 + 0.6222i | 2.0540 + 0.2400i | 1.3565 + 0.1259i | 1.3565 + 0.1259i |
| 16 | 1.6775 + 0.1331i | 1.6321 + 0.1195i | 1.3567 + 0.1125i | 1.3567 + 0.1125i | 1.9896 + 0.2026i | 1.9730 + 0.5695i | 1.3013 + 0.1147i | 1.3013 + 0.1147i |
| 16.5 | 1.4483 + 0.1058i | 1.5082 + 0.1076i | 1.2511 + 0.1063i | 1.2511 + 0.1063i | 2.0481 + 0.1978i | 1.7457 + 0.1177i | 1.1891 + 0.1088i | 1.1891 + 0.1088i |
| 17 | 1.4531 + 0.1045i | 1.5085 + 0.1072i | 1.2484 + 0.1046i | 1.2484 + 0.1046i | 2.0518 + 0.1917i | 1.7527 + 0.1170i | 1.1874 + 0.1093i | 1.1874 + 0.1093i |
| 17.5 | 1.4543 + 0.1049i | 1.5074 + 0.1080i | 1.2478 + 0.1028i | 1.2478 + 0.1028i | 2.0450 + 0.1840i | 1.7515 + 0.1165i | 1.1867 + 0.1106i | 1.1867 + 0.1106i |
| 18 | 1.4513 + 0.1053i | 1.5036 + 0.1079i | 1.2466 + 0.1004i | 1.2466 + 0.1004i | 2.0343 + 0.1812i | 1.7462 + 0.1147i | 1.1849 + 0.1124i | 1.1849 + 0.1124i |
| 18.5 | 1.4335 + 0.0772i | 1.3407 + 0.0725i | 1.1058 + 0.0808i | 1.1058 + 0.0808i | 1.6706 + 0.1002i | 1.9444 + 0.1347i | 1.0600 + 0.0831i | 1.1058 + 0.0808i |
| 19 | 1.4268 + 0.0758i | 1.3215 + 0.0692i | 1.0950 + 0.0758i | 1.1342 + 0.0740i | 1.6492 + 0.0990i | 1.9145 + 0.1300i | 1.0506 + 0.0781i | 1.0506 + 0.0781i |
| 19.5 | 1.4256 + 0.0701i | 1.2941 + 0.0652i | 1.0723 + 0.0704i | 1.1247 + 0.0692i | 1.6348 + 0.0961i | 1.8944 + 0.1321i | 1.0262 + 0.0737i | 1.0262 + 0.0737i |

-continued

| | | | | | | | | |
|---|---|---|---|---|---|---|---|---|
| 20 | 1.9230 + 0.1724i | 1.4387 + 0.0640i | 1.2248 + 0.0751i | 1.2729 + 0.0732i | 1.6851 + 0.1131i | 1.4739 + 0.1668i | 1.2330 + 0.2173i | 1.2857 + 0.2110i |
| 20.5 | 1.4461 + 0.0954i | 1.3740 + 0.1022i | 1.2251 + 0.0792i | 1.2251 + 0.0792i | 1.6304 + 0.0979i | 1.8780 + 0.1229i | 1.1036 + 0.0880i | 1.1036 + 0.0880i |
| 21 | 1.3631 + 0.0520i | 1.8339 + 0.1330i | 1.1991 + 0.0634i | 1.1476 + 0.0664i | 1.4080 + 0.1199i | 1.6121 + 0.0933i | 1.2253 + 0.1727i | 1.1607 + 0.1854i |
| 21.5 | 1.6991 + 0.0948i | 1.9089 + 0.1361i | 1.1361 + 0.0560i | 1.1361 + 0.0560i | 1.5161 + 0.0821i | 1.3698 + 0.0855i | 1.1545 + 0.1540i | 1.2377 + 0.1156i |
| 22 | 1.3605 + 0.0520i | 1.8286 + 0.1178i | 1.2193 + 0.0642i | 1.1598 + 0.0644i | 1.4249 + 0.1170i | 1.6056 + 0.0877i | 1.2333 + 0.1806i | 1.1693 + 0.1944i |
| 22.5 | 1.6912 + 0.0798i | 1.4055 + 0.0597i | 1.1376 + 0.0545i | 1.2506 + 0.0551i | 1.5794 + 0.1910i | 1.4051 + 0.1749i | 1.1445 + 0.1725i | 1.2429 + 0.1635i |
| 23 | 1.7275 + 0.0857i | 1.4188 + 0.0423i | 1.1857 + 0.0607i | 1.2751 + 0.0595i | 1.5834 + 0.1747i | 1.4232 + 0.1559i | 1.1749 + 0.1749i | 1.2918 + 0.1822i |
| 23.5 | 1.4664 + 0.0626i | 1.6566 + 0.0991i | 1.3043 + 0.0474i | 1.1711 + 0.0454i | 1.4135 + 0.1717i | 1.5496 + 0.2588i | 1.2755 + 0.1587i | 1.1759 + 0.1394i |
| 24 | 1.5037 + 0.0710i | 1.3591 + 0.0502i | 1.1808 + 0.0443i | 1.2467 + 0.0983i | 1.5451 + 0.2150i | 1.7164 + 0.1072i | 1.3895 + 0.2257i | 1.2198 + 0.1964i |
| 24.5 | 1.5376 + 0.0755i | 1.7254 + 0.0875i | 1.3836 + 0.0522i | 1.2524 + 0.0657i | 1.5831 + 0.2354i | 1.4320 + 0.2269i | 1.1755 + 0.2097i | 1.2871 + 0.1867i |
| 25 | 1.5306 + 0.0744i | 1.6915 + 0.1083i | 1.3846 + 0.0555i | 1.2679 + 0.0610i | 1.4621 + 0.1953i | 1.3400 + 0.2355i | 1.1762 + 0.2323i | 1.2439 + 0.1711i |
| 25.5 | 1.5775 + 0.2201i | 1.6203 + 0.0729i | 1.1822 + 0.0559i | 1.2916 + 0.0458i | 1.4605 + 0.1876i | 1.4494 + 0.0655i | 1.1852 + 0.1643i | 1.3065 + 0.1507i |
| 26 | 1.4357 + 0.0696i | 1.5824 + 0.0779i | 1.3020 + 0.0505i | 1.1807 + 0.0541i | 1.3893 + 0.1877i | 1.2727 + 0.2084i | 1.1282 + 0.2339i | 1.1761 + 0.1587i |
| 26.5 | 1.4441 + 0.0577i | 1.5851 + 0.0770i | 1.3160 + 0.0502i | 1.2061 + 0.0559i | 1.4166 + 0.1663i | 1.3051 + 0.2007i | 1.1730 + 0.2374i | 1.2080 + 0.1543i |
| 27 | 1.4179 + 0.0644i | 1.5639 + 0.0718i | 1.2943 + 0.0443i | 1.1861 + 0.0531i | 1.4462 + 0.1886i | 1.3139 + 0.1830i | 1.5847 + 0.2617i | 1.2070 + 0.1573i |
| 27.5 | 1.4359 + 0.0589i | 1.5791 + 0.0680i | 1.3202 + 0.0508i | 1.2143 + 0.0516i | 1.4507 + 0.1735i | 1.3288 + 0.1906i | 1.5715 + 0.2387i | 1.2136 + 0.1561i |
| 28 | 1.3893 + 0.0618i | 1.5163 + 0.0570i | 1.2840 + 0.0506i | 1.1933 + 0.0574i | 1.4329 + 0.1769i | 1.3157 + 0.1870i | 1.5739 + 0.1994i | 1.2085 + 0.16781 |

| SNR/w | w72 | w73 | w74 | w75 | w76 | w77 | w78 | w79 |
|---|---|---|---|---|---|---|---|---|
| 7 | 1.1550 + 0.6415i | 1.1550 + 0.6415i | 1.2912 + 0.3708i | 1.2912 + 0.3708i | 1.1550 + 0.6415i | 1.0674 + 0.5791i | 1.2912 + 0.3708i | 1.1739 + 0.3565i |
| 7.5 | 1.1144 + 0.6528i | 1.1144 + 0.6528i | 1.2576 + 0.3290i | 1.2576 + 0.3290i | 1.1144 + 0.6528i | 1.1144 + 0.6528i | 1.2576 + 0.3290i | 1.2576 + 0.3290i |
| 8 | 1.2660 + 0.3053i | 1.2660 + 0.3053i | 1.2660 + 0.3053i | 1.2660 + 0.3053i | 1.1122 + 0.6781i | 1.1122 + 0.6781i | 1.1122 + 0.6781i | 1.1122 + 0.6781i |
| 8.5 | 1.1194 + 0.2766i | 1.1194 + 0.2766i | 1.1194 + 0.2766i | 1.1194 + 0.2766i | 0.9851 + 0.5907i | 0.9851 + 0.5907i | 0.9851 + 0.5907i | 0.9851 + 0.5907i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 1.4023 + 0.2970i | 1.3323 + 0.2669i | 1.3323 + 0.2669i | 1.3323 + 0.2669i | 1.3323 + 0.2669i | 1.3323 + 0.2669i | 1.3323 + 0.2669i | 1.3323 + 0.2669i |
| 11.5 | 1.3555 + 0.2725i | 1.3555 + 0.2725i | 1.3555 + 0.2725i | 1.3555 + 0.2725i | 1.3555 + 0.2725i | 1.3555 + 0.2725i | 1.3555 + 0.2725i | 1.2978 + 0.2447i |
| 12 | 1.3581 + 0.2718i | 1.3581 + 0.2718i | 1.3581 + 0.2718i | 1.3581 + 0.2718i | 1.3581 + 0.2718i | 1.2941 + 0.2659i | 1.3581 + 0.2718i | 1.2941 + 0.2659i |
| 12.5 | 1.4424 + 0.2554i | 1.3200 + 0.2305i | 1.3200 + 0.2305i | 1.3200 + 0.2305i | 1.3200 + 0.2305i | 1.3200 + 0.2305i | 1.3200 + 0.2305i | 1.3200 + 0.2305i |
| 13 | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i |
| 13.5 | 1.2722 + 0.1695i | 1.2722 + 0.1695i | 1.2722 + 0.1695i | 1.2722 + 0.1695i | 1.2722 + 0.1695i | 1.2722 + 0.1695i | 1.2722 + 0.1695i | 1.2741 + 0.2155i |
| 14 | 1.2372 + 0.1421i | 1.2372 + 0.1421i | 1.2372 + 0.1421i | 1.2372 + 0.1421i | 1.3006 + 0.1843i | 1.3006 + 0.1843i | 1.3006 + 0.1843i | 1.3006 + 0.1843i |
| 14.5 | 1.2317 + 0.1455i | 1.2317 + 0.1455i | 1.2317 + 0.1455i | 1.2317 + 0.1455i | 1.2827 + 0.1828i | 1.2317 + 0.1455i | 1.2827 + 0.1828i | 1.2827 + 0.1828i |
| 15 | 1.0365 + 0.1172i | 1.0365 + 0.1172i | 1.0890 + 0.1187i | 1.0890 + 0.1187i | 1.0365 + 0.1172i | 1.0365 + 0.1172i | 1.0365 + 0.1172i | 1.0365 + 0.1172i |
| 15.5 | 1.0016 + 0.1116i | 1.0016 + 0.1116i | 1.0736 + 0.1126i | 1.0736 + 0.1126i | 1.0016 + 0.1116i | 1.0016 + 0.1116i | 1.0736 + 0.1126i | 1.0736 + 0.1126i |
| 16 | 0.9484 + 0.1042i | 0.9484 + 0.1042i | 1.0222 + 0.1048i | 1.0222 + 0.1048i | 0.9484 + 0.1042i | 0.9484 + 0.1042i | 1.0222 + 0.1048i | 1.0222 + 0.1048i |
| 16.5 | 0.9120 + 0.1119i | 0.9120 + 0.1119i | 0.9723 + 0.1111i | 0.9723 + 0.1111i | 0.9120 + 0.1119i | 0.9120 + 0.1119i | 0.9723 + 0.1111i | 0.9723 + 0.1111i |
| 17 | 0.9068 + 0.1115i | 0.9068 + 0.1115i | 0.9684 + 0.1102i | 0.9684 + 0.1102i | 0.9068 + 0.1115i | 0.9068 + 0.1115i | 0.9684 + 0.1102i | 0.9684 + 0.1102i |

-continued

| | | | | | | | | |
|---|---|---|---|---|---|---|---|---|
| 17.5 | 0.9046 + 0.1109i | 0.9046 + 0.1109i | 0.9677 + 0.1088i | 0.9677 + 0.1088i | 0.9046 + 0.1109i | 0.9046 + 0.1109i | 0.9677 + 0.1088i | 0.9677 + 0.1088i |
| 18 | 0.9046 + 0.1107i | 0.9046 + 0.1107i | 0.9691 + 0.1074i | 0.9691 + 0.1074i | 0.9046 + 0.1107i | 0.9046 + 0.1107i | 0.9691 + 0.1074i | 0.9691 + 0.1074i |
| 18.5 | 0.7943 + 0.1008i | 0.7943 + 0.1008i | 0.8562 + 0.0942i | 0.8562 + 0.0942i | 0.7943 + 0.1008i | 0.7943 + 0.1008i | 0.8562 + 0.0942i | 0.8562 + 0.0942i |
| 19 | 0.7768 + 0.0961i | 0.7768 + 0.0961i | 0.8426 + 0.0873i | 0.8426 + 0.0873i | 0.7768 + 0.0961i | 0.7768 + 0.0961i | 0.8426 + 0.0873i | 0.8426 + 0.0873i |
| 19.5 | 0.7513 + 0.0751i | 0.7513 + 0.0751i | 0.8156 + 0.0794i | 0.8156 + 0.0794i | 0.7661 + 0.1128i | 0.7661 + 0.1128i | 0.8454 + 0.0933i | 0.8156 + 0.0794i |
| 20 | 0.9936 + 0.0741i | 0.9936 + 0.0741i | 1.0658 + 0.0746i | 1.0658 + 0.0746i | 0.9872 + 0.2147i | 0.9872 + 0.2147i | 1.0667 + 0.2175i | 1.0667 + 0.2175i |
| 20.5 | 0.8603 + 0.0622i | 0.8603 + 0.0622i | 0.8603 + 0.0622i | 0.8603 + 0.0622i | 0.8610 + 0.1536i | 0.8610 + 0.1536i | 0.9491 + 0.1152i | 0.9491 + 0.1152i |
| 21 | 0.8976 + 0.0632i | 0.8976 + 0.0632i | 1.0064 + 0.0653i | 1.0064 + 0.0653i | 0.8957 + 0.1794i | 0.8957 + 0.1794i | 1.0081 + 0.1834i | 1.0081 + 0.1834i |
| 21.5 | 0.8981 + 0.0684i | 0.8981 + 0.0684i | 0.9819 + 0.0672i | 0.9819 + 0.0672i | 0.9033 + 0.2029i | 0.9033 + 0.2029i | 0.9990 + 0.1908i | 0.9990 + 0.1908i |
| 22 | 0.9042 + 0.0625i | 0.9042 + 0.0625i | 1.0269 + 0.0644i | 1.0269 + 0.0644i | 0.9022 + 0.1856i | 0.9022 + 0.1856i | 1.0297 + 0.1905i | 1.0297 + 0.1905i |
| 22.5 | 0.8885 + 0.0624i | 0.8885 + 0.0624i | 1.0235 + 0.0603i | 0.9860 + 0.0649i | 0.8899 + 0.1872i | 0.8899 + 0.1872i | 1.0287 + 0.1810i | 0.9915 + 0.1807i |
| 23 | 0.8931 + 0.0565i | 0.8931 + 0.0565i | 1.0364 + 0.0541i | 1.0364 + 0.0541i | 0.8908 + 0.1680i | 0.8908 + 0.1680i | 1.0289 + 0.1764i | 1.0289 + 0.1764i |
| 23.5 | 0.9003 + 0.0604i | 0.9003 + 0.0604i | 1.0088 + 0.0553i | 1.0449 + 0.0537i | 0.9091 + 0.1794i | 0.9091 + 0.1794i | 1.0442 + 0.1674i | 1.0442 + 0.1674i |
| 24 | 0.9256 + 0.0605i | 0.9256 + 0.0605i | 1.0543 + 0.0675i | 1.0543 + 0.0675i | 0.9170 + 0.1788i | 0.9170 + 0.1788i | 1.0378 + 0.1928i | 1.0895 + 0.1956i |
| 24.5 | 0.9474 + 0.0573i | 0.9474 + 0.0573i | 1.0686 + 0.0690i | 1.1345 + 0.0491i | 0.9234 + 0.1779i | 0.9234 + 0.1779i | 1.0723 + 0.1843i | 1.0268 + 0.2010i |
| 25 | 0.9630 + 0.0520i | 0.9218 + 0.0598i | 1.0488 + 0.0488i | 1.1469 + 0.0461i | 0.9571 + 0.1742i | 0.9240 + 0.1503i | 1.0655 + 0.1717i | 1.1358 + 0.1228i |
| 25.5 | 0.8699 + 0.0500i | 0.9203 + 0.0513i | 1.0902 + 0.0567i | 1.0070 + 0.0499i | 0.8680 + 0.1530i | 0.9206 + 0.1491i | 1.0838 + 0.1610i | 1.0009 + 0.1570i |
| 26 | 0.9159 + 0.0417i | 0.9301 + 0.0926i | 1.0176 + 0.0319i | 1.0715 + 0.0679i | 0.9294 + 0.2082i | 0.9297 + 0.1559i | 1.0424 + 0.2248i | 1.0467 + 0.1461i |
| 26.5 | 0.9403 + 0.0431i | 0.9115 + 0.0762i | 1.0176 + 0.0326i | 1.1072 + 0.0445i | 0.9539 + 0.2438i | 0.9401 + 0.1658i | 1.0737 + 0.2562i | 1.0556 + 0.1522i |
| 27 | 0.9113 + 0.0415i | 0.8658 + 0.0784i | 0.9957 + 0.0565i | 1.0840 + 0.0474i | 0.9122 + 0.1735i | 0.8662 + 0.1446i | 1.0072 + 0.1528i | 1.1002 + 0.1441i |
| 27.5 | 0.9440 + 0.0418i | 0.8706 + 0.0464i | 1.0192 + 0.0503i | 1.1107 + 0.0449i | 0.9170 + 0.1714i | 0.8778 + 0.1234i | 1.0092 + 0.1421i | 1.1104 + 0.1311i |
| 28 | 0.8988 + 0.0380i | 0.9745 + 0.0468i | 1.0860 + 0.0321i | 1.0493 + 0.0829i | 0.9289 + 0.1655i | 0.8389 + 0.2190i | 1.0132 + 0.1785i | 1.1095 + 0.14701 |

| SNR/w | w80 | w81 | w82 | w83 | w84 | w85 | w86 | w87 |
|---|---|---|---|---|---|---|---|---|
| 7 | 1.1550 + 0.6415i | 1.1550 + 0.6415i | 1.2912 + 0.3708i | 1.2912 + 0.3708i | 1.1550 + 0.6415i | 1.0674 + 0.5791i | 1.2912 + 0.3708i | 1.1739 + 0.3565i |
| 7.5 | 1.1144 + 0.6528i | 1.1144 + 0.6528i | 1.2576 + 0.3290i | 1.2576 + 0.3290i | 1.1144 + 0.6528i | 1.1144 + 0.6528i | 1.2576 + 0.3290i | 1.2576 + 0.3290i |
| 8 | 1.2660 + 0.3053i | 1.2660 + 0.3053i | 1.2660 + 0.3053i | 1.2660 + 0.3053i | 1.1122 + 0.6781i | 1.1122 + 0.6781i | 1.1122 + 0.6781i | 1.1122 + 0.6781i |
| 8.5 | 1.3234 + 0.2940i | 1.3234 + 0.2940i | 1.3234 + 0.2940i | 1.3234 + 0.2940i | 1.1488 + 0.7259i | 1.1488 + 0.7259i | 1.1488 + 0.7259i | 1.1488 + 0.7259i |
| 9 | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i |
| 9.5 | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i |
| 10 | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i |
| 10.5 | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i |
| 11 | 1.1426 + 0.7756i | 1.1426 + 0.7756i | 1.1426 + 0.7756i | 1.1426 + 0.7756i | 1.1426 + 0.7756i | 1.1426 + 0.7756i | 1.1426 + 0.7756i | 1.1426 + 0.7756i |
| 11.5 | 1.1449 + 0.7733i | 1.1449 + 0.7733i | 1.1449 + 0.7733i | 1.1449 + 0.7733i | 1.1449 + 0.7733i | 1.1449 + 0.7733i | 1.1449 + 0.7733i | 1.1449 + 0.7733i |
| 12 | 1.1456 + 0.7737i | 1.1456 + 0.7737i | 1.1456 + 0.7737i | 1.1456 + 0.7737i | 1.1456 + 0.7737i | 1.1456 + 0.7737i | 1.1456 + 0.7737i | 1.1456 + 0.7737i |
| 12.5 | 1.1936 + 0.6891i | 1.1936 + 0.6891i | 1.1936 + 0.6891i | 1.1936 + 0.6891i | 1.1936 + 0.6891i | 1.1936 + 0.6891i | 1.1936 + 0.6891i | 1.1936 + 0.6891i |
| 13 | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i |
| 13.5 | 1.1912 + 0.6890i | 1.3555 + 0.7570i | 1.1912 + 0.6890i | 1.3044 + 0.7014i | 1.1506 + 0.5882i | 1.2444 + 0.5981i | 1.1506 + 0.5882i | 1.2444 + 0.5981i |
| 14 | 1.4081 + 0.9240i | 1.3266 + 0.8316i | 1.4081 + 0.9240i | 1.3266 + 0.8316i | 1.4911 + 0.5849i | 1.4911 + 0.5849i | 1.4911 + 0.5849i | 1.4911 + 0.5849i |
| 14.5 | 1.4323 + 0.9128i | 1.3416 + 0.8265i | 1.4323 + 0.9128i | 1.3416 + 0.8265i | 1.4950 + 0.5593i | 1.4950 + 0.5593i | 1.4950 + 0.5593i | 1.4950 + 0.5593i |

-continued

| | | | | | | | | |
|---|---|---|---|---|---|---|---|---|
| 15 | 1.6166 + 0.6733i | 1.5327 + 0.5881i | 1.3503 + 0.3985i | 1.3503 + 0.3985i | 1.6400 + 0.4397i | 1.6400 + 0.4397i | 1.3806 + 0.3499i | 1.3503 + 0.3985i |
| 15.5 | 1.4860 + 0.5649i | 1.4860 + 0.5649i | 1.3446 + 0.3846i | 1.3446 + 0.3846i | 1.6403 + 0.5309i | 1.5852 + 0.5183i | 1.3436 + 0.3520i | 1.3446 + 0.3846i |
| 16 | 1.4894 + 0.4824i | 1.5041 + 0.5324i | 1.3069 + 0.3665i | 1.3069 + 0.3665i | 1.5903 + 0.4644i | 1.6566 + 0.5241i | 1.2875 + 0.3247i | 1.2875 + 0.3247i |
| 16.5 | 1.4385 + 0.3455i | 1.4852 + 0.3323i | 1.2393 + 0.3381i | 1.2393 + 0.3381i | 1.8518 + 0.4951i | 1.6966 + 0.3427i | 1.1870 + 0.3055i | 1.1870 + 0.3055i |
| 17 | 1.4458 + 0.3440i | 1.4918 + 0.3307i | 1.2352 + 0.3414i | 1.2352 + 0.3414i | 1.8705 + 0.5044i | 1.7104 + 0.3345i | 1.1851 + 0.3028i | 1.1851 + 0.3028i |
| 17.5 | 1.4472 + 0.3429i | 1.4936 + 0.3303i | 1.2319 + 0.3447i | 1.2319 + 0.3447i | 1.8868 + 0.5097i | 1.7156 + 0.3328i | 1.1839 + 0.2997i | 1.1839 + 0.2997i |
| 18 | 1.4449 + 0.3401i | 1.4915 + 0.3280i | 1.2294 + 0.3473i | 1.2294 + 0.3473i | 1.8862 + 0.5096i | 1.7134 + 0.3314i | 1.1821 + 0.2956i | 1.1821 + 0.2956i |
| 18.5 | 1.4077 + 0.2179i | 1.3384 + 0.2148i | 1.1296 + 0.2562i | 1.1296 + 0.2562i | 1.6531 + 0.2935i | 1.9314 + 0.4196i | 1.0809 + 0.2390i | 1.0809 + 0.2390i |
| 19 | 1.3931 + 0.2132i | 1.3188 + 0.2086i | 1.1164 + 0.2494i | 1.1164 + 0.2494i | 1.6349 + 0.2879i | 1.9151 + 0.4067i | 1.0632 + 0.2197i | 1.0632 + 0.2197i |
| 19.5 | 1.3981 + 0.2090i | 1.2948 + 0.1953i | 1.0938 + 0.2388i | 1.0938 + 0.2388i | 1.5971 + 0.2809i | 1.8304 + 0.3832i | 1.0382 + 0.2045i | 1.0382 + 0.2045i |
| 20 | 1.7815 + 0.4751i | 1.4947 + 0.5250i | 1.2330 + 0.5211i | 1.2924 + 0.5254i | 1.6486 + 0.3169i | 1.4854 + 0.3471i | 1.2402 + 0.3648i | 1.3024 + 0.3616i |
| 20.5 | 1.4528 + 0.2817i | 1.3601 + 0.2817i | 1.1850 + 0.3018i | 1.1850 + 0.3018i | 1.6350 + 0.2881i | 1.8444 + 0.4201i | 1.1109 + 0.2285i | 1.1109 + 0.2285i |
| 21 | 1.9010 + 0.4585i | 1.6938 + 0.3559i | 1.2752 + 0.4149i | 1.1803 + 0.4240i | 1.4242 + 0.2749i | 1.5512 + 0.2768i | 1.2791 + 0.3004i | 1.1734 + 0.3075i |
| 21.5 | 1.5210 + 0.4295i | 1.3922 + 0.3763i | 1.2275 + 0.4595i | 1.2578 + 0.4012i | 1.5387 + 0.2494i | 1.3855 + 0.2443i | 1.1759 + 0.2690i | 1.2344 + 0.2704i |
| 22 | 1.8348 + 0.3993i | 1.5329 + 0.3997i | 1.3013 + 0.4349i | 1.1899 + 0.4442i | 1.4158 + 0.2489i | 1.5984 + 0.2593i | 1.2925 + 0.3015i | 1.1810 + 0.3192i |
| 22.5 | 1.5888 + 0.4053i | 1.4083 + 0.4183i | 1.1560 + 0.4261i | 1.2651 + 0.4195i | 1.8004 + 0.3093i | 1.3843 + 0.2805i | 1.1504 + 0.2971i | 1.2457 + 0.2926i |
| 23 | 1.6211 + 0.3847i | 1.4209 + 0.4485i | 1.1797 + 0.4135i | 1.2791 + 0.4462i | 1.7497 + 0.3033i | 1.4218 + 0.3117i | 1.1757 + 0.2963i | 1.2821 + 0.2953i |
| 23.5 | 1.3219 + 0.5378i | 1.3808 + 0.4436i | 1.1930 + 0.4695i | 1.2166 + 0.4068i | 1.7837 + 0.3062i | 1.3978 + 0.3365i | 1.2218 + 0.2650i | 1.2151 + 0.3021i |
| 24 | 1.4544 + 0.5247i | 1.2839 + 0.5031i | 1.3919 + 0.3970i | 1.2020 + 0.4350i | 1.5721 + 0.3834i | 1.7484 + 0.3285i | 1.3331 + 0.3099i | 1.2153 + 0.3093i |
| 24.5 | 1.2528 + 0.5442i | 1.3771 + 0.4900i | 1.1779 + 0.4401i | 1.2795 + 0.4047i | 1.7543 + 0.3201i | 1.4294 + 0.3521i | 1.1682 + 0.3125i | 1.2881 + 0.3079i |
| 25 | 1.2983 + 0.5282i | 1.4160 + 0.4599i | 1.1643 + 0.5224i | 1.1475 + 0.4397i | 1.5155 + 0.3070i | 1.3432 + 0.3541i | 1.1465 + 0.2989i | 1.2191 + 0.3646i |
| 25.5 | 1.2159 + 0.4133i | 1.5064 + 0.3808i | 1.1497 + 0.3852i | 1.3705 + 0.3603i | 1.7393 + 0.2807i | 1.6490 + 0.4561i | 1.1846 + 0.2701i | 1.3033 + 0.2639i |
| 26 | 1.2978 + 0.5029i | 1.3930 + 0.4106i | 1.1805 + 0.5049i | 1.1527 + 0.4078i | 1.6859 + 0.2482i | 1.3072 + 0.3236i | 1.5221 + 0.2723i | 1.1975 + 0.3375i |
| 26.5 | 1.4481 + 0.5040i | 1.3937 + 0.4028i | 1.1626 + 0.4656i | 1.2689 + 0.4386i | 1.6732 + 0.2462i | 1.3551 + 0.3008i | 1.5213 + 0.2743i | 1.2473 + 0.3399i |
| 27 | 1.3902 + 0.4354i | 1.2902 + 0.3800i | 1.1890 + 0.4695i | 1.1811 + 0.3714i | 1.4284 + 0.3107i | 1.2970 + 0.2793i | 1.0892 + 0.2786i | 1.1782 + 0.2634i |
| 27.5 | 1.3263 + 0.4151i | 1.4095 + 0.3204i | 1.2199 + 0.4281i | 1.1604 + 0.3543i | 1.5775 + 0.4006i | 1.2854 + 0.2866i | 1.0929 + 0.2569i | 1.1834 + 0.2541i |
| 28 | 1.3867 + 0.4311i | 1.4607 + 0.3299i | 1.2745 + 0.4347i | 1.1818 + 0.3938i | 1.6162 + 0.3509i | 1.3455 + 0.2946i | 1.1478 + 0.2771i | 1.2386 + 0.29821 |

| SNR/w | w88 | w89 | w90 | w91 | w92 | w93 | w94 | w95 |
|---|---|---|---|---|---|---|---|---|
| 7 | 1.1550 + 0.6415i | 1.0674 + 0.5791i | 1.2912 + 0.3708i | 1.1739 + 0.3565i | 1.0674 + 0.5791i | 1.0674 + 0.5791i | 1.1739 + 0.3565i | 1.1739 + 0.3565i |
| 7.5 | 1.1144 + 0.6528i | 1.1144 + 0.6528i | 1.2576 + 0.3290i | 1.2576 + 0.3290i | 1.0242 + 0.5805i | 1.0242 + 0.5805i | 1.1415 + 0.3165i | 1.1415 + 0.3165i |
| 8 | 1.1432 + 0.2944i | 1.1432 + 0.2944i | 1.1432 + 0.2944i | 1.1432 + 0.2944i | 1.0154 + 0.5977i | 1.0154 + 0.5977i | 1.0154 + 0.5977i | 1.0154 + 0.5977i |
| 8.5 | 1.1194 + 0.2766i | 1.1194 + 0.2766i | 1.1194 + 0.2766i | 1.1194 + 0.2766i | 0.9851 + 0.5907i | 0.9851 + 0.5907i | 0.9851 + 0.5907i | 0.9851 + 0.5907i |
| 9 | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i |
| 9.5 | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i |
| 10 | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i |
| 10.5 | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i |
| 11 | 1.1426 + 0.7756i | 1.1426 + 0.7756i | 1.1426 + 0.7756i | 1.1426 + 0.7756i | 1.1026 + 0.7368i | 1.1426 + 0.7756i | 1.1026 + 0.7368i | 1.1426 + 0.7756i |
| 11.5 | 1.1449 + 0.7733i | 1.1449 + 0.7733i | 1.1449 + 0.7733i | 1.1449 + 0.7733i | 1.1449 + 0.7733i | 1.1449 + 0.7733i | 1.1449 + 0.7733i | 1.1449 + 0.7733i |
| 12 | 1.1456 + 0.7737i | 1.1456 + 0.7737i | 1.1456 + 0.7737i | 1.1456 + 0.7737i | 1.1456 + 0.7737i | 1.1456 + 0.7737i | 1.1456 + 0.7737i | 1.1456 + 0.7737i |

-continued

| | | | | | | | | |
|---|---|---|---|---|---|---|---|---|
| 12.5 | 1.1936 + 0.6891i | 1.1936 + 0.6891i | 1.1936 + 0.6891i | 1.1936 + 0.6891i | 1.1197 + 0.6410i | 1.1936 + 0.6891i | 1.1197 + 0.6410i | 1.1936 + 0.6891i |
| 13 | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i |
| 13.5 | 1.1039 + 0.6745i | 1.1039 + 0.6745i | 1.1039 + 0.6745i | 1.1039 + 0.6745i | 1.0988 + 0.5976i | 1.1506 + 0.5882i | 1.0988 + 0.5976i | 1.1506 + 0.5882i |
| 14 | 1.1382 + 0.6389i | 1.1382 + 0.6389i | 1.1382 + 0.6389i | 1.1382 + 0.6389i | 1.2255 + 0.5065i | 1.2255 + 0.5065i | 1.2255 + 0.5065i | 1.2255 + 0.5065i |
| 14.5 | 1.1310 + 0.6308i | 1.1310 + 0.6308i | 1.1310 + 0.6308i | 1.1310 + 0.6308i | 1.2166 + 0.4913i | 1.2166 + 0.4913i | 1.2166 + 0.4913i | 1.2166 + 0.4913i |
| 15 | 1.0418 + 0.3470i | 1.0418 + 0.3470i | 1.0418 + 0.3470i | 1.0418 + 0.3470i | 1.0418 + 0.3470i | 1.0418 + 0.3470i | 1.0418 + 0.3470i | 1.0418 + 0.3470i |
| 15.5 | 1.0001 + 0.3389i | 1.0001 + 0.3389i | 1.0652 + 0.3417i | 1.0652 + 0.3417i | 1.0001 + 0.3389i | 1.0001 + 0.3389i | 1.0652 + 0.3417i | 1.0652 + 0.3417i |
| 16 | 0.9517 + 0.3117i | 0.9517 + 0.3117i | 1.0193 + 0.3132i | 1.0193 + 0.3132i | 0.9517 + 0.3117i | 0.9517 + 0.3117i | 1.0193 + 0.3132i | 1.0193 + 0.3132i |
| 16.5 | 0.9225 + 0.3561i | 0.9225 + 0.3561i | 0.9847 + 0.3495i | 0.9847 + 0.3495i | 0.9225 + 0.3561i | 0.9225 + 0.3561i | 0.9847 + 0.3495i | 0.9847 + 0.3495i |
| 17 | 0.9169 + 0.3619i | 0.9169 + 0.3619i | 0.9815 + 0.3696i | 0.9815 + 0.3696i | 0.9180 + 0.3366i | 0.9169 + 0.3619i | 0.9849 + 0.3298i | 0.9849 + 0.3298i |
| 17.5 | 0.9142 + 0.3769i | 0.9142 + 0.3769i | 0.9815 + 0.3740i | 0.9815 + 0.3740i | 0.9156 + 0.3305i | 0.9156 + 0.3305i | 0.9860 + 0.3236i | 0.9860 + 0.3236i |
| 18 | 0.9141 + 0.3832i | 0.9141 + 0.3832i | 0.9843 + 0.3807i | 0.9843 + 0.3807i | 0.9151 + 0.3225i | 0.9151 + 0.3225i | 0.9886 + 0.3165i | 0.9886 + 0.3165i |
| 18.5 | 0.8242 + 0.3278i | 0.8242 + 0.3278i | 0.8883 + 0.3019i | 0.8883 + 0.3019i | 0.8214 + 0.2859i | 0.8214 + 0.2859i | 0.8966 + 0.2737i | 0.8883 + 0.3019i |
| 19 | 0.8215 + 0.3242i | 0.8215 + 0.3242i | 0.8868 + 0.3103i | 0.8868 + 0.3103i | 0.8108 + 0.2681i | 0.8108 + 0.2681i | 0.8869 + 0.2553i | 0.8869 + 0.2553i |
| 19.5 | 0.8200 + 0.3300i | 0.8200 + 0.3300i | 0.8835 + 0.3126i | 0.8835 + 0.3126i | 0.7990 + 0.2581i | 0.7990 + 0.2581i | 0.8734 + 0.2424i | 0.8734 + 0.2424i |
| 20 | 0.9529 + 0.5004i | 0.9529 + 0.5004i | 1.0594 + 0.5123i | 1.0594 + 0.5123i | 0.9736 + 0.3595i | 0.9736 + 0.3595i | 1.0673 + 0.3650i | 1.0673 + 0.3650i |
| 20.5 | 0.8941 + 0.3936i | 0.8941 + 0.3936i | 0.9867 + 0.3771i | 0.9867 + 0.3771i | 0.8765 + 0.2771i | 0.8765 + 0.2771i | 0.9717 + 0.2599i | 0.9717 + 0.2599i |
| 21 | 0.8921 + 0.4264i | 0.8921 + 0.4264i | 0.9966 + 0.4266i | 1.0364 + 0.4264i | 0.8935 + 0.3049i | 0.8935 + 0.3049i | 1.0116 + 0.3077i | 1.0116 + 0.3077i |
| 21.5 | 0.9111 + 0.4525i | 0.9111 + 0.4525i | 1.0660 + 0.4503i | 1.0660 + 0.4503i | 0.9102 + 0.3318i | 0.9102 + 0.3318i | 1.0425 + 0.3156i | 1.0425 + 0.3156i |
| 22 | 0.8945 + 0.4361i | 0.8945 + 0.4361i | 1.0147 + 0.4454i | 1.0566 + 0.4440i | 0.8991 + 0.3102i | 0.8991 + 0.3102i | 1.0324 + 0.3166i | 1.0324 + 0.3166i |
| 22.5 | 0.8928 + 0.4472i | 0.8928 + 0.4472i | 1.0159 + 0.4386i | 1.0159 + 0.4386i | 0.8913 + 0.3120i | 0.8913 + 0.3120i | 1.0329 + 0.3081i | 0.9965 + 0.3137i |
| 23 | 0.9063 + 0.4225i | 0.9063 + 0.4225i | 1.0351 + 0.4138i | 1.0351 + 0.4138i | 0.8923 + 0.2934i | 0.8923 + 0.2934i | 1.0507 + 0.2866i | 1.0098 + 0.2870i |
| 23.5 | 0.9196 + 0.4245i | 0.9196 + 0.4245i | 1.0533 + 0.4358i | 1.0533 + 0.4358i | 0.9208 + 0.2970i | 0.9208 + 0.2970i | 1.0625 + 0.2939i | 1.0625 + 0.2939i |
| 24 | 0.8859 + 0.4034i | 0.8859 + 0.4034i | 1.0109 + 0.4143i | 1.0972 + 0.4234i | 0.9036 + 0.2927i | 0.9036 + 0.2927i | 1.0221 + 0.3073i | 1.1006 + 0.3080i |
| 24.5 | 0.8753 + 0.4197i | 0.8753 + 0.4197i | 1.0696 + 0.4404i | 0.9798 + 0.4306i | 0.8983 + 0.2987i | 0.8983 + 0.2987i | 1.0686 + 0.3238i | 1.0059 + 0.3162i |
| 25 | 0.9102 + 0.5075i | 0.9170 + 0.4303i | 1.0241 + 0.5303i | 1.0328 + 0.4412i | 0.9443 + 0.2680i | 0.9308 + 0.3404i | 1.0467 + 0.2771i | 1.0251 + 0.3580i |
| 25.5 | 0.9146 + 0.4349i | 0.9045 + 0.3595i | 1.0466 + 0.3967i | 0.9891 + 0.3453i | 0.8628 + 0.2351i | 0.8976 + 0.2659i | 1.0804 + 0.2637i | 0.9941 + 0.2617i |
| 26 | 1.0272 + 0.4905i | 1.0257 + 0.4280i | 0.9434 + 0.4788i | 0.9114 + 0.4552i | 0.9236 + 0.2785i | 0.8965 + 0.3421i | 1.0143 + 0.3002i | 0.9068 + 0.3854i |
| 26.5 | 0.9902 + 0.3600i | 0.9588 + 0.3951i | 1.0628 + 0.4448i | 0.9496 + 0.4697i | 0.8975 + 0.2987i | 0.8675 + 0.3774i | 1.1092 + 0.3451i | 0.8734 + 0.4346i |
| 27 | 1.0478 + 0.5049i | 1.0616 + 0.4245i | 0.9563 + 0.4822i | 0.9741 + 0.4130i | 0.9128 + 0.2490i | 0.9100 + 0.3284i | 1.0094 + 0.2429i | 0.9848 + 0.3374i |
| 27.5 | 1.0559 + 0.4504i | 1.0285 + 0.3785i | 0.9708 + 0.5009i | 0.9399 + 0.4335i | 0.9282 + 0.2534i | 0.9606 + 0.3233i | 1.0203 + 0.2262i | 0.9167 + 0.3776i |
| 28 | 0.9950 + 0.4764i | 0.9740 + 0.4084i | 0.9094 + 0.5124i | 0.9401 + 0.5713i | 1.0045 + 0.2913i | 1.0508 + 0.3677i | 1.0666 + 0.2494i | 0.8323 + 0.44761 |

| SNR/w | w96 | w97 | w98 | w99 | w100 | w101 | w102 | w103 |
|---|---|---|---|---|---|---|---|---|
| 7 | 1.1550 + 0.6415i | 1.1550 + 0.6415i | 1.2912 + 0.3708i | 1.2912 + 0.3708i | 1.1550 + 0.6415i | 1.0674 + 0.5791i | 1.2912 + 0.3708i | 1.1739 + 0.3565i |
| 7.5 | 1.1144 + 0.6528i | 1.1144 + 0.6528i | 1.2576 + 0.3290i | 1.2576 + 0.3290i | 1.1144 + 0.6528i | 1.1144 + 0.6528i | 1.2576 + 0.3290i | 1.2576 + 0.3290i |
| 8 | 1.2660 + 0.3053i | 1.2660 + 0.3053i | 1.2660 + 0.3053i | 1.2660 + 0.3053i | 1.1122 + 0.6781i | 1.1122 + 0.6781i | 1.1122 + 0.6781i | 1.1122 + 0.6781i |
| 8.5 | 1.3234 + 0.2940i | 1.3234 + 0.2940i | 1.3234 + 0.2940i | 1.3234 + 0.2940i | 1.1488 + 0.7259i | 1.1488 + 0.7259i | 1.1488 + 0.7259i | 1.1488 + 0.7259i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |

-continued

| | | | | | | | | |
|---|---|---|---|---|---|---|---|---|
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 0.9736 + 0.2211i | 0.9736 + 0.2211i | 0.9736 + 0.2211i | 0.9736 + 0.2211i | 0.9736 + 0.2211i | 0.9736 + 0.2211i | 0.9736 + 0.2211i | 0.9736 + 0.2211i |
| 11.5 | 0.9684 + 0.2116i | 0.9684 + 0.2116i | 0.9684 + 0.2116i | 0.9684 + 0.2116i | 0.9684 + 0.2116i | 0.9684 + 0.2116i | 0.9684 + 0.2116i | 0.9684 + 0.2116i |
| 12 | 0.9663 + 0.2046i | 0.9663 + 0.2046i | 0.9663 + 0.2046i | 0.9663 + 0.2046i | 0.9663 + 0.2046i | 0.9663 + 0.2046i | 0.9663 + 0.2046i | 0.9663 + 0.2046i |
| 12.5 | 0.9266 + 0.1771i | 0.9266 + 0.1771i | 0.9266 + 0.1771i | 0.9266 + 0.1771i | 0.9266 + 0.1771i | 0.9266 + 0.1771i | 0.9266 + 0.1771i | 0.9266 + 0.1771i |
| 13 | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i |
| 13.5 | 0.8935 + 0.1573i | 0.8935 + 0.1573i | 0.8935 + 0.1573i | 0.8935 + 0.1573i | 0.8935 + 0.1573i | 0.8935 + 0.1573i | 0.8935 + 0.1573i | 0.8935 + 0.1573i |
| 14 | 0.8530 + 0.1539i | 0.8530 + 0.1539i | 0.8530 + 0.1539i | 0.8530 + 0.1539i | 0.8530 + 0.1539i | 0.8530 + 0.1539i | 0.8530 + 0.1539i | 0.8530 + 0.1539i |
| 14.5 | 0.8411 + 0.1470i | 0.8411 + 0.1470i | 0.8411 + 0.1470i | 0.8411 + 0.1470i | 0.8411 + 0.1470i | 0.8411 + 0.1470i | 0.8411 + 0.1470i | 0.8411 + 0.1470i |
| 15 | 0.6390 + 0.1131i | 0.6390 + 0.1131i | 0.6390 + 0.1131i | 0.6390 + 0.1131i | 0.6390 + 0.1131i | 0.6390 + 0.1131i | 0.6390 + 0.1131i | 0.6390 + 0.1131i |
| 15.5 | 0.6273 + 0.1094i | 0.6273 + 0.1094i | 0.6273 + 0.1094i | 0.6273 + 0.1094i | 0.6273 + 0.1094i | 0.6273 + 0.1094i | 0.6273 + 0.1094i | 0.6273 + 0.1094i |
| 16 | 0.5863 + 0.1101i | 0.5863 + 0.1101i | 0.5863 + 0.1101i | 0.5863 + 0.1101i | 0.5863 + 0.1101i | 0.5863 + 0.1101i | 0.5863 + 0.1101i | 0.5863 + 0.1101i |
| 16.5 | 0.5897 + 0.1157i | 0.5897 + 0.1157i | 0.5897 + 0.1157i | 0.5897 + 0.1157i | 0.5897 + 0.1157i | 0.5897 + 0.1157i | 0.5897 + 0.1157i | 0.5897 + 0.1157i |
| 17 | 0.5857 + 0.1156i | 0.5857 + 0.1156i | 0.5857 + 0.1156i | 0.5857 + 0.1156i | 0.5857 + 0.1156i | 0.5857 + 0.1156i | 0.5857 + 0.1156i | 0.5857 + 0.1156i |
| 17.5 | 0.5809 + 0.1157i | 0.5809 + 0.1157i | 0.5809 + 0.1157i | 0.5809 + 0.1157i | 0.5809 + 0.1157i | 0.5809 + 0.1157i | 0.5809 + 0.1157i | 0.5809 + 0.1157i |
| 18 | 0.5750 + 0.1148i | 0.5750 + 0.1148i | 0.5750 + 0.1148i | 0.5750 + 0.1148i | 0.5750 + 0.1148i | 0.5750 + 0.1148i | 0.5750 + 0.1148i | 0.5750 + 0.1148i |
| 18.5 | 0.4996 + 0.0925i | 0.4996 + 0.0925i | 0.4996 + 0.0925i | 0.4996 + 0.0925i | 0.5003 + 0.1452i | 0.5003 + 0.1452i | 0.5003 + 0.1452i | 0.5003 + 0.1452i |
| 19 | 0.4795 + 0.0818i | 0.4795 + 0.0818i | 0.4795 + 0.0818i | 0.4795 + 0.0818i | 0.4840 + 0.1638i | 0.4840 + 0.1638i | 0.4840 + 0.1638i | 0.4840 + 0.1638i |
| 19.5 | 0.4652 + 0.0749i | 0.4652 + 0.0749i | 0.4652 + 0.0749i | 0.4652 + 0.0749i | 0.4737 + 0.1800i | 0.4737 + 0.1800i | 0.4737 + 0.1800i | 0.4737 + 0.1800i |
| 20 | 0.6612 + 0.0694i | 0.6612 + 0.0694i | 0.6612 + 0.0694i | 0.6612 + 0.0694i | 0.6532 + 0.1712i | 0.6532 + 0.1712i | 0.6532 + 0.1712i | 0.6532 + 0.1712i |
| 20.5 | 0.5376 + 0.0651i | 0.5376 + 0.0651i | 0.5376 + 0.0651i | 0.5376 + 0.0651i | 0.5422 + 0.1817i | 0.5422 + 0.1817i | 0.5422 + 0.1817i | 0.5422 + 0.1817i |
| 21 | 0.5658 + 0.0610i | 0.5658 + 0.0610i | 0.5658 + 0.0610i | 0.5658 + 0.0610i | 0.5650 + 0.1728i | 0.5650 + 0.1728i | 0.5650 + 0.1728i | 0.5650 + 0.1728i |
| 21.5 | 0.5903 + 0.0620i | 0.5903 + 0.0620i | 0.5903 + 0.0620i | 0.5903 + 0.0620i | 0.5852 + 0.1821i | 0.5852 + 0.1821i | 0.5852 + 0.1821i | 0.5852 + 0.1821i |
| 22 | 0.5714 + 0.0583i | 0.5714 + 0.0583i | 0.5714 + 0.0583i | 0.5714 + 0.0583i | 0.5692 + 0.1735i | 0.5692 + 0.1735i | 0.5692 + 0.1735i | 0.5692 + 0.1735i |
| 22.5 | 0.5719 + 0.0592i | 0.5719 + 0.0592i | 0.5719 + 0.0592i | 0.5719 + 0.0592i | 0.5716 + 0.1807i | 0.5716 + 0.1807i | 0.5716 + 0.1807i | 0.5716 + 0.1807i |
| 23 | 0.5686 + 0.0608i | 0.5686 + 0.0608i | 0.5686 + 0.0608i | 0.5686 + 0.0608i | 0.5476 + 0.1727i | 0.5476 + 0.1727i | 0.5856 + 0.1752i | 0.5856 + 0.1752i |
| 23.5 | 0.5463 + 0.0579i | 0.5463 + 0.0579i | 0.5973 + 0.0581i | 0.5973 + 0.0581i | 0.5451 + 0.1746i | 0.5451 + 0.1746i | 0.5954 + 0.1757i | 0.5954 + 0.1757i |
| 24 | 0.5320 + 0.0551i | 0.5320 + 0.0551i | 0.5979 + 0.0547i | 0.5979 + 0.0547i | 0.5320 + 0.1673i | 0.5320 + 0.1673i | 0.5958 + 0.1663i | 0.5958 + 0.1663i |
| 24.5 | 0.5336 + 0.0530i | 0.5336 + 0.0530i | 0.6137 + 0.0524i | 0.6137 + 0.0524i | 0.5351 + 0.1608i | 0.5351 + 0.1608i | 0.6123 + 0.1597i | 0.6123 + 0.1597i |
| 25 | 0.5579 + 0.0562i | 0.5579 + 0.0562i | 0.6377 + 0.0571i | 0.6377 + 0.0571i | 0.5575 + 0.1695i | 0.5575 + 0.1695i | 0.6391 + 0.1714i | 0.6391 + 0.1714i |
| 25.5 | 0.5123 + 0.0569i | 0.5123 + 0.0569i | 0.5874 + 0.0548i | 0.5874 + 0.0548i | 0.5211 + 0.1908i | 0.5175 + 0.1547i | 0.5952 + 0.1669i | 0.5952 + 0.1669i |
| 26 | 0.5288 + 0.0400i | 0.5857 + 0.0687i | 0.4820 + 0.0208i | 0.6310 + 0.0929i | 0.5798 + 0.2126i | 0.5801 + 0.1655i | 0.6572 + 0.2101i | 0.6463 + 0.1533i |
| 26.5 | 0.5532 + 0.0309i | 0.5478 + 0.0912i | 0.6447 + 0.0402i | 0.6376 + 0.0755i | 0.5674 + 0.2153i | 0.5589 + 0.1584i | 0.6549 + 0.1897i | 0.6259 + 0.1463i |
| 27 | 0.5645 + 0.0293i | 0.5775 + 0.0917i | 0.4254 + 0.0322i | 0.6367 + 0.1004i | 0.5594 + 0.2218i | 0.5685 + 0.1676i | 0.6391 + 0.2359i | 0.6415 + 0.1699i |
| 27.5 | 0.5689 + 0.0303i | 0.5769 + 0.0968i | 0.4283 + 0.0333i | 0.6371 + 0.1067i | 0.5690 + 0.2288i | 0.5706 + 0.1684i | 0.6484 + 0.2299i | 0.6440 + 0.1694i |
| 28 | 0.5612 + 0.0506i | 0.5718 + 0.1142i | 0.4988 + 0.0234i | 0.6505 + 0.1199i | 0.5646 + 0.2390i | 0.5722 + 0.1799i | 0.6434 + 0.2525i | 0.6497 + 0.18511 |

| SNR/w | w104 | w105 | w106 | w107 | w108 | w109 | w110 | w111 |
|---|---|---|---|---|---|---|---|---|
| 7 | 1.1550 + 0.6415i | 1.0674 + 0.5791i | 1.2912 + 0.3708i | 1.1739 + 0.3565i | 1.0674 + 0.5791i | 1.0674 + 0.5791i | 1.1739 + 0.3565i | 1.1739 + 0.3565i |

-continued

| | | | | | | | | |
|---|---|---|---|---|---|---|---|---|
| 7.5 | 1.1144 + 0.6528i | 1.1144 + 0.6528i | 1.2576 + 0.3290i | 1.2576 + 0.3290i | 1.0242 + 0.5805i | 1.0242 + 0.5805i | 1.1415 + 0.3165i | 1.1415 + 0.3165i |
| 8 | 1.1432 + 0.2944i | 1.1432 + 0.2944i | 1.1432 + 0.2944i | 1.1432 + 0.2944i | 1.0154 + 0.5977i | 1.0154 + 0.5977i | 1.0154 + 0.5977i | 1.0154 + 0.5977i |
| 8.5 | 1.1194 + 0.2766i | 1.1194 + 0.2766i | 1.1194 + 0.2766i | 1.1194 + 0.2766i | 0.9851 + 0.5907i | 0.9851 + 0.5907i | 0.9851 + 0.5907i | 0.9851 + 0.5907i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 0.9736 + 0.2211i | 0.9736 + 0.2211i | 0.9736 + 0.2211i | 0.9736 + 0.2211i | 0.9736 + 0.2211i | 0.9736 + 0.2211i | 0.9736 + 0.2211i | 0.9736 + 0.2211i |
| 11.5 | 0.9684 + 0.2116i | 0.9684 + 0.2116i | 0.9684 + 0.2116i | 0.9684 + 0.2116i | 0.9684 + 0.2116i | 0.9684 + 0.2116i | 0.9684 + 0.2116i | 0.9684 + 0.2116i |
| 12 | 0.9663 + 0.2046i | 0.9663 + 0.2046i | 0.9663 + 0.2046i | 0.9663 + 0.2046i | 0.9663 + 0.2046i | 0.9663 + 0.2046i | 0.9663 + 0.2046i | 0.9663 + 0.2046i |
| 12.5 | 0.9266 + 0.1771i | 0.9266 + 0.1771i | 0.9266 + 0.1771i | 0.9266 + 0.1771i | 0.9266 + 0.1771i | 0.9266 + 0.1771i | 0.9266 + 0.1771i | 0.9266 + 0.1771i |
| 13 | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i |
| 13.5 | 0.8935 + 0.1573i | 0.8935 + 0.1573i | 0.8935 + 0.1573i | 0.8935 + 0.1573i | 0.9409 + 0.1603i | 0.9409 + 0.1603i | 0.9409 + 0.1603i | 0.9409 + 0.1603i |
| 14 | 0.9435 + 0.1570i | 0.9435 + 0.1570i | 0.9435 + 0.1570i | 0.9435 + 0.1570i | 0.9435 + 0.1570i | 0.9435 + 0.1570i | 0.9435 + 0.1570i | 0.9435 + 0.1570i |
| 14.5 | 0.9336 + 0.1519i | 0.9336 + 0.1519i | 0.9336 + 0.1519i | 0.9336 + 0.1519i | 0.9336 + 0.1519i | 0.9336 + 0.1519i | 0.9336 + 0.1519i | 0.9336 + 0.1519i |
| 15 | 0.7280 + 0.1141i | 0.7280 + 0.1141i | 0.7280 + 0.1141i | 0.7280 + 0.1141i | 0.7280 + 0.1141i | 0.7280 + 0.1141i | 0.7280 + 0.1141i | 0.7280 + 0.1141i |
| 15.5 | 0.7185 + 0.1111i | 0.7185 + 0.1111i | 0.7185 + 0.1111i | 0.7185 + 0.1111i | 0.7185 + 0.1111i | 0.7185 + 0.1111i | 0.7185 + 0.1111i | 0.7185 + 0.1111i |
| 16 | 0.6737 + 0.1085i | 0.6737 + 0.1085i | 0.6737 + 0.1085i | 0.6737 + 0.1085i | 0.6737 + 0.1085i | 0.6737 + 0.1085i | 0.6737 + 0.1085i | 0.6737 + 0.1085i |
| 16.5 | 0.6764 + 0.1153i | 0.6764 + 0.1153i | 0.6764 + 0.1153i | 0.6764 + 0.1153i | 0.6764 + 0.1153i | 0.6764 + 0.1153i | 0.6764 + 0.1153i | 0.6764 + 0.1153i |
| 17 | 0.6807 + 0.1153i | 0.6807 + 0.1153i | 0.6807 + 0.1153i | 0.6807 + 0.1153i | 0.6807 + 0.1153i | 0.6807 + 0.1153i | 0.6807 + 0.1153i | 0.6807 + 0.1153i |
| 17.5 | 0.6889 + 0.1153i | 0.6889 + 0.1153i | 0.6889 + 0.1153i | 0.6889 + 0.1153i | 0.6889 + 0.1153i | 0.6889 + 0.1153i | 0.6889 + 0.1153i | 0.6889 + 0.1153i |
| 18 | 0.7013 + 0.1150i | 0.7013 + 0.1150i | 0.7013 + 0.1150i | 0.7013 + 0.1150i | 0.7013 + 0.1150i | 0.7013 + 0.1150i | 0.7013 + 0.1150i | 0.7013 + 0.1150i |
| 18.5 | 0.5966 + 0.0943i | 0.5966 + 0.0943i | 0.5966 + 0.0943i | 0.5966 + 0.0943i | 0.5950 + 0.1350i | 0.5950 + 0.1350i | 0.5950 + 0.1350i | 0.5950 + 0.1350i |
| 19 | 0.5849 + 0.0833i | 0.5849 + 0.0833i | 0.5849 + 0.0833i | 0.5849 + 0.0833i | 0.5881 + 0.1455i | 0.5881 + 0.1455i | 0.5881 + 0.1455i | 0.5881 + 0.1455i |
| 19.5 | 0.5741 + 0.0746i | 0.5741 + 0.0746i | 0.5741 + 0.0746i | 0.5741 + 0.0746i | 0.5840 + 0.1567i | 0.5840 + 0.1567i | 0.5840 + 0.1567i | 0.5840 + 0.1567i |
| 20 | 0.8279 + 0.0709i | 0.8279 + 0.0709i | 0.8279 + 0.0709i | 0.8279 + 0.0709i | 0.8194 + 0.1956i | 0.8194 + 0.1956i | 0.8194 + 0.1956i | 0.8194 + 0.1956i |
| 20.5 | 0.6828 + 0.0657i | 0.6828 + 0.0657i | 0.6828 + 0.0657i | 0.6828 + 0.0657i | 0.6888 + 0.1733i | 0.6888 + 0.1733i | 0.6888 + 0.1733i | 0.6888 + 0.1733i |
| 21 | 0.7538 + 0.0616i | 0.7538 + 0.0616i | 0.7099 + 0.0612i | 0.7099 + 0.0612i | 0.7518 + 0.1748i | 0.7518 + 0.1748i | 0.7082 + 0.1738i | 0.7082 + 0.1738i |
| 21.5 | 0.7487 + 0.0659i | 0.7487 + 0.0659i | 0.7487 + 0.0659i | 0.7487 + 0.0659i | 0.7671 + 0.1949i | 0.7671 + 0.1949i | 0.7259 + 0.1919i | 0.7259 + 0.1919i |
| 22 | 0.7749 + 0.0604i | 0.7749 + 0.0604i | 0.7105 + 0.0596i | 0.7105 + 0.0596i | 0.7716 + 0.1792i | 0.7716 + 0.1792i | 0.7083 + 0.1767i | 0.7083 + 0.1767i |
| 22.5 | 0.7668 + 0.0619i | 0.7668 + 0.0619i | 0.7061 + 0.0610i | 0.7061 + 0.0610i | 0.7649 + 0.1855i | 0.7649 + 0.1855i | 0.7041 + 0.1839i | 0.7041 + 0.1839i |
| 23 | 0.7676 + 0.0577i | 0.7676 + 0.0577i | 0.6978 + 0.0604i | 0.6978 + 0.0604i | 0.7752 + 0.1744i | 0.7752 + 0.1744i | 0.6976 + 0.1776i | 0.6976 + 0.1776i |
| 23.5 | 0.7905 + 0.0600i | 0.7905 + 0.0600i | 0.7024 + 0.0596i | 0.7024 + 0.0596i | 0.7921 + 0.1808i | 0.7921 + 0.1808i | 0.7011 + 0.1782i | 0.7011 + 0.1782i |
| 24 | 0.8058 + 0.0559i | 0.8058 + 0.0559i | 0.7006 + 0.0544i | 0.7006 + 0.0544i | 0.7978 + 0.1683i | 0.7978 + 0.1683i | 0.6964 + 0.1646i | 0.6964 + 0.1646i |
| 24.5 | 0.8228 + 0.0536i | 0.8228 + 0.0536i | 0.7137 + 0.0524i | 0.7137 + 0.0524i | 0.8117 + 0.1648i | 0.8117 + 0.1648i | 0.7096 + 0.1603i | 0.7096 + 0.1603i |
| 25 | 0.8234 + 0.0536i | 0.8234 + 0.0536i | 0.7271 + 0.0577i | 0.7271 + 0.0577i | 0.8295 + 0.1722i | 0.8295 + 0.1722i | 0.7310 + 0.1725i | 0.7310 + 0.1725i |
| 25.5 | 0.7751 + 0.0500i | 0.7751 + 0.0500i | 0.6743 + 0.0499i | 0.6743 + 0.0499i | 0.7703 + 0.1482i | 0.7703 + 0.1482i | 0.6805 + 0.1609i | 0.6805 + 0.1609i |
| 26 | 0.8256 + 0.0420i | 0.6508 + 0.0265i | 0.7670 + 0.0378i | 0.7001 + 0.0587i | 0.8198 + 0.1719i | 0.8198 + 0.1719i | 0.7337 + 0.1934i | 0.7270 + 0.1387i |
| 26.5 | 0.8065 + 0.0845i | 0.8269 + 0.0473i | 0.7329 + 0.0868i | 0.7278 + 0.0424i | 0.8099 + 0.1836i | 0.8587 + 0.1711i | 0.7310 + 0.1812i | 1.0556 + 0.1522i |

-continued

| | | | | | | | | |
|---|---|---|---|---|---|---|---|---|
| 27 | 0.7854 + 0.0273i | 0.7838 + 0.0820i | 0.6971 + 0.0252i | 0.6977 + 0.0837i | 0.7918 + 0.2254i | 0.7850 + 0.1575i | 0.7135 + 0.2418i | 0.7115 + 0.1638i |
| 27.5 | 0.7633 + 0.0268i | 0.7892 + 0.0699i | 0.6869 + 0.0273i | 0.6979 + 0.0911i | 0.8189 + 0.2114i | 0.8022 + 0.1410i | 0.7337 + 0.2230i | 0.7228 + 0.1574i |
| 28 | 0.8172 + 0.0455i | 0.7772 + 0.1040i | 0.7246 + 0.0275i | 0.7114 + 0.0993i | 0.8716 + 0.1301i | 0.8012 + 0.1702i | 0.7245 + 0.2595i | 0.7276 + 0.19141 |

| SNR/w | w112 | w113 | w114 | w115 | w116 | w117 | w118 | w119 |
|---|---|---|---|---|---|---|---|---|
| 7 | 1.1550 + 0.6415i | 1.0674 + 0.5791i | 1.2912 + 0.3708i | 1.1739 + 0.3565i | 1.0674 + 0.5791i | 1.0674 + 0.5791i | 1.1739 + 0.3565i | 1.1739 + 0.3565i |
| 7.5 | 1.1144 + 0.6528i | 1.1144 + 0.6528i | 1.2576 + 0.3290i | 1.2576 + 0.3290i | 1.0242 + 0.5805i | 1.0242 + 0.5805i | 1.1415 + 0.3165i | 1.1415 + 0.3165i |
| 8 | 1.1432 + 0.2944i | 1.1432 + 0.2944i | 1.1432 + 0.2944i | 1.1432 + 0.2944i | 1.0154 + 0.5977i | 1.0154 + 0.5977i | 1.0154 + 0.5977i | 1.0154 + 0.5977i |
| 8.5 | 1.1194 + 0.2766i | 1.3234 + 0.2940i | 1.1194 + 0.2766i | 1.3234 + 0.2940i | 0.9851 + 0.5907i | 1.1488 + 0.7259i | 1.1488 + 0.7259i | 1.1488 + 0.7259i |
| 9 | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i |
| 9.5 | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i |
| 10 | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i |
| 10.5 | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i |
| 11 | 0.8430 + 0.5594i | 0.8430 + 0.5594i | 0.8430 + 0.5594i | 0.8430 + 0.5594i | 0.8430 + 0.5594i | 0.8430 + 0.5594i | 0.8430 + 0.5594i | 0.8430 + 0.5594i |
| 11.5 | 0.8333 + 0.5644i | 0.8333 + 0.5644i | 0.8333 + 0.5644i | 0.8333 + 0.5644i | 0.8333 + 0.5644i | 0.8333 + 0.5644i | 0.8333 + 0.5644i | 0.8333 + 0.5644i |
| 12 | 0.8233 + 0.5743i | 0.8233 + 0.5743i | 0.8233 + 0.5743i | 0.8233 + 0.5743i | 0.8233 + 0.5743i | 0.8233 + 0.5743i | 0.8233 + 0.5743i | 0.8233 + 0.5743i |
| 12.5 | 0.8294 + 0.5072i | 0.8294 + 0.5072i | 0.8294 + 0.5072i | 0.8294 + 0.5072i | 0.8294 + 0.5072i | 0.8294 + 0.5072i | 0.8294 + 0.5072i | 0.8294 + 0.5072i |
| 13 | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i |
| 13.5 | 0.8201 + 0.4731i | 0.8201 + 0.4731i | 0.8201 + 0.4731i | 0.8201 + 0.4731i | 0.8201 + 0.4731i | 0.8201 + 0.4731i | 0.8201 + 0.4731i | 0.8201 + 0.4731i |
| 14 | 0.7998 + 0.4314i | 0.7998 + 0.4314i | 0.7998 + 0.4314i | 0.7998 + 0.4314i | 0.7998 + 0.4314i | 0.7998 + 0.4314i | 0.7998 + 0.4314i | 0.7998 + 0.4314i |
| 14.5 | 0.7916 + 0.4239i | 0.7916 + 0.4239i | 0.7916 + 0.4239i | 0.7916 + 0.4239i | 0.7916 + 0.4239i | 0.7916 + 0.4239i | 0.7916 + 0.4239i | 0.7916 + 0.4239i |
| 15 | 0.6440 + 0.3324i | 0.6440 + 0.3324i | 0.6440 + 0.3324i | 0.6440 + 0.3324i | 0.6440 + 0.3324i | 0.6440 + 0.3324i | 0.6440 + 0.3324i | 0.6440 + 0.3324i |
| 15.5 | 0.6321 + 0.3233i | 0.6321 + 0.3233i | 0.6321 + 0.3233i | 0.6321 + 0.3233i | 0.6321 + 0.3233i | 0.6321 + 0.3233i | 0.6321 + 0.3233i | 0.6321 + 0.3233i |
| 16 | 0.5975 + 0.3327i | 0.5975 + 0.3327i | 0.5975 + 0.3327i | 0.5975 + 0.3327i | 0.5975 + 0.3327i | 0.5975 + 0.3327i | 0.5975 + 0.3327i | 0.5975 + 0.3327i |
| 16.5 | 0.5901 + 0.3529i | 0.5901 + 0.3529i | 0.5901 + 0.3529i | 0.5901 + 0.3529i | 0.5901 + 0.3529i | 0.5901 + 0.3529i | 0.5901 + 0.3529i | 0.5901 + 0.3529i |
| 17 | 0.5861 + 0.3535i | 0.5861 + 0.3535i | 0.5861 + 0.3535i | 0.5861 + 0.3535i | 0.5861 + 0.3535i | 0.5861 + 0.3535i | 0.5861 + 0.3535i | 0.5861 + 0.3535i |
| 17.5 | 0.5811 + 0.3607i | 0.5811 + 0.3607i | 0.5811 + 0.3607i | 0.5811 + 0.3607i | 0.5808 + 0.3344i | 0.5811 + 0.3607i | 0.5808 + 0.3344i | 0.5811 + 0.3607i |
| 18 | 0.5743 + 0.3784i | 0.5743 + 0.3784i | 0.5743 + 0.3784i | 0.5743 + 0.3784i | 0.5745 + 0.3275i | 0.5745 + 0.3275i | 0.5745 + 0.3275i | 0.5745 + 0.3275i |
| 18.5 | 0.5248 + 0.4147i | 0.5248 + 0.4147i | 0.5248 + 0.4147i | 0.5248 + 0.4147i | 0.5114 + 0.3280i | 0.5114 + 0.3280i | 0.5114 + 0.3280i | 0.5114 + 0.3280i |
| 19 | 0.5240 + 0.4309i | 0.5240 + 0.4309i | 0.5240 + 0.4309i | 0.5240 + 0.4309i | 0.5018 + 0.3260i | 0.5018 + 0.3260i | 0.5018 + 0.3260i | 0.5018 + 0.3260i |
| 19.5 | 0.5263 + 0.4439i | 0.5263 + 0.4439i | 0.5263 + 0.4439i | 0.5263 + 0.4439i | 0.4971 + 0.3267i | 0.4971 + 0.3267i | 0.4971 + 0.3267i | 0.4971 + 0.3267i |
| 20 | 0.6133 + 0.4297i | 0.6133 + 0.4297i | 0.6133 + 0.4297i | 0.6133 + 0.4297i | 0.6352 + 0.3103i | 0.6352 + 0.3103i | 0.6352 + 0.3103i | 0.6352 + 0.3103i |
| 20.5 | 0.5665 + 0.4387i | 0.5665 + 0.4387i | 0.5665 + 0.4387i | 0.5665 + 0.4387i | 0.5531 + 0.3135i | 0.5531 + 0.3135i | 0.5531 + 0.3135i | 0.5531 + 0.3135i |
| 21 | 0.5624 + 0.4230i | 0.5624 + 0.4230i | 0.5624 + 0.4230i | 0.5624 + 0.4230i | 0.5636 + 0.2986i | 0.5636 + 0.2986i | 0.5636 + 0.2986i | 0.5636 + 0.2986i |
| 21.5 | 0.5688 + 0.4357i | 0.5688 + 0.4357i | 0.5688 + 0.4357i | 0.5688 + 0.4357i | 0.5773 + 0.3079i | 0.5773 + 0.3079i | 0.5773 + 0.3079i | 0.5773 + 0.3079i |
| 22 | 0.5625 + 0.4194i | 0.5625 + 0.4194i | 0.5625 + 0.4194i | 0.5625 + 0.4194i | 0.5659 + 0.2939i | 0.5659 + 0.2939i | 0.5659 + 0.2939i | 0.5659 + 0.2939i |
| 22.5 | 0.5645 + 0.4308i | 0.5645 + 0.4308i | 0.5645 + 0.4308i | 0.5645 + 0.4308i | 0.5679 + 0.3049i | 0.5679 + 0.3049i | 0.5679 + 0.3049i | 0.5679 + 0.3049i |
| 23 | 0.5455 + 0.4271i | 0.5455 + 0.4271i | 0.5873 + 0.4287i | 0.5873 + 0.4287i | 0.5487 + 0.2990i | 0.5487 + 0.2990i | 0.5880 + 0.2980i | 0.5880 + 0.2980i |
| 23.5 | 0.5421 + 0.4218i | 0.5421 + 0.4218i | 0.5946 + 0.4228i | 0.5946 + 0.4228i | 0.5434 + 0.2954i | 0.5434 + 0.2954i | 0.5939 + 0.2963i | 0.5939 + 0.2963i |
| 24 | 0.5284 + 0.4128i | 0.5284 + 0.4128i | 0.5874 + 0.4122i | 0.5874 + 0.4122i | 0.5310 + 0.2850i | 0.5310 + 0.2850i | 0.5919 + 0.2846i | 0.5919 + 0.2846i |

-continued

| | | | | | | | | |
|---|---|---|---|---|---|---|---|---|
| 24.5 | 0.5365 + 0.4381i | 0.5382 + 0.3853i | 0.5982 + 0.4418i | 0.6015 + 0.3864i | 0.5372 + 0.2765i | 0.5372 + 0.2765i | 0.6078 + 0.2760i | 0.6078 + 0.2760i |
| 25 | 0.5453 + 0.4454i | 0.5502 + 0.3898i | 0.6234 + 0.4539i | 0.6307 + 0.3941i | 0.5556 + 0.2865i | 0.5556 + 0.2865i | 0.6380 + 0.2905i | 0.6380 + 0.2905i |
| 25.5 | 0.5461 + 0.4689i | 0.5406 + 0.4028i | 0.6279 + 0.4619i | 0.6209 + 0.3959i | 0.5286 + 0.2713i | 0.5338 + 0.3241i | 0.6051 + 0.2663i | 0.6111 + 0.3180i |
| 26 | 0.5698 + 0.4829i | 0.5665 + 0.4039i | 0.6267 + 0.4766i | 0.6435 + 0.4035i | 0.5791 + 0.2819i | 0.5732 + 0.3319i | 0.6629 + 0.2838i | 0.6557 + 0.3430i |
| 26.5 | 0.5542 + 0.5035i | 0.5680 + 0.4220i | 0.6136 + 0.5202i | 0.6338 + 0.4274i | 0.5765 + 0.2788i | 0.5763 + 0.3431i | 0.6576 + 0.2694i | 0.6479 + 0.3478i |
| 27 | 0.5772 + 0.4729i | 0.6966 + 0.5064i | 0.6313 + 0.4262i | 0.6900 + 0.4641i | 0.5461 + 0.2809i | 0.5401 + 0.3444i | 0.6216 + 0.3057i | 0.5842 + 0.3465i |
| 27.5 | 0.5441 + 0.4997i | 0.7312 + 0.5058i | 0.6143 + 0.4752i | 0.6785 + 0.4286i | 0.5678 + 0.2914i | 0.5691 + 0.3548i | 0.6493 + 0.2928i | 0.6423 + 0.3564i |
| 28 | 0.5732 + 0.4753i | 0.7131 + 0.5308i | 0.6412 + 0.4359i | 0.6970 + 0.4732i | 0.5488 + 0.2953i | 0.5454 + 0.3628i | 0.6317 + 0.3194i | 0.5938 + 0.36121 |

| SNR/w | w120 | w121 | w122 | w123 | w124 | w125 | w126 | w127 |
|---|---|---|---|---|---|---|---|---|
| 7 | 1.0674 + 0.5791i | 1.0674 + 0.5791i | 1.1739 + 0.3565i | 1.1739 + 0.3565i | 1.0674 + 0.5791i | 1.0674 + 0.5791i | 1.1739 + 0.3565i | 1.1739 + 0.3565i |
| 7.5 | 1.0242 + 0.5805i | 1.0242 + 0.5805i | 1.1415 + 0.3165i | 1.1415 + 0.3165i | 1.0242 + 0.5805i | 1.0242 + 0.5805i | 1.1415 + 0.3165i | 1.1415 + 0.3165i |
| 8 | 1.1432 + 0.2944i | 1.1432 + 0.2944i | 1.1432 + 0.2944i | 1.1432 + 0.2944i | 1.0154 + 0.5977i | 1.0154 + 0.5977i | 1.0154 + 0.5977i | 1.0154 + 0.5977i |
| 8.5 | 1.1194 + 0.2766i | 1.1194 + 0.2766i | 1.1194 + 0.2766i | 1.1194 + 0.2766i | 0.9851 + 0.5907i | 0.9851 + 0.5907i | 0.9851 + 0.5907i | 0.9851 + 0.5907i |
| 9 | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i |
| 9.5 | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i |
| 10 | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i |
| 10.5 | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i |
| 11 | 0.8430 + 0.5594i | 0.8430 + 0.5594i | 0.8430 + 0.5594i | 0.8430 + 0.5594i | 0.8430 + 0.5594i | 0.8430 + 0.5594i | 0.8430 + 0.5594i | 0.8430 + 0.5594i |
| 11.5 | 0.8333 + 0.5644i | 0.8333 + 0.5644i | 0.8333 + 0.5644i | 0.8333 + 0.5644i | 0.8333 + 0.5644i | 0.8333 + 0.5644i | 0.8333 + 0.5644i | 0.8333 + 0.5644i |
| 12 | 0.8233 + 0.5743i | 0.8233 + 0.5743i | 0.8233 + 0.5743i | 0.8233 + 0.5743i | 0.8233 + 0.5743i | 0.8233 + 0.5743i | 0.8233 + 0.5743i | 0.8233 + 0.5743i |
| 12.5 | 0.8294 + 0.5072i | 0.8294 + 0.5072i | 0.8294 + 0.5072i | 0.8294 + 0.5072i | 0.8294 + 0.5072i | 0.8294 + 0.5072i | 0.8294 + 0.5072i | 0.8294 + 0.5072i |
| 13 | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i |
| 13.5 | 0.8201 + 0.4731i | 0.8201 + 0.4731i | 0.8201 + 0.4731i | 0.8201 + 0.4731i | 0.8201 + 0.4731i | 0.8201 + 0.4731i | 0.8201 + 0.4731i | 0.8201 + 0.4731i |
| 14 | 0.8741 + 0.4615i | 0.8741 + 0.4615i | 0.8741 + 0.4615i | 0.8741 + 0.4615i | 0.8741 + 0.4615i | 0.8741 + 0.4615i | 0.8741 + 0.4615i | 0.8741 + 0.4615i |
| 14.5 | 0.8718 + 0.4558i | 0.8718 + 0.4558i | 0.8718 + 0.4558i | 0.8718 + 0.4558i | 0.8718 + 0.4558i | 0.8718 + 0.4558i | 0.8718 + 0.4558i | 0.8718 + 0.4558i |
| 15 | 0.7272 + 0.3352i | 0.7272 + 0.3352i | 0.7272 + 0.3352i | 0.7272 + 0.3352i | 0.7272 + 0.3352i | 0.7272 + 0.3352i | 0.7272 + 0.3352i | 0.7272 + 0.3352i |
| 15.5 | 0.7112 + 0.3323i | 0.7112 + 0.3323i | 0.7112 + 0.3323i | 0.7112 + 0.3323i | 0.7112 + 0.3323i | 0.7112 + 0.3323i | 0.7112 + 0.3323i | 0.7112 + 0.3323i |
| 16 | 0.6776 + 0.3286i | 0.6776 + 0.3286i | 0.6776 + 0.3286i | 0.6776 + 0.3286i | 0.6776 + 0.3286i | 0.6776 + 0.3286i | 0.6776 + 0.3286i | 0.6776 + 0.3286i |
| 16.5 | 0.6798 + 0.3534i | 0.6798 + 0.3534i | 0.6798 + 0.3534i | 0.6798 + 0.3534i | 0.6798 + 0.3534i | 0.6798 + 0.3534i | 0.6798 + 0.3534i | 0.6798 + 0.3534i |
| 17 | 0.6897 + 0.3587i | 0.6897 + 0.3587i | 0.6897 + 0.3587i | 0.6897 + 0.3587i | 0.6897 + 0.3587i | 0.6897 + 0.3587i | 0.6724 + 0.3390i | 0.6724 + 0.3390i |
| 17.5 | 0.6994 + 0.3653i | 0.6994 + 0.3653i | 0.6994 + 0.3653i | 0.6994 + 0.3653i | 0.6903 + 0.3342i | 0.6994 + 0.3653i | 0.6903 + 0.3342i | 0.6903 + 0.3342i |
| 18 | 0.7101 + 0.3792i | 0.7101 + 0.3792i | 0.7101 + 0.3792i | 0.7101 + 0.3792i | 0.7070 + 0.3268i | 0.7070 + 0.3268i | 0.7070 + 0.3268i | 0.7070 + 0.3268i |
| 18.5 | 0.6355 + 0.3814i | 0.6355 + 0.3814i | 0.6355 + 0.3814i | 0.6355 + 0.3814i | 0.6151 + 0.3139i | 0.6151 + 0.3139i | 0.6151 + 0.3139i | 0.6151 + 0.3139i |
| 19 | 0.6507 + 0.3851i | 0.6507 + 0.3851i | 0.6507 + 0.3851i | 0.6507 + 0.3851i | 0.6178 + 0.3034i | 0.6178 + 0.3034i | 0.6178 + 0.3034i | 0.6178 + 0.3034i |
| 19.5 | 0.6629 + 0.3939i | 0.6629 + 0.3939i | 0.6629 + 0.3939i | 0.6629 + 0.3939i | 0.6213 + 0.2984i | 0.6213 + 0.2984i | 0.6213 + 0.2984i | 0.6213 + 0.2984i |
| 20 | 0.7784 + 0.4670i | 0.7784 + 0.4670i | 0.7784 + 0.4670i | 0.7784 + 0.4670i | 0.8009 + 0.3355i | 0.8009 + 0.3355i | 0.8009 + 0.3355i | 0.8009 + 0.3355i |
| 20.5 | 0.7301 + 0.4216i | 0.7301 + 0.4216i | 0.7301 + 0.4216i | 0.7301 + 0.4216i | 0.7088 + 0.3006i | 0.7088 + 0.3006i | 0.7088 + 0.3006i | 0.7088 + 0.3006i |
| 21 | 0.7483 + 0.4245i | 0.7483 + 0.4245i | 0.7037 + 0.4239i | 0.7037 + 0.4239i | 0.7494 + 0.3007i | 0.7494 + 0.3007i | 0.7055 + 0.2997i | 0.7055 + 0.2997i |
| 21.5 | 0.7656 + 0.4486i | 0.7656 + 0.4486i | 0.7088 + 0.4464i | 0.7088 + 0.4464i | 0.7665 + 0.3224i | 0.7665 + 0.3224i | 0.7166 + 0.3187i | 0.7166 + 0.3187i |

-continued

| | | | | | | | | |
|---|---|---|---|---|---|---|---|---|
| 22 | 0.7603 + 0.4266i | 0.7603 + 0.4266i | 0.6987 + 0.4225i | 0.6987 + 0.4225i | 0.7666 + 0.3018i | 0.7666 + 0.3018i | 0.7041 + 0.2986i | 0.7041 + 0.2986i |
| 22.5 | 0.7670 + 0.4425i | 0.7670 + 0.4425i | 0.7000 + 0.4383i | 0.7000 + 0.4383i | 0.7664 + 0.3107i | 0.7664 + 0.3107i | 0.7025 + 0.3102i | 0.7025 + 0.3102i |
| 23 | 0.7810 + 0.4229i | 0.7810 + 0.4229i | 0.7029 + 0.4322i | 0.7029 + 0.4322i | 0.7756 + 0.2985i | 0.7756 + 0.2985i | 0.6967 + 0.2986i | 0.6967 + 0.2986i |
| 23.5 | 0.7958 + 0.4134i | 0.7958 + 0.4134i | 0.7004 + 0.4218i | 0.7004 + 0.4218i | 0.7952 + 0.2982i | 0.7952 + 0.2982i | 0.6980 + 0.2962i | 0.6980 + 0.2962i |
| 24 | 0.7774 + 0.4109i | 0.7774 + 0.4109i | 0.6863 + 0.4107i | 0.6863 + 0.4107i | 0.7842 + 0.2820i | 0.7842 + 0.2820i | 0.6911 + 0.2828i | 0.6911 + 0.2828i |
| 24.5 | 0.7755 + 0.4408i | 0.7713 + 0.3997i | 0.6867 + 0.4431i | 0.6891 + 0.3906i | 0.7912 + 0.2860i | 0.7912 + 0.2860i | 0.7000 + 0.2778i | 0.7000 + 0.2778i |
| 25 | 0.7995 + 0.4820i | 0.8171 + 0.4128i | 0.7102 + 0.4660i | 0.7219 + 0.4003i | 0.8339 + 0.2736i | 0.8318 + 0.3245i | 0.7325 + 0.2751i | 0.7307 + 0.3150i |
| 25.5 | 0.8154 + 0.4444i | 0.8041 + 0.3748i | 0.7181 + 0.4538i | 0.7090 + 0.3874i | 0.7836 + 0.2479i | 0.7852 + 0.2984i | 0.6906 + 0.2579i | 0.6979 + 0.3074i |
| 26 | 0.7109 + 0.5267i | 0.7933 + 0.4911i | 0.6853 + 0.4989i | 0.7434 + 0.4295i | 0.8119 + 0.2687i | 0.8144 + 0.3360i | 0.7394 + 0.2759i | 0.7571 + 0.3617i |
| 26.5 | 0.7330 + 0.5364i | 0.7626 + 0.4705i | 0.6735 + 0.5353i | 0.7029 + 0.4406i | 0.8089 + 0.2759i | 0.7900 + 0.3695i | 0.7325 + 0.2706i | 0.7251 + 0.3586i |
| 27 | 0.8413 + 0.5029i | 0.8110 + 0.4476i | 0.6888 + 0.3768i | 0.7429 + 0.4148i | 0.8225 + 0.2737i | 0.8412 + 0.3609i | 0.7112 + 0.3146i | 0.7703 + 0.3556i |
| 27.5 | 0.8444 + 0.5124i | 0.7991 + 0.4492i | 0.6143 + 0.4752i | 0.7216 + 0.4137i | 0.8351 + 0.2795i | 0.8172 + 0.3610i | 0.7372 + 0.2864i | 0.7394 + 0.3488i |
| 28 | 0.8115 + 0.5747i | 0.9164 + 0.3766i | 0.7047 + 0.3807i | 0.7428 + 0.4237i | 0.9347 + 0.2772i | 0.8627 + 0.3189i | 0.7327 + 0.3199i | 0.8033 + 0.36711 |

| SNR/w | w128 | w129 | w130 | w131 | w132 | w133 | w134 | w135 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2279 + 0.4119i | 0.2279 + 0.4119i | 0.2279 + 0.4119i | 0.2279 + 0.4119i | 0.2279 + 0.4119i | 0.2279 + 0.4119i | 0.2279 + 0.4119i | 0.2279 + 0.4119i |
| 8.5 | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i |
| 9 | 0.3931 + 2.0687i | 0.2962 + 1.4568i | 0.2962 + 1.4568i | 0.2962 + 1.4568i | 0.2962 + 1.4568i | 0.2962 + 1.4568i | 0.2962 + 1.4568i | 0.2850 + 1.3540i |
| 9.5 | 0.4001 + 2.0659i | 0.2931 + 1.4703i | 0.2931 + 1.4703i | 0.2931 + 1.4703i | 0.2931 + 1.4703i | 0.2931 + 1.4703i | 0.2931 + 1.4703i | 0.2804 + 1.3831i |
| 10 | 0.4076 + 2.0613i | 0.2877 + 1.4563i | 0.2877 + 1.4563i | 0.2877 + 1.4563i | 0.2877 + 1.4563i | 0.2877 + 1.4563i | 0.2877 + 1.4563i | 0.2877 + 1.4563i |
| 10.5 | 0.4367 + 2.0633i | 0.2937 + 1.4820i | 0.2937 + 1.4820i | 0.2937 + 1.4820i | 0.2937 + 1.4820i | 0.2937 + 1.4820i | 0.2937 + 1.4820i | 0.2763 + 1.4151i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i |
| 13 | 0.7072 + 1.7916i | 0.3864 + 1.5448i | 0.5480 + 1.7046i | 0.3864 + 1.5448i | 0.1823 + 1.3021i | 0.1823 + 1.3021i | 0.1823 + 1.3021i | 0.1823 + 1.3021i |
| 13.5 | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i |
| 14 | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i |
| 14.5 | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i |
| 15 | 0.1089 + 0.9337i | 0.1089 + 0.9337i | 0.1089 + 0.9337i | 0.1089 + 0.9337i | 0.1557 + 0.8813i | 0.1557 + 0.8813i | 0.1557 + 0.8813i | 0.1557 + 0.8813i |
| 15.5 | 0.1085 + 0.9355i | 0.1085 + 0.9355i | 0.1085 + 0.9355i | 0.1085 + 0.9355i | 0.1634 + 0.8895i | 0.1634 + 0.8895i | 0.1634 + 0.8895i | 0.1634 + 0.8895i |
| 16 | 0.1050 + 1.1694i | 0.1444 + 1.1486i | 0.1050 + 1.1694i | 0.1444 + 1.1486i | 0.1598 + 0.9603i | 0.1598 + 0.9603i | 0.1598 + 0.9603i | 0.1598 + 0.9603i |
| 16.5 | 0.0972 + 1.5339i | 0.1100 + 1.2587i | 0.1342 + 1.7892i | 0.1127 + 1.2073i | 0.1134 + 0.9196i | 0.1137 + 0.9858i | 0.1134 + 0.9196i | 0.1137 + 0.9858i |
| 17 | 0.0983 + 1.5325i | 0.1102 + 1.2536i | 0.1311 + 1.7918i | 0.1116 + 1.2028i | 0.1130 + 0.9150i | 0.1137 + 0.9836i | 0.1130 + 0.9150i | 0.1137 + 0.9836i |
| 17.5 | 0.0987 + 1.5243i | 0.1109 + 1.2478i | 0.1257 + 1.7839i | 0.1117 + 1.1979i | 0.1131 + 0.9127i | 0.1143 + 0.9836i | 0.1131 + 0.9127i | 0.1143 + 0.9836i |
| 18 | 0.1006 + 1.5247i | 0.1112 + 1.2459i | 0.1242 + 1.7780i | 0.1122 + 1.1982i | 0.1117 + 0.9130i | 0.1132 + 0.9853i | 0.1117 + 0.9130i | 0.1132 + 0.9853i |
| 18.5 | 0.0767 + 1.5118i | 0.0870 + 1.3422i | 0.1944 + 2.0287i | 0.0901 + 1.2929i | 0.0881 + 1.0369i | 0.0875 + 1.1126i | 0.0881 + 1.0369i | 0.0875 + 1.1126i |
| 19 | 0.0744 + 1.4981i | 0.0851 + 1.3326i | 0.1794 + 2.0056i | 0.0874 + 1.2840i | 0.0808 + 1.0409i | 0.0820 + 1.1126i | 0.0808 + 1.0409i | 0.0820 + 1.1126i |

-continued

| | | | | | | | | |
|---|---|---|---|---|---|---|---|---|
| 19.5 | 0.0752 + 1.5337i | 0.0955 + 1.3157i | 0.1184 + 1.4863i | 0.0955 + 1.3157i | 0.0762 + 1.0479i | 0.0803 + 1.1289i | 0.0762 + 1.0479i | 0.0803 + 1.1289i |
| 20 | 0.1316 + 1.8965i | 0.0779 + 1.0678i | 0.0714 + 1.3185i | 0.0721 + 1.1636i | 0.0703 + 0.7860i | 0.0680 + 0.8535i | 0.0703 + 0.7860i | 0.0680 + 0.8535i |
| 20.5 | 0.0626 + 1.4912i | 0.0694 + 1.2086i | 0.0906 + 1.3933i | 0.0694 + 1.2086i | 0.0650 + 0.9379i | 0.0667 + 1.0256i | 0.0650 + 0.9379i | 0.0667 + 1.0256i |
| 21 | 0.0566 + 1.3765i | 0.0634 + 1.2157i | 0.1312 + 1.8435i | 0.0646 + 1.1619i | 0.0641 + 0.9102i | 0.0644 + 1.0160i | 0.0641 + 0.9102i | 0.0644 + 1.0160i |
| 21.5 | 0.0769 + 1.6079i | 0.0600 + 1.1808i | 0.0696 + 1.4311i | 0.0605 + 1.2664i | 0.0589 + 0.8958i | 0.0594 + 1.0308i | 0.0589 + 0.8958i | 0.0594 + 1.0308i |
| 22 | 0.0510 + 1.3552i | 0.0609 + 1.2217i | 0.1064 + 1.8045i | 0.0551 + 1.1486i | 0.0634 + 0.8931i | 0.0594 + 1.0082i | 0.0634 + 0.8931i | 0.0594 + 1.0082i |
| 22.5 | 0.0791 + 1.6235i | 0.0595 + 1.1619i | 0.0601 + 1.4463i | 0.0547 + 1.2748i | 0.0600 + 0.8898i | 0.0596 + 1.0378i | 0.0600 + 0.8898i | 0.0611 + 0.9993i |
| 23 | 0.0749 + 1.6355i | 0.0569 + 1.1877i | 0.0706 + 1.4379i | 0.0637 + 1.3045i | 0.0517 + 0.8912i | 0.0510 + 1.0772i | 0.0517 + 0.8912i | 0.0557 + 1.0136i |
| 23.5 | 0.0477 + 1.8317i | 0.0474 + 1.1599i | 0.0728 + 1.4375i | 0.0610 + 1.3181i | 0.0576 + 0.8796i | 0.0537 + 1.0431i | 0.0576 + 0.8796i | 0.0564 + 0.9856i |
| 24 | 0.0878 + 1.7221i | 0.0632 + 1.2393i | 0.0735 + 1.5241i | 0.0421 + 1.3702i | 0.0575 + 0.9316i | 0.0611 + 1.1293i | 0.0575 + 0.9316i | 0.0593 + 1.0507i |
| 24.5 | 0.0895 + 1.7536i | 0.0613 + 1.3638i | 0.0760 + 1.5470i | 0.0501 + 1.2243i | 0.0488 + 0.9067i | 0.0467 + 1.0086i | 0.0503 + 0.8690i | 0.0466 + 1.1053i |
| 25 | 0.0931 + 1.7166i | 0.0566 + 1.3482i | 0.0751 + 1.5225i | 0.0462 + 1.2117i | 0.0474 + 0.9022i | 0.0455 + 0.9995i | 0.0493 + 0.8602i | 0.0444 + 1.0970i |
| 25.5 | 0.0758 + 1.6507i | 0.0505 + 1.3310i | 0.0710 + 1.4902i | 0.0549 + 1.2097i | 0.0438 + 0.9415i | 0.0377 + 1.0346i | 0.0846 + 0.9291i | 0.0622 + 1.1023i |
| 26 | 0.0601 + 1.4639i | 0.0558 + 1.3274i | 0.1068 + 1.6195i | 0.0328 + 1.1706i | 0.0431 + 0.8824i | 0.0431 + 0.8824i | 0.0642 + 0.9670i | 0.0431 + 1.0429i |
| 26.5 | 0.0683 + 1.5203i | 0.0701 + 1.3841i | 0.0850 + 1.6726i | 0.0362 + 1.2588i | 0.0544 + 0.9100i | 0.0513 + 0.9841i | 0.0324 + 1.1232i | 0.0576 + 1.0610i |
| 27 | 0.0637 + 1.4870i | 0.0530 + 1.3497i | 0.0764 + 1.6418i | 0.0536 + 1.2353i | 0.0420 + 0.9016i | 0.0378 + 0.9756i | 0.0444 + 1.1113i | 0.0805 + 1.0397i |
| 27.5 | 0.0628 + 1.3974i | 0.0561 + 1.2894i | 0.0641 + 1.5359i | 0.1283 + 1.2196i | 0.0408 + 0.9054i | 0.0369 + 0.9810i | 0.0341 + 1.1435i | 0.0589 + 1.0577i |
| 28 | 0.0586 + 1.3727i | 0.1555 + 1.3034i | 0.0663 + 1.5122i | 0.1473 + 1.1900i | 0.0359 + 0.9236i | 0.0375 + 1.0235i | 0.0402 + 1.2339i | 0.0477 + 1.12661 |

| SNR/w | w136 | w137 | w138 | w139 | w140 | w141 | w142 | w143 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2279 + 0.4119i | 0.2279 + 0.4119i | 0.2279 + 0.4119i | 0.2279 + 0.4119i | 0.2540 + 0.4692i | 0.2279 + 0.4119i | 0.2540 + 0.4692i | 0.2279 + 0.4119i |
| 8.5 | 0.2621 + 0.5179i | 0.2175 + 0.3998i | 0.2621 + 0.5179i | 0.2175 + 0.3998i | 0.2621 + 0.5179i | 0.2621 + 0.5179i | 0.2621 + 0.5179i | 0.2621 + 0.5179i |
| 9 | 0.2962 + 1.4568i | 0.2962 + 1.4568i | 0.2962 + 1.4568i | 0.2850 + 1.3540i | 0.2962 + 1.4568i | 0.2850 + 1.3540i | 0.2850 + 1.3540i | 0.2850 + 1.3540i |
| 9.5 | 0.2931 + 1.4703i | 0.2931 + 1.4703i | 0.2931 + 1.4703i | 0.2804 + 1.3831i | 0.2931 + 1.4703i | 0.2804 + 1.3831i | 0.2804 + 1.3831i | 0.2804 + 1.3831i |
| 10 | 0.2877 + 1.4563i | 0.2877 + 1.4563i | 0.2877 + 1.4563i | 0.2877 + 1.4563i | 0.2877 + 1.4563i | 0.2877 + 1.4563i | 0.2877 + 1.4563i | 0.2727 + 1.3797i |
| 10.5 | 0.2937 + 1.4820i | 0.2937 + 1.4820i | 0.2937 + 1.4820i | 0.2763 + 1.4151i | 0.2937 + 1.4820i | 0.2763 + 1.4151i | 0.2763 + 1.4151i | 0.2763 + 1.4151i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i |
| 13 | 0.2783 + 2.0929i | 0.2668 + 1.5463i | 0.2047 + 1.8160i | 0.2333 + 1.6150i | 0.1823 + 1.3021i | 0.1823 + 1.3021i | 0.1823 + 1.3021i | 0.1790 + 1.3480i |
| 13.5 | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i |
| 14 | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i |
| 14.5 | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i |
| 15 | 0.1089 + 0.9337i | 0.1089 + 0.9337i | 0.1089 + 0.9337i | 0.1089 + 0.9337i | 0.1557 + 0.8813i | 0.1557 + 0.8813i | 0.1557 + 0.8813i | 0.1557 + 0.8813i |
| 15.5 | 0.1085 + 0.9355i | 0.1085 + 0.9355i | 0.1085 + 0.9355i | 0.1085 + 0.9355i | 0.1634 + 0.8895i | 0.1634 + 0.8895i | 0.1634 + 0.8895i | 0.1634 + 0.8895i |
| 16 | 0.1050 + 1.1694i | 0.1444 + 1.1486i | 0.1050 + 1.1694i | 0.1444 + 1.1486i | 0.1598 + 0.9603i | 0.1598 + 0.9603i | 0.1598 + 0.9603i | 0.1598 + 0.9603i |
| 16.5 | 0.1003 + 1.4730i | 0.1100 + 1.2587i | 0.2016 + 2.0694i | 0.1127 + 1.2073i | 0.1134 + 0.9196i | 0.1137 + 0.9858i | 0.1134 + 0.9196i | 0.1137 + 0.9858i |

-continued

| | | | | | | | | |
|---|---|---|---|---|---|---|---|---|
| 17 | 0.0998 + 1.4730i | 0.1102 + 1.2536i | 0.2013 + 2.0723i | 0.1116 + 1.2028i | 0.1130 + 0.9150i | 0.1137 + 0.9836i | 0.1130 + 0.9150i | 0.1137 + 0.9836i |
| 17.5 | 0.0988 + 1.4659i | 0.1109 + 1.2478i | 0.1973 + 2.0632i | 0.1117 + 1.1979i | 0.1131 + 0.9127i | 0.1143 + 0.9836i | 0.1131 + 0.9127i | 0.1143 + 0.9836i |
| 18 | 0.0991 + 1.4625i | 0.1112 + 1.2459i | 0.1977 + 2.0538i | 0.1122 + 1.1982i | 0.1117 + 0.9130i | 0.1132 + 0.9853i | 0.1117 + 0.9130i | 0.1132 + 0.9853i |
| 18.5 | 0.1910 + 1.5579i | 0.2343 + 1.3492i | 0.1431 + 1.7701i | 0.2372 + 1.2959i | 0.1908 + 1.0283i | 0.2050 + 1.1029i | 0.1908 + 1.0283i | 0.2050 + 1.1029i |
| 19 | 0.2005 + 1.5419i | 0.2412 + 1.3402i | 0.1377 + 1.7502i | 0.2448 + 1.2861i | 0.2107 + 1.0297i | 0.2222 + 1.1025i | 0.2107 + 1.0297i | 0.2222 + 1.1025i |
| 19.5 | 0.1545 + 1.7181i | 0.2624 + 1.2819i | 0.2850 + 1.5423i | 0.2677 + 1.3192i | 0.2186 + 1.0320i | 0.2321 + 1.1085i | 0.2186 + 1.0320i | 0.2321 + 1.1085i |
| 20 | 0.0990 + 1.6597i | 0.0779 + 1.0678i | 0.0744 + 1.4636i | 0.0779 + 1.0678i | 0.1218 + 0.7966i | 0.1044 + 0.8769i | 0.1218 + 0.7966i | 0.1044 + 0.8769i |
| 20.5 | 0.1248 + 1.6210i | 0.1957 + 1.2003i | 0.2104 + 1.4066i | 0.1957 + 1.2003i | 0.1871 + 0.9324i | 0.1917 + 1.0185i | 0.1871 + 0.9324i | 0.1917 + 1.0185i |
| 21 | 0.1464 + 1.4100i | 0.1799 + 1.2274i | 0.0916 + 1.6132i | 0.1856 + 1.1690i | 0.1852 + 0.9092i | 0.1867 + 1.0190i | 0.1852 + 0.9092i | 0.1867 + 1.0190i |
| 21.5 | 0.1329 + 1.8110i | 0.1785 + 1.1792i | 0.1881 + 1.4135i | 0.1836 + 1.2632i | 0.1684 + 0.8948i | 0.1725 + 1.0304i | 0.1684 + 0.8948i | 0.1725 + 1.0304i |
| 22 | 0.0760 + 1.4947i | 0.1660 + 1.1960i | 0.1932 + 1.6270i | 0.1685 + 1.1538i | 0.1862 + 0.8964i | 0.1808 + 1.0223i | 0.1862 + 0.8964i | 0.1808 + 1.0223i |
| 22.5 | 0.1993 + 1.7519i | 0.1777 + 1.1663i | 0.1733 + 1.4310i | 0.1704 + 1.2820i | 0.1781 + 0.8873i | 0.1775 + 1.0391i | 0.1781 + 0.8873i | 0.1776 + 0.9980i |
| 23 | 0.0964 + 1.7933i | 0.1763 + 1.1862i | 0.1993 + 1.4336i | 0.1869 + 1.2930i | 0.1577 + 0.8931i | 0.1678 + 1.0712i | 0.1577 + 0.8931i | 0.1592 + 1.0127i |
| 23.5 | 0.2224 + 1.7477i | 0.1587 + 1.1598i | 0.0786 + 1.6259i | 0.1644 + 1.2701i | 0.1717 + 0.8813i | 0.1654 + 1.0555i | 0.1717 + 0.8813i | 0.1690 + 0.9911i |
| 24 | 0.2059 + 1.3214i | 0.1962 + 1.2278i | 0.2073 + 1.4403i | 0.2541 + 1.5814i | 0.1735 + 0.9273i | 0.1853 + 1.1204i | 0.1735 + 0.9273i | 0.1790 + 1.0453i |
| 24.5 | 0.3255 + 1.7591i | 0.1702 + 1.3294i | 0.2212 + 1.6117i | 0.1562 + 1.2055i | 0.1511 + 0.8904i | 0.1398 + 1.0100i | 0.1511 + 0.8904i | 0.1427 + 1.0977i |
| 25 | 0.3472 + 1.7040i | 0.1573 + 1.3131i | 0.2161 + 1.5686i | 0.1468 + 1.1983i | 0.1469 + 0.8839i | 0.1353 + 1.0028i | 0.1469 + 0.8839i | 0.1358 + 1.0939i |
| 25.5 | 0.2337 + 1.6652i | 0.2321 + 1.1730i | 0.2083 + 1.5062i | 0.1547 + 1.2132i | 0.2051 + 0.9488i | 0.2157 + 1.0645i | 0.1608 + 0.9436i | 0.1497 + 1.0697i |
| 26 | 0.3076 + 1.5930i | 0.1352 + 1.2642i | 0.2100 + 1.4742i | 0.1117 + 1.1707i | 0.1697 + 0.9111i | 0.1855 + 1.0551i | 0.1491 + 0.9425i | 0.1223 + 1.0684i |
| 26.5 | 0.2675 + 1.6286i | 0.1335 + 1.3004i | 0.2245 + 1.4893i | 0.1429 + 1.2032i | 0.1579 + 0.9322i | 0.1592 + 1.0119i | 0.1815 + 0.8811i | 0.1547 + 1.1064i |
| 27 | 0.2178 + 1.5591i | 0.1947 + 1.1461i | 0.1887 + 1.4107i | 0.1532 + 1.2458i | 0.2220 + 0.9109i | 0.2132 + 1.0386i | 0.1577 + 0.9120i | 0.1514 + 1.0025i |
| 27.5 | 0.2076 + 1.6180i | 0.2354 + 1.1287i | 0.1770 + 1.4782i | 0.1619 + 1.1335i | 0.2094 + 0.9195i | 0.2160 + 1.0223i | 0.1473 + 0.9211i | 0.1402 + 1.0282i |
| 28 | 0.2491 + 1.5678i | 0.2319 + 1.0829i | 0.1797 + 1.4545i | 0.1551 + 1.0959i | 0.2134 + 0.9134i | 0.2284 + 0.9984i | 0.1399 + 0.9185i | 0.1422 + 1.00601 |

| SNR/w | w144 | w145 | w146 | w147 | w148 | w149 | w150 | w151 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2279 + 0.4119i | 0.2279 + 0.4119i | 0.2279 + 0.4119i | 0.2279 + 0.4119i | 0.2540 + 0.4692i | 0.2279 + 0.4119i | 0.2540 + 0.4692i | 0.2279 + 0.4119i |
| 8.5 | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i |
| 9 | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i |
| 10 | 0.2442 + 1.0177i | 0.2442 + 1.0177i | 0.2442 + 1.0177i | 0.2442 + 1.0177i | 0.2442 + 1.0177i | 0.2442 + 1.0177i | 0.2442 + 1.0177i | 0.2442 + 1.0177i |
| 10.5 | 0.2325 + 1.0121i | 0.2325 + 1.0121i | 0.2325 + 1.0121i | 0.2325 + 1.0121i | 0.2325 + 1.0121i | 0.2325 + 1.0121i | 0.2325 + 1.0121i | 0.2325 + 1.0121i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i |
| 13 | 0.1625 + 0.8963i | 0.1625 + 0.8963i | 0.1625 + 0.8963i | 0.1625 + 0.8963i | 0.1561 + 0.9541i | 0.1625 + 0.8963i | 0.1561 + 0.9541i | 0.1625 + 0.8963i |
| 13.5 | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i |
| 14 | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i |

-continued

| | | | | | | | | |
|---|---|---|---|---|---|---|---|---|
| 14.5 | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i |
| 15 | 0.1425 + 0.6182i | 0.1425 + 0.6182i | 0.1425 + 0.6182i | 0.1425 + 0.6182i | 0.1425 + 0.6182i | 0.1425 + 0.6182i | 0.1425 + 0.6182i | 0.1425 + 0.6182i |
| 15.5 | 0.1429 + 0.6236i | 0.1429 + 0.6236i | 0.1429 + 0.6236i | 0.1429 + 0.6236i | 0.1429 + 0.6236i | 0.1429 + 0.6236i | 0.1429 + 0.6236i | 0.1429 + 0.6236i |
| 16 | 0.1233 + 0.6305i | 0.1233 + 0.6305i | 0.1233 + 0.6305i | 0.1233 + 0.6305i | 0.1305 + 0.7061i | 0.1305 + 0.7061i | 0.1305 + 0.7061i | 0.1305 + 0.7061i |
| 16.5 | 0.1119 + 0.5862i | 0.1119 + 0.5862i | 0.1119 + 0.5862i | 0.1119 + 0.5862i | 0.1120 + 0.6744i | 0.1120 + 0.6744i | 0.1120 + 0.6744i | 0.1120 + 0.6744i |
| 17 | 0.1116 + 0.5832i | 0.1116 + 0.5832i | 0.1116 + 0.5832i | 0.1116 + 0.5832i | 0.1116 + 0.6804i | 0.1116 + 0.6804i | 0.1116 + 0.6804i | 0.1116 + 0.6804i |
| 17.5 | 0.1111 + 0.5789i | 0.1111 + 0.5789i | 0.1111 + 0.5789i | 0.1111 + 0.5789i | 0.1112 + 0.6913i | 0.1112 + 0.6913i | 0.1112 + 0.6913i | 0.1112 + 0.6913i |
| 18 | 0.1106 + 0.5718i | 0.1106 + 0.5718i | 0.1106 + 0.5718i | 0.1106 + 0.5718i | 0.1104 + 0.7036i | 0.1104 + 0.7036i | 0.1104 + 0.7036i | 0.1104 + 0.7036i |
| 18.5 | 0.1102 + 0.6537i | 0.1102 + 0.6537i | 0.1102 + 0.6537i | 0.1102 + 0.6537i | 0.0920 + 0.8398i | 0.0920 + 0.8398i | 0.0920 + 0.8398i | 0.0920 + 0.8398i |
| 19 | 0.0846 + 0.6736i | 0.0846 + 0.6736i | 0.0846 + 0.6736i | 0.0846 + 0.6736i | 0.0812 + 0.8563i | 0.0812 + 0.8563i | 0.0812 + 0.8563i | 0.0812 + 0.8563i |
| 19.5 | 0.0756 + 0.6874i | 0.0756 + 0.6874i | 0.0756 + 0.6874i | 0.0756 + 0.6874i | 0.0737 + 0.8671i | 0.0737 + 0.8671i | 0.0737 + 0.8671i | 0.0737 + 0.8671i |
| 20 | 0.0686 + 0.4786i | 0.0686 + 0.4786i | 0.0686 + 0.4786i | 0.0686 + 0.4786i | 0.0680 + 0.6150i | 0.0680 + 0.6150i | 0.0680 + 0.6150i | 0.0680 + 0.6150i |
| 20.5 | 0.0633 + 0.6036i | 0.0633 + 0.6036i | 0.0633 + 0.6036i | 0.0633 + 0.6036i | 0.0637 + 0.7697i | 0.0637 + 0.7697i | 0.0637 + 0.7697i | 0.0637 + 0.7697i |
| 21 | 0.0612 + 0.5785i | 0.0612 + 0.5785i | 0.0612 + 0.5785i | 0.0612 + 0.5785i | 0.0626 + 0.7673i | 0.0622 + 0.7241i | 0.0626 + 0.7673i | 0.0622 + 0.7241i |
| 21.5 | 0.0580 + 0.5517i | 0.0580 + 0.5517i | 0.0580 + 0.5517i | 0.0580 + 0.5517i | 0.0579 + 0.7549i | 0.0575 + 0.6950i | 0.0579 + 0.7549i | 0.0575 + 0.6950i |
| 22 | 0.0594 + 0.5713i | 0.0594 + 0.5713i | 0.0594 + 0.5713i | 0.0594 + 0.5713i | 0.0617 + 0.7653i | 0.0609 + 0.7080i | 0.0617 + 0.7653i | 0.0609 + 0.7080i |
| 22.5 | 0.0586 + 0.5613i | 0.0586 + 0.5613i | 0.0586 + 0.5613i | 0.0586 + 0.5613i | 0.0597 + 0.7658i | 0.0589 + 0.6968i | 0.0597 + 0.7658i | 0.0589 + 0.6968i |
| 23 | 0.0582 + 0.5442i | 0.0582 + 0.5442i | 0.0582 + 0.5442i | 0.0582 + 0.5442i | 0.0523 + 0.7605i | 0.0530 + 0.6770i | 0.0523 + 0.7605i | 0.0530 + 0.6770i |
| 23.5 | 0.0579 + 0.5297i | 0.0582 + 0.5729i | 0.0579 + 0.5297i | 0.0582 + 0.5729i | 0.0573 + 0.7643i | 0.0571 + 0.6803i | 0.0573 + 0.7643i | 0.0571 + 0.6803i |
| 24 | 0.0551 + 0.5330i | 0.0552 + 0.6012i | 0.0551 + 0.5330i | 0.0552 + 0.6012i | 0.0562 + 0.8072i | 0.0555 + 0.7029i | 0.0562 + 0.8072i | 0.0555 + 0.7029i |
| 24.5 | 0.0588 + 0.5230i | 0.0585 + 0.5848i | 0.0588 + 0.5230i | 0.0585 + 0.5848i | 0.0540 + 0.7694i | 0.0578 + 0.6777i | 0.0540 + 0.7694i | 0.0578 + 0.6777i |
| 25 | 0.0574 + 0.5122i | 0.0570 + 0.5825i | 0.0574 + 0.5122i | 0.0570 + 0.5825i | 0.0528 + 0.7637i | 0.0570 + 0.6711i | 0.0528 + 0.7637i | 0.0570 + 0.6711i |
| 25.5 | 0.0554 + 0.5660i | 0.0546 + 0.6473i | 0.0554 + 0.5660i | 0.0546 + 0.6473i | 0.0422 + 0.8329i | 0.0578 + 0.7393i | 0.0806 + 0.8359i | 0.0578 + 0.7393i |
| 26 | 0.0362 + 0.5516i | 0.0352 + 0.6211i | 0.0930 + 0.5503i | 0.0944 + 0.6214i | 0.0501 + 0.7778i | 0.0354 + 0.7025i | 0.0941 + 0.7686i | 0.0950 + 0.6968i |
| 26.5 | 0.0319 + 0.5344i | 0.0328 + 0.6243i | 0.0702 + 0.5348i | 0.0709 + 0.6199i | 0.0401 + 0.8246i | 0.0334 + 0.7183i | 0.0928 + 0.7983i | 0.0787 + 0.7149i |
| 27 | 0.0308 + 0.5613i | 0.0315 + 0.6418i | 0.0874 + 0.5600i | 0.0899 + 0.6395i | 0.0368 + 0.8194i | 0.0314 + 0.7259i | 0.0953 + 0.8062i | 0.0929 + 0.7245i |
| 27.5 | 0.0313 + 0.5647i | 0.0315 + 0.6436i | 0.0920 + 0.5643i | 0.0922 + 0.6441i | 0.0347 + 0.8220i | 0.0302 + 0.7280i | 0.0933 + 0.8100i | 0.0920 + 0.7282i |
| 28 | 0.0301 + 0.5655i | 0.0298 + 0.6462i | 0.0886 + 0.5661i | 0.0881 + 0.6466i | 0.0319 + 0.8305i | 0.0282 + 0.7314i | 0.0870 + 0.8145i | 0.0878 + 0.73231 |

| SNR/w | w152 | w153 | w154 | w155 | w156 | w157 | w158 | w159 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i |
| 8.5 | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i |
| 9 | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i |
| 10 | 0.2442 + 1.0177i | 0.2442 + 1.0177i | 0.2442 + 1.0177i | 0.2442 + 1.0177i | 0.2442 + 1.0177i | 0.2442 + 1.0177i | 0.2442 + 1.0177i | 0.2442 + 1.0177i |
| 10.5 | 0.2325 + 1.0121i | 0.2325 + 1.0121i | 0.2325 + 1.0121i | 0.2325 + 1.0121i | 0.2325 + 1.0121i | 0.2325 + 1.0121i | 0.2325 + 1.0121i | 0.2325 + 1.0121i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |

-continued

| | | | | | | | | |
|---|---|---|---|---|---|---|---|---|
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i |
| 13 | 0.1625 + 0.8963i | 0.1625 + 0.8963i | 0.1625 + 0.8963i | 0.1625 + 0.8963i | 0.1561 + 0.9541i | 0.1561 + 0.9541i | 0.1561 + 0.9541i | 0.1561 + 0.9541i |
| 13.5 | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i |
| 14 | 0.1680 + 0.4234i | 0.1397 + 0.4459i | 0.1397 + 0.4459i | 0.1397 + 0.4459i | 0.1680 + 0.4234i | 0.1397 + 0.4459i | 0.1397 + 0.4459i | 0.1397 + 0.4459i |
| 14.5 | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i |
| 15 | 0.1425 + 0.6182i | 0.1425 + 0.6182i | 0.1425 + 0.6182i | 0.1425 + 0.6182i | 0.1425 + 0.6182i | 0.1425 + 0.6182i | 0.1425 + 0.6182i | 0.1425 + 0.6182i |
| 15.5 | 0.1429 + 0.6236i | 0.1429 + 0.6236i | 0.1429 + 0.6236i | 0.1429 + 0.6236i | 0.1429 + 0.6236i | 0.1429 + 0.6236i | 0.1429 + 0.6236i | 0.1429 + 0.6236i |
| 16 | 0.1233 + 0.6305i | 0.1233 + 0.6305i | 0.1233 + 0.6305i | 0.1233 + 0.6305i | 0.1305 + 0.7061i | 0.1305 + 0.7061i | 0.1305 + 0.7061i | 0.1305 + 0.7061i |
| 16.5 | 0.1119 + 0.5862i | 0.1119 + 0.5862i | 0.1119 + 0.5862i | 0.1119 + 0.5862i | 0.1120 + 0.6744i | 0.1120 + 0.6744i | 0.1120 + 0.6744i | 0.1120 + 0.6744i |
| 17 | 0.1116 + 0.5832i | 0.1116 + 0.5832i | 0.1116 + 0.5832i | 0.1116 + 0.5832i | 0.1116 + 0.6804i | 0.1116 + 0.6804i | 0.1116 + 0.6804i | 0.1116 + 0.6804i |
| 17.5 | 0.1111 + 0.5789i | 0.1111 + 0.5789i | 0.1111 + 0.5789i | 0.1111 + 0.5789i | 0.1112 + 0.6913i | 0.1112 + 0.6913i | 0.1112 + 0.6913i | 0.1112 + 0.6913i |
| 18 | 0.1106 + 0.5718i | 0.1106 + 0.5718i | 0.1106 + 0.5718i | 0.1106 + 0.5718i | 0.1104 + 0.7036i | 0.1104 + 0.7036i | 0.1104 + 0.7036i | 0.1104 + 0.7036i |
| 18.5 | 0.1102 + 0.6537i | 0.1102 + 0.6537i | 0.1102 + 0.6537i | 0.1102 + 0.6537i | 0.1506 + 0.8340i | 0.1506 + 0.8340i | 0.1506 + 0.8340i | 0.1506 + 0.8340i |
| 19 | 0.1415 + 0.6692i | 0.1415 + 0.6692i | 0.1415 + 0.6692i | 0.1415 + 0.6692i | 0.1746 + 0.8465i | 0.1746 + 0.8465i | 0.1746 + 0.8465i | 0.1746 + 0.8465i |
| 19.5 | 0.1571 + 0.6805i | 0.1571 + 0.6805i | 0.1571 + 0.6805i | 0.1571 + 0.6805i | 0.1891 + 0.8559i | 0.1891 + 0.8559i | 0.1891 + 0.8559i | 0.1891 + 0.8559i |
| 20 | 0.1756 + 0.4881i | 0.1756 + 0.4881i | 0.1756 + 0.4881i | 0.1756 + 0.4881i | 0.1535 + 0.6247i | 0.1535 + 0.6247i | 0.1535 + 0.6247i | 0.1535 + 0.6247i |
| 20.5 | 0.1741 + 0.6024i | 0.1741 + 0.6024i | 0.1741 + 0.6024i | 0.1741 + 0.6024i | 0.1805 + 0.7664i | 0.1805 + 0.7664i | 0.1805 + 0.7664i | 0.1805 + 0.7664i |
| 21 | 0.1729 + 0.5763i | 0.1729 + 0.5763i | 0.1729 + 0.5763i | 0.1729 + 0.5763i | 0.1790 + 0.7657i | 0.1773 + 0.7216i | 0.1790 + 0.7657i | 0.1773 + 0.7216i |
| 21.5 | 0.1679 + 0.5531i | 0.1679 + 0.5531i | 0.1679 + 0.5531i | 0.1679 + 0.5531i | 0.1651 + 0.7527i | 0.1644 + 0.6950i | 0.1651 + 0.7527i | 0.1644 + 0.6950i |
| 22 | 0.1768 + 0.5685i | 0.1768 + 0.5685i | 0.1768 + 0.5685i | 0.1768 + 0.5685i | 0.1819 + 0.7649i | 0.1802 + 0.7051i | 0.1819 + 0.7649i | 0.1802 + 0.7051i |
| 22.5 | 0.1728 + 0.5580i | 0.1728 + 0.5580i | 0.1728 + 0.5580i | 0.1728 + 0.5580i | 0.1742 + 0.7575i | 0.1714 + 0.6942i | 0.1742 + 0.7575i | 0.1714 + 0.6942i |
| 23 | 0.1711 + 0.5337i | 0.1696 + 0.5727i | 0.1711 + 0.5337i | 0.1696 + 0.5727i | 0.1663 + 0.7694i | 0.1695 + 0.6852i | 0.1663 + 0.7694i | 0.1695 + 0.6852i |
| 23.5 | 0.1756 + 0.5324i | 0.1748 + 0.5753i | 0.1756 + 0.5324i | 0.1748 + 0.5753i | 0.1727 + 0.7650i | 0.1738 + 0.6824i | 0.1727 + 0.7650i | 0.1738 + 0.6824i |
| 24 | 0.1665 + 0.5324i | 0.1666 + 0.5983i | 0.1665 + 0.5324i | 0.1666 + 0.5983i | 0.1690 + 0.8040i | 0.1674 + 0.7005i | 0.1690 + 0.8040i | 0.1674 + 0.7005i |
| 24.5 | 0.1768 + 0.5229i | 0.1754 + 0.5881i | 0.1768 + 0.5229i | 0.1754 + 0.5881i | 0.1654 + 0.7787i | 0.1713 + 0.6822i | 0.1654 + 0.7787i | 0.1713 + 0.6822i |
| 25 | 0.1734 + 0.5128i | 0.1721 + 0.5855i | 0.1734 + 0.5128i | 0.1721 + 0.5855i | 0.1626 + 0.7732i | 0.1681 + 0.6756i | 0.1626 + 0.7732i | 0.1681 + 0.6756i |
| 25.5 | 0.1691 + 0.5646i | 0.1899 + 0.6415i | 0.1691 + 0.5646i | 0.1527 + 0.6436i | 0.2004 + 0.8274i | 0.1939 + 0.7293i | 0.1615 + 0.8311i | 0.1553 + 0.7315i |
| 26 | 0.2234 + 0.5457i | 0.2245 + 0.6191i | 0.1645 + 0.5475i | 0.1657 + 0.6192i | 0.1748 + 0.8005i | 0.2191 + 0.7001i | 0.1748 + 0.8005i | 0.1706 + 0.6989i |
| 26.5 | 0.1889 + 0.5296i | 0.1889 + 0.6067i | 0.1371 + 0.5320i | 0.1410 + 0.6135i | 0.2034 + 0.7668i | 0.1936 + 0.6930i | 0.1697 + 0.8030i | 0.1474 + 0.6948i |
| 27 | 0.2121 + 0.5552i | 0.2127 + 0.6337i | 0.1515 + 0.5573i | 0.1534 + 0.6358i | 0.2191 + 0.8143i | 0.2146 + 0.7189i | 0.1560 + 0.8180i | 0.1570 + 0.7210i |
| 27.5 | 0.2181 + 0.5647i | 0.2174 + 0.6442i | 0.1553 + 0.5644i | 0.1553 + 0.6440i | 0.2141 + 0.8228i | 0.2166 + 0.7312i | 0.1515 + 0.8243i | 0.1561 + 0.7276i |
| 28 | 0.2101 + 0.5674i | 0.2108 + 0.6469i | 0.1492 + 0.5671i | 0.1491 + 0.6469i | 0.2083 + 0.8201i | 0.2103 + 0.7318i | 0.1448 + 0.8276i | 0.1494 + 0.73021 |

| SNR/w | w160 | w161 | w162 | w163 | w164 | w165 | w166 | w167 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2279 + 0.4119i | 0.2279 + 0.4119i | 0.2279 + 0.4119i | 0.2279 + 0.4119i | 0.2540 + 0.4692i | 0.2279 + 0.4119i | 0.2540 + 0.4692i | 0.2279 + 0.4119i |
| 8.5 | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i |
| 9 | 1.1715 + 1.7495i | 0.8225 + 1.2549i | 0.8225 + 1.2549i | 0.8225 + 1.2549i | 0.8225 + 1.2549i | 0.8225 + 1.2549i | 0.8225 + 1.2549i | 0.7580 + 1.1712i |

-continued

| | | | | | | | | |
|---|---|---|---|---|---|---|---|---|
| 9.5 | 1.1695 + 1.7496i | 0.8325 + 1.2570i | 0.8325 + 1.2570i | 0.8325 + 1.2570i | 0.8325 + 1.2570i | 0.8325 + 1.2570i | 0.8325 + 1.2570i | 0.7800 + 1.1846i |
| 10 | 1.1664 + 1.7479i | 0.8251 + 1.2380i | 0.8251 + 1.2380i | 0.8251 + 1.2380i | 0.8251 + 1.2380i | 0.8251 + 1.2380i | 0.8251 + 1.2380i | 0.8251 + 1.2380i |
| 10.5 | 1.1809 + 1.7123i | 0.8398 + 1.2493i | 0.8398 + 1.2493i | 0.8398 + 1.2493i | 0.8398 + 1.2493i | 0.8398 + 1.2493i | 0.8398 + 1.2493i | 0.7964 + 1.1875i |
| 11 | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i |
| 13 | 0.7692 + 1.3337i | 0.6950 + 1.2744i | 0.6950 + 1.2744i | 0.6950 + 1.2744i | 0.6337 + 1.1456i | 0.6337 + 1.1456i | 0.6337 + 1.1456i | 0.6337 + 1.1456i |
| 13.5 | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i |
| 14 | 0.1761 + 0.7756i | 0.1761 + 0.7756i | 0.1761 + 0.7756i | 0.1761 + 0.7756i | 0.1761 + 0.7756i | 0.1761 + 0.7756i | 0.1761 + 0.7756i | 0.1761 + 0.7756i |
| 14.5 | 0.1746 + 0.7901i | 0.1746 + 0.7901i | 0.1746 + 0.7901i | 0.1746 + 0.7901i | 0.1746 + 0.7901i | 0.1746 + 0.7901i | 0.1746 + 0.7901i | 0.1746 + 0.7901i |
| 15 | 0.1548 + 1.2438i | 0.2569 + 1.1882i | 0.1548 + 1.2438i | 0.2569 + 1.1882i | 0.3993 + 0.9722i | 0.3993 + 0.9722i | 0.3993 + 0.9722i | 0.3993 + 0.9722i |
| 15.5 | 0.1242 + 1.2740i | 0.1858 + 1.2756i | 0.1242 + 1.2740i | 0.1858 + 1.2756i | 0.4115 + 0.9594i | 0.4115 + 0.9594i | 0.4115 + 0.9594i | 0.4115 + 0.9594i |
| 16 | 0.1921 + 1.5489i | 0.3782 + 1.2966i | 0.2042 + 1.4748i | 0.3782 + 1.2966i | 0.4227 + 0.9434i | 0.4256 + 0.9922i | 0.4227 + 0.9434i | 0.4256 + 0.9922i |
| 16.5 | 0.2958 + 1.5189i | 0.3519 + 1.2468i | 0.3869 + 1.6973i | 0.3519 + 1.2468i | 0.3412 + 0.9152i | 0.3422 + 0.9787i | 0.3412 + 0.9152i | 0.3422 + 0.9787i |
| 17 | 0.2880 + 1.5187i | 0.3502 + 1.2424i | 0.3847 + 1.7131i | 0.3502 + 1.2424i | 0.3424 + 0.9115i | 0.3425 + 0.9769i | 0.3424 + 0.9115i | 0.3425 + 0.9769i |
| 17.5 | 0.2810 + 1.5145i | 0.3496 + 1.2371i | 0.3774 + 1.7181i | 0.3496 + 1.2371i | 0.3445 + 0.9088i | 0.3436 + 0.9769i | 0.3445 + 0.9088i | 0.3436 + 0.9769i |
| 18 | 0.2793 + 1.5139i | 0.3532 + 1.2221i | 0.3797 + 1.7225i | 0.3532 + 1.2221i | 0.3645 + 0.9102i | 0.3621 + 0.9814i | 0.3645 + 0.9102i | 0.3621 + 0.9814i |
| 18.5 | 0.6224 + 1.5379i | 0.5759 + 1.3142i | 0.6038 + 1.8517i | 0.5605 + 1.2517i | 0.4811 + 0.9781i | 0.5045 + 1.0512i | 0.4811 + 0.9781i | 0.5045 + 1.0512i |
| 19 | 0.6136 + 1.5287i | 0.5785 + 1.3124i | 0.6082 + 1.8229i | 0.5656 + 1.2442i | 0.5036 + 0.9733i | 0.5241 + 1.0508i | 0.5036 + 0.9733i | 0.5241 + 1.0508i |
| 19.5 | 0.5093 + 1.8272i | 0.5718 + 1.2403i | 0.5904 + 1.5365i | 0.5797 + 1.3019i | 0.5185 + 0.9693i | 0.5365 + 1.0505i | 0.5185 + 0.9693i | 0.5365 + 1.0505i |
| 20 | 0.3901 + 1.8592i | 0.2655 + 1.0853i | 0.2151 + 1.3209i | 0.2464 + 1.1466i | 0.3484 + 0.8442i | 0.3291 + 0.9137i | 0.3484 + 0.8442i | 0.3291 + 0.9137i |
| 20.5 | 0.3779 + 1.6732i | 0.4551 + 1.2071i | 0.4323 + 1.4599i | 0.4551 + 1.2071i | 0.4614 + 0.9212i | 0.4616 + 1.0134i | 0.4614 + 0.9212i | 0.4616 + 1.0134i |
| 21 | 0.4425 + 1.4246i | 0.4497 + 1.2508i | 0.4339 + 1.6179i | 0.4486 + 1.1809i | 0.4403 + 0.9042i | 0.4457 + 1.0301i | 0.4403 + 0.9042i | 0.4457 + 1.0301i |
| 21.5 | 0.4335 + 1.8289i | 0.4421 + 1.1662i | 0.4338 + 1.4210i | 0.4422 + 1.2638i | 0.4033 + 0.8880i | 0.4226 + 1.0373i | 0.4033 + 0.8880i | 0.4137 + 1.0009i |
| 22 | 0.4811 + 1.5692i | 0.4329 + 1.2286i | 0.4113 + 1.4351i | 0.4329 + 1.2286i | 0.4303 + 0.8997i | 0.4340 + 1.0474i | 0.4303 + 0.8997i | 0.4340 + 1.0474i |
| 22.5 | 0.4404 + 1.7644i | 0.4091 + 1.1667i | 0.4579 + 1.4331i | 0.4310 + 1.2944i | 0.4161 + 0.8850i | 0.4141 + 1.0322i | 0.4161 + 0.8850i | 0.4086 + 0.9927i |
| 23 | 0.4242 + 1.7554i | 0.4248 + 1.1691i | 0.4472 + 1.4475i | 0.4330 + 1.2938i | 0.4129 + 0.9003i | 0.4122 + 1.0484i | 0.4129 + 0.9003i | 0.3988 + 1.0072i |
| 23.5 | 0.3933 + 1.5893i | 0.4100 + 1.1638i | 0.4356 + 1.4074i | 0.4278 + 1.2731i | 0.4179 + 0.8922i | 0.4150 + 1.0457i | 0.4179 + 0.8922i | 0.3988 + 1.0007i |
| 24 | 0.4643 + 1.6633i | 0.4653 + 1.1815i | 0.4746 + 1.4795i | 0.4874 + 1.3073i | 0.4187 + 0.9025i | 0.4439 + 1.0768i | 0.4187 + 0.9025i | 0.4296 + 1.0142i |
| 24.5 | 0.4614 + 1.3869i | 0.4192 + 1.2422i | 0.4295 + 1.5513i | 0.3583 + 1.1597i | 0.4108 + 0.9173i | 0.4097 + 1.0235i | 0.3699 + 0.9056i | 0.3567 + 1.0552i |
| 25 | 0.5062 + 1.5466i | 0.3909 + 1.1806i | 0.4561 + 1.3999i | 0.4328 + 1.2778i | 0.3985 + 0.9191i | 0.3847 + 1.0408i | 0.3554 + 0.9098i | 0.3375 + 1.0392i |
| 25.5 | 0.4109 + 1.6213i | 0.4201 + 1.1814i | 0.4176 + 1.4698i | 0.4725 + 1.1133i | 0.4845 + 0.8904i | 0.4948 + 0.9831i | 0.4139 + 0.8984i | 0.4391 + 1.0220i |
| 26 | 0.5441 + 1.3586i | 0.4659 + 1.1498i | 0.4319 + 1.4062i | 0.4167 + 1.2626i | 0.4195 + 0.9309i | 0.4592 + 1.0189i | 0.3573 + 0.9441i | 0.3828 + 1.0426i |
| 26.5 | 0.5122 + 1.4464i | 0.4081 + 1.1447i | 0.4495 + 1.3429i | 0.4100 + 1.2413i | 0.3605 + 0.9756i | 0.3812 + 1.0530i | 0.3762 + 0.9043i | 0.4593 + 0.9010i |
| 27 | 0.5155 + 1.4738i | 0.4056 + 1.2349i | 0.4154 + 1.4035i | 0.4713 + 1.3098i | 0.4513 + 0.9439i | 0.4491 + 1.0353i | 0.4185 + 0.8835i | 0.5363 + 1.0313i |
| 27.5 | 0.4528 + 1.4608i | 0.3983 + 1.2179i | 0.3506 + 1.3699i | 0.4330 + 1.3116i | 0.4947 + 0.9196i | 0.4801 + 1.0177i | 0.4268 + 0.9033i | 0.5624 + 1.0275i |
| 28 | 0.5059 + 1.4670i | 0.5266 + 1.2312i | 0.4108 + 1.2036i | 0.4382 + 1.3162i | 0.4826 + 1.1077i | 0.5122 + 1.0210i | 0.4263 + 0.9068i | 0.4319 + 0.99521 |

-continued

| SNR/w | w168 | w169 | w170 | w171 | w172 | w173 | w174 | w175 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i |
| 8.5 | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i |
| 9 | 0.8225 + 1.2549i | 0.8225 + 1.2549i | 0.8225 + 1.2549i | 0.7580 + 1.1712i | 0.8225 + 1.2549i | 0.7580 + 1.1712i | 0.7580 + 1.1712i | 0.7580 + 1.1712i |
| 9.5 | 0.8325 + 1.2570i | 0.8325 + 1.2570i | 0.8325 + 1.2570i | 0.7800 + 1.1846i | 0.8325 + 1.2570i | 0.7800 + 1.1846i | 0.7800 + 1.1846i | 0.7800 + 1.1846i |
| 10 | 0.8251 + 1.2380i | 0.8251 + 1.2380i | 0.8251 + 1.2380i | 0.8251 + 1.2380i | 0.8251 + 1.2380i | 0.8251 + 1.2380i | 0.8251 + 1.2380i | 0.7816 + 1.1728i |
| 10.5 | 0.8398 + 1.2493i | 0.8398 + 1.2493i | 0.8398 + 1.2493i | 0.7964 + 1.1875i | 0.8398 + 1.2493i | 0.7964 + 1.1875i | 0.7964 + 1.1875i | 0.7964 + 1.1875i |
| 11 | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i |
| 13 | 0.6337 + 1.1456i | 0.6337 + 1.1456i | 0.6337 + 1.1456i | 0.5973 + 1.1415i | 0.6337 + 1.1456i | 0.5973 + 1.1415i | 0.6337 + 1.1456i | 0.5973 + 1.1415i |
| 13.5 | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i |
| 14 | 0.1761 + 0.7756i | 0.1761 + 0.7756i | 0.1761 + 0.7756i | 0.1761 + 0.7756i | 0.1761 + 0.7756i | 0.1761 + 0.7756i | 0.1761 + 0.7756i | 0.1761 + 0.7756i |
| 14.5 | 0.1746 + 0.7901i | 0.1746 + 0.7901i | 0.1746 + 0.7901i | 0.1746 + 0.7901i | 0.1746 + 0.7901i | 0.1746 + 0.7901i | 0.1746 + 0.7901i | 0.1746 + 0.7901i |
| 15 | 0.1548 + 1.2438i | 0.2569 + 1.1882i | 0.1548 + 1.2438i | 0.2569 + 1.1882i | 0.3993 + 0.9722i | 0.3993 + 0.9722i | 0.3993 + 0.9722i | 0.3993 + 0.9722i |
| 15.5 | 0.1936 + 1.1915i | 0.2544 + 1.2145i | 0.1936 + 1.1915i | 0.2544 + 1.2145i | 0.3981 + 1.0139i | 0.3981 + 1.0139i | 0.3981 + 1.0139i | 0.3981 + 1.0139i |
| 16 | 0.1202 + 1.5524i | 0.3782 + 1.2966i | 0.1458 + 1.4668i | 0.3782 + 1.2966i | 0.4227 + 0.9434i | 0.4256 + 0.9922i | 0.4227 + 0.9434i | 0.4256 + 0.9922i |
| 16.5 | 0.3396 + 1.4835i | 0.3519 + 1.2468i | 0.4480 + 1.5575i | 0.3519 + 1.2468i | 0.3412 + 0.9152i | 0.3422 + 0.9787i | 0.3412 + 0.9152i | 0.3422 + 0.9787i |
| 17 | 0.3338 + 1.4825i | 0.3502 + 1.2424i | 0.4573 + 1.5560i | 0.3502 + 1.2424i | 0.3424 + 0.9115i | 0.3425 + 0.9769i | 0.3424 + 0.9115i | 0.3425 + 0.9769i |
| 17.5 | 0.3287 + 1.4767i | 0.3496 + 1.2371i | 0.4622 + 1.5494i | 0.3496 + 1.2371i | 0.3445 + 0.9088i | 0.3436 + 0.9769i | 0.3445 + 0.9088i | 0.3436 + 0.9769i |
| 18 | 0.3273 + 1.4723i | 0.3301 + 1.2672i | 0.4716 + 1.5416i | 0.3532 + 1.2221i | 0.3213 + 0.9082i | 0.3211 + 0.9756i | 0.3213 + 0.9082i | 0.3211 + 0.9756i |
| 18.5 | 0.4160 + 1.5551i | 0.4079 + 1.3496i | 0.3930 + 1.7342i | 0.4025 + 1.2867i | 0.3601 + 1.0064i | 0.3730 + 1.0825i | 0.3601 + 1.0064i | 0.3730 + 1.0825i |
| 19 | 0.4096 + 1.5434i | 0.4091 + 1.3422i | 0.3868 + 1.7355i | 0.4051 + 1.2765i | 0.3667 + 1.0053i | 0.3795 + 1.0813i | 0.3667 + 1.0053i | 0.3795 + 1.0813i |
| 19.5 | 0.1896 + 1.9476i | 0.4173 + 1.2630i | 0.4293 + 1.5290i | 0.4215 + 1.3193i | 0.3717 + 1.0035i | 0.3867 + 1.0802i | 0.3717 + 1.0035i | 0.3867 + 1.0802i |
| 20 | 0.2891 + 1.6189i | 0.2183 + 1.0742i | 0.2287 + 1.4492i | 0.2183 + 1.0742i | 0.2615 + 0.8212i | 0.2485 + 0.8979i | 0.2615 + 0.8212i | 0.2485 + 0.8979i |
| 20.5 | 0.1559 + 1.8551i | 0.3284 + 1.2041i | 0.3245 + 1.4116i | 0.3284 + 1.2041i | 0.3234 + 0.9257i | 0.3264 + 1.0118i | 0.3234 + 0.9257i | 0.3264 + 1.0118i |
| 21 | 0.2900 + 1.4178i | 0.3085 + 1.2507i | 0.2645 + 1.6046i | 0.3133 + 1.1795i | 0.3142 + 0.9074i | 0.3156 + 1.0246i | 0.3142 + 0.9074i | 0.3156 + 1.0246i |
| 21.5 | 0.3087 + 1.6359i | 0.3076 + 1.1747i | 0.3096 + 1.4426i | 0.3112 + 1.2557i | 0.2873 + 0.8921i | 0.2954 + 1.0282i | 0.2873 + 0.8921i | 0.2954 + 1.0282i |
| 22 | 0.2306 + 1.3849i | 0.2809 + 1.2390i | 0.2905 + 1.4691i | 0.2945 + 1.1903i | 0.3077 + 0.9000i | 0.3077 + 1.0367i | 0.3077 + 0.9000i | 0.3077 + 1.0367i |
| 22.5 | 0.3278 + 1.6041i | 0.2970 + 1.1686i | 0.3037 + 1.4425i | 0.2970 + 1.2912i | 0.2944 + 0.8820i | 0.2944 + 1.0396i | 0.2944 + 0.8820i | 0.2951 + 0.9957i |
| 23 | 0.2943 + 1.6238i | 0.2952 + 1.1812i | 0.3204 + 1.4563i | 0.3158 + 1.2876i | 0.2803 + 0.8960i | 0.2822 + 1.0584i | 0.2803 + 0.8960i | 0.2794 + 1.0101i |
| 23.5 | 0.2662 + 1.5264i | 0.2867 + 1.1635i | 0.2847 + 1.3880i | 0.2871 + 1.2790i | 0.2884 + 0.8828i | 0.2818 + 1.0582i | 0.2884 + 0.8828i | 0.2853 + 0.9967i |
| 24 | 0.3157 + 1.8053i | 0.3327 + 1.2080i | 0.3481 + 1.4263i | 0.3796 + 1.3103i | 0.2926 + 0.9175i | 0.3123 + 1.1027i | 0.2926 + 0.9175i | 0.3029 + 1.0334i |
| 24.5 | 0.3338 + 1.3906i | 0.2893 + 1.2934i | 0.2719 + 1.4925i | 0.2628 + 1.1826i | 0.2654 + 0.9066i | 0.2364 + 1.0101i | 0.2654 + 0.9066i | 0.2549 + 1.0649i |
| 25 | 0.2741 + 1.3971i | 0.2823 + 1.2733i | 0.3404 + 1.4960i | 0.2496 + 1.1769i | 0.2551 + 0.9023i | 0.2246 + 1.0063i | 0.2551 + 0.9023i | 0.2459 + 1.0740i |
| 25.5 | 0.3610 + 1.3165i | 0.3191 + 1.2022i | 0.2929 + 1.4100i | 0.2095 + 1.3211i | 0.2809 + 0.9302i | 0.3045 + 1.0609i | 0.3388 + 0.9217i | 0.3581 + 1.0225i |

-continued

| | | | | | | | | |
|---|---|---|---|---|---|---|---|---|
| 26 | 0.2562 + 1.3168i | 0.2416 + 1.2052i | 0.3169 + 1.4056i | 0.3353 + 1.1847i | 0.2646 + 0.9367i | 0.2466 + 1.0790i | 0.2646 + 0.9367i | 0.3161 + 1.0751i |
| 26.5 | 0.3891 + 1.5208i | 0.2212 + 1.3291i | 0.3380 + 1.3952i | 0.2946 + 1.2451i | 0.2695 + 0.9684i | 0.2704 + 1.0530i | 0.2713 + 0.8960i | 0.2536 + 1.1406i |
| 27 | 0.2908 + 1.3146i | 0.2866 + 1.2128i | 0.3054 + 1.4311i | 0.3265 + 1.1340i | 0.2959 + 0.9159i | 0.3072 + 1.0000i | 0.3513 + 0.8854i | 0.3357 + 1.0591i |
| 27.5 | 0.2183 + 1.3371i | 0.2840 + 1.2244i | 0.2932 + 1.4680i | 0.3445 + 1.1098i | 0.2843 + 0.9156i | 0.2866 + 1.0054i | 0.3594 + 0.9169i | 0.3648 + 1.0180i |
| 28 | 0.2888 + 1.3750i | 0.2811 + 1.1589i | 0.3632 + 1.4529i | 0.3464 + 1.0908i | 0.2807 + 0.8996i | 0.2837 + 1.2544i | 0.3472 + 0.9117i | 0.3452 + 1.00211 |

| SNR/w | w176 | w177 | w178 | w179 | w180 | w181 | w182 | w183 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i |
| 8.5 | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i |
| 9 | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i |
| 10 | 0.5468 + 0.8978i | 0.5468 + 0.8978i | 0.5468 + 0.8978i | 0.5468 + 0.8978i | 0.5468 + 0.8978i | 0.5468 + 0.8978i | 0.5468 + 0.8978i | 0.5468 + 0.8978i |
| 10.5 | 0.5425 + 0.8879i | 0.5425 + 0.8879i | 0.5425 + 0.8879i | 0.5425 + 0.8879i | 0.5425 + 0.8879i | 0.5425 + 0.8879i | 0.5425 + 0.8879i | 0.5425 + 0.8879i |
| 11 | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i |
| 12 | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i |
| 13 | 0.4648 + 0.8318i | 0.4648 + 0.8318i | 0.4648 + 0.8318i | 0.4648 + 0.8318i | 0.4648 + 0.8318i | 0.4648 + 0.8318i | 0.4648 + 0.8318i | 0.4648 + 0.8318i |
| 13.5 | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i |
| 14 | 0.4093 + 0.6060i | 0.4093 + 0.6060i | 0.4093 + 0.6060i | 0.4093 + 0.6060i | 0.4093 + 0.6060i | 0.4093 + 0.6060i | 0.4093 + 0.6060i | 0.4093 + 0.6060i |
| 14.5 | 0.4149 + 0.6037i | 0.4149 + 0.6037i | 0.4149 + 0.6037i | 0.4149 + 0.6037i | 0.4149 + 0.6037i | 0.4149 + 0.6037i | 0.4149 + 0.6037i | 0.4149 + 0.6037i |
| 15 | 0.4058 + 0.6156i | 0.4058 + 0.6156i | 0.4058 + 0.6156i | 0.4058 + 0.6156i | 0.4058 + 0.6156i | 0.4058 + 0.6156i | 0.4058 + 0.6156i | 0.4058 + 0.6156i |
| 15.5 | 0.4071 + 0.5938i | 0.4071 + 0.5938i | 0.4071 + 0.5938i | 0.4071 + 0.5938i | 0.4110 + 0.6470i | 0.4110 + 0.6470i | 0.4110 + 0.6470i | 0.4110 + 0.6470i |
| 16 | 0.3778 + 0.6023i | 0.3778 + 0.6023i | 0.3778 + 0.6023i | 0.3778 + 0.6023i | 0.3868 + 0.6809i | 0.3868 + 0.6809i | 0.3868 + 0.6809i | 0.3868 + 0.6809i |
| 16.5 | 0.3459 + 0.5861i | 0.3459 + 0.5861i | 0.3459 + 0.5861i | 0.3459 + 0.5861i | 0.3454 + 0.6725i | 0.3454 + 0.6725i | 0.3454 + 0.6725i | 0.3454 + 0.6725i |
| 17 | 0.3461 + 0.5834i | 0.3461 + 0.5834i | 0.3461 + 0.5834i | 0.3461 + 0.5834i | 0.3459 + 0.6781i | 0.3459 + 0.6781i | 0.3459 + 0.6781i | 0.3459 + 0.6781i |
| 17.5 | 0.3651 + 0.5790i | 0.3651 + 0.5790i | 0.3651 + 0.5790i | 0.3651 + 0.5790i | 0.3580 + 0.6881i | 0.3580 + 0.6881i | 0.3580 + 0.6881i | 0.3580 + 0.6881i |
| 18 | 0.3699 + 0.5726i | 0.3699 + 0.5726i | 0.3699 + 0.5726i | 0.3699 + 0.5726i | 0.3696 + 0.6985i | 0.3696 + 0.6985i | 0.3696 + 0.6985i | 0.3696 + 0.6985i |
| 18.5 | 0.3738 + 0.6263i | 0.3738 + 0.6263i | 0.3738 + 0.6263i | 0.3738 + 0.6263i | 0.4179 + 0.7902i | 0.4179 + 0.7902i | 0.4179 + 0.7902i | 0.4179 + 0.7902i |
| 19 | 0.3971 + 0.6302i | 0.3971 + 0.6302i | 0.3971 + 0.6302i | 0.3971 + 0.6302i | 0.4486 + 0.7925i | 0.4486 + 0.7925i | 0.4486 + 0.7925i | 0.4486 + 0.7925i |
| 19.5 | 0.4169 + 0.6347i | 0.4169 + 0.6347i | 0.4169 + 0.6347i | 0.4169 + 0.6347i | 0.4691 + 0.7964i | 0.4691 + 0.7964i | 0.4691 + 0.7964i | 0.4691 + 0.7964i |
| 20 | 0.4344 + 0.5383i | 0.4344 + 0.5383i | 0.4344 + 0.5383i | 0.4344 + 0.5383i | 0.3963 + 0.6856i | 0.3963 + 0.6856i | 0.3963 + 0.6856i | 0.3963 + 0.6856i |
| 20.5 | 0.4336 + 0.5920i | 0.4336 + 0.5920i | 0.4336 + 0.5920i | 0.4336 + 0.5920i | 0.4488 + 0.7551i | 0.4488 + 0.7551i | 0.4488 + 0.7551i | 0.4488 + 0.7551i |
| 21 | 0.4211 + 0.5673i | 0.4211 + 0.5673i | 0.4211 + 0.5673i | 0.4211 + 0.5673i | 0.4296 + 0.7571i | 0.4265 + 0.7104i | 0.4296 + 0.7571i | 0.4265 + 0.7104i |
| 21.5 | 0.4148 + 0.5630i | 0.4148 + 0.5630i | 0.4148 + 0.5630i | 0.4148 + 0.5630i | 0.4039 + 0.7447i | 0.4048 + 0.6984i | 0.4039 + 0.7447i | 0.4048 + 0.6984i |
| 22 | 0.4243 + 0.5622i | 0.4243 + 0.5622i | 0.4243 + 0.5622i | 0.4243 + 0.5622i | 0.4277 + 0.7656i | 0.4269 + 0.7001i | 0.4277 + 0.7656i | 0.4269 + 0.7001i |
| 22.5 | 0.4201 + 0.5620i | 0.4201 + 0.5620i | 0.4201 + 0.5620i | 0.4201 + 0.5620i | 0.4166 + 0.7523i | 0.4191 + 0.6937i | 0.4166 + 0.7523i | 0.4191 + 0.6937i |
| 23 | 0.4201 + 0.5417i | 0.4186 + 0.5838i | 0.4201 + 0.5417i | 0.4186 + 0.5838i | 0.4105 + 0.7806i | 0.4110 + 0.6931i | 0.4105 + 0.7806i | 0.4110 + 0.6931i |

-continued

| | | | | | | | | |
|---|---|---|---|---|---|---|---|---|
| 23.5 | 0.4234 + 0.5374i | 0.4229 + 0.5818i | 0.4234 + 0.5374i | 0.4229 + 0.5818i | 0.4210 + 0.7721i | 0.4238 + 0.6880i | 0.4210 + 0.7721i | 0.4238 + 0.6880i |
| 24 | 0.4100 + 0.5305i | 0.4084 + 0.5910i | 0.4100 + 0.5305i | 0.4084 + 0.5910i | 0.4033 + 0.7824i | 0.4052 + 0.6898i | 0.4033 + 0.7824i | 0.4052 + 0.6898i |
| 24.5 | 0.4217 + 0.5263i | 0.4165 + 0.6027i | 0.4217 + 0.5263i | 0.4165 + 0.6027i | 0.4210 + 0.8001i | 0.4086 + 0.6991i | 0.3823 + 0.8003i | 0.4086 + 0.6991i |
| 25 | 0.4499 + 0.5230i | 0.4394 + 0.6025i | 0.3970 + 0.5187i | 0.3924 + 0.5977i | 0.4127 + 0.8016i | 0.4248 + 0.6985i | 0.3717 + 0.7989i | 0.3841 + 0.6928i |
| 25.5 | 0.4713 + 0.5531i | 0.4766 + 0.6300i | 0.4019 + 0.5558i | 0.4036 + 0.6329i | 0.4825 + 0.7991i | 0.4804 + 0.7133i | 0.4063 + 0.8041i | 0.4045 + 0.7167i |
| 26 | 0.4704 + 0.5396i | 0.4557 + 0.6111i | 0.4115 + 0.5347i | 0.4241 + 0.6454i | 0.4123 + 0.8520i | 0.4554 + 0.8028i | 0.3640 + 0.8375i | 0.4184 + 0.7393i |
| 26.5 | 0.4616 + 0.5519i | 0.4251 + 0.6479i | 0.3986 + 0.5420i | 0.3877 + 0.6124i | 0.3594 + 0.7678i | 0.3969 + 0.7243i | 0.3707 + 0.8267i | 0.4482 + 0.8030i |
| 27 | 0.4932 + 0.5555i | 0.4800 + 0.6280i | 0.4144 + 0.5520i | 0.4124 + 0.6261i | 0.4851 + 0.7848i | 0.4912 + 0.6997i | 0.4214 + 0.7951i | 0.4128 + 0.7066i |
| 27.5 | 0.4887 + 0.5809i | 0.4812 + 0.6491i | 0.4174 + 0.5692i | 0.4122 + 0.6478i | 0.4949 + 0.8030i | 0.4972 + 0.7169i | 0.4243 + 0.8140i | 0.4168 + 0.7278i |
| 28 | 0.4885 + 0.5615i | 0.4738 + 0.6399i | 0.4131 + 0.5615i | 0.4096 + 0.6374i | 0.4750 + 0.8030i | 0.4772 + 0.7164i | 0.4136 + 0.8164i | 0.4073 + 0.72161 |

| SNR/w | w184 | w185 | w186 | w187 | w188 | w189 | w190 | w191 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2943 + 0.5156i | 0.2943 + 0.5156i | 0.2495 + 0.4483i | 0.2495 + 0.4483i |
| 8 | 0.2715 + 0.5261i | 0.2715 + 0.5261i | 0.2715 + 0.5261i | 0.2715 + 0.5261i | 0.2715 + 0.5261i | 0.2715 + 0.5261i | 0.2715 + 0.5261i | 0.2715 + 0.5261i |
| 8.5 | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i |
| 9 | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i |
| 10 | 0.5468 + 0.8978i | 0.5468 + 0.8978i | 0.5468 + 0.8978i | 0.5468 + 0.8978i | 0.5468 + 0.8978i | 0.5468 + 0.8978i | 0.5468 + 0.8978i | 0.5468 + 0.8978i |
| 10.5 | 0.5425 + 0.8879i | 0.5425 + 0.8879i | 0.5425 + 0.8879i | 0.5425 + 0.8879i | 0.5425 + 0.8879i | 0.5425 + 0.8879i | 0.5425 + 0.8879i | 0.5425 + 0.8879i |
| 11 | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i |
| 12 | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i |
| 13 | 0.4648 + 0.8318i | 0.4648 + 0.8318i | 0.4648 + 0.8318i | 0.4648 + 0.8318i | 0.4648 + 0.8318i | 0.4648 + 0.8318i | 0.4648 + 0.8318i | 0.4648 + 0.8318i |
| 13.5 | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i |
| 14 | 0.4093 + 0.6060i | 0.4093 + 0.6060i | 0.4093 + 0.6060i | 0.4093 + 0.6060i | 0.4093 + 0.6060i | 0.4093 + 0.6060i | 0.4093 + 0.6060i | 0.4093 + 0.6060i |
| 14.5 | 0.4149 + 0.6037i | 0.4149 + 0.6037i | 0.4149 + 0.6037i | 0.4149 + 0.6037i | 0.4149 + 0.6037i | 0.4149 + 0.6037i | 0.4149 + 0.6037i | 0.4149 + 0.6037i |
| 15 | 0.4058 + 0.6156i | 0.4058 + 0.6156i | 0.4058 + 0.6156i | 0.4058 + 0.6156i | 0.4058 + 0.6156i | 0.4058 + 0.6156i | 0.4058 + 0.6156i | 0.4058 + 0.6156i |
| 15.5 | 0.4071 + 0.5938i | 0.4071 + 0.5938i | 0.4071 + 0.5938i | 0.4071 + 0.5938i | 0.4110 + 0.6470i | 0.4110 + 0.6470i | 0.4110 + 0.6470i | 0.4110 + 0.6470i |
| 16 | 0.3778 + 0.6023i | 0.3778 + 0.6023i | 0.3778 + 0.6023i | 0.3778 + 0.6023i | 0.3868 + 0.6809i | 0.3868 + 0.6809i | 0.3868 + 0.6809i | 0.3868 + 0.6809i |
| 16.5 | 0.3459 + 0.5861i | 0.3459 + 0.5861i | 0.3459 + 0.5861i | 0.3459 + 0.5861i | 0.3454 + 0.6725i | 0.3454 + 0.6725i | 0.3454 + 0.6725i | 0.3454 + 0.6725i |
| 17 | 0.3461 + 0.5834i | 0.3461 + 0.5834i | 0.3461 + 0.5834i | 0.3461 + 0.5834i | 0.3459 + 0.6781i | 0.3459 + 0.6781i | 0.3459 + 0.6781i | 0.3459 + 0.6781i |
| 17.5 | 0.3255 + 0.5796i | 0.3255 + 0.5796i | 0.3255 + 0.5796i | 0.3255 + 0.5796i | 0.3265 + 0.6846i | 0.3265 + 0.6846i | 0.3580 + 0.6881i | 0.3265 + 0.6846i |
| 18 | 0.3175 + 0.5728i | 0.3175 + 0.5728i | 0.3175 + 0.5728i | 0.3175 + 0.5728i | 0.3191 + 0.7014i | 0.3191 + 0.7014i | 0.3191 + 0.7014i | 0.3191 + 0.7014i |
| 18.5 | 0.3101 + 0.6373i | 0.3101 + 0.6373i | 0.3101 + 0.6373i | 0.3101 + 0.6373i | 0.3304 + 0.8123i | 0.3304 + 0.8123i | 0.3304 + 0.8123i | 0.3304 + 0.8123i |
| 19 | 0.3093 + 0.6504i | 0.3093 + 0.6504i | 0.3093 + 0.6504i | 0.3093 + 0.6504i | 0.3348 + 0.8218i | 0.3348 + 0.8218i | 0.3348 + 0.8218i | 0.3348 + 0.8218i |
| 19.5 | 0.3091 + 0.6604i | 0.3091 + 0.6604i | 0.3091 + 0.6604i | 0.3091 + 0.6604i | 0.3379 + 0.8293i | 0.3379 + 0.8293i | 0.3379 + 0.8293i | 0.3379 + 0.8293i |
| 20 | 0.3126 + 0.5103i | 0.3126 + 0.5103i | 0.3126 + 0.5103i | 0.3126 + 0.5103i | 0.2889 + 0.6526i | 0.2889 + 0.6526i | 0.2889 + 0.6526i | 0.2889 + 0.6526i |
| 20.5 | 0.3061 + 0.5984i | 0.3061 + 0.5984i | 0.3061 + 0.5984i | 0.3061 + 0.5984i | 0.3151 + 0.7614i | 0.3151 + 0.7614i | 0.3151 + 0.7614i | 0.3151 + 0.7614i |

-continued

| | | | | | | | | |
|---|---|---|---|---|---|---|---|---|
| 21 | 0.2981 + 0.5721i | 0.2981 + 0.5721i | 0.2981 + 0.5721i | 0.2981 + 0.5721i | 0.3058 + 0.7624i | 0.3034 + 0.7165i | 0.3058 + 0.7624i | 0.3034 + 0.7165i |
| 21.5 | 0.2894 + 0.5564i | 0.2894 + 0.5564i | 0.2894 + 0.5564i | 0.2894 + 0.5564i | 0.2841 + 0.7489i | 0.2837 + 0.6957i | 0.2841 + 0.7489i | 0.2837 + 0.6957i |
| 22 | 0.2989 + 0.5650i | 0.2989 + 0.5650i | 0.2989 + 0.5650i | 0.2989 + 0.5650i | 0.3037 + 0.7640i | 0.3024 + 0.7019i | 0.3037 + 0.7640i | 0.3024 + 0.7019i |
| 22.5 | 0.2925 + 0.5584i | 0.2925 + 0.5584i | 0.2925 + 0.5584i | 0.2925 + 0.5584i | 0.2931 + 0.7505i | 0.2913 + 0.6920i | 0.2931 + 0.7505i | 0.2913 + 0.6920i |
| 23 | 0.2895 + 0.5356i | 0.2897 + 0.5764i | 0.2895 + 0.5356i | 0.2897 + 0.5764i | 0.2851 + 0.7771i | 0.2883 + 0.6891i | 0.2851 + 0.7771i | 0.2883 + 0.6891i |
| 23.5 | 0.2961 + 0.5344i | 0.2953 + 0.5790i | 0.2961 + 0.5344i | 0.2953 + 0.5790i | 0.2950 + 0.7690i | 0.2948 + 0.6849i | 0.2950 + 0.7690i | 0.2948 + 0.6849i |
| 24 | 0.2837 + 0.5315i | 0.2827 + 0.5939i | 0.2837 + 0.5315i | 0.2827 + 0.5939i | 0.2855 + 0.7974i | 0.2808 + 0.6950i | 0.2855 + 0.7974i | 0.2808 + 0.6950i |
| 24.5 | 0.2963 + 0.5236i | 0.2930 + 0.5942i | 0.2963 + 0.5236i | 0.2930 + 0.5942i | 0.2771 + 0.7889i | 0.2869 + 0.6899i | 0.2771 + 0.7889i | 0.2869 + 0.6899i |
| 25 | 0.2929 + 0.5147i | 0.2893 + 0.5911i | 0.2929 + 0.5147i | 0.2893 + 0.5911i | 0.2718 + 0.7842i | 0.2834 + 0.6839i | 0.2718 + 0.7842i | 0.2834 + 0.6839i |
| 25.5 | 0.2691 + 0.5602i | 0.2701 + 0.6365i | 0.3232 + 0.5582i | 0.3244 + 0.6346i | 0.2749 + 0.8226i | 0.2718 + 0.7235i | 0.3274 + 0.8149i | 0.3244 + 0.7213i |
| 26 | 0.2972 + 0.5451i | 0.2990 + 0.6252i | 0.3472 + 0.5423i | 0.3491 + 0.6333i | 0.2795 + 0.8178i | 0.2862 + 0.7117i | 0.2795 + 0.8178i | 0.3367 + 0.7232i |
| 26.5 | 0.2596 + 0.5290i | 0.2589 + 0.5985i | 0.3256 + 0.5326i | 0.3154 + 0.6039i | 0.2797 + 0.7660i | 0.2874 + 0.6779i | 0.2816 + 0.8277i | 0.2874 + 0.6779i |
| 27 | 0.2766 + 0.5536i | 0.2777 + 0.6319i | 0.3404 + 0.5532i | 0.3419 + 0.6283i | 0.2818 + 0.8033i | 0.2795 + 0.7152i | 0.3469 + 0.7986i | 0.3449 + 0.7116i |
| 27.5 | 0.2828 + 0.5653i | 0.2811 + 0.6456i | 0.3483 + 0.5665i | 0.3451 + 0.6465i | 0.2821 + 0.8240i | 0.2808 + 0.7321i | 0.3509 + 0.8188i | 0.3469 + 0.7317i |
| 28 | 0.2732 + 0.5668i | 0.2746 + 0.6455i | 0.3392 + 0.5659i | 0.3408 + 0.6410i | 0.2773 + 0.8163i | 0.2760 + 0.7294i | 0.3462 + 0.8141i | 0.3422 + 0.72591 |

| SNR/w | w192 | w193 | w194 | w195 | w196 | w197 | w198 | w199 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4119 + 0.2279i | 0.4119 + 0.2279i | 0.4119 + 0.2279i | 0.4119 + 0.2279i | 0.4119 + 0.2279i | 0.4119 + 0.2279i | 0.4119 + 0.2279i | 0.4119 + 0.2279i |
| 8.5 | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i |
| 11.5 | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i |
| 12 | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i |
| 12.5 | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i |
| 14 | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i |
| 14.5 | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i |
| 15 | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i |
| 16 | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i |
| 18 | 0.1133 + 0.1114i | 0.1133 + 0.1114i | 0.1133 + 0.1114i | 0.1133 + 0.1114i | 0.1133 + 0.1114i | 0.1133 + 0.1114i | 0.1133 + 0.1114i | 0.1133 + 0.1114i |

-continued

| | | | | | | | | |
|---|---|---|---|---|---|---|---|---|
| 18.5 | 0.0961 + 0.0854i | 0.0961 + 0.0854i | 0.0961 + 0.0854i | 0.0961 + 0.0854i | 0.0971 + 0.1780i | 0.0971 + 0.1780i | 0.0971 + 0.1780i | 0.0971 + 0.1780i |
| 19 | 0.0921 + 0.0770i | 0.0921 + 0.0770i | 0.0921 + 0.0770i | 0.0921 + 0.0770i | 0.0938 + 0.2028i | 0.0938 + 0.2028i | 0.0938 + 0.2028i | 0.0938 + 0.2028i |
| 19.5 | 0.0905 + 0.0748i | 0.0905 + 0.0748i | 0.0905 + 0.0748i | 0.0905 + 0.0748i | 0.0927 + 0.2157i | 0.0927 + 0.2157i | 0.0927 + 0.2157i | 0.0927 + 0.2157i |
| 20 | 0.0722 + 0.0935i | 0.0722 + 0.0935i | 0.0722 + 0.0935i | 0.0722 + 0.0935i | 0.0722 + 0.0935i | 0.0722 + 0.0935i | 0.0722 + 0.0935i | 0.0722 + 0.0935i |
| 20.5 | 0.0636 + 0.0660i | 0.0636 + 0.0660i | 0.0636 + 0.0660i | 0.0636 + 0.0660i | 0.0638 + 0.1878i | 0.0638 + 0.1878i | 0.0638 + 0.1878i | 0.0638 + 0.1878i |
| 21 | 0.0606 + 0.0613i | 0.0606 + 0.0613i | 0.0606 + 0.0613i | 0.0606 + 0.0613i | 0.0605 + 0.1754i | 0.0605 + 0.1754i | 0.0605 + 0.1754i | 0.0605 + 0.1754i |
| 21.5 | 0.0624 + 0.0575i | 0.0624 + 0.0575i | 0.0624 + 0.0575i | 0.0624 + 0.0575i | 0.0619 + 0.1651i | 0.0619 + 0.1651i | 0.0619 + 0.1651i | 0.0619 + 0.1651i |
| 22 | 0.0583 + 0.0591i | 0.0583 + 0.0591i | 0.0583 + 0.0591i | 0.0583 + 0.0591i | 0.0583 + 0.1759i | 0.0583 + 0.1759i | 0.0583 + 0.1759i | 0.0583 + 0.1759i |
| 22.5 | 0.0593 + 0.0592i | 0.0593 + 0.0592i | 0.0593 + 0.0592i | 0.0593 + 0.0592i | 0.0611 + 0.1735i | 0.0611 + 0.1735i | 0.0611 + 0.1735i | 0.0611 + 0.1735i |
| 23 | 0.0597 + 0.0546i | 0.0597 + 0.0546i | 0.0597 + 0.0546i | 0.0597 + 0.0546i | 0.0589 + 0.1642i | 0.0589 + 0.1642i | 0.0589 + 0.1642i | 0.0589 + 0.1642i |
| 23.5 | 0.0579 + 0.0565i | 0.0579 + 0.0565i | 0.0579 + 0.0565i | 0.0579 + 0.0565i | 0.0585 + 0.1710i | 0.0585 + 0.1710i | 0.0585 + 0.1710i | 0.0585 + 0.1710i |
| 24 | 0.0568 + 0.0565i | 0.0568 + 0.0565i | 0.0568 + 0.0565i | 0.0568 + 0.0565i | 0.0567 + 0.1703i | 0.0567 + 0.1703i | 0.0567 + 0.1703i | 0.0567 + 0.1703i |
| 24.5 | 0.0562 + 0.0569i | 0.0562 + 0.0569i | 0.0562 + 0.0569i | 0.0562 + 0.0569i | 0.0565 + 0.1714i | 0.0565 + 0.1714i | 0.0565 + 0.1714i | 0.0565 + 0.1714i |
| 25 | 0.0573 + 0.0541i | 0.0573 + 0.0541i | 0.0573 + 0.0541i | 0.0573 + 0.0541i | 0.0573 + 0.1634i | 0.0573 + 0.1634i | 0.0573 + 0.1634i | 0.0573 + 0.1634i |
| 25.5 | 0.0539 + 0.0400i | 0.0526 + 0.0822i | 0.0539 + 0.0400i | 0.0526 + 0.0822i | 0.0548 + 0.2082i | 0.0533 + 0.1620i | 0.0548 + 0.2082i | 0.0533 + 0.1620i |
| 26 | 0.0344 + 0.0341i | 0.0353 + 0.0840i | 0.0901 + 0.0333i | 0.0896 + 0.0834i | 0.0350 + 0.2090i | 0.0359 + 0.1529i | 0.0840 + 0.2107i | 0.0864 + 0.1532i |
| 26.5 | 0.0350 + 0.0336i | 0.0344 + 0.0721i | 0.0994 + 0.0336i | 0.0982 + 0.0745i | 0.0332 + 0.1857i | 0.0337 + 0.1391i | 0.0949 + 0.1879i | 0.0967 + 0.1405i |
| 27 | 0.0312 + 0.0312i | 0.0315 + 0.0893i | 0.0899 + 0.0311i | 0.0893 + 0.0896i | 0.0313 + 0.2132i | 0.0316 + 0.1532i | 0.0877 + 0.2140i | 0.0886 + 0.1536i |
| 27.5 | 0.0321 + 0.0316i | 0.0320 + 0.0923i | 0.0944 + 0.0317i | 0.0944 + 0.0924i | 0.0316 + 0.2186i | 0.0319 + 0.1557i | 0.0930 + 0.2195i | 0.0936 + 0.1565i |
| 28 | 0.0325 + 0.0301i | 0.0319 + 0.0893i | 0.0962 + 0.0306i | 0.0959 + 0.0901i | 0.0317 + 0.2134i | 0.0317 + 0.1511i | 0.0943 + 0.2132i | 0.0949 + 0.15131 |

| SNR/w | w200 | w201 | w202 | w203 | w204 | w205 | w206 | w207 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4119 + 0.2279i | 0.4119 + 0.2279i | 0.4119 + 0.2279i | 0.4119 + 0.2279i | 0.4692 + 0.2540i | 0.4119 + 0.2279i | 0.4692 + 0.2540i | 0.4119 + 0.2279i |
| 8.5 | 0.5179 + 0.2621i | 0.3997 + 0.2175i | 0.5179 + 0.2621i | 0.3997 + 0.2175i | 0.5179 + 0.2621i | 0.5179 + 0.2621i | 0.5179 + 0.2621i | 0.5179 + 0.2621i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i |
| 11.5 | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i |
| 12 | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i |
| 12.5 | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i |
| 14 | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i |
| 14.5 | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i |
| 15 | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i |

-continued

| | | | | | | | | |
|---|---|---|---|---|---|---|---|---|
| 16 | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i |
| 18 | 0.1133 + 0.1114i | 0.1133 + 0.1114i | 0.1133 + 0.1114i | 0.1133 + 0.1114i | 0.1133 + 0.1114i | 0.1133 + 0.1114i | 0.1133 + 0.1114i | 0.1133 + 0.1114i |
| 18.5 | 0.0961 + 0.0854i | 0.0961 + 0.0854i | 0.0961 + 0.0854i | 0.0961 + 0.0854i | 0.0971 + 0.1780i | 0.0971 + 0.1780i | 0.0971 + 0.1780i | 0.0971 + 0.1780i |
| 19 | 0.0921 + 0.0770i | 0.0921 + 0.0770i | 0.0921 + 0.0770i | 0.0921 + 0.0770i | 0.0938 + 0.2028i | 0.0938 + 0.2028i | 0.0938 + 0.2028i | 0.0938 + 0.2028i |
| 19.5 | 0.0905 + 0.0748i | 0.0905 + 0.0748i | 0.0905 + 0.0748i | 0.0905 + 0.0748i | 0.0927 + 0.2157i | 0.0927 + 0.2157i | 0.0927 + 0.2157i | 0.0927 + 0.2157i |
| 20 | 0.2104 + 0.0757i | 0.2104 + 0.0757i | 0.2104 + 0.0757i | 0.2104 + 0.0757i | 0.2094 + 0.1154i | 0.2094 + 0.1154i | 0.2094 + 0.1154i | 0.2094 + 0.1154i |
| 20.5 | 0.1593 + 0.0657i | 0.1593 + 0.0657i | 0.1593 + 0.0657i | 0.1593 + 0.0657i | 0.1613 + 0.1873i | 0.1613 + 0.1873i | 0.1613 + 0.1873i | 0.1613 + 0.1873i |
| 21 | 0.1708 + 0.0613i | 0.1708 + 0.0613i | 0.1708 + 0.0613i | 0.1708 + 0.0613i | 0.1705 + 0.1750i | 0.1705 + 0.1750i | 0.1705 + 0.1750i | 0.1705 + 0.1750i |
| 21.5 | 0.1850 + 0.0578i | 0.1850 + 0.0578i | 0.1850 + 0.0578i | 0.1850 + 0.0578i | 0.1832 + 0.1667i | 0.1832 + 0.1667i | 0.1832 + 0.1667i | 0.1832 + 0.1667i |
| 22 | 0.1740 + 0.0587i | 0.1740 + 0.0587i | 0.1740 + 0.0587i | 0.1740 + 0.0587i | 0.1739 + 0.1750i | 0.1739 + 0.1750i | 0.1739 + 0.1750i | 0.1739 + 0.1750i |
| 22.5 | 0.1798 + 0.0568i | 0.1798 + 0.0568i | 0.1798 + 0.0568i | 0.1798 + 0.0568i | 0.1797 + 0.1737i | 0.1797 + 0.1737i | 0.1797 + 0.1737i | 0.1797 + 0.1737i |
| 23 | 0.1753 + 0.0566i | 0.1753 + 0.0566i | 0.1753 + 0.0566i | 0.1753 + 0.0566i | 0.1746 + 0.1655i | 0.1746 + 0.1655i | 0.1746 + 0.1655i | 0.1746 + 0.1655i |
| 23.5 | 0.1751 + 0.0567i | 0.1751 + 0.0567i | 0.1751 + 0.0567i | 0.1751 + 0.0567i | 0.1756 + 0.1709i | 0.1756 + 0.1709i | 0.1756 + 0.1709i | 0.1756 + 0.1709i |
| 24 | 0.1711 + 0.0565i | 0.1711 + 0.0565i | 0.1711 + 0.0565i | 0.1711 + 0.0565i | 0.1709 + 0.1707i | 0.1709 + 0.1707i | 0.1709 + 0.1707i | 0.1709 + 0.1707i |
| 24.5 | 0.1692 + 0.0568i | 0.1692 + 0.0568i | 0.1692 + 0.0568i | 0.1692 + 0.0568i | 0.1703 + 0.1710i | 0.1703 + 0.1710i | 0.1703 + 0.1710i | 0.1703 + 0.1710i |
| 25 | 0.1749 + 0.0537i | 0.1749 + 0.0537i | 0.1749 + 0.0537i | 0.1749 + 0.0537i | 0.1745 + 0.1626i | 0.1745 + 0.1626i | 0.1745 + 0.1626i | 0.1745 + 0.1626i |
| 25.5 | 0.1615 + 0.0411i | 0.1623 + 0.0829i | 0.1615 + 0.0411i | 0.1623 + 0.0829i | 0.1638 + 0.2083i | 0.1635 + 0.1621i | 0.1638 + 0.2083i | 0.1635 + 0.1621i |
| 26 | 0.2200 + 0.0335i | 0.2157 + 0.0862i | 0.1605 + 0.0334i | 0.1594 + 0.0842i | 0.2057 + 0.2111i | 0.2090 + 0.1567i | 0.1533 + 0.2109i | 0.1556 + 0.1545i |
| 26.5 | 0.2312 + 0.0326i | 0.2301 + 0.0822i | 0.1675 + 0.0333i | 0.1669 + 0.0781i | 0.2213 + 0.2007i | 0.2267 + 0.1480i | 0.1613 + 0.1940i | 0.1643 + 0.1434i |
| 27 | 0.2133 + 0.0321i | 0.2124 + 0.0917i | 0.1539 + 0.0316i | 0.1528 + 0.0907i | 0.2111 + 0.2173i | 0.2112 + 0.1563i | 0.1511 + 0.2158i | 0.1520 + 0.1548i |
| 27.5 | 0.2220 + 0.0325i | 0.2205 + 0.0962i | 0.1593 + 0.0316i | 0.1585 + 0.0936i | 0.2186 + 0.2223i | 0.2194 + 0.1603i | 0.1562 + 0.2208i | 0.1568 + 0.1579i |
| 28 | 0.2272 + 0.0295i | 0.2268 + 0.0890i | 0.1609 + 0.0303i | 0.1613 + 0.0901i | 0.2228 + 0.2150i | 0.2255 + 0.1519i | 0.1587 + 0.2135i | 0.1605 + 0.15171 |

| SNR/w | w208 | w209 | w210 | w211 | w212 | w213 | w214 | w215 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4119 + 0.2279i | 0.4119 + 0.2279i | 0.4119 + 0.2279i | 0.4119 + 0.2279i | 0.4692 + 0.2540i | 0.4119 + 0.2279i | 0.4692 + 0.2540i | 0.4119 + 0.2279i |
| 8.5 | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i |
| 9 | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i |
| 9.5 | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i |
| 10 | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i |
| 10.5 | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i |
| 11 | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i |
| 11.5 | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i |
| 12 | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i |
| 12.5 | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i |
| 13 | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i |

-continued

| | | | | | | | | |
|---|---|---|---|---|---|---|---|---|
| 13.5 | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i |
| 14 | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i |
| 14.5 | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i |
| 15 | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i |
| 15.5 | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i |
| 16 | 0.1142 + 0.3766i | 0.1142 + 0.3766i | 0.1142 + 0.3766i | 0.1142 + 0.3766i | 0.1142 + 0.3766i | 0.1142 + 0.3766i | 0.1142 + 0.3766i | 0.1142 + 0.3766i |
| 16.5 | 0.1133 + 0.3468i | 0.1133 + 0.3468i | 0.1133 + 0.3468i | 0.1133 + 0.3468i | 0.1133 + 0.3468i | 0.1133 + 0.3468i | 0.1133 + 0.3468i | 0.1133 + 0.3468i |
| 17 | 0.1129 + 0.3473i | 0.1129 + 0.3473i | 0.1129 + 0.3473i | 0.1129 + 0.3473i | 0.1129 + 0.3473i | 0.1129 + 0.3473i | 0.1129 + 0.3473i | 0.1129 + 0.3473i |
| 17.5 | 0.1113 + 0.3593i | 0.1113 + 0.3593i | 0.1113 + 0.3593i | 0.1113 + 0.3593i | 0.1146 + 0.3275i | 0.1113 + 0.3593i | 0.1146 + 0.3275i | 0.1113 + 0.3593i |
| 18 | 0.1118 + 0.3721i | 0.1118 + 0.3721i | 0.1118 + 0.3721i | 0.1118 + 0.3721i | 0.1122 + 0.3197i | 0.1122 + 0.3197i | 0.1122 + 0.3197i | 0.1122 + 0.3197i |
| 18.5 | 0.1033 + 0.4748i | 0.1033 + 0.4748i | 0.1033 + 0.4748i | 0.1033 + 0.4748i | 0.0995 + 0.3488i | 0.0995 + 0.3488i | 0.0995 + 0.3488i | 0.0995 + 0.3488i |
| 19 | 0.1037 + 0.5029i | 0.1037 + 0.5029i | 0.1037 + 0.5029i | 0.1037 + 0.5029i | 0.0979 + 0.3590i | 0.0979 + 0.3590i | 0.0979 + 0.3590i | 0.0979 + 0.3590i |
| 19.5 | 0.0798 + 0.5209i | 0.0798 + 0.5209i | 0.0798 + 0.5209i | 0.0798 + 0.5209i | 0.0976 + 0.3682i | 0.0976 + 0.3682i | 0.0976 + 0.3682i | 0.0976 + 0.3682i |
| 20 | 0.0700 + 0.3244i | 0.0700 + 0.3244i | 0.0700 + 0.3244i | 0.0700 + 0.3244i | 0.0714 + 0.2590i | 0.0714 + 0.2590i | 0.0714 + 0.2590i | 0.0714 + 0.2590i |
| 20.5 | 0.0631 + 0.4551i | 0.0631 + 0.4551i | 0.0631 + 0.4551i | 0.0631 + 0.4551i | 0.0635 + 0.3220i | 0.0635 + 0.3220i | 0.0635 + 0.3220i | 0.0635 + 0.3220i |
| 21 | 0.0606 + 0.4318i | 0.0606 + 0.4318i | 0.0606 + 0.4318i | 0.0606 + 0.4318i | 0.0605 + 0.3029i | 0.0605 + 0.3029i | 0.0605 + 0.3029i | 0.0605 + 0.3029i |
| 21.5 | 0.0595 + 0.4083i | 0.0595 + 0.4083i | 0.0595 + 0.4083i | 0.0595 + 0.4083i | 0.0610 + 0.2852i | 0.0610 + 0.2852i | 0.0610 + 0.2852i | 0.0610 + 0.2852i |
| 22 | 0.0587 + 0.4286i | 0.0587 + 0.4286i | 0.0587 + 0.4286i | 0.0587 + 0.4286i | 0.0588 + 0.2997i | 0.0588 + 0.2997i | 0.0588 + 0.2997i | 0.0588 + 0.2997i |
| 22.5 | 0.0573 + 0.4196i | 0.0573 + 0.4196i | 0.0573 + 0.4196i | 0.0573 + 0.4196i | 0.0591 + 0.2925i | 0.0591 + 0.2925i | 0.0591 + 0.2925i | 0.0591 + 0.2925i |
| 23 | 0.0552 + 0.4065i | 0.0552 + 0.4065i | 0.0552 + 0.4065i | 0.0552 + 0.4065i | 0.0586 + 0.2809i | 0.0586 + 0.2809i | 0.0586 + 0.2809i | 0.0586 + 0.2809i |
| 23.5 | 0.0585 + 0.4134i | 0.0585 + 0.4134i | 0.0585 + 0.4134i | 0.0585 + 0.4134i | 0.0586 + 0.2893i | 0.0586 + 0.2893i | 0.0586 + 0.2893i | 0.0586 + 0.2893i |
| 24 | 0.0557 + 0.4158i | 0.0557 + 0.4158i | 0.0557 + 0.4158i | 0.0557 + 0.4158i | 0.0564 + 0.2883i | 0.0564 + 0.2883i | 0.0564 + 0.2883i | 0.0564 + 0.2883i |
| 24.5 | 0.0582 + 0.4127i | 0.0582 + 0.4127i | 0.0582 + 0.4127i | 0.0582 + 0.4127i | 0.0571 + 0.2886i | 0.0571 + 0.2886i | 0.0571 + 0.2886i | 0.0571 + 0.2886i |
| 25 | 0.0575 + 0.4254i | 0.0575 + 0.3805i | 0.0575 + 0.4254i | 0.0575 + 0.3805i | 0.0572 + 0.2775i | 0.0572 + 0.2775i | 0.0572 + 0.2775i | 0.0572 + 0.2775i |
| 25.5 | 0.0564 + 0.4860i | 0.0531 + 0.4193i | 0.0564 + 0.4860i | 0.0531 + 0.4193i | 0.0559 + 0.2861i | 0.0548 + 0.3407i | 0.0559 + 0.2861i | 0.0548 + 0.3407i |
| 26 | 0.0351 + 0.4808i | 0.0342 + 0.4146i | 0.0899 + 0.4781i | 0.0857 + 0.4137i | 0.0349 + 0.2807i | 0.0346 + 0.3432i | 0.0827 + 0.2816i | 0.0843 + 0.3431i |
| 26.5 | 0.0318 + 0.4522i | 0.0321 + 0.3789i | 0.0739 + 0.4533i | 0.0796 + 0.3824i | 0.0325 + 0.2516i | 0.0330 + 0.3088i | 0.0908 + 0.2538i | 0.0850 + 0.3119i |
| 27 | 0.0308 + 0.4850i | 0.0311 + 0.4144i | 0.0873 + 0.4850i | 0.0875 + 0.4142i | 0.0307 + 0.2794i | 0.0310 + 0.3456i | 0.0863 + 0.2798i | 0.0866 + 0.3448i |
| 27.5 | 0.0311 + 0.4893i | 0.0313 + 0.4189i | 0.0920 + 0.4897i | 0.0921 + 0.4194i | 0.0314 + 0.2837i | 0.0311 + 0.3499i | 0.0926 + 0.2848i | 0.0919 + 0.3507i |
| 28 | 0.0302 + 0.4887i | 0.0304 + 0.4150i | 0.0892 + 0.4889i | 0.0900 + 0.4153i | 0.0313 + 0.2777i | 0.0307 + 0.3444i | 0.0933 + 0.2782i | 0.0916 + 0.34491 |

| SNR/w | w216 | w217 | w218 | w219 | w220 | w221 | w222 | w223 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i |
| 8.5 | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i |
| 9 | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i |
| 9.5 | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i |
| 10 | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i |
| 10.5 | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i |

-continued

| | | | | | | | | |
|---|---|---|---|---|---|---|---|---|
| 11 | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i |
| 11.5 | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i |
| 12 | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i |
| 12.5 | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i |
| 13 | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i |
| 13.5 | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i |
| 14 | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i |
| 14.5 | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i |
| 15 | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i |
| 15.5 | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i |
| 16 | 0.1142 + 0.3766i | 0.1142 + 0.3766i | 0.1142 + 0.3766i | 0.1142 + 0.3766i | 0.1142 + 0.3766i | 0.1142 + 0.3766i | 0.1142 + 0.3766i | 0.1142 + 0.3766i |
| 16.5 | 0.1133 + 0.3468i | 0.1133 + 0.3468i | 0.1133 + 0.3468i | 0.1133 + 0.3468i | 0.1133 + 0.3468i | 0.1133 + 0.3468i | 0.1133 + 0.3468i | 0.1133 + 0.3468i |
| 17 | 0.1129 + 0.3473i | 0.1129 + 0.3473i | 0.1129 + 0.3473i | 0.1129 + 0.3473i | 0.1129 + 0.3473i | 0.1129 + 0.3473i | 0.1129 + 0.3473i | 0.1129 + 0.3473i |
| 17.5 | 0.1113 + 0.3593i | 0.1113 + 0.3593i | 0.1113 + 0.3593i | 0.1113 + 0.3593i | 0.1146 + 0.3275i | 0.1146 + 0.3275i | 0.1146 + 0.3275i | 0.1146 + 0.3275i |
| 18 | 0.1118 + 0.3721i | 0.1118 + 0.3721i | 0.1118 + 0.3721i | 0.1118 + 0.3721i | 0.1122 + 0.3197i | 0.1122 + 0.3197i | 0.1122 + 0.3197i | 0.1122 + 0.3197i |
| 18.5 | 0.1033 + 0.4748i | 0.1033 + 0.4748i | 0.1033 + 0.4748i | 0.1033 + 0.4748i | 0.0995 + 0.3488i | 0.0995 + 0.3488i | 0.0995 + 0.3488i | 0.0995 + 0.3488i |
| 19 | 0.1037 + 0.5029i | 0.1037 + 0.5029i | 0.1037 + 0.5029i | 0.1037 + 0.5029i | 0.0979 + 0.3590i | 0.0979 + 0.3590i | 0.0979 + 0.3590i | 0.0979 + 0.3590i |
| 19.5 | 0.1298 + 0.5175i | 0.1298 + 0.5175i | 0.1298 + 0.5175i | 0.1298 + 0.5175i | 0.0976 + 0.3682i | 0.0976 + 0.3682i | 0.0976 + 0.3682i | 0.0976 + 0.3682i |
| 20 | 0.1950 + 0.3354i | 0.1950 + 0.3354i | 0.1950 + 0.3354i | 0.1950 + 0.3354i | 0.2030 + 0.2636i | 0.2030 + 0.2636i | 0.2030 + 0.2636i | 0.2030 + 0.2636i |
| 20.5 | 0.1682 + 0.4544i | 0.1682 + 0.4544i | 0.1682 + 0.4544i | 0.1682 + 0.4544i | 0.1644 + 0.3218i | 0.1644 + 0.3218i | 0.1644 + 0.3218i | 0.1644 + 0.3218i |
| 21 | 0.1707 + 0.4303i | 0.1707 + 0.4303i | 0.1707 + 0.4303i | 0.1707 + 0.4303i | 0.1703 + 0.3021i | 0.1703 + 0.3021i | 0.1703 + 0.3021i | 0.1703 + 0.3021i |
| 21.5 | 0.1741 + 0.4109i | 0.1741 + 0.4109i | 0.1741 + 0.4109i | 0.1741 + 0.4109i | 0.1795 + 0.2874i | 0.1795 + 0.2874i | 0.1795 + 0.2874i | 0.1795 + 0.2874i |
| 22 | 0.1749 + 0.4271i | 0.1749 + 0.4271i | 0.1749 + 0.4271i | 0.1749 + 0.4271i | 0.1738 + 0.2981i | 0.1738 + 0.2981i | 0.1738 + 0.2981i | 0.1738 + 0.2981i |
| 22.5 | 0.1745 + 0.4185i | 0.1745 + 0.4185i | 0.1745 + 0.4185i | 0.1745 + 0.4185i | 0.1777 + 0.2932i | 0.1777 + 0.2932i | 0.1777 + 0.2932i | 0.1777 + 0.2932i |
| 23 | 0.1713 + 0.4102i | 0.1713 + 0.4102i | 0.1713 + 0.4102i | 0.1713 + 0.4102i | 0.1741 + 0.2862i | 0.1741 + 0.2862i | 0.1741 + 0.2862i | 0.1741 + 0.2862i |
| 23.5 | 0.1756 + 0.4146i | 0.1756 + 0.4146i | 0.1756 + 0.4146i | 0.1756 + 0.4146i | 0.1762 + 0.2899i | 0.1762 + 0.2899i | 0.1762 + 0.2899i | 0.1762 + 0.2899i |
| 24 | 0.1687 + 0.4159i | 0.1687 + 0.4159i | 0.1687 + 0.4159i | 0.1687 + 0.4159i | 0.1702 + 0.2887i | 0.1702 + 0.2887i | 0.1702 + 0.2887i | 0.1702 + 0.2887i |
| 24.5 | 0.1756 + 0.4120i | 0.1756 + 0.4120i | 0.1756 + 0.4120i | 0.1756 + 0.4120i | 0.1726 + 0.2878i | 0.1726 + 0.2878i | 0.1726 + 0.2878i | 0.1726 + 0.2878i |
| 25 | 0.1734 + 0.4261i | 0.1734 + 0.3796i | 0.1734 + 0.4261i | 0.1734 + 0.3796i | 0.1736 + 0.2766i | 0.1736 + 0.2766i | 0.1736 + 0.2766i | 0.1736 + 0.2766i |
| 25.5 | 0.1682 + 0.4846i | 0.1685 + 0.4186i | 0.1682 + 0.4846i | 0.1685 + 0.4186i | 0.1657 + 0.2863i | 0.1678 + 0.3421i | 0.1657 + 0.2863i | 0.1678 + 0.3421i |
| 26 | 0.2196 + 0.4716i | 0.2157 + 0.4087i | 0.1610 + 0.4748i | 0.1570 + 0.4119i | 0.2054 + 0.2809i | 0.2094 + 0.3380i | 0.1524 + 0.2824i | 0.1543 + 0.3418i |
| 26.5 | 0.1932 + 0.4577i | 0.1997 + 0.3933i | 0.1389 + 0.4551i | 0.1435 + 0.3873i | 0.2147 + 0.2666i | 0.2083 + 0.3257i | 0.1555 + 0.2607i | 0.1493 + 0.3184i |
| 27 | 0.2118 + 0.4809i | 0.2110 + 0.4119i | 0.1507 + 0.4836i | 0.1502 + 0.4134i | 0.2109 + 0.2819i | 0.2107 + 0.3441i | 0.1498 + 0.2809i | 0.1497 + 0.3442i |
| 27.5 | 0.2186 + 0.4902i | 0.2189 + 0.4202i | 0.1557 + 0.4902i | 0.1557 + 0.4197i | 0.2185 + 0.2872i | 0.2190 + 0.3526i | 0.1559 + 0.2865i | 0.1554 + 0.3519i |
| 28 | 0.2101 + 0.4919i | 0.2114 + 0.4198i | 0.1496 + 0.4906i | 0.1510 + 0.4173i | 0.2183 + 0.2814i | 0.2142 + 0.3497i | 0.1566 + 0.2788i | 0.1537 + 0.34671 |

| SNR/w | w224 | w225 | w226 | w227 | w228 | w229 | w230 | w231 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4119 + 0.2279i | 0.4119 + 0.2279i | 0.4119 + 0.2279i | 0.4119 + 0.2279i | 0.4692 + 0.2540i | 0.4119 + 0.2279i | 0.4692 + 0.2540i | 0.4119 + 0.2279i |

-continued

| | | | | | | | | |
|---|---|---|---|---|---|---|---|---|
| 8.5 | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i |
| 15 | 0.3696 + 0.1160i | 0.3696 + 0.1160i | 0.3696 + 0.1160i | 0.3696 + 0.1160i | 0.3696 + 0.1160i | 0.3696 + 0.1160i | 0.3696 + 0.1160i | 0.3696 + 0.1160i |
| 15.5 | 0.3609 + 0.1145i | 0.3609 + 0.1145i | 0.3609 + 0.1145i | 0.3609 + 0.1145i | 0.3609 + 0.1145i | 0.3609 + 0.1145i | 0.3609 + 0.1145i | 0.3609 + 0.1145i |
| 16 | 0.3375 + 0.1176i | 0.3375 + 0.1176i | 0.3375 + 0.1176i | 0.3375 + 0.1176i | 0.3375 + 0.1176i | 0.3375 + 0.1176i | 0.3375 + 0.1176i | 0.3375 + 0.1176i |
| 16.5 | 0.3522 + 0.1139i | 0.3522 + 0.1139i | 0.3522 + 0.1139i | 0.3522 + 0.1139i | 0.3522 + 0.1139i | 0.3522 + 0.1139i | 0.3522 + 0.1139i | 0.3522 + 0.1139i |
| 17 | 0.3521 + 0.1137i | 0.3521 + 0.1137i | 0.3521 + 0.1137i | 0.3521 + 0.1137i | 0.3521 + 0.1137i | 0.3521 + 0.1137i | 0.3521 + 0.1137i | 0.3521 + 0.1137i |
| 17.5 | 0.3638 + 0.1126i | 0.3638 + 0.1126i | 0.3638 + 0.1126i | 0.3638 + 0.1126i | 0.3638 + 0.1126i | 0.3638 + 0.1126i | 0.3638 + 0.1126i | 0.3638 + 0.1126i |
| 18 | 0.3770 + 0.1130i | 0.3770 + 0.1130i | 0.3770 + 0.1130i | 0.3770 + 0.1130i | 0.3770 + 0.1130i | 0.3770 + 0.1130i | 0.3770 + 0.1130i | 0.3770 + 0.1130i |
| 18.5 | 0.2978 + 0.0877i | 0.2978 + 0.0877i | 0.2978 + 0.0877i | 0.2978 + 0.0877i | 0.3007 + 0.1662i | 0.3007 + 0.1662i | 0.3007 + 0.1662i | 0.3007 + 0.1662i |
| 19 | 0.2928 + 0.0778i | 0.2928 + 0.0778i | 0.2928 + 0.0778i | 0.2928 + 0.0778i | 0.3114 + 0.1880i | 0.3114 + 0.1880i | 0.3114 + 0.1880i | 0.3114 + 0.1880i |
| 19.5 | 0.3016 + 0.0738i | 0.3016 + 0.0738i | 0.3016 + 0.0738i | 0.3016 + 0.0738i | 0.3110 + 0.2020i | 0.3110 + 0.2020i | 0.3110 + 0.2020i | 0.3110 + 0.2020i |
| 20 | 0.5049 + 0.0708i | 0.5049 + 0.0708i | 0.5049 + 0.0708i | 0.5049 + 0.0708i | 0.4994 + 0.1471i | 0.4994 + 0.1471i | 0.4994 + 0.1471i | 0.4994 + 0.1471i |
| 20.5 | 0.4001 + 0.0654i | 0.4001 + 0.0654i | 0.4001 + 0.0654i | 0.4001 + 0.0654i | 0.4035 + 0.1848i | 0.4035 + 0.1848i | 0.4035 + 0.1848i | 0.4035 + 0.1848i |
| 21 | 0.4216 + 0.0611i | 0.4216 + 0.0611i | 0.4216 + 0.0611i | 0.4216 + 0.0611i | 0.4212 + 0.1733i | 0.4212 + 0.1733i | 0.4212 + 0.1733i | 0.4212 + 0.1733i |
| 21.5 | 0.4460 + 0.0597i | 0.4460 + 0.0597i | 0.4460 + 0.0597i | 0.4460 + 0.0597i | 0.4424 + 0.1748i | 0.4424 + 0.1748i | 0.4424 + 0.1748i | 0.4424 + 0.1748i |
| 22 | 0.4254 + 0.0584i | 0.4254 + 0.0584i | 0.4254 + 0.0584i | 0.4254 + 0.0584i | 0.4248 + 0.1721i | 0.4248 + 0.1721i | 0.4248 + 0.1721i | 0.4248 + 0.1721i |
| 22.5 | 0.4316 + 0.0602i | 0.4316 + 0.0602i | 0.4316 + 0.0602i | 0.4316 + 0.0602i | 0.4324 + 0.1762i | 0.4324 + 0.1762i | 0.4324 + 0.1762i | 0.4324 + 0.1762i |
| 23 | 0.4302 + 0.0540i | 0.4302 + 0.0540i | 0.4302 + 0.0540i | 0.4302 + 0.0540i | 0.4255 + 0.1756i | 0.4255 + 0.1756i | 0.4255 + 0.1756i | 0.4255 + 0.1756i |
| 23.5 | 0.4263 + 0.0573i | 0.4263 + 0.0573i | 0.4263 + 0.0573i | 0.4263 + 0.0573i | 0.4258 + 0.1725i | 0.4258 + 0.1725i | 0.4258 + 0.1725i | 0.4258 + 0.1725i |
| 24 | 0.4158 + 0.0562i | 0.4158 + 0.0562i | 0.4158 + 0.0562i | 0.4158 + 0.0562i | 0.4158 + 0.1696i | 0.4158 + 0.1696i | 0.4158 + 0.1696i | 0.4158 + 0.1696i |
| 24.5 | 0.4391 + 0.0544i | 0.4391 + 0.0544i | 0.3936 + 0.0550i | 0.3936 + 0.0550i | 0.4411 + 0.1644i | 0.4411 + 0.1644i | 0.3963 + 0.1660i | 0.3963 + 0.1660i |
| 25 | 0.4741 + 0.0555i | 0.4741 + 0.0555i | 0.4096 + 0.0551i | 0.4096 + 0.0551i | 0.4732 + 0.1674i | 0.4732 + 0.1674i | 0.4081 + 0.1657i | 0.4081 + 0.1657i |
| 25.5 | 0.4332 + 0.0580i | 0.4332 + 0.0580i | 0.3744 + 0.0411i | 0.3745 + 0.0772i | 0.4411 + 0.1978i | 0.4377 + 0.1570i | 0.3822 + 0.2018i | 0.3792 + 0.1581i |
| 26 | 0.4883 + 0.1036i | 0.4883 + 0.1036i | 0.4269 + 0.0476i | 0.4149 + 0.1052i | 0.4979 + 0.1913i | 0.4979 + 0.1913i | 0.4158 + 0.2122i | 0.4119 + 0.1755i |
| 26.5 | 0.4824 + 0.0289i | 0.4857 + 0.0919i | 0.4205 + 0.0350i | 0.4205 + 0.0961i | 0.4899 + 0.2242i | 0.4866 + 0.1642i | 0.4194 + 0.2229i | 0.4216 + 0.1624i |
| 27 | 0.5079 + 0.0438i | 0.5036 + 0.1009i | 0.4254 + 0.0322i | 0.4167 + 0.1021i | 0.4840 + 0.2135i | 0.4940 + 0.1581i | 0.4139 + 0.2120i | 0.4156 + 0.1554i |
| 27.5 | 0.5112 + 0.0414i | 0.5049 + 0.1036i | 0.4283 + 0.0333i | 0.4231 + 0.1059i | 0.4951 + 0.2253i | 0.4990 + 0.1631i | 0.4241 + 0.2243i | 0.4237 + 0.1622i |

-continued

| SNR/w | w232 | w233 | w234 | w235 | w236 | w237 | w238 | w239 |
|---|---|---|---|---|---|---|---|---|
| 28 | 0.6043 + 0.0218i | 0.5006 + 0.1245i | 0.4388 + 0.0377i | 0.4351 + 0.1002i | 0.4847 + 0.2316i | 0.4930 + 0.1739i | 0.4142 + 0.2270i | 0.4205 + 0.16321 |
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i |
| 8.5 | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i |
| 15 | 0.3696 + 0.1160i | 0.3696 + 0.1160i | 0.3696 + 0.1160i | 0.3696 + 0.1160i | 0.3696 + 0.1160i | 0.3696 + 0.1160i | 0.3696 + 0.1160i | 0.3696 + 0.1160i |
| 15.5 | 0.3609 + 0.1145i | 0.3609 + 0.1145i | 0.3609 + 0.1145i | 0.3609 + 0.1145i | 0.3609 + 0.1145i | 0.3609 + 0.1145i | 0.3609 + 0.1145i | 0.3609 + 0.1145i |
| 16 | 0.3375 + 0.1176i | 0.3375 + 0.1176i | 0.3375 + 0.1176i | 0.3375 + 0.1176i | 0.3375 + 0.1176i | 0.3375 + 0.1176i | 0.3375 + 0.1176i | 0.3375 + 0.1176i |
| 16.5 | 0.3522 + 0.1139i | 0.3522 + 0.1139i | 0.3522 + 0.1139i | 0.3522 + 0.1139i | 0.3522 + 0.1139i | 0.3522 + 0.1139i | 0.3522 + 0.1139i | 0.3522 + 0.1139i |
| 17 | 0.3521 + 0.1137i | 0.3521 + 0.1137i | 0.3521 + 0.1137i | 0.3521 + 0.1137i | 0.3521 + 0.1137i | 0.3521 + 0.1137i | 0.3521 + 0.1137i | 0.3521 + 0.1137i |
| 17.5 | 0.3323 + 0.1152i | 0.3323 + 0.1152i | 0.3638 + 0.1126i | 0.3638 + 0.1126i | 0.3323 + 0.1152i | 0.3323 + 0.1152i | 0.3323 + 0.1152i | 0.3323 + 0.1152i |
| 18 | 0.3243 + 0.1125i | 0.3243 + 0.1125i | 0.3243 + 0.1125i | 0.3243 + 0.1125i | 0.3243 + 0.1125i | 0.3243 + 0.1125i | 0.3243 + 0.1125i | 0.3243 + 0.1125i |
| 18.5 | 0.2978 + 0.0877i | 0.2978 + 0.0877i | 0.2978 + 0.0877i | 0.2978 + 0.0877i | 0.3007 + 0.1662i | 0.3007 + 0.1662i | 0.3007 + 0.1662i | 0.3007 + 0.1662i |
| 19 | 0.2671 + 0.0777i | 0.2671 + 0.0777i | 0.2928 + 0.0778i | 0.2928 + 0.0778i | 0.2719 + 0.1922i | 0.2719 + 0.1922i | 0.2719 + 0.1922i | 0.2719 + 0.1922i |
| 19.5 | 0.2598 + 0.0741i | 0.2598 + 0.0741i | 0.2598 + 0.0741i | 0.2598 + 0.0741i | 0.2641 + 0.2070i | 0.2641 + 0.2070i | 0.2641 + 0.2070i | 0.2641 + 0.2070i |
| 20 | 0.3583 + 0.0733i | 0.3583 + 0.0733i | 0.3583 + 0.0733i | 0.3583 + 0.0733i | 0.3557 + 0.1281i | 0.3557 + 0.1281i | 0.3557 + 0.1281i | 0.3557 + 0.1281i |
| 20.5 | 0.2886 + 0.0655i | 0.2886 + 0.0655i | 0.2886 + 0.0655i | 0.2886 + 0.0655i | 0.2903 + 0.1864i | 0.2903 + 0.1864i | 0.2903 + 0.1864i | 0.2903 + 0.1864i |
| 21 | 0.2964 + 0.0612i | 0.2964 + 0.0612i | 0.2964 + 0.0612i | 0.2964 + 0.0612i | 0.2961 + 0.1741i | 0.2961 + 0.1741i | 0.2961 + 0.1741i | 0.2961 + 0.1741i |
| 21.5 | 0.3136 + 0.0587i | 0.3136 + 0.0587i | 0.3136 + 0.0587i | 0.3136 + 0.0587i | 0.3109 + 0.1701i | 0.3109 + 0.1701i | 0.3109 + 0.1701i | 0.3109 + 0.1701i |
| 22 | 0.2965 + 0.0583i | 0.2965 + 0.0583i | 0.2965 + 0.0583i | 0.2965 + 0.0583i | 0.2961 + 0.1740i | 0.2961 + 0.1740i | 0.2961 + 0.1740i | 0.2961 + 0.1740i |
| 22.5 | 0.3044 + 0.0585i | 0.3044 + 0.0585i | 0.3044 + 0.0585i | 0.3044 + 0.0585i | 0.3022 + 0.1743i | 0.3022 + 0.1743i | 0.3022 + 0.1743i | 0.3022 + 0.1743i |
| 23 | 0.3002 + 0.0559i | 0.3002 + 0.0559i | 0.3002 + 0.0559i | 0.3002 + 0.0559i | 0.3008 + 0.1679i | 0.3008 + 0.1679i | 0.3008 + 0.1679i | 0.3008 + 0.1679i |
| 23.5 | 0.2968 + 0.0565i | 0.2968 + 0.0565i | 0.2968 + 0.0565i | 0.2968 + 0.0565i | 0.2971 + 0.1712i | 0.2971 + 0.1712i | 0.2971 + 0.1712i | 0.2971 + 0.1712i |
| 24 | 0.2891 + 0.0565i | 0.2891 + 0.0565i | 0.2891 + 0.0565i | 0.2891 + 0.0565i | 0.2888 + 0.1706i | 0.2888 + 0.1706i | 0.2888 + 0.1706i | 0.2888 + 0.1706i |
| 24.5 | 0.2864 + 0.0561i | 0.2864 + 0.0561i | 0.2864 + 0.0561i | 0.2864 + 0.0561i | 0.2884 + 0.1691i | 0.2884 + 0.1691i | 0.2884 + 0.1691i | 0.2884 + 0.1691i |
| 25 | 0.2793 + 0.0538i | 0.2793 + 0.0538i | 0.3242 + 0.0543i | 0.3242 + 0.0543i | 0.2783 + 0.1631i | 0.2783 + 0.1631i | 0.3224 + 0.1639i | 0.3224 + 0.1639i |

-continued

| | | | | | | | | |
|---|---|---|---|---|---|---|---|---|
| 25.5 | 0.2565 + 0.0404i | 0.2580 + 0.0815i | 0.2933 + 0.0406i | 0.2942 + 0.0808i | 0.2624 + 0.2089i | 0.2607 + 0.1620i | 0.3016 + 0.2071i | 0.2979 + 0.1608i |
| 26 | 0.2912 + 0.0349i | 0.2858 + 0.0896i | 0.3531 + 0.0375i | 0.3456 + 0.0944i | 0.2776 + 0.2130i | 0.2797 + 0.1616i | 0.3388 + 0.2141i | 0.3395 + 0.1659i |
| 26.5 | 0.2981 + 0.0330i | 0.2963 + 0.0873i | 0.3583 + 0.0345i | 0.3569 + 0.0932i | 0.2863 + 0.2090i | 0.2920 + 0.1540i | 0.3512 + 0.2175i | 0.3553 + 0.1593i |
| 27 | 0.2788 + 0.0329i | 0.2765 + 0.0939i | 0.3366 + 0.0360i | 0.3386 + 0.0968i | 0.2771 + 0.2176i | 0.2758 + 0.1577i | 0.3431 + 0.2153i | 0.3406 + 0.1566i |
| 27.5 | 0.2859 + 0.0343i | 0.2847 + 0.0994i | 0.3429 + 0.0370i | 0.3476 + 0.1015i | 0.2852 + 0.2242i | 0.2849 + 0.1629i | 0.3535 + 0.2247i | 0.3513 + 0.1631i |
| 28 | 0.2966 + 0.0296i | 0.2938 + 0.0892i | 0.3680 + 0.0313i | 0.3621 + 0.0922i | 0.2866 + 0.2178i | 0.2907 + 0.1527i | 0.3496 + 0.2221i | 0.3560 + 0.15541 |

| SNR/w | w240 | w241 | w242 | w243 | w244 | w245 | w246 | w247 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i |
| 8.5 | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i |
| 9 | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i |
| 9.5 | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i |
| 10 | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i |
| 10.5 | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i |
| 11 | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i |
| 11.5 | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i |
| 13.5 | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i |
| 14.5 | 0.5322 + 0.3087i | 0.5322 + 0.3087i | 0.5322 + 0.3087i | 0.5322 + 0.3087i | 0.5322 + 0.3087i | 0.5322 + 0.3087i | 0.5322 + 0.3087i | 0.5322 + 0.3087i |
| 15 | 0.3819 + 0.3404i | 0.3819 + 0.3404i | 0.3819 + 0.3404i | 0.3819 + 0.3404i | 0.3819 + 0.3404i | 0.3819 + 0.3404i | 0.3819 + 0.3404i | 0.3819 + 0.3404i |
| 15.5 | 0.3793 + 0.3446i | 0.3793 + 0.3446i | 0.3793 + 0.3446i | 0.3793 + 0.3446i | 0.3793 + 0.3446i | 0.3793 + 0.3446i | 0.3793 + 0.3446i | 0.3793 + 0.3446i |
| 16 | 0.3517 + 0.3604i | 0.3517 + 0.3604i | 0.3517 + 0.3604i | 0.3517 + 0.3604i | 0.3517 + 0.3604i | 0.3517 + 0.3604i | 0.3517 + 0.3604i | 0.3517 + 0.3604i |
| 16.5 | 0.3493 + 0.3492i | 0.3493 + 0.3492i | 0.3493 + 0.3492i | 0.3493 + 0.3492i | 0.3493 + 0.3492i | 0.3493 + 0.3492i | 0.3493 + 0.3492i | 0.3493 + 0.3492i |
| 17 | 0.3543 + 0.3548i | 0.3543 + 0.3548i | 0.3543 + 0.3548i | 0.3543 + 0.3548i | 0.3543 + 0.3548i | 0.3543 + 0.3548i | 0.3543 + 0.3548i | 0.3543 + 0.3548i |
| 17.5 | 0.3687 + 0.3574i | 0.3687 + 0.3574i | 0.3687 + 0.3574i | 0.3687 + 0.3574i | 0.3697 + 0.3307i | 0.3687 + 0.3574i | 0.3697 + 0.3307i | 0.3687 + 0.3574i |
| 18 | 0.3739 + 0.3746i | 0.3739 + 0.3746i | 0.3739 + 0.3746i | 0.3739 + 0.3746i | 0.3754 + 0.3235i | 0.3754 + 0.3235i | 0.3754 + 0.3235i | 0.3754 + 0.3235i |
| 18.5 | 0.3414 + 0.4506i | 0.3414 + 0.4506i | 0.3414 + 0.4506i | 0.3414 + 0.4506i | 0.3146 + 0.3407i | 0.3146 + 0.3407i | 0.3146 + 0.3407i | 0.3146 + 0.3407i |
| 19 | 0.3529 + 0.4716i | 0.3529 + 0.4716i | 0.3529 + 0.4716i | 0.3529 + 0.4716i | 0.3284 + 0.3442i | 0.3284 + 0.3442i | 0.3284 + 0.3442i | 0.3284 + 0.3442i |
| 19.5 | 0.3681 + 0.4838i | 0.3681 + 0.4838i | 0.3681 + 0.4838i | 0.3681 + 0.4838i | 0.3345 + 0.3493i | 0.3345 + 0.3493i | 0.3345 + 0.3493i | 0.3345 + 0.3493i |
| 20 | 0.4657 + 0.3917i | 0.4657 + 0.3917i | 0.4657 + 0.3917i | 0.4657 + 0.3917i | 0.4846 + 0.2895i | 0.4846 + 0.2895i | 0.4846 + 0.2895i | 0.4846 + 0.2895i |
| 20.5 | 0.4208 + 0.4471i | 0.4208 + 0.4471i | 0.4208 + 0.4471i | 0.4208 + 0.4471i | 0.4110 + 0.3182i | 0.4110 + 0.3182i | 0.4110 + 0.3182i | 0.4110 + 0.3182i |
| 21 | 0.4198 + 0.4245i | 0.4198 + 0.4245i | 0.4198 + 0.4245i | 0.4198 + 0.4245i | 0.4204 + 0.2992i | 0.4204 + 0.2992i | 0.4204 + 0.2992i | 0.4204 + 0.2992i |
| 21.5 | 0.4260 + 0.4246i | 0.4260 + 0.4246i | 0.4260 + 0.4246i | 0.4260 + 0.4246i | 0.4352 + 0.2986i | 0.4352 + 0.2986i | 0.4352 + 0.2986i | 0.4352 + 0.2986i |
| 22 | 0.4231 + 0.4203i | 0.4231 + 0.4203i | 0.4231 + 0.4203i | 0.4231 + 0.4203i | 0.4238 + 0.2942i | 0.4238 + 0.2942i | 0.4238 + 0.2942i | 0.4238 + 0.2942i |
| 22.5 | 0.4230 + 0.4251i | 0.4230 + 0.4251i | 0.4230 + 0.4251i | 0.4230 + 0.4251i | 0.4273 + 0.2986i | 0.4273 + 0.2986i | 0.4273 + 0.2986i | 0.4273 + 0.2986i |

-continued

| | | | | | | | | |
|---|---|---|---|---|---|---|---|---|
| 23 | 0.4211 + 0.4201i | 0.4211 + 0.4201i | 0.4211 + 0.4201i | 0.4211 + 0.4201i | 0.4266 + 0.2914i | 0.4266 + 0.2914i | 0.4266 + 0.2914i | 0.4266 + 0.2914i |
| 23.5 | 0.4239 + 0.4187i | 0.4239 + 0.4187i | 0.4239 + 0.4187i | 0.4239 + 0.4187i | 0.4248 + 0.2925i | 0.4248 + 0.2925i | 0.4248 + 0.2925i | 0.4248 + 0.2925i |
| 24 | 0.4175 + 0.4190i | 0.4175 + 0.4190i | 0.4175 + 0.4190i | 0.3992 + 0.3999i | 0.4150 + 0.2873i | 0.4150 + 0.2873i | 0.4150 + 0.2873i | 0.4150 + 0.2873i |
| 24.5 | 0.4441 + 0.4330i | 0.4456 + 0.3871i | 0.4061 + 0.4315i | 0.4061 + 0.3880i | 0.4440 + 0.2800i | 0.4440 + 0.2800i | 0.4014 + 0.2816i | 0.4014 + 0.2816i |
| 25 | 0.4605 + 0.4369i | 0.4656 + 0.3853i | 0.4012 + 0.4314i | 0.4034 + 0.3820i | 0.4707 + 0.2825i | 0.4707 + 0.2825i | 0.4058 + 0.2804i | 0.4058 + 0.2804i |
| 25.5 | 0.4659 + 0.4740i | 0.4613 + 0.4078i | 0.3989 + 0.4774i | 0.3958 + 0.4114i | 0.4488 + 0.2770i | 0.4545 + 0.3309i | 0.3879 + 0.2805i | 0.3914 + 0.3357i |
| 26 | 0.4896 + 0.4720i | 0.4932 + 0.4049i | 0.4193 + 0.4606i | 0.4242 + 0.4025i | 0.4987 + 0.2781i | 0.4969 + 0.3245i | 0.4217 + 0.2807i | 0.4195 + 0.3226i |
| 26.5 | 0.4795 + 0.4819i | 0.4925 + 0.4148i | 0.4080 + 0.4687i | 0.4168 + 0.4091i | 0.4942 + 0.2865i | 0.4967 + 0.3440i | 0.4169 + 0.2892i | 0.4181 + 0.3435i |
| 27 | 0.4961 + 0.4776i | 0.4761 + 0.4203i | 0.4122 + 0.4857i | 0.4125 + 0.4173i | 0.4776 + 0.2777i | 0.4790 + 0.3514i | 0.4145 + 0.2787i | 0.4149 + 0.3453i |
| 27.5 | 0.4894 + 0.4920i | 0.4859 + 0.4203i | 0.4207 + 0.4950i | 0.4201 + 0.4209i | 0.4953 + 0.2912i | 0.5006 + 0.3617i | 0.4249 + 0.2903i | 0.4218 + 0.3534i |
| 28 | 0.4912 + 0.4863i | 0.4759 + 0.4288i | 0.4092 + 0.4951i | 0.4078 + 0.4275i | 0.4796 + 0.2942i | 0.4808 + 0.3655i | 0.4118 + 0.2932i | 0.4092 + 0.35901 |

| SNR/w | w248 | w249 | w250 | w251 | w252 | w253 | w254 | w255 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.5153 + 0.2942i | 0.5153 + 0.2942i | 0.4478 + 0.2496i | 0.4478 + 0.2496i |
| 8 | 0.5261 + 0.2715i | 0.5261 + 0.2715i | 0.5261 + 0.2715i | 0.5261 + 0.2715i | 0.5261 + 0.2715i | 0.5261 + 0.2715i | 0.5261 + 0.2715i | 0.5261 + 0.2715i |
| 8.5 | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i |
| 9 | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i |
| 9.5 | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i |
| 10 | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i |
| 10.5 | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i |
| 11 | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i |
| 11.5 | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i |
| 13.5 | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i |
| 14.5 | 0.5322 + 0.3087i | 0.5322 + 0.3087i | 0.5322 + 0.3087i | 0.5322 + 0.3087i | 0.5322 + 0.3087i | 0.5322 + 0.3087i | 0.5322 + 0.3087i | 0.5322 + 0.3087i |
| 15 | 0.3819 + 0.3404i | 0.3819 + 0.3404i | 0.3819 + 0.3404i | 0.3819 + 0.3404i | 0.3819 + 0.3404i | 0.3819 + 0.3404i | 0.3819 + 0.3404i | 0.3819 + 0.3404i |
| 15.5 | 0.3793 + 0.3446i | 0.3793 + 0.3446i | 0.3793 + 0.3446i | 0.3793 + 0.3446i | 0.3793 + 0.3446i | 0.3793 + 0.3446i | 0.3793 + 0.3446i | 0.3793 + 0.3446i |
| 16 | 0.3517 + 0.3604i | 0.3517 + 0.3604i | 0.3517 + 0.3604i | 0.3517 + 0.3604i | 0.3517 + 0.3604i | 0.3517 + 0.3604i | 0.3517 + 0.3604i | 0.3517 + 0.3604i |
| 16.5 | 0.3493 + 0.3492i | 0.3493 + 0.3492i | 0.3493 + 0.3492i | 0.3493 + 0.3492i | 0.3493 + 0.3492i | 0.3493 + 0.3492i | 0.3493 + 0.3492i | 0.3493 + 0.3492i |
| 17 | 0.3543 + 0.3548i | 0.3543 + 0.3548i | 0.3543 + 0.3548i | 0.3543 + 0.3548i | 0.3347 + 0.3351i | 0.3347 + 0.3351i | 0.3347 + 0.3351i | 0.3347 + 0.3351i |
| 17.5 | 0.3287 + 0.3561i | 0.3287 + 0.3561i | 0.3287 + 0.3561i | 0.3287 + 0.3561i | 0.3297 + 0.3292i | 0.3287 + 0.3561i | 0.3297 + 0.3292i | 0.3287 + 0.3561i |
| 18 | 0.3203 + 0.3731i | 0.3203 + 0.3731i | 0.3203 + 0.3731i | 0.3203 + 0.3731i | 0.3218 + 0.3219i | 0.3218 + 0.3219i | 0.3218 + 0.3219i | 0.3218 + 0.3219i |
| 18.5 | 0.2964 + 0.4577i | 0.2964 + 0.4577i | 0.2964 + 0.4577i | 0.2964 + 0.4577i | 0.2878 + 0.3423i | 0.2878 + 0.3423i | 0.3146 + 0.3407i | 0.3146 + 0.3407i |
| 19 | 0.2905 + 0.4851i | 0.2905 + 0.4851i | 0.2905 + 0.4851i | 0.2905 + 0.4851i | 0.2795 + 0.3492i | 0.2795 + 0.3492i | 0.2795 + 0.3492i | 0.2795 + 0.3492i |
| 19.5 | 0.2875 + 0.5020i | 0.2875 + 0.5020i | 0.2875 + 0.5020i | 0.2875 + 0.5020i | 0.2736 + 0.3578i | 0.2736 + 0.3578i | 0.2736 + 0.3578i | 0.2736 + 0.3578i |
| 20 | 0.3343 + 0.3601i | 0.3343 + 0.3601i | 0.3343 + 0.3601i | 0.3343 + 0.3601i | 0.3464 + 0.2743i | 0.3464 + 0.2743i | 0.3464 + 0.2743i | 0.3464 + 0.2743i |

-continued

| | | | | | | | | |
|---|---|---|---|---|---|---|---|---|
| 20.5 | 0.2984 + 0.4519i | 0.2984 + 0.4519i | 0.2984 + 0.4519i | 0.2984 + 0.4519i | 0.2937 + 0.3207i | 0.2937 + 0.3207i | 0.2937 + 0.3207i | 0.2937 + 0.3207i |
| 21 | 0.2958 + 0.4274i | 0.2958 + 0.4274i | 0.2958 + 0.4274i | 0.2958 + 0.4274i | 0.2956 + 0.3006i | 0.2956 + 0.3006i | 0.2956 + 0.3006i | 0.2956 + 0.3006i |
| 21.5 | 0.2982 + 0.4164i | 0.2982 + 0.4164i | 0.2982 + 0.4164i | 0.2982 + 0.4164i | 0.3055 + 0.2919i | 0.3055 + 0.2919i | 0.3055 + 0.2919i | 0.3055 + 0.2919i |
| 22 | 0.2967 + 0.4234i | 0.2967 + 0.4234i | 0.2967 + 0.4234i | 0.2967 + 0.4234i | 0.2960 + 0.2956i | 0.2960 + 0.2956i | 0.2960 + 0.2956i | 0.2960 + 0.2956i |
| 22.5 | 0.2956 + 0.4208i | 0.2956 + 0.4208i | 0.2956 + 0.4208i | 0.2956 + 0.4208i | 0.3008 + 0.2941i | 0.3008 + 0.2941i | 0.3008 + 0.2941i | 0.3008 + 0.2941i |
| 23 | 0.2959 + 0.4148i | 0.2959 + 0.4148i | 0.2959 + 0.4148i | 0.2959 + 0.4148i | 0.2939 + 0.2903i | 0.2939 + 0.2903i | 0.2939 + 0.2903i | 0.2939 + 0.2903i |
| 23.5 | 0.2964 + 0.4164i | 0.2964 + 0.4164i | 0.2964 + 0.4164i | 0.2964 + 0.4164i | 0.2968 + 0.2905i | 0.2968 + 0.2905i | 0.2968 + 0.2905i | 0.2968 + 0.2905i |
| 24 | 0.2865 + 0.4155i | 0.2865 + 0.4155i | 0.2865 + 0.4155i | 0.2865 + 0.4155i | 0.2882 + 0.2887i | 0.2882 + 0.2887i | 0.2882 + 0.2887i | 0.2882 + 0.2887i |
| 24.5 | 0.2967 + 0.4295i | 0.2962 + 0.3915i | 0.2967 + 0.4295i | 0.2962 + 0.3915i | 0.2924 + 0.2853i | 0.2924 + 0.2853i | 0.2924 + 0.2853i | 0.2924 + 0.2853i |
| 25 | 0.2771 + 0.4268i | 0.2768 + 0.3791i | 0.3135 + 0.4278i | 0.3155 + 0.3799i | 0.2771 + 0.2770i | 0.2771 + 0.2770i | 0.3194 + 0.2780i | 0.3194 + 0.2780i |
| 25.5 | 0.2679 + 0.4831i | 0.2671 + 0.4177i | 0.3196 + 0.4813i | 0.3153 + 0.4153i | 0.2642 + 0.2859i | 0.2656 + 0.3405i | 0.3076 + 0.2846i | 0.3109 + 0.3393i |
| 26 | 0.2901 + 0.4652i | 0.2841 + 0.4025i | 0.3477 + 0.4578i | 0.3484 + 0.3989i | 0.2773 + 0.2828i | 0.2787 + 0.3328i | 0.3433 + 0.2843i | 0.3468 + 0.3291i |
| 26.5 | 0.2625 + 0.4607i | 0.2678 + 0.3993i | 0.3331 + 0.4633i | 0.3357 + 0.4044i | 0.2800 + 0.2739i | 0.2750 + 0.3327i | 0.3456 + 0.2833i | 0.3396 + 0.3394i |
| 27 | 0.2775 + 0.4791i | 0.2786 + 0.4104i | 0.3419 + 0.4815i | 0.3447 + 0.4116i | 0.2784 + 0.2816i | 0.2788 + 0.3435i | 0.3453 + 0.2801i | 0.3462 + 0.3431i |
| 27.5 | 0.2845 + 0.4908i | 0.2855 + 0.4209i | 0.3510 + 0.4925i | 0.3519 + 0.4213i | 0.2848 + 0.2876i | 0.2849 + 0.3525i | 0.3530 + 0.2885i | 0.3520 + 0.3524i |
| 28 | 0.2735 + 0.4926i | 0.2751 + 0.4223i | 0.3391 + 0.4945i | 0.3402 + 0.4252i | 0.2814 + 0.2854i | 0.2775 + 0.3535i | 0.3445 + 0.2894i | 0.3418 + 0.35661 |

Figure 18A:
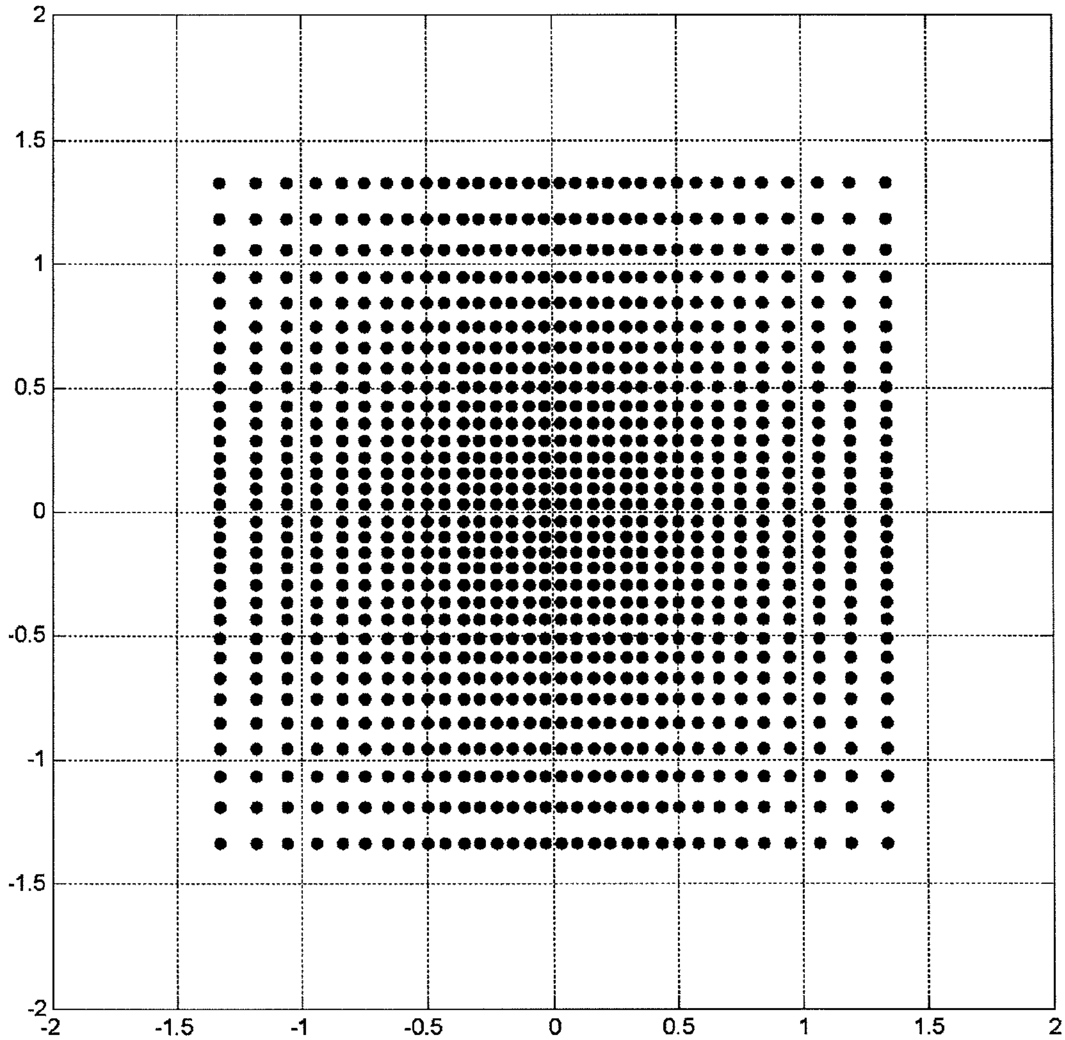
FIG. 18 shows diagrams illustrating non-uniform 1024-QAM constellations.
Figure 18B:
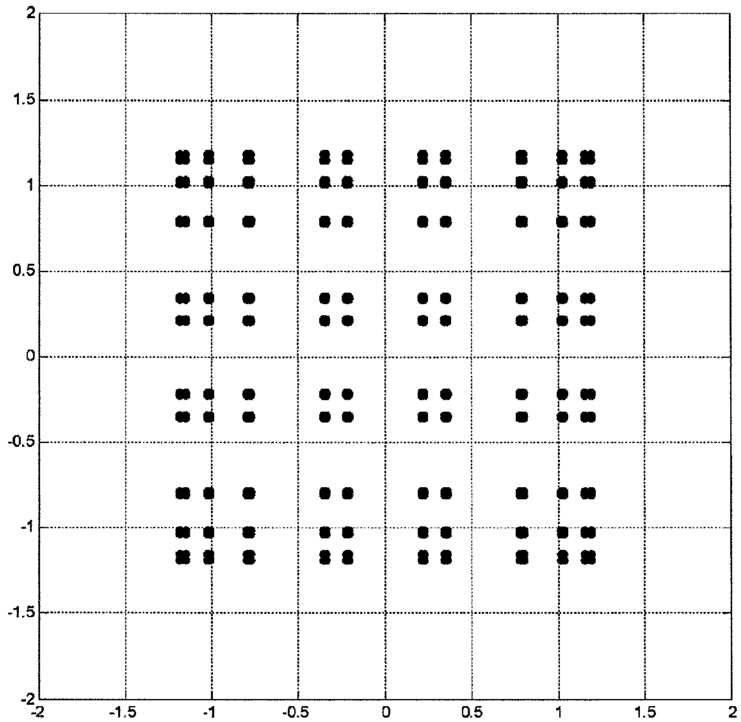
Figure 18C:
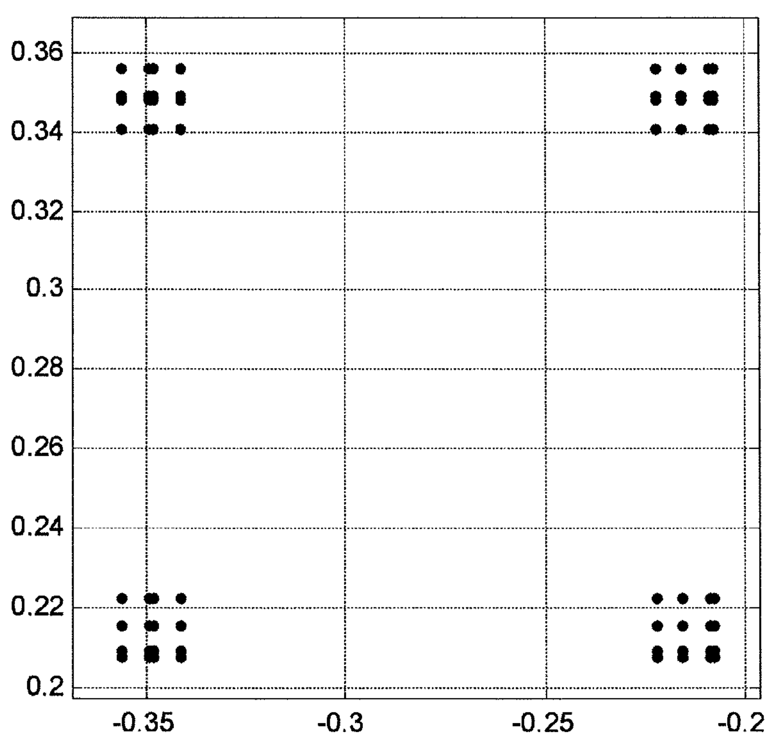

For further illustration FIG. 18 exemplary shows two of the proposed 1024-$N^2$-NUCs optimized for 27 dB SNR (FIG. 18A) and 8 dB SNR (FIG. 18B) and an enlargement of the $N^2$-NUC optimized for 8 dB SNR (FIG. 18C), illustrating that several constellation points tend to merge at low SNR.

Figure 19A:
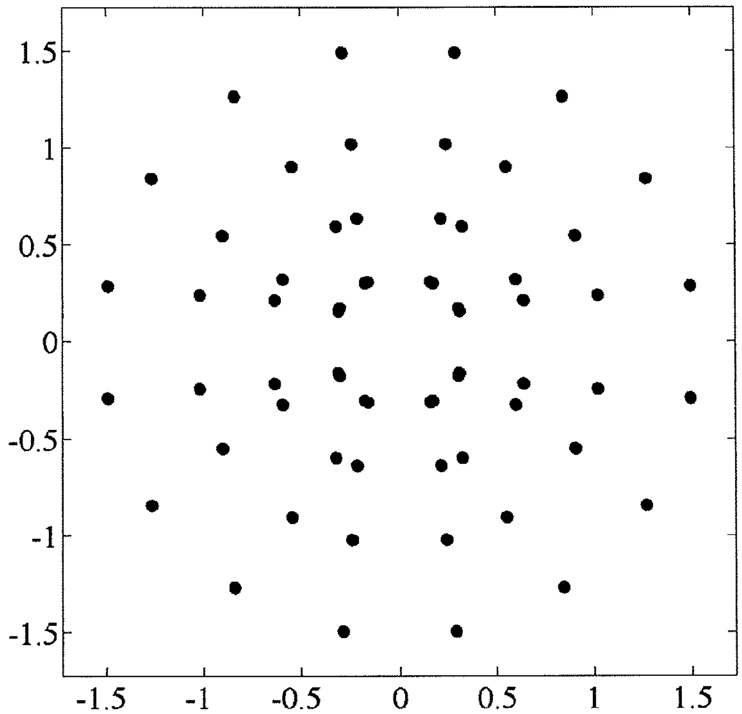
FIG. 19 shows diagrams illustrating non-uniform 64-QQAM constellations.
Figure 19B:
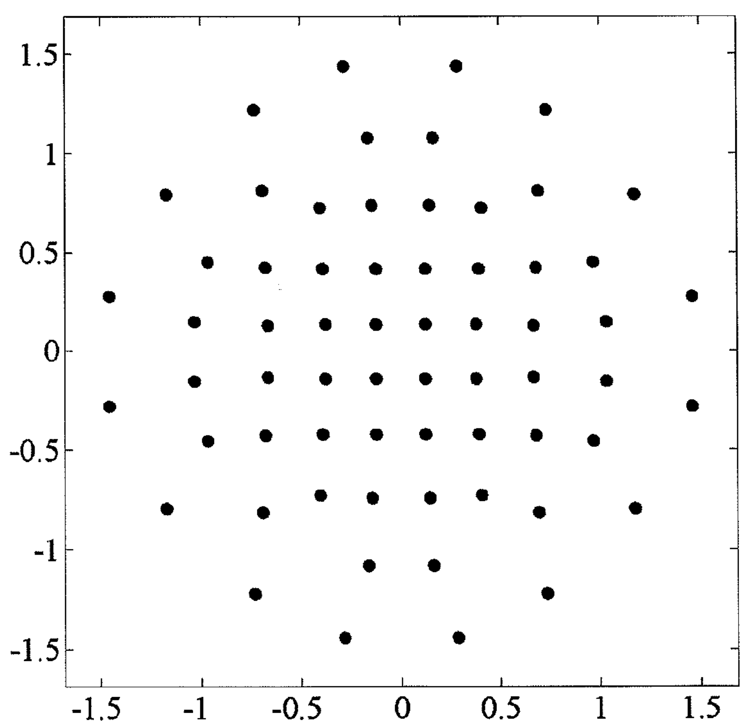

FIG. 19 exemplary shows two 64-QNUCs optimized for 10 dB SNR (FIG. 19A) and 15 dB SNR (FIG. 19B). In contrast to the rectangular shaped $N^2$-NUCs, the QNUC constellations have a circular shape, reducing the peak-power of the constellation compared to $N^2$-NUCs, by avoiding the constellation points near the corner. The constellation points of large QNUCs tend to merge in the same way like $N^2$-NUCs when being optimized at low SNR. This is e.g. the case in the inner circle of the 64-QNUC optimized at 10 dB target SNR shown in FIG. 19A.

The condensation of constellations, especially if optimized for very low SNR, may sometimes lead to (complete) puncturing of the least significant bits of the constellation. This is for example the case for a 256-$N^2$-NUC optimized for 0 dB SNR, which results in a QPSK constellation with all 64 constellation points of one quadrant having exactly the same constellation point position. When demapping such a constellation in the receiver, the first two bits can be restored by means of the four different constellation point positions. In case of an uncoded system the remaining 6 least significant bits could not be restored. This is however possible using a BICM chain with state-of-the-art forward error correction codes, which is able to correct the remaining bits based on the information of the two most significant bits. Such a BICM chain, as e.g. conventionally used in systems according to various DVB standards, is thus preferably used in the transmitter and the receiver of a communication system according to the present disclosure. Preferably, the use of such a BICM chain is assumed to be used when performing an optimization of the constellations, and the BICM capacity is the target capacity during the optimization process. In th extreme example mentioned above, it would alternatively possible to directly transmit a QPSK constellation carrying only 2 bits per constellation symbol to avoid the increased demapping complexity. For higher SNR the transmission of condensed non-uniform constellations with very high order is however advantageous from a performance perspective compared to smaller non-uniform constellations.

Obviously, numerous modifications and variations of the present disclosure are possible in light of the above teachings. It is therefore to be understood that within the scope of the appended claims, the disclosure may be practiced otherwise than as specifically described herein (e.g., if the NUC position vectors are rounded to a smaller number of digits).

In the claims, the word “comprising” does not exclude other elements or steps, and the indefinite article “a” or “an” does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

A circuit that may be used for implementing one or more of the elements of the claimed apparatus is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

Any reference signs in the claims should not be construed as limiting the scope.

The invention claimed is:

1. A coding and modulation apparatus comprising:

encoder circuitry configured to encode input data into cell words; and modulator circuitry configured to modulate said cell words into constellation values of a non-uniform constellation, wherein said modulator circuitry is configured to use, based on a total number M of constellation points of the constellation and a signal-to-noise ratio SNR in dB, a non-uniform constellation from a group of constellations comprising one or more constellations defined by a constellation position vector comprising a predetermined number of constellation positions, and in one or more constellation position vectors, two or more constellation positions are identical resulting from a condensation of previously optimized preliminary constellation positions.

2. The coding and modulation apparatus as claimed in claim 1, wherein said modulator circuitry is configured to use, based on the total number M of constellation points of the constellation, the signal-to-noise ratio SNR in dB and channel characteristics, the non-uniform constellation from the group of constellations comprising one or more of the following constellations defined by the constellation position vector u comprising the predetermined number v of constellation positions, wherein v=sqrt(M)/2−1:

a1) 64-QAM/8-PAM for the AWGN channel (maximum penalty of 0.001 b/s/Hz)

0.0 dB: u=[3×1.000]
1.0 dB: u=[3×1.000]
2.0 dB: u=[0.735, 1.000, 1.485]
3.0 dB: u=[1.000, 2×2.265]
4.0 dB: u=[1.000, 2×2.842]
5.0 dB: u=[1.000, 2×3.337]
6.0 dB: u=[1.000, 2×3.672]
7.0 dB: u=[1.000, 2×3.774]

b1) 256-QAM/16-PAM for the AWGN channel (maximum penalty of 0.001 b/s/Hz)

0.0 dB: u=[7×1.000]
1.0 dB: u=[7×1.000]
2.0 dB: u=[0.856, 0.650, 0.731, 1.000, 0.856, 1.222, 1.488]
3.0 dB: u=[3×1.000, 4×2.265]
4.0 dB: u=[3×1.000, 4×2.843]
5.0 dB: u=[3×1.000, 4×3.337]
6.0 dB: u=[3×1.000, 4×3.672]
7.0 dB: u=[3×1.000, 4×3.773]
8.0 dB: u=[1.000, 1.208, 1.000, 3.633, 3.258, 3.633, 5.360]
9.0 dB: u=[1.000, 1.284, 1.000, 3.634, 3.295, 3.634, 5.668]
10.0 dB: u=[1.000, 1.498, 1.335, 2×3.680, 4.472, 6.457]
11.0 dB: u=[1.000, 2×1.811, 3.971, 4.204, 5.712, 7.600]
12.0 dB: u=[1.000, 2×2.219, 4.347, 4.737, 6.667, 8.767]
13.0 dB: u=[1.000, 2×2.620, 4.719, 5.258, 7.485, 9.942]
14.0 dB: u=[1.000, 2×2.885, 4.980, 5.626, 8.030, 10.779]

c1) 1024-QAM/32-PAM for the AWGN channel (maximum penalty of 0.001 b/s/Hz)

0.0 dB: u=[15×1.000]
1.0 dB: u=[15×1.000]
2.0 dB: u=[1.000, 2×0.901, 4×0.703, 2×1.000, 2×0.901, 1.335, 1.279, 1.455, 1.528]
3.0 dB: u=[7×1.000, 8×2.266]
4.0 dB: u=[7×1.000, 8×2.849]
5.0 dB: u=[7×1.000, 8×3.336]
6.0 dB: u=[7×1.000, 8×3.668]
7.0 dB: u=[7×1.000, 3.718, 3.300, 3.091, 3.300, 3.718, 3.300, 3.718, 5.583]
8.0 dB: u=[1.096, 1.205, 1.096, 1.205, 1.324, 1.205, 1.096, 4.305, 3.869, 3.666, 3.869, 4.305, 3.869, 4.305, 6.936]
9.0 dB: u=[1.000, 2×1.165, 2×1.360, 2×1.165, 2×4.032, 2×3.692, 2×4.032, 4.948, 7.121]
10.0 dB: u=[1.000, 2×1.219, 2×1.492, 2×1.219, 3.933, 4.288, 3.933, 3.690, 3.933, 4.288, 5.679, 7.550]
11.0 dB: u=[3×1.000, 4×1.827, 3.963, 4.112, 4.265, 4.112, 6.203, 5.835, 6.203, 8.623]
12.0 dB: u=[3×1.000, 4×2.254, 4.402, 4.576, 4.777, 4.576, 7.086, 6.839, 7.301, 9.870]
13.0 dB: u=[3×1.000, 4×2.605, 2×4.764, 2×5.165, 7.361, 7.583, 8.742, 11.047]
14.0 dB: u=[3×1.000, 4×2.852, 2×4.972, 2×5.531, 7.724, 8.140, 9.778, 12.105]
15.0 dB: u=[3×1.000, 2×2.931, 2×3.051, 2×5.104, 5.716, 5.814, 7.961, 8.482, 10.428, 12.892]
16.0 dB: u=[3×1.000, 2×2.974, 2×3.152, 2×5.173, 5.831, 6.002, 8.071, 8.636, 10.752, 13.319]
17.0 dB: u=[3×1.000, 2×2.951, 2×3.234, 2×5.161, 5.943, 6.163, 8.073, 8.669, 10.809, 13.379]
18.0 dB: u=[1.000, 2×1.226, 2×3.176, 2×3.747, 2×5.686, 6.923, 7.165, 9.065, 9.785, 12.083, 14.863]
19.0 dB: u=[1.000, 2×1.714, 2×3.689, 2×4.830, 2×6.860, 8.634, 8.952, 11.029, 12.021, 14.586, 17.762]
20.0 dB: u=[1.000, 2×2.547, 2×4.588, 2×6.419, 2×8.668, 10.896, 11.417, 13.777, 15.283, 18.195, 21.909]
21.0 dB: u=[1.000, 2×2.877, 2×4.945, 2×7.032, 9.280, 9.499, 11.722, 12.522, 14.875, 16.901, 19.832, 23.605]
22.0 dB: u=[1.000, 2×2.988, 2×5.065, 2×7.242, 9.445, 9.858, 11.970, 13.095, 15.312, 17.587, 20.467, 24.094]
23.0 dB: u=[1.000, 2×3.011, 2×5.091, 7.151, 7.425, 9.376, 10.130, 12.040, 13.561, 15.616, 17.939, 20.714, 24.127]
24.0 dB: u=[1.000, 2×3.017, 4.976, 5.229, 7.039, 7.672, 9.386, 10.592, 12.301, 14.031, 16.039, 18.330, 20.996, 24.207]

d1) 4096-QAM/32-PAM for the AWGN channel (maximum penalty of 0.001 b/s/Hz)

0.0 dB: u=[31×1.000]
1.0 dB: u=[31×1.000]
2.0 dB: u=[15×1.000, 16×1.566]
3.0 dB: u=[15×1.000, 16×2.265]
4.0 dB: u=[15×1.000, 16×2.840]
5.0 dB: u=[15×1.000, 16×3.336]
6.0 dB: u=[15×1.000, 16×3.673]
7.0 dB: u=[15×1.000, 3.525, 3.931, 3.525, 3.321, 3.186, 3.321, 3.525, 3.321, 3.525, 3.931, 3.525, 3.321, 3.525, 3.931, 6.619, 3.931]
8.0 dB: u=[4×1.000, 1.104, 3×1.000, 1.104, 1.177, 1.104, 1.000, 1.104, 2×1.000, 4.116, 3.703, 3.508, 3.703, 3.508, 3.382, 3.508, 3.703, 4.116, 3.703, 3.508, 3.703, 4.116, 3.703, 4.116, 7.045]
9.0 dB: u=[1.000, 2×1.113, 2×1.244, 2×1.113, 2×1.244, 1.359, 1.417, 2×1.244, 2×1.113, 4.102, 4.573, 4.102, 3.833, 3.679, 3.833, 4.102, 3.833, 4.102, 4.573, 4.102, 3.833, 4.102, 4.573, 6.278, 8.039]

10.0 dB: u=[3×1.000, 4×1.111, 4×1.530, 4×1.367, 3.739, 3.831, 4.032, 3.911, 3.831, 3.911, 3.831, 3.739, 4.416, 4.655, 4.789, 4.606, 2×5.823, 6.640, 8.423]

11.0 dB: u=[7×1.000, 8×1.818, 2×3.970, 2×4.102, 2×4.235, 2×4.102, 6.038, 6.345, 5.947, 5.745, 6.038, 6.345, 7.640, 9.593]

12.0 dB: u=[7×1.000, 8×2.235, 2×4.392, 2×4.554, 2×4.735, 2×4.554, 6.942, 7.383, 6.942, 6.693, 6.942, 7.383, 8.823, 10.982]

13.0 dB: u=[7×1.000, 8×2.617, 4×4.814, 4×5.138, 7.415, 2×7.705, 7.415, 8.210, 8.760, 9.982, 12.237]

14.0 dB: u=[7×1.000, 8×2.850, 4×4.972, 4×5.521, 2×7.763, 2×8.079, 9.585, 9.912, 11.037, 13.294]

15.0 dB: u=[7×1.000, 4×2.928, 4×3.046, 4×5.103, 4×5.753, 2×7.981, 2×8.417, 10.138, 10.576, 11.955, 14.209]

16.0 dB: u=[7×1.000, 4×2.972, 4×3.145, 4×5.170, 2×5.823, 2×5.973, 2×8.065, 2×8.590, 10.431, 10.930, 12.610, 14.901]

17.0 dB: u=[7×1.000, 4×2.958, 4×3.220, 4×5.164, 2×5.918, 2×6.124, 2×8.062, 2×8.636, 10.521, 11.028, 12.897, 15.237]

18.0 dB: u=[3×1.000, 4×1.189, 4×3.142, 4×3.651, 4×5.593, 2×6.744, 2×6.971, 2×8.871, 9.455, 9.648, 11.569, 12.124, 14.220, 16.768]

19.0 dB: u=[3×1.000, 4×1.583, 4×3.546, 4×4.556, 4×6.550, 2×8.227, 2×8.504, 2×10.528, 11.281, 11.554, 13.629, 14.307, 16.686, 19.573]

20.0 dB: u=[3×1.000, 4×2.458, 4×4.492, 4×6.251, 4×8.473, 2×10.667, 2×11.113, 2×13.465, 14.623, 14.994, 17.348, 18.281, 21.118, 24.602]

21.0 dB: u=[3×1.000, 4×2.842, 4×4.906, 4×6.964, 4×9.303, 2×11.630, 2×12.349, 2×14.708, 16.380, 16.840, 19.124, 20.381, 23.243, 26.857]

22.0 dB: u=[3×1.000, 4×2.971, 4×5.048, 4×7.211, 2×9.432, 2×9.772, 2×11.925, 2×12.920, 2×15.175, 17.084, 17.716, 19.872, 21.565, 24.287, 27.805]

23.0 dB: u=[3×1.000, 4×3.008, 4×5.087, 2×7.172, 2×7.381, 2×9.393, 2×10.022, 2×11.988, 2×13.375, 15.346, 15.561, 17.434, 18.215, 20.268, 22.212, 24.831, 28.169]

24.0 dB: u=[3×1.000, 4×3.015, 2×5.007, 2×5.178, 2×7.069, 2×7.547, 2×9.337, 2×10.376, 2×12.134, 2×13.791, 15.616, 15.985, 17.760, 18.781, 20.693, 22.738, 25.267, 28.415]

25.0 dB: u=[3×1.000, 2×2.913, 2×3.130, 2×4.892, 2×5.384, 2×7.025, 2×7.968, 2×9.534, 2×10.914, 2×12.555, 14.212, 14.407, 16.054, 16.647, 18.303, 19.611, 21.420, 23.482, 25.937, 28.932]

26.0 dB: u=[1.000, 2×2.141, 2×4.125, 2×5.413, 2×7.372, 2×8.904, 2×10.870, 2×12.675, 2×14.736, 2×16.835, 2×19.148, 21.465, 21.902, 24.118, 25.242, 27.472, 29.544, 32.086, 35.010, 38.427, 42.552]

27.0 dB: u=[1.000, 2×2.790, 2×4.801, 2×6.655, 2×8.706, 2×10.682, 2×12.820, 2×14.977, 2×17.286, 2×19.711, 22.498, 22.182, 25.727, 24.851, 29.748, 28.013, 34.572, 32.089, 40.637, 37.412, 45.092, 49.504]

28.0 dB: u=[1.000, 2×2.952, 2×4.969, 2×6.972, 2×9.048, 2×11.145, 2×13.331, 2×15.586, 2×17.958, 20.313, 20.628, 22.838, 23.639, 25.745, 27.254, 29.338, 31.413, 33.756, 36.326, 39.189, 42.387, 46.003, 50.241]

29.0 dB: u=[1.000, 2×2.994, 2×5.014, 2×7.048, 2×9.124, 2×11.244, 2×13.431, 2×15.694, 17.879, 18.274, 20.259, 21.134, 23.005, 24.437, 26.277, 28.091, 30.092, 32.230, 34.555, 37.093, 39.868, 42.923, 46.331, 50.284]

30.0 dB: u=[1.000, 2×3.001, 2×5.017, 2×7.054, 2×9.124, 2×11.238, 13.270, 13.576, 15.421, 16.084, 17.796, 18.910, 20.535, 21.978, 23.627, 25.285, 27.064, 28.931, 30.927, 33.057, 35.346, 37.807, 40.470, 43.372, 46.582, 50.264]

31.0 dB: u=[1.000, 2×3.003, 2×5.020, 2×7.066, 8.953, 9.409, 11.049, 11.848, 13.368, 14.480, 15.939, 17.246, 18.719, 20.155, 21.693, 23.254, 24.898, 26.606, 28.405, 30.298, 32.300, 34.422, 36.678, 39.084, 41.662, 44.449, 47.509, 50.990]

e1) 16384-QAM/64-PAM for the AWGN channel (maximum penalty of 0.001 b/s/Hz)

0.0 dB: u=[63×1.000]

1.0 dB: u=[63×1.000]

2.0 dB: u=[15×1.000, 16×0.857, 16×1.303, 16×1.605]

3.0 dB: u=[31×1.000, 32×2.177]

4.0 dB: u=[31×1.000, 32×2.836]

5.0 dB: u=[31×1.000, 32×3.333]

6.0 dB: u=[31×1.000, 32×3.673]

7.0 dB: u=[31×1.000, 4.090, 3.724, 3.530, 3.724, 3.530, 3.397, 3.530, 3.724, 3.530, 3.397, 3.293, 3.397, 3.530, 3.397, 3.530, 3.724, 4.090, 3.724, 3.530, 3.724, 3.530, 3.397, 3.530, 3.724, 4.090, 3.724, 3.530, 3.724, 4.090, 3.724, 4.090, 7.483]

8.0 dB: u=[9×1.000, 1.086, 1.119, 6×1.000, 1.086, 1.119, 1.192, 1.157, 1.086, 1.119, 2×1.000, 1.086, 1.119, 4×1.000, 3.919, 4.323, 3.813, 3.592, 3.433, 3.592, 3.813, 3.592, 3.433, 3.592, 3.433, 3.318, 3.433, 3.592, 3.813, 3.592, 3.919, 4.323, 3.813, 3.592, 3.433, 3.592, 3.813, 3.592, 3.919, 4.323, 3.813, 3.592, 3.919, 4.323, 6.290, 7.685]

9.0 dB: u=[3×1.000, 4×1.114, 4×1.248, 4×1.114, 4×1.248, 4×1.394, 4×1.248, 4×1.114, 4.104, 4.287, 4.682, 4.443, 3.991, 4.104, 2×3.847, 3.661, 3.724, 2×3.847, 3.991, 4.104, 2×3.847, 4.104, 4.287, 4.628, 4.443, 3.991, 4.104, 2×3.847, 4.104, 4.287, 4.682, 4.443, 6.435, 6.296, 7.265, 8.609]

10.0 dB: u=[7×1.000, 8×1.100, 8×1.533, 8×1.382, 2×3.757, 3.919, 3.867, 3.951, 4.006, 3.867, 3.817, 3.757, 3.817, 3.919, 3.867, 3.817, 3.867, 2×3.757, 4.469, 4.599, 4.706, 4.599, 4.749, 4.856, 4.803, 4.658, 6.929, 6.735, 5.877, 5.758, 5.657, 5.839, 7.481, 9.163]

11.0 dB: u=[15×1.000, 16×1.816, 4×3.966, 4×4.096, 4×4.227, 4×4.096, 5.966, 6.208, 6.437, 6.208, 5.830, 5.966, 5.830, 5.692, 5.966, 6.208, 6.437, 6.208, 2×7.705, 8.533, 10.365]

12.0 dB: u=[15×1.000, 16×2.236, 4×4.396, 4×4.557, 4×4.736, 4×4.557, 7.107, 6.911, 7.235, 7.468, 2×6.911, 6.667, 6.766, 7.107, 6.911, 7.235, 7.468, 8.912, 8.798, 11.825, 9.973]

13.0 dB: u=[15×1.000, 16×2.596, 8×4.762, 8×5.143, 2×7.305, 6×7.514, 8.446, 8.754, 8.991, 8.754, 9.766, 10.072, 11.163, 13.220]

14.0 dB: u=[15×1.000, 16×2.848, 8×4.966, 8×5.521, 2×7.743, 2×7.911, 2×8.096, 2×7.911, 9.701, 10.719, 10.201, 2×9.701, 10.719, 12.192, 14.614]

15.0 dB: u=[15×1.000, 8×2.930, 8×3.047, 8×5.104, 8×5.752, 4×7.992, 4×8.406, 10.133, 10.253, 10.611, 10.444, 11.671, 12.109, 13.242, 15.414]

16.0 dB: u=[15×1.000, 8×2.972, 8×3.143, 8×5.168, 8×5.893, 4×8.068, 4×8.577, 2×10.450, 2×10.871, 12.299, 12.764, 14.054, 16.196]

17.0 dB: u=[15×1.000, 8×2.961, 8×3.216, 8×5.166, 4×5.909, 4×6.110, 4×8.059, 4×8.622, 2×10.511, 2×10.986, 12.590, 13.067, 14.608, 16.752]

18.0 dB: u=[7×1.000, 8×1.177, 8×3.133, 8×3.621, 8×5.565, 4×6.685, 4×6.909, 4×8.812, 2×9.388, 2×9.565, 2×11.483, 2×12.019, 13.845, 14.347, 16.199, 18.548]

19.0 dB: u=[7×1.000, 8×1.532, 8×3.491, 8×4.447, 8×6.430, 4×8.063, 4×8.330, 4×10.331, 2×11.063, 2×11.316, 2×13.369, 13.926, 14.104, 16.092, 16.659, 18.836, 21.510]

20.0 dB: u=[7×1.000, 8×2.411, 8×4.441, 8×6.165, 8×8.372, 4×10.547, 4×10.967, 4×13.310, 2×14.421, 2×14.769, 2×17.128, 2×18.007, 20.513, 21.240, 23.934, 27.213]

21.0 dB: u=[7×1.000, 8×2.827, 8×4.888, 8×6.933, 8×9.263, 4×11.584, 4×12.274, 4×14.635, 2×16.276, 2×16.686, 2×18.998, 19.963, 20.339, 22.686, 23.583, 26.399, 29.858]

22.0 dB: u=[7×1.000, 8×2.965, 8×5.040, 8×7.196, 4×9.421, 4×9.742, 4×11.903, 4×12.865, 4×15.126, 2×17.021, 2×17.604, 2×19.770, 21.150, 21.593, 23.727, 24.888, 27.571, 30.969]

23.0 dB: u=[7×1.000, 8×3.005, 8×5.082, 4×7.176, 4×7.364, 4×9.397, 4×9.983, 4×11.967, 4×13.302, 2×15.294, 2×15.482, 2×17.361, 2×18.087, 2×20.145, 21.757, 22.329, 24.290, 25.813, 28.317, 31.558]

24.0 dB: u=[7×1.000, 8×3.015, 4×5.019, 4×5.165, 4×7.085, 4×7.515, 4×9.334, 4×10.309, 4×12.090, 4×13.714, 2×15.553, 2×15.876, 2×17.670, 2×18.604, 20.453, 20.612, 22.254, 22.927, 24.801, 26.551, 28.954, 32.025]

25.0 dB: u=[7×1.000, 4×2.931, 4×3.109, 4×4.911, 4×5.337, 4×7.016, 4×7.883, 4×9.478, 4×10.821, 4×12.467, 4×14.205, 2×15.954, 2×16.491, 2×18.159, 2×19.396, 21.080, 21.339, 22.964, 23.782, 25.568, 27.419, 29.759, 32.683]

26.0 dB: u=[3×1.000, 4×1.884, 4×3.855, 4×4.927, 4×6.843, 4×8.215, 4×10.105, 4×11.782, 4×13.738, 4×15.713, 4×17.893, 2×20.090, 2×20.456, 2×22.570, 2×23.555, 2×25.674, 2×27.571, 29.725, 30.253, 32.352, 33.735, 36.025, 38.572, 41.664, 45.470]

27.0 dB: u=[3×1.000, 4×2.745, 4×4.753, 4×6.566, 4×8.609, 4×10.551, 4×12.676, 4×14.803, 4×17.089, 4×19.483, 4×22.077, 2×24.582, 2×25.344, 2×27.649, 2×29.257, 2×31.590, 33.857, 34.166, 36.468, 37.390, 39.733, 41.723, 44.342, 47.359, 50.916, 55.220]

28.0 dB: u=[3×1.000, 4×2.934, 4×4.950, 4×6.934, 4×9.004, 4×11.085, 4×13.261, 4×15.500, 4×17.856, 4×20.345, 22.742, 2×23.379, 22.742, 26.883, 2×25.549, 26.883, 28.997, 2×30.983, 28.997, 36.152, 2×33.295, 35.579, 39.681, 41.897, 44.144, 38.325, 49.799, 46.784, 53.994, 58.160]

29.0 dB: u=[3×1.000, 4×2.988, 4×5.007, 4×7.036, 4×9.114, 4×11.232, 4×13.416, 4×15.675, 17.913, 2×18.177, 17.913, 20.929, 2×20.270, 20.929, 22.896, 2×24.145, 22.896, 27.774, 2×26.034, 27.774, 29.763, 2×31.861, 29.763, 37.351, 33.987, 34.372, 36.376, 41.043, 43.147, 45.453, 39.320, 50.968, 48.048, 54.910, 58.822]

30.0 dB: u=[3×1.000, 4×3.000, 4×5.016, 4×7.051, 4×9.121, 4×11.232, 4×13.405, 2×15.470, 2×15.881, 2×17.729, 2×18.570, 2×20.295, 2×21.595, 2×23.273, 2×24.873, 2×26.639, 2×28.470, 2×30.436, 32.392, 32.711, 34.547, 35.336, 37.104, 38.513, 40.306, 42.170, 44.245, 46.527, 49.052, 51.851, 54.998, 58.656]

31.0 dB: u=[3×1.000, 4×3.003, 4×5.019, 4×7.054, 4×9.125, 2×11.057, 2×11.477, 2×13.178, 2×13.960, 2×15.535, 2×16.677, 2×18.190, 2×19.557, 2×21.091, 2×22.613, 2×24.235, 2×25.904, 2×27.669, 2×29.524, 31.360, 31.656, 33.356, 34.068, 35.686, 36.918, 38.517, 40.116, 41.883, 43.779, 45.847, 48.096, 50.551, 53.249, 56.249, 59.711]

32.0 dB: u=[3×1.000, 2×2.865, 2×3.161, 2×4.833, 2×5.325, 2×6.878, 2×7.642, 2×9.090, 2×10.097, 2×11.482, 2×12.648, 2×14.021, 2×15.290, 2×16.687, 2×18.042, 2×19.489, 2×20.937, 2×22.460, 2×24.017, 2×25.645, 2×27.335, 2×29.110, 30.844, 31.130, 32.726, 33.383, 34.885, 35.997, 37.462, 38.884, 40.452, 42.102, 43.877, 45.783, 47.836, 50.050, 52.443, 55.051, 57.933, 61.231]

33.0 dB: u=[1.000, 2×2.762, 2×4.766, 2×6.547, 2×8.555, 2×10.371, 2×12.392, 2×14.256, 2×16.299, 2×18.227, 2×20.305, 2×22.314, 2×24.444, 2×26.544, 2×28.745, 2×30.954, 2×33.252, 2×35.590, 2×38.020, 2×40.522, 2×43.123, 2×45.824, 2×48.677, 51.283, 52.328, 54.547, 56.212, 58.368, 60.435, 62.704, 65.049, 67.558, 70.213, 73.046, 76.062, 79.283, 82.728, 86.428, 90.433, 94.832, 99.852]

34.0 dB: u=[1.000, 2×2.943, 2×4.950, 2×6.907, 2×8.928, 2×10.909, 2×12.948, 2×14.965, 2×17.043, 2×19.112, 2×21.236, 2×23.367, 2×25.550, 2×27.758, 2×30.021, 2×32.328, 2×34.694, 2×37.116, 2×39.612, 2×42.186, 2×44.868, 47.318, 48.209, 50.288, 51.721, 53.703, 55.498, 57.510, 59.526, 61.671, 63.886, 66.220, 68.665, 71.237, 73.948, 76.809, 79.828, 83.024, 86.409, 90.026, 93.913, 98.160, 102.946]

35.0 dB: u=[1.000, 2×2.994, 2×5.002, 2×7.004, 2×9.027, 2×11.050, 2×13.097, 2×15.150, 2×17.233, 2×19.328, 2×21.461, 2×23.614, 2×25.805, 2×28.030, 2×30.293, 2×32.600, 2×34.961, 2×37.382, 39.631, 40.214, 42.171, 43.208, 45.028, 46.443, 48.209, 49.842, 51.639, 53.417, 55.298, 57.211, 59.205, 61.266, 63.411, 65.644, 67.971, 70.400, 72.940, 75.594, 78.374, 81.287, 84.349, 87.577, 90.999, 94.654, 98.612, 103.054]

36.0 dB: u=[1.000, 2×2.999, 2×5.002, 2×7.009, 2×9.026, 2×11.051, 2×13.089, 2×15.141, 2×17.211, 2×19.300, 2×21.411, 2×23.547, 2×25.710, 2×27.910, 2×30.167, 32.203, 32.886, 34.599, 35.652, 37.258, 38.564, 40.135, 41.577, 43.166, 44.701, 46.334, 47.954, 49.649, 51.360, 53.135, 54.946, 56.821, 58.748, 60.741, 62.799, 64.931, 67.137, 69.424, 71.796, 74.259, 76.818, 79.482, 82.261, 85.166, 88.211, 91.422, 94.837, 98.522, 102.628]

37.0 dB: u=[1.000, 2×3.000, 2×5.000, 2×7.007, 2×9.021, 2×11.041, 2×13.073, 2×15.117, 2×17.179, 2×19.282, 21.172, 21.782, 23.368, 24.275, 25.758, 26.875, 28.304, 29.538, 30.962, 32.269, 33.704, 35.065, 36.522, 37.937, 39.428, 40.895, 42.428, 43.953, 45.536, 47.126, 48.764, 50.430, 52.143, 53.885, 55.680, 57.517, 59.408, 61.348, 63.347, 65.404, 67.519, 69.702, 71.955, 74.279, 76.680, 79.165, 81.738, 84.409, 87.195, 90.105, 93.161, 96.396, 99.876, 103.730]

f1) 65536-QAM/256-PAM for the AWGN channel (maximum penalty of 0.001 b/s/Hz)

0.0 dB: u=[127×1.000]

1.0 dB: u=[127×1.000]

2.0 dB: u=[31×1.000, 32×0.857, 32×1.303, 32×1.606]

3.0 dB: u=[63×1.000, 64×2.176]

4.0 dB: u=[63×1.000, 64×2.831]

5.0 dB: u=[63×1.000, 64×3.319]

6.0 dB: u=[63×1.000, 64×3.669]

7.0 dB: u=[63×1.000, 4.286, 4.177, 2×3.723, 2×3.520, 2×3.723, 2×3.520, 2×3.382, 2×3.520, 2×3.723, 2×3.520, 2×3.382, 2×3.274, 2×3.382, 2×3.520, 2×3.382, 2×3.520, 2×3.723, 4.177, 4.059, 2×3.723, 2×3.520, 2×3.723, 2×3.520, 2×3.382, 2×3.520, 2×3.723, 4.177, 4.059, 2×3.723, 2×3.520, 2×3.723, 4.059, 3.948, 2×3.723, 4.286, 4.059, 7.660, 7.196]

8.0 dB: u=[3×1.000, 4×1.065, 4×1.135, 4×1.065, 4×1.135, 4×1.210, 4×1.135, 4×1.065, 4×1.135, 4×1.210, 2×1.307, 2×1.271, 4×1.210, 4×1.135, 4×1.210, 4×1.135, 4×1.065, 4.396, 4.265, 4.661, 4.827, 4.217, 4.131, 3.934, 3.994, 2×3.769, 3.888, 3.934, 4.217, 4.131, 3.934, 3.994, 2×3.769, 3.888, 3.934, 2×3.769, 3.639, 3.667, 2×3.769, 3.888, 3.934, 4.217, 4.131, 3.934, 3.994, 4.357, 4.217, 4.612, 4.771, 4.217, 4.131, 3.934, 3.994, 2×3.769, 3.888, 3.934, 4.217, 4.131, 3.934, 3.994, 4.396, 4.265, 4.661, 4.827, 4.217, 4.131, 3.934, 3.994, 4.396, 4.265, 4.661, 4.827, 6.875, 7.071, 8.738, 7.997]

9.0 dB: u=[7×1.000, 8×1.114, 8×1.246, 8×1.114, 8×1.246, 8×1.394, 8×1.246, 8×1.114, 4.058, 4.007, 4.126, 4.204, 4.559, 4.473, 4.282, 4.368, 2×4.007, 4.085, 4.126, 3.926, 3.893, 3.811, 3.848, 3.675, 3.648, 3.701, 3.719, 2×3.848, 3.769, 3.793, 3.926, 3.893, 2×4.007, 3.848, 3.811, 3.742, 3.769, 4.126, 4.058, 4.204, 4.282, 4.645, 4.559, 4.368, 4.446, 4.058, 4.007, 4.126, 4.169, 3.960, 3.926, 2×3.848, 4.282, 4.204, 4.389, 4.473, 4.842, 4.760, 4.559, 4.645, 6.428, 6.464, 2×6.299, 7.158, 7.425, 9.044, 8.060]

10.0 dB: u=[15×1.000, 16×1.112, 16×1.529, 16×1.366, 8×3.826, 2×4.002, 4.037, 4.002, 20×3.826, 4.387, 4.444, 4.508, 4.444, 4.652, 4.726, 4.652, 4.576, 4.698, 4.757, 4.819, 4.757, 4.605, 4.652, 4.605, 4.552, 5.668, 5.840, 6.014, 2×5.840, 5.941, 5.840, 5.713, 6.644, 2×6.764, 6.700, 7.922, 7.573, 8.152, 9.850]

11.0 dB: u=[31×1.000, 32×1.819, 8×3.973, 8×4.103, 8×4.230, 8×4.103, 6.000, 5.830, 2×6.173, 6.413, 6.316, 2×6.173, 3×5.830, 6.000, 4×5.830, 6.173, 6.000, 6.173, 6.316, 6.504, 6.413, 6.173, 6.316, 7.762, 7.561, 7.659, 7.762, 8.638, 8.805, 11.102, 9.467]

12.0 dB: u=[31×1.000, 32×2.239, 8×4.397, 8×4.560, 8×4.739, 8×4.560, 2×6.948, 7.175, 6.948, 7.345, 7.494, 7.345, 7.175, 4×6.948, 4×6.722, 2×6.948, 7.175, 6.948, 7.345, 7.494, 7.345, 7.175, 8.683, 8.878, 9.017, 8.878, 10.325, 10.078, 10.753, 12.687]

13.0 dB: u=[31×1.000, 32×2.599, 16×4.765, 16×5.147, 4×7.309, 12×7.516, 8.421, 8.513, 8.788, 8.678, 8.887, 8.993, 8.788, 8.678, 9.724, 10.019, 10.214, 10.019, 2×11.216, 12.193, 14.175]

14.0 dB: u=[31×1.000, 32×2.847, 16×4.969, 16×5.523, 8×7.770, 8×8.065, 2×9.558, 2×9.779, 2×9.973, 2×9.779, 11.057, 10.738, 11.057, 11.311, 12.391, 12.095, 15.485, 13.454]

15.0 dB: u=[31×1.000, 16×2.926, 16×3.043, 16×5.098, 16×5.749, 8×7.982, 8×8.402, 2×10.142, 2×10.256, 2×10.567, 2×10.426, 11.656, 11.941, 12.206, 11.941, 12.910, 13.365, 14.441, 16.525]

16.0 dB: u=[31×1.000, 16×2.973, 16×3.142, 16×5.170, 16×5.895, 8×8.067, 8×8.580, 4×10.456, 4×10.857, 2×12.355, 12.790, 12.637, 13.762, 14.220, 15.329, 17.384]

17.0 dB: u=[31×1.000, 16×2.960, 16×3.214, 16×5.162, 8×5.904, 8×6.106, 8×8.053, 8×8.616, 4×10.508, 4×10.968, 2×12.598, 2×13.010, 14.298, 14.760, 16.006, 18.015]

18.0 dB: u=[15×1.000, 16×1.172, 16×3.130, 16×3.608, 16×5.555, 8×6.660, 8×6.884, 8×8.787, 4×9.363, 4×9.539, 4×11.454, 4×11.982, 2×13.799, 2×14.279, 15.850, 16.337, 17.921, 20.100]

19.0 dB: u=[15×1.000, 16×1.512, 16×3.469, 16×4.404, 16×6.382, 8×7.996, 8×8.261, 8×10.249, 4×10.981, 4×11.223, 4×13.268, 4×13.898, 2×15.960, 2×16.509, 18.400, 18.930, 20.886, 23.376]

20.0 dB: u=[15×1.000, 16×2.386, 16×4.414, 16×6.118, 16×8.317, 8×10.476, 8×10.886, 8×13.219, 4×14.316, 4×14.651, 4×17.007, 4×17.863, 2×20.355, 2×21.065, 23.436, 24.086, 26.592, 29.684]

21.0 dB: u=[15×1.000, 16×2.820, 16×4.880, 16×6.919, 16×9.246, 8×11.565, 8×12.244, 8×14.603, 4×16.218, 4×16.619, 4×18.933, 2×19.883, 2×20.235, 2×22.600, 23.316, 23.603, 25.960, 26.703, 29.412, 32.727]

22.0 dB: u=[15×1.000, 16×2.962, 16×5.037, 16×7.191, 8×9.420, 8×9.735, 8×11.900, 8×12.854, 8×15.118, 4×17.008, 4×17.575, 4×19.744, 21.506, 2×21.106, 21.506, 23.668, 24.921, 24.560, 23.668, 30.643, 27.984, 27.122, 33.921]

23.0 dB: u=[15×1.000, 16×3.005, 16×5.084, 8×7.181, 8×7.363, 8×9.405, 8×9.977, 8×11.970, 8×13.288, 4×15.288, 4×15.470, 4×17.349, 4×18.064, 4×20.124, 2×21.729, 2×22.257, 2×24.230, 25.455, 25.897, 27.844, 28.971, 31.440, 34.588]

24.0 dB: u=[15×1.000, 16×3.015, 16×5.093, 8×7.092, 8×7.505, 8×9.336, 8×10.290, 8×12.080, 8×13.695, 4×15.539, 4×15.847, 4×17.647, 4×18.557, 2×20.416, 2×20.561, 2×22.200, 2×22.835, 2×24.707, 26.150, 26.691, 28.485, 29.923, 32.234, 35.223]

25.0 dB: u=[15×1.000, 8×2.937, 8×3.101, 8×4.918, 8×5.319, 8×7.013, 8×7.850, 8×9.457, 8×10.784, 8×12.431, 4×14.084, 4×14.241, 4×15.914, 4×16.431, 4×18.103, 4×19.312, 2×21.003, 2×21.239, 2×22.865, 2×23.634, 25.351, 25.491, 26.977, 27.597, 29.327, 30.957, 33.192, 36.048]

26.0 dB: u=[7×1.000, 8×1.751, 8×3.715, 8×4.672, 8×6.564, 8×7.850, 8×9.697, 8×11.309, 8×13.208, 8×15.117, 8×17.229, 4×19.360, 4×19.701, 4×21.756, 4×22.685, 4×24.742, 4×26.554, 2×28.644, 2×29.115, 2×31.151, 2×32.415, 2×34.639, 36.730, 37.664, 39.858, 42.102, 44.969, 48.567]

27.0 dB: u=[7×1.000, 8×2.720, 8×4.728, 8×6.519, 8×8.560, 8×10.483, 8×12.601, 8×14.713, 8×16.990, 8×19.369, 4×21.831, 4×22.068, 4×24.451, 4×25.169, 4×27.482, 4×29.033, 4×31.365, 2×33.614, 2×33.889, 2×36.197, 2×37.046, 2×39.387, 2×41.287, 43.650, 44.168, 46.467, 47.908, 50.441, 53.239, 56.649, 60.853]

28.0 dB: u=[7×1.000, 8×2.928, 8×4.944, 8×6.920, 8×8.990, 8×11.065, 8×13.238, 8×15.473, 8×17.828, 8×20.314, 4×22.720, 4×23.310, 4×25.501, 4×26.777, 4×28.909, 4×30.873, 4×33.178, 2×35.463, 2×35.988, 2×38.173, 2×39.456, 2×41.675, 2×43.881, 46.184, 47.022, 49.238, 51.105, 53.590, 56.454, 59.836, 63.927]

29.0 dB: u=[7×1.000, 8×2.986, 8×5.004, 8×7.032, 8×9.109, 8×11.223, 8×13.408, 8×15.666, 8×18.031, 4×20.270, 4×20.866, 4×22.862, 4×24.045, 4×25.955, 4×27.666, 4×29.653, 4×31.738, 2×33.870, 2×34.214, 2×36.235, 2×37.137, 2×39.119, 2×40.782, 2×42.873, 44.936, 45.426, 47.419, 48.625, 50.667, 52.731, 55.171, 57.969, 61.203, 65.058]

30.0 dB: u=[7×1.000, 8×3.001, 8×5.020, 8×7.057, 8×9.131, 8×11.246, 8×13.421, 4×15.511, 4×15.856, 4×17.754, 4×18.499, 4×20.268, 4×21.504, 4×23.204,

4×24.782, 4×26.549, 4×28.369, 4×30.330, 4×32.432, 2×34.436, 2×35.132, 2×36.929, 2×38.256, 2×40.052, 2×41.875, 43.791, 44.084, 45.917, 46.719, 48.534, 50.063, 51.990, 54.102, 56.491, 59.187, 62.258, 65.870]

31.0 dB: u=[7×1.000, 8×3.003, 8×5.019, 8×7.054, 8×9.122, 4×11.083, 4×11.411, 4×13.173, 4×13.832, 4×15.460, 4×16.513, 4×18.052, 4×19.381, 4×20.921, 4×22.424, 4×24.042, 4×25.699, 4×27.454, 4×29.296, 2×31.145, 2×31.379, 2×33.117, 2×33.719, 2×35.368, 2×36.504, 2×38.110, 2×39.660, 2×41.401, 2×43.273, 45.088, 45.674, 47.329, 48.513, 50.173, 51.856, 53.758, 55.858, 58.191, 60.789, 63.713, 67.116]

32.0 dB: u=[7×1.000, 8×3.006, 4×4.882, 4×5.206, 4×6.874, 4×7.455, 4×8.995, 4×9.879, 4×11.320, 4×12.434, 4×13.833, 4×15.084, 4×16.495, 4×17.846, 4×19.301, 4×20.747, 4×22.273, 4×23.829, 4×25.460, 4×27.149, 4×28.924, 2×30.680, 2×30.909, 2×32.549, 2×33.106, 2×34.649, 2×35.673, 2×37.158, 2×38.541, 2×40.098, 2×41.722, 2×43.483, 45.193, 45.624, 47.191, 48.124, 49.644, 51.049, 52.674, 54.418, 56.330, 58.425, 60.723, 63.256, 66.083, 69.345]

33.0 dB: u=[3×1.000, 4×2.712, 4×4.714, 4×6.435, 4×8.443, 4×10.207, 4×12.226, 4×14.042, 4×16.079, 4×17.969, 4×20.039, 4×22.012, 4×24.125, 4×26.187, 4×28.366, 4×30.537, 4×32.808, 4×35.112, 4×37.514, 4×39.982, 4×42.543, 4×45.207, 4×48.003, 2×50.621, 2×51.414, 2×53.704, 2×55.153, 2×57.335, 2×59.292, 2×61.525, 2×63.798, 2×66.245, 2×68.838, 71.379, 71.892, 74.225, 75.393, 77.634, 79.518, 81.802, 84.144, 86.728, 89.497, 92.509, 95.768, 99.325, 103.203, 107.495, 112.416]

34.0 dB: u=[3×1.000, 4×2.925, 4×4.928, 4×6.864, 4×8.882, 4×10.844, 4×12.883, 4×14.882, 4×16.950, 4×18.995, 4×21.107, 4×23.219, 4×25.393, 4×27.583, 4×29.835, 4×32.125, 4×34.479, 4×36.888, 4×39.369, 4×41.925, 4×44.576, 2×47.066, 2×47.686, 2×49.882, 2×51.053, 2×53.110, 2×54.771, 2×56.793, 2×58.742, 2×60.857, 2×63.018, 2×65.307, 2×67.698, 2×70.232, 72.669, 73.235, 75.434, 76.617, 78.702, 80.475, 82.580, 84.717, 87.028, 89.485, 92.117, 94.936, 97.958, 101.203, 104.696, 108.486, 112.652, 117.394]

35.0 dB: u=[3×1.000, 4×2.984, 4×4.987, 4×6.980, 4×8.997, 4×11.011, 4×13.053, 4×15.099, 4×17.174, 4×19.263, 4×21.385, 4×23.530, 4×25.714, 4×27.928, 4×30.187, 4×32.490, 4×34.843, 4×37.251, 4×39.735, 2×42.025, 2×42.685, 2×44.664, 2×45.803, 2×47.654, 2×49.164, 2×50.979, 2×52.698, 2×54.564, 2×56.433, 2×58.403, 2×60.420, 2×62.532, 2×64.719, 2×67.010, 2×69.421, 71.662, 72.402, 74.352, 75.647, 77.507, 79.204, 81.118, 83.067, 85.144, 87.321, 89.634, 92.084, 94.688, 97.451, 100.380, 103.497, 106.828, 110.418, 114.336, 118.759]

36.0 dB: u=[3×1.000, 4×2.989, 4×4.993, 4×6.994, 4×8.995, 4×11.008, 4×13.043, 4×15.093, 4×17.158, 4×19.243, 4×21.356, 4×23.490, 4×25.650, 4×27.841, 4×30.070, 4×32.352, 2×34.445, 2×35.035, 2×36.831, 2×37.816, 2×39.484, 2×40.779, 2×42.392, 2×43.861, 2×45.497, 2×47.077, 2×48.747, 2×50.422, 2×52.167, 2×53.931, 2×55.770, 2×57.663, 2×59.621, 2×61.639, 2×63.727, 2×65.895, 67.940, 68.443, 70.252, 71.226, 72.922, 74.300, 75.964, 77.595, 79.344, 81.138, 83.037, 85.014, 87.092, 89.253, 91.537, 93.932, 96.465, 99.108, 101.914, 104.876, 108.021, 111.366, 115.037, 119.139]

37.0 dB: u=[3×1.000, 4×2.997, 4×4.999, 4×7.007, 4×9.024, 4×11.050, 4×13.079, 4×15.122, 4×17.181, 4×19.254, 4×21.355, 4×23.489, 2×25.434, 2×25.952, 2×27.628, 2×28.491, 2×30.036, 2×31.166, 2×32.647, 2×33.919, 2×35.392, 2×36.746, 2×38.224, 2×39.653, 2×41.171, 2×42.666, 2×44.228, 2×45.790, 2×47.404, 2×49.033, 2×50.711, 2×52.418, 2×54.177, 2×55.990, 2×57.840, 2×59.741, 2×61.705, 2×63.727, 65.629, 66.118, 67.778, 68.666, 70.226, 71.454, 72.968, 74.399, 75.939, 77.501, 79.147, 80.824, 82.585, 84.404, 86.299, 88.276, 90.339, 92.487, 94.730, 97.075, 99.520, 102.070, 104.762, 107.588, 110.586, 113.773, 117.223, 121.065]

38.0 dB: u=[3×1.000, 4×3.005, 4×5.009, 4×7.018, 4×9.035, 4×11.062, 2×12.915, 2×13.430, 2×15.010, 2×15.838, 2×17.310, 2×18.358, 2×19.754, 2×20.913, 2×22.250, 2×23.456, 2×24.787, 2×26.031, 2×27.410, 2×28.692, 2×30.072, 2×31.374, 2×32.766, 2×34.142, 2×35.581, 2×36.981, 2×38.440, 2×39.894, 2×41.388, 2×42.911, 2×44.446, 2×45.974, 2×47.559, 2×49.143, 2×50.785, 2×52.468, 2×54.185, 2×55.946, 2×57.729, 2×59.552, 2×61.410, 2×63.338, 65.129, 65.640, 67.190, 68.061, 69.490, 70.624, 72.051, 73.323, 74.748, 76.151, 77.669, 79.176, 80.748, 82.337, 83.995, 85.730, 87.490, 89.327, 91.257, 93.258, 95.308, 97.438, 99.656, 101.980, 104.390, 106.909, 109.574, 112.319, 115.237, 118.346, 121.697, 125.593]

39.0 dB: u=[1.000, 2×2.751, 2×4.747, 2×6.496, 2×8.486, 2×10.232, 2×12.231, 2×13.997, 2×15.998, 2×17.792, 2×19.801, 2×21.616, 2×23.631, 2×25.469, 2×27.492, 2×29.361, 2×31.393, 2×33.296, 2×35.349, 2×37.291, 2×39.360, 2×41.336, 2×43.420, 2×45.435, 2×47.548, 2×49.608, 2×51.754, 2×53.869, 2×56.063, 2×58.237, 2×60.470, 2×62.701, 2×64.988, 2×67.283, 2×69.626, 2×71.986, 2×74.402, 2×76.842, 2×79.328, 2×81.856, 2×84.445, 2×87.089, 2×89.779, 2×92.518, 2×95.321, 2×98.201, 2×101.204, 103.860, 105.067, 107.214, 108.859, 110.936, 112.827, 114.927, 116.964, 119.123, 121.275, 123.524, 125.798, 128.155, 130.567, 133.060, 135.620, 138.265, 140.991, 143.813, 146.722, 149.727, 152.824, 156.032, 159.353, 162.784, 166.332, 170.024, 173.856, 177.846, 182.017, 186.406, 191.051, 196.029, 201.527]

40.0 dB: u=[1.000, 2×2.968, 2×5.011, 2×7.027, 2×9.111, 2×11.119, 2×13.194, 2×15.207, 2×17.290, 2×19.326, 2×21.413, 2×23.450, 2×25.542, 2×27.597, 2×29.706, 2×31.783, 2×33.910, 2×36.005, 2×38.150, 2×40.263, 2×42.417, 2×44.591, 2×46.807, 2×49.019, 2×51.263, 2×53.505, 2×55.784, 2×58.072, 2×60.405, 2×62.733, 2×65.112, 2×67.506, 2×69.909, 2×72.329, 2×74.805, 2×77.307, 2×79.848, 2×82.426, 2×85.060, 2×87.718, 2×90.448, 2×93.242, 2×96.116, 98.718, 99.591, 101.733, 103.090, 105.112, 106.717, 108.719, 110.488, 112.474, 114.411, 116.467, 118.479, 120.599, 122.739, 124.950, 127.193, 129.496, 131.814, 134.178, 136.585, 139.086, 141.643, 144.315, 147.044, 149.863, 152.735, 155.692, 158.704, 161.825, 165.014, 168.299, 171.634, 175.110, 178.675, 182.371, 186.233, 190.233, 194.388, 198.750, 203.386, 208.349, 213.825]

g1) 262144-QAM/512-PAM for the AWGN channel (maximum penalty of 0.001 b/s/Hz)

0.0 dB: u=[255×1.000]

1.0 dB: u=[255×1.000]

2.0 dB: u=[63×1.000, 64×0.857, 64×1.303, 64×1.606]

3.0 dB: u=[127×1.000, 128×2.176]

4.0 dB: u=[127×1.000, 128×2.828]

5.0 dB: u=[127×1.000, 128×3.320]

6.0 dB: u=[127×1.000, 128×3.670]

7.0 dB: u=[127×1.000, 8×3.947, 8×3.557, 8×3.337, 8×3.557, 12×3.337, 4×3.143, 8×3.337, 8×3.557, 8×3.947, 8×3.557, 8×3.337, 8×3.557, 8×3.947, 8×3.557, 8×3.947, 4×5.263, 7.660, 7.231, 7.040, 7.405]

8.0 dB: u=[3×1.000, 4×0.943, 6×1.000, 10×1.106, 4×1.000, 28×1.106, 4×1.000, 20×1.106, 2×1.267, 2×1.252, 2×1.210, 2×1.230, 6×1.106, 2×1.210, 24×1.106, 4×1.000, 4×1.106, 2×4.027, 2×4.123, 2×4.524, 2×4.349, 2×4.027, 2×4.123, 2×3.889, 2×3.812, 2×3.615, 2×3.651, 2×3.812, 2×3.736, 2×3.889, 2×3.977, 2×3.768, 2×3.707, 2×3.561, 2×3.615, 2×3.736, 2×3.676, 2×3.587, 2×3.615, 2×3.520, 2×3.486, 2×3.615, 2×3.676, 2×3.812, 2×3.768, 2×3.921, 2×4.027, 2×3.812, 2×3.736, 2×4.027, 2×4.193, 2×4.639, 2×4.445, 2×4.027, 2×4.145, 2×3.889, 2×3.812, 2×3.615, 2×3.676, 2×3.812, 2×3.768, 2×3.939, 2×4.027, 2×3.812, 2×3.736, 2×4.027, 2×4.162, 2×4.600, 2×4.412, 2×4.027, 2×4.123, 2×3.889, 2×3.812, 2×4.193, 2×4.373, 2×4.871, 2×4.676, 2×6.703, 2×6.571, 2×7.684, 8.471, 8.491]

9.0 dB: u=[15×1.000, 16×1.116, 16×1.253, 16×1.116, 16×1.253, 16×1.401, 16×1.253, 16×1.116, 4.064, 4.094, 2×4.139, 4.301, 4.340, 4.264, 4.233, 4.556, 4.598, 4.684, 4.640, 4.435, 4.476, 4.396, 4.363, 2×3.993, 4.041, 4.023, 2×4.139, 2×4.094, 2×3.915, 2×3.950, 3×3.864, 3.802, 3.648, 3.671, 6×3.720, 4×3.864, 4×3.802, 2×3.950, 2×3.993, 2×4.094, 4.064, 4.041, 2×3.864, 3.915, 3.864, 4×3.802, 2×4.094, 4.172, 4.139, 4.301, 4.340, 4.264, 4.233, 4.556, 4.598, 4.684, 4.640, 4.435, 4.476, 4.396, 4.363, 2×3.993, 4.041, 4.023, 2×4.139, 2×4.094, 2×3.915, 2×3.950, 3×3.864, 3.802, 4.139, 4.172, 4.233, 4.207, 4.396, 4.435, 4.340, 4.301, 4.660, 4.706, 4.793, 4.747, 4.537, 4.580, 4.498, 4.459, 6.404, 6.449, 6.485, 6.449, 6.347, 6.377, 6.347, 6.318, 7.465, 7.367, 7.202, 7.259, 8.254, 7.911, 8.572, 9.660]

10.0 dB: u=[31×1.000, 32×1.113, 32×1.526, 32×1.360, 8×3.762, 8×3.877, 2×3.996, 2×4.020, 2×4.045, 2×4.020, 24×3.877, 16×3.762, 2×4.372, 2×4.411, 2×4.477, 2×4.433, 2×4.638, 2×4.693, 2×4.605, 2×4.549, 2×4.693, 2×4.748, 2×4.804, 2×4.748, 2×4.605, 2×4.638, 2×4.580, 2×4.549, 5.708, 5.645, 5.798, 5.859, 6.006, 5.937, 5.798, 2×5.859, 5.798, 5.895, 5.937, 5.859, 5.798, 5.708, 5.753, 6.784, 6.643, 6.746, 6.859, 6.828, 6.746, 6.675, 6.784, 2×7.887, 7.587, 7.633, 8.134, 8.261, 10.507, 9.022]

11.0 dB: u=[63×1.000, 64×1.816, 16×3.970, 16×4.100, 16×4.229, 16×4.100, 4×5.873, 4×6.099, 4×6.305, 4×6.099, 12×5.873, 4×5.704, 4×6.099, 6.407, 3×6.305, 6.522, 6.459, 6.522, 6.590, 6.407, 3×6.305, 7.724, 7.525, 7.724, 7.904, 7.836, 7.724, 7.602, 7.724, 8.598, 8.549, 2×8.671, 9.536, 10.170, 11.840, 9.833]

12.0 dB: u=[63×1.000, 64×2.231, 16×4.387, 16×4.550, 16×4.729, 16×4.550, 4×6.806, 4×7.031, 4×7.305, 4×7.031, 4×6.806, 4×7.031, 4×6.806, 4×6.667, 4×7.031, 2×7.305, 2×7.031, 2×7.495, 2×7.574, 4×7.305, 8.613, 8.786, 8.930, 8.786, 8.930, 9.037, 8.930, 8.786, 10.001, 10.204, 10.145, 10.001, 11.011, 10.903, 11.673, 13.547]

13.0 dB: u=[63×1.000, 64×2.597, 32×4.765, 32×5.145, 8×7.311, 24×7.518, 2×8.428, 2×8.501, 4×8.725, 2×8.889, 2×8.974, 4×8.725, 9.719, 9.842, 10.134, 9.960, 10.134, 10.252, 10.058, 9.960, 11.011, 2×11.372, 11.177, 12.225, 12.296, 13.208, 15.101]

14.0 dB: u=[63×1.000, 64×2.845, 32×4.965, 32×5.519, 16×7.766, 16×8.055, 4×9.548, 4×9.781, 4×9.978, 4×9.781, 10.661, 10.803, 10.989, 10.803, 11.128, 11.269, 11.128, 10.989, 12.045, 12.310, 12.502, 12.310, 13.980, 13.589, 13.980, 16.380]

15.0 dB: u=[63×1.000, 32×2.927, 32×3.044, 32×5.101, 32×5.750, 16×7.983, 16×8.407, 8×10.192, 4×10.573, 4×10.441, 2×11.695, 2×11.938, 2×12.168, 2×11.938, 13.243, 12.933, 13.243, 13.504, 14.591, 14.274, 17.564, 15.583]

16.0 dB: u=[63×1.000, 32×2.972, 32×3.143, 32×5.169, 32×5.896, 16×8.069, 16×8.582, 8×10.457, 8×10.858, 4×12.369, 4×12.698, 13.754, 13.934, 14.289, 14.078, 15.039, 15.482, 16.504, 18.483]

17.0 dB: u=[63×1.000, 32×2.958, 32×3.211, 32×5.161, 16×5.901, 16×6.102, 16×8.051, 16×8.614, 8×10.503, 8×10.964, 4×12.593, 4×12.995, 2×14.330, 2×14.702, 16.168, 15.721, 19.168, 17.239]

18.0 dB: u=[31×1.000, 32×1.168, 32×3.124, 32×3.598, 32×5.538, 16×6.635, 16×6.858, 16×8.756, 8×9.328, 8×9.499, 8×11.412, 8×11.937, 4×13.759, 4×14.221, 2×15.819, 2×16.250, 18.040, 17.558, 21.402, 19.352]

19.0 dB: u=[31×1.000, 32×1.500, 32×3.456, 32×4.378, 32×6.353, 16×7.956, 16×8.220, 16×10.203, 8×10.927, 8×11.171, 8×13.206, 8×13.837, 4×15.887, 4×16.424, 2×18.302, 2×18.807, 20.987, 20.461, 25.040, 22.702]

20.0 dB: u=[31×1.000, 32×2.373, 32×4.399, 32×6.090, 32×8.284, 16×10.437, 16×10.846, 16×13.176, 8×14.259, 8×14.597, 8×16.947, 8×17.804, 4×20.278, 4×20.976, 2×23.328, 2×23.954, 26.141, 26.753, 29.044, 31.968]

21.0 dB: u=[31×1.000, 32×2.814, 32×4.875, 32×6.911, 32×9.236, 16×11.555, 16×12.232, 16×14.594, 8×16.207, 8×16.608, 8×18.921, 4×19.881, 4×20.211, 4×22.584, 2×23.284, 2×23.552, 2×25.918, 26.528, 26.743, 29.034, 29.701, 32.271, 35.440]

22.0 dB: u=[31×1.000, 32×2.962, 32×5.038, 32×7.192, 16×9.421, 16×9.730, 16×11.897, 16×12.838, 16×15.104, 8×16.985, 8×17.546, 8×19.715, 4×21.065, 4×21.458, 4×23.625, 4×24.678, 2×27.073, 27.750, 28.046, 30.270, 31.004, 33.592, 36.773]

23.0 dB: u=[31×1.000, 32×3.004, 32×5.080, 16×7.173, 16×7.351, 16×9.392, 16×9.957, 16×11.949, 16×13.259, 8×15.258, 8×15.436, 8×17.312, 8×18.020, 8×20.076, 4×21.673, 4×22.198, 4×24.166, 2×25.397, 2×25.786, 2×27.759, 28.615, 28.978, 30.980, 31.841, 34.296, 37.350]

24.0 dB: u=[31×1.000, 32×3.014, 16×5.023, 16×5.159, 16×7.091, 16×7.497, 16×9.330, 16×10.272, 16×12.064, 16×13.671, 8×15.517, 8×15.820, 8×17.622, 8×18.521, 4×20.385, 4×20.522, 4×22.155, 4×22.780, 4×24.646, 2×26.081, 2×26.589, 2×28.388, 29.563, 29.993, 31.769, 32.893, 35.174, 38.095]

25.0 dB: u=[31×1.000, 16×2.940, 16×3.098, 16×4.921, 16×5.312, 16×7.013, 16×7.837, 16×9.450, 16×10.770, 16×12.418, 8×14.070, 8×14.223, 8×15.900, 8×16.405, 8×18.082, 8×19.278, 4×20.973, 4×21.201, 4×22.827, 4×23.579, 4×25.364, 2×26.908, 2×27.491, 2×29.218, 30.551, 31.089, 32.749, 34.169, 36.333, 39.127]

26.0 dB: u=[15×1.000, 16×1.702, 16×3.663, 16×4.577, 16×6.460, 16×7.711, 16×9.543, 16×11.127, 16×13.004, 16×14.886, 16×16.970, 8×19.076, 8×19.408, 8×21.441, 8×22.350, 8×24.384, 8×26.166, 4×28.230, 4×28.684, 4×30.692, 4×31.919, 4×34.104, 2×36.154, 2×37.025, 2×39.192, 41.808, 41.055, 45.921, 43.913, 52.126, 48.648]

27.0 dB: u=[15×1.000, 16×2.712, 16×4.720, 16×6.502, 16×8.541, 16×10.457, 16×12.572, 16×14.678, 16×16.952, 16×19.327, 8×21.787, 8×22.018,

8×24.404, 8×25.107, 8×27.423, 8×28.953, 8×31.285, 4×33.527, 4×33.789, 4×36.101, 4×36.924, 4×39.264, 4×41.128, 2×43.494, 2×43.960, 2×46.262, 2×47.600, 49.983, 50.301, 52.511, 53.594, 56.099, 58.700, 61.998, 66.125]

28.0 dB: u=[15×1.000, 16×2.925, 16×4.941, 16×6.916, 16×8.986, 16×11.060, 16×13.234, 16×15.469, 16×17.825, 16×20.309, 8×22.722, 8×23.293, 8×25.494, 8×26.748, 8×28.887, 8×30.842, 8×33.144, 4×35.433, 4×35.931, 4×38.129, 4×39.369, 4×41.592, 4×43.771, 2×46.069, 2×46.857, 2×49.074, 2×50.879, 53.115, 53.656, 55.838, 57.297, 59.712, 62.427, 65.708, 69.732]

29.0 dB: u=[15×1.000, 16×2.986, 16×5.004, 16×7.031, 16×9.107, 16×11.222, 16×13.406, 16×15.664, 16×18.029, 8×20.275, 8×20.849, 8×22.859, 8×24.018, 8×25.937, 8×27.635, 8×29.625, 8×31.704, 4×33.840, 4×34.163, 4×36.195, 4×37.060, 4×39.052, 4×40.683, 4×42.770, 2×44.829, 2×45.277, 2×47.279, 2×48.412, 2×50.460, 2×52.488, 54.607, 55.423, 57.466, 59.252, 61.568, 64.245, 67.398, 71.190]

30.0 dB: u=[15×1.000, 16×3.000, 16×5.018, 16×7.055, 16×9.127, 16×11.242, 16×13.417, 8×15.516, 8×15.837, 8×17.752, 8×18.464, 8×20.249, 8×21.458, 8×23.166, 8×24.734, 8×26.502, 8×28.318, 8×30.275, 4×32.248, 4×32.494, 4×34.378, 4×35.040, 4×36.847, 4×38.139, 4×39.936, 4×41.741, 2×43.658, 2×43.918, 2×45.761, 2×46.504, 2×48.325, 2×49.795, 2×51.707, 53.582, 54.049, 55.870, 57.015, 58.892, 60.818, 63.085, 65.678, 68.671, 72.224]

31.0 dB: u=[15×1.000, 16×3.004, 16×5.022, 16×7.058, 16×9.127, 8×11.102, 8×11.399, 8×13.186, 8×13.802, 8×15.453, 8×16.471, 8×18.024, 8×19.340, 8×20.885, 8×22.385, 8×24.005, 8×25.661, 8×27.417, 8×29.257, 8×31.220, 4×33.083, 4×33.649, 4×35.315, 4×36.413, 4×38.029, 4×39.562, 4×41.296, 4×43.152, 45.493, 2×44.972, 45.493, 47.165, 2×48.274, 47.165, 51.578, 2×49.934, 51.578, 53.335, 56.033, 55.292, 53.603, 60.926, 59.134, 57.713, 62.892, 65.125, 67.640, 70.498, 73.850]

32.0 dB: u=[15×1.000, 16×3.005, 8×4.908, 8×5.161, 8×6.887, 8×7.370, 8×8.962, 8×9.757, 8×11.234, 8×12.302, 8×13.719, 8×14.955, 8×16.370, 8×17.714, 8×19.171, 8×20.614, 8×22.140, 8×23.693, 8×25.323, 8×27.010, 8×28.781, 8×30.645, 4×32.410, 4×32.908, 4×34.477, 4×35.442, 4×36.940, 4×38.292, 4×39.842, 4×41.448, 4×43.189, 2×45.289, 2×44.884, 2×47.764, 2×46.841, 53.997, 52.911, 2×49.337, 50.457, 50.853, 52.293, 54.790, 56.162, 57.253, 58.569, 59.839, 61.331, 62.910, 64.688, 66.658, 68.856, 71.307, 74.064, 77.281]

33.0 dB: u=[7×1.000, 8×2.671, 8×4.671, 8×6.365, 8×8.369, 8×10.104, 8×12.117, 8×13.910, 8×15.938, 8×17.803, 8×19.859, 8×21.807, 8×23.908, 8×25.954, 8×28.118, 8×30.273, 8×32.527, 8×34.812, 8×37.193, 8×39.640, 8×42.187, 8×44.830, 8×47.603, 4×50.209, 4×50.944, 4×53.244, 4×54.628, 4×56.810, 4×58.730, 4×60.946, 4×63.195, 4×65.615, 4×68.173, 4×70.932, 74.532, 2×73.509, 74.532, 76.790, 2×78.556, 76.790, 83.087, 2×80.809, 83.087, 85.598, 88.583, 88.088, 85.598, 94.351, 92.089, 90.910, 96.334, 98.719, 101.263, 104.055, 107.127, 110.507, 114.236, 118.403, 123.217]

34.0 dB: u=[7×1.000, 8×2.914, 8×4.916, 8×6.843, 8×8.857, 8×10.809, 8×12.844, 8×14.833, 8×16.899, 8×18.938, 8×21.048, 8×23.152, 8×25.320, 8×27.503, 8×29.750, 8×32.031, 8×34.378, 8×36.780, 8×39.256, 8×41.805, 8×44.445, 2×47.481, 4×46.956, 2×47.481, 2×49.726, 4×50.782, 2×49.726, 2×54.471, 4×52.878, 2×54.471, 2×56.502, 4×58.420, 2×56.502, 2×62.669, 4×60.526, 2×62.669, 2×64.944, 4×67.320, 2×64.944 72.280, 72.752, 4×69.834, 72.752, 72.280, 76.035, 74.989, 79.841, 2×78.155, 79.841, 74.989, 76.035, 86.310, 88.727, 81.940, 2×84.029, 81.940, 88.727, 86.310, 93.788, 91.344, 100.837, 98.677, 96.943, 103.055, 91.344, 94.806, 110.962, 108.113, 105.490, 114.056, 117.423, 125.860, 121.784, 131.079]

35.0 dB: u=[7×1.000, 8×2.981, 8×4.987, 8×6.981, 8×9.003, 8×11.018, 8×13.062, 8×15.108, 8×17.187, 8×19.278, 8×21.406, 8×23.557, 8×25.746, 8×27.966, 8×30.232, 8×32.540, 8×34.900, 8×37.313, 8×39.797, 2×42.669, 4×42.122, 2×42.669, 2×44.713, 4×45.729, 2×44.713, 2×49.074, 4×47.629, 2×49.074, 2×50.909, 4×52.605, 2×50.909, 2×56.337, 4×54.478, 2×56.337, 2×58.305, 4×60.312, 2×58.305, 2×64.599, 4×62.418, 2×64.599, 2×66.884, 4×69.276, 2×66.884, 75.270, 74.142, 72.123, 2×71.548, 72.123, 74.142, 75.270, 77.176, 78.793, 80.702, 2×82.610, 80.702, 78.793, 77.176, 91.541, 89.091, 86.808, 2×84.662, 86.808, 89.091, 91.541, 94.774, 96.714, 102.167, 104.297, 106.543, 100.217, 98.282, 93.804, 109.837, 112.437, 115.236, 118.244, 121.484, 124.992, 128.852, 133.258]

36.0 dB: u=[7×1.000, 8×2.995, 8×4.999, 8×7.002, 8×9.018, 8×11.040, 8×13.080, 8×15.131, 8×17.204, 8×19.293, 8×21.407, 8×23.545, 8×25.713, 8×27.912, 8×30.149, 8×32.430, 4×34.571, 4×35.008, 4×36.899, 4×37.712, 4×39.460, 4×40.650, 4×42.307, 4×43.732, 4×45.378, 4×46.938, 4×48.623, 4×50.288, 4×52.040, 4×53.808, 4×55.649, 4×57.531, 4×59.484, 4×61.496, 4×63.583, 4×65.750, 2×67.835, 2×68.223, 2×70.106, 2×70.917, 2×72.674, 2×73.951, 2×75.641, 2×77.214, 2×78.951, 2×80.708, 2×82.571, 2×84.504, 2×86.538, 2×88.675, 90.723, 91.214, 93.050, 94.050, 95.786, 97.254, 98.989, 100.734, 102.613, 104.584, 106.689, 113.802, 111.288, 108.919, 120.898, 123.947, 117.440, 127.766, 131.367, 135.439]

37.0 dB: u=[7×1.000, 8×3.001, 8×5.008, 8×7.019, 8×9.038, 8×11.065, 8×13.103, 8×15.154, 8×17.220, 8×19.304, 8×21.411, 8×23.544, 4×25.544, 4×25.918, 4×27.690, 4×28.369, 4×30.004, 4×31.008, 4×32.542, 4×33.763, 4×35.259, 4×36.599, 4×38.099, 4×39.516, 4×41.044, 4×42.525, 4×44.090, 4×45.639, 4×47.255, 4×48.875, 4×50.555, 4×52.257, 4×54.014, 4×55.808, 4×57.656, 4×59.551, 4×61.505, 4×63.519, 4×65.615, 2×67.539, 2×68.172, 2×69.820, 2×70.876, 2×72.431, 2×73.781, 2×75.335, 2×76.852, 2×78.474, 2×80.123, 2×81.852, 2×83.635, 2×85.500, 2×87.443, 2×89.489, 92.010, 91.388, 94.747, 93.660, 97.737, 96.313, 103.229, 99.393, 100.814, 104.883, 106.781, 113.061, 110.859, 108.763, 116.322, 124.129, 121.377, 118.778, 127.812, 130.946, 134.362, 138.194]

38.0 dB: u=[7×1.000, 8×3.002, 8×5.006, 8×7.014, 8×9.029, 8×11.058, 4×12.967, 4×13.265, 4×14.976, 4×15.505, 4×17.085, 4×17.893, 4×19.361, 4×20.381, 4×21.786, 4×22.926, 4×24.309, 4×25.515, 4×26.897, 4×28.151, 4×29.543, 4×30.842, 4×32.252, 4×33.596, 4×35.028, 4×36.415, 4×37.872, 4×39.303, 4×40.792, 4×42.271, 4×43.801, 4×45.335, 4×46.913, 4×48.506, 4×50.143, 4×51.803, 4×53.503, 4×55.235, 4×57.011, 4×58.828, 4×60.693, 4×62.608, 64.448, 2×64.736, 64.448, 67.000, 2×66.403, 67.000, 68.541, 2×69.509, 68.541, 72.186, 2×70.960, 72.186, 73.620, 2×74.990, 73.620, 77.947, 2×76.468, 77.947, 79.500, 2×81.083, 79.500, 84.418, 2×82.728, 84.418, 86.174, 2×87.990, 86.174, 92.090, 2×89.885, 91.685, 94.487, 95.983, 97.152, 93.690, 103.036, 98.609, 99.994, 101.507, 106.325, 108.078, 109.911, 104.651, 118.138, 111.829, 113.835, 115.937, 128.074, 125.397, 122.861, 120.442, 131.362, 134.383, 137.650, 141.301]

39.0 dB: u=[3×1.000, 4×2.677, 4×4.676, 4×6.358, 4×8.358, 4×10.052, 4×12.052, 4×13.763, 4×15.766, 4×17.496, 4×19.500, 4×21.256, 4×23.265, 4×25.051, 4×27.068, 4×28.889, 4×30.915, 4×32.771, 4×34.811, 4×36.704, 4×38.758, 4×40.692, 4×42.764, 4×44.742, 4×46.842, 4×48.867, 4×50.993, 4×53.065, 4×55.226, 4×57.356, 4×59.561, 4×61.751, 4×64.007, 4×66.265, 4×68.580, 4×70.908, 4×73.288, 4×75.693, 4×78.153, 4×80.645, 4×83.188, 4×85.774, 4×88.419, 4×91.119, 4×93.883, 4×96.712, 4×99.628, 2×102.293, 2×103.123, 2×105.396, 2×106.752, 2×108.879, 2×110.615, 2×112.699, 2×114.641, 2×116.762, 2×118.842, 2×121.042, 2×123.251, 2×125.552, 2×127.896, 2×130.328, 2×132.821, 2×135.397, 2×138.050, 2×140.796, 2×143.654, 146.290, 147.139, 149.400, 150.834, 152.970, 154.819, 156.948, 159.021, 161.239, 163.484, 165.843, 168.269, 170.808,173.443, 176.186, 179.044, 182.024 185.122, 188.346, 191.701, 195.202, 198.865, 207.449, 203.418, 212.351, 216.874, 221.751, 227.179]

40.0 dB: u=[3×1.000, 4×2.884, 4×4.868, 4×6.787, 4×8.796, 4×10.733, 4×12.764, 4×14.718, 4×16.746, 4×18.729, 4×20.770, 4×22.741, 4×24.758, 4×26.707, 4×28.730, 4×30.714, 4×32.782, 4×34.846, 4×36.972, 4×39.076, 4×41.212, 4×43.297, 4×45.418, 4×47.511, 4×49.663, 4×51.833, 4×54.051, 4×56.276, 4×58.541, 4×60.809, 4×63.114, 4×65.423, 4×67.796, 4×70.179, 4×72.604, 4×75.028, 4×77.480, 4×79.962, 4×82.507, 4×85.100, 4×87.722, 4×90.373, 4×93.097, 4×95.894, 2×98.443, 2×99.192, 2×101.350, 2×102.593, 2×104.608, 2×106.201, 2×108.143, 2×109.900, 2×111.831, 2×113.740, 2×115.749, 2×117.768, 2×119.876, 2×122.014, 2×124.151, 2×126.386, 2×128.620, 2×130.937, 2×133.303, 2×135.790, 2×138.316, 2×140.941, 2×143.602, 146.738, 146.121, 150.043, 148.924, 153.674, 152.079, 157.452, 155.652, 161.396, 159.464, 165.590, 163.491, 170.087, 167.782, 174.837, 172.447, 179.889, 177.326, 185.223, 182.532, 190.913, 187.989, 201.138, 197.890, 194.755, 204.461, 219.958, 208.625, 212.291, 216.021, 229.420, 225.077, 234.685, 240.034]

h1) 1048576-QAM/1024-PAM for the AWGN channel (maximum penalty of 0.001 b/s/Hz)

0.0 dB: u=[511×1.000]

1.0 dB: u=[511×1.000]

2.0 dB: u=[127×1.000, 128×0.857, 128×1.303, 128×1.606]

3.0 dB: u=[255×1.000, 256×2.208]

4.0 dB: u=[255×1.000, 256×2.826]

5.0 dB: u=[255×1.000, 256×3.322]

6.0 dB: u=[255×1.000, 256×3.655]

7.0 dB: u=[15×1.000, 16×1.042, 16×1.085, 16×1.042, 16×1.085, 16×1.132, 16×1.085, 16×1.042, 16×1.085, 16×1.132, 16×1.180, 16×1.132, 16×1.085, 16×1.132, 16×1.085, 16×1.042, 8×4.172, 8×4.337, 16×3.848, 16×3.643, 16×3.848, 16×3.643, 8×3.524, 8×3.434, 16×3.643, 16×3.848, 4.093, 7×4.172, 8×4.337, 16×3.848, 16×3.643, 16×3.848, 8×4.172, 8×4.337, 16×3.848, 4×4.172, 3×4.337, 4.172, 4×4.512, 3×4.449, 4.415, 6.206, 2×6.128, 6.206, 6.128, 2×6.063, 6.128, 7.861, 7.683, 7.630, 7.804, 8.180, 7.975, 8.038, 8.250]

8.0 dB: u=[7×1.000, 8×0.974, 8×1.000, 8×1.026, 128×1.120, 8×1.282, 8×1.251, 8×1.217, 8×1.251, 64×1.120, 8×4.221, 4×4.565, 4×4.467, 8×4.221, 4×4.070, 4×4.019, 8×3.764, 4×3.922, 4×3.888, 4×3.970, 4×4.019, 4×3.855, 4×3.820, 4×3.637, 4×3.660, 4×3.764, 4×3.712, 4×3.660, 4×3.688, 4×3.586, 4×3.548, 8×3.764, 4×3.888, 4×3.855, 4×3.922, 4×3.970, 4×3.820, 4×3.764, 4×4.120, 4×4.221, 4×4.467, 4.379, 4.394, 2×4.379, 8×4.221, 4×4.019, 4×3.970, 8×3.764, 4×3.888, 4×3.855, 4×3.922, 4×3.970, 4×3.820, 4×3.764, 8×4.221, 4×4.565, 4×4.467, 8×4.221, 4×4.070, 4×4.019, 4.607, 4.629, 4.650, 4.629, 4.780, 4.800, 4.780, 4.760, 5.098, 5.112, 5.126, 5.112, 5.002, 5.017, 5.002, 4.985, 6.840, 6.815, 6.793, 6.815, 6.670, 6.657, 6.670, 6.683, 7.999, 7.932, 7.848, 7.909, 8.622, 8.520, 8.662, 8.774]

9.0 dB: u=[7×1.000, 24×0.959, 8×1.086, 8×1.028, 16×1.086, 32×1.202, 32×1.086, 8×1.265, 24×1.202, 8×1.352, 8×1.316, 8×1.352, 8×1.389, 32×1.202, 32×1.086, 2×3.863, 2×3.890, 2×3.922, 2×3.890, 2×4.046, 2×4.076, 2×4.046, 2×4.006, 2×4.337, 2×4.377, 2×4.420, 2×4.377, 2×4.174, 2×4.212, 2×4.174, 2×4.142, 4×3.863, 2×3.890, 2×3.863, 6×4.006, 2×3.966, 8×3.797, 8×3.715, 8×3.546, 8×3.626, 8×3.715, 8×3.626, 2×3.760, 6×3.797, 2×3.863, 2×3.890, 4×3.863, 8×3.715, 8×3.626, 4×3.922, 2×3.966, 2×3.922, 2×4.109, 2×4.142, 2×4.109, 2×4.076, 2×4.420, 2×4.463, 2×4.506, 2×4.463, 2×4.251, 2×4.289, 2×4.251, 2×4.212, 2×3.890, 6×3.922, 2×4.006, 2×4.046, 4×4.006, 4×3.797, 2×3.863, 2×3.797, 8×3.715, 2×4.076, 2×4.109, 2×4.142, 2×4.109, 2×4.316, 2×4.359, 2×4.316, 2×4.274, 2×4.625, 2×4.667, 2×4.708, 2×4.667, 2×4.463, 2×4.506, 2×4.463, 2×4.420, 2×6.334, 2×6.314, 2×6.297, 2×6.314, 8×6.094, 2×7.098, 2×6.955, 2×6.850, 2×6.955, 8.208, 8.239, 7.823, 7.806, 8.239, 8.271, 8.980, 8.929]

10.0 dB: u=[63×1.000, 64×1.112, 64×1.524, 64×1.362, 8×3.752, 8×3.788, 4×3.842, 4×3.889, 8×3.842, 4×3.990, 4×4.007, 4×4.044, 4×4.025, 8×3.919, 8×3.889, 16×3.842, 8×3.919, 8×3.889, 16×3.788, 16×3.725, 4×4.370, 4×4.409, 4×4.478, 4×4.433, 4×4.646, 4×4.706, 4×4.610, 4×4.570, 4×4.706, 4×4.752, 4×4.812, 4×4.752, 4×4.610, 4×4.646, 4×4.570, 4×4.532, 2×5.618, 2×5.655, 2×5.829, 2×5.790, 2×5.921, 2×5.972, 2×5.829, 2×5.770, 4×5.829, 2×5.944, 2×5.921, 4×5.829, 2×5.736, 2×5.708, 6.703, 6.720, 6.813, 6.800, 6.913, 6.923, 2×6.844, 2×6.777, 2×6.844, 2×6.777, 2×6.703, 2×7.781, 2×7.821, 2×7.562, 2×7.515, 2×8.216, 2×8.176, 9.359, 9.273, 10.248, 10.472]

11.0 dB: u=[127×1.000, 128×1.815, 32×3.964, 32×4.094, 32×4.225, 32×4.094, 8×5.875, 8×6.103, 8×6.298, 8×6.103, 24×5.875, 8×5.702, 8×6.103, 8×6.298, 8×6.475, 8×6.298, 7.730, 2×7.585, 7.730, 7.843, 2×7.730, 7.927, 7.843, 4×7.730, 2×7.585, 7.730, 8.768, 8.628, 8.465, 2×8.628, 8.515, 8.628, 8.721, 9.588, 9.768, 9.725, 9.540, 10.271, 12.518, 11.033, 10.153]

12.0 dB: u=[127×1.000, 128×2.228, 32×4.389, 32×4.549, 32×4.726, 32×4.549, 16×6.920, 16×7.240, 16×6.920, 16×6.700, 8×6.920, 8×7.240, 8×7.506, 8×7.240, 2×8.599, 14×8.866, 10.189, 10.051, 10.189, 10.320, 10.189, 2×10.051, 10.189, 11.171, 10.965, 10.823, 10.965, 11.632, 11.557, 14.362, 12.624]

13.0 dB: u=[127×1.000, 128×2.598, 64×4.766, 64×5.145, 16×7.309, 48×7.514, 4×8.427, 4×8.515, 4×8.772, 4×8.678, 4×8.887, 4×8.979, 4×8.772, 4×8.678, 9.708, 9.766, 9.834, 9.766, 10.010, 10.162, 2×10.010, 2×10.162, 10.256, 10.162, 4×10.010, 10.952, 11.180, 11.420, 11.180, 11.266, 11.420, 11.266, 11.111, 12.106, 12.308, 12.414, 12.308, 13.720, 13.301, 13.720, 15.960]

14.0 dB: u=[127×1.000, 128×2.846, 64×4.967, 64×5.518, 32×7.766, 16×8.118, 16×8.002, 8×9.552, 8×9.774, 8×9.966, 8×9.774, 4×10.715, 4×11.023, 4×11.255, 4×11.023, 12.010, 12.218, 12.404, 12.218, 12.404, 12.541, 12.404, 12.218, 13.236, 13.491, 13.654, 13.491, 15.024, 14.630, 15.024, 17.348]

15.0 dB: u=[127×1.000, 64×2.926, 64×3.040, 64×5.095, 64×5.743, 32×7.972, 32×8.395, 16×10.173, 8×10.554, 8×10.426, 4×11.673, 4×11.909, 4×12.132, 4×11.909, 2×12.969, 2×13.252, 2×13.466, 2×13.252, 14.454, 14.148, 14.454, 14.679, 15.692, 15.415, 18.520, 16.638]

16.0 dB: u=[127×1.000, 64×2.973, 64×3.142, 64×5.170, 32×5.822, 32×5.970, 32×8.070, 32×8.582, 16×10.451, 16×10.857, 8×12.337, 8×12.696, 2×13.789, 2×13.934, 2×14.237, 2×14.080, 15.099, 15.391, 15.634, 15.391, 16.210, 16.651, 17.558, 19.523]

17.0 dB: u=[127×1.000, 64×2.961, 64×3.215, 64×5.166, 32×5.907, 32×6.111, 32×8.060, 32×8.623, 16×10.515, 16×10.976, 8×12.611, 8×13.005, 4×14.357, 4×14.706, 2×15.782, 2×16.136, 17.421, 16.990, 20.277, 18.421]

18.0 dB: u=[63×1.000, 64×1.166, 64×3.121, 64×3.593, 64×5.532, 32×6.626, 32×6.850, 32×8.746, 16×9.317, 16×9.488, 16×11.398, 16×11.921, 8×13.738, 8×14.201, 4×15.801, 4×16.218, 2×17.571, 2×17.971, 19.514, 19.028, 22.631, 20.661]

19.0 dB: u=[63×1.000, 64×1.509, 64×3.465, 64×4.392, 64×6.367, 32×7.972, 32×8.230, 32×10.218, 16×10.928, 16×11.176, 16×13.219, 16×13.851, 8×15.905, 8×16.449, 4×18.341, 4×18.839, 20.532, 2×21.012, 20.532, 24.454, 22.960, 22.455, 26.649]

20.0 dB: u=[63×1.000, 64×2.370, 64×4.396, 64×6.084, 64×8.276, 32×10.423, 32×10.825, 32×13.151, 16×14.224, 16×14.558, 16×16.910, 16×17.756, 8×20.238, 8×20.937, 4×23.291, 4×23.916, 2×26.093, 2×26.690, 29.263, 28.659, 34.095, 31.334]

21.0 dB: u=[63×1.000, 64×2.812, 64×4.871, 64×6.903, 64×9.230, 32×11.550, 32×12.224, 32×14.587, 16×16.198, 16×16.595, 16×18.914, 8×19.854, 8×20.197, 8×22.565, 4×23.278, 4×23.535, 4×25.891, 4×26.598, 2×28.992, 2×29.633, 31.900, 32.521, 34.952, 38.002]

22.0 dB: u=[63×1.000, 64×2.960, 64×5.036, 64×7.189, 32×9.418, 32×9.728, 32×11.896, 32×12.840, 32×15.109, 16×16.992, 16×17.557, 16×19.730, 8×21.086, 8×21.475, 8×23.641, 8×24.684, 4×27.071, 4×27.870, 2×30.240, 2×30.943, 33.247, 33.895, 36.386, 39.432]

23.0 dB: u=[63×1.000, 64×3.005, 64×5.083, 32×7.180, 32×7.357, 32×9.405, 32×9.964, 32×11.961, 32×13.262, 16×15.266, 16×15.441, 16×17.320, 16×18.021, 16×20.078, 8×21.668, 8×22.189, 8×24.163, 4×25.390, 4×25.790, 4×27.758, 2×28.641, 2×28.963, 2×30.991, 31.946, 31.637, 34.726, 33.992, 40.124, 37.140]

24.0 dB: u=[63×1.000, 64×3.015, 64×5.092, 32×7.094, 32×7.494, 32×9.333, 32×10.268, 32×12.064, 32×13.668, 16×15.514, 16×15.813, 16×17.613, 16×18.506, 8×20.367, 8×20.507, 8×22.137, 8×22.762, 8×24.626, 4×26.055, 4×26.559, 4×28.354, 2×29.531, 2×29.936, 2×31.731, 32.592, 33.013, 34.786, 35.751, 37.990, 40.849]

25.0 dB: u=[63×1.000, 32×2.941, 32×3.097, 32×4.922, 32×5.307, 32×7.010, 32×7.826, 32×9.442, 32×10.758, 32×12.406, 16×14.056, 16×14.209, 16×15.885, 16×16.393, 16×18.067, 16×19.263, 8×20.954, 8×21.181, 8×22.804, 8×23.552, 8×25.334, 4×26.869, 4×27.456, 4×29.178, 2×30.523, 2×31.026, 2×32.691, 33.837, 34.302, 35.924, 37.115, 39.212, 41.917]

26.0 dB: u=[31×1.000, 32×1.664, 32×3.624, 32×4.506, 32×6.383, 32×7.615, 32×9.436, 32×11.006, 32×12.870, 32×14.737, 32×16.802, 16×18.891, 16×19.216, 16×21.233, 16×22.126, 16×24.142, 16×25.897, 8×27.944, 8×28.381, 8×30.377, 8×31.576, 8×33.750, 4×35.780, 4×36.650, 4×38.790, 2×40.629, 2×41.351, 2×43.422, 45.060, 45.719, 47.720, 49.466, 52.091, 55.474]

27.0 dB: u=[31×1.000, 32×2.708, 32×4.716, 32×6.496, 32×8.536, 32×10.448, 32×12.563, 32×14.665, 32×16.936, 32×19.305, 16×21.761, 16×21.989, 16×24.375, 16×25.072, 16×27.390, 16×28.915, 16×31.249, 8×33.489, 8×33.747, 8×36.061, 8×36.872, 8×39.212, 8×41.056, 4×43.420, 4×43.890, 4×46.186, 4×47.528, 2×49.914, 2×50.204, 2×52.415, 2×53.444, 2×55.948, 58.127, 59.050, 61.472, 63.838, 67.021, 71.065]

28.0 dB: u=[31×1.000, 32×2.924, 32×4.940, 32×6.912, 32×8.981, 32×11.052, 32×13.223, 32×15.452, 32×17.802, 32×20.281, 16×22.691, 16×23.251, 16×25.455, 16×26.697, 16×28.838, 16×30.787, 16×33.087, 8×35.374, 8×35.865, 8×38.059, 8×39.285, 8×41.512, 8×43.686, 4×45.985, 4×46.750, 4×48.967, 4×50.738, 2×52.970, 2×53.481, 2×55.656, 2×57.051, 2×59.475, 61.778, 62.929, 65.318, 67.873, 71.052, 75.010]

29.0 dB: u=[31×1.000, 32×2.985, 32×5.003, 32×7.030, 32×9.106, 32×11.219, 32×13.403, 32×15.660, 32×18.024, 16×20.272, 16×20.833, 16×22.850, 16×23.996, 16×25.921, 16×27.619, 16×29.607, 16×31.684, 8×33.824, 8×34.135, 8×36.172, 8×37.017, 8×39.014, 8×40.629, 8×42.713, 4×44.770, 4×45.209, 4×47.213, 4×48.333, 4×50.376, 4×52.385, 2×54.500, 2×55.274, 2×57.312, 2×59.046, 61.107, 61.671, 63.693, 65.162, 67.411, 69.980, 73.056, 76.807]

30.0 dB: u=[31×1.000, 32×3.001, 32×5.019, 32×7.057, 32×9.131, 32×11.246, 32×13.419, 16×15.521, 16×15.831, 16×17.754, 16×18.448, 16×20.240, 16×21.435, 16×23.147, 16×24.710, 16×26.478, 16×28.292, 16×30.247, 8×32.223, 8×32.460, 8×34.350, 8×34.995, 8×36.808, 8×38.086, 8×39.885, 8×41.684, 4×43.602, 4×43.857, 4×45.704, 4×46.432, 4×48.255, 4×49.706, 4×51.609, 2×53.481, 2×53.912, 2×55.735, 2×56.816, 2×58.692, 60.449, 60.749, 62.556, 63.391, 65.260, 66.986, 69.144, 71.641, 74.559, 78.055]

31.0 dB: u=[31×1.000, 32×3.003, 32×5.018, 32×7.053, 32×9.120, 16×11.097, 16×11.381, 16×13.178, 16×13.772, 16×15.432, 16×16.431, 16×17.990, 16×19.299, 16×20.845, 16×22.342, 16×23.961, 16×25.615, 16×27.368, 16×29.207, 16×31.167, 8×33.030, 8×33.587, 8×35.254, 8×36.343, 8×37.960, 8×39.486, 8×41.216, 8×43.066, 4×44.886, 4×45.379, 4×47.056, 4×48.133, 4×49.794, 4×51.421, 2×53.177, 2×53.420, 2×55.111, 2×55.810, 2×57.490, 2×58.865, 2×60.642, 62.380, 62.859, 64.538, 65.669, 67.406, 69.233, 71.362, 73.794, 76.594, 79.911]

32.0 dB: u=[31×1.000, 32×3.005, 16×4.906, 16×5.162, 16×6.884, 16×7.371, 16×8.959, 16×9.758, 16×11.233, 16×12.303, 16×13.718, 16×14.953, 16×16.368,

16×17.713, 16×19.168, 16×20.611, 16×22.136, 16×23.689, 16×25.318, 16×27.005, 16×28.777, 16×30.641, 8×32.406, 8×32.911, 8×34.475, 8×35.447, 8×36.943, 8×38.299, 8×39.849, 8×41.458, 8×43.200, 4×44.914, 4×45.280, 4×46.866, 4×47.702, 4×49.237, 4×50.583, 4×52.185, 4×53.891, 2×55.585, 2×56.039, 2×57.609, 2×58.618, 2×60.179, 2×61.715, 63.362, 63.634, 65.211, 65.947, 67.522, 68.902, 70.603, 72.480, 74.597, 76.979, 79.680, 82.846]

33.0 dB: u=[15×1.000, 16×2.656, 16×4.659, 16×6.338, 16×8.339, 16×10.061, 16×12.073, 16×13.860, 16×15.884, 16×17.740, 16×19.787, 16×21.732, 16×23.829, 16×25.867, 16×28.025, 16×30.170, 16×32.420, 16×34.699, 16×37.075, 16×39.513, 16×42.050, 16×44.682, 16×47.447, 8×50.056, 8×50.753, 8×53.066, 8×54.403, 8×56.594, 8×58.485, 8×60.702, 8×62.933, 8×65.349, 8×67.888, 4×70.437, 4×70.835, 4×73.214, 4×74.193, 4×76.457, 4×78.198, 4×80.453, 4×82.713, 4×85.209, 2×87.700, 2×88.145, 2×90.484, 2×91.604, 2×93.875, 2×95.806, 2×98.139, 2×100.646, 103.126, 103.808, 106.101, 107.635, 109.922, 112.212, 114.848, 117.768, 120.987, 124.593, 128.669, 133.396]

34.0 dB: u=[15×1.000, 16×2.910, 16×4.914, 16×6.837, 16×8.852, 16×10.800, 16×12.835, 16×14.820, 16×16.886, 16×18.923, 16×21.032, 16×23.134, 16×25.302, 16×27.484, 16×29.731, 16×32.014, 16×34.363, 16×36.766, 16×39.245, 16×41.797, 16×44.442, 8×46.963, 8×47.466, 8×49.729, 8×50.752, 8×52.861, 8×54.433, 8×56.471, 8×58.382, 8×60.488, 8×62.626, 8×64.895, 8×67.262, 8×69.767, 8×72.434, 2×75.879, 4×74.910, 2×75.879, 2×78.018, 4×79.648, 2×78.018, 2×83.807, 4×81.746, 2×83.807, 2×86.066, 4×88.455, 2×86.066, 94.359, 93.474, 4×91.036, 93.474, 94.359, 96.532, 98.144, 100.316, 102.748, 102.097, 100.316, 98.144, 96.532, 110.726, 112.288, 107.629, 108.782, 104.829, 105.875, 114.329, 116.356, 118.648, 121.120, 123.844, 126.834, 130.110, 133.716, 137.733, 142.370]

35.0 dB: u=[15×1.000, 16×2.980, 16×4.986, 16×6.976, 16×8.995, 16×11.006, 16×13.047, 16×15.089, 16×17.165, 16×19.250, 16×21.373, 16×23.516, 16×25.698, 16×27.910, 16×30.169, 16×32.470, 16×34.824, 16×37.232, 16×39.709, 8×42.039, 8×42.549, 8×44.612, 8×45.583, 8×47.500, 8×48.917, 8×50.760, 8×52.445, 8×54.317, 8×56.169, 8×58.133, 8×60.138, 8×62.241, 8×64.416, 8×66.691, 8×69.074, 4×71.349, 4×71.882, 4×73.916, 4×74.991, 4×76.908, 4×78.487, 4×80.393, 4×82.276, 4×84.312, 4×86.433, 4×88.693, 4×91.106, 2×94.247, 2×93.357, 2×97.730, 2×96.194, 2×105.929, 2×99.672, 2×101.622, 2×103.709, 111.614, 110.607, 115.222, 113.576, 119.242, 117.235, 2×108.352, 130.818, 122.816, 125.254, 127.929, 134.631, 138.060, 141.862, 146.197]

36.0 dB: u=[15×1.000, 16×2.996, 16×4.999, 16×7.002, 16×9.020, 16×11.044, 16×13.083, 16×15.133, 16×17.204, 16×19.293, 16×21.407, 16×23.546, 16×25.715, 16×27.915, 16×30.151, 16×32.432, 8×34.584, 8×34.988, 8×36.904, 8×37.673, 8×39.442, 8×40.601, 8×42.272, 8×43.686, 8×45.338, 8×46.893, 8×48.581, 8×50.242, 8×51.994, 8×53.758, 8×55.598, 8×57.476, 8×59.426, 8×61.434, 8×63.520, 8×65.683, 8×67.948, 4×70.028, 4×70.770, 4×72.551, 4×73.776, 4×75.476, 4×77.022, 4×78.759, 4×80.501, 4×82.357, 4×84.279, 4×86.305, 4×88.431, 2×90.923, 2×90.491, 2×93.707, 2×92.787, 2×96.882, 2×95.464, 2×100.340, 2×98.620, 2×104.159, 2×102.204, 108.270, 108.694, 2×106.240, 113.253, 114.725, 110.551, 111.487, 120.208, 130.311, 116.502, 118.323, 123.098, 125.334, 127.738, 133.707, 136.690, 139.915, 143.462, 147.486]

37.0 dB: u=[15×1.000, 16×3.000, 16×5.004, 16×7.012, 16×9.028, 16×11.052, 16×13.087, 16×15.135, 16×17.199, 16×19.280, 16×21.382, 16×23.512, 8×25.525, 8×25.850, 8×27.654, 8×28.265, 8×29.928, 8×30.878, 8×32.429, 8×33.625, 8×35.127, 8×36.455, 8×37.956, 8×39.366, 8×40.891, 8×42.368, 8×43.933, 8×45.480, 8×47.097, 8×48.716, 8×50.392, 8×52.090, 8×53.843, 8×55.630, 8×57.471, 8×59.361, 8×61.312, 8×63.319, 8×65.405, 4×67.333, 4×67.921, 4×69.586, 4×70.600, 4×72.166, 4×73.494, 4×75.047, 4×76.552, 4×78.169, 4×79.809, 4×81.529, 4×83.305, 4×85.161, 4×87.094, 4×89.122, 2×91.026, 2×91.565, 2×93.241, 2×94.243, 2×95.824, 2×97.192, 2×98.780, 2×100.362, 2×102.058, 2×103.818, 2×105.680, 2×107.640, 109.526, 109.980, 111.676, 112.604, 114.212, 115.583, 117.197, 118.838, 120.607, 127.529, 129.752, 122.428, 134.624, 132.114, 125.459, 137.294, 140.142, 143.214, 146.566, 150.358]

38.0 dB: u=[15×1.000, 16×3.001, 16×5.004, 16×7.011, 16×9.026, 16×11.049, 16×13.093, 8×14.975, 8×15.399, 8×17.034, 8×17.729, 8×19.241, 8×20.190, 8×21.617, 8×22.723, 8×24.113, 8×25.304, 8×26.687, 8×27.932, 8×29.324, 8×30.614, 8×32.021, 8×33.354, 8×34.781, 8×36.158, 8×37.611, 8×39.035, 8×40.521, 8×41.994, 8×43.521, 8×45.051, 8×46.625, 8×48.214, 8×49.844, 8×51.499, 8×53.196, 8×54.926, 8×56.699, 8×58.511, 8×60.369, 8×62.276, 8×64.248, 4×66.601, 4×66.065, 4×69.076, 4×68.166, 4×71.736, 4×70.541, 4×74.526, 4×73.172, 4×77.460, 4×75.997, 4×80.568, 4×79.001, 4×83.880, 4×82.201, 4×87.425, 4×85.623, 4×91.268, 4×89.299, 96.378, 2×95.281, 96.378, 93.064, 2×93.763, 93.064, 102.183, 2×100.680, 102.183, 97.836, 2×99.185, 97.836, 108.930, 2×107.134, 108.930, 103.773, 2×105.413, 103.773, 117.128, 115.645, 114.686, 118.432, 110.824, 113.121, 112.603, 110.824, 130.377, 132.455, 126.519, 128.398, 119.932, 124.739, 123.054, 121.441, 137.552, 135.241, 140.525, 143.114, 145.868, 148.830, 152.056, 155.678]

39.0 dB: u=[7×1.000, 8×2.648, 8×4.650, 8×6.303, 8×8.307, 8×9.971, 8×11.973, 8×13.655, 8×15.660, 8×17.366, 8×19.374, 8×21.107, 8×23.117, 8×24.880, 8×26.897, 8×28.695, 8×30.719, 8×32.554, 8×34.589, 8×36.465, 8×38.514, 8×40.433, 8×42.501, 8×44.463, 8×46.555, 8×48.566, 8×50.684, 8×52.748, 8×54.903, 8×57.021, 8×59.216, 8×61.393, 8×63.637, 8×65.879, 8×68.182, 8×70.496, 8×72.865, 8×75.258, 8×77.702, 8×80.183, 8×82.718, 8×85.299, 8×87.936, 8×90.623, 8×93.368, 8×96.175, 8×99.064, 2×101.745, 4×102.436, 2×101.745, 2×105.992, 4×104.768, 2×105.992, 2×108.157, 4×109.818, 2×108.157, 2×113.809, 4×111.908, 2×113.809, 2×115.922, 4×117.978, 2×115.922, 2×122.348, 4×120.161, 2×122.348, 2×124.633, 4×126.954, 2×124.633, 2×131.821, 4×129.357, 2×131.821, 2×134.371, 4×137.001, 2×134.371, 2×142.546, 4×139.724, 2×142.546, 2×145.190, 2×149.459, 2×148.197, 2×145.876, 2×155.500, 2×153.382, 2×151.631, 2×157.538, 2×159.798, 2×161.874, 164.431, 2×167.000, 165.022, 172.094, 2×169.513, 172.094, 174.791, 2×177.621, 174.791, 183.383, 181.170, 180.221, 185.009, 187.167, 189.199, 191.353, 193.543, 195.863, 198.260, 200.786, 203.425, 206.198, 209.105, 212.158, 215.358, 218.720, 222.251, 225.964, 229.879, 234.024, 238.437, 243.252, 248.655]

40.0 dB: u=[7×1.000, 8×2.904, 8×4.905, 8×6.809, 8×8.808, 8×10.721, 8×12.724, 8×14.646, 8×16.657, 8×18.594, 8×20.616, 8×22.572, 8×24.607, 8×26.585, 8×28.635, 8×30.635, 8×32.699, 8×34.720, 8×36.804, 8×38.856, 8×40.965, 8×43.052, 8×45.192, 8×47.316, 8×49.488, 8×51.654, 8×53.862, 8×56.071, 8×58.318, 8×60.570, 8×62.862, 8×65.174, 8×67.526, 8×69.899, 8×72.310, 8×74.749, 8×77.227, 8×79.737, 8×82.287, 8×84.875, 8×87.508, 8×90.185, 8×92.915, 8×95.715, 4×99.021, 4×98.270, 4×102.436, 4×101.206, 4×106.055, 4×104.471, 4×109.800, 4×108.025, 4×113.679, 4×111.782, 4×117.691, 4×115.701, 4×121.865, 4×119.779, 4×126.220, 4×124.028, 4×130.790, 4×128.484, 4×135.590, 4×133.162, 4×140.652, 4×138.086, 4×146.023, 4×143.289, 2×152.750, 2×151.470, 2×149.292, 2×148.548, 2×160.400, 2×158.466, 2×156.471, 2×154.787, 2×164.555, 2×166.704, 2×168.896, 2×162.476, 2×178.475, 2×171.187, 2×173.535, 2×175.967, 2×183.795, 186.296, 187.103, 189.251, 190.597, 2×181.079, 207.690, 202.438, 192.632, 194.382, 196.405, 198.390, 200.572, 205.578, 218.005, 215.272, 223.827, 220.857, 230.164, 226.928, 212.648, 210.135, 237.031, 245.237, 241.382, 233.522, 250.244, 254.565, 264.978, 259.760]

a2) 64-QAM/8-PAM for the AWGN channel (maximum penalty of 0.01 b/s/Hz)

0.0 dB: u=[3×1.000]

1.0 dB: u=[3×1.000]

2.0 dB: u=[3×1.000]

3.0 dB: u=[1.000, 2×2.265]

4.0 dB: u=[1.000, 2×2.842]

5.0 dB: u=[1.000, 2×3.337]

6.0 dB: u=[1.000, 2×3.672]

7.0 dB: u=[1.000, 2×3.774]

8.0 dB: u=[1.000, 2×3.734]

b2) 256-QAM/16-PAM for the AWGN channel (maximum penalty of 0.01 b/s/Hz)

0.0 dB: u=[7×1.000]

1.0 dB: u=[7×1.000]

2.0 dB: u=[7×1.000]

3.0 dB: u=[3×1.000, 4×2.265]

4.0 dB: u=[3×1.000, 4×2.843]

5.0 dB: u=[3×1.000, 4×3.337]

6.0 dB: u=[3×1.000, 4×3.672]

7.0 dB: u=[3×1.000, 4×3.773]

8.0 dB: u=[3×1.000, 3.454, 3.097, 3.454, 5.095]

9.0 dB: u=[3×1.000, 3.393, 3.077, 3.393, 5.293]

10.0 dB: u=[1.000, 2×1.417, 2×3.680, 4.472, 6.457]

11.0 dB: u=[1.000, 2×1.811, 2×4.087, 5.712, 7.600]

12.0 dB: u=[1.000, 2×2.219, 2×4.542, 6.667, 8.767]

13.0 dB: u=[1.000, 2×2.620, 4.719, 5.258, 7.485, 9.942]

14.0 dB: u=[1.000, 2×2.885, 4.980, 5.626, 8.030, 10.779]

15.0 dB: u=[1.000, 2×3.018, 5.130, 5.838, 8.299, 11.178]

16.0 dB: u=[1.000, 2×3.079, 5.186, 5.980, 8.375, 11.244]

17.0 dB: u=[1.000, 2×3.099, 5.146, 6.168, 8.377, 11.143]

c2) 1024-QAM/32-PAM for the AWGN channel (maximum penalty of 0.01 b/s/Hz)

0.0 dB: u=[15×1.000]

1.0 dB: u=[15×1.000]

2.0 dB: u=[15×1.000]

3.0 dB: u=[7×1.000, 8×2.266]

4.0 dB: u=[7×1.000, 8×2.849]

5.0 dB: u=[7×1.000, 8×3.336]

6.0 dB: u=[7×1.000, 8×3.668]

7.0 dB: u=[7×1.000, 3.718, 3×3.247, 3.718, 3.247, 3.718, 5.583]

8.0 dB: u=[7×1.000, 3.732, 3×3.310, 3.732, 3.310, 3.732, 6.013]

9.0 dB: u=[7×1.000, 2×3.439, 2×3.149, 2×3.439, 4.220, 6.073]

10.0 dB: u=[3×1.000, 2×1.302, 2×1.000, 3.432, 3.742, 3.432, 3.221, 3.432, 3.742, 4.956, 6.589]

11.0 dB: u=[3×1.000, 4×1.827, 4×4.113, 3×6.080, 8.623]

12.0 dB: u=[3×1.000, 4×2.254, 4×4.583, 3×7.075, 9.870]

13.0 dB: u=[3×1.000, 4×2.605, 4×4.964, 3×7.896, 11.047]

14.0 dB: u=[3×1.000, 4×2.852, 2×4.972, 2×5.531, 2×7.932, 9.778, 12.105]

15.0 dB: u=[3×1.000, 4×2.991, 2×5.104, 2×5.765, 7.961, 8.482, 10.428, 12.892]

16.0 dB: u=[3×1.000, 4×3.063, 2×5.173, 2×5.916, 8.071, 8.636, 10.752, 13.319]

17.0 dB: u=[3×1.000, 4×3.092, 2×5.161, 2×6.053, 8.073, 8.669, 10.809, 13.379]

18.0 dB: u=[3×1.000, 2×2.853, 2×3.366, 2×5.108, 2×6.328, 8.143, 8.790, 10.854, 13.351]

19.0 dB: u=[1.000, 2×1.714, 2×3.689, 2×4.830, 2×6.860, 2×8.793, 11.029, 12.021, 14.586, 17.762]

20.0 dB: u=[1.000, 2×2.547, 2×4.588, 2×6.419, 2×8.668, 2×11.156, 13.777, 15.283, 18.195, 21.909]

21.0 dB: u=[1.000, 2×2.877, 2×4.945, 2×7.032, 2×9.390, 2×12.122, 14.875, 16.901, 19.832, 23.605]

22.0 dB: u=[1.000, 2×2.988, 2×5.065, 2×7.242, 2×9.652, 11.970, 13.095, 15.312, 17.587, 20.467, 24.094]

23.0 dB: u=[1.000, 2×3.011, 2×5.091, 2×7.288, 9.376, 10.130, 12.040, 13.561, 15.616, 17.939, 20.714, 24.127]

24.0 dB: u=[1.000, 2×3.017, 2×5.102, 2×7.355, 9.386, 10.592, 12.301, 14.031, 16.039, 18.330, 20.996, 24.207]

25.0 dB: u=[1.000, 2×3.036, 4.849, 5.583, 7.098, 8.231, 9.725, 11.176, 12.812, 14.585, 16.570, 18.804, 21.359, 24.391]

d2) 4096-QAM/64-PAM for the AWGN channel (maximum penalty of 0.01 b/s/Hz)

0.0 dB: u=[31×1.000]

1.0 dB: u=[31×1.000]

2.0 dB: u=[31×1.000]

3.0 dB: u=[15×1.000, 16×2.265]

4.0 dB: u=[15×1.000, 16×2.840]

5.0 dB: u=[15×1.000, 16×3.336]

6.0 dB: u=[15×1.000, 16×3.673]

7.0 dB: u=[15×1.000, 3.420, 3.931, 7×3.420, 3.931, 3×3.420, 3.931, 6.619, 3.931]

8.0 dB: u=[15×1.000, 3.969, 7×3.474, 3.969, 3×3.474, 3.969, 3.474, 3.969, 6.792]

9.0 dB: u=[15×1.000, 3.469, 3.867, 3.469, 3×3.215, 3.469, 3.215, 3.469, 3.867, 3.469, 3.215, 3.469, 3.867, 5.309, 6.798]

10.0 dB: u=[7×1.000, 8×1.372, 8×3.650, 4.183, 3×4.436, 2×5.516, 6.290, 7.980]

11.0 dB: u=[7×1.000, 8×1.818, 8×4.102, 6×6.077, 7.640, 9.593]

12.0 dB: u=[7×1.000, 8×2.235, 8×4.559, 6×7.047, 8.823, 10.982]

13.0 dB: u=[7×1.000, 8×2.617, 8×4.976, 4×7.560, 8.210, 8.760, 9.982, 12.237]

14.0 dB: u=[7×1.000, 8×2.850, 4×4.972, 4×5.521, 4×7.921, 2×9.749, 11.037, 13.294]

15.0 dB: u=[7×1.000, 8×2.987, 4×5.103, 4×5.753, 4×8.199, 2×10.357, 11.955, 14.209]

16.0 dB: u=[7×1.000, 8×3.058, 4×5.170, 4×5.898, 2×8.065, 2×8.590, 10.431, 10.930, 12.610, 14.901]

17.0 dB: u=[7×1.000, 8×3.089, 4×5.164, 4×6.021, 2×8.062, 2×8.636, 10.521, 11.028, 12.897, 15.237]

18.0 dB: u=[7×1.000, 4×2.871, 4×3.337, 4×5.111, 4×6.267, 2×8.107, 2×8.729, 10.572, 11.079, 12.994, 15.323]

19.0 dB: u=[3×1.000, 4×1.583, 4×3.546, 4×4.556, 4×6.550, 4×8.365, 2×10.528, 2×11.418, 13.629, 14.307, 16.686, 19.573]

20.0 dB: u=[3×1.000, 4×2.458, 4×4.492, 4×6.251, 4×8.473, 4×10.890, 2×13.465, 2×14.809, 2×17.814, 21.118, 24.602]

21.0 dB: u=[3×1.000, 4×2.842, 4×4.906, 4×6.964, 4×9.303, 2×11.630, 2×12.349, 2×14.708, 2×16.610, 19.124, 20.381, 23.243, 26.857]

22.0 dB: u=[3×1.000, 4×2.971, 4×5.048, 4×7.211, 4×9.602, 2×11.925, 2×12.920, 2×15.175, 2×17.400, 19.872, 21.565, 24.287, 27.805]

23.0 dB: u=[3×1.000, 4×3.008, 4×5.087, 4×7.277, 4×9.708, 2×11.988, 2×13.375, 2×15.453, 17.434, 18.215, 20.268, 22.212, 24.831, 28.169]

24.0 dB: u=[3×1.000, 4×3.015, 4×5.093, 4×7.308, 2×9.337, 2×10.376, 2×12.134, 2×13.791, 2×15.800, 17.760, 18.781, 20.693, 22.738, 25.267, 28.415]

25.0 dB: u=[3×1.000, 4×3.021, 4×5.138, 2×7.025, 2×7.968, 2×9.534, 2×10.914, 2×12.555, 2×14.309, 16.054, 16.647, 18.303, 19.611, 21.420, 23.482, 25.937, 28.932]

26.0 dB: u=[1.000, 2×2.141, 2×4.125, 2×5.413, 2×7.372, 2×8.904, 2×10.870, 2×12.675, 2×14.736, 2×16.835, 2×19.148, 2×21.683, 24.118, 25.242, 27.472, 29.544, 32.086, 35.010, 38.427, 42.552]

27.0 dB: u=[1.000, 2×2.790, 2×4.801, 2×6.655, 2×8.706, 2×10.682, 2×12.820, 2×14.977, 2×17.286, 2×19.711, 2×22.340, 2×25.289, 29.748, 28.013, 34.572, 32.089, 40.637, 37.412, 45.092, 49.504]

28.0 dB: u=[1.000, 2×2.952, 2×4.969, 2×6.972, 2×9.048, 2×11.145, 2×13.331, 2×15.586, 2×17.958, 2×20.470, 2×23.239, 25.745, 27.254, 29.338, 31.413, 33.756, 36.326, 39.189, 42.387, 46.003, 50.241]

29.0 dB: u=[1.000, 2×2.994, 2×5.014, 2×7.048, 2×9.124, 2×11.244, 2×13.431, 2×15.694, 2×18.076, 2×20.697, 23.005, 24.437, 26.277, 28.091, 30.092, 32.230, 34.555, 37.093, 39.868, 42.923, 46.331, 50.284]

30.0 dB: u=[1.000, 2×3.001, 2×5.017, 2×7.054, 2×9.124, 2×11.238, 2×13.423, 2×15.753, 17.796, 18.910, 20.535, 21.978, 23.627, 25.285, 27.064, 28.931, 30.927, 33.057, 35.346, 37.807, 40.470, 43.372, 46.582, 50.264]

31.0 dB: u=[1.000, 2×3.003, 2×5.020, 2×7.066, 2×9.181, 2×11.448, 13.368, 14.480, 15.939, 17.246, 18.719, 20.155, 21.693, 23.254, 24.898, 26.606, 28.405, 30.298, 32.300, 34.422, 36.678, 39.084, 41.662, 44.449, 47.509, 50.990]

e2) 16384-QAM/128-PAM for the AWGN channel (maximum penalty of 0.01 b/s/Hz)

0.0 dB: u=[63×1.000]

1.0 dB: u=[63×1.000]

2.0 dB: u=[63×1.000]

3.0 dB: u=[31×1.000, 32×2.177]

4.0 dB: u=[31×1.000, 32×2.836]

5.0 dB: u=[31×1.000, 32×3.333]

6.0 dB: u=[31×1.000, 32×3.673]

7.0 dB: u=[31×1.000, 31×3.653, 7.483]

8.0 dB: u=[31×1.000, 3.523, 4.171, 15×3.523, 4.171, 7×3.523, 4.171, 3×3.523, 4.171, 6.068, 7.414]

9.0 dB: u=[31×1.000, 3.320, 3.683, 3.936, 3.683, 13×3.320, 3.683, 3.936, 3.683, 5×3.320, 3.683, 3.936, 3.683, 5.430, 5.313, 6.131, 7.265]

10.0 dB: u=[15×1.000, 16×1.388, 16×3.660, 8×4.456, 2×6.506, 4×5.507, 7.124, 8.725]

11.0 dB: u=[15×1.000, 16×1.816, 16×4.096, 12×6.080, 2×7.705, 8.533, 10.365]

12.0 dB: u=[15×1.000, 16×2.236, 16×4.562, 12×7.058, 2×8.855, 11.825, 9.973]

13.0 dB: u=[15×1.000, 16×2.596, 16×4.952, 8×7.462, 4×8.736, 9.766, 10.072, 11.163, 13.220]

14.0 dB: u=[15×1.000, 16×2.848, 8×4.966, 8×5.521, 8×7.915, 9.701, 10.719, 10.201, 2×9.701, 10.719, 12.192, 14.614]

15.0 dB: u=[15×1.000, 16×2.988, 8×5.104, 8×5.752, 8×8.199, 4×10.360, 2×11.890, 13.242, 15.414]

16.0 dB: u=[15×1.000, 16×3.057, 8×5.168, 8×5.893, 4×8.068, 4×8.577, 2×10.450, 2×10.871, 12.299, 12.764, 14.054, 16.196]

17.0 dB: u=[15×1.000, 16×3.088, 8×5.166, 8×6.009, 4×8.059, 4×8.622, 4×10.749, 12.590, 13.067, 14.608, 16.752]

18.0 dB: u=[15×1.000, 8×2.878, 8×3.327, 8×5.113, 8×6.245, 4×8.096, 4×8.707, 2×10.551, 2×11.043, 12.721, 13.182, 14.884, 17.042]

19.0 dB: u=[7×1.000, 8×1.532, 8×3.491, 8×4.447, 8×6.430, 8×8.197, 4×10.331, 4×11.189, 2×13.369, 2×14.015, 16.092, 16.659, 18.836, 21.510]

20.0 dB: u=[7×1.000, 8×2.411, 8×4.441, 8×6.165, 8×8.372, 8×10.757, 4×13.310, 4×14.595, 2×17.128, 2×18.007, 20.513, 21.240, 23.934, 27.213]

21.0 dB: u=[7×1.000, 8×2.827, 8×4.888, 8×6.933, 8×9.263, 4×11.584, 4×12.274, 4×14.635, 4×16.481, 2×18.998, 2×20.151, 22.686, 23.583, 26.399, 29.858]

22.0 dB: u=[7×1.000, 8×2.965, 8×5.040, 8×7.196, 8×9.582, 4×11.903, 4×12.865, 4×15.126, 4×17.313, 2×19.770, 2×21.371, 23.727, 24.888, 27.571, 30.969]

23.0 dB: u=[7×1.000, 8×3.005, 8×5.082, 8×7.270, 8×9.690, 4×11.967, 4×13.302, 4×15.388, 2×17.361, 2×18.087, 2×20.145, 2×22.043, 24.290, 25.813, 28.317, 31.558]

24.0 dB: u=[7×1.000, 8×3.015, 8×5.092, 8×7.300, 4×9.334, 4×10.309, 4×12.090, 4×13.714, 4×15.715, 2×17.670, 2×18.604, 2×20.533, 2×22.591, 24.801, 26.551, 28.954, 32.025]

25.0 dB: u=[7×1.000, 8×3.020, 8×5.124, 4×7.016, 4×7.883, 4×9.478, 4×10.821, 4×12.467, 4×14.205, 2×15.954, 2×16.491, 2×18.159, 2×19.396, 2×21.210, 22.964, 23.782, 25.568, 27.419, 29.759, 32.683]

26.0 dB: u=[3×1.000, 4×1.884, 4×3.855, 4×4.927, 4×6.843, 4×8.215, 4×10.105, 4×11.782, 4×13.738, 4×15.713, 4×17.893, 4×20.273, 2×22.570, 2×23.555, 2×25.674, 2×27.571, 2×29.989, 32.352, 33.735, 36.025, 38.572, 41.664, 45.470]

27.0 dB: u=[3×1.000, 4×2.745, 4×4.753, 4×6.566, 4×8.609, 4×10.551, 4×12.676, 4×14.803, 4×17.089, 4×19.483, 4×22.077, 4×24.963, 2×27.649, 2×29.257, 2×31.590, 2×34.012, 2×36.929, 39.733, 41.723, 44.342, 47.359, 50.916, 55.220]

28.0 dB: u=[3×1.000, 4×2.934, 4×4.950, 4×6.934, 4×9.004, 4×11.085, 4×13.261, 4×15.500, 4×17.856, 4×20.345, 4×23.061, 26.883, 2×25.549, 26.883, 28.997, 2×30.983, 28.997, 35.865, 2×33.295, 35.865, 39.681, 41.897, 44.144, 38.325, 49.799, 46.784, 53.994, 58.160]

29.0 dB: u=[3×1.000, 4×2.988, 4×5.007, 4×7.036, 4×9.114, 4×11.232, 4×13.416, 4×15.675, 4×18.045, 4×20.600, 22.896, 2×24.145, 22.896, 27.774, 2×26.034, 27.774, 29.763, 2×31.861, 29.763, 36.863, 2×34.180, 36.863, 41.043, 43.147, 45.453, 39.320, 50.968, 48.048, 54.910, 58.822]

30.0 dB: u=[3×1.000, 4×3.000, 4×5.016, 4×7.051, 4×9.121, 4×11.232, 4×13.405, 4×15.676, 4×18.150, 2×20.295, 2×21.595, 2×23.273, 2×24.873, 2×26.639, 2×28.470, 2×30.436, 2×32.551, 2×34.942, 37.104, 38.513, 40.306, 42.170, 44.245, 46.527, 49.052, 51.851, 54.998, 58.656]

31.0 dB: u=[3×1.000, 4×3.003, 4×5.019, 4×7.054, 4×9.125, 4×11.267, 4×13.569, 2×15.535, 2×16.677, 2×18.190, 2×19.557, 2×21.091, 2×22.613, 2×24.235, 2×25.904, 2×27.669, 2×29.524, 2×31.508, 2×33.712, 35.686, 36.918, 38.517, 40.116, 41.883, 43.779, 45.847, 48.096, 50.551, 53.249, 56.249, 59.711]

32.0 dB: u=[3×1.000, 4×3.013, 4×5.079, 4×7.260, 2×9.090, 2×10.097, 2×11.482, 2×12.648, 2×14.021, 2×15.290, 2×16.687, 2×18.042, 2×19.489, 2×20.937, 2×22.460, 2×24.017, 2×25.645, 2×27.335, 2×29.110, 2×30.987, 2×33.055, 34.885, 35.997, 37.462, 38.884, 40.452, 42.102, 43.877, 45.783, 47.836, 50.050, 52.443, 55.051, 57.933, 61.231]

33.0 dB: u=[1.000, 2×2.762, 2×4.766, 2×6.547, 2×8.555, 2×10.371, 2×12.392, 2×14.256, 2×16.299, 2×18.227, 2×20.305, 2×22.314, 2×24.444, 2×26.544, 2×28.745, 2×30.954, 2×33.252, 2×35.590, 2×38.020, 2×40.522, 2×43.123, 2×45.824, 2×48.677, 2×51.806, 54.547, 56.212, 58.368, 60.435, 62.704, 65.049, 67.558, 70.213, 73.046, 76.062, 79.283, 82.728, 86.428, 90.433, 94.832, 99.852]

34.0 dB: u=[1.000, 2×2.943, 2×4.950, 2×6.907, 2×8.928, 2×10.909, 2×12.948, 2×14.965, 2×17.043, 2×19.112, 2×21.236, 2×23.367, 2×25.550, 2×27.758, 2×30.021, 2×32.328, 2×34.694, 2×37.116, 2×39.612, 2×42.186, 2×44.868, 2×47.764, 2×51.004, 53.703, 55.498, 57.510, 59.526, 61.671, 63.886, 66.220, 68.665, 71.237, 73.948, 76.809, 79.828, 83.024, 86.409, 90.026, 93.913, 98.160, 102.946]

35.0 dB: u=[1.000, 2×2.994, 2×5.002, 2×7.004, 2×9.027, 2×11.050, 2×13.097, 2×15.150, 2×17.233, 2×19.328, 2×21.461, 2×23.614, 2×25.805, 2×28.030, 2×30.293, 2×32.600, 2×34.961, 2×37.382, 2×39.923, 2×42.690, 2×45.736, 48.209, 49.842, 51.639, 53.417, 55.298, 57.211, 59.205, 61.266, 63.411, 65.644, 67.971, 70.400, 72.940, 75.594, 78.374, 81.287, 84.349, 87.577, 90.999, 94.654, 98.612, 103.054]

36.0 dB: u=[1.000, 2×2.999, 2×5.002, 2×7.009, 2×9.026, 2×11.051, 2×13.089, 2×15.141, 2×17.211, 2×19.300, 2×21.411, 2×23.547, 2×25.710, 2×27.910, 2×30.167, 2×32.544, 2×35.125, 37.258, 38.564, 40.135, 41.577, 43.166, 44.701, 46.334, 47.954, 49.649, 51.360, 53.135, 54.946, 56.821, 58.748, 60.741, 62.799, 64.931, 67.137, 69.424, 71.796, 74.259, 76.818, 79.482, 82.261, 85.166, 88.211, 91.422, 94.837, 98.522, 102.628]

37.0 dB: u=[1.000, 2×3.000, 2×5.000, 2×7.007, 2×9.021, 2×11.041, 2×13.073, 2×15.117, 2×17.179, 2×19.282, 2×21.477, 2×23.822, 2×26.316, 28.304, 29.538, 30.962, 32.269, 33.704, 35.065, 36.522, 37.937, 39.428, 40.895, 42.428, 43.953, 45.536, 47.126, 48.764, 50.430, 52.143, 53.885, 55.680, 57.517, 59.408, 61.348, 63.347, 65.404, 67.519, 69.702, 71.955, 74.279, 76.680, 79.165, 81.738, 84.409, 87.195, 90.105, 93.161, 96.396, 99.876, 103.730]

f2) 65536-QAM/256-PAM for the AWGN channel (maximum penalty of 0.01 b/s/Hz)

0.0 dB: u=[127×1.000]

1.0 dB: u=[127×1.000]

2.0 dB: u=[127×1.000]

3.0 dB: u=[63×1.000, 64×2.176]

4.0 dB: u=[63×1.000, 64×2.831]

5.0 dB: u=[63×1.000, 64×3.319]

6.0 dB: u=[63×1.000, 64×3.669]

7.0 dB: u=[63×1.000, 62×3.653, 2×7.428]

8.0 dB: u=[63×1.000, 2×3.524, 2×4.158, 30×3.524, 2×4.158, 14×3.524, 2×4.158, 6×3.524, 2×4.158, 6.043, 6.215, 7.680, 7.029]

9.0 dB: u=[39×1.000, 8×1.208, 16×1.000, 4×3.414, 3.949, 3.867, 3.709, 3.790, 27×3.414, 3.709, 4.025, 3.949, 3.790, 3.867, 8×3.414, 3.709, 3.414, 3.790, 3.867, 4.195, 4.124, 3.949, 4.025, 2×5.585, 2×5.457, 6.201, 6.432, 7.835, 6.982]

10.0 dB: u=[31×1.000, 32×1.371, 32×3.646, 16×4.371, 8×5.529, 4×6.363, 7.504, 7.172, 7.721, 9.329]

11.0 dB: u=[31×1.000, 32×1.819, 32×4.102, 24×6.089, 4×7.686, 2×8.970, 11.102, 8.970]

12.0 dB: u=[31×1.000, 32×2.239, 32×4.564, 24×7.060, 4×8.864, 2×10.201, 10.753, 12.687]

13.0 dB: u=[31×1.000, 32×2.599, 32×4.956, 16×7.464, 8×8.718, 4×9.994, 2×11.216, 12.193, 14.175]

14.0 dB: u=[31×1.000, 32×2.847, 16×4.969, 16×5.523, 16×7.918, 8×9.772, 4×11.041, 2×12.243, 15.485, 13.454]

15.0 dB: u=[31×1.000, 32×2.985, 16×5.098, 16×5.749, 16×8.192, 8×10.348, 4×11.936, 2×13.138, 14.441, 16.525]

16.0 dB: u=[31×1.000, 32×3.057, 16×5.170, 16×5.895, 8×8.067, 8×8.580, 8×10.657, 4×12.534, 2×13.991, 15.329, 17.384]

17.0 dB: u=[31×1.000, 32×3.087, 16×5.162, 16×6.005, 8×8.053, 8×8.616, 4×10.508, 4×10.968, 2×12.598, 2×13.010, 14.298, 14.760, 16.006, 18.015]

18.0 dB: u=[31×1.000, 16×2.882, 16×3.323, 16×5.115, 16×6.236, 8×8.092, 8×8.703, 4×10.548, 4×11.034, 2×12.707, 2×13.149, 14.596, 15.045, 16.504, 18.510]

19.0 dB: u=[15×1.000, 16×1.512, 16×3.469, 16×4.404, 16×6.382, 16×8.128, 8×10.249, 8×11.102, 4×13.268, 4×13.898, 4×16.235, 18.400, 18.930, 20.886, 23.376]

20.0 dB: u=[15×1.000, 16×2.386, 16×4.414, 16×6.118, 16×8.317, 16×10.681, 8×13.219, 8×14.484, 4×17.007, 4×17.863, 4×20.710, 23.436, 24.086, 26.592, 29.684]

21.0 dB: u=[15×1.000, 16×2.820, 16×4.880, 16×6.919, 16×9.246, 8×11.565, 8×12.244, 8×14.603, 8×16.419, 4×18.933, 4×20.059, 2×22.600, 2×23.459, 25.960, 26.703, 29.412, 32.727]

22.0 dB: u=[15×1.000, 16×2.962, 16×5.037, 16×7.191, 16×9.578, 8×11.900, 8×12.854, 8×15.118, 8×17.292, 4×19.744, 4×21.306, 23.668, 2×24.741, 23.668, 30.643, 27.984, 27.122, 33.921]

23.0 dB: u=[15×1.000, 16×3.005, 16×5.084, 16×7.272, 8×9.405, 8×9.977, 8×11.970, 8×13.288, 8×15.379, 4×17.349, 4×18.064, 4×20.124, 2×21.729, 2×22.257, 2×24.230, 2×25.676, 27.844, 28.971, 31.440, 34.588]

24.0 dB: u=[15×1.000, 16×3.015, 16×5.093, 16×7.299, 8×9.336, 8×10.290, 8×12.080, 8×13.695, 8×15.693, 4×17.647, 4×18.557, 4×20.488, 2×22.200, 2×22.835, 2×24.707, 2×26.420, 28.485, 29.923, 32.234, 35.223]

25.0 dB: u=[15×1.000, 16×3.019, 16×5.119, 8×7.013, 8×7.850, 8×9.457, 8×10.784, 8×12.431, 8×14.162,

8×16.173, 4×18.103, 4×19.312, 4×21.121, 2×22.865, 2×23.634, 2×25.421, 26.977, 27.597, 29.327, 30.957, 33.192, 36.048]

26.0 dB: u=[7×1.000, 8×1.751, 8×3.715, 8×4.672, 8×6.564, 8×7.850, 8×9.697, 8×11.309, 8×13.208, 8×15.117, 8×17.229, 8×19.530, 4×21.756, 4×22.685, 4×24.742, 4×26.554, 4×28.880, 2×31.151, 2×32.415, 2×34.639, 36.730, 37.664, 39.858, 42.102, 44.969, 48.567]

27.0 dB: u=[7×1.000, 8×2.720, 8×4.728, 8×6.519, 8×8.560, 8×10.483, 8×12.601, 8×14.713, 8×16.990, 8×19.369, 8×21.949, 8×24.810, 4×27.482, 4×29.033, 4×31.365, 4×33.752, 4×36.622, 2×39.387, 2×41.287, 2×43.909, 2×47.187, 50.441, 53.239, 56.649, 60.853]

28.0 dB: u=[7×1.000, 8×2.928, 8×4.944, 8×6.920, 8×8.990, 8×11.065, 8×13.238, 8×15.473, 8×17.828, 8×20.314, 8×23.015, 4×25.501, 4×26.777, 4×28.909, 4×30.873, 4×33.178, 4×35.725, 2×38.173, 2×39.456, 2×41.675, 2×43.881, 2×46.603, 49.238, 51.105, 53.590, 56.454, 59.836, 63.927]

29.0 dB: u=[7×1.000, 8×2.986, 8×5.004, 8×7.032, 8×9.109, 8×11.223, 8×13.408, 8×15.666, 8×18.031, 8×20.568, 4×22.862, 4×24.045, 4×25.955, 4×27.666, 4×29.653, 4×31.738, 4×34.042, 4×36.686, 2×39.119, 2×40.782, 2×42.873, 2×45.181, 47.419, 48.625, 50.667, 52.731, 55.171, 57.969, 61.203, 65.058]

30.0 dB: u=[7×1.000, 8×3.001, 8×5.020, 8×7.057, 8×9.131, 8×11.246, 8×13.421, 8×15.683, 8×18.127, 4×20.268, 4×21.504, 4×23.204, 4×24.782, 4×26.549, 4×28.369, 4×30.330, 4×32.432, 4×34.784, 2×36.929, 2×38.256, 2×40.052, 2×41.875, 2×43.937, 2×46.318, 48.534, 50.063, 51.990, 54.102, 56.491, 59.187, 62.258, 65.870]

31.0 dB: u=[7×1.000, 8×3.003, 8×5.019, 8×7.054, 8×9.122, 8×11.247, 8×13.502, 4×15.460, 4×16.513, 4×18.052, 4×19.381, 4×20.921, 4×22.424, 4×24.042, 4×25.699, 4×27.454, 4×29.296, 4×31.262, 4×33.418, 2×35.368, 2×36.504, 2×38.110, 2×39.660, 2×41.401, 2×43.273, 2×45.381, 47.329, 48.513, 50.173, 51.856, 53.758, 55.858, 58.191, 60.789, 63.713, 67.116]

32.0 dB: u=[7×1.000, 8×3.006, 8×5.044, 8×7.165, 4×8.995, 4×9.879, 4×11.320, 4×12.434, 4×13.833, 4×15.084, 4×16.495, 4×17.846, 4×19.301, 4×20.747, 4×22.273, 4×23.829, 4×25.460, 4×27.149, 4×28.924, 4×30.794, 4×32.828, 2×34.649, 2×35.673, 2×37.158, 2×38.541, 2×40.098, 2×41.722, 2×43.483, 2×45.409, 47.191, 48.124, 49.644, 51.049, 52.674, 54.418, 56.330, 58.425, 60.723, 63.256, 66.083, 69.345]

33.0 dB: u=[3×1.000, 4×2.712, 4×4.714, 4×6.435, 4×8.443, 4×10.207, 4×12.226, 4×14.042, 4×16.079, 4×17.969, 4×20.039, 4×22.012, 4×24.125, 4×26.187, 4×28.366, 4×30.537, 4×32.808, 4×35.112, 4×37.514, 4×39.982, 4×42.543, 4×45.207, 4×48.003, 4×51.017, 4×54.429, 2×57.335, 2×59.292, 2×61.525, 2×63.798, 2×66.245, 2×68.838, 2×71.635, 2×74.809, 77.634, 79.518, 81.802, 84.144, 86.728, 89.497, 92.509, 95.768, 99.325, 103.203, 107.495, 112.416]

34.0 dB: u=[3×1.000, 4×2.925, 4×4.928, 4×6.864, 4×8.882, 4×10.844, 4×12.883, 4×14.882, 4×16.950, 4×18.995, 4×21.107, 4×23.219, 4×25.393, 4×27.583, 4×29.835, 4×32.125, 4×34.479, 4×36.888, 4×39.369, 4×41.925, 4×44.576, 4×47.376, 4×50.468, 2×53.110, 2×54.771, 2×56.793, 2×58.742, 2×60.857, 2×63.018, 2×65.307, 2×67.698, 2×70.232, 2×72.952, 2×76.025, 78.702, 80.475, 82.580, 84.717, 87.028, 89.485, 92.117, 94.936, 97.958, 101.203, 104.696, 108.486, 112.652, 117.394]

35.0 dB: u=[3×1.000, 4×2.984, 4×4.987, 4×6.980, 4×8.997, 4×11.011, 4×13.053, 4×15.099, 4×17.174, 4×19.263, 4×21.385, 4×23.530, 4×25.714, 4×27.928, 4×30.187, 4×32.490, 4×34.843, 4×37.251, 4×39.735, 4×42.355, 4×45.234, 2×47.654, 2×49.164, 2×50.979, 2×52.698, 2×54.564, 2×56.433, 2×58.403, 2×60.420, 2×62.532, 2×64.719, 2×67.010, 2×69.421, 2×72.032, 74.352, 75.647, 77.507, 79.204, 81.118, 83.067, 85.144, 87.321, 89.634, 92.084, 94.688, 97.451, 100.380, 103.497, 106.828, 110.418, 114.336, 118.759]

36.0 dB: u=[3×1.000, 4×2.989, 4×4.993, 4×6.994, 4×8.995, 4×11.008, 4×13.043, 4×15.093, 4×17.158, 4×19.243, 4×21.356, 4×23.490, 4×25.650, 4×27.841, 4×30.070, 4×32.352, 4×34.740, 4×37.324, 2×39.484, 2×40.779, 2×42.392, 2×43.861, 2×45.497, 2×47.077, 2×48.747, 2×50.422, 2×52.167, 2×53.931, 2×55.770, 2×57.663, 2×59.621, 2×61.639, 2×63.727, 2×65.895, 2×68.191, 2×70.739, 72.922, 74.300, 75.964, 77.595, 79.344, 81.138, 83.037, 85.014, 87.092, 89.253, 91.537, 93.932, 96.465, 99.108, 101.914, 104.876, 108.021, 111.366, 115.037, 119.139]

37.0 dB: u=[3×1.000, 4×2.997, 4×4.999, 4×7.007, 4×9.024, 4×11.050, 4×13.079, 4×15.122, 4×17.181, 4×19.254, 4×21.355, 4×23.489, 4×25.693, 4×28.060, 4×30.601, 2×32.647, 2×33.919, 2×35.392, 2×36.746, 2×38.224, 2×39.653, 2×41.171, 2×42.666, 2×44.228, 2×45.790, 2×47.404, 2×49.033, 2×50.711, 2×52.418, 2×54.177, 2×55.990, 2×57.840, 2×59.741, 2×61.705, 2×63.727, 2×65.874, 2×68.222, 70.226, 71.454, 72.968, 74.399, 75.939, 77.501, 79.147, 80.824, 82.585, 84.404, 86.299, 88.276, 90.339, 92.487, 94.730, 97.075, 99.520, 102.070, 104.762, 107.588, 110.586, 113.773, 117.223, 121.065]

38.0 dB: u=[3×1.000, 4×3.005, 4×5.009, 4×7.018, 4×9.035, 4×11.062, 4×13.172, 4×15.424, 2×17.310, 2×18.358, 2×19.754, 2×20.913, 2×22.250, 2×23.456, 2×24.787, 2×26.031, 2×27.410, 2×28.692, 2×30.072, 2×31.374, 2×32.766, 2×34.142, 2×35.581, 2×36.981, 2×38.440, 2×39.894, 2×41.388, 2×42.911, 2×44.446, 2×45.974, 2×47.559, 2×49.143, 2×50.785, 2×52.468, 2×54.185, 2×55.946, 2×57.729, 2×59.552, 2×61.410, 2×63.338, 2×65.385, 2×67.626, 69.490, 70.624, 72.051, 73.323, 74.748, 76.151, 77.669, 79.176, 80.748, 82.337, 83.995, 85.730, 87.490, 89.327, 91.257, 93.258, 95.308, 97.438, 99.656, 101.980, 104.390, 106.909, 109.574, 112.319, 115.237, 118.346, 121.697, 125.593]

39.0 dB: u=[1.000, 2×2.751, 2×4.747, 2×6.496, 2×8.486, 2×10.232, 2×12.231, 2×13.997, 2×15.998, 2×17.792, 2×19.801, 2×21.616, 2×23.631, 2×25.469, 2×27.492, 2×29.361, 2×31.393, 2×33.296, 2×35.349, 2×37.291, 2×39.360, 2×41.336, 2×43.420, 2×45.435, 2×47.548, 2×49.608, 2×51.754, 2×53.869, 2×56.063, 2×58.237, 2×60.470, 2×62.701, 2×64.988, 2×67.283, 2×69.626, 2×71.986, 2×74.402, 2×76.842, 2×79.328, 2×81.856, 2×84.445, 2×87.089, 2×89.779, 2×92.518, 2×95.321, 2×98.201, 2×101.204, 2×104.464, 107.214, 108.859, 110.936, 112.827, 114.927, 116.964, 119.123, 121.275, 123.524, 125.798, 128.155, 130.567, 133.060, 135.620, 138.265, 140.991, 143.813, 146.722, 149.727, 152.824, 156.032, 159.353, 162.784, 166.332, 170.024, 173.856, 177.846, 182.017, 186.406, 191.051, 196.029, 201.527]

40.0 dB: u=[1.000, 2×2.968, 2×5.011, 2×7.027, 2×9.111, 2×11.119, 2×13.194, 2×15.207, 2×17.290, 2×19.326, 2×21.413, 2×23.450, 2×25.542, 2×27.597, 2×29.706, 2×31.783, 2×33.910, 2×36.005, 2×38.150, 2×40.263,

2×42.417, 2×44.591, 2×46.807, 2×49.019, 2×51.263, 2×53.505, 2×55.784, 2×58.072, 2×60.405, 2×62.733, 2×65.112, 2×67.506, 2×69.909, 2×72.329, 2×74.805, 2×77.307, 2×79.848, 2×82.426, 2×85.060, 2×87.718, 2×90.448, 2×93.242, 2×96.116, 2×99.155, 2×102.411, 105.112, 106.717, 108.719, 110.488, 112.474, 114.411, 116.467, 118.479, 120.599, 122.739, 124.950, 127.193, 129.496, 131.814, 134.178, 136.585, 139.086, 141.643, 144.315, 147.044, 149.863, 152.735, 155.692, 158.704, 161.825, 165.014, 168.299, 171.634, 175.110, 178.675, 182.371, 186.233, 190.233, 194.388, 198.750, 203.386, 208.349, 213.825]

g2) 262144-QAM/512-PAM for the AWGN channel (maximum penalty of 0.01 b/s/Hz)

0.0 dB: u=[255×1.000]

1.0 dB: u=[255×1.000]

2.0 dB: u=[255×1.000]

3.0 dB: u=[127×1.000, 128×2.176]

4.0 dB: u=[127×1.000, 128×2.828]

5.0 dB: u=[127×1.000, 128×3.320]

6.0 dB: u=[127×1.000, 128×3.670]

7.0 dB: u=[127×1.000, 124×3.635, 4×7.334]

8.0 dB: u=[127×1.000, 4×3.519, 2×4.141, 2×4.023, 60×3.519, 2×4.246, 2×4.023, 28×3.519, 2×4.246, 2×4.023, 10×3.519, 2×4.023, 2×4.459, 2×4.246, 2×6.136, 2×6.016, 2×7.034, 2×7.764]

9.0 dB: u=[15×1.000, 16×1.116, 16×1.253, 16×1.116, 16×1.253, 16×1.401, 16×1.253, 16×1.116, 4×3.971, 4.301, 4.367, 2×4.239, 2×4.571, 2×4.669, 2×4.459, 2×4.367, 16×3.971, 8×3.705, 28×3.971, 4.301, 4.367, 2×4.239, 2×4.571, 2×4.669, 2×4.459, 2×4.367, 18×3.971, 2×4.239, 4.367, 4.459, 4.367, 4.301, 2×4.669, 4.793, 4.747, 2×4.571, 2×4.459, 6.404, 6.449, 6.485, 6.449, 4×6.347, 7.465, 7.367, 7.202, 7.259, 8.254, 7.911, 8.572, 9.660]

10.0 dB: u=[63×1.000, 64×1.366, 64×3.645, 32×4.350, 16×5.514, 8×6.396, 2×7.465, 2×7.203, 2×7.759, 9.944, 8.539]

11.0 dB: u=[63×1.000, 64×1.816, 64×4.100, 48×6.082, 8×7.720, 4×8.622, 2×9.846, 11.840, 9.846]

12.0 dB: u=[63×1.000, 64×2.231, 64×4.554, 48×7.043, 8×8.850, 4×10.088, 2×10.957, 11.673, 13.547]

13.0 dB: u=[63×1.000, 64×2.597, 64×4.955, 32×7.466, 16×8.711, 8×10.007, 4×11.233, 2×12.260, 13.208, 15.101]

14.0 dB: u=[63×1.000, 64×2.845, 32×4.965, 32×5.519, 32×7.910, 16×9.772, 8×10.971, 4×12.292, 3×13.850, 16.380]

15.0 dB: u=[63×1.000, 64×2.986, 32×5.101, 32×5.750, 32×8.195, 16×10.350, 8×11.935, 4×13.231, 2×14.432, 17.564, 15.583]

16.0 dB: u=[63×1.000, 64×3.057, 32×5.169, 32×5.896, 16×8.069, 16×8.582, 16×10.658, 8×12.533, 4×14.014, 2×15.260, 16.504, 18.483]

17.0 dB: u=[63×1.000, 64×3.085, 32×5.161, 32×6.002, 16×8.051, 16×8.614, 8×10.503, 8×10.964, 8×12.794, 4×14.516 16.168, 15.721, 19.168, 17.239]

18.0 dB: u=[63×1.000, 32×2.883, 32×3.320, 32×5.110, 32×6.225, 16×8.080, 16×8.686, 8×10.530, 8×11.014, 4×12.696, 4×13.122, 2×14.596, 2×14.995, 16.645, 16.201, 19.748, 17.857]

19.0 dB: u=[31×1.000, 32×1.500, 32×3.456, 32×4.378, 32×6.353, 32×8.088, 16×10.203, 16×11.049, 8×13.206, 8×13.837, 8×16.156, 4×18.554, 20.987, 20.461, 25.040, 22.702]

20.0 dB: u=[31×1.000, 32×2.373, 32×4.399, 32×6.090, 32×8.284, 32×10.641, 16×13.176, 16×14.428, 8×16.947, 8×17.804, 8×20.627, 4×23.641, 26.141, 26.753, 29.044, 31.968]

21.0 dB: u=[31×1.000, 32×2.814, 32×4.875, 32×6.911, 32×9.236, 16×11.555, 16×12.232, 16×14.594, 16×16.408, 8×18.921, 8×20.046, 4×22.584, 4×23.418, 4×26.277, 29.034, 29.701, 32.271, 35.440]

22.0 dB: u=[31×1.000, 32×2.962, 32×5.038, 32×7.192, 32×9.575, 16×11.897, 16×12.838, 16×15.104, 16×17.266, 8×19.715, 8×21.262, 4×23.625, 4×24.678, 4×27.485, 2×30.637, 33.592, 36.773]

23.0 dB: u=[31×1.000, 32×3.004, 32×5.080, 32×7.262, 32×9.674, 16×11.949, 16×13.259, 16×15.347, 8×17.312, 8×18.020, 8×20.076, 8×21.936, 4×24.166, 4×25.592, 2×27.759, 2×28.797, 30.980, 31.841, 34.296, 37.350]

24.0 dB: u=[31×1.000, 32×3.014, 32×5.091, 32×7.294, 16×9.330, 16×10.272, 16×12.064, 16×13.671, 16×15.669, 8×17.622, 8×18.521, 8×20.454, 4×22.155, 4×22.780, 4×24.646, 4×26.335, 2×28.388, 2×29.778, 31.769, 32.893, 35.174, 38.095]

25.0 dB: u=[31×1.000, 32×3.019, 32×5.117, 16×7.013, 16×7.837, 16×9.450, 16×10.770, 16×12.418, 16×14.146, 16×16.153, 8×18.082, 8×19.278, 8×21.087, 4×22.827, 4×23.579, 4×25.364, 2×26.908, 2×27.491, 2×29.218, 2×30.820, 32.749, 34.169, 36.333, 39.127]

26.0 dB: u=[31×1.000, 16×2.711, 16×3.387, 16×4.781, 16×5.708, 16×7.063, 16×8.235, 16×9.625, 16×11.018, 16×12.561, 16×14.242, 8×15.870, 8×16.542, 8×18.048, 8×19.367, 8×21.063, 4×22.717, 4×23.625, 4×25.242, 2×26.760, 2×27.404, 2×29.008, 30.945, 30.387, 33.989, 32.503, 38.582, 36.007]

27.0 dB: u=[15×1.000, 16×2.712, 16×4.720, 16×6.502, 16×8.541, 16×10.457, 16×12.572, 16×14.678, 16×16.952, 16×19.327, 16×21.903, 16×24.756, 8×27.423, 8×28.953, 8×31.285, 8×33.658, 8×36.513, 4×39.264, 4×41.128, 4×43.727, 2×46.262, 2×47.600, 2×50.142, 2×53.052, 56.099, 58.700, 61.998, 66.125]

28.0 dB: u=[15×1.000, 16×2.925, 16×4.941, 16×6.916, 16×8.986, 16×11.060, 16×13.234, 16×15.469, 16×17.825, 16×20.309, 16×23.007, 8×25.494, 8×26.748, 8×28.887, 8×30.842, 8×33.144, 8×35.682, 4×38.129, 4×39.369, 4×41.592, 4×43.771, 4×46.463, 2×49.074, 2×50.879, 2×53.385, 55.838, 57.297, 59.712, 62.427, 65.708, 69.732]

29.0 dB: u=[15×1.000, 16×2.986, 16×5.004, 16×7.031, 16×9.107, 16×11.222, 16×13.406, 16×15.664, 16×18.029, 16×20.562, 8×22.859, 8×24.018, 8×25.937, 8×27.635, 8×29.625, 8×31.704, 8×34.002, 8×36.627, 4×39.052, 4×40.683, 4×42.770, 4×45.053, 2×47.279, 2×48.412, 2×50.460, 2×52.488, 2×55.015, 57.466, 59.252, 61.568, 64.245, 67.398, 71.190]

30.0 dB: u=[15×1.000, 16×3.000, 16×5.018, 16×7.055, 16×9.127, 16×11.242, 16×13.417, 16×15.676, 16×18.108, 8×20.249, 8×21.458, 8×23.166, 8×24.734, 8×26.502, 8×28.318, 8×30.275, 8×32.371, 8×34.709, 4×36.847, 4×38.139, 4×39.936, 4×41.741, 4×43.788, 4×46.132, 2×48.325, 2×49.795, 2×51.707, 2×53.816, 55.870, 57.015, 58.892, 60.818, 63.085, 65.678, 68.671, 72.224]

31.0 dB: u=[15×1.000, 16×3.004, 16×5.022, 16×7.058, 16×9.127, 16×11.251, 16×13.494, 8×15.453, 8×16.471, 8×18.024, 8×19.340, 8×20.885, 8×22.385, 8×24.005, 8×25.661, 8×27.417, 8×29.257, 8×31.220, 8×33.366, 4×35.315, 4×36.413, 4×38.029, 4×39.562,

4×41.296, 4×43.152, 4×45.233, 47.165, 2×48.274, 47.165, 51.578, 2×49.934, 51.578, 53.469, 2×55.662, 53.469, 60.926, 59.134, 57.713, 62.892, 65.125, 67.640, 70.498, 73.850]

32.0 dB: u=[15×1.000, 16×3.005, 16×5.035, 16×7.128, 8×8.962, 8×9.757, 8×11.234, 8×12.302, 8×13.719, 8×14.955, 8×16.370, 8×17.714, 8×19.171, 8×20.614, 8×22.140, 8×23.693, 8×25.323, 8×27.010, 8×28.781, 8×30.645, 8×32.659, 4×34.477, 4×35.442, 4×36.940, 4×38.292, 4×39.842, 4×41.448, 4×43.189, 4×45.087, 2×47.764, 2×46.841, 53.997, 52.602, 2×49.337, 2×50.655, 52.602, 54.790, 56.162, 57.253, 58.569, 59.839, 61.331, 62.910, 64.688, 66.658, 68.856, 71.307, 74.064, 77.281]

33.0 dB: u=[7×1.000, 8×2.671, 8×4.671, 8×6.365, 8×8.369, 8×10.104, 8×12.117, 8×13.910, 8×15.938, 8×17.803, 8×19.859, 8×21.807, 8×23.908, 8×25.954, 8×28.118, 8×30.273, 8×32.527, 8×34.812, 8×37.193, 8×39.640, 8×42.187, 8×44.830, 8×47.603, 8×50.576, 8×53.936, 4×56.810, 4×58.730, 4×60.946, 4×63.195, 4×65.615, 4×68.173, 4×70.932, 4×74.021, 76.790, 2×78.556, 76.790, 83.087, 2×80.809, 83.087, 85.598, 2×88.336, 85.598, 94.351, 2×91.499, 96.334, 98.719, 101.263, 104.055, 107.127, 110.507, 114.236, 118.403, 123.217]

34.0 dB: u=[7×1.000, 8×2.914, 8×4.916, 8×6.843, 8×8.857, 8×10.809, 8×12.844, 8×14.833, 8×16.899, 8×18.938, 8×21.048, 8×23.152, 8×25.320, 8×27.503, 8×29.750, 8×32.031, 8×34.378, 8×36.780, 8×39.256, 8×41.805, 8×44.445, 8×47.219, 8×50.254, 2×54.471, 4×52.878, 2×54.471, 2×56.502, 4×58.420, 2×56.502, 2×62.669, 4×60.526, 2×62.669, 2×64.944, 4×67.320, 2×64.944, 2×72.516, 4×69.834, 2×72.516, 2×75.512, 79.841, 2×78.155, 79.841, 2×75.512, 86.310, 88.727, 81.940, 2×84.029, 81.940, 88.727, 86.310, 94.297, 91.344, 100.837, 98.677, 96.943, 103.055, 91.344, 94.297, 110.962, 108.113, 105.490, 114.056, 117.423, 125.860, 121.784, 131.079]

35.0 dB: u=[7×1.000, 8×2.981, 8×4.987, 8×6.981, 8×9.003, 8×11.018, 8×13.062, 8×15.108, 8×17.187, 8×19.278, 8×21.406, 8×23.557, 8×25.746, 8×27.966, 8×30.232, 8×32.540, 8×34.900, 8×37.313, 8×39.797, 8×42.395, 8×45.221, 2×49.074, 4×47.629, 2×49.074, 2×50.909, 4×52.605, 2×50.909, 2×56.337, 4×54.478, 2×56.337, 2×58.305, 4×60.312, 2×58.305, 2×64.599, 4×62.418, 2×64.599, 2×66.884, 4×69.276, 2×66.884, 2×74.706, 4×71.836, 2×74.706, 77.176, 78.793, 80.702, 2×82.610, 80.702, 78.793, 77.176, 91.541, 89.091, 86.808, 2×84.662, 86.808, 89.091, 91.541, 94.289, 96.714, 102.167, 104.297, 106.543, 100.217, 98.282, 94.289, 109.837, 112.437, 115.236, 118.244, 121.484, 124.992, 128.852, 133.258]

36.0 dB: u=[7×1.000, 8×2.995, 8×4.999, 8×7.002, 8×9.018, 8×11.040, 8×13.080, 8×15.131, 8×17.204, 8×19.293, 8×21.407, 8×23.545, 8×25.713, 8×27.912, 8×30.149, 8×32.430, 8×34.789, 8×37.305, 8×40.055, 4×42.307, 4×43.732, 4×45.378, 4×46.938, 4×48.623, 4×50.288, 4×52.040, 4×53.808, 4×55.649, 4×57.531, 4×59.484, 4×61.496, 4×63.583, 4×65.750, 4×68.029, 4×70.512, 2×72.674, 2×73.951, 2×75.641, 2×77.214, 2×78.951, 2×80.708, 2×82.571, 2×84.504, 2×86.538, 2×88.675, 2×90.969, 2×93.550, 95.786, 97.254, 98.989, 100.734, 102.613, 104.584, 106.689, 113.802, 111.288, 108.919, 120.898, 123.947, 117.440, 127.766, 131.367, 135.439]

37.0 dB: u=[7×1.000, 8×3.001, 8×5.008, 8×7.019, 8×9.038, 8×11.065, 8×13.103, 8×15.154, 8×17.220, 8×19.304, 8×21.411, 8×23.544, 8×25.731, 8×28.030, 8×30.506, 4×32.542, 4×33.763, 4×35.259, 4×36.599, 4×38.099, 4×39.516, 4×41.044, 4×42.525, 4×44.090, 4×45.639, 4×47.255, 4×48.875, 4×50.555, 4×52.257, 4×54.014, 4×55.808, 4×57.656, 4×59.551, 4×61.505, 4×63.519, 4×65.615, 4×67.856, 4×70.348, 2×72.431, 2×73.781, 2×75.335, 2×76.852, 2×78.474, 2×80.123, 2×81.852, 2×83.635, 2×85.500, 2×87.443, 2×89.489, 2×91.699, 2×94.204, 97.737, 96.313, 103.229, 99.393, 100.814, 104.883, 106.781, 113.061, 110.859, 108.763, 116.322, 124.129, 121.377, 118.778, 127.812, 130.946, 134.362, 138.194]

38.0 dB: u=[7×1.000, 8×3.002, 8×5.006, 8×7.014, 8×9.029, 8×11.058, 8×13.116, 8×15.241, 8×17.489, 4×19.361, 4×20.381, 4×21.786, 4×22.926, 4×24.309, 4×25.515, 4×26.897, 4×28.151, 4×29.543, 4×30.842, 4×32.252, 4×33.596, 4×35.028, 4×36.415, 4×37.872, 4×39.303, 4×40.792, 4×42.271, 4×43.801, 4×45.335, 4×46.913, 4×48.506, 4×50.143, 4×51.803, 4×53.503, 4×55.235, 4×57.011, 4×58.828, 4×60.693, 4×62.608, 4×64.592, 4×66.702, 68.541, 2×69.509, 68.541, 72.186, 2×70.960, 72.186, 73.620, 2×74.990, 73.620, 77.947, 2×76.468, 77.947, 79.500, 2×81.083, 79.500, 84.418, 2×82.728, 84.418, 86.174, 2×87.990, 86.174, 91.887, 2×89.885, 91.887, 94.088, 95.983, 97.152, 94.088, 103.036, 98.609, 99.994, 101.507, 106.325, 108.078, 109.911, 104.651, 118.138, 111.829, 113.835, 115.937, 128.074, 125.397, 122.861, 120.442, 131.362, 134.383, 137.650, 141.301]

39.0 dB: u=[3×1.000, 4×2.677, 4×4.676, 4×6.358, 4×8.358, 4×10.052, 4×12.052, 4×13.763, 4×15.766, 4×17.496, 4×19.500, 4×21.256, 4×23.265, 4×25.051, 4×27.068, 4×28.889, 4×30.915, 4×32.771, 4×34.811, 4×36.704, 4×38.758, 4×40.692, 4×42.764, 4×44.742, 4×46.842, 4×48.867, 4×50.993, 4×53.065, 4×55.226, 4×57.356, 4×59.561, 4×61.751, 4×64.007, 4×66.265, 4×68.580, 4×70.908, 4×73.288, 4×75.693, 4×78.153, 4×80.645, 4×83.188, 4×85.774, 4×88.419, 4×91.119, 4×93.883, 4×96.712, 4×99.628, 4×102.708, 4×106.074, 2×108.879, 2×110.615, 2×112.699, 2×114.641, 2×116.762, 2×118.842, 2×121.042, 2×123.251, 2×125.552, 2×127.896, 2×130.328, 2×132.821, 2×135.397, 2×138.050, 2×140.796, 2×143.654, 2×146.715, 2×150.117, 152.970, 154.819, 156.948, 159.021, 161.239, 163.484, 165.843, 168.269, 170.808, 173.443, 176.186, 179.044, 182.024, 185.122, 188.346, 191.701, 195.202, 198.865, 207.449, 203.418, 212.351, 216.874, 221.751, 227.179]

40.0 dB: u=[3×1.000, 4×2.884, 4×4.868, 4×6.787, 4×8.796, 4×10.733, 4×12.764, 4×14.718, 4×16.746, 4×18.729, 4×20.770, 4×22.741, 4×24.758, 4×26.707, 4×28.730, 4×30.714, 4×32.782, 4×34.846, 4×36.972, 4×39.076, 4×41.212, 4×43.297, 4×45.418, 4×47.511, 4×49.663, 4×51.833, 4×54.051, 4×56.276, 4×58.541, 4×60.809, 4×63.114, 4×65.423, 4×67.796, 4×70.179, 4×72.604, 4×75.028, 4×77.480, 4×79.962, 4×82.507, 4×85.100, 4×87.722, 4×90.373, 4×93.097, 4×95.894, 4×98.818, 4×101.971, 2×104.608, 2×106.201, 2×108.143, 2×109.900, 2×111.831, 2×113.740, 2×115.749, 2×117.768, 2×119.876, 2×122.014, 2×124.151, 2×126.386, 2×128.620, 2×130.937, 2×133.303, 2×135.790, 2×138.316, 2×140.941, 2×143.602, 2×146.430, 2×149.483, 153.674, 152.079, 157.452, 155.652, 161.396, 159.464, 165.590, 163.491, 170.087, 167.782, 174.837, 172.447, 179.889, 177.326, 185.223, 182.532, 190.913, 187.989, 201.138, 197.890, 194.755, 204.461, 219.958, 208.625, 212.291, 216.021, 229.420, 225.077, 234.685, 240.034]

h2) 1048576-QAM/1024-PAM for the AWGN channel (maximum penalty of 0.01 b/s/Hz)

0.0 dB: u=[511×1.000]

1.0 dB: u=[511×1.000]

2.0 dB: u=[511×1.000]

3.0 dB: u=[255×1.000, 256×2.208]

4.0 dB: u=[255×1.000, 256×2.826]

5.0 dB: u=[255×1.000, 256×3.322]

6.0 dB: u=[255×1.000, 256×3.655]

7.0 dB: u=[255×1.000, 16×3.938, 112×3.442, 16×3.938, 48×3.442, 16×3.938, 16×3.442, 16×3.938, 8×5.643, 4×7.208, 7.561, 2×7.208, 7.561]

8.0 dB: u=[255×1.000, 8×3.505, 8×4.019, 120×3.505, 8×4.019, 56×3.505, 8×4.019, 16×3.505, 4×4.019, 4×4.263, 4×4.559, 4×4.460, 4×6.079, 4×5.949, 4×7.065, 7.707, 7.598, 7.707, 7.826]

9.0 dB: u=[159×1.000, 32×1.208, 64×1.000, 16×3.437, 4×3.854, 2×3.949, 2×3.854, 2×3.729, 2×3.763, 2×3.729, 34×3.437, 8×3.168, 72×3.437, 2×3.949, 2×3.987, 2×4.025, 2×3.987, 6×3.854, 2×3.763, 40×3.437, 8×3.854, 2×4.132, 2×4.169, 2×4.206, 2×4.169, 2×3.987, 2×4.025, 2×3.987, 2×3.949, 8×5.641, 8×5.444, 2×6.340, 2×6.213, 2×6.119, 2×6.213, 7.332, 7.360, 2×6.980, 7.360, 7.388, 8.022, 7.976]

10.0 dB: u=[127×1.000, 128×1.367, 128×3.647, 64×4.357, 32×5.506, 16×6.439, 4×7.389, 4×7.140, 4×7.763, 2×8.824, 9.706, 9.919]

11.0 dB: u=[127×1.000, 128×1.815, 128×4.094, 96×6.073, 16×7.721, 8×8.623, 5×9.841, 12.518, 11.033, 9.841]

12.0 dB: u=[127×1.000, 128×2.228, 128×4.553, 96×7.039, 16×8.833, 8×10.154, 6×11.185, 14.362, 12.624]

13.0 dB: u=[127×1.000, 128×2.598, 128×4.956, 64×7.463, 32×8.713, 16×10.003, 8×11.224, 4×12.284, 3×13.580, 15.960]

14.0 dB: u=[127×1.000, 128×2.846, 64×4.967, 64×5.518, 64×7.913, 32×9.767, 16×11.004, 8×12.302, 4×13.468, 3×14.893, 17.348]

15.0 dB: u=[127×1.000, 128×2.983, 64×5.095, 64×5.743, 64×8.183, 32×10.331, 16×11.906, 8×13.235, 4×14.434, 2×15.553, 18.520, 16.638]

16.0 dB: u=[127×1.000, 128×3.057, 64×5.170, 64×5.896, 32×8.070, 32×8.582, 32×10.654, 16×12.517, 8×14.010, 4×15.379, 2×16.431, 17.558, 19.523]

17.0 dB: u=[127×1.000, 128×3.088, 64×5.166, 64×6.009, 32×8.060, 32×8.623, 16×10.515, 16×10.976, 16×12.808, 8×14.532, 4×15.959, 17.421, 16.990, 20.277, 18.421]

18.0 dB: u=[127×1.000, 64×2.882, 64×3.317, 64×5.108, 64×6.221, 32×8.075, 32×8.681, 16×10.523, 16×11.006, 8×12.684, 8×13.112, 4×14.589, 4×14.974, 4×16.408, 18.017, 17.568, 20.895, 19.076]

19.0 dB: u=[63×1.000, 64×1.509, 64×3.465, 64×4.392, 64×6.367, 64×8.101, 32×10.218, 32×11.052, 16×13.219, 16×13.851, 16×16.177, 8×18.590, 4×20.772, 24.454, 22.960, 22.455, 26.649]

20.0 dB: u=[63×1.000, 64×2.370, 64×4.396, 64×6.084, 64×8.276, 64×10.624, 32×13.151, 32×14.391, 16×16.910, 16×17.756, 16×20.588, 8×23.604, 4×26.392, 29.263, 28.659, 34.095, 31.334]

21.0 dB: u=[63×1.000, 64×2.812, 64×4.871, 64×6.903, 64×9.230, 32×11.550, 32×12.224, 32×14.587, 32×16.397, 16×18.914, 16×20.025, 8×22.565, 8×23.406, 8×26.244, 4×29.313, 31.900, 32.521, 34.952, 38.002]

22.0 dB: u=[63×1.000, 64×2.960, 64×5.036, 64×7.189, 64×9.573, 32×11.896, 32×12.840, 32×15.109, 32×17.275, 16×19.730, 16×21.280, 8×23.641, 8×24.684, 8×27.470, 4×30.592, 2×33.571, 36.386, 39.432]

23.0 dB: u=[63×1.000, 64×3.005, 64×5.083, 64×7.269, 64×9.684, 32×11.961, 32×13.262, 32×15.353, 16×17.320, 16×18.021, 16×20.078, 16×21.928, 8×24.163, 8×25.590, 4×27.758, 4×28.802, 2×30.991, 2×31.791, 34.726, 33.992, 40.124, 37.140]

24.0 dB: u=[63×1.000, 64×3.015, 64×5.092, 64×7.294, 32×9.333, 32×10.268, 32×12.064, 32×13.668, 32×15.664, 16×17.613, 16×18.506, 16×20.437, 8×22.137, 8×22.762, 8×24.626, 8×26.307, 4×28.354, 4×29.733, 2×31.731, 2×32.802, 34.786, 35.751, 37.990, 40.849]

25.0 dB: u=[63×1.000, 64×3.019, 64×5.115, 32×7.010, 32×7.826, 32×9.442, 32×10.758, 32×12.406, 32×14.133, 32×16.139, 16×18.067, 16×19.263, 16×21.067, 8×22.804, 8×23.552, 8×25.334, 4×26.869, 4×27.456, 4×29.178, 4×30.774, 2×32.691, 2×34.070, 35.924, 37.115, 39.212, 41.917]

26.0 dB: u=[63×1.000, 32×2.720, 32×3.382, 32×4.792, 32×5.716, 32×7.083, 32×8.262, 32×9.661, 32×11.063, 32×12.613, 32×14.303, 16×15.939, 16×16.610, 16×18.123, 16×19.441, 16×21.141, 8×22.804, 8×23.703, 8×25.336, 4×26.860, 4×27.513, 4×29.119, 4×30.770, 2×32.596, 2×34.073, 35.822, 37.133, 39.103, 41.643]

27.0 dB: u=[31×1.000, 32×2.708, 32×4.716, 32×6.496, 32×8.536, 32×10.448, 32×12.563, 32×14.665, 32×16.936, 32×19.305, 32×21.875, 32×24.723, 16×27.390, 16×28.915, 16×31.249, 16×33.618, 16×36.467, 8×39.212, 8×41.056, 8×43.655, 4×46.186, 4×47.528, 4×50.059, 4×52.930, 2×55.948, 2×58.589, 61.472, 63.838, 67.021, 71.065]

28.0 dB: u=[31×1.000, 32×2.924, 32×4.940, 32×6.912, 32×8.981, 32×11.052, 32×13.223, 32×15.452, 32×17.802, 32×20.281, 32×22.971, 16×25.455, 16×26.697, 16×28.838, 16×30.787, 16×33.087, 16×35.619, 8×38.059, 8×39.285, 8×41.512, 8×43.686, 8×46.368, 4×48.967, 4×50.738, 4×53.225, 2×55.656, 2×57.051, 2×59.475, 2×62.354, 65.318, 67.873, 71.052, 75.010]

29.0 dB: u=[31×1.000, 32×2.985, 32×5.003, 32×7.030, 32×9.106, 32×11.219, 32×13.403, 32×15.660, 32×18.024, 32×20.553, 16×22.850, 16×23.996, 16×25.921, 16×27.619, 16×29.607, 16×31.684, 16×33.980, 16×36.595, 8×39.014, 8×40.629, 8×42.713, 8×44.990, 4×47.213, 4×48.333, 4×50.376, 4×52.385, 4×54.887, 2×57.312, 2×59.046, 2×61.389, 63.693, 65.162, 67.411, 69.980, 73.056, 76.807]

30.0 dB: u=[31×1.000, 32×3.001, 32×5.019, 32×7.057, 32×9.131, 32×11.246, 32×13.419, 32×15.676, 32×18.101, 16×20.240, 16×21.435, 16×23.147, 16×24.710, 16×26.478, 16×28.292, 16×30.247, 16×32.342, 16×34.673, 8×36.808, 8×38.086, 8×39.885, 8×41.684, 8×43.730, 8×46.068, 4×48.255, 4×49.706, 4×51.609, 4×53.696, 2×55.735, 2×56.816, 2×58.692, 2×60.599, 2×62.974, 65.260, 66.986, 69.144, 71.641, 74.559, 78.055]

31.0 dB: u=[31×1.000, 32×3.003, 32×5.018, 32×7.053, 32×9.120, 32×11.239, 32×13.475, 16×15.432, 16×16.431, 16×17.990, 16×19.299, 16×20.845,

16×22.342, 16×23.961, 16×25.615, 16×27.368, 16×29.207, 16×31.167, 16×33.309, 8×35.254, 8×36.343, 8×37.960, 8×39.486, 8×41.216, 8×43.066, 8×45.133, 4×47.056, 4×48.133, 4×49.794, 4×51.421, 4×53.299, 4×55.460, 2×57.490, 2×58.865, 2×60.642, 2×62.619, 64.538, 65.669, 67.406, 69.233, 71.362, 73.794, 76.594, 79.911]

32.0 dB: u=[31×1.000, 32×3.005, 32×5.034, 32×7.127, 16×8.959, 16×9.758, 16×11.233, 16×12.303, 16×13.718, 16×14.953, 16×16.368, 16×17.713, 16×19.168, 16×20.611, 16×22.136, 16×23.689, 16×25.318, 16×27.005, 16×28.777, 16×30.641, 16×32.658, 8×34.475, 8×35.447, 8×36.943, 8×38.299, 8×39.849, 8×41.458, 8×43.200, 8×45.097, 4×46.866, 4×47.702, 4×49.237, 4×50.583, 4×52.185, 4×53.891, 4×55.812, 2×57.609, 2×58.618, 2×60.179, 2×61.715, 2×63.498, 65.211, 65.947, 67.522, 68.902, 70.603, 72.480, 74.597, 76.979, 79.680, 82.846]

33.0 dB: u=[15×1.000, 16×2.656, 16×4.659, 16×6.338, 16×8.339, 16×10.061, 16×12.073, 16×13.860, 16×15.884, 16×17.740, 16×19.787, 16×21.732, 16×23.829, 16×25.867, 16×28.025, 16×30.170, 16×32.420, 16×34.699, 16×37.075, 16×39.513, 16×42.050, 16×44.682, 16×47.447, 16×50.404, 16×53.734, 8×56.594, 8×58.485, 8×60.702, 8×62.933, 8×65.349, 8×67.888, 8×70.636, 8×73.704, 4×76.457, 4×78.198, 4×80.453, 4×82.713, 4×85.209, 4×87.923, 4×91.044, 2×93.875, 2×95.806, 2×98.139, 2×100.646, 2×103.467, 2×106.868, 109.922, 112.212, 114.848, 117.768, 120.987, 124.593, 128.669, 133.396]

34.0 dB: u=[15×1.000, 16×2.910, 16×4.914, 16×6.837, 16×8.852, 16×10.800, 16×12.835, 16×14.820, 16×16.886, 16×18.923, 16×21.032, 16×23.134, 16×25.302, 16×27.484, 16×29.731, 16×32.014, 16×34.363, 16×36.766, 16×39.245, 16×41.797, 16×44.442, 16×47.215, 16×50.240, 8×52.861, 8×54.433, 8×56.471, 8×58.382, 8×60.488, 8×62.626, 8×64.895, 8×67.262, 8×69.767, 8×72.434, 8×75.395, 2×78.018, 4×79.648, 2×78.018, 2×83.807, 4×81.746, 2×83.807, 2×86.066, 4×88.455, 2×86.066, 2×93.917, 4×91.036, 2×93.917, 96.532, 98.144, 100.316, 2×102.422, 100.316, 98.144, 96.532, 110.726, 112.288, 2×108.206, 2×105.352, 114.329, 116.356, 118.648, 121.120, 123.844, 126.834, 130.110, 133.716, 137.733, 142.370]

35.0 dB: u=[15×1.000, 16×2.980, 16×4.986, 16×6.976, 16×8.995, 16×11.006, 16×13.047, 16×15.089, 16×17.165, 16×19.250, 16×21.373, 16×23.516, 16×25.698, 16×27.910, 16×30.169, 16×32.470, 16×34.824, 16×37.232, 16×39.709, 16×42.294, 16×45.098, 8×47.500, 8×48.917, 8×50.760, 8×52.445, 8×54.317, 8×56.169, 8×58.133, 8×60.138, 8×62.241, 8×64.416, 8×66.691, 8×69.074, 8×71.615, 8×74.454, 4×76.908, 4×78.487, 4×80.393, 4×82.276, 4×84.312, 4×86.433, 4×88.693, 4×91.106, 4×93.802, 2×97.730, 2×96.194, 2×105.929, 2×99.672, 2×101.622, 2×103.709, 2×111.110, 115.222, 113.576, 119.242, 117.235, 2×108.352, 130.818, 122.816, 125.254, 127.929, 134.631, 138.060, 141.862, 146.197]

36.0 dB: u=[15×1.000, 16×2.996, 16×4.999, 16×7.002, 16×9.020, 16×11.044, 16×13.083, 16×15.133, 16×17.204, 16×19.293, 16×21.407, 16×23.546, 16×25.715, 16×27.915, 16×30.151, 16×32.432, 16×34.786, 16×37.288, 16×40.022, 8×42.272, 8×43.686, 8×45.338, 8×46.893, 8×48.581, 8×50.242, 8×51.994, 8×53.758, 8×55.598, 8×57.476, 8×59.426, 8×61.434, 8×63.520, 8×65.683, 8×67.948, 8×70.399, 4×72.551, 4×73.776, 4×75.476, 4×77.022, 4×78.759, 4×80.501, 4×82.357, 4×84.279, 4×86.305, 4×88.431, 4×90.707, 4×93.247, 2×96.882, 2×95.464, 2×100.340, 2×98.620, 2×104.159, 2×102.204, 2×108.482, 2×106.240, 113.253, 114.725, 2×111.019, 120.208, 130.311, 116.502, 118.323, 123.098, 125.334, 127.738, 133.707, 136.690, 139.915, 143.462, 147.486]

37.0 dB: u=[15×1.000, 16×3.000, 16×5.004, 16×7.012, 16×9.028, 16×11.052, 16×13.087, 16×15.135, 16×17.199, 16×19.280, 16×21.382, 16×23.512, 16×25.687, 16×27.960, 16×30.403, 8×32.429, 8×33.625, 8×35.127, 8×36.455, 8×37.956, 8×39.366, 8×40.891, 8×42.368, 8×43.933, 8×45.480, 8×47.097, 8×48.716, 8×50.392, 8×52.090, 8×53.843, 8×55.630, 8×57.471, 8×59.361, 8×61.312, 8×63.319, 8×65.405, 8×67.627, 4×69.586, 4×70.600, 4×72.166, 4×73.494, 4×75.047, 4×76.552, 4×78.169, 4×79.809, 4×81.529, 4×83.305, 4×85.161, 4×87.094, 4×89.122, 4×91.296, 2×93.241, 2×94.243, 2×95.824, 2×97.192, 2×98.780, 2×100.362, 2×102.058, 2×103.818, 2×105.680, 2×107.640, 2×109.753, 2×112.140, 114.212, 115.583, 117.197, 118.838, 120.607, 127.529, 129.752, 122.428, 134.624, 132.114, 125.459, 137.294, 140.142, 143.214, 146.566, 150.358]

38.0 dB: u=[15×1.000, 16×3.001, 16×5.004, 16×7.011, 16×9.026, 16×11.049, 16×13.093, 16×15.187, 16×17.381, 16×19.715, 8×21.617, 8×22.723, 8×24.113, 8×25.304, 8×26.687, 8×27.932, 8×29.324, 8×30.614, 8×32.021, 8×33.354, 8×34.781, 8×36.158, 8×37.611, 8×39.035, 8×40.521, 8×41.994, 8×43.521, 8×45.051, 8×46.625, 8×48.214, 8×49.844, 8×51.499, 8×53.196, 8×54.926, 8×56.699, 8×58.511, 8×60.369, 8×62.276, 8×64.248, 8×66.333, 8×68.621, 4×71.736, 4×70.541, 4×74.526, 4×73.172, 4×77.460, 4×75.997, 4×80.568, 4×79.001, 4×83.880, 4×82.201, 4×87.425, 4×85.623, 4×91.268, 4×89.299, 96.378, 2×95.281, 96.378, 4×93.413, 102.183, 2×100.680, 102.183, 97.836, 2×99.185, 97.836, 108.930, 2×107.134, 108.930, 103.773, 2×105.413, 103.773, 117.128, 115.645, 114.686, 118.432, 110.824, 2×112.862, 110.824, 130.377, 132.455, 126.519, 128.398, 119.932, 124.739, 123.054, 121.441, 137.552, 135.241, 140.525, 143.114, 145.868, 148.830, 152.056, 155.678]

39.0 dB: u=[7×1.000, 8×2.648, 8×4.650, 8×6.303, 8×8.307, 8×9.971, 8×11.973, 8×13.655, 8×15.660, 8×17.366, 8×19.374, 8×21.107, 8×23.117, 8×24.880, 8×26.897, 8×28.695, 8×30.719, 8×32.554, 8×34.589, 8×36.465, 8×38.514, 8×40.433, 8×42.501, 8×44.463, 8×46.555, 8×48.566, 8×50.684, 8×52.748, 8×54.903, 8×57.021, 8×59.216, 8×61.393, 8×63.637, 8×65.879, 8×68.182, 8×70.496, 8×72.865, 8×75.258, 8×77.702, 8×80.183, 8×82.718, 8×85.299, 8×87.936, 8×90.623, 8×93.368, 8×96.175, 8×99.064, 8×102.091, 8×105.380, 2×108.157, 4×109.818, 2×108.157, 2×113.809, 4×111.908, 2×113.809, 2×115.922, 4×117.978, 2×115.922, 2×122.348, 4×120.161, 2×122.348, 2×124.633, 4×126.954, 2×124.633, 2×131.821, 4×129.357, 2×131.821, 2×134.371, 4×137.001, 2×134.371, 2×142.546, 4×139.724, 2×142.546, 2×145.533, 4×148.828, 2×145.533, 2×155.500, 2×153.382, 2×151.631, 2×157.538, 2×159.798, 2×161.874, 164.726, 2×167.000, 164.726, 172.094, 2×169.513, 172.094, 174.791, 2×177.621, 174.791, 183.383, 2×180.696, 185.009, 187.167, 189.199, 191.353, 193.543, 195.863, 198.260, 200.786, 203.425, 206.198, 209.105, 212.158, 215.358, 218.720, 222.251, 225.964, 229.879, 234.024, 238.437, 243.252, 248.655]

40.0 dB: u=[7×1.000, 8×2.904, 8×4.905, 8×6.809, 8×8.808, 8×10.721, 8×12.724, 8×14.646, 8×16.657, 8×18.594, 8×20.616, 8×22.572, 8×24.607, 8×26.585, 8×28.635, 8×30.635, 8×32.699, 8×34.720, 8×36.804, 8×38.856, 8×40.965, 8×43.052, 8×45.192, 8×47.316, 8×49.488, 8×51.654, 8×53.862, 8×56.071, 8×58.318, 8×60.570, 8×62.862, 8×65.174, 8×67.526, 8×69.899, 8×72.310, 8×74.749, 8×77.227, 8×79.737, 8×82.287, 8×84.875, 8×87.508, 8×90.185, 8×92.915, 8×95.715, 8×98.645, 8×101.821, 4×106.055, 4×104.471, 4×109.800, 4×108.025, 4×113.679, 4×111.782, 4×117.691, 4×115.701, 4×121.865, 4×119.779, 4×126.220, 4×124.028, 4×130.790, 4×128.484, 4×135.590, 4×133.162, 4×140.652, 4×138.086, 4×146.023, 4×143.289, 4×152.110, 4×148.920, 2×160.400, 2×158.466, 2×156.471, 2×154.787, 2×164.555, 2×166.704, 2×168.896, 2×162.476, 2×178.475, 2×171.187, 2×173.535, 2×175.967, 2×183.795, 2×186.699, 2×189.924, 2×181.079, 207.690, 202.438, 192.632, 194.382, 196.405, 198.390, 200.572, 205.578, 218.005, 215.272, 223.827, 220.857, 230.164, 226.928, 212.648, 210.135, 237.031, 245.237, 241.382, 233.522, 250.244, 254.565, 264.978, 259.760]

a3) 64-QAM/8-PAM for the fading channel (maximum penalty of 0.001 b/s/Hz)

5.0 dB: u=[1.000, 2×3.083]

6.0 dB: u=[1.000, 2×3.240]

7.0 dB: u=[1.000, 2×3.393]

b3) 256-QAM/16-PAM for the fading channel (maximum penalty of 0.001 b/s/Hz)

0.0 dB: u=[7×1.000]

1.0 dB: u=[7×1.000]

2.0 dB: u=[7×1.000]

3.0 dB: u=[3×1.000, 4×2.675]

4.0 dB: u=[3×1.000, 4×2.899]

5.0 dB: u=[3×1.000, 4×3.077]

6.0 dB: u=[3×1.000, 4×3.232]

7.0 dB: u=[3×1.000, 4×3.366]

8.0 dB: u=[1.000, 2×1.288, 2×3.209, 4.162, 5.461]

9.0 dB: u=[1.000, 2×1.471, 2×3.461, 4.743, 6.166]

10.0 dB: u=[1.000, 2×1.713, 3.675, 3.890, 5.355, 6.977]

11.0 dB: u=[1.000, 2×2.006, 3.998, 4.307, 5.999, 7.852]

12.0 dB: u=[1.000, 2×2.284, 4.294, 4.706, 6.575, 8.646]

13.0 dB: u=[1.000, 2×2.506, 4.519, 5.051, 7.031, 9.278]

14.0 dB: u=[1.000, 2×2.671, 4.672, 5.361, 7.387, 9.767]

c3) 1024-QAM/32-PAM for the fading channel (maximum penalty of 0.001 b/s/Hz)

0.0 dB: u=[15×1.000]

1.0 dB: u=[15×1.000]

2.0 dB: u=[15×1.000]

3.0 dB: u=[7×1.000, 8×2.673]

4.0 dB: u=[7×1.000, 8×2.900]

5.0 dB: u=[7×1.000, 8×3.077]

6.0 dB: u=[7×1.000, 3.260, 2.862, 2.674, 2.862, 3.260, 2.862, 3.260, 4.776]

7.0 dB: u=[7×1.000, 8×3.367]

8.0 dB: u=[3×1.000, 4×1.277, 4×3.196, 4.320, 4.119, 4.624, 6.099]

9.0 dB: u=[3×1.000, 4×1.447, 3.357, 3.433, 3.507, 3.433, 4.739, 4.679, 5.338, 6.826]

10.0 dB: u=[3×1.000, 4×1.687, 2×3.661, 2×3.838, 2×5.281, 6.185, 7.727]

11.0 dB: u=[3×1.000, 4×1.973, 2×3.970, 2×4.245, 2×5.887, 7.078, 8.716]

12.0 dB: u=[3×1.000, 4×2.247, 2×4.256, 2×4.639, 6.330, 6.563, 7.891, 9.664]

13.0 dB: u=[3×1.000, 4×2.471, 2×4.481, 2×4.985, 6.752, 7.064, 8.576, 10.487]

14.0 dB: u=[3×1.000, 4×2.641, 2×4.636, 2×5.287, 7.075, 7.471, 9.123, 11.160]

15.0 dB: u=[3×1.000, 2×2.667, 2×2.856, 2×4.735, 2×5.567, 7.329, 7.819, 9.561, 11.697]

16.0 dB: u=[3×1.000, 2×2.691, 2×3.024, 2×4.816, 2×5.850, 7.564, 8.177, 9.960, 12.173]

17.0 dB: u=[1.000, 2×1.275, 2×3.036, 2×3.678, 2×5.585, 6.858, 7.050, 8.846, 9.707, 11.731, 14.294]

18.0 dB: u=[1.000, 2×1.688, 2×3.524, 2×4.580, 2×6.633, 8.201, 8.517, 10.495, 11.664, 13.960, 16.926]

19.0 dB: u=[1.000, 2×2.089, 2×3.993, 2×5.386, 2×7.559, 9.335, 9.841, 11.923, 13.393, 15.894, 19.155]

20.0 dB: u=[1.000, 2×2.373, 2×4.326, 2×5.958, 2×8.201, 10.088, 10.867, 12.949, 14.665, 17.276, 20.696]

21.0 dB: u=[1.000, 2×2.565, 2×4.550, 2×6.340, 8.419, 8.859, 10.599, 11.681, 13.718, 15.610, 18.272, 21.752]

22.0 dB: u=[1.000, 2×2.690, 2×4.695, 6.438, 6.772, 8.619, 9.386, 11.054, 12.374, 14.383, 16.382, 19.059, 22.542]

23.0 dB: u=[1.000, 2×2.775, 2×4.814, 2×6.878, 8.895, 9.937, 11.565, 13.033, 15.030, 17.093, 19.763, 23.229]

24.0 dB: u=[1.000, 2×2.864, 2×4.959, 2×7.133, 9.125, 10.288, 11.866, 13.373, 15.311, 17.350, 19.939, 23.269]

d3) 4096-QAM/64-PAM for the fading channel (maximum penalty of 0.001 b/s/Hz)

0.0 dB: u=[31×1.000]

1.0 dB: u=[31×1.000]

2.0 dB: u=[31×1.000]

3.0 dB: u=[15×1.000, 16×2.675]

4.0 dB: u=[15×1.000, 16×2.898]

5.0 dB: u=[15×1.000, 3.369, 2.918, 2.664, 2.918, 3×2.664, 2.918, 3.369, 2.918, 2.664, 2.918, 3.369, 2.918, 3.369, 4.870]

6.0 dB: u=[15×1.000, 16×3.223]

7.0 dB: u=[15×1.000, 16×3.366]

8.0 dB: u=[15×1.000, 15×3.345, 5.928]

9.0 dB: u=[7×1.000, 8×1.442, 8×3.428, 4.684, 4.780, 2×4.684, 2×5.313, 6.120, 7.541]

10.0 dB: u=[7×1.000, 8×1.679, 4×3.659, 4×3.822, 4×5.278, 6.070, 6.147, 6.985, 8.502]

11.0 dB: u=[7×1.000, 8×1.968, 4×3.972, 4×4.232, 4×5.885, 2×6.996, 7.962, 9.577]

12.0 dB: u=[7×1.000, 8×2.239, 4×4.254, 4×4.618, 2×6.327, 2×6.529, 7.708, 7.886, 8.918, 10.607]

13.0 dB: u=[7×1.000, 8×2.463, 4×4.477, 4×4.961, 2×6.736, 2×7.024, 8.349, 8.589, 9.779, 11.539]

14.0 dB: u=[7×1.000, 8×2.632, 4×4.631, 4×5.261, 2×7.051, 2×7.427, 8.869, 9.164, 10.503, 12.342]

15.0 dB: u=[7×1.000, 4×2.664, 4×2.844, 4×4.729, 4×5.540, 2×7.299, 2×7.771, 9.289, 9.639, 11.111, 13.024]

16.0 dB: u=[7×1.000, 4×2.691, 4×3.004, 4×4.806, 4×5.815, 2×7.523, 2×8.113, 9.660, 10.080, 11.640, 13.624]

17.0 dB: u=[3×1.000, 4×1.237, 4×2.991, 4×3.585, 4×5.476, 2×6.712, 2×6.884, 2×8.655, 2×9.465, 11.175, 11.742, 13.536, 15.810]

18.0 dB: u=[3×1.000, 4×1.630, 4×3.456, 4×4.454, 4×6.486, 2×8.021, 2×8.301, 2×10.248, 2×11.346, 13.262, 14.048, 16.116, 18.766]

19.0 dB: u=[3×1.000, 4×2.039, 4×3.934, 4×5.283, 4×7.440, 2×9.195, 2×9.643, 2×11.708, 2×13.099, 15.174, 16.218, 18.497, 21.462]

20.0 dB: u=[3×1.000, 4×2.334, 4×4.280, 4×5.875, 4×8.105, 2×9.979, 2×10.678, 2×12.751, 14.218, 14.584, 16.565, 17.853, 20.240, 23.383]

21.0 dB: u=[3×1.000, 4×2.533, 4×4.513, 4×6.274, 2×8.369, 2×8.738, 2×10.496, 2×11.495, 2×13.520, 15.113, 15.646, 17.603, 19.097, 21.533, 24.754]

22.0 dB: u=[3×1.000, 4×2.666, 4×4.666, 2×6.412, 2×6.674, 2×8.564, 2×9.238, 2×10.918, 2×12.167, 2×14.155, 15.812, 16.579, 18.471, 20.125, 22.578, 25.825]

23.0 dB: u=[3×1.000, 4×2.756, 4×4.781, 2×6.499, 2×7.085, 2×8.797, 2×9.761, 2×11.392, 2×12.807, 14.610, 14.984, 16.507, 17.503, 19.342, 21.105, 23.567, 26.808]

24.0 dB: u=[3×1.000, 4×2.840, 4×4.925, 4×7.080, 2×9.088, 2×10.215, 2×11.808, 2×13.301, 2×15.306, 17.051, 18.203, 19.992, 21.802, 24.229, 27.402]

25.0 dB: u=[1.000, 2×1.927, 2×3.739, 2×4.745, 2×6.716, 2×7.883, 2×9.764, 2×11.180, 2×13.292, 2×14.998, 2×17.204, 19.131, 19.658, 21.729, 22.836, 24.799, 26.561, 29.019, 31.588, 34.934, 39.304]

26.0 dB: u=[1.000, 2×2.272, 2×4.131, 2×5.463, 2×7.474, 2×8.934, 2×10.913, 2×12.582, 2×14.800, 2×16.734, 2×19.110, 21.158, 22.084, 24.131, 25.563, 27.641, 29.643, 32.253, 35.037, 38.585, 43.181]

27.0 dB: u=[1.000, 2×2.495, 2×4.397, 2×5.943, 2×7.978, 2×9.634, 2×11.676, 2×13.512, 2×15.776, 2×17.880, 20.845, 20.029, 23.872, 22.613, 27.531, 25.886, 31.828, 29.681, 37.149, 34.504, 41.575, 46.004]

28.0 dB: u=[1.000, 2×2.644, 2×4.575, 2×6.259, 2×8.306, 2×10.087, 2×12.161, 2×14.121, 2×16.466, 2×18.812, 21.010, 22.161, 23.894, 25.357, 27.356, 29.140, 31.325, 33.555, 36.258, 39.186, 42.810, 47.455]

29.0 dB: u=[1.000, 2×2.736, 2×4.685, 2×6.458, 2×8.507, 2×10.386, 2×12.539, 2×14.702, 2×17.218, 19.225, 20.353, 22.053, 23.381, 25.117, 26.699, 28.693, 30.556, 32.759, 35.040, 37.747, 40.682, 44.278, 48.856]

30.0 dB: u=[1.000, 2×2.812, 2×4.789, 2×6.673, 2×8.791, 2×10.832, 2×13.096, 2×15.391, 17.420, 18.514, 20.002, 21.239, 22.885, 24.288, 26.000, 27.621, 29.574, 31.451, 33.625, 35.881, 38.523, 41.393, 44.879, 49.301]

31.0 dB: u=[1.000, 2×2.877, 2×4.867, 2×6.804, 8.505, 9.310, 10.538, 11.402, 12.732, 13.671, 14.960, 15.997, 17.414, 18.546, 19.949, 21.197, 22.741, 24.129, 25.752, 27.326, 29.165, 30.965, 33.013, 35.148, 37.617, 40.306, 43.543, 47.640]

e3) 16384-QAM/128-PAM for the fading channel (maximum penalty of 0.001 b/s/Hz)

0.0 dB: u=[63×1.000]

1.0 dB: u=[63×1.000]

2.0 dB: u=[63×1.000]

3.0 dB: u=[31×1.000, 32×2.677]

4.0 dB: u=[31×1.000, 32×2.901]

5.0 dB: u=[31×1.000, 32×3.072]

6.0 dB: u=[31×1.000, 32×3.223]

7.0 dB: u=[31×1.000, 32×3.361]

8.0 dB: u=[31×1.000, 30×3.343, 2×5.926]

9.0 dB: u=[15×1.000, 16×1.445, 16×3.435, 4.816, 4.904, 5.015, 4.904, 4×4.691, 5.015, 5.133, 5.218, 5.133, 2×6.158, 6.889, 8.215]

10.0 dB: u=[15×1.000, 16×1.681, 8×3.664, 8×3.822, 8×5.289, 6.060, 2×6.176, 6.060, 6.919, 6.988, 7.806, 9.262]

11.0 dB: u=[15×1.000, 16×1.961, 8×3.967, 8×4.222, 8×5.877, 4×6.992, 2×7.875, 8.842, 10.400]

12.0 dB: u=[15×1.000, 16×2.238, 8×4.256, 8×4.619, 4×6.341, 4×6.525, 7.680, 7.803, 7.924, 7.803, 8.733, 8.923, 9.874, 11.521]

13.0 dB: u=[15×1.000, 16×2.462, 8×4.475, 8×4.952, 4×6.739, 4×7.008, 2×8.355, 2×8.562, 9.560, 9.791, 10.822, 12.516]

14.0 dB: u=[15×1.000, 16×2.630, 8×4.628, 8×5.250, 4×7.043, 4×7.404, 2×8.851, 2×9.125, 10.269, 10.528, 11.673, 13.397]

15.0 dB: u=[15×1.000, 8×2.664, 8×2.840, 8×4.727, 8×5.532, 4×7.294, 4×7.754, 2×9.271, 2×9.611, 10.869, 11.166, 12.416, 14.189]

16.0 dB: u=[15×1.000, 8×2.692, 8×2.998, 8×4.803, 8×5.805, 4×7.516, 4×8.089, 2×9.629, 2×10.040, 11.381, 11.721, 13.080, 14.904]

17.0 dB: u=[7×1.000, 8×1.227, 8×2.979, 8×3.558, 8×5.448, 4×6.673, 4×6.837, 4×8.604, 4×9.394, 2×11.087, 2×11.637, 13.175, 13.607, 15.209, 17.291]

18.0 dB: u=[7×1.000, 8×1.610, 8×3.432, 8×4.409, 8×6.433, 4×7.954, 4×8.223, 4×10.162, 4×11.234, 2×13.127, 2×13.881, 15.642, 16.224, 18.107, 20.536]

19.0 dB: u=[7×1.000, 8×2.017, 8×3.908, 8×5.238, 8×7.389, 4×9.135, 4×9.566, 4×11.627, 4×12.994, 2×15.045, 2×16.039, 17.959, 18.733, 20.836, 23.567]

20.0 dB: u=[7×1.000, 8×2.318, 8×4.259, 8×5.840, 8×8.063, 4×9.929, 4×10.602, 4×12.673, 2×14.127, 2×14.460, 2×16.431, 2×17.661, 19.656, 20.650, 22.872, 25.794]

21.0 dB: u=[7×1.000, 8×2.522, 8×4.499, 8×6.250, 4×8.351, 4×8.698, 4×10.459, 4×11.427, 4×13.454, 2×15.039, 2×15.530, 2×17.478, 18.759, 19.085, 20.952, 22.151, 24.424, 27.437]

22.0 dB: u=[7×1.000, 8×2.657, 8×4.656, 8×6.523, 4×8.548, 4×9.191, 4×10.878, 4×12.100, 4×14.085, 2×15.733, 2×16.448, 2×18.329, 19.727, 20.182, 22.009, 23.379, 25.671, 28.719]

23.0 dB: u=[7×1.000, 8×2.746, 8×4.764, 4×6.484, 4×7.029, 4×8.756, 4×9.693, 4×11.322, 4×12.716, 2×14.523, 2×14.857, 2×16.384, 2×17.332, 2×19.152, 20.622, 21.261, 23.026, 24.538, 26.830, 29.880]

24.0 dB: u=[7×1.000, 8×2.831, 8×4.913, 4×6.637, 4×7.479, 4×9.070, 4×10.183, 4×11.783, 4×13.268, 4×15.261, 2×16.997, 2×18.113, 2×19.891, 21.395, 22.221, 23.919, 25.517, 27.792, 30.807]

25.0 dB: u=[3×1.000, 4×1.871, 4×3.677, 4×4.628, 4×6.592, 4×7.709, 4×9.570, 4×10.941, 4×13.032, 4×14.691, 4×16.863, 2×18.764, 2×19.226, 2×21.289, 2×22.316, 2×24.249, 2×25.941, 28.091, 28.652, 30.487, 31.838, 34.101, 36.367, 39.457, 43.533]

26.0 dB: u=[3×1.000, 4×2.233, 4×4.089, 4×5.383, 4×7.390, 4×8.812, 4×10.780, 4×12.416, 4×14.621, 4×16.520, 4×18.869, 2×20.894, 2×21.732, 2×23.785, 2×25.144, 2×27.192, 2×29.148, 31.380, 32.283, 34.191, 35.830, 38.237, 40.746, 44.054, 48.382]

27.0 dB: u=[3×1.000, 4×2.465, 4×4.359, 4×5.873, 4×7.903, 4×9.526, 4×11.556, 4×13.362, 4×15.615, 4×17.679, 19.826, 2×20.543, 19.826, 23.504, 2×22.321, 23.504, 25.509, 2×27.091, 25.509, 31.662, 2×29.203, 31.048, 34.810, 36.610, 38.360, 33.641, 41.609, 43.931, 47.280, 51.680]

28.0 dB: u=[3×1.000, 4×2.614, 4×4.533, 4×6.189, 4×8.225, 4×9.979, 4×12.042, 4×13.961, 4×16.263,

4×18.527, 2×20.693, 2×21.767, 2×23.490, 2×24.889, 2×26.863, 2×28.586, 2×30.755, 32.636, 33.596, 35.465, 36.882, 38.842, 40.789, 43.276, 45.959, 49.358, 53.746]

29.0 dB: u=[3×1.000, 4×2.716, 4×4.660, 4×6.413, 4×8.459, 4×10.304, 4×12.417, 4×14.509, 4×16.967, 2×18.939, 2×20.000, 2×21.702, 2×22.975, 2×24.695, 2×26.225, 2×28.193, 2×30.033, 2×32.315, 34.277, 35.472, 37.294, 38.852, 40.832, 42.855, 45.345, 48.058, 51.436, 55.795]

30.0 dB: u=[3×1.000, 4×2.790, 4×4.763, 4×6.623, 4×8.739, 4×10.761, 4×13.022, 4×15.309, 4×17.891, 2×19.935, 2×21.149, 2×22.820, 2×24.202, 2×25.927, 2×27.539, 2×29.524, 2×31.517, 2×33.945, 35.996, 37.328, 39.124, 40.764, 42.757, 44.816, 47.304, 50.013, 53.361, 57.647]

a4) 64-QAM/8-PAM for the fading channel (maximum penalty of 0.01 b/s/Hz)

5.0 dB: u=[1.000, 2×3.083]

6.0 dB: u=[1.000, 2×3.240]

7.0 dB: u=[1.000, 2×3.393]

b4) 256-QAM/16-PAM for the fading channel (maximum penalty of 0.01 b/s/Hz)

0.0 dB: u=[7×1.000]

1.0 dB: u=[7×1.000]

2.0 dB: u=[7×1.000]

3.0 dB: u=[3×1.000, 4×2.675]

4.0 dB: u=[3×1.000, 4×2.899]

5.0 dB: u=[3×1.000, 4×3.077]

6.0 dB: u=[3×1.000, 4×3.232]

7.0 dB: u=[3×1.000, 4×3.366]

8.0 dB: u=[3×1.000, 4×3.506]

9.0 dB: u=[1.000, 2×1.471, 2×3.461, 4.743, 6.166]

10.0 dB: u=[1.000, 2×1.713, 2×3.782, 5.355, 6.977]

11.0 dB: u=[1.000, 2×2.006, 2×4.153, 5.999, 7.852]

12.0 dB: u=[1.000, 2×2.284, 2×4.500, 6.575, 8.646]

13.0 dB: u=[1.000, 2×2.506, 4.519, 5.051, 7.031, 9.278]

14.0 dB: u=[1.000, 2×2.671, 4.672, 5.361, 7.387, 9.767]

15.0 dB: u=[1.000, 2×2.793, 4.772, 5.668, 7.689, 10.162]

16.0 dB: u=[1.000, 2×2.887, 4.858, 5.964, 7.960, 10.483]

17.0 dB: u=[1.000, 2×2.983, 4.948, 6.206, 8.165, 10.677]

c4) 1024-QAM/32-PAM for the fading channel (maximum penalty of 0.01 b/s/Hz)

0.0 dB: u=[15×1.000]

1.0 dB: u=[15×1.000]

2.0 dB: u=[15×1.000]

3.0 dB: u=[7×1.000, 8×2.673]

4.0 dB: u=[7×1.000, 8×2.900]

5.0 dB: u=[7×1.000, 8×3.077]

6.0 dB: u=[7×1.000, 3.260, 3×2.815, 3.260, 2.815, 3.260, 4.776]

7.0 dB: u=[7×1.000, 8×3.367]

8.0 dB: u=[7×1.000, 7×3.243, 5.357]

9.0 dB: u=[7×1.000, 7×3.326, 5.580]

10.0 dB: u=[3×1.000, 4×1.687, 4×3.750, 2×5.281, 6.185, 7.727]

11.0 dB: u=[3×1.000, 4×1.973, 4×4.107, 2×5.887, 7.078, 8.716]

12.0 dB: u=[3×1.000, 4×2.247, 4×4.447, 2×6.446, 7.891, 9.664]

13.0 dB: u=[3×1.000, 4×2.471, 2×4.481, 2×4.985, 2×6.908, 8.576, 10.487]

14.0 dB: u=[3×1.000, 4×2.641, 2×4.636, 2×5.287, 2×7.273, 9.123, 11.160]

15.0 dB: u=[3×1.000, 4×2.762, 2×4.735, 2×5.567, 2×7.574, 9.561, 11.697]

16.0 dB: u=[3×1.000, 4×2.857, 2×4.816, 2×5.850, 7.564, 8.177, 9.960, 12.173]

17.0 dB: u=[3×1.000, 4×2.951, 2×4.910, 2×6.113, 7.777, 8.534, 10.313, 12.566]

18.0 dB: u=[3×1.000, 2×2.622, 2×3.407, 2×4.935, 2×6.219, 7.808, 8.678, 10.386, 12.593]

19.0 dB: u=[1.000, 2×2.089, 2×3.993, 2×5.386, 2×7.559, 2×9.588, 11.923, 13.393, 15.894, 19.155]

20.0 dB: u=[1.000, 2×2.373, 2×4.326, 2×5.958, 2×8.201, 2×10.478, 12.949, 14.665, 17.276, 20.696]

21.0 dB: u=[1.000, 2×2.565, 2×4.550, 2×6.340, 2×8.639, 2×11.140, 13.718, 15.610, 18.272, 21.752]

22.0 dB: u=[1.000, 2×2.690, 2×4.695, 2×6.605, 2×9.002, 11.054, 12.374, 14.383, 16.382, 19.059, 22.542]

23.0 dB: u=[1.000, 2×2.775, 2×4.814, 2×6.878, 2×9.416, 11.565, 13.033, 15.030, 17.093, 19.763, 23.229]

24.0 dB: u=[1.000, 2×2.864, 2×4.959, 2×7.133, 9.125, 10.288, 11.866, 13.373, 15.311, 17.350, 19.939, 23.269]

25.0 dB: u=[1.000, 2×2.917, 4.585, 5.430, 6.684, 7.687, 9.100, 10.290, 11.788, 13.267, 15.095, 17.040, 19.470, 22.581]

d4) 4096-QAM/64-PAM for the fading channel (maximum penalty of 0.01 b/s/Hz)

0.0 dB: u=[31×1.000]

1.0 dB: u=[31×1.000]

2.0 dB: u=[31×1.000]

3.0 dB: u=[15×1.000, 16×2.675]

4.0 dB: u=[15×1.000, 16×2.898]

5.0 dB: u=[15×1.000, 3.369, 7×2.803, 3.369, 3×2.803, 3.369, 2.803, 3.369, 4.870]

6.0 dB: u=[15×1.000, 16×3.223]

7.0 dB: u=[15×1.000, 16×3.366]

8.0 dB: u=[15×1.000, 15×3.345, 5.928]

9.0 dB: u=[15×1.000, 15×3.440, 6.175]

10.0 dB: u=[7×1.000, 8×1.679, 8×3.741, 4×5.278, 2×6.109, 6.985, 8.502]

11.0 dB: u=[7×1.000, 8×1.968, 8×4.102, 4×5.885, 3×7.318, 9.577]

12.0 dB: u=[7×1.000, 8×2.239, 8×4.436, 7×7.175, 10.607]

13.0 dB: u=[7×1.000, 8×2.463, 4×4.477, 4×4.961, 4×6.880, 2×8.469, 9.779, 11.539]

14.0 dB: u=[7×1.000, 8×2.632, 4×4.631, 4×5.261, 4×7.239, 2×9.017, 10.503, 12.342]

15.0 dB: u=[7×1.000, 8×2.754, 4×4.729, 4×5.540, 2×7.299, 2×7.771, 2×9.464, 11.111, 13.024]

16.0 dB: u=[7×1.000, 8×2.847, 4×4.806, 4×5.815, 2×7.523, 2×8.113, 2×9.870, 11.640, 13.624]

17.0 dB: u=[7×1.000, 4×2.674, 4×3.204, 4×4.895, 4×6.077, 2×7.737, 2×8.461, 9.990, 10.497, 12.100, 14.134]

18.0 dB: u=[7×1.000, 4×2.628, 4×3.387, 4×4.931, 4×6.205, 2×7.792, 2×8.626, 2×10.382, 12.253, 14.268]

19.0 dB: u=[3×1.000, 4×2.039, 4×3.934, 4×5.283, 4×7.440, 4×9.419, 2×11.708, 2×13.099, 15.174, 16.218, 18.497, 21.462]

20.0 dB: u=[3×1.000, 4×2.334, 4×4.280, 4×5.875, 4×8.105, 4×10.328, 2×12.751, 2×14.401, 16.565, 17.853, 20.240, 23.383]

21.0 dB: u=[3×1.000, 4×2.533, 4×4.513, 4×6.274, 4×8.553, 2×10.496, 2×11.495, 2×13.520, 2×15.379, 17.603, 19.097, 21.533, 24.754]

22.0 dB: u=[3×1.000, 4×2.666, 4×4.666, 4×6.543, 4×8.901, 2×10.918, 2×12.167, 2×14.155, 2×16.195, 18.471, 20.125, 22.578, 25.825]

23.0 dB: u=[3×1.000, 4×2.756, 4×4.781, 4×6.792, 2×8.797, 2×9.761, 2×11.392, 2×12.807, 2×14.797, 16.507, 17.503, 19.342, 21.105, 23.567, 26.808]

24.0 dB: u=[3×1.000, 4×2.840, 4×4.925, 4×7.080, 2×9.088, 2×10.215, 2×11.808, 2×13.301, 2×15.306, 17.051, 18.203, 19.992, 21.802, 24.229, 27.402]

25.0 dB: u=[3×1.000, 4×2.898, 4×4.988, 2×6.671, 2×7.639, 2×9.082, 2×10.248, 2×11.755, 2×13.252, 2×15.225, 16.945, 18.149, 19.828, 21.583, 23.870, 26.856]

26.0 dB: u=[1.000, 2×2.272, 2×4.131, 2×5.463, 2×7.474, 2×8.934, 2×10.913, 2×12.582, 2×14.800, 2×16.734, 2×19.110, 2×21.621, 24.131, 25.563, 27.641, 29.643, 32.253, 35.037, 38.585, 43.181]

27.0 dB: u=[1.000, 2×2.495, 2×4.397, 2×5.943, 2×7.978, 2×9.634, 2×11.676, 2×13.512, 2×15.776, 2×17.880, 2×20.437, 23.872, 22.613, 27.531, 25.886, 31.828, 29.681, 37.149, 34.504, 41.575, 46.004]

28.0 dB: u=[1.000, 2×2.644, 2×4.575, 2×6.259, 2×8.306, 2×10.087, 2×12.161, 2×14.121, 2×16.466, 2×18.812, 2×21.586, 23.894, 25.357, 27.356, 29.140, 31.325, 33.555, 36.258, 39.186, 42.810, 47.455]

29.0 dB: u=[1.000, 2×2.736, 2×4.685, 2×6.458, 2×8.507, 2×10.386, 2×12.539, 2×14.702, 2×17.218, 2×19.789, 22.053, 23.381, 25.117, 26.699, 28.693, 30.556, 32.759, 35.040, 37.747, 40.682, 44.278, 48.856]

30.0 dB: u=[1.000, 2×2.812, 2×4.789, 2×6.673, 2×8.791, 2×10.832, 2×13.096, 2×15.391, 2×17.967, 2×20.621, 22.885, 24.288, 26.000, 27.621, 29.574, 31.451, 33.625, 35.881, 38.523, 41.393, 44.879, 49.301]

31.0 dB: u=[1.000, 2×2.877, 2×4.867, 2×6.804, 2×8.907, 2×10.970, 2×13.201, 14.960, 15.997, 17.414, 18.546, 19.949, 21.197, 22.741, 24.129, 25.752, 27.326, 29.165, 30.965, 33.013, 35.148, 37.617, 40.306, 43.543, 47.640]

e4) 16384-QAM/128-PAM for the fading channel (maximum penalty of 0.01 b/s/Hz)

0.0 dB: u=[63×1.000]

1.0 dB: u=[63×1.000]

2.0 dB: u=[63×1.000]

3.0 dB: u=[31×1.000, 32×2.677]

4.0 dB: u=[31×1.000, 32×2.901]

5.0 dB: u=[31×1.000, 32×3.072]

6.0 dB: u=[31×1.000, 32×3.223]

7.0 dB: u=[31×1.000, 32×3.361]

8.0 dB: u=[31×1.000, 30×3.343, 2×5.926]

9.0 dB: u=[15×1.000, 16×1.445, 16×3.435, 12×4.909, 2×6.158, 6.889, 8.215]

10.0 dB: u=[15×1.000, 16×1.681, 16×3.743, 8×5.289, 4×6.118, 2×6.954, 7.806, 9.262]

11.0 dB: u=[15×1.000, 16×1.961, 16×4.095, 15×6.638, 10.400]

12.0 dB: u=[15×1.000, 16×2.238, 16×4.438, 8×6.433, 4×7.802, 2×8.828, 9.874, 11.521]

13.0 dB: u=[15×1.000, 16×2.462, 8×4.475, 8×4.952, 8×6.873, 4×8.459, 2×9.675, 10.822, 12.516]

14.0 dB: u=[15×1.000, 16×2.630, 8×4.628, 8×5.250, 8×7.224, 4×8.988, 2×10.399, 11.673, 13.397]

15.0 dB: u=[15×1.000, 16×2.752, 8×4.727, 8×5.532, 4×7.294, 4×7.754, 4×9.441, 2×11.017, 12.416, 14.189]

16.0 dB: u=[15×1.000, 16×2.845, 8×4.803, 8×5.805, 4×7.516, 4×8.089, 4×9.835, 2×11.551, 13.080, 14.904]

17.0 dB: u=[15×1.000, 8×2.675, 8×3.195, 8×4.891, 8×6.066, 4×7.726, 4×8.435, 2×9.955, 2×10.449, 2×12.024, 13.656, 15.526]

18.0 dB: u=[7×1.000, 8×1.610, 8×3.432, 8×4.409, 8×6.433, 8×8.088, 4×10.162, 4×11.234, 2×13.127, 2×13.881, 2×15.933, 18.107, 20.536]

19.0 dB: u=[7×1.000, 8×2.017, 8×3.908, 8×5.238, 8×7.389, 8×9.351, 4×11.627, 4×12.994, 4×15.542, 2×18.346, 20.836, 23.567]

20.0 dB: u=[7×1.000, 8×2.318, 8×4.259, 8×5.840, 8×8.063, 8×10.266, 4×12.673, 4×14.294, 2×16.431, 2×17.661, 19.656, 20.650, 22.872, 25.794]

21.0 dB: u=[7×1.000, 8×2.522, 8×4.499, 8×6.250, 8×8.524, 4×10.459, 4×11.427, 4×13.454, 4×15.285, 2×17.478, 2×18.922, 20.952, 22.151, 24.424, 27.437]

22.0 dB: u=[7×1.000, 8×2.657, 8×4.656, 8×6.523, 8×8.870, 4×10.878, 4×12.100, 4×14.085, 4×16.090, 2×18.329, 2×19.955, 22.009, 23.379, 25.671, 28.719]

23.0 dB: u=[7×1.000, 8×2.746, 8×4.764, 8×6.757, 4×8.756, 4×9.693, 4×11.322, 4×12.716, 4×14.690, 2×16.384, 2×17.332, 2×19.152, 2×20.941, 23.026, 24.538, 26.830, 29.880]

24.0 dB: u=[7×1.000, 8×2.831, 8×4.913, 8×7.058, 4×9.070, 4×10.183, 4×11.783, 4×13.268, 4×15.261, 2×16.997, 2×18.113, 2×19.891, 2×21.808, 23.919, 25.517, 27.792, 30.807]

25.0 dB: u=[7×1.000, 8×2.893, 8×4.981, 4×6.667, 4×7.622, 4×9.079, 4×10.235, 4×11.748, 4×13.233, 4×15.189, 2×16.893, 2×18.072, 2×19.765, 21.239, 22.180, 23.756, 25.335, 27.488, 30.327]

26.0 dB: u=[3×1.000, 4×2.233, 4×4.089, 4×5.383, 4×7.390, 4×8.812, 4×10.780, 4×12.416, 4×14.621, 4×16.520, 4×18.869, 4×21.313, 2×23.785, 2×25.144, 2×27.192, 2×29.148, 2×31.831, 34.191, 35.830, 38.237, 40.746, 44.054, 48.382]

27.0 dB: u=[3×1.000, 4×2.465, 4×4.359, 4×5.873, 4×7.903, 4×9.526, 4×11.556, 4×13.362, 4×15.615, 4×17.679, 4×20.184, 4×22.912, 25.509, 2×27.091, 25.509, 31.355, 2×29.203, 31.355, 34.225, 36.610, 38.360, 34.225, 41.609, 43.931, 47.280, 51.680]

28.0 dB: u=[3×1.000, 4×2.614, 4×4.533, 4×6.189, 4×8.225, 4×9.979, 4×12.042, 4×13.961, 4×16.263, 4×18.527, 4×21.230, 2×23.490, 2×24.889, 2×26.863, 2×28.586, 2×30.755, 2×33.116, 35.465, 36.882, 38.842, 40.789, 43.276, 45.959, 49.358, 53.746]

29.0 dB: u=[3×1.000, 4×2.716, 4×4.660, 4×6.413, 4×8.459, 4×10.304, 4×12.417, 4×14.509, 4×16.967, 4×19.470, 2×21.702, 2×22.975, 2×24.695, 2×26.225, 2×28.193, 2×30.033, 2×32.315, 2×34.875, 37.294, 38.852, 40.832, 42.855, 45.345, 48.058, 51.436, 55.795]

30.0 dB: u=[3×1.000, 4×2.790, 4×4.763, 4×6.623, 4×8.739, 4×10.761, 4×13.022, 4×15.309, 4×17.891, 2×19.935, 2×21.149, 2×22.820, 2×24.202, 2×25.927, 2×27.539, 2×29.524, 2×31.517, 2×33.945, 35.996, 37.328, 39.124, 40.764, 42.757, 44.816, 47.304, 50.013, 53.361, 57.647].

3. A receiver comprising demodulation circuitry configured to demodulate cell words from constellation values produced by the coding and modulation apparatus as claimed in claim 2.

4. The coding and modulation apparatus as claimed in claim 1, wherein a non-fading channel associated with operation of the coding and modulation apparatus is an Additive White Noise Channel, and a fading channel associated with operation of the coding and modulation apparatus is a Rayleigh fading channel.

5. The coding and modulation apparatus as claimed in claim 1, wherein said modulator circuitry is configured to use, based on the total number M of constellation points of the constellation and the signal-to-noise ratio SNR in dB, the non-uniform constellation from the group of constellations comprising one or more of the following constellations, wherein the constellation points of the different quadrants of a constellation are defined by the constellation position vector $w_{0 \ldots b-1}$, b=M/4, the constellation points $x_{0 \ldots b-1}$ of a first quadrant are defined as $x_{0 \ldots b-1}=w_{0 \ldots b-1}$, the constellation points $x_{b \ldots 2b-1}$ of a second quadrant are defined as $x_{b \ldots 2b-1}=\mathrm{conj}(w_{0 \ldots b-1})$, the constellation points $x_{3b \ldots 4b-1}$ of a third quadrant are defined as $x_{3b \ldots 4b-1}=-w_{0 \ldots b-1}$, the constellation points $x_{2b \ldots 3b-1}$ of a fourth quadrant are defined as $x_{2b \ldots 3b-1}=-\mathrm{conj}(w_{0 \ldots b-1})$, conj is the complex conjugate, and the constellation position vectors of the different constellations of the group of constellations are defined as follows:

i1) 32QQAM with max. penalty=0.001 b/s/Hz—AWGN channel

| SNR/w | w0 | w1 | w2 | w3 | w4 | w5 | w6 | w7 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i |
| 2 | 0.4053 + 0.5879i | 0.5879 + 0.4054i | 0.6114 + 1.0565i | 1.0566 + 0.6114i | 0.4053 + 0.5879i | 0.5879 + 0.4054i | 0.6114 + 1.0565i | 1.0566 + 0.6114i |
| 2.5 | 0.3507 + 0.5354i | 0.5354 + 0.3507i | 0.5763 + 1.1217i | 1.1217 + 0.5763i | 0.3507 + 0.5354i | 0.5354 + 0.3507i | 0.5763 + 1.1217i | 1.1217 + 0.5763i |
| 3 | 0.3189 + 0.5012i | 0.5012 + 0.3189i | 0.5551 + 1.1571i | 1.1571 + 0.5551i | 0.3189 + 0.5012i | 0.5012 + 0.3189i | 0.5551 + 1.1571i | 1.1571 + 0.5551i |
| 3.5 | 0.2980 + 0.4781i | 0.4781 + 0.2981i | 0.5410 + 1.1789i | 1.1789 + 0.5410i | 0.2980 + 0.4781i | 0.4781 + 0.2981i | 0.5410 + 1.1789i | 1.1789 + 0.5410i |
| 4 | 0.2842 + 0.4633i | 0.4633 + 0.2842i | 0.5309 + 1.1928i | 1.1928 + 0.5309i | 0.2842 + 0.4633i | 0.4633 + 0.2842i | 0.5309 + 1.1928i | 1.1928 + 0.5309i |
| 4.5 | 0.2752 + 0.4551i | 0.4551 + 0.2752i | 0.5232 + 1.2014i | 1.2014 + 0.5232i | 0.2752 + 0.4551i | 0.4551 + 0.2752i | 0.5232 + 1.2014i | 1.2014 + 0.5232i |
| 5 | 0.2696 + 0.4521i | 0.4521 + 0.2696i | 0.5169 + 1.2065i | 1.2065 + 0.5169i | 0.2696 + 0.4521i | 0.4521 + 0.2696i | 0.5169 + 1.2065i | 1.2065 + 0.5169i |
| 5.5 | 0.2663 + 0.4530i | 0.4530 + 0.2663i | 0.5115 + 1.2092i | 1.2092 + 0.5115i | 0.2663 + 0.4530i | 0.4530 + 0.2663i | 0.5115 + 1.2092i | 1.2092 + 0.5115i |
| 6 | 0.2642 + 0.4570i | 0.4570 + 0.2642i | 0.5067 + 1.2102i | 1.2102 + 0.5067i | 0.2642 + 0.4570i | 0.4570 + 0.2642i | 0.5067 + 1.2102i | 1.2102 + 0.5067i |
| 6.5 | 0.2626 + 0.4588i | 0.4588 + 0.2626i | 0.5028 + 1.2085i | 1.2085 + 0.5028i | 0.2626 + 0.4588i | 0.4588 + 0.2626i | 0.5028 + 1.2085i | 1.2085 + 0.5028i |
| 7 | 0.2602 + 0.4573i | 0.4572 + 0.2602i | 0.3595 + 1.2746i | 1.2746 + 0.3595i | 0.2602 + 0.4573i | 0.4572 + 0.2602i | 0.6396 + 1.1327i | 1.1327 + 0.6395i |
| 7.5 | 0.2410 + 0.4578i | 0.4577 + 0.2410i | 0.3211 + 1.2755i | 1.2755 + 0.3211i | 0.2728 + 0.4655i | 0.4655 + 0.2728i | 0.6715 + 1.1226i | 1.1226 + 0.6715i |
| 8 | 0.2351 + 0.4699i | 0.4699 + 0.2351i | 0.2957 + 1.2701i | 1.2701 + 0.2957i | 0.2695 + 0.4698i | 0.4698 + 0.2695i | 0.6913 + 1.1190i | 1.1190 + 0.6913i |
| 8.5 | 0.2270 + 0.3121i | 0.6255 + 0.2091i | 0.3173 + 1.3160i | 1.3378 + 0.3422i | 0.2428 + 0.4444i | 0.5783 + 0.3109i | 0.4151 + 1.0074i | 1.0441 + 0.8436i |
| 9 | 0.2117 + 0.2518i | 0.6564 + 0.1984i | 0.3463 + 1.3865i | 1.3392 + 0.3470i | 0.2317 + 0.4565i | 0.6091 + 0.3434i | 0.3354 + 0.9582i | 0.9927 + 0.8356i |
| 9.5 | 0.2014 + 0.2235i | 0.6716 + 0.1924i | 0.3533 + 1.4075i | 1.3374 + 0.3431i | 0.2276 + 0.4678i | 0.6230 + 0.3674i | 0.3047 + 0.9383i | 0.9683 + 0.8393i |
| 10 | 0.1946 + 0.2025i | 0.6811 + 0.1872i | 0.3555 + 1.4163i | 1.3323 + 0.3370i | 0.2266 + 0.4818i | 0.6303 + 0.3928i | 0.2860 + 0.9269i | 0.9538 + 0.8460i |
| 10.5 | 0.1917 + 0.1863i | 0.6885 + 0.1824i | 0.3554 + 1.4185i | 1.3247 + 0.3312i | 0.2273 + 0.4949i | 0.6340 + 0.4191i | 0.2729 + 0.9204i | 0.9446 + 0.8543i |
| 11 | 0.1929 + 0.1744i | 0.6963 + 0.1782i | 0.3541 + 1.4168i | 1.3162 + 0.3270i | 0.2283 + 0.5036i | 0.6364 + 0.4437i | 0.2627 + 0.9170i | 0.9382 + 0.8637i |
| 11.5 | 0.1978 + 0.1660i | 0.7046 + 0.1752i | 0.3521 + 1.4127i | 1.3074 + 0.3244i | 0.2287 + 0.5076i | 0.6386 + 0.4654i | 0.2546 + 0.9154i | 0.9335 + 0.8738i |
| 12 | 0.2047 + 0.1603i | 0.7126 + 0.1738i | 0.3499 + 1.4076i | 1.2978 + 0.3226i | 0.2280 + 0.5086i | 0.6410 + 0.4845i | 0.2485 + 0.9154i | 0.9299 + 0.8841i |
| 12.5 | 0.2121 + 0.1569i | 0.7185 + 0.1739i | 0.3478 + 1.4027i | 1.2867 + 0.3209i | 0.2258 + 0.5089i | 0.6431 + 0.5018i | 0.2443 + 0.9172i | 0.9274 + 0.8949i |
| 13 | 0.2187 + 0.1559i | 0.7211 + 0.1755i | 0.3459 + 1.3987i | 1.2734 + 0.3186i | 0.2225 + 0.5103i | 0.6446 + 0.5183i | 0.2415 + 0.9207i | 0.9257 + 0.9059i |
| 13.5 | 0.2234 + 0.1575i | 0.7198 + 0.1782i | 0.3442 + 1.3961i | 1.2579 + 0.3156i | 0.2189 + 0.5139i | 0.6455 + 0.5346i | 0.2398 + 0.9259i | 0.9246 + 0.9174i |
| 14 | 0.2261 + 0.1614i | 0.7147 + 0.1816i | 0.3425 + 1.3949i | 1.2405 + 0.3119i | 0.2157 + 0.5201i | 0.6463 + 0.5505i | 0.2389 + 0.9324i | 0.9230 + 0.9294i |
| 14.5 | 0.2113 + 0.1819i | 0.6590 + 0.1934i | 0.6163 + 1.2930i | 1.1691 + 0.2524i | 0.2042 + 0.5736i | 0.6214 + 0.5984i | 0.2154 + 1.0277i | 1.0670 + 0.7825i |
| 15 | 0.2082 + 0.1903i | 0.6467 + 0.1971i | 0.6624 + 1.2634i | 1.1455 + 0.2430i | 0.2028 + 0.5942i | 0.6209 + 0.6087i | 0.2221 + 1.0561i | 1.0812 + 0.7572i |

j1) 64QQAM with max. penalty=0.001 b/s/Hz—AWGN channel

| SNR/w | w0 | w1 | w2 | w3 | w4 | w5 | w6 | w7 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i |
| 2 | 1.0566 + 0.6114i | 1.0566 + 0.6114i | 0.5879 + 0.4053i | 0.5879 + 0.4053i | 0.6114 + 1.0566i | 0.6114 + 1.0566i | 0.4053 + 0.5879i | 0.4053 + 0.5879i |
| 2.5 | 1.1217 + 0.5763i | 1.1217 + 0.5763i | 1.1217 + 0.5763i | 1.1217 + 0.5763i | 0.5354 + 0.3507i | 0.5354 + 0.3507i | 0.5354 + 0.3507i | 0.5354 + 0.3507i |
| 3 | 0.5551 + 1.1571i | 0.3189 + 0.5012i | 1.1571 + 0.5551i | 0.5012 + 0.3189i | 0.5551 + 1.1571i | 0.3189 + 0.5012i | 1.1571 + 0.5551i | 0.5012 + 0.3189i |
| 3.5 | 1.1789 + 0.5410i | 1.1789 + 0.5410i | 1.1789 + 0.5410i | 1.1789 + 0.5410i | 0.4781 + 0.2981i | 0.4781 + 0.2981i | 0.4781 + 0.2981i | 0.4781 + 0.2981i |
| 4 | 0.2842 + 0.4633i | 0.2842 + 0.4633i | 0.5309 + 1.1928i | 0.5309 + 1.1928i | 0.2842 + 0.4633i | 0.2842 + 0.4633i | 0.5309 + 1.1928i | 0.5309 + 1.1928i |
| 4.5 | 0.5232 + 1.2014i | 0.5232 + 1.2014i | 0.5232 + 1.2014i | 0.5232 + 1.2014i | 1.2014 + 0.5232i | 1.2014 + 0.5232i | 1.2014 + 0.5232i | 1.2014 + 0.5232i |
| 5 | 1.2065 + 0.5169i | 1.2065 + 0.5169i | 1.2065 + 0.5169i | 1.2065 + 0.5169i | 0.5169 + 1.2065i | 0.5169 + 1.2065i | 0.5169 + 1.2065i | 0.5169 + 1.2065i |
| 5.5 | 1.2092 + 0.5115i | 1.2092 + 0.5115i | 1.2092 + 0.5115i | 1.2092 + 0.5115i | 0.4530 + 0.2663i | 0.4530 + 0.2663i | 0.4530 + 0.2663i | 0.4530 + 0.2663i |
| 6 | 0.2642 + 0.4570i | 0.2642 + 0.4570i | 0.2642 + 0.4570i | 0.2642 + 0.4570i | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i | 1.2085 + 0.5028i | 1.2085 + 0.5028i | 1.2085 + 0.5028i | 1.2085 + 0.5028i |
| 7 | 0.3595 + 1.2746i | 0.6396 + 1.1327i | 0.3595 + 1.2746i | 0.6396 + 1.1327i | 1.2746 + 0.3595i | 1.1327 + 0.6396i | 1.2746 + 0.3595i | 1.1327 + 0.6396i |
| 7.5 | 0.7476 + 1.2181i | 0.5961 + 1.0258i | 0.3325 + 1.3887i | 0.3069 + 1.1510i | 1.2181 + 0.7475i | 1.0258 + 0.5961i | 1.3887 + 0.3325i | 1.1510 + 0.3069i |
| 8 | 0.3109 + 1.4253i | 0.7943 + 1.2523i | 0.2868 + 1.0998i | 0.5786 + 0.9799i | 1.4253 + 0.3109i | 1.2523 + 0.7943i | 1.0998 + 0.2868i | 0.9799 + 0.5786i |
| 8.5 | 1.6023 + 0.4387i | 1.0881 + 0.8753i | 0.4387 + 1.6023i | 0.8753 + 1.0881i | 0.9239 + 0.2202i | 0.8454 + 0.3049i | 0.7818 + 0.2019i | 0.7540 + 0.2653i |
| 9 | 0.4221 + 1.5951i | 1.5951 + 0.4221i | 0.8732 + 1.0971i | 1.0971 + 0.8732i | 0.7823 + 0.2020i | 0.9288 + 0.2247i | 0.7537 + 0.2686i | 0.8479 + 0.3175i |
| 9.5 | 0.8408 + 1.2670i | 0.5485 + 0.9136i | 0.2950 + 1.4844i | 0.2548 + 1.0308i | 1.2670 + 0.8407i | 0.9136 + 0.5485i | 1.4844 + 0.2950i | 1.0308 + 0.2548i |
| 10 | 1.2647 + 0.8443i | 1.4891 + 0.2935i | 0.9020 + 0.5498i | 1.0230 + 0.2451i | 0.3072 + 0.1682i | 0.3072 + 0.1682i | 0.5944 + 0.3252i | 0.6401 + 0.2182i |
| 10.5 | 0.2925 + 1.4892i | 0.8449 + 1.2622i | 0.2351 + 1.0196i | 0.5555 + 0.8926i | 1.4892 + 0.2925i | 1.2622 + 0.8449i | 1.0196 + 0.2351i | 0.8926 + 0.5555i |
| 11 | 0.8435 + 1.2594i | 0.5630 + 0.8851i | 0.2921 + 1.4867i | 0.2255 + 1.0193i | 1.2594 + 0.8435i | 0.8851 + 0.5630i | 1.4867 + 0.2921i | 1.0193 + 0.2255i |
| 11.5 | 0.2920 + 1.4827i | 0.8411 + 1.2563i | 0.2174 + 1.0211i | 0.5702 + 0.8798i | 1.4827 + 0.2920i | 1.2563 + 0.8411i | 1.0211 + 0.2174i | 0.8798 + 0.5702i |
| 12 | 0.2920 + 1.4781i | 0.8380 + 1.2527i | 0.2112 + 1.0242i | 0.5763 + 0.8768i | 1.4781 + 0.2920i | 1.2527 + 0.8380i | 1.0242 + 0.2112i | 0.8768 + 0.5763i |
| 12.5 | 0.2920 + 1.4732i | 0.8348 + 1.2487i | 0.2071 + 1.0283i | 0.5811 + 0.8760i | 1.4732 + 0.2920i | 1.2487 + 0.8348i | 1.0283 + 0.2071i | 0.8760 + 0.5811i |
| 13 | 0.2978 + 1.4669i | 0.8421 + 1.2355i | 0.2135 + 1.0389i | 0.6055 + 0.8654i | 1.4685 + 0.2859i | 1.2516 + 0.8201i | 1.0279 + 0.1981i | 0.8857 + 0.5642i |
| 13.5 | 1.4627 + 0.2996i | 1.0469 + 0.2187i | 1.2278 + 0.8422i | 0.8605 + 0.6179i | 0.4106 + 0.1299i | 0.7441 + 0.1749i | 0.3822 + 0.1824i | 0.6160 + 0.4168i |
| 14 | 0.2989 + 1.4602i | 0.8389 + 1.2232i | 0.2232 + 1.0534i | 0.6245 + 0.8593i | 1.4560 + 0.2819i | 1.2434 + 0.8085i | 1.0319 + 0.1914i | 0.8945 + 0.5550i |
| 14.5 | 0.2878 + 1.4388i | 0.8133 + 1.2150i | 0.2219 + 1.0386i | 0.6145 + 0.8494i | 1.4656 + 0.2931i | 1.2278 + 0.8230i | 1.0649 + 0.2069i | 0.8971 + 0.5677i |
| 15 | 0.9687 − 0.4488i | 0.1261 − 0.4193i | 0.6752 − 0.4269i | 0.3896 − 0.4201i | 1.0304 − 0.1506i | 0.1248 − 0.1379i | 0.6647 − 0.1295i | 0.3769 − 0.1364i |
| 15.5 | 0.9856 − 0.4661i | 0.1264 − 0.4145i | 0.6825 − 0.4329i | 0.3948 − 0.4179i | 1.0366 − 0.1534i | 0.1272 − 0.1353i | 0.6796 − 0.1340i | 0.3877 − 0.1359i |
| 16 | 1.0161 − 0.4912i | 0.1287 − 0.4061i | 0.6966 − 0.4427i | 0.4025 − 0.4142i | 1.0441 − 0.1581i | 0.1321 − 0.1317i | 0.6995 − 0.1411i | 0.4035 − 0.1354i |
| 16.5 | 1.0519 − 0.5188i | 0.1325 − 0.3998i | 0.7146 − 0.4532i | 0.4122 − 0.4120i | 1.0500 − 0.1642i | 0.1374 − 0.1295i | 0.7170 − 0.1473i | 0.4185 − 0.1357i |
| 17 | 1.0725 − 0.5328i | 0.1361 − 0.4023i | 0.7267 − 0.4592i | 0.4198 − 0.4151i | 1.0501 − 0.1676i | 0.1398 − 0.1309i | 0.7233 − 0.1496i | 0.4246 − 0.1370i |
| 17.5 | 1.0854 − 0.5394i | 0.1392 − 0.4078i | 0.7353 − 0.4623i | 0.4262 − 0.4205i | 1.0474 − 0.1695i | 0.1407 − 0.1336i | 0.7243 − 0.1504i | 0.4265 − 0.1388i |
| 18 | 1.0941 − 0.5424i | 0.1418 − 0.4131i | 0.7424 − 0.4645i | 0.4318 − 0.4266i | 1.0439 − 0.1707i | 0.1411 − 0.1361i | 0.7235 − 0.1509i | 0.4269 − 0.1406i |

-continued

| | | | | | | | | |
|---|---|---|---|---|---|---|---|---|
| 18.5 | 1.0998 − 0.5430i | 0.1439 − 0.4173i | 0.7487 − 0.4666i | 0.4370 − 0.4325i | 1.0405 − 0.1713i | 0.1414 − 0.1380i | 0.7224 − 0.1517i | 0.4269 − 0.1425i |
| 19 | 1.1032 − 0.5410i | 0.1458 − 0.4204i | 0.7543 − 0.4691i | 0.4418 − 0.4382i | 1.0373 − 0.1716i | 0.1414 − 0.1393i | 0.7213 − 0.1527i | 0.4267 − 0.1443i |
| 19.5 | 1.1043 − 0.5346i | 0.1473 − 0.4225i | 0.7587 − 0.4731i | 0.4459 − 0.4435i | 1.0338 − 0.1710i | 0.1414 − 0.1401i | 0.7201 − 0.1544i | 0.4264 − 0.1461i |
| 20 | 1.1039 − 0.5232i | 0.1486 − 0.4237i | 0.7620 − 0.4802i | 0.4492 − 0.4482i | 1.0304 − 0.1696i | 0.1413 − 0.1405i | 0.7193 − 0.1572i | 0.4263 − 0.1477i |

| SNR/w | w8 | w9 | w10 | w11 | w12 | w13 | w14 | w15 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i |
| 2 | 1.0566 + 0.6114i | 1.0566 + 0.6114i | 0.5879 + 0.4053i | 0.5879 + 0.4053i | 0.6114 + 1.0566i | 0.6114 + 1.0566i | 0.4053 + 0.5879i | 0.4053 + 0.5879i |
| 2.5 | 0.5763 + 1.1217i | 0.5763 + 1.1217i | 0.5763 + 1.1217i | 0.5763 + 1.1217i | 0.3507 + 0.5354i | 0.3507 + 0.5354i | 0.3507 + 0.5354i | 0.3507 + 0.5354i |
| 3 | 0.5551 + 1.1571i | 0.3189 + 0.5012i | 1.1571 + 0.5551i | 0.5012 + 0.3189i | 0.5551 + 1.1571i | 0.3189 + 0.5012i | 1.1571 + 0.5551i | 0.5012 + 0.3189i |
| 3.5 | 0.5410 + 1.1789i | 0.5410 + 1.1789i | 0.5410 + 1.1789i | 0.5410 + 1.1789i | 0.2980 + 0.4781i | 0.2980 + 0.4781i | 0.2980 + 0.4781i | 0.2980 + 0.4781i |
| 4 | 0.4633 + 0.2842i | 0.4633 + 0.2842i | 1.1928 + 0.5309i | 1.1928 + 0.5309i | 0.4633 + 0.2842i | 0.4633 + 0.2842i | 1.1928 + 0.5309i | 1.1928 + 0.5309i |
| 4.5 | 0.2752 + 0.4551i | 0.2752 + 0.4551i | 0.2752 + 0.4551i | 0.2752 + 0.4551i | 0.4551 + 0.2752i | 0.4551 + 0.2752i | 0.4551 + 0.2752i | 0.4551 + 0.2752i |
| 5 | 0.4521 + 0.2696i | 0.4521 + 0.2696i | 0.4521 + 0.2696i | 0.4521 + 0.2696i | 0.2696 + 0.4521i | 0.2696 + 0.4521i | 0.2696 + 0.4521i | 0.2696 + 0.4521i |
| 5.5 | 0.5115 + 1.2092i | 0.5115 + 1.2092i | 0.5115 + 1.2092i | 0.5115 + 1.2092i | 0.2663 + 0.4530i | 0.2663 + 0.4530i | 0.2663 + 0.4530i | 0.2663 + 0.4530i |
| 6 | 0.5067 + 1.2102i | 0.5067 + 1.2102i | 0.5067 + 1.2102i | 0.5067 + 1.2102i | 1.2102 + 0.5067i | 1.2102 + 0.5067i | 1.2102 + 0.5067i | 1.2102 + 0.5067i |
| 6.5 | 0.2626 + 0.4588i | 0.2626 + 0.4588i | 0.2626 + 0.4588i | 0.2626 + 0.4588i | 0.4588 + 0.2626i | 0.4588 + 0.2626i | 0.4588 + 0.2626i | 0.4588 + 0.2626i |
| 7 | 0.2602 + 0.4573i | 0.2602 + 0.4573i | 0.2602 + 0.4573i | 0.2602 + 0.4573i | 0.4573 + 0.2602i | 0.4573 + 0.2602i | 0.4573 + 0.2602i | 0.4573 + 0.2602i |
| 7.5 | 0.2376 + 0.4123i | 0.2685 + 0.4969i | 0.2376 + 0.4123i | 0.2685 + 0.4969i | 0.4123 + 0.2376i | 0.4969 + 0.2685i | 0.4123 + 0.2376i | 0.4969 + 0.2685i |
| 8 | 0.2193 + 0.3832i | 0.2193 + 0.3832i | 0.2478 + 0.5286i | 0.2937 + 0.5184i | 0.3832 + 0.2193i | 0.3832 + 0.2193i | 0.5286 + 0.2478i | 0.5184 + 0.2937i |
| 8.5 | 0.2019 + 0.7818i | 0.2653 + 0.7540i | 0.2202 + 0.9239i | 0.3049 + 0.8454i | 0.2686 + 0.2686i | 0.2686 + 0.2686i | 0.2686 + 0.2686i | 0.2686 + 0.2686i |
| 9 | 0.2247 + 0.9288i | 0.2020 + 0.7823i | 0.3175 + 0.8479i | 0.2686 + 0.7537i | 0.2668 + 0.2584i | 0.2668 + 0.2584i | 0.2668 + 0.2584i | 0.2660 + 0.2913i |
| 9.5 | 0.1758 + 0.3172i | 0.3159 + 0.5815i | 0.1758 + 0.3172i | 0.2278 + 0.6176i | 0.3172 + 0.1758i | 0.5815 + 0.3159i | 0.3172 + 0.1758i | 0.6176 + 0.2278i |
| 10 | 0.8443 + 1.2648i | 0.2935 + 1.4891i | 0.5498 + 0.9020i | 0.2451 + 1.0230i | 0.1682 + 0.3072i | 0.1682 + 0.3072i | 0.3252 + 0.5944i | 0.2182 + 0.6401i |
| 10.5 | 0.1635 + 0.3025i | 0.1635 + 0.3025i | 0.2075 + 0.6586i | 0.3354 + 0.6030i | 0.3025 + 0.1635i | 0.3025 + 0.1635i | 0.6586 + 0.2075i | 0.6030 + 0.3354i |
| 11 | 0.1606 + 0.3016i | 0.3460 + 0.6087i | 0.1606 + 0.3016i | 0.1969 + 0.6737i | 0.3016 + 0.1606i | 0.6087 + 0.3460i | 0.3016 + 0.1606i | 0.6737 + 0.1969i |
| 11.5 | 0.1583 + 0.3034i | 0.1583 + 0.3034i | 0.1871 + 0.6855i | 0.3563 + 0.6126i | 0.3034 + 0.1583i | 0.3034 + 0.1583i | 0.6855 + 0.1871i | 0.6126 + 0.3563i |
| 12 | 0.1560 + 0.3070i | 0.1560 + 0.3070i | 0.1789 + 0.6942i | 0.3657 + 0.6155i | 0.3070 + 0.1560i | 0.3070 + 0.1560i | 0.6942 + 0.1789i | 0.6155 + 0.3657i |
| 12.5 | 0.1393 + 0.3138i | 0.1671 + 0.3094i | 0.1720 + 0.7004i | 0.3741 + 0.6174i | 0.3138 + 0.1393i | 0.3094 + 0.1671i | 0.7004 + 0.1720i | 0.6174 + 0.3741i |
| 13 | 0.1338 + 0.3767i | 0.1752 + 0.3563i | 0.1756 + 0.7261i | 0.4023 + 0.6180i | 0.2730 + 0.1455i | 0.2730 + 0.1455i | 0.6840 + 0.1578i | 0.6145 + 0.3555i |
| 13.5 | 0.2831 + 1.4625i | 0.1935 + 1.0296i | 0.8124 + 1.2487i | 0.5574 + 0.8909i | 0.1413 + 0.2555i | 0.1488 + 0.6759i | 0.1413 + 0.2555i | 0.3493 + 0.6111i |
| 14 | 0.1266 + 0.4289i | 0.1907 + 0.3970i | 0.1717 + 0.7575i | 0.4261 + 0.6136i | 0.2461 + 0.1402i | 0.2461 + 0.1402i | 0.6735 + 0.1418i | 0.6085 + 0.3483i |
| 14.5 | 0.1177 + 0.4119i | 0.2516 + 0.3998i | 0.1559 + 0.7442i | 0.4328 + 0.5954i | 0.1678 + 0.1166i | 0.3325 + 0.1582i | 0.7408 + 0.1355i | 0.6200 + 0.3227i |
| 15 | 1.1704 − 0.7904i | 0.1452 − 0.7405i | 0.6932 − 0.8128i | 0.4017 − 0.7221i | 1.4580 − 0.2741i | 0.1644 − 1.0798i | 0.7344 − 1.2171i | 0.2867 − 1.4419i |
| 15.5 | 1.1580 − 0.8178i | 0.1416 − 0.7330i | 0.6913 − 0.8132i | 0.4018 − 0.7177i | 1.4529 − 0.2702i | 0.1686 − 1.0718i | 0.7097 − 1.2125i | 0.2732 − 1.4375i |
| 16 | 1.1306 − 0.8649i | 0.1385 − 0.7199i | 0.6874 − 0.8123i | 0.4017 − 0.7107i | 1.4516 − 0.2578i | 0.1689 − 1.0567i | 0.6750 − 1.2072i | 0.2558 − 1.4247i |

-continued

| | | | | | | | | |
|---|---|---|---|---|---|---|---|---|
| 16.5 | 1.0952 − 0.9115i | 0.1369 − 0.7073i | 0.6868 − 0.8108i | 0.4044 − 0.7057i | 1.4480 − 0.2403i | 0.1677 − 1.0405i | 0.6406 − 1.1995i | 0.2402 − 1.4087i |
| 17 | 1.0771 − 0.9315i | 0.1373 − 0.7043i | 0.6956 − 0.8095i | 0.4114 − 0.7109i | 1.4380 − 0.2294i | 0.1680 − 1.0338i | 0.6220 − 1.1896i | 0.2326 − 1.3986i |
| 17.5 | 1.0693 − 0.9408i | 0.1388 − 0.7057i | 0.7092 − 0.8073i | 0.4197 − 0.7206i | 1.4261 − 0.2216i | 0.1682 − 1.0316i | 0.6106 − 1.1783i | 0.2287 − 1.3914i |
| 18 | 1.0666 − 0.9452i | 0.1406 − 0.7083i | 0.7229 − 0.8052i | 0.4275 − 0.7307i | 1.4143 − 0.2157i | 0.1685 − 1.0310i | 0.6029 − 1.1680i | 0.2262 − 1.3855i |
| 18.5 | 1.0673 − 0.9458i | 0.1425 − 0.7109i | 0.7349 − 0.8045i | 0.4344 − 0.7399i | 1.4036 − 0.2110i | 0.1691 − 1.0309i | 0.5971 − 1.1599i | 0.2240 − 1.3805i |
| 19 | 1.0720 − 0.9413i | 0.1445 − 0.7131i | 0.7452 − 0.8057i | 0.4404 − 0.7481i | 1.3941 − 0.2072i | 0.1697 − 1.0309i | 0.5918 − 1.1539i | 0.2216 − 1.3761i |
| 19.5 | 1.0847 − 0.9271i | 0.1467 − 0.7148i | 0.7552 − 0.8112i | 0.4463 − 0.7557i | 1.3857 − 0.2033i | 0.1703 − 1.0305i | 0.5851 − 1.1507i | 0.2181 − 1.3721i |
| 20 | 1.1043 − 0.9013i | 0.1491 − 0.7159i | 0.7655 − 0.8232i | 0.4529 − 0.7625i | 1.3785 − 0.1990i | 0.1705 − 1.0293i | 0.5745 − 1.1503i | 0.2128 − 1.3684i |

k1) 256QQAM with max. penalty=0.001 b/s/Hz—AWGN channel

| SNR/w | w0 | w1 | w2 | w3 | w4 | w5 | w6 | w7 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i |
| 7 | 1.1322 + 0.6970i | 1.0432 + 0.6178i | 1.5234 + 1.0871i | 1.1322 + 0.6970i | 1.2925 + 0.3605i | 1.1736 + 0.3521i | 1.6996 + 0.3860i | 1.2925 + 0.3605i |
| 7.5 | 0.2588 + 0.4732i | 0.2411 + 0.4249i | 0.5864 + 1.0293i | 0.6595 + 1.1198i | 0.2753 + 0.5196i | 0.2588 + 0.4732i | 0.5525 + 0.9862i | 0.5864 + 1.0293i |
| 8 | 0.3565 + 1.7813i | 0.3059 + 1.2626i | 0.3059 + 1.2626i | 0.2962 + 1.1484i | 1.0099 + 1.5146i | 0.6749 + 1.1091i | 0.6749 + 1.1091i | 0.6000 + 1.0201i |
| 8.5 | 0.3488 + 1.7914i | 0.2880 + 1.2587i | 0.2880 + 1.2587i | 0.2788 + 1.1468i | 1.0152 + 1.5168i | 0.6879 + 1.1023i | 0.6879 + 1.1023i | 0.6127 + 1.0130i |
| 9 | 1.6414 + 0.6837i | 0.9335 + 0.8803i | 0.2681 + 1.4953i | 0.7270 + 0.9501i | 1.8682 + 0.2925i | 0.8579 + 0.9067i | 0.3433 + 1.4695i | 0.6978 + 1.0003i |
| 9.5 | 1.6327 + 0.6734i | 0.9469 + 0.8771i | 0.2526 + 1.4830i | 0.7372 + 0.9369i | 1.8490 + 0.2874i | 0.8644 + 0.9027i | 0.3370 + 1.4511i | 0.7054 + 0.9892i |
| 10 | 1.7476 − 0.3437i | 1.4280 − 0.2830i | 1.0127 − 0.2440i | 1.0127 − 0.2440i | 1.4280 − 0.2830i | 1.3530 − 0.2686i | 1.0127 − 0.2440i | 1.0415 − 0.2449i |
| 10.5 | 1.7549 − 0.3495i | 1.4293 − 0.2804i | 1.0027 − 0.2346i | 1.0027 − 0.2346i | 1.4293 − 0.2804i | 1.3614 − 0.2635i | 1.0027 − 0.2346i | 1.0372 − 0.2356i |
| 11 | 0.3538 + 1.7624i | 0.2788 + 1.4265i | 0.2788 + 1.4265i | 0.2610 + 1.3647i | 0.9952 + 1.4965i | 0.8098 + 1.2072i | 0.8098 + 1.2072i | 0.7783 + 1.1510i |
| 11.5 | 0.3289 + 1.4165i | 0.3556 + 1.7714i | 0.2605 + 1.3630i | 0.2302 + 1.4276i | 0.7692 + 1.2350i | 1.0007 + 1.5057i | 0.7800 + 1.1485i | 0.8472 + 1.1728i |
| 12 | 0.6800 + 1.6926i | 0.3911 + 1.3645i | 0.2191 + 1.7524i | 0.2274 + 1.4208i | 0.8678 + 1.2487i | 0.7275 + 1.1667i | 0.8747 + 1.0470i | 0.7930 + 1.0406i |
| 12.5 | 0.7085 + 1.6630i | 0.4337 + 1.3632i | 0.2265 + 1.7707i | 0.2214 + 1.4346i | 0.8829 + 1.2345i | 0.7423 + 1.1546i | 0.9077 + 1.0034i | 0.8363 + 0.9971i |
| 13 | 0.7232 + 1.6427i | 0.4625 + 1.3572i | 0.2367 + 1.7836i | 0.2081 + 1.4453i | 0.8955 + 1.2316i | 0.7485 + 1.1494i | 0.9349 + 0.9699i | 0.8724 + 0.9626i |
| 13.5 | 0.7280 + 1.6384i | 0.4787 + 1.3492i | 0.2417 + 1.7872i | 0.1966 + 1.4478i | 0.9185 + 1.2490i | 0.7448 + 1.1524i | 0.9536 + 0.9516i | 0.8912 + 0.9461i |
| 14 | 0.6852 + 1.6631i | 0.4978 + 1.3396i | 0.2241 + 1.7611i | 0.1891 + 1.4343i | 1.0300 + 1.3532i | 0.7389 + 1.1771i | 0.9797 + 0.9598i | 0.8864 + 0.9798i |
| 14.5 | 0.6850 + 1.6565i | 0.5110 + 1.3346i | 0.2284 + 1.7618i | 0.1836 + 1.4363i | 1.0485 + 1.3578i | 0.7448 + 1.1781i | 0.9923 + 0.9464i | 0.9014 + 0.9717i |
| 15 | 1.1831 + 1.3352i | 1.5548 + 0.8930i | 1.0563 + 0.9473i | 1.1944 + 0.8535i | 1.7139 + 0.2236i | 1.4688 + 0.5085i | 0.9846 + 0.6522i | 1.0982 + 0.6252i |
| 15.5 | 1.3333 + 1.1727i | 0.9525 + 1.0450i | 0.8764 + 1.5619i | 0.8595 + 1.2191i | 1.2665 + 0.7890i | 1.0238 + 0.8157i | 1.0119 + 0.5685i | 1.0066 + 0.6087i |
| 16 | 1.0693 + 1.3695i | 1.6456 + 0.7233i | 1.0401 + 0.9844i | 1.3351 + 0.9489i | 1.6696 + 0.1992i | 1.4116 + 0.4773i | 0.9912 + 0.6923i | 1.1625 + 0.6341i |
| 16.5 | 1.3185 + 1.1655i | 1.0729 + 0.9416i | 0.9781 + 1.3517i | 0.9292 + 0.9707i | 1.4986 + 0.8198i | 1.2084 + 0.6881i | 0.9265 + 0.5535i | 0.9824 + 0.6211i |
| 17 | 1.1514 + 1.3474i | 1.3447 + 1.0136i | 0.9323 + 1.1378i | 0.9510 + 0.9427i | 1.2112 + 0.5426i | 1.2864 + 0.7311i | 0.9873 + 0.5679i | 0.9676 + 0.7289i |
| 17.5 | 1.1159 + 1.3726i | 1.3078 + 1.0458i | 0.9051 + 1.1657i | 0.9509 + 0.9581i | 1.2112 + 0.5506i | 1.3032 + 0.7544i | 0.9969 + 0.5672i | 0.9755 + 0.7547i |

-continued

| | | | | | | | | |
|---|---|---|---|---|---|---|---|---|
| 18 | 1.1058 + 1.3496i | 1.2204 + 1.0180i | 0.8713 + 1.1743i | 0.9189 + 0.9604i | 1.2283 + 0.6284i | 1.4576 + 0.8033i | 1.0010 + 0.6008i | 0.9350 + 0.7635i |
| 18.5 | 1.1022 + 1.3396i | 1.2102 + 1.0122i | 0.8669 + 1.1800i | 0.9153 + 0.9665i | 1.2205 + 0.6352i | 1.4496 + 0.8012i | 0.9972 + 0.5981i | 0.9328 + 0.7745i |
| 19 | 1.5817 + 0.4283i | 1.4894 + 0.1404i | 1.4735 + 0.7375i | 1.2229 + 0.6531i | 1.0586 + 0.3317i | 1.2553 + 0.3125i | 0.9114 + 0.4575i | 1.0349 + 0.5768i |
| 19.5 | 0.8375 + 1.4782i | 1.3271 + 0.8728i | 1.1494 + 1.1881i | 1.0720 + 0.8655i | 1.5541 + 0.6145i | 1.2416 + 0.5886i | 0.9113 + 0.4993i | 1.0207 + 0.6225i |
| 20 | 1.1577 + 1.2607i | 1.2132 + 0.9665i | 0.8650 + 1.2652i | 0.9371 + 1.0167i | 1.2341 + 0.6321i | 1.4507 + 0.7875i | 0.9999 + 0.6438i | 0.9509 + 0.8111i |
| 20.5 | 1.1623 + 1.2367i | 1.2152 + 0.9464i | 0.8671 + 1.2704i | 0.9416 + 1.0203i | 1.2263 + 0.6212i | 1.4418 + 0.7638i | 0.9979 + 0.6457i | 0.9519 + 0.8158i |
| 21 | 1.1584 + 1.2194i | 1.2110 + 0.9332i | 0.8614 + 1.2738i | 0.9374 + 1.0274i | 1.2218 + 0.6145i | 1.4309 + 0.7504i | 0.9986 + 0.6549i | 0.9484 + 0.8261i |
| 21.5 | 1.1541 + 1.1980i | 1.2082 + 0.9192i | 0.8523 + 1.2778i | 0.9253 + 1.0390i | 1.2200 + 0.6057i | 1.4217 + 0.7371i | 1.0021 + 0.6678i | 0.9448 + 0.8412i |
| 22 | 1.1564 + 1.1321i | 1.2409 + 0.8772i | 0.8304 + 1.2958i | 0.8902 + 1.0738i | 1.2195 + 0.5872i | 1.4329 + 0.6862i | 1.0077 + 0.6857i | 0.9610 + 0.8761i |
| 22.5 | 1.1672 + 1.0989i | 1.2422 + 0.8522i | 0.8024 + 1.2971i | 0.8967 + 1.0878i | 1.2134 + 0.5744i | 1.4239 + 0.6620i | 1.0091 + 0.6909i | 0.9644 + 0.8828i |
| 23 | 1.2322 + 1.0269i | 1.4082 + 0.7080i | 0.7782 + 1.3193i | 0.9660 + 1.1333i | 1.4427 + 0.4179i | 1.1837 + 0.7680i | 0.9625 + 0.7036i | 0.9821 + 0.8987i |
| 23.5 | 1.1616 + 1.0595i | 1.2384 + 0.8218i | 0.7696 + 1.2863i | 0.8965 + 1.0947i | 1.1989 + 0.5582i | 1.4012 + 0.6249i | 1.0129 + 0.6976i | 0.9657 + 0.8860i |
| 24 | 1.2424 + 0.9493i | 1.2834 + 0.7245i | 0.9545 + 1.2183i | 1.0015 + 1.0002i | 1.1739 + 0.5257i | 1.3794 + 0.4917i | 1.0065 + 0.6128i | 1.0346 + 0.7930i |
| 24.5 | 1.2328 + 0.9369i | 1.2653 + 0.7160i | 0.9349 + 1.2178i | 0.9989 + 1.0051i | 1.1766 + 0.5132i | 1.3771 + 0.4884i | 1.0162 + 0.6131i | 1.0287 + 0.7970i |
| 25 | 1.2245 + 0.9258i | 1.2535 + 0.7077i | 0.9208 + 1.2133i | 0.9969 + 1.0052i | 1.1757 + 0.5047i | 1.3715 + 0.4846i | 1.0198 + 0.6112i | 1.0268 + 0.7962i |
| 25.5 | 1.2171 + 0.9128i | 1.2413 + 0.6969i | 0.9105 + 1.2064i | 0.9951 + 1.0017i | 1.1707 + 0.4940i | 1.3617 + 0.4870i | 1.0203 + 0.6063i | 1.0247 + 0.7923i |
| 26 | 1.2103 + 0.9014i | 1.2323 + 0.6874i | 0.9022 + 1.1987i | 0.9925 + 0.9967i | 1.1677 + 0.4847i | 1.3547 + 0.4862i | 1.0215 + 0.6013i | 1.0233 + 0.7878i |

| SNR/ w | w8 | w9 | w10 | w11 | w12 | w13 | w14 | w15 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i |
| 7 | 1.0432 + 0.6178i | 0.9995 + 0.5797i | 1.1322 + 0.6970i | 1.0432 + 0.6178i | 1.1736 + 0.3521i | 1.1130 + 0.3476i | 1.2925 + 0.3605i | 1.1736 + 0.3521i |
| 7.5 | 0.4732 + 0.2588i | 0.4249 + 0.2411i | 1.0293 + 0.5865i | 1.1198 + 0.6595i | 0.5196 + 0.2753i | 0.4732 + 0.2588i | 0.9862 + 0.5525i | 1.0293 + 0.5865i |
| 8 | 0.3059 + 1.2626i | 0.2962 + 1.1484i | 0.2962 + 1.1484i | 0.2917 + 1.0949i | 0.6749 + 1.1091i | 0.6000 + 1.0201i | 0.6000 + 1.0201i | 0.5650 + 0.9791i |
| 8.5 | 0.2880 + 1.2587i | 0.2788 + 1.1468i | 0.2788 + 1.1468i | 0.2750 + 1.0951i | 0.6879 + 1.1023i | 0.6127 + 1.0130i | 0.6127 + 1.0130i | 0.5775 + 0.9727i |
| 9 | 1.5505 + 1.0696i | 0.9759 + 0.9428i | 0.3350 + 1.5307i | 0.7461 + 0.9896i | 1.1886 + 1.6606i | 0.8973 + 0.9758i | 0.4528 + 1.5320i | 0.7212 + 1.0496i |
| 9.5 | 1.5654 + 1.1053i | 0.9822 + 0.9424i | 0.3199 + 1.5216i | 0.7507 + 0.9792i | 1.1323 + 1.6866i | 0.8963 + 0.9732i | 0.4510 + 1.5195i | 0.7234 + 1.0425i |
| 10 | 1.4799 − 0.9890i | 1.2150 − 0.8088i | 0.8943 − 0.5436i | 0.8943 − 0.5436i | 1.2150 − 0.8088i | 1.1516 − 0.7656i | 0.8943 − 0.5436i | 0.9155 − 0.5630i |
| 10.5 | 1.4880 − 0.9918i | 1.2116 − 0.8109i | 0.8807 − 0.5437i | 0.8807 − 0.5437i | 1.2116 − 0.8109i | 1.1516 − 0.7744i | 0.8807 − 0.5437i | 0.9058 − 0.5674i |
| 11 | 0.2244 + 0.9784i | 0.2257 + 1.0057i | 0.2257 + 1.0057i | 0.2268 + 1.0350i | 0.5343 + 0.8558i | 0.5530 + 0.8761i | 0.5530 + 0.8761i | 0.5730 + 0.8975i |
| 11.5 | 0.2175 + 1.0013i | 0.2159 + 0.9723i | 0.2194 + 1.0327i | 0.2175 + 1.0013i | 0.5578 + 0.8655i | 0.5381 + 0.8437i | 0.5789 + 0.8889i | 0.5578 + 0.8655i |
| 12 | 0.2098 + 0.9768i | 0.2241 + 1.0454i | 0.1858 + 0.9878i | 0.1901 + 1.0659i | 0.5547 + 0.8312i | 0.5479 + 0.8651i | 0.6073 + 0.8182i | 0.5955 + 0.8420i |
| 12.5 | 0.2230 + 0.9899i | 0.2479 + 1.0582i | 0.1802 + 1.0070i | 0.1891 + 1.0869i | 0.5702 + 0.8176i | 0.5659 + 0.8534i | 0.6286 + 0.8049i | 0.6286 + 0.8049i |
| 13 | 0.2408 + 0.9979i | 0.2750 + 1.0662i | 0.1741 + 1.0211i | 0.1849 + 1.1031i | 0.5789 + 0.8090i | 0.5764 + 0.8491i | 0.6485 + 0.7846i | 0.6485 + 0.7846i |
| 13.5 | 0.2553 + 0.9993i | 0.2988 + 1.0689i | 0.1656 + 1.0288i | 0.1779 + 1.1140i | 0.5802 + 0.8040i | 0.5788 + 0.8534i | 0.6616 + 0.7612i | 0.6574 + 0.7871i |
| 14 | 0.2659 + 0.9951i | 0.3199 + 1.0652i | 0.1586 + 1.0330i | 0.1732 + 1.1198i | 0.5806 + 0.7935i | 0.5791 + 0.8600i | 0.6672 + 0.7597i | 0.6655 + 0.7988i |
| 14.5 | 0.2918 + 0.9977i | 0.3457 + 1.0677i | 0.1513 + 1.0448i | 0.1608 + 1.1366i | 0.5795 + 0.7993i | 0.5814 + 0.8684i | 0.6777 + 0.7528i | 0.6798 + 0.7908i |

-continued

| | | | | | | | | |
|---|---|---|---|---|---|---|---|---|
| 15 | 0.7901 + 1.2547i | 0.5814 + 1.0118i | 0.8074 + 1.0302i | 0.6237 + 1.0012i | 0.6052 + 0.6617i | 0.5759 + 0.7150i | 0.7056 + 0.6773i | 0.6439 + 0.7138i |
| 15.5 | 0.2231 + 1.7092i | 0.6616 + 0.9740i | 0.5030 + 1.4567i | 0.6230 + 1.1163i | 0.6633 + 0.6064i | 0.6841 + 0.7162i | 0.7194 + 0.5707i | 0.7211 + 0.6351i |
| 16 | 0.7189 + 1.2484i | 0.5519 + 1.0360i | 0.8125 + 0.9999i | 0.6001 + 0.9735i | 0.6062 + 0.6558i | 0.5673 + 0.7044i | 0.7357 + 0.7025i | 0.6195 + 0.7364i |
| 16.5 | 0.5954 + 1.6721i | 0.6356 + 0.9282i | 0.6612 + 1.3085i | 0.6870 + 0.9890i | 0.6139 + 0.5878i | 0.6161 + 0.6843i | 0.7069 + 0.5730i | 0.6968 + 0.6615i |
| 17 | 0.7916 + 1.5326i | 0.5781 + 0.9103i | 0.6737 + 1.2261i | 0.6488 + 0.9682i | 0.6008 + 0.5904i | 0.5968 + 0.6937i | 0.7280 + 0.5839i | 0.7207 + 0.6853i |
| 17.5 | 0.7546 + 1.5371i | 0.5791 + 0.9008i | 0.6529 + 1.2248i | 0.6563 + 0.9619i | 0.5998 + 0.5837i | 0.5965 + 0.6939i | 0.7601 + 0.5787i | 0.7439 + 0.6985i |
| 18 | 0.7460 + 1.5301i | 0.5607 + 0.8951i | 0.6305 + 1.2208i | 0.6414 + 0.9625i | 0.5848 + 0.5763i | 0.5797 + 0.7001i | 0.7518 + 0.5786i | 0.7339 + 0.7041i |
| 18.5 | 0.7388 + 1.5187i | 0.5534 + 0.8948i | 0.6245 + 1.2171i | 0.6469 + 0.9671i | 0.5816 + 0.5744i | 0.5746 + 0.7125i | 0.7634 + 0.5763i | 0.7384 + 0.7224i |
| 19 | 1.0419 + 1.2518i | 0.8657 + 1.0272i | 1.2891 + 1.0296i | 1.0567 + 0.8727i | 0.6260 + 0.6701i | 0.7308 + 0.8371i | 0.7597 + 0.5841i | 0.8864 + 0.7205i |
| 19.5 | 0.6600 + 1.2390i | 0.6575 + 0.9736i | 0.8905 + 1.1414i | 0.8571 + 0.9152i | 0.6106 + 0.5775i | 0.6382 + 0.7572i | 0.7620 + 0.5398i | 0.8086 + 0.7221i |
| 20 | 0.5458 + 1.2087i | 0.5280 + 0.9935i | 0.6621 + 1.4483i | 0.7224 + 0.9905i | 0.5909 + 0.6140i | 0.5567 + 0.7928i | 0.7623 + 0.6325i | 0.7410 + 0.7994i |
| 20.5 | 0.5495 + 1.2117i | 0.5295 + 0.9994i | 0.6564 + 1.4451i | 0.7273 + 1.0021i | 0.5962 + 0.6217i | 0.5627 + 0.8030i | 0.7674 + 0.6377i | 0.7457 + 0.8086i |
| 21 | 0.5460 + 1.2127i | 0.5252 + 1.0028i | 0.6465 + 1.4397i | 0.7242 + 1.0131i | 0.6013 + 0.6294i | 0.5660 + 0.8106i | 0.7730 + 0.6458i | 0.7464 + 0.8190i |
| 21.5 | 0.5373 + 1.2128i | 0.5165 + 1.0048i | 0.6343 + 1.4321i | 0.7152 + 1.0245i | 0.6073 + 0.6384i | 0.5684 + 0.8175i | 0.7801 + 0.6568i | 0.7459 + 0.8311i |
| 22 | 0.5187 + 1.2127i | 0.4960 + 1.0047i | 0.6102 + 1.4243i | 0.6926 + 1.0375i | 0.6194 + 0.6507i | 0.5744 + 0.8249i | 0.7952 + 0.6762i | 0.7540 + 0.8498i |
| 22.5 | 0.5099 + 1.2100i | 0.4914 + 1.0072i | 0.5898 + 1.4201i | 0.6910 + 1.0470i | 0.6271 + 0.6619i | 0.5827 + 0.8346i | 0.8016 + 0.6867i | 0.7612 + 0.8629i |
| 23 | 0.5427 + 1.2003i | 0.5813 + 1.0089i | 0.5291 + 1.4273i | 0.7630 + 1.0578i | 0.6294 + 0.6610i | 0.6110 + 0.8310i | 0.7906 + 0.6835i | 0.7844 + 0.8645i |
| 23.5 | 0.4976 + 1.2018i | 0.4821 + 1.0103i | 0.5648 + 1.4016i | 0.6826 + 1.0558i | 0.6404 + 0.6801i | 0.5954 + 0.8500i | 0.8128 + 0.7021i | 0.7699 + 0.8797i |
| 24 | 0.5286 + 1.2013i | 0.6120 + 1.0209i | 0.7270 + 1.2479i | 0.7961 + 1.0299i | 0.6617 + 0.6693i | 0.6621 + 0.8401i | 0.8310 + 0.6617i | 0.8389 + 0.8357i |
| 24.5 | 0.5158 + 1.1967i | 0.6077 + 1.0231i | 0.7117 + 1.2419i | 0.7917 + 1.0319i | 0.6714 + 0.6767i | 0.6662 + 0.8463i | 0.8411 + 0.6694i | 0.8402 + 0.8434i |
| 25 | 0.5056 + 1.1921i | 0.6041 + 1.0245i | 0.7005 + 1.2353i | 0.7883 + 1.0319i | 0.6790 + 0.6831i | 0.6702 + 0.8514i | 0.8475 + 0.6749i | 0.8427 + 0.8479i |
| 25.5 | 0.4973 + 1.1878i | 0.6009 + 1.0255i | 0.6921 + 1.2284i | 0.7855 + 1.0302i | 0.6850 + 0.6886i | 0.6728 + 0.8554i | 0.8517 + 0.6775i | 0.8443 + 0.8495i |
| 26 | 0.4905 + 1.1842i | 0.5982 + 1.0262i | 0.6854 + 1.2221i | 0.7829 + 1.0274i | 0.6911 + 0.6930i | 0.6740 + 0.8584i | 0.8561 + 0.6778i | 0.8451 + 0.8492i |

| SNR/w | w16 | w17 | w18 | w19 | w20 | w21 | w22 | w23 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i |
| 7 | 0.4468 + 0.2453i | 0.4880 + 0.2600i | 0.4066 + 0.2304i | 0.4468 + 0.2453i | 0.4468 + 0.2453i | 0.4880 + 0.2600i | 0.4066 + 0.2304i | 0.4468 + 0.2453i |
| 7.5 | 0.2411 + 0.4249i | 0.2236 + 0.3788i | 0.6595 + 1.1198i | 0.9931 + 1.5130i | 0.2588 + 0.4732i | 0.2411 + 0.4249i | 0.5864 + 1.0293i | 0.6595 + 1.1198i |
| 8 | 1.7813 + 0.3565i | 1.2626 + 0.3059i | 1.2626 + 0.3059i | 1.1484 + 0.2962i | 1.5146 + 1.0099i | 1.1091 + 0.6749i | 1.1091 + 0.6749i | 1.0201 + 0.6000i |
| 8.5 | 1.7914 + 0.3488i | 1.2587 + 0.2880i | 1.2587 + 0.2880i | 1.1468 + 0.2788i | 1.5168 + 1.0152i | 1.1023 + 0.6879i | 1.1023 + 0.6879i | 1.0130 + 0.6127i |
| 9 | 1.1513 + 0.2749i | 0.9582 + 0.3853i | 0.9227 + 0.2153i | 0.8467 + 0.3088i | 1.1613 + 0.2336i | 0.9349 + 0.3518i | 0.9227 + 0.2153i | 0.8467 + 0.3088i |
| 9.5 | 1.1819 + 0.2793i | 0.9635 + 0.4036i | 0.9143 + 0.2124i | 0.8374 + 0.3155i | 1.2076 + 0.2313i | 0.9381 + 0.3697i | 0.9143 + 0.2124i | 0.8374 + 0.3155i |
| 10 | 0.3146 − 0.1705i | 0.3146 − 0.1705i | 0.6218 − 0.2169i | 0.6218 − 0.2169i | 0.3146 − 0.1705i | 0.3146 − 0.1705i | 0.6218 − 0.2169i | 0.6218 − 0.2169i |
| 10.5 | 0.3056 − 0.1640i | 0.3056 − 0.1640i | 0.6406 − 0.2071i | 0.6406 − 0.2071i | 0.3056 − 0.1640i | 0.3056 − 0.1640i | 0.6406 − 0.2071i | 0.6406 − 0.2071i |
| 11 | 1.7631 + 0.3541i | 1.4266 + 0.2789i | 1.4266 + 0.2789i | 1.3649 + 0.2609i | 1.4961 + 0.9954i | 1.2072 + 0.8100i | 1.2072 + 0.8100i | 1.1510 + 0.7784i |
| 11.5 | 1.4190 + 0.3287i | 1.7739 + 0.3559i | 1.3649 + 0.2600i | 1.4293 + 0.2298i | 1.2376 + 0.7681i | 1.5057 + 1.0025i | 1.1507 + 0.7776i | 1.1738 + 0.8449i |

-continued

| | | | | | | | | |
|---|---|---|---|---|---|---|---|---|
| 12 | 1.4070 + 0.1790i | 1.7227 + 0.2900i | 1.3246 + 0.2562i | 1.3636 + 0.3654i | 1.3708 + 1.2834i | 1.6701 + 0.8403i | 1.1614 + 0.7909i | 1.2241 + 0.7367i |
| 12.5 | 1.4067 + 0.1623i | 1.7386 + 0.2869i | 1.3213 + 0.2614i | 1.3555 + 0.3818i | 1.3728 + 1.2802i | 1.6730 + 0.8349i | 1.1629 + 0.7604i | 1.2237 + 0.7169i |
| 13 | 1.4076 + 0.1477i | 1.7480 + 0.2870i | 1.3169 + 0.2677i | 1.3479 + 0.3950i | 1.3698 + 1.2765i | 1.6671 + 0.8318i | 1.1603 + 0.7369i | 1.2208 + 0.7017i |
| 13.5 | 1.4079 + 0.1358i | 1.7492 + 0.2856i | 1.3108 + 0.2733i | 1.3393 + 0.4031i | 1.3733 + 1.2596i | 1.6601 + 0.8198i | 1.1559 + 0.7249i | 1.2163 + 0.6897i |
| 14 | 1.3832 + 0.1273i | 1.7176 + 0.2506i | 1.2890 + 0.2587i | 1.3115 + 0.3882i | 1.4490 + 1.1367i | 1.6791 + 0.7233i | 1.1637 + 0.7318i | 1.2117 + 0.6596i |
| 14.5 | 1.3830 + 0.1182i | 1.7146 + 0.2469i | 1.2824 + 0.2560i | 1.3020 + 0.3885i | 1.4514 + 1.1095i | 1.6674 + 0.7048i | 1.1614 + 0.7220i | 1.2096 + 0.6442i |
| 15 | 0.9728 + 0.1097i | 0.9728 + 0.1097i | 0.9203 + 0.1683i | 0.9203 + 0.1683i | 1.3276 + 0.1371i | 1.2605 + 0.2607i | 0.9657 + 0.4185i | 1.0313 + 0.4086i |
| 15.5 | 1.7803 + 0.2282i | 1.4175 + 0.1304i | 1.0142 + 0.1107i | 1.0875 + 0.1106i | 1.5669 + 0.6281i | 1.3668 + 0.3723i | 1.0160 + 0.3423i | 1.0838 + 0.3367i |
| 16 | 0.9770 + 0.1124i | 0.9770 + 0.1124i | 0.9145 + 0.1775i | 0.9145 + 0.1775i | 1.3198 + 0.1175i | 1.2383 + 0.2709i | 0.9483 + 0.4442i | 1.0242 + 0.4164i |
| 16.5 | 1.6501 + 0.1602i | 1.3265 + 0.1294i | 0.9609 + 0.1136i | 1.0472 + 0.1153i | 1.6046 + 0.4875i | 1.2991 + 0.3994i | 0.9506 + 0.3440i | 1.0402 + 0.3427i |
| 17 | 1.3221 + 0.1224i | 1.6557 + 0.1780i | 1.0381 + 0.1026i | 0.9427 + 0.1024i | 1.2802 + 0.3500i | 1.5980 + 0.5501i | 0.9903 + 0.3365i | 0.9340 + 0.2929i |
| 17.5 | 1.3275 + 0.1269i | 1.6476 + 0.1778i | 1.0687 + 0.1009i | 0.9443 + 0.0988i | 1.2837 + 0.3590i | 1.5920 + 0.5468i | 1.0024 + 0.3379i | 0.9388 + 0.2809i |
| 18 | 1.3214 + 0.1348i | 1.6192 + 0.1568i | 1.0864 + 0.1085i | 0.9690 + 0.1136i | 1.2847 + 0.3887i | 1.5877 + 0.4787i | 1.0252 + 0.3747i | 0.9593 + 0.3085i |
| 18.5 | 1.3267 + 0.1381i | 1.6139 + 0.1586i | 1.1074 + 0.1075i | 0.9719 + 0.1124i | 1.2798 + 0.3928i | 1.5690 + 0.4783i | 1.0323 + 0.3791i | 0.9610 + 0.2983i |
| 19 | 0.8818 + 0.0863i | 0.8598 + 0.0671i | 0.6659 + 0.0819i | 0.6786 + 0.1287i | 0.9883 + 0.2131i | 1.1539 + 0.0898i | 0.7883 + 0.3358i | 0.7109 + 0.2753i |
| 19.5 | 1.5486 + 0.1257i | 1.2666 + 0.1072i | 0.9028 + 0.1029i | 1.0498 + 0.1027i | 1.4788 + 0.3590i | 1.2369 + 0.3451i | 0.9051 + 0.3205i | 1.0533 + 0.3050i |
| 20 | 1.5281 + 0.1441i | 1.2566 + 0.1120i | 0.9743 + 0.0673i | 1.0261 + 0.1720i | 1.4715 + 0.4355i | 1.2435 + 0.3351i | 0.9816 + 0.4825i | 1.0252 + 0.3371i |
| 20.5 | 1.5048 + 0.1396i | 1.2429 + 0.1109i | 0.9704 + 0.0648i | 1.0197 + 0.1762i | 1.4594 + 0.4244i | 1.2338 + 0.3332i | 0.9790 + 0.4840i | 1.0192 + 0.3364i |
| 21 | 1.4884 + 0.1372i | 1.2362 + 0.1109i | 0.9743 + 0.0635i | 1.0194 + 0.1825i | 1.4526 + 0.4196i | 1.2302 + 0.3337i | 0.9804 + 0.4906i | 1.0189 + 0.3404i |
| 21.5 | 1.4742 + 0.1349i | 1.2309 + 0.1105i | 0.9796 + 0.0634i | 1.0198 + 0.1891i | 1.4461 + 0.4142i | 1.2279 + 0.3323i | 0.9827 + 0.4998i | 1.0202 + 0.3467i |
| 22 | 1.4534 + 0.1259i | 1.2190 + 0.1086i | 0.9789 + 0.0639i | 1.0144 + 0.1947i | 1.4356 + 0.3854i | 1.2194 + 0.3249i | 0.9844 + 0.5115i | 1.0179 + 0.3535i |
| 22.5 | 1.4370 + 0.1217i | 1.2104 + 0.1069i | 0.9794 + 0.0652i | 1.0117 + 0.2003i | 1.4268 + 0.3730i | 1.2148 + 0.3198i | 0.9818 + 0.5182i | 1.0172 + 0.3596i |
| 23 | 1.1919 + 0.0896i | 1.4034 + 0.1266i | 1.0017 + 0.0743i | 0.9909 + 0.2196i | 1.2082 + 0.5145i | 1.2105 + 0.3132i | 1.0055 + 0.5362i | 1.0096 + 0.3698i |
| 23.5 | 1.4070 + 0.1153i | 1.1945 + 0.1045i | 0.9784 + 0.0686i | 1.0093 + 0.2102i | 1.4123 + 0.3539i | 1.2076 + 0.3137i | 0.9768 + 0.5294i | 1.0171 + 0.3701i |
| 24 | 1.1265 + 0.0892i | 1.3157 + 0.0959i | 0.9524 + 0.0776i | 0.9403 + 0.2321i | 1.4948 + 0.2501i | 1.2660 + 0.2959i | 0.9649 + 0.4426i | 1.0812 + 0.3131i |
| 24.5 | 1.1278 + 0.0893i | 1.3152 + 0.0946i | 0.9556 + 0.0782i | 0.9422 + 0.2341i | 1.4851 + 0.2508i | 1.2669 + 0.2917i | 0.9719 + 0.4412i | 1.0855 + 0.3077i |
| 25 | 1.1316 + 0.0895i | 1.3173 + 0.0939i | 0.9608 + 0.0790i | 0.9429 + 0.2357i | 1.4766 + 0.2540i | 1.2666 + 0.2886i | 0.9763 + 0.4381i | 1.0887 + 0.3028i |
| 25.5 | 1.1477 + 0.0888i | 1.3330 + 0.0946i | 0.9772 + 0.0808i | 0.9387 + 0.2361i | 1.4686 + 0.2702i | 1.2647 + 0.2863i | 0.9779 + 0.4321i | 1.0881 + 0.2935i |
| 26 | 1.1595 + 0.0882i | 1.3430 + 0.0950i | 0.9894 + 0.0820i | 0.9367 + 0.2358i | 1.4613 + 0.2782i | 1.2637 + 0.2839i | 0.9800 + 0.4265i | 1.0889 + 0.2858i |

| SNR/w | w24 | w25 | w26 | w27 | w28 | w29 | w30 | w31 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i |
| 7 | 0.4880 + 0.2600i | 0.5211 + 0.2931i | 0.4468 + 0.2453i | 0.4880 + 0.2600i | 0.4880 + 0.2600i | 0.5344 + 0.2543i | 0.4468 + 0.2453i | 0.4880 + 0.2600i |
| 7.5 | 0.4249 + 0.2411i | 0.3788 + 0.2236i | 1.1198 + 0.6595i | 1.5130 + 0.9931i | 0.4732 + 0.2588i | 0.4249 + 0.2411i | 1.0293 + 0.5865i | 1.1198 + 0.6595i |
| 8 | 1.2626 + 0.3059i | 1.1484 + 0.2962i | 1.1484 + 0.2962i | 1.0949 + 0.2917i | 1.1091 + 0.6749i | 1.0201 + 0.6000i | 1.0201 + 0.6000i | 0.9791 + 0.5650i |
| 8.5 | 1.2587 + 0.2880i | 1.1468 + 0.2788i | 1.1468 + 0.2788i | 1.0951 + 0.2750i | 1.1023 + 0.6879i | 1.0130 + 0.6127i | 1.0130 + 0.6127i | 0.9727 + 0.5775i |

-continued

| | | | | | | | | |
|---|---|---|---|---|---|---|---|---|
| 9 | 0.9919 + 0.2437i | 0.9006 + 0.3666i | 0.8684 + 0.2080i | 0.8187 + 0.2931i | 0.9919 + 0.2437i | 0.8825 + 0.3368i | 0.8684 + 0.2080i | 0.8187 + 0.2931i |
| 9.5 | 1.0016 + 0.2399i | 0.8985 + 0.3753i | 0.8605 + 0.2013i | 0.8101 + 0.2923i | 1.0016 + 0.2399i | 0.8803 + 0.3458i | 0.8605 + 0.2013i | 0.8101 + 0.2923i |
| 10 | 0.3146 − 0.1705i | 0.3146 − 0.1705i | 0.5800 − 0.3158i | 0.5800 − 0.3158i | 0.3146 − 0.1705i | 0.3146 − 0.1705i | 0.5800 − 0.3158i | 0.5800 − 0.3158i |
| 10.5 | 0.3056 − 0.1640i | 0.3056 − 0.1640i | 0.5895 − 0.3251i | 0.5895 − 0.3251i | 0.3056 − 0.1640i | 0.3056 − 0.1640i | 0.5895 − 0.3251i | 0.5895 − 0.3251i |
| 11 | 0.9785 + 0.2245i | 1.0059 + 0.2257i | 1.0059 + 0.2257i | 1.0352 + 0.2267i | 0.8559 + 0.5343i | 0.8762 + 0.5531i | 0.8762 + 0.5531i | 0.8976 + 0.5730i |
| 11.5 | 1.0013 + 0.2166i | 0.9721 + 0.2149i | 1.0331 + 0.2184i | 1.0013 + 0.2166i | 0.8669 + 0.5549i | 0.8450 + 0.5352i | 0.8906 + 0.5760i | 0.8669 + 0.5549i |
| 12 | 0.9769 + 0.1863i | 0.9452 + 0.2057i | 1.0100 + 0.2182i | 0.9795 + 0.2417i | 0.8236 + 0.4847i | 0.8236 + 0.4847i | 0.8798 + 0.5374i | 0.8798 + 0.5374i |
| 12.5 | 0.9683 + 0.1724i | 0.9333 + 0.1897i | 1.0041 + 0.2062i | 0.9683 + 0.2269i | 0.8172 + 0.4564i | 0.8172 + 0.4564i | 0.8727 + 0.5122i | 0.8727 + 0.5122i |
| 13 | 0.9630 + 0.1618i | 0.9257 + 0.1770i | 1.0010 + 0.1965i | 0.9611 + 0.2140i | 0.8114 + 0.4387i | 0.8114 + 0.4387i | 0.8656 + 0.4956i | 0.8656 + 0.4956i |
| 13.5 | 0.9601 + 0.1547i | 0.9220 + 0.1683i | 1.0004 + 0.1894i | 0.9581 + 0.2045i | 0.8069 + 0.4342i | 0.8069 + 0.4342i | 0.8601 + 0.4908i | 0.8601 + 0.4908i |
| 14 | 0.9469 + 0.1512i | 0.9124 + 0.1673i | 0.9890 + 0.1827i | 0.9504 + 0.2018i | 0.8010 + 0.4478i | 0.8010 + 0.4478i | 0.8569 + 0.5016i | 0.8569 + 0.5016i |
| 14.5 | 0.9396 + 0.1469i | 0.9065 + 0.1618i | 0.9886 + 0.1761i | 0.9486 + 0.1944i | 0.8013 + 0.4424i | 0.8013 + 0.4424i | 0.8556 + 0.4991i | 0.8556 + 0.4991i |
| 15 | 0.6366 + 0.1410i | 0.6366 + 0.1410i | 0.6534 + 0.1501i | 0.6366 + 0.1410i | 0.6009 + 0.4054i | 0.6009 + 0.4054i | 0.6631 + 0.4203i | 0.6466 + 0.4063i |
| 15.5 | 0.6290 + 0.1097i | 0.6290 + 0.1097i | 0.7380 + 0.1117i | 0.7116 + 0.1105i | 0.6382 + 0.3325i | 0.6300 + 0.3171i | 0.7230 + 0.3385i | 0.7071 + 0.3272i |
| 16 | 0.6325 + 0.1361i | 0.6325 + 0.1361i | 0.6562 + 0.1495i | 0.6562 + 0.1495i | 0.6041 + 0.4194i | 0.6041 + 0.4194i | 0.6844 + 0.4315i | 0.6536 + 0.4074i |
| 16.5 | 0.5984 + 0.1101i | 0.5984 + 0.1101i | 0.7207 + 0.1103i | 0.6832 + 0.1122i | 0.6014 + 0.3528i | 0.5903 + 0.3283i | 0.7010 + 0.3475i | 0.6697 + 0.3280i |
| 17 | 0.5882 + 0.1166i | 0.5882 + 0.1166i | 0.6682 + 0.1069i | 0.7042 + 0.1111i | 0.5954 + 0.3748i | 0.5987 + 0.3416i | 0.7073 + 0.3701i | 0.7192 + 0.3275i |
| 17.5 | 0.5867 + 0.1202i | 0.5867 + 0.1202i | 0.6742 + 0.1025i | 0.7217 + 0.1106i | 0.5959 + 0.3826i | 0.5970 + 0.3410i | 0.7339 + 0.3759i | 0.7430 + 0.3188i |
| 18 | 0.5972 + 0.1204i | 0.5972 + 0.1204i | 0.7244 + 0.0980i | 0.7655 + 0.1162i | 0.5947 + 0.3818i | 0.5970 + 0.3304i | 0.7535 + 0.3905i | 0.7704 + 0.3249i |
| 18.5 | 0.5961 + 0.1025i | 0.5964 + 0.1417i | 0.7314 + 0.0890i | 0.7775 + 0.1184i | 0.5953 + 0.3915i | 0.5975 + 0.3225i | 0.7649 + 0.4029i | 0.7817 + 0.3156i |
| 19 | 0.4061 + 0.0799i | 0.4265 + 0.2175i | 0.4641 + 0.0772i | 0.4884 + 0.1954i | 0.5409 + 0.5182i | 0.4759 + 0.3755i | 0.6422 + 0.4556i | 0.5543 + 0.3409i |
| 19.5 | 0.5082 + 0.0656i | 0.5265 + 0.1285i | 0.7398 + 0.0890i | 0.6724 + 0.1233i | 0.5700 + 0.4187i | 0.5429 + 0.2967i | 0.7319 + 0.3429i | 0.6646 + 0.2744i |
| 20 | 0.6423 + 0.0698i | 0.6358 + 0.1904i | 0.8003 + 0.0754i | 0.8009 + 0.2018i | 0.6132 + 0.4606i | 0.6264 + 0.3286i | 0.7906 + 0.4757i | 0.8007 + 0.3342i |
| 20.5 | 0.6384 + 0.0678i | 0.6332 + 0.1948i | 0.7968 + 0.0730i | 0.8000 + 0.2036i | 0.6160 + 0.4668i | 0.6266 + 0.3299i | 0.7913 + 0.4796i | 0.8013 + 0.3338i |
| 21 | 0.6429 + 0.0675i | 0.6384 + 0.1981i | 0.8011 + 0.0721i | 0.8064 + 0.2059i | 0.6220 + 0.4731i | 0.6327 + 0.3327i | 0.7953 + 0.4864i | 0.8070 + 0.3371i |
| 21.5 | 0.6501 + 0.0680i | 0.6464 + 0.2016i | 0.8075 + 0.0719i | 0.8146 + 0.2088i | 0.6296 + 0.4809i | 0.6412 + 0.3374i | 0.8008 + 0.4955i | 0.8141 + 0.3431i |
| 22 | 0.6546 + 0.0693i | 0.6531 + 0.2062i | 0.8096 + 0.0722i | 0.8191 + 0.2122i | 0.6400 + 0.4925i | 0.6498 + 0.3451i | 0.8073 + 0.5082i | 0.8199 + 0.3516i |
| 22.5 | 0.6581 + 0.0702i | 0.6580 + 0.2095i | 0.8121 + 0.0727i | 0.8228 + 0.2154i | 0.6452 + 0.5010i | 0.6552 + 0.3508i | 0.8087 + 0.5167i | 0.8230 + 0.3582i |
| 23 | 0.6613 + 0.0692i | 0.6601 + 0.2094i | 0.8231 + 0.0709i | 0.8202 + 0.2164i | 0.6479 + 0.5023i | 0.6570 + 0.3532i | 0.8160 + 0.5191i | 0.8231 + 0.3662i |
| 23.5 | 0.6618 + 0.0721i | 0.6653 + 0.2161i | 0.8148 + 0.0743i | 0.8285 + 0.2219i | 0.6524 + 0.5156i | 0.6640 + 0.3620i | 0.8099 + 0.5313i | 0.8291 + 0.3705i |
| 24 | 0.6277 + 0.0697i | 0.6260 + 0.2109i | 0.7852 + 0.0706i | 0.7804 + 0.2127i | 0.6444 + 0.5097i | 0.6285 + 0.3572i | 0.8056 + 0.5017i | 0.7792 + 0.3548i |
| 24.5 | 0.6341 + 0.0711i | 0.6317 + 0.2150i | 0.7905 + 0.0716i | 0.7839 + 0.2154i | 0.6537 + 0.5167i | 0.6360 + 0.3632i | 0.8156 + 0.5101i | 0.7875 + 0.3608i |
| 25 | 0.6408 + 0.0723i | 0.6355 + 0.2186i | 0.7969 + 0.0724i | 0.7860 + 0.2176i | 0.6614 + 0.5229i | 0.6414 + 0.3685i | 0.8234 + 0.5160i | 0.7936 + 0.3653i |
| 25.5 | 0.6523 + 0.0731i | 0.6352 + 0.2218i | 0.8115 + 0.0731i | 0.7837 + 0.2189i | 0.6674 + 0.5284i | 0.6441 + 0.3734i | 0.8292 + 0.5189i | 0.7961 + 0.3682i |
| 26 | 0.6622 + 0.0739i | 0.6337 + 0.2246i | 0.8231 + 0.0739i | 0.7818 + 0.2196i | 0.6739 + 0.5331i | 0.6474 + 0.3777i | 0.8353 + 0.5198i | 0.7994 + 0.3695i |

| SNR/w | w32 | w33 | w34 | w35 | w36 | w37 | w38 | w39 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |

-continued

| | | | | | | | | |
|---|---|---|---|---|---|---|---|---|
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i |
| 7 | 0.5818 + 1.1302i | 0.5321 + 1.0488i | 0.7162 + 1.3338i | 0.5818 + 1.1302i | 0.3631 + 1.2644i | 0.3443 + 1.1417i | 0.4291 + 1.7565i | 0.3631 + 1.2644i |
| 7.5 | 0.2588 + 0.4732i | 0.2411 + 0.4249i | 0.3175 + 1.1489i | 0.3279 + 1.2665i | 0.2753 + 0.5196i | 0.2588 + 0.4732i | 0.3124 + 1.0924i | 0.3175 + 1.1489i |
| 8 | 0.2167 + 0.3748i | 0.2357 + 0.4259i | 0.2357 + 0.4259i | 0.2549 + 0.4795i | 0.2167 + 0.3748i | 0.2357 + 0.4259i | 0.2357 + 0.4259i | 0.2549 + 0.4795i |
| 8.5 | 0.2088 + 0.3720i | 0.2294 + 0.4290i | 0.2294 + 0.4290i | 0.2299 + 0.4909i | 0.2088 + 0.3720i | 0.2294 + 0.4290i | 0.2294 + 0.4290i | 0.2708 + 0.4861i |
| 9 | 0.1853 + 0.6815i | 0.2599 + 0.6790i | 0.1918 + 0.8048i | 0.2852 + 0.7636i | 0.1853 + 0.6815i | 0.2599 + 0.6790i | 0.1918 + 0.8048i | 0.2852 + 0.7636i |
| 9.5 | 0.1820 + 0.6851i | 0.2619 + 0.6777i | 0.1923 + 0.8151i | 0.2969 + 0.7633i | 0.1820 + 0.6851i | 0.2619 + 0.6777i | 0.1923 + 0.8151i | 0.2969 + 0.7633i |
| 10 | 0.3437 − 1.7476i | 0.2830 − 1.4280i | 0.2440 − 1.0127i | 0.2440 − 1.0127i | 0.2830 − 1.4280i | 0.2686 − 1.3530i | 0.2440 − 1.0127i | 0.2449 − 1.0415i |
| 10.5 | 0.3495 − 1.7549i | 0.2804 − 1.4293i | 0.2346 − 1.0027i | 0.2346 − 1.0027i | 0.2804 − 1.4293i | 0.2635 − 1.3614i | 0.2346 − 1.0027i | 0.2356 − 1.0372i |
| 11 | 0.1598 + 0.3010i | 0.1598 + 0.3010i | 0.1598 + 0.3010i | 0.1598 + 0.3010i | 0.1598 + 0.3010i | 0.1598 + 0.3010i | 0.1598 + 0.3010i | 0.1598 + 0.3010i |
| 11.5 | 0.1564 + 0.3007i | 0.1564 + 0.3007i | 0.1564 + 0.3007i | 0.1564 + 0.3007i | 0.1564 + 0.3007i | 0.1564 + 0.3007i | 0.1564 + 0.3007i | 0.1564 + 0.3007i |
| 12 | 0.1373 + 0.3307i | 0.1373 + 0.3307i | 0.1373 + 0.3307i | 0.1373 + 0.3307i | 0.1645 + 0.3236i | 0.1645 + 0.3236i | 0.1645 + 0.3236i | 0.1645 + 0.3236i |
| 12.5 | 0.1302 + 0.3786i | 0.1302 + 0.3786i | 0.1302 + 0.3786i | 0.1302 + 0.3786i | 0.1661 + 0.3606i | 0.1661 + 0.3606i | 0.1661 + 0.3606i | 0.1661 + 0.3606i |
| 13 | 0.1252 + 0.4124i | 0.1252 + 0.4124i | 0.1252 + 0.4124i | 0.1252 + 0.4124i | 0.1684 + 0.3861i | 0.1684 + 0.3861i | 0.1684 + 0.3861i | 0.1684 + 0.3861i |
| 13.5 | 0.1217 + 0.4285i | 0.1217 + 0.4285i | 0.1217 + 0.4285i | 0.1217 + 0.4285i | 0.1708 + 0.3974i | 0.1708 + 0.3974i | 0.1708 + 0.3974i | 0.1708 + 0.3974i |
| 14 | 0.1184 + 0.4351i | 0.1184 + 0.4351i | 0.1184 + 0.4351i | 0.1184 + 0.4351i | 0.1716 + 0.4008i | 0.1716 + 0.4008i | 0.1716 + 0.4008i | 0.1716 + 0.4008i |
| 14.5 | 0.1157 + 0.4495i | 0.1157 + 0.4495i | 0.1157 + 0.4495i | 0.1157 + 0.4495i | 0.1754 + 0.4094i | 0.1754 + 0.4094i | 0.1754 + 0.4094i | 0.1754 + 0.4094i |
| 15 | 0.2366 + 1.7925i | 0.1132 + 1.0217i | 0.1343 + 1.4263i | 0.1131 + 1.0934i | 0.1115 + 0.6331i | 0.1142 + 0.7348i | 0.1115 + 0.6331i | 0.1120 + 0.7126i |
| 15.5 | 0.1106 + 0.9815i | 0.1744 + 0.9230i | 0.1106 + 0.9815i | 0.1744 + 0.9230i | 0.1357 + 0.6326i | 0.1479 + 0.6548i | 0.1357 + 0.6326i | 0.1479 + 0.6548i |
| 16 | 0.1430 + 1.4001i | 0.1156 + 1.1081i | 0.1884 + 1.7333i | 0.1078 + 1.0066i | 0.1070 + 0.6209i | 0.1080 + 0.7000i | 0.1070 + 0.6209i | 0.1060 + 0.7438i |
| 16.5 | 0.1053 + 1.2977i | 0.1293 + 0.9737i | 0.1785 + 1.2326i | 0.1473 + 0.9932i | 0.1172 + 0.6177i | 0.1219 + 0.7208i | 0.1172 + 0.6177i | 0.1219 + 0.7208i |
| 17 | 0.1490 + 1.6173i | 0.1183 + 0.9591i | 0.1303 + 1.3054i | 0.1236 + 1.0413i | 0.1097 + 0.6047i | 0.1122 + 0.7387i | 0.1097 + 0.6047i | 0.1188 + 0.7034i |
| 17.5 | 0.1411 + 1.5896i | 0.1170 + 0.9512i | 0.1278 + 1.2852i | 0.1257 + 1.0327i | 0.1073 + 0.5955i | 0.1100 + 0.7473i | 0.1073 + 0.5955i | 0.1221 + 0.7136i |
| 18 | 0.1396 + 1.5775i | 0.1131 + 0.9418i | 0.1242 + 1.2789i | 0.1226 + 1.0347i | 0.1041 + 0.5771i | 0.1063 + 0.7507i | 0.1041 + 0.5771i | 0.1223 + 0.7129i |
| 18.5 | 0.1401 + 1.5712i | 0.1104 + 0.9411i | 0.1233 + 1.2808i | 0.1220 + 1.0474i | 0.0863 + 0.5683i | 0.1030 + 0.7613i | 0.1177 + 0.5704i | 0.1259 + 0.7175i |
| 19 | 0.1202 + 1.4352i | 0.0996 + 1.2052i | 0.2171 + 1.6874i | 0.2773 + 1.1812i | 0.0839 + 0.8147i | 0.0834 + 0.9964i | 0.1971 + 0.8041i | 0.2436 + 0.9839i |
| 19.5 | 0.1542 + 1.5593i | 0.0710 + 0.9899i | 0.1176 + 1.2799i | 0.1750 + 1.0404i | 0.0755 + 0.6559i | 0.0799 + 0.8133i | 0.1865 + 0.6474i | 0.2027 + 0.8117i |
| 20 | 0.1167 + 1.2700i | 0.0962 + 1.0708i | 0.1297 + 1.5321i | 0.0883 + 0.8994i | 0.0749 + 0.5327i | 0.0612 + 0.6589i | 0.1829 + 0.5465i | 0.1233 + 0.7216i |
| 20.5 | 0.1161 + 1.2756i | 0.0974 + 1.0790i | 0.1295 + 1.5298i | 0.0884 + 0.9064i | 0.0720 + 0.5415i | 0.0591 + 0.6728i | 0.1883 + 0.5570i | 0.1297 + 0.7318i |
| 21 | 0.1140 + 1.2762i | 0.0978 + 1.0812i | 0.1280 + 1.5231i | 0.0867 + 0.9060i | 0.0704 + 0.5429i | 0.0574 + 0.6772i | 0.1921 + 0.5608i | 0.1353 + 0.7334i |
| 21.5 | 0.1108 + 1.2731i | 0.0977 + 1.0794i | 0.1256 + 1.5126i | 0.0853 + 0.9029i | 0.0694 + 0.5429i | 0.0559 + 0.6795i | 0.1945 + 0.5628i | 0.1410 + 0.7326i |
| 22 | 0.1045 + 1.2645i | 0.0959 + 1.0725i | 0.1201 + 1.4962i | 0.0871 + 0.8987i | 0.0687 + 0.5451i | 0.0549 + 0.6836i | 0.1961 + 0.5662i | 0.1487 + 0.7336i |
| 22.5 | 0.1015 + 1.2588i | 0.0952 + 1.0704i | 0.1161 + 1.4831i | 0.0884 + 0.8992i | 0.0685 + 0.5510i | 0.0545 + 0.6912i | 0.1980 + 0.5732i | 0.1557 + 0.7375i |
| 23 | 0.1141 + 1.4950i | 0.0679 + 0.9023i | 0.1059 + 1.2572i | 0.1019 + 1.0664i | 0.0653 + 0.5841i | 0.0662 + 0.7419i | 0.2015 + 0.5913i | 0.1899 + 0.7378i |
| 23.5 | 0.0985 + 1.2520i | 0.0938 + 1.0710i | 0.1114 + 1.4628i | 0.0905 + 0.9054i | 0.0693 + 0.5689i | 0.0563 + 0.7102i | 0.2034 + 0.5915i | 0.1695 + 0.7506i |
| 24 | 0.0901 + 1.1911i | 0.0801 + 1.0038i | 0.1106 + 1.4060i | 0.2328 + 0.9654i | 0.0680 + 0.6561i | 0.0697 + 0.8236i | 0.2070 + 0.6480i | 0.2108 + 0.8051i |
| 24.5 | 0.0894 + 1.1877i | 0.0808 + 1.0036i | 0.1074 + 1.3967i | 0.2340 + 0.9604i | 0.0695 + 0.6593i | 0.0707 + 0.8259i | 0.2118 + 0.6478i | 0.2131 + 0.8017i |
| 25 | 0.0890 + 1.1877i | 0.0816 + 1.0065i | 0.1053 + 1.3909i | 0.2349 + 0.9570i | 0.0709 + 0.6644i | 0.0718 + 0.8309i | 0.2160 + 0.6470i | 0.2150 + 0.7989i |

-continued

| | | | | | | | | |
|---|---|---|---|---|---|---|---|---|
| 25.5 | 0.0889 + 1.1889i | 0.0823 + 1.0105i | 0.1037 + 1.3867i | 0.2355 + 0.9547i | 0.0721 + 0.6705i | 0.0727 + 0.8369i | 0.2196 + 0.6455i | 0.2165 + 0.7966i |
| 26 | 0.0888 + 1.1903i | 0.0829 + 1.0145i | 0.1023 + 1.3833i | 0.2357 + 0.9536i | 0.0732 + 0.6770i | 0.0737 + 0.8430i | 0.2228 + 0.6437i | 0.2175 + 0.7949i |

| SNR/w | w40 | w41 | w42 | w43 | w44 | w45 | w46 | w47 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i |
| 7 | 0.5321 + 1.0488i | 0.5054 + 1.0028i | 0.5818 + 1.1302i | 0.5321 + 1.0488i | 0.3443 + 1.1417i | 0.3344 + 1.0806i | 0.3631 + 1.2644i | 0.3443 + 1.1417i |
| 7.5 | 0.4732 + 0.2588i | 0.4249 + 0.2411i | 1.1489 + 0.3175i | 1.2665 + 0.3279i | 0.5196 + 0.2753i | 0.4732 + 0.2588i | 1.0924 + 0.3124i | 1.1489 + 0.3175i |
| 8 | 0.2357 + 0.4259i | 0.2549 + 0.4795i | 0.2549 + 0.4795i | 0.2486 + 0.5341i | 0.2357 + 0.4259i | 0.2549 + 0.4795i | 0.2549 + 0.4795i | 0.2969 + 0.5272i |
| 8.5 | 0.2294 + 0.4290i | 0.2299 + 0.4909i | 0.2299 + 0.4909i | 0.2411 + 0.5508i | 0.2294 + 0.4290i | 0.2708 + 0.4861i | 0.2708 + 0.4861i | 0.2980 + 0.5370i |
| 9 | 0.1853 + 0.6815i | 0.2599 + 0.6790i | 0.1918 + 0.8048i | 0.2852 + 0.7636i | 0.1853 + 0.6815i | 0.2599 + 0.6790i | 0.1918 + 0.8048i | 0.2852 + 0.7636i |
| 9.5 | 0.1820 + 0.6851i | 0.2619 + 0.6777i | 0.1923 + 0.8151i | 0.2969 + 0.7633i | 0.1820 + 0.6851i | 0.2619 + 0.6777i | 0.1923 + 0.8151i | 0.2969 + 0.7633i |
| 10 | 0.9890 − 1.4799i | 0.8088 − 1.2150i | 0.5436 − 0.8943i | 0.5436 − 0.8943i | 0.8088 − 1.2150i | 0.7657 − 1.1516i | 0.5436 − 0.8943i | 0.5630 − 0.9155i |
| 10.5 | 0.9918 − 1.4880i | 0.8109 − 1.2116i | 0.5437 − 0.8807i | 0.5437 − 0.8807i | 0.8109 − 1.2116i | 0.7744 − 1.1516i | 0.5437 − 0.8807i | 0.5674 − 0.9058i |
| 11 | 0.1969 + 0.6553i | 0.1969 + 0.6553i | 0.1969 + 0.6553i | 0.1969 + 0.6553i | 0.3348 + 0.5953i | 0.3348 + 0.5953i | 0.3348 + 0.5953i | 0.3348 + 0.5953i |
| 11.5 | 0.1877 + 0.6663i | 0.1877 + 0.6663i | 0.1877 + 0.6663i | 0.1877 + 0.6663i | 0.3449 + 0.5981i | 0.3449 + 0.5981i | 0.3449 + 0.5981i | 0.3449 + 0.5981i |
| 12 | 0.1786 + 0.6836i | 0.1786 + 0.6836i | 0.1786 + 0.6836i | 0.1786 + 0.6836i | 0.3585 + 0.6001i | 0.3585 + 0.6001i | 0.3585 + 0.6001i | 0.3585 + 0.6001i |
| 12.5 | 0.1783 + 0.7098i | 0.1783 + 0.7098i | 0.1783 + 0.7098i | 0.1783 + 0.7098i | 0.3778 + 0.6041i | 0.3778 + 0.6041i | 0.3778 + 0.6041i | 0.3778 + 0.6041i |
| 13 | 0.1775 + 0.7313i | 0.1775 + 0.7313i | 0.1775 + 0.7313i | 0.1775 + 0.7313i | 0.3914 + 0.6049i | 0.3914 + 0.6049i | 0.3914 + 0.6049i | 0.3914 + 0.6049i |
| 13.5 | 0.1744 + 0.7444i | 0.1744 + 0.7444i | 0.1744 + 0.7444i | 0.1744 + 0.7444i | 0.3995 + 0.6028i | 0.3995 + 0.6028i | 0.3995 + 0.6028i | 0.3995 + 0.6028i |
| 14 | 0.1772 + 0.7474i | 0.1772 + 0.7474i | 0.1516 + 0.7621i | 0.1772 + 0.7474i | 0.4023 + 0.5991i | 0.4023 + 0.5991i | 0.4023 + 0.5991i | 0.4023 + 0.5991i |
| 14.5 | 0.1898 + 0.7577i | 0.1898 + 0.7577i | 0.1474 + 0.7693i | 0.1474 + 0.7693i | 0.4096 + 0.6004i | 0.4096 + 0.6004i | 0.4096 + 0.6004i | 0.4089 + 0.5826i |
| 15 | 0.6334 + 1.5624i | 0.3445 + 1.0222i | 0.3767 + 1.3678i | 0.3375 + 1.0864i | 0.3247 + 0.6377i | 0.3307 + 0.7164i | 0.3247 + 0.6377i | 0.3307 + 0.7164i |
| 15.5 | 0.1266 + 1.3390i | 0.4298 + 0.9537i | 0.2698 + 1.2595i | 0.4136 + 1.0326i | 0.4146 + 0.6068i | 0.4236 + 0.6703i | 0.4011 + 0.5965i | 0.4047 + 0.6466i |
| 16 | 0.4307 + 1.3657i | 0.3427 + 1.0736i | 0.5886 + 1.6752i | 0.3211 + 0.9921i | 0.3296 + 0.6232i | 0.3421 + 0.6984i | 0.3115 + 0.6358i | 0.3204 + 0.7350i |
| 16.5 | 0.2029 + 1.6229i | 0.4061 + 0.9419i | 0.4138 + 1.2839i | 0.3981 + 0.9966i | 0.3744 + 0.6031i | 0.3838 + 0.6977i | 0.3484 + 0.6000i | 0.3571 + 0.6873i |
| 17 | 0.4551 + 1.5890i | 0.3688 + 0.9394i | 0.3994 + 1.2831i | 0.3584 + 1.0296i | 0.3706 + 0.5982i | 0.3667 + 0.7052i | 0.3292 + 0.5917i | 0.3315 + 0.6797i |
| 17.5 | 0.4310 + 1.5685i | 0.3749 + 0.9291i | 0.3899 + 1.2664i | 0.3578 + 1.0211i | 0.3781 + 0.5910i | 0.3716 + 0.7091i | 0.3216 + 0.5867i | 0.3245 + 0.6863i |
| 18 | 0.4257 + 1.5553i | 0.3653 + 0.9212i | 0.3793 + 1.2595i | 0.3474 + 1.0247i | 0.3805 + 0.5765i | 0.3633 + 0.7147i | 0.3133 + 0.5726i | 0.3120 + 0.6868i |
| 18.5 | 0.4244 + 1.5436i | 0.3639 + 0.9208i | 0.3774 + 1.2582i | 0.3430 + 1.0368i | 0.3915 + 0.5705i | 0.3623 + 0.7269i | 0.3080 + 0.5673i | 0.3034 + 0.6934i |
| 19 | 0.7690 + 1.4112i | 0.6649 + 1.1380i | 0.4761 + 1.4765i | 0.4596 + 1.1970i | 0.4764 + 0.7356i | 0.5686 + 0.9186i | 0.3592 + 0.7734i | 0.4125 + 0.9576i |
| 19.5 | 0.4619 + 1.4871i | 0.4964 + 0.9866i | 0.3490 + 1.2589i | 0.3490 + 1.0371i | 0.4558 + 0.6134i | 0.4773 + 0.7891i | 0.3323 + 0.6317i | 0.3411 + 0.8066i |
| 20 | 0.3324 + 1.2294i | 0.3300 + 1.0062i | 0.3879 + 1.4978i | 0.2451 + 0.8999i | 0.4353 + 0.5950i | 0.4122 + 0.7607i | 0.3109 + 0.5751i | 0.2807 + 0.7485i |
| 20.5 | 0.3324 + 1.2302i | 0.3334 + 1.0155i | 0.3846 + 1.4868i | 0.2478 + 0.9074i | 0.4435 + 0.6045i | 0.4193 + 0.7714i | 0.3125 + 0.5857i | 0.2831 + 0.7571i |
| 21 | 0.3284 + 1.2285i | 0.3320 + 1.0206i | 0.3786 + 1.4755i | 0.2471 + 0.9090i | 0.4494 + 0.6106i | 0.4225 + 0.7777i | 0.3144 + 0.5907i | 0.2838 + 0.7596i |
| 21.5 | 0.3217 + 1.2283i | 0.3261 + 1.0269i | 0.3716 + 1.4663i | 0.2470 + 0.9085i | 0.4549 + 0.6160i | 0.4247 + 0.7818i | 0.3170 + 0.5938i | 0.2850 + 0.7600i |
| 22 | 0.3100 + 1.2397i | 0.3058 + 1.0469i | 0.3607 + 1.4682i | 0.2567 + 0.9079i | 0.4631 + 0.6208i | 0.4319 + 0.7788i | 0.3205 + 0.5962i | 0.2904 + 0.7595i |

-continued

| | | | | | | | | |
|---|---|---|---|---|---|---|---|---|
| 22.5 | 0.3044 + 1.2443i | 0.3002 + 1.0568i | 0.3505 + 1.4648i | 0.2617 + 0.9117i | 0.4705 + 0.6290i | 0.4380 + 0.7857i | 0.3259 + 0.6027i | 0.2955 + 0.7625i |
| 23 | 0.3452 + 1.1540i | 0.4129 + 0.9793i | 0.3125 + 1.3457i | 0.2563 + 0.9501i | 0.4782 + 0.6393i | 0.4531 + 0.8051i | 0.3394 + 0.6131i | 0.3093 + 0.7816i |
| 23.5 | 0.2993 + 1.2594i | 0.2906 + 1.0772i | 0.3403 + 1.4686i | 0.2690 + 0.9234i | 0.4846 + 0.6443i | 0.4495 + 0.7999i | 0.3381 + 0.6175i | 0.3079 + 0.7726i |
| 24 | 0.4884 + 1.4147i | 0.4408 + 0.9883i | 0.2990 + 1.3047i | 0.3098 + 1.1123i | 0.5034 + 0.6582i | 0.5007 + 0.8232i | 0.3521 + 0.6461i | 0.3534 + 0.7992i |
| 24.5 | 0.4818 + 1.4041i | 0.4361 + 0.9895i | 0.2934 + 1.3012i | 0.3024 + 1.1113i | 0.5119 + 0.6637i | 0.5063 + 0.8279i | 0.3591 + 0.6480i | 0.3581 + 0.8012i |
| 25 | 0.4778 + 1.3940i | 0.4318 + 0.9909i | 0.2896 + 1.2989i | 0.2959 + 1.1112i | 0.5190 + 0.6693i | 0.5110 + 0.8331i | 0.3652 + 0.6503i | 0.3620 + 0.8038i |
| 25.5 | 0.4747 + 1.3846i | 0.4279 + 0.9924i | 0.2865 + 1.2969i | 0.2905 + 1.1114i | 0.5249 + 0.6752i | 0.5140 + 0.8384i | 0.3704 + 0.6529i | 0.3647 + 0.8068i |
| 26 | 0.4711 + 1.3764i | 0.4242 + 0.9942i | 0.2836 + 1.2952i | 0.2860 + 1.1119i | 0.5308 + 0.6813i | 0.5155 + 0.8438i | 0.3755 + 0.6565i | 0.3664 + 0.8105i |

| SNR/ w | w48 | w49 | w50 | w51 | w52 | w53 | w54 | w55 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i |
| 7 | 0.2515 + 0.4210i | 0.2719 + 0.4652i | 0.2350 + 0.3745i | 0.2515 + 0.4210i | 0.2515 + 0.4210i | 0.2515 + 0.4210i | 0.2350 + 0.3745i | 0.2515 + 0.4210i |
| 7.5 | 0.2411 + 0.4249i | 0.2236 + 0.3788i | 0.3279 + 1.2665i | 0.3690 + 1.7569i | 0.2588 + 0.4732i | 0.2411 + 0.4249i | 0.3175 + 1.1489i | 0.3279 + 1.2665i |
| 8 | 0.3748 + 0.2167i | 0.4259 + 0.2357i | 0.4259 + 0.2357i | 0.4795 + 0.2549i | 0.3748 + 0.2167i | 0.4259 + 0.2357i | 0.4259 + 0.2357i | 0.4795 + 0.2549i |
| 8.5 | 0.3720 + 0.2088i | 0.4290 + 0.2294i | 0.4290 + 0.2294i | 0.4909 + 0.2299i | 0.3720 + 0.2088i | 0.4290 + 0.2294i | 0.4290 + 0.2294i | 0.4861 + 0.2708i |
| 9 | 0.2497 + 0.2245i | 0.2893 + 0.2371i | 0.2893 + 0.2371i | 0.3356 + 0.2412i | 0.2497 + 0.2245i | 0.2893 + 0.2371i | 0.2893 + 0.2371i | 0.3356 + 0.2412i |
| 9.5 | 0.2419 + 0.2216i | 0.2871 + 0.2459i | 0.2958 + 0.2095i | 0.3444 + 0.2369i | 0.2419 + 0.2216i | 0.2871 + 0.2459i | 0.2958 + 0.2095i | 0.3444 + 0.2369i |
| 10 | 0.1705 − 0.3146i | 0.1705 − 0.3146i | 0.2169 − 0.6218i | 0.2169 − 0.6218i | 0.1705 − 0.3146i | 0.1705 − 0.3146i | 0.2169 − 0.6218i | 0.2169 − 0.6218i |
| 10.5 | 0.1640 − 0.3056i | 0.1640 − 0.3056i | 0.2071 − 0.6406i | 0.2071 − 0.6406i | 0.1640 − 0.3056i | 0.1640 − 0.3056i | 0.2071 − 0.6406i | 0.2071 − 0.6406i |
| 11 | 0.3012 + 0.1597i | 0.3012 + 0.1597i | 0.3012 + 0.1597i | 0.3012 + 0.1597i | 0.3012 + 0.1597i | 0.3012 + 0.1597i | 0.3012 + 0.1597i | 0.3012 + 0.1597i |
| 11.5 | 0.2975 + 0.1563i | 0.2975 + 0.1563i | 0.2975 + 0.1563i | 0.2975 + 0.1563i | 0.2975 + 0.1563i | 0.2975 + 0.1563i | 0.2975 + 0.1563i | 0.2975 + 0.1563i |
| 12 | 0.2707 + 0.1533i | 0.2707 + 0.1533i | 0.2707 + 0.1533i | 0.2707 + 0.1533i | 0.2707 + 0.1533i | 0.2707 + 0.1533i | 0.2707 + 0.1533i | 0.2707 + 0.1533i |
| 12.5 | 0.2453 + 0.1484i | 0.2453 + 0.1484i | 0.2453 + 0.1484i | 0.2453 + 0.1484i | 0.2453 + 0.1484i | 0.2453 + 0.1484i | 0.2453 + 0.1484i | 0.2453 + 0.1484i |
| 13 | 0.2294 + 0.1447i | 0.2294 + 0.1447i | 0.2294 + 0.1447i | 0.2294 + 0.1447i | 0.2294 + 0.1447i | 0.2294 + 0.1447i | 0.2294 + 0.1447i | 0.2294 + 0.1447i |
| 13.5 | 0.2219 + 0.1422i | 0.2219 + 0.1422i | 0.2219 + 0.1422i | 0.2219 + 0.1422i | 0.2219 + 0.1422i | 0.2219 + 0.1422i | 0.2219 + 0.1422i | 0.2219 + 0.1422i |
| 14 | 0.2153 + 0.1266i | 0.2153 + 0.1266i | 0.2153 + 0.1266i | 0.2153 + 0.1266i | 0.2218 + 0.1534i | 0.2218 + 0.1534i | 0.2218 + 0.1534i | 0.2218 + 0.1534i |
| 14.5 | 0.2086 + 0.1249i | 0.2086 + 0.1249i | 0.2086 + 0.1249i | 0.2086 + 0.1249i | 0.2149 + 0.1561i | 0.2149 + 0.1561i | 0.2149 + 0.1561i | 0.2149 + 0.1561i |
| 15 | 0.1241 + 0.1182i | 0.1241 + 0.1182i | 0.1241 + 0.1182i | 0.1241 + 0.1182i | 0.1177 + 0.3603i | 0.1177 + 0.3603i | 0.1177 + 0.3603i | 0.1177 + 0.3603i |
| 15.5 | 0.1165 + 0.1237i | 0.1165 + 0.1237i | 0.1165 + 0.1237i | 0.1165 + 0.1237i | 0.1236 + 0.3719i | 0.1236 + 0.3719i | 0.1236 + 0.3719i | 0.1236 + 0.3719i |
| 16 | 0.1248 + 0.1142i | 0.1248 + 0.1142i | 0.1248 + 0.1142i | 0.1248 + 0.1142i | 0.1150 + 0.3690i | 0.1163 + 0.3424i | 0.1150 + 0.3690i | 0.1163 + 0.3424i |
| 16.5 | 0.1124 + 0.1192i | 0.1124 + 0.1192i | 0.1124 + 0.1192i | 0.1124 + 0.1192i | 0.1139 + 0.3829i | 0.1135 + 0.3525i | 0.1139 + 0.3829i | 0.1135 + 0.3525i |
| 17 | 0.1157 + 0.1157i | 0.1157 + 0.1157i | 0.1157 + 0.1157i | 0.1157 + 0.1157i | 0.1113 + 0.3773i | 0.1134 + 0.3400i | 0.1113 + 0.3773i | 0.1134 + 0.3400i |
| 17.5 | 0.1169 + 0.1143i | 0.1169 + 0.1143i | 0.1169 + 0.1143i | 0.1169 + 0.1143i | 0.1111 + 0.3793i | 0.1143 + 0.3320i | 0.1111 + 0.3793i | 0.1143 + 0.3320i |
| 18 | 0.1033 + 0.1105i | 0.1033 + 0.1105i | 0.1339 + 0.1101i | 0.1339 + 0.1101i | 0.0984 + 0.3716i | 0.1017 + 0.3147i | 0.1253 + 0.3759i | 0.1301 + 0.3177i |
| 18.5 | 0.0939 + 0.0943i | 0.0946 + 0.1241i | 0.1446 + 0.0939i | 0.1449 + 0.1242i | 0.0911 + 0.3755i | 0.0942 + 0.3061i | 0.1336 + 0.3799i | 0.1399 + 0.3092i |
| 19 | 0.0786 + 0.0928i | 0.0849 + 0.2753i | 0.0786 + 0.0928i | 0.0849 + 0.2753i | 0.0877 + 0.6350i | 0.0977 + 0.4554i | 0.1446 + 0.6281i | 0.0977 + 0.4554i |
| 19.5 | 0.0951 + 0.0766i | 0.0782 + 0.2154i | 0.0951 + 0.0766i | 0.1213 + 0.2125i | 0.0760 + 0.5036i | 0.0772 + 0.3648i | 0.1642 + 0.4957i | 0.1421 + 0.3594i |

-continued

| | | | | | | | | |
|---|---|---|---|---|---|---|---|---|
| 20 | 0.0713 + 0.0697i | 0.0711 + 0.1478i | 0.2060 + 0.0687i | 0.2046 + 0.1520i | 0.0715 + 0.3878i | 0.0710 + 0.2879i | 0.1957 + 0.3967i | 0.2012 + 0.2903i |
| 20.5 | 0.0696 + 0.0636i | 0.0695 + 0.1639i | 0.2051 + 0.0633i | 0.2044 + 0.1665i | 0.0700 + 0.4057i | 0.0696 + 0.2929i | 0.1995 + 0.4139i | 0.2029 + 0.2955i |
| 21 | 0.0696 + 0.0610i | 0.0696 + 0.1698i | 0.2077 + 0.0610i | 0.2073 + 0.1721i | 0.0698 + 0.4114i | 0.0697 + 0.2939i | 0.2034 + 0.4201i | 0.2063 + 0.2971i |
| 21.5 | 0.0707 + 0.0595i | 0.0706 + 0.1722i | 0.2119 + 0.0599i | 0.2114 + 0.1748i | 0.0701 + 0.4134i | 0.0705 + 0.2935i | 0.2066 + 0.4231i | 0.2100 + 0.2979i |
| 22 | 0.0723 + 0.0588i | 0.0719 + 0.1737i | 0.2166 + 0.0598i | 0.2155 + 0.1775i | 0.0704 + 0.4157i | 0.0713 + 0.2939i | 0.2086 + 0.4265i | 0.2132 + 0.3001i |
| 22.5 | 0.0730 + 0.0592i | 0.0727 + 0.1768i | 0.2188 + 0.0604i | 0.2178 + 0.1809i | 0.0710 + 0.4212i | 0.0721 + 0.2976i | 0.2107 + 0.4330i | 0.2155 + 0.3047i |
| 23 | 0.0720 + 0.0615i | 0.0717 + 0.1851i | 0.2162 + 0.0625i | 0.2153 + 0.1881i | 0.0692 + 0.4430i | 0.0709 + 0.3116i | 0.2088 + 0.4508i | 0.2131 + 0.3169i |
| 23.5 | 0.0735 + 0.0614i | 0.0734 + 0.1846i | 0.2204 + 0.0628i | 0.2198 + 0.1888i | 0.0720 + 0.4369i | 0.0730 + 0.3094i | 0.2145 + 0.4495i | 0.2184 + 0.3170i |
| 24 | 0.0668 + 0.0698i | 0.0669 + 0.2101i | 0.2012 + 0.0697i | 0.2017 + 0.2100i | 0.0675 + 0.5006i | 0.0672 + 0.3530i | 0.2047 + 0.4981i | 0.2028 + 0.3524i |
| 24.5 | 0.0679 + 0.0704i | 0.0679 + 0.2120i | 0.2045 + 0.0702i | 0.2048 + 0.2113i | 0.0689 + 0.5043i | 0.0683 + 0.3561i | 0.2088 + 0.4995i | 0.2060 + 0.3542i |
| 25 | 0.0687 + 0.0711i | 0.0686 + 0.2143i | 0.2073 + 0.0705i | 0.2070 + 0.2122i | 0.0701 + 0.5091i | 0.0690 + 0.3598i | 0.2121 + 0.5000i | 0.2083 + 0.3552i |
| 25.5 | 0.0699 + 0.0718i | 0.0690 + 0.2167i | 0.2111 + 0.0703i | 0.2080 + 0.2118i | 0.0711 + 0.5149i | 0.0694 + 0.3642i | 0.2146 + 0.4990i | 0.2095 + 0.3547i |
| 26 | 0.0711 + 0.0728i | 0.0687 + 0.2202i | 0.2153 + 0.0697i | 0.2074 + 0.2103i | 0.0722 + 0.5215i | 0.0699 + 0.3698i | 0.2171 + 0.4970i | 0.2104 + 0.3528i |

| SNR/w | w56 | w57 | w58 | w59 | w60 | w61 | w62 | w63 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i |
| 7 | 0.2719 + 0.4652i | 0.2897 + 0.4968i | 0.2515 + 0.4210i | 0.2719 + 0.4652i | 0.2515 + 0.4210i | 0.2719 + 0.4652i | 0.2515 + 0.4210i | 0.2515 + 0.4210i |
| 7.5 | 0.4249 + 0.2411i | 0.3788 + 0.2236i | 1.2665 + 0.3279i | 1.7569 + 0.3690i | 0.4732 + 0.2588i | 0.4249 + 0.2411i | 1.1489 + 0.3175i | 1.2665 + 0.3279i |
| 8 | 0.4259 + 0.2357i | 0.4795 + 0.2549i | 0.4795 + 0.2549i | 0.5341 + 0.2486i | 0.4259 + 0.2357i | 0.4795 + 0.2549i | 0.4795 + 0.2549i | 0.5272 + 0.2969i |
| 8.5 | 0.4290 + 0.2294i | 0.4909 + 0.2299i | 0.4909 + 0.2299i | 0.5508 + 0.2411i | 0.4290 + 0.2294i | 0.4861 + 0.2708i | 0.4861 + 0.2708i | 0.5370 + 0.2980i |
| 9 | 0.2497 + 0.2245i | 0.2893 + 0.2371i | 0.2979 + 0.2152i | 0.3356 + 0.2412i | 0.2497 + 0.2245i | 0.2893 + 0.2371i | 0.2979 + 0.2152i | 0.3356 + 0.2412i |
| 9.5 | 0.2419 + 0.2216i | 0.2871 + 0.2459i | 0.2958 + 0.2095i | 0.3444 + 0.2369i | 0.2419 + 0.2216i | 0.2871 + 0.2459i | 0.2958 + 0.2095i | 0.3444 + 0.2369i |
| 10 | 0.1705 − 0.3146i | 0.1705 − 0.3146i | 0.3158 − 0.5800i | 0.3158 − 0.5800i | 0.1705 − 0.3146i | 0.1705 − 0.3146i | 0.3158 − 0.5800i | 0.3158 − 0.5800i |
| 10.5 | 0.1640 − 0.3056i | 0.1640 − 0.3056i | 0.3251 − 0.5895i | 0.3251 − 0.5895i | 0.1640 − 0.3056i | 0.1640 − 0.3056i | 0.3251 − 0.5895i | 0.3251 − 0.5895i |
| 11 | 0.6554 + 0.1969i | 0.6554 + 0.1969i | 0.6554 + 0.1969i | 0.6554 + 0.1969i | 0.5954 + 0.3347i | 0.5954 + 0.3347i | 0.5954 + 0.3347i | 0.5954 + 0.3347i |
| 11.5 | 0.6652 + 0.1867i | 0.6652 + 0.1867i | 0.6652 + 0.1867i | 0.6652 + 0.1867i | 0.5982 + 0.3424i | 0.5982 + 0.3424i | 0.5982 + 0.3424i | 0.5982 + 0.3424i |
| 12 | 0.6459 + 0.1725i | 0.6459 + 0.1725i | 0.6459 + 0.1725i | 0.6459 + 0.1725i | 0.5863 + 0.3220i | 0.5863 + 0.3220i | 0.5863 + 0.3220i | 0.5863 + 0.3220i |
| 12.5 | 0.6281 + 0.1582i | 0.6281 + 0.1582i | 0.6281 + 0.1582i | 0.6281 + 0.1582i | 0.5785 + 0.3055i | 0.5785 + 0.3055i | 0.5785 + 0.3055i | 0.5785 + 0.3055i |
| 13 | 0.6132 + 0.1477i | 0.6132 + 0.1477i | 0.6132 + 0.1477i | 0.6132 + 0.1477i | 0.5707 + 0.2977i | 0.5707 + 0.2977i | 0.5707 + 0.2977i | 0.5707 + 0.2977i |
| 13.5 | 0.6060 + 0.1399i | 0.6060 + 0.1399i | 0.6060 + 0.1399i | 0.6060 + 0.1399i | 0.5660 + 0.3001i | 0.5660 + 0.3001i | 0.5660 + 0.3001i | 0.5660 + 0.3001i |
| 14 | 0.6035 + 0.1350i | 0.6035 + 0.1350i | 0.6035 + 0.1350i | 0.6035 + 0.1350i | 0.5609 + 0.3115i | 0.5609 + 0.3115i | 0.5609 + 0.3115i | 0.5609 + 0.3115i |
| 14.5 | 0.5956 + 0.1287i | 0.5956 + 0.1287i | 0.5956 + 0.1287i | 0.5956 + 0.1287i | 0.5560 + 0.3155i | 0.5560 + 0.3155i | 0.5560 + 0.3155i | 0.5560 + 0.3155i |
| 15 | 0.3683 + 0.1249i | 0.3683 + 0.1249i | 0.3683 + 0.1249i | 0.3683 + 0.1249i | 0.3492 + 0.3785i | 0.3492 + 0.3785i | 0.3492 + 0.3785i | 0.3492 + 0.3785i |
| 15.5 | 0.3709 + 0.1155i | 0.3709 + 0.1155i | 0.3479 + 0.1171i | 0.3479 + 0.1171i | 0.3870 + 0.3484i | 0.3870 + 0.3484i | 0.3707 + 0.3564i | 0.3707 + 0.3564i |
| 16 | 0.3766 + 0.1242i | 0.3766 + 0.1242i | 0.3766 + 0.1242i | 0.3766 + 0.1242i | 0.3486 + 0.3874i | 0.3591 + 0.3689i | 0.3486 + 0.3874i | 0.3591 + 0.3689i |
| 16.5 | 0.3535 + 0.1156i | 0.3535 + 0.1156i | 0.3317 + 0.1131i | 0.3535 + 0.1156i | 0.3530 + 0.3734i | 0.3698 + 0.3435i | 0.3530 + 0.3734i | 0.3436 + 0.3473i |

-continued

| | | | | | | | | |
|---|---|---|---|---|---|---|---|---|
| 17 | 0.3704 + 0.1194i | 0.3704 + 0.1194i | 0.3390 + 0.1174i | 0.3390 + 0.1174i | 0.3747 + 0.3766i | 0.3717 + 0.3453i | 0.3348 + 0.3800i | 0.3339 + 0.3472i |
| 17.5 | 0.3791 + 0.1202i | 0.3791 + 0.1202i | 0.3376 + 0.1170i | 0.3376 + 0.1170i | 0.3834 + 0.3812i | 0.3805 + 0.3416i | 0.3287 + 0.3836i | 0.3290 + 0.3417i |
| 18 | 0.4012 + 0.1159i | 0.4012 + 0.1159i | 0.3338 + 0.1122i | 0.3338 + 0.1122i | 0.3940 + 0.3783i | 0.3941 + 0.3266i | 0.3224 + 0.3797i | 0.3242 + 0.3257i |
| 18.5 | 0.4172 + 0.0983i | 0.4129 + 0.1333i | 0.3295 + 0.0948i | 0.3269 + 0.1276i | 0.4055 + 0.3867i | 0.4070 + 0.3192i | 0.3165 + 0.3859i | 0.3192 + 0.3168i |
| 19 | 0.2391 + 0.0872i | 0.2587 + 0.2558i | 0.2391 + 0.0872i | 0.2587 + 0.2558i | 0.3841 + 0.5754i | 0.3150 + 0.4197i | 0.3139 + 0.6000i | 0.2782 + 0.4299i |
| 19.5 | 0.3357 + 0.0722i | 0.3554 + 0.1787i | 0.2645 + 0.0759i | 0.2773 + 0.1974i | 0.4211 + 0.4555i | 0.3908 + 0.3235i | 0.3141 + 0.4762i | 0.2975 + 0.3417i |
| 20 | 0.4915 + 0.0675i | 0.4864 + 0.1749i | 0.3507 + 0.0674i | 0.3479 + 0.1618i | 0.4601 + 0.4402i | 0.4756 + 0.3132i | 0.3316 + 0.4177i | 0.3417 + 0.2995i |
| 20.5 | 0.4886 + 0.0646i | 0.4846 + 0.1827i | 0.3469 + 0.0633i | 0.3450 + 0.1729i | 0.4639 + 0.4505i | 0.4766 + 0.3165i | 0.3324 + 0.4313i | 0.3406 + 0.3039i |
| 21 | 0.4930 + 0.0636i | 0.4893 + 0.1869i | 0.3495 + 0.0617i | 0.3478 + 0.1777i | 0.4697 + 0.4569i | 0.4820 + 0.3193i | 0.3355 + 0.4373i | 0.3439 + 0.3060i |
| 21.5 | 0.5002 + 0.0638i | 0.4966 + 0.1905i | 0.3552 + 0.0612i | 0.3533 + 0.1810i | 0.4764 + 0.4630i | 0.4895 + 0.3231i | 0.3397 + 0.4416i | 0.3490 + 0.3083i |
| 22 | 0.5063 + 0.0651i | 0.5034 + 0.1956i | 0.3611 + 0.0619i | 0.3592 + 0.1852i | 0.4850 + 0.4713i | 0.4975 + 0.3302i | 0.3439 + 0.4470i | 0.3544 + 0.3131i |
| 22.5 | 0.5098 + 0.0662i | 0.5076 + 0.1992i | 0.3641 + 0.0628i | 0.3625 + 0.1888i | 0.4912 + 0.4790i | 0.5027 + 0.3358i | 0.3482 + 0.4545i | 0.3582 + 0.3185i |
| 23 | 0.5089 + 0.0667i | 0.5074 + 0.2012i | 0.3614 + 0.0643i | 0.3600 + 0.1938i | 0.4951 + 0.4835i | 0.5034 + 0.3391i | 0.3505 + 0.4649i | 0.3566 + 0.3265i |
| 23.5 | 0.5134 + 0.0686i | 0.5133 + 0.2063i | 0.3668 + 0.0653i | 0.3660 + 0.1965i | 0.5011 + 0.4924i | 0.5105 + 0.3465i | 0.3558 + 0.4698i | 0.3634 + 0.3304i |
| 24 | 0.4796 + 0.0697i | 0.4800 + 0.2104i | 0.3382 + 0.0697i | 0.3390 + 0.2100i | 0.4925 + 0.5035i | 0.4833 + 0.3548i | 0.3463 + 0.4979i | 0.3414 + 0.3526i |
| 24.5 | 0.4861 + 0.0706i | 0.4859 + 0.2131i | 0.3435 + 0.0702i | 0.3439 + 0.2114i | 0.5003 + 0.5082i | 0.4895 + 0.3586i | 0.3523 + 0.4998i | 0.3464 + 0.3545i |
| 25 | 0.4922 + 0.0714i | 0.4900 + 0.2154i | 0.3482 + 0.0705i | 0.3474 + 0.2123i | 0.5068 + 0.5129i | 0.4941 + 0.3621i | 0.3574 + 0.5015i | 0.3500 + 0.3558i |
| 25.5 | 0.5014 + 0.0721i | 0.4909 + 0.2174i | 0.3548 + 0.0706i | 0.3488 + 0.2127i | 0.5120 + 0.5180i | 0.4965 + 0.3657i | 0.3613 + 0.5034i | 0.3518 + 0.3569i |
| 26 | 0.5101 + 0.0730i | 0.4897 + 0.2198i | 0.3616 + 0.0709i | 0.3479 + 0.2135i | 0.5175 + 0.5233i | 0.4992 + 0.3698i | 0.3655 + 0.5062i | 0.3537 + 0.3587i |

11) 1kQQAM with max. penalty=0.001 b/s/Hz—AWGN channel

| SNR/ w | w0 | w1 | w2 | w3 | w4 | w5 | w6 | w7 |
|---|---|---|---|---|---|---|---|---|
| 7 | 1.2470 + 1.8367i | 0.6834 + 1.2111i | 0.4280 + 2.1615i | 0.3795 + 1.3685i | 0.6834 + 1.2111i | 0.6203 + 1.1269i | 0.3795 + 1.3685i | 0.3664 + 1.2524i |
| 7.5 | 1.2147 + 1.7841i | 0.9775 + 1.4975i | 0.4075 + 2.1185i | 0.3773 + 1.7335i | 0.6871 + 1.1551i | 0.7107 + 1.1845i | 0.3340 + 1.3132i | 0.3394 + 1.3455i |
| 8 | 0.3978 + 2.0885i | 0.3528 + 1.7466i | 0.3367 + 1.5749i | 0.3329 + 1.5346i | 1.1912 + 1.7585i | 0.9886 + 1.4907i | 0.8852 + 1.3630i | 0.8567 + 1.3285i |
| 8.5 | 0.3944 + 2.0732i | 0.3348 + 1.7139i | 0.3252 + 1.6265i | 0.3149 + 1.5557i | 1.1771 + 1.7502i | 0.9699 + 1.4579i | 0.9225 + 1.3957i | 0.8771 + 1.3353i |
| 9 | 2.0688 + 0.3931i | 1.5226 + 0.3041i | 1.5226 + 0.3041i | 1.4130 + 0.2910i | 1.5226 + 0.3041i | 1.4130 + 0.2910i | 1.4130 + 0.2910i | 1.3541 + 0.2851i |
| 9.5 | 2.0659 + 0.4001i | 1.5258 + 0.3016i | 1.5258 + 0.3016i | 1.4155 + 0.2850i | 1.5258 + 0.3016i | 1.4155 + 0.2850i | 1.4155 + 0.2850i | 1.4155 + 0.2850i |
| 10 | 2.0614 + 0.4082i | 1.5259 + 0.3010i | 1.5259 + 0.3010i | 1.4442 + 0.2855i | 1.5259 + 0.3010i | 1.4442 + 0.2855i | 1.4442 + 0.2855i | 1.3999 + 0.2768i |
| 10.5 | 2.0377 + 0.5960i | 1.4218 + 0.2924i | 1.8845 + 0.2992i | 1.4573 + 0.2727i | 1.5221 + 0.3248i | 1.4218 + 0.2924i | 1.5822 + 0.2893i | 1.4573 + 0.2727i |
| 11 | 2.0390 + 0.5892i | 1.9449 + 0.9829i | 2.1322 + 0.2257i | 1.6928 + 1.3984i | 0.6643 + 1.9775i | 0.9378 + 1.8902i | 0.2768 + 2.1985i | 1.3588 + 1.7046i |
| 11.5 | 2.0197 + 0.5915i | 1.9273 + 0.9738i | 2.1141 + 0.2170i | 1.6778 + 1.3854i | 0.6565 + 1.9726i | 0.9379 + 1.8778i | 0.2618 + 2.1756i | 1.3509 + 1.6828i |
| 12 | 1.9956 + 0.5790i | 1.9068 + 0.9328i | 2.0896 + 0.2054i | 1.6925 + 1.3344i | 0.6557 + 1.9767i | 0.9827 + 1.8677i | 0.2501 + 2.1554i | 1.3795 + 1.6301i |
| 12.5 | 2.1158 + 0.2551i | 1.9736 + 0.7598i | 1.2067 + 1.7622i | 1.7509 + 1.2633i | 0.4696 + 1.4431i | 0.4534 + 1.4338i | 0.5999 + 1.4947i | 0.5550 + 1.4555i |
| 13 | 1.1348 + 1.8042i | 1.5056 + 1.4947i | 1.8256 + 0.9213i | 1.6326 + 1.1112i | 1.6003 + 0.1353i | 1.6516 + 0.1238i | 2.0062 + 0.5266i | 2.0128 + 0.1983i |
| 13.5 | 2.1871 + 0.3000i | 1.8533 + 0.9857i | 1.1098 + 1.7333i | 1.5930 + 1.5042i | 0.5540 + 1.3961i | 0.5317 + 1.3797i | 0.6814 + 1.4935i | 0.6040 + 1.4250i |
| 14 | 1.2483 + 1.5217i | 0.1461 + 1.4775i | 1.0118 + 1.6410i | 0.7721 + 1.8992i | 0.5249 + 1.3438i | 0.4746 + 1.3690i | 0.6571 + 1.4190i | 0.6040 + 1.4423i |

-continued

| | | | | | | | | |
|---|---|---|---|---|---|---|---|---|
| 14.5 | 1.3062 + 1.5059i | 0.1503 + 1.4749i | 1.0464 + 1.6055i | 0.8162 + 1.8855i | 0.5385 + 1.3224i | 0.4757 + 1.3733i | 0.7020 + 1.4249i | 0.6369 + 1.4730i |
| 15 | 1.4903 + 1.1383i | 0.9110 + 1.4937i | 1.4109 + 1.4171i | 1.1243 + 1.6910i | 1.0821 + 1.1204i | 0.9502 + 1.2140i | 1.0380 + 1.0923i | 0.9559 + 1.1435i |
| 15.5 | 1.3441 + 1.0864i | 1.6500 + 1.0447i | 1.3102 + 1.2118i | 1.5763 + 1.4126i | 0.9974 + 1.0754i | 0.9256 + 1.0475i | 0.9974 + 1.0754i | 0.9256 + 1.0475i |
| 16 | 1.3350 + 1.1084i | 1.4475 + 0.9747i | 1.5607 + 1.3993i | 1.7541 + 1.0489i | 1.0500 + 0.9792i | 1.0135 + 0.9798i | 0.9647 + 0.9464i | 0.9496 + 0.9596i |
| 16.5 | 1.2147 + 1.5219i | 1.5401 + 1.3313i | 1.1978 + 1.2058i | 1.2559 + 1.1577i | 1.8450 + 0.9334i | 1.5494 + 0.9965i | 1.1978 + 0.9549i | 1.2537 + 0.9642i |
| 17 | 1.2118 + 1.5215i | 1.5329 + 1.3209i | 1.1917 + 1.2081i | 1.2568 + 1.1617i | 1.8374 + 0.9409i | 1.5357 + 0.9911i | 1.1881 + 0.9512i | 1.2485 + 0.9597i |
| 17.5 | 1.2108 + 1.5244i | 1.5290 + 1.3088i | 1.1858 + 1.2120i | 1.2645 + 1.1672i | 1.8238 + 0.9430i | 1.5237 + 0.9832i | 1.1800 + 0.9524i | 1.2475 + 0.9593i |
| 18 | 1.2082 + 1.5168i | 1.5240 + 1.3020i | 1.1811 + 1.2092i | 1.2761 + 1.1672i | 1.8137 + 0.9371i | 1.5194 + 0.9786i | 1.1750 + 0.9549i | 1.2506 + 0.9591i |
| 18.5 | 1.7580 + 0.8556i | 1.4723 + 0.8642i | 1.6081 + 1.1548i | 1.3616 + 0.9559i | 1.6322 + 0.6294i | 1.4250 + 0.6945i | 1.1917 + 0.7017i | 1.2482 + 0.7340i |
| 19 | 1.7624 + 0.8434i | 1.4961 + 0.8499i | 1.5901 + 1.1466i | 1.3710 + 0.9545i | 1.6320 + 0.6089i | 1.4335 + 0.6810i | 1.2009 + 0.7014i | 1.2596 + 0.7328i |
| 19.5 | 1.7721 + 0.9602i | 1.5439 + 0.8692i | 1.5357 + 1.2087i | 1.3865 + 0.9588i | 1.4330 + 0.5782i | 1.4962 + 0.6937i | 1.2677 + 0.6543i | 1.2934 + 0.7411i |
| 20 | 1.1090 + 1.6424i | 1.3041 + 1.4291i | 0.8414 + 1.7420i | 1.0620 + 1.3420i | 1.3469 + 1.1420i | 1.6140 + 1.1270i | 1.1259 + 1.0802i | 1.0687 + 1.1589i |
| 20.5 | 1.5361 + 1.2929i | 1.7337 + 0.8357i | 1.2780 + 1.4499i | 1.2622 + 1.2031i | 1.4523 + 0.7959i | 1.5055 + 0.9923i | 1.2671 + 0.8392i | 1.2824 + 1.0044i |
| 21 | 1.1920 + 1.4825i | 1.1801 + 1.2582i | 1.4681 + 1.3237i | 1.1055 + 1.1254i | 1.5435 + 0.9938i | 1.3407 + 1.0511i | 1.1841 + 0.8772i | 1.1708 + 0.9914i |
| 21.5 | 1.3352 + 1.3968i | 1.5544 + 1.1632i | 1.1041 + 1.4991i | 1.0921 + 1.2512i | 1.3845 + 0.9402i | 1.3310 + 1.1297i | 1.2245 + 0.9236i | 1.1581 + 1.0783i |
| 22 | 1.1448 + 1.4301i | 1.2314 + 1.2283i | 1.3851 + 1.4301i | 1.1791 + 1.0727i | 1.5570 + 0.9357i | 1.4463 + 1.1297i | 1.3343 + 0.9131i | 1.1627 + 0.9172i |
| 22.5 | 1.3571 + 1.4599i | 1.6063 + 1.1774i | 1.1068 + 1.5873i | 1.2491 + 1.2384i | 1.5617 + 0.8881i | 1.4366 + 1.0501i | 1.2716 + 0.8875i | 1.2361 + 1.0472i |
| 23 | 1.2474 + 1.3969i | 1.4038 + 1.1579i | 1.0418 + 1.5521i | 1.2120 + 1.1649i | 1.3678 + 0.8860i | 1.5336 + 0.9857i | 1.2086 + 0.8597i | 1.2130 + 1.0083i |
| 23.5 | 1.3740 + 1.3412i | 1.5419 + 1.1137i | 1.0721 + 1.4824i | 1.1453 + 1.2860i | 1.3865 + 0.9633i | 1.3170 + 1.1167i | 1.1954 + 0.9088i | 1.1762 + 1.0540i |
| 24 | 1.3790 + 1.2726i | 1.2140 + 1.1908i | 1.1518 + 1.3905i | 1.5627 + 1.0245i | 1.3824 + 0.8840i | 1.3211 + 1.0410i | 1.1686 + 0.8903i | 1.1570 + 1.0107i |
| 24.5 | 1.2961 + 1.3306i | 1.5578 + 1.0359i | 0.8364 + 1.6008i | 1.1053 + 1.2451i | 1.3744 + 0.9233i | 1.3731 + 1.1025i | 1.2130 + 0.9446i | 1.2096 + 1.1104i |
| 25 | 1.2369 + 1.3509i | 1.5739 + 0.9502i | 0.8752 + 1.5743i | 1.0781 + 1.2268i | 1.3726 + 1.0001i | 1.3629 + 1.1723i | 1.2107 + 0.9621i | 1.1961 + 1.1184i |
| 25.5 | 1.1981 + 1.3312i | 1.4448 + 1.0547i | 1.0785 + 1.4777i | 1.3216 + 0.9567i | 1.5082 + 0.8231i | 1.2653 + 1.1488i | 1.1548 + 0.9162i | 1.1687 + 1.0355i |
| 26 | 1.3600 + 1.2363i | 1.4725 + 1.0370i | 0.8236 + 1.5404i | 1.1012 + 1.2158i | 1.3405 + 0.9099i | 1.2954 + 1.0600i | 1.2050 + 0.8913i | 1.1575 + 1.0871i |
| 26.5 | 1.2790 + 1.2022i | 1.4224 + 1.0247i | 0.8336 + 1.4661i | 1.1191 + 1.1349i | 1.3645 + 0.8540i | 1.2671 + 1.0236i | 1.2289 + 0.8713i | 1.1326 + 0.9925i |
| 27 | 1.3272 + 1.2196i | 1.3559 + 1.0732i | 1.0028 + 1.3882i | 1.0375 + 1.2417i | 1.4394 + 0.9027i | 1.0528 + 1.0954i | 1.2910 + 0.9298i | 1.1738 + 1.1370i |
| 27.5 | 1.2847 + 1.1501i | 1.3344 + 1.0100i | 0.9562 + 1.3726i | 0.9853 + 1.2319i | 1.5330 + 0.7517i | 1.0098 + 1.0854i | 1.1767 + 0.9824i | 1.1243 + 1.1021i |
| 28 | 1.2471 + 1.1326i | 1.3598 + 1.0114i | 0.9946 + 1.3891i | 1.0600 + 1.1563i | 1.4990 + 0.7151i | 1.0049 + 1.0334i | 1.2249 + 0.9302i | 1.1234 + 1.0412i |

| SNR/w | w8 | w9 | w10 | w11 | w12 | w13 | w14 | w15 |
|---|---|---|---|---|---|---|---|---|
| 7 | 0.6834 + 1.2111i | 0.6203 + 1.1269i | 0.3795 + 1.3685i | 0.3664 + 1.2524i | 0.6203 + 1.1269i | 0.5879 + 1.0807i | 0.3664 + 1.2524i | 0.3587 + 1.1911i |
| 7.5 | 0.6871 + 1.1551i | 0.7107 + 1.1845i | 0.3340 + 1.3132i | 0.3394 + 1.3455i | 0.6229 + 1.0763i | 0.6321 + 1.0878i | 0.3243 + 1.2106i | 0.3243 + 1.2106i |
| 8 | 0.3053 + 1.2660i | 0.3053 + 1.2660i | 0.3053 + 1.2660i | 0.3053 + 1.2660i | 0.6782 + 1.1122i | 0.6782 + 1.1122i | 0.6782 + 1.1122i | 0.6782 + 1.1122i |
| 8.5 | 0.2755 + 1.1100i | 0.2755 + 1.1100i | 0.2755 + 1.1100i | 0.2755 + 1.1100i | 0.5891 + 0.9828i | 0.5891 + 0.9828i | 0.5891 + 0.9828i | 0.5891 + 0.9828i |
| 9 | 1.5226 + 0.3041i | 1.4130 + 0.2910i | 1.4130 + 0.2910i | 1.3541 + 0.2851i | 1.4130 + 0.2910i | 1.3541 + 0.2851i | 1.3541 + 0.2851i | 1.3541 + 0.2851i |
| 9.5 | 1.5258 + 0.3016i | 1.4155 + 0.2850i | 1.4155 + 0.2850i | 1.4155 + 0.2850i | 1.4155 + 0.2850i | 1.4155 + 0.2850i | 1.4155 + 0.2850i | 1.3603 + 0.2772i |
| 10 | 1.5259 + 0.3010i | 1.4442 + 0.2855i | 1.4442 + 0.2855i | 1.3999 + 0.2768i | 1.4442 + 0.2855i | 1.3999 + 0.2768i | 1.3999 + 0.2768i | 1.3999 + 0.2768i |
| 10.5 | 1.4218 + 0.2924i | 1.3860 + 0.2687i | 1.4573 + 0.2727i | 1.3860 + 0.2687i | 1.4218 + 0.2924i | 1.3860 + 0.2687i | 1.4573 + 0.2727i | 1.3860 + 0.2687i |
| 11 | 0.2694 + 1.5131i | 0.2666 + 1.4804i | 0.2206 + 1.5281i | 0.2221 + 1.4905i | 0.3240 + 1.5996i | 0.3139 + 1.5353i | 0.2481 + 1.6183i | 0.2508 + 1.5412i |

-continued

| | | | | | | | | |
|---|---|---|---|---|---|---|---|---|
| 11.5 | 0.2762 + 1.5039i | 0.2735 + 1.4726i | 0.2175 + 1.5226i | 0.2194 + 1.4854i | 0.3318 + 1.5889i | 0.3211 + 1.5250i | 0.2441 + 1.6117i | 0.2476 + 1.5333i |
| 12 | 0.2854 + 1.4955i | 0.2803 + 1.4638i | 0.2140 + 1.5186i | 0.2152 + 1.4801i | 0.3402 + 1.5829i | 0.3241 + 1.5142i | 0.2375 + 1.6120i | 0.2398 + 1.5271i |
| 12.5 | 0.1259 + 1.6593i | 0.1270 + 1.7379i | 0.7712 + 2.0048i | 0.2871 + 2.1268i | 0.3253 + 1.5363i | 0.3253 + 1.5363i | 0.5495 + 1.5637i | 0.4968 + 1.5173i |
| 13 | 1.3969 + 0.5361i | 1.3969 + 0.5361i | 1.4747 + 0.6396i | 1.4392 + 0.6354i | 1.4954 + 0.3520i | 1.4954 + 0.3520i | 1.5164 + 0.4919i | 1.4763 + 0.4841i |
| 13.5 | 0.1154 + 1.5910i | 0.1145 + 1.6518i | 0.7071 + 2.0121i | 0.2331 + 2.0568i | 0.3267 + 1.5289i | 0.3267 + 1.5289i | 0.5457 + 1.6384i | 0.4754 + 1.5699i |
| 14 | 0.1319 + 1.6053i | 0.1497 + 1.5552i | 0.1917 + 2.0093i | 0.4128 + 1.8626i | 0.4746 + 1.3690i | 0.4232 + 1.4126i | 0.5659 + 1.3830i | 0.5277 + 1.4369i |
| 14.5 | 0.1282 + 1.6465i | 0.1597 + 1.5527i | 0.1959 + 2.0115i | 0.4545 + 1.8615i | 0.5001 + 1.3385i | 0.4346 + 1.4163i | 0.5932 + 1.3889i | 0.5460 + 1.4894i |
| 15 | 0.1724 + 2.0081i | 0.7788 + 1.5257i | 0.5016 + 1.9561i | 0.7186 + 1.7492i | 0.9055 + 1.0616i | 0.8665 + 1.1704i | 0.9034 + 1.0402i | 0.8738 + 1.1071i |
| 15.5 | 1.0823 + 1.6174i | 0.7196 + 1.5112i | 0.8215 + 1.8773i | 0.6957 + 1.5465i | 0.9231 + 1.2709i | 0.8160 + 1.2862i | 0.9126 + 1.2412i | 0.8126 + 1.2668i |
| 16 | 1.1791 + 1.3117i | 0.9549 + 1.3540i | 1.1769 + 1.6347i | 0.9200 + 1.4356i | 0.9718 + 1.0622i | 0.9278 + 1.1107i | 0.9134 + 1.0069i | 0.8947 + 1.0639i |
| 16.5 | 0.9383 + 1.3523i | 0.8697 + 1.2142i | 0.9874 + 1.2241i | 0.9264 + 1.1757i | 0.8953 + 0.9296i | 0.8826 + 0.9589i | 0.9598 + 0.9439i | 0.9383 + 0.9662i |
| 17 | 0.9377 + 1.3662i | 0.8598 + 1.2150i | 0.9907 + 1.2238i | 0.9170 + 1.1772i | 0.8927 + 0.9249i | 0.8786 + 0.9565i | 0.9605 + 0.9419i | 0.9339 + 0.9669i |
| 17.5 | 0.9391 + 1.3812i | 0.8495 + 1.2161i | 0.9970 + 1.2255i | 0.9056 + 1.1802i | 0.8919 + 0.9238i | 0.8751 + 0.9580i | 0.9650 + 0.9445i | 0.9298 + 0.9718i |
| 18 | 0.9438 + 1.3828i | 0.8433 + 1.2138i | 1.0046 + 1.2199i | 0.8973 + 1.1788i | 0.8923 + 0.9236i | 0.8728 + 0.9592i | 0.9729 + 0.9487i | 0.9271 + 0.9762i |
| 18.5 | 1.1693 + 1.2798i | 1.1128 + 1.0938i | 1.3758 + 1.3185i | 1.1973 + 1.0256i | 0.9845 + 0.7965i | 1.0167 + 0.8742i | 1.0414 + 0.7718i | 1.0742 + 0.8464i |
| 19 | 1.1743 + 1.2715i | 1.1163 + 1.0948i | 1.3788 + 1.3352i | 1.2168 + 1.0183i | 0.9937 + 0.7969i | 1.0293 + 0.8865i | 1.0541 + 0.7706i | 1.0917 + 0.8547i |
| 19.5 | 1.2327 + 1.2807i | 1.1357 + 1.0702i | 1.2398 + 1.5594i | 1.2320 + 0.9996i | 1.0121 + 0.7959i | 1.0506 + 0.8804i | 1.0895 + 0.7549i | 1.1392 + 0.8268i |
| 20 | 0.6577 + 1.4430i | 0.7012 + 1.2781i | 0.8212 + 1.5008i | 0.8660 + 1.3198i | 0.8139 + 1.0062i | 0.7661 + 1.1278i | 0.8943 + 1.0255i | 0.8877 + 1.1417i |
| 20.5 | 0.9929 + 1.4515i | 0.9693 + 1.2162i | 0.9174 + 1.6990i | 1.0885 + 1.1841i | 0.9646 + 0.8840i | 0.9671 + 1.0103i | 1.0896 + 0.8706i | 1.0906 + 1.0064i |
| 21 | 0.9434 + 1.4728i | 0.9500 + 1.2899i | 0.9423 + 1.7074i | 0.9504 + 1.1268i | 0.9076 + 0.8486i | 0.8989 + 0.9010i | 1.0276 + 0.8623i | 0.9660 + 0.9752i |
| 21.5 | 0.8934 + 1.0735i | 0.8717 + 1.1114i | 0.9076 + 1.4446i | 0.9079 + 1.2674i | 0.8877 + 0.9231i | 0.8877 + 0.9231i | 1.0506 + 0.9108i | 1.0442 + 0.9272i |
| 22 | 0.9594 + 1.3673i | 0.9220 + 1.1877i | 0.9343 + 1.6326i | 1.0387 + 1.1184i | 0.8615 + 0.8877i | 0.8791 + 1.0284i | 0.9391 + 0.8804i | 1.0097 + 0.9542i |
| 22.5 | 0.8991 + 1.3062i | 0.8949 + 1.1654i | 1.0334 + 1.3983i | 1.0685 + 1.1889i | 0.9101 + 0.9127i | 0.9056 + 1.0351i | 1.0634 + 0.9074i | 1.0737 + 1.0418i |
| 23 | 0.8457 + 1.3352i | 0.8766 + 1.1938i | 1.0182 + 1.3610i | 1.0395 + 1.2129i | 0.9092 + 0.9223i | 0.9015 + 1.0480i | 1.0580 + 0.9038i | 1.0534 + 1.0422i |
| 23.5 | 0.8918 + 1.3385i | 0.8706 + 1.1982i | 0.8699 + 1.5126i | 1.0232 + 1.1858i | 0.8968 + 0.9242i | 0.8841 + 1.0548i | 1.0408 + 0.9107i | 1.0278 + 1.0448i |
| 24 | 0.9437 + 1.3080i | 0.8750 + 1.1648i | 0.9760 + 1.4721i | 1.0245 + 1.1502i | 0.8778 + 0.9006i | 0.8693 + 1.0265i | 1.0051 + 0.8991i | 1.0075 + 1.0190i |
| 24.5 | 0.9028 + 1.2861i | 0.9293 + 1.1520i | 0.8365 + 1.4219i | 1.0395 + 1.4368i | 1.0384 + 1.0284i | 0.9141 + 1.0040i | 1.0741 + 0.9112i | 0.9432 + 0.8972i |
| 25 | 0.8829 + 1.2606i | 0.9138 + 1.1340i | 0.8454 + 1.3942i | 1.0180 + 1.3974i | 1.0318 + 1.0219i | 0.9035 + 0.9954i | 1.0712 + 0.9074i | 0.9395 + 0.8888i |
| 25.5 | 0.7345 + 1.4935i | 0.9225 + 1.1907i | 0.8959 + 1.4840i | 0.9694 + 1.3246i | 0.9279 + 0.9107i | 1.0693 + 1.1756i | 1.0319 + 0.9222i | 1.0107 + 1.0471i |
| 26 | 0.8946 + 1.3593i | 0.9389 + 1.2209i | 1.0235 + 1.4279i | 1.1745 + 1.3460i | 1.0293 + 0.8852i | 0.9361 + 0.9368i | 1.1008 + 0.9458i | 1.0205 + 1.0570i |
| 26.5 | 0.8398 + 1.2923i | 0.9326 + 1.1801i | 0.9612 + 1.3780i | 1.0603 + 1.2681i | 1.0358 + 0.8637i | 0.9582 + 0.9419i | 1.1285 + 0.8265i | 1.0066 + 1.0375i |
| 27 | 0.8712 + 1.2714i | 0.9051 + 1.1465i | 0.8569 + 1.4350i | 1.1634 + 1.3187i | 1.0441 + 0.9494i | 0.9580 + 1.0356i | 1.1718 + 0.9809i | 0.9066 + 0.9385i |
| 27.5 | 0.8145 + 1.3026i | 0.8485 + 1.1849i | 0.7985 + 1.4488i | 1.1193 + 1.2690i | 1.1199 + 0.7168i | 0.8978 + 1.0853i | 1.0728 + 0.9252i | 0.9727 + 0.9570i |
| 28 | 0.9261 + 1.2557i | 0.9064 + 1.1434i | 0.8489 + 1.3711i | 1.1138 + 1.2723i | 1.1308 + 0.8070i | 0.9002 + 1.0336i | 1.1114 + 0.9086i | 0.8336 + 0.9681i |

| SNR/w | w16 | w17 | w18 | w19 | w20 | w21 | w22 | w23 |
|---|---|---|---|---|---|---|---|---|
| 7 | 0.6834 + 1.2111i | 0.6203 + 1.1269i | 0.3795 + 1.3685i | 0.3664 + 1.2524i | 0.6203 + 1.1269i | 0.5879 + 1.0807i | 0.3664 + 1.2524i | 0.3587 + 1.1911i |
| 7.5 | 0.6871 + 1.1551i | 0.7107 + 1.1845i | 0.3340 + 1.3132i | 0.3394 + 1.3455i | 0.6229 + 1.0763i | 0.6229 + 1.0763i | 0.3243 + 1.2106i | 0.3243 + 1.2106i |
| 8 | 0.3053 + 1.2660i | 0.3053 + 1.2660i | 0.3053 + 1.2660i | 0.3053 + 1.2660i | 0.6782 + 1.1122i | 0.6782 + 1.1122i | 0.6782 + 1.1122i | 0.6782 + 1.1122i |

-continued

| | | | | | | | | |
|---|---|---|---|---|---|---|---|---|
| 8.5 | 0.2955 + 1.3421i | 0.2955 + 1.3421i | 0.2955 + 1.3421i | 0.2955 + 1.3421i | 0.7434 + 1.1699i | 0.7434 + 1.1699i | 0.7434 + 1.1699i | 0.7434 + 1.1699i |
| 9 | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i |
| 10 | 1.0164 + 0.2442i | 1.0164 + 0.2442i | 1.0164 + 0.2442i | 1.0164 + 0.2442i | 1.0164 + 0.2442i | 1.0164 + 0.2442i | 1.0164 + 0.2442i | 1.0164 + 0.2442i |
| 10.5 | 1.0031 + 0.2326i | 1.0031 + 0.2326i | 1.0031 + 0.2326i | 1.0031 + 0.2326i | 1.0031 + 0.2326i | 1.0031 + 0.2326i | 1.0031 + 0.2326i | 1.0031 + 0.2326i |
| 11 | 0.8209 + 1.1647i | 0.8631 + 1.1979i | 0.8476 + 1.1522i | 0.9045 + 1.1940i | 0.8352 + 1.2130i | 0.8916 + 1.2840i | 0.8631 + 1.1979i | 0.9532 + 1.2725i |
| 11.5 | 0.8190 + 1.1650i | 0.8549 + 1.2031i | 0.8518 + 1.1493i | 0.9105 + 1.1942i | 0.8549 + 1.2031i | 0.8940 + 1.2944i | 0.8549 + 1.2031i | 0.9695 + 1.2795i |
| 12 | 0.8205 + 1.1674i | 0.8519 + 1.2156i | 0.8575 + 1.1454i | 0.9208 + 1.1932i | 0.8519 + 1.2156i | 0.9156 + 1.3204i | 0.8862 + 1.1870i | 1.0082 + 1.2910i |
| 12.5 | 1.0349 + 1.1222i | 1.0575 + 1.1030i | 1.1779 + 1.3115i | 1.3201 + 1.2209i | 0.8168 + 1.1703i | 0.8081 + 1.1502i | 0.8190 + 1.2572i | 0.7967 + 1.2204i |
| 13 | 1.0794 + 0.1887i | 1.0794 + 0.1887i | 1.0461 + 0.2119i | 1.0461 + 0.2119i | 1.1379 + 0.1590i | 1.1379 + 0.1590i | 1.0794 + 0.1887i | 1.0794 + 0.1887i |
| 13.5 | 1.1489 + 1.1197i | 1.3661 + 1.0778i | 1.1464 + 1.2789i | 1.3152 + 1.1853i | 0.8070 + 1.1957i | 0.7685 + 1.1750i | 0.8426 + 1.2622i | 0.7882 + 1.2129i |
| 14 | 1.1284 + 1.1433i | 1.0498 + 1.0225i | 1.0822 + 1.1063i | 1.0498 + 1.0225i | 0.7910 + 1.1369i | 0.7773 + 1.1014i | 0.8015 + 1.1742i | 0.7910 + 1.1369i |
| 14.5 | 1.1639 + 1.1492i | 1.0803 + 1.0201i | 1.1094 + 1.1262i | 1.0803 + 1.0201i | 0.7981 + 1.1326i | 0.7835 + 1.0949i | 0.8181 + 1.1797i | 0.7981 + 1.1326i |
| 15 | 1.3865 + 0.8444i | 1.3175 + 0.7494i | 1.2334 + 0.7081i | 1.2326 + 0.6778i | 1.1515 + 0.8590i | 1.1372 + 0.8042i | 1.1030 + 0.8243i | 1.1126 + 0.7761i |
| 15.5 | 1.2987 + 0.8102i | 1.2995 + 0.7667i | 1.2080 + 0.7457i | 1.2075 + 0.7166i | 1.0197 + 0.8347i | 0.9995 + 0.8192i | 1.0227 + 0.8236i | 1.0064 + 0.8103i |
| 16 | 1.2983 + 0.7167i | 1.3470 + 0.7459i | 1.2062 + 0.6208i | 1.2062 + 0.6208i | 1.0914 + 0.7539i | 1.0914 + 0.7539i | 1.0638 + 0.7215i | 1.0638 + 0.7215i |
| 16.5 | 1.4219 + 0.5556i | 1.4219 + 0.5556i | 1.2462 + 0.5855i | 1.2462 + 0.5855i | 1.6092 + 0.6786i | 1.5059 + 0.7313i | 1.2179 + 0.7344i | 1.2443 + 0.7444i |
| 17 | 1.4330 + 0.5504i | 1.4330 + 0.5504i | 1.2436 + 0.5789i | 1.2436 + 0.5789i | 1.6365 + 0.6778i | 1.5001 + 0.7492i | 1.2113 + 0.7399i | 1.2434 + 0.7494i |
| 17.5 | 1.4418 + 0.5395i | 1.4326 + 0.5576i | 1.2382 + 0.5741i | 1.2382 + 0.5741i | 1.6542 + 0.6753i | 1.4909 + 0.7585i | 1.2045 + 0.7465i | 1.2417 + 0.7541i |
| 18 | 1.4431 + 0.5367i | 1.4307 + 0.5570i | 1.2285 + 0.5660i | 1.2370 + 0.5724i | 1.6573 + 0.6715i | 1.4814 + 0.7623i | 1.1998 + 0.7521i | 1.2414 + 0.7575i |
| 18.5 | 1.3930 + 0.3640i | 1.3485 + 0.3893i | 1.1570 + 0.4271i | 1.1803 + 0.4223i | 1.5455 + 0.4576i | 1.3962 + 0.5257i | 1.1551 + 0.5306i | 1.1835 + 0.5235i |
| 19 | 1.3739 + 0.3510i | 1.3309 + 0.3746i | 1.1467 + 0.4140i | 1.1679 + 0.4096i | 1.5317 + 0.4427i | 1.3896 + 0.5168i | 1.1598 + 0.5415i | 1.1880 + 0.5295i |
| 19.5 | 1.3536 + 0.3475i | 1.2950 + 0.3231i | 1.1495 + 0.3917i | 1.1495 + 0.3917i | 1.4933 + 0.4426i | 1.7116 + 0.5868i | 1.1818 + 0.5280i | 1.1608 + 0.5011i |
| 20 | 1.7660 + 0.7375i | 1.4962 + 0.6907i | 1.2173 + 0.6961i | 1.2519 + 0.6976i | 1.3547 + 0.9559i | 1.4932 + 0.8746i | 1.1716 + 0.9087i | 1.1490 + 0.8711i |
| 20.5 | 1.4038 + 0.4647i | 1.3690 + 0.4405i | 1.1991 + 0.4770i | 1.1991 + 0.4770i | 1.4531 + 0.6314i | 1.6329 + 0.5542i | 1.2411 + 0.6786i | 1.2092 + 0.6296i |
| 21 | 1.4522 + 0.5679i | 1.6057 + 0.5378i | 1.3175 + 0.5452i | 1.1940 + 0.5550i | 1.4469 + 0.7784i | 1.6981 + 0.7459i | 1.2631 + 0.7452i | 1.1908 + 0.6751i |
| 21.5 | 1.4604 + 0.5935i | 1.7875 + 0.3980i | 1.2674 + 0.5839i | 1.7463 + 0.6216i | 1.4419 + 0.7605i | 1.6376 + 0.8704i | 1.2514 + 0.7312i | 1.1983 + 0.7401i |
| 22 | 1.4439 + 0.5853i | 1.6108 + 0.5303i | 1.3004 + 0.5868i | 1.1846 + 0.5909i | 1.4889 + 0.7419i | 1.7240 + 0.7079i | 1.3086 + 0.7519i | 1.1714 + 0.7584i |
| 22.5 | 1.5607 + 0.5647i | 1.7514 + 0.6378i | 1.1625 + 0.5397i | 1.2356 + 0.5517i | 1.4933 + 0.7257i | 1.3820 + 0.6548i | 1.2027 + 0.7601i | 1.2562 + 0.6724i |
| 23 | 1.6061 + 0.5652i | 1.8194 + 0.5891i | 1.1596 + 0.5779i | 1.2454 + 0.5628i | 1.5850 + 0.7789i | 1.4301 + 0.6629i | 1.1633 + 0.7212i | 1.3024 + 0.6774i |
| 23.5 | 1.2583 + 0.6069i | 1.7469 + 0.5762i | 1.1684 + 0.6129i | 1.5785 + 0.4968i | 1.6073 + 0.8302i | 1.4743 + 0.6934i | 1.1800 + 0.7580i | 1.3289 + 0.7757i |
| 24 | 1.3854 + 0.6727i | 1.2630 + 0.5854i | 1.2543 + 0.7381i | 1.1484 + 0.5860i | 1.5471 + 0.7468i | 1.6867 + 0.5760i | 1.1344 + 0.7766i | 1.1028 + 0.6774i |
| 24.5 | 1.1699 + 0.6085i | 1.6812 + 0.6256i | 1.1989 + 0.6932i | 1.5850 + 0.4763i | 1.5370 + 0.8085i | 1.4838 + 0.6414i | 1.2190 + 0.8012i | 1.3611 + 0.7212i |
| 25 | 1.2811 + 0.6537i | 1.5886 + 0.4923i | 1.1525 + 0.6181i | 1.7297 + 0.3433i | 1.6454 + 0.6927i | 1.4737 + 0.6267i | 1.3158 + 0.8304i | 1.4511 + 0.7770i |
| 25.5 | 1.4469 + 0.5411i | 1.3690 + 0.6538i | 1.3128 + 0.5092i | 1.2090 + 0.5803i | 1.5706 + 0.6441i | 1.3251 + 0.7695i | 1.1678 + 0.8071i | 1.1961 + 0.6963i |
| 26 | 1.4116 + 0.5752i | 1.5736 + 0.6220i | 1.1918 + 0.6209i | 1.5623 + 0.4562i | 1.5497 + 0.8311i | 1.4238 + 0.7455i | 1.1749 + 0.7608i | 1.2959 + 0.7280i |
| 26.5 | 1.5874 + 0.4394i | 1.5767 + 0.6137i | 1.1624 + 0.5760i | 1.2819 + 0.5439i | 1.5158 + 0.8040i | 1.4253 + 0.6800i | 1.2447 + 0.7358i | 1.3051 + 0.6448i |
| 27 | 1.5345 + 0.4449i | 1.5144 + 0.5973i | 1.2543 + 0.5426i | 1.3709 + 0.5896i | 1.4385 + 0.7521i | 1.1966 + 0.7287i | 1.3082 + 0.8079i | 1.2925 + 0.6791i |
| 27.5 | 1.4370 + 0.4627i | 1.4958 + 0.5797i | 1.2388 + 0.5368i | 1.3470 + 0.5780i | 1.4133 + 0.8583i | 1.2565 + 0.6932i | 1.2710 + 0.8408i | 1.3720 + 0.7047i |

-continued

| | | | | | | | | |
|---|---|---|---|---|---|---|---|---|
| 28 | 1.5172 + 0.4779i | 1.4228 + 0.5698i | 1.2002 + 0.5259i | 1.2996 + 0.5704i | 1.4031 + 0.8380i | 1.2168 + 0.6822i | 1.2773 + 0.8086i | 1.3336 + 0.6909i |

| SNR/w | w24 | w25 | w26 | w27 | w28 | w29 | w30 | w31 |
|---|---|---|---|---|---|---|---|---|
| 7 | 0.6203 + 1.1269i | 0.5879 + 1.0807i | 0.3664 + 1.2524i | 0.3587 + 1.1911i | 0.5879 + 1.0807i | 0.5639 + 1.0452i | 0.3587 + 1.1911i | 0.3527 + 1.1449i |
| 7.5 | 0.6229 + 1.0763i | 0.6229 + 1.0763i | 0.3243 + 1.2106i | 0.3243 + 1.2106i | 0.5841 + 1.0273i | 0.5841 + 1.0273i | 0.3172 + 1.1461i | 0.3172 + 1.1461i |
| 8 | 0.2956 + 1.1569i | 0.2956 + 1.1569i | 0.2956 + 1.1569i | 0.2956 + 1.1569i | 0.6067 + 1.0261i | 0.6067 + 1.0261i | 0.6067 + 1.0261i | 0.6067 + 1.0261i |
| 8.5 | 0.2755 + 1.1100i | 0.2755 + 1.1100i | 0.2755 + 1.1100i | 0.2755 + 1.1100i | 0.5891 + 0.9828i | 0.5891 + 0.9828i | 0.5891 + 0.9828i | 0.5891 + 0.9828i |
| 9 | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i |
| 10 | 1.0164 + 0.2442i | 1.0164 + 0.2442i | 1.0164 + 0.2442i | 1.0164 + 0.2442i | 1.0164 + 0.2442i | 1.0164 + 0.2442i | 1.0164 + 0.2442i | 1.0382 + 0.2450i |
| 10.5 | 1.0031 + 0.2326i | 1.0293 + 0.2313i | 1.0031 + 0.2326i | 1.0293 + 0.2313i | 1.0031 + 0.2326i | 1.0293 + 0.2313i | 1.0031 + 0.2326i | 1.0293 + 0.2313i |
| 11 | 0.7302 + 1.2048i | 0.7302 + 1.2048i | 0.7488 + 1.1658i | 0.7590 + 1.1929i | 0.7253 + 1.2394i | 0.7446 + 1.2677i | 0.7590 + 1.1929i | 0.7753 + 1.2277i |
| 11.5 | 0.7137 + 1.2023i | 0.7187 + 1.2368i | 0.7457 + 1.1655i | 0.7536 + 1.1934i | 0.7187 + 1.2368i | 0.7308 + 1.2798i | 0.7536 + 1.1934i | 0.7681 + 1.2301i |
| 12 | 0.6924 + 1.2241i | 0.6952 + 1.2615i | 0.7337 + 1.1858i | 0.7337 + 1.1858i | 0.6952 + 1.2615i | 0.7079 + 1.3063i | 0.7325 + 1.2081i | 0.7461 + 1.2415i |
| 12.5 | 0.9604 + 1.0447i | 0.9604 + 1.0447i | 0.9810 + 1.0802i | 0.9810 + 1.0802i | 0.8312 + 1.1010i | 0.8312 + 1.1010i | 0.8168 + 1.1703i | 0.8081 + 1.1502i |
| 13 | 1.1056 + 0.2714i | 1.1056 + 0.2714i | 1.0741 + 0.2873i | 1.0741 + 0.2873i | 1.1622 + 0.2335i | 1.1622 + 0.2335i | 1.1096 + 0.2493i | 1.1056 + 0.2714i |
| 13.5 | 0.9715 + 0.9809i | 0.9715 + 0.9809i | 0.9715 + 0.9809i | 0.9715 + 0.9809i | 0.8534 + 1.0513i | 0.8534 + 1.0513i | 0.8534 + 1.0513i | 0.8375 + 1.0599i |
| 14 | 0.9635 + 0.9170i | 0.9635 + 0.9170i | 0.9635 + 0.9170i | 0.9635 + 0.9170i | 0.7713 + 1.0701i | 0.7757 + 1.0506i | 0.7773 + 1.1014i | 0.7713 + 1.0701i |
| 14.5 | 0.9763 + 0.8886i | 0.9763 + 0.8886i | 0.9763 + 0.8886i | 0.9763 + 0.8886i | 0.7653 + 1.0721i | 0.7855 + 1.0474i | 0.7835 + 1.0949i | 0.7855 + 1.0474i |
| 15 | 0.9975 + 0.6035i | 0.9975 + 0.6035i | 1.0268 + 0.6029i | 1.0268 + 0.6029i | 0.9769 + 0.7204i | 0.9891 + 0.6850i | 0.9769 + 0.7204i | 0.9891 + 0.6850i |
| 15.5 | 0.9962 + 0.5714i | 0.9962 + 0.5714i | 1.0275 + 0.5734i | 1.0275 + 0.5734i | 0.9712 + 0.6224i | 0.9712 + 0.6224i | 0.9889 + 0.6205i | 0.9889 + 0.6205i |
| 16 | 0.9553 + 0.5302i | 0.9553 + 0.5302i | 0.9922 + 0.5305i | 0.9922 + 0.5305i | 0.9525 + 0.5999i | 0.9525 + 0.5999i | 0.9722 + 0.5994i | 0.9722 + 0.5994i |
| 16.5 | 0.9292 + 0.5928i | 0.9292 + 0.5928i | 0.9946 + 0.5942i | 0.9946 + 0.5942i | 0.9211 + 0.6843i | 0.9211 + 0.6843i | 0.9838 + 0.6926i | 0.9838 + 0.6926i |
| 17 | 0.9244 + 0.5890i | 0.9244 + 0.5890i | 0.9955 + 0.5891i | 0.9955 + 0.5891i | 0.9162 + 0.6919i | 0.9162 + 0.6919i | 0.9842 + 0.6988i | 0.9842 + 0.6988i |
| 17.5 | 0.9226 + 0.5846i | 0.9226 + 0.5846i | 0.9985 + 0.5838i | 0.9985 + 0.5838i | 0.9135 + 0.7046i | 0.9135 + 0.7046i | 0.9860 + 0.7101i | 0.9860 + 0.7101i |
| 18 | 0.9216 + 0.5798i | 0.9216 + 0.5798i | 1.0034 + 0.5785i | 1.0034 + 0.5785i | 0.9135 + 0.7246i | 0.9105 + 0.7117i | 0.9949 + 0.7304i | 0.9857 + 0.7145i |
| 18.5 | 0.8679 + 0.5021i | 0.8679 + 0.5021i | 0.9292 + 0.4862i | 0.9292 + 0.4862i | 0.9128 + 0.6119i | 0.9005 + 0.5846i | 0.9747 + 0.5858i | 0.9613 + 0.5607i |
| 19 | 0.8747 + 0.4890i | 0.8747 + 0.4890i | 0.9383 + 0.4703i | 0.9383 + 0.4703i | 0.9282 + 0.6231i | 0.9148 + 0.5935i | 0.9892 + 0.5958i | 0.9748 + 0.5681i |
| 19.5 | 0.8811 + 0.4849i | 0.8811 + 0.4849i | 0.9429 + 0.4612i | 0.9429 + 0.4612i | 0.9477 + 0.6399i | 0.9358 + 0.6096i | 1.0163 + 0.6040i | 1.0042 + 0.5748i |
| 20 | 0.9236 + 0.6522i | 0.9236 + 0.6522i | 1.0425 + 0.6633i | 1.0275 + 0.6768i | 0.8720 + 0.8422i | 0.8881 + 0.8007i | 0.9559 + 0.8772i | 0.9855 + 0.8360i |
| 20.5 | 0.9223 + 0.5412i | 0.9223 + 0.5412i | 1.0283 + 0.5133i | 1.0283 + 0.5133i | 0.9508 + 0.7322i | 0.9459 + 0.6833i | 1.0638 + 0.7179i | 1.0587 + 0.6626i |
| 21 | 0.8935 + 0.5656i | 0.8935 + 0.5656i | 0.9979 + 0.5557i | 1.0380 + 0.5582i | 0.9006 + 0.7223i | 0.8935 + 0.7037i | 1.0274 + 0.7211i | 1.0515 + 0.6813i |
| 21.5 | 0.9084 + 0.5872i | 0.9084 + 0.5872i | 1.0628 + 0.5825i | 1.0458 + 0.5901i | 0.8996 + 0.7455i | 0.8996 + 0.7455i | 1.0446 + 0.7454i | 1.0526 + 0.7376i |
| 22 | 0.8887 + 0.5713i | 0.8887 + 0.5713i | 1.0106 + 0.5766i | 1.0532 + 0.5907i | 0.8774 + 0.7307i | 0.8698 + 0.6919i | 0.9792 + 0.7557i | 1.0444 + 0.7361i |
| 22.5 | 0.8932 + 0.5737i | 0.9001 + 0.5987i | 1.0483 + 0.5684i | 1.0223 + 0.6001i | 0.9017 + 0.7879i | 0.9044 + 0.7215i | 1.0636 + 0.7751i | 1.0312 + 0.7129i |
| 23 | 0.8951 + 0.5381i | 0.9020 + 0.5765i | 1.0480 + 0.5500i | 1.0052 + 0.5823i | 0.9122 + 0.8113i | 0.8977 + 0.7054i | 1.0333 + 0.7739i | 0.9929 + 0.6941i |
| 23.5 | 0.8979 + 0.5389i | 0.9021 + 0.5899i | 1.0570 + 0.5654i | 1.0095 + 0.5968i | 0.8981 + 0.7978i | 0.9002 + 0.7040i | 1.0453 + 0.7856i | 1.0004 + 0.7110i |
| 24 | 0.8946 + 0.5174i | 0.8865 + 0.5769i | 0.9939 + 0.5077i | 1.0334 + 0.5527i | 0.8883 + 0.7796i | 0.8934 + 0.6762i | 0.9999 + 0.7892i | 1.0024 + 0.6743i |
| 24.5 | 1.0545 + 0.6208i | 0.8992 + 0.5849i | 1.0410 + 0.5398i | 0.9570 + 0.5335i | 1.0118 + 0.6978i | 0.9039 + 0.7061i | 1.0649 + 0.7904i | 0.9378 + 0.8081i |

-continued

| | | | | | | | | |
|---|---|---|---|---|---|---|---|---|
| 25 | 0.8835 + 0.5791i | 0.8749 + 0.6592i | 1.0400 + 0.6364i | 0.9662 + 0.6804i | 1.1689 + 0.7806i | 0.8574 + 0.7588i | 1.0682 + 0.7758i | 0.9493 + 0.7863i |
| 25.5 | 0.9398 + 0.5123i | 0.9446 + 0.5967i | 1.0491 + 0.4947i | 1.0814 + 0.5792i | 0.9376 + 0.7957i | 0.9469 + 0.6888i | 1.0478 + 0.7966i | 1.0645 + 0.6841i |
| 26 | 1.0266 + 0.5732i | 0.9271 + 0.6038i | 1.0759 + 0.6299i | 0.9204 + 0.6524i | 1.0128 + 0.7985i | 0.9004 + 0.8291i | 1.0612 + 0.7235i | 0.9050 + 0.7337i |
| 26.5 | 1.0181 + 0.6445i | 0.9222 + 0.6468i | 1.0522 + 0.5581i | 0.9366 + 0.5502i | 1.0179 + 0.7432i | 0.9097 + 0.7340i | 1.1323 + 0.7123i | 0.9024 + 0.8172i |
| 27 | 1.0119 + 0.5802i | 0.9632 + 0.6574i | 1.1374 + 0.5920i | 1.0660 + 0.6825i | 1.0530 + 0.8275i | 0.9525 + 0.7602i | 1.1564 + 0.8642i | 0.9247 + 0.8497i |
| 27.5 | 1.1048 + 0.5047i | 0.9732 + 0.6687i | 1.1360 + 0.5830i | 1.0261 + 0.6028i | 1.0533 + 0.7823i | 0.9559 + 0.7668i | 1.1523 + 0.8406i | 0.9478 + 0.8579i |
| 28 | 1.0788 + 0.4957i | 0.9727 + 0.6831i | 1.1083 + 0.5853i | 1.0158 + 0.6073i | 1.0912 + 0.7187i | 0.9908 + 0.7740i | 1.0145 + 0.8889i | 0.9211 + 0.9015i |

| SNR/w | w32 | w33 | w34 | w35 | w36 | w37 | w38 | w39 |
|---|---|---|---|---|---|---|---|---|
| 7 | 0.6834 + 1.2111i | 0.6203 + 1.1269i | 0.3795 + 1.3685i | 0.3664 + 1.2524i | 0.6203 + 1.1269i | 0.5879 + 1.0807i | 0.3664 + 1.2524i | 0.3587 + 1.1911i |
| 7.5 | 0.6871 + 1.1551i | 0.7107 + 1.1845i | 0.3340 + 1.3132i | 0.3394 + 1.3455i | 0.6229 + 1.0763i | 0.6229 + 1.0763i | 0.3243 + 1.2106i | 0.3243 + 1.2106i |
| 8 | 0.3053 + 1.2660i | 0.3053 + 1.2660i | 0.3053 + 1.2660i | 0.3053 + 1.2660i | 0.6782 + 1.1122i | 0.6782 + 1.1122i | 0.6782 + 1.1122i | 0.6782 + 1.1122i |
| 8.5 | 0.2955 + 1.3421i | 0.2955 + 1.3421i | 0.2955 + 1.3421i | 0.2955 + 1.3421i | 0.7434 + 1.1699i | 0.7434 + 1.1699i | 0.7434 + 1.1699i | 0.7434 + 1.1699i |
| 9 | 1.7494 + 1.1716i | 1.3087 + 0.8633i | 1.3087 + 0.8633i | 1.2190 + 0.7954i | 1.3087 + 0.8633i | 1.2190 + 0.7954i | 1.2190 + 0.7954i | 1.1712 + 0.7580i |
| 9.5 | 1.7496 + 1.1695i | 1.3032 + 0.8658i | 1.3032 + 0.8658i | 1.2262 + 0.8104i | 1.3032 + 0.8658i | 1.2262 + 0.8104i | 1.2262 + 0.8104i | 1.1846 + 0.7800i |
| 10 | 1.7476 + 1.1668i | 1.2968 + 0.8651i | 1.2968 + 0.8651i | 1.2277 + 0.8183i | 1.2968 + 0.8651i | 1.2277 + 0.8183i | 1.2277 + 0.8183i | 1.1900 + 0.7931i |
| 10.5 | 1.6826 + 1.1762i | 1.2393 + 0.8297i | 1.3288 + 0.9046i | 1.1987 + 0.8027i | 1.2989 + 0.8614i | 1.1987 + 0.8027i | 1.2393 + 0.8297i | 1.1987 + 0.8027i |
| 11 | 0.2043 + 0.9827i | 0.2043 + 0.9827i | 0.2043 + 0.9827i | 0.2043 + 0.9827i | 0.2043 + 0.9827i | 0.2043 + 0.9827i | 0.2043 + 0.9827i | 0.2043 + 0.9827i |
| 11.5 | 0.1944 + 0.9833i | 0.1944 + 0.9833i | 0.1944 + 0.9833i | 0.1944 + 0.9833i | 0.1944 + 0.9833i | 0.1944 + 0.9833i | 0.1944 + 0.9833i | 0.1944 + 0.9833i |
| 12 | 0.1843 + 0.9833i | 0.1843 + 0.9833i | 0.1843 + 0.9833i | 0.1843 + 0.9833i | 0.1843 + 0.9833i | 0.1843 + 0.9833i | 0.1843 + 0.9833i | 0.1843 + 0.9833i |
| 12.5 | 0.1863 + 1.0692i | 0.1863 + 1.0692i | 0.2022 + 1.0451i | 0.2022 + 1.0451i | 0.2423 + 1.1255i | 0.2423 + 1.1255i | 0.2559 + 1.0868i | 0.2559 + 1.0868i |
| 13 | 1.0982 + 1.2299i | 1.1688 + 1.2296i | 1.1143 + 1.0869i | 1.2060 + 1.1004i | 0.9857 + 0.9531i | 0.9857 + 0.9531i | 0.9857 + 0.9531i | 1.0052 + 0.9448i |
| 13.5 | 0.2092 + 1.0869i | 0.2092 + 1.0869i | 0.2194 + 1.0533i | 0.2194 + 1.0533i | 0.3028 + 1.1187i | 0.3028 + 1.1187i | 0.3020 + 1.0794i | 0.3020 + 1.0794i |
| 14 | 0.1509 + 1.1139i | 0.1370 + 1.1552i | 0.1619 + 1.0634i | 0.1619 + 1.0634i | 0.3071 + 1.0781i | 0.3071 + 1.0781i | 0.3099 + 1.0456i | 0.3099 + 1.0456i |
| 14.5 | 0.1449 + 1.1327i | 0.1306 + 1.1877i | 0.1503 + 1.0734i | 0.1416 + 1.0974i | 0.3398 + 1.0875i | 0.3398 + 1.0875i | 0.3282 + 1.0466i | 0.3282 + 1.0466i |
| 15 | 0.1591 + 1.5394i | 0.4955 + 1.3775i | 0.2019 + 1.5174i | 0.4551 + 1.3944i | 0.6309 + 0.9869i | 0.6163 + 1.0795i | 0.6309 + 0.9869i | 0.6182 + 1.0532i |
| 15.5 | 0.1274 + 1.6424i | 0.2983 + 1.5080i | 0.1465 + 1.6140i | 0.3069 + 1.5179i | 0.6484 + 0.9762i | 0.6532 + 0.9960i | 0.6484 + 0.9762i | 0.6532 + 0.9960i |
| 16 | 0.3712 + 1.7894i | 0.5775 + 1.3833i | 0.5311 + 1.7286i | 0.5825 + 1.4596i | 0.6562 + 0.9352i | 0.6470 + 0.9934i | 0.6707 + 0.9278i | 0.6653 + 0.9679i |
| 16.5 | 0.9790 + 1.7611i | 0.5632 + 1.2042i | 0.6550 + 1.8625i | 0.5632 + 1.2042i | 0.5726 + 0.9159i | 0.5700 + 0.9781i | 0.5726 + 0.9159i | 0.5700 + 0.9781i |
| 17 | 0.9719 + 1.7576i | 0.5632 + 1.2036i | 0.6484 + 1.8669i | 0.5632 + 1.2036i | 0.5708 + 0.9120i | 0.5693 + 0.9768i | 0.5708 + 0.9120i | 0.5693 + 0.9768i |
| 17.5 | 0.9596 + 1.7576i | 0.5628 + 1.2012i | 0.6359 + 1.8638i | 0.5628 + 1.2012i | 0.5682 + 0.9084i | 0.5682 + 0.9765i | 0.5682 + 0.9084i | 0.5682 + 0.9765i |
| 18 | 0.9565 + 1.7467i | 0.5597 + 1.1973i | 0.6376 + 1.8550i | 0.5597 + 1.1973i | 0.5627 + 0.9080i | 0.5638 + 0.9795i | 0.5627 + 0.9080i | 0.5638 + 0.9795i |
| 18.5 | 0.8180 + 1.4853i | 0.7467 + 1.2574i | 0.8969 + 1.7495i | 0.7299 + 1.1971i | 0.6496 + 0.9248i | 0.6665 + 0.9821i | 0.6496 + 0.9248i | 0.6737 + 1.0037i |
| 19 | 0.8131 + 1.4757i | 0.7498 + 1.2637i | 0.8853 + 1.7279i | 0.7348 + 1.1948i | 0.6625 + 0.9215i | 0.6785 + 0.9845i | 0.6625 + 0.9215i | 0.6873 + 1.0091i |
| 19.5 | 0.8222 + 1.7689i | 0.7329 + 1.2092i | 0.7753 + 1.4943i | 0.7495 + 1.2497i | 0.6759 + 0.9245i | 0.6976 + 1.0138i | 0.6759 + 0.9245i | 0.6976 + 1.0138i |
| 20 | 0.5491 + 1.7035i | 0.4164 + 1.1274i | 0.3416 + 1.3191i | 0.4000 + 1.1739i | 0.5011 + 0.8954i | 0.4761 + 0.9710i | 0.5011 + 0.8954i | 0.4761 + 0.9710i |
| 20.5 | 0.5496 + 1.8328i | 0.5969 + 1.1973i | 0.5741 + 1.4423i | 0.6003 + 1.2412i | 0.6155 + 0.9153i | 0.6053 + 1.0278i | 0.6155 + 0.9153i | 0.6226 + 1.0166i |
| 21 | 0.5908 + 1.4191i | 0.6104 + 1.2526i | 0.4486 + 1.8391i | 0.6140 + 1.1685i | 0.5778 + 0.8980i | 0.5844 + 1.0085i | 0.5778 + 0.8980i | 0.5989 + 1.0366i |
| 21.5 | 0.5651 + 1.6424i | 0.5819 + 1.1504i | 0.5713 + 1.4458i | 0.5849 + 1.2696i | 0.5230 + 0.8818i | 0.5536 + 1.0212i | 0.5383 + 0.8832i | 0.5512 + 0.9689i |

-continued

| | | | | | | | | |
|---|---|---|---|---|---|---|---|---|
| 22 | 0.6243 + 1.4649i | 0.5939 + 1.3037i | 0.4047 + 1.8156i | 0.5830 + 1.2010i | 0.5691 + 0.9002i | 0.5564 + 1.0225i | 0.5691 + 0.9002i | 0.5732 + 1.0495i |
| 22.5 | 0.6526 + 1.7382i | 0.5201 + 1.1584i | 0.5875 + 1.5167i | 0.5606 + 1.2579i | 0.5384 + 0.8854i | 0.5343 + 1.0408i | 0.5671 + 0.8932i | 0.5685 + 1.0088i |
| 23 | 0.6244 + 1.6853i | 0.5396 + 1.1646i | 0.5897 + 1.4912i | 0.5627 + 1.2896i | 0.5300 + 0.8893i | 0.5385 + 1.0557i | 0.5662 + 0.9004i | 0.5719 + 1.0071i |
| 23.5 | 0.5088 + 1.7163i | 0.5473 + 1.1551i | 0.5636 + 1.4803i | 0.5544 + 1.2433i | 0.5327 + 0.8892i | 0.5348 + 1.0466i | 0.5758 + 0.8987i | 0.5771 + 1.0111i |
| 24 | 0.6364 + 1.6353i | 0.5959 + 1.1661i | 0.6239 + 1.4562i | 0.6065 + 1.3009i | 0.5237 + 0.8675i | 0.5685 + 1.0623i | 0.5644 + 0.8873i | 0.5725 + 0.9911i |
| 24.5 | 0.6032 + 1.6635i | 0.5024 + 1.1613i | 0.6020 + 1.2960i | 0.5939 + 1.1667i | 0.5099 + 0.9139i | 0.5036 + 1.0359i | 0.5855 + 0.9120i | 0.5903 + 1.0334i |
| 25 | 0.6389 + 1.6546i | 0.4853 + 1.1426i | 0.5804 + 1.3364i | 0.5604 + 1.2030i | 0.4874 + 0.9257i | 0.4845 + 1.0420i | 0.5645 + 0.9258i | 0.5744 + 1.0392i |
| 25.5 | 0.5812 + 1.5932i | 0.5105 + 1.2487i | 0.5473 + 1.4117i | 0.5765 + 1.1450i | 0.5751 + 0.8885i | 0.5696 + 0.9833i | 0.6604 + 0.8996i | 0.6267 + 1.0328i |
| 26 | 0.4991 + 1.5686i | 0.5486 + 1.1925i | 0.6897 + 1.1182i | 0.6481 + 1.2195i | 0.6050 + 0.9119i | 0.5370 + 0.9447i | 0.6526 + 1.0254i | 0.5772 + 1.0462i |
| 26.5 | 0.5345 + 1.6138i | 0.5130 + 1.1337i | 0.6387 + 1.0936i | 0.5568 + 1.2390i | 0.6269 + 0.8981i | 0.4851 + 1.0350i | 0.6143 + 0.9936i | 0.5184 + 0.9539i |
| 27 | 0.4015 + 1.5842i | 0.5558 + 1.2016i | 0.6111 + 1.3403i | 0.6382 + 1.1360i | 0.5330 + 0.8941i | 0.4820 + 1.1330i | 0.6037 + 0.9226i | 0.6160 + 1.0341i |
| 27.5 | 0.4096 + 1.5974i | 0.5213 + 1.2084i | 0.5614 + 1.3474i | 0.6135 + 1.1429i | 0.5637 + 0.8891i | 0.4831 + 1.1158i | 0.6283 + 0.9257i | 0.6504 + 1.0330i |
| 28 | 0.4374 + 1.5965i | 0.6091 + 1.1608i | 0.5915 + 1.3566i | 0.6593 + 1.2473i | 0.5376 + 0.9041i | 0.6008 + 1.0615i | 0.6254 + 0.8954i | 0.6315 + 0.9789i |

| SNR/w | w40 | w41 | w42 | w43 | w44 | w45 | w46 | w47 |
|---|---|---|---|---|---|---|---|---|
| 7 | 0.6203 + 1.1269i | 0.5879 + 1.0807i | 0.3664 + 1.2524i | 0.3587 + 1.1911i | 0.5879 + 1.0807i | 0.5639 + 1.0452i | 0.3587 + 1.1911i | 0.3527 + 1.1449i |
| 7.5 | 0.6229 + 1.0763i | 0.6229 + 1.0763i | 0.3243 + 1.2106i | 0.3243 + 1.2106i | 0.5841 + 1.0273i | 0.5841 + 1.0273i | 0.3172 + 1.1461i | 0.3172 + 1.1461i |
| 8 | 0.2956 + 1.1569i | 0.2956 + 1.1569i | 0.2956 + 1.1569i | 0.2956 + 1.1569i | 0.6067 + 1.0261i | 0.6067 + 1.0261i | 0.6067 + 1.0261i | 0.6067 + 1.0261i |
| 8.5 | 0.2755 + 1.1100i | 0.2755 + 1.1100i | 0.2755 + 1.1100i | 0.2755 + 1.1100i | 0.5891 + 0.9828i | 0.5891 + 0.9828i | 0.5891 + 0.9828i | 0.5891 + 0.9828i |
| 9 | 1.3087 + 0.8633i | 1.2190 + 0.7954i | 1.2190 + 0.7954i | 1.1712 + 0.7580i | 1.2190 + 0.7954i | 1.1712 + 0.7580i | 1.1712 + 0.7580i | 1.1712 + 0.7580i |
| 9.5 | 1.3032 + 0.8658i | 1.2262 + 0.8104i | 1.2262 + 0.8104i | 1.1846 + 0.7800i | 1.2262 + 0.8104i | 1.1846 + 0.7800i | 1.1846 + 0.7800i | 1.1846 + 0.7800i |
| 10 | 1.2968 + 0.8651i | 1.2277 + 0.8183i | 1.2277 + 0.8183i | 1.1900 + 0.7931i | 1.2277 + 0.8183i | 1.1900 + 0.7931i | 1.1900 + 0.7931i | 1.1900 + 0.7931i |
| 10.5 | 1.2393 + 0.8297i | 1.1987 + 0.8027i | 1.2393 + 0.8297i | 1.1745 + 0.7815i | 1.2393 + 0.8297i | 1.1745 + 0.7815i | 1.1987 + 0.8027i | 1.1745 + 0.7815i |
| 11 | 0.1932 + 1.0799i | 0.1932 + 1.0799i | 0.1932 + 1.0799i | 0.1932 + 1.0799i | 0.1932 + 1.0799i | 0.1932 + 1.0799i | 0.1932 + 1.0799i | 0.1932 + 1.0799i |
| 11.5 | 0.1889 + 1.0783i | 0.1889 + 1.0783i | 0.1889 + 1.0783i | 0.1889 + 1.0783i | 0.1889 + 1.0783i | 0.1889 + 1.0783i | 0.1889 + 1.0783i | 0.1889 + 1.0783i |
| 12 | 0.1847 + 1.0766i | 0.1847 + 1.0766i | 0.1847 + 1.0766i | 0.1847 + 1.0766i | 0.1847 + 1.0766i | 0.1847 + 1.0766i | 0.1847 + 1.0766i | 0.1847 + 1.0766i |
| 12.5 | 0.1663 + 1.1062i | 0.1663 + 1.1062i | 0.1863 + 1.0692i | 0.1863 + 1.0692i | 0.2130 + 1.1610i | 0.2130 + 1.1610i | 0.2342 + 1.1053i | 0.2342 + 1.1053i |
| 13 | 1.1262 + 0.8094i | 1.1262 + 0.8094i | 1.1733 + 0.8217i | 1.1733 + 0.8217i | 1.0310 + 0.8384i | 1.0310 + 0.8384i | 1.0310 + 0.8384i | 1.0615 + 0.8309i |
| 13.5 | 0.1493 + 1.1587i | 0.1493 + 1.1587i | 0.1688 + 1.0929i | 0.1688 + 1.0929i | 0.2304 + 1.1738i | 0.2304 + 1.1738i | 0.2452 + 1.1060i | 0.2452 + 1.1060i |
| 14 | 0.1509 + 1.1139i | 0.1370 + 1.1552i | 0.1619 + 1.0634i | 0.1557 + 1.0801i | 0.3071 + 1.0781i | 0.2999 + 1.1047i | 0.3099 + 1.0456i | 0.3071 + 1.0781i |
| 14.5 | 0.1449 + 1.1327i | 0.1306 + 1.1877i | 0.1503 + 1.0734i | 0.1416 + 1.0974i | 0.3398 + 1.0875i | 0.3322 + 1.1034i | 0.3282 + 1.0466i | 0.3282 + 1.0466i |
| 15 | 0.1729 + 1.6258i | 0.5301 + 1.4133i | 0.2360 + 1.5834i | 0.4835 + 1.4383i | 0.6591 + 0.9884i | 0.6402 + 1.0789i | 0.6591 + 0.9884i | 0.6440 + 1.0511i |
| 15.5 | 0.1783 + 2.0138i | 0.4786 + 1.4270i | 0.4591 + 1.9026i | 0.4793 + 1.4490i | 0.6150 + 1.0563i | 0.6104 + 1.1350i | 0.6150 + 1.0563i | 0.6104 + 1.1350i |
| 16 | 0.1615 + 1.9642i | 0.6491 + 1.3361i | 0.8166 + 1.8585i | 0.6677 + 1.3884i | 0.6653 + 0.9679i | 0.6648 + 1.0542i | 0.6824 + 0.9524i | 0.6765 + 1.0248i |
| 16.5 | 0.7602 + 1.4834i | 0.6457 + 1.2464i | 0.6704 + 1.5226i | 0.6234 + 1.2436i | 0.6561 + 0.9154i | 0.6510 + 0.9712i | 0.6561 + 0.9154i | 0.6510 + 0.9712i |
| 17 | 0.7674 + 1.4916i | 0.6480 + 1.2445i | 0.6589 + 1.5275i | 0.6222 + 1.2437i | 0.6691 + 0.9104i | 0.6658 + 0.9655i | 0.6484 + 0.9120i | 0.6467 + 0.9704i |
| 17.5 | 0.7728 + 1.4984i | 0.6519 + 1.2427i | 0.6465 + 1.5284i | 0.6233 + 1.2445i | 0.6755 + 0.9070i | 0.6746 + 0.9631i | 0.6527 + 0.9083i | 0.6539 + 0.9681i |
| 18 | 0.7831 + 1.4978i | 0.6594 + 1.2395i | 0.6418 + 1.5205i | 0.6278 + 1.2472i | 0.6851 + 0.9061i | 0.6860 + 0.9628i | 0.6615 + 0.9070i | 0.6657 + 0.9671i |
| 18.5 | 1.0099 + 1.3939i | 0.9240 + 1.1657i | 1.1966 + 1.6143i | 0.8847 + 1.1340i | 0.8199 + 0.8642i | 0.8521 + 0.9294i | 0.8199 + 0.8642i | 0.8357 + 0.9478i |

-continued

| | | | | | | | | |
|---|---|---|---|---|---|---|---|---|
| 19 | 1.0089 + 1.3854i | 0.9317 + 1.1639i | 1.1714 + 1.6030i | 0.8884 + 1.1335i | 0.8416 + 0.8560i | 0.8693 + 0.9355i | 0.8242 + 0.8659i | 0.8475 + 0.9550i |
| 19.5 | 1.0472 + 1.3158i | 0.9601 + 1.1483i | 0.9672 + 1.4659i | 0.9033 + 1.1563i | 0.8620 + 0.8605i | 0.8955 + 0.9529i | 0.8317 + 0.8718i | 0.8608 + 0.9652i |
| 20 | 0.5008 + 1.4978i | 0.5599 + 1.2077i | 0.4017 + 1.3861i | 0.4910 + 1.2146i | 0.6741 + 0.9583i | 0.6244 + 1.0551i | 0.6448 + 0.9428i | 0.6008 + 1.0207i |
| 20.5 | 0.8136 + 1.4139i | 0.8016 + 1.2232i | 0.6965 + 1.5705i | 0.7525 + 1.2015i | 0.8142 + 0.9002i | 0.8183 + 1.0236i | 0.7650 + 0.9052i | 0.7689 + 1.0279i |
| 21 | 0.7412 + 1.4650i | 0.7761 + 1.2729i | 0.6892 + 1.6914i | 0.7846 + 1.1451i | 0.7382 + 0.8775i | 0.7685 + 0.9477i | 0.7062 + 0.8840i | 0.7561 + 1.0136i |
| 21.5 | 0.7899 + 1.6946i | 0.7179 + 1.1320i | 0.7344 + 1.4506i | 0.7296 + 1.2738i | 0.7376 + 0.9029i | 0.7043 + 0.9821i | 0.6765 + 0.8832i | 0.6698 + 0.9341i |
| 22 | 0.7843 + 1.4333i | 0.7705 + 1.2498i | 0.7026 + 1.7278i | 0.7003 + 1.1772i | 0.7420 + 0.8972i | 0.7590 + 1.0320i | 0.7021 + 0.8941i | 0.7000 + 1.0561i |
| 22.5 | 0.7634 + 1.3802i | 0.7514 + 1.1770i | 0.8230 + 1.5535i | 0.6680 + 1.2094i | 0.7721 + 0.9026i | 0.7530 + 1.0356i | 0.6926 + 0.8983i | 0.6827 + 1.0183i |
| 23 | 0.7407 + 1.4100i | 0.7168 + 1.1622i | 0.8274 + 1.5617i | 0.6629 + 1.2434i | 0.7852 + 0.9095i | 0.7666 + 1.0370i | 0.6839 + 0.9059i | 0.6837 + 1.0019i |
| 23.5 | 0.6960 + 1.6848i | 0.7272 + 1.1865i | 0.7086 + 1.4468i | 0.6649 + 1.2963i | 0.7845 + 0.9168i | 0.7512 + 1.0593i | 0.6918 + 0.9051i | 0.6794 + 1.0148i |
| 24 | 0.8224 + 1.6271i | 0.7310 + 1.1523i | 0.7840 + 1.4334i | 0.7347 + 1.2858i | 0.7779 + 0.8837i | 0.7423 + 1.0272i | 0.6821 + 0.8793i | 0.6766 + 0.9745i |
| 24.5 | 0.6380 + 1.4769i | 0.8075 + 1.1341i | 0.7223 + 1.3126i | 0.7056 + 1.1575i | 0.7675 + 0.8980i | 0.7992 + 1.0027i | 0.6777 + 0.9081i | 0.6881 + 1.0255i |
| 25 | 0.6810 + 1.4782i | 0.7864 + 1.1315i | 0.7113 + 1.3095i | 0.6760 + 1.1703i | 0.7607 + 0.9150i | 0.7845 + 1.0125i | 0.6564 + 0.9256i | 0.6660 + 1.0394i |
| 25.5 | 0.7834 + 1.3291i | 0.7989 + 1.1836i | 0.6586 + 1.3212i | 0.6790 + 1.1822i | 0.8334 + 0.9240i | 0.8389 + 1.0490i | 0.7408 + 0.9196i | 0.7235 + 1.0449i |
| 26 | 0.6326 + 1.5030i | 0.8468 + 1.1407i | 0.7209 + 1.3784i | 0.7653 + 1.2445i | 0.6935 + 0.8959i | 0.8740 + 1.0322i | 0.7256 + 0.9768i | 0.8038 + 0.9722i |
| 26.5 | 0.6623 + 1.5103i | 0.7938 + 1.1419i | 0.6742 + 1.3558i | 0.6837 + 1.2238i | 0.7039 + 0.8883i | 0.8594 + 1.0384i | 0.7255 + 0.9867i | 0.8205 + 0.9417i |
| 27 | 0.6819 + 1.4965i | 0.7875 + 1.1320i | 0.7367 + 1.3484i | 0.7100 + 1.2226i | 0.7563 + 0.9153i | 0.7455 + 1.0248i | 0.6815 + 0.9082i | 0.8338 + 1.0015i |
| 27.5 | 0.6106 + 1.5039i | 0.7463 + 1.1465i | 0.6780 + 1.3719i | 0.6672 + 1.2405i | 0.7683 + 0.9391i | 0.7867 + 1.0395i | 0.7004 + 0.9076i | 0.8788 + 0.9640i |
| 28 | 0.6738 + 1.4981i | 0.7958 + 1.1175i | 0.7244 + 1.3669i | 0.7701 + 1.2287i | 0.7924 + 0.8491i | 0.7061 + 1.0819i | 0.7163 + 0.8855i | 0.7346 + 0.9830i |

| SNR/w | w48 | w49 | w50 | w51 | w52 | w53 | w54 | w55 |
|---|---|---|---|---|---|---|---|---|
| 7 | 0.6203 + 1.1269i | 0.5879 + 1.0807i | 0.3664 + 1.2524i | 0.3587 + 1.1911i | 0.5879 + 1.0807i | 0.5639 + 1.0452i | 0.3587 + 1.1911i | 0.3527 + 1.1449i |
| 7.5 | 0.6229 + 1.0763i | 0.6229 + 1.0763i | 0.3243 + 1.2106i | 0.3243 + 1.2106i | 0.5841 + 1.0273i | 0.5841 + 1.0273i | 0.3172 + 1.1461i | 0.3172 + 1.1461i |
| 8 | 0.2956 + 1.1569i | 0.2956 + 1.1569i | 0.2956 + 1.1569i | 0.2956 + 1.1569i | 0.6067 + 1.0261i | 0.6067 + 1.0261i | 0.6067 + 1.0261i | 0.6067 + 1.0261i |
| 8.5 | 0.2874 + 1.2418i | 0.2874 + 1.2418i | 0.2874 + 1.2418i | 0.2874 + 1.2418i | 0.6771 + 1.0898i | 0.6771 + 1.0898i | 0.6771 + 1.0898i | 0.6771 + 1.0898i |
| 9 | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i |
| 10 | 0.8968 + 0.5459i | 0.8968 + 0.5459i | 0.8968 + 0.5459i | 0.8968 + 0.5459i | 0.8968 + 0.5459i | 0.8968 + 0.5459i | 0.8968 + 0.5459i | 0.8968 + 0.5459i |
| 10.5 | 0.8830 + 0.5450i | 0.8830 + 0.5450i | 0.8830 + 0.5450i | 0.8830 + 0.5450i | 0.8830 + 0.5450i | 0.8830 + 0.5450i | 0.8830 + 0.5450i | 0.8830 + 0.5450i |
| 11 | 0.4984 + 0.8939i | 0.4984 + 0.8939i | 0.4984 + 0.8939i | 0.4984 + 0.8939i | 0.4984 + 0.8939i | 0.4984 + 0.8939i | 0.4984 + 0.8939i | 0.4984 + 0.8939i |
| 11.5 | 0.5081 + 0.8838i | 0.5081 + 0.8838i | 0.5081 + 0.8838i | 0.5081 + 0.8838i | 0.5081 + 0.8838i | 0.5081 + 0.8838i | 0.5081 + 0.8838i | 0.5081 + 0.8838i |
| 12 | 0.5146 + 0.8768i | 0.5146 + 0.8768i | 0.5146 + 0.8768i | 0.5146 + 0.8768i | 0.5146 + 0.8768i | 0.5146 + 0.8768i | 0.5146 + 0.8768i | 0.5146 + 0.8768i |
| 12.5 | 0.5822 + 0.8338i | 0.5822 + 0.8338i | 0.5822 + 0.8338i | 0.5822 + 0.8338i | 0.5794 + 0.8826i | 0.5794 + 0.8826i | 0.5794 + 0.8826i | 0.5794 + 0.8826i |
| 13 | 0.7986 + 0.5929i | 0.7986 + 0.5929i | 0.7986 + 0.5929i | 0.7986 + 0.5929i | 0.7914 + 0.6293i | 0.7914 + 0.6293i | 0.7914 + 0.6293i | 0.7914 + 0.6293i |
| 13.5 | 0.5892 + 0.8018i | 0.5892 + 0.8018i | 0.5892 + 0.8018i | 0.5892 + 0.8018i | 0.5764 + 0.8728i | 0.5764 + 0.8728i | 0.5764 + 0.8728i | 0.5764 + 0.8728i |
| 14 | 0.6534 + 0.7300i | 0.6534 + 0.7300i | 0.6534 + 0.7300i | 0.6534 + 0.7300i | 0.6037 + 0.8242i | 0.6037 + 0.8242i | 0.6037 + 0.8242i | 0.6037 + 0.8242i |
| 14.5 | 0.6604 + 0.7151i | 0.6604 + 0.7151i | 0.6604 + 0.7151i | 0.6604 + 0.7151i | 0.5990 + 0.8291i | 0.5990 + 0.8291i | 0.5990 + 0.8291i | 0.5990 + 0.8291i |
| 15 | 0.6517 + 0.5928i | 0.6517 + 0.5928i | 0.6517 + 0.5928i | 0.6517 + 0.5928i | 0.6549 + 0.6778i | 0.6542 + 0.6594i | 0.6549 + 0.6778i | 0.6549 + 0.6778i |
| 15.5 | 0.6528 + 0.6065i | 0.6528 + 0.6065i | 0.6528 + 0.6065i | 0.6528 + 0.6065i | 0.6768 + 0.7164i | 0.6768 + 0.7164i | 0.6768 + 0.7164i | 0.6768 + 0.7164i |

-continued

| | | | | | | | | |
|---|---|---|---|---|---|---|---|---|
| 16 | 0.6288 + 0.5806i | 0.6288 + 0.5806i | 0.6288 + 0.5806i | 0.6288 + 0.5806i | 0.6488 + 0.6716i | 0.6474 + 0.6572i | 0.6513 + 0.6860i | 0.6488 + 0.6716i |
| 16.5 | 0.5868 + 0.5877i | 0.5868 + 0.5877i | 0.5868 + 0.5877i | 0.5868 + 0.5877i | 0.5855 + 0.6757i | 0.5855 + 0.6757i | 0.5855 + 0.6757i | 0.5808 + 0.6625i |
| 17 | 0.5837 + 0.5846i | 0.5837 + 0.5846i | 0.5837 + 0.5846i | 0.5837 + 0.5846i | 0.5802 + 0.6871i | 0.5821 + 0.6661i | 0.5802 + 0.6871i | 0.5821 + 0.6661i |
| 17.5 | 0.5794 + 0.5798i | 0.5794 + 0.5798i | 0.5794 + 0.5798i | 0.5794 + 0.5798i | 0.5757 + 0.6938i | 0.5776 + 0.6710i | 0.5757 + 0.6938i | 0.5776 + 0.6710i |
| 18 | 0.5719 + 0.5736i | 0.5719 + 0.5736i | 0.5719 + 0.5736i | 0.5719 + 0.5736i | 0.5682 + 0.7054i | 0.5699 + 0.6832i | 0.5682 + 0.7054i | 0.5699 + 0.6832i |
| 18.5 | 0.5557 + 0.5937i | 0.5557 + 0.5937i | 0.5557 + 0.5937i | 0.5557 + 0.5937i | 0.5979 + 0.7540i | 0.5916 + 0.7334i | 0.5979 + 0.7540i | 0.5916 + 0.7334i |
| 19 | 0.5631 + 0.5896i | 0.5631 + 0.5896i | 0.5631 + 0.5896i | 0.5631 + 0.5896i | 0.6124 + 0.7561i | 0.6046 + 0.7329i | 0.6124 + 0.7561i | 0.6046 + 0.7329i |
| 19.5 | 0.5710 + 0.5915i | 0.5710 + 0.5915i | 0.5710 + 0.5915i | 0.5710 + 0.5915i | 0.6265 + 0.7635i | 0.6170 + 0.7357i | 0.6265 + 0.7635i | 0.6170 + 0.7357i |
| 20 | 0.5822 + 0.5765i | 0.5822 + 0.5765i | 0.5822 + 0.5765i | 0.5822 + 0.5765i | 0.5421 + 0.7458i | 0.5485 + 0.7213i | 0.5421 + 0.7458i | 0.5485 + 0.7213i |
| 20.5 | 0.5822 + 0.5821i | 0.5822 + 0.5821i | 0.5822 + 0.5821i | 0.5822 + 0.5821i | 0.6018 + 0.7641i | 0.5972 + 0.7267i | 0.6018 + 0.7641i | 0.5972 + 0.7267i |
| 21 | 0.5616 + 0.5634i | 0.5616 + 0.5634i | 0.5616 + 0.5634i | 0.5616 + 0.5634i | 0.5660 + 0.7470i | 0.5633 + 0.7034i | 0.5660 + 0.7470i | 0.5633 + 0.7034i |
| 21.5 | 0.5495 + 0.5732i | 0.5495 + 0.5732i | 0.5693 + 0.5746i | 0.5693 + 0.5746i | 0.5331 + 0.7428i | 0.5381 + 0.7072i | 0.5541 + 0.7458i | 0.5596 + 0.7108i |
| 22 | 0.5609 + 0.5487i | 0.5607 + 0.5707i | 0.5609 + 0.5487i | 0.5607 + 0.5707i | 0.5638 + 0.7634i | 0.5616 + 0.6982i | 0.5638 + 0.7634i | 0.5616 + 0.6982i |
| 22.5 | 0.5470 + 0.5539i | 0.5476 + 0.5769i | 0.5738 + 0.5571i | 0.5742 + 0.5796i | 0.5425 + 0.7656i | 0.5443 + 0.7009i | 0.5719 + 0.7641i | 0.5718 + 0.7017i |
| 23 | 0.5438 + 0.5498i | 0.5380 + 0.5928i | 0.5956 + 0.5500i | 0.5895 + 0.5949i | 0.5352 + 0.7741i | 0.5370 + 0.6971i | 0.5807 + 0.7810i | 0.5873 + 0.6984i |
| 23.5 | 0.5420 + 0.5404i | 0.5426 + 0.5844i | 0.5959 + 0.5394i | 0.5992 + 0.5846i | 0.5405 + 0.7778i | 0.5435 + 0.6909i | 0.5919 + 0.7808i | 0.5973 + 0.6934i |
| 24 | 0.5255 + 0.5297i | 0.5242 + 0.5894i | 0.5852 + 0.5291i | 0.5854 + 0.5881i | 0.5232 + 0.7731i | 0.5221 + 0.6867i | 0.5850 + 0.7703i | 0.5860 + 0.6850i |
| 24.5 | 0.5320 + 0.5316i | 0.5261 + 0.6108i | 0.5951 + 0.5356i | 0.5905 + 0.6148i | 0.5146 + 0.8039i | 0.5192 + 0.7047i | 0.5858 + 0.8006i | 0.5865 + 0.7049i |
| 25 | 0.5351 + 0.5313i | 0.5235 + 0.6126i | 0.6088 + 0.5413i | 0.5929 + 0.6237i | 0.4978 + 0.8117i | 0.5101 + 0.7078i | 0.5655 + 0.8168i | 0.5769 + 0.7155i |
| 25.5 | 0.5530 + 0.5469i | 0.5591 + 0.6248i | 0.6363 + 0.5402i | 0.6435 + 0.6188i | 0.5711 + 0.7972i | 0.5652 + 0.7099i | 0.6605 + 0.7964i | 0.6520 + 0.7038i |
| 26 | 0.5591 + 0.5670i | 0.5177 + 0.6201i | 0.6098 + 0.6293i | 0.5253 + 0.6674i | 0.6050 + 0.8173i | 0.5282 + 0.8134i | 0.6187 + 0.7290i | 0.5315 + 0.7314i |
| 26.5 | 0.5260 + 0.5793i | 0.4902 + 0.6512i | 0.5918 + 0.6233i | 0.5219 + 0.6802i | 0.6218 + 0.8082i | 0.5542 + 0.8063i | 0.6169 + 0.7217i | 0.5205 + 0.7582i |
| 27 | 0.5743 + 0.5517i | 0.6712 + 0.5573i | 0.5951 + 0.5922i | 0.6584 + 0.6238i | 0.5523 + 0.8038i | 0.5626 + 0.7109i | 0.6275 + 0.8020i | 0.6357 + 0.7064i |
| 27.5 | 0.5592 + 0.5829i | 0.7089 + 0.5603i | 0.6120 + 0.5818i | 0.6742 + 0.6278i | 0.5700 + 0.8032i | 0.5742 + 0.7097i | 0.6450 + 0.8012i | 0.6522 + 0.7089i |
| 28 | 0.5735 + 0.5443i | 0.6544 + 0.5617i | 0.5761 + 0.6045i | 0.6223 + 0.6342i | 0.5404 + 0.8158i | 0.5418 + 0.7248i | 0.6162 + 0.8123i | 0.6016 + 0.7162i |

| SNR/w | w56 | w57 | w58 | w59 | w60 | w61 | w62 | w63 |
|---|---|---|---|---|---|---|---|---|
| 7 | 0.5879 + 1.0807i | 0.5639 + 1.0452i | 0.3587 + 1.1911i | 0.3527 + 1.1449i | 0.5639 + 1.0452i | 0.5639 + 1.0452i | 0.3527 + 1.1449i | 0.3527 + 1.1449i |
| 7.5 | 0.5841 + 1.0273i | 0.5841 + 1.0273i | 0.3172 + 1.1461i | 0.3172 + 1.1461i | 0.5583 + 0.9946i | 0.5841 + 1.0273i | 0.3121 + 1.1042i | 0.3172 + 1.1461i |
| 8 | 0.2909 + 1.1021i | 0.2909 + 1.1021i | 0.2909 + 1.1021i | 0.2909 + 1.1021i | 0.5711 + 0.9836i | 0.5711 + 0.9836i | 0.5711 + 0.9836i | 0.5711 + 0.9836i |
| 8.5 | 0.2747 + 1.0834i | 0.2747 + 1.0834i | 0.2747 + 1.0834i | 0.2755 + 1.1100i | 0.5714 + 0.9632i | 0.5714 + 0.9632i | 0.5714 + 0.9632i | 0.5891 + 0.9828i |
| 9 | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i |
| 10 | 0.8968 + 0.5459i | 0.8968 + 0.5459i | 0.8968 + 0.5459i | 0.8968 + 0.5459i | 0.8968 + 0.5459i | 0.8968 + 0.5459i | 0.8968 + 0.5459i | 0.9130 + 0.5610i |
| 10.5 | 0.8830 + 0.5450i | 0.8830 + 0.5450i | 0.8830 + 0.5450i | 0.8999 + 0.5564i | 0.8830 + 0.5450i | 0.8999 + 0.5564i | 0.8830 + 0.5450i | 0.8999 + 0.5564i |
| 11 | 0.4913 + 0.9328i | 0.4913 + 0.9328i | 0.4913 + 0.9328i | 0.4913 + 0.9328i | 0.4913 + 0.9328i | 0.4913 + 0.9328i | 0.4913 + 0.9328i | 0.4913 + 0.9328i |
| 11.5 | 0.5036 + 0.9211i | 0.5036 + 0.9211i | 0.5036 + 0.9211i | 0.5036 + 0.9211i | 0.5036 + 0.9211i | 0.5036 + 0.9211i | 0.5036 + 0.9211i | 0.5036 + 0.9211i |
| 12 | 0.5099 + 0.9157i | 0.5099 + 0.9157i | 0.5099 + 0.9157i | 0.5099 + 0.9157i | 0.5099 + 0.9157i | 0.5099 + 0.9157i | 0.5099 + 0.9157i | 0.5099 + 0.9157i |
| 12.5 | 0.6107 + 0.8306i | 0.6107 + 0.8306i | 0.5822 + 0.8338i | 0.5822 + 0.8338i | 0.6070 + 0.8755i | 0.6070 + 0.8755i | 0.5794 + 0.8826i | 0.5794 + 0.8826i |

-continued

| | | | | | | | | |
|---|---|---|---|---|---|---|---|---|
| 13 | 0.8552 + 0.5879i | 0.8552 + 0.5879i | 0.8552 + 0.5879i | 0.8552 + 0.5879i | 0.8390 + 0.6247i | 0.8390 + 0.6247i | 0.8390 + 0.6247i | 0.8390 + 0.6247i |
| 13.5 | 0.6385 + 0.7909i | 0.6385 + 0.7909i | 0.6385 + 0.7909i | 0.6385 + 0.7909i | 0.6259 + 0.8459i | 0.6259 + 0.8459i | 0.6259 + 0.8459i | 0.6259 + 0.8459i |
| 14 | 0.6962 + 0.7427i | 0.6962 + 0.7427i | 0.6962 + 0.7427i | 0.6962 + 0.7427i | 0.6037 + 0.8242i | 0.6258 + 0.8266i | 0.6037 + 0.8242i | 0.6258 + 0.8266i |
| 14.5 | 0.7109 + 0.7314i | 0.7109 + 0.7314i | 0.7109 + 0.7314i | 0.7109 + 0.7314i | 0.6231 + 0.8370i | 0.6231 + 0.8370i | 0.5990 + 0.8291i | 0.6231 + 0.8370i |
| 15 | 0.7167 + 0.5928i | 0.7167 + 0.5928i | 0.7167 + 0.5928i | 0.7167 + 0.5928i | 0.7125 + 0.6806i | 0.7146 + 0.6593i | 0.7125 + 0.6806i | 0.7125 + 0.6806i |
| 15.5 | 0.7040 + 0.5764i | 0.7040 + 0.5764i | 0.7040 + 0.5764i | 0.7040 + 0.5764i | 0.7116 + 0.6428i | 0.7116 + 0.6428i | 0.7116 + 0.6428i | 0.7116 + 0.6428i |
| 16 | 0.6902 + 0.5639i | 0.6902 + 0.5639i | 0.6902 + 0.5639i | 0.6902 + 0.5639i | 0.6998 + 0.6407i | 0.7027 + 0.6248i | 0.6979 + 0.6575i | 0.6998 + 0.6407i |
| 16.5 | 0.6882 + 0.5903i | 0.6882 + 0.5903i | 0.6652 + 0.5898i | 0.6652 + 0.5898i | 0.6842 + 0.6771i | 0.6842 + 0.6771i | 0.6620 + 0.6763i | 0.6620 + 0.6763i |
| 17 | 0.6969 + 0.5874i | 0.6969 + 0.5874i | 0.6701 + 0.5868i | 0.6701 + 0.5868i | 0.6917 + 0.6826i | 0.6917 + 0.6826i | 0.6633 + 0.6909i | 0.6679 + 0.6719i |
| 17.5 | 0.7105 + 0.5831i | 0.7105 + 0.5831i | 0.6825 + 0.5824i | 0.6825 + 0.5824i | 0.6999 + 0.7005i | 0.7059 + 0.6818i | 0.6721 + 0.6991i | 0.6780 + 0.6793i |
| 18 | 0.7231 + 0.5776i | 0.7231 + 0.5776i | 0.6951 + 0.5766i | 0.6951 + 0.5766i | 0.7106 + 0.7122i | 0.7172 + 0.6953i | 0.6817 + 0.7109i | 0.6885 + 0.6928i |
| 18.5 | 0.6936 + 0.5549i | 0.6936 + 0.5549i | 0.6745 + 0.5607i | 0.6745 + 0.5607i | 0.7448 + 0.6967i | 0.7338 + 0.6742i | 0.7448 + 0.6967i | 0.7338 + 0.6742i |
| 19 | 0.7049 + 0.5452i | 0.7049 + 0.5452i | 0.7049 + 0.5452i | 0.7049 + 0.5452i | 0.7679 + 0.6989i | 0.7563 + 0.6729i | 0.7679 + 0.6989i | 0.7563 + 0.6729i |
| 19.5 | 0.7309 + 0.5392i | 0.7309 + 0.5392i | 0.7123 + 0.5455i | 0.7123 + 0.5455i | 0.7983 + 0.7050i | 0.7854 + 0.6754i | 0.7757 + 0.7137i | 0.7639 + 0.6838i |
| 20 | 0.7648 + 0.6193i | 0.7648 + 0.6193i | 0.7282 + 0.6105i | 0.7282 + 0.6105i | 0.7212 + 0.7993i | 0.7274 + 0.7651i | 0.6876 + 0.7938i | 0.6932 + 0.7604i |
| 20.5 | 0.7708 + 0.5641i | 0.7708 + 0.5641i | 0.7318 + 0.5689i | 0.7318 + 0.5689i | 0.7986 + 0.7490i | 0.7922 + 0.7061i | 0.7530 + 0.7531i | 0.7483 + 0.7113i |
| 21 | 0.7480 + 0.5637i | 0.7480 + 0.5637i | 0.7021 + 0.5632i | 0.7021 + 0.5632i | 0.7422 + 0.7346i | 0.7472 + 0.7039i | 0.6990 + 0.7343i | 0.7011 + 0.7006i |
| 21.5 | 0.7644 + 0.5865i | 0.7644 + 0.5865i | 0.7017 + 0.5836i | 0.7017 + 0.5836i | 0.7565 + 0.7484i | 0.7593 + 0.7277i | 0.6893 + 0.7521i | 0.6917 + 0.7266i |
| 22 | 0.7478 + 0.5605i | 0.7478 + 0.5605i | 0.6930 + 0.5581i | 0.6930 + 0.5581i | 0.7418 + 0.7491i | 0.7413 + 0.6938i | 0.6950 + 0.7561i | 0.6917 + 0.6959i |
| 22.5 | 0.7671 + 0.5696i | 0.7648 + 0.5926i | 0.6970 + 0.5663i | 0.6951 + 0.5891i | 0.7699 + 0.7757i | 0.7684 + 0.7133i | 0.6931 + 0.7729i | 0.6933 + 0.7088i |
| 23 | 0.7870 + 0.5451i | 0.7912 + 0.6039i | 0.7025 + 0.5494i | 0.7033 + 0.6027i | 0.7851 + 0.8112i | 0.7935 + 0.7088i | 0.6966 + 0.7929i | 0.7030 + 0.7082i |
| 23.5 | 0.7963 + 0.5341i | 0.7903 + 0.5944i | 0.7035 + 0.5353i | 0.7033 + 0.5871i | 0.7903 + 0.7972i | 0.7922 + 0.6992i | 0.6988 + 0.7924i | 0.7016 + 0.6975i |
| 24 | 0.7772 + 0.5242i | 0.7811 + 0.5804i | 0.6843 + 0.5275i | 0.6854 + 0.5855i | 0.7824 + 0.7742i | 0.7823 + 0.6813i | 0.6846 + 0.7745i | 0.6870 + 0.6835i |
| 24.5 | 0.7677 + 0.5362i | 0.7985 + 0.5994i | 0.6876 + 0.5405i | 0.6898 + 0.6182i | 0.7690 + 0.8026i | 0.8002 + 0.7097i | 0.6815 + 0.7942i | 0.6898 + 0.7018i |
| 25 | 0.7836 + 0.5649i | 0.7723 + 0.6495i | 0.6941 + 0.5537i | 0.6818 + 0.6387i | 0.7471 + 0.8318i | 0.7654 + 0.7459i | 0.6548 + 0.8214i | 0.6666 + 0.7271i |
| 25.5 | 0.8260 + 0.5243i | 0.8354 + 0.6026i | 0.7272 + 0.5323i | 0.7357 + 0.6102i | 0.8363 + 0.7982i | 0.8396 + 0.6938i | 0.7479 + 0.7978i | 0.7438 + 0.6972i |
| 26 | 0.7207 + 0.5888i | 0.8167 + 0.5761i | 0.6922 + 0.6311i | 0.8130 + 0.6488i | 0.7083 + 0.8179i | 0.8062 + 0.8263i | 0.7032 + 0.7252i | 0.8007 + 0.7286i |
| 26.5 | 0.7502 + 0.6146i | 0.8241 + 0.6346i | 0.6717 + 0.6243i | 0.8549 + 0.5585i | 0.7192 + 0.7846i | 0.8042 + 0.7367i | 0.6819 + 0.7074i | 0.8326 + 0.8445i |
| 27 | 0.8564 + 0.5757i | 0.8744 + 0.6584i | 0.7873 + 0.6025i | 0.7483 + 0.6489i | 0.7885 + 0.8284i | 0.8377 + 0.7472i | 0.7063 + 0.8058i | 0.7323 + 0.7227i |
| 27.5 | 0.8715 + 0.5878i | 0.8831 + 0.6759i | 0.8064 + 0.6168i | 0.7632 + 0.6612i | 0.8096 + 0.8448i | 0.8499 + 0.7616i | 0.7229 + 0.8172i | 0.7483 + 0.7350i |
| 28 | 0.8185 + 0.6598i | 0.8890 + 0.6878i | 0.7513 + 0.6619i | 0.6922 + 0.6583i | 0.7947 + 0.7648i | 0.8894 + 0.7813i | 0.7012 + 0.7888i | 0.6735 + 0.7261i |

| SNR/w | w64 | w65 | w66 | w67 | w68 | w69 | w70 | w71 |
|---|---|---|---|---|---|---|---|---|
| 7 | 1.8365 + 1.2473i | 1.2111 + 0.6836i | 2.1615 + 0.4280i | 1.3685 + 0.3795i | 1.2111 + 0.6836i | 1.1269 + 0.6205i | 1.3685 + 0.3795i | 1.2525 + 0.3664i |
| 7.5 | 1.7843 + 1.2148i | 1.5010 + 0.9781i | 2.1191 + 0.4071i | 1.7374 + 0.3777i | 1.1547 + 0.6858i | 1.1852 + 0.7101i | 1.3117 + 0.3337i | 1.3460 + 0.3393i |
| 8 | 2.0885 + 0.3978i | 1.7466 + 0.3528i | 1.5750 + 0.3367i | 1.5346 + 0.3328i | 1.7585 + 1.1911i | 1.4907 + 0.9885i | 1.3631 + 0.8851i | 1.3286 + 0.8566i |
| 8.5 | 2.0732 + 0.3944i | 1.7141 + 0.3348i | 1.6263 + 0.3252i | 1.5557 + 0.3149i | 1.7503 + 1.1771i | 1.4580 + 0.9699i | 1.3957 + 0.9225i | 1.3353 + 0.8771i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |

-continued

| | | | | | | | | |
|---|---|---|---|---|---|---|---|---|
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 1.5407 + 0.3365i | 1.4255 + 0.3224i | 1.5424 + 0.2759i | 1.4191 + 0.2826i | 1.3823 + 0.2915i | 1.3352 + 0.2806i | 1.3834 + 0.2624i | 1.3278 + 0.2554i |
| 11.5 | 1.5505 + 0.3455i | 1.4293 + 0.3268i | 1.5574 + 0.2658i | 1.4239 + 0.2730i | 1.3848 + 0.2966i | 1.3395 + 0.2921i | 1.3880 + 0.2554i | 1.3345 + 0.2523i |
| 12 | 1.5615 + 0.3581i | 1.4382 + 0.3463i | 1.5777 + 0.2407i | 1.4295 + 0.2590i | 1.3838 + 0.2941i | 1.3406 + 0.2949i | 1.3933 + 0.2286i | 1.3447 + 0.2356i |
| 12.5 | 1.6796 + 0.2609i | 1.6231 + 0.3777i | 1.4866 + 0.2567i | 1.4695 + 0.3056i | 1.3481 + 0.2491i | 1.3458 + 0.2730i | 1.3263 + 0.2454i | 1.3245 + 0.2658i |
| 13 | 0.4298 + 0.1206i | 0.4298 + 0.1206i | 0.4298 + 0.1206i | 0.4298 + 0.1206i | 0.4298 + 0.1206i | 0.4298 + 0.1206i | 0.4298 + 0.1206i | 0.4298 + 0.1206i |
| 13.5 | 1.7821 + 0.2022i | 1.7069 + 0.6226i | 1.6649 + 0.2207i | 1.6075 + 0.4960i | 1.5379 + 0.2267i | 1.4650 + 0.3647i | 1.5187 + 0.2429i | 1.4650 + 0.3647i |
| 14 | 1.5804 + 1.3865i | 2.1260 + 0.2205i | 1.8405 + 1.0633i | 2.0446 + 0.6571i | 1.6304 + 0.2123i | 1.7090 + 0.2082i | 1.6062 + 0.2504i | 1.6575 + 0.2608i |
| 14.5 | 1.6382 + 1.3165i | 2.0902 + 0.1960i | 1.8765 + 0.9757i | 2.0346 + 0.5849i | 1.6080 + 0.1998i | 1.6865 + 0.1947i | 1.5872 + 0.2316i | 1.6395 + 0.2404i |
| 15 | 1.8736 + 0.9301i | 2.1142 + 0.3056i | 1.3497 + 0.1188i | 1.3497 + 0.1188i | 1.7111 + 0.1507i | 1.7593 + 0.1621i | 1.4137 + 0.1224i | 1.4137 + 0.1224i |
| 15.5 | 1.6897 + 0.1409i | 1.7447 + 0.1440i | 1.4161 + 0.1190i | 1.4047 + 0.1209i | 1.9715 + 0.6222i | 2.0540 + 0.2400i | 1.3565 + 0.1259i | 1.3565 + 0.1259i |
| 16 | 1.6775 + 0.1331i | 1.6321 + 0.1195i | 1.3567 + 0.1125i | 1.3567 + 0.1125i | 1.9896 + 0.2026i | 1.9730 + 0.5695i | 1.3013 + 0.1147i | 1.3013 + 0.1147i |
| 16.5 | 1.4483 + 0.1058i | 1.5082 + 0.1076i | 1.2511 + 0.1063i | 1.2511 + 0.1063i | 2.0481 + 0.1978i | 1.7457 + 0.1177i | 1.1891 + 0.1088i | 1.1891 + 0.1088i |
| 17 | 1.4531 + 0.1045i | 1.5085 + 0.1072i | 1.2484 + 0.1046i | 1.2484 + 0.1046i | 2.0518 + 0.1917i | 1.7527 + 0.1170i | 1.1874 + 0.1093i | 1.1874 + 0.1093i |
| 17.5 | 1.4543 + 0.1049i | 1.5074 + 0.1080i | 1.2478 + 0.1028i | 1.2478 + 0.1028i | 2.0450 + 0.1840i | 1.7515 + 0.1165i | 1.1867 + 0.1106i | 1.1867 + 0.1106i |
| 18 | 1.4513 + 0.1053i | 1.5036 + 0.1079i | 1.2538 + 0.1005i | 1.2393 + 0.1002i | 2.0343 + 0.1812i | 1.7462 + 0.1147i | 1.1849 + 0.1124i | 1.1849 + 0.1124i |
| 18.5 | 1.4335 + 0.0772i | 1.3407 + 0.0725i | 1.1059 + 0.0808i | 1.1384 + 0.0788i | 1.6706 + 0.1002i | 1.9444 + 0.1347i | 1.0666 + 0.0829i | 1.0666 + 0.0829i |
| 19 | 1.4268 + 0.0758i | 1.3215 + 0.0692i | 1.0950 + 0.0758i | 1.1342 + 0.0740i | 1.6492 + 0.0990i | 1.9145 + 0.1300i | 1.0506 + 0.0781i | 1.0506 + 0.0781i |
| 19.5 | 1.4256 + 0.0701i | 1.2941 + 0.0652i | 1.0723 + 0.0704i | 1.1247 + 0.0692i | 1.6348 + 0.0961i | 1.8944 + 0.1321i | 1.0262 + 0.0737i | 1.0262 + 0.0737i |
| 20 | 1.9230 + 0.1724i | 1.4387 + 0.0640i | 1.2248 + 0.0751i | 1.2729 + 0.0732i | 1.6851 + 0.1131i | 1.4739 + 0.1668i | 1.2330 + 0.2173i | 1.2857 + 0.2110i |
| 20.5 | 1.4461 + 0.0954i | 1.3740 + 0.1022i | 1.2110 + 0.0728i | 1.2392 + 0.0857i | 1.6304 + 0.0979i | 1.8780 + 0.1229i | 1.1036 + 0.0880i | 1.1036 + 0.0880i |
| 21 | 1.3631 + 0.0520i | 1.8339 + 0.1330i | 1.1991 + 0.0634i | 1.1476 + 0.0664i | 1.4080 + 0.1199i | 1.6121 + 0.0933i | 1.2253 + 0.1727i | 1.1607 + 0.1854i |
| 21.5 | 1.6991 + 0.0948i | 1.9089 + 0.1361i | 1.1209 + 0.0616i | 1.1513 + 0.0504i | 1.5161 + 0.0821i | 1.3698 + 0.0855i | 1.1545 + 0.1540i | 1.2377 + 0.1156i |
| 22 | 1.3605 + 0.0520i | 1.8286 + 0.1178i | 1.2193 + 0.0642i | 1.1598 + 0.0644i | 1.4249 + 0.1170i | 1.6056 + 0.0877i | 1.2333 + 0.1806i | 1.1693 + 0.1944i |
| 22.5 | 1.6912 + 0.0798i | 1.4055 + 0.0597i | 1.1376 + 0.0545i | 1.2506 + 0.0551i | 1.5794 + 0.1910i | 1.4051 + 0.1749i | 1.1445 + 0.1725i | 1.2429 + 0.1635i |
| 23 | 1.7275 + 0.0857i | 1.4188 + 0.0423i | 1.1857 + 0.0607i | 1.2751 + 0.0595i | 1.5834 + 0.1747i | 1.4232 + 0.1559i | 1.1749 + 0.1749i | 1.2918 + 0.1822i |
| 23.5 | 1.4664 + 0.0626i | 1.6566 + 0.0991i | 1.3043 + 0.0474i | 1.1711 + 0.0454i | 1.4135 + 0.1717i | 1.5496 + 0.2588i | 1.2755 + 0.1587i | 1.1759 + 0.1394i |
| 24 | 1.5037 + 0.0710i | 1.3591 + 0.0502i | 1.1808 + 0.0443i | 1.2467 + 0.0983i | 1.5451 + 0.2150i | 1.7164 + 0.1072i | 1.3895 + 0.2257i | 1.2198 + 0.1964i |
| 24.5 | 1.5376 + 0.0755i | 1.7254 + 0.0875i | 1.3836 + 0.0522i | 1.2524 + 0.0657i | 1.5831 + 0.2354i | 1.4320 + 0.2269i | 1.1755 + 0.2097i | 1.2871 + 0.1867i |
| 25 | 1.5306 + 0.0744i | 1.6915 + 0.1083i | 1.3846 + 0.0555i | 1.2679 + 0.0610i | 1.4621 + 0.1953i | 1.3400 + 0.2355i | 1.1762 + 0.2323i | 1.2439 + 0.1711i |
| 25.5 | 1.5775 + 0.2201i | 1.6203 + 0.0729i | 1.1822 + 0.0559i | 1.2916 + 0.0458i | 1.4605 + 0.1876i | 1.4494 + 0.0655i | 1.1852 + 0.1643i | 1.3065 + 0.1507i |
| 26 | 1.4357 + 0.0696i | 1.5824 + 0.0779i | 1.3020 + 0.0505i | 1.1807 + 0.0541i | 1.3893 + 0.1877i | 1.2727 + 0.2084i | 1.1282 + 0.2339i | 1.1761 + 0.1587i |
| 26.5 | 1.4441 + 0.0577i | 1.5851 + 0.0770i | 1.3160 + 0.0502i | 1.2061 + 0.0559i | 1.4166 + 0.1663i | 1.3051 + 0.2007i | 1.1730 + 0.2374i | 1.2080 + 0.1543i |
| 27 | 1.4179 + 0.0644i | 1.5639 + 0.0718i | 1.2943 + 0.0443i | 1.1861 + 0.0531i | 1.4462 + 0.1886i | 1.3139 + 0.1830i | 1.5847 + 0.2617i | 1.2070 + 0.1573i |
| 27.5 | 1.4359 + 0.0589i | 1.5791 + 0.0680i | 1.3202 + 0.0508i | 1.2143 + 0.0516i | 1.4507 + 0.1735i | 1.3288 + 0.1906i | 1.5715 + 0.2387i | 1.2136 + 0.1561i |
| 28 | 1.3893 + 0.0618i | 1.5163 + 0.0570i | 1.2840 + 0.0506i | 1.1933 + 0.0574i | 1.4329 + 0.1769i | 1.3157 + 0.1870i | 1.5739 + 0.1994i | 1.2085 + 0.1678i |

| SNR/ w | w72 | w73 | w74 | w75 | w76 | w77 | w78 | w79 |
|---|---|---|---|---|---|---|---|---|
| 7 | 1.2111 + 0.6836i | 1.1269 + 0.6205i | 1.3685 + 0.3795i | 1.2525 + 0.3664i | 1.1269 + 0.6205i | 1.0807 + 0.5881i | 1.2525 + 0.3664i | 1.1912 + 0.3587i |

-continued

| | | | | | | | | |
|---|---|---|---|---|---|---|---|---|
| 7.5 | 1.1547 + 0.6858i | 1.1852 + 0.7101i | 1.3117 + 0.3337i | 1.3460 + 0.3393i | 1.0763 + 0.6220i | 1.0882 + 0.6314i | 1.2101 + 0.3241i | 1.2101 + 0.3241i |
| 8 | 1.2660 + 0.3053i | 1.2660 + 0.3053i | 1.2660 + 0.3053i | 1.2660 + 0.3053i | 1.1122 + 0.6781i | 1.1122 + 0.6781i | 1.1122 + 0.6781i | 1.1122 + 0.6781i |
| 8.5 | 1.1099 + 0.2755i | 1.1099 + 0.2755i | 1.1099 + 0.2755i | 1.1099 + 0.2755i | 0.9827 + 0.5890i | 0.9827 + 0.5890i | 0.9827 + 0.5890i | 0.9827 + 0.5890i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 1.3823 + 0.2915i | 1.3352 + 0.2806i | 1.3834 + 0.2624i | 1.3352 + 0.2806i | 1.3147 + 0.2720i | 1.2904 + 0.2600i | 1.3278 + 0.2554i | 1.2904 + 0.2600i |
| 11.5 | 1.3848 + 0.2966i | 1.3395 + 0.2921i | 1.3880 + 0.2554i | 1.3345 + 0.2523i | 1.3066 + 0.2759i | 1.3066 + 0.2759i | 1.3345 + 0.2523i | 1.2978 + 0.2447i |
| 12 | 1.3733 + 0.3193i | 1.3344 + 0.3196i | 1.3766 + 0.2535i | 1.3339 + 0.2600i | 1.3016 + 0.2902i | 1.3016 + 0.2902i | 1.3070 + 0.2383i | 1.3070 + 0.2383i |
| 12.5 | 1.3712 + 0.2039i | 1.3574 + 0.2268i | 1.3430 + 0.2021i | 1.3340 + 0.2218i | 1.2853 + 0.2129i | 1.2853 + 0.2129i | 1.2853 + 0.2129i | 1.2853 + 0.2129i |
| 13 | 0.4298 + 0.1206i | 0.4298 + 0.1206i | 0.4298 + 0.1206i | 0.4298 + 0.1206i | 0.4298 + 0.1206i | 0.4298 + 0.1206i | 0.4298 + 0.1206i | 0.4298 + 0.1206i |
| 13.5 | 1.2747 + 0.1449i | 1.2485 + 0.1724i | 1.2747 + 0.1449i | 1.2485 + 0.1724i | 1.2956 + 0.1735i | 1.2711 + 0.2104i | 1.2956 + 0.1735i | 1.2711 + 0.2104i |
| 14 | 1.2372 + 0.1421i | 1.2372 + 0.1421i | 1.2372 + 0.1421i | 1.2372 + 0.1421i | 1.3006 + 0.1843i | 1.3006 + 0.1843i | 1.3006 + 0.1843i | 1.3006 + 0.1843i |
| 14.5 | 1.2212 + 0.1365i | 1.2212 + 0.1365i | 1.2212 + 0.1365i | 1.2212 + 0.1365i | 1.2805 + 0.1825i | 1.2805 + 0.1825i | 1.2805 + 0.1825i | 1.2805 + 0.1825i |
| 15 | 1.0145 + 0.1170i | 1.0145 + 0.1170i | 1.0847 + 0.1181i | 1.0847 + 0.1181i | 1.0145 + 0.1170i | 1.0145 + 0.1170i | 1.0847 + 0.1181i | 1.0847 + 0.1181i |
| 15.5 | 1.0016 + 0.1116i | 1.0016 + 0.1116i | 1.0677 + 0.1135i | 1.0677 + 0.1135i | 1.0016 + 0.1116i | 1.0016 + 0.1116i | 1.0796 + 0.1116i | 1.0796 + 0.1116i |
| 16 | 0.9484 + 0.1042i | 0.9484 + 0.1042i | 1.0145 + 0.1061i | 1.0145 + 0.1061i | 0.9484 + 0.1042i | 0.9484 + 0.1042i | 1.0300 + 0.1036i | 1.0300 + 0.1036i |
| 16.5 | 0.9120 + 0.1119i | 0.9120 + 0.1119i | 0.9723 + 0.1111i | 0.9723 + 0.1111i | 0.9120 + 0.1119i | 0.9120 + 0.1119i | 0.9723 + 0.1111i | 0.9723 + 0.1111i |
| 17 | 0.9068 + 0.1115i | 0.9068 + 0.1115i | 0.9684 + 0.1102i | 0.9684 + 0.1102i | 0.9068 + 0.1115i | 0.9068 + 0.1115i | 0.9684 + 0.1102i | 0.9684 + 0.1102i |
| 17.5 | 0.9046 + 0.1109i | 0.9046 + 0.1109i | 0.9587 + 0.1031i | 0.9587 + 0.1031i | 0.9046 + 0.1109i | 0.9046 + 0.1109i | 0.9766 + 0.1146i | 0.9766 + 0.1146i |
| 18 | 0.9005 + 0.1000i | 0.9005 + 0.1000i | 0.9590 + 0.0977i | 0.9590 + 0.0977i | 0.9087 + 0.1213i | 0.9087 + 0.1213i | 0.9793 + 0.1171i | 0.9793 + 0.1171i |
| 18.5 | 0.7943 + 0.1008i | 0.7943 + 0.1008i | 0.8518 + 0.0927i | 0.8518 + 0.0927i | 0.7943 + 0.1008i | 0.7943 + 0.1008i | 0.8696 + 0.0989i | 0.8518 + 0.0927i |
| 19 | 0.7712 + 0.0834i | 0.7712 + 0.0834i | 0.8286 + 0.0797i | 0.8286 + 0.0797i | 0.7825 + 0.1088i | 0.7825 + 0.1088i | 0.8566 + 0.0950i | 0.8566 + 0.0950i |
| 19.5 | 0.7513 + 0.0751i | 0.7513 + 0.0751i | 0.8059 + 0.0713i | 0.8059 + 0.0713i | 0.7661 + 0.1128i | 0.7661 + 0.1128i | 0.8403 + 0.0944i | 0.8403 + 0.0944i |
| 20 | 0.9936 + 0.0741i | 0.9936 + 0.0741i | 1.0658 + 0.0746i | 1.0658 + 0.0746i | 0.9872 + 0.2147i | 0.9872 + 0.2147i | 1.0768 + 0.2182i | 1.0565 + 0.2169i |
| 20.5 | 0.8402 + 0.0679i | 0.8402 + 0.0679i | 0.8803 + 0.0565i | 0.8803 + 0.0565i | 0.8610 + 0.1536i | 0.8610 + 0.1536i | 0.9491 + 0.1152i | 0.9491 + 0.1152i |
| 21 | 0.8976 + 0.0632i | 0.8976 + 0.0632i | 0.9963 + 0.0649i | 1.0165 + 0.0658i | 0.8957 + 0.1794i | 0.8957 + 0.1794i | 0.9955 + 0.1822i | 1.0207 + 0.1845i |
| 21.5 | 0.8981 + 0.0684i | 0.8981 + 0.0684i | 0.9890 + 0.0680i | 0.9749 + 0.0663i | 0.9033 + 0.2029i | 0.9033 + 0.2029i | 1.0095 + 0.1899i | 0.9885 + 0.1918i |
| 22 | 0.9042 + 0.0625i | 0.9042 + 0.0625i | 1.0170 + 0.0646i | 1.0368 + 0.0643i | 0.9022 + 0.1856i | 0.9022 + 0.1856i | 1.0172 + 0.1896i | 1.0422 + 0.1915i |
| 22.5 | 0.8885 + 0.0624i | 0.8885 + 0.0624i | 1.0235 + 0.0603i | 0.9860 + 0.0649i | 0.8899 + 0.1872i | 0.8899 + 0.1872i | 1.0287 + 0.1810i | 0.9915 + 0.1807i |
| 23 | 0.8931 + 0.0565i | 0.8931 + 0.0565i | 1.0522 + 0.0581i | 1.0206 + 0.0501i | 0.8908 + 0.1680i | 0.8908 + 0.1680i | 1.0456 + 0.1748i | 1.0122 + 0.1779i |
| 23.5 | 0.9003 + 0.0604i | 0.9003 + 0.0604i | 1.0088 + 0.0553i | 1.0449 + 0.0537i | 0.9091 + 0.1794i | 0.9091 + 0.1794i | 1.0295 + 0.1733i | 1.0590 + 0.1616i |
| 24 | 0.9256 + 0.0605i | 0.9256 + 0.0605i | 1.0609 + 0.0650i | 1.0478 + 0.0699i | 0.9252 + 0.1819i | 0.9088 + 0.1757i | 1.0378 + 0.1928i | 1.0895 + 0.1956i |
| 24.5 | 0.9591 + 0.0547i | 0.9357 + 0.0599i | 1.0686 + 0.0690i | 1.1345 + 0.0491i | 0.9170 + 0.1776i | 0.9298 + 0.1782i | 1.0723 + 0.1843i | 1.0268 + 0.2010i |
| 25 | 0.9630 + 0.0520i | 0.9218 + 0.0598i | 1.0488 + 0.0488i | 1.1469 + 0.0461i | 0.9571 + 0.1742i | 0.9240 + 0.1503i | 1.0655 + 0.1717i | 1.1358 + 0.1228i |
| 25.5 | 0.8699 + 0.0500i | 0.9203 + 0.0513i | 1.0902 + 0.0567i | 1.0070 + 0.0499i | 0.8680 + 0.1530i | 0.9206 + 0.1491i | 1.0838 + 0.1610i | 1.0009 + 0.1570i |
| 26 | 0.9159 + 0.0417i | 0.9301 + 0.0926i | 1.0176 + 0.0319i | 1.0715 + 0.0679i | 0.9294 + 0.2082i | 0.9297 + 0.1559i | 1.0424 + 0.2248i | 1.0467 + 0.1461i |
| 26.5 | 0.9403 + 0.0431i | 0.9115 + 0.0762i | 1.0176 + 0.0326i | 1.1072 + 0.0445i | 0.9539 + 0.2438i | 0.9401 + 0.1658i | 1.0737 + 0.2562i | 1.0556 + 0.1522i |

-continued

| | | | | | | | | |
|---|---|---|---|---|---|---|---|---|
| 27 | 0.9113 + 0.0415i | 0.8658 + 0.0784i | 0.9957 + 0.0565i | 1.0840 + 0.0474i | 0.9122 + 0.1735i | 0.8662 + 0.1446i | 1.0072 + 0.1528i | 1.1002 + 0.1441i |
| 27.5 | 0.9440 + 0.0418i | 0.8706 + 0.0464i | 1.0192 + 0.0503i | 1.1107 + 0.0449i | 0.9170 + 0.1714i | 0.8778 + 0.1234i | 1.0092 + 0.1421i | 1.1104 + 0.1311i |
| 28 | 0.8988 + 0.0380i | 0.9745 + 0.0468i | 1.0860 + 0.0321i | 1.0493 + 0.0829i | 0.9289 + 0.1655i | 0.8389 + 0.2190i | 1.0132 + 0.1785i | 1.1095 + 0.1470i |

| SNR/w | w80 | w81 | w82 | w83 | w84 | w85 | w86 | w87 |
|---|---|---|---|---|---|---|---|---|
| 7 | 1.2111 + 0.6836i | 1.1269 + 0.6205i | 1.3685 + 0.3795i | 1.2525 + 0.3664i | 1.1269 + 0.6205i | 1.0807 + 0.5881i | 1.2525 + 0.3664i | 1.1912 + 0.3587i |
| 7.5 | 1.1547 + 0.6858i | 1.1852 + 0.7101i | 1.3117 + 0.3337i | 1.3460 + 0.3393i | 1.0763 + 0.6220i | 1.0763 + 0.6220i | 1.2101 + 0.3241i | 1.2101 + 0.3241i |
| 8 | 1.2660 + 0.3053i | 1.2660 + 0.3053i | 1.2660 + 0.3053i | 1.2660 + 0.3053i | 1.1122 + 0.6781i | 1.1122 + 0.6781i | 1.1122 + 0.6781i | 1.1122 + 0.6781i |
| 8.5 | 1.3421 + 0.2955i | 1.3421 + 0.2955i | 1.3421 + 0.2955i | 1.3421 + 0.2955i | 1.1699 + 0.7434i | 1.1699 + 0.7434i | 1.1699 + 0.7434i | 1.1699 + 0.7434i |
| 9 | 0.5708 + 0.2334i | 0.5708 + 0.2334i | 0.5708 + 0.2334i | 0.5708 + 0.2334i | 0.5708 + 0.2334i | 0.5708 + 0.2334i | 0.5708 + 0.2334i | 0.5708 + 0.2334i |
| 9.5 | 0.6013 + 0.2261i | 0.6013 + 0.2261i | 0.6013 + 0.2261i | 0.6013 + 0.2261i | 0.6013 + 0.2261i | 0.6013 + 0.2261i | 0.6013 + 0.2261i | 0.6013 + 0.2261i |
| 10 | 0.6259 + 0.2172i | 0.6259 + 0.2172i | 0.6259 + 0.2172i | 0.6259 + 0.2172i | 0.6259 + 0.2172i | 0.6259 + 0.2172i | 0.6259 + 0.2172i | 0.6259 + 0.2172i |
| 10.5 | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i |
| 11 | 1.1604 + 0.7831i | 1.1959 + 0.8017i | 1.1467 + 0.8044i | 1.1797 + 0.8257i | 1.1335 + 0.7681i | 1.1604 + 0.7831i | 1.1335 + 0.7681i | 1.1467 + 0.8044i |
| 11.5 | 1.1686 + 0.7844i | 1.2056 + 0.8024i | 1.1407 + 0.8086i | 1.1823 + 0.8348i | 1.1400 + 0.7694i | 1.1686 + 0.7844i | 1.1407 + 0.8086i | 1.1407 + 0.8086i |
| 12 | 1.1697 + 0.7849i | 1.2122 + 0.7997i | 1.1329 + 0.8240i | 1.1781 + 0.8474i | 1.1397 + 0.7686i | 1.1697 + 0.7849i | 1.1329 + 0.8240i | 1.1329 + 0.8240i |
| 12.5 | 1.2313 + 0.7226i | 1.3069 + 0.7502i | 1.2313 + 0.7226i | 1.3069 + 0.7502i | 1.1708 + 0.6384i | 1.2017 + 0.6448i | 1.1708 + 0.6384i | 1.2017 + 0.6448i |
| 13 | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i |
| 13.5 | 1.1992 + 0.7044i | 1.3555 + 0.7570i | 1.1832 + 0.6735i | 1.3044 + 0.7014i | 1.1698 + 0.5970i | 1.2444 + 0.5981i | 1.1698 + 0.5970i | 1.2444 + 0.5981i |
| 14 | 1.3895 + 0.9370i | 1.3266 + 0.8316i | 1.4268 + 0.9110i | 1.3266 + 0.8316i | 1.4740 + 0.5832i | 1.4740 + 0.5832i | 1.5083 + 0.5866i | 1.5083 + 0.5866i |
| 14.5 | 1.4191 + 0.9375i | 1.3416 + 0.8265i | 1.4455 + 0.8881i | 1.3416 + 0.8265i | 1.4809 + 0.5569i | 1.4809 + 0.5569i | 1.5092 + 0.5616i | 1.5092 + 0.5616i |
| 15 | 1.6166 + 0.6733i | 1.5327 + 0.5881i | 1.3344 + 0.4056i | 1.3372 + 0.4255i | 1.6400 + 0.4397i | 1.6400 + 0.4397i | 1.3800 + 0.3572i | 1.3800 + 0.3572i |
| 15.5 | 1.4949 + 0.5621i | 1.4771 + 0.5677i | 1.3463 + 0.3922i | 1.3447 + 0.4029i | 1.6403 + 0.5309i | 1.5852 + 0.5183i | 1.3431 + 0.3554i | 1.3431 + 0.3554i |
| 16 | 1.4894 + 0.4824i | 1.5041 + 0.5324i | 1.3069 + 0.3665i | 1.3069 + 0.3665i | 1.5903 + 0.4644i | 1.6566 + 0.5241i | 1.2875 + 0.3247i | 1.2875 + 0.3247i |
| 16.5 | 1.4385 + 0.3455i | 1.4852 + 0.3323i | 1.2393 + 0.3381i | 1.2393 + 0.3381i | 1.8518 + 0.4951i | 1.6966 + 0.3427i | 1.1870 + 0.3055i | 1.1870 + 0.3055i |
| 17 | 1.4458 + 0.3440i | 1.4918 + 0.3307i | 1.2352 + 0.3414i | 1.2352 + 0.3414i | 1.8705 + 0.5044i | 1.7104 + 0.3345i | 1.1851 + 0.3028i | 1.1851 + 0.3028i |
| 17.5 | 1.4472 + 0.3429i | 1.4936 + 0.3303i | 1.2319 + 0.3447i | 1.2319 + 0.3447i | 1.8868 + 0.5097i | 1.7156 + 0.3328i | 1.1839 + 0.2997i | 1.1839 + 0.2997i |
| 18 | 1.4449 + 0.3401i | 1.4915 + 0.3280i | 1.2294 + 0.3473i | 1.2294 + 0.3473i | 1.8862 + 0.5096i | 1.7134 + 0.3314i | 1.1821 + 0.2956i | 1.1821 + 0.2956i |
| 18.5 | 1.4077 + 0.2179i | 1.3384 + 0.2148i | 1.1187 + 0.2595i | 1.1404 + 0.2530i | 1.6531 + 0.2935i | 1.9314 + 0.4196i | 1.0809 + 0.2390i | 1.0809 + 0.2390i |
| 19 | 1.3931 + 0.2132i | 1.3188 + 0.2086i | 1.1044 + 0.2532i | 1.1283 + 0.2456i | 1.6349 + 0.2879i | 1.9151 + 0.4067i | 1.0632 + 0.2197i | 1.0632 + 0.2197i |
| 19.5 | 1.3981 + 0.2090i | 1.2948 + 0.1953i | 1.0785 + 0.2426i | 1.1091 + 0.2350i | 1.5971 + 0.2809i | 1.8304 + 0.3832i | 1.0382 + 0.2045i | 1.0382 + 0.2045i |
| 20 | 1.7815 + 0.4751i | 1.4947 + 0.5250i | 1.2330 + 0.5211i | 1.2924 + 0.5254i | 1.6486 + 0.3169i | 1.4854 + 0.3471i | 1.2402 + 0.3648i | 1.3024 + 0.3616i |
| 20.5 | 1.4528 + 0.2817i | 1.3601 + 0.2817i | 1.1691 + 0.3120i | 1.2009 + 0.2917i | 1.6350 + 0.2881i | 1.8444 + 0.4201i | 1.1109 + 0.2285i | 1.1109 + 0.2285i |
| 21 | 1.9010 + 0.4585i | 1.6938 + 0.3559i | 1.2752 + 0.4149i | 1.1803 + 0.4240i | 1.4242 + 0.2749i | 1.5512 + 0.2768i | 1.2791 + 0.3004i | 1.1734 + 0.3075i |
| 21.5 | 1.5210 + 0.4295i | 1.3922 + 0.3763i | 1.2275 + 0.4595i | 1.2578 + 0.4012i | 1.5387 + 0.2494i | 1.3855 + 0.2443i | 1.1759 + 0.2690i | 1.2344 + 0.2704i |
| 22 | 1.8348 + 0.3993i | 1.5329 + 0.3997i | 1.3013 + 0.4349i | 1.1899 + 0.4442i | 1.4158 + 0.2489i | 1.5984 + 0.2593i | 1.2925 + 0.3015i | 1.1810 + 0.3192i |
| 22.5 | 1.5888 + 0.4053i | 1.4083 + 0.4183i | 1.1560 + 0.4261i | 1.2651 + 0.4195i | 1.8004 + 0.3093i | 1.3843 + 0.2805i | 1.1504 + 0.2971i | 1.2457 + 0.2926i |
| 23 | 1.6211 + 0.3847i | 1.4209 + 0.4485i | 1.1797 + 0.4135i | 1.2791 + 0.4462i | 1.7497 + 0.3033i | 1.4218 + 0.3117i | 1.1757 + 0.2963i | 1.2821 + 0.2953i |
| 23.5 | 1.3219 + 0.5378i | 1.3808 + 0.4436i | 1.1930 + 0.4695i | 1.2166 + 0.4068i | 1.7837 + 0.3062i | 1.3978 + 0.3365i | 1.2218 + 0.2650i | 1.2151 + 0.3021i |

-continued

| | | | | | | | | |
|---|---|---|---|---|---|---|---|---|
| 24 | 1.4544 + 0.5247i | 1.2839 + 0.5031i | 1.3919 + 0.3970i | 1.2020 + 0.4350i | 1.5721 + 0.3834i | 1.7484 + 0.3285i | 1.3331 + 0.3099i | 1.2153 + 0.3093i |
| 24.5 | 1.2528 + 0.5442i | 1.3771 + 0.4900i | 1.1779 + 0.4401i | 1.2795 + 0.4047i | 1.7543 + 0.3201i | 1.4294 + 0.3521i | 1.1682 + 0.3125i | 1.2881 + 0.3079i |
| 25 | 1.2983 + 0.5282i | 1.4160 + 0.4599i | 1.1643 + 0.5224i | 1.1475 + 0.4397i | 1.5155 + 0.3070i | 1.3432 + 0.3541i | 1.1465 + 0.2989i | 1.2191 + 0.3646i |
| 25.5 | 1.2159 + 0.4133i | 1.5064 + 0.3808i | 1.1497 + 0.3852i | 1.3705 + 0.3603i | 1.7393 + 0.2807i | 1.6490 + 0.4561i | 1.1846 + 0.2701i | 1.3033 + 0.2639i |
| 26 | 1.2978 + 0.5029i | 1.3930 + 0.4106i | 1.1805 + 0.5049i | 1.1527 + 0.4078i | 1.6859 + 0.2482i | 1.3072 + 0.3236i | 1.5221 + 0.2723i | 1.1975 + 0.3375i |
| 26.5 | 1.4481 + 0.5040i | 1.3937 + 0.4028i | 1.1626 + 0.4656i | 1.2689 + 0.4386i | 1.6732 + 0.2462i | 1.3551 + 0.3008i | 1.5213 + 0.2743i | 1.2473 + 0.3399i |
| 27 | 1.3902 + 0.4354i | 1.2902 + 0.3800i | 1.1890 + 0.4695i | 1.1811 + 0.3714i | 1.4284 + 0.3107i | 1.2970 + 0.2793i | 1.0892 + 0.2786i | 1.1782 + 0.2634i |
| 27.5 | 1.3263 + 0.4151i | 1.4095 + 0.3204i | 1.2199 + 0.4281i | 1.1604 + 0.3543i | 1.5775 + 0.4006i | 1.2854 + 0.2866i | 1.0929 + 0.2569i | 1.1834 + 0.2541i |
| 28 | 1.3867 + 0.4311i | 1.4607 + 0.3299i | 1.2745 + 0.4347i | 1.1818 + 0.3938i | 1.6162 + 0.3509i | 1.3455 + 0.2946i | 1.1478 + 0.2771i | 1.2386 + 0.2982i |

| SNR/w | w88 | w89 | w90 | w91 | w92 | w93 | w94 | w95 |
|---|---|---|---|---|---|---|---|---|
| 7 | 1.1269 + 0.6205i | 1.0807 + 0.5881i | 1.2525 + 0.3664i | 1.1912 + 0.3587i | 1.0807 + 0.5881i | 1.0452 + 0.5641i | 1.1912 + 0.3587i | 1.1450 + 0.3528i |
| 7.5 | 1.0763 + 0.6220i | 1.0763 + 0.6220i | 1.2101 + 0.3241i | 1.2101 + 0.3241i | 1.0274 + 0.5831i | 1.0274 + 0.5831i | 1.1457 + 0.3170i | 1.1457 + 0.3170i |
| 8 | 1.1569 + 0.2955i | 1.1569 + 0.2955i | 1.1569 + 0.2955i | 1.1569 + 0.2955i | 1.0261 + 0.6066i | 1.0261 + 0.6066i | 1.0261 + 0.6066i | 1.0261 + 0.6066i |
| 8.5 | 1.1099 + 0.2755i | 1.1099 + 0.2755i | 1.1099 + 0.2755i | 1.1099 + 0.2755i | 0.9827 + 0.5890i | 0.9827 + 0.5890i | 0.9827 + 0.5890i | 0.9827 + 0.5890i |
| 9 | 0.5708 + 0.2334i | 0.5708 + 0.2334i | 0.5708 + 0.2334i | 0.5708 + 0.2334i | 0.5708 + 0.2334i | 0.5708 + 0.2334i | 0.5708 + 0.2334i | 0.5708 + 0.2334i |
| 9.5 | 0.6013 + 0.2261i | 0.6013 + 0.2261i | 0.6013 + 0.2261i | 0.6013 + 0.2261i | 0.6013 + 0.2261i | 0.6013 + 0.2261i | 0.6013 + 0.2261i | 0.6013 + 0.2261i |
| 10 | 0.6259 + 0.2172i | 0.6259 + 0.2172i | 0.6259 + 0.2172i | 0.6259 + 0.2172i | 0.6259 + 0.2172i | 0.6259 + 0.2172i | 0.6259 + 0.2172i | 0.6259 + 0.2172i |
| 10.5 | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i |
| 11 | 1.1162 + 0.7425i | 1.1335 + 0.7681i | 1.1162 + 0.7425i | 1.1335 + 0.7681i | 1.1162 + 0.7425i | 1.1162 + 0.7425i | 1.0969 + 0.7444i | 1.1162 + 0.7425i |
| 11.5 | 1.1344 + 0.7387i | 1.1344 + 0.7387i | 1.1094 + 0.7540i | 1.1400 + 0.7694i | 1.1344 + 0.7387i | 1.1344 + 0.7387i | 1.1094 + 0.7540i | 1.1344 + 0.7387i |
| 12 | 1.1393 + 0.7213i | 1.1700 + 0.7305i | 1.1113 + 0.7527i | 1.1397 + 0.7686i | 1.1393 + 0.7213i | 1.1393 + 0.7213i | 1.1113 + 0.7527i | 1.1113 + 0.7527i |
| 12.5 | 1.1331 + 0.7163i | 1.1603 + 0.7237i | 1.1464 + 0.7012i | 1.1764 + 0.7112i | 1.1226 + 0.6493i | 1.1226 + 0.6493i | 1.1335 + 0.6333i | 1.1335 + 0.6333i |
| 13 | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i |
| 13.5 | 1.0884 + 0.6773i | 1.1194 + 0.6718i | 1.0884 + 0.6773i | 1.1194 + 0.6718i | 1.0988 + 0.5976i | 1.1314 + 0.5794i | 1.0988 + 0.5976i | 1.1314 + 0.5794i |
| 14 | 1.1382 + 0.6389i | 1.1382 + 0.6389i | 1.1382 + 0.6389i | 1.1382 + 0.6389i | 1.2255 + 0.5065i | 1.2255 + 0.5065i | 1.2255 + 0.5065i | 1.2255 + 0.5065i |
| 14.5 | 1.1302 + 0.6266i | 1.1336 + 0.6433i | 1.1302 + 0.6266i | 1.1302 + 0.6266i | 1.2166 + 0.4913i | 1.2166 + 0.4913i | 1.2166 + 0.4913i | 1.2166 + 0.4913i |
| 15 | 1.0121 + 0.3496i | 1.0121 + 0.3496i | 1.0742 + 0.3535i | 1.0742 + 0.3535i | 1.0077 + 0.3323i | 1.0121 + 0.3496i | 1.0679 + 0.3346i | 1.0742 + 0.3535i |
| 15.5 | 1.0001 + 0.3453i | 1.0001 + 0.3453i | 1.0651 + 0.3506i | 1.0651 + 0.3506i | 1.0001 + 0.3324i | 1.0001 + 0.3324i | 1.0654 + 0.3327i | 1.0654 + 0.3327i |
| 16 | 0.9502 + 0.3185i | 0.9502 + 0.3185i | 1.0160 + 0.3216i | 1.0160 + 0.3216i | 0.9532 + 0.3048i | 0.9532 + 0.3048i | 1.0227 + 0.3047i | 1.0227 + 0.3047i |
| 16.5 | 0.9218 + 0.3707i | 0.9218 + 0.3707i | 0.9838 + 0.3658i | 0.9838 + 0.3658i | 0.9232 + 0.3415i | 0.9232 + 0.3415i | 0.9856 + 0.3333i | 0.9856 + 0.3333i |
| 17 | 0.9164 + 0.3736i | 0.9164 + 0.3736i | 0.9815 + 0.3696i | 0.9815 + 0.3696i | 0.9180 + 0.3375i | 0.9180 + 0.3375i | 0.9849 + 0.3298i | 0.9849 + 0.3298i |
| 17.5 | 0.9142 + 0.3769i | 0.9142 + 0.3769i | 0.9815 + 0.3740i | 0.9815 + 0.3740i | 0.9156 + 0.3305i | 0.9156 + 0.3305i | 0.9860 + 0.3236i | 0.9860 + 0.3236i |
| 18 | 0.9141 + 0.3832i | 0.9141 + 0.3832i | 0.9843 + 0.3807i | 0.9843 + 0.3807i | 0.9151 + 0.3225i | 0.9151 + 0.3225i | 0.9886 + 0.3165i | 0.9886 + 0.3165i |
| 18.5 | 0.8242 + 0.3278i | 0.8242 + 0.3278i | 0.8872 + 0.3145i | 0.8872 + 0.3145i | 0.8214 + 0.2859i | 0.8214 + 0.2859i | 0.8935 + 0.2752i | 0.8935 + 0.2752i |
| 19 | 0.8215 + 0.3242i | 0.8215 + 0.3242i | 0.8868 + 0.3103i | 0.8868 + 0.3103i | 0.8108 + 0.2681i | 0.8108 + 0.2681i | 0.8869 + 0.2553i | 0.8869 + 0.2553i |
| 19.5 | 0.8200 + 0.3300i | 0.8200 + 0.3300i | 0.8835 + 0.3126i | 0.8835 + 0.3126i | 0.7990 + 0.2581i | 0.7990 + 0.2581i | 0.8734 + 0.2424i | 0.8734 + 0.2424i |
| 20 | 0.9529 + 0.5004i | 0.9529 + 0.5004i | 1.0693 + 0.5130i | 1.0495 + 0.5116i | 0.9736 + 0.3595i | 0.9736 + 0.3595i | 1.0786 + 0.3657i | 1.0560 + 0.3643i |
| 20.5 | 0.8941 + 0.3936i | 0.8941 + 0.3936i | 0.9867 + 0.3771i | 0.9867 + 0.3771i | 0.8765 + 0.2771i | 0.8765 + 0.2771i | 0.9717 + 0.2599i | 0.9717 + 0.2599i |

-continued

| | | | | | | | | |
|---|---|---|---|---|---|---|---|---|
| 21 | 0.8921 + 0.4264i | 0.8921 + 0.4264i | 0.9966 + 0.4266i | 1.0364 + 0.4264i | 0.8935 + 0.3049i | 0.8935 + 0.3049i | 0.9947 + 0.3071i | 1.0286 + 0.3083i |
| 21.5 | 0.9111 + 0.4525i | 0.9111 + 0.4525i | 1.0760 + 0.4526i | 1.0560 + 0.4480i | 0.9102 + 0.3318i | 0.9102 + 0.3318i | 1.0507 + 0.3110i | 1.0342 + 0.3202i |
| 22 | 0.8945 + 0.4361i | 0.8945 + 0.4361i | 1.0147 + 0.4454i | 1.0566 + 0.4440i | 0.8991 + 0.3102i | 0.8991 + 0.3102i | 1.0146 + 0.3155i | 1.0502 + 0.3176i |
| 22.5 | 0.8928 + 0.4472i | 0.8928 + 0.4472i | 1.0333 + 0.4413i | 0.9986 + 0.4359i | 0.8913 + 0.3120i | 0.8913 + 0.3120i | 1.0329 + 0.3081i | 0.9965 + 0.3137i |
| 23 | 0.9063 + 0.4225i | 0.9063 + 0.4225i | 1.0477 + 0.4197i | 1.0225 + 0.4080i | 0.8923 + 0.2934i | 0.8923 + 0.2934i | 1.0507 + 0.2866i | 1.0098 + 0.2870i |
| 23.5 | 0.9127 + 0.4335i | 0.9265 + 0.4155i | 1.0590 + 0.4526i | 1.0475 + 0.4190i | 0.9208 + 0.2970i | 0.9208 + 0.2970i | 1.0587 + 0.2866i | 1.0664 + 0.3012i |
| 24 | 0.8972 + 0.4131i | 0.8745 + 0.3937i | 1.0109 + 0.4143i | 1.0972 + 0.4234i | 0.9184 + 0.2920i | 0.8887 + 0.2934i | 1.0221 + 0.3073i | 1.1006 + 0.3080i |
| 24.5 | 0.8620 + 0.4205i | 0.8885 + 0.4188i | 1.0696 + 0.4404i | 0.9798 + 0.4306i | 0.8874 + 0.2941i | 0.9092 + 0.3033i | 1.0686 + 0.3238i | 1.0059 + 0.3162i |
| 25 | 0.9102 + 0.5075i | 0.9170 + 0.4303i | 1.0241 + 0.5303i | 1.0328 + 0.4412i | 0.9443 + 0.2680i | 0.9308 + 0.3404i | 1.0467 + 0.2771i | 1.0251 + 0.3580i |
| 25.5 | 0.9146 + 0.4349i | 0.9045 + 0.3595i | 1.0466 + 0.3967i | 0.9891 + 0.3453i | 0.8628 + 0.2351i | 0.8976 + 0.2659i | 1.0804 + 0.2637i | 0.9941 + 0.2617i |
| 26 | 1.0272 + 0.4905i | 1.0257 + 0.4280i | 0.9434 + 0.4788i | 0.9114 + 0.4552i | 0.9236 + 0.2785i | 0.8965 + 0.3421i | 1.0143 + 0.3002i | 0.9068 + 0.3854i |
| 26.5 | 0.9902 + 0.3600i | 0.9588 + 0.3951i | 1.0628 + 0.4448i | 0.9496 + 0.4697i | 0.8975 + 0.2987i | 0.8675 + 0.3774i | 1.1092 + 0.3451i | 0.8734 + 0.4346i |
| 27 | 1.0478 + 0.5049i | 1.0616 + 0.4245i | 0.9563 + 0.4822i | 0.9741 + 0.4130i | 0.9128 + 0.2490i | 0.9100 + 0.3284i | 1.0094 + 0.2429i | 0.9848 + 0.3374i |
| 27.5 | 1.0559 + 0.4504i | 1.0285 + 0.3785i | 0.9708 + 0.5009i | 0.9399 + 0.4335i | 0.9282 + 0.2534i | 0.9606 + 0.3233i | 1.0203 + 0.2262i | 0.9167 + 0.3776i |
| 28 | 0.9950 + 0.4764i | 0.9740 + 0.4084i | 0.9094 + 0.5124i | 0.9401 + 0.5713i | 1.0045 + 0.2913i | 1.0508 + 0.3677i | 1.0666 + 0.2494i | 0.8323 + 0.4476i |

| SNR/w | w96 | w97 | w98 | w99 | w100 | w101 | w102 | w103 |
|---|---|---|---|---|---|---|---|---|
| 7 | 1.2111 + 0.6836i | 1.1269 + 0.6205i | 1.3685 + 0.3795i | 1.2525 + 0.3664i | 1.1269 + 0.6205i | 1.0807 + 0.5881i | 1.2525 + 0.3664i | 1.1912 + 0.3587i |
| 7.5 | 1.1547 + 0.6858i | 1.1852 + 0.7101i | 1.3117 + 0.3337i | 1.3460 + 0.3393i | 1.0763 + 0.6220i | 1.0763 + 0.6220i | 1.2101 + 0.3241i | 1.2101 + 0.3241i |
| 8 | 1.2660 + 0.3053i | 1.2660 + 0.3053i | 1.2660 + 0.3053i | 1.2660 + 0.3053i | 1.1122 + 0.6781i | 1.1122 + 0.6781i | 1.1122 + 0.6781i | 1.1122 + 0.6781i |
| 8.5 | 1.3421 + 0.2955i | 1.3421 + 0.2955i | 1.3421 + 0.2955i | 1.3421 + 0.2955i | 1.1699 + 0.7434i | 1.1699 + 0.7434i | 1.1699 + 0.7434i | 1.1699 + 0.7434i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 0.9711 + 0.2223i | 0.9711 + 0.2223i | 0.9711 + 0.2223i | 0.9711 + 0.2223i | 0.9711 + 0.2223i | 0.9711 + 0.2223i | 0.9711 + 0.2223i | 0.9711 + 0.2223i |
| 11.5 | 0.9636 + 0.2130i | 0.9636 + 0.2130i | 0.9636 + 0.2130i | 0.9636 + 0.2130i | 0.9636 + 0.2130i | 0.9636 + 0.2130i | 0.9636 + 0.2130i | 0.9792 + 0.2085i |
| 12 | 0.9592 + 0.2058i | 0.9592 + 0.2058i | 0.9592 + 0.2058i | 0.9592 + 0.2058i | 0.9592 + 0.2058i | 0.9592 + 0.2058i | 0.9592 + 0.2058i | 0.9780 + 0.2025i |
| 12.5 | 0.9033 + 0.1775i | 0.9033 + 0.1775i | 0.9033 + 0.1775i | 0.9033 + 0.1775i | 0.9260 + 0.1773i | 0.9260 + 0.1773i | 0.9260 + 0.1773i | 0.9260 + 0.1773i |
| 13 | 0.4057 + 0.1622i | 0.4057 + 0.1622i | 0.4057 + 0.1622i | 0.4057 + 0.1622i | 0.4057 + 0.1622i | 0.4057 + 0.1622i | 0.4057 + 0.1622i | 0.4057 + 0.1622i |
| 13.5 | 0.8721 + 0.1617i | 0.8721 + 0.1617i | 0.8721 + 0.1617i | 0.8721 + 0.1617i | 0.8721 + 0.1617i | 0.8721 + 0.1617i | 0.8721 + 0.1617i | 0.8721 + 0.1617i |
| 14 | 0.8530 + 0.1539i | 0.8530 + 0.1539i | 0.8530 + 0.1539i | 0.8530 + 0.1539i | 0.8530 + 0.1539i | 0.8530 + 0.1539i | 0.8530 + 0.1539i | 0.8530 + 0.1539i |
| 14.5 | 0.8411 + 0.1470i | 0.8411 + 0.1470i | 0.8411 + 0.1470i | 0.8411 + 0.1470i | 0.8411 + 0.1470i | 0.8411 + 0.1470i | 0.8411 + 0.1470i | 0.8411 + 0.1470i |
| 15 | 0.6390 + 0.1131i | 0.6390 + 0.1131i | 0.6390 + 0.1131i | 0.6390 + 0.1131i | 0.6390 + 0.1131i | 0.6390 + 0.1131i | 0.6390 + 0.1131i | 0.6390 + 0.1131i |
| 15.5 | 0.6324 + 0.1096i | 0.6324 + 0.1096i | 0.6222 + 0.1093i | 0.6222 + 0.1093i | 0.6324 + 0.1096i | 0.6324 + 0.1096i | 0.6222 + 0.1093i | 0.6222 + 0.1093i |
| 16 | 0.5915 + 0.1102i | 0.5915 + 0.1102i | 0.5812 + 0.1101i | 0.5812 + 0.1101i | 0.5915 + 0.1102i | 0.5915 + 0.1102i | 0.5812 + 0.1101i | 0.5812 + 0.1101i |
| 16.5 | 0.5897 + 0.1157i | 0.5897 + 0.1157i | 0.5897 + 0.1157i | 0.5897 + 0.1157i | 0.5897 + 0.1157i | 0.5897 + 0.1157i | 0.5897 + 0.1157i | 0.5897 + 0.1157i |
| 17 | 0.5857 + 0.1156i | 0.5857 + 0.1156i | 0.5857 + 0.1156i | 0.5857 + 0.1156i | 0.5857 + 0.1156i | 0.5857 + 0.1156i | 0.5857 + 0.1156i | 0.5857 + 0.1156i |
| 17.5 | 0.5809 + 0.1157i | 0.5809 + 0.1157i | 0.5809 + 0.1157i | 0.5809 + 0.1157i | 0.5809 + 0.1157i | 0.5809 + 0.1157i | 0.5809 + 0.1157i | 0.5809 + 0.1157i |

-continued

| | | | | | | | | |
|---|---|---|---|---|---|---|---|---|
| 18 | 0.5752 + 0.1044i | 0.5752 + 0.1044i | 0.5752 + 0.1044i | 0.5752 + 0.1044i | 0.5747 + 0.1252i | 0.5747 + 0.1252i | 0.5747 + 0.1252i | 0.5747 + 0.1252i |
| 18.5 | 0.4996 + 0.0925i | 0.4996 + 0.0925i | 0.4996 + 0.0925i | 0.4996 + 0.0925i | 0.5003 + 0.1452i | 0.5003 + 0.1452i | 0.5003 + 0.1452i | 0.5003 + 0.1452i |
| 19 | 0.4795 + 0.0818i | 0.4795 + 0.0818i | 0.4795 + 0.0818i | 0.4795 + 0.0818i | 0.4840 + 0.1638i | 0.4840 + 0.1638i | 0.4840 + 0.1638i | 0.4840 + 0.1638i |
| 19.5 | 0.4652 + 0.0749i | 0.4652 + 0.0749i | 0.4652 + 0.0749i | 0.4652 + 0.0749i | 0.4737 + 0.1800i | 0.4737 + 0.1800i | 0.4737 + 0.1800i | 0.4737 + 0.1800i |
| 20 | 0.6612 + 0.0694i | 0.6612 + 0.0694i | 0.6612 + 0.0694i | 0.6612 + 0.0694i | 0.6532 + 0.1712i | 0.6532 + 0.1712i | 0.6532 + 0.1712i | 0.6532 + 0.1712i |
| 20.5 | 0.5376 + 0.0651i | 0.5376 + 0.0651i | 0.5376 + 0.0651i | 0.5376 + 0.0651i | 0.5422 + 0.1817i | 0.5422 + 0.1817i | 0.5422 + 0.1817i | 0.5422 + 0.1817i |
| 21 | 0.5658 + 0.0610i | 0.5658 + 0.0610i | 0.5658 + 0.0610i | 0.5658 + 0.0610i | 0.5650 + 0.1728i | 0.5650 + 0.1728i | 0.5650 + 0.1728i | 0.5650 + 0.1728i |
| 21.5 | 0.5850 + 0.0617i | 0.5850 + 0.0617i | 0.5957 + 0.0622i | 0.5957 + 0.0622i | 0.5791 + 0.1814i | 0.5791 + 0.1814i | 0.5913 + 0.1828i | 0.5913 + 0.1828i |
| 22 | 0.5591 + 0.0583i | 0.5591 + 0.0583i | 0.5836 + 0.0583i | 0.5836 + 0.0583i | 0.5576 + 0.1733i | 0.5576 + 0.1733i | 0.5809 + 0.1737i | 0.5809 + 0.1737i |
| 22.5 | 0.5596 + 0.0585i | 0.5596 + 0.0585i | 0.5842 + 0.0598i | 0.5842 + 0.0598i | 0.5597 + 0.1807i | 0.5597 + 0.1807i | 0.5835 + 0.1806i | 0.5835 + 0.1806i |
| 23 | 0.5548 + 0.0623i | 0.5548 + 0.0623i | 0.5823 + 0.0593i | 0.5823 + 0.0593i | 0.5476 + 0.1727i | 0.5476 + 0.1727i | 0.5856 + 0.1752i | 0.5856 + 0.1752i |
| 23.5 | 0.5463 + 0.0579i | 0.5463 + 0.0579i | 0.5973 + 0.0581i | 0.5973 + 0.0581i | 0.5451 + 0.1746i | 0.5451 + 0.1746i | 0.5954 + 0.1757i | 0.5954 + 0.1757i |
| 24 | 0.5320 + 0.0551i | 0.5320 + 0.0551i | 0.5979 + 0.0547i | 0.5979 + 0.0547i | 0.5320 + 0.1673i | 0.5320 + 0.1673i | 0.5958 + 0.1663i | 0.5958 + 0.1663i |
| 24.5 | 0.5336 + 0.0530i | 0.5336 + 0.0530i | 0.6137 + 0.0524i | 0.6137 + 0.0524i | 0.5351 + 0.1608i | 0.5351 + 0.1608i | 0.6123 + 0.1597i | 0.6123 + 0.1597i |
| 25 | 0.5579 + 0.0562i | 0.5579 + 0.0562i | 0.6376 + 0.0520i | 0.6378 + 0.0621i | 0.5575 + 0.1766i | 0.5575 + 0.1624i | 0.6391 + 0.1800i | 0.6390 + 0.1629i |
| 25.5 | 0.5118 + 0.0433i | 0.5128 + 0.0705i | 0.5870 + 0.0440i | 0.5879 + 0.0655i | 0.5211 + 0.1908i | 0.5175 + 0.1547i | 0.5970 + 0.1831i | 0.5933 + 0.1507i |
| 26 | 0.5288 + 0.0400i | 0.5857 + 0.0687i | 0.4820 + 0.0208i | 0.6310 + 0.0929i | 0.5798 + 0.2126i | 0.5801 + 0.1655i | 0.6572 + 0.2101i | 0.6463 + 0.1533i |
| 26.5 | 0.5532 + 0.0309i | 0.5478 + 0.0912i | 0.6447 + 0.0402i | 0.6376 + 0.0755i | 0.5674 + 0.2153i | 0.5589 + 0.1584i | 0.6549 + 0.1897i | 0.6259 + 0.1463i |
| 27 | 0.5645 + 0.0293i | 0.5775 + 0.0917i | 0.4254 + 0.0322i | 0.6367 + 0.1004i | 0.5594 + 0.2218i | 0.5685 + 0.1676i | 0.6391 + 0.2359i | 0.6415 + 0.1699i |
| 27.5 | 0.5689 + 0.0303i | 0.5769 + 0.0968i | 0.4283 + 0.0333i | 0.6371 + 0.1067i | 0.5690 + 0.2288i | 0.5706 + 0.1684i | 0.6484 + 0.2299i | 0.6440 + 0.1694i |
| 28 | 0.5612 + 0.0506i | 0.5718 + 0.1142i | 0.4988 + 0.0234i | 0.6505 + 0.1199i | 0.5646 + 0.2390i | 0.5722 + 0.1799i | 0.6434 + 0.2525i | 0.6497 + 0.1851i |

| SNR/w | w104 | w105 | w106 | w107 | w108 | w109 | w110 | w111 |
|---|---|---|---|---|---|---|---|---|
| 7 | 1.1269 + 0.6205i | 1.0807 + 0.5881i | 1.2525 + 0.3664i | 1.1912 + 0.3587i | 1.0807 + 0.5881i | 1.0452 + 0.5641i | 1.1912 + 0.3587i | 1.1450 + 0.3528i |
| 7.5 | 1.0763 + 0.6220i | 1.0763 + 0.6220i | 1.2101 + 0.3241i | 1.2101 + 0.3241i | 1.0274 + 0.5831i | 1.0274 + 0.5831i | 1.1457 + 0.3170i | 1.1457 + 0.3170i |
| 8 | 1.1569 + 0.2955i | 1.1569 + 0.2955i | 1.1569 + 0.2955i | 1.1569 + 0.2955i | 1.0261 + 0.6066i | 1.0261 + 0.6066i | 1.0261 + 0.6066i | 1.0261 + 0.6066i |
| 8.5 | 1.1099 + 0.2755i | 1.1099 + 0.2755i | 1.1099 + 0.2755i | 1.1099 + 0.2755i | 0.9827 + 0.5890i | 0.9827 + 0.5890i | 0.9827 + 0.5890i | 0.9827 + 0.5890i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 0.9711 + 0.2223i | 0.9711 + 0.2223i | 0.9711 + 0.2223i | 0.9711 + 0.2223i | 0.9711 + 0.2223i | 0.9846 + 0.2158i | 0.9846 + 0.2158i | 0.9846 + 0.2158i |
| 11.5 | 0.9636 + 0.2130i | 0.9636 + 0.2130i | 0.9636 + 0.2130i | 0.9636 + 0.2130i | 0.9792 + 0.2085i | 0.9792 + 0.2085i | 0.9792 + 0.2085i | 0.9792 + 0.2085i |
| 12 | 0.9592 + 0.2058i | 0.9592 + 0.2058i | 0.9592 + 0.2058i | 0.9780 + 0.2025i | 0.9780 + 0.2025i | 0.9780 + 0.2025i | 0.9780 + 0.2025i | 0.9780 + 0.2025i |
| 12.5 | 0.9260 + 0.1773i | 0.9260 + 0.1773i | 0.9260 + 0.1773i | 0.9260 + 0.1773i | 0.9511 + 0.1764i | 0.9511 + 0.1764i | 0.9511 + 0.1764i | 0.9511 + 0.1764i |
| 13 | 0.4057 + 0.1622i | 0.4057 + 0.1622i | 0.4057 + 0.1622i | 0.4057 + 0.1622i | 0.4057 + 0.1622i | 0.4057 + 0.1622i | 0.4057 + 0.1622i | 0.4057 + 0.1622i |
| 13.5 | 0.9385 + 0.1544i | 0.9385 + 0.1544i | 0.9385 + 0.1544i | 0.9385 + 0.1544i | 0.9385 + 0.1544i | 0.9385 + 0.1544i | 0.9385 + 0.1544i | 0.9385 + 0.1544i |
| 14 | 0.9435 + 0.1570i | 0.9435 + 0.1570i | 0.9435 + 0.1570i | 0.9435 + 0.1570i | 0.9435 + 0.1570i | 0.9435 + 0.1570i | 0.9435 + 0.1570i | 0.9435 + 0.1570i |
| 14.5 | 0.9336 + 0.1519i | 0.9336 + 0.1519i | 0.9336 + 0.1519i | 0.9336 + 0.1519i | 0.9336 + 0.1519i | 0.9336 + 0.1519i | 0.9336 + 0.1519i | 0.9336 + 0.1519i |

-continued

| | | | | | | | | |
|---|---|---|---|---|---|---|---|---|
| 15 | 0.7343 + 0.1137i | 0.7343 + 0.1137i | 0.7176 + 0.1148i | 0.7176 + 0.1148i | 0.7343 + 0.1137i | 0.7343 + 0.1137i | 0.7343 + 0.1137i | 0.7176 + 0.1148i |
| 15.5 | 0.7311 + 0.1109i | 0.7311 + 0.1109i | 0.7060 + 0.1113i | 0.7060 + 0.1113i | 0.7311 + 0.1109i | 0.7311 + 0.1109i | 0.7060 + 0.1113i | 0.7060 + 0.1113i |
| 16 | 0.6870 + 0.1081i | 0.6870 + 0.1081i | 0.6603 + 0.1090i | 0.6603 + 0.1090i | 0.6870 + 0.1081i | 0.6870 + 0.1081i | 0.6603 + 0.1090i | 0.6603 + 0.1090i |
| 16.5 | 0.6798 + 0.1147i | 0.6798 + 0.1147i | 0.6798 + 0.1147i | 0.6798 + 0.1147i | 0.6798 + 0.1147i | 0.6798 + 0.1147i | 0.6663 + 0.1171i | 0.6663 + 0.1171i |
| 17 | 0.6913 + 0.1153i | 0.6913 + 0.1153i | 0.6701 + 0.1153i | 0.6701 + 0.1153i | 0.6913 + 0.1153i | 0.6913 + 0.1153i | 0.6701 + 0.1153i | 0.6701 + 0.1153i |
| 17.5 | 0.6999 + 0.1154i | 0.6999 + 0.1154i | 0.6778 + 0.1153i | 0.6778 + 0.1153i | 0.6999 + 0.1154i | 0.6999 + 0.1154i | 0.6778 + 0.1153i | 0.6778 + 0.1153i |
| 18 | 0.7126 + 0.1042i | 0.7126 + 0.1042i | 0.6920 + 0.1041i | 0.6920 + 0.1041i | 0.7109 + 0.1261i | 0.7109 + 0.1261i | 0.6899 + 0.1256i | 0.6899 + 0.1256i |
| 18.5 | 0.6081 + 0.0946i | 0.6081 + 0.0946i | 0.5851 + 0.0940i | 0.5851 + 0.0940i | 0.6066 + 0.1339i | 0.6066 + 0.1339i | 0.5834 + 0.1361i | 0.5834 + 0.1361i |
| 19 | 0.5973 + 0.0837i | 0.5973 + 0.0837i | 0.5724 + 0.0828i | 0.5724 + 0.0828i | 0.6004 + 0.1436i | 0.6004 + 0.1436i | 0.5758 + 0.1473i | 0.5758 + 0.1473i |
| 19.5 | 0.5855 + 0.0749i | 0.5855 + 0.0749i | 0.5626 + 0.0743i | 0.5626 + 0.0743i | 0.5954 + 0.1545i | 0.5954 + 0.1545i | 0.5727 + 0.1589i | 0.5727 + 0.1589i |
| 20 | 0.8398 + 0.0712i | 0.8398 + 0.0712i | 0.8161 + 0.0705i | 0.8161 + 0.0705i | 0.8325 + 0.1977i | 0.8325 + 0.1977i | 0.8062 + 0.1936i | 0.8062 + 0.1936i |
| 20.5 | 0.6828 + 0.0657i | 0.6828 + 0.0657i | 0.6828 + 0.0657i | 0.6828 + 0.0657i | 0.6888 + 0.1733i | 0.6888 + 0.1733i | 0.6888 + 0.1733i | 0.6888 + 0.1733i |
| 21 | 0.7538 + 0.0616i | 0.7538 + 0.0616i | 0.7099 + 0.0612i | 0.7099 + 0.0612i | 0.7518 + 0.1748i | 0.7518 + 0.1748i | 0.7082 + 0.1738i | 0.7082 + 0.1738i |
| 21.5 | 0.7661 + 0.0663i | 0.7661 + 0.0663i | 0.7313 + 0.0656i | 0.7313 + 0.0656i | 0.7671 + 0.1949i | 0.7671 + 0.1949i | 0.7259 + 0.1919i | 0.7259 + 0.1919i |
| 22 | 0.7749 + 0.0604i | 0.7749 + 0.0604i | 0.7105 + 0.0596i | 0.7105 + 0.0596i | 0.7716 + 0.1792i | 0.7716 + 0.1792i | 0.7083 + 0.1767i | 0.7083 + 0.1767i |
| 22.5 | 0.7668 + 0.0619i | 0.7668 + 0.0619i | 0.7061 + 0.0610i | 0.7061 + 0.0610i | 0.7649 + 0.1855i | 0.7649 + 0.1855i | 0.7041 + 0.1839i | 0.7041 + 0.1839i |
| 23 | 0.7676 + 0.0577i | 0.7676 + 0.0577i | 0.6978 + 0.0604i | 0.6978 + 0.0604i | 0.7752 + 0.1744i | 0.7752 + 0.1744i | 0.6976 + 0.1776i | 0.6976 + 0.1776i |
| 23.5 | 0.7905 + 0.0600i | 0.7905 + 0.0600i | 0.7024 + 0.0596i | 0.7024 + 0.0596i | 0.7921 + 0.1808i | 0.7921 + 0.1808i | 0.7011 + 0.1782i | 0.7011 + 0.1782i |
| 24 | 0.8058 + 0.0559i | 0.8058 + 0.0559i | 0.7006 + 0.0544i | 0.7006 + 0.0544i | 0.7978 + 0.1683i | 0.7978 + 0.1683i | 0.6964 + 0.1646i | 0.6964 + 0.1646i |
| 24.5 | 0.8228 + 0.0536i | 0.8228 + 0.0536i | 0.7137 + 0.0524i | 0.7137 + 0.0524i | 0.8117 + 0.1648i | 0.8117 + 0.1648i | 0.7096 + 0.1603i | 0.7096 + 0.1603i |
| 25 | 0.8167 + 0.0476i | 0.8301 + 0.0596i | 0.7280 + 0.0514i | 0.7263 + 0.0640i | 0.8267 + 0.1863i | 0.8324 + 0.1581i | 0.7321 + 0.1829i | 0.7299 + 0.1621i |
| 25.5 | 0.7861 + 0.0463i | 0.7641 + 0.0537i | 0.6743 + 0.0499i | 0.6743 + 0.0499i | 0.7796 + 0.1574i | 0.7610 + 0.1390i | 0.6803 + 0.1757i | 0.6806 + 0.1462i |
| 26 | 0.8256 + 0.0420i | 0.6508 + 0.0265i | 0.7670 + 0.0378i | 0.7001 + 0.0587i | 0.8174 + 0.1879i | 0.8223 + 0.1559i | 0.7337 + 0.1934i | 0.7270 + 0.1387i |
| 26.5 | 0.8065 + 0.0845i | 0.8269 + 0.0473i | 0.7329 + 0.0868i | 0.7278 + 0.0424i | 0.8099 + 0.1836i | 0.8587 + 0.1711i | 0.7310 + 0.1812i | 1.0556 + 0.1522i |
| 27 | 0.7854 + 0.0273i | 0.7838 + 0.0820i | 0.6971 + 0.0252i | 0.6977 + 0.0837i | 0.7918 + 0.2254i | 0.7850 + 0.1575i | 0.7135 + 0.2418i | 0.7115 + 0.1638i |
| 27.5 | 0.7633 + 0.0268i | 0.7892 + 0.0699i | 0.6869 + 0.0273i | 0.6979 + 0.0911i | 0.8189 + 0.2114i | 0.8022 + 0.1410i | 0.7337 + 0.2230i | 0.7228 + 0.1574i |
| 28 | 0.8172 + 0.0455i | 0.7772 + 0.1040i | 0.7246 + 0.0275i | 0.7114 + 0.0993i | 0.8716 + 0.1301i | 0.8012 + 0.1702i | 0.7245 + 0.2595i | 0.7276 + 0.1914i |

| SNR/ w | w112 | w113 | w114 | w115 | w116 | w117 | w118 | w119 |
|---|---|---|---|---|---|---|---|---|
| 7 | 1.1269 + 0.6205i | 1.0807 + 0.5881i | 1.2525 + 0.3664i | 1.1912 + 0.3587i | 1.0807 + 0.5881i | 1.0452 + 0.5641i | 1.1912 + 0.3587i | 1.1450 + 0.3528i |
| 7.5 | 1.0763 + 0.6220i | 1.0763 + 0.6220i | 1.2101 + 0.3241i | 1.2101 + 0.3241i | 1.0274 + 0.5831i | 1.0274 + 0.5831i | 1.1457 + 0.3170i | 1.1457 + 0.3170i |
| 8 | 1.1569 + 0.2955i | 1.1569 + 0.2955i | 1.1569 + 0.2955i | 1.1569 + 0.2955i | 1.0261 + 0.6066i | 1.0261 + 0.6066i | 1.0261 + 0.6066i | 1.0261 + 0.6066i |
| 8.5 | 1.2418 + 0.2874i | 1.2418 + 0.2874i | 1.2418 + 0.2874i | 1.2418 + 0.2874i | 1.0898 + 0.6771i | 1.0898 + 0.6771i | 1.0898 + 0.6771i | 1.0898 + 0.6771i |
| 9 | 0.5474 + 0.2991i | 0.5474 + 0.2991i | 0.5474 + 0.2991i | 0.5474 + 0.2991i | 0.5474 + 0.2991i | 0.5474 + 0.2991i | 0.5474 + 0.2991i | 0.5474 + 0.2991i |
| 9.5 | 0.5682 + 0.3084i | 0.5682 + 0.3084i | 0.5682 + 0.3084i | 0.5682 + 0.3084i | 0.5682 + 0.3084i | 0.5682 + 0.3084i | 0.5682 + 0.3084i | 0.5682 + 0.3084i |
| 10 | 0.5832 + 0.3180i | 0.5832 + 0.3180i | 0.5832 + 0.3180i | 0.5832 + 0.3180i | 0.5832 + 0.3180i | 0.5832 + 0.3180i | 0.5832 + 0.3180i | 0.5832 + 0.3180i |
| 10.5 | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i |
| 11 | 0.8423 + 0.5603i | 0.8423 + 0.5603i | 0.8423 + 0.5603i | 0.8423 + 0.5603i | 0.8423 + 0.5603i | 0.8423 + 0.5603i | 0.8423 + 0.5603i | 0.8423 + 0.5603i |
| 11.5 | 0.8325 + 0.5654i | 0.8325 + 0.5654i | 0.8325 + 0.5654i | 0.8325 + 0.5654i | 0.8325 + 0.5654i | 0.8325 + 0.5654i | 0.8325 + 0.5654i | 0.8325 + 0.5654i |

-continued

| | | | | | | | | |
|---|---|---|---|---|---|---|---|---|
| 12 | 0.8216 + 0.5765i | 0.8216 + 0.5765i | 0.8216 + 0.5765i | 0.8216 + 0.5765i | 0.8216 + 0.5765i | 0.8216 + 0.5765i | 0.8216 + 0.5765i | 0.8216 + 0.5765i |
| 12.5 | 0.8199 + 0.5095i | 0.8199 + 0.5095i | 0.8199 + 0.5095i | 0.8199 + 0.5095i | 0.8373 + 0.5007i | 0.8373 + 0.5007i | 0.8373 + 0.5007i | 0.8373 + 0.5007i |
| 13 | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i |
| 13.5 | 0.8068 + 0.4612i | 0.8068 + 0.4612i | 0.8068 + 0.4612i | 0.8068 + 0.4612i | 0.8068 + 0.4612i | 0.8068 + 0.4612i | 0.8068 + 0.4612i | 0.8152 + 0.4479i |
| 14 | 0.7991 + 0.4480i | 0.7991 + 0.4480i | 0.7991 + 0.4480i | 0.7991 + 0.4480i | 0.8004 + 0.4148i | 0.8004 + 0.4148i | 0.8004 + 0.4148i | 0.8004 + 0.4148i |
| 14.5 | 0.7896 + 0.4435i | 0.7896 + 0.4435i | 0.7896 + 0.4435i | 0.7896 + 0.4435i | 0.7936 + 0.4044i | 0.7936 + 0.4044i | 0.7936 + 0.4044i | 0.7936 + 0.4044i |
| 15 | 0.6440 + 0.3324i | 0.6440 + 0.3324i | 0.6440 + 0.3324i | 0.6440 + 0.3324i | 0.6440 + 0.3324i | 0.6440 + 0.3324i | 0.6440 + 0.3324i | 0.6440 + 0.3324i |
| 15.5 | 0.6322 + 0.3309i | 0.6322 + 0.3309i | 0.6322 + 0.3309i | 0.6322 + 0.3309i | 0.6320 + 0.3157i | 0.6320 + 0.3157i | 0.6320 + 0.3157i | 0.6320 + 0.3157i |
| 16 | 0.5983 + 0.3420i | 0.5983 + 0.3420i | 0.5983 + 0.3420i | 0.5983 + 0.3420i | 0.5967 + 0.3234i | 0.5967 + 0.3234i | 0.5967 + 0.3234i | 0.5967 + 0.3234i |
| 16.5 | 0.5902 + 0.3641i | 0.5902 + 0.3641i | 0.5902 + 0.3641i | 0.5902 + 0.3641i | 0.5899 + 0.3417i | 0.5899 + 0.3417i | 0.5899 + 0.3417i | 0.5899 + 0.3417i |
| 17 | 0.5863 + 0.3677i | 0.5863 + 0.3677i | 0.5863 + 0.3677i | 0.5863 + 0.3677i | 0.5859 + 0.3394i | 0.5859 + 0.3394i | 0.5859 + 0.3394i | 0.5859 + 0.3394i |
| 17.5 | 0.5812 + 0.3725i | 0.5812 + 0.3725i | 0.5812 + 0.3725i | 0.5812 + 0.3725i | 0.5808 + 0.3357i | 0.5808 + 0.3357i | 0.5808 + 0.3357i | 0.5808 + 0.3357i |
| 18 | 0.5743 + 0.3784i | 0.5743 + 0.3784i | 0.5743 + 0.3784i | 0.5743 + 0.3784i | 0.5745 + 0.3275i | 0.5745 + 0.3275i | 0.5745 + 0.3275i | 0.5745 + 0.3275i |
| 18.5 | 0.5248 + 0.4147i | 0.5248 + 0.4147i | 0.5248 + 0.4147i | 0.5248 + 0.4147i | 0.5114 + 0.3280i | 0.5114 + 0.3280i | 0.5114 + 0.3280i | 0.5114 + 0.3280i |
| 19 | 0.5240 + 0.4309i | 0.5240 + 0.4309i | 0.5240 + 0.4309i | 0.5240 + 0.4309i | 0.5018 + 0.3260i | 0.5018 + 0.3260i | 0.5018 + 0.3260i | 0.5018 + 0.3260i |
| 19.5 | 0.5263 + 0.4439i | 0.5263 + 0.4439i | 0.5263 + 0.4439i | 0.5263 + 0.4439i | 0.4971 + 0.3267i | 0.4971 + 0.3267i | 0.4971 + 0.3267i | 0.4971 + 0.3267i |
| 20 | 0.6133 + 0.4297i | 0.6133 + 0.4297i | 0.6133 + 0.4297i | 0.6133 + 0.4297i | 0.6352 + 0.3103i | 0.6352 + 0.3103i | 0.6352 + 0.3103i | 0.6352 + 0.3103i |
| 20.5 | 0.5665 + 0.4387i | 0.5665 + 0.4387i | 0.5665 + 0.4387i | 0.5665 + 0.4387i | 0.5531 + 0.3135i | 0.5531 + 0.3135i | 0.5531 + 0.3135i | 0.5531 + 0.3135i |
| 21 | 0.5624 + 0.4230i | 0.5624 + 0.4230i | 0.5624 + 0.4230i | 0.5624 + 0.4230i | 0.5636 + 0.2986i | 0.5636 + 0.2986i | 0.5636 + 0.2986i | 0.5636 + 0.2986i |
| 21.5 | 0.5602 + 0.4348i | 0.5602 + 0.4348i | 0.5773 + 0.4365i | 0.5773 + 0.4365i | 0.5700 + 0.3071i | 0.5700 + 0.3071i | 0.5846 + 0.3087i | 0.5846 + 0.3087i |
| 22 | 0.5524 + 0.4197i | 0.5524 + 0.4197i | 0.5726 + 0.4192i | 0.5726 + 0.4192i | 0.5550 + 0.2935i | 0.5550 + 0.2935i | 0.5768 + 0.2944i | 0.5768 + 0.2944i |
| 22.5 | 0.5503 + 0.4300i | 0.5503 + 0.4300i | 0.5786 + 0.4315i | 0.5786 + 0.4315i | 0.5550 + 0.3043i | 0.5550 + 0.3043i | 0.5808 + 0.3056i | 0.5808 + 0.3056i |
| 23 | 0.5455 + 0.4271i | 0.5455 + 0.4271i | 0.5873 + 0.4287i | 0.5873 + 0.4287i | 0.5487 + 0.2990i | 0.5487 + 0.2990i | 0.5880 + 0.2980i | 0.5880 + 0.2980i |
| 23.5 | 0.5420 + 0.4303i | 0.5423 + 0.4132i | 0.5947 + 0.4316i | 0.5945 + 0.4140i | 0.5434 + 0.2954i | 0.5434 + 0.2954i | 0.5939 + 0.2963i | 0.5939 + 0.2963i |
| 24 | 0.5281 + 0.4273i | 0.5287 + 0.3983i | 0.5871 + 0.4265i | 0.5877 + 0.3978i | 0.5310 + 0.2798i | 0.5310 + 0.2903i | 0.5922 + 0.2794i | 0.5917 + 0.2898i |
| 24.5 | 0.5365 + 0.4381i | 0.5382 + 0.3853i | 0.5982 + 0.4418i | 0.6015 + 0.3864i | 0.5370 + 0.2654i | 0.5375 + 0.2877i | 0.6082 + 0.2642i | 0.6073 + 0.2878i |
| 25 | 0.5453 + 0.4454i | 0.5502 + 0.3898i | 0.6234 + 0.4539i | 0.6307 + 0.3941i | 0.5562 + 0.2716i | 0.5549 + 0.3013i | 0.6389 + 0.2737i | 0.6372 + 0.3073i |
| 25.5 | 0.5461 + 0.4689i | 0.5406 + 0.4028i | 0.6279 + 0.4619i | 0.6209 + 0.3959i | 0.5286 + 0.2713i | 0.5338 + 0.3241i | 0.6051 + 0.2663i | 0.6111 + 0.3180i |
| 26 | 0.5698 + 0.4829i | 0.5665 + 0.4039i | 0.6267 + 0.4766i | 0.6435 + 0.4035i | 0.5791 + 0.2819i | 0.5732 + 0.3319i | 0.6629 + 0.2838i | 0.6557 + 0.3430i |
| 26.5 | 0.5542 + 0.5035i | 0.5680 + 0.4220i | 0.6136 + 0.5202i | 0.6338 + 0.4274i | 0.5765 + 0.2788i | 0.5763 + 0.3431i | 0.6576 + 0.2694i | 0.6479 + 0.3478i |
| 27 | 0.5772 + 0.4729i | 0.6966 + 0.5064i | 0.6313 + 0.4262i | 0.6900 + 0.4641i | 0.5461 + 0.2809i | 0.5401 + 0.3444i | 0.6216 + 0.3057i | 0.5842 + 0.3465i |
| 27.5 | 0.5441 + 0.4997i | 0.7312 + 0.5058i | 0.6143 + 0.4752i | 0.6785 + 0.4286i | 0.5678 + 0.2914i | 0.5691 + 0.3548i | 0.6493 + 0.2928i | 0.6423 + 0.3564i |
| 28 | 0.5732 + 0.4753i | 0.7131 + 0.5308i | 0.6412 + 0.4359i | 0.6970 + 0.4732i | 0.5488 + 0.2953i | 0.5454 + 0.3628i | 0.6317 + 0.3194i | 0.5938 + 0.3612i |

| SNR/ w | w120 | w121 | w122 | w123 | w124 | w125 | w126 | w127 |
|---|---|---|---|---|---|---|---|---|
| 7 | 1.0807 + 0.5881i | 1.0452 + 0.5641i | 1.1912 + 0.3587i | 1.1450 + 0.3528i | 1.0452 + 0.5641i | 1.0452 + 0.5641i | 1.1450 + 0.3528i | 1.1450 + 0.3528i |
| 7.5 | 1.0274 + 0.5831i | 1.0274 + 0.5831i | 1.1457 + 0.3170i | 1.1457 + 0.3170i | 0.9947 + 0.5573i | 1.0274 + 0.5831i | 1.1037 + 0.3118i | 1.1457 + 0.3170i |
| 8 | 1.1020 + 0.2908i | 1.1020 + 0.2908i | 1.1020 + 0.2908i | 1.1020 + 0.2908i | 0.9836 + 0.5710i | 0.9836 + 0.5710i | 0.9836 + 0.5710i | 0.9836 + 0.5710i |
| 8.5 | 1.0834 + 0.2747i | 1.0834 + 0.2747i | 1.0834 + 0.2747i | 1.1099 + 0.2755i | 0.9632 + 0.5714i | 0.9632 + 0.5714i | 0.9632 + 0.5714i | 0.9827 + 0.5890i |

-continued

| | | | | | | | | |
|---|---|---|---|---|---|---|---|---|
| 9 | 0.5474 + 0.2991i | 0.5474 + 0.2991i | 0.5474 + 0.2991i | 0.5474 + 0.2991i | 0.5474 + 0.2991i | 0.5474 + 0.2991i | 0.5474 + 0.2991i | 0.5474 + 0.2991i |
| 9.5 | 0.5682 + 0.3084i | 0.5682 + 0.3084i | 0.5682 + 0.3084i | 0.5682 + 0.3084i | 0.5682 + 0.3084i | 0.5682 + 0.3084i | 0.5682 + 0.3084i | 0.5682 + 0.3084i |
| 10 | 0.5832 + 0.3180i | 0.5832 + 0.3180i | 0.5832 + 0.3180i | 0.5832 + 0.3180i | 0.5832 + 0.3180i | 0.5832 + 0.3180i | 0.5832 + 0.3180i | 0.5832 + 0.3180i |
| 10.5 | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i |
| 11 | 0.8423 + 0.5603i | 0.8423 + 0.5603i | 0.8423 + 0.5603i | 0.8423 + 0.5603i | 0.8423 + 0.5603i | 0.8529 + 0.5456i | 0.8423 + 0.5603i | 0.8423 + 0.5603i |
| 11.5 | 0.8325 + 0.5654i | 0.8325 + 0.5654i | 0.8325 + 0.5654i | 0.8325 + 0.5654i | 0.8325 + 0.5654i | 0.8450 + 0.5501i | 0.8325 + 0.5654i | 0.8325 + 0.5654i |
| 12 | 0.8216 + 0.5765i | 0.8348 + 0.5590i | 0.8216 + 0.5765i | 0.8216 + 0.5765i | 0.8216 + 0.5765i | 0.8348 + 0.5590i | 0.8216 + 0.5765i | 0.8216 + 0.5765i |
| 12.5 | 0.8267 + 0.5267i | 0.8199 + 0.5095i | 0.8199 + 0.5095i | 0.8199 + 0.5095i | 0.8430 + 0.5170i | 0.8373 + 0.5007i | 0.8373 + 0.5007i | 0.8373 + 0.5007i |
| 13 | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i |
| 13.5 | 0.8271 + 0.4933i | 0.8271 + 0.4933i | 0.8271 + 0.4933i | 0.8271 + 0.4933i | 0.8271 + 0.4933i | 0.8409 + 0.4757i | 0.8409 + 0.4757i | 0.8409 + 0.4757i |
| 14 | 0.8721 + 0.4834i | 0.8721 + 0.4834i | 0.8721 + 0.4834i | 0.8721 + 0.4834i | 0.8761 + 0.4396i | 0.8761 + 0.4396i | 0.8761 + 0.4396i | 0.8761 + 0.4396i |
| 14.5 | 0.8681 + 0.4817i | 0.8681 + 0.4817i | 0.8681 + 0.4817i | 0.8681 + 0.4817i | 0.8755 + 0.4298i | 0.8755 + 0.4298i | 0.8755 + 0.4298i | 0.8755 + 0.4298i |
| 15 | 0.7298 + 0.3374i | 0.7298 + 0.3374i | 0.7298 + 0.3374i | 0.7298 + 0.3374i | 0.7298 + 0.3374i | 0.7298 + 0.3374i | 0.7194 + 0.3284i | 0.7194 + 0.3284i |
| 15.5 | 0.7191 + 0.3382i | 0.7191 + 0.3382i | 0.7002 + 0.3406i | 0.7002 + 0.3406i | 0.7225 + 0.3243i | 0.7225 + 0.3243i | 0.7028 + 0.3263i | 0.7028 + 0.3263i |
| 16 | 0.6879 + 0.3355i | 0.6879 + 0.3355i | 0.6678 + 0.3387i | 0.6678 + 0.3387i | 0.6878 + 0.3189i | 0.6878 + 0.3189i | 0.6669 + 0.3214i | 0.6669 + 0.3214i |
| 16.5 | 0.6909 + 0.3652i | 0.6909 + 0.3652i | 0.6696 + 0.3643i | 0.6696 + 0.3643i | 0.6898 + 0.3424i | 0.6898 + 0.3424i | 0.6688 + 0.3416i | 0.6688 + 0.3416i |
| 17 | 0.6985 + 0.3688i | 0.6985 + 0.3688i | 0.6741 + 0.3677i | 0.6741 + 0.3677i | 0.6964 + 0.3397i | 0.6964 + 0.3397i | 0.6724 + 0.3390i | 0.6724 + 0.3390i |
| 17.5 | 0.7102 + 0.3730i | 0.7102 + 0.3730i | 0.6848 + 0.3721i | 0.6848 + 0.3721i | 0.7068 + 0.3349i | 0.7068 + 0.3349i | 0.6820 + 0.3345i | 0.6820 + 0.3345i |
| 18 | 0.7224 + 0.3798i | 0.7224 + 0.3798i | 0.6977 + 0.3787i | 0.6977 + 0.3787i | 0.7189 + 0.3270i | 0.7189 + 0.3270i | 0.6951 + 0.3266i | 0.6951 + 0.3266i |
| 18.5 | 0.6468 + 0.3779i | 0.6468 + 0.3779i | 0.6242 + 0.3848i | 0.6242 + 0.3848i | 0.6273 + 0.3124i | 0.6273 + 0.3124i | 0.6029 + 0.3154i | 0.6029 + 0.3154i |
| 19 | 0.6612 + 0.3808i | 0.6612 + 0.3808i | 0.6402 + 0.3895i | 0.6402 + 0.3895i | 0.6298 + 0.3011i | 0.6298 + 0.3011i | 0.6058 + 0.3058i | 0.6058 + 0.3058i |
| 19.5 | 0.6725 + 0.3895i | 0.6725 + 0.3895i | 0.6533 + 0.3984i | 0.6533 + 0.3984i | 0.6322 + 0.2957i | 0.6322 + 0.2957i | 0.6103 + 0.3011i | 0.6103 + 0.3011i |
| 20 | 0.7959 + 0.4709i | 0.7959 + 0.4709i | 0.7609 + 0.4630i | 0.7609 + 0.4630i | 0.8165 + 0.3382i | 0.8165 + 0.3382i | 0.7854 + 0.3329i | 0.7854 + 0.3329i |
| 20.5 | 0.7475 + 0.4190i | 0.7475 + 0.4190i | 0.7128 + 0.4242i | 0.7128 + 0.4242i | 0.7235 + 0.2994i | 0.7235 + 0.2994i | 0.6941 + 0.3018i | 0.6941 + 0.3018i |
| 21 | 0.7483 + 0.4245i | 0.7483 + 0.4245i | 0.7037 + 0.4239i | 0.7037 + 0.4239i | 0.7494 + 0.3007i | 0.7494 + 0.3007i | 0.7055 + 0.2997i | 0.7055 + 0.2997i |
| 21.5 | 0.7656 + 0.4486i | 0.7656 + 0.4486i | 0.7088 + 0.4464i | 0.7088 + 0.4464i | 0.7665 + 0.3224i | 0.7665 + 0.3224i | 0.7166 + 0.3187i | 0.7166 + 0.3187i |
| 22 | 0.7603 + 0.4266i | 0.7603 + 0.4266i | 0.6987 + 0.4225i | 0.6987 + 0.4225i | 0.7666 + 0.3018i | 0.7666 + 0.3018i | 0.7041 + 0.2986i | 0.7041 + 0.2986i |
| 22.5 | 0.7670 + 0.4425i | 0.7670 + 0.4425i | 0.7000 + 0.4383i | 0.7000 + 0.4383i | 0.7664 + 0.3107i | 0.7664 + 0.3107i | 0.7025 + 0.3102i | 0.7025 + 0.3102i |
| 23 | 0.7810 + 0.4229i | 0.7810 + 0.4229i | 0.6975 + 0.4436i | 0.7082 + 0.4208i | 0.7756 + 0.2985i | 0.7756 + 0.2985i | 0.6967 + 0.2986i | 0.6967 + 0.2986i |
| 23.5 | 0.7984 + 0.4234i | 0.7931 + 0.4034i | 0.7006 + 0.4317i | 0.7002 + 0.4120i | 0.7952 + 0.2982i | 0.7952 + 0.2982i | 0.6980 + 0.2962i | 0.6980 + 0.2962i |
| 24 | 0.7750 + 0.4250i | 0.7798 + 0.3969i | 0.6858 + 0.4247i | 0.6867 + 0.3966i | 0.7814 + 0.2774i | 0.7870 + 0.2866i | 0.6913 + 0.2777i | 0.6908 + 0.2880i |
| 24.5 | 0.7755 + 0.4408i | 0.7713 + 0.3997i | 0.6867 + 0.4431i | 0.6891 + 0.3906i | 0.7962 + 0.2783i | 0.7862 + 0.2937i | 0.7010 + 0.2666i | 0.6990 + 0.2890i |
| 25 | 0.7995 + 0.4820i | 0.8171 + 0.4128i | 0.7102 + 0.4660i | 0.7219 + 0.4003i | 0.8339 + 0.2736i | 0.8318 + 0.3245i | 0.7325 + 0.2751i | 0.7307 + 0.3150i |
| 25.5 | 0.8154 + 0.4444i | 0.8041 + 0.3748i | 0.7181 + 0.4538i | 0.7090 + 0.3874i | 0.7836 + 0.2479i | 0.7852 + 0.2984i | 0.6906 + 0.2579i | 0.6979 + 0.3074i |
| 26 | 0.7109 + 0.5267i | 0.7933 + 0.4911i | 0.6853 + 0.4989i | 0.7434 + 0.4295i | 0.8119 + 0.2687i | 0.8144 + 0.3360i | 0.7394 + 0.2759i | 0.7571 + 0.3617i |
| 26.5 | 0.7330 + 0.5364i | 0.7626 + 0.4705i | 0.6735 + 0.5353i | 0.7029 + 0.4406i | 0.8089 + 0.2759i | 0.7900 + 0.3695i | 0.7325 + 0.2706i | 0.7251 + 0.3586i |
| 27 | 0.8413 + 0.5029i | 0.8110 + 0.4476i | 0.6888 + 0.3768i | 0.7429 + 0.4148i | 0.8225 + 0.2737i | 0.8412 + 0.3609i | 0.7112 + 0.3146i | 0.7703 + 0.3556i |
| 27.5 | 0.8444 + 0.5124i | 0.7991 + 0.4492i | 0.6143 + 0.4752i | 0.7216 + 0.4137i | 0.8351 + 0.2795i | 0.8172 + 0.3610i | 0.7372 + 0.2864i | 0.7394 + 0.3488i |
| 28 | 0.8115 + 0.5747i | 0.9164 + 0.3766i | 0.7047 + 0.3807i | 0.7428 + 0.4237i | 0.9347 + 0.2772i | 0.8627 + 0.3189i | 0.7327 + 0.3199i | 0.8033 + 0.3671i |

-continued

| SNR/w | w128 | w129 | w130 | w131 | w132 | w133 | w134 | w135 |
|---|---|---|---|---|---|---|---|---|
| 7 | 0.2420 + 0.4138i | 0.2420 + 0.4138i | 0.2420 + 0.4138i | 0.2420 + 0.4138i | 0.2420 + 0.4138i | 0.2556 + 0.4501i | 0.2420 + 0.4138i | 0.2556 + 0.4501i |
| 7.5 | 0.2280 + 0.4017i | 0.2280 + 0.4017i | 0.2280 + 0.4017i | 0.2164 + 0.3766i | 0.2420 + 0.4261i | 0.2420 + 0.4261i | 0.2420 + 0.4261i | 0.2280 + 0.4017i |
| 8 | 0.2188 + 0.3795i | 0.2188 + 0.3795i | 0.2188 + 0.3795i | 0.2188 + 0.3795i | 0.2188 + 0.3795i | 0.2188 + 0.3795i | 0.2188 + 0.3795i | 0.2188 + 0.3795i |
| 8.5 | 0.2067 + 0.3753i | 0.2067 + 0.3753i | 0.2067 + 0.3753i | 0.2067 + 0.3753i | 0.2067 + 0.3753i | 0.2067 + 0.3753i | 0.2067 + 0.3753i | 0.2067 + 0.3753i |
| 9 | 0.3931 + 2.0687i | 0.3041 + 1.5225i | 0.3041 + 1.5225i | 0.2910 + 1.4129i | 0.3041 + 1.5225i | 0.2910 + 1.4129i | 0.2910 + 1.4129i | 0.2850 + 1.3540i |
| 9.5 | 0.4001 + 2.0659i | 0.3016 + 1.5258i | 0.3016 + 1.5258i | 0.2850 + 1.4155i | 0.3016 + 1.5258i | 0.2850 + 1.4155i | 0.2850 + 1.4155i | 0.2850 + 1.4155i |
| 10 | 0.4076 + 2.0613i | 0.3009 + 1.5258i | 0.3009 + 1.5258i | 0.2854 + 1.4442i | 0.3009 + 1.5258i | 0.2854 + 1.4442i | 0.2854 + 1.4442i | 0.2768 + 1.3998i |
| 10.5 | 0.4367 + 2.0633i | 0.3041 + 1.5241i | 0.3041 + 1.5241i | 0.2857 + 1.4497i | 0.3041 + 1.5241i | 0.2857 + 1.4497i | 0.2857 + 1.4497i | 0.2756 + 1.4128i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1262 + 0.3791i | 0.1262 + 0.3791i | 0.1262 + 0.3791i | 0.1262 + 0.3791i | 0.1262 + 0.3791i | 0.1262 + 0.3791i | 0.1262 + 0.3791i | 0.1262 + 0.3791i |
| 13 | 0.7072 + 1.7916i | 0.3938 + 1.5314i | 0.5480 + 1.7046i | 0.3789 + 1.5583i | 0.1726 + 1.2844i | 0.1953 + 1.3258i | 0.1726 + 1.2844i | 0.1953 + 1.3258i |
| 13.5 | 0.1166 + 0.4366i | 0.1166 + 0.4366i | 0.1166 + 0.4366i | 0.1166 + 0.4366i | 0.1166 + 0.4366i | 0.1166 + 0.4366i | 0.1166 + 0.4366i | 0.1166 + 0.4366i |
| 14 | 0.1152 + 0.4655i | 0.1152 + 0.4655i | 0.1152 + 0.4655i | 0.1152 + 0.4655i | 0.1152 + 0.4655i | 0.1152 + 0.4655i | 0.1152 + 0.4655i | 0.1152 + 0.4655i |
| 14.5 | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i |
| 15 | 0.1089 + 0.9337i | 0.1089 + 0.9337i | 0.1089 + 0.9337i | 0.1089 + 0.9337i | 0.1557 + 0.8813i | 0.1557 + 0.8813i | 0.1557 + 0.8813i | 0.1557 + 0.8813i |
| 15.5 | 0.1085 + 0.9312i | 0.1085 + 0.9312i | 0.1085 + 0.9312i | 0.1085 + 0.9312i | 0.1630 + 0.8872i | 0.1630 + 0.8872i | 0.1630 + 0.8872i | 0.1630 + 0.8872i |
| 16 | 0.1059 + 1.1569i | 0.1438 + 1.1408i | 0.1040 + 1.1819i | 0.1450 + 1.1564i | 0.1528 + 0.9550i | 0.1668 + 0.9656i | 0.1528 + 0.9550i | 0.1668 + 0.9656i |
| 16.5 | 0.0972 + 1.5339i | 0.1100 + 1.2587i | 0.1342 + 1.7892i | 0.1127 + 1.2073i | 0.1134 + 0.9196i | 0.1137 + 0.9858i | 0.1134 + 0.9196i | 0.1137 + 0.9858i |
| 17 | 0.0983 + 1.5325i | 0.1102 + 1.2536i | 0.1311 + 1.7918i | 0.1116 + 1.2028i | 0.1130 + 0.9150i | 0.1137 + 0.9836i | 0.1130 + 0.9150i | 0.1137 + 0.9836i |
| 17.5 | 0.0987 + 1.5243i | 0.1109 + 1.2478i | 0.1257 + 1.7839i | 0.1117 + 1.1979i | 0.1131 + 0.9127i | 0.1143 + 0.9836i | 0.1131 + 0.9127i | 0.1143 + 0.9836i |
| 18 | 0.1006 + 1.5247i | 0.1086 + 1.2380i | 0.1242 + 1.7780i | 0.1086 + 1.1943i | 0.1042 + 0.9141i | 0.1072 + 0.9814i | 0.1042 + 0.9141i | 0.1055 + 0.9946i |
| 18.5 | 0.0767 + 1.5118i | 0.0870 + 1.3422i | 0.1944 + 2.0287i | 0.0901 + 1.2929i | 0.0881 + 1.0369i | 0.0875 + 1.1126i | 0.0881 + 1.0369i | 0.0875 + 1.1126i |
| 19 | 0.0744 + 1.4981i | 0.0851 + 1.3326i | 0.1794 + 2.0056i | 0.0874 + 1.2840i | 0.0808 + 1.0409i | 0.0820 + 1.1126i | 0.0808 + 1.0409i | 0.0820 + 1.1126i |
| 19.5 | 0.0752 + 1.5337i | 0.0955 + 1.3157i | 0.1184 + 1.4863i | 0.0955 + 1.3157i | 0.0762 + 1.0479i | 0.0803 + 1.1289i | 0.0762 + 1.0479i | 0.0803 + 1.1289i |
| 20 | 0.1316 + 1.8965i | 0.0766 + 1.0786i | 0.0714 + 1.3185i | 0.0721 + 1.1636i | 0.0703 + 0.7860i | 0.0676 + 0.8645i | 0.0703 + 0.7860i | 0.0683 + 0.8425i |
| 20.5 | 0.0626 + 1.4912i | 0.0683 + 1.1894i | 0.0906 + 1.3933i | 0.0705 + 1.2277i | 0.0650 + 0.9379i | 0.0667 + 1.0256i | 0.0650 + 0.9379i | 0.0667 + 1.0256i |
| 21 | 0.0566 + 1.3765i | 0.0634 + 1.2157i | 0.1312 + 1.8435i | 0.0646 + 1.1619i | 0.0641 + 0.9102i | 0.0644 + 1.0160i | 0.0641 + 0.9102i | 0.0644 + 1.0160i |
| 21.5 | 0.0769 + 1.6079i | 0.0600 + 1.1808i | 0.0696 + 1.4311i | 0.0605 + 1.2664i | 0.0589 + 0.8958i | 0.0594 + 1.0467i | 0.0589 + 0.8958i | 0.0594 + 1.0150i |
| 22 | 0.0510 + 1.3552i | 0.0609 + 1.2217i | 0.1064 + 1.8045i | 0.0551 + 1.1486i | 0.0634 + 0.8931i | 0.0605 + 0.9972i | 0.0634 + 0.8931i | 0.0583 + 1.0193i |
| 22.5 | 0.0791 + 1.6235i | 0.0595 + 1.1619i | 0.0601 + 1.4463i | 0.0547 + 1.2748i | 0.0600 + 0.8898i | 0.0596 + 1.0378i | 0.0600 + 0.8898i | 0.0611 + 0.9993i |
| 23 | 0.0749 + 1.6355i | 0.0569 + 1.1877i | 0.0706 + 1.4379i | 0.0637 + 1.3045i | 0.0532 + 0.8809i | 0.0510 + 1.0772i | 0.0502 + 0.9016i | 0.0557 + 1.0136i |
| 23.5 | 0.0477 + 1.8317i | 0.0474 + 1.1599i | 0.0728 + 1.4375i | 0.0610 + 1.3181i | 0.0574 + 0.8705i | 0.0537 + 1.0431i | 0.0579 + 0.8886i | 0.0564 + 0.9856i |
| 24 | 0.0878 + 1.7221i | 0.0632 + 1.2393i | 0.0735 + 1.5241i | 0.0421 + 1.3702i | 0.0570 + 0.9140i | 0.0611 + 1.1293i | 0.0580 + 0.9491i | 0.0593 + 1.0507i |
| 24.5 | 0.0895 + 1.7536i | 0.0613 + 1.3638i | 0.0760 + 1.5470i | 0.0501 + 1.2243i | 0.0488 + 0.9067i | 0.0467 + 1.0086i | 0.0503 + 0.8690i | 0.0466 + 1.1053i |
| 25 | 0.0931 + 1.7166i | 0.0566 + 1.3482i | 0.0751 + 1.5225i | 0.0462 + 1.2117i | 0.0474 + 0.9022i | 0.0455 + 0.9995i | 0.0493 + 0.8602i | 0.0444 + 1.0970i |
| 25.5 | 0.0758 + 1.6507i | 0.0505 + 1.3310i | 0.0710 + 1.4902i | 0.0549 + 1.2097i | 0.0438 + 0.9415i | 0.0377 + 1.0346i | 0.0846 + 0.9291i | 0.0622 + 1.1023i |

-continued

| | | | | | | | | |
|---|---|---|---|---|---|---|---|---|
| 26 | 0.0601 + 1.4639i | 0.0558 + 1.3274i | 0.1068 + 1.6195i | 0.0328 + 1.1706i | 0.0577 + 0.8856i | 0.0286 + 0.8791i | 0.0642 + 0.9670i | 0.0431 + 1.0429i |
| 26.5 | 0.0683 + 1.5203i | 0.0701 + 1.3841i | 0.0850 + 1.6726i | 0.0362 + 1.2588i | 0.0544 + 0.9100i | 0.0513 + 0.9841i | 0.0324 + 1.1232i | 0.0576 + 1.0610i |
| 27 | 0.0637 + 1.4870i | 0.0530 + 1.3497i | 0.0764 + 1.6418i | 0.0536 + 1.2353i | 0.0420 + 0.9016i | 0.0378 + 0.9756i | 0.0444 + 1.1113i | 0.0805 + 1.0397i |
| 27.5 | 0.0628 + 1.3974i | 0.0561 + 1.2894i | 0.0641 + 1.5359i | 0.1283 + 1.2196i | 0.0408 + 0.9054i | 0.0369 + 0.9810i | 0.0341 + 1.1435i | 0.0589 + 1.0577i |
| 28 | 0.0586 + 1.3727i | 0.1555 + 1.3034i | 0.0663 + 1.5122i | 0.1473 + 1.1900i | 0.0359 + 0.9236i | 0.0375 + 1.0235i | 0.0402 + 1.2339i | 0.0477 + 1.1266i |

| SNR/w | w136 | w137 | w138 | w139 | w140 | w141 | w142 | w143 |
|---|---|---|---|---|---|---|---|---|
| 7 | 0.2420 + 0.4138i | 0.2556 + 0.4501i | 0.2420 + 0.4138i | 0.2556 + 0.4501i | 0.2556 + 0.4501i | 0.2556 + 0.4501i | 0.2556 + 0.4501i | 0.2556 + 0.4501i |
| 7.5 | 0.2420 + 0.4261i | 0.2420 + 0.4261i | 0.2280 + 0.4017i | 0.2280 + 0.4017i | 0.2648 + 0.4537i | 0.2648 + 0.4537i | 0.2379 + 0.4490i | 0.2420 + 0.4261i |
| 8 | 0.2367 + 0.4280i | 0.2367 + 0.4280i | 0.2367 + 0.4280i | 0.2367 + 0.4280i | 0.2367 + 0.4280i | 0.2367 + 0.4280i | 0.2367 + 0.4280i | 0.2367 + 0.4280i |
| 8.5 | 0.2302 + 0.4919i | 0.2302 + 0.4919i | 0.2302 + 0.4919i | 0.2302 + 0.4919i | 0.2709 + 0.4857i | 0.2709 + 0.4857i | 0.2709 + 0.4857i | 0.2709 + 0.4857i |
| 9 | 0.3041 + 1.5225i | 0.2910 + 1.4129i | 0.2910 + 1.4129i | 0.2850 + 1.3540i | 0.2910 + 1.4129i | 0.2850 + 1.3540i | 0.2850 + 1.3540i | 0.2850 + 1.3540i |
| 9.5 | 0.3016 + 1.5258i | 0.2850 + 1.4155i | 0.2850 + 1.4155i | 0.2850 + 1.4155i | 0.2850 + 1.4155i | 0.2850 + 1.4155i | 0.2850 + 1.4155i | 0.2772 + 1.3604i |
| 10 | 0.3009 + 1.5258i | 0.2854 + 1.4442i | 0.2854 + 1.4442i | 0.2768 + 1.3998i | 0.2854 + 1.4442i | 0.2768 + 1.3998i | 0.2768 + 1.3998i | 0.2768 + 1.3998i |
| 10.5 | 0.3041 + 1.5241i | 0.2857 + 1.4497i | 0.2857 + 1.4497i | 0.2756 + 1.4128i | 0.2857 + 1.4497i | 0.2756 + 1.4128i | 0.2857 + 1.4497i | 0.2756 + 1.4128i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1262 + 0.3791i | 0.1262 + 0.3791i | 0.1262 + 0.3791i | 0.1262 + 0.3791i | 0.1262 + 0.3791i | 0.1262 + 0.3791i | 0.1262 + 0.3791i | 0.1262 + 0.3791i |
| 13 | 0.2783 + 2.0929i | 0.2668 + 1.5463i | 0.2047 + 1.8160i | 0.2333 + 1.6150i | 0.1726 + 1.2844i | 0.1953 + 1.3258i | 0.1726 + 1.2844i | 0.1790 + 1.3480i |
| 13.5 | 0.1166 + 0.4366i | 0.1166 + 0.4366i | 0.1166 + 0.4366i | 0.1166 + 0.4366i | 0.1166 + 0.4366i | 0.1166 + 0.4366i | 0.1166 + 0.4366i | 0.1166 + 0.4366i |
| 14 | 0.1152 + 0.4655i | 0.1152 + 0.4655i | 0.1152 + 0.4655i | 0.1152 + 0.4655i | 0.1152 + 0.4655i | 0.1152 + 0.4655i | 0.1152 + 0.4655i | 0.1152 + 0.4655i |
| 14.5 | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i |
| 15 | 0.1089 + 0.9337i | 0.1089 + 0.9337i | 0.1089 + 0.9337i | 0.1089 + 0.9337i | 0.1557 + 0.8813i | 0.1557 + 0.8813i | 0.1557 + 0.8813i | 0.1557 + 0.8813i |
| 15.5 | 0.1085 + 0.9483i | 0.1085 + 0.9312i | 0.1085 + 0.9483i | 0.1085 + 0.9312i | 0.1645 + 0.8964i | 0.1630 + 0.8872i | 0.1645 + 0.8964i | 0.1630 + 0.8872i |
| 16 | 0.1059 + 1.1569i | 0.1438 + 1.1408i | 0.1040 + 1.1819i | 0.1450 + 1.1564i | 0.1528 + 0.9550i | 0.1668 + 0.9656i | 0.1528 + 0.9550i | 0.1668 + 0.9656i |
| 16.5 | 0.1003 + 1.4730i | 0.1100 + 1.2587i | 0.2016 + 2.0694i | 0.1127 + 1.2073i | 0.1134 + 0.9196i | 0.1137 + 0.9858i | 0.1134 + 0.9196i | 0.1137 + 0.9858i |
| 17 | 0.0998 + 1.4730i | 0.1102 + 1.2536i | 0.2013 + 2.0723i | 0.1116 + 1.2028i | 0.1130 + 0.9150i | 0.1137 + 0.9836i | 0.1130 + 0.9150i | 0.1137 + 0.9836i |
| 17.5 | 0.0988 + 1.4659i | 0.1109 + 1.2478i | 0.1973 + 2.0632i | 0.1117 + 1.1979i | 0.1131 + 0.9127i | 0.1143 + 0.9836i | 0.1131 + 0.9127i | 0.1143 + 0.9836i |
| 18 | 0.0991 + 1.4625i | 0.1137 + 1.2538i | 0.1977 + 2.0538i | 0.1157 + 1.2020i | 0.1192 + 0.9118i | 0.1211 + 0.9760i | 0.1192 + 0.9118i | 0.1191 + 0.9891i |
| 18.5 | 0.1910 + 1.5579i | 0.2343 + 1.3492i | 0.1431 + 1.7701i | 0.2372 + 1.2959i | 0.1908 + 1.0283i | 0.2028 + 1.0935i | 0.1908 + 1.0283i | 0.2073 + 1.1122i |
| 19 | 0.2005 + 1.5419i | 0.2412 + 1.3402i | 0.1377 + 1.7502i | 0.2448 + 1.2861i | 0.2107 + 1.0297i | 0.2201 + 1.0924i | 0.2107 + 1.0297i | 0.2243 + 1.1127i |
| 19.5 | 0.1545 + 1.7181i | 0.2624 + 1.2819i | 0.2850 + 1.5423i | 0.2677 + 1.3192i | 0.2186 + 1.0320i | 0.2321 + 1.1085i | 0.2186 + 1.0320i | 0.2321 + 1.1085i |
| 20 | 0.0990 + 1.6597i | 0.0805 + 1.0463i | 0.0744 + 1.4636i | 0.0766 + 1.0786i | 0.1218 + 0.7966i | 0.1017 + 0.8881i | 0.1218 + 0.7966i | 0.1070 + 0.8657i |
| 20.5 | 0.1248 + 1.6210i | 0.1954 + 1.1793i | 0.2104 + 1.4066i | 0.1960 + 1.2212i | 0.1871 + 0.9324i | 0.1917 + 1.0185i | 0.1871 + 0.9324i | 0.1917 + 1.0185i |
| 21 | 0.1464 + 1.4100i | 0.1799 + 1.2274i | 0.0916 + 1.6132i | 0.1856 + 1.1690i | 0.1852 + 0.9092i | 0.1864 + 1.0088i | 0.1852 + 0.9092i | 0.1871 + 1.0292i |
| 21.5 | 0.1329 + 1.8110i | 0.1785 + 1.1792i | 0.1881 + 1.4135i | 0.1836 + 1.2632i | 0.1684 + 0.8948i | 0.1728 + 1.0462i | 0.1684 + 0.8948i | 0.1721 + 1.0147i |
| 22 | 0.0760 + 1.4947i | 0.1660 + 1.1960i | 0.1932 + 1.6270i | 0.1685 + 1.1538i | 0.1862 + 0.8964i | 0.1808 + 1.0223i | 0.1862 + 0.8964i | 0.1808 + 1.0223i |
| 22.5 | 0.1993 + 1.7519i | 0.1777 + 1.1663i | 0.1733 + 1.4310i | 0.1704 + 1.2820i | 0.1781 + 0.8873i | 0.1775 + 1.0391i | 0.1781 + 0.8873i | 0.1776 + 0.9980i |

-continued

| | | | | | | | | |
|---|---|---|---|---|---|---|---|---|
| 23 | 0.0964 + 1.7933i | 0.1763 + 1.1862i | 0.1993 + 1.4336i | 0.1869 + 1.2930i | 0.1577 + 0.8931i | 0.1678 + 1.0712i | 0.1577 + 0.8931i | 0.1592 + 1.0127i |
| 23.5 | 0.2224 + 1.7477i | 0.1587 + 1.1598i | 0.0786 + 1.6259i | 0.1644 + 1.2701i | 0.1723 + 0.8716i | 0.1654 + 1.0555i | 0.1712 + 0.8911i | 0.1690 + 0.9911i |
| 24 | 0.2059 + 1.3214i | 0.1962 + 1.2278i | 0.2073 + 1.4403i | 0.2541 + 1.5814i | 0.1734 + 0.9105i | 0.1853 + 1.1204i | 0.1736 + 0.9440i | 0.1790 + 1.0453i |
| 24.5 | 0.3255 + 1.7591i | 0.1702 + 1.3294i | 0.2212 + 1.6117i | 0.1562 + 1.2055i | 0.1514 + 0.9059i | 0.1398 + 1.0100i | 0.1508 + 0.8749i | 0.1427 + 1.0977i |
| 25 | 0.3472 + 1.7040i | 0.1573 + 1.3131i | 0.2161 + 1.5686i | 0.1468 + 1.1983i | 0.1475 + 0.9016i | 0.1353 + 1.0028i | 0.1463 + 0.8662i | 0.1358 + 1.0939i |
| 25.5 | 0.2337 + 1.6652i | 0.2321 + 1.1730i | 0.2083 + 1.5062i | 0.1547 + 1.2132i | 0.2051 + 0.9488i | 0.2157 + 1.0645i | 0.1608 + 0.9436i | 0.1497 + 1.0697i |
| 26 | 0.3076 + 1.5930i | 0.1352 + 1.2642i | 0.2100 + 1.4742i | 0.1117 + 1.1707i | 0.1697 + 0.9111i | 0.1855 + 1.0551i | 0.1491 + 0.9425i | 0.1223 + 1.0684i |
| 26.5 | 0.2675 + 1.6286i | 0.1335 + 1.3004i | 0.2245 + 1.4893i | 0.1429 + 1.2032i | 0.1579 + 0.9322i | 0.1592 + 1.0119i | 0.1815 + 0.8811i | 0.1547 + 1.1064i |
| 27 | 0.2178 + 1.5591i | 0.1947 + 1.1461i | 0.1887 + 1.4107i | 0.1532 + 1.2458i | 0.2220 + 0.9109i | 0.2132 + 1.0386i | 0.1577 + 0.9120i | 0.1514 + 1.0025i |
| 27.5 | 0.2076 + 1.6180i | 0.2354 + 1.1287i | 0.1770 + 1.4782i | 0.1619 + 1.1335i | 0.2094 + 0.9195i | 0.2160 + 1.0223i | 0.1473 + 0.9211i | 0.1402 + 1.0282i |
| 28 | 0.2491 + 1.5678i | 0.2319 + 1.0829i | 0.1797 + 1.4545i | 0.1551 + 1.0959i | 0.2134 + 0.9134i | 0.2284 + 0.9984i | 0.1399 + 0.9185i | 0.1422 + 1.0060i |

| SNR/w | w144 | w145 | w146 | w147 | w148 | w149 | w150 | w151 |
|---|---|---|---|---|---|---|---|---|
| 7 | 0.2420 + 0.4138i | 0.2556 + 0.4501i | 0.2420 + 0.4138i | 0.2556 + 0.4501i | 0.2556 + 0.4501i | 0.2556 + 0.4501i | 0.2556 + 0.4501i | 0.2556 + 0.4501i |
| 7.5 | 0.2420 + 0.4261i | 0.2420 + 0.4261i | 0.2420 + 0.4261i | 0.2280 + 0.4017i | 0.2648 + 0.4537i | 0.2648 + 0.4537i | 0.2379 + 0.4490i | 0.2379 + 0.4490i |
| 8 | 0.2367 + 0.4280i | 0.2367 + 0.4280i | 0.2367 + 0.4280i | 0.2367 + 0.4280i | 0.2367 + 0.4280i | 0.2367 + 0.4280i | 0.2367 + 0.4280i | 0.2367 + 0.4280i |
| 8.5 | 0.2203 + 0.3946i | 0.2067 + 0.3753i | 0.2203 + 0.3946i | 0.2067 + 0.3753i | 0.2203 + 0.3946i | 0.2203 + 0.3946i | 0.2203 + 0.3946i | 0.2203 + 0.3946i |
| 9 | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i |
| 10 | 0.2441 + 1.0164i | 0.2441 + 1.0164i | 0.2441 + 1.0164i | 0.2441 + 1.0164i | 0.2441 + 1.0164i | 0.2441 + 1.0164i | 0.2441 + 1.0164i | 0.2441 + 1.0164i |
| 10.5 | 0.2321 + 1.0073i | 0.2321 + 1.0073i | 0.2321 + 1.0073i | 0.2321 + 1.0073i | 0.2321 + 1.0073i | 0.2321 + 1.0073i | 0.2321 + 1.0073i | 0.2334 + 1.0266i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1570 + 0.3698i | 0.1570 + 0.3698i | 0.1570 + 0.3698i | 0.1570 + 0.3698i | 0.1570 + 0.3698i | 0.1570 + 0.3698i | 0.1570 + 0.3698i | 0.1570 + 0.3698i |
| 13 | 0.1639 + 0.8829i | 0.1639 + 0.8829i | 0.1639 + 0.8829i | 0.1639 + 0.8829i | 0.1563 + 0.9531i | 0.1563 + 0.9531i | 0.1563 + 0.9531i | 0.1563 + 0.9531i |
| 13.5 | 0.1613 + 0.4107i | 0.1613 + 0.4107i | 0.1613 + 0.4107i | 0.1613 + 0.4107i | 0.1613 + 0.4107i | 0.1613 + 0.4107i | 0.1613 + 0.4107i | 0.1613 + 0.4107i |
| 14 | 0.1677 + 0.4235i | 0.1677 + 0.4235i | 0.1677 + 0.4235i | 0.1677 + 0.4235i | 0.1677 + 0.4235i | 0.1677 + 0.4235i | 0.1677 + 0.4235i | 0.1677 + 0.4235i |
| 14.5 | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i |
| 15 | 0.1386 + 0.6110i | 0.1386 + 0.6110i | 0.1386 + 0.6110i | 0.1386 + 0.6110i | 0.1475 + 0.6274i | 0.1475 + 0.6274i | 0.1475 + 0.6274i | 0.1475 + 0.6274i |
| 15.5 | 0.1374 + 0.6149i | 0.1374 + 0.6149i | 0.1374 + 0.6149i | 0.1374 + 0.6149i | 0.1484 + 0.6322i | 0.1484 + 0.6322i | 0.1484 + 0.6322i | 0.1484 + 0.6322i |
| 16 | 0.1233 + 0.6305i | 0.1233 + 0.6305i | 0.1233 + 0.6305i | 0.1233 + 0.6305i | 0.1305 + 0.7061i | 0.1305 + 0.7061i | 0.1305 + 0.7061i | 0.1305 + 0.7061i |
| 16.5 | 0.1119 + 0.5862i | 0.1119 + 0.5862i | 0.1119 + 0.5862i | 0.1119 + 0.5862i | 0.1120 + 0.6858i | 0.1121 + 0.6631i | 0.1120 + 0.6858i | 0.1121 + 0.6631i |
| 17 | 0.1116 + 0.5832i | 0.1116 + 0.5832i | 0.1116 + 0.5832i | 0.1116 + 0.5832i | 0.1115 + 0.6931i | 0.1117 + 0.6678i | 0.1115 + 0.6931i | 0.1117 + 0.6678i |
| 17.5 | 0.1111 + 0.5789i | 0.1111 + 0.5789i | 0.1111 + 0.5789i | 0.1111 + 0.5789i | 0.1111 + 0.7043i | 0.1113 + 0.6783i | 0.1111 + 0.7043i | 0.1113 + 0.6783i |
| 18 | 0.1015 + 0.5717i | 0.1015 + 0.5717i | 0.1015 + 0.5717i | 0.1015 + 0.5717i | 0.1014 + 0.7157i | 0.1017 + 0.6908i | 0.1014 + 0.7157i | 0.1017 + 0.6908i |
| 18.5 | 0.0945 + 0.6545i | 0.0945 + 0.6545i | 0.0945 + 0.6545i | 0.0945 + 0.6545i | 0.0919 + 0.8514i | 0.0921 + 0.8282i | 0.0919 + 0.8514i | 0.0921 + 0.8282i |
| 19 | 0.0846 + 0.6736i | 0.0846 + 0.6736i | 0.0846 + 0.6736i | 0.0846 + 0.6736i | 0.0812 + 0.8671i | 0.0812 + 0.8456i | 0.0812 + 0.8671i | 0.0812 + 0.8456i |
| 19.5 | 0.0756 + 0.6874i | 0.0756 + 0.6874i | 0.0756 + 0.6874i | 0.0756 + 0.6874i | 0.0736 + 0.8802i | 0.0737 + 0.8541i | 0.0736 + 0.8802i | 0.0737 + 0.8541i |

-continued

| | | | | | | | | |
|---|---|---|---|---|---|---|---|---|
| 20 | 0.0686 + 0.4786i | 0.0686 + 0.4786i | 0.0686 + 0.4786i | 0.0686 + 0.4786i | 0.0683 + 0.6269i | 0.0678 + 0.6031i | 0.0683 + 0.6269i | 0.0678 + 0.6031i |
| 20.5 | 0.0633 + 0.6036i | 0.0633 + 0.6036i | 0.0633 + 0.6036i | 0.0633 + 0.6036i | 0.0638 + 0.7848i | 0.0635 + 0.7547i | 0.0638 + 0.7848i | 0.0635 + 0.7547i |
| 21 | 0.0612 + 0.5785i | 0.0612 + 0.5785i | 0.0612 + 0.5785i | 0.0612 + 0.5785i | 0.0626 + 0.7673i | 0.0622 + 0.7241i | 0.0626 + 0.7673i | 0.0622 + 0.7241i |
| 21.5 | 0.0581 + 0.5423i | 0.0579 + 0.5611i | 0.0581 + 0.5423i | 0.0579 + 0.5611i | 0.0579 + 0.7549i | 0.0575 + 0.6950i | 0.0579 + 0.7549i | 0.0575 + 0.6950i |
| 22 | 0.0593 + 0.5614i | 0.0595 + 0.5811i | 0.0593 + 0.5614i | 0.0595 + 0.5811i | 0.0617 + 0.7653i | 0.0609 + 0.7080i | 0.0617 + 0.7653i | 0.0609 + 0.7080i |
| 22.5 | 0.0588 + 0.5488i | 0.0585 + 0.5738i | 0.0588 + 0.5488i | 0.0585 + 0.5738i | 0.0597 + 0.7658i | 0.0589 + 0.6968i | 0.0597 + 0.7658i | 0.0589 + 0.6968i |
| 23 | 0.0592 + 0.5283i | 0.0572 + 0.5601i | 0.0592 + 0.5283i | 0.0572 + 0.5601i | 0.0523 + 0.7605i | 0.0530 + 0.6770i | 0.0523 + 0.7605i | 0.0530 + 0.6770i |
| 23.5 | 0.0579 + 0.5297i | 0.0582 + 0.5729i | 0.0579 + 0.5297i | 0.0582 + 0.5729i | 0.0573 + 0.7643i | 0.0571 + 0.6803i | 0.0573 + 0.7643i | 0.0571 + 0.6803i |
| 24 | 0.0551 + 0.5330i | 0.0552 + 0.6012i | 0.0551 + 0.5330i | 0.0552 + 0.6012i | 0.0559 + 0.8129i | 0.0555 + 0.7029i | 0.0566 + 0.8015i | 0.0555 + 0.7029i |
| 24.5 | 0.0588 + 0.5230i | 0.0585 + 0.5848i | 0.0588 + 0.5230i | 0.0585 + 0.5848i | 0.0535 + 0.7638i | 0.0578 + 0.6777i | 0.0545 + 0.7749i | 0.0578 + 0.6777i |
| 25 | 0.0574 + 0.5122i | 0.0570 + 0.5825i | 0.0574 + 0.5122i | 0.0570 + 0.5825i | 0.0515 + 0.7571i | 0.0570 + 0.6711i | 0.0541 + 0.7704i | 0.0570 + 0.6711i |
| 25.5 | 0.0438 + 0.5661i | 0.0416 + 0.6480i | 0.0669 + 0.5658i | 0.0677 + 0.6466i | 0.0422 + 0.8329i | 0.0420 + 0.7408i | 0.0806 + 0.8359i | 0.0735 + 0.7378i |
| 26 | 0.0362 + 0.5516i | 0.0352 + 0.6211i | 0.0930 + 0.5503i | 0.0944 + 0.6214i | 0.0501 + 0.7778i | 0.0354 + 0.7025i | 0.0941 + 0.7686i | 0.0950 + 0.6968i |
| 26.5 | 0.0319 + 0.5344i | 0.0328 + 0.6243i | 0.0702 + 0.5348i | 0.0709 + 0.6199i | 0.0401 + 0.8246i | 0.0334 + 0.7183i | 0.0928 + 0.7983i | 0.0787 + 0.7149i |
| 27 | 0.0308 + 0.5613i | 0.0315 + 0.6418i | 0.0874 + 0.5600i | 0.0899 + 0.6395i | 0.0368 + 0.8194i | 0.0314 + 0.7259i | 0.0953 + 0.8062i | 0.0929 + 0.7245i |
| 27.5 | 0.0313 + 0.5647i | 0.0315 + 0.6436i | 0.0920 + 0.5643i | 0.0922 + 0.6441i | 0.0347 + 0.8220i | 0.0302 + 0.7280i | 0.0933 + 0.8100i | 0.0920 + 0.7282i |
| 28 | 0.0301 + 0.5655i | 0.0298 + 0.6462i | 0.0886 + 0.5661i | 0.0881 + 0.6466i | 0.0319 + 0.8305i | 0.0282 + 0.7314i | 0.0870 + 0.8145i | 0.0878 + 0.7323i |

| SNR/w | w152 | w153 | w154 | w155 | w156 | w157 | w158 | w159 |
|---|---|---|---|---|---|---|---|---|
| 7 | 0.2556 + 0.4501i | 0.2556 + 0.4501i | 0.2556 + 0.4501i | 0.2556 + 0.4501i | 0.2556 + 0.4501i | 0.2688 + 0.4861i | 0.2556 + 0.4501i | 0.2688 + 0.4861i |
| 7.5 | 0.2648 + 0.4537i | 0.2648 + 0.4537i | 0.2379 + 0.4490i | 0.2420 + 0.4261i | 0.2798 + 0.4856i | 0.2798 + 0.4856i | 0.2466 + 0.4825i | 0.2466 + 0.4825i |
| 8 | 0.2367 + 0.4780i | 0.2367 + 0.4780i | 0.2367 + 0.4780i | 0.2367 + 0.4780i | 0.2728 + 0.4786i | 0.2728 + 0.4786i | 0.2728 + 0.4786i | 0.2728 + 0.4786i |
| 8.5 | 0.2360 + 0.5215i | 0.2360 + 0.5215i | 0.2360 + 0.5215i | 0.2360 + 0.5215i | 0.2843 + 0.5113i | 0.2843 + 0.5113i | 0.2843 + 0.5113i | 0.2843 + 0.5113i |
| 9 | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i |
| 10 | 0.2441 + 1.0164i | 0.2441 + 1.0164i | 0.2441 + 1.0164i | 0.2441 + 1.0164i | 0.2441 + 1.0164i | 0.2441 + 1.0164i | 0.2441 + 1.0164i | 0.2450 + 1.0381i |
| 10.5 | 0.2321 + 1.0073i | 0.2321 + 1.0073i | 0.2321 + 1.0073i | 0.2334 + 1.0266i | 0.2321 + 1.0073i | 0.2334 + 1.0266i | 0.2321 + 1.0073i | 0.2334 + 1.0266i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1570 + 0.3698i | 0.1570 + 0.3698i | 0.1570 + 0.3698i | 0.1570 + 0.3698i | 0.1570 + 0.3698i | 0.1570 + 0.3698i | 0.1570 + 0.3698i | 0.1570 + 0.3698i |
| 13 | 0.1639 + 0.8829i | 0.1639 + 0.8829i | 0.1639 + 0.8829i | 0.1639 + 0.8829i | 0.1563 + 0.9531i | 0.1563 + 0.9531i | 0.1563 + 0.9531i | 0.1563 + 0.9531i |
| 13.5 | 0.1613 + 0.4107i | 0.1613 + 0.4107i | 0.1613 + 0.4107i | 0.1613 + 0.4107i | 0.1613 + 0.4107i | 0.1613 + 0.4107i | 0.1613 + 0.4107i | 0.1613 + 0.4107i |
| 14 | 0.1677 + 0.4235i | 0.1677 + 0.4235i | 0.1677 + 0.4235i | 0.1677 + 0.4235i | 0.1677 + 0.4235i | 0.1677 + 0.4235i | 0.1677 + 0.4235i | 0.1677 + 0.4235i |
| 14.5 | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i |
| 15 | 0.1386 + 0.6110i | 0.1386 + 0.6110i | 0.1386 + 0.6110i | 0.1386 + 0.6110i | 0.1475 + 0.6274i | 0.1386 + 0.6110i | 0.1475 + 0.6274i | 0.1475 + 0.6274i |
| 15.5 | 0.1374 + 0.6149i | 0.1374 + 0.6149i | 0.1374 + 0.6149i | 0.1374 + 0.6149i | 0.1484 + 0.6322i | 0.1484 + 0.6322i | 0.1484 + 0.6322i | 0.1484 + 0.6322i |
| 16 | 0.1233 + 0.6305i | 0.1233 + 0.6305i | 0.1233 + 0.6305i | 0.1233 + 0.6305i | 0.1305 + 0.7061i | 0.1305 + 0.7061i | 0.1305 + 0.7061i | 0.1305 + 0.7061i |
| 16.5 | 0.1119 + 0.5862i | 0.1119 + 0.5862i | 0.1119 + 0.5862i | 0.1119 + 0.5862i | 0.1120 + 0.6858i | 0.1121 + 0.6631i | 0.1120 + 0.6858i | 0.1121 + 0.6631i |

-continued

| | | | | | | | | |
|---|---|---|---|---|---|---|---|---|
| 17 | 0.1116 + 0.5832i | 0.1116 + 0.5832i | 0.1116 + 0.5832i | 0.1116 + 0.5832i | 0.1115 + 0.6931i | 0.1117 + 0.6678i | 0.1115 + 0.6931i | 0.1117 + 0.6678i |
| 17.5 | 0.1111 + 0.5789i | 0.1111 + 0.5789i | 0.1111 + 0.5789i | 0.1111 + 0.5789i | 0.1111 + 0.7043i | 0.1113 + 0.6783i | 0.1111 + 0.7043i | 0.1113 + 0.6783i |
| 18 | 0.1198 + 0.5719i | 0.1198 + 0.5719i | 0.1198 + 0.5719i | 0.1198 + 0.5719i | 0.1189 + 0.7162i | 0.1194 + 0.6916i | 0.1189 + 0.7162i | 0.1194 + 0.6916i |
| 18.5 | 0.1260 + 0.6530i | 0.1260 + 0.6530i | 0.1260 + 0.6530i | 0.1260 + 0.6530i | 0.1528 + 0.8453i | 0.1485 + 0.8227i | 0.1528 + 0.8453i | 0.1485 + 0.8227i |
| 19 | 0.1415 + 0.6692i | 0.1415 + 0.6692i | 0.1415 + 0.6692i | 0.1415 + 0.6692i | 0.1770 + 0.8573i | 0.1723 + 0.8358i | 0.1770 + 0.8573i | 0.1723 + 0.8358i |
| 19.5 | 0.1571 + 0.6805i | 0.1571 + 0.6805i | 0.1571 + 0.6805i | 0.1571 + 0.6805i | 0.1912 + 0.8683i | 0.1870 + 0.8435i | 0.1912 + 0.8683i | 0.1870 + 0.8435i |
| 20 | 0.1756 + 0.4881i | 0.1756 + 0.4881i | 0.1756 + 0.4881i | 0.1756 + 0.4881i | 0.1516 + 0.6364i | 0.1554 + 0.6129i | 0.1516 + 0.6364i | 0.1554 + 0.6129i |
| 20.5 | 0.1741 + 0.6024i | 0.1741 + 0.6024i | 0.1741 + 0.6024i | 0.1741 + 0.6024i | 0.1809 + 0.7811i | 0.1801 + 0.7517i | 0.1809 + 0.7811i | 0.1801 + 0.7517i |
| 21 | 0.1729 + 0.5763i | 0.1729 + 0.5763i | 0.1729 + 0.5763i | 0.1729 + 0.5763i | 0.1790 + 0.7657i | 0.1773 + 0.7216i | 0.1790 + 0.7657i | 0.1773 + 0.7216i |
| 21.5 | 0.1683 + 0.5443i | 0.1675 + 0.5619i | 0.1683 + 0.5443i | 0.1675 + 0.5619i | 0.1651 + 0.7527i | 0.1644 + 0.6950i | 0.1651 + 0.7527i | 0.1644 + 0.6950i |
| 22 | 0.1766 + 0.5583i | 0.1770 + 0.5787i | 0.1766 + 0.5583i | 0.1770 + 0.5787i | 0.1819 + 0.7649i | 0.1802 + 0.7051i | 0.1819 + 0.7649i | 0.1802 + 0.7051i |
| 22.5 | 0.1728 + 0.5468i | 0.1729 + 0.5691i | 0.1728 + 0.5468i | 0.1729 + 0.5691i | 0.1742 + 0.7575i | 0.1714 + 0.6942i | 0.1742 + 0.7575i | 0.1714 + 0.6942i |
| 23 | 0.1711 + 0.5337i | 0.1696 + 0.5727i | 0.1711 + 0.5337i | 0.1696 + 0.5727i | 0.1663 + 0.7694i | 0.1695 + 0.6852i | 0.1663 + 0.7694i | 0.1695 + 0.6852i |
| 23.5 | 0.1756 + 0.5324i | 0.1748 + 0.5753i | 0.1756 + 0.5324i | 0.1748 + 0.5753i | 0.1727 + 0.7650i | 0.1738 + 0.6824i | 0.1727 + 0.7650i | 0.1738 + 0.6824i |
| 24 | 0.1665 + 0.5324i | 0.1666 + 0.5983i | 0.1665 + 0.5324i | 0.1666 + 0.5983i | 0.1701 + 0.8091i | 0.1674 + 0.7005i | 0.1680 + 0.7988i | 0.1674 + 0.7005i |
| 24.5 | 0.1768 + 0.5229i | 0.1754 + 0.5881i | 0.1768 + 0.5229i | 0.1754 + 0.5881i | 0.1686 + 0.7746i | 0.1713 + 0.6822i | 0.1623 + 0.7828i | 0.1713 + 0.6822i |
| 25 | 0.1816 + 0.5127i | 0.1789 + 0.5856i | 0.1653 + 0.5129i | 0.1653 + 0.5854i | 0.1672 + 0.7680i | 0.1731 + 0.6769i | 0.1580 + 0.7784i | 0.1632 + 0.6743i |
| 25.5 | 0.1867 + 0.5642i | 0.1899 + 0.6415i | 0.1514 + 0.5651i | 0.1527 + 0.6436i | 0.2004 + 0.8274i | 0.1939 + 0.7293i | 0.1615 + 0.8311i | 0.1553 + 0.7315i |
| 26 | 0.2234 + 0.5457i | 0.2245 + 0.6191i | 0.1645 + 0.5475i | 0.1657 + 0.6192i | 0.1857 + 0.8119i | 0.2191 + 0.7001i | 0.1638 + 0.7891i | 0.1706 + 0.6989i |
| 26.5 | 0.1889 + 0.5296i | 0.1889 + 0.6067i | 0.1371 + 0.5320i | 0.1410 + 0.6135i | 0.2034 + 0.7668i | 0.1936 + 0.6930i | 0.1697 + 0.8030i | 0.1474 + 0.6948i |
| 27 | 0.2121 + 0.5552i | 0.2127 + 0.6337i | 0.1515 + 0.5573i | 0.1534 + 0.6358i | 0.2191 + 0.8143i | 0.2146 + 0.7189i | 0.1560 + 0.8180i | 0.1570 + 0.7210i |
| 27.5 | 0.2181 + 0.5647i | 0.2174 + 0.6442i | 0.1553 + 0.5644i | 0.1553 + 0.6440i | 0.2141 + 0.8228i | 0.2166 + 0.7312i | 0.1515 + 0.8243i | 0.1561 + 0.7276i |
| 28 | 0.2101 + 0.5674i | 0.2108 + 0.6469i | 0.1492 + 0.5671i | 0.1491 + 0.6469i | 0.2083 + 0.8201i | 0.2103 + 0.7318i | 0.1448 + 0.8276i | 0.1494 + 0.7302i |

| SNR/w | w160 | w161 | w162 | w163 | w164 | w165 | w166 | w167 |
|---|---|---|---|---|---|---|---|---|
| 7 | 0.2420 + 0.4138i | 0.2556 + 0.4501i | 0.2420 + 0.4138i | 0.2556 + 0.4501i | 0.2556 + 0.4501i | 0.2556 + 0.4501i | 0.2556 + 0.4501i | 0.2556 + 0.4501i |
| 7.5 | 0.2420 + 0.4261i | 0.2420 + 0.4261i | 0.2420 + 0.4261i | 0.2280 + 0.4017i | 0.2648 + 0.4537i | 0.2648 + 0.4537i | 0.2379 + 0.4490i | 0.2420 + 0.4261i |
| 8 | 0.2367 + 0.4280i | 0.2367 + 0.4280i | 0.2367 + 0.4280i | 0.2367 + 0.4280i | 0.2367 + 0.4280i | 0.2367 + 0.4280i | 0.2367 + 0.4280i | 0.2367 + 0.4280i |
| 8.5 | 0.2203 + 0.3946i | 0.2067 + 0.3753i | 0.2203 + 0.3946i | 0.2067 + 0.3753i | 0.2203 + 0.3946i | 0.2203 + 0.3946i | 0.2203 + 0.3946i | 0.2203 + 0.3946i |
| 9 | 1.1715 + 1.7495i | 0.8632 + 1.3087i | 0.8632 + 1.3087i | 0.7953 + 1.2190i | 0.8632 + 1.3087i | 0.7953 + 1.2190i | 0.7953 + 1.2190i | 0.7580 + 1.1712i |
| 9.5 | 1.1695 + 1.7496i | 0.8657 + 1.3032i | 0.8657 + 1.3032i | 0.8104 + 1.2262i | 0.8657 + 1.3032i | 0.8104 + 1.2262i | 0.8104 + 1.2262i | 0.7800 + 1.1846i |
| 10 | 1.1664 + 1.7479i | 0.8650 + 1.2969i | 0.8650 + 1.2969i | 0.8182 + 1.2278i | 0.8650 + 1.2969i | 0.8182 + 1.2278i | 0.8182 + 1.2278i | 0.7929 + 1.1900i |
| 10.5 | 1.1809 + 1.7123i | 0.8481 + 1.2650i | 0.8751 + 1.2974i | 0.8165 + 1.2154i | 0.8751 + 1.2974i | 0.8165 + 1.2154i | 0.8165 + 1.2154i | 0.8165 + 1.2154i |
| 11 | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i |
| 13 | 0.7692 + 1.3337i | 0.7085 + 1.2812i | 0.7085 + 1.2812i | 0.6679 + 1.2607i | 0.6595 + 1.1351i | 0.6299 + 1.1538i | 0.6595 + 1.1351i | 0.6299 + 1.1538i |
| 13.5 | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i |

-continued

| | | | | | | | | |
|---|---|---|---|---|---|---|---|---|
| 14 | 0.1569 + 0.7809i | 0.1569 + 0.7809i | 0.1569 + 0.7809i | 0.1569 + 0.7809i | 0.1952 + 0.7703i | 0.1952 + 0.7703i | 0.1952 + 0.7703i | 0.1952 + 0.7703i |
| 14.5 | 0.1484 + 0.7976i | 0.1484 + 0.7976i | 0.1484 + 0.7976i | 0.1484 + 0.7976i | 0.2008 + 0.7827i | 0.2008 + 0.7827i | 0.2008 + 0.7827i | 0.2008 + 0.7827i |
| 15 | 0.1527 + 1.2540i | 0.2569 + 1.1882i | 0.1527 + 1.2540i | 0.2569 + 1.1882i | 0.4008 + 0.9524i | 0.3978 + 0.9920i | 0.4008 + 0.9524i | 0.3978 + 0.9920i |
| 15.5 | 0.1242 + 1.2740i | 0.1858 + 1.2756i | 0.1242 + 1.2740i | 0.1858 + 1.2756i | 0.4131 + 0.9507i | 0.4099 + 0.9681i | 0.4131 + 0.9507i | 0.4099 + 0.9681i |
| 16 | 0.1921 + 1.5489i | 0.3864 + 1.3049i | 0.2042 + 1.4748i | 0.3684 + 1.3253i | 0.4234 + 0.9406i | 0.4252 + 0.9919i | 0.4234 + 0.9406i | 0.4242 + 0.9783i |
| 16.5 | 0.2958 + 1.5189i | 0.3521 + 1.2456i | 0.3869 + 1.6973i | 0.3623 + 1.2204i | 0.3449 + 0.9161i | 0.3458 + 0.9807i | 0.3449 + 0.9161i | 0.3458 + 0.9807i |
| 17 | 0.2880 + 1.5187i | 0.3502 + 1.2404i | 0.3847 + 1.7131i | 0.3630 + 1.2154i | 0.3550 + 0.9126i | 0.3547 + 0.9796i | 0.3550 + 0.9126i | 0.3547 + 0.9796i |
| 17.5 | 0.2810 + 1.5145i | 0.3493 + 1.2344i | 0.3774 + 1.7181i | 0.3651 + 1.2097i | 0.3605 + 0.9099i | 0.3588 + 0.9801i | 0.3605 + 0.9099i | 0.3588 + 0.9801i |
| 18 | 0.2793 + 1.5139i | 0.3515 + 1.2341i | 0.3797 + 1.7225i | 0.3661 + 1.2067i | 0.3645 + 0.9102i | 0.3621 + 0.9814i | 0.3645 + 0.9102i | 0.3621 + 0.9814i |
| 18.5 | 0.6224 + 1.5379i | 0.5759 + 1.3142i | 0.6038 + 1.8517i | 0.5605 + 1.2517i | 0.4811 + 0.9781i | 0.5006 + 1.0392i | 0.4811 + 0.9781i | 0.5083 + 1.0631i |
| 19 | 0.6136 + 1.5287i | 0.5785 + 1.3124i | 0.6082 + 1.8229i | 0.5656 + 1.2442i | 0.5036 + 0.9733i | 0.5206 + 1.0374i | 0.5036 + 0.9733i | 0.5276 + 1.0642i |
| 19.5 | 0.5093 + 1.8272i | 0.5718 + 1.2403i | 0.5904 + 1.5365i | 0.5797 + 1.3019i | 0.5185 + 0.9693i | 0.5389 + 1.0616i | 0.5185 + 0.9693i | 0.5341 + 1.0394i |
| 20 | 0.3901 + 1.8592i | 0.2655 + 1.0853i | 0.2151 + 1.3209i | 0.2464 + 1.1466i | 0.3484 + 0.8442i | 0.3291 + 0.9137i | 0.3484 + 0.8442i | 0.3291 + 0.9137i |
| 20.5 | 0.3779 + 1.6732i | 0.4566 + 1.1811i | 0.4323 + 1.4599i | 0.4535 + 1.2331i | 0.4614 + 0.9212i | 0.4616 + 1.0134i | 0.4614 + 0.9212i | 0.4616 + 1.0134i |
| 21 | 0.4425 + 1.4246i | 0.4497 + 1.2508i | 0.4339 + 1.6179i | 0.4486 + 1.1809i | 0.4403 + 0.9042i | 0.4459 + 1.0172i | 0.4403 + 0.9042i | 0.4455 + 1.0429i |
| 21.5 | 0.4335 + 1.8289i | 0.4421 + 1.1662i | 0.4338 + 1.4210i | 0.4422 + 1.2638i | 0.4033 + 0.8880i | 0.4226 + 1.0373i | 0.4033 + 0.8880i | 0.4137 + 1.0009i |
| 22 | 0.4811 + 1.5692i | 0.4285 + 1.2414i | 0.4113 + 1.4351i | 0.4373 + 1.2159i | 0.4303 + 0.8997i | 0.4341 + 1.0375i | 0.4303 + 0.8997i | 0.4339 + 1.0572i |
| 22.5 | 0.4404 + 1.7644i | 0.4091 + 1.1667i | 0.4579 + 1.4331i | 0.4310 + 1.2944i | 0.4161 + 0.8850i | 0.4141 + 1.0322i | 0.4161 + 0.8850i | 0.4086 + 0.9927i |
| 23 | 0.4242 + 1.7554i | 0.4248 + 1.1691i | 0.4472 + 1.4475i | 0.4330 + 1.2938i | 0.4215 + 0.8941i | 0.4122 + 1.0484i | 0.4042 + 0.9066i | 0.3988 + 1.0072i |
| 23.5 | 0.3933 + 1.5893i | 0.4100 + 1.1638i | 0.4356 + 1.4074i | 0.4278 + 1.2731i | 0.4283 + 0.8857i | 0.4150 + 1.0457i | 0.4074 + 0.8987i | 0.3988 + 1.0007i |
| 24 | 0.4643 + 1.6633i | 0.4653 + 1.1815i | 0.4746 + 1.4795i | 0.4874 + 1.3073i | 0.4237 + 0.8868i | 0.4439 + 1.0768i | 0.4137 + 0.9183i | 0.4296 + 1.0142i |
| 24.5 | 0.4614 + 1.3869i | 0.4192 + 1.2422i | 0.4295 + 1.5513i | 0.3583 + 1.1597i | 0.4108 + 0.9173i | 0.4097 + 1.0235i | 0.3699 + 0.9056i | 0.3567 + 1.0552i |
| 25 | 0.5062 + 1.5466i | 0.3909 + 1.1806i | 0.4561 + 1.3999i | 0.4328 + 1.2778i | 0.3985 + 0.9191i | 0.3847 + 1.0408i | 0.3554 + 0.9098i | 0.3375 + 1.0392i |
| 25.5 | 0.4109 + 1.6213i | 0.4201 + 1.1814i | 0.4176 + 1.4698i | 0.4725 + 1.1133i | 0.4845 + 0.8904i | 0.4948 + 0.9831i | 0.4139 + 0.8984i | 0.4391 + 1.0220i |
| 26 | 0.5441 + 1.3586i | 0.4659 + 1.1498i | 0.4319 + 1.4062i | 0.4167 + 1.2626i | 0.4195 + 0.9309i | 0.4592 + 1.0189i | 0.3573 + 0.9441i | 0.3828 + 1.0426i |
| 26.5 | 0.5122 + 1.4464i | 0.4081 + 1.1447i | 0.4495 + 1.3429i | 0.4100 + 1.2413i | 0.3605 + 0.9756i | 0.3812 + 1.0530i | 0.3762 + 0.9043i | 0.4593 + 0.9010i |
| 27 | 0.5155 + 1.4738i | 0.4056 + 1.2349i | 0.4154 + 1.4035i | 0.4713 + 1.3098i | 0.4513 + 0.9439i | 0.4491 + 1.0353i | 0.4185 + 0.8835i | 0.5363 + 1.0313i |
| 27.5 | 0.4528 + 1.4608i | 0.3983 + 1.2179i | 0.3506 + 1.3699i | 0.4330 + 1.3116i | 0.4947 + 0.9196i | 0.4801 + 1.0177i | 0.4268 + 0.9033i | 0.5624 + 1.0275i |
| 28 | 0.5059 + 1.4670i | 0.5266 + 1.2312i | 0.4108 + 1.2036i | 0.4382 + 1.3162i | 0.4826 + 1.1077i | 0.5122 + 1.0210i | 0.4263 + 0.9068i | 0.4319 + 0.9952i |

| SNR/w | w168 | w169 | w170 | w171 | w172 | w173 | w174 | w175 |
|---|---|---|---|---|---|---|---|---|
| 7 | 0.2556 + 0.4501i | 0.2556 + 0.4501i | 0.2556 + 0.4501i | 0.2556 + 0.4501i | 0.2556 + 0.4501i | 0.2688 + 0.4861i | 0.2556 + 0.4501i | 0.2688 + 0.4861i |
| 7.5 | 0.2648 + 0.4537i | 0.2648 + 0.4537i | 0.2379 + 0.4490i | 0.2420 + 0.4261i | 0.2798 + 0.4856i | 0.2798 + 0.4856i | 0.2466 + 0.4825i | 0.2466 + 0.4825i |
| 8 | 0.2367 + 0.4780i | 0.2367 + 0.4780i | 0.2367 + 0.4780i | 0.2367 + 0.4780i | 0.2728 + 0.4786i | 0.2728 + 0.4786i | 0.2728 + 0.4786i | 0.2728 + 0.4786i |
| 8.5 | 0.2360 + 0.5215i | 0.2360 + 0.5215i | 0.2360 + 0.5215i | 0.2360 + 0.5215i | 0.2843 + 0.5113i | 0.2843 + 0.5113i | 0.2843 + 0.5113i | 0.2843 + 0.5113i |
| 9 | 0.8632 + 1.3087i | 0.7953 + 1.2190i | 0.7953 + 1.2190i | 0.7580 + 1.1712i | 0.7953 + 1.2190i | 0.7580 + 1.1712i | 0.7580 + 1.1712i | 0.7580 + 1.1712i |
| 9.5 | 0.8657 + 1.3032i | 0.8104 + 1.2262i | 0.8104 + 1.2262i | 0.7800 + 1.1846i | 0.8104 + 1.2262i | 0.7800 + 1.1846i | 0.7800 + 1.1846i | 0.7800 + 1.1846i |
| 10 | 0.8650 + 1.2969i | 0.8182 + 1.2278i | 0.8182 + 1.2278i | 0.7929 + 1.1900i | 0.8182 + 1.2278i | 0.7929 + 1.1900i | 0.7929 + 1.1900i | 0.7929 + 1.1900i |
| 10.5 | 0.8751 + 1.2974i | 0.8165 + 1.2154i | 0.8165 + 1.2154i | 0.7914 + 1.1834i | 0.8165 + 1.2154i | 0.7914 + 1.1834i | 0.8165 + 1.2154i | 0.7914 + 1.1834i |

-continued

| | | | | | | | | |
|---|---|---|---|---|---|---|---|---|
| 11 | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i |
| 13 | 0.6468 + 1.1775i | 0.6155 + 1.1833i | 0.6299 + 1.1538i | 0.6155 + 1.1833i | 0.6140 + 1.1075i | 0.5905 + 1.1221i | 0.6140 + 1.1075i | 0.5905 + 1.1221i |
| 13.5 | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i |
| 14 | 0.1569 + 0.7809i | 0.1569 + 0.7809i | 0.1569 + 0.7809i | 0.1569 + 0.7809i | 0.1952 + 0.7703i | 0.1952 + 0.7703i | 0.1952 + 0.7703i | 0.1952 + 0.7703i |
| 14.5 | 0.1484 + 0.7976i | 0.1484 + 0.7976i | 0.1484 + 0.7976i | 0.1484 + 0.7976i | 0.2008 + 0.7827i | 0.2008 + 0.7827i | 0.2008 + 0.7827i | 0.2008 + 0.7827i |
| 15 | 0.1570 + 1.2336i | 0.2569 + 1.1882i | 0.1570 + 1.2336i | 0.2569 + 1.1882i | 0.4008 + 0.9524i | 0.3978 + 0.9920i | 0.4008 + 0.9524i | 0.3978 + 0.9920i |
| 15.5 | 0.1936 + 1.1915i | 0.2544 + 1.2145i | 0.1936 + 1.1915i | 0.2544 + 1.2145i | 0.3970 + 0.9978i | 0.3992 + 1.0300i | 0.3970 + 0.9978i | 0.3992 + 1.0300i |
| 16 | 0.1202 + 1.5524i | 0.3902 + 1.2699i | 0.1458 + 1.4668i | 0.3679 + 1.2863i | 0.4206 + 0.9517i | 0.4279 + 1.0067i | 0.4234 + 0.9406i | 0.4252 + 0.9919i |
| 16.5 | 0.3396 + 1.4835i | 0.3411 + 1.2758i | 0.4480 + 1.5575i | 0.3521 + 1.2456i | 0.3299 + 0.9123i | 0.3314 + 0.9729i | 0.3449 + 0.9161i | 0.3458 + 0.9807i |
| 17 | 0.3338 + 1.4825i | 0.3376 + 1.2735i | 0.4573 + 1.5560i | 0.3502 + 1.2404i | 0.3299 + 0.9104i | 0.3304 + 0.9742i | 0.3299 + 0.9104i | 0.3304 + 0.9742i |
| 17.5 | 0.3287 + 1.4767i | 0.3347 + 1.2698i | 0.4622 + 1.5494i | 0.3493 + 1.2344i | 0.3285 + 0.9077i | 0.3284 + 0.9738i | 0.3285 + 0.9077i | 0.3284 + 0.9738i |
| 18 | 0.3273 + 1.4723i | 0.3301 + 1.2672i | 0.4716 + 1.5416i | 0.3419 + 1.2255i | 0.3213 + 0.9082i | 0.3211 + 0.9756i | 0.3213 + 0.9082i | 0.3211 + 0.9756i |
| 18.5 | 0.4160 + 1.5551i | 0.4079 + 1.3496i | 0.3930 + 1.7342i | 0.4025 + 1.2867i | 0.3601 + 1.0064i | 0.3708 + 1.0708i | 0.3601 + 1.0064i | 0.3752 + 1.0942i |
| 19 | 0.4096 + 1.5434i | 0.4091 + 1.3422i | 0.3868 + 1.7355i | 0.4051 + 1.2765i | 0.3667 + 1.0053i | 0.3772 + 1.0686i | 0.3667 + 1.0053i | 0.3819 + 1.0940i |
| 19.5 | 0.1896 + 1.9476i | 0.4173 + 1.2630i | 0.4293 + 1.5290i | 0.4215 + 1.3193i | 0.3717 + 1.0035i | 0.3894 + 1.0902i | 0.3717 + 1.0035i | 0.3841 + 1.0703i |
| 20 | 0.2891 + 1.6189i | 0.2191 + 1.0576i | 0.2287 + 1.4492i | 0.2175 + 1.0907i | 0.2615 + 0.8212i | 0.2469 + 0.9073i | 0.2615 + 0.8212i | 0.2501 + 0.8885i |
| 20.5 | 0.1559 + 1.8551i | 0.3285 + 1.1781i | 0.3245 + 1.4116i | 0.3282 + 1.2302i | 0.3234 + 0.9257i | 0.3269 + 1.0213i | 0.3234 + 0.9257i | 0.3259 + 1.0022i |
| 21 | 0.2900 + 1.4178i | 0.3085 + 1.2507i | 0.2645 + 1.6046i | 0.3133 + 1.1795i | 0.3142 + 0.9074i | 0.3155 + 1.0127i | 0.3142 + 0.9074i | 0.3156 + 1.0365i |
| 21.5 | 0.3087 + 1.6359i | 0.3076 + 1.1747i | 0.3096 + 1.4426i | 0.3112 + 1.2557i | 0.2873 + 0.8921i | 0.2967 + 1.0444i | 0.2873 + 0.8921i | 0.2940 + 1.0120i |
| 22 | 0.2306 + 1.3849i | 0.2809 + 1.2390i | 0.2905 + 1.4691i | 0.2945 + 1.1903i | 0.3077 + 0.9000i | 0.3077 + 1.0367i | 0.3077 + 0.9000i | 0.3077 + 1.0367i |
| 22.5 | 0.3278 + 1.6041i | 0.2970 + 1.1686i | 0.3037 + 1.4425i | 0.2970 + 1.2912i | 0.2944 + 0.8820i | 0.2944 + 1.0396i | 0.2944 + 0.8820i | 0.2951 + 0.9957i |
| 23 | 0.2943 + 1.6238i | 0.2952 + 1.1812i | 0.3204 + 1.4563i | 0.3158 + 1.2876i | 0.2803 + 0.8960i | 0.2822 + 1.0584i | 0.2803 + 0.8960i | 0.2794 + 1.0101i |
| 23.5 | 0.2662 + 1.5264i | 0.2867 + 1.1635i | 0.2847 + 1.3880i | 0.2871 + 1.2790i | 0.2863 + 0.8736i | 0.2818 + 1.0582i | 0.2905 + 0.8919i | 0.2853 + 0.9967i |
| 24 | 0.3157 + 1.8053i | 0.3327 + 1.2080i | 0.3481 + 1.4263i | 0.3796 + 1.3103i | 0.2893 + 0.9032i | 0.3123 + 1.1027i | 0.2959 + 0.9319i | 0.3029 + 1.0334i |
| 24.5 | 0.3338 + 1.3906i | 0.2893 + 1.2934i | 0.2719 + 1.4925i | 0.2628 + 1.1826i | 0.2548 + 0.9166i | 0.2364 + 1.0101i | 0.2759 + 0.8967i | 0.2549 + 1.0649i |
| 25 | 0.2741 + 1.3971i | 0.2823 + 1.2733i | 0.3404 + 1.4960i | 0.2496 + 1.1769i | 0.2423 + 0.9140i | 0.2246 + 1.0063i | 0.2679 + 0.8905i | 0.2459 + 1.0740i |
| 25.5 | 0.3610 + 1.3165i | 0.3191 + 1.2022i | 0.2929 + 1.4100i | 0.2095 + 1.3211i | 0.2809 + 0.9302i | 0.3045 + 1.0609i | 0.3388 + 0.9217i | 0.3581 + 1.0225i |
| 26 | 0.2562 + 1.3168i | 0.2416 + 1.2052i | 0.3169 + 1.4056i | 0.3353 + 1.1847i | 0.2478 + 0.9328i | 0.2466 + 1.0790i | 0.2813 + 0.9406i | 0.3161 + 1.0751i |
| 26.5 | 0.3891 + 1.5208i | 0.2212 + 1.3291i | 0.3380 + 1.3952i | 0.2946 + 1.2451i | 0.2695 + 0.9684i | 0.2704 + 1.0530i | 0.2713 + 0.8960i | 0.2536 + 1.1406i |
| 27 | 0.2908 + 1.3146i | 0.2866 + 1.2128i | 0.3054 + 1.4311i | 0.3265 + 1.1340i | 0.2959 + 0.9159i | 0.3072 + 1.0000i | 0.3513 + 0.8854i | 0.3357 + 1.0591i |
| 27.5 | 0.2183 + 1.3371i | 0.2840 + 1.2244i | 0.2932 + 1.4680i | 0.3445 + 1.1098i | 0.2843 + 0.9156i | 0.2866 + 1.0054i | 0.3594 + 0.9169i | 0.3648 + 1.0180i |
| 28 | 0.2888 + 1.3750i | 0.2811 + 1.1589i | 0.3632 + 1.4529i | 0.3464 + 1.0908i | 0.2807 + 0.8996i | 0.2837 + 1.2544i | 0.3472 + 0.9117i | 0.3452 + 1.0021i |

| SNR/w | w176 | w177 | w178 | w179 | w180 | w181 | w182 | w183 |
|---|---|---|---|---|---|---|---|---|
| 7 | 0.2556 + 0.4501i | 0.2556 + 0.4501i | 0.2556 + 0.4501i | 0.2556 + 0.4501i | 0.2556 + 0.4501i | 0.2688 + 0.4861i | 0.2556 + 0.4501i | 0.2688 + 0.4861i |
| 7.5 | 0.2648 + 0.4537i | 0.2648 + 0.4537i | 0.2379 + 0.4490i | 0.2379 + 0.4490i | 0.2798 + 0.4856i | 0.2798 + 0.4856i | 0.2466 + 0.4825i | 0.2466 + 0.4825i |

-continued

| | | | | | | | | |
|---|---|---|---|---|---|---|---|---|
| 8 | 0.2367 + 0.4780i | 0.2367 + 0.4780i | 0.2367 + 0.4780i | 0.2367 + 0.4780i | 0.2728 + 0.4786i | 0.2728 + 0.4786i | 0.2728 + 0.4786i | 0.2728 + 0.4786i |
| 8.5 | 0.2136 + 0.4205i | 0.2136 + 0.4205i | 0.2136 + 0.4205i | 0.2136 + 0.4205i | 0.2397 + 0.4224i | 0.2397 + 0.4224i | 0.2397 + 0.4224i | 0.2397 + 0.4224i |
| 9 | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i |
| 10 | 0.5458 + 0.8968i | 0.5458 + 0.8968i | 0.5458 + 0.8968i | 0.5458 + 0.8968i | 0.5458 + 0.8968i | 0.5458 + 0.8968i | 0.5458 + 0.8968i | 0.5458 + 0.8968i |
| 10.5 | 0.5391 + 0.8844i | 0.5391 + 0.8844i | 0.5391 + 0.8844i | 0.5391 + 0.8844i | 0.5391 + 0.8844i | 0.5391 + 0.8844i | 0.5391 + 0.8844i | 0.5528 + 0.8984i |
| 11 | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i |
| 12 | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i |
| 13 | 0.4551 + 0.8187i | 0.4551 + 0.8187i | 0.4551 + 0.8187i | 0.4551 + 0.8187i | 0.4745 + 0.8449i | 0.4745 + 0.8449i | 0.4745 + 0.8449i | 0.4745 + 0.8449i |
| 13.5 | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i |
| 14 | 0.4134 + 0.5965i | 0.4134 + 0.5965i | 0.4134 + 0.5965i | 0.4134 + 0.5965i | 0.4041 + 0.6182i | 0.4134 + 0.5965i | 0.4041 + 0.6182i | 0.4041 + 0.6182i |
| 14.5 | 0.4221 + 0.5881i | 0.4221 + 0.5881i | 0.4221 + 0.5881i | 0.4221 + 0.5881i | 0.4077 + 0.6193i | 0.4077 + 0.6193i | 0.4077 + 0.6193i | 0.4077 + 0.6193i |
| 15 | 0.4021 + 0.5894i | 0.4021 + 0.5894i | 0.4021 + 0.5894i | 0.4021 + 0.5894i | 0.4095 + 0.6418i | 0.4095 + 0.6418i | 0.4095 + 0.6418i | 0.4095 + 0.6418i |
| 15.5 | 0.4122 + 0.5978i | 0.4122 + 0.5978i | 0.4122 + 0.5978i | 0.4122 + 0.5978i | 0.4180 + 0.6562i | 0.4180 + 0.6562i | 0.4180 + 0.6562i | 0.4180 + 0.6562i |
| 16 | 0.3855 + 0.6021i | 0.3855 + 0.6021i | 0.3855 + 0.6021i | 0.3855 + 0.6021i | 0.3969 + 0.6876i | 0.3922 + 0.6761i | 0.3969 + 0.6876i | 0.3922 + 0.6761i |
| 16.5 | 0.3578 + 0.5859i | 0.3578 + 0.5859i | 0.3578 + 0.5859i | 0.3578 + 0.5859i | 0.3567 + 0.6823i | 0.3573 + 0.6612i | 0.3567 + 0.6823i | 0.3573 + 0.6612i |
| 17 | 0.3611 + 0.5832i | 0.3611 + 0.5832i | 0.3611 + 0.5832i | 0.3611 + 0.5832i | 0.3602 + 0.6889i | 0.3606 + 0.6651i | 0.3602 + 0.6889i | 0.3606 + 0.6651i |
| 17.5 | 0.3651 + 0.5790i | 0.3651 + 0.5790i | 0.3651 + 0.5790i | 0.3651 + 0.5790i | 0.3652 + 0.6978i | 0.3653 + 0.6726i | 0.3652 + 0.6978i | 0.3653 + 0.6726i |
| 18 | 0.3699 + 0.5726i | 0.3699 + 0.5726i | 0.3699 + 0.5726i | 0.3699 + 0.5726i | 0.3697 + 0.7105i | 0.3695 + 0.6865i | 0.3697 + 0.7105i | 0.3695 + 0.6865i |
| 18.5 | 0.3738 + 0.6263i | 0.3738 + 0.6263i | 0.3738 + 0.6263i | 0.3738 + 0.6263i | 0.4213 + 0.8009i | 0.4146 + 0.7796i | 0.4213 + 0.8009i | 0.4146 + 0.7796i |
| 19 | 0.3971 + 0.6302i | 0.3971 + 0.6302i | 0.3971 + 0.6302i | 0.3971 + 0.6302i | 0.4522 + 0.8036i | 0.4450 + 0.7814i | 0.4522 + 0.8036i | 0.4450 + 0.7814i |
| 19.5 | 0.4169 + 0.6347i | 0.4169 + 0.6347i | 0.4169 + 0.6347i | 0.4169 + 0.6347i | 0.4731 + 0.8087i | 0.4650 + 0.7840i | 0.4731 + 0.8087i | 0.4650 + 0.7840i |
| 20 | 0.4344 + 0.5383i | 0.4344 + 0.5383i | 0.4344 + 0.5383i | 0.4344 + 0.5383i | 0.3929 + 0.6967i | 0.3997 + 0.6745i | 0.3929 + 0.6967i | 0.3997 + 0.6745i |
| 20.5 | 0.4336 + 0.5920i | 0.4336 + 0.5920i | 0.4336 + 0.5920i | 0.4336 + 0.5920i | 0.4503 + 0.7711i | 0.4474 + 0.7391i | 0.4503 + 0.7711i | 0.4474 + 0.7391i |
| 21 | 0.4211 + 0.5673i | 0.4211 + 0.5673i | 0.4211 + 0.5673i | 0.4211 + 0.5673i | 0.4296 + 0.7571i | 0.4265 + 0.7104i | 0.4296 + 0.7571i | 0.4265 + 0.7104i |
| 21.5 | 0.4157 + 0.5569i | 0.4140 + 0.5692i | 0.4157 + 0.5569i | 0.4140 + 0.5692i | 0.4039 + 0.7447i | 0.4048 + 0.6984i | 0.4039 + 0.7447i | 0.4048 + 0.6984i |
| 22 | 0.4241 + 0.5508i | 0.4245 + 0.5736i | 0.4241 + 0.5508i | 0.4245 + 0.5736i | 0.4277 + 0.7656i | 0.4269 + 0.7001i | 0.4277 + 0.7656i | 0.4269 + 0.7001i |
| 22.5 | 0.4200 + 0.5512i | 0.4202 + 0.5729i | 0.4200 + 0.5512i | 0.4202 + 0.5729i | 0.4166 + 0.7523i | 0.4191 + 0.6937i | 0.4166 + 0.7523i | 0.4191 + 0.6937i |
| 23 | 0.4301 + 0.5423i | 0.4186 + 0.5838i | 0.4101 + 0.5411i | 0.4186 + 0.5838i | 0.4105 + 0.7806i | 0.4110 + 0.6931i | 0.4105 + 0.7806i | 0.4110 + 0.6931i |
| 23.5 | 0.4342 + 0.5380i | 0.4337 + 0.5823i | 0.4125 + 0.5369i | 0.4121 + 0.5813i | 0.4306 + 0.7737i | 0.4345 + 0.6883i | 0.4114 + 0.7705i | 0.4132 + 0.6878i |
| 24 | 0.4240 + 0.5305i | 0.4224 + 0.5909i | 0.3960 + 0.5305i | 0.3944 + 0.5911i | 0.4145 + 0.7848i | 0.4190 + 0.6893i | 0.3922 + 0.7799i | 0.3915 + 0.6903i |
| 24.5 | 0.4394 + 0.5271i | 0.4335 + 0.6041i | 0.4041 + 0.5255i | 0.3995 + 0.6013i | 0.4210 + 0.8001i | 0.4255 + 0.7005i | 0.3823 + 0.8003i | 0.3916 + 0.6976i |
| 25 | 0.4499 + 0.5230i | 0.4394 + 0.6025i | 0.3970 + 0.5187i | 0.3924 + 0.5977i | 0.4127 + 0.8016i | 0.4248 + 0.6985i | 0.3717 + 0.7989i | 0.3841 + 0.6928i |
| 25.5 | 0.4713 + 0.5531i | 0.4766 + 0.6300i | 0.4019 + 0.5558i | 0.4036 + 0.6329i | 0.4825 + 0.7991i | 0.4804 + 0.7133i | 0.4063 + 0.8041i | 0.4045 + 0.7167i |
| 26 | 0.4704 + 0.5396i | 0.4557 + 0.6111i | 0.4115 + 0.5347i | 0.4241 + 0.6454i | 0.4123 + 0.8520i | 0.4554 + 0.8028i | 0.3640 + 0.8375i | 0.4184 + 0.7393i |
| 26.5 | 0.4616 + 0.5519i | 0.4251 + 0.6479i | 0.3986 + 0.5420i | 0.3877 + 0.6124i | 0.3594 + 0.7678i | 0.3969 + 0.7243i | 0.3707 + 0.8267i | 0.4482 + 0.8030i |
| 27 | 0.4932 + 0.5555i | 0.4800 + 0.6280i | 0.4144 + 0.5520i | 0.4124 + 0.6261i | 0.4851 + 0.7848i | 0.4912 + 0.6997i | 0.4214 + 0.7951i | 0.4128 + 0.7066i |

-continued

| | | | | | | | | |
|---|---|---|---|---|---|---|---|---|
| 27.5 | 0.4887 + 0.5809i | 0.4812 + 0.6491i | 0.4174 + 0.5692i | 0.4122 + 0.6478i | 0.4949 + 0.8030i | 0.4972 + 0.7169i | 0.4243 + 0.8140i | 0.4168 + 0.7278i |
| 28 | 0.4885 + 0.5615i | 0.4738 + 0.6399i | 0.4131 + 0.5615i | 0.4096 + 0.6374i | 0.4750 + 0.8030i | 0.4772 + 0.7164i | 0.4136 + 0.8164i | 0.4073 + 0.7216i |

| SNR/w | w184 | w185 | w186 | w187 | w188 | w189 | w190 | w191 |
|---|---|---|---|---|---|---|---|---|
| 7 | 0.2556 + 0.4501i | 0.2688 + 0.4861i | 0.2556 + 0.4501i | 0.2688 + 0.4861i | 0.2688 + 0.4861i | 0.2688 + 0.4861i | 0.2688 + 0.4861i | 0.2688 + 0.4861i |
| 7.5 | 0.2798 + 0.4856i | 0.2798 + 0.4856i | 0.2466 + 0.4825i | 0.2466 + 0.4825i | 0.2943 + 0.5156i | 0.2943 + 0.5156i | 0.2548 + 0.5168i | 0.2548 + 0.5168i |
| 8 | 0.2478 + 0.5293i | 0.2478 + 0.5293i | 0.2478 + 0.5293i | 0.2478 + 0.5293i | 0.2953 + 0.5229i | 0.2953 + 0.5229i | 0.2953 + 0.5229i | 0.2953 + 0.5229i |
| 8.5 | 0.2412 + 0.5504i | 0.2412 + 0.5504i | 0.2412 + 0.5504i | 0.2412 + 0.5504i | 0.2977 + 0.5358i | 0.2977 + 0.5358i | 0.2977 + 0.5358i | 0.2977 + 0.5358i |
| 9 | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i |
| 10 | 0.5458 + 0.8968i | 0.5458 + 0.8968i | 0.5458 + 0.8968i | 0.5458 + 0.8968i | 0.5458 + 0.8968i | 0.5458 + 0.8968i | 0.5458 + 0.8968i | 0.5609 + 0.9130i |
| 10.5 | 0.5391 + 0.8844i | 0.5391 + 0.8844i | 0.5391 + 0.8844i | 0.5528 + 0.8984i | 0.5391 + 0.8844i | 0.5528 + 0.8984i | 0.5391 + 0.8844i | 0.5528 + 0.8984i |
| 11 | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i |
| 12 | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i |
| 13 | 0.4551 + 0.8187i | 0.4551 + 0.8187i | 0.4551 + 0.8187i | 0.4551 + 0.8187i | 0.4745 + 0.8449i | 0.4745 + 0.8449i | 0.4745 + 0.8449i | 0.4745 + 0.8449i |
| 13.5 | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i |
| 14 | 0.4134 + 0.5965i | 0.4134 + 0.5965i | 0.4134 + 0.5965i | 0.4134 + 0.5965i | 0.4041 + 0.6182i | 0.4041 + 0.6182i | 0.4041 + 0.6182i | 0.4041 + 0.6182i |
| 14.5 | 0.4221 + 0.5881i | 0.4221 + 0.5881i | 0.4221 + 0.5881i | 0.4221 + 0.5881i | 0.4077 + 0.6193i | 0.4077 + 0.6193i | 0.4077 + 0.6193i | 0.4077 + 0.6193i |
| 15 | 0.4021 + 0.5894i | 0.4021 + 0.5894i | 0.4021 + 0.5894i | 0.4021 + 0.5894i | 0.4095 + 0.6418i | 0.4095 + 0.6418i | 0.4095 + 0.6418i | 0.4095 + 0.6418i |
| 15.5 | 0.4020 + 0.5898i | 0.4020 + 0.5898i | 0.4020 + 0.5898i | 0.4020 + 0.5898i | 0.4040 + 0.6378i | 0.4040 + 0.6378i | 0.4040 + 0.6378i | 0.4040 + 0.6378i |
| 16 | 0.3700 + 0.6026i | 0.3700 + 0.6026i | 0.3700 + 0.6026i | 0.3700 + 0.6026i | 0.3812 + 0.6855i | 0.3767 + 0.6745i | 0.3812 + 0.6855i | 0.3767 + 0.6745i |
| 16.5 | 0.3341 + 0.5863i | 0.3341 + 0.5863i | 0.3341 + 0.5863i | 0.3341 + 0.5863i | 0.3336 + 0.6838i | 0.3340 + 0.6625i | 0.3336 + 0.6838i | 0.3340 + 0.6625i |
| 17 | 0.3312 + 0.5837i | 0.3312 + 0.5837i | 0.3312 + 0.5837i | 0.3312 + 0.5837i | 0.3314 + 0.6911i | 0.3315 + 0.6671i | 0.3314 + 0.6911i | 0.3315 + 0.6671i |
| 17.5 | 0.3255 + 0.5796i | 0.3255 + 0.5796i | 0.3255 + 0.5796i | 0.3255 + 0.5796i | 0.3273 + 0.7010i | 0.3269 + 0.6758i | 0.3273 + 0.7010i | 0.3269 + 0.6758i |
| 18 | 0.3175 + 0.5728i | 0.3175 + 0.5728i | 0.3175 + 0.5728i | 0.3175 + 0.5728i | 0.3195 + 0.7134i | 0.3188 + 0.6894i | 0.3195 + 0.7134i | 0.3188 + 0.6894i |
| 18.5 | 0.3101 + 0.6373i | 0.3101 + 0.6373i | 0.3101 + 0.6373i | 0.3101 + 0.6373i | 0.3320 + 0.8235i | 0.3288 + 0.8011i | 0.3320 + 0.8235i | 0.3288 + 0.8011i |
| 19 | 0.3093 + 0.6504i | 0.3093 + 0.6504i | 0.3093 + 0.6504i | 0.3093 + 0.6504i | 0.3368 + 0.8329i | 0.3327 + 0.8107i | 0.3368 + 0.8329i | 0.3327 + 0.8107i |
| 19.5 | 0.3091 + 0.6604i | 0.3091 + 0.6604i | 0.3091 + 0.6604i | 0.3091 + 0.6604i | 0.3403 + 0.8413i | 0.3355 + 0.8173i | 0.3403 + 0.8413i | 0.3355 + 0.8173i |
| 20 | 0.3126 + 0.5103i | 0.3126 + 0.5103i | 0.3126 + 0.5103i | 0.3126 + 0.5103i | 0.2869 + 0.6641i | 0.2910 + 0.6411i | 0.2869 + 0.6641i | 0.2910 + 0.6411i |
| 20.5 | 0.3061 + 0.5984i | 0.3061 + 0.5984i | 0.3061 + 0.5984i | 0.3061 + 0.5984i | 0.3158 + 0.7762i | 0.3144 + 0.7466i | 0.3158 + 0.7762i | 0.3144 + 0.7466i |
| 21 | 0.2981 + 0.5721i | 0.2981 + 0.5721i | 0.2981 + 0.5721i | 0.2981 + 0.5721i | 0.3058 + 0.7624i | 0.3034 + 0.7165i | 0.3058 + 0.7624i | 0.3034 + 0.7165i |
| 21.5 | 0.2900 + 0.5487i | 0.2889 + 0.5640i | 0.2900 + 0.5487i | 0.2889 + 0.5640i | 0.2841 + 0.7489i | 0.2837 + 0.6957i | 0.2841 + 0.7489i | 0.2837 + 0.6957i |
| 22 | 0.2987 + 0.5542i | 0.2992 + 0.5758i | 0.2987 + 0.5542i | 0.2992 + 0.5758i | 0.3037 + 0.7640i | 0.3024 + 0.7019i | 0.3037 + 0.7640i | 0.3024 + 0.7019i |
| 22.5 | 0.2930 + 0.5479i | 0.2919 + 0.5689i | 0.2930 + 0.5479i | 0.2919 + 0.5689i | 0.2931 + 0.7505i | 0.2913 + 0.6920i | 0.2931 + 0.7505i | 0.2913 + 0.6920i |
| 23 | 0.2895 + 0.5356i | 0.2897 + 0.5764i | 0.2895 + 0.5356i | 0.2897 + 0.5764i | 0.2851 + 0.7771i | 0.2883 + 0.6891i | 0.2851 + 0.7771i | 0.2883 + 0.6891i |
| 23.5 | 0.2961 + 0.5344i | 0.2953 + 0.5790i | 0.2961 + 0.5344i | 0.2953 + 0.5790i | 0.2950 + 0.7690i | 0.2948 + 0.6849i | 0.2950 + 0.7690i | 0.2948 + 0.6849i |
| 24 | 0.2837 + 0.5315i | 0.2827 + 0.5939i | 0.2837 + 0.5315i | 0.2827 + 0.5939i | 0.2824 + 0.8027i | 0.2808 + 0.6950i | 0.2887 + 0.7921i | 0.2808 + 0.6950i |

-continued

| | | | | | | | | |
|---|---|---|---|---|---|---|---|---|
| 24.5 | 0.2883 + 0.5234i | 0.2856 + 0.5937i | 0.3044 + 0.5238i | 0.3004 + 0.5947i | 0.2707 + 0.7847i | 0.2797 + 0.6898i | 0.2836 + 0.7930i | 0.2941 + 0.6900i |
| 25 | 0.2775 + 0.5141i | 0.2762 + 0.5902i | 0.3082 + 0.5152i | 0.3024 + 0.5920i | 0.2637 + 0.7785i | 0.2724 + 0.6839i | 0.2799 + 0.7900i | 0.2944 + 0.6840i |
| 25.5 | 0.2691 + 0.5602i | 0.2701 + 0.6365i | 0.3232 + 0.5582i | 0.3244 + 0.6346i | 0.2749 + 0.8226i | 0.2718 + 0.7235i | 0.3274 + 0.8149i | 0.3244 + 0.7213i |
| 26 | 0.2972 + 0.5451i | 0.2990 + 0.6252i | 0.3472 + 0.5423i | 0.3491 + 0.6333i | 0.2628 + 0.8162i | 0.2862 + 0.7117i | 0.2961 + 0.8194i | 0.3367 + 0.7232i |
| 26.5 | 0.2596 + 0.5290i | 0.2589 + 0.5985i | 0.3256 + 0.5326i | 0.3154 + 0.6039i | 0.2797 + 0.7660i | 0.2874 + 0.6779i | 0.2816 + 0.8277i | 0.2874 + 0.6779i |
| 27 | 0.2766 + 0.5536i | 0.2777 + 0.6319i | 0.3404 + 0.5532i | 0.3419 + 0.6283i | 0.2818 + 0.8033i | 0.2795 + 0.7152i | 0.3469 + 0.7986i | 0.3449 + 0.7116i |
| 27.5 | 0.2828 + 0.5653i | 0.2811 + 0.6456i | 0.3483 + 0.5665i | 0.3451 + 0.6465i | 0.2821 + 0.8240i | 0.2808 + 0.7321i | 0.3509 + 0.8188i | 0.3469 + 0.7317i |
| 28 | 0.2732 + 0.5668i | 0.2746 + 0.6455i | 0.3392 + 0.5659i | 0.3408 + 0.6410i | 0.2773 + 0.8163i | 0.2760 + 0.7294i | 0.3462 + 0.8141i | 0.3422 + 0.7259i |

| SNR/w | w192 | w193 | w194 | w195 | w196 | w197 | w198 | w199 |
|---|---|---|---|---|---|---|---|---|
| 7 | 0.4139 + 0.2420i | 0.4139 + 0.2420i | 0.4139 + 0.2420i | 0.4139 + 0.2420i | 0.4139 + 0.2420i | 0.4502 + 0.2556i | 0.4139 + 0.2420i | 0.4502 + 0.2556i |
| 7.5 | 0.4026 + 0.2281i | 0.4026 + 0.2281i | 0.4026 + 0.2281i | 0.3757 + 0.2165i | 0.4284 + 0.2422i | 0.4284 + 0.2422i | 0.4026 + 0.2281i | 0.4026 + 0.2281i |
| 8 | 0.3795 + 0.2188i | 0.3795 + 0.2188i | 0.3795 + 0.2188i | 0.3795 + 0.2188i | 0.3795 + 0.2188i | 0.3795 + 0.2188i | 0.3795 + 0.2188i | 0.3795 + 0.2188i |
| 8.5 | 0.3753 + 0.2067i | 0.3753 + 0.2067i | 0.3753 + 0.2067i | 0.3753 + 0.2067i | 0.3753 + 0.2067i | 0.3753 + 0.2067i | 0.3753 + 0.2067i | 0.3753 + 0.2067i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.3224 + 0.1541i | 0.3224 + 0.1541i | 0.3224 + 0.1541i | 0.3224 + 0.1541i | 0.3224 + 0.1541i | 0.3224 + 0.1541i | 0.3224 + 0.1541i | 0.3224 + 0.1541i |
| 11.5 | 0.3192 + 0.1479i | 0.3192 + 0.1479i | 0.3192 + 0.1479i | 0.3192 + 0.1479i | 0.3192 + 0.1479i | 0.3192 + 0.1479i | 0.3192 + 0.1479i | 0.3192 + 0.1479i |
| 12 | 0.3251 + 0.1434i | 0.3251 + 0.1434i | 0.3251 + 0.1434i | 0.3251 + 0.1434i | 0.3251 + 0.1434i | 0.3251 + 0.1434i | 0.3251 + 0.1434i | 0.3251 + 0.1434i |
| 12.5 | 0.2482 + 0.1424i | 0.2482 + 0.1424i | 0.2482 + 0.1424i | 0.2482 + 0.1424i | 0.2482 + 0.1424i | 0.2482 + 0.1424i | 0.2482 + 0.1424i | 0.2482 + 0.1424i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.2205 + 0.1335i | 0.2205 + 0.1335i | 0.2205 + 0.1335i | 0.2205 + 0.1335i | 0.2205 + 0.1335i | 0.2205 + 0.1335i | 0.2205 + 0.1335i | 0.2205 + 0.1335i |
| 14 | 0.2029 + 0.1317i | 0.2029 + 0.1317i | 0.2029 + 0.1317i | 0.2029 + 0.1317i | 0.2029 + 0.1317i | 0.2029 + 0.1317i | 0.2029 + 0.1317i | 0.2029 + 0.1317i |
| 14.5 | 0.1977 + 0.1305i | 0.1977 + 0.1305i | 0.1977 + 0.1305i | 0.1977 + 0.1305i | 0.1977 + 0.1305i | 0.1977 + 0.1305i | 0.1977 + 0.1305i | 0.1977 + 0.1305i |
| 15 | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i |
| 16 | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i |
| 18 | 0.1031 + 0.1019i | 0.1031 + 0.1019i | 0.1031 + 0.1019i | 0.1031 + 0.1019i | 0.1029 + 0.1208i | 0.1029 + 0.1208i | 0.1029 + 0.1208i | 0.1029 + 0.1208i |
| 18.5 | 0.0961 + 0.0854i | 0.0961 + 0.0854i | 0.0961 + 0.0854i | 0.0961 + 0.0854i | 0.0971 + 0.1780i | 0.0971 + 0.1780i | 0.0971 + 0.1780i | 0.0971 + 0.1780i |
| 19 | 0.0921 + 0.0770i | 0.0921 + 0.0770i | 0.0921 + 0.0770i | 0.0921 + 0.0770i | 0.0938 + 0.2028i | 0.0938 + 0.2028i | 0.0938 + 0.2028i | 0.0938 + 0.2028i |
| 19.5 | 0.0905 + 0.0748i | 0.0905 + 0.0748i | 0.0905 + 0.0748i | 0.0905 + 0.0748i | 0.0927 + 0.2157i | 0.0927 + 0.2157i | 0.0927 + 0.2157i | 0.0927 + 0.2157i |
| 20 | 0.0723 + 0.0768i | 0.0723 + 0.0768i | 0.0723 + 0.0768i | 0.0723 + 0.0768i | 0.0721 + 0.1102i | 0.0721 + 0.1102i | 0.0721 + 0.1102i | 0.0721 + 0.1102i |
| 20.5 | 0.0636 + 0.0660i | 0.0636 + 0.0660i | 0.0636 + 0.0660i | 0.0636 + 0.0660i | 0.0638 + 0.1878i | 0.0638 + 0.1878i | 0.0638 + 0.1878i | 0.0638 + 0.1878i |
| 21 | 0.0606 + 0.0613i | 0.0606 + 0.0613i | 0.0606 + 0.0613i | 0.0606 + 0.0613i | 0.0605 + 0.1754i | 0.0605 + 0.1754i | 0.0605 + 0.1754i | 0.0605 + 0.1754i |

-continued

| | | | | | | | | |
|---|---|---|---|---|---|---|---|---|
| 21.5 | 0.0624 + 0.0575i | 0.0624 + 0.0575i | 0.0624 + 0.0575i | 0.0624 + 0.0575i | 0.0619 + 0.1651i | 0.0619 + 0.1651i | 0.0619 + 0.1651i | 0.0619 + 0.1651i |
| 22 | 0.0583 + 0.0591i | 0.0583 + 0.0591i | 0.0583 + 0.0591i | 0.0583 + 0.0591i | 0.0583 + 0.1759i | 0.0583 + 0.1759i | 0.0583 + 0.1759i | 0.0583 + 0.1759i |
| 22.5 | 0.0593 + 0.0592i | 0.0593 + 0.0592i | 0.0593 + 0.0592i | 0.0593 + 0.0592i | 0.0611 + 0.1735i | 0.0611 + 0.1735i | 0.0611 + 0.1735i | 0.0611 + 0.1735i |
| 23 | 0.0597 + 0.0546i | 0.0597 + 0.0546i | 0.0597 + 0.0546i | 0.0597 + 0.0546i | 0.0589 + 0.1642i | 0.0589 + 0.1642i | 0.0589 + 0.1642i | 0.0589 + 0.1642i |
| 23.5 | 0.0579 + 0.0565i | 0.0579 + 0.0565i | 0.0579 + 0.0565i | 0.0579 + 0.0565i | 0.0585 + 0.1710i | 0.0585 + 0.1710i | 0.0585 + 0.1710i | 0.0585 + 0.1710i |
| 24 | 0.0568 + 0.0565i | 0.0568 + 0.0565i | 0.0568 + 0.0565i | 0.0568 + 0.0565i | 0.0567 + 0.1703i | 0.0567 + 0.1703i | 0.0567 + 0.1703i | 0.0567 + 0.1703i |
| 24.5 | 0.0562 + 0.0569i | 0.0562 + 0.0569i | 0.0562 + 0.0569i | 0.0562 + 0.0569i | 0.0565 + 0.1714i | 0.0565 + 0.1714i | 0.0565 + 0.1714i | 0.0565 + 0.1714i |
| 25 | 0.0497 + 0.0540i | 0.0497 + 0.0540i | 0.0650 + 0.0541i | 0.0650 + 0.0541i | 0.0499 + 0.1635i | 0.0499 + 0.1635i | 0.0646 + 0.1633i | 0.0646 + 0.1633i |
| 25.5 | 0.0539 + 0.0400i | 0.0526 + 0.0822i | 0.0539 + 0.0400i | 0.0526 + 0.0822i | 0.0548 + 0.2082i | 0.0533 + 0.1620i | 0.0548 + 0.2082i | 0.0533 + 0.1620i |
| 26 | 0.0344 + 0.0341i | 0.0353 + 0.0840i | 0.0901 + 0.0333i | 0.0896 + 0.0834i | 0.0350 + 0.2090i | 0.0359 + 0.1529i | 0.0840 + 0.2107i | 0.0864 + 0.1532i |
| 26.5 | 0.0350 + 0.0336i | 0.0344 + 0.0721i | 0.0994 + 0.0336i | 0.0982 + 0.0745i | 0.0332 + 0.1857i | 0.0337 + 0.1391i | 0.0949 + 0.1879i | 0.0967 + 0.1405i |
| 27 | 0.0312 + 0.0312i | 0.0315 + 0.0893i | 0.0899 + 0.0311i | 0.0893 + 0.0896i | 0.0313 + 0.2132i | 0.0316 + 0.1532i | 0.0877 + 0.2140i | 0.0886 + 0.1536i |
| 27.5 | 0.0321 + 0.0316i | 0.0320 + 0.0923i | 0.0944 + 0.0317i | 0.0944 + 0.0924i | 0.0316 + 0.2186i | 0.0319 + 0.1557i | 0.0930 + 0.2195i | 0.0936 + 0.1565i |
| 28 | 0.0325 + 0.0301i | 0.0319 + 0.0893i | 0.0962 + 0.0306i | 0.0959 + 0.0901i | 0.0317 | 0.0317 + 0.1511i | 0.0943 + 0.2132i | 0.0949 + 0.1513i |

| SNR/ w | w200 | w201 | w202 | w203 | w204 | w205 | w206 | w207 |
|---|---|---|---|---|---|---|---|---|
| 7 | 0.4139 + 0.2420i | 0.4502 + 0.2556i | 0.4139 + 0.2420i | 0.4502 + 0.2556i | 0.4502 + 0.2556i | 0.4502 + 0.2556i | 0.4502 + 0.2556i | 0.4502 + 0.2556i |
| 7.5 | 0.4284 + 0.2422i | 0.4284 + 0.2422i | 0.4026 + 0.2281i | 0.4026 + 0.2281i | 0.4532 + 0.2648i | 0.4532 + 0.2648i | 0.4500 + 0.2383i | 0.4284 + 0.2422i |
| 8 | 0.4279 + 0.2367i | 0.4279 + 0.2367i | 0.4279 + 0.2367i | 0.4279 + 0.2367i | 0.4279 + 0.2367i | 0.4279 + 0.2367i | 0.4279 + 0.2367i | 0.4279 + 0.2367i |
| 8.5 | 0.4919 + 0.2302i | 0.4919 + 0.2302i | 0.4919 + 0.2302i | 0.4919 + 0.2302i | 0.4857 + 0.2709i | 0.4857 + 0.2709i | 0.4857 + 0.2709i | 0.4857 + 0.2709i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.3224 + 0.1541i | 0.3224 + 0.1541i | 0.3224 + 0.1541i | 0.3224 + 0.1541i | 0.3224 + 0.1541i | 0.3224 + 0.1541i | 0.3224 + 0.1541i | 0.3224 + 0.1541i |
| 11.5 | 0.3192 + 0.1479i | 0.3192 + 0.1479i | 0.3192 + 0.1479i | 0.3192 + 0.1479i | 0.3192 + 0.1479i | 0.3192 + 0.1479i | 0.3192 + 0.1479i | 0.3192 + 0.1479i |
| 12 | 0.3251 + 0.1434i | 0.3251 + 0.1434i | 0.3251 + 0.1434i | 0.3251 + 0.1434i | 0.3251 + 0.1434i | 0.3251 + 0.1434i | 0.3251 + 0.1434i | 0.3251 + 0.1434i |
| 12.5 | 0.2482 + 0.1424i | 0.2482 + 0.1424i | 0.2482 + 0.1424i | 0.2482 + 0.1424i | 0.2482 + 0.1424i | 0.2482 + 0.1424i | 0.2482 + 0.1424i | 0.2482 + 0.1424i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.2205 + 0.1335i | 0.2205 + 0.1335i | 0.2205 + 0.1335i | 0.2205 + 0.1335i | 0.2205 + 0.1335i | 0.2205 + 0.1335i | 0.2205 + 0.1335i | 0.2205 + 0.1335i |
| 14 | 0.2029 + 0.1317i | 0.2029 + 0.1317i | 0.2029 + 0.1317i | 0.2029 + 0.1317i | 0.2029 + 0.1317i | 0.2029 + 0.1317i | 0.2029 + 0.1317i | 0.2029 + 0.1317i |
| 14.5 | 0.1977 + 0.1305i | 0.1977 + 0.1305i | 0.1977 + 0.1305i | 0.1977 + 0.1305i | 0.1977 + 0.1305i | 0.1977 + 0.1305i | 0.1977 + 0.1305i | 0.1977 + 0.1305i |
| 15 | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i |
| 16 | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i |
| 18 | 0.1236 + 0.1019i | 0.1236 + 0.1019i | 0.1236 + 0.1019i | 0.1236 + 0.1019i | 0.1234 + 0.1209i | 0.1234 + 0.1209i | 0.1234 + 0.1209i | 0.1234 + 0.1209i |

-continued

| | | | | | | | | |
|---|---|---|---|---|---|---|---|---|
| 18.5 | 0.0961 + 0.0854i | 0.0961 + 0.0854i | 0.0961 + 0.0854i | 0.0961 + 0.0854i | 0.0971 + 0.1780i | 0.0971 + 0.1780i | 0.0971 + 0.1780i | 0.0971 + 0.1780i |
| 19 | 0.0921 + 0.0770i | 0.0921 + 0.0770i | 0.0921 + 0.0770i | 0.0921 + 0.0770i | 0.0938 + 0.2028i | 0.0938 + 0.2028i | 0.0938 + 0.2028i | 0.0938 + 0.2028i |
| 19.5 | 0.0905 + 0.0748i | 0.0905 + 0.0748i | 0.0905 + 0.0748i | 0.0905 + 0.0748i | 0.0927 + 0.2157i | 0.0927 + 0.2157i | 0.0927 + 0.2157i | 0.0927 + 0.2157i |
| 20 | 0.2104 + 0.0757i | 0.2104 + 0.0757i | 0.2104 + 0.0757i | 0.2104 + 0.0757i | 0.2094 + 0.1154i | 0.2094 + 0.1154i | 0.2094 + 0.1154i | 0.2094 + 0.1154i |
| 20.5 | 0.1593 + 0.0657i | 0.1593 + 0.0657i | 0.1593 + 0.0657i | 0.1593 + 0.0657i | 0.1613 + 0.1873i | 0.1613 + 0.1873i | 0.1613 + 0.1873i | 0.1613 + 0.1873i |
| 21 | 0.1708 + 0.0613i | 0.1708 + 0.0613i | 0.1708 + 0.0613i | 0.1708 + 0.0613i | 0.1705 + 0.1750i | 0.1705 + 0.1750i | 0.1705 + 0.1750i | 0.1705 + 0.1750i |
| 21.5 | 0.1850 + 0.0578i | 0.1850 + 0.0578i | 0.1850 + 0.0578i | 0.1850 + 0.0578i | 0.1832 + 0.1667i | 0.1832 + 0.1667i | 0.1832 + 0.1667i | 0.1832 + 0.1667i |
| 22 | 0.1740 + 0.0587i | 0.1740 + 0.0587i | 0.1740 + 0.0587i | 0.1740 + 0.0587i | 0.1739 + 0.1750i | 0.1739 + 0.1750i | 0.1739 + 0.1750i | 0.1739 + 0.1750i |
| 22.5 | 0.1798 + 0.0568i | 0.1798 + 0.0568i | 0.1798 + 0.0568i | 0.1798 + 0.0568i | 0.1797 + 0.1737i | 0.1797 + 0.1737i | 0.1797 + 0.1737i | 0.1797 + 0.1737i |
| 23 | 0.1753 + 0.0566i | 0.1753 + 0.0566i | 0.1753 + 0.0566i | 0.1753 + 0.0566i | 0.1746 + 0.1655i | 0.1746 + 0.1655i | 0.1746 + 0.1655i | 0.1746 + 0.1655i |
| 23.5 | 0.1751 + 0.0567i | 0.1751 + 0.0567i | 0.1751 + 0.0567i | 0.1751 + 0.0567i | 0.1756 + 0.1709i | 0.1756 + 0.1709i | 0.1756 + 0.1709i | 0.1756 + 0.1709i |
| 24 | 0.1711 + 0.0565i | 0.1711 + 0.0565i | 0.1711 + 0.0565i | 0.1711 + 0.0565i | 0.1709 + 0.1707i | 0.1709 + 0.1707i | 0.1709 + 0.1707i | 0.1709 + 0.1707i |
| 24.5 | 0.1692 + 0.0568i | 0.1692 + 0.0568i | 0.1692 + 0.0568i | 0.1692 + 0.0568i | 0.1703 + 0.1710i | 0.1703 + 0.1710i | 0.1703 + 0.1710i | 0.1703 + 0.1710i |
| 25 | 0.1878 + 0.0537i | 0.1878 + 0.0537i | 0.1620 + 0.0538i | 0.1620 + 0.0538i | 0.1869 + 0.1626i | 0.1869 + 0.1626i | 0.1621 + 0.1626i | 0.1621 + 0.1626i |
| 25.5 | 0.1715 + 0.0412i | 0.1727 + 0.0826i | 0.1516 + 0.0410i | 0.1518 + 0.0833i | 0.1745 + 0.2087i | 0.1743 + 0.1629i | 0.1532 + 0.2079i | 0.1527 + 0.1612i |
| 26 | 0.2200 + 0.0335i | 0.2157 + 0.0862i | 0.1605 + 0.0334i | 0.1594 + 0.0842i | 0.2057 + 0.2111i | 0.2090 + 0.1567i | 0.1533 + 0.2109i | 0.1556 + 0.1545i |
| 26.5 | 0.2312 + 0.0326i | 0.2301 + 0.0822i | 0.1675 + 0.0333i | 0.1669 + 0.0781i | 0.2213 + 0.2007i | 0.2267 + 0.1480i | 0.1613 + 0.1940i | 0.1643 + 0.1434i |
| 27 | 0.2133 + 0.0321i | 0.2124 + 0.0917i | 0.1539 + 0.0316i | 0.1528 + 0.0907i | 0.2111 + 0.2173i | 0.2112 + 0.1563i | 0.1511 + 0.2158i | 0.1520 + 0.1548i |
| 27.5 | 0.2220 + 0.0325i | 0.2205 + 0.0962i | 0.1593 + 0.0316i | 0.1585 + 0.0936i | 0.2186 + 0.2223i | 0.2194 + 0.1603i | 0.1562 + 0.2208i | 0.1568 + 0.1579i |
| 28 | 0.2272 + 0.0295i | 0.2268 + 0.0890i | 0.1609 + 0.0303i | 0.1613 + 0.0901i | 0.2228 + 0.2150i | 0.2255 + 0.1519i | 0.1587 + 0.2135i | 0.1605 + 0.1517i |

| SNR/w | w208 | w209 | w210 | w211 | w212 | w213 | w214 | w215 |
|---|---|---|---|---|---|---|---|---|
| 7 | 0.4139 + 0.2420i | 0.4502 + 0.2556i | 0.4139 + 0.2420i | 0.4502 + 0.2556i | 0.4502 + 0.2556i | 0.4502 + 0.2556i | 0.4502 + 0.2556i | 0.4502 + 0.2556i |
| 7.5 | 0.4284 + 0.2422i | 0.4284 + 0.2422i | 0.4284 + 0.2422i | 0.4026 + 0.2281i | 0.4532 + 0.2648i | 0.4532 + 0.2648i | 0.4500 + 0.2383i | 0.4284 + 0.2422i |
| 8 | 0.4279 + 0.2367i | 0.4279 + 0.2367i | 0.4279 + 0.2367i | 0.4279 + 0.2367i | 0.4279 + 0.2367i | 0.4279 + 0.2367i | 0.4279 + 0.2367i | 0.4279 + 0.2367i |
| 8.5 | 0.3946 + 0.2203i | 0.3753 + 0.2067i | 0.3946 + 0.2203i | 0.3753 + 0.2067i | 0.3946 + 0.2203i | 0.3946 + 0.2203i | 0.3946 + 0.2203i | 0.3946 + 0.2203i |
| 9 | 0.2334 + 0.5708i | 0.2334 + 0.5708i | 0.2334 + 0.5708i | 0.2334 + 0.5708i | 0.2334 + 0.5708i | 0.2334 + 0.5708i | 0.2334 + 0.5708i | 0.2334 + 0.5708i |
| 9.5 | 0.2261 + 0.6013i | 0.2261 + 0.6013i | 0.2261 + 0.6013i | 0.2261 + 0.6013i | 0.2261 + 0.6013i | 0.2261 + 0.6013i | 0.2261 + 0.6013i | 0.2261 + 0.6013i |
| 10 | 0.2172 + 0.6259i | 0.2172 + 0.6259i | 0.2172 + 0.6259i | 0.2172 + 0.6259i | 0.2172 + 0.6259i | 0.2172 + 0.6259i | 0.2172 + 0.6259i | 0.2172 + 0.6259i |
| 10.5 | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i |
| 11 | 0.3107 + 0.1761i | 0.3107 + 0.1761i | 0.3107 + 0.1761i | 0.3107 + 0.1761i | 0.3107 + 0.1761i | 0.3107 + 0.1761i | 0.3107 + 0.1761i | 0.3107 + 0.1761i |
| 11.5 | 0.3058 + 0.1740i | 0.3058 + 0.1740i | 0.3058 + 0.1740i | 0.3058 + 0.1740i | 0.3058 + 0.1740i | 0.3058 + 0.1740i | 0.3058 + 0.1740i | 0.3058 + 0.1740i |
| 12 | 0.3089 + 0.1735i | 0.3089 + 0.1735i | 0.3089 + 0.1735i | 0.3089 + 0.1735i | 0.3089 + 0.1735i | 0.3089 + 0.1735i | 0.3089 + 0.1735i | 0.3089 + 0.1735i |
| 12.5 | 0.2451 + 0.1663i | 0.2451 + 0.1663i | 0.2451 + 0.1663i | 0.2451 + 0.1663i | 0.2451 + 0.1663i | 0.2451 + 0.1663i | 0.2451 + 0.1663i | 0.2451 + 0.1663i |
| 13 | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i |
| 13.5 | 0.2162 + 0.1596i | 0.2162 + 0.1596i | 0.2162 + 0.1596i | 0.2162 + 0.1596i | 0.2162 + 0.1596i | 0.2162 + 0.1596i | 0.2162 + 0.1596i | 0.2162 + 0.1596i |
| 14 | 0.2037 + 0.1615i | 0.2037 + 0.1615i | 0.2037 + 0.1615i | 0.2037 + 0.1615i | 0.2037 + 0.1615i | 0.2037 + 0.1615i | 0.2037 + 0.1615i | 0.2037 + 0.1615i |
| 14.5 | 0.1955 + 0.1660i | 0.1955 + 0.1660i | 0.1955 + 0.1660i | 0.1955 + 0.1660i | 0.1955 + 0.1660i | 0.1955 + 0.1660i | 0.1955 + 0.1660i | 0.1955 + 0.1660i |
| 15 | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i |

-continued

| | | | | | | | | |
|---|---|---|---|---|---|---|---|---|
| 15.5 | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i |
| 16 | 0.1145 + 0.3867i | 0.1145 + 0.3867i | 0.1145 + 0.3867i | 0.1145 + 0.3867i | 0.1139 + 0.3666i | 0.1139 + 0.3666i | 0.1139 + 0.3666i | 0.1139 + 0.3666i |
| 16.5 | 0.1132 + 0.3584i | 0.1132 + 0.3584i | 0.1132 + 0.3584i | 0.1132 + 0.3584i | 0.1134 + 0.3351i | 0.1134 + 0.3351i | 0.1134 + 0.3351i | 0.1134 + 0.3351i |
| 17 | 0.1128 + 0.3620i | 0.1128 + 0.3620i | 0.1128 + 0.3620i | 0.1128 + 0.3620i | 0.1130 + 0.3327i | 0.1130 + 0.3327i | 0.1130 + 0.3327i | 0.1130 + 0.3327i |
| 17.5 | 0.1124 + 0.3668i | 0.1124 + 0.3668i | 0.1124 + 0.3668i | 0.1124 + 0.3668i | 0.1127 + 0.3280i | 0.1127 + 0.3280i | 0.1127 + 0.3280i | 0.1127 + 0.3280i |
| 18 | 0.1020 + 0.3721i | 0.1020 + 0.3721i | 0.1020 + 0.3721i | 0.1020 + 0.3721i | 0.1022 + 0.3196i | 0.1022 + 0.3196i | 0.1022 + 0.3196i | 0.1022 + 0.3196i |
| 18.5 | 0.1033 + 0.4748i | 0.1033 + 0.4748i | 0.1033 + 0.4748i | 0.1033 + 0.4748i | 0.0995 + 0.3488i | 0.0995 + 0.3488i | 0.0995 + 0.3488i | 0.0995 + 0.3488i |
| 19 | 0.0880 + 0.5037i | 0.0880 + 0.5037i | 0.0880 + 0.5037i | 0.0880 + 0.5037i | 0.0946 + 0.3591i | 0.0946 + 0.3591i | 0.0946 + 0.3591i | 0.0946 + 0.3591i |
| 19.5 | 0.0798 + 0.5209i | 0.0798 + 0.5209i | 0.0798 + 0.5209i | 0.0798 + 0.5209i | 0.0825 + 0.3687i | 0.0825 + 0.3687i | 0.0825 + 0.3687i | 0.0825 + 0.3687i |
| 20 | 0.0700 + 0.3244i | 0.0700 + 0.3244i | 0.0700 + 0.3244i | 0.0700 + 0.3244i | 0.0714 + 0.2590i | 0.0714 + 0.2590i | 0.0714 + 0.2590i | 0.0714 + 0.2590i |
| 20.5 | 0.0631 + 0.4551i | 0.0631 + 0.4551i | 0.0631 + 0.4551i | 0.0631 + 0.4551i | 0.0635 + 0.3220i | 0.0635 + 0.3220i | 0.0635 + 0.3220i | 0.0635 + 0.3220i |
| 21 | 0.0606 + 0.4318i | 0.0606 + 0.4318i | 0.0606 + 0.4318i | 0.0606 + 0.4318i | 0.0605 + 0.3029i | 0.0605 + 0.3029i | 0.0605 + 0.3029i | 0.0605 + 0.3029i |
| 21.5 | 0.0595 + 0.4083i | 0.0595 + 0.4083i | 0.0595 + 0.4083i | 0.0595 + 0.4083i | 0.0610 + 0.2852i | 0.0610 + 0.2852i | 0.0610 + 0.2852i | 0.0610 + 0.2852i |
| 22 | 0.0587 + 0.4286i | 0.0587 + 0.4286i | 0.0587 + 0.4286i | 0.0587 + 0.4286i | 0.0588 + 0.2997i | 0.0588 + 0.2997i | 0.0588 + 0.2997i | 0.0588 + 0.2997i |
| 22.5 | 0.0573 + 0.4196i | 0.0573 + 0.4196i | 0.0573 + 0.4196i | 0.0573 + 0.4196i | 0.0591 + 0.2925i | 0.0591 + 0.2925i | 0.0591 + 0.2925i | 0.0591 + 0.2925i |
| 23 | 0.0552 + 0.4065i | 0.0552 + 0.4065i | 0.0552 + 0.4065i | 0.0552 + 0.4065i | 0.0586 + 0.2809i | 0.0586 + 0.2809i | 0.0586 + 0.2809i | 0.0586 + 0.2809i |
| 23.5 | 0.0583 + 0.4211i | 0.0587 + 0.4058i | 0.0583 + 0.4211i | 0.0587 + 0.4058i | 0.0586 + 0.2893i | 0.0586 + 0.2893i | 0.0586 + 0.2893i | 0.0586 + 0.2893i |
| 24 | 0.0556 + 0.4321i | 0.0558 + 0.3996i | 0.0556 + 0.4321i | 0.0558 + 0.3996i | 0.0564 + 0.2825i | 0.0563 + 0.2941i | 0.0564 + 0.2825i | 0.0563 + 0.2941i |
| 24.5 | 0.0583 + 0.4291i | 0.0581 + 0.3963i | 0.0583 + 0.4291i | 0.0581 + 0.3963i | 0.0571 + 0.2816i | 0.0572 + 0.2955i | 0.0571 + 0.2816i | 0.0572 + 0.2955i |
| 25 | 0.0517 + 0.4253i | 0.0513 + 0.3805i | 0.0633 + 0.4254i | 0.0636 + 0.3805i | 0.0504 + 0.2667i | 0.0503 + 0.2885i | 0.0643 + 0.2665i | 0.0640 + 0.2883i |
| 25.5 | 0.0466 + 0.4869i | 0.0531 + 0.4193i | 0.0662 + 0.4850i | 0.0531 + 0.4193i | 0.0559 + 0.2861i | 0.0548 + 0.3407i | 0.0559 + 0.2861i | 0.0548 + 0.3407i |
| 26 | 0.0351 + 0.4808i | 0.0342 + 0.4146i | 0.0899 + 0.4781i | 0.0857 + 0.4137i | 0.0349 + 0.2807i | 0.0346 + 0.3432i | 0.0827 + 0.2816i | 0.0843 + 0.3431i |
| 26.5 | 0.0318 + 0.4522i | 0.0321 + 0.3789i | 0.0739 + 0.4533i | 0.0796 + 0.3824i | 0.0325 + 0.2516i | 0.0330 + 0.3088i | 0.0908 + 0.2538i | 0.0850 + 0.3119i |
| 27 | 0.0308 + 0.4850i | 0.0311 + 0.4144i | 0.0873 + 0.4850i | 0.0875 + 0.4142i | 0.0307 + 0.2794i | 0.0310 + 0.3456i | 0.0863 + 0.2798i | 0.0866 + 0.3448i |
| 27.5 | 0.0311 + 0.4893i | 0.0313 + 0.4189i | 0.0920 + 0.4897i | 0.0921 + 0.4194i | 0.0314 + 0.2837i | 0.0311 + 0.3499i | 0.0926 + 0.2848i | 0.0919 + 0.3507i |
| 28 | 0.0302 + 0.4887i | 0.0304 + 0.4150i | 0.0892 + 0.4889i | 0.0900 + 0.4153i | 0.0313 + 0.2777i | 0.0307 + 0.3444i | 0.0933 + 0.2782i | 0.0916 + 0.3449i |

| SNR/w | w216 | w217 | w218 | w219 | w220 | w221 | w222 | w223 |
|---|---|---|---|---|---|---|---|---|
| 7 | 0.4502 + 0.2556i | 0.4502 + 0.2556i | 0.4502 + 0.2556i | 0.4502 + 0.2556i | 0.4502 + 0.2556i | 0.4862 + 0.2687i | 0.4502 + 0.2556i | 0.4862 + 0.2687i |
| 7.5 | 0.4532 + 0.2648i | 0.4532 + 0.2648i | 0.4500 + 0.2383i | 0.4284 + 0.2422i | 0.4852 + 0.2798i | 0.4852 + 0.2798i | 0.4819 + 0.2466i | 0.4819 + 0.2466i |
| 8 | 0.4779 + 0.2367i | 0.4779 + 0.2367i | 0.4779 + 0.2367i | 0.4779 + 0.2367i | 0.4786 + 0.2728i | 0.4786 + 0.2728i | 0.4786 + 0.2728i | 0.4786 + 0.2728i |
| 8.5 | 0.5214 + 0.2360i | 0.5214 + 0.2360i | 0.5214 + 0.2360i | 0.5214 + 0.2360i | 0.5113 + 0.2843i | 0.5113 + 0.2843i | 0.5113 + 0.2843i | 0.5113 + 0.2843i |
| 9 | 0.2334 + 0.5708i | 0.2334 + 0.5708i | 0.2334 + 0.5708i | 0.2334 + 0.5708i | 0.2334 + 0.5708i | 0.2334 + 0.5708i | 0.2334 + 0.5708i | 0.2334 + 0.5708i |
| 9.5 | 0.2261 + 0.6013i | 0.2261 + 0.6013i | 0.2261 + 0.6013i | 0.2261 + 0.6013i | 0.2261 + 0.6013i | 0.2261 + 0.6013i | 0.2261 + 0.6013i | 0.2261 + 0.6013i |
| 10 | 0.2172 + 0.6259i | 0.2172 + 0.6259i | 0.2172 + 0.6259i | 0.2172 + 0.6259i | 0.2172 + 0.6259i | 0.2172 + 0.6259i | 0.2172 + 0.6259i | 0.2172 + 0.6259i |
| 10.5 | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i |
| 11 | 0.3107 + 0.1761i | 0.3224 + 0.1541i | 0.3107 + 0.1761i | 0.3107 + 0.1761i | 0.3107 + 0.1761i | 0.3107 + 0.1761i | 0.3107 + 0.1761i | 0.3107 + 0.1761i |
| 11.5 | 0.3058 + 0.1740i | 0.3058 + 0.1740i | 0.3058 + 0.1740i | 0.3058 + 0.1740i | 0.3058 + 0.1740i | 0.3058 + 0.1740i | 0.3058 + 0.1740i | 0.3058 + 0.1740i |
| 12 | 0.3089 + 0.1735i | 0.3089 + 0.1735i | 0.3089 + 0.1735i | 0.3089 + 0.1735i | 0.3089 + 0.1735i | 0.3089 + 0.1735i | 0.3089 + 0.1735i | 0.3089 + 0.1735i |

-continued

| | | | | | | | | |
|---|---|---|---|---|---|---|---|---|
| 12.5 | 0.2451 + 0.1663i | 0.2451 + 0.1663i | 0.2451 + 0.1663i | 0.2451 + 0.1663i | 0.2451 + 0.1663i | 0.2451 + 0.1663i | 0.2451 + 0.1663i | 0.2451 + 0.1663i |
| 13 | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i |
| 13.5 | 0.2162 + 0.1596i | 0.2162 + 0.1596i | 0.2162 + 0.1596i | 0.2162 + 0.1596i | 0.2162 + 0.1596i | 0.2162 + 0.1596i | 0.2162 + 0.1596i | 0.2162 + 0.1596i |
| 14 | 0.2037 + 0.1615i | 0.2037 + 0.1615i | 0.2037 + 0.1615i | 0.2037 + 0.1615i | 0.2037 + 0.1615i | 0.2037 + 0.1615i | 0.2037 + 0.1615i | 0.2037 + 0.1615i |
| 14.5 | 0.1955 + 0.1660i | 0.1955 + 0.1660i | 0.1955 + 0.1660i | 0.1955 + 0.1660i | 0.1955 + 0.1660i | 0.1955 + 0.1660i | 0.1955 + 0.1660i | 0.1955 + 0.1660i |
| 15 | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i |
| 15.5 | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i |
| 16 | 0.1145 + 0.3867i | 0.1145 + 0.3867i | 0.1145 + 0.3867i | 0.1145 + 0.3867i | 0.1139 + 0.3666i | 0.1139 + 0.3666i | 0.1139 + 0.3666i | 0.1139 + 0.3666i |
| 16.5 | 0.1132 + 0.3584i | 0.1132 + 0.3584i | 0.1132 + 0.3584i | 0.1132 + 0.3584i | 0.1134 + 0.3351i | 0.1134 + 0.3351i | 0.1134 + 0.3351i | 0.1134 + 0.3351i |
| 17 | 0.1128 + 0.3620i | 0.1128 + 0.3620i | 0.1128 + 0.3620i | 0.1128 + 0.3620i | 0.1130 + 0.3327i | 0.1130 + 0.3327i | 0.1130 + 0.3327i | 0.1130 + 0.3327i |
| 17.5 | 0.1124 + 0.3668i | 0.1124 + 0.3668i | 0.1124 + 0.3668i | 0.1124 + 0.3668i | 0.1127 + 0.3280i | 0.1127 + 0.3280i | 0.1127 + 0.3280i | 0.1127 + 0.3280i |
| 18 | 0.1216 + 0.3721i | 0.1216 + 0.3721i | 0.1216 + 0.3721i | 0.1216 + 0.3721i | 0.1222 + 0.3198i | 0.1222 + 0.3198i | 0.1222 + 0.3198i | 0.1222 + 0.3198i |
| 18.5 | 0.1033 + 0.4748i | 0.1033 + 0.4748i | 0.1033 + 0.4748i | 0.1033 + 0.4748i | 0.0995 + 0.3488i | 0.0995 + 0.3488i | 0.0995 + 0.3488i | 0.0995 + 0.3488i |
| 19 | 0.1195 + 0.5020i | 0.1195 + 0.5020i | 0.1195 + 0.5020i | 0.1195 + 0.5020i | 0.1078 + 0.3588i | 0.1078 + 0.3588i | 0.0946 + 0.3591i | 0.0946 + 0.3591i |
| 19.5 | 0.1298 + 0.5175i | 0.1298 + 0.5175i | 0.1298 + 0.5175i | 0.1298 + 0.5175i | 0.1126 + 0.3677i | 0.1126 + 0.3677i | 0.1126 + 0.3677i | 0.1126 + 0.3677i |
| 20 | 0.1950 + 0.3354i | 0.1950 + 0.3354i | 0.1950 + 0.3354i | 0.1950 + 0.3354i | 0.2030 + 0.2636i | 0.2030 + 0.2636i | 0.2030 + 0.2636i | 0.2030 + 0.2636i |
| 20.5 | 0.1682 + 0.4544i | 0.1682 + 0.4544i | 0.1682 + 0.4544i | 0.1682 + 0.4544i | 0.1644 + 0.3218i | 0.1644 + 0.3218i | 0.1644 + 0.3218i | 0.1644 + 0.3218i |
| 21 | 0.1707 + 0.4303i | 0.1707 + 0.4303i | 0.1707 + 0.4303i | 0.1707 + 0.4303i | 0.1703 + 0.3021i | 0.1703 + 0.3021i | 0.1703 + 0.3021i | 0.1703 + 0.3021i |
| 21.5 | 0.1741 + 0.4109i | 0.1741 + 0.4109i | 0.1741 + 0.4109i | 0.1741 + 0.4109i | 0.1795 + 0.2874i | 0.1795 + 0.2874i | 0.1795 + 0.2874i | 0.1795 + 0.2874i |
| 22 | 0.1749 + 0.4271i | 0.1749 + 0.4271i | 0.1749 + 0.4271i | 0.1749 + 0.4271i | 0.1738 + 0.2981i | 0.1738 + 0.2981i | 0.1738 + 0.2981i | 0.1738 + 0.2981i |
| 22.5 | 0.1745 + 0.4185i | 0.1745 + 0.4185i | 0.1745 + 0.4185i | 0.1745 + 0.4185i | 0.1777 + 0.2932i | 0.1777 + 0.2932i | 0.1777 + 0.2932i | 0.1777 + 0.2932i |
| 23 | 0.1713 + 0.4102i | 0.1713 + 0.4102i | 0.1713 + 0.4102i | 0.1713 + 0.4102i | 0.1741 + 0.2862i | 0.1741 + 0.2862i | 0.1741 + 0.2862i | 0.1741 + 0.2862i |
| 23.5 | 0.1755 + 0.4225i | 0.1758 + 0.4068i | 0.1755 + 0.4225i | 0.1758 + 0.4068i | 0.1762 + 0.2899i | 0.1762 + 0.2899i | 0.1762 + 0.2899i | 0.1762 + 0.2899i |
| 24 | 0.1684 + 0.4315i | 0.1690 + 0.4003i | 0.1684 + 0.4315i | 0.1690 + 0.4003i | 0.1703 + 0.2831i | 0.1701 + 0.2943i | 0.1703 + 0.2831i | 0.1701 + 0.2943i |
| 24.5 | 0.1760 + 0.4292i | 0.1752 + 0.3947i | 0.1760 + 0.4292i | 0.1752 + 0.3947i | 0.1723 + 0.2806i | 0.1728 + 0.2950i | 0.1723 + 0.2806i | 0.1728 + 0.2950i |
| 25 | 0.1829 + 0.4260i | 0.1836 + 0.3794i | 0.1638 + 0.4261i | 0.1632 + 0.3797i | 0.1852 + 0.2652i | 0.1851 + 0.2880i | 0.1620 + 0.2653i | 0.1622 + 0.2879i |
| 25.5 | 0.1841 + 0.4843i | 0.1829 + 0.4186i | 0.1522 + 0.4849i | 0.1542 + 0.4185i | 0.1779 + 0.2862i | 0.1807 + 0.3418i | 0.1534 + 0.2865i | 0.1548 + 0.3424i |
| 26 | 0.2196 + 0.4716i | 0.2157 + 0.4087i | 0.1610 + 0.4748i | 0.1570 + 0.4119i | 0.2054 + 0.2809i | 0.2094 + 0.3380i | 0.1524 + 0.2824i | 0.1543 + 0.3418i |
| 26.5 | 0.1932 + 0.4577i | 0.1997 + 0.3933i | 0.1389 + 0.4551i | 0.1435 + 0.3873i | 0.2147 + 0.2666i | 0.2083 + 0.3257i | 0.1555 + 0.2607i | 0.1493 + 0.3184i |
| 27 | 0.2118 + 0.4809i | 0.2110 + 0.4119i | 0.1507 + 0.4836i | 0.1502 + 0.4134i | 0.2109 + 0.2819i | 0.2107 + 0.3441i | 0.1498 + 0.2809i | 0.1497 + 0.3442i |
| 27.5 | 0.2186 + 0.4902i | 0.2189 + 0.4202i | 0.1557 + 0.4902i | 0.1557 + 0.4197i | 0.2185 + 0.2872i | 0.2190 + 0.3526i | 0.1559 + 0.2865i | 0.1554 + 0.3519i |
| 28 | 0.2101 + 0.4919i | 0.2114 + 0.4198i | 0.1496 + 0.4906i | 0.1510 + 0.4173i | 0.2183 + 0.2814i | 0.2142 + 0.3497i | 0.1566 + 0.2788i | 0.1537 + 0.3467i |

| SNR/w | w224 | w225 | w226 | w227 | w228 | w229 | w230 | w231 |
|---|---|---|---|---|---|---|---|---|
| 7 | 0.4139 + 0.2420i | 0.4502 + 0.2556i | 0.4139 + 0.2420i | 0.4502 + 0.2556i | 0.4502 + 0.2556i | 0.4502 + 0.2556i | 0.4502 + 0.2556i | 0.4502 + 0.2556i |
| 7.5 | 0.4284 + 0.2422i | 0.4284 + 0.2422i | 0.4284 + 0.2422i | 0.4026 + 0.2281i | 0.4532 + 0.2648i | 0.4532 + 0.2648i | 0.4500 + 0.2383i | 0.4284 + 0.2422i |
| 8 | 0.4279 + 0.2367i | 0.4279 + 0.2367i | 0.4279 + 0.2367i | 0.4279 + 0.2367i | 0.4279 + 0.2367i | 0.4279 + 0.2367i | 0.4279 + 0.2367i | 0.4279 + 0.2367i |
| 8.5 | 0.3946 + 0.2203i | 0.3753 + 0.2067i | 0.3946 + 0.2203i | 0.3753 + 0.2067i | 0.3946 + 0.2203i | 0.3946 + 0.2203i | 0.3946 + 0.2203i | 0.3946 + 0.2203i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |

-continued

| | | | | | | | | |
|---|---|---|---|---|---|---|---|---|
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i |
| 15 | 0.3733 + 0.1159i | 0.3733 + 0.1159i | 0.3733 + 0.1159i | 0.3733 + 0.1159i | 0.3733 + 0.1159i | 0.3733 + 0.1159i | 0.3733 + 0.1159i | 0.3733 + 0.1159i |
| 15.5 | 0.3717 + 0.1138i | 0.3717 + 0.1138i | 0.3717 + 0.1138i | 0.3717 + 0.1138i | 0.3717 + 0.1138i | 0.3717 + 0.1138i | 0.3717 + 0.1138i | 0.3717 + 0.1138i |
| 16 | 0.3478 + 0.1172i | 0.3478 + 0.1172i | 0.3478 + 0.1172i | 0.3478 + 0.1172i | 0.3478 + 0.1172i | 0.3478 + 0.1172i | 0.3478 + 0.1172i | 0.3478 + 0.1172i |
| 16.5 | 0.3638 + 0.1141i | 0.3638 + 0.1141i | 0.3638 + 0.1141i | 0.3638 + 0.1141i | 0.3638 + 0.1141i | 0.3638 + 0.1141i | 0.3638 + 0.1141i | 0.3638 + 0.1141i |
| 17 | 0.3668 + 0.1139i | 0.3668 + 0.1139i | 0.3668 + 0.1139i | 0.3668 + 0.1139i | 0.3668 + 0.1139i | 0.3668 + 0.1139i | 0.3668 + 0.1139i | 0.3668 + 0.1139i |
| 17.5 | 0.3713 + 0.1139i | 0.3713 + 0.1139i | 0.3713 + 0.1139i | 0.3713 + 0.1139i | 0.3713 + 0.1139i | 0.3713 + 0.1139i | 0.3713 + 0.1139i | 0.3713 + 0.1139i |
| 18 | 0.3770 + 0.1032i | 0.3770 + 0.1032i | 0.3770 + 0.1032i | 0.3770 + 0.1032i | 0.3769 + 0.1228i | 0.3769 + 0.1228i | 0.3769 + 0.1228i | 0.3769 + 0.1228i |
| 18.5 | 0.3136 + 0.0880i | 0.3136 + 0.0880i | 0.3136 + 0.0880i | 0.3136 + 0.0880i | 0.3169 + 0.1649i | 0.3169 + 0.1649i | 0.3169 + 0.1649i | 0.3169 + 0.1649i |
| 19 | 0.3047 + 0.0779i | 0.3047 + 0.0779i | 0.3047 + 0.0779i | 0.3047 + 0.0779i | 0.3114 + 0.1880i | 0.3114 + 0.1880i | 0.3114 + 0.1880i | 0.3114 + 0.1880i |
| 19.5 | 0.3016 + 0.0738i | 0.3016 + 0.0738i | 0.3016 + 0.0738i | 0.3016 + 0.0738i | 0.3110 + 0.2020i | 0.3110 + 0.2020i | 0.3110 + 0.2020i | 0.3110 + 0.2020i |
| 20 | 0.5049 + 0.0708i | 0.5049 + 0.0708i | 0.5049 + 0.0708i | 0.5049 + 0.0708i | 0.4994 + 0.1471i | 0.4994 + 0.1471i | 0.4994 + 0.1471i | 0.4994 + 0.1471i |
| 20.5 | 0.4001 + 0.0654i | 0.4001 + 0.0654i | 0.4001 + 0.0654i | 0.4001 + 0.0654i | 0.4035 + 0.1848i | 0.4035 + 0.1848i | 0.4035 + 0.1848i | 0.4035 + 0.1848i |
| 21 | 0.4216 + 0.0611i | 0.4216 + 0.0611i | 0.4216 + 0.0611i | 0.4216 + 0.0611i | 0.4212 + 0.1733i | 0.4212 + 0.1733i | 0.4212 + 0.1733i | 0.4212 + 0.1733i |
| 21.5 | 0.4460 + 0.0597i | 0.4460 + 0.0597i | 0.4460 + 0.0597i | 0.4460 + 0.0597i | 0.4424 + 0.1748i | 0.4424 + 0.1748i | 0.4424 + 0.1748i | 0.4424 + 0.1748i |
| 22 | 0.4254 + 0.0584i | 0.4254 + 0.0584i | 0.4254 + 0.0584i | 0.4254 + 0.0584i | 0.4248 + 0.1721i | 0.4248 + 0.1721i | 0.4248 + 0.1721i | 0.4248 + 0.1721i |
| 22.5 | 0.4316 + 0.0602i | 0.4316 + 0.0602i | 0.4316 + 0.0602i | 0.4316 + 0.0602i | 0.4324 + 0.1762i | 0.4324 + 0.1762i | 0.4324 + 0.1762i | 0.4324 + 0.1762i |
| 23 | 0.4302 + 0.0540i | 0.4302 + 0.0540i | 0.4302 + 0.0540i | 0.4302 + 0.0540i | 0.4255 + 0.1756i | 0.4255 + 0.1756i | 0.4255 + 0.1756i | 0.4255 + 0.1756i |
| 23.5 | 0.4370 + 0.0576i | 0.4370 + 0.0576i | 0.4157 + 0.0570i | 0.4157 + 0.0570i | 0.4362 + 0.1725i | 0.4362 + 0.1725i | 0.4153 + 0.1725i | 0.4153 + 0.1725i |
| 24 | 0.4312 + 0.0561i | 0.4312 + 0.0561i | 0.4003 + 0.0563i | 0.4003 + 0.0563i | 0.4310 + 0.1694i | 0.4310 + 0.1694i | 0.4005 + 0.1699i | 0.4005 + 0.1699i |
| 24.5 | 0.4391 + 0.0544i | 0.4391 + 0.0544i | 0.3936 + 0.0550i | 0.3936 + 0.0550i | 0.4411 + 0.1644i | 0.4411 + 0.1644i | 0.3963 + 0.1660i | 0.3963 + 0.1660i |
| 25 | 0.4741 + 0.0555i | 0.4741 + 0.0555i | 0.4096 + 0.0551i | 0.4096 + 0.0551i | 0.4731 + 0.1733i | 0.4733 + 0.1614i | 0.4082 + 0.1712i | 0.4080 + 0.1602i |
| 25.5 | 0.4328 + 0.0417i | 0.4336 + 0.0744i | 0.3744 + 0.0411i | 0.3745 + 0.0772i | 0.4411 + 0.1978i | 0.4377 + 0.1570i | 0.3822 + 0.2018i | 0.3792 + 0.1581i |
| 26 | 0.4870 + 0.0884i | 0.4896 + 0.1188i | 0.4269 + 0.0476i | 0.4149 + 0.1052i | 0.4977 + 0.2069i | 0.4981 + 0.1758i | 0.4158 + 0.2122i | 0.4119 + 0.1755i |
| 26.5 | 0.4824 + 0.0289i | 0.4857 + 0.0919i | 0.4205 + 0.0350i | 0.4205 + 0.0961i | 0.4899 + 0.2242i | 0.4866 + 0.1642i | 0.4194 + 0.2229i | 0.4216 + 0.1624i |
| 27 | 0.5079 + 0.0438i | 0.5036 + 0.1009i | 0.4254 + 0.0322i | 0.4167 + 0.1021i | 0.4840 + 0.2135i | 0.4940 + 0.1581i | 0.4139 + 0.2120i | 0.4156 + 0.1554i |
| 27.5 | 0.5112 + 0.0414i | 0.5049 + 0.1036i | 0.4283 + 0.0333i | 0.4231 + 0.1059i | 0.4951 + 0.2253i | 0.4990 + 0.1631i | 0.4241 + 0.2243i | 0.4237 + 0.1622i |
| 28 | 0.6043 + 0.0218i | 0.5006 + 0.1245i | 0.4388 + 0.0377i | 0.4351 + 0.1002i | 0.4847 + 0.2316i | 0.4930 + 0.1739i | 0.4142 + 0.2270i | 0.4205 + 0.1632i |

-continued

| SNR/ w | w232 | w233 | w234 | w235 | w236 | w237 | w238 | w239 |
|---|---|---|---|---|---|---|---|---|
| 7 | 0.4502 + 0.2556i | 0.4502 + 0.2556i | 0.4502 + 0.2556i | 0.4502 + 0.2556i | 0.4502 + 0.2556i | 0.4862 + 0.2687i | 0.4502 + 0.2556i | 0.4862 + 0.2687i |
| 7.5 | 0.4532 + 0.2648i | 0.4532 + 0.2648i | 0.4500 + 0.2383i | 0.4284 + 0.2422i | 0.4852 + 0.2798i | 0.4852 + 0.2798i | 0.4819 + 0.2466i | 0.4819 + 0.2466i |
| 8 | 0.4779 + 0.2367i | 0.4779 + 0.2367i | 0.4779 + 0.2367i | 0.4779 + 0.2367i | 0.4786 + 0.2728i | 0.4786 + 0.2728i | 0.4786 + 0.2728i | 0.4786 + 0.2728i |
| 8.5 | 0.5214 + 0.2360i | 0.5214 + 0.2360i | 0.5214 + 0.2360i | 0.5214 + 0.2360i | 0.5113 + 0.2843i | 0.5113 + 0.2843i | 0.5113 + 0.2843i | 0.5113 + 0.2843i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i |
| 15 | 0.3586 + 0.1164i | 0.3586 + 0.1164i | 0.3733 + 0.1159i | 0.3733 + 0.1159i | 0.3586 + 0.1164i | 0.3586 + 0.1164i | 0.3733 + 0.1159i | 0.3733 + 0.1159i |
| 15.5 | 0.3502 + 0.1152i | 0.3502 + 0.1152i | 0.3502 + 0.1152i | 0.3502 + 0.1152i | 0.3502 + 0.1152i | 0.3502 + 0.1152i | 0.3502 + 0.1152i | 0.3502 + 0.1152i |
| 16 | 0.3271 + 0.1181i | 0.3271 + 0.1181i | 0.3271 + 0.1181i | 0.3271 + 0.1181i | 0.3271 + 0.1181i | 0.3271 + 0.1181i | 0.3271 + 0.1181i | 0.3271 + 0.1181i |
| 16.5 | 0.3406 + 0.1138i | 0.3406 + 0.1138i | 0.3406 + 0.1138i | 0.3406 + 0.1138i | 0.3406 + 0.1138i | 0.3406 + 0.1138i | 0.3406 + 0.1138i | 0.3406 + 0.1138i |
| 17 | 0.3375 + 0.1135i | 0.3375 + 0.1135i | 0.3375 + 0.1135i | 0.3375 + 0.1135i | 0.3375 + 0.1135i | 0.3375 + 0.1135i | 0.3375 + 0.1135i | 0.3375 + 0.1135i |
| 17.5 | 0.3328 + 0.1134i | 0.3328 + 0.1134i | 0.3328 + 0.1134i | 0.3328 + 0.1134i | 0.3328 + 0.1134i | 0.3328 + 0.1134i | 0.3328 + 0.1134i | 0.3328 + 0.1134i |
| 18 | 0.3244 + 0.1028i | 0.3244 + 0.1028i | 0.3244 + 0.1028i | 0.3244 + 0.1028i | 0.3243 + 0.1222i | 0.3243 + 0.1222i | 0.3243 + 0.1222i | 0.3243 + 0.1222i |
| 18.5 | 0.2821 + 0.0875i | 0.2821 + 0.0875i | 0.2821 + 0.0875i | 0.2821 + 0.0875i | 0.2844 + 0.1675i | 0.2844 + 0.1675i | 0.2844 + 0.1675i | 0.2844 + 0.1675i |
| 19 | 0.2681 + 0.0776i | 0.2681 + 0.0776i | 0.2681 + 0.0776i | 0.2681 + 0.0776i | 0.2719 + 0.1922i | 0.2719 + 0.1922i | 0.2719 + 0.1922i | 0.2719 + 0.1922i |
| 19.5 | 0.2598 + 0.0741i | 0.2598 + 0.0741i | 0.2598 + 0.0741i | 0.2598 + 0.0741i | 0.2641 + 0.2070i | 0.2641 + 0.2070i | 0.2641 + 0.2070i | 0.2641 + 0.2070i |
| 20 | 0.3583 + 0.0733i | 0.3583 + 0.0733i | 0.3583 + 0.0733i | 0.3583 + 0.0733i | 0.3557 + 0.1281i | 0.3557 + 0.1281i | 0.3557 + 0.1281i | 0.3557 + 0.1281i |
| 20.5 | 0.2886 + 0.0655i | 0.2886 + 0.0655i | 0.2886 + 0.0655i | 0.2886 + 0.0655i | 0.2903 + 0.1864i | 0.2903 + 0.1864i | 0.2903 + 0.1864i | 0.2903 + 0.1864i |
| 21 | 0.2964 + 0.0612i | 0.2964 + 0.0612i | 0.2964 + 0.0612i | 0.2964 + 0.0612i | 0.2961 + 0.1741i | 0.2961 + 0.1741i | 0.2961 + 0.1741i | 0.2961 + 0.1741i |
| 21.5 | 0.3136 + 0.0587i | 0.3136 + 0.0587i | 0.3136 + 0.0587i | 0.3136 + 0.0587i | 0.3109 + 0.1701i | 0.3109 + 0.1701i | 0.3109 + 0.1701i | 0.3109 + 0.1701i |
| 22 | 0.2965 + 0.0583i | 0.2965 + 0.0583i | 0.2965 + 0.0583i | 0.2965 + 0.0583i | 0.2961 + 0.1740i | 0.2961 + 0.1740i | 0.2961 + 0.1740i | 0.2961 + 0.1740i |
| 22.5 | 0.3044 + 0.0585i | 0.3044 + 0.0585i | 0.3044 + 0.0585i | 0.3044 + 0.0585i | 0.3022 + 0.1743i | 0.3022 + 0.1743i | 0.3022 + 0.1743i | 0.3022 + 0.1743i |
| 23 | 0.3002 + 0.0559i | 0.3002 + 0.0559i | 0.3002 + 0.0559i | 0.3002 + 0.0559i | 0.3008 + 0.1679i | 0.3008 + 0.1679i | 0.3008 + 0.1679i | 0.3008 + 0.1679i |
| 23.5 | 0.2968 + 0.0565i | 0.2968 + 0.0565i | 0.2968 + 0.0565i | 0.2968 + 0.0565i | 0.2971 + 0.1712i | 0.2971 + 0.1712i | 0.2971 + 0.1712i | 0.2971 + 0.1712i |
| 24 | 0.2835 + 0.0565i | 0.2835 + 0.0565i | 0.2947 + 0.0565i | 0.2947 + 0.0565i | 0.2833 + 0.1706i | 0.2833 + 0.1706i | 0.2943 + 0.1705i | 0.2943 + 0.1705i |
| 24.5 | 0.2767 + 0.0562i | 0.2767 + 0.0562i | 0.2962 + 0.0561i | 0.2962 + 0.0561i | 0.2786 + 0.1694i | 0.2786 + 0.1694i | 0.2982 + 0.1688i | 0.2982 + 0.1688i |
| 25 | 0.2793 + 0.0538i | 0.2793 + 0.0538i | 0.3242 + 0.0543i | 0.3242 + 0.0543i | 0.2785 + 0.1682i | 0.2782 + 0.1581i | 0.3224 + 0.1691i | 0.3224 + 0.1588i |
| 25.5 | 0.2565 + 0.0404i | 0.2580 + 0.0815i | 0.2933 + 0.0406i | 0.2942 + 0.0808i | 0.2624 + 0.2089i | 0.2607 + 0.1620i | 0.3016 + 0.2071i | 0.2979 + 0.1608i |

-continued

| | | | | | | | | |
|---|---|---|---|---|---|---|---|---|
| 26 | 0.2912 + 0.0349i | 0.2858 + 0.0896i | 0.3531 + 0.0375i | 0.3456 + 0.0944i | 0.2776 + 0.2130i | 0.2797 + 0.1616i | 0.3388 + 0.2141i | 0.3395 + 0.1659i |
| 26.5 | 0.2981 + 0.0330i | 0.2963 + 0.0873i | 0.3583 + 0.0345i | 0.3569 + 0.0932i | 0.2863 + 0.2090i | 0.2920 + 0.1540i | 0.3512 + 0.2175i | 0.3553 + 0.1593i |
| 27 | 0.2788 + 0.0329i | 0.2765 + 0.0939i | 0.3366 + 0.0360i | 0.3386 + 0.0968i | 0.2771 + 0.2176i | 0.2758 + 0.1577i | 0.3431 + 0.2153i | 0.3406 + 0.1566i |
| 27.5 | 0.2859 + 0.0343i | 0.2847 + 0.0994i | 0.3429 + 0.0370i | 0.3476 + 0.1015i | 0.2852 + 0.2242i | 0.2849 + 0.1629i | 0.3535 + 0.2247i | 0.3513 + 0.1631i |
| 28 | 0.2966 + 0.0296i | 0.2938 + 0.0892i | 0.3680 + 0.0313i | 0.3621 + 0.0922i | 0.2866 + 0.2178i | 0.2907 + 0.1527i | 0.3496 + 0.2221i | 0.3560 + 0.1554i |

| SNR/w | w240 | w241 | w242 | w243 | w244 | w245 | w246 | w247 |
|---|---|---|---|---|---|---|---|---|
| 7 | 0.4502 + 0.2556i | 0.4502 + 0.2556i | 0.4502 + 0.2556i | 0.4502 + 0.2556i | 0.4502 + 0.2556i | 0.4862 + 0.2687i | 0.4502 + 0.2556i | 0.4862 + 0.2687i |
| 7.5 | 0.4532 + 0.2648i | 0.4532 + 0.2648i | 0.4500 + 0.2383i | 0.4284 + 0.2422i | 0.4852 + 0.2798i | 0.4852 + 0.2798i | 0.4819 + 0.2466i | 0.4819 + 0.2466i |
| 8 | 0.4779 + 0.2367i | 0.4779 + 0.2367i | 0.4779 + 0.2367i | 0.4779 + 0.2367i | 0.4786 + 0.2728i | 0.4786 + 0.2728i | 0.4786 + 0.2728i | 0.4786 + 0.2728i |
| 8.5 | 0.4205 + 0.2136i | 0.4205 + 0.2136i | 0.4205 + 0.2136i | 0.4205 + 0.2136i | 0.4223 + 0.2397i | 0.4223 + 0.2397i | 0.4223 + 0.2397i | 0.4223 + 0.2397i |
| 9 | 0.2991 + 0.5474i | 0.2991 + 0.5474i | 0.2991 + 0.5474i | 0.2991 + 0.5474i | 0.2991 + 0.5474i | 0.2991 + 0.5474i | 0.2991 + 0.5474i | 0.2991 + 0.5474i |
| 9.5 | 0.3084 + 0.5682i | 0.3084 + 0.5682i | 0.3084 + 0.5682i | 0.3084 + 0.5682i | 0.3084 + 0.5682i | 0.3084 + 0.5682i | 0.3084 + 0.5682i | 0.3084 + 0.5682i |
| 10 | 0.3180 + 0.5832i | 0.3180 + 0.5832i | 0.3180 + 0.5832i | 0.3180 + 0.5832i | 0.3180 + 0.5832i | 0.3180 + 0.5832i | 0.3180 + 0.5832i | 0.3180 + 0.5832i |
| 10.5 | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i |
| 11 | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i |
| 11.5 | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i |
| 13.5 | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i |
| 14.5 | 0.5355 + 0.3122i | 0.5355 + 0.3122i | 0.5355 + 0.3122i | 0.5355 + 0.3122i | 0.5355 + 0.3122i | 0.5355 + 0.3122i | 0.5355 + 0.3122i | 0.5355 + 0.3122i |
| 15 | 0.3853 + 0.3413i | 0.3853 + 0.3413i | 0.3853 + 0.3413i | 0.3853 + 0.3413i | 0.3853 + 0.3413i | 0.3853 + 0.3413i | 0.3853 + 0.3413i | 0.3853 + 0.3413i |
| 15.5 | 0.3892 + 0.3462i | 0.3892 + 0.3462i | 0.3892 + 0.3462i | 0.3892 + 0.3462i | 0.3844 + 0.3362i | 0.3844 + 0.3362i | 0.3844 + 0.3362i | 0.3844 + 0.3362i |
| 16 | 0.3619 + 0.3680i | 0.3619 + 0.3680i | 0.3619 + 0.3680i | 0.3619 + 0.3680i | 0.3595 + 0.3485i | 0.3595 + 0.3485i | 0.3595 + 0.3485i | 0.3595 + 0.3485i |
| 16.5 | 0.3610 + 0.3609i | 0.3610 + 0.3609i | 0.3610 + 0.3609i | 0.3610 + 0.3609i | 0.3616 + 0.3383i | 0.3616 + 0.3383i | 0.3616 + 0.3383i | 0.3616 + 0.3383i |
| 17 | 0.3641 + 0.3646i | 0.3641 + 0.3646i | 0.3641 + 0.3646i | 0.3641 + 0.3646i | 0.3649 + 0.3361i | 0.3649 + 0.3361i | 0.3649 + 0.3361i | 0.3649 + 0.3361i |
| 17.5 | 0.3683 + 0.3694i | 0.3683 + 0.3694i | 0.3683 + 0.3694i | 0.3683 + 0.3694i | 0.3696 + 0.3321i | 0.3696 + 0.3321i | 0.3696 + 0.3321i | 0.3696 + 0.3321i |
| 18 | 0.3739 + 0.3746i | 0.3739 + 0.3746i | 0.3739 + 0.3746i | 0.3739 + 0.3746i | 0.3754 + 0.3235i | 0.3754 + 0.3235i | 0.3754 + 0.3235i | 0.3754 + 0.3235i |
| 18.5 | 0.3414 + 0.4506i | 0.3414 + 0.4506i | 0.3414 + 0.4506i | 0.3414 + 0.4506i | 0.3269 + 0.3401i | 0.3269 + 0.3401i | 0.3269 + 0.3401i | 0.3269 + 0.3401i |
| 19 | 0.3529 + 0.4716i | 0.3529 + 0.4716i | 0.3529 + 0.4716i | 0.3529 + 0.4716i | 0.3284 + 0.3442i | 0.3284 + 0.3442i | 0.3284 + 0.3442i | 0.3284 + 0.3442i |
| 19.5 | 0.3681 + 0.4838i | 0.3681 + 0.4838i | 0.3681 + 0.4838i | 0.3681 + 0.4838i | 0.3345 + 0.3493i | 0.3345 + 0.3493i | 0.3345 + 0.3493i | 0.3345 + 0.3493i |
| 20 | 0.4657 + 0.3917i | 0.4657 + 0.3917i | 0.4657 + 0.3917i | 0.4657 + 0.3917i | 0.4846 + 0.2895i | 0.4846 + 0.2895i | 0.4846 + 0.2895i | 0.4846 + 0.2895i |
| 20.5 | 0.4208 + 0.4471i | 0.4208 + 0.4471i | 0.4208 + 0.4471i | 0.4208 + 0.4471i | 0.4110 + 0.3182i | 0.4110 + 0.3182i | 0.4110 + 0.3182i | 0.4110 + 0.3182i |
| 21 | 0.4198 + 0.4245i | 0.4198 + 0.4245i | 0.4198 + 0.4245i | 0.4198 + 0.4245i | 0.4204 + 0.2992i | 0.4204 + 0.2992i | 0.4204 + 0.2992i | 0.4204 + 0.2992i |
| 21.5 | 0.4260 + 0.4246i | 0.4260 + 0.4246i | 0.4260 + 0.4246i | 0.4260 + 0.4246i | 0.4352 + 0.2986i | 0.4352 + 0.2986i | 0.4352 + 0.2986i | 0.4352 + 0.2986i |
| 22 | 0.4231 + 0.4203i | 0.4231 + 0.4203i | 0.4231 + 0.4203i | 0.4231 + 0.4203i | 0.4238 + 0.2942i | 0.4238 + 0.2942i | 0.4238 + 0.2942i | 0.4238 + 0.2942i |
| 22.5 | 0.4230 + 0.4251i | 0.4230 + 0.4251i | 0.4230 + 0.4251i | 0.4230 + 0.4251i | 0.4273 + 0.2986i | 0.4273 + 0.2986i | 0.4273 + 0.2986i | 0.4273 + 0.2986i |

-continued

| | | | | | | | | |
|---|---|---|---|---|---|---|---|---|
| 23 | 0.4230 + 0.4229i | 0.4230 + 0.4229i | 0.4230 + 0.4229i | 0.4153 + 0.4120i | 0.4298 + 0.2903i | 0.4298 + 0.2903i | 0.4298 + 0.2903i | 0.4169 + 0.2947i |
| 23.5 | 0.4341 + 0.4277i | 0.4342 + 0.4101i | 0.4135 + 0.4270i | 0.4137 + 0.4098i | 0.4351 + 0.2929i | 0.4351 + 0.2929i | 0.4145 + 0.2921i | 0.4145 + 0.2921i |
| 24 | 0.4266 + 0.4286i | 0.4273 + 0.3997i | 0.3987 + 0.4288i | 0.3992 + 0.3999i | 0.4297 + 0.2819i | 0.4296 + 0.2923i | 0.4004 + 0.2823i | 0.4005 + 0.2927i |
| 24.5 | 0.4441 + 0.4330i | 0.4456 + 0.3871i | 0.4061 + 0.4315i | 0.4061 + 0.3880i | 0.4435 + 0.2703i | 0.4444 + 0.2897i | 0.4008 + 0.2724i | 0.4020 + 0.2908i |
| 25 | 0.4605 + 0.4369i | 0.4656 + 0.3853i | 0.4012 + 0.4314i | 0.4034 + 0.3820i | 0.4711 + 0.2693i | 0.4704 + 0.2957i | 0.4060 + 0.2680i | 0.4057 + 0.2929i |
| 25.5 | 0.4659 + 0.4740i | 0.4613 + 0.4078i | 0.3989 + 0.4774i | 0.3958 + 0.4114i | 0.4488 + 0.2770i | 0.4545 + 0.3309i | 0.3879 + 0.2805i | 0.3914 + 0.3357i |
| 26 | 0.4896 + 0.4720i | 0.4932 + 0.4049i | 0.4193 + 0.4606i | 0.4242 + 0.4025i | 0.4987 + 0.2781i | 0.4969 + 0.3245i | 0.4217 + 0.2807i | 0.4195 + 0.3226i |
| 26.5 | 0.4795 + 0.4819i | 0.4925 + 0.4148i | 0.4080 + 0.4687i | 0.4168 + 0.4091i | 0.4942 + 0.2865i | 0.4967 + 0.3440i | 0.4169 + 0.2892i | 0.4181 + 0.3435i |
| 27 | 0.4961 + 0.4776i | 0.4761 + 0.4203i | 0.4122 + 0.4857i | 0.4125 + 0.4173i | 0.4776 + 0.2777i | 0.4790 + 0.3514i | 0.4145 + 0.2787i | 0.4149 + 0.3453i |
| 27.5 | 0.4894 + 0.4920i | 0.4859 + 0.4203i | 0.4207 + 0.4950i | 0.4201 + 0.4209i | 0.4953 + 0.2912i | 0.5006 + 0.3617i | 0.4249 + 0.2903i | 0.4218 + 0.3534i |
| 28 | 0.4912 + 0.4863i | 0.4759 + 0.4288i | 0.4092 + 0.4951i | 0.4078 + 0.4275i | 0.4796 + 0.2942i | 0.4808 + 0.3655i | 0.4118 + 0.2932i | 0.4092 + 0.3590i |

| SNR/w | w248 | w249 | w250 | w251 | w252 | w253 | w254 | w255 |
|---|---|---|---|---|---|---|---|---|
| 7 | 0.4502 + 0.2556i | 0.4862 + 0.2687i | 0.4502 + 0.2556i | 0.4862 + 0.2687i | 0.4862 + 0.2687i | 0.4862 + 0.2687i | 0.4862 + 0.2687i | 0.4862 + 0.2687i |
| 7.5 | 0.4852 + 0.2798i | 0.4852 + 0.2798i | 0.4819 + 0.2466i | 0.4819 + 0.2466i | 0.5153 + 0.2942i | 0.5153 + 0.2942i | 0.5163 + 0.2548i | 0.5163 + 0.2548i |
| 8 | 0.5292 + 0.2478i | 0.5292 + 0.2478i | 0.5292 + 0.2478i | 0.5292 + 0.2478i | 0.5229 + 0.2953i | 0.5229 + 0.2953i | 0.5229 + 0.2953i | 0.5229 + 0.2953i |
| 8.5 | 0.5504 + 0.2412i | 0.5504 + 0.2412i | 0.5504 + 0.2412i | 0.5504 + 0.2412i | 0.5358 + 0.2977i | 0.5358 + 0.2977i | 0.5358 + 0.2977i | 0.5358 + 0.2977i |
| 9 | 0.2991 + 0.5474i | 0.2991 + 0.5474i | 0.2991 + 0.5474i | 0.2991 + 0.5474i | 0.2991 + 0.5474i | 0.2991 + 0.5474i | 0.2991 + 0.5474i | 0.2991 + 0.5474i |
| 9.5 | 0.3084 + 0.5682i | 0.3084 + 0.5682i | 0.3084 + 0.5682i | 0.3084 + 0.5682i | 0.3084 + 0.5682i | 0.3084 + 0.5682i | 0.3084 + 0.5682i | 0.3084 + 0.5682i |
| 10 | 0.3180 + 0.5832i | 0.3180 + 0.5832i | 0.3180 + 0.5832i | 0.3180 + 0.5832i | 0.3180 + 0.5832i | 0.3180 + 0.5832i | 0.3180 + 0.5832i | 0.3180 + 0.5832i |
| 10.5 | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i |
| 11 | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i |
| 11.5 | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i |
| 13.5 | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i |
| 14.5 | 0.5355 + 0.3122i | 0.5355 + 0.3122i | 0.5355 + 0.3122i | 0.5355 + 0.3122i | 0.5222 + 0.2983i | 0.5222 + 0.2983i | 0.5222 + 0.2983i | 0.5222 + 0.2983i |
| 15 | 0.3853 + 0.3413i | 0.3853 + 0.3413i | 0.3853 + 0.3413i | 0.3853 + 0.3413i | 0.3716 + 0.3378i | 0.3716 + 0.3378i | 0.3716 + 0.3378i | 0.3716 + 0.3378i |
| 15.5 | 0.3737 + 0.3509i | 0.3737 + 0.3509i | 0.3737 + 0.3509i | 0.3737 + 0.3509i | 0.3686 + 0.3433i | 0.3686 + 0.3433i | 0.3686 + 0.3433i | 0.3737 + 0.3509i |
| 16 | 0.3440 + 0.3723i | 0.3440 + 0.3723i | 0.3440 + 0.3723i | 0.3440 + 0.3723i | 0.3412 + 0.3528i | 0.3412 + 0.3528i | 0.3412 + 0.3528i | 0.3412 + 0.3528i |
| 16.5 | 0.3370 + 0.3602i | 0.3370 + 0.3602i | 0.3370 + 0.3602i | 0.3370 + 0.3602i | 0.3376 + 0.3376i | 0.3376 + 0.3376i | 0.3376 + 0.3376i | 0.3376 + 0.3376i |
| 17 | 0.3338 + 0.3637i | 0.3338 + 0.3637i | 0.3338 + 0.3637i | 0.3338 + 0.3637i | 0.3347 + 0.3351i | 0.3347 + 0.3351i | 0.3347 + 0.3351i | 0.3347 + 0.3351i |
| 17.5 | 0.3283 + 0.3681i | 0.3283 + 0.3681i | 0.3283 + 0.3681i | 0.3283 + 0.3681i | 0.3296 + 0.3307i | 0.3296 + 0.3307i | 0.3296 + 0.3307i | 0.3296 + 0.3307i |
| 18 | 0.3203 + 0.3731i | 0.3203 + 0.3731i | 0.3203 + 0.3731i | 0.3203 + 0.3731i | 0.3218 + 0.3219i | 0.3218 + 0.3219i | 0.3218 + 0.3219i | 0.3218 + 0.3219i |
| 18.5 | 0.2964 + 0.4577i | 0.2964 + 0.4577i | 0.2964 + 0.4577i | 0.2964 + 0.4577i | 0.2889 + 0.3422i | 0.2889 + 0.3422i | 0.2889 + 0.3422i | 0.2889 + 0.3422i |
| 19 | 0.2905 + 0.4851i | 0.2905 + 0.4851i | 0.2905 + 0.4851i | 0.2905 + 0.4851i | 0.2795 + 0.3492i | 0.2795 + 0.3492i | 0.2795 + 0.3492i | 0.2795 + 0.3492i |
| 19.5 | 0.2875 + 0.5020i | 0.2875 + 0.5020i | 0.2875 + 0.5020i | 0.2875 + 0.5020i | 0.2736 + 0.3578i | 0.2736 + 0.3578i | 0.2736 + 0.3578i | 0.2736 + 0.3578i |

-continued

| | | | | | | | | |
|---|---|---|---|---|---|---|---|---|
| 20 | 0.3343 + 0.3601i | 0.3343 + 0.3601i | 0.3343 + 0.3601i | 0.3343 + 0.3601i | 0.3464 + 0.2743i | 0.3464 + 0.2743i | 0.3464 + 0.2743i | 0.3464 + 0.2743i |
| 20.5 | 0.2984 + 0.4519i | 0.2984 + 0.4519i | 0.2984 + 0.4519i | 0.2984 + 0.4519i | 0.2937 + 0.3207i | 0.2937 + 0.3207i | 0.2937 + 0.3207i | 0.2937 + 0.3207i |
| 21 | 0.2958 + 0.4274i | 0.2958 + 0.4274i | 0.2958 + 0.4274i | 0.2958 + 0.4274i | 0.2956 + 0.3006i | 0.2956 + 0.3006i | 0.2956 + 0.3006i | 0.2956 + 0.3006i |
| 21.5 | 0.2982 + 0.4164i | 0.2982 + 0.4164i | 0.2982 + 0.4164i | 0.2982 + 0.4164i | 0.3055 + 0.2919i | 0.3055 + 0.2919i | 0.3055 + 0.2919i | 0.3055 + 0.2919i |
| 22 | 0.2967 + 0.4234i | 0.2967 + 0.4234i | 0.2967 + 0.4234i | 0.2967 + 0.4234i | 0.2960 + 0.2956i | 0.2960 + 0.2956i | 0.2960 + 0.2956i | 0.2960 + 0.2956i |
| 22.5 | 0.2956 + 0.4208i | 0.2956 + 0.4208i | 0.2956 + 0.4208i | 0.2956 + 0.4208i | 0.3008 + 0.2941i | 0.3008 + 0.2941i | 0.3008 + 0.2941i | 0.3008 + 0.2941i |
| 23 | 0.2959 + 0.4148i | 0.2959 + 0.4148i | 0.2959 + 0.4148i | 0.2959 + 0.4148i | 0.2939 + 0.2903i | 0.2939 + 0.2903i | 0.2939 + 0.2903i | 0.2939 + 0.2903i |
| 23.5 | 0.2965 + 0.4249i | 0.2963 + 0.4079i | 0.2965 + 0.4249i | 0.2963 + 0.4079i | 0.2968 + 0.2905i | 0.2968 + 0.2905i | 0.2968 + 0.2905i | 0.2968 + 0.2905i |
| 24 | 0.2813 + 0.4303i | 0.2816 + 0.4007i | 0.2913 + 0.4304i | 0.2918 + 0.4007i | 0.2830 + 0.2835i | 0.2828 + 0.2942i | 0.2936 + 0.2832i | 0.2935 + 0.2939i |
| 24.5 | 0.2876 + 0.4295i | 0.2869 + 0.3918i | 0.3057 + 0.4296i | 0.3056 + 0.3912i | 0.2822 + 0.2778i | 0.2830 + 0.2935i | 0.3018 + 0.2769i | 0.3025 + 0.2928i |
| 25 | 0.2771 + 0.4268i | 0.2768 + 0.3791i | 0.3135 + 0.4278i | 0.3155 + 0.3799i | 0.2772 + 0.2653i | 0.2769 + 0.2887i | 0.3198 + 0.2662i | 0.3190 + 0.2899i |
| 25.5 | 0.2679 + 0.4831i | 0.2671 + 0.4177i | 0.3196 + 0.4813i | 0.3153 + 0.4153i | 0.2642 + 0.2859i | 0.2656 + 0.3405i | 0.3076 + 0.2846i | 0.3109 + 0.3393i |
| 26 | 0.2901 + 0.4652i | 0.2841 + 0.4025i | 0.3477 + 0.4578i | 0.3484 + 0.3989i | 0.2773 + 0.2828i | 0.2787 + 0.3328i | 0.3433 + 0.2843i | 0.3468 + 0.3291i |
| 26.5 | 0.2625 + 0.4607i | 0.2678 + 0.3993i | 0.3331 + 0.4633i | 0.3357 + 0.4044i | 0.2800 + 0.2739i | 0.2750 + 0.3327i | 0.3456 + 0.2833i | 0.3396 + 0.3394i |
| 27 | 0.2775 + 0.4791i | 0.2786 + 0.4104i | 0.3419 + 0.4815i | 0.3447 + 0.4116i | 0.2784 + 0.2816i | 0.2788 + 0.3435i | 0.3453 + 0.2801i | 0.3462 + 0.3431i |
| 27.5 | 0.2845 + 0.4908i | 0.2855 + 0.4209i | 0.3510 + 0.4925i | 0.3519 + 0.4213i | 0.2848 + 0.2876i | 0.2849 + 0.3525i | 0.3530 + 0.2885i | 0.3520 + 0.3524i |
| 28 | 0.2735 + 0.4926i | 0.2751 + 0.4223i | 0.3391 + 0.4945i | 0.3402 + 0.4252i | 0.2814 + 0.2854i | 0.2775 + 0.3535i | 0.3445 + 0.2894i | 0.3418 + 0.3566i |

i2) 32QQAM with max. penalty=0.01 b/s/Hz—AWGN channel

| SNR/w | w0 | w1 | w2 | w3 | w4 | w5 | w6 | w7 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i |
| 2 | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i |
| 2.5 | 0.3507 + 0.5354i | 0.5354 + 0.3507i | 0.5763 + 1.1217i | 1.1217 + 0.5763i | 0.3507 + 0.5354i | 0.5354 + 0.3507i | 0.5763 + 1.1217i | 1.1217 + 0.5763i |
| 3 | 0.3189 + 0.5012i | 0.5012 + 0.3189i | 0.5551 + 1.1571i | 1.1571 + 0.5551i | 0.3189 + 0.5012i | 0.5012 + 0.3189i | 0.5551 + 1.1571i | 1.1571 + 0.5551i |
| 3.5 | 0.2980 + 0.4781i | 0.4781 + 0.2981i | 0.5410 + 1.1789i | 1.1789 + 0.5410i | 0.2980 + 0.4781i | 0.4781 + 0.2981i | 0.5410 + 1.1789i | 1.1789 + 0.5410i |
| 4 | 0.2842 + 0.4633i | 0.4633 + 0.2842i | 0.5309 + 1.1928i | 1.1928 + 0.5309i | 0.2842 + 0.4633i | 0.4633 + 0.2842i | 0.5309 + 1.1928i | 1.1928 + 0.5309i |
| 4.5 | 0.2752 + 0.4551i | 0.4551 + 0.2752i | 0.5232 + 1.2014i | 1.2014 + 0.5232i | 0.2752 + 0.4551i | 0.4551 + 0.2752i | 0.5232 + 1.2014i | 1.2014 + 0.5232i |
| 5 | 0.2696 + 0.4521i | 0.4521 + 0.2696i | 0.5169 + 1.2065i | 1.2065 + 0.5169i | 0.2696 + 0.4521i | 0.4521 + 0.2696i | 0.5169 + 1.2065i | 1.2065 + 0.5169i |
| 5.5 | 0.2663 + 0.4530i | 0.4530 + 0.2663i | 0.5115 + 1.2092i | 1.2092 + 0.5115i | 0.2663 + 0.4530i | 0.4530 + 0.2663i | 0.5115 + 1.2092i | 1.2092 + 0.5115i |
| 6 | 0.2642 + 0.4570i | 0.4570 + 0.2642i | 0.5067 + 1.2102i | 1.2102 + 0.5067i | 0.2642 + 0.4570i | 0.4570 + 0.2642i | 0.5067 + 1.2102i | 1.2102 + 0.5067i |
| 6.5 | 0.2626 + 0.4588i | 0.4588 + 0.2626i | 0.5028 + 1.2085i | 1.2085 + 0.5028i | 0.2626 + 0.4588i | 0.4588 + 0.2626i | 0.5028 + 1.2085i | 1.2085 + 0.5028i |
| 7 | 0.2602 + 0.4573i | 0.4572 + 0.2602i | 0.3595 + 1.2746i | 1.2746 + 0.3595i | 0.2602 + 0.4573i | 0.4572 + 0.2602i | 0.6396 + 1.1327i | 1.1327 + 0.6395i |
| 7.5 | 0.2569 + 0.4616i | 0.4616 + 0.2569i | 0.3211 + 1.2755i | 1.2755 + 0.3211i | 0.2569 + 0.4616i | 0.4616 + 0.2569i | 0.6715 + 1.1226i | 1.1226 + 0.6715i |
| 8 | 0.2523 + 0.4699i | 0.4699 + 0.2523i | 0.2957 + 1.2701i | 1.2701 + 0.2957i | 0.2523 + 0.4699i | 0.4699 + 0.2523i | 0.6913 + 1.1190i | 1.1190 + 0.6913i |
| 8.5 | 0.2349 + 0.3783i | 0.6019 + 0.2600i | 0.3173 + 1.3160i | 1.3378 + 0.3422i | 0.2349 + 0.3783i | 0.6019 + 0.2600i | 0.4151 + 1.0074i | 1.0441 + 0.8436i |

-continued

| SNR/w | w0 | w1 | w2 | w3 | w4 | w5 | w6 | w7 |
|---|---|---|---|---|---|---|---|---|
| 9 | 0.2117 + 0.2518i | 0.6564 + 0.1984i | 0.3463 + 1.3865i | 1.3392 + 0.3470i | 0.2317 + 0.4565i | 0.6091 + 0.3434i | 0.3354 + 0.9582i | 0.9927 + 0.8356i |
| 9.5 | 0.2014 + 0.2235i | 0.6716 + 0.1924i | 0.3533 + 1.4075i | 1.3374 + 0.3431i | 0.2276 + 0.4678i | 0.6230 + 0.3674i | 0.3047 + 0.9383i | 0.9683 + 0.8393i |
| 10 | 0.1946 + 0.2025i | 0.6811 + 0.1872i | 0.3555 + 1.4163i | 1.3323 + 0.3370i | 0.2266 + 0.4818i | 0.6303 + 0.3928i | 0.2860 + 0.9269i | 0.9538 + 0.8460i |
| 10.5 | 0.1917 + 0.1863i | 0.6885 + 0.1824i | 0.3554 + 1.4185i | 1.3247 + 0.3312i | 0.2273 + 0.4949i | 0.6340 + 0.4191i | 0.2729 + 0.9204i | 0.9446 + 0.8543i |
| 11 | 0.1929 + 0.1744i | 0.6963 + 0.1782i | 0.3541 + 1.4168i | 1.3162 + 0.3270i | 0.2283 + 0.5036i | 0.6364 + 0.4437i | 0.2627 + 0.9170i | 0.9382 + 0.8637i |
| 11.5 | 0.1978 + 0.1660i | 0.7046 + 0.1752i | 0.3521 + 1.4127i | 1.3074 + 0.3244i | 0.2287 + 0.5076i | 0.6386 + 0.4654i | 0.2546 + 0.9154i | 0.9335 + 0.8738i |
| 12 | 0.2047 + 0.1603i | 0.7126 + 0.1738i | 0.3499 + 1.4076i | 1.2978 + 0.3226i | 0.2280 + 0.5086i | 0.6410 + 0.4845i | 0.2485 + 0.9154i | 0.9299 + 0.8841i |
| 12.5 | 0.2121 + 0.1569i | 0.7185 + 0.1739i | 0.3478 + 1.4027i | 1.2867 + 0.3209i | 0.2258 + 0.5089i | 0.6431 + 0.5018i | 0.2443 + 0.9172i | 0.9274 + 0.8949i |
| 13 | 0.2187 + 0.1559i | 0.7211 + 0.1755i | 0.3459 + 1.3987i | 1.2734 + 0.3186i | 0.2225 + 0.5103i | 0.6446 + 0.5183i | 0.2415 + 0.9207i | 0.9257 + 0.9059i |
| 13.5 | 0.2234 + 0.1575i | 0.7198 + 0.1782i | 0.3442 + 1.3961i | 1.2579 + 0.3156i | 0.2189 + 0.5139i | 0.6455 + 0.5346i | 0.2398 + 0.9259i | 0.9246 + 0.9174i |
| 14 | 0.2261 + 0.1614i | 0.7147 + 0.1816i | 0.3425 + 1.3949i | 1.2405 + 0.3119i | 0.2157 + 0.5201i | 0.6463 + 0.5505i | 0.2389 + 0.9324i | 0.9230 + 0.9294i |
| 14.5 | 0.2113 + 0.1819i | 0.6590 + 0.1934i | 0.6163 + 1.2930i | 1.1691 + 0.2524i | 0.2042 + 0.5736i | 0.6214 + 0.5984i | 0.2154 + 1.0277i | 1.0670 + 0.7825i |
| 15 | 0.2082 + 0.1903i | 0.6467 + 0.1971i | 0.6624 + 1.2634i | 1.1455 + 0.2430i | 0.2028 + 0.5942i | 0.6209 + 0.6087i | 0.2221 + 1.0561i | 1.0812 + 0.7572i |

j2) 64QQAM with max. penalty=0.01 b/s/Hz—AWGN channel

| SNR/w | w0 | w1 | w2 | w3 | w4 | w5 | w6 | w7 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i |
| 2 | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i |
| 2.5 | 1.1217 + 0.5763i | 1.1217 + 0.5763i | 1.1217 + 0.5763i | 1.1217 + 0.5763i | 0.5354 + 0.3507i | 0.5354 + 0.3507i | 0.5354 + 0.3507i | 0.5354 + 0.3507i |
| 3 | 0.5551 + 1.1571i | 0.3189 + 0.5012i | 1.1571 + 0.5551i | 0.5012 + 0.3189i | 0.5551 + 1.1571i | 0.3189 + 0.5012i | 1.1571 + 0.5551i | 0.5012 + 0.3189i |
| 3.5 | 1.1789 + 0.5410i | 1.1789 + 0.5410i | 1.1789 + 0.5410i | 1.1789 + 0.5410i | 0.4781 + 0.2981i | 0.4781 + 0.2981i | 0.4781 + 0.2981i | 0.4781 + 0.2981i |
| 4 | 0.2842 + 0.4633i | 0.2842 + 0.4633i | 0.5309 + 1.1928i | 0.5309 + 1.1928i | 0.2842 + 0.4633i | 0.2842 + 0.4633i | 0.5309 + 1.1928i | 0.5309 + 1.1928i |
| 4.5 | 0.5232 + 1.2014i | 0.5232 + 1.2014i | 0.5232 + 1.2014i | 0.5232 + 1.2014i | 1.2014 + 0.5232i | 1.2014 + 0.5232i | 1.2014 + 0.5232i | 1.2014 + 0.5232i |
| 5 | 1.2065 + 0.5169i | 1.2065 + 0.5169i | 1.2065 + 0.5169i | 1.2065 + 0.5169i | 0.5169 + 1.2065i | 0.5169 + 1.2065i | 0.5169 + 1.2065i | 0.5169 + 1.2065i |
| 5.5 | 1.2092 + 0.5115i | 1.2092 + 0.5115i | 1.2092 + 0.5115i | 1.2092 + 0.5115i | 0.4530 + 0.2663i | 0.4530 + 0.2663i | 0.4530 + 0.2663i | 0.4530 + 0.2663i |
| 6 | 0.2642 + 0.4570i | 0.2642 + 0.4570i | 0.2642 + 0.4570i | 0.2642 + 0.4570i | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i | 1.2085 + 0.5028i | 1.2085 + 0.5028i | 1.2085 + 0.5028i | 1.2085 + 0.5028i |
| 7 | 0.3595 + 1.2746i | 0.6396 + 1.1327i | 0.3595 + 1.2746i | 0.6396 + 1.1327i | 1.2746 + 0.3595i | 1.1327 + 0.6396i | 1.2746 + 0.3595i | 1.1327 + 0.6396i |
| 7.5 | 0.7476 + 1.2181i | 0.5961 + 1.0258i | 0.3325 + 1.3887i | 0.3069 + 1.1510i | 1.2181 + 0.7475i | 1.0258 + 0.5961i | 1.3887 + 0.3325i | 1.1510 + 0.3069i |
| 8 | 0.3109 + 1.4253i | 0.7943 + 1.2523i | 0.2868 + 1.0998i | 0.5786 + 0.9799i | 1.4253 + 0.3109i | 1.2523 + 0.7943i | 1.0998 + 0.2868i | 0.9799 + 0.5786i |
| 8.5 | 1.6023 + 0.4387i | 1.0881 + 0.8753i | 0.4387 + 1.6023i | 0.8753 + 1.0881i | 0.8846 + 0.2625i | 0.8846 + 0.2625i | 0.7679 + 0.2336i | 0.7679 + 0.2336i |
| 9 | 0.4221 + 1.5951i | 1.5951 + 0.4221i | 0.8732 + 1.0971i | 1.0971 + 0.8732i | 0.7946 + 0.2627i | 0.9288 + 0.2247i | 0.7946 + 0.2627i | 0.7946 + 0.2627i |
| 9.5 | 0.8408 + 1.2670i | 0.5485 + 0.9136i | 0.2950 + 1.4844i | 0.2548 + 1.0308i | 1.2670 + 0.8407i | 0.9136 + 0.5485i | 1.4844 + 0.2950i | 1.0308 + 0.2548i |
| 10 | 1.2647 + 0.8443i | 1.4891 + 0.2935i | 0.9020 + 0.5498i | 1.0230 + 0.2451i | 0.3072 + 0.1682i | 0.3072 + 0.1682i | 0.6173 + 0.2717i | 0.6173 + 0.2717i |

-continued

| | | | | | | | | |
|---|---|---|---|---|---|---|---|---|
| 10.5 | 0.2925 + 1.4892i | 0.8449 + 1.2622i | 0.2351 + 1.0196i | 0.5555 + 0.8926i | 1.4892 + 0.2925i | 1.2622 + 0.8449i | 1.0196 + 0.2351i | 0.8926 + 0.5555i |
| 11 | 0.8435 + 1.2594i | 0.5630 + 0.8851i | 0.2921 + 1.4867i | 0.2255 + 1.0193i | 1.2594 + 0.8435i | 0.8851 + 0.5630i | 1.4867 + 0.2921i | 1.0193 + 0.2255i |
| 11.5 | 0.2920 + 1.4827i | 0.8411 + 1.2563i | 0.2174 + 1.0211i | 0.5702 + 0.8798i | 1.4827 + 0.2920i | 1.2563 + 0.8411i | 1.0211 + 0.2174i | 0.8798 + 0.5702i |
| 12 | 0.2920 + 1.4781i | 0.8380 + 1.2527i | 0.2112 + 1.0242i | 0.5763 + 0.8768i | 1.4781 + 0.2920i | 1.2527 + 0.8380i | 1.0242 + 0.2112i | 0.8768 + 0.5763i |
| 12.5 | 0.2920 + 1.4732i | 0.8348 + 1.2487i | 0.2071 + 1.0283i | 0.5811 + 0.8760i | 1.4732 + 0.2920i | 1.2487 + 0.8348i | 1.0283 + 0.2071i | 0.8760 + 0.5811i |
| 13 | 0.2978 + 1.4669i | 0.8421 + 1.2355i | 0.2135 + 1.0389i | 0.6055 + 0.8654i | 1.4685 + 0.2859i | 1.2516 + 0.8201i | 1.0279 + 0.1981i | 0.8857 + 0.5642i |
| 13.5 | 1.4627 + 0.2996i | 1.0469 + 0.2187i | 1.2278 + 0.8422i | 0.8605 + 0.6179i | 0.3964 + 0.1561i | 0.7441 + 0.1749i | 0.3964 + 0.1561i | 0.6160 + 0.4168i |
| 14 | 0.2989 + 1.4602i | 0.8389 + 1.2232i | 0.2232 + 1.0534i | 0.6245 + 0.8593i | 1.4560 + 0.2819i | 1.2434 + 0.8085i | 1.0319 + 0.1914i | 0.8945 + 0.5550i |
| 14.5 | 0.2878 + 1.4388i | 0.8133 + 1.2150i | 0.2219 + 1.0386i | 0.6145 + 0.8494i | 1.4656 + 0.2931i | 1.2278 + 0.8230i | 1.0649 + 0.2069i | 0.8971 + 0.5677i |
| 15 | 0.9687 − 0.4488i | 0.1261 − 0.4193i | 0.6752 − 0.4269i | 0.3896 − 0.4201i | 1.0304 − 0.1506i | 0.1248 − 0.1379i | 0.6647 − 0.1295i | 0.3769 − 0.1364i |
| 15.5 | 0.9856 − 0.4661i | 0.1264 − 0.4145i | 0.6825 − 0.4329i | 0.3948 − 0.4179i | 1.0366 − 0.1534i | 0.1272 − 0.1353i | 0.6796 − 0.1340i | 0.3877 − 0.1359i |
| 16 | 1.0161 − 0.4912i | 0.1287 − 0.4061i | 0.6966 − 0.4427i | 0.4025 − 0.4142i | 1.0441 − 0.1581i | 0.1321 − 0.1317i | 0.6995 − 0.1411i | 0.4035 − 0.1354i |
| 16.5 | 1.0519 − 0.5188i | 0.1325 − 0.3998i | 0.7146 − 0.4532i | 0.4122 − 0.4120i | 1.0500 − 0.1642i | 0.1374 − 0.1295i | 0.7170 − 0.1473i | 0.4185 − 0.1357i |
| 17 | 1.0725 − 0.5328i | 0.1361 − 0.4023i | 0.7267 − 0.4592i | 0.4198 − 0.4151i | 1.0501 − 0.1676i | 0.1398 − 0.1309i | 0.7233 − 0.1496i | 0.4246 − 0.1370i |
| 17.5 | 1.0854 − 0.5394i | 0.1392 − 0.4078i | 0.7353 − 0.4623i | 0.4262 − 0.4205i | 1.0474 − 0.1695i | 0.1407 − 0.1336i | 0.7243 − 0.1504i | 0.4265 − 0.1388i |
| 18 | 1.0941 − 0.5424i | 0.1418 − 0.4131i | 0.7424 − 0.4645i | 0.4318 − 0.4266i | 1.0439 − 0.1707i | 0.1411 − 0.1361i | 0.7235 − 0.1509i | 0.4269 − 0.1406i |
| 18.5 | 1.0998 − 0.5430i | 0.1439 − 0.4173i | 0.7487 − 0.4666i | 0.4370 − 0.4325i | 1.0405 − 0.1713i | 0.1414 − 0.1380i | 0.7224 − 0.1517i | 0.4269 − 0.1425i |
| 19 | 1.1032 − 0.5410i | 0.1458 − 0.4204i | 0.7543 − 0.4691i | 0.4418 − 0.4382i | 1.0373 − 0.1716i | 0.1414 − 0.1393i | 0.7213 − 0.1527i | 0.4267 − 0.1443i |
| 19.5 | 1.1043 − 0.5346i | 0.1473 − 0.4225i | 0.7587 − 0.4731i | 0.4459 − 0.4435i | 1.0338 − 0.1710i | 0.1414 − 0.1401i | 0.7201 − 0.1544i | 0.4264 − 0.1461i |
| 20 | 1.1039 − 0.5232i | 0.1486 − 0.4237i | 0.7620 − 0.4802i | 0.4492 − 0.4482i | 1.0304 − 0.1696i | 0.1413 − 0.1405i | 0.7193 − 0.1572i | 0.4263 − 0.1477i |

| SNR/w | w8 | w9 | w10 | w11 | w12 | w13 | w14 | w15 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1.5 | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i | 0.7014 + 0.7014i |
| 2 | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i | 0.6653 + 0.6653i |
| 2.5 | 0.5763 + 1.1217i | 0.5763 + 1.1217i | 0.5763 + 1.1217i | 0.5763 + 1.1217i | 0.3507 + 0.5354i | 0.3507 + 0.5354i | 0.3507 + 0.5354i | 0.3507 + 0.5354i |
| 3 | 0.5551 + 1.1571i | 0.3189 + 0.5012i | 1.1571 + 0.5551i | 0.5012 + 0.3189i | 0.5551 + 1.1571i | 0.3189 + 0.5012i | 1.1571 + 0.5551i | 0.5012 + 0.3189i |
| 3.5 | 0.5410 + 1.1789i | 0.5410 + 1.1789i | 0.5410 + 1.1789i | 0.5410 + 1.1789i | 0.2980 + 0.4781i | 0.2980 + 0.4781i | 0.2980 + 0.4781i | 0.2980 + 0.4781i |
| 4 | 0.4633 + 0.2842i | 0.4633 + 0.2842i | 1.1928 + 0.5309i | 1.1928 + 0.5309i | 0.4633 + 0.2842i | 0.4633 + 0.2842i | 1.1928 + 0.5309i | 1.1928 + 0.5309i |
| 4.5 | 0.2752 + 0.4551i | 0.2752 + 0.4551i | 0.2752 + 0.4551i | 0.2752 + 0.4551i | 0.4551 + 0.2752i | 0.4551 + 0.2752i | 0.4551 + 0.2752i | 0.4551 + 0.2752i |
| 5 | 0.4521 + 0.2696i | 0.4521 + 0.2696i | 0.4521 + 0.2696i | 0.4521 + 0.2696i | 0.2696 + 0.4521i | 0.2696 + 0.4521i | 0.2696 + 0.4521i | 0.2696 + 0.4521i |
| 5.5 | 0.5115 + 1.2092i | 0.5115 + 1.2092i | 0.5115 + 1.2092i | 0.5115 + 1.2092i | 0.2663 + 0.4530i | 0.2663 + 0.4530i | 0.2663 + 0.4530i | 0.2663 + 0.4530i |
| 6 | 0.5067 + 1.2102i | 0.5067 + 1.2102i | 0.5067 + 1.2102i | 0.5067 + 1.2102i | 1.2102 + 0.5067i | 1.2102 + 0.5067i | 1.2102 + 0.5067i | 1.2102 + 0.5067i |
| 6.5 | 0.2626 + 0.4588i | 0.2626 + 0.4588i | 0.2626 + 0.4588i | 0.2626 + 0.4588i | 0.4588 + 0.2626i | 0.4588 + 0.2626i | 0.4588 + 0.2626i | 0.4588 + 0.2626i |
| 7 | 0.2602 + 0.4573i | 0.2602 + 0.4573i | 0.2602 + 0.4573i | 0.2602 + 0.4573i | 0.4573 + 0.2602i | 0.4573 + 0.2602i | 0.4573 + 0.2602i | 0.4573 + 0.2602i |
| 7.5 | 0.2530 + 0.4546i | 0.2530 + 0.4546i | 0.2530 + 0.4546i | 0.2530 + 0.4546i | 0.4546 + 0.2530i | 0.4546 + 0.2530i | 0.4546 + 0.2530i | 0.4546 + 0.2530i |
| 8 | 0.2450 + 0.4533i | 0.2450 + 0.4533i | 0.2450 + 0.4533i | 0.2450 + 0.4533i | 0.4533 + 0.2450i | 0.4533 + 0.2450i | 0.4533 + 0.2450i | 0.4533 + 0.2450i |
| 8.5 | 0.2574 + 0.7937i | 0.2574 + 0.7937i | 0.2202 + 0.9239i | 0.2574 + 0.7937i | 0.2686 + 0.2686i | 0.2686 + 0.2686i | 0.2686 + 0.2686i | 0.2686 + 0.2686i |

-continued

| | | | | | | | | |
|---|---|---|---|---|---|---|---|---|
| 9 | 0.2711 + 0.8883i | 0.2353 + 0.7680i | 0.2711 + 0.8883i | 0.2353 + 0.7680i | 0.2666 + 0.2666i | 0.2666 + 0.2666i | 0.2666 + 0.2666i | 0.2666 + 0.2666i |
| 9.5 | 0.1758 + 0.3172i | 0.2719 + 0.5996i | 0.1758 + 0.3172i | 0.2719 + 0.5996i | 0.3172 + 0.1758i | 0.5996 + 0.2719i | 0.3172 + 0.1758i | 0.5996 + 0.2719i |
| 10 | 0.8443 + 1.2648i | 0.2935 + 1.4891i | 0.5498 + 0.9020i | 0.2451 + 1.0230i | 0.1682 + 0.3072i | 0.1682 + 0.3072i | 0.2717 + 0.6173i | 0.2717 + 0.6173i |
| 10.5 | 0.1635 + 0.3025i | 0.1635 + 0.3025i | 0.2075 + 0.6586i | 0.3354 + 0.6030i | 0.3025 + 0.1635i | 0.3025 + 0.1635i | 0.6586 + 0.2075i | 0.6030 + 0.3354i |
| 11 | 0.1606 + 0.3016i | 0.3460 + 0.6087i | 0.1606 + 0.3016i | 0.1969 + 0.6737i | 0.3016 + 0.1606i | 0.6087 + 0.3460i | 0.3016 + 0.1606i | 0.6737 + 0.1969i |
| 11.5 | 0.1583 + 0.3034i | 0.1583 + 0.3034i | 0.1871 + 0.6855i | 0.3563 + 0.6126i | 0.3034 + 0.1583i | 0.3034 + 0.1583i | 0.6855 + 0.1871i | 0.6126 + 0.3563i |
| 12 | 0.1560 + 0.3070i | 0.1560 + 0.3070i | 0.1789 + 0.6942i | 0.3657 + 0.6155i | 0.3070 + 0.1560i | 0.3070 + 0.1560i | 0.6942 + 0.1789i | 0.6155 + 0.3657i |
| 12.5 | 0.1532 + 0.3116i | 0.1532 + 0.3116i | 0.1720 + 0.7004i | 0.3741 + 0.6174i | 0.3116 + 0.1532i | 0.3116 + 0.1532i | 0.7004 + 0.1720i | 0.6174 + 0.3741i |
| 13 | 0.1545 + 0.3665i | 0.1545 + 0.3665i | 0.1756 + 0.7261i | 0.4023 + 0.6180i | 0.2730 + 0.1455i | 0.2730 + 0.1455i | 0.6840 + 0.1578i | 0.6145 + 0.3555i |
| 13.5 | 0.2831 + 1.4625i | 0.1935 + 1.0296i | 0.8124 + 1.2487i | 0.5574 + 0.8909i | 0.1413 + 0.2555i | 0.1488 + 0.6759i | 0.1413 + 0.2555i | 0.3493 + 0.6111i |
| 14 | 0.1587 + 0.4130i | 0.1587 + 0.4130i | 0.1717 + 0.7575i | 0.4261 + 0.6136i | 0.2461 + 0.1402i | 0.2461 + 0.1402i | 0.6735 + 0.1418i | 0.6085 + 0.3483i |
| 14.5 | 0.1177 + 0.4119i | 0.2516 + 0.3998i | 0.1559 + 0.7442i | 0.4328 + 0.5954i | 0.1678 + 0.1166i | 0.3325 + 0.1582i | 0.7408 + 0.1355i | 0.6200 + 0.3227i |
| 15 | 1.1704 − 0.7904i | 0.1452 − 0.7405i | 0.6932 − 0.8128i | 0.4017 − 0.7221i | 1.4580 − 0.2741i | 0.1644 − 1.0798i | 0.7344 − 1.2171i | 0.2867 − 1.4419i |
| 15.5 | 1.1580 − 0.8178i | 0.1416 − 0.7330i | 0.6913 − 0.8132i | 0.4018 − 0.7177i | 1.4529 − 0.2702i | 0.1686 − 1.0718i | 0.7097 − 1.2125i | 0.2732 − 1.4375i |
| 16 | 1.1306 − 0.8649i | 0.1385 − 0.7199i | 0.6874 − 0.8123i | 0.4017 − 0.7107i | 1.4516 − 0.2578i | 0.1689 − 1.0567i | 0.6750 − 1.2072i | 0.2558 − 1.4247i |
| 16.5 | 1.0952 − 0.9115i | 0.1369 − 0.7073i | 0.6868 − 0.8108i | 0.4044 − 0.7057i | 1.4480 − 0.2403i | 0.1677 − 1.0405i | 0.6406 − 1.1995i | 0.2402 − 1.4087i |
| 17 | 1.0771 − 0.9315i | 0.1373 − 0.7043i | 0.6956 − 0.8095i | 0.4114 − 0.7109i | 1.4380 − 0.2294i | 0.1680 − 1.0338i | 0.6220 − 1.1896i | 0.2326 − 1.3986i |
| 17.5 | 1.0693 − 0.9408i | 0.1388 − 0.7057i | 0.7092 − 0.8073i | 0.4197 − 0.7206i | 1.4261 − 0.2216i | 0.1682 − 1.0316i | 0.6106 − 1.1783i | 0.2287 − 1.3914i |
| 18 | 1.0666 − 0.9452i | 0.1406 − 0.7083i | 0.7229 − 0.8052i | 0.4275 − 0.7307i | 1.4143 − 0.2157i | 0.1685 − 1.0310i | 0.6029 − 1.1680i | 0.2262 − 1.3855i |
| 18.5 | 1.0673 − 0.9458i | 0.1425 − 0.7109i | 0.7349 − 0.8045i | 0.4344 − 0.7399i | 1.4036 − 0.2110i | 0.1691 − 1.0309i | 0.5971 − 1.1599i | 0.2240 − 1.3805i |
| 19 | 1.0720 − 0.9413i | 0.1445 − 0.7131i | 0.7452 − 0.8057i | 0.4404 − 0.7481i | 1.3941 − 0.2072i | 0.1697 − 1.0309i | 0.5918 − 1.1539i | 0.2216 − 1.3761i |
| 19.5 | 1.0847 − 0.9271i | 0.1467 − 0.7148i | 0.7552 − 0.8112i | 0.4463 − 0.7557i | 1.3857 − 0.2033i | 0.1703 − 1.0305i | 0.5851 − 1.1507i | 0.2181 − 1.3721i |
| 20 | 1.1043 − 0.9013i | 0.1491 − 0.7159i | 0.7655 − 0.8232i | 0.4529 − 0.7625i | 1.3785 − 0.1990i | 0.1705 − 1.0293i | 0.5745 − 1.1503i | 0.2128 − 1.3684i |

k2) 256QQAM with max. penalty=0.01 b/s/Hz—AWGN channel

| SNR/w | w0 | w1 | w2 | w3 | w4 | w5 | w6 | w7 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i |
| 7 | 1.0751 + 0.6463i | 1.0751 + 0.6463i | 1.5234 + 1.0871i | 1.0751 + 0.6463i | 1.2330 + 0.3563i | 1.2330 + 0.3563i | 1.6996 + 0.3860i | 1.2330 + 0.3563i |
| 7.5 | 0.2521 + 0.4541i | 0.2521 + 0.4541i | 0.5780 + 1.0186i | 0.6595 + 1.1198i | 0.2521 + 0.4541i | 0.2521 + 0.4541i | 0.5780 + 1.0186i | 0.5780 + 1.0186i |
| 8 | 0.3565 + 1.7813i | 0.3059 + 1.2626i | 0.3059 + 1.2626i | 0.2951 + 1.1350i | 1.0099 + 1.5146i | 0.6749 + 1.1091i | 0.6749 + 1.1091i | 0.5912 + 1.0099i |
| 8.5 | 0.3488 + 1.7914i | 0.2880 + 1.2587i | 0.2880 + 1.2587i | 0.2778 + 1.1339i | 1.0152 + 1.5168i | 0.6879 + 1.1023i | 0.6879 + 1.1023i | 0.6039 + 1.0029i |
| 9 | 1.6414 + 0.6837i | 0.9224 + 0.9099i | 0.3155 + 1.4985i | 0.7236 + 0.9800i | 1.8682 + 0.2925i | 0.9224 + 0.9099i | 0.3155 + 1.4985i | 0.7236 + 0.9800i |
| 9.5 | 1.6327 + 0.6734i | 0.9312 + 0.9074i | 0.2863 + 1.5023i | 0.7311 + 0.9685i | 1.8490 + 0.2874i | 0.9312 + 0.9074i | 0.3370 + 1.4511i | 0.7311 + 0.9685i |
| 10 | 1.7476 − 0.3437i | 1.4030 − 0.2782i | 1.0199 − 0.2443i | 1.0199 − 0.2443i | 1.4030 − 0.2782i | 1.4030 − 0.2782i | 1.0199 − 0.2443i | 1.0199 − 0.2443i |
| 10.5 | 1.7549 − 0.3495i | 1.4067 − 0.2747i | 1.0113 − 0.2349i | 1.0113 − 0.2349i | 1.4067 − 0.2747i | 1.4067 − 0.2747i | 1.0113 − 0.2349i | 1.0113 − 0.2349i |

-continued

| | | | | | | | | |
|---|---|---|---|---|---|---|---|---|
| 11 | 0.3538 + 1.7624i | 0.2729 + 1.4059i | 0.2729 + 1.4059i | 0.2729 + 1.4059i | 0.9952 + 1.4965i | 0.7993 + 1.1885i | 0.7993 + 1.1885i | 0.7993 + 1.1885i |
| 11.5 | 0.2732 + 1.4024i | 0.3556 + 1.7714i | 0.2732 + 1.4024i | 0.2732 + 1.4024i | 0.7988 + 1.1854i | 1.0007 + 1.5057i | 0.7988 + 1.1854i | 0.7988 + 1.1854i |
| 12 | 0.6800 + 1.6926i | 0.3911 + 1.3645i | 0.2191 + 1.7524i | 0.2274 + 1.4208i | 0.8678 + 1.2487i | 0.7275 + 1.1667i | 0.8338 + 1.0438i | 0.8338 + 1.0438i |
| 12.5 | 0.7085 + 1.6630i | 0.4337 + 1.3632i | 0.2265 + 1.7707i | 0.2214 + 1.4346i | 0.8829 + 1.2345i | 0.7423 + 1.1546i | 0.8720 + 1.0003i | 0.8720 + 1.0003i |
| 13 | 0.7232 + 1.6427i | 0.4625 + 1.3572i | 0.2367 + 1.7836i | 0.2081 + 1.4453i | 0.8955 + 1.2316i | 0.7485 + 1.1494i | 0.9036 + 0.9662i | 0.9036 + 0.9662i |
| 13.5 | 0.7280 + 1.6384i | 0.4787 + 1.3492i | 0.2417 + 1.7872i | 0.1966 + 1.4478i | 0.9185 + 1.2490i | 0.7448 + 1.1524i | 0.9224 + 0.9489i | 0.9224 + 0.9489i |
| 14 | 0.6852 + 1.6631i | 0.4978 + 1.3396i | 0.2241 + 1.7611i | 0.1891 + 1.4343i | 1.0300 + 1.3532i | 0.7389 + 1.1771i | 0.9797 + 0.9598i | 0.8864 + 0.9798i |
| 14.5 | 0.6850 + 1.6565i | 0.5110 + 1.3346i | 0.2284 + 1.7618i | 0.1836 + 1.4363i | 1.0485 + 1.3578i | 0.7448 + 1.1781i | 0.9923 + 0.9464i | 0.9014 + 0.9717i |
| 15 | 1.1831 + 1.3352i | 1.5548 + 0.8930i | 1.0563 + 0.9473i | 1.1944 + 0.8535i | 1.7139 + 0.2236i | 1.4688 + 0.5085i | 0.9846 + 0.6522i | 1.0982 + 0.6252i |
| 15.5 | 1.3333 + 1.1727i | 0.9525 + 1.0450i | 0.8764 + 1.5619i | 0.8595 + 1.2191i | 1.2665 + 0.7890i | 1.0238 + 0.8157i | 1.0093 + 0.5886i | 1.0093 + 0.5886i |
| 16 | 1.0693 + 1.3695i | 1.6456 + 0.7233i | 1.0401 + 0.9844i | 1.3351 + 0.9489i | 1.6696 + 0.1992i | 1.4116 + 0.4773i | 0.9912 + 0.6923i | 1.1625 + 0.6341i |
| 16.5 | 1.3185 + 1.1655i | 1.0729 + 0.9416i | 0.9781 + 1.3517i | 0.9292 + 0.9707i | 1.4986 + 0.8198i | 1.2084 + 0.6881i | 0.9265 + 0.5535i | 0.9824 + 0.6211i |
| 17 | 1.1514 + 1.3474i | 1.3447 + 1.0136i | 0.9323 + 1.1378i | 0.9510 + 0.9427i | 1.2112 + 0.5426i | 1.2864 + 0.7311i | 0.9873 + 0.5679i | 0.9676 + 0.7289i |
| 17.5 | 1.1159 + 1.3726i | 1.3078 + 1.0458i | 0.9051 + 1.1657i | 0.9509 + 0.9581i | 1.2112 + 0.5506i | 1.3032 + 0.7544i | 0.9969 + 0.5672i | 0.9755 + 0.7547i |
| 18 | 1.1058 + 1.3496i | 1.2204 + 1.0180i | 0.8713 + 1.1743i | 0.9189 + 0.9604i | 1.2283 + 0.6284i | 1.4576 + 0.8033i | 1.0010 + 0.6008i | 0.9350 + 0.7635i |
| 18.5 | 1.1022 + 1.3396i | 1.2102 + 1.0122i | 0.8669 + 1.1800i | 0.9153 + 0.9665i | 1.2205 + 0.6352i | 1.4496 + 0.8012i | 0.9972 + 0.5981i | 0.9328 + 0.7745i |
| 19 | 1.5817 + 0.4283i | 1.4894 + 0.1404i | 1.4735 + 0.7375i | 1.2229 + 0.6531i | 1.0586 + 0.3317i | 1.2553 + 0.3125i | 0.9114 + 0.4575i | 1.0349 + 0.5768i |
| 19.5 | 0.8375 + 1.4782i | 1.3271 + 0.8728i | 1.1494 + 1.1881i | 1.0720 + 0.8655i | 1.5541 + 0.6145i | 1.2416 + 0.5886i | 0.9113 + 0.4993i | 1.0207 + 0.6225i |
| 20 | 1.1577 + 1.2607i | 1.2132 + 0.9665i | 0.8650 + 1.2652i | 0.9371 + 1.0167i | 1.2341 + 0.6321i | 1.4507 + 0.7875i | 0.9999 + 0.6438i | 0.9509 + 0.8111i |
| 20.5 | 1.1623 + 1.2367i | 1.2152 + 0.9464i | 0.8671 + 1.2704i | 0.9416 + 1.0203i | 1.2263 + 0.6212i | 1.4418 + 0.7638i | 0.9979 + 0.6457i | 0.9519 + 0.8158i |
| 21 | 1.1584 + 1.2194i | 1.2110 + 0.9332i | 0.8614 + 1.2738i | 0.9374 + 1.0274i | 1.2218 + 0.6145i | 1.4309 + 0.7504i | 0.9986 + 0.6549i | 0.9484 + 0.8261i |
| 21.5 | 1.1541 + 1.1980i | 1.2082 + 0.9192i | 0.8523 + 1.2778i | 0.9253 + 1.0390i | 1.2200 + 0.6057i | 1.4217 + 0.7371i | 1.0021 + 0.6678i | 0.9448 + 0.8412i |
| 22 | 1.1564 + 1.1321i | 1.2409 + 0.8772i | 0.8304 + 1.2958i | 0.8902 + 1.0738i | 1.2195 + 0.5872i | 1.4329 + 0.6862i | 1.0077 + 0.6857i | 0.9610 + 0.8761i |
| 22.5 | 1.1672 + 1.0989i | 1.2422 + 0.8522i | 0.8024 + 1.2971i | 0.8967 + 1.0878i | 1.2134 + 0.5744i | 1.4239 + 0.6620i | 1.0091 + 0.6909i | 0.9644 + 0.8828i |
| 23 | 1.2322 + 1.0269i | 1.4082 + 0.7080i | 0.7782 + 1.3193i | 0.9660 + 1.1333i | 1.4427 + 0.4179i | 1.1837 + 0.7680i | 0.9625 + 0.7036i | 0.9821 + 0.8987i |
| 23.5 | 1.1616 + 1.0595i | 1.2384 + 0.8218i | 0.7696 + 1.2863i | 0.8965 + 1.0947i | 1.1989 + 0.5582i | 1.4012 + 0.6249i | 1.0129 + 0.6976i | 0.9657 + 0.8860i |
| 24 | 1.2424 + 0.9493i | 1.2834 + 0.7245i | 0.9545 + 1.2183i | 1.0015 + 1.0002i | 1.1739 + 0.5257i | 1.3794 + 0.4917i | 1.0065 + 0.6128i | 1.0346 + 0.7930i |
| 24.5 | 1.2328 + 0.9369i | 1.2653 + 0.7160i | 0.9349 + 1.2178i | 0.9989 + 1.0051i | 1.1766 + 0.5132i | 1.3771 + 0.4884i | 1.0162 + 0.6131i | 1.0287 + 0.7970i |
| 25 | 1.2245 + 0.9258i | 1.2535 + 0.7077i | 0.9208 + 1.2133i | 0.9969 + 1.0052i | 1.1757 + 0.5047i | 1.3715 + 0.4846i | 1.0198 + 0.6112i | 1.0268 + 0.7962i |
| 25.5 | 1.2171 + 0.9128i | 1.2413 + 0.6969i | 0.9105 + 1.2064i | 0.9951 + 1.0017i | 1.1707 + 0.4940i | 1.3617 + 0.4870i | 1.0203 + 0.6063i | 1.0247 + 0.7923i |
| 26 | 1.2103 + 0.9014i | 1.2323 + 0.6874i | 0.9022 + 1.1987i | 0.9925 + 0.9967i | 1.1677 + 0.4847i | 1.3547 + 0.4862i | 1.0215 + 0.6013i | 1.0233 + 0.7878i |

| SNR/w | w8 | w9 | w10 | w11 | w12 | w13 | w14 | w15 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i | 1.2085 + 0.5028i |
| 7 | 1.0751 + 0.6463i | 1.0751 + 0.6463i | 1.0751 + 0.6463i | 1.0751 + 0.6463i | 1.2330 + 0.3563i | 1.1130 + 0.3476i | 1.2330 + 0.3563i | 1.2330 + 0.3563i |
| 7.5 | 0.4541 + 0.2521i | 0.4541 + 0.2521i | 1.0186 + 0.5780i | 1.1198 + 0.6595i | 0.4541 + 0.2521i | 0.4541 + 0.2521i | 1.0186 + 0.5780i | 1.0186 + 0.5780i |
| 8 | 0.3059 + 1.2626i | 0.2951 + 1.1350i | 0.2951 + 1.1350i | 0.2951 + 1.1350i | 0.6749 + 1.1091i | 0.5912 + 1.0099i | 0.5912 + 1.0099i | 0.5912 + 1.0099i |

-continued

| | | | | | | | | |
|---|---|---|---|---|---|---|---|---|
| 8.5 | 0.2880 + 1.2587i | 0.2778 + 1.1339i | 0.2778 + 1.1339i | 0.2778 + 1.1339i | 0.6879 + 1.1023i | 0.6039 + 1.0029i | 0.6039 + 1.0029i | 0.6039 + 1.0029i |
| 9 | 1.5505 + 1.0696i | 0.9224 + 0.9099i | 0.3155 + 1.4985i | 0.7236 + 0.9800i | 1.1886 + 1.6606i | 0.8973 + 0.9758i | 0.4528 + 1.5320i | 0.7212 + 1.0496i |
| 9.5 | 1.5654 + 1.1053i | 0.9312 + 0.9074i | 0.2863 + 1.5023i | 0.7311 + 0.9685i | 1.1323 + 1.6866i | 0.8963 + 0.9732i | 0.4510 + 1.5195i | 0.7234 + 1.0425i |
| 10 | 1.4799 − 0.9890i | 1.1939 − 0.7944i | 0.8996 − 0.5484i | 0.8996 − 0.5484i | 1.1939 − 0.7944i | 1.1939 − 0.7944i | 0.8996 − 0.5484i | 0.8996 − 0.5484i |
| 10.5 | 1.4880 − 0.9918i | 1.1916 − 0.7987i | 0.8869 − 0.5497i | 0.8869 − 0.5497i | 1.1916 − 0.7987i | 1.1916 − 0.7987i | 0.8869 − 0.5497i | 0.8869 − 0.5497i |
| 11 | 0.2256 + 1.0062i | 0.2256 + 1.0062i | 0.2256 + 1.0062i | 0.2256 + 1.0062i | 0.5533 + 0.8764i | 0.5533 + 0.8764i | 0.5533 + 0.8764i | 0.5533 + 0.8764i |
| 11.5 | 0.2176 + 1.0019i | 0.2176 + 1.0019i | 0.2176 + 1.0019i | 0.2176 + 1.0019i | 0.5582 + 0.8659i | 0.5582 + 0.8659i | 0.5582 + 0.8659i | 0.5582 + 0.8659i |
| 12 | 0.2025 + 1.0190i | 0.2025 + 1.0190i | 0.2025 + 1.0190i | 0.2025 + 1.0190i | 0.5763 + 0.8391i | 0.5763 + 0.8391i | 0.5763 + 0.8391i | 0.5763 + 0.8391i |
| 12.5 | 0.2101 + 1.0355i | 0.2101 + 1.0355i | 0.2101 + 1.0355i | 0.2101 + 1.0355i | 0.5983 + 0.8202i | 0.5983 + 0.8202i | 0.5983 + 0.8202i | 0.5983 + 0.8202i |
| 13 | 0.2408 + 0.9979i | 0.2750 + 1.0662i | 0.1741 + 1.0211i | 0.1849 + 1.1031i | 0.6002 + 0.8180i | 0.6002 + 0.8180i | 0.6515 + 0.7734i | 0.6002 + 0.8180i |
| 13.5 | 0.2553 + 0.9993i | 0.2988 + 1.0689i | 0.1656 + 1.0288i | 0.1779 + 1.1140i | 0.5795 + 0.8287i | 0.5795 + 0.8287i | 0.6595 + 0.7742i | 0.6595 + 0.7742i |
| 14 | 0.2659 + 0.9951i | 0.3199 + 1.0652i | 0.1586 + 1.0330i | 0.1732 + 1.1198i | 0.5798 + 0.8268i | 0.5798 + 0.8268i | 0.6663 + 0.7792i | 0.6663 + 0.7792i |
| 14.5 | 0.2918 + 0.9977i | 0.3457 + 1.0677i | 0.1513 + 1.0448i | 0.1608 + 1.1366i | 0.5795 + 0.7993i | 0.5814 + 0.8684i | 0.6788 + 0.7718i | 0.6788 + 0.7718i |
| 15 | 0.7901 + 1.2547i | 0.6026 + 1.0065i | 0.8074 + 1.0302i | 0.6026 + 1.0065i | 0.6083 + 0.6968i | 0.6083 + 0.6968i | 0.7056 + 0.6773i | 0.6083 + 0.6968i |
| 15.5 | 0.2231 + 1.7092i | 0.6616 + 0.9740i | 0.5030 + 1.4567i | 0.6230 + 1.1163i | 0.7013 + 0.6041i | 0.6841 + 0.7162i | 0.7013 + 0.6041i | 0.7013 + 0.6041i |
| 16 | 0.7189 + 1.2484i | 0.5519 + 1.0360i | 0.8125 + 0.9999i | 0.6001 + 0.9735i | 0.5867 + 0.6801i | 0.5867 + 0.6801i | 0.7357 + 0.7025i | 0.6195 + 0.7364i |
| 16.5 | 0.5954 + 1.6721i | 0.6356 + 0.9282i | 0.6612 + 1.3085i | 0.6870 + 0.9890i | 0.6139 + 0.5878i | 0.6161 + 0.6843i | 0.7069 + 0.5730i | 0.6968 + 0.6615i |
| 17 | 0.7916 + 1.5326i | 0.5781 + 0.9103i | 0.6737 + 1.2261i | 0.6488 + 0.9682i | 0.6008 + 0.5904i | 0.5968 + 0.6937i | 0.7280 + 0.5839i | 0.7207 + 0.6853i |
| 17.5 | 0.7546 + 1.5371i | 0.5791 + 0.9008i | 0.6529 + 1.2248i | 0.6563 + 0.9619i | 0.5998 + 0.5837i | 0.5965 + 0.6939i | 0.7601 + 0.5787i | 0.7439 + 0.6985i |
| 18 | 0.7460 + 1.5301i | 0.5607 + 0.8951i | 0.6305 + 1.2208i | 0.6414 + 0.9625i | 0.5848 + 0.5763i | 0.5797 + 0.7001i | 0.7518 + 0.5786i | 0.7339 + 0.7041i |
| 18.5 | 0.7388 + 1.5187i | 0.5534 + 0.8948i | 0.6245 + 1.2171i | 0.6469 + 0.9671i | 0.5816 + 0.5744i | 0.5746 + 0.7125i | 0.7634 + 0.5763i | 0.7384 + 0.7224i |
| 19 | 1.0419 + 1.2518i | 0.8657 + 1.0272i | 1.2891 + 1.0296i | 1.0567 + 0.8727i | 0.6260 + 0.6701i | 0.7308 + 0.8371i | 0.7597 + 0.5841i | 0.8864 + 0.7205i |
| 19.5 | 0.6600 + 1.2390i | 0.6575 + 0.9736i | 0.8905 + 1.1414i | 0.8571 + 0.9152i | 0.6106 + 0.5775i | 0.6382 + 0.7572i | 0.7620 + 0.5398i | 0.8086 + 0.7221i |
| 20 | 0.5458 + 1.2087i | 0.5280 + 0.9935i | 0.6621 + 1.4483i | 0.7224 + 0.9905i | 0.5909 + 0.6140i | 0.5567 + 0.7928i | 0.7623 + 0.6325i | 0.7410 + 0.7994i |
| 20.5 | 0.5495 + 1.2117i | 0.5295 + 0.9994i | 0.6564 + 1.4451i | 0.7273 + 1.0021i | 0.5962 + 0.6217i | 0.5627 + 0.8030i | 0.7674 + 0.6377i | 0.7457 + 0.8086i |
| 21 | 0.5460 + 1.2127i | 0.5252 + 1.0028i | 0.6465 + 1.4397i | 0.7242 + 1.0131i | 0.6013 + 0.6294i | 0.5660 + 0.8106i | 0.7730 + 0.6458i | 0.7464 + 0.8190i |
| 21.5 | 0.5373 + 1.2128i | 0.5165 + 1.0048i | 0.6343 + 1.4321i | 0.7152 + 1.0245i | 0.6073 + 0.6384i | 0.5684 + 0.8175i | 0.7801 + 0.6568i | 0.7459 + 0.8311i |
| 22 | 0.5187 + 1.2127i | 0.4960 + 1.0047i | 0.6102 + 1.4243i | 0.6926 + 1.0375i | 0.6194 + 0.6507i | 0.5744 + 0.8249i | 0.7952 + 0.6762i | 0.7540 + 0.8498i |
| 22.5 | 0.5099 + 1.2100i | 0.4914 + 1.0072i | 0.5898 + 1.4201i | 0.6910 + 1.0470i | 0.6271 + 0.6619i | 0.5827 + 0.8346i | 0.8016 + 0.6867i | 0.7612 + 0.8629i |
| 23 | 0.5427 + 1.2003i | 0.5813 + 1.0089i | 0.5291 + 1.4273i | 0.7630 + 1.0578i | 0.6294 + 0.6610i | 0.6110 + 0.8310i | 0.7906 + 0.6835i | 0.7844 + 0.8645i |
| 23.5 | 0.4976 + 1.2018i | 0.4821 + 1.0103i | 0.5648 + 1.4016i | 0.6826 + 1.0558i | 0.6404 + 0.6801i | 0.5954 + 0.8500i | 0.8128 + 0.7021i | 0.7699 + 0.8797i |
| 24 | 0.5286 + 1.2013i | 0.6120 + 1.0209i | 0.7270 + 1.2479i | 0.7961 + 1.0299i | 0.6617 + 0.6693i | 0.6621 + 0.8401i | 0.8310 + 0.6617i | 0.8389 + 0.8357i |
| 24.5 | 0.5158 + 1.1967i | 0.6077 + 1.0231i | 0.7117 + 1.2419i | 0.7917 + 1.0319i | 0.6714 + 0.6767i | 0.6662 + 0.8463i | 0.8411 + 0.6694i | 0.8402 + 0.8434i |
| 25 | 0.5056 + 1.1921i | 0.6041 + 1.0245i | 0.7005 + 1.2353i | 0.7883 + 1.0319i | 0.6790 + 0.6831i | 0.6702 + 0.8514i | 0.8475 + 0.6749i | 0.8427 + 0.8479i |
| 25.5 | 0.4973 + 1.1878i | 0.6009 + 1.0255i | 0.6921 + 1.2284i | 0.7855 + 1.0302i | 0.6850 + 0.6886i | 0.6728 + 0.8554i | 0.8517 + 0.6775i | 0.8443 + 0.8495i |
| 26 | 0.4905 + 1.1842i | 0.5982 + 1.0262i | 0.6854 + 1.2221i | 0.7829 + 1.0274i | 0.6911 + 0.6930i | 0.6740 + 0.8584i | 0.8561 + 0.6778i | 0.8451 + 0.8492i |

| SNR/w | w16 | w17 | w18 | w19 | w20 | w21 | w22 | w23 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |

-continued

| | | | | | | | | |
|---|---|---|---|---|---|---|---|---|
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i |
| 7 | 0.4673 + 0.2525i | 0.4673 + 0.2525i | 0.4673 + 0.2525i | 0.4673 + 0.2525i | 0.4673 + 0.2525i | 0.4673 + 0.2525i | 0.4673 + 0.2525i | 0.4673 + 0.2525i |
| 7.5 | 0.2521 + 0.4541i | 0.2521 + 0.4541i | 0.6595 + 1.1198i | 0.9931 + 1.5130i | 0.2521 + 0.4541i | 0.2521 + 0.4541i | 0.5780 + 1.0186i | 0.6595 + 1.1198i |
| 8 | 1.7813 + 0.3565i | 1.2626 + 0.3059i | 1.2626 + 0.3059i | 1.1350 + 0.2951i | 1.5146 + 1.0099i | 1.1091 + 0.6749i | 1.1091 + 0.6749i | 1.0099 + 0.5912i |
| 8.5 | 1.7914 + 0.3488i | 1.2587 + 0.2880i | 1.2587 + 0.2880i | 1.1339 + 0.2778i | 1.5168 + 1.0152i | 1.1023 + 0.6879i | 1.1023 + 0.6879i | 1.0029 + 0.6039i |
| 9 | 1.1563 + 0.2542i | 0.9312 + 0.3679i | 0.9277 + 0.2224i | 0.8427 + 0.3081i | 1.1563 + 0.2542i | 0.9312 + 0.3679i | 0.9277 + 0.2224i | 0.8427 + 0.3081i |
| 9.5 | 1.1947 + 0.2553i | 0.9334 + 0.3829i | 0.9095 + 0.2111i | 0.8351 + 0.3123i | 1.1947 + 0.2553i | 0.9334 + 0.3829i | 0.9095 + 0.2111i | 0.8351 + 0.3123i |
| 10 | 0.3146 − 0.1705i | 0.3146 − 0.1705i | 0.6218 − 0.2169i | 0.6218 − 0.2169i | 0.3146 − 0.1705i | 0.3146 − 0.1705i | 0.6218 − 0.2169i | 0.6218 − 0.2169i |
| 10.5 | 0.3056 − 0.1640i | 0.3056 − 0.1640i | 0.6406 − 0.2071i | 0.6406 − 0.2071i | 0.3056 − 0.1640i | 0.3056 − 0.1640i | 0.6406 − 0.2071i | 0.6406 − 0.2071i |
| 11 | 1.7631 + 0.3541i | 1.4060 + 0.2729i | 1.4060 + 0.2729i | 1.4060 + 0.2729i | 1.4961 + 0.9954i | 1.1885 + 0.7994i | 1.1885 + 0.7994i | 1.1885 + 0.7994i |
| 11.5 | 1.4044 + 0.2728i | 1.7739 + 0.3559i | 1.4044 + 0.2728i | 1.4044 + 0.2728i | 1.1874 + 0.7969i | 1.5057 + 1.0025i | 1.1874 + 0.7969i | 1.1874 + 0.7969i |
| 12 | 1.3658 + 0.2176i | 1.7227 + 0.2900i | 1.3658 + 0.2176i | 1.3636 + 0.3654i | 1.3708 + 1.2834i | 1.6701 + 0.8403i | 1.1927 + 0.7638i | 1.1927 + 0.7638i |
| 12.5 | 1.4067 + 0.1623i | 1.7386 + 0.2869i | 1.3213 + 0.2614i | 1.3555 + 0.3818i | 1.3728 + 1.2802i | 1.6730 + 0.8349i | 1.1933 + 0.7386i | 1.1933 + 0.7386i |
| 13 | 1.4076 + 0.1477i | 1.7480 + 0.2870i | 1.3169 + 0.2677i | 1.3479 + 0.3950i | 1.3698 + 1.2765i | 1.6671 + 0.8318i | 1.1603 + 0.7369i | 1.2208 + 0.7017i |
| 13.5 | 1.4079 + 0.1358i | 1.7492 + 0.2856i | 1.3108 + 0.2733i | 1.3393 + 0.4031i | 1.3733 + 1.2596i | 1.6601 + 0.8198i | 1.1559 + 0.7249i | 1.2163 + 0.6897i |
| 14 | 1.3832 + 0.1273i | 1.7176 + 0.2506i | 1.2890 + 0.2587i | 1.3115 + 0.3882i | 1.4490 + 1.1367i | 1.6791 + 0.7233i | 1.1637 + 0.7318i | 1.2117 + 0.6596i |
| 14.5 | 1.3830 + 0.1182i | 1.7146 + 0.2469i | 1.2824 + 0.2560i | 1.3020 + 0.3885i | 1.4514 + 1.1095i | 1.6674 + 0.7048i | 1.1614 + 0.7220i | 1.2096 + 0.6442i |
| 15 | 0.9728 + 0.1097i | 0.9728 + 0.1097i | 0.9203 + 0.1683i | 0.9203 + 0.1683i | 1.3276 + 0.1371i | 1.2605 + 0.2607i | 0.9985 + 0.4136i | 0.9985 + 0.4136i |
| 15.5 | 1.7803 + 0.2282i | 1.4175 + 0.1304i | 1.0142 + 0.1107i | 1.0875 + 0.1106i | 1.5669 + 0.6281i | 1.3668 + 0.3723i | 1.0499 + 0.3395i | 1.0499 + 0.3395i |
| 16 | 0.9770 + 0.1124i | 0.9770 + 0.1124i | 0.9145 + 0.1775i | 0.9145 + 0.1775i | 1.3198 + 0.1175i | 1.2383 + 0.2709i | 0.9483 + 0.4442i | 1.0242 + 0.4164i |
| 16.5 | 1.6501 + 0.1602i | 1.3265 + 0.1294i | 0.9609 + 0.1136i | 1.0472 + 0.1153i | 1.6046 + 0.4875i | 1.2991 + 0.3994i | 0.9506 + 0.3440i | 1.0402 + 0.3427i |
| 17 | 1.3221 + 0.1224i | 1.6557 + 0.1780i | 1.0381 + 0.1026i | 0.9427 + 0.1024i | 1.2802 + 0.3500i | 1.5980 + 0.5501i | 0.9903 + 0.3365i | 0.9340 + 0.2929i |
| 17.5 | 1.3275 + 0.1269i | 1.6476 + 0.1778i | 1.0687 + 0.1009i | 0.9443 + 0.0988i | 1.2837 + 0.3590i | 1.5920 + 0.5468i | 1.0024 + 0.3379i | 0.9388 + 0.2809i |
| 18 | 1.3214 + 0.1348i | 1.6192 + 0.1568i | 1.0864 + 0.1085i | 0.9690 + 0.1136i | 1.2847 + 0.3887i | 1.5877 + 0.4787i | 1.0252 + 0.3747i | 0.9593 + 0.3085i |
| 18.5 | 1.3267 + 0.1381i | 1.6139 + 0.1586i | 1.1074 + 0.1075i | 0.9719 + 0.1124i | 1.2798 + 0.3928i | 1.5690 + 0.4783i | 1.0323 + 0.3791i | 0.9610 + 0.2983i |
| 19 | 0.8708 + 0.0767i | 0.8708 + 0.0767i | 0.6723 + 0.1053i | 0.6723 + 0.1053i | 0.9883 + 0.2131i | 1.1539 + 0.0898i | 0.7883 + 0.3358i | 0.7109 + 0.2753i |
| 19.5 | 1.5486 + 0.1257i | 1.2666 + 0.1072i | 0.9028 + 0.1029i | 1.0498 + 0.1027i | 1.4788 + 0.3590i | 1.2369 + 0.3451i | 0.9051 + 0.3205i | 1.0533 + 0.3050i |
| 20 | 1.5281 + 0.1441i | 1.2566 + 0.1120i | 0.9743 + 0.0673i | 1.0261 + 0.1720i | 1.4715 + 0.4355i | 1.2435 + 0.3351i | 0.9816 + 0.4825i | 1.0252 + 0.3371i |
| 20.5 | 1.5048 + 0.1396i | 1.2429 + 0.1109i | 0.9704 + 0.0648i | 1.0197 + 0.1762i | 1.4594 + 0.4244i | 1.2338 + 0.3332i | 0.9790 + 0.4840i | 1.0192 + 0.3364i |
| 21 | 1.4884 + 0.1372i | 1.2362 + 0.1109i | 0.9743 + 0.0635i | 1.0194 + 0.1825i | 1.4526 + 0.4196i | 1.2302 + 0.3337i | 0.9804 + 0.4906i | 1.0189 + 0.3404i |
| 21.5 | 1.4742 + 0.1349i | 1.2309 + 0.1105i | 0.9796 + 0.0634i | 1.0198 + 0.1891i | 1.4461 + 0.4142i | 1.2279 + 0.3323i | 0.9827 + 0.4998i | 1.0202 + 0.3467i |
| 22 | 1.4534 + 0.1259i | 1.2190 + 0.1086i | 0.9789 + 0.0639i | 1.0144 + 0.1947i | 1.4356 + 0.3854i | 1.2194 + 0.3249i | 0.9844 + 0.5115i | 1.0179 + 0.3535i |
| 22.5 | 1.4370 + 0.1217i | 1.2104 + 0.1069i | 0.9794 + 0.0652i | 1.0117 + 0.2003i | 1.4268 + 0.3730i | 1.2148 + 0.3198i | 0.9818 + 0.5182i | 1.0172 + 0.3596i |
| 23 | 1.1919 + 0.0896i | 1.4034 + 0.1266i | 1.0017 + 0.0743i | 0.9909 + 0.2196i | 1.2082 + 0.5145i | 1.2105 + 0.3132i | 1.0055 + 0.5362i | 1.0096 + 0.3698i |
| 23.5 | 1.4070 + 0.1153i | 1.1945 + 0.1045i | 0.9784 + 0.0686i | 1.0093 + 0.2102i | 1.4123 + 0.3539i | 1.2076 + 0.3137i | 0.9768 + 0.5294i | 1.0171 + 0.3701i |
| 24 | 1.1265 + 0.0892i | 1.3157 + 0.0959i | 0.9524 + 0.0776i | 0.9403 + 0.2321i | 1.4948 + 0.2501i | 1.2660 + 0.2959i | 0.9649 + 0.4426i | 1.0812 + 0.3131i |
| 24.5 | 1.1278 + 0.0893i | 1.3152 + 0.0946i | 0.9556 + 0.0782i | 0.9422 + 0.2341i | 1.4851 + 0.2508i | 1.2669 + 0.2917i | 0.9719 + 0.4412i | 1.0855 + 0.3077i |
| 25 | 1.1316 + 0.0895i | 1.3173 + 0.0939i | 0.9608 + 0.0790i | 0.9429 + 0.2357i | 1.4766 + 0.2540i | 1.2666 + 0.2886i | 0.9763 + 0.4381i | 1.0887 + 0.3028i |

-continued

| | | | | | | | | |
|---|---|---|---|---|---|---|---|---|
| 25.5 | 1.1477 + 0.0888i | 1.3330 + 0.0946i | 0.9772 + 0.0808i | 0.9387 + 0.2361i | 1.4686 + 0.2702i | 1.2647 + 0.2863i | 0.9779 + 0.4321i | 1.0881 + 0.2935i |
| 26 | 1.1595 + 0.0882i | 1.3430 + 0.0950i | 0.9894 + 0.0820i | 0.9367 + 0.2358i | 1.4613 + 0.2782i | 1.2637 + 0.2839i | 0.9800 + 0.4265i | 1.0889 + 0.2858i |

| SNR/w | w24 | w25 | w26 | w27 | w28 | w29 | w30 | w31 |
|---|---|---|---|---|---|---|---|---|
| 5 | 0.4521 + 0.2696i | 0.4521 + 0.2696i | 1.2065 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i | 0.4588 + 0.2626i |
| 7 | 0.4673 + 0.2525i | 0.4673 + 0.2525i | 0.4673 + 0.2525i | 0.4673 + 0.2525i | 0.4673 + 0.2525i | 0.4673 + 0.2525i | 0.4673 + 0.2525i | 0.4673 + 0.2525i |
| 7.5 | 0.4541 + 0.2521i | 0.4541 + 0.2521i | 1.1198 + 0.6595i | 1.5130 + 0.9931i | 0.4541 + 0.2521i | 0.4541 + 0.2521i | 1.0186 + 0.5780i | 1.1198 + 0.6595i |
| 8 | 1.2626 + 0.3059i | 1.1350 + 0.2951i | 1.1350 + 0.2951i | 1.1350 + 0.2951i | 1.1091 + 0.6749i | 1.0099 + 0.5912i | 1.0099 + 0.5912i | 1.0099 + 0.5912i |
| 8.5 | 1.2587 + 0.2880i | 1.1339 + 0.2778i | 1.1339 + 0.2778i | 1.1339 + 0.2778i | 1.1023 + 0.6879i | 1.0029 + 0.6039i | 1.0029 + 0.6039i | 1.0029 + 0.6039i |
| 9 | 0.9277 + 0.2224i | 0.9312 + 0.3679i | 0.9277 + 0.2224i | 0.8427 + 0.3081i | 0.9277 + 0.2224i | 0.8427 + 0.3081i | 0.9277 + 0.2224i | 0.8427 + 0.3081i |
| 9.5 | 1.0053 + 0.2519i | 0.9334 + 0.3829i | 0.9095 + 0.2111i | 0.8351 + 0.3123i | 0.9095 + 0.2111i | 0.8351 + 0.3123i | 0.9095 + 0.2111i | 0.8351 + 0.3123i |
| 10 | 0.3146 − 0.1705i | 0.3146 − 0.1705i | 0.5800 − 0.3158i | 0.5800 − 0.3158i | 0.3146 − 0.1705i | 0.3146 − 0.1705i | 0.5800 − 0.3158i | 0.5800 − 0.3158i |
| 10.5 | 0.3056 − 0.1640i | 0.3056 − 0.1640i | 0.5895 − 0.3251i | 0.5895 − 0.3251i | 0.3056 − 0.1640i | 0.3056 − 0.1640i | 0.5895 − 0.3251i | 0.5895 − 0.3251i |
| 11 | 1.0064 + 0.2256i | 1.0064 + 0.2256i | 1.0064 + 0.2256i | 1.0064 + 0.2256i | 0.8765 + 0.5534i | 0.8765 + 0.5534i | 0.8765 + 0.5534i | 0.8765 + 0.5534i |
| 11.5 | 1.0019 + 0.2166i | 1.0019 + 0.2166i | 1.0019 + 0.2166i | 1.0019 + 0.2166i | 0.8673 + 0.5553i | 0.8673 + 0.5553i | 0.8673 + 0.5553i | 0.8673 + 0.5553i |
| 12 | 0.9779 + 0.2130i | 0.9779 + 0.2130i | 0.9779 + 0.2130i | 0.9779 + 0.2130i | 0.8517 + 0.5110i | 0.8517 + 0.5110i | 0.8517 + 0.5110i | 0.8517 + 0.5110i |
| 12.5 | 0.9685 + 0.1988i | 0.9685 + 0.1988i | 0.9685 + 0.1988i | 0.9685 + 0.1988i | 0.8450 + 0.4843i | 0.8450 + 0.4843i | 0.8450 + 0.4843i | 0.8450 + 0.4843i |
| 13 | 0.9627 + 0.1873i | 0.9627 + 0.1873i | 0.9627 + 0.1873i | 0.9627 + 0.1873i | 0.8114 + 0.4387i | 0.8114 + 0.4387i | 0.8656 + 0.4956i | 0.8656 + 0.4956i |
| 13.5 | 0.9601 + 0.1792i | 0.9601 + 0.1792i | 0.9601 + 0.1792i | 0.9601 + 0.1792i | 0.8069 + 0.4342i | 0.8069 + 0.4342i | 0.8601 + 0.4908i | 0.8601 + 0.4908i |
| 14 | 0.9497 + 0.1757i | 0.9497 + 0.1757i | 0.9497 + 0.1757i | 0.9497 + 0.1757i | 0.8010 + 0.4478i | 0.8010 + 0.4478i | 0.8569 + 0.5016i | 0.8569 + 0.5016i |
| 14.5 | 0.9458 + 0.1698i | 0.9458 + 0.1698i | 0.9458 + 0.1698i | 0.9458 + 0.1698i | 0.8013 + 0.4424i | 0.8013 + 0.4424i | 0.8556 + 0.4991i | 0.8556 + 0.4991i |
| 15 | 0.6408 + 0.1433i | 0.6408 + 0.1433i | 0.6408 + 0.1433i | 0.6408 + 0.1433i | 0.6279 + 0.4093i | 0.6279 + 0.4093i | 0.6279 + 0.4093i | 0.6279 + 0.4093i |
| 15.5 | 0.6290 + 0.1097i | 0.6290 + 0.1097i | 0.7248 + 0.1111i | 0.7248 + 0.1111i | 0.6341 + 0.3248i | 0.6341 + 0.3248i | 0.7151 + 0.3328i | 0.7151 + 0.3328i |
| 16 | 0.6443 + 0.1428i | 0.6443 + 0.1428i | 0.6443 + 0.1428i | 0.6443 + 0.1428i | 0.6206 + 0.4154i | 0.6206 + 0.4154i | 0.6844 + 0.4315i | 0.6206 + 0.4154i |
| 16.5 | 0.5984 + 0.1101i | 0.5984 + 0.1101i | 0.7019 + 0.1112i | 0.7019 + 0.1112i | 0.5958 + 0.3406i | 0.5958 + 0.3406i | 0.6854 + 0.3378i | 0.6854 + 0.3378i |
| 17 | 0.5882 + 0.1166i | 0.5882 + 0.1166i | 0.6862 + 0.1090i | 0.6862 + 0.1090i | 0.5970 + 0.3582i | 0.5970 + 0.3582i | 0.7132 + 0.3488i | 0.7132 + 0.3488i |
| 17.5 | 0.5867 + 0.1202i | 0.5867 + 0.1202i | 0.6979 + 0.1065i | 0.6979 + 0.1065i | 0.5964 + 0.3618i | 0.5964 + 0.3618i | 0.7385 + 0.3474i | 0.7385 + 0.3474i |
| 18 | 0.5972 + 0.1204i | 0.5972 + 0.1204i | 0.7450 + 0.1071i | 0.7450 + 0.1071i | 0.5959 + 0.3561i | 0.5959 + 0.3561i | 0.7535 + 0.3905i | 0.7704 + 0.3249i |
| 18.5 | 0.5962 + 0.1221i | 0.5962 + 0.1221i | 0.7314 + 0.0890i | 0.7775 + 0.1184i | 0.5953 + 0.3915i | 0.5975 + 0.3225i | 0.7649 + 0.4029i | 0.7817 + 0.3156i |
| 19 | 0.4351 + 0.0785i | 0.4574 + 0.2064i | 0.4351 + 0.0785i | 0.4574 + 0.2064i | 0.5409 + 0.5182i | 0.4759 + 0.3755i | 0.6422 + 0.4556i | 0.5543 + 0.3409i |
| 19.5 | 0.5174 + 0.0970i | 0.5174 + 0.0970i | 0.7398 + 0.0890i | 0.6724 + 0.1233i | 0.5700 + 0.4187i | 0.5429 + 0.2967i | 0.7319 + 0.3429i | 0.6646 + 0.2744i |
| 20 | 0.6423 + 0.0698i | 0.6358 + 0.1904i | 0.8003 + 0.0754i | 0.8009 + 0.2018i | 0.6132 + 0.4606i | 0.6264 + 0.3286i | 0.7906 + 0.4757i | 0.8007 + 0.3342i |
| 20.5 | 0.6384 + 0.0678i | 0.6332 + 0.1948i | 0.7968 + 0.0730i | 0.8000 + 0.2036i | 0.6160 + 0.4668i | 0.6266 + 0.3299i | 0.7913 + 0.4796i | 0.8013 + 0.3338i |
| 21 | 0.6429 + 0.0675i | 0.6384 + 0.1981i | 0.8011 + 0.0721i | 0.8064 + 0.2059i | 0.6220 + 0.4731i | 0.6327 + 0.3327i | 0.7953 + 0.4864i | 0.8070 + 0.3371i |
| 21.5 | 0.6501 + 0.0680i | 0.6464 + 0.2016i | 0.8075 + 0.0719i | 0.8146 + 0.2088i | 0.6296 + 0.4809i | 0.6412 + 0.3374i | 0.8008 + 0.4955i | 0.8141 + 0.3431i |
| 22 | 0.6546 + 0.0693i | 0.6531 + 0.2062i | 0.8096 + 0.0722i | 0.8191 + 0.2122i | 0.6400 + 0.4925i | 0.6498 + 0.3451i | 0.8073 + 0.5082i | 0.8199 + 0.3516i |
| 22.5 | 0.6581 + 0.0702i | 0.6580 + 0.2095i | 0.8121 + 0.0727i | 0.8228 + 0.2154i | 0.6452 + 0.5010i | 0.6552 + 0.3508i | 0.8087 + 0.5167i | 0.8230 + 0.3582i |

-continued

| | | | | | | | | |
|---|---|---|---|---|---|---|---|---|
| 23 | 0.6613 + 0.0692i | 0.6601 + 0.2094i | 0.8231 + 0.0709i | 0.8202 + 0.2164i | 0.6479 + 0.5023i | 0.6570 + 0.3532i | 0.8160 + 0.5191i | 0.8231 + 0.3662i |
| 23.5 | 0.6618 + 0.0721i | 0.6653 + 0.2161i | 0.8148 + 0.0743i | 0.8285 + 0.2219i | 0.6524 + 0.5156i | 0.6640 + 0.3620i | 0.8099 + 0.5313i | 0.8291 + 0.3705i |
| 24 | 0.6277 + 0.0697i | 0.6260 + 0.2109i | 0.7852 + 0.0706i | 0.7804 + 0.2127i | 0.6444 + 0.5097i | 0.6285 + 0.3572i | 0.8056 + 0.5017i | 0.7792 + 0.3548i |
| 24.5 | 0.6341 + 0.0711i | 0.6317 + 0.2150i | 0.7905 + 0.0716i | 0.7839 + 0.2154i | 0.6537 + 0.5167i | 0.6360 + 0.3632i | 0.8156 + 0.5101i | 0.7875 + 0.3608i |
| 25 | 0.6408 + 0.0723i | 0.6355 + 0.2186i | 0.7969 + 0.0724i | 0.7860 + 0.2176i | 0.6614 + 0.5229i | 0.6414 + 0.3685i | 0.8234 + 0.5160i | 0.7936 + 0.3653i |
| 25.5 | 0.6523 + 0.0731i | 0.6352 + 0.2218i | 0.8115 + 0.0731i | 0.7837 + 0.2189i | 0.6674 + 0.5284i | 0.6441 + 0.3734i | 0.8292 + 0.5189i | 0.7961 + 0.3682i |
| 26 | 0.6622 + 0.0739i | 0.6337 + 0.2246i | 0.8231 + 0.0739i | 0.7818 + 0.2196i | 0.6739 + 0.5331i | 0.6474 + 0.3777i | 0.8353 + 0.5198i | 0.7994 + 0.3695i |

| SNR/w | w32 | w33 | w34 | w35 | w36 | w37 | w38 | w39 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i |
| 7 | 0.5496 + 1.0771i | 0.5496 + 1.0771i | 0.7162 + 1.3338i | 0.5496 + 1.0771i | 0.3537 + 1.2031i | 0.3537 + 1.2031i | 0.4291 + 1.7565i | 0.3537 + 1.2031i |
| 7.5 | 0.2521 + 0.4541i | 0.2521 + 0.4541i | 0.3162 + 1.1348i | 0.3279 + 1.2665i | 0.2521 + 0.4541i | 0.2521 + 0.4541i | 0.3162 + 1.1348i | 0.3162 + 1.1348i |
| 8 | 0.2309 + 0.4131i | 0.2309 + 0.4131i | 0.2309 + 0.4131i | 0.2594 + 0.4923i | 0.2309 + 0.4131i | 0.2309 + 0.4131i | 0.2309 + 0.4131i | 0.2594 + 0.4923i |
| 8.5 | 0.2243 + 0.4147i | 0.2243 + 0.4147i | 0.2243 + 0.4147i | 0.2552 + 0.5023i | 0.2243 + 0.4147i | 0.2243 + 0.4147i | 0.2243 + 0.4147i | 0.2552 + 0.5023i |
| 9 | 0.2226 + 0.6803i | 0.2226 + 0.6803i | 0.1918 + 0.8048i | 0.2852 + 0.7636i | 0.2226 + 0.6803i | 0.2226 + 0.6803i | 0.1918 + 0.8048i | 0.2852 + 0.7636i |
| 9.5 | 0.2158 + 0.6823i | 0.2158 + 0.6823i | 0.1923 + 0.8151i | 0.2969 + 0.7633i | 0.2158 + 0.6823i | 0.2158 + 0.6823i | 0.1923 + 0.8151i | 0.2969 + 0.7633i |
| 10 | 0.3437 − 1.7476i | 0.2782 − 1.4030i | 0.2443 − 1.0199i | 0.2443 − 1.0199i | 0.2782 − 1.4030i | 0.2782 − 1.4030i | 0.2443 − 1.0199i | 0.2443 − 1.0199i |
| 10.5 | 0.3495 − 1.7549i | 0.2747 − 1.4067i | 0.2349 − 1.0113i | 0.2349 − 1.0113i | 0.2747 − 1.4067i | 0.2747 − 1.4067i | 0.2349 − 1.0113i | 0.2349 − 1.0113i |
| 11 | 0.1598 + 0.3010i | 0.1598 + 0.3010i | 0.1598 + 0.3010i | 0.1598 + 0.3010i | 0.1598 + 0.3010i | 0.1598 + 0.3010i | 0.1598 + 0.3010i | 0.1598 + 0.3010i |
| 11.5 | 0.1564 + 0.3007i | 0.1564 + 0.3007i | 0.1564 + 0.3007i | 0.1564 + 0.3007i | 0.1564 + 0.3007i | 0.1564 + 0.3007i | 0.1564 + 0.3007i | 0.1564 + 0.3007i |
| 12 | 0.1509 + 0.3272i | 0.1509 + 0.3272i | 0.1509 + 0.3272i | 0.1509 + 0.3272i | 0.1509 + 0.3272i | 0.1509 + 0.3272i | 0.1509 + 0.3272i | 0.1509 + 0.3272i |
| 12.5 | 0.1481 + 0.3696i | 0.1481 + 0.3696i | 0.1481 + 0.3696i | 0.1481 + 0.3696i | 0.1481 + 0.3696i | 0.1481 + 0.3696i | 0.1481 + 0.3696i | 0.1481 + 0.3696i |
| 13 | 0.1468 + 0.3993i | 0.1468 + 0.3993i | 0.1468 + 0.3993i | 0.1468 + 0.3993i | 0.1468 + 0.3993i | 0.1468 + 0.3993i | 0.1468 + 0.3993i | 0.1468 + 0.3993i |
| 13.5 | 0.1463 + 0.4129i | 0.1463 + 0.4129i | 0.1463 + 0.4129i | 0.1463 + 0.4129i | 0.1463 + 0.4129i | 0.1463 + 0.4129i | 0.1463 + 0.4129i | 0.1463 + 0.4129i |
| 14 | 0.1450 + 0.4179i | 0.1450 + 0.4179i | 0.1450 + 0.4179i | 0.1450 + 0.4179i | 0.1450 + 0.4179i | 0.1450 + 0.4179i | 0.1450 + 0.4179i | 0.1450 + 0.4179i |
| 14.5 | 0.1157 + 0.4495i | 0.1157 + 0.4495i | 0.1157 + 0.4495i | 0.1157 + 0.4495i | 0.1754 + 0.4094i | 0.1754 + 0.4094i | 0.1754 + 0.4094i | 0.1754 + 0.4094i |
| 15 | 0.2366 + 1.7925i | 0.1132 + 1.0217i | 0.1343 + 1.4263i | 0.1131 + 1.0934i | 0.1115 + 0.6331i | 0.1131 + 0.7237i | 0.1115 + 0.6331i | 0.1131 + 0.7237i |
| 15.5 | 0.1106 + 0.9815i | 0.1744 + 0.9230i | 0.1106 + 0.9815i | 0.1744 + 0.9230i | 0.1418 + 0.6437i | 0.1418 + 0.6437i | 0.1418 + 0.6437i | 0.1418 + 0.6437i |
| 16 | 0.1430 + 1.4001i | 0.1156 + 1.1081i | 0.1884 + 1.7333i | 0.1078 + 1.0066i | 0.1070 + 0.6209i | 0.1070 + 0.7219i | 0.1070 + 0.6209i | 0.1070 + 0.7219i |
| 16.5 | 0.1053 + 1.2977i | 0.1383 + 0.9835i | 0.1785 + 1.2326i | 0.1383 + 0.9835i | 0.1172 + 0.6177i | 0.1219 + 0.7208i | 0.1172 + 0.6177i | 0.1219 + 0.7208i |
| 17 | 0.1490 + 1.6173i | 0.1183 + 0.9591i | 0.1303 + 1.3054i | 0.1236 + 1.0413i | 0.1097 + 0.6047i | 0.1155 + 0.7211i | 0.1097 + 0.6047i | 0.1155 + 0.7211i |
| 17.5 | 0.1411 + 1.5896i | 0.1170 + 0.9512i | 0.1278 + 1.2852i | 0.1257 + 1.0327i | 0.1073 + 0.5955i | 0.1161 + 0.7305i | 0.1073 + 0.5955i | 0.1161 + 0.7305i |
| 18 | 0.1396 + 1.5775i | 0.1131 + 0.9418i | 0.1242 + 1.2789i | 0.1226 + 1.0347i | 0.1041 + 0.5771i | 0.1143 + 0.7318i | 0.1041 + 0.5771i | 0.1143 + 0.7318i |
| 18.5 | 0.1401 + 1.5712i | 0.1104 + 0.9411i | 0.1233 + 1.2808i | 0.1220 + 1.0474i | 0.1020 + 0.5694i | 0.1145 + 0.7394i | 0.1020 + 0.5694i | 0.1145 + 0.7394i |
| 19 | 0.1202 + 1.4352i | 0.0996 + 1.2052i | 0.2171 + 1.6874i | 0.2773 + 1.1812i | 0.0839 + 0.8147i | 0.0834 + 0.9964i | 0.1971 + 0.8041i | 0.2436 + 0.9839i |
| 19.5 | 0.1542 + 1.5593i | 0.0710 + 0.9899i | 0.1176 + 1.2799i | 0.1750 + 1.0404i | 0.0755 + 0.6559i | 0.0799 + 0.8133i | 0.1865 + 0.6474i | 0.2027 + 0.8117i |
| 20 | 0.1167 + 1.2700i | 0.0962 + 1.0708i | 0.1297 + 1.5321i | 0.0883 + 0.8994i | 0.0749 + 0.5327i | 0.0612 + 0.6589i | 0.1829 + 0.5465i | 0.1233 + 0.7216i |

-continued

| | | | | | | | | |
|---|---|---|---|---|---|---|---|---|
| 20.5 | 0.1161 + 1.2756i | 0.0974 + 1.0790i | 0.1295 + 1.5298i | 0.0884 + 0.9064i | 0.0720 + 0.5415i | 0.0591 + 0.6728i | 0.1883 + 0.5570i | 0.1297 + 0.7318i |
| 21 | 0.1140 + 1.2762i | 0.0978 + 1.0812i | 0.1280 + 1.5231i | 0.0867 + 0.9060i | 0.0704 + 0.5429i | 0.0574 + 0.6772i | 0.1921 + 0.5608i | 0.1353 + 0.7334i |
| 21.5 | 0.1108 + 1.2731i | 0.0977 + 1.0794i | 0.1256 + 1.5126i | 0.0853 + 0.9029i | 0.0694 + 0.5429i | 0.0985 + 0.7061i | 0.1945 + 0.5628i | 0.0985 + 0.7061i |
| 22 | 0.1045 + 1.2645i | 0.0959 + 1.0725i | 0.1201 + 1.4962i | 0.0871 + 0.8987i | 0.0687 + 0.5451i | 0.1018 + 0.7086i | 0.1961 + 0.5662i | 0.1018 + 0.7086i |
| 22.5 | 0.1015 + 1.2588i | 0.0952 + 1.0704i | 0.1161 + 1.4831i | 0.0884 + 0.8992i | 0.0685 + 0.5510i | 0.0545 + 0.6912i | 0.1980 + 0.5732i | 0.1557 + 0.7375i |
| 23 | 0.1141 + 1.4950i | 0.0679 + 0.9023i | 0.1059 + 1.2572i | 0.1019 + 1.0664i | 0.0653 + 0.5841i | 0.0662 + 0.7419i | 0.2015 + 0.5913i | 0.1899 + 0.7378i |
| 23.5 | 0.0985 + 1.2520i | 0.0938 + 1.0710i | 0.1114 + 1.4628i | 0.0905 + 0.9054i | 0.0693 + 0.5689i | 0.0563 + 0.7102i | 0.2034 + 0.5915i | 0.1695 + 0.7506i |
| 24 | 0.0901 + 1.1911i | 0.0801 + 1.0038i | 0.1106 + 1.4060i | 0.2328 + 0.9654i | 0.0680 + 0.6561i | 0.0697 + 0.8236i | 0.2070 + 0.6480i | 0.2108 + 0.8051i |
| 24.5 | 0.0894 + 1.1877i | 0.0808 + 1.0036i | 0.1074 + 1.3967i | 0.2340 + 0.9604i | 0.0695 + 0.6593i | 0.0707 + 0.8259i | 0.2118 + 0.6478i | 0.2131 + 0.8017i |
| 25 | 0.0890 + 1.1877i | 0.0816 + 1.0065i | 0.1053 + 1.3909i | 0.2349 + 0.9570i | 0.0709 + 0.6644i | 0.0718 + 0.8309i | 0.2160 + 0.6470i | 0.2150 + 0.7989i |
| 25.5 | 0.0889 + 1.1889i | 0.0823 + 1.0105i | 0.1037 + 1.3867i | 0.2355 + 0.9547i | 0.0721 + 0.6705i | 0.0727 + 0.8369i | 0.2196 + 0.6455i | 0.2165 + 0.7966i |
| 26 | 0.0888 + 1.1903i | 0.0829 + 1.0145i | 0.1023 + 1.3833i | 0.2357 + 0.9536i | 0.0732 + 0.6770i | 0.0737 + 0.8430i | 0.2228 + 0.6437i | 0.2175 + 0.7949i |

| SNR/w | w40 | w41 | w42 | w43 | w44 | w45 | w46 | w47 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i | 0.5028 + 1.2085i |
| 7 | 0.5496 + 1.0771i | 0.5496 + 1.0771i | 0.5496 + 1.0771i | 0.5496 + 1.0771i | 0.3537 + 1.2031i | 0.3344 + 1.0806i | 0.3537 + 1.2031i | 0.3537 + 1.2031i |
| 7.5 | 0.4541 + 0.2521i | 0.4541 + 0.2521i | 1.1348 + 0.3162i | 1.2665 + 0.3279i | 0.4541 + 0.2521i | 0.4541 + 0.2521i | 1.1348 + 0.3162i | 1.1348 + 0.3162i |
| 8 | 0.2309 + 0.4131i | 0.2594 + 0.4923i | 0.2594 + 0.4923i | 0.2594 + 0.4923i | 0.2309 + 0.4131i | 0.2594 + 0.4923i | 0.2594 + 0.4923i | 0.2594 + 0.4923i |
| 8.5 | 0.2243 + 0.4147i | 0.2552 + 0.5023i | 0.2552 + 0.5023i | 0.2552 + 0.5023i | 0.2243 + 0.4147i | 0.2552 + 0.5023i | 0.2552 + 0.5023i | 0.2552 + 0.5023i |
| 9 | 0.2226 + 0.6803i | 0.2226 + 0.6803i | 0.1918 + 0.8048i | 0.2852 + 0.7636i | 0.2226 + 0.6803i | 0.2226 + 0.6803i | 0.1918 + 0.8048i | 0.2852 + 0.7636i |
| 9.5 | 0.2158 + 0.6823i | 0.2158 + 0.6823i | 0.1923 + 0.8151i | 0.2969 + 0.7633i | 0.2158 + 0.6823i | 0.2653 + 0.6756i | 0.1923 + 0.8151i | 0.2969 + 0.7633i |
| 10 | 0.9890 − 1.4799i | 0.7944 − 1.1939i | 0.5484 − 0.8996i | 0.5484 − 0.8996i | 0.7944 − 1.1939i | 0.7944 − 1.1939i | 0.5484 − 0.8996i | 0.5484 − 0.8996i |
| 10.5 | 0.9918 − 1.4880i | 0.7987 − 1.1916i | 0.5497 − 0.8869i | 0.5497 − 0.8869i | 0.7987 − 1.1916i | 0.7987 − 1.1916i | 0.5497 − 0.8869i | 0.5497 − 0.8869i |
| 11 | 0.1969 + 0.6553i | 0.1969 + 0.6553i | 0.1969 + 0.6553i | 0.1969 + 0.6553i | 0.3348 + 0.5953i | 0.3348 + 0.5953i | 0.3348 + 0.5953i | 0.3348 + 0.5953i |
| 11.5 | 0.1877 + 0.6663i | 0.1877 + 0.6663i | 0.1877 + 0.6663i | 0.1877 + 0.6663i | 0.3449 + 0.5981i | 0.3449 + 0.5981i | 0.3449 + 0.5981i | 0.3449 + 0.5981i |
| 12 | 0.1786 + 0.6836i | 0.1786 + 0.6836i | 0.1786 + 0.6836i | 0.1786 + 0.6836i | 0.3585 + 0.6001i | 0.3585 + 0.6001i | 0.3585 + 0.6001i | 0.3585 + 0.6001i |
| 12.5 | 0.1783 + 0.7098i | 0.1783 + 0.7098i | 0.1783 + 0.7098i | 0.1783 + 0.7098i | 0.3778 + 0.6041i | 0.3778 + 0.6041i | 0.3778 + 0.6041i | 0.3778 + 0.6041i |
| 13 | 0.1775 + 0.7313i | 0.1775 + 0.7313i | 0.1775 + 0.7313i | 0.1775 + 0.7313i | 0.3914 + 0.6049i | 0.3914 + 0.6049i | 0.3914 + 0.6049i | 0.3914 + 0.6049i |
| 13.5 | 0.1744 + 0.7444i | 0.1744 + 0.7444i | 0.1744 + 0.7444i | 0.1744 + 0.7444i | 0.3995 + 0.6028i | 0.3995 + 0.6028i | 0.3995 + 0.6028i | 0.3995 + 0.6028i |
| 14 | 0.1708 + 0.7511i | 0.1708 + 0.7511i | 0.1708 + 0.7511i | 0.1708 + 0.7511i | 0.4023 + 0.5991i | 0.4023 + 0.5991i | 0.4023 + 0.5991i | 0.4023 + 0.5991i |
| 14.5 | 0.1686 + 0.7635i | 0.1686 + 0.7635i | 0.1686 + 0.7635i | 0.1686 + 0.7635i | 0.4094 + 0.5960i | 0.4094 + 0.5960i | 0.4094 + 0.5960i | 0.4094 + 0.5960i |
| 15 | 0.6334 + 1.5624i | 0.3410 + 1.0543i | 0.3767 + 1.3678i | 0.3410 + 1.0543i | 0.3247 + 0.6377i | 0.3307 + 0.7164i | 0.3247 + 0.6377i | 0.3307 + 0.7164i |
| 15.5 | 0.1266 + 1.3390i | 0.4298 + 0.9537i | 0.2698 + 1.2595i | 0.4136 + 1.0326i | 0.4110 + 0.6301i | 0.4110 + 0.6301i | 0.4110 + 0.6301i | 0.4110 + 0.6301i |
| 16 | 0.4307 + 1.3657i | 0.3427 + 1.0736i | 0.5886 + 1.6752i | 0.3211 + 0.9921i | 0.3205 + 0.6295i | 0.3313 + 0.7167i | 0.3205 + 0.6295i | 0.3313 + 0.7167i |
| 16.5 | 0.2029 + 1.6229i | 0.4021 + 0.9693i | 0.4138 + 1.2839i | 0.4021 + 0.9693i | 0.3614 + 0.6015i | 0.3705 + 0.6925i | 0.3614 + 0.6015i | 0.3705 + 0.6925i |
| 17 | 0.4551 + 1.5890i | 0.3688 + 0.9394i | 0.3994 + 1.2831i | 0.3584 + 1.0296i | 0.3499 + 0.5950i | 0.3491 + 0.6925i | 0.3499 + 0.5950i | 0.3491 + 0.6925i |
| 17.5 | 0.4310 + 1.5685i | 0.3749 + 0.9291i | 0.3899 + 1.2664i | 0.3578 + 1.0211i | 0.3498 + 0.5889i | 0.3481 + 0.6977i | 0.3498 + 0.5889i | 0.3481 + 0.6977i |

-continued

| | | | | | | | | |
|---|---|---|---|---|---|---|---|---|
| 18 | 0.4257 + 1.5553i | 0.3653 + 0.9212i | 0.3793 + 1.2595i | 0.3474 + 1.0247i | 0.3805 + 0.5765i | 0.3633 + 0.7147i | 0.3133 + 0.5726i | 0.3120 + 0.6868i |
| 18.5 | 0.4244 + 1.5436i | 0.3639 + 0.9208i | 0.3774 + 1.2582i | 0.3430 + 1.0368i | 0.3915 + 0.5705i | 0.3623 + 0.7269i | 0.3080 + 0.5673i | 0.3034 + 0.6934i |
| 19 | 0.7690 + 1.4112i | 0.6649 + 1.1380i | 0.4761 + 1.4765i | 0.4596 + 1.1970i | 0.4764 + 0.7356i | 0.5686 + 0.9186i | 0.3592 + 0.7734i | 0.4125 + 0.9576i |
| 19.5 | 0.4619 + 1.4871i | 0.4964 + 0.9866i | 0.3490 + 1.2589i | 0.3490 + 1.0371i | 0.4558 + 0.6134i | 0.4773 + 0.7891i | 0.3323 + 0.6317i | 0.3411 + 0.8066i |
| 20 | 0.3324 + 1.2294i | 0.3300 + 1.0062i | 0.3879 + 1.4978i | 0.2451 + 0.8999i | 0.4353 + 0.5950i | 0.4122 + 0.7607i | 0.3109 + 0.5751i | 0.2807 + 0.7485i |
| 20.5 | 0.3324 + 1.2302i | 0.3334 + 1.0155i | 0.3846 + 1.4868i | 0.2478 + 0.9074i | 0.4435 + 0.6045i | 0.4193 + 0.7714i | 0.3125 + 0.5857i | 0.2831 + 0.7571i |
| 21 | 0.3284 + 1.2285i | 0.3320 + 1.0206i | 0.3786 + 1.4755i | 0.2471 + 0.9090i | 0.4494 + 0.6106i | 0.4225 + 0.7777i | 0.3144 + 0.5907i | 0.2838 + 0.7596i |
| 21.5 | 0.3217 + 1.2283i | 0.3261 + 1.0269i | 0.3716 + 1.4663i | 0.2470 + 0.9085i | 0.4549 + 0.6160i | 0.4247 + 0.7818i | 0.3170 + 0.5938i | 0.2850 + 0.7600i |
| 22 | 0.3100 + 1.2397i | 0.3058 + 1.0469i | 0.3607 + 1.4682i | 0.2567 + 0.9079i | 0.4631 + 0.6208i | 0.4319 + 0.7788i | 0.3205 + 0.5962i | 0.2904 + 0.7595i |
| 22.5 | 0.3044 + 1.2443i | 0.3002 + 1.0568i | 0.3505 + 1.4648i | 0.2617 + 0.9117i | 0.4705 + 0.6290i | 0.4380 + 0.7857i | 0.3259 + 0.6027i | 0.2955 + 0.7625i |
| 23 | 0.3452 + 1.1540i | 0.4129 + 0.9793i | 0.3125 + 1.3457i | 0.2563 + 0.9501i | 0.4782 + 0.6393i | 0.4531 + 0.8051i | 0.3394 + 0.6131i | 0.3093 + 0.7816i |
| 23.5 | 0.2993 + 1.2594i | 0.2906 + 1.0772i | 0.3403 + 1.4686i | 0.2690 + 0.9234i | 0.4846 + 0.6443i | 0.4495 + 0.7999i | 0.3381 + 0.6175i | 0.3079 + 0.7726i |
| 24 | 0.4884 + 1.4147i | 0.4408 + 0.9883i | 0.2990 + 1.3047i | 0.3098 + 1.1123i | 0.5034 + 0.6582i | 0.5007 + 0.8232i | 0.3521 + 0.6461i | 0.3534 + 0.7992i |
| 24.5 | 0.4818 + 1.4041i | 0.4361 + 0.9895i | 0.2934 + 1.3012i | 0.3024 + 1.1113i | 0.5119 + 0.6637i | 0.5063 + 0.8279i | 0.3591 + 0.6480i | 0.3581 + 0.8012i |
| 25 | 0.4778 + 1.3940i | 0.4318 + 0.9909i | 0.2896 + 1.2989i | 0.2959 + 1.1112i | 0.5190 + 0.6693i | 0.5110 + 0.8331i | 0.3652 + 0.6503i | 0.3620 + 0.8038i |
| 25.5 | 0.4747 + 1.3846i | 0.4279 + 0.9924i | 0.2865 + 1.2969i | 0.2905 + 1.1114i | 0.5249 + 0.6752i | 0.5140 + 0.8384i | 0.3704 + 0.6529i | 0.3647 + 0.8068i |
| 26 | 0.4711 + 1.3764i | 0.4242 + 0.9942i | 0.2836 + 1.2952i | 0.2860 + 1.1119i | 0.5308 + 0.6813i | 0.5155 + 0.8438i | 0.3755 + 0.6565i | 0.3664 + 0.8105i |

| SNR/w | w48 | w49 | w50 | w51 | w52 | w53 | w54 | w55 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i |
| 7 | 0.2569 + 0.4310i | 0.2569 + 0.4310i | 0.2569 + 0.4310i | 0.2569 + 0.4310i | 0.2569 + 0.4310i | 0.2569 + 0.4310i | 0.2569 + 0.4310i | 0.2569 + 0.4310i |
| 7.5 | 0.2521 + 0.4541i | 0.2153 + 0.3744i | 0.3279 + 1.2665i | 0.3690 + 1.7569i | 0.2521 + 0.4541i | 0.2521 + 0.4541i | 0.3162 + 1.1348i | 0.3279 + 1.2665i |
| 8 | 0.4131 + 0.2309i | 0.4131 + 0.2309i | 0.4131 + 0.2309i | 0.4923 + 0.2594i | 0.4131 + 0.2309i | 0.4131 + 0.2309i | 0.4131 + 0.2309i | 0.4923 + 0.2594i |
| 8.5 | 0.4147 + 0.2243i | 0.4147 + 0.2243i | 0.4147 + 0.2243i | 0.5023 + 0.2552i | 0.4147 + 0.2243i | 0.4147 + 0.2243i | 0.4147 + 0.2243i | 0.5023 + 0.2552i |
| 9 | 0.2776 + 0.2292i | 0.2776 + 0.2292i | 0.2776 + 0.2292i | 0.3356 + 0.2412i | 0.2776 + 0.2292i | 0.2776 + 0.2292i | 0.2776 + 0.2292i | 0.3356 + 0.2412i |
| 9.5 | 0.2749 + 0.2257i | 0.2749 + 0.2257i | 0.2749 + 0.2257i | 0.3444 + 0.2369i | 0.2749 + 0.2257i | 0.2749 + 0.2257i | 0.2749 + 0.2257i | 0.3444 + 0.2369i |
| 10 | 0.1705 − 0.3146i | 0.1705 − 0.3146i | 0.2169 − 0.6218i | 0.2169 − 0.6218i | 0.1705 − 0.3146i | 0.1705 − 0.3146i | 0.2169 − 0.6218i | 0.2169 − 0.6218i |
| 10.5 | 0.1640 − 0.3056i | 0.1640 − 0.3056i | 0.2071 − 0.6406i | 0.2071 − 0.6406i | 0.1640 − 0.3056i | 0.1640 − 0.3056i | 0.2071 − 0.6406i | 0.2071 − 0.6406i |
| 11 | 0.3012 + 0.1597i | 0.3012 + 0.1597i | 0.3012 + 0.1597i | 0.3012 + 0.1597i | 0.3012 + 0.1597i | 0.3012 + 0.1597i | 0.3012 + 0.1597i | 0.3012 + 0.1597i |
| 11.5 | 0.2975 + 0.1563i | 0.2975 + 0.1563i | 0.2975 + 0.1563i | 0.2975 + 0.1563i | 0.2975 + 0.1563i | 0.2975 + 0.1563i | 0.2975 + 0.1563i | 0.2975 + 0.1563i |
| 12 | 0.2707 + 0.1533i | 0.2707 + 0.1533i | 0.2707 + 0.1533i | 0.2707 + 0.1533i | 0.2707 + 0.1533i | 0.2707 + 0.1533i | 0.2707 + 0.1533i | 0.2707 + 0.1533i |
| 12.5 | 0.2453 + 0.1484i | 0.2453 + 0.1484i | 0.2453 + 0.1484i | 0.2453 + 0.1484i | 0.2453 + 0.1484i | 0.2453 + 0.1484i | 0.2453 + 0.1484i | 0.2453 + 0.1484i |
| 13 | 0.2294 + 0.1447i | 0.2294 + 0.1447i | 0.2294 + 0.1447i | 0.2294 + 0.1447i | 0.2294 + 0.1447i | 0.2294 + 0.1447i | 0.2294 + 0.1447i | 0.2294 + 0.1447i |
| 13.5 | 0.2219 + 0.1422i | 0.2219 + 0.1422i | 0.2219 + 0.1422i | 0.2219 + 0.1422i | 0.2219 + 0.1422i | 0.2219 + 0.1422i | 0.2219 + 0.1422i | 0.2219 + 0.1422i |
| 14 | 0.2185 + 0.1400i | 0.2185 + 0.1400i | 0.2185 + 0.1400i | 0.2185 + 0.1400i | 0.2185 + 0.1400i | 0.2185 + 0.1400i | 0.2185 + 0.1400i | 0.2185 + 0.1400i |
| 14.5 | 0.2118 + 0.1405i | 0.2118 + 0.1405i | 0.2118 + 0.1405i | 0.2118 + 0.1405i | 0.2118 + 0.1405i | 0.2118 + 0.1405i | 0.2118 + 0.1405i | 0.2118 + 0.1405i |
| 15 | 0.1241 + 0.1182i | 0.1241 + 0.1182i | 0.1241 + 0.1182i | 0.1241 + 0.1182i | 0.1177 + 0.3603i | 0.1177 + 0.3603i | 0.1177 + 0.3603i | 0.1177 + 0.3603i |

-continued

| | | | | | | | | |
|---|---|---|---|---|---|---|---|---|
| 15.5 | 0.1165 + 0.1237i | 0.1165 + 0.1237i | 0.1165 + 0.1237i | 0.1165 + 0.1237i | 0.1236 + 0.3719i | 0.1236 + 0.3719i | 0.1236 + 0.3719i | 0.1236 + 0.3719i |
| 16 | 0.1248 + 0.1142i | 0.1248 + 0.1142i | 0.1248 + 0.1142i | 0.1248 + 0.1142i | 0.1157 + 0.3557i | 0.1157 + 0.3557i | 0.1157 + 0.3557i | 0.1157 + 0.3557i |
| 16.5 | 0.1124 + 0.1192i | 0.1124 + 0.1192i | 0.1124 + 0.1192i | 0.1124 + 0.1192i | 0.1137 + 0.3677i | 0.1137 + 0.3677i | 0.1137 + 0.3677i | 0.1137 + 0.3677i |
| 17 | 0.1157 + 0.1157i | 0.1157 + 0.1157i | 0.1157 + 0.1157i | 0.1157 + 0.1157i | 0.1124 + 0.3586i | 0.1124 + 0.3586i | 0.1124 + 0.3586i | 0.1124 + 0.3586i |
| 17.5 | 0.1169 + 0.1143i | 0.1169 + 0.1143i | 0.1169 + 0.1143i | 0.1169 + 0.1143i | 0.1127 + 0.3556i | 0.1127 + 0.3556i | 0.1127 + 0.3556i | 0.1127 + 0.3556i |
| 18 | 0.1186 + 0.1103i | 0.1186 + 0.1103i | 0.1186 + 0.1103i | 0.1186 + 0.1103i | 0.1118 + 0.3737i | 0.1159 + 0.3162i | 0.1118 + 0.3737i | 0.1159 + 0.3162i |
| 18.5 | 0.1110 + 0.1041i | 0.1110 + 0.1041i | 0.1110 + 0.1041i | 0.1449 + 0.1242i | 0.1124 + 0.3777i | 0.1170 + 0.3077i | 0.1124 + 0.3777i | 0.1170 + 0.3077i |
| 19 | 0.0786 + 0.0928i | 0.0849 + 0.2753i | 0.0786 + 0.0928i | 0.0849 + 0.2753i | 0.1162 + 0.6316i | 0.0977 + 0.4554i | 0.1162 + 0.6316i | 0.0977 + 0.4554i |
| 19.5 | 0.0951 + 0.0766i | 0.0997 + 0.2139i | 0.0951 + 0.0766i | 0.0997 + 0.2139i | 0.0760 + 0.5036i | 0.1097 + 0.3621i | 0.1642 + 0.4957i | 0.1097 + 0.3621i |
| 20 | 0.0712 + 0.1087i | 0.0712 + 0.1087i | 0.2053 + 0.1104i | 0.2053 + 0.1104i | 0.0715 + 0.3878i | 0.0710 + 0.2879i | 0.1957 + 0.3967i | 0.2012 + 0.2903i |
| 20.5 | 0.0696 + 0.0636i | 0.0695 + 0.1639i | 0.2051 + 0.0633i | 0.2044 + 0.1665i | 0.0700 + 0.4057i | 0.0696 + 0.2929i | 0.1995 + 0.4139i | 0.2029 + 0.2955i |
| 21 | 0.0696 + 0.0610i | 0.0696 + 0.1698i | 0.2077 + 0.0610i | 0.2073 + 0.1721i | 0.0698 + 0.4114i | 0.0697 + 0.2939i | 0.2034 + 0.4201i | 0.2063 + 0.2971i |
| 21.5 | 0.0707 + 0.0595i | 0.0706 + 0.1722i | 0.2119 + 0.0599i | 0.2114 + 0.1748i | 0.0701 + 0.4134i | 0.0705 + 0.2935i | 0.2066 + 0.4231i | 0.2100 + 0.2979i |
| 22 | 0.0723 + 0.0588i | 0.0719 + 0.1737i | 0.2166 + 0.0598i | 0.2155 + 0.1775i | 0.0704 + 0.4157i | 0.0713 + 0.2939i | 0.2086 + 0.4265i | 0.2132 + 0.3001i |
| 22.5 | 0.0730 + 0.0592i | 0.0727 + 0.1768i | 0.2188 + 0.0604i | 0.2178 + 0.1809i | 0.0710 + 0.4212i | 0.0721 + 0.2976i | 0.2107 + 0.4330i | 0.2155 + 0.3047i |
| 23 | 0.0720 + 0.0615i | 0.0717 + 0.1851i | 0.2162 + 0.0625i | 0.2153 + 0.1881i | 0.0692 + 0.4430i | 0.0709 + 0.3116i | 0.2088 + 0.4508i | 0.2131 + 0.3169i |
| 23.5 | 0.0735 + 0.0614i | 0.0734 + 0.1846i | 0.2204 + 0.0628i | 0.2198 + 0.1888i | 0.0720 + 0.4369i | 0.0730 + 0.3094i | 0.2145 + 0.4495i | 0.2184 + 0.3170i |
| 24 | 0.0668 + 0.0698i | 0.0669 + 0.2101i | 0.2012 + 0.0697i | 0.2017 + 0.2100i | 0.0675 + 0.5006i | 0.0672 + 0.3530i | 0.2047 + 0.4981i | 0.2028 + 0.3524i |
| 24.5 | 0.0679 + 0.0704i | 0.0679 + 0.2120i | 0.2045 + 0.0702i | 0.2048 + 0.2113i | 0.0689 + 0.5043i | 0.0683 + 0.3561i | 0.2088 + 0.4995i | 0.2060 + 0.3542i |
| 25 | 0.0687 + 0.0711i | 0.0686 + 0.2143i | 0.2073 + 0.0705i | 0.2070 + 0.2122i | 0.0701 + 0.5091i | 0.0690 + 0.3598i | 0.2121 + 0.5000i | 0.2083 + 0.3552i |
| 25.5 | 0.0699 + 0.0718i | 0.0690 + 0.2167i | 0.2111 + 0.0703i | 0.2080 + 0.2118i | 0.0711 + 0.5149i | 0.0694 + 0.3642i | 0.2146 + 0.4990i | 0.2095 + 0.3547i |
| 26 | 0.0711 + 0.0728i | 0.0687 + 0.2202i | 0.2153 + 0.0697i | 0.2074 + 0.2103i | 0.0722 + 0.5215i | 0.0699 + 0.3698i | 0.2171 + 0.4970i | 0.2104 + 0.3528i |

| SNR/w | w56 | w57 | w58 | w59 | w60 | w61 | w62 | w63 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i | 0.2626 + 0.4588i |
| 7 | 0.2569 + 0.4310i | 0.2569 + 0.4310i | 0.2569 + 0.4310i | 0.2569 + 0.4310i | 0.2569 + 0.4310i | 0.2569 + 0.4310i | 0.2569 + 0.4310i | 0.2569 + 0.4310i |
| 7.5 | 0.4541 + 0.2521i | 0.3744 + 0.2153i | 1.2665 + 0.3279i | 1.7569 + 0.3690i | 0.4541 + 0.2521i | 0.4541 + 0.2521i | 1.1348 + 0.3162i | 1.2665 + 0.3279i |
| 8 | 0.4131 + 0.2309i | 0.4923 + 0.2594i | 0.4923 + 0.2594i | 0.4923 + 0.2594i | 0.4131 + 0.2309i | 0.4923 + 0.2594i | 0.4923 + 0.2594i | 0.4923 + 0.2594i |
| 8.5 | 0.4147 + 0.2243i | 0.5023 + 0.2552i | 0.5023 + 0.2552i | 0.5023 + 0.2552i | 0.4147 + 0.2243i | 0.5023 + 0.2552i | 0.5023 + 0.2552i | 0.5023 + 0.2552i |
| 9 | 0.2776 + 0.2292i | 0.2776 + 0.2292i | 0.2776 + 0.2292i | 0.3356 + 0.2412i | 0.2776 + 0.2292i | 0.2776 + 0.2292i | 0.2776 + 0.2292i | 0.3356 + 0.2412i |
| 9.5 | 0.2749 + 0.2257i | 0.2749 + 0.2257i | 0.2749 + 0.2257i | 0.3444 + 0.2369i | 0.2749 + 0.2257i | 0.2749 + 0.2257i | 0.2749 + 0.2257i | 0.3444 + 0.2369i |
| 10 | 0.1705 − 0.3146i | 0.1705 − 0.3146i | 0.3158 − 0.5800i | 0.3158 − 0.5800i | 0.1705 − 0.3146i | 0.1705 − 0.3146i | 0.3158 − 0.5800i | 0.3158 − 0.5800i |
| 10.5 | 0.1640 − 0.3056i | 0.1640 − 0.3056i | 0.3251 − 0.5895i | 0.3251 − 0.5895i | 0.1640 − 0.3056i | 0.1640 − 0.3056i | 0.3251 − 0.5895i | 0.3251 − 0.5895i |
| 11 | 0.6554 + 0.1969i | 0.6554 + 0.1969i | 0.6554 + 0.1969i | 0.6554 + 0.1969i | 0.5954 + 0.3347i | 0.5954 + 0.3347i | 0.5954 + 0.3347i | 0.5954 + 0.3347i |
| 11.5 | 0.6652 + 0.1867i | 0.6652 + 0.1867i | 0.6652 + 0.1867i | 0.6652 + 0.1867i | 0.5982 + 0.3424i | 0.5982 + 0.3424i | 0.5982 + 0.3424i | 0.5982 + 0.3424i |
| 12 | 0.6459 + 0.1725i | 0.6459 + 0.1725i | 0.6459 + 0.1725i | 0.6459 + 0.1725i | 0.5863 + 0.3220i | 0.5863 + 0.3220i | 0.5863 + 0.3220i | 0.5863 + 0.3220i |
| 12.5 | 0.6281 + 0.1582i | 0.6281 + 0.1582i | 0.6281 + 0.1582i | 0.6281 + 0.1582i | 0.5785 + 0.3055i | 0.5785 + 0.3055i | 0.5785 + 0.3055i | 0.5785 + 0.3055i |

-continued

| | | | | | | | | |
|---|---|---|---|---|---|---|---|---|
| 13 | 0.6132 + 0.1477i | 0.6132 + 0.1477i | 0.6132 + 0.1477i | 0.6132 + 0.1477i | 0.5707 + 0.2977i | 0.5707 + 0.2977i | 0.5707 + 0.2977i | 0.5707 + 0.2977i |
| 13.5 | 0.6060 + 0.1399i | 0.6060 + 0.1399i | 0.6060 + 0.1399i | 0.6060 + 0.1399i | 0.5660 + 0.3001i | 0.5660 + 0.3001i | 0.5660 + 0.3001i | 0.5660 + 0.3001i |
| 14 | 0.6035 + 0.1350i | 0.6035 + 0.1350i | 0.6035 + 0.1350i | 0.6035 + 0.1350i | 0.5609 + 0.3115i | 0.5609 + 0.3115i | 0.5609 + 0.3115i | 0.5609 + 0.3115i |
| 14.5 | 0.5956 + 0.1287i | 0.5956 + 0.1287i | 0.5956 + 0.1287i | 0.5956 + 0.1287i | 0.5560 + 0.3155i | 0.5560 + 0.3155i | 0.5560 + 0.3155i | 0.5560 + 0.3155i |
| 15 | 0.3683 + 0.1249i | 0.3683 + 0.1249i | 0.3683 + 0.1249i | 0.3683 + 0.1249i | 0.3492 + 0.3785i | 0.3492 + 0.3785i | 0.3492 + 0.3785i | 0.3492 + 0.3785i |
| 15.5 | 0.3594 + 0.1163i | 0.3594 + 0.1163i | 0.3594 + 0.1163i | 0.3594 + 0.1163i | 0.3789 + 0.3524i | 0.3789 + 0.3524i | 0.3789 + 0.3524i | 0.3789 + 0.3524i |
| 16 | 0.3766 + 0.1242i | 0.3766 + 0.1242i | 0.3766 + 0.1242i | 0.3766 + 0.1242i | 0.3539 + 0.3781i | 0.3539 + 0.3781i | 0.3539 + 0.3781i | 0.3539 + 0.3781i |
| 16.5 | 0.3481 + 0.1150i | 0.3481 + 0.1150i | 0.3481 + 0.1150i | 0.3481 + 0.1150i | 0.3549 + 0.3594i | 0.3549 + 0.3594i | 0.3549 + 0.3594i | 0.3549 + 0.3594i |
| 17 | 0.3547 + 0.1184i | 0.3547 + 0.1184i | 0.3547 + 0.1184i | 0.3547 + 0.1184i | 0.3538 + 0.3623i | 0.3538 + 0.3623i | 0.3538 + 0.3623i | 0.3538 + 0.3623i |
| 17.5 | 0.3583 + 0.1186i | 0.3583 + 0.1186i | 0.3583 + 0.1186i | 0.3583 + 0.1186i | 0.3554 + 0.3620i | 0.3554 + 0.3620i | 0.3554 + 0.3620i | 0.3554 + 0.3620i |
| 18 | 0.4012 + 0.1159i | 0.4012 + 0.1159i | 0.3338 + 0.1122i | 0.3338 + 0.1122i | 0.3941 + 0.3525i | 0.3941 + 0.3525i | 0.3224 + 0.3797i | 0.3242 + 0.3257i |
| 18.5 | 0.4150 + 0.1158i | 0.4150 + 0.1158i | 0.3282 + 0.1112i | 0.3282 + 0.1112i | 0.4055 + 0.3867i | 0.4070 + 0.3192i | 0.3165 + 0.3859i | 0.3192 + 0.3168i |
| 19 | 0.2391 + 0.0872i | 0.2587 + 0.2558i | 0.2391 + 0.0872i | 0.2587 + 0.2558i | 0.3841 + 0.5754i | 0.2966 + 0.4248i | 0.3139 + 0.6000i | 0.2966 + 0.4248i |
| 19.5 | 0.3357 + 0.0722i | 0.3554 + 0.1787i | 0.2645 + 0.0759i | 0.2773 + 0.1974i | 0.4211 + 0.4555i | 0.3908 + 0.3235i | 0.3141 + 0.4762i | 0.2975 + 0.3417i |
| 20 | 0.4915 + 0.0675i | 0.4864 + 0.1749i | 0.3507 + 0.0674i | 0.3479 + 0.1618i | 0.4601 + 0.4402i | 0.4756 + 0.3132i | 0.3316 + 0.4177i | 0.3417 + 0.2995i |
| 20.5 | 0.4886 + 0.0646i | 0.4846 + 0.1827i | 0.3469 + 0.0633i | 0.3450 + 0.1729i | 0.4639 + 0.4505i | 0.4766 + 0.3165i | 0.3324 + 0.4313i | 0.3406 + 0.3039i |
| 21 | 0.4930 + 0.0636i | 0.4893 + 0.1869i | 0.3495 + 0.0617i | 0.3478 + 0.1777i | 0.4697 + 0.4569i | 0.4820 + 0.3193i | 0.3355 + 0.4373i | 0.3439 + 0.3060i |
| 21.5 | 0.5002 + 0.0638i | 0.4966 + 0.1905i | 0.3552 + 0.0612i | 0.3533 + 0.1810i | 0.4764 + 0.4630i | 0.4895 + 0.3231i | 0.3397 + 0.4416i | 0.3490 + 0.3083i |
| 22 | 0.5063 + 0.0651i | 0.5034 + 0.1956i | 0.3611 + 0.0619i | 0.3592 + 0.1852i | 0.4850 + 0.4713i | 0.4975 + 0.3302i | 0.3439 + 0.4470i | 0.3544 + 0.3131i |
| 22.5 | 0.5098 + 0.0662i | 0.5076 + 0.1992i | 0.3641 + 0.0628i | 0.3625 + 0.1888i | 0.4912 + 0.4790i | 0.5027 + 0.3358i | 0.3482 + 0.4545i | 0.3582 + 0.3185i |
| 23 | 0.5089 + 0.0667i | 0.5074 + 0.2012i | 0.3614 + 0.0643i | 0.3600 + 0.1938i | 0.4951 + 0.4835i | 0.5034 + 0.3391i | 0.3505 + 0.4649i | 0.3566 + 0.3265i |
| 23.5 | 0.5134 + 0.0686i | 0.5133 + 0.2063i | 0.3668 + 0.0653i | 0.3660 + 0.1965i | 0.5011 + 0.4924i | 0.5105 + 0.3465i | 0.3558 + 0.4698i | 0.3634 + 0.3304i |
| 24 | 0.4796 + 0.0697i | 0.4800 + 0.2104i | 0.3382 + 0.0697i | 0.3390 + 0.2100i | 0.4925 + 0.5035i | 0.4833 + 0.3548i | 0.3463 + 0.4979i | 0.3414 + 0.3526i |
| 24.5 | 0.4861 + 0.0706i | 0.4859 + 0.2131i | 0.3435 + 0.0702i | 0.3439 + 0.2114i | 0.5003 + 0.5082i | 0.4895 + 0.3586i | 0.3523 + 0.4998i | 0.3464 + 0.3545i |
| 25 | 0.4922 + 0.0714i | 0.4900 + 0.2154i | 0.3482 + 0.0705i | 0.3474 + 0.2123i | 0.5068 + 0.5129i | 0.4941 + 0.3621i | 0.3574 + 0.5015i | 0.3500 + 0.3558i |
| 25.5 | 0.5014 + 0.0721i | 0.4909 + 0.2174i | 0.3548 + 0.0706i | 0.3488 + 0.2127i | 0.5120 + 0.5180i | 0.4965 + 0.3657i | 0.3613 + 0.5034i | 0.3518 + 0.3569i |
| 26 | 0.5101 + 0.0730i | 0.4897 + 0.2198i | 0.3616 + 0.0709i | 0.3479 + 0.2135i | 0.5175 + 0.5233i | 0.4992 + 0.3698i | 0.3655 + 0.5062i | 0.3537 + 0.3587i |

l2) 1kQQAM with max. penalty=0.01 b/s/Hz—AWGN channel

| SNR/w | w0 | w1 | w2 | w3 | w4 | w5 | w6 | w7 |
|---|---|---|---|---|---|---|---|---|
| 7 | 1.2470 + 1.8367i | 0.6413 + 1.1550i | 0.4280 + 2.1615i | 0.3707 + 1.2911i | 0.6413 + 1.1550i | 0.6413 + 1.1550i | 0.3707 + 1.2911i | 0.3707 + 1.2911i |
| 7.5 | 1.2147 + 1.7841i | 0.9775 + 1.4975i | 0.4075 + 2.1185i | 0.3773 + 1.7335i | 0.6538 + 1.1143i | 0.6538 + 1.1143i | 0.3292 + 1.2581i | 0.3292 + 1.2581i |
| 8 | 0.3978 + 2.0885i | 0.3528 + 1.7466i | 0.3348 + 1.5547i | 0.3348 + 1.5547i | 1.1912 + 1.7585i | 0.9886 + 1.4907i | 0.8710 + 1.3458i | 0.8710 + 1.3458i |
| 8.5 | 0.3944 + 2.0732i | 0.3300 + 1.6702i | 0.3300 + 1.6702i | 0.3149 + 1.5557i | 1.1771 + 1.7502i | 0.9462 + 1.4268i | 0.9462 + 1.4268i | 0.8771 + 1.3353i |
| 9 | 2.0688 + 0.3931i | 1.4568 + 0.2962i | 1.4568 + 0.2962i | 1.4568 + 0.2962i | 1.4568 + 0.2962i | 1.4568 + 0.2962i | 1.4568 + 0.2962i | 1.3541 + 0.2851i |
| 9.5 | 2.0659 + 0.4001i | 1.4703 + 0.2931i | 1.4703 + 0.2931i | 1.4703 + 0.2931i | 1.4703 + 0.2931i | 1.4703 + 0.2931i | 1.4703 + 0.2931i | 1.3831 + 0.2804i |
| 10 | 2.0614 + 0.4082i | 1.4563 + 0.2877i | 1.4563 + 0.2877i | 1.4563 + 0.2877i | 1.4563 + 0.2877i | 1.4563 + 0.2877i | 1.4563 + 0.2877i | 1.4563 + 0.2877i |
| 10.5 | 2.0377 + 0.5960i | 1.4217 + 0.2779i | 1.8845 + 0.2992i | 1.4217 + 0.2779i | 1.5221 + 0.3248i | 1.4217 + 0.2779i | 1.5822 + 0.2893i | 1.4217 + 0.2779i |

-continued

| | | | | | | | | |
|---|---|---|---|---|---|---|---|---|
| 11 | 2.0390 + 0.5892i | 1.9449 + 0.98291 | 2.1322 + 0.2257i | 1.6928 + 1.3984i | 0.6643 + 1.9775i | 0.9378 + 1.8902i | 0.2768 + 2.1985i | 1.3588 + 1.7046i |
| 11.5 | 2.0197 + 0.5915i | 1.9273 + 0.97381 | 2.1141 + 0.2170i | 1.6778 + 1.3854i | 0.6565 + 1.9726i | 0.9379 + 1.8778i | 0.2618 + 2.1756i | 1.3509 + 1.6828i |
| 12 | 1.9956 + 0.5790i | 1.9068 + 0.93281 | 2.0896 + 0.2054i | 1.6925 + 1.3344i | 0.6557 + 1.9767i | 0.9827 + 1.8677i | 0.2501 + 2.1554i | 1.3795 + 1.6301i |
| 12.5 | 2.1158 + 0.2551i | 1.9736 + 0.7598i | 1.2067 + 1.7622i | 1.7509 + 1.2633i | 0.4937 + 1.4624i | 0.4937 + 1.4624i | 0.5747 + 1.5292i | 0.4937 + 1.4624i |
| 13 | 1.1348 + 1.8042i | 1.5056 + 1.4947i | 1.8256 + 0.9213i | 1.6326 + 1.1112i | 1.6260 + 0.1296i | 1.6260 + 0.1296i | 2.0062 + 0.5266i | 2.0128 + 0.1983i |
| 13.5 | 2.1871 + 0.3000i | 1.8533 + 0.9857i | 1.1098 + 1.7333i | 1.5930 + 1.5042i | 0.5632 + 1.4003i | 0.5632 + 1.4003i | 0.6814 + 1.4935i | 0.5632 + 1.4003i |
| 14 | 1.2483 + 1.5217i | 0.1461 + 1.4775i | 1.0118 + 1.6410i | 0.7721 + 1.8992i | 0.5100 + 1.3662i | 0.5100 + 1.3662i | 0.6306 + 1.4306i | 0.6306 + 1.4306i |
| 14.5 | 1.3062 + 1.5059i | 0.1503 + 1.4749i | 1.0464 + 1.6055i | 0.8162 + 1.8855i | 0.5193 + 1.3304i | 0.4552 + 1.3948i | 0.7020 + 1.4249i | 0.6369 + 1.4730i |
| 15 | 1.4903 + 1.1383i | 0.9110 + 1.4937i | 1.4109 + 1.4171i | 1.1243 + 1.6910i | 1.0600 + 1.1063i | 0.9502 + 1.2140i | 1.0600 + 1.1063i | 0.9559 + 1.1435i |
| 15.5 | 1.3441 + 1.0864i | 1.6500 + 1.0447i | 1.3102 + 1.2118i | 1.5763 + 1.4126i | 0.9974 + 1.0754i | 0.9256 + 1.0475i | 0.9974 + 1.0754i | 0.9256 + 1.0475i |
| 16 | 1.3350 + 1.1084i | 1.4475 + 0.9747i | 1.5607 + 1.3993i | 1.7541 + 1.0489i | 1.0500 + 0.9792i | 1.0135 + 0.9798i | 0.9572 + 0.9530i | 0.9572 + 0.9530i |
| 16.5 | 1.2147 + 1.5219i | 1.5401 + 1.3313i | 1.1978 + 1.2058i | 1.2559 + 1.1577i | 1.8450 + 0.9334i | 1.5494 + 0.9965i | 1.1978 + 0.9549i | 1.2537 + 0.9642i |
| 17 | 1.2118 + 1.5215i | 1.5329 + 1.3209i | 1.1917 + 1.2081i | 1.2568 + 1.1617i | 1.8374 + 0.9409i | 1.5357 + 0.9911i | 1.1881 + 0.9512i | 1.2485 + 0.9597i |
| 17.5 | 1.2108 + 1.5244i | 1.5290 + 1.3088i | 1.1858 + 1.2120i | 1.2645 + 1.1672i | 1.8238 + 0.9430i | 1.5237 + 0.9832i | 1.1800 + 0.9524i | 1.2475 + 0.9593i |
| 18 | 1.2082 + 1.5168i | 1.5240 + 1.3020i | 1.1811 + 1.2092i | 1.2761 + 1.1672i | 1.8137 + 0.9371i | 1.5194 + 0.9786i | 1.1750 + 0.9549i | 1.2506 + 0.9591i |
| 18.5 | 1.7580 + 0.8556i | 1.4723 + 0.8642i | 1.6081 + 1.1548i | 1.3616 + 0.9559i | 1.6322 + 0.6294i | 1.4250 + 0.6945i | 1.1917 + 0.7017i | 1.2482 + 0.7340i |
| 19 | 1.7624 + 0.8434i | 1.4961 + 0.8499i | 1.5901 + 1.1466i | 1.3710 + 0.9545i | 1.6320 + 0.6089i | 1.4335 + 0.6810i | 1.2009 + 0.7014i | 1.2596 + 0.7328i |
| 19.5 | 1.7721 + 0.9602i | 1.5439 + 0.8692i | 1.5357 + 1.2087i | 1.3865 + 0.9588i | 1.4330 + 0.5782i | 1.4962 + 0.6937i | 1.2677 + 0.6543i | 1.2934 + 0.7411i |
| 20 | 1.1090 + 1.6424i | 1.3041 + 1.4291i | 0.8414 + 1.7420i | 1.0620 + 1.3420i | 1.3469 + 1.1420i | 1.6140 + 1.1270i | 1.1259 + 1.0802i | 1.0687 + 1.1589i |
| 20.5 | 1.5361 + 1.2929i | 1.7337 + 0.8357i | 1.2780 + 1.4499i | 1.2622 + 1.2031i | 1.4523 + 0.7959i | 1.5055 + 0.9923i | 1.2671 + 0.8392i | 1.2824 + 1.0044i |
| 21 | 1.1920 + 1.4825i | 1.1801 + 1.2582i | 1.4681 + 1.3237i | 1.1055 + 1.1254i | 1.5435 + 0.9938i | 1.3407 + 1.0511i | 1.1841 + 0.8772i | 1.1708 + 0.9914i |
| 21.5 | 1.3352 + 1.3968i | 1.5544 + 1.1632i | 1.1041 + 1.4991i | 1.0921 + 1.2512i | 1.3845 + 0.9402i | 1.3310 + 1.1297i | 1.2245 + 0.9236i | 1.1581 + 1.0783i |
| 22 | 1.1448 + 1.4301i | 1.2314 + 1.2283i | 1.3851 + 1.4301i | 1.1791 + 1.0727i | 1.5570 + 0.9357i | 1.4463 + 1.1297i | 1.3343 + 0.9131i | 1.1627 + 0.9172i |
| 22.5 | 1.3571 + 1.4599i | 1.6063 + 1.1774i | 1.1068 + 1.5873i | 1.2491 + 1.2384i | 1.5617 + 0.8881i | 1.4366 + 1.0501i | 1.2716 + 0.8875i | 1.2361 + 1.0472i |
| 23 | 1.2474 + 1.3969i | 1.4038 + 1.1579i | 1.0418 + 1.5521i | 1.2120 + 1.1649i | 1.3678 + 0.8860i | 1.5336 + 0.9857i | 1.2086 + 0.8597i | 1.2130 + 1.0083i |
| 23.5 | 1.3740 + 1.3412i | 1.5419 + 1.1137i | 1.0721 + 1.4824i | 1.1453 + 1.2860i | 1.3865 + 0.9633i | 1.3170 + 1.1167i | 1.1954 + 0.9088i | 1.1762 + 1.0540i |
| 24 | 1.3790 + 1.2726i | 1.2140 + 1.1908i | 1.1518 + 1.3905i | 1.5627 + 1.0245i | 1.3824 + 0.8840i | 1.3211 + 1.0410i | 1.1686 + 0.8903i | 1.1570 + 1.0107i |
| 24.5 | 1.2961 + 1.3306i | 1.5578 + 1.0359i | 0.8364 + 1.6008i | 1.1053 + 1.2451i | 1.3744 + 0.9233i | 1.3731 + 1.1025i | 1.2130 + 0.9446i | 1.2096 + 1.1104i |
| 25 | 1.2369 + 1.3509i | 1.5739 + 0.9502i | 0.8752 + 1.5743i | 1.0781 + 1.2268i | 1.3726 + 1.0001i | 1.3629 + 1.1723i | 1.2107 + 0.9621i | 1.1961 + 1.1184i |
| 25.5 | 1.1981 + 1.3312i | 1.4448 + 1.0547i | 1.0785 + 1.4777i | 1.3216 + 0.9567i | 1.5082 + 0.8231i | 1.2653 + 1.1488i | 1.1548 + 0.9162i | 1.1687 + 1.0355i |
| 26 | 1.3600 + 1.2363i | 1.4725 + 1.0370i | 0.8236 + 1.5404i | 1.1012 + 1.2158i | 1.3405 + 0.9099i | 1.2954 + 1.0600i | 1.2050 + 0.8913i | 1.1575 + 1.0871i |
| 26.5 | 1.2790 + 1.2022i | 1.4224 + 1.0247i | 0.8336 + 1.4661i | 1.1191 + 1.1349i | 1.3645 + 0.8540i | 1.2671 + 1.0236i | 1.2289 + 0.8713i | 1.1326 + 0.9925i |
| 27 | 1.3272 + 1.2196i | 1.3559 + 1.0732i | 1.0028 + 1.3882i | 1.0375 + 1.2417i | 1.4394 + 0.9027i | 1.0528 + 1.0954i | 1.2910 + 0.9298i | 1.1738 + 1.1370i |
| 27.5 | 1.2847 + 1.1501i | 1.3344 + 1.0100i | 0.9562 + 1.3726i | 0.9853 + 1.2319i | 1.5330 + 0.7517i | 1.0098 + 1.0854i | 1.1767 + 0.9824i | 1.1243 + 1.1021i |
| 28 | 1.2471 + 1.1326i | 1.3598 + 1.0114i | 0.9946 + 1.3891i | 1.0600 + 1.1563i | 1.4990 + 0.7151i | 1.0049 + 1.0334i | 1.2249 + 0.9302i | 1.1234 + 1.0412i |

| SNR/w | w8 | w9 | w10 | w11 | w12 | w13 | w14 | w15 |
|---|---|---|---|---|---|---|---|---|
| 7 | 0.6413 + 1.1550i | 0.6413 + 1.1550i | 0.3707 + 1.2911i | 0.3707 + 1.2911i | 0.6413 + 1.1550i | 0.5789 + 1.0674i | 0.3707 + 1.2911i | 0.3565 + 1.1738i |
| 7.5 | 0.6538 + 1.1143i | 0.6538 + 1.1143i | 0.3292 + 1.2581i | 0.3292 + 1.2581i | 0.6538 + 1.1143i | 0.6538 + 1.1143i | 0.3292 + 1.2581i | 0.3292 + 1.2581i |
| 8 | 0.3053 + 1.2660i | 0.3053 + 1.2660i | 0.3053 + 1.2660i | 0.3053 + 1.2660i | 0.6782 + 1.1122i | 0.6782 + 1.1122i | 0.6782 + 1.1122i | 0.6782 + 1.1122i |

-continued

| | | | | | | | | |
|---|---|---|---|---|---|---|---|---|
| 8.5 | 0.2766 + 1.1195i | 0.2766 + 1.1195i | 0.2766 + 1.1195i | 0.2766 + 1.1195i | 0.5908 + 0.9851i | 0.5908 + 0.9851i | 0.5908 + 0.9851i | 0.5908 + 0.9851i |
| 9 | 1.4568 + 0.2962i | 1.4568 + 0.2962i | 1.4568 + 0.2962i | 1.3541 + 0.2851i | 1.4568 + 0.2962i | 1.3541 + 0.2851i | 1.3541 + 0.2851i | 1.3541 + 0.2851i |
| 9.5 | 1.4703 + 0.2931i | 1.4703 + 0.2931i | 1.4703 + 0.2931i | 1.3831 + 0.2804i | 1.4703 + 0.2931i | 1.3831 + 0.2804i | 1.3831 + 0.2804i | 1.3831 + 0.2804i |
| 10 | 1.4563 + 0.2877i | 1.4563 + 0.2877i | 1.4563 + 0.2877i | 1.4563 + 0.2877i | 1.4563 + 0.2877i | 1.4563 + 0.2877i | 1.4563 + 0.2877i | 1.3798 + 0.2727i |
| 10.5 | 1.4217 + 0.2779i | 1.4217 + 0.2779i | 1.4217 + 0.2779i | 1.4217 + 0.2779i | 1.4217 + 0.2779i | 1.4217 + 0.2779i | 1.4217 + 0.2779i | 1.4217 + 0.2779i |
| 11 | 0.2573 + 1.5147i | 0.2573 + 1.5147i | 0.2573 + 1.5147i | 0.2573 + 1.5147i | 0.3240 + 1.5996i | 0.2573 + 1.5147i | 0.2481 + 1.6183i | 0.2573 + 1.5147i |
| 11.5 | 0.2664 + 1.5304i | 0.2664 + 1.5304i | 0.2664 + 1.5304i | 0.2664 + 1.5304i | 0.2664 + 1.5304i | 0.2664 + 1.5304i | 0.2664 + 1.5304i | 0.2664 + 1.5304i |
| 12 | 0.2671 + 1.5243i | 0.2671 + 1.5243i | 0.2671 + 1.5243i | 0.2671 + 1.5243i | 0.2671 + 1.5243i | 0.2671 + 1.5243i | 0.2671 + 1.5243i | 0.2671 + 1.5243i |
| 12.5 | 0.1264 + 1.6986i | 0.1264 + 1.6986i | 0.7712 + 2.0048i | 0.2871 + 2.1268i | 0.3253 + 1.5363i | 0.3253 + 1.5363i | 0.5747 + 1.5292i | 0.4937 + 1.4624i |
| 13 | 1.3969 + 0.5361i | 1.3969 + 0.5361i | 1.4570 + 0.6375i | 1.4570 + 0.6375i | 1.4954 + 0.3520i | 1.4954 + 0.3520i | 1.4964 + 0.4880i | 1.4964 + 0.4880i |
| 13.5 | 0.1150 + 1.6214i | 0.1150 + 1.6214i | 0.7071 + 2.0121i | 0.2331 + 2.0568i | 0.3267 + 1.5289i | 0.3267 + 1.5289i | 0.5457 + 1.6384i | 0.4754 + 1.5699i |
| 14 | 0.1408 + 1.5802i | 0.1408 + 1.5802i | 0.1917 + 2.0093i | 0.4128 + 1.8626i | 0.5100 + 1.3662i | 0.4232 + 1.4126i | 0.5100 + 1.3662i | 0.5277 + 1.4369i |
| 14.5 | 0.1282 + 1.6465i | 0.1597 + 1.5527i | 0.1959 + 2.0115i | 0.4545 + 1.8615i | 0.5193 + 1.3304i | 0.4552 + 1.3948i | 0.5932 + 1.3889i | 0.5460 + 1.4894i |
| 15 | 0.1724 + 2.0081i | 0.7788 + 1.5257i | 0.5016 + 1.9561i | 0.7186 + 1.7492i | 0.8942 + 1.0696i | 0.8665 + 1.1704i | 0.8942 + 1.0696i | 0.8942 + 1.0696i |
| 15.5 | 1.0823 + 1.6174i | 0.7196 + 1.5112i | 0.8215 + 1.8773i | 0.6957 + 1.5465i | 0.9178 + 1.2561i | 0.8143 + 1.2765i | 0.9178 + 1.2561i | 0.8143 + 1.2765i |
| 16 | 1.1791 + 1.3117i | 0.9549 + 1.3540i | 1.1769 + 1.6347i | 0.9200 + 1.4356i | 0.9718 + 1.0622i | 0.9278 + 1.1107i | 0.9134 + 1.0069i | 0.8947 + 1.0639i |
| 16.5 | 0.9383 + 1.3523i | 0.8697 + 1.2142i | 0.9874 + 1.2241i | 0.9264 + 1.1757i | 0.8889 + 0.9443i | 0.8889 + 0.9443i | 0.9490 + 0.9550i | 0.9490 + 0.9550i |
| 17 | 0.9377 + 1.3662i | 0.8598 + 1.2150i | 0.9907 + 1.2238i | 0.9170 + 1.1772i | 0.8857 + 0.9407i | 0.8857 + 0.9407i | 0.9605 + 0.9419i | 0.9339 + 0.9669i |
| 17.5 | 0.9391 + 1.3812i | 0.8495 + 1.2161i | 0.9970 + 1.2255i | 0.9056 + 1.1802i | 0.8919 + 0.9238i | 0.8751 + 0.9580i | 0.9650 + 0.9445i | 0.9298 + 0.9718i |
| 18 | 0.9438 + 1.3828i | 0.8433 + 1.2138i | 1.0046 + 1.2199i | 0.8973 + 1.1788i | 0.8923 + 0.9236i | 0.8728 + 0.9592i | 0.9729 + 0.9487i | 0.9271 + 0.9762i |
| 18.5 | 1.1693 + 1.2798i | 1.1128 + 1.0938i | 1.3758 + 1.3185i | 1.1973 + 1.0256i | 0.9845 + 0.7965i | 1.0167 + 0.8742i | 1.0414 + 0.7718i | 1.0742 + 0.8464i |
| 19 | 1.1743 + 1.2715i | 1.1163 + 1.0948i | 1.3788 + 1.3352i | 1.2168 + 1.0183i | 0.9937 + 0.7969i | 1.0293 + 0.8865i | 1.0541 + 0.7706i | 1.0917 + 0.8547i |
| 19.5 | 1.2327 + 1.2807i | 1.1357 + 1.0702i | 1.2398 + 1.5594i | 1.2320 + 0.9996i | 1.0121 + 0.7959i | 1.0506 + 0.8804i | 1.0895 + 0.7549i | 1.1392 + 0.8268i |
| 20 | 0.6577 + 1.4430i | 0.7012 + 1.2781i | 0.8212 + 1.5008i | 0.8660 + 1.3198i | 0.8139 + 1.0062i | 0.7661 + 1.1278i | 0.8943 + 1.0255i | 0.8877 + 1.1417i |
| 20.5 | 0.9929 + 1.4515i | 0.9693 + 1.2162i | 0.9174 + 1.6990i | 1.0885 + 1.1841i | 0.9646 + 0.8840i | 0.9671 + 1.0103i | 1.0896 + 0.8706i | 1.0906 + 1.0064i |
| 21 | 0.9434 + 1.4728i | 0.9500 + 1.2899i | 0.9423 + 1.7074i | 0.9504 + 1.1268i | 0.9076 + 0.8486i | 0.8989 + 0.9010i | 1.0276 + 0.8623i | 0.9660 + 0.9752i |
| 21.5 | 0.8934 + 1.0735i | 0.8717 + 1.1114i | 0.9076 + 1.4446i | 0.9079 + 1.2674i | 0.8877 + 0.9231i | 0.8877 + 0.9231i | 1.0474 + 0.9190i | 1.0474 + 0.9190i |
| 22 | 0.9594 + 1.3673i | 0.9220 + 1.1877i | 0.9343 + 1.6326i | 1.0387 + 1.1184i | 0.8615 + 0.8877i | 0.8791 + 1.0284i | 0.9391 + 0.8804i | 1.0097 + 0.9542i |
| 22.5 | 0.8991 + 1.3062i | 0.8949 + 1.1654i | 1.0334 + 1.3983i | 1.0685 + 1.1889i | 0.9101 + 0.9127i | 0.9056 + 1.0351i | 1.0634 + 0.9074i | 1.0737 + 1.0418i |
| 23 | 0.8457 + 1.3352i | 0.8766 + 1.1938i | 1.0182 + 1.3610i | 1.0395 + 1.2129i | 0.9092 + 0.9223i | 0.9015 + 1.0480i | 1.0580 + 0.9038i | 1.0534 + 1.0422i |
| 23.5 | 0.8918 + 1.3385i | 0.8706 + 1.1982i | 0.8699 + 1.5126i | 1.0232 + 1.1858i | 0.8968 + 0.9242i | 0.8841 + 1.0548i | 1.0408 + 0.9107i | 1.0278 + 1.0448i |
| 24 | 0.9437 + 1.3080i | 0.8750 + 1.1648i | 0.9760 + 1.4721i | 1.0245 + 1.1502i | 0.8778 + 0.9006i | 0.8693 + 1.0265i | 1.0051 + 0.8991i | 1.0075 + 1.0190i |
| 24.5 | 0.9028 + 1.2861i | 0.9293 + 1.1520i | 0.8365 + 1.4219i | 1.0395 + 1.4368i | 1.0384 + 1.0284i | 0.9141 + 1.0040i | 1.0741 + 0.9112i | 0.9432 + 0.8972i |
| 25 | 0.8829 + 1.2606i | 0.9138 + 1.1340i | 0.8454 + 1.3942i | 1.0180 + 1.3974i | 1.0318 + 1.0219i | 0.9035 + 0.9954i | 1.0712 + 0.9074i | 0.9395 + 0.8888i |
| 25.5 | 0.7345 + 1.4935i | 0.9225 + 1.1907i | 0.8959 + 1.4840i | 0.9694 + 1.3246i | 0.9279 + 0.9107i | 1.0693 + 1.1756i | 1.0319 + 0.9222i | 1.0107 + 1.0471i |
| 26 | 0.8946 + 1.3593i | 0.9389 + 1.2209i | 1.0235 + 1.4279i | 1.1745 + 1.3460i | 1.0293 + 0.8852i | 0.9361 + 0.9368i | 1.1008 + 0.9458i | 1.0205 + 1.0570i |
| 26.5 | 0.8398 + 1.2923i | 0.9326 + 1.1801i | 0.9612 + 1.3780i | 1.0603 + 1.2681i | 1.0358 + 0.8637i | 0.9582 + 0.9419i | 1.1285 + 0.8265i | 1.0066 + 1.0375i |
| 27 | 0.8712 + 1.2714i | 0.9051 + 1.1465i | 0.8569 + 1.4350i | 1.1634 + 1.3187i | 1.0441 + 0.9494i | 0.9580 + 1.0356i | 1.1718 + 0.9809i | 0.9066 + 0.9385i |
| 27.5 | 0.8145 + 1.3026i | 0.8485 + 1.1849i | 0.7985 + 1.4488i | 1.1193 + 1.2690i | 1.1199 + 0.7168i | 0.8978 + 1.0853i | 1.0728 + 0.9252i | 0.9727 + 0.9570i |

-continued

| | | | | | | | | |
|---|---|---|---|---|---|---|---|---|
| 28 | 0.9261 + 1.2557i | 0.9064 + 1.1434i | 0.8489 + 1.3711i | 1.1138 + 1.2723i | 1.1308 + 0.8070i | 0.9002 + 1.0336i | 1.1114 + 0.9086i | 0.8336 + 0.9681i |

| SNR/w | w16 | w17 | w18 | w19 | w20 | w21 | w22 | w23 |
|---|---|---|---|---|---|---|---|---|
| 7 | 0.6413 + 1.1550i | 0.6413 + 1.1550i | 0.3707 + 1.2911i | 0.3707 + 1.2911i | 0.6413 + 1.1550i | 0.5789 + 1.0674i | 0.3707 + 1.2911i | 0.3565 + 1.1738i |
| 7.5 | 0.6538 + 1.1143i | 0.6538 + 1.1143i | 0.3292 + 1.2581i | 0.3292 + 1.2581i | 0.6538 + 1.1143i | 0.6538 + 1.1143i | 0.3292 + 1.2581i | 0.3292 + 1.2581i |
| 8 | 0.3053 + 1.2660i | 0.3053 + 1.2660i | 0.3053 + 1.2660i | 0.3053 + 1.2660i | 0.6782 + 1.1122i | 0.6782 + 1.1122i | 0.6782 + 1.1122i | 0.6782 + 1.1122i |
| 8.5 | 0.2939 + 1.3233i | 0.2939 + 1.3233i | 0.2939 + 1.3233i | 0.2939 + 1.3233i | 0.7259 + 1.1487i | 0.7259 + 1.1487i | 0.7259 + 1.1487i | 0.7259 + 1.1487i |
| 9 | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i |
| 10 | 1.0178 + 0.2442i | 1.0178 + 0.2442i | 1.0178 + 0.2442i | 1.0178 + 0.2442i | 1.0178 + 0.2442i | 1.0178 + 0.2442i | 1.0178 + 0.2442i | 1.0178 + 0.2442i |
| 10.5 | 1.0097 + 0.2323i | 1.0097 + 0.2323i | 1.0097 + 0.2323i | 1.0097 + 0.2323i | 1.0097 + 0.2323i | 1.0097 + 0.2323i | 1.0097 + 0.2323i | 1.0097 + 0.2323i |
| 11 | 0.8326 + 1.1852i | 0.8326 + 1.1852i | 0.8326 + 1.1852i | 0.9045 + 1.1940i | 0.8326 + 1.1852i | 0.9224 + 1.2782i | 0.8326 + 1.1852i | 0.9224 + 1.2782i |
| 11.5 | 0.8003 + 1.1940i | 0.8003 + 1.1940i | 0.8003 + 1.1940i | 0.8003 + 1.1940i | 0.8003 + 1.1940i | 0.9318 + 1.2869i | 0.8003 + 1.1940i | 0.9318 + 1.2869i |
| 12 | 0.8135 + 1.1945i | 0.8135 + 1.1945i | 0.8135 + 1.1945i | 0.8135 + 1.1945i | 0.8135 + 1.1945i | 0.9619 + 1.3057i | 0.8135 + 1.1945i | 0.9619 + 1.3057i |
| 12.5 | 0.9959 + 1.0791i | 0.9959 + 1.0791i | 1.1779 + 1.3115i | 1.3201 + 1.2209i | 0.8160 + 1.1651i | 0.8160 + 1.1651i | 0.8160 + 1.1651i | 0.8160 + 1.1651i |
| 13 | 1.0742 + 0.2040i | 1.0742 + 0.2040i | 1.0742 + 0.2040i | 1.0742 + 0.2040i | 1.1379 + 0.1590i | 1.1379 + 0.1590i | 1.0742 + 0.2040i | 1.0742 + 0.2040i |
| 13.5 | 1.1489 + 1.1197i | 1.3661 + 1.0778i | 1.1464 + 1.2789i | 1.3152 + 1.1853i | 0.7879 + 1.1946i | 0.7879 + 1.1946i | 0.8426 + 1.2622i | 0.7879 + 1.1946i |
| 14 | 1.1053 + 1.1248i | 1.0498 + 1.0225i | 1.1053 + 1.1248i | 1.0498 + 1.0225i | 0.7876 + 1.1302i | 0.7876 + 1.1302i | 0.7876 + 1.1302i | 0.7876 + 1.1302i |
| 14.5 | 1.1367 + 1.1377i | 1.0803 + 1.0201i | 1.1367 + 1.1377i | 1.0803 + 1.0201i | 0.7911 + 1.1178i | 0.7911 + 1.1178i | 0.7911 + 1.1178i | 0.7911 + 1.1178i |
| 15 | 1.3865 + 0.8444i | 1.3175 + 0.7494i | 1.2330 + 0.6930i | 1.2330 + 0.6930i | 1.1306 + 0.8292i | 1.1306 + 0.8292i | 1.1306 + 0.8292i | 1.1126 + 0.7761i |
| 15.5 | 1.2987 + 0.8102i | 1.2995 + 0.7667i | 1.2077 + 0.7311i | 1.2077 + 0.7311i | 1.0121 + 0.8220i | 1.0121 + 0.8220i | 1.0121 + 0.8220i | 1.0121 + 0.8220i |
| 16 | 1.2983 + 0.7167i | 1.3470 + 0.7459i | 1.2062 + 0.6208i | 1.2062 + 0.6208i | 1.0914 + 0.7539i | 1.0914 + 0.7539i | 1.0638 + 0.7215i | 1.0638 + 0.7215i |
| 16.5 | 1.4219 + 0.5556i | 1.4219 + 0.5556i | 1.2462 + 0.5855i | 1.2462 + 0.5855i | 1.6092 + 0.6786i | 1.5059 + 0.7313i | 1.2311 + 0.7394i | 1.2311 + 0.7394i |
| 17 | 1.4330 + 0.5504i | 1.4330 + 0.5504i | 1.2436 + 0.5789i | 1.2436 + 0.5789i | 1.6365 + 0.6778i | 1.5001 + 0.7492i | 1.2274 + 0.7447i | 1.2274 + 0.7447i |
| 17.5 | 1.4372 + 0.5485i | 1.4372 + 0.5485i | 1.2382 + 0.5741i | 1.2382 + 0.5741i | 1.6542 + 0.6753i | 1.4909 + 0.7585i | 1.2045 + 0.7465i | 1.2417 + 0.7541i |
| 18 | 1.4369 + 0.5468i | 1.4369 + 0.5468i | 1.2328 + 0.5692i | 1.2328 + 0.5692i | 1.6573 + 0.6715i | 1.4814 + 0.7623i | 1.1998 + 0.7521i | 1.2414 + 0.7575i |
| 18.5 | 1.3930 + 0.3640i | 1.3485 + 0.3893i | 1.1687 + 0.4247i | 1.1687 + 0.4247i | 1.5455 + 0.4576i | 1.3962 + 0.5257i | 1.1693 + 0.5271i | 1.1693 + 0.5271i |
| 19 | 1.3739 + 0.3510i | 1.3309 + 0.3746i | 1.1573 + 0.4118i | 1.1573 + 0.4118i | 1.5317 + 0.4427i | 1.3896 + 0.5168i | 1.1739 + 0.5355i | 1.1739 + 0.5355i |
| 19.5 | 1.3536 + 0.3475i | 1.2950 + 0.3231i | 1.1495 + 0.3917i | 1.1495 + 0.3917i | 1.4933 + 0.4426i | 1.7116 + 0.5868i | 1.1713 + 0.5146i | 1.1713 + 0.5146i |
| 20 | 1.7660 + 0.7375i | 1.4962 + 0.6907i | 1.2346 + 0.6969i | 1.2346 + 0.6969i | 1.3547 + 0.9559i | 1.4932 + 0.8746i | 1.1716 + 0.9087i | 1.1490 + 0.8711i |
| 20.5 | 1.3864 + 0.4526i | 1.3864 + 0.4526i | 1.1991 + 0.4770i | 1.1991 + 0.4770i | 1.4531 + 0.6314i | 1.6329 + 0.5542i | 1.2252 + 0.6541i | 1.2252 + 0.6541i |
| 21 | 1.4522 + 0.5679i | 1.6057 + 0.5378i | 1.3175 + 0.5452i | 1.1940 + 0.5550i | 1.4469 + 0.7784i | 1.6981 + 0.7459i | 1.2631 + 0.7452i | 1.1908 + 0.6751i |
| 21.5 | 1.4604 + 0.5935i | 1.7875 + 0.3980i | 1.2674 + 0.5839i | 1.7463 + 0.6216i | 1.4419 + 0.7605i | 1.6376 + 0.8704i | 1.2514 + 0.7312i | 1.1983 + 0.7401i |
| 22 | 1.4439 + 0.5853i | 1.6108 + 0.5303i | 1.3004 + 0.5868i | 1.1846 + 0.5909i | 1.4889 + 0.7419i | 1.7240 + 0.7079i | 1.3086 + 0.7519i | 1.1714 + 0.7584i |
| 22.5 | 1.5607 + 0.5647i | 1.7514 + 0.6378i | 1.1625 + 0.5397i | 1.2356 + 0.5517i | 1.4933 + 0.7257i | 1.3820 + 0.6548i | 1.2027 + 0.7601i | 1.2562 + 0.6724i |
| 23 | 1.6061 + 0.5652i | 1.8194 + 0.5891i | 1.1596 + 0.5779i | 1.2454 + 0.5628i | 1.5850 + 0.7789i | 1.4301 + 0.6629i | 1.1633 + 0.7212i | 1.3024 + 0.6774i |
| 23.5 | 1.2583 + 0.6069i | 1.7469 + 0.5762i | 1.1684 + 0.6129i | 1.5785 + 0.4968i | 1.6073 + 0.8302i | 1.4743 + 0.6934i | 1.1800 + 0.7580i | 1.3289 + 0.7757i |
| 24 | 1.3854 + 0.6727i | 1.2630 + 0.5854i | 1.2543 + 0.7381i | 1.1484 + 0.5860i | 1.5471 + 0.7468i | 1.6867 + 0.5760i | 1.1344 + 0.7766i | 1.1028 + 0.6774i |
| 24.5 | 1.1699 + 0.6085i | 1.6812 + 0.6256i | 1.1989 + 0.6932i | 1.5850 + 0.4763i | 1.5370 + 0.8085i | 1.4838 + 0.6414i | 1.2190 + 0.8012i | 1.3611 + 0.7212i |
| 25 | 1.2811 + 0.6537i | 1.5886 + 0.4923i | 1.1525 + 0.6181i | 1.7297 + 0.3433i | 1.6454 + 0.6927i | 1.4737 + 0.6267i | 1.3158 + 0.8304i | 1.4511 + 0.7770i |

-continued

| | | | | | | | | |
|---|---|---|---|---|---|---|---|---|
| 25.5 | 1.4469 + 0.5411i | 1.3690 + 0.6538i | 1.3128 + 0.5092i | 1.2090 + 0.5803i | 1.5706 + 0.6441i | 1.3251 + 0.7695i | 1.1678 + 0.8071i | 1.1961 + 0.6963i |
| 26 | 1.4116 + 0.5752i | 1.5736 + 0.6220i | 1.1918 + 0.6209i | 1.5623 + 0.4562i | 1.5497 + 0.8311i | 1.4238 + 0.7455i | 1.1749 + 0.7608i | 1.2959 + 0.7280i |
| 26.5 | 1.5874 + 0.4394i | 1.5767 + 0.6137i | 1.1624 + 0.5760i | 1.2819 + 0.5439i | 1.5158 + 0.8040i | 1.4253 + 0.6800i | 1.2447 + 0.7358i | 1.3051 + 0.6448i |
| 27 | 1.5345 + 0.4449i | 1.5144 + 0.5973i | 1.2543 + 0.5426i | 1.3709 + 0.5896i | 1.4385 + 0.7521i | 1.1966 + 0.7287i | 1.3082 + 0.8079i | 1.2925 + 0.6791i |
| 27.5 | 1.4370 + 0.4627i | 1.4958 + 0.5797i | 1.2388 + 0.5368i | 1.3470 + 0.5780i | 1.4133 + 0.8583i | 1.2565 + 0.6932i | 1.2710 + 0.8408i | 1.3720 + 0.7047i |
| 28 | 1.5172 + 0.4779i | 1.4228 + 0.5698i | 1.2002 + 0.5259i | 1.2996 + 0.5704i | 1.4031 + 0.8380i | 1.2168 + 0.6822i | 1.2773 + 0.8086i | 1.3336 + 0.6909i |

| SNR/w | w24 | w25 | w26 | w27 | w28 | w29 | w30 | w31 |
|---|---|---|---|---|---|---|---|---|
| 7 | 0.6413 + 1.1550i | 0.5789 + 1.0674i | 0.3707 + 1.2911i | 0.3565 + 1.1738i | 0.5789 + 1.0674i | 0.5789 + 1.0674i | 0.3565 + 1.1738i | 0.3565 + 1.1738i |
| 7.5 | 0.6538 + 1.1143i | 0.6538 + 1.1143i | 0.3292 + 1.2581i | 0.3292 + 1.2581i | 0.5815 + 1.0241i | 0.5815 + 1.0241i | 0.3167 + 1.1419i | 0.3167 + 1.1419i |
| 8 | 0.2944 + 1.1432i | 0.2944 + 1.1432i | 0.2944 + 1.1432i | 0.2944 + 1.1432i | 0.5978 + 1.0154i | 0.5978 + 1.0154i | 0.5978 + 1.0154i | 0.5978 + 1.0154i |
| 8.5 | 0.2766 + 1.1195i | 0.2766 + 1.1195i | 0.2766 + 1.1195i | 0.2766 + 1.1195i | 0.5908 + 0.9851i | 0.5908 + 0.9851i | 0.5908 + 0.9851i | 0.5908 + 0.9851i |
| 9 | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i | 1.0523 + 0.2630i |
| 9.5 | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i | 1.0304 + 0.2536i |
| 10 | 1.0178 + 0.2442i | 1.0178 + 0.2442i | 1.0178 + 0.2442i | 1.0178 + 0.2442i | 1.0178 + 0.2442i | 1.0178 + 0.2442i | 1.0178 + 0.2442i | 1.0178 + 0.2442i |
| 10.5 | 1.0097 + 0.2323i | 1.0097 + 0.2323i | 1.0097 + 0.2323i | 1.0097 + 0.2323i | 1.0097 + 0.2323i | 1.0097 + 0.2323i | 1.0097 + 0.2323i | 1.0097 + 0.2323i |
| 11 | 0.7437 + 1.2072i | 0.7437 + 1.2072i | 0.7437 + 1.2072i | 0.8326 + 1.1852i | 0.7437 + 1.2072i | 0.7446 + 1.2677i | 0.7437 + 1.2072i | 0.7437 + 1.2072i |
| 11.5 | 0.8003 + 1.1940i | 0.8003 + 1.1940i | 0.8003 + 1.1940i | 0.8003 + 1.1940i | 0.7226 + 1.2640i | 0.7226 + 1.2640i | 0.8003 + 1.1940i | 0.8003 + 1.1940i |
| 12 | 0.6977 + 1.2633i | 0.6977 + 1.2633i | 0.8135 + 1.1945i | 0.8135 + 1.1945i | 0.6977 + 1.2633i | 0.6977 + 1.2633i | 0.8135 + 1.1945i | 0.8135 + 1.1945i |
| 12.5 | 0.9959 + 1.0791i | 0.9959 + 1.0791i | 0.9959 + 1.0791i | 0.9959 + 1.0791i | 0.8160 + 1.1651i | 0.8160 + 1.1651i | 0.8160 + 1.1651i | 0.8160 + 1.1651i |
| 13 | 1.1043 + 0.2710i | 1.1043 + 0.2710i | 1.1043 + 0.2710i | 1.1043 + 0.2710i | 1.1641 + 0.2297i | 1.1043 + 0.2710i | 1.0742 + 0.2040i | 1.1043 + 0.2710i |
| 13.5 | 0.9715 + 0.9809i | 0.9715 + 0.9809i | 0.9715 + 0.9809i | 0.9715 + 0.9809i | 0.8494 + 1.0534i | 0.8494 + 1.0534i | 0.8494 + 1.0534i | 0.8494 + 1.0534i |
| 14 | 0.9635 + 0.9170i | 0.9635 + 0.9170i | 0.9635 + 0.9170i | 0.9635 + 0.9170i | 0.7728 + 1.0636i | 0.7728 + 1.0636i | 0.7876 + 1.1302i | 0.7728 + 1.0636i |
| 14.5 | 0.9763 + 0.8886i | 0.9763 + 0.8886i | 0.9763 + 0.8886i | 0.9763 + 0.8886i | 0.7911 + 1.1178i | 0.7855 + 1.0474i | 0.7911 + 1.1178i | 0.7855 + 1.0474i |
| 15 | 1.0121 + 0.6032i | 1.0121 + 0.6032i | 1.0121 + 0.6032i | 1.0121 + 0.6032i | 0.9830 + 0.7027i | 0.9830 + 0.7027i | 0.9830 + 0.7027i | 0.9830 + 0.7027i |
| 15.5 | 1.0118 + 0.5724i | 1.0118 + 0.5724i | 1.0118 + 0.5724i | 1.0118 + 0.5724i | 0.9801 + 0.6215i | 0.9801 + 0.6215i | 0.9801 + 0.6215i | 0.9801 + 0.6215i |
| 16 | 0.9674 + 0.5299i | 0.9674 + 0.5299i | 0.9929 + 0.5319i | 0.9674 + 0.5299i | 0.9624 + 0.5996i | 0.9624 + 0.5996i | 0.9624 + 0.5996i | 0.9624 + 0.5996i |
| 16.5 | 0.9292 + 0.5928i | 0.9292 + 0.5928i | 0.9946 + 0.5942i | 0.9946 + 0.5942i | 0.9211 + 0.6843i | 0.9211 + 0.6843i | 0.9838 + 0.6926i | 0.9838 + 0.6926i |
| 17 | 0.9244 + 0.5890i | 0.9244 + 0.5890i | 0.9955 + 0.5891i | 0.9955 + 0.5891i | 0.9162 + 0.6919i | 0.9162 + 0.6919i | 0.9842 + 0.6988i | 0.9842 + 0.6988i |
| 17.5 | 0.9226 + 0.5846i | 0.9226 + 0.5846i | 0.9985 + 0.5838i | 0.9985 + 0.5838i | 0.9135 + 0.7046i | 0.9135 + 0.7046i | 0.9860 + 0.7101i | 0.9860 + 0.7101i |
| 18 | 0.9216 + 0.5798i | 0.9216 + 0.5798i | 1.0034 + 0.5785i | 1.0034 + 0.5785i | 0.9120 + 0.7182i | 0.9120 + 0.7182i | 0.9903 + 0.7224i | 0.9903 + 0.7224i |
| 18.5 | 0.8679 + 0.5021i | 0.8679 + 0.5021i | 0.9292 + 0.4862i | 0.9292 + 0.4862i | 0.9067 + 0.5983i | 0.9067 + 0.5983i | 0.9680 + 0.5733i | 0.9680 + 0.5733i |
| 19 | 0.8747 + 0.4890i | 0.8747 + 0.4890i | 0.9383 + 0.4703i | 0.9383 + 0.4703i | 0.9215 + 0.6083i | 0.9215 + 0.6083i | 0.9820 + 0.5819i | 0.9820 + 0.5819i |
| 19.5 | 0.8811 + 0.4849i | 0.8811 + 0.4849i | 0.9429 + 0.4612i | 0.9429 + 0.4612i | 0.9418 + 0.6248i | 0.9418 + 0.6248i | 1.0102 + 0.5894i | 1.0102 + 0.5894i |
| 20 | 0.9236 + 0.6522i | 0.9236 + 0.6522i | 1.0350 + 0.6700i | 1.0350 + 0.6700i | 0.8720 + 0.8422i | 0.8881 + 0.8007i | 0.9559 + 0.8772i | 0.9855 + 0.8360i |
| 20.5 | 0.9223 + 0.5412i | 0.9223 + 0.5412i | 1.0283 + 0.5133i | 1.0283 + 0.5133i | 0.9484 + 0.7077i | 0.9484 + 0.7077i | 1.0612 + 0.6903i | 1.0612 + 0.6903i |
| 21 | 0.8935 + 0.5656i | 0.8935 + 0.5656i | 0.9979 + 0.5557i | 1.0380 + 0.5582i | 0.8971 + 0.7130i | 0.8971 + 0.7130i | 1.0274 + 0.7211i | 1.0515 + 0.6813i |
| 21.5 | 0.9084 + 0.5872i | 0.9084 + 0.5872i | 1.0543 + 0.5863i | 1.0543 + 0.5863i | 0.8996 + 0.7455i | 0.8996 + 0.7455i | 1.0486 + 0.7415i | 1.0486 + 0.7415i |
| 22 | 0.8887 + 0.5713i | 0.8887 + 0.5713i | 1.0106 + 0.5766i | 1.0532 + 0.5907i | 0.8774 + 0.7307i | 0.8698 + 0.6919i | 0.9792 + 0.7557i | 1.0444 + 0.7361i |
| 22.5 | 0.8966 + 0.5862i | 0.8966 + 0.5862i | 1.0483 + 0.5684i | 1.0223 + 0.6001i | 0.9017 + 0.7879i | 0.9044 + 0.7215i | 1.0636 + 0.7751i | 1.0312 + 0.7129i |

| | | | | | | | | |
|---|---|---|---|---|---|---|---|---|
| 23 | 0.8951 + 0.5381i | 0.9020 + 0.5765i | 1.0480 + 0.5500i | 1.0052 + 0.5823i | 0.9122 + 0.8113i | 0.8977 + 0.7054i | 1.0333 + 0.7739i | 0.9929 + 0.6941i |
| 23.5 | 0.8979 + 0.5389i | 0.9021 + 0.5899i | 1.0570 + 0.5654i | 1.0095 + 0.5968i | 0.8981 + 0.7978i | 0.9002 + 0.7040i | 1.0453 + 0.7856i | 1.0004 + 0.7110i |
| 24 | 0.8946 + 0.5174i | 0.8865 + 0.5769i | 0.9939 + 0.5077i | 1.0334 + 0.5527i | 0.8883 + 0.7796i | 0.8934 + 0.6762i | 0.9999 + 0.7892i | 1.0024 + 0.6743i |
| 24.5 | 1.0545 + 0.6208i | 0.8992 + 0.5849i | 1.0410 + 0.5398i | 0.9570 + 0.5335i | 1.0118 + 0.6978i | 0.9039 + 0.7061i | 1.0649 + 0.7904i | 0.9378 + 0.8081i |
| 25 | 0.8835 + 0.5791i | 0.8749 + 0.6592i | 1.0400 + 0.6364i | 0.9662 + 0.6804i | 1.1689 + 0.7806i | 0.8574 + 0.7588i | 1.0682 + 0.7758i | 0.9493 + 0.7863i |
| 25.5 | 0.9398 + 0.5123i | 0.9446 + 0.5967i | 1.0491 + 0.4947i | 1.0814 + 0.5792i | 0.9376 + 0.7957i | 0.9469 + 0.6888i | 1.0478 + 0.7966i | 1.0645 + 0.6841i |
| 26 | 1.0266 + 0.5732i | 0.9271 + 0.6038i | 1.0759 + 0.6299i | 0.9204 + 0.6524i | 1.0128 + 0.7985i | 0.9004 + 0.8291i | 1.0612 + 0.7235i | 0.9050 + 0.7337i |
| 26.5 | 1.0181 + 0.6445i | 0.9222 + 0.6468i | 1.0522 + 0.5581i | 0.9366 + 0.5502i | 1.0179 + 0.7432i | 0.9097 + 0.7340i | 1.1323 + 0.7123i | 0.9024 + 0.8172i |
| 27 | 1.0119 + 0.5802i | 0.9632 + 0.6574i | 1.1374 + 0.5920i | 1.0660 + 0.6825i | 1.0530 + 0.8275i | 0.9525 + 0.7602i | 1.1564 + 0.8642i | 0.9247 + 0.8497i |
| 27.5 | 1.1048 + 0.5047i | 0.9732 + 0.6687i | 1.1360 + 0.5830i | 1.0261 + 0.6028i | 1.0533 + 0.7823i | 0.9559 + 0.7668i | 1.1523 + 0.8406i | 0.9478 + 0.8579i |
| 28 | 1.0788 + 0.4957i | 0.9727 + 0.6831i | 1.1083 + 0.5853i | 1.0158 + 0.6073i | 1.0912 + 0.7187i | 0.9908 + 0.7740i | 1.0145 + 0.8889i | 0.9211 + 0.9015i |

| SNR/w | w32 | w33 | w34 | w35 | w36 | w37 | w38 | w39 |
|---|---|---|---|---|---|---|---|---|
| 7 | 0.6413 + 1.1550i | 0.6413 + 1.1550i | 0.3707 + 1.2911i | 0.3707 + 1.2911i | 0.6413 + 1.1550i | 0.5789 + 1.0674i | 0.3707 + 1.2911i | 0.3565 + 1.1738i |
| 7.5 | 0.6538 + 1.1143i | 0.6538 + 1.1143i | 0.3292 + 1.2581i | 0.3292 + 1.2581i | 0.6538 + 1.1143i | 0.6538 + 1.1143i | 0.3292 + 1.2581i | 0.3292 + 1.2581i |
| 8 | 0.3053 + 1.2660i | 0.3053 + 1.2660i | 0.3053 + 1.2660i | 0.3053 + 1.2660i | 0.6782 + 1.1122i | 0.6782 + 1.1122i | 0.6782 + 1.1122i | 0.6782 + 1.1122i |
| 8.5 | 0.2939 + 1.3233i | 0.2939 + 1.3233i | 0.2939 + 1.3233i | 0.2939 + 1.3233i | 0.7259 + 1.1487i | 0.7259 + 1.1487i | 0.7259 + 1.1487i | 0.7259 + 1.1487i |
| 9 | 1.7494 + 1.1716i | 1.2549 + 0.8225i | 1.2549 + 0.8225i | 1.2549 + 0.8225i | 1.2549 + 0.8225i | 1.2549 + 0.8225i | 1.2549 + 0.8225i | 1.1712 + 0.7580i |
| 9.5 | 1.7496 + 1.1695i | 1.2570 + 0.8325i | 1.2570 + 0.8325i | 1.2570 + 0.8325i | 1.2570 + 0.8325i | 1.2570 + 0.8325i | 1.2570 + 0.8325i | 1.1846 + 0.7800i |
| 10 | 1.7476 + 1.1668i | 1.2379 + 0.8253i | 1.2379 + 0.8253i | 1.2379 + 0.8253i | 1.2379 + 0.8253i | 1.2379 + 0.8253i | 1.2379 + 0.8253i | 1.2379 + 0.8253i |
| 10.5 | 1.6826 + 1.1762i | 1.2263 + 0.8203i | 1.3288 + 0.9046i | 1.2263 + 0.8203i | 1.2263 + 0.8203i | 1.2263 + 0.8203i | 1.2263 + 0.8203i | 1.2263 + 0.8203i |
| 11 | 0.2043 + 0.9827i | 0.2043 + 0.9827i | 0.2043 + 0.9827i | 0.2043 + 0.9827i | 0.2043 + 0.9827i | 0.2043 + 0.9827i | 0.2043 + 0.9827i | 0.2043 + 0.9827i |
| 11.5 | 0.1917 + 1.0308i | 0.1917 + 1.0308i | 0.1917 + 1.0308i | 0.1917 + 1.0308i | 0.1917 + 1.0308i | 0.1917 + 1.0308i | 0.1917 + 1.0308i | 0.1917 + 1.0308i |
| 12 | 0.1845 + 1.0300i | 0.1845 + 1.0300i | 0.1845 + 1.0300i | 0.1845 + 1.0300i | 0.1845 + 1.0300i | 0.1845 + 1.0300i | 0.1845 + 1.0300i | 0.1845 + 1.0300i |
| 12.5 | 0.2108 + 1.0960i | 0.2108 + 1.0960i | 0.2108 + 1.0960i | 0.2108 + 1.0960i | 0.2108 + 1.0960i | 0.2108 + 1.0960i | 0.2108 + 1.0960i | 0.2108 + 1.0960i |
| 13 | 1.0982 + 1.2299i | 1.1688 + 1.2296i | 1.1143 + 1.0869i | 1.2060 + 1.1004i | 0.9905 + 0.9511i | 0.9905 + 0.9511i | 0.9905 + 0.9511i | 0.9905 + 0.9511i |
| 13.5 | 0.2107 + 1.0848i | 0.2107 + 1.0848i | 0.2107 + 1.0848i | 0.2107 + 1.0848i | 0.3024 + 1.0991i | 0.3024 + 1.0991i | 0.3024 + 1.0991i | 0.3024 + 1.0991i |
| 14 | 0.1522 + 1.1010i | 0.1522 + 1.1010i | 0.1522 + 1.1010i | 0.1522 + 1.1010i | 0.3073 + 1.0692i | 0.3073 + 1.0692i | 0.3073 + 1.0692i | 0.3073 + 1.0692i |
| 14.5 | 0.1419 + 1.1228i | 0.1419 + 1.1228i | 0.1419 + 1.1228i | 0.1419 + 1.1228i | 0.3330 + 1.0690i | 0.3330 + 1.0690i | 0.3330 + 1.0690i | 0.3330 + 1.0690i |
| 15 | 0.1805 + 1.5284i | 0.4911 + 1.4059i | 0.1805 + 1.5284i | 0.4911 + 1.4059i | 0.6404 + 1.0091i | 0.6282 + 1.0792i | 0.6404 + 1.0091i | 0.6404 + 1.0091i |
| 15.5 | 0.1369 + 1.6282i | 0.3026 + 1.5129i | 0.1369 + 1.6282i | 0.3026 + 1.5129i | 0.6508 + 0.9861i | 0.6508 + 0.9861i | 0.6508 + 0.9861i | 0.6508 + 0.9861i |
| 16 | 0.3712 + 1.7894i | 0.5775 + 1.3833i | 0.5311 + 1.7286i | 0.5825 + 1.4596i | 0.6693 + 0.9448i | 0.6549 + 0.9826i | 0.6693 + 0.9448i | 0.6549 + 0.9826i |
| 16.5 | 0.9790 + 1.7611i | 0.5632 + 1.2042i | 0.6550 + 1.8625i | 0.5632 + 1.2042i | 0.5726 + 0.9159i | 0.5700 + 0.9781i | 0.5726 + 0.9159i | 0.5700 + 0.9781i |
| 17 | 0.9719 + 1.7576i | 0.5632 + 1.2036i | 0.6484 + 1.8669i | 0.5632 + 1.2036i | 0.5708 + 0.9120i | 0.5693 + 0.9768i | 0.5708 + 0.9120i | 0.5693 + 0.9768i |
| 17.5 | 0.9596 + 1.7576i | 0.5628 + 1.2012i | 0.6359 + 1.8638i | 0.5628 + 1.2012i | 0.5682 + 0.9084i | 0.5682 + 0.9765i | 0.5682 + 0.9084i | 0.5682 + 0.9765i |
| 18 | 0.9565 + 1.7467i | 0.5597 + 1.1973i | 0.6376 + 1.8550i | 0.5597 + 1.1973i | 0.5627 + 0.9080i | 0.5638 + 0.9795i | 0.5627 + 0.9080i | 0.5638 + 0.9795i |
| 18.5 | 0.8180 + 1.4853i | 0.7467 + 1.2574i | 0.8969 + 1.7495i | 0.7299 + 1.1971i | 0.6496 + 0.9248i | 0.6701 + 0.9929i | 0.6496 + 0.9248i | 0.6701 + 0.9929i |
| 19 | 0.8131 + 1.4757i | 0.7498 + 1.2637i | 0.8853 + 1.7279i | 0.7348 + 1.1948i | 0.6625 + 0.9215i | 0.6829 + 0.9968i | 0.6625 + 0.9215i | 0.6829 + 0.9968i |
| 19.5 | 0.8222 + 1.7689i | 0.7329 + 1.2092i | 0.7753 + 1.4943i | 0.7495 + 1.2497i | 0.6759 + 0.9245i | 0.6976 + 1.0138i | 0.6759 + 0.9245i | 0.6976 + 1.0138i |
| 20 | 0.5491 + 1.7035i | 0.4164 + 1.1274i | 0.3416 + 1.3191i | 0.4000 + 1.1739i | 0.5011 + 0.8954i | 0.4761 + 0.9710i | 0.5011 + 0.8954i | 0.4761 + 0.9710i |

-continued

| | | | | | | | | |
|---|---|---|---|---|---|---|---|---|
| 20.5 | 0.5496 + 1.8328i | 0.5986 + 1.2193i | 0.5741 + 1.4423i | 0.5986 + 1.2193i | 0.6155 + 0.9153i | 0.6139 + 1.0222i | 0.6155 + 0.9153i | 0.6139 + 1.0222i |
| 21 | 0.5908 + 1.4191i | 0.6104 + 1.2526i | 0.4486 + 1.8391i | 0.6140 + 1.1685i | 0.5778 + 0.8980i | 0.5917 + 1.0226i | 0.5778 + 0.8980i | 0.5917 + 1.0226i |
| 21.5 | 0.5651 + 1.6424i | 0.5819 + 1.1504i | 0.5713 + 1.4458i | 0.5849 + 1.2696i | 0.5307 + 0.8825i | 0.5536 + 1.0212i | 0.5307 + 0.8825i | 0.5512 + 0.9689i |
| 22 | 0.6243 + 1.4649i | 0.5939 + 1.3037i | 0.4047 + 1.8156i | 0.5830 + 1.2010i | 0.5691 + 0.9002i | 0.5648 + 1.0360i | 0.5691 + 0.9002i | 0.5648 + 1.0360i |
| 22.5 | 0.6526 + 1.7382i | 0.5201 + 1.1584i | 0.5875 + 1.5167i | 0.5606 + 1.2579i | 0.5528 + 0.8893i | 0.5343 + 1.0408i | 0.5528 + 0.8893i | 0.5685 + 1.0088i |
| 23 | 0.6244 + 1.6853i | 0.5396 + 1.1646i | 0.5897 + 1.4912i | 0.5627 + 1.2896i | 0.5300 + 0.8893i | 0.5385 + 1.0557i | 0.5662 + 0.9004i | 0.5719 + 1.0071i |
| 23.5 | 0.5088 + 1.7163i | 0.5473 + 1.1551i | 0.5636 + 1.4803i | 0.5544 + 1.2433i | 0.5327 + 0.8892i | 0.5348 + 1.0466i | 0.5758 + 0.8987i | 0.5771 + 1.0111i |
| 24 | 0.6364 + 1.6353i | 0.5959 + 1.1661i | 0.6239 + 1.4562i | 0.6065 + 1.3009i | 0.5237 + 0.8675i | 0.5685 + 1.0623i | 0.5644 + 0.8873i | 0.5725 + 0.9911i |
| 24.5 | 0.6032 + 1.6635i | 0.5024 + 1.1613i | 0.6020 + 1.2960i | 0.5939 + 1.1667i | 0.5099 + 0.9139i | 0.5036 + 1.0359i | 0.5855 + 0.9120i | 0.5903 + 1.0334i |
| 25 | 0.6389 + 1.6546i | 0.4853 + 1.1426i | 0.5804 + 1.3364i | 0.5604 + 1.2030i | 0.4874 + 0.9257i | 0.4845 + 1.0420i | 0.5645 + 0.9258i | 0.5744 + 1.0392i |
| 25.5 | 0.5812 + 1.5932i | 0.5105 + 1.2487i | 0.5473 + 1.4117i | 0.5765 + 1.1450i | 0.5751 + 0.8885i | 0.5696 + 0.9833i | 0.6604 + 0.8996i | 0.6267 + 1.0328i |
| 26 | 0.4991 + 1.5686i | 0.5486 + 1.1925i | 0.6897 + 1.1182i | 0.6481 + 1.2195i | 0.6050 + 0.9119i | 0.5370 + 0.9447i | 0.6526 + 1.0254i | 0.5772 + 1.0462i |
| 26.5 | 0.5345 + 1.6138i | 0.5130 + 1.1337i | 0.6387 + 1.0936i | 0.5568 + 1.2390i | 0.6269 + 0.8981i | 0.4851 + 1.0350i | 0.6143 + 0.9936i | 0.5184 + 0.9539i |
| 27 | 0.4015 + 1.5842i | 0.5558 + 1.2016i | 0.6111 + 1.3403i | 0.6382 + 1.1360i | 0.5330 + 0.8941i | 0.4820 + 1.1330i | 0.6037 + 0.9226i | 0.6160 + 1.0341i |
| 27.5 | 0.4096 + 1.5974i | 0.5213 + 1.2084i | 0.5614 + 1.3474i | 0.6135 + 1.1429i | 0.5637 + 0.8891i | 0.4831 + 1.1158i | 0.6283 + 0.9257i | 0.6504 + 1.0330i |
| 28 | 0.4374 + 1.5965i | 0.6091 + 1.1608i | 0.5915 + 1.3566i | 0.6593 + 1.2473i | 0.5376 + 0.9041i | 0.6008 + 1.0615i | 0.6254 + 0.8954i | 0.6315 + 0.9789i |

| SNR/w | w40 | w41 | w42 | w43 | w44 | w45 | w46 | w47 |
|---|---|---|---|---|---|---|---|---|
| 7 | 0.6413 + 1.1550i | 0.5789 + 1.0674i | 0.3707 + 1.2911i | 0.3565 + 1.1738i | 0.5789 + 1.0674i | 0.5789 + 1.0674i | 0.3565 + 1.1738i | 0.3565 + 1.1738i |
| 7.5 | 0.6538 + 1.1143i | 0.6538 + 1.1143i | 0.3292 + 1.2581i | 0.3292 + 1.2581i | 0.5815 + 1.0241i | 0.5815 + 1.0241i | 0.3167 + 1.1419i | 0.3167 + 1.1419i |
| 8 | 0.2944 + 1.1432i | 0.2944 + 1.1432i | 0.2944 + 1.1432i | 0.2944 + 1.1432i | 0.5978 + 1.0154i | 0.5978 + 1.0154i | 0.5978 + 1.0154i | 0.5978 + 1.0154i |
| 8.5 | 0.2766 + 1.1195i | 0.2766 + 1.1195i | 0.2766 + 1.1195i | 0.2766 + 1.1195i | 0.5908 + 0.9851i | 0.5908 + 0.9851i | 0.5908 + 0.9851i | 0.5908 + 0.9851i |
| 9 | 1.2549 + 0.8225i | 1.2549 + 0.8225i | 1.2549 + 0.8225i | 1.1712 + 0.7580i | 1.2549 + 0.8225i | 1.1712 + 0.7580i | 1.1712 + 0.7580i | 1.1712 + 0.7580i |
| 9.5 | 1.2570 + 0.8325i | 1.2570 + 0.8325i | 1.2570 + 0.8325i | 1.1846 + 0.7800i | 1.2570 + 0.8325i | 1.1846 + 0.7800i | 1.1846 + 0.7800i | 1.1846 + 0.7800i |
| 10 | 1.2379 + 0.8253i | 1.2379 + 0.8253i | 1.2379 + 0.8253i | 1.2379 + 0.8253i | 1.2379 + 0.8253i | 1.2379 + 0.8253i | 1.2379 + 0.8253i | 1.1727 + 0.7818i |
| 10.5 | 1.2263 + 0.8203i | 1.2263 + 0.8203i | 1.2263 + 0.8203i | 1.1745 + 0.7815i | 1.2263 + 0.8203i | 1.1745 + 0.7815i | 1.2263 + 0.8203i | 1.1745 + 0.7815i |
| 11 | 0.1932 + 1.0799i | 0.1932 + 1.0799i | 0.1932 + 1.0799i | 0.1932 + 1.0799i | 0.1932 + 1.0799i | 0.1932 + 1.0799i | 0.1932 + 1.0799i | 0.1932 + 1.0799i |
| 11.5 | 0.1917 + 1.0308i | 0.1917 + 1.0308i | 0.1917 + 1.0308i | 0.1917 + 1.0308i | 0.1917 + 1.0308i | 0.1917 + 1.0308i | 0.1917 + 1.0308i | 0.1917 + 1.0308i |
| 12 | 0.1845 + 1.0300i | 0.1845 + 1.0300i | 0.1845 + 1.0300i | 0.1845 + 1.0300i | 0.1845 + 1.0300i | 0.1845 + 1.0300i | 0.1845 + 1.0300i | 0.1845 + 1.0300i |
| 12.5 | 0.2108 + 1.0960i | 0.2108 + 1.0960i | 0.2108 + 1.0960i | 0.2108 + 1.0960i | 0.2108 + 1.0960i | 0.2108 + 1.0960i | 0.2108 + 1.0960i | 0.2108 + 1.0960i |
| 13 | 1.1188 + 0.8173i | 1.1188 + 0.8173i | 1.1188 + 0.8173i | 1.1853 + 0.8237i | 1.0310 + 0.8384i | 1.0310 + 0.8384i | 1.0310 + 0.8384i | 1.1188 + 0.8173i |
| 13.5 | 0.1493 + 1.1587i | 0.1493 + 1.1587i | 0.2107 + 1.0848i | 0.2107 + 1.0848i | 0.2304 + 1.1738i | 0.2304 + 1.1738i | 0.2107 + 1.0848i | 0.2107 + 1.0848i |
| 14 | 0.1522 + 1.1010i | 0.1522 + 1.1010i | 0.1522 + 1.1010i | 0.1522 + 1.1010i | 0.3073 + 1.0692i | 0.3073 + 1.0692i | 0.3073 + 1.0692i | 0.3073 + 1.0692i |
| 14.5 | 0.1419 + 1.1228i | 0.1419 + 1.1228i | 0.1419 + 1.1228i | 0.1419 + 1.1228i | 0.3330 + 1.0690i | 0.3330 + 1.0690i | 0.3330 + 1.0690i | 0.3330 + 1.0690i |
| 15 | 0.1729 + 1.6258i | 0.4911 + 1.4059i | 0.2360 + 1.5834i | 0.4911 + 1.4059i | 0.6404 + 1.0091i | 0.6282 + 1.0792i | 0.6404 + 1.0091i | 0.6404 + 1.0091i |
| 15.5 | 0.1783 + 2.0138i | 0.4789 + 1.4380i | 0.4591 + 1.9026i | 0.4789 + 1.4380i | 0.6150 + 1.0563i | 0.6104 + 1.1350i | 0.6150 + 1.0563i | 0.6104 + 1.1350i |
| 16 | 0.1615 + 1.9642i | 0.6491 + 1.3361i | 0.8166 + 1.8585i | 0.6677 + 1.3884i | 0.6693 + 0.9448i | 0.6706 + 1.0395i | 0.6693 + 0.9448i | 0.6706 + 1.0395i |
| 16.5 | 0.7602 + 1.4834i | 0.6346 + 1.2450i | 0.6704 + 1.5226i | 0.6346 + 1.2450i | 0.6561 + 0.9154i | 0.6510 + 0.9712i | 0.6561 + 0.9154i | 0.6510 + 0.9712i |
| 17 | 0.7674 + 1.4916i | 0.6351 + 1.2441i | 0.6589 + 1.5275i | 0.6351 + 1.2441i | 0.6588 + 0.9112i | 0.6562 + 0.9680i | 0.6588 + 0.9112i | 0.6562 + 0.9680i |
| 17.5 | 0.7728 + 1.4984i | 0.6376 + 1.2436i | 0.6465 + 1.5284i | 0.6376 + 1.2436i | 0.6641 + 0.9076i | 0.6642 + 0.9656i | 0.6641 + 0.9076i | 0.6642 + 0.9656i |

-continued

| | | | | | | | | |
|---|---|---|---|---|---|---|---|---|
| 18 | 0.7831 + 1.4978i | 0.6436 + 1.2433i | 0.6418 + 1.5205i | 0.6436 + 1.2433i | 0.6733 + 0.9065i | 0.6758 + 0.9650i | 0.6733 + 0.9065i | 0.6758 + 0.9650i |
| 18.5 | 1.0099 + 1.3939i | 0.9240 + 1.1657i | 1.1966 + 1.6143i | 0.8847 + 1.1340i | 0.8199 + 0.8642i | 0.8439 + 0.9386i | 0.8199 + 0.8642i | 0.8439 + 0.9386i |
| 19 | 1.0089 + 1.3854i | 0.9317 + 1.1639i | 1.1714 + 1.6030i | 0.8884 + 1.1335i | 0.8329 + 0.8609i | 0.8584 + 0.9453i | 0.8329 + 0.8609i | 0.8584 + 0.9453i |
| 19.5 | 1.0472 + 1.3158i | 0.9601 + 1.1483i | 0.9672 + 1.4659i | 0.9033 + 1.1563i | 0.8469 + 0.8661i | 0.8955 + 0.9529i | 0.8469 + 0.8661i | 0.8608 + 0.9652i |
| 20 | 0.5008 + 1.4978i | 0.5599 + 1.2077i | 0.4017 + 1.3861i | 0.4910 + 1.2146i | 0.6594 + 0.9506i | 0.6244 + 1.0551i | 0.6594 + 0.9506i | 0.6008 + 1.0207i |
| 20.5 | 0.8136 + 1.4139i | 0.7771 + 1.2124i | 0.6965 + 1.5705i | 0.7771 + 1.2124i | 0.7896 + 0.9027i | 0.7936 + 1.0257i | 0.7896 + 0.9027i | 0.7936 + 1.0257i |
| 21 | 0.7412 + 1.4650i | 0.7761 + 1.2729i | 0.6892 + 1.6914i | 0.7846 + 1.1451i | 0.7222 + 0.8808i | 0.7685 + 0.9477i | 0.7222 + 0.8808i | 0.7561 + 1.0136i |
| 21.5 | 0.7899 + 1.6946i | 0.7179 + 1.1320i | 0.7344 + 1.4506i | 0.7296 + 1.2738i | 0.7376 + 0.9029i | 0.7043 + 0.9821i | 0.6765 + 0.8832i | 0.6698 + 0.9341i |
| 22 | 0.7843 + 1.4333i | 0.7705 + 1.2498i | 0.7026 + 1.7278i | 0.7003 + 1.1772i | 0.7420 + 0.8972i | 0.7590 + 1.0320i | 0.7021 + 0.8941i | 0.7000 + 1.0561i |
| 22.5 | 0.7634 + 1.3802i | 0.7514 + 1.1770i | 0.8230 + 1.5535i | 0.6680 + 1.2094i | 0.7721 + 0.9026i | 0.7530 + 1.0356i | 0.6926 + 0.8983i | 0.6827 + 1.0183i |
| 23 | 0.7407 + 1.4100i | 0.7168 + 1.1622i | 0.8274 + 1.5617i | 0.6629 + 1.2434i | 0.7852 + 0.9095i | 0.7666 + 1.0370i | 0.6839 + 0.9059i | 0.6837 + 1.0019i |
| 23.5 | 0.6960 + 1.6848i | 0.7272 + 1.1865i | 0.7086 + 1.4468i | 0.6649 + 1.2963i | 0.7845 + 0.9168i | 0.7512 + 1.0593i | 0.6918 + 0.9051i | 0.6794 + 1.0148i |
| 24 | 0.8224 + 1.6271i | 0.7310 + 1.1523i | 0.7840 + 1.4334i | 0.7347 + 1.2858i | 0.7779 + 0.8837i | 0.7423 + 1.0272i | 0.6821 + 0.8793i | 0.6766 + 0.9745i |
| 24.5 | 0.6380 + 1.4769i | 0.8075 + 1.1341i | 0.7223 + 1.3126i | 0.7056 + 1.1575i | 0.7675 + 0.8980i | 0.7992 + 1.0027i | 0.6777 + 0.9081i | 0.6881 + 1.0255i |
| 25 | 0.6810 + 1.4782i | 0.7864 + 1.1315i | 0.7113 + 1.3095i | 0.6760 + 1.1703i | 0.7607 + 0.9150i | 0.7845 + 1.0125i | 0.6564 + 0.9256i | 0.6660 + 1.0394i |
| 25.5 | 0.7834 + 1.3291i | 0.7989 + 1.1836i | 0.6586 + 1.3212i | 0.6790 + 1.1822i | 0.8334 + 0.9240i | 0.8389 + 1.0490i | 0.7408 + 0.9196i | 0.7235 + 1.0449i |
| 26 | 0.6326 + 1.5030i | 0.8468 + 1.1407i | 0.7209 + 1.3784i | 0.7653 + 1.2445i | 0.6935 + 0.8959i | 0.8740 + 1.0322i | 0.7256 + 0.9768i | 0.8038 + 0.9722i |
| 26.5 | 0.6623 + 1.5103i | 0.7938 + 1.1419i | 0.6742 + 1.3558i | 0.6837 + 1.2238i | 0.7039 + 0.8883i | 0.8594 + 1.0384i | 0.7255 + 0.9867i | 0.8205 + 0.9417i |
| 27 | 0.6819 + 1.4965i | 0.7875 + 1.1320i | 0.7367 + 1.3484i | 0.7100 + 1.2226i | 0.7563 + 0.9153i | 0.7455 + 1.0248i | 0.6815 + 0.9082i | 0.8338 + 1.0015i |
| 27.5 | 0.6106 + 1.5039i | 0.7463 + 1.1465i | 0.6780 + 1.3719i | 0.6672 + 1.2405i | 0.7683 + 0.9391i | 0.7867 + 1.0395i | 0.7004 + 0.9076i | 0.8788 + 0.9640i |
| 28 | 0.6738 + 1.4981i | 0.7958 + 1.1175i | 0.7244 + 1.3669i | 0.7701 + 1.2287i | 0.7924 + 0.8491i | 0.7061 + 1.0819i | 0.7163 + 0.8855i | 0.7346 + 0.9830i |

| SNR/w | w48 | w49 | w50 | w51 | w52 | w53 | w54 | w55 |
|---|---|---|---|---|---|---|---|---|
| 7 | 0.6413 + 1.1550i | 0.5789 + 1.0674i | 0.3707 + 1.2911i | 0.3565 + 1.1738i | 0.5789 + 1.0674i | 0.5789 + 1.0674i | 0.3565 + 1.1738i | 0.3565 + 1.1738i |
| 7.5 | 0.6538 + 1.1143i | 0.6538 + 1.1143i | 0.3292 + 1.2581i | 0.3292 + 1.2581i | 0.5815 + 1.0241i | 0.5815 + 1.0241i | 0.3167 + 1.1419i | 0.3167 + 1.1419i |
| 8 | 0.2944 + 1.1432i | 0.2944 + 1.1432i | 0.2944 + 1.1432i | 0.2944 + 1.1432i | 0.5978 + 1.0154i | 0.5978 + 1.0154i | 0.5978 + 1.0154i | 0.5978 + 1.0154i |
| 8.5 | 0.2766 + 1.1195i | 0.2939 + 1.3233i | 0.2766 + 1.1195i | 0.2939 + 1.3233i | 0.5908 + 0.9851i | 0.7259 + 1.1487i | 0.7259 + 1.1487i | 0.7259 + 1.1487i |
| 9 | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i |
| 10 | 0.8978 + 0.5469i | 0.8978 + 0.5469i | 0.8978 + 0.5469i | 0.8978 + 0.5469i | 0.8978 + 0.5469i | 0.8978 + 0.5469i | 0.8978 + 0.5469i | 0.8978 + 0.5469i |
| 10.5 | 0.8862 + 0.5471i | 0.8862 + 0.5471i | 0.8862 + 0.5471i | 0.8862 + 0.5471i | 0.8862 + 0.5471i | 0.8862 + 0.5471i | 0.8862 + 0.5471i | 0.8862 + 0.5471i |
| 11 | 0.4948 + 0.9134i | 0.4948 + 0.9134i | 0.4948 + 0.9134i | 0.4948 + 0.9134i | 0.4948 + 0.9134i | 0.4948 + 0.9134i | 0.4948 + 0.9134i | 0.4948 + 0.9134i |
| 11.5 | 0.5059 + 0.9024i | 0.5059 + 0.9024i | 0.5059 + 0.9024i | 0.5059 + 0.9024i | 0.5059 + 0.9024i | 0.5059 + 0.9024i | 0.5059 + 0.9024i | 0.5059 + 0.9024i |
| 12 | 0.5122 + 0.8962i | 0.5122 + 0.8962i | 0.5122 + 0.8962i | 0.5122 + 0.8962i | 0.5122 + 0.8962i | 0.5122 + 0.8962i | 0.5122 + 0.8962i | 0.5122 + 0.8962i |
| 12.5 | 0.5878 + 0.8569i | 0.5878 + 0.8569i | 0.5878 + 0.8569i | 0.5878 + 0.8569i | 0.5878 + 0.8569i | 0.5878 + 0.8569i | 0.5878 + 0.8569i | 0.5878 + 0.8569i |
| 13 | 0.8210 + 0.6087i | 0.8210 + 0.6087i | 0.8210 + 0.6087i | 0.8210 + 0.6087i | 0.8210 + 0.6087i | 0.8210 + 0.6087i | 0.8210 + 0.6087i | 0.8210 + 0.6087i |
| 13.5 | 0.6179 + 0.8129i | 0.6179 + 0.8129i | 0.6179 + 0.8129i | 0.6179 + 0.8129i | 0.5764 + 0.8728i | 0.5764 + 0.8728i | 0.5764 + 0.8728i | 0.5764 + 0.8728i |
| 14 | 0.6748 + 0.7364i | 0.6748 + 0.7364i | 0.6748 + 0.7364i | 0.6748 + 0.7364i | 0.6092 + 0.8248i | 0.6092 + 0.8248i | 0.6092 + 0.8248i | 0.6092 + 0.8248i |
| 14.5 | 0.6856 + 0.7232i | 0.6856 + 0.7232i | 0.6856 + 0.7232i | 0.6856 + 0.7232i | 0.6080 + 0.8320i | 0.6080 + 0.8320i | 0.6080 + 0.8320i | 0.6080 + 0.8320i |
| 15 | 0.6809 + 0.6002i | 0.6809 + 0.6002i | 0.6809 + 0.6002i | 0.6809 + 0.6002i | 0.6881 + 0.6763i | 0.6809 + 0.6002i | 0.6881 + 0.6763i | 0.6881 + 0.6763i |

-continued

| | | | | | | | | |
|---|---|---|---|---|---|---|---|---|
| 15.5 | 0.6528 + 0.6065i | 0.6528 + 0.6065i | 0.6528 + 0.6065i | 0.6528 + 0.6065i | 0.6768 + 0.7164i | 0.6768 + 0.7164i | 0.6768 + 0.7164i | 0.6768 + 0.7164i |
| 16 | 0.6288 + 0.5806i | 0.6288 + 0.5806i | 0.6288 + 0.5806i | 0.6288 + 0.5806i | 0.6491 + 0.6716i | 0.6491 + 0.6716i | 0.6491 + 0.6716i | 0.6491 + 0.6716i |
| 16.5 | 0.5868 + 0.5877i | 0.5868 + 0.5877i | 0.5868 + 0.5877i | 0.5868 + 0.5877i | 0.5843 + 0.6724i | 0.5843 + 0.6724i | 0.5843 + 0.6724i | 0.5843 + 0.6724i |
| 17 | 0.5837 + 0.5846i | 0.5837 + 0.5846i | 0.5837 + 0.5846i | 0.5837 + 0.5846i | 0.5812 + 0.6766i | 0.5812 + 0.6766i | 0.5812 + 0.6766i | 0.5812 + 0.6766i |
| 17.5 | 0.5794 + 0.5798i | 0.5794 + 0.5798i | 0.5794 + 0.5798i | 0.5794 + 0.5798i | 0.5767 + 0.6824i | 0.5767 + 0.6824i | 0.5767 + 0.6824i | 0.5767 + 0.6824i |
| 18 | 0.5719 + 0.5736i | 0.5719 + 0.5736i | 0.5719 + 0.5736i | 0.5719 + 0.5736i | 0.5690 + 0.6943i | 0.5690 + 0.6943i | 0.5690 + 0.6943i | 0.5690 + 0.6943i |
| 18.5 | 0.5557 + 0.5937i | 0.5557 + 0.5937i | 0.5557 + 0.5937i | 0.5557 + 0.5937i | 0.5947 + 0.7437i | 0.5947 + 0.7437i | 0.5947 + 0.7437i | 0.5947 + 0.7437i |
| 19 | 0.5631 + 0.5896i | 0.5631 + 0.5896i | 0.5631 + 0.5896i | 0.5631 + 0.5896i | 0.6085 + 0.7445i | 0.6085 + 0.7445i | 0.6085 + 0.7445i | 0.6085 + 0.7445i |
| 19.5 | 0.5710 + 0.5915i | 0.5710 + 0.5915i | 0.5710 + 0.5915i | 0.5710 + 0.5915i | 0.6218 + 0.7496i | 0.6218 + 0.7496i | 0.6218 + 0.7496i | 0.6218 + 0.7496i |
| 20 | 0.5822 + 0.5765i | 0.5822 + 0.5765i | 0.5822 + 0.5765i | 0.5822 + 0.5765i | 0.5453 + 0.7335i | 0.5453 + 0.7335i | 0.5453 + 0.7335i | 0.5453 + 0.7335i |
| 20.5 | 0.5822 + 0.5821i | 0.5822 + 0.5821i | 0.5822 + 0.5821i | 0.5822 + 0.5821i | 0.5995 + 0.7454i | 0.5995 + 0.7454i | 0.5995 + 0.7454i | 0.5995 + 0.7454i |
| 21 | 0.5616 + 0.5634i | 0.5616 + 0.5634i | 0.5616 + 0.5634i | 0.5616 + 0.5634i | 0.5660 + 0.7470i | 0.5633 + 0.7034i | 0.5660 + 0.7470i | 0.5633 + 0.7034i |
| 21.5 | 0.5594 + 0.5739i | 0.5594 + 0.5739i | 0.5594 + 0.5739i | 0.5594 + 0.5739i | 0.5418 + 0.7319i | 0.5418 + 0.7319i | 0.5418 + 0.7319i | 0.5596 + 0.7108i |
| 22 | 0.5608 + 0.5597i | 0.5608 + 0.5597i | 0.5608 + 0.5597i | 0.5608 + 0.5597i | 0.5638 + 0.7634i | 0.5616 + 0.6982i | 0.5638 + 0.7634i | 0.5616 + 0.6982i |
| 22.5 | 0.5561 + 0.5626i | 0.5561 + 0.5626i | 0.5561 + 0.5626i | 0.5742 + 0.5796i | 0.5572 + 0.7649i | 0.5581 + 0.7013i | 0.5572 + 0.7649i | 0.5581 + 0.7013i |
| 23 | 0.5438 + 0.5498i | 0.5380 + 0.5928i | 0.5956 + 0.5500i | 0.5895 + 0.5949i | 0.5352 + 0.7741i | 0.5370 + 0.6971i | 0.5807 + 0.7810i | 0.5873 + 0.6984i |
| 23.5 | 0.5420 + 0.5404i | 0.5426 + 0.5844i | 0.5959 + 0.5394i | 0.5992 + 0.5846i | 0.5405 + 0.7778i | 0.5435 + 0.6909i | 0.5919 + 0.7808i | 0.5973 + 0.6934i |
| 24 | 0.5255 + 0.5297i | 0.5242 + 0.5894i | 0.5852 + 0.5291i | 0.5854 + 0.5881i | 0.5232 + 0.7731i | 0.5221 + 0.6867i | 0.5850 + 0.7703i | 0.5860 + 0.6850i |
| 24.5 | 0.5320 + 0.5316i | 0.5261 + 0.6108i | 0.5951 + 0.5356i | 0.5905 + 0.6148i | 0.5146 + 0.8039i | 0.5192 + 0.7047i | 0.5858 + 0.8006i | 0.5865 + 0.7049i |
| 25 | 0.5351 + 0.5313i | 0.5235 + 0.6126i | 0.6088 + 0.5413i | 0.5929 + 0.6237i | 0.4978 + 0.8117i | 0.5101 + 0.7078i | 0.5655 + 0.8168i | 0.5769 + 0.7155i |
| 25.5 | 0.5530 + 0.5469i | 0.5591 + 0.6248i | 0.6363 + 0.5402i | 0.6435 + 0.6188i | 0.5711 + 0.7972i | 0.5652 + 0.7099i | 0.6605 + 0.7964i | 0.6520 + 0.7038i |
| 26 | 0.5591 + 0.5670i | 0.5177 + 0.6201i | 0.6098 + 0.6293i | 0.5253 + 0.6674i | 0.6050 + 0.8173i | 0.5282 + 0.8134i | 0.6187 + 0.7290i | 0.5315 + 0.7314i |
| 26.5 | 0.5260 + 0.5793i | 0.4902 + 0.6512i | 0.5918 + 0.6233i | 0.5219 + 0.6802i | 0.6218 + 0.8082i | 0.5542 + 0.8063i | 0.6169 + 0.7217i | 0.5205 + 0.7582i |
| 27 | 0.5743 + 0.5517i | 0.6712 + 0.5573i | 0.5951 + 0.5922i | 0.6584 + 0.6238i | 0.5523 + 0.8038i | 0.5626 + 0.7109i | 0.6275 + 0.8020i | 0.6357 + 0.7064i |
| 27.5 | 0.5592 + 0.5829i | 0.7089 + 0.5603i | 0.6120 + 0.5818i | 0.6742 + 0.6278i | 0.5700 + 0.8032i | 0.5742 + 0.7097i | 0.6450 + 0.8012i | 0.6522 + 0.7089i |
| 28 | 0.5735 + 0.5443i | 0.6544 + 0.5617i | 0.5761 + 0.6045i | 0.6223 + 0.6342i | 0.5404 + 0.8158i | 0.5418 + 0.7248i | 0.6162 + 0.8123i | 0.6016 + 0.7162i |

| SNR/w | w56 | w57 | w58 | w59 | w60 | w61 | w62 | w63 |
|---|---|---|---|---|---|---|---|---|
| 7 | 0.5789 + 1.0674i | 0.5789 + 1.0674i | 0.3565 + 1.1738i | 0.3565 + 1.1738i | 0.5789 + 1.0674i | 0.5789 + 1.0674i | 0.3565 + 1.1738i | 0.3565 + 1.1738i |
| 7.5 | 0.5815 + 1.0241i | 0.5815 + 1.0241i | 0.3167 + 1.1419i | 0.3167 + 1.1419i | 0.5815 + 1.0241i | 0.5815 + 1.0241i | 0.3167 + 1.1419i | 0.3167 + 1.1419i |
| 8 | 0.2944 + 1.1432i | 0.2944 + 1.1432i | 0.2944 + 1.1432i | 0.2944 + 1.1432i | 0.5978 + 1.0154i | 0.5978 + 1.0154i | 0.5978 + 1.0154i | 0.5978 + 1.0154i |
| 8.5 | 0.2766 + 1.1195i | 0.2766 + 1.1195i | 0.2766 + 1.1195i | 0.2766 + 1.1195i | 0.5908 + 0.9851i | 0.5908 + 0.9851i | 0.5908 + 0.9851i | 0.5908 + 0.9851i |
| 9 | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i | 0.9336 + 0.5589i |
| 9.5 | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i | 0.9126 + 0.5494i |
| 10 | 0.8978 + 0.5469i | 0.8978 + 0.5469i | 0.8978 + 0.5469i | 0.8978 + 0.5469i | 0.8978 + 0.5469i | 0.8978 + 0.5469i | 0.8978 + 0.5469i | 0.8978 + 0.5469i |
| 10.5 | 0.8862 + 0.5471i | 0.8862 + 0.5471i | 0.8862 + 0.5471i | 0.8862 + 0.5471i | 0.8862 + 0.5471i | 0.8862 + 0.5471i | 0.8862 + 0.5471i | 0.8862 + 0.5471i |
| 11 | 0.4948 + 0.9134i | 0.4948 + 0.9134i | 0.4948 + 0.9134i | 0.4948 + 0.9134i | 0.4948 + 0.9134i | 0.4948 + 0.9134i | 0.4948 + 0.9134i | 0.4948 + 0.9134i |
| 11.5 | 0.5059 + 0.9024i | 0.5059 + 0.9024i | 0.5059 + 0.9024i | 0.5059 + 0.9024i | 0.5059 + 0.9024i | 0.5059 + 0.9024i | 0.5059 + 0.9024i | 0.5059 + 0.9024i |
| 12 | 0.5122 + 0.8962i | 0.5122 + 0.8962i | 0.5122 + 0.8962i | 0.5122 + 0.8962i | 0.5122 + 0.8962i | 0.5122 + 0.8962i | 0.5122 + 0.8962i | 0.5122 + 0.8962i |
| 12.5 | 0.5878 + 0.8569i | 0.5878 + 0.8569i | 0.5878 + 0.8569i | 0.5878 + 0.8569i | 0.5878 + 0.8569i | 0.5878 + 0.8569i | 0.5878 + 0.8569i | 0.5878 + 0.8569i |

-continued

| | | | | | | | | |
|---|---|---|---|---|---|---|---|---|
| 13 | 0.8210 + 0.6087i | 0.8210 + 0.6087i | 0.8210 + 0.6087i | 0.8210 + 0.6087i | 0.8210 + 0.6087i | 0.8210 + 0.6087i | 0.8210 + 0.6087i | 0.8210 + 0.6087i |
| 13.5 | 0.6179 + 0.8129i | 0.6179 + 0.8129i | 0.6179 + 0.8129i | 0.6179 + 0.8129i | 0.6179 + 0.8129i | 0.6179 + 0.8129i | 0.6179 + 0.8129i | 0.6179 + 0.8129i |
| 14 | 0.6748 + 0.7364i | 0.6748 + 0.7364i | 0.6748 + 0.7364i | 0.6748 + 0.7364i | 0.6092 + 0.8248i | 0.6092 + 0.8248i | 0.6092 + 0.8248i | 0.6092 + 0.8248i |
| 14.5 | 0.6856 + 0.7232i | 0.6856 + 0.7232i | 0.6856 + 0.7232i | 0.6856 + 0.7232i | 0.6080 + 0.8320i | 0.6080 + 0.8320i | 0.6080 + 0.8320i | 0.6080 + 0.8320i |
| 15 | 0.6809 + 0.6002i | 0.6809 + 0.6002i | 0.6809 + 0.6002i | 0.6809 + 0.6002i | 0.6881 + 0.6763i | 0.6881 + 0.6763i | 0.6881 + 0.6763i | 0.6881 + 0.6763i |
| 15.5 | 0.7040 + 0.5764i | 0.7040 + 0.5764i | 0.7040 + 0.5764i | 0.7040 + 0.5764i | 0.7116 + 0.6428i | 0.7116 + 0.6428i | 0.7116 + 0.6428i | 0.7116 + 0.6428i |
| 16 | 0.6902 + 0.5639i | 0.6902 + 0.5639i | 0.6902 + 0.5639i | 0.6902 + 0.5639i | 0.7001 + 0.6410i | 0.7001 + 0.6410i | 0.7001 + 0.6410i | 0.7001 + 0.6410i |
| 16.5 | 0.6767 + 0.5900i | 0.6767 + 0.5900i | 0.6767 + 0.5900i | 0.6767 + 0.5900i | 0.6731 + 0.6767i | 0.6731 + 0.6767i | 0.6731 + 0.6767i | 0.6731 + 0.6767i |
| 17 | 0.6835 + 0.5871i | 0.6835 + 0.5871i | 0.6835 + 0.5871i | 0.6835 + 0.5871i | 0.6787 + 0.6820i | 0.6787 + 0.6820i | 0.6787 + 0.6820i | 0.6787 + 0.6820i |
| 17.5 | 0.6965 + 0.5828i | 0.6965 + 0.5828i | 0.6965 + 0.5828i | 0.6965 + 0.5828i | 0.6890 + 0.6902i | 0.6890 + 0.6902i | 0.6890 + 0.6902i | 0.6890 + 0.6902i |
| 18 | 0.7091 + 0.5771i | 0.7091 + 0.5771i | 0.7091 + 0.5771i | 0.7091 + 0.5771i | 0.6995 + 0.7028i | 0.6995 + 0.7028i | 0.6995 + 0.7028i | 0.6995 + 0.7028i |
| 18.5 | 0.6841 + 0.5578i | 0.6841 + 0.5578i | 0.6841 + 0.5578i | 0.6841 + 0.5578i | 0.7393 + 0.6855i | 0.7393 + 0.6855i | 0.7393 + 0.6855i | 0.7393 + 0.6855i |
| 19 | 0.7049 + 0.5452i | 0.7049 + 0.5452i | 0.7049 + 0.5452i | 0.7049 + 0.5452i | 0.7621 + 0.6859i | 0.7621 + 0.6859i | 0.7621 + 0.6859i | 0.7621 + 0.6859i |
| 19.5 | 0.7216 + 0.5424i | 0.7216 + 0.5424i | 0.7216 + 0.5424i | 0.7216 + 0.5424i | 0.7864 + 0.6980i | 0.7864 + 0.6980i | 0.7864 + 0.6980i | 0.7639 + 0.6838i |
| 20 | 0.7648 + 0.6193i | 0.7648 + 0.6193i | 0.7282 + 0.6105i | 0.7282 + 0.6105i | 0.7121 + 0.7861i | 0.7121 + 0.7861i | 0.7121 + 0.7861i | 0.6932 + 0.7604i |
| 20.5 | 0.7513 + 0.5665i | 0.7513 + 0.5665i | 0.7513 + 0.5665i | 0.7513 + 0.5665i | 0.7730 + 0.7299i | 0.7730 + 0.7299i | 0.7730 + 0.7299i | 0.7730 + 0.7299i |
| 21 | 0.7480 + 0.5637i | 0.7480 + 0.5637i | 0.7021 + 0.5632i | 0.7021 + 0.5632i | 0.7447 + 0.7193i | 0.7447 + 0.7193i | 0.7001 + 0.7175i | 0.7001 + 0.7175i |
| 21.5 | 0.7644 + 0.5865i | 0.7644 + 0.5865i | 0.7017 + 0.5836i | 0.7017 + 0.5836i | 0.7579 + 0.7381i | 0.7579 + 0.7381i | 0.6905 + 0.7394i | 0.6905 + 0.7394i |
| 22 | 0.7478 + 0.5605i | 0.7478 + 0.5605i | 0.6930 + 0.5581i | 0.6930 + 0.5581i | 0.7418 + 0.7491i | 0.7413 + 0.6938i | 0.6950 + 0.7561i | 0.6917 + 0.6959i |
| 22.5 | 0.7660 + 0.5811i | 0.7660 + 0.5811i | 0.6961 + 0.5777i | 0.6961 + 0.5777i | 0.7699 + 0.7757i | 0.7684 + 0.7133i | 0.6931 + 0.7729i | 0.6933 + 0.7088i |
| 23 | 0.7870 + 0.5451i | 0.7912 + 0.6039i | 0.7025 + 0.5494i | 0.7033 + 0.6027i | 0.7851 + 0.8112i | 0.7935 + 0.7088i | 0.6966 + 0.7929i | 0.7030 + 0.7082i |
| 23.5 | 0.7963 + 0.5341i | 0.7903 + 0.5944i | 0.7035 + 0.5353i | 0.7033 + 0.5871i | 0.7903 + 0.7972i | 0.7922 + 0.6992i | 0.6988 + 0.7924i | 0.7016 + 0.6975i |
| 24 | 0.7772 + 0.5242i | 0.7811 + 0.5804i | 0.6843 + 0.5275i | 0.6854 + 0.5855i | 0.7824 + 0.7742i | 0.7823 + 0.6813i | 0.6846 + 0.7745i | 0.6870 + 0.6835i |
| 24.5 | 0.7677 + 0.5362i | 0.7985 + 0.5994i | 0.6876 + 0.5405i | 0.6898 + 0.6182i | 0.7690 + 0.8026i | 0.8002 + 0.7097i | 0.6815 + 0.7942i | 0.6898 + 0.7018i |
| 25 | 0.7836 + 0.5649i | 0.7723 + 0.6495i | 0.6941 + 0.5537i | 0.6818 + 0.6387i | 0.7471 + 0.8318i | 0.7654 + 0.7459i | 0.6548 + 0.8214i | 0.6666 + 0.7271i |
| 25.5 | 0.8260 + 0.5243i | 0.8354 + 0.6026i | 0.7272 + 0.5323i | 0.7357 + 0.6102i | 0.8363 + 0.7982i | 0.8396 + 0.6938i | 0.7479 + 0.7978i | 0.7438 + 0.6972i |
| 26 | 0.7207 + 0.5888i | 0.8167 + 0.5761i | 0.6922 + 0.6311i | 0.8130 + 0.6488i | 0.7083 + 0.8179i | 0.8062 + 0.8263i | 0.7032 + 0.7252i | 0.8007 + 0.7286i |
| 26.5 | 0.7502 + 0.6146i | 0.8241 + 0.6346i | 0.6717 + 0.6243i | 0.8549 + 0.5585i | 0.7192 + 0.7846i | 0.8042 + 0.7367i | 0.6819 + 0.7074i | 0.8326 + 0.8445i |
| 27 | 0.8564 + 0.5757i | 0.8744 + 0.6584i | 0.7873 + 0.6025i | 0.7483 + 0.6489i | 0.7885 + 0.8284i | 0.8377 + 0.7472i | 0.7063 + 0.8058i | 0.7323 + 0.7227i |
| 27.5 | 0.8715 + 0.5878i | 0.8831 + 0.6759i | 0.8064 + 0.6168i | 0.7632 + 0.6612i | 0.8096 + 0.8448i | 0.8499 + 0.7616i | 0.7229 + 0.8172i | 0.7483 + 0.7350i |
| 28 | 0.8185 + 0.6598i | 0.8890 + 0.6878i | 0.7513 + 0.6619i | 0.6922 + 0.6583i | 0.7947 + 0.7648i | 0.8894 + 0.7813i | 0.7012 + 0.7888i | 0.6735 + 0.7261i |

| SNR/w | w64 | w65 | w66 | w67 | w68 | w69 | w70 | w71 |
|---|---|---|---|---|---|---|---|---|
| 7 | 1.8365 + 1.2473i | 1.1550 + 0.6415i | 2.1615 + 0.4280i | 1.2912 + 0.3708i | 1.1550 + 0.6415i | 1.1550 + 0.6415i | 1.2912 + 0.3708i | 1.2912 + 0.3708i |
| 7.5 | 1.7843 + 1.2148i | 1.5010 + 0.9781i | 2.1191 + 0.4071i | 1.7374 + 0.3777i | 1.1144 + 0.6528i | 1.1144 + 0.6528i | 1.2576 + 0.3290i | 1.2576 + 0.3290i |
| 8 | 2.0885 + 0.3978i | 1.7466 + 0.3528i | 1.5548 + 0.3348i | 1.5548 + 0.3348i | 1.7585 + 1.1911i | 1.4907 + 0.9885i | 1.3458 + 0.8709i | 1.3458 + 0.8709i |
| 8.5 | 2.0732 + 0.3944i | 1.6702 + 0.3300i | 1.6702 + 0.3300i | 1.5557 + 0.3149i | 1.7503 + 1.1771i | 1.4268 + 0.9462i | 1.4268 + 0.9462i | 1.3353 + 0.8771i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |

-continued

| | | | | | | | | |
|---|---|---|---|---|---|---|---|---|
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 1.5415 + 0.3062i | 1.4023 + 0.2970i | 1.5415 + 0.3062i | 1.4023 + 0.2970i | 1.4023 + 0.2970i | 1.3323 + 0.2669i | 1.3323 + 0.2669i | 1.3323 + 0.2669i |
| 11.5 | 1.5124 + 0.3127i | 1.5124 + 0.3127i | 1.5124 + 0.3127i | 1.3555 + 0.2725i | 1.3555 + 0.2725i | 1.3555 + 0.2725i | 1.3555 + 0.2725i | 1.3555 + 0.2725i |
| 12 | 1.5258 + 0.3150i | 1.5258 + 0.3150i | 1.5258 + 0.3150i | 1.3581 + 0.2718i | 1.3581 + 0.2718i | 1.3581 + 0.2718i | 1.3581 + 0.2718i | 1.3581 + 0.2718i |
| 12.5 | 1.6796 + 0.2609i | 1.6231 + 0.3777i | 1.4424 + 0.2554i | 1.4424 + 0.2554i | 1.3200 + 0.2305i | 1.3200 + 0.2305i | 1.3200 + 0.2305i | 1.3200 + 0.2305i |
| 13 | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i |
| 13.5 | 1.7821 + 0.2022i | 1.7069 + 0.6226i | 1.6649 + 0.2207i | 1.6075 + 0.4960i | 1.5283 + 0.2348i | 1.4650 + 0.3647i | 1.5283 + 0.2348i | 1.4650 + 0.3647i |
| 14 | 1.5804 + 1.3865i | 2.1260 + 0.2205i | 1.8405 + 1.0633i | 2.0446 + 0.6571i | 1.6314 + 0.2412i | 1.7090 + 0.2082i | 1.6314 + 0.2412i | 1.6314 + 0.2412i |
| 14.5 | 1.6382 + 1.3165i | 2.0902 + 0.1960i | 1.8765 + 0.9757i | 2.0346 + 0.5849i | 1.6116 + 0.2239i | 1.6865 + 0.1947i | 1.6116 + 0.2239i | 1.6116 + 0.2239i |
| 15 | 1.8736 + 0.9301i | 2.1142 + 0.3056i | 1.3817 + 0.1206i | 1.3817 + 0.1206i | 1.7352 + 0.1564i | 1.7352 + 0.1564i | 1.3817 + 0.1206i | 1.3817 + 0.1206i |
| 15.5 | 1.6897 + 0.1409i | 1.7447 + 0.1440i | 1.4104 + 0.1200i | 1.4104 + 0.1200i | 1.9715 + 0.6222i | 2.0540 + 0.2400i | 1.3565 + 0.1259i | 1.3565 + 0.1259i |
| 16 | 1.6775 + 0.1331i | 1.6321 + 0.1195i | 1.3567 + 0.1125i | 1.3567 + 0.1125i | 1.9896 + 0.2026i | 1.9730 + 0.5695i | 1.3013 + 0.1147i | 1.3013 + 0.1147i |
| 16.5 | 1.4483 + 0.1058i | 1.5082 + 0.1076i | 1.2511 + 0.1063i | 1.2511 + 0.1063i | 2.0481 + 0.1978i | 1.7457 + 0.1177i | 1.1891 + 0.1088i | 1.1891 + 0.1088i |
| 17 | 1.4531 + 0.1045i | 1.5085 + 0.1072i | 1.2484 + 0.1046i | 1.2484 + 0.1046i | 2.0518 + 0.1917i | 1.7527 + 0.1170i | 1.1874 + 0.1093i | 1.1874 + 0.1093i |
| 17.5 | 1.4543 + 0.1049i | 1.5074 + 0.1080i | 1.2478 + 0.1028i | 1.2478 + 0.1028i | 2.0450 + 0.1840i | 1.7515 + 0.1165i | 1.1867 + 0.1106i | 1.1867 + 0.1106i |
| 18 | 1.4513 + 0.1053i | 1.5036 + 0.1079i | 1.2466 + 0.1004i | 1.2466 + 0.1004i | 2.0343 + 0.1812i | 1.7462 + 0.1147i | 1.1849 + 0.1124i | 1.1849 + 0.1124i |
| 18.5 | 1.4335 + 0.0772i | 1.3407 + 0.0725i | 1.1058 + 0.0808i | 1.1058 + 0.0808i | 1.6706 + 0.1002i | 1.9444 + 0.1347i | 1.0600 + 0.0831i | 1.1058 + 0.0808i |
| 19 | 1.4268 + 0.0758i | 1.3215 + 0.0692i | 1.0950 + 0.0758i | 1.1342 + 0.0740i | 1.6492 + 0.0990i | 1.9145 + 0.1300i | 1.0506 + 0.0781i | 1.0506 + 0.0781i |
| 19.5 | 1.4256 + 0.0701i | 1.2941 + 0.0652i | 1.0723 + 0.0704i | 1.1247 + 0.0692i | 1.6348 + 0.0961i | 1.8944 + 0.1321i | 1.0262 + 0.0737i | 1.0262 + 0.0737i |
| 20 | 1.9230 + 0.1724i | 1.4387 + 0.0640i | 1.2248 + 0.0751i | 1.2729 + 0.0732i | 1.6851 + 0.1131i | 1.4739 + 0.1668i | 1.2330 + 0.2173i | 1.2857 + 0.2110i |
| 20.5 | 1.4461 + 0.0954i | 1.3740 + 0.1022i | 1.2251 + 0.0792i | 1.2251 + 0.0792i | 1.6304 + 0.0979i | 1.8780 + 0.1229i | 1.1036 + 0.0880i | 1.1036 + 0.0880i |
| 21 | 1.3631 + 0.0520i | 1.8339 + 0.1330i | 1.1991 + 0.0634i | 1.1476 + 0.0664i | 1.4080 + 0.1199i | 1.6121 + 0.0933i | 1.2253 + 0.1727i | 1.1607 + 0.1854i |
| 21.5 | 1.6991 + 0.0948i | 1.9089 + 0.1361i | 1.1361 + 0.0560i | 1.1361 + 0.0560i | 1.5161 + 0.0821i | 1.3698 + 0.0855i | 1.1545 + 0.1540i | 1.2377 + 0.1156i |
| 22 | 1.3605 + 0.0520i | 1.8286 + 0.1178i | 1.2193 + 0.0642i | 1.1598 + 0.0644i | 1.4249 + 0.1170i | 1.6056 + 0.0877i | 1.2333 + 0.1806i | 1.1693 + 0.1944i |
| 22.5 | 1.6912 + 0.0798i | 1.4055 + 0.0597i | 1.1376 + 0.0545i | 1.2506 + 0.0551i | 1.5794 + 0.1910i | 1.4051 + 0.1749i | 1.1445 + 0.1725i | 1.2429 + 0.1635i |
| 23 | 1.7275 + 0.0857i | 1.4188 + 0.0423i | 1.1857 + 0.0607i | 1.2751 + 0.0595i | 1.5834 + 0.1747i | 1.4232 + 0.1559i | 1.1749 + 0.1749i | 1.2918 + 0.1822i |
| 23.5 | 1.4664 + 0.0626i | 1.6566 + 0.0991i | 1.3043 + 0.0474i | 1.1711 + 0.0454i | 1.4135 + 0.1717i | 1.5496 + 0.2588i | 1.2755 + 0.1587i | 1.1759 + 0.1394i |
| 24 | 1.5037 + 0.0710i | 1.3591 + 0.0502i | 1.1808 + 0.0443i | 1.2467 + 0.0983i | 1.5451 + 0.2150i | 1.7164 + 0.1072i | 1.3895 + 0.2257i | 1.2198 + 0.1964i |
| 24.5 | 1.5376 + 0.0755i | 1.7254 + 0.0875i | 1.3836 + 0.0522i | 1.2524 + 0.0657i | 1.5831 + 0.2354i | 1.4320 + 0.2269i | 1.1755 + 0.2097i | 1.2871 + 0.1867i |
| 25 | 1.5306 + 0.0744i | 1.6915 + 0.1083i | 1.3846 + 0.0555i | 1.2679 + 0.0610i | 1.4621 + 0.1953i | 1.3400 + 0.2355i | 1.1762 + 0.2323i | 1.2439 + 0.1711i |
| 25.5 | 1.5775 + 0.2201i | 1.6203 + 0.0729i | 1.1822 + 0.0559i | 1.2916 + 0.0458i | 1.4605 + 0.1876i | 1.4494 + 0.0655i | 1.1852 + 0.1643i | 1.3065 + 0.1507i |
| 26 | 1.4357 + 0.0696i | 1.5824 + 0.0779i | 1.3020 + 0.0505i | 1.1807 + 0.0541i | 1.3893 + 0.1877i | 1.2727 + 0.2084i | 1.1282 + 0.2339i | 1.1761 + 0.1587i |
| 26.5 | 1.4441 + 0.0577i | 1.5851 + 0.0770i | 1.3160 + 0.0502i | 1.2061 + 0.0559i | 1.4166 + 0.1663i | 1.3051 + 0.2007i | 1.1730 + 0.2374i | 1.2080 + 0.1543i |
| 27 | 1.4179 + 0.0644i | 1.5639 + 0.0718i | 1.2943 + 0.0443i | 1.1861 + 0.0531i | 1.4462 + 0.1886i | 1.3139 + 0.1830i | 1.5847 + 0.2617i | 1.2070 + 0.1573i |
| 27.5 | 1.4359 + 0.0589i | 1.5791 + 0.0680i | 1.3202 + 0.0508i | 1.2143 + 0.0516i | 1.4507 + 0.1735i | 1.3288 + 0.1906i | 1.5715 + 0.2387i | 1.2136 + 0.1561i |
| 28 | 1.3893 + 0.0618i | 1.5163 + 0.0570i | 1.2840 + 0.0506i | 1.1933 + 0.0574i | 1.4329 + 0.1769i | 1.3157 + 0.1870i | 1.5739 + 0.1994i | 1.2085 + 0.1678i |

| SNR/w | w72 | w73 | w74 | w75 | w76 | w77 | w78 | w79 |
|---|---|---|---|---|---|---|---|---|
| 7 | 1.1550 + 0.6415i | 1.1550 + 0.6415i | 1.2912 + 0.3708i | 1.2912 + 0.3708i | 1.1550 + 0.6415i | 1.0674 + 0.5791i | 1.2912 + 0.3708i | 1.1739 + 0.3565i |
| 7.5 | 1.1144 + 0.6528i | 1.1144 + 0.6528i | 1.2576 + 0.3290i | 1.2576 + 0.3290i | 1.1144 + 0.6528i | 1.1144 + 0.6528i | 1.2576 + 0.3290i | 1.2576 + 0.3290i |

-continued

| | | | | | | | | |
|---|---|---|---|---|---|---|---|---|
| 8 | 1.2660 + 0.3053i | 1.2660 + 0.3053i | 1.2660 + 0.3053i | 1.2660 + 0.3053i | 1.1122 + 0.6781i | 1.1122 + 0.6781i | 1.1122 + 0.6781i | 1.1122 + 0.6781i |
| 8.5 | 1.1194 + 0.2766i | 1.1194 + 0.2766i | 1.1194 + 0.2766i | 1.1194 + 0.2766i | 0.9851 + 0.5907i | 0.9851 + 0.5907i | 0.9851 + 0.5907i | 0.9851 + 0.5907i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 1.4023 + 0.2970i | 1.3323 + 0.2669i | 1.3323 + 0.2669i | 1.3323 + 0.2669i | 1.3323 + 0.2669i | 1.3323 + 0.2669i | 1.3323 + 0.2669i | 1.3323 + 0.2669i |
| 11.5 | 1.3555 + 0.2725i | 1.3555 + 0.2725i | 1.3555 + 0.2725i | 1.3555 + 0.2725i | 1.3555 + 0.2725i | 1.3555 + 0.2725i | 1.3555 + 0.2725i | 1.2978 + 0.2447i |
| 12 | 1.3581 + 0.2718i | 1.3581 + 0.2718i | 1.3581 + 0.2718i | 1.3581 + 0.2718i | 1.3581 + 0.2718i | 1.2941 + 0.2659i | 1.3581 + 0.2718i | 1.2941 + 0.2659i |
| 12.5 | 1.4424 + 0.2554i | 1.3200 + 0.2305i | 1.3200 + 0.2305i | 1.3200 + 0.2305i | 1.3200 + 0.2305i | 1.3200 + 0.2305i | 1.3200 + 0.2305i | 1.3200 + 0.2305i |
| 13 | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i |
| 13.5 | 1.2722 + 0.1695i | 1.2722 + 0.1695i | 1.2722 + 0.1695i | 1.2722 + 0.1695i | 1.2722 + 0.1695i | 1.2722 + 0.1695i | 1.2722 + 0.1695i | 1.2741 + 0.2155i |
| 14 | 1.2372 + 0.1421i | 1.2372 + 0.1421i | 1.2372 + 0.1421i | 1.2372 + 0.1421i | 1.3006 + 0.1843i | 1.3006 + 0.1843i | 1.3006 + 0.1843i | 1.3006 + 0.1843i |
| 14.5 | 1.2317 + 0.1455i | 1.2317 + 0.1455i | 1.2317 + 0.1455i | 1.2317 + 0.1455i | 1.2827 + 0.1828i | 1.2317 + 0.1455i | 1.2827 + 0.1828i | 1.2827 + 0.1828i |
| 15 | 1.0365 + 0.1172i | 1.0365 + 0.1172i | 1.0890 + 0.1187i | 1.0890 + 0.1187i | 1.0365 + 0.1172i | 1.0365 + 0.1172i | 1.0365 + 0.1172i | 1.0365 + 0.1172i |
| 15.5 | 1.0016 + 0.1116i | 1.0016 + 0.1116i | 1.0736 + 0.1126i | 1.0736 + 0.1126i | 1.0016 + 0.1116i | 1.0016 + 0.1116i | 1.0736 + 0.1126i | 1.0736 + 0.1126i |
| 16 | 0.9484 + 0.1042i | 0.9484 + 0.1042i | 1.0222 + 0.1048i | 1.0222 + 0.1048i | 0.9484 + 0.1042i | 0.9484 + 0.1042i | 1.0222 + 0.1048i | 1.0222 + 0.1048i |
| 16.5 | 0.9120 + 0.1119i | 0.9120 + 0.1119i | 0.9723 + 0.1111i | 0.9723 + 0.1111i | 0.9120 + 0.1119i | 0.9120 + 0.1119i | 0.9723 + 0.1111i | 0.9723 + 0.1111i |
| 17 | 0.9068 + 0.1115i | 0.9068 + 0.1115i | 0.9684 + 0.1102i | 0.9684 + 0.1102i | 0.9068 + 0.1115i | 0.9068 + 0.1115i | 0.9684 + 0.1102i | 0.9684 + 0.1102i |
| 17.5 | 0.9046 + 0.1109i | 0.9046 + 0.1109i | 0.9677 + 0.1088i | 0.9677 + 0.1088i | 0.9046 + 0.1109i | 0.9046 + 0.1109i | 0.9677 + 0.1088i | 0.9677 + 0.1088i |
| 18 | 0.9046 + 0.1107i | 0.9046 + 0.1107i | 0.9691 + 0.1074i | 0.9691 + 0.1074i | 0.9046 + 0.1107i | 0.9046 + 0.1107i | 0.9691 + 0.1074i | 0.9691 + 0.1074i |
| 18.5 | 0.7943 + 0.1008i | 0.7943 + 0.1008i | 0.8562 + 0.0942i | 0.8562 + 0.0942i | 0.7943 + 0.1008i | 0.7943 + 0.1008i | 0.8562 + 0.0942i | 0.8562 + 0.0942i |
| 19 | 0.7768 + 0.0961i | 0.7768 + 0.0961i | 0.8426 + 0.0873i | 0.8426 + 0.0873i | 0.7768 + 0.0961i | 0.7768 + 0.0961i | 0.8426 + 0.0873i | 0.8426 + 0.0873i |
| 19.5 | 0.7513 + 0.0751i | 0.7513 + 0.0751i | 0.8156 + 0.0794i | 0.8156 + 0.0794i | 0.7661 + 0.1128i | 0.7661 + 0.1128i | 0.8454 + 0.0933i | 0.8156 + 0.0794i |
| 20 | 0.9936 + 0.0741i | 0.9936 + 0.0741i | 1.0658 + 0.0746i | 1.0658 + 0.0746i | 0.9872 + 0.2147i | 0.9872 + 0.2147i | 1.0667 + 0.2175i | 1.0667 + 0.2175i |
| 20.5 | 0.8603 + 0.0622i | 0.8603 + 0.0622i | 0.8603 + 0.0622i | 0.8603 + 0.0622i | 0.8610 + 0.1536i | 0.8610 + 0.1536i | 0.9491 + 0.1152i | 0.9491 + 0.1152i |
| 21 | 0.8976 + 0.0632i | 0.8976 + 0.0632i | 1.0064 + 0.0653i | 1.0064 + 0.0653i | 0.8957 + 0.1794i | 0.8957 + 0.1794i | 1.0081 + 0.1834i | 1.0081 + 0.1834i |
| 21.5 | 0.8981 + 0.0684i | 0.8981 + 0.0684i | 0.9819 + 0.0672i | 0.9819 + 0.0672i | 0.9033 + 0.2029i | 0.9033 + 0.2029i | 0.9990 + 0.1908i | 0.9990 + 0.1908i |
| 22 | 0.9042 + 0.0625i | 0.9042 + 0.0625i | 1.0269 + 0.0644i | 1.0269 + 0.0644i | 0.9022 + 0.1856i | 0.9022 + 0.1856i | 1.0297 + 0.1905i | 1.0297 + 0.1905i |
| 22.5 | 0.8885 + 0.0624i | 0.8885 + 0.0624i | 1.0235 + 0.0603i | 0.9860 + 0.0649i | 0.8899 + 0.1872i | 0.8899 + 0.1872i | 1.0287 + 0.1810i | 0.9915 + 0.1807i |
| 23 | 0.8931 + 0.0565i | 0.8931 + 0.0565i | 1.0364 + 0.0541i | 1.0364 + 0.0541i | 0.8908 + 0.1680i | 0.8908 + 0.1680i | 1.0289 + 0.1764i | 1.0289 + 0.1764i |
| 23.5 | 0.9003 + 0.0604i | 0.9003 + 0.0604i | 1.0088 + 0.0553i | 1.0449 + 0.0537i | 0.9091 + 0.1794i | 0.9091 + 0.1794i | 1.0442 + 0.1674i | 1.0442 + 0.1674i |
| 24 | 0.9256 + 0.0605i | 0.9256 + 0.0605i | 1.0543 + 0.0675i | 1.0543 + 0.0675i | 0.9170 + 0.1788i | 0.9170 + 0.1788i | 1.0378 + 0.1928i | 1.0895 + 0.1956i |
| 24.5 | 0.9474 + 0.0573i | 0.9474 + 0.0573i | 1.0686 + 0.0690i | 1.1345 + 0.0491i | 0.9234 + 0.1779i | 0.9234 + 0.1779i | 1.0723 + 0.1843i | 1.0268 + 0.2010i |
| 25 | 0.9630 + 0.0520i | 0.9218 + 0.0598i | 1.0488 + 0.0488i | 1.1469 + 0.0461i | 0.9571 + 0.1742i | 0.9240 + 0.1503i | 1.0655 + 0.1717i | 1.1358 + 0.1228i |
| 25.5 | 0.8699 + 0.0500i | 0.9203 + 0.0513i | 1.0902 + 0.0567i | 1.0070 + 0.0499i | 0.8680 + 0.1530i | 0.9206 + 0.1491i | 1.0838 + 0.1610i | 1.0009 + 0.1570i |
| 26 | 0.9159 + 0.0417i | 0.9301 + 0.0926i | 1.0176 + 0.0319i | 1.0715 + 0.0679i | 0.9294 + 0.2082i | 0.9297 + 0.1559i | 1.0424 + 0.2248i | 1.0467 + 0.1461i |
| 26.5 | 0.9403 + 0.0431i | 0.9115 + 0.0762i | 1.0176 + 0.0326i | 1.1072 + 0.0445i | 0.9539 + 0.2438i | 0.9401 + 0.1658i | 1.0737 + 0.2562i | 1.0556 + 0.1522i |
| 27 | 0.9113 + 0.0415i | 0.8658 + 0.0784i | 0.9957 + 0.0565i | 1.0840 + 0.0474i | 0.9122 + 0.1735i | 0.8662 + 0.1446i | 1.0072 + 0.1528i | 1.1002 + 0.1441i |

-continued

| | | | | | | | | |
|---|---|---|---|---|---|---|---|---|
| 27.5 | 0.9440 + 0.0418i | 0.8706 + 0.0464i | 1.0192 + 0.0503i | 1.1107 + 0.0449i | 0.9170 + 0.1714i | 0.8778 + 0.1234i | 1.0092 + 0.1421i | 1.1104 + 0.1311i |
| 28 | 0.8988 + 0.0380i | 0.9745 + 0.0468i | 1.0860 + 0.0321i | 1.0493 + 0.0829i | 0.9289 + 0.1655i | 0.8389 + 0.2190i | 1.0132 + 0.1785i | 1.1095 + 0.1470i |

| SNR/w | w80 | w81 | w82 | w83 | w84 | w85 | w86 | w87 |
|---|---|---|---|---|---|---|---|---|
| 7 | 1.1550 + 0.6415i | 1.1550 + 0.6415i | 1.2912 + 0.3708i | 1.2912 + 0.3708i | 1.1550 + 0.6415i | 1.0674 + 0.5791i | 1.2912 + 0.3708i | 1.1739 + 0.3565i |
| 7.5 | 1.1144 + 0.6528i | 1.1144 + 0.6528i | 1.2576 + 0.3290i | 1.2576 + 0.3290i | 1.1144 + 0.6528i | 1.1144 + 0.6528i | 1.2576 + 0.3290i | 1.2576 + 0.3290i |
| 8 | 1.2660 + 0.3053i | 1.2660 + 0.3053i | 1.2660 + 0.3053i | 1.2660 + 0.3053i | 1.1122 + 0.6781i | 1.1122 + 0.6781i | 1.1122 + 0.6781i | 1.1122 + 0.6781i |
| 8.5 | 1.3234 + 0.2940i | 1.3234 + 0.2940i | 1.3234 + 0.2940i | 1.3234 + 0.2940i | 1.1488 + 0.7259i | 1.1488 + 0.7259i | 1.1488 + 0.7259i | 1.1488 + 0.7259i |
| 9 | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i |
| 9.5 | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i |
| 10 | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i |
| 10.5 | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i |
| 11 | 1.1426 + 0.7756i | 1.1426 + 0.7756i | 1.1426 + 0.7756i | 1.1426 + 0.7756i | 1.1426 + 0.7756i | 1.1426 + 0.7756i | 1.1426 + 0.7756i | 1.1426 + 0.7756i |
| 11.5 | 1.1449 + 0.7733i | 1.1449 + 0.7733i | 1.1449 + 0.7733i | 1.1449 + 0.7733i | 1.1449 + 0.7733i | 1.1449 + 0.7733i | 1.1449 + 0.7733i | 1.1449 + 0.7733i |
| 12 | 1.1456 + 0.7737i | 1.1456 + 0.7737i | 1.1456 + 0.7737i | 1.1456 + 0.7737i | 1.1456 + 0.7737i | 1.1456 + 0.7737i | 1.1456 + 0.7737i | 1.1456 + 0.7737i |
| 12.5 | 1.1936 + 0.6891i | 1.1936 + 0.6891i | 1.1936 + 0.6891i | 1.1936 + 0.6891i | 1.1936 + 0.6891i | 1.1936 + 0.6891i | 1.1936 + 0.6891i | 1.1936 + 0.6891i |
| 13 | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i |
| 13.5 | 1.1912 + 0.6890i | 1.3555 + 0.7570i | 1.1912 + 0.6890i | 1.3044 + 0.7014i | 1.1506 + 0.5882i | 1.2444 + 0.5981i | 1.1506 + 0.5882i | 1.2444 + 0.5981i |
| 14 | 1.4081 + 0.9240i | 1.3266 + 0.8316i | 1.4081 + 0.9240i | 1.3266 + 0.8316i | 1.4911 + 0.5849i | 1.4911 + 0.5849i | 1.4911 + 0.5849i | 1.4911 + 0.5849i |
| 14.5 | 1.4323 + 0.9128i | 1.3416 + 0.8265i | 1.4323 + 0.9128i | 1.3416 + 0.8265i | 1.4950 + 0.5593i | 1.4950 + 0.5593i | 1.4950 + 0.5593i | 1.4950 + 0.5593i |
| 15 | 1.6166 + 0.6733i | 1.5327 + 0.5881i | 1.3503 + 0.3985i | 1.3503 + 0.3985i | 1.6400 + 0.4397i | 1.6400 + 0.4397i | 1.3806 + 0.3499i | 1.3503 + 0.3985i |
| 15.5 | 1.4860 + 0.5649i | 1.4860 + 0.5649i | 1.3446 + 0.3846i | 1.3446 + 0.3846i | 1.6403 + 0.5309i | 1.5852 + 0.5183i | 1.3436 + 0.3520i | 1.3446 + 0.3846i |
| 16 | 1.4894 + 0.4824i | 1.5041 + 0.5324i | 1.3069 + 0.3665i | 1.3069 + 0.3665i | 1.5903 + 0.4644i | 1.6566 + 0.5241i | 1.2875 + 0.3247i | 1.2875 + 0.3247i |
| 16.5 | 1.4385 + 0.3455i | 1.4852 + 0.3323i | 1.2393 + 0.3381i | 1.2393 + 0.3381i | 1.8518 + 0.4951i | 1.6966 + 0.3427i | 1.1870 + 0.3055i | 1.1870 + 0.3055i |
| 17 | 1.4458 + 0.3440i | 1.4918 + 0.3307i | 1.2352 + 0.3414i | 1.2352 + 0.3414i | 1.8705 + 0.5044i | 1.7104 + 0.3345i | 1.1851 + 0.3028i | 1.1851 + 0.3028i |
| 17.5 | 1.4472 + 0.3429i | 1.4936 + 0.3303i | 1.2319 + 0.3447i | 1.2319 + 0.3447i | 1.8868 + 0.5097i | 1.7156 + 0.3328i | 1.1839 + 0.2997i | 1.1839 + 0.2997i |
| 18 | 1.4449 + 0.3401i | 1.4915 + 0.3280i | 1.2294 + 0.3473i | 1.2294 + 0.3473i | 1.8862 + 0.5096i | 1.7134 + 0.3314i | 1.1821 + 0.2956i | 1.1821 + 0.2956i |
| 18.5 | 1.4077 + 0.2179i | 1.3384 + 0.2148i | 1.1296 + 0.2562i | 1.1296 + 0.2562i | 1.6531 + 0.2935i | 1.9314 + 0.4196i | 1.0809 + 0.2390i | 1.0809 + 0.2390i |
| 19 | 1.3931 + 0.2132i | 1.3188 + 0.2086i | 1.1164 + 0.2494i | 1.1164 + 0.2494i | 1.6349 + 0.2879i | 1.9151 + 0.4067i | 1.0632 + 0.2197i | 1.0632 + 0.2197i |
| 19.5 | 1.3981 + 0.2090i | 1.2948 + 0.1953i | 1.0938 + 0.2388i | 1.0938 + 0.2388i | 1.5971 + 0.2809i | 1.8304 + 0.3832i | 1.0382 + 0.2045i | 1.0382 + 0.2045i |
| 20 | 1.7815 + 0.4751i | 1.4947 + 0.5250i | 1.2330 + 0.5211i | 1.2924 + 0.5254i | 1.6486 + 0.3169i | 1.4854 + 0.3471i | 1.2402 + 0.3648i | 1.3024 + 0.3616i |
| 20.5 | 1.4528 + 0.2817i | 1.3601 + 0.2817i | 1.1850 + 0.3018i | 1.1850 + 0.3018i | 1.6350 + 0.2881i | 1.8444 + 0.4201i | 1.1109 + 0.2285i | 1.1109 + 0.2285i |
| 21 | 1.9010 + 0.4585i | 1.6938 + 0.3559i | 1.2752 + 0.4149i | 1.1803 + 0.4240i | 1.4242 + 0.2749i | 1.5512 + 0.2768i | 1.2791 + 0.3004i | 1.1734 + 0.3075i |
| 21.5 | 1.5210 + 0.4295i | 1.3922 + 0.3763i | 1.2275 + 0.4595i | 1.2578 + 0.4012i | 1.5387 + 0.2494i | 1.3855 + 0.2443i | 1.1759 + 0.2690i | 1.2344 + 0.2704i |
| 22 | 1.8348 + 0.3993i | 1.5329 + 0.3997i | 1.3013 + 0.4349i | 1.1899 + 0.4442i | 1.4158 + 0.2489i | 1.5984 + 0.2593i | 1.2925 + 0.3015i | 1.1810 + 0.3192i |
| 22.5 | 1.5888 + 0.4053i | 1.4083 + 0.4183i | 1.1560 + 0.4261i | 1.2651 + 0.4195i | 1.8004 + 0.3093i | 1.3843 + 0.2805i | 1.1504 + 0.2971i | 1.2457 + 0.2926i |
| 23 | 1.6211 + 0.3847i | 1.4209 + 0.4485i | 1.1797 + 0.4135i | 1.2791 + 0.4462i | 1.7497 + 0.3033i | 1.4218 + 0.3117i | 1.1757 + 0.2963i | 1.2821 + 0.2953i |
| 23.5 | 1.3219 + 0.5378i | 1.3808 + 0.4436i | 1.1930 + 0.4695i | 1.2166 + 0.4068i | 1.7837 + 0.3062i | 1.3978 + 0.3365i | 1.2218 + 0.2650i | 1.2151 + 0.3021i |
| 24 | 1.4544 + 0.5247i | 1.2839 + 0.5031i | 1.3919 + 0.3970i | 1.2020 + 0.4350i | 1.5721 + 0.3834i | 1.7484 + 0.3285i | 1.3331 + 0.3099i | 1.2153 + 0.3093i |
| 24.5 | 1.2528 + 0.5442i | 1.3771 + 0.4900i | 1.1779 + 0.4401i | 1.2795 + 0.4047i | 1.7543 + 0.3201i | 1.4294 + 0.3521i | 1.1682 + 0.3125i | 1.2881 + 0.3079i |

-continued

| | | | | | | | | |
|---|---|---|---|---|---|---|---|---|
| 25 | 1.2983 + 0.5282i | 1.4160 + 0.4599i | 1.1643 + 0.5224i | 1.1475 + 0.4397i | 1.5155 + 0.3070i | 1.3432 + 0.3541i | 1.1465 + 0.2989i | 1.2191 + 0.3646i |
| 25.5 | 1.2159 + 0.4133i | 1.5064 + 0.3808i | 1.1497 + 0.3852i | 1.3705 + 0.3603i | 1.7393 + 0.2807i | 1.6490 + 0.4561i | 1.1846 + 0.2701i | 1.3033 + 0.2639i |
| 26 | 1.2978 + 0.5029i | 1.3930 + 0.4106i | 1.1805 + 0.5049i | 1.1527 + 0.4078i | 1.6859 + 0.2482i | 1.3072 + 0.3236i | 1.5221 + 0.2723i | 1.1975 + 0.3375i |
| 26.5 | 1.4481 + 0.5040i | 1.3937 + 0.4028i | 1.1626 + 0.4656i | 1.2689 + 0.4386i | 1.6732 + 0.2462i | 1.3551 + 0.3008i | 1.5213 + 0.2743i | 1.2473 + 0.3399i |
| 27 | 1.3902 + 0.4354i | 1.2902 + 0.3800i | 1.1890 + 0.4695i | 1.1811 + 0.3714i | 1.4284 + 0.3107i | 1.2970 + 0.2793i | 1.0892 + 0.2786i | 1.1782 + 0.2634i |
| 27.5 | 1.3263 + 0.4151i | 1.4095 + 0.3204i | 1.2199 + 0.4281i | 1.1604 + 0.3543i | 1.5775 + 0.4006i | 1.2854 + 0.2866i | 1.0929 + 0.2569i | 1.1834 + 0.2541i |
| 28 | 1.3867 + 0.4311i | 1.4607 + 0.3299i | 1.2745 + 0.4347i | 1.1818 + 0.3938i | 1.6162 + 0.3509i | 1.3455 + 0.2946i | 1.1478 + 0.2771i | 1.2386 + 0.2982i |

| SNR/w | w88 | w89 | w90 | w91 | w92 | w93 | w94 | w95 |
|---|---|---|---|---|---|---|---|---|
| 7 | 1.1550 + 0.6415i | 1.0674 + 0.5791i | 1.2912 + 0.3708i | 1.1739 + 0.3565i | 1.0674 + 0.5791i | 1.0674 + 0.5791i | 1.1739 + 0.3565i | 1.1739 + 0.3565i |
| 7.5 | 1.1144 + 0.6528i | 1.1144 + 0.6528i | 1.2576 + 0.3290i | 1.2576 + 0.3290i | 1.0242 + 0.5805i | 1.0242 + 0.5805i | 1.1415 + 0.3165i | 1.1415 + 0.3165i |
| 8 | 1.1432 + 0.2944i | 1.1432 + 0.2944i | 1.1432 + 0.2944i | 1.1432 + 0.2944i | 1.0154 + 0.5977i | 1.0154 + 0.5977i | 1.0154 + 0.5977i | 1.0154 + 0.5977i |
| 8.5 | 1.1194 + 0.2766i | 1.1194 + 0.2766i | 1.1194 + 0.2766i | 1.1194 + 0.2766i | 0.9851 + 0.5907i | 0.9851 + 0.5907i | 0.9851 + 0.5907i | 0.9851 + 0.5907i |
| 9 | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i |
| 9.5 | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i |
| 10 | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i |
| 10.5 | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i | 0.6430 + 0.2081i |
| 11 | 1.1426 + 0.7756i | 1.1426 + 0.7756i | 1.1426 + 0.7756i | 1.1426 + 0.7756i | 1.1026 + 0.7368i | 1.1426 + 0.7756i | 1.1026 + 0.7368i | 1.1426 + 0.7756i |
| 11.5 | 1.1449 + 0.7733i | 1.1449 + 0.7733i | 1.1449 + 0.7733i | 1.1449 + 0.7733i | 1.1449 + 0.7733i | 1.1449 + 0.7733i | 1.1449 + 0.7733i | 1.1449 + 0.7733i |
| 12 | 1.1456 + 0.7737i | 1.1456 + 0.7737i | 1.1456 + 0.7737i | 1.1456 + 0.7737i | 1.1456 + 0.7737i | 1.1456 + 0.7737i | 1.1456 + 0.7737i | 1.1456 + 0.7737i |
| 12.5 | 1.1936 + 0.6891i | 1.1936 + 0.6891i | 1.1936 + 0.6891i | 1.1936 + 0.6891i | 1.1197 + 0.6410i | 1.1936 + 0.6891i | 1.1197 + 0.6410i | 1.1936 + 0.6891i |
| 13 | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i | 0.7594 + 0.1711i |
| 13.5 | 1.1039 + 0.6745i | 1.1039 + 0.6745i | 1.1039 + 0.6745i | 1.1039 + 0.6745i | 1.0988 + 0.5976i | 1.1506 + 0.5882i | 1.0988 + 0.5976i | 1.1506 + 0.5882i |
| 14 | 1.1382 + 0.6389i | 1.1382 + 0.6389i | 1.1382 + 0.6389i | 1.1382 + 0.6389i | 1.2255 + 0.5065i | 1.2255 + 0.5065i | 1.2255 + 0.5065i | 1.2255 + 0.5065i |
| 14.5 | 1.1310 + 0.6308i | 1.1310 + 0.6308i | 1.1310 + 0.6308i | 1.1310 + 0.6308i | 1.2166 + 0.4913i | 1.2166 + 0.4913i | 1.2166 + 0.4913i | 1.2166 + 0.4913i |
| 15 | 1.0418 + 0.3470i | 1.0418 + 0.3470i | 1.0418 + 0.3470i | 1.0418 + 0.3470i | 1.0418 + 0.3470i | 1.0418 + 0.3470i | 1.0418 + 0.3470i | 1.0418 + 0.3470i |
| 15.5 | 1.0001 + 0.3389i | 1.0001 + 0.3389i | 1.0652 + 0.3417i | 1.0652 + 0.3417i | 1.0001 + 0.3389i | 1.0001 + 0.3389i | 1.0652 + 0.3417i | 1.0652 + 0.3417i |
| 16 | 0.9517 + 0.3117i | 0.9517 + 0.3117i | 1.0193 + 0.3132i | 1.0193 + 0.3132i | 0.9517 + 0.3117i | 0.9517 + 0.3117i | 1.0193 + 0.3132i | 1.0193 + 0.3132i |
| 16.5 | 0.9225 + 0.3561i | 0.9225 + 0.3561i | 0.9847 + 0.3495i | 0.9847 + 0.3495i | 0.9225 + 0.3561i | 0.9225 + 0.3561i | 0.9847 + 0.3495i | 0.9847 + 0.3495i |
| 17 | 0.9169 + 0.3619i | 0.9169 + 0.3619i | 0.9815 + 0.3696i | 0.9815 + 0.3696i | 0.9180 + 0.3366i | 0.9169 + 0.3619i | 0.9849 + 0.3298i | 0.9849 + 0.3298i |
| 17.5 | 0.9142 + 0.3769i | 0.9142 + 0.3769i | 0.9815 + 0.3740i | 0.9815 + 0.3740i | 0.9156 + 0.3305i | 0.9156 + 0.3305i | 0.9860 + 0.3236i | 0.9860 + 0.3236i |
| 18 | 0.9141 + 0.3832i | 0.9141 + 0.3832i | 0.9843 + 0.3807i | 0.9843 + 0.3807i | 0.9151 + 0.3225i | 0.9151 + 0.3225i | 0.9886 + 0.3165i | 0.9886 + 0.3165i |
| 18.5 | 0.8242 + 0.3278i | 0.8242 + 0.3278i | 0.8883 + 0.3019i | 0.8883 + 0.3019i | 0.8214 + 0.2859i | 0.8214 + 0.2859i | 0.8966 + 0.2737i | 0.8883 + 0.3019i |
| 19 | 0.8215 + 0.3242i | 0.8215 + 0.3242i | 0.8868 + 0.3103i | 0.8868 + 0.3103i | 0.8108 + 0.2681i | 0.8108 + 0.2681i | 0.8869 + 0.2553i | 0.8869 + 0.2553i |
| 19.5 | 0.8200 + 0.3300i | 0.8200 + 0.3300i | 0.8835 + 0.3126i | 0.8835 + 0.3126i | 0.7990 + 0.2581i | 0.7990 + 0.2581i | 0.8734 + 0.2424i | 0.8734 + 0.2424i |
| 20 | 0.9529 + 0.5004i | 0.9529 + 0.5004i | 1.0594 + 0.5123i | 1.0594 + 0.5123i | 0.9736 + 0.3595i | 0.9736 + 0.3595i | 1.0673 + 0.3650i | 1.0673 + 0.3650i |
| 20.5 | 0.8941 + 0.3936i | 0.8941 + 0.3936i | 0.9867 + 0.3771i | 0.9867 + 0.3771i | 0.8765 + 0.2771i | 0.8765 + 0.2771i | 0.9717 + 0.2599i | 0.9717 + 0.2599i |
| 21 | 0.8921 + 0.4264i | 0.8921 + 0.4264i | 0.9966 + 0.4266i | 1.0364 + 0.4264i | 0.8935 + 0.3049i | 0.8935 + 0.3049i | 1.0116 + 0.3077i | 1.0116 + 0.3077i |
| 21.5 | 0.9111 + 0.4525i | 0.9111 + 0.4525i | 1.0660 + 0.4503i | 1.0660 + 0.4503i | 0.9102 + 0.3318i | 0.9102 + 0.3318i | 1.0425 + 0.3156i | 1.0425 + 0.3156i |
| 22 | 0.8945 + 0.4361i | 0.8945 + 0.4361i | 1.0147 + 0.4454i | 1.0566 + 0.4440i | 0.8991 + 0.3102i | 0.8991 + 0.3102i | 1.0324 + 0.3166i | 1.0324 + 0.3166i |

-continued

| | | | | | | | | |
|---|---|---|---|---|---|---|---|---|
| 22.5 | 0.8928 + 0.4472i | 0.8928 + 0.4472i | 1.0159 + 0.4386i | 1.0159 + 0.4386i | 0.8913 + 0.3120i | 0.8913 + 0.3120i | 1.0329 + 0.3081i | 0.9965 + 0.3137i |
| 23 | 0.9063 + 0.4225i | 0.9063 + 0.4225i | 1.0351 + 0.4138i | 1.0351 + 0.4138i | 0.8923 + 0.2934i | 0.8923 + 0.2934i | 1.0507 + 0.2866i | 1.0098 + 0.2870i |
| 23.5 | 0.9196 + 0.4245i | 0.9196 + 0.4245i | 1.0533 + 0.4358i | 1.0533 + 0.4358i | 0.9208 + 0.2970i | 0.9208 + 0.2970i | 1.0625 + 0.2939i | 1.0625 + 0.2939i |
| 24 | 0.8859 + 0.4034i | 0.8859 + 0.4034i | 1.0109 + 0.4143i | 1.0972 + 0.4234i | 0.9036 + 0.2927i | 0.9036 + 0.2927i | 1.0221 + 0.3073i | 1.1006 + 0.3080i |
| 24.5 | 0.8753 + 0.4197i | 0.8753 + 0.4197i | 1.0696 + 0.4404i | 0.9798 + 0.4306i | 0.8983 + 0.2987i | 0.8983 + 0.2987i | 1.0686 + 0.3238i | 1.0059 + 0.3162i |
| 25 | 0.9102 + 0.5075i | 0.9170 + 0.4303i | 1.0241 + 0.5303i | 1.0328 + 0.4412i | 0.9443 + 0.2680i | 0.9308 + 0.3404i | 1.0467 + 0.2771i | 1.0251 + 0.3580i |
| 25.5 | 0.9146 + 0.4349i | 0.9045 + 0.3595i | 1.0466 + 0.3967i | 0.9891 + 0.3453i | 0.8628 + 0.2351i | 0.8976 + 0.2659i | 1.0804 + 0.2637i | 0.9941 + 0.2617i |
| 26 | 1.0272 + 0.4905i | 1.0257 + 0.4280i | 0.9434 + 0.4788i | 0.9114 + 0.4552i | 0.9236 + 0.2785i | 0.8965 + 0.3421i | 1.0143 + 0.3002i | 0.9068 + 0.3854i |
| 26.5 | 0.9902 + 0.3600i | 0.9588 + 0.3951i | 1.0628 + 0.4448i | 0.9496 + 0.4697i | 0.8975 + 0.2987i | 0.8675 + 0.3774i | 1.1092 + 0.3451i | 0.8734 + 0.4346i |
| 27 | 1.0478 + 0.5049i | 1.0616 + 0.4245i | 0.9563 + 0.4822i | 0.9741 + 0.4130i | 0.9128 + 0.2490i | 0.9100 + 0.3284i | 1.0094 + 0.2429i | 0.9848 + 0.3374i |
| 27.5 | 1.0559 + 0.4504i | 1.0285 + 0.3785i | 0.9708 + 0.5009i | 0.9399 + 0.4335i | 0.9282 + 0.2534i | 0.9606 + 0.3233i | 1.0203 + 0.2262i | 0.9167 + 0.3776i |
| 28 | 0.9950 + 0.4764i | 0.9740 + 0.4084i | 0.9094 + 0.5124i | 0.9401 + 0.5713i | 1.0045 + 0.2913i | 1.0508 + 0.3677i | 1.0666 + 0.2494i | 0.8323 + 0.4476i |

| SNR/w | w96 | w97 | w98 | w99 | w100 | w101 | w102 | w103 |
|---|---|---|---|---|---|---|---|---|
| 7 | 1.1550 + 0.6415i | 1.1550 + 0.6415i | 1.2912 + 0.3708i | 1.2912 + 0.3708i | 1.1550 + 0.6415i | 1.0674 + 0.5791i | 1.2912 + 0.3708i | 1.1739 + 0.3565i |
| 7.5 | 1.1144 + 0.6528i | 1.1144 + 0.6528i | 1.2576 + 0.3290i | 1.2576 + 0.3290i | 1.1144 + 0.6528i | 1.1144 + 0.6528i | 1.2576 + 0.3290i | 1.2576 + 0.3290i |
| 8 | 1.2660 + 0.3053i | 1.2660 + 0.3053i | 1.2660 + 0.3053i | 1.2660 + 0.3053i | 1.1122 + 0.6781i | 1.1122 + 0.6781i | 1.1122 + 0.6781i | 1.1122 + 0.6781i |
| 8.5 | 1.3234 + 0.2940i | 1.3234 + 0.2940i | 1.3234 + 0.2940i | 1.3234 + 0.2940i | 1.1488 + 0.7259i | 1.1488 + 0.7259i | 1.1488 + 0.7259i | 1.1488 + 0.7259i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 0.9736 + 0.2211i | 0.9736 + 0.2211i | 0.9736 + 0.2211i | 0.9736 + 0.2211i | 0.9736 + 0.2211i | 0.9736 + 0.2211i | 0.9736 + 0.2211i | 0.9736 + 0.2211i |
| 11.5 | 0.9684 + 0.2116i | 0.9684 + 0.2116i | 0.9684 + 0.2116i | 0.9684 + 0.2116i | 0.9684 + 0.2116i | 0.9684 + 0.2116i | 0.9684 + 0.2116i | 0.9684 + 0.2116i |
| 12 | 0.9663 + 0.2046i | 0.9663 + 0.2046i | 0.9663 + 0.2046i | 0.9663 + 0.2046i | 0.9663 + 0.2046i | 0.9663 + 0.2046i | 0.9663 + 0.2046i | 0.9663 + 0.2046i |
| 12.5 | 0.9266 + 0.1771i | 0.9266 + 0.1771i | 0.9266 + 0.1771i | 0.9266 + 0.1771i | 0.9266 + 0.1771i | 0.9266 + 0.1771i | 0.9266 + 0.1771i | 0.9266 + 0.1771i |
| 13 | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i |
| 13.5 | 0.8935 + 0.1573i | 0.8935 + 0.1573i | 0.8935 + 0.1573i | 0.8935 + 0.1573i | 0.8935 + 0.1573i | 0.8935 + 0.1573i | 0.8935 + 0.1573i | 0.8935 + 0.1573i |
| 14 | 0.8530 + 0.1539i | 0.8530 + 0.1539i | 0.8530 + 0.1539i | 0.8530 + 0.1539i | 0.8530 + 0.1539i | 0.8530 + 0.1539i | 0.8530 + 0.1539i | 0.8530 + 0.1539i |
| 14.5 | 0.8411 + 0.1470i | 0.8411 + 0.1470i | 0.8411 + 0.1470i | 0.8411 + 0.1470i | 0.8411 + 0.1470i | 0.8411 + 0.1470i | 0.8411 + 0.1470i | 0.8411 + 0.1470i |
| 15 | 0.6390 + 0.1131i | 0.6390 + 0.1131i | 0.6390 + 0.1131i | 0.6390 + 0.1131i | 0.6390 + 0.1131i | 0.6390 + 0.1131i | 0.6390 + 0.1131i | 0.6390 + 0.1131i |
| 15.5 | 0.6273 + 0.1094i | 0.6273 + 0.1094i | 0.6273 + 0.1094i | 0.6273 + 0.1094i | 0.6273 + 0.1094i | 0.6273 + 0.1094i | 0.6273 + 0.1094i | 0.6273 + 0.1094i |
| 16 | 0.5863 + 0.1101i | 0.5863 + 0.1101i | 0.5863 + 0.1101i | 0.5863 + 0.1101i | 0.5863 + 0.1101i | 0.5863 + 0.1101i | 0.5863 + 0.1101i | 0.5863 + 0.1101i |
| 16.5 | 0.5897 + 0.1157i | 0.5897 + 0.1157i | 0.5897 + 0.1157i | 0.5897 + 0.1157i | 0.5897 + 0.1157i | 0.5897 + 0.1157i | 0.5897 + 0.1157i | 0.5897 + 0.1157i |
| 17 | 0.5857 + 0.1156i | 0.5857 + 0.1156i | 0.5857 + 0.1156i | 0.5857 + 0.1156i | 0.5857 + 0.1156i | 0.5857 + 0.1156i | 0.5857 + 0.1156i | 0.5857 + 0.1156i |
| 17.5 | 0.5809 + 0.1157i | 0.5809 + 0.1157i | 0.5809 + 0.1157i | 0.5809 + 0.1157i | 0.5809 + 0.1157i | 0.5809 + 0.1157i | 0.5809 + 0.1157i | 0.5809 + 0.1157i |
| 18 | 0.5750 + 0.1148i | 0.5750 + 0.1148i | 0.5750 + 0.1148i | 0.5750 + 0.1148i | 0.5750 + 0.1148i | 0.5750 + 0.1148i | 0.5750 + 0.1148i | 0.5750 + 0.1148i |
| 18.5 | 0.4996 + 0.0925i | 0.4996 + 0.0925i | 0.4996 + 0.0925i | 0.4996 + 0.0925i | 0.5003 + 0.1452i | 0.5003 + 0.1452i | 0.5003 + 0.1452i | 0.5003 + 0.1452i |
| 19 | 0.4795 + 0.0818i | 0.4795 + 0.0818i | 0.4795 + 0.0818i | 0.4795 + 0.0818i | 0.4840 + 0.1638i | 0.4840 + 0.1638i | 0.4840 + 0.1638i | 0.4840 + 0.1638i |
| 19.5 | 0.4652 + 0.0749i | 0.4652 + 0.0749i | 0.4652 + 0.0749i | 0.4652 + 0.0749i | 0.4737 + 0.1800i | 0.4737 + 0.1800i | 0.4737 + 0.1800i | 0.4737 + 0.1800i |

-continued

| | | | | | | | | |
|---|---|---|---|---|---|---|---|---|
| 20 | 0.6612 + 0.0694i | 0.6612 + 0.0694i | 0.6612 + 0.0694i | 0.6612 + 0.0694i | 0.6532 + 0.1712i | 0.6532 + 0.1712i | 0.6532 + 0.1712i | 0.6532 + 0.1712i |
| 20.5 | 0.5376 + 0.0651i | 0.5376 + 0.0651i | 0.5376 + 0.0651i | 0.5376 + 0.0651i | 0.5422 + 0.1817i | 0.5422 + 0.1817i | 0.5422 + 0.1817i | 0.5422 + 0.1817i |
| 21 | 0.5658 + 0.0610i | 0.5658 + 0.0610i | 0.5658 + 0.0610i | 0.5658 + 0.0610i | 0.5650 + 0.1728i | 0.5650 + 0.1728i | 0.5650 + 0.1728i | 0.5650 + 0.1728i |
| 21.5 | 0.5903 + 0.0620i | 0.5903 + 0.0620i | 0.5903 + 0.0620i | 0.5903 + 0.0620i | 0.5852 + 0.1821i | 0.5852 + 0.1821i | 0.5852 + 0.1821i | 0.5852 + 0.1821i |
| 22 | 0.5714 + 0.0583i | 0.5714 + 0.0583i | 0.5714 + 0.0583i | 0.5714 + 0.0583i | 0.5692 + 0.1735i | 0.5692 + 0.1735i | 0.5692 + 0.1735i | 0.5692 + 0.1735i |
| 22.5 | 0.5719 + 0.0592i | 0.5719 + 0.0592i | 0.5719 + 0.0592i | 0.5719 + 0.0592i | 0.5716 + 0.1807i | 0.5716 + 0.1807i | 0.5716 + 0.1807i | 0.5716 + 0.1807i |
| 23 | 0.5686 + 0.0608i | 0.5686 + 0.0608i | 0.5686 + 0.0608i | 0.5686 + 0.0608i | 0.5476 + 0.1727i | 0.5476 + 0.1727i | 0.5856 + 0.1752i | 0.5856 + 0.1752i |
| 23.5 | 0.5463 + 0.0579i | 0.5463 + 0.0579i | 0.5973 + 0.0581i | 0.5973 + 0.0581i | 0.5451 + 0.1746i | 0.5451 + 0.1746i | 0.5954 + 0.1757i | 0.5954 + 0.1757i |
| 24 | 0.5320 + 0.0551i | 0.5320 + 0.0551i | 0.5979 + 0.0547i | 0.5979 + 0.0547i | 0.5320 + 0.1673i | 0.5320 + 0.1673i | 0.5958 + 0.1663i | 0.5958 + 0.1663i |
| 24.5 | 0.5336 + 0.0530i | 0.5336 + 0.0530i | 0.6137 + 0.0524i | 0.6137 + 0.0524i | 0.5351 + 0.1608i | 0.5351 + 0.1608i | 0.6123 + 0.1597i | 0.6123 + 0.1597i |
| 25 | 0.5579 + 0.0562i | 0.5579 + 0.0562i | 0.6377 + 0.0571i | 0.6377 + 0.0571i | 0.5575 + 0.1695i | 0.5575 + 0.1695i | 0.6391 + 0.1714i | 0.6391 + 0.1714i |
| 25.5 | 0.5123 + 0.0569i | 0.5123 + 0.0569i | 0.5874 + 0.0548i | 0.5874 + 0.0548i | 0.5211 + 0.1908i | 0.5175 + 0.1547i | 0.5952 + 0.1669i | 0.5952 + 0.1669i |
| 26 | 0.5288 + 0.0400i | 0.5857 + 0.0687i | 0.4820 + 0.0208i | 0.6310 + 0.0929i | 0.5798 + 0.2126i | 0.5801 + 0.1655i | 0.6572 + 0.2101i | 0.6463 + 0.1533i |
| 26.5 | 0.5532 + 0.0309i | 0.5478 + 0.0912i | 0.6447 + 0.0402i | 0.6376 + 0.0755i | 0.5674 + 0.2153i | 0.5589 + 0.1584i | 0.6549 + 0.1897i | 0.6259 + 0.1463i |
| 27 | 0.5645 + 0.0293i | 0.5775 + 0.0917i | 0.4254 + 0.0322i | 0.6367 + 0.1004i | 0.5594 + 0.2218i | 0.5685 + 0.1676i | 0.6391 + 0.2359i | 0.6415 + 0.1699i |
| 27.5 | 0.5689 + 0.0303i | 0.5769 + 0.0968i | 0.4283 + 0.0333i | 0.6371 + 0.1067i | 0.5690 + 0.2288i | 0.5706 + 0.1684i | 0.6484 + 0.2299i | 0.6440 + 0.1694i |
| 28 | 0.5612 + 0.0506i | 0.5718 + 0.1142i | 0.4988 + 0.0234i | 0.6505 + 0.1199i | 0.5646 + 0.2390i | 0.5722 + 0.1799i | 0.6434 + 0.2525i | 0.6497 + 0.1851i |

| SNR/w | w104 | w105 | w106 | w107 | w108 | w109 | w110 | w111 |
|---|---|---|---|---|---|---|---|---|
| 7 | 1.1550 + 0.6415i | 1.0674 + 0.5791i | 1.2912 + 0.3708i | 1.1739 + 0.3565i | 1.0674 + 0.5791i | 1.0674 + 0.5791i | 1.1739 + 0.3565i | 1.1739 + 0.3565i |
| 7.5 | 1.1144 + 0.6528i | 1.1144 + 0.6528i | 1.2576 + 0.3290i | 1.2576 + 0.3290i | 1.0242 + 0.5805i | 1.0242 + 0.5805i | 1.1415 + 0.3165i | 1.1415 + 0.3165i |
| 8 | 1.1432 + 0.2944i | 1.1432 + 0.2944i | 1.1432 + 0.2944i | 1.1432 + 0.2944i | 1.0154 + 0.5977i | 1.0154 + 0.5977i | 1.0154 + 0.5977i | 1.0154 + 0.5977i |
| 8.5 | 1.1194 + 0.2766i | 1.1194 + 0.2766i | 1.1194 + 0.2766i | 1.1194 + 0.2766i | 0.9851 + 0.5907i | 0.9851 + 0.5907i | 0.9851 + 0.5907i | 0.9851 + 0.5907i |
| 9 | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i | 0.3483 + 0.1927i |
| 9.5 | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i | 0.3253 + 0.1787i |
| 10 | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i | 0.3108 + 0.1693i |
| 10.5 | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i | 0.3051 + 0.1637i |
| 11 | 0.9736 + 0.2211i | 0.9736 + 0.2211i | 0.9736 + 0.2211i | 0.9736 + 0.2211i | 0.9736 + 0.2211i | 0.9736 + 0.2211i | 0.9736 + 0.2211i | 0.9736 + 0.2211i |
| 11.5 | 0.9684 + 0.2116i | 0.9684 + 0.2116i | 0.9684 + 0.2116i | 0.9684 + 0.2116i | 0.9684 + 0.2116i | 0.9684 + 0.2116i | 0.9684 + 0.2116i | 0.9684 + 0.2116i |
| 12 | 0.9663 + 0.2046i | 0.9663 + 0.2046i | 0.9663 + 0.2046i | 0.9663 + 0.2046i | 0.9663 + 0.2046i | 0.9663 + 0.2046i | 0.9663 + 0.2046i | 0.9663 + 0.2046i |
| 12.5 | 0.9266 + 0.1771i | 0.9266 + 0.1771i | 0.9266 + 0.1771i | 0.9266 + 0.1771i | 0.9266 + 0.1771i | 0.9266 + 0.1771i | 0.9266 + 0.1771i | 0.9266 + 0.1771i |
| 13 | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i | 0.4178 + 0.1414i |
| 13.5 | 0.8935 + 0.1573i | 0.8935 + 0.1573i | 0.8935 + 0.1573i | 0.8935 + 0.1573i | 0.9409 + 0.1603i | 0.9409 + 0.1603i | 0.9409 + 0.1603i | 0.9409 + 0.1603i |
| 14 | 0.9435 + 0.1570i | 0.9435 + 0.1570i | 0.9435 + 0.1570i | 0.9435 + 0.1570i | 0.9435 + 0.1570i | 0.9435 + 0.1570i | 0.9435 + 0.1570i | 0.9435 + 0.1570i |
| 14.5 | 0.9336 + 0.1519i | 0.9336 + 0.1519i | 0.9336 + 0.1519i | 0.9336 + 0.1519i | 0.9336 + 0.1519i | 0.9336 + 0.1519i | 0.9336 + 0.1519i | 0.9336 + 0.1519i |
| 15 | 0.7280 + 0.1141i | 0.7280 + 0.1141i | 0.7280 + 0.1141i | 0.7280 + 0.1141i | 0.7280 + 0.1141i | 0.7280 + 0.1141i | 0.7280 + 0.1141i | 0.7280 + 0.1141i |
| 15.5 | 0.7185 + 0.1111i | 0.7185 + 0.1111i | 0.7185 + 0.1111i | 0.7185 + 0.1111i | 0.7185 + 0.1111i | 0.7185 + 0.1111i | 0.7185 + 0.1111i | 0.7185 + 0.1111i |
| 16 | 0.6737 + 0.1085i | 0.6737 + 0.1085i | 0.6737 + 0.1085i | 0.6737 + 0.1085i | 0.6737 + 0.1085i | 0.6737 + 0.1085i | 0.6737 + 0.1085i | 0.6737 + 0.1085i |
| 16.5 | 0.6764 + 0.1153i | 0.6764 + 0.1153i | 0.6764 + 0.1153i | 0.6764 + 0.1153i | 0.6764 + 0.1153i | 0.6764 + 0.1153i | 0.6764 + 0.1153i | 0.6764 + 0.1153i |
| 17 | 0.6807 + 0.1153i | 0.6807 + 0.1153i | 0.6807 + 0.1153i | 0.6807 + 0.1153i | 0.6807 + 0.1153i | 0.6807 + 0.1153i | 0.6807 + 0.1153i | 0.6807 + 0.1153i |

-continued

| | | | | | | | | |
|---|---|---|---|---|---|---|---|---|
| 17.5 | 0.6889 + 0.1153i | 0.6889 + 0.1153i | 0.6889 + 0.1153i | 0.6889 + 0.1153i | 0.6889 + 0.1153i | 0.6889 + 0.1153i | 0.6889 + 0.1153i | 0.6889 + 0.1153i |
| 18 | 0.7013 + 0.1150i | 0.7013 + 0.1150i | 0.7013 + 0.1150i | 0.7013 + 0.1150i | 0.7013 + 0.1150i | 0.7013 + 0.1150i | 0.7013 + 0.1150i | 0.7013 + 0.1150i |
| 18.5 | 0.5966 + 0.0943i | 0.5966 + 0.0943i | 0.5966 + 0.0943i | 0.5966 + 0.0943i | 0.5950 + 0.1350i | 0.5950 + 0.1350i | 0.5950 + 0.1350i | 0.5950 + 0.1350i |
| 19 | 0.5849 + 0.0833i | 0.5849 + 0.0833i | 0.5849 + 0.0833i | 0.5849 + 0.0833i | 0.5881 + 0.1455i | 0.5881 + 0.1455i | 0.5881 + 0.1455i | 0.5881 + 0.1455i |
| 19.5 | 0.5741 + 0.0746i | 0.5741 + 0.0746i | 0.5741 + 0.0746i | 0.5741 + 0.0746i | 0.5840 + 0.1567i | 0.5840 + 0.1567i | 0.5840 + 0.1567i | 0.5840 + 0.1567i |
| 20 | 0.8279 + 0.0709i | 0.8279 + 0.0709i | 0.8279 + 0.0709i | 0.8279 + 0.0709i | 0.8194 + 0.1956i | 0.8194 + 0.1956i | 0.8194 + 0.1956i | 0.8194 + 0.1956i |
| 20.5 | 0.6828 + 0.0657i | 0.6828 + 0.0657i | 0.6828 + 0.0657i | 0.6828 + 0.0657i | 0.6888 + 0.1733i | 0.6888 + 0.1733i | 0.6888 + 0.1733i | 0.6888 + 0.1733i |
| 21 | 0.7538 + 0.0616i | 0.7538 + 0.0616i | 0.7099 + 0.0612i | 0.7099 + 0.0612i | 0.7518 + 0.1748i | 0.7518 + 0.1748i | 0.7082 + 0.1738i | 0.7082 + 0.1738i |
| 21.5 | 0.7487 + 0.0659i | 0.7487 + 0.0659i | 0.7487 + 0.0659i | 0.7487 + 0.0659i | 0.7671 + 0.1949i | 0.7671 + 0.1949i | 0.7259 + 0.1919i | 0.7259 + 0.1919i |
| 22 | 0.7749 + 0.0604i | 0.7749 + 0.0604i | 0.7105 + 0.0596i | 0.7105 + 0.0596i | 0.7716 + 0.1792i | 0.7716 + 0.1792i | 0.7083 + 0.1767i | 0.7083 + 0.1767i |
| 22.5 | 0.7668 + 0.0619i | 0.7668 + 0.0619i | 0.7061 + 0.0610i | 0.7061 + 0.0610i | 0.7649 + 0.1855i | 0.7649 + 0.1855i | 0.7041 + 0.1839i | 0.7041 + 0.1839i |
| 23 | 0.7676 + 0.0577i | 0.7676 + 0.0577i | 0.6978 + 0.0604i | 0.6978 + 0.0604i | 0.7752 + 0.1744i | 0.7752 + 0.1744i | 0.6976 + 0.1776i | 0.6976 + 0.1776i |
| 23.5 | 0.7905 + 0.0600i | 0.7905 + 0.0600i | 0.7024 + 0.0596i | 0.7024 + 0.0596i | 0.7921 + 0.1808i | 0.7921 + 0.1808i | 0.7011 + 0.1782i | 0.7011 + 0.1782i |
| 24 | 0.8058 + 0.0559i | 0.8058 + 0.0559i | 0.7006 + 0.0544i | 0.7006 + 0.0544i | 0.7978 + 0.1683i | 0.7978 + 0.1683i | 0.6964 + 0.1646i | 0.6964 + 0.1646i |
| 24.5 | 0.8228 + 0.0536i | 0.8228 + 0.0536i | 0.7137 + 0.0524i | 0.7137 + 0.0524i | 0.8117 + 0.1648i | 0.8117 + 0.1648i | 0.7096 + 0.1603i | 0.7096 + 0.1603i |
| 25 | 0.8234 + 0.0536i | 0.8234 + 0.0536i | 0.7271 + 0.0577i | 0.7271 + 0.0577i | 0.8295 + 0.1722i | 0.8295 + 0.1722i | 0.7310 + 0.1725i | 0.7310 + 0.1725i |
| 25.5 | 0.7751 + 0.0500i | 0.7751 + 0.0500i | 0.6743 + 0.0499i | 0.6743 + 0.0499i | 0.7703 + 0.1482i | 0.7703 + 0.1482i | 0.6805 + 0.1609i | 0.6805 + 0.1609i |
| 26 | 0.8256 + 0.0420i | 0.6508 + 0.0265i | 0.7670 + 0.0378i | 0.7001 + 0.0587i | 0.8198 + 0.1719i | 0.8198 + 0.1719i | 0.7337 + 0.1934i | 0.7270 + 0.1387i |
| 26.5 | 0.8065 + 0.0845i | 0.8269 + 0.0473i | 0.7329 + 0.0868i | 0.7278 + 0.0424i | 0.8099 + 0.1836i | 0.8587 + 0.1711i | 0.7310 + 0.1812i | 1.0556 + 0.1522i |
| 27 | 0.7854 + 0.0273i | 0.7838 + 0.0820i | 0.6971 + 0.0252i | 0.6977 + 0.0837i | 0.7918 + 0.2254i | 0.7850 + 0.1575i | 0.7135 + 0.2418i | 0.7115 + 0.1638i |
| 27.5 | 0.7633 + 0.0268i | 0.7892 + 0.0699i | 0.6869 + 0.0273i | 0.6979 + 0.0911i | 0.8189 + 0.2114i | 0.8022 + 0.1410i | 0.7337 + 0.2230i | 0.7228 + 0.1574i |
| 28 | 0.8172 + 0.0455i | 0.7772 + 0.1040i | 0.7246 + 0.0275i | 0.7114 + 0.0993i | 0.8716 + 0.1301i | 0.8012 + 0.1702i | 0.7245 + 0.2595i | 0.7276 + 0.1914i |

| SNR/w | w112 | w113 | w114 | w115 | w116 | w117 | w118 | w119 |
|---|---|---|---|---|---|---|---|---|
| 7 | 1.1550 + 0.6415i | 1.0674 + 0.5791i | 1.2912 + 0.3708i | 1.1739 + 0.3565i | 1.0674 + 0.5791i | 1.0674 + 0.5791i | 1.1739 + 0.3565i | 1.1739 + 0.3565i |
| 7.5 | 1.1144 + 0.6528i | 1.1144 + 0.6528i | 1.2576 + 0.3290i | 1.2576 + 0.3290i | 1.0242 + 0.5805i | 1.0242 + 0.5805i | 1.1415 + 0.3165i | 1.1415 + 0.3165i |
| 8 | 1.1432 + 0.2944i | 1.1432 + 0.2944i | 1.1432 + 0.2944i | 1.1432 + 0.2944i | 1.0154 + 0.5977i | 1.0154 + 0.5977i | 1.0154 + 0.5977i | 1.0154 + 0.5977i |
| 8.5 | 1.1194 + 0.2766i | 1.3234 + 0.2940i | 1.1194 + 0.2766i | 1.3234 + 0.2940i | 0.9851 + 0.5907i | 1.1488 + 0.7259i | 1.1488 + 0.7259i | 1.1488 + 0.7259i |
| 9 | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i |
| 9.5 | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i |
| 10 | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i |
| 10.5 | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i |
| 11 | 0.8430 + 0.5594i | 0.8430 + 0.5594i | 0.8430 + 0.5594i | 0.8430 + 0.5594i | 0.8430 + 0.5594i | 0.8430 + 0.5594i | 0.8430 + 0.5594i | 0.8430 + 0.5594i |
| 11.5 | 0.8333 + 0.5644i | 0.8333 + 0.5644i | 0.8333 + 0.5644i | 0.8333 + 0.5644i | 0.8333 + 0.5644i | 0.8333 + 0.5644i | 0.8333 + 0.5644i | 0.8333 + 0.5644i |
| 12 | 0.8233 + 0.5743i | 0.8233 + 0.5743i | 0.8233 + 0.5743i | 0.8233 + 0.5743i | 0.8233 + 0.5743i | 0.8233 + 0.5743i | 0.8233 + 0.5743i | 0.8233 + 0.5743i |
| 12.5 | 0.8294 + 0.5072i | 0.8294 + 0.5072i | 0.8294 + 0.5072i | 0.8294 + 0.5072i | 0.8294 + 0.5072i | 0.8294 + 0.5072i | 0.8294 + 0.5072i | 0.8294 + 0.5072i |
| 13 | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i |
| 13.5 | 0.8201 + 0.4731i | 0.8201 + 0.4731i | 0.8201 + 0.4731i | 0.8201 + 0.4731i | 0.8201 + 0.4731i | 0.8201 + 0.4731i | 0.8201 + 0.4731i | 0.8201 + 0.4731i |
| 14 | 0.7998 + 0.4314i | 0.7998 + 0.4314i | 0.7998 + 0.4314i | 0.7998 + 0.4314i | 0.7998 + 0.4314i | 0.7998 + 0.4314i | 0.7998 + 0.4314i | 0.7998 + 0.4314i |
| 14.5 | 0.7916 + 0.4239i | 0.7916 + 0.4239i | 0.7916 + 0.4239i | 0.7916 + 0.4239i | 0.7916 + 0.4239i | 0.7916 + 0.4239i | 0.7916 + 0.4239i | 0.7916 + 0.4239i |

-continued

| | | | | | | | | |
|---|---|---|---|---|---|---|---|---|
| 15 | 0.6440 + 0.3324i | 0.6440 + 0.3324i | 0.6440 + 0.3324i | 0.6440 + 0.3324i | 0.6440 + 0.3324i | 0.6440 + 0.3324i | 0.6440 + 0.3324i | 0.6440 + 0.3324i |
| 15.5 | 0.6321 + 0.3233i | 0.6321 + 0.3233i | 0.6321 + 0.3233i | 0.6321 + 0.3233i | 0.6321 + 0.3233i | 0.6321 + 0.3233i | 0.6321 + 0.3233i | 0.6321 + 0.3233i |
| 16 | 0.5975 + 0.3327i | 0.5975 + 0.3327i | 0.5975 + 0.3327i | 0.5975 + 0.3327i | 0.5975 + 0.3327i | 0.5975 + 0.3327i | 0.5975 + 0.3327i | 0.5975 + 0.3327i |
| 16.5 | 0.5901 + 0.3529i | 0.5901 + 0.3529i | 0.5901 + 0.3529i | 0.5901 + 0.3529i | 0.5901 + 0.3529i | 0.5901 + 0.3529i | 0.5901 + 0.3529i | 0.5901 + 0.3529i |
| 17 | 0.5861 + 0.3535i | 0.5861 + 0.3535i | 0.5861 + 0.3535i | 0.5861 + 0.3535i | 0.5861 + 0.3535i | 0.5861 + 0.3535i | 0.5861 + 0.3535i | 0.5861 + 0.3535i |
| 17.5 | 0.5811 + 0.3607i | 0.5811 + 0.3607i | 0.5811 + 0.3607i | 0.5811 + 0.3607i | 0.5808 + 0.3344i | 0.5811 + 0.3607i | 0.5808 + 0.3344i | 0.5811 + 0.3607i |
| 18 | 0.5743 + 0.3784i | 0.5743 + 0.3784i | 0.5743 + 0.3784i | 0.5743 + 0.3784i | 0.5745 + 0.3275i | 0.5745 + 0.3275i | 0.5745 + 0.3275i | 0.5745 + 0.3275i |
| 18.5 | 0.5248 + 0.4147i | 0.5248 + 0.4147i | 0.5248 + 0.4147i | 0.5248 + 0.4147i | 0.5114 + 0.3280i | 0.5114 + 0.3280i | 0.5114 + 0.3280i | 0.5114 + 0.3280i |
| 19 | 0.5240 + 0.4309i | 0.5240 + 0.4309i | 0.5240 + 0.4309i | 0.5240 + 0.4309i | 0.5018 + 0.3260i | 0.5018 + 0.3260i | 0.5018 + 0.3260i | 0.5018 + 0.3260i |
| 19.5 | 0.5263 + 0.4439i | 0.5263 + 0.4439i | 0.5263 + 0.4439i | 0.5263 + 0.4439i | 0.4971 + 0.3267i | 0.4971 + 0.3267i | 0.4971 + 0.3267i | 0.4971 + 0.3267i |
| 20 | 0.6133 + 0.4297i | 0.6133 + 0.4297i | 0.6133 + 0.4297i | 0.6133 + 0.4297i | 0.6352 + 0.3103i | 0.6352 + 0.3103i | 0.6352 + 0.3103i | 0.6352 + 0.3103i |
| 20.5 | 0.5665 + 0.4387i | 0.5665 + 0.4387i | 0.5665 + 0.4387i | 0.5665 + 0.4387i | 0.5531 + 0.3135i | 0.5531 + 0.3135i | 0.5531 + 0.3135i | 0.5531 + 0.3135i |
| 21 | 0.5624 + 0.4230i | 0.5624 + 0.4230i | 0.5624 + 0.4230i | 0.5624 + 0.4230i | 0.5636 + 0.2986i | 0.5636 + 0.2986i | 0.5636 + 0.2986i | 0.5636 + 0.2986i |
| 21.5 | 0.5688 + 0.4357i | 0.5688 + 0.4357i | 0.5688 + 0.4357i | 0.5688 + 0.4357i | 0.5773 + 0.3079i | 0.5773 + 0.3079i | 0.5773 + 0.3079i | 0.5773 + 0.3079i |
| 22 | 0.5625 + 0.4194i | 0.5625 + 0.4194i | 0.5625 + 0.4194i | 0.5625 + 0.4194i | 0.5659 + 0.2939i | 0.5659 + 0.2939i | 0.5659 + 0.2939i | 0.5659 + 0.2939i |
| 22.5 | 0.5645 + 0.4308i | 0.5645 + 0.4308i | 0.5645 + 0.4308i | 0.5645 + 0.4308i | 0.5679 + 0.3049i | 0.5679 + 0.3049i | 0.5679 + 0.3049i | 0.5679 + 0.3049i |
| 23 | 0.5455 + 0.4271i | 0.5455 + 0.4271i | 0.5873 + 0.4287i | 0.5873 + 0.4287i | 0.5487 + 0.2990i | 0.5487 + 0.2990i | 0.5880 + 0.2980i | 0.5880 + 0.2980i |
| 23.5 | 0.5421 + 0.4218i | 0.5421 + 0.4218i | 0.5946 + 0.4228i | 0.5946 + 0.4228i | 0.5434 + 0.2954i | 0.5434 + 0.2954i | 0.5939 + 0.2963i | 0.5939 + 0.2963i |
| 24 | 0.5284 + 0.4128i | 0.5284 + 0.4128i | 0.5874 + 0.4122i | 0.5874 + 0.4122i | 0.5310 + 0.2850i | 0.5310 + 0.2850i | 0.5919 + 0.2846i | 0.5919 + 0.2846i |
| 24.5 | 0.5365 + 0.4381i | 0.5382 + 0.3853i | 0.5982 + 0.4418i | 0.6015 + 0.3864i | 0.5372 + 0.2765i | 0.5372 + 0.2765i | 0.6078 + 0.2760i | 0.6078 + 0.2760i |
| 25 | 0.5453 + 0.4454i | 0.5502 + 0.3898i | 0.6234 + 0.4539i | 0.6307 + 0.3941i | 0.5556 + 0.2865i | 0.5556 + 0.2865i | 0.6380 + 0.2905i | 0.6380 + 0.2905i |
| 25.5 | 0.5461 + 0.4689i | 0.5406 + 0.4028i | 0.6279 + 0.4619i | 0.6209 + 0.3959i | 0.5286 + 0.2713i | 0.5338 + 0.3241i | 0.6051 + 0.2663i | 0.6111 + 0.3180i |
| 26 | 0.5698 + 0.4829i | 0.5665 + 0.4039i | 0.6267 + 0.4766i | 0.6435 + 0.4035i | 0.5791 + 0.2819i | 0.5732 + 0.3319i | 0.6629 + 0.2838i | 0.6557 + 0.3430i |
| 26.5 | 0.5542 + 0.5035i | 0.5680 + 0.4220i | 0.6136 + 0.5202i | 0.6338 + 0.4274i | 0.5765 + 0.2788i | 0.5763 + 0.3431i | 0.6576 + 0.2694i | 0.6479 + 0.3478i |
| 27 | 0.5772 + 0.4729i | 0.6966 + 0.5064i | 0.6313 + 0.4262i | 0.6900 + 0.4641i | 0.5461 + 0.2809i | 0.5401 + 0.3444i | 0.6216 + 0.3057i | 0.5842 + 0.3465i |
| 27.5 | 0.5441 + 0.4997i | 0.7312 + 0.5058i | 0.6143 + 0.4752i | 0.6785 + 0.4286i | 0.5678 + 0.2914i | 0.5691 + 0.3548i | 0.6493 + 0.2928i | 0.6423 + 0.3564i |
| 28 | 0.5732 + 0.4753i | 0.7131 + 0.5308i | 0.6412 + 0.4359i | 0.6970 + 0.4732i | 0.5488 + 0.2953i | 0.5454 + 0.3628i | 0.6317 + 0.3194i | 0.5938 + 0.3612i |

| SNR/w | w120 | w121 | w122 | w123 | w124 | w125 | w126 | w127 |
|---|---|---|---|---|---|---|---|---|
| 7 | 1.0674 + 0.5791i | 1.0674 + 0.5791i | 1.1739 + 0.3565i | 1.1739 + 0.3565i | 1.0674 + 0.5791i | 1.0674 + 0.5791i | 1.1739 + 0.3565i | 1.1739 + 0.3565i |
| 7.5 | 1.0242 + 0.5805i | 1.0242 + 0.5805i | 1.1415 + 0.3165i | 1.1415 + 0.3165i | 1.0242 + 0.5805i | 1.0242 + 0.5805i | 1.1415 + 0.3165i | 1.1415 + 0.3165i |
| 8 | 1.1432 + 0.2944i | 1.1432 + 0.2944i | 1.1432 + 0.2944i | 1.1432 + 0.2944i | 1.0154 + 0.5977i | 1.0154 + 0.5977i | 1.0154 + 0.5977i | 1.0154 + 0.5977i |
| 8.5 | 1.1194 + 0.2766i | 1.1194 + 0.2766i | 1.1194 + 0.2766i | 1.1194 + 0.2766i | 0.9851 + 0.5907i | 0.9851 + 0.5907i | 0.9851 + 0.5907i | 0.9851 + 0.5907i |
| 9 | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i | 0.5591 + 0.2663i |
| 9.5 | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i | 0.5847 + 0.2673i |
| 10 | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i | 0.6046 + 0.2676i |
| 10.5 | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i | 0.5923 + 0.3291i |
| 11 | 0.8430 + 0.5594i | 0.8430 + 0.5594i | 0.8430 + 0.5594i | 0.8430 + 0.5594i | 0.8430 + 0.5594i | 0.8430 + 0.5594i | 0.8430 + 0.5594i | 0.8430 + 0.5594i |
| 11.5 | 0.8333 + 0.5644i | 0.8333 + 0.5644i | 0.8333 + 0.5644i | 0.8333 + 0.5644i | 0.8333 + 0.5644i | 0.8333 + 0.5644i | 0.8333 + 0.5644i | 0.8333 + 0.5644i |
| 12 | 0.8233 + 0.5743i | 0.8233 + 0.5743i | 0.8233 + 0.5743i | 0.8233 + 0.5743i | 0.8233 + 0.5743i | 0.8233 + 0.5743i | 0.8233 + 0.5743i | 0.8233 + 0.5743i |

-continued

| | | | | | | | | |
|---|---|---|---|---|---|---|---|---|
| 12.5 | 0.8294 + 0.5072i | 0.8294 + 0.5072i | 0.8294 + 0.5072i | 0.8294 + 0.5072i | 0.8294 + 0.5072i | 0.8294 + 0.5072i | 0.8294 + 0.5072i | 0.8294 + 0.5072i |
| 13 | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i | 0.6241 + 0.3850i |
| 13.5 | 0.8201 + 0.4731i | 0.8201 + 0.4731i | 0.8201 + 0.4731i | 0.8201 + 0.4731i | 0.8201 + 0.4731i | 0.8201 + 0.4731i | 0.8201 + 0.4731i | 0.8201 + 0.4731i |
| 14 | 0.8741 + 0.4615i | 0.8741 + 0.4615i | 0.8741 + 0.4615i | 0.8741 + 0.4615i | 0.8741 + 0.4615i | 0.8741 + 0.4615i | 0.8741 + 0.4615i | 0.8741 + 0.4615i |
| 14.5 | 0.8718 + 0.4558i | 0.8718 + 0.4558i | 0.8718 + 0.4558i | 0.8718 + 0.4558i | 0.8718 + 0.4558i | 0.8718 + 0.4558i | 0.8718 + 0.4558i | 0.8718 + 0.4558i |
| 15 | 0.7272 + 0.3352i | 0.7272 + 0.3352i | 0.7272 + 0.3352i | 0.7272 + 0.3352i | 0.7272 + 0.3352i | 0.7272 + 0.3352i | 0.7272 + 0.3352i | 0.7272 + 0.3352i |
| 15.5 | 0.7112 + 0.3323i | 0.7112 + 0.3323i | 0.7112 + 0.3323i | 0.7112 + 0.3323i | 0.7112 + 0.3323i | 0.7112 + 0.3323i | 0.7112 + 0.3323i | 0.7112 + 0.3323i |
| 16 | 0.6776 + 0.3286i | 0.6776 + 0.3286i | 0.6776 + 0.3286i | 0.6776 + 0.3286i | 0.6776 + 0.3286i | 0.6776 + 0.3286i | 0.6776 + 0.3286i | 0.6776 + 0.3286i |
| 16.5 | 0.6798 + 0.3534i | 0.6798 + 0.3534i | 0.6798 + 0.3534i | 0.6798 + 0.3534i | 0.6798 + 0.3534i | 0.6798 + 0.3534i | 0.6798 + 0.3534i | 0.6798 + 0.3534i |
| 17 | 0.6897 + 0.3587i | 0.6897 + 0.3587i | 0.6897 + 0.3587i | 0.6897 + 0.3587i | 0.6897 + 0.3587i | 0.6897 + 0.3587i | 0.6724 + 0.3390i | 0.6724 + 0.3390i |
| 17.5 | 0.6994 + 0.3653i | 0.6994 + 0.3653i | 0.6994 + 0.3653i | 0.6994 + 0.3653i | 0.6903 + 0.3342i | 0.6994 + 0.3653i | 0.6903 + 0.3342i | 0.6903 + 0.3342i |
| 18 | 0.7101 + 0.3792i | 0.7101 + 0.3792i | 0.7101 + 0.3792i | 0.7101 + 0.3792i | 0.7070 + 0.3268i | 0.7070 + 0.3268i | 0.7070 + 0.3268i | 0.7070 + 0.3268i |
| 18.5 | 0.6355 + 0.3814i | 0.6355 + 0.3814i | 0.6355 + 0.3814i | 0.6355 + 0.3814i | 0.6151 + 0.3139i | 0.6151 + 0.3139i | 0.6151 + 0.3139i | 0.6151 + 0.3139i |
| 19 | 0.6507 + 0.3851i | 0.6507 + 0.3851i | 0.6507 + 0.3851i | 0.6507 + 0.3851i | 0.6178 + 0.3034i | 0.6178 + 0.3034i | 0.6178 + 0.3034i | 0.6178 + 0.3034i |
| 19.5 | 0.6629 + 0.3939i | 0.6629 + 0.3939i | 0.6629 + 0.3939i | 0.6629 + 0.3939i | 0.6213 + 0.2984i | 0.6213 + 0.2984i | 0.6213 + 0.2984i | 0.6213 + 0.2984i |
| 20 | 0.7784 + 0.4670i | 0.7784 + 0.4670i | 0.7784 + 0.4670i | 0.7784 + 0.4670i | 0.8009 + 0.3355i | 0.8009 + 0.3355i | 0.8009 + 0.3355i | 0.8009 + 0.3355i |
| 20.5 | 0.7301 + 0.4216i | 0.7301 + 0.4216i | 0.7301 + 0.4216i | 0.7301 + 0.4216i | 0.7088 + 0.3006i | 0.7088 + 0.3006i | 0.7088 + 0.3006i | 0.7088 + 0.3006i |
| 21 | 0.7483 + 0.4245i | 0.7483 + 0.4245i | 0.7037 + 0.4239i | 0.7037 + 0.4239i | 0.7494 + 0.3007i | 0.7494 + 0.3007i | 0.7055 + 0.2997i | 0.7055 + 0.2997i |
| 21.5 | 0.7656 + 0.4486i | 0.7656 + 0.4486i | 0.7088 + 0.4464i | 0.7088 + 0.4464i | 0.7665 + 0.3224i | 0.7665 + 0.3224i | 0.7166 + 0.3187i | 0.7166 + 0.3187i |
| 22 | 0.7603 + 0.4266i | 0.7603 + 0.4266i | 0.6987 + 0.4225i | 0.6987 + 0.4225i | 0.7666 + 0.3018i | 0.7666 + 0.3018i | 0.7041 + 0.2986i | 0.7041 + 0.2986i |
| 22.5 | 0.7670 + 0.4425i | 0.7670 + 0.4425i | 0.7000 + 0.4383i | 0.7000 + 0.4383i | 0.7664 + 0.3107i | 0.7664 + 0.3107i | 0.7025 + 0.3102i | 0.7025 + 0.3102i |
| 23 | 0.7810 + 0.4229i | 0.7810 + 0.4229i | 0.7029 + 0.4322i | 0.7029 + 0.4322i | 0.7756 + 0.2985i | 0.7756 + 0.2985i | 0.6967 + 0.2986i | 0.6967 + 0.2986i |
| 23.5 | 0.7958 + 0.4134i | 0.7958 + 0.4134i | 0.7004 + 0.4218i | 0.7004 + 0.4218i | 0.7952 + 0.2982i | 0.7952 + 0.2982i | 0.6980 + 0.2962i | 0.6980 + 0.2962i |
| 24 | 0.7774 + 0.4109i | 0.7774 + 0.4109i | 0.6863 + 0.4107i | 0.6863 + 0.4107i | 0.7842 + 0.2820i | 0.7842 + 0.2820i | 0.6911 + 0.2828i | 0.6911 + 0.2828i |
| 24.5 | 0.7755 + 0.4408i | 0.7713 + 0.3997i | 0.6867 + 0.4431i | 0.6891 + 0.3906i | 0.7912 + 0.2860i | 0.7912 + 0.2860i | 0.7000 + 0.2778i | 0.7000 + 0.2778i |
| 25 | 0.7995 + 0.4820i | 0.8171 + 0.4128i | 0.7102 + 0.4660i | 0.7219 + 0.4003i | 0.8339 + 0.2736i | 0.8318 + 0.3245i | 0.7325 + 0.2751i | 0.7307 + 0.3150i |
| 25.5 | 0.8154 + 0.4444i | 0.8041 + 0.3748i | 0.7181 + 0.4538i | 0.7090 + 0.3874i | 0.7836 + 0.2479i | 0.7852 + 0.2984i | 0.6906 + 0.2579i | 0.6979 + 0.3074i |
| 26 | 0.7109 + 0.5267i | 0.7933 + 0.4911i | 0.6853 + 0.4989i | 0.7434 + 0.4295i | 0.8119 + 0.2687i | 0.8144 + 0.3360i | 0.7394 + 0.2759i | 0.7571 + 0.3617i |
| 26.5 | 0.7330 + 0.5364i | 0.7626 + 0.4705i | 0.6735 + 0.5353i | 0.7029 + 0.4406i | 0.8089 + 0.2759i | 0.7900 + 0.3695i | 0.7325 + 0.2706i | 0.7251 + 0.3586i |
| 27 | 0.8413 + 0.5029i | 0.8110 + 0.4476i | 0.6888 + 0.3768i | 0.7429 + 0.4148i | 0.8225 + 0.2737i | 0.8412 + 0.3609i | 0.7112 + 0.3146i | 0.7703 + 0.3556i |
| 27.5 | 0.8444 + 0.5124i | 0.7991 + 0.4492i | 0.6143 + 0.4752i | 0.7216 + 0.4137i | 0.8351 + 0.2795i | 0.8172 + 0.3610i | 0.7372 + 0.2864i | 0.7394 + 0.3488i |
| 28 | 0.8115 + 0.5747i | 0.9164 + 0.3766i | 0.7047 + 0.3807i | 0.7428 + 0.4237i | 0.9347 + 0.2772i | 0.8627 + 0.3189i | 0.7327 + 0.3199i | 0.8033 + 0.3671i |

| SNR/w | w128 | w129 | w130 | w131 | w132 | w133 | w134 | w135 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2279 + 0.4119i | 0.2279 + 0.4119i | 0.2279 + 0.4119i | 0.2279 + 0.4119i | 0.2279 + 0.4119i | 0.2279 + 0.4119i | 0.2279 + 0.4119i | 0.2279 + 0.4119i |
| 8.5 | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i |
| 9 | 0.3931 + 2.0687i | 0.2962 + 1.4568i | 0.2962 + 1.4568i | 0.2962 + 1.4568i | 0.2962 + 1.4568i | 0.2962 + 1.4568i | 0.2962 + 1.4568i | 0.2850 + 1.3540i |
| 9.5 | 0.4001 + 2.0659i | 0.2931 + 1.4703i | 0.2931 + 1.4703i | 0.2931 + 1.4703i | 0.2931 + 1.4703i | 0.2931 + 1.4703i | 0.2931 + 1.4703i | 0.2804 + 1.3831i |

-continued

| | | | | | | | | |
|---|---|---|---|---|---|---|---|---|
| 10 | 0.4076 + 2.0613i | 0.2877 + 1.4563i | 0.2877 + 1.4563i | 0.2877 + 1.4563i | 0.2877 + 1.4563i | 0.2877 + 1.4563i | 0.2877 + 1.4563i | 0.2877 + 1.4563i |
| 10.5 | 0.4367 + 2.0633i | 0.2937 + 1.4820i | 0.2937 + 1.4820i | 0.2937 + 1.4820i | 0.2937 + 1.4820i | 0.2937 + 1.4820i | 0.2937 + 1.4820i | 0.2763 + 1.4151i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i |
| 13 | 0.7072 + 1.7916i | 0.3864 + 1.5448i | 0.5480 + 1.7046i | 0.3864 + 1.5448i | 0.1823 + 1.3021i | 0.1823 + 1.3021i | 0.1823 + 1.3021i | 0.1823 + 1.3021i |
| 13.5 | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i |
| 14 | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i |
| 14.5 | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i |
| 15 | 0.1089 + 0.9337i | 0.1089 + 0.9337i | 0.1089 + 0.9337i | 0.1089 + 0.9337i | 0.1557 + 0.8813i | 0.1557 + 0.8813i | 0.1557 + 0.8813i | 0.1557 + 0.8813i |
| 15.5 | 0.1085 + 0.9355i | 0.1085 + 0.9355i | 0.1085 + 0.9355i | 0.1085 + 0.9355i | 0.1634 + 0.8895i | 0.1634 + 0.8895i | 0.1634 + 0.8895i | 0.1634 + 0.8895i |
| 16 | 0.1050 + 1.1694i | 0.1444 + 1.1486i | 0.1050 + 1.1694i | 0.1444 + 1.1486i | 0.1598 + 0.9603i | 0.1598 + 0.9603i | 0.1598 + 0.9603i | 0.1598 + 0.9603i |
| 16.5 | 0.0972 + 1.5339i | 0.1100 + 1.2587i | 0.1342 + 1.7892i | 0.1127 + 1.2073i | 0.1134 + 0.9196i | 0.1137 + 0.9858i | 0.1134 + 0.9196i | 0.1137 + 0.9858i |
| 17 | 0.0983 + 1.5325i | 0.1102 + 1.2536i | 0.1311 + 1.7918i | 0.1116 + 1.2028i | 0.1130 + 0.9150i | 0.1137 + 0.9836i | 0.1130 + 0.9150i | 0.1137 + 0.9836i |
| 17.5 | 0.0987 + 1.5243i | 0.1109 + 1.2478i | 0.1257 + 1.7839i | 0.1117 + 1.1979i | 0.1131 + 0.9127i | 0.1143 + 0.9836i | 0.1131 + 0.9127i | 0.1143 + 0.9836i |
| 18 | 0.1006 + 1.5247i | 0.1112 + 1.2459i | 0.1242 + 1.7780i | 0.1122 + 1.1982i | 0.1117 + 0.9130i | 0.1132 + 0.9853i | 0.1117 + 0.9130i | 0.1132 + 0.9853i |
| 18.5 | 0.0767 + 1.5118i | 0.0870 + 1.3422i | 0.1944 + 2.0287i | 0.0901 + 1.2929i | 0.0881 + 1.0369i | 0.0875 + 1.1126i | 0.0881 + 1.0369i | 0.0875 + 1.1126i |
| 19 | 0.0744 + 1.4981i | 0.0851 + 1.3326i | 0.1794 + 2.0056i | 0.0874 + 1.2840i | 0.0808 + 1.0409i | 0.0820 + 1.1126i | 0.0808 + 1.0409i | 0.0820 + 1.1126i |
| 19.5 | 0.0752 + 1.5337i | 0.0955 + 1.3157i | 0.1184 + 1.4863i | 0.0955 + 1.3157i | 0.0762 + 1.0479i | 0.0803 + 1.1289i | 0.0762 + 1.0479i | 0.0803 + 1.1289i |
| 20 | 0.1316 + 1.8965i | 0.0779 + 1.0678i | 0.0714 + 1.3185i | 0.0721 + 1.1636i | 0.0703 + 0.7860i | 0.0680 + 0.8535i | 0.0703 + 0.7860i | 0.0680 + 0.8535i |
| 20.5 | 0.0626 + 1.4912i | 0.0694 + 1.2086i | 0.0906 + 1.3933i | 0.0694 + 1.2086i | 0.0650 + 0.9379i | 0.0667 + 1.0256i | 0.0650 + 0.9379i | 0.0667 + 1.0256i |
| 21 | 0.0566 + 1.3765i | 0.0634 + 1.2157i | 0.1312 + 1.8435i | 0.0646 + 1.1619i | 0.0641 + 0.9102i | 0.0644 + 1.0160i | 0.0641 + 0.9102i | 0.0644 + 1.0160i |
| 21.5 | 0.0769 + 1.6079i | 0.0600 + 1.1808i | 0.0696 + 1.4311i | 0.0605 + 1.2664i | 0.0589 + 0.8958i | 0.0594 + 1.0308i | 0.0589 + 0.8958i | 0.0594 + 1.0308i |
| 22 | 0.0510 + 1.3552i | 0.0609 + 1.2217i | 0.1064 + 1.8045i | 0.0551 + 1.1486i | 0.0634 + 0.8931i | 0.0594 + 1.0082i | 0.0634 + 0.8931i | 0.0594 + 1.0082i |
| 22.5 | 0.0791 + 1.6235i | 0.0595 + 1.1619i | 0.0601 + 1.4463i | 0.0547 + 1.2748i | 0.0600 + 0.8898i | 0.0596 + 1.0378i | 0.0600 + 0.8898i | 0.0611 + 0.9993i |
| 23 | 0.0749 + 1.6355i | 0.0569 + 1.1877i | 0.0706 + 1.4379i | 0.0637 + 1.3045i | 0.0517 + 0.8912i | 0.0510 + 1.0772i | 0.0517 + 0.8912i | 0.0557 + 1.0136i |
| 23.5 | 0.0477 + 1.8317i | 0.0474 + 1.1599i | 0.0728 + 1.4375i | 0.0610 + 1.3181i | 0.0576 + 0.8796i | 0.0537 + 1.0431i | 0.0576 + 0.8796i | 0.0564 + 0.9856i |
| 24 | 0.0878 + 1.7221i | 0.0632 + 1.2393i | 0.0735 + 1.5241i | 0.0421 + 1.3702i | 0.0575 + 0.9316i | 0.0611 + 1.1293i | 0.0575 + 0.9316i | 0.0593 + 1.0507i |
| 24.5 | 0.0895 + 1.7536i | 0.0613 + 1.3638i | 0.0760 + 1.5470i | 0.0501 + 1.2243i | 0.0488 + 0.9067i | 0.0467 + 1.0086i | 0.0503 + 0.8690i | 0.0466 + 1.1053i |
| 25 | 0.0931 + 1.7166i | 0.0566 + 1.3482i | 0.0751 + 1.5225i | 0.0462 + 1.2117i | 0.0474 + 0.9022i | 0.0455 + 0.9995i | 0.0493 + 0.8602i | 0.0444 + 1.0970i |
| 25.5 | 0.0758 + 1.6507i | 0.0505 + 1.3310i | 0.0710 + 1.4902i | 0.0549 + 1.2097i | 0.0438 + 0.9415i | 0.0377 + 1.0346i | 0.0846 + 0.9291i | 0.0622 + 1.1023i |
| 26 | 0.0601 + 1.4639i | 0.0558 + 1.3274i | 0.1068 + 1.6195i | 0.0328 + 1.1706i | 0.0431 + 0.8824i | 0.0431 + 0.8824i | 0.0642 + 0.9670i | 0.0431 + 1.0429i |
| 26.5 | 0.0683 + 1.5203i | 0.0701 + 1.3841i | 0.0850 + 1.6726i | 0.0362 + 1.2588i | 0.0544 + 0.9100i | 0.0513 + 0.9841i | 0.0324 + 1.1232i | 0.0576 + 1.0610i |
| 27 | 0.0637 + 1.4870i | 0.0530 + 1.3497i | 0.0764 + 1.6418i | 0.0536 + 1.2353i | 0.0420 + 0.9016i | 0.0378 + 0.9756i | 0.0444 + 1.1113i | 0.0805 + 1.0397i |
| 27.5 | 0.0628 + 1.3974i | 0.0561 + 1.2894i | 0.0641 + 1.5359i | 0.1283 + 1.2196i | 0.0408 + 0.9054i | 0.0369 + 0.9810i | 0.0341 + 1.1435i | 0.0589 + 1.0577i |
| 28 | 0.0586 + 1.3727i | 0.1555 + 1.3034i | 0.0663 + 1.5122i | 0.1473 + 1.1900i | 0.0359 + 0.9236i | 0.0375 + 1.0235i | 0.0402 + 1.2339i | 0.0477 + 1.1266i |

| SNR/w | w136 | w137 | w138 | w139 | w140 | w141 | w142 | w143 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |

-continued

| | | | | | | | | |
|---|---|---|---|---|---|---|---|---|
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2279 + 0.4119i | 0.2279 + 0.4119i | 0.2279 + 0.4119i | 0.2279 + 0.4119i | 0.2540 + 0.4692i | 0.2279 + 0.4119i | 0.2540 + 0.4692i | 0.2279 + 0.4119i |
| 8.5 | 0.2621 + 0.5179i | 0.2175 + 0.3998i | 0.2621 + 0.5179i | 0.2175 + 0.3998i | 0.2621 + 0.5179i | 0.2621 + 0.5179i | 0.2621 + 0.5179i | 0.2621 + 0.5179i |
| 9 | 0.2962 + 1.4568i | 0.2962 + 1.4568i | 0.2962 + 1.4568i | 0.2850 + 1.3540i | 0.2962 + 1.4568i | 0.2850 + 1.3540i | 0.2850 + 1.3540i | 0.2850 + 1.3540i |
| 9.5 | 0.2931 + 1.4703i | 0.2931 + 1.4703i | 0.2931 + 1.4703i | 0.2804 + 1.3831i | 0.2931 + 1.4703i | 0.2804 + 1.3831i | 0.2804 + 1.3831i | 0.2804 + 1.3831i |
| 10 | 0.2877 + 1.4563i | 0.2877 + 1.4563i | 0.2877 + 1.4563i | 0.2877 + 1.4563i | 0.2877 + 1.4563i | 0.2877 + 1.4563i | 0.2877 + 1.4563i | 0.2727 + 1.3797i |
| 10.5 | 0.2937 + 1.4820i | 0.2937 + 1.4820i | 0.2937 + 1.4820i | 0.2763 + 1.4151i | 0.2937 + 1.4820i | 0.2763 + 1.4151i | 0.2763 + 1.4151i | 0.2763 + 1.4151i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i |
| 13 | 0.2783 + 2.0929i | 0.2668 + 1.5463i | 0.2047 + 1.8160i | 0.2333 + 1.6150i | 0.1823 + 1.3021i | 0.1823 + 1.3021i | 0.1823 + 1.3021i | 0.1790 + 1.3480i |
| 13.5 | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i |
| 14 | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i |
| 14.5 | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i | 0.1124 + 0.4809i |
| 15 | 0.1089 + 0.9337i | 0.1089 + 0.9337i | 0.1089 + 0.9337i | 0.1089 + 0.9337i | 0.1557 + 0.8813i | 0.1557 + 0.8813i | 0.1557 + 0.8813i | 0.1557 + 0.8813i |
| 15.5 | 0.1085 + 0.9355i | 0.1085 + 0.9355i | 0.1085 + 0.9355i | 0.1085 + 0.9355i | 0.1634 + 0.8895i | 0.1634 + 0.8895i | 0.1634 + 0.8895i | 0.1634 + 0.8895i |
| 16 | 0.1050 + 1.1694i | 0.1444 + 1.1486i | 0.1050 + 1.1694i | 0.1444 + 1.1486i | 0.1598 + 0.9603i | 0.1598 + 0.9603i | 0.1598 + 0.9603i | 0.1598 + 0.9603i |
| 16.5 | 0.1003 + 1.4730i | 0.1100 + 1.2587i | 0.2016 + 2.0694i | 0.1127 + 1.2073i | 0.1134 + 0.9196i | 0.1137 + 0.9858i | 0.1134 + 0.9196i | 0.1137 + 0.9858i |
| 17 | 0.0998 + 1.4730i | 0.1102 + 1.2536i | 0.2013 + 2.0723i | 0.1116 + 1.2028i | 0.1130 + 0.9150i | 0.1137 + 0.9836i | 0.1130 + 0.9150i | 0.1137 + 0.9836i |
| 17.5 | 0.0988 + 1.4659i | 0.1109 + 1.2478i | 0.1973 + 2.0632i | 0.1117 + 1.1979i | 0.1131 + 0.9127i | 0.1143 + 0.9836i | 0.1131 + 0.9127i | 0.1143 + 0.9836i |
| 18 | 0.0991 + 1.4625i | 0.1112 + 1.2459i | 0.1977 + 2.0538i | 0.1122 + 1.1982i | 0.1117 + 0.9130i | 0.1132 + 0.9853i | 0.1117 + 0.9130i | 0.1132 + 0.9853i |
| 18.5 | 0.1910 + 1.5579i | 0.2343 + 1.3492i | 0.1431 + 1.7701i | 0.2372 + 1.2959i | 0.1908 + 1.0283i | 0.2050 + 1.1029i | 0.1908 + 1.0283i | 0.2050 + 1.1029i |
| 19 | 0.2005 + 1.5419i | 0.2412 + 1.3402i | 0.1377 + 1.7502i | 0.2448 + 1.2861i | 0.2107 + 1.0297i | 0.2222 + 1.1025i | 0.2107 + 1.0297i | 0.2222 + 1.1025i |
| 19.5 | 0.1545 + 1.7181i | 0.2624 + 1.2819i | 0.2850 + 1.5423i | 0.2677 + 1.3192i | 0.2186 + 1.0320i | 0.2321 + 1.1085i | 0.2186 + 1.0320i | 0.2321 + 1.1085i |
| 20 | 0.0990 + 1.6597i | 0.0779 + 1.0678i | 0.0744 + 1.4636i | 0.0779 + 1.0678i | 0.1218 + 0.7966i | 0.1044 + 0.8769i | 0.1218 + 0.7966i | 0.1044 + 0.8769i |
| 20.5 | 0.1248 + 1.6210i | 0.1957 + 1.2003i | 0.2104 + 1.4066i | 0.1957 + 1.2003i | 0.1871 + 0.9324i | 0.1917 + 1.0185i | 0.1871 + 0.9324i | 0.1917 + 1.0185i |
| 21 | 0.1464 + 1.4100i | 0.1799 + 1.2274i | 0.0916 + 1.6132i | 0.1856 + 1.1690i | 0.1852 + 0.9092i | 0.1867 + 1.0190i | 0.1852 + 0.9092i | 0.1867 + 1.0190i |
| 21.5 | 0.1329 + 1.8110i | 0.1785 + 1.1792i | 0.1881 + 1.4135i | 0.1836 + 1.2632i | 0.1684 + 0.8948i | 0.1725 + 1.0304i | 0.1684 + 0.8948i | 0.1725 + 1.0304i |
| 22 | 0.0760 + 1.4947i | 0.1660 + 1.1960i | 0.1932 + 1.6270i | 0.1685 + 1.1538i | 0.1862 + 0.8964i | 0.1808 + 1.0223i | 0.1862 + 0.8964i | 0.1808 + 1.0223i |
| 22.5 | 0.1993 + 1.7519i | 0.1777 + 1.1663i | 0.1733 + 1.4310i | 0.1704 + 1.2820i | 0.1781 + 0.8873i | 0.1775 + 1.0391i | 0.1781 + 0.8873i | 0.1776 + 0.9980i |
| 23 | 0.0964 + 1.7933i | 0.1763 + 1.1862i | 0.1993 + 1.4336i | 0.1869 + 1.2930i | 0.1577 + 0.8931i | 0.1678 + 1.0712i | 0.1577 + 0.8931i | 0.1592 + 1.0127i |
| 23.5 | 0.2224 + 1.7477i | 0.1587 + 1.1598i | 0.0786 + 1.6259i | 0.1644 + 1.2701i | 0.1717 + 0.8813i | 0.1654 + 1.0555i | 0.1717 + 0.8813i | 0.1690 + 0.9911i |
| 24 | 0.2059 + 1.3214i | 0.1962 + 1.2278i | 0.2073 + 1.4403i | 0.2541 + 1.5814i | 0.1735 + 0.9273i | 0.1853 + 1.1204i | 0.1735 + 0.9273i | 0.1790 + 1.0453i |
| 24.5 | 0.3255 + 1.7591i | 0.1702 + 1.3294i | 0.2212 + 1.6117i | 0.1562 + 1.2055i | 0.1511 + 0.8904i | 0.1398 + 1.0100i | 0.1511 + 0.8904i | 0.1427 + 1.0977i |
| 25 | 0.3472 + 1.7040i | 0.1573 + 1.3131i | 0.2161 + 1.5686i | 0.1468 + 1.1983i | 0.1469 + 0.8839i | 0.1353 + 1.0028i | 0.1469 + 0.8839i | 0.1358 + 1.0939i |
| 25.5 | 0.2337 + 1.6652i | 0.2321 + 1.1730i | 0.2083 + 1.5062i | 0.1547 + 1.2132i | 0.2051 + 0.9488i | 0.2157 + 1.0645i | 0.1608 + 0.9436i | 0.1497 + 1.0697i |
| 26 | 0.3076 + 1.5930i | 0.1352 + 1.2642i | 0.2100 + 1.4742i | 0.1117 + 1.1707i | 0.1697 + 0.9111i | 0.1855 + 1.0551i | 0.1491 + 0.9425i | 0.1223 + 1.0684i |
| 26.5 | 0.2675 + 1.6286i | 0.1335 + 1.3004i | 0.2245 + 1.4893i | 0.1429 + 1.2032i | 0.1579 + 0.9322i | 0.1592 + 1.0119i | 0.1815 + 0.8811i | 0.1547 + 1.1064i |

-continued

| | | | | | | | | |
|---|---|---|---|---|---|---|---|---|
| 27 | 0.2178 + 1.5591i | 0.1947 + 1.1461i | 0.1887 + 1.4107i | 0.1532 + 1.2458i | 0.2220 + 0.9109i | 0.2132 + 1.0386i | 0.1577 + 0.9120i | 0.1514 + 1.0025i |
| 27.5 | 0.2076 + 1.6180i | 0.2354 + 1.1287i | 0.1770 + 1.4782i | 0.1619 + 1.1335i | 0.2094 + 0.9195i | 0.2160 + 1.0223i | 0.1473 + 0.9211i | 0.1402 + 1.0282i |
| 28 | 0.2491 + 1.5678i | 0.2319 + 1.0829i | 0.1797 + 1.4545i | 0.1551 + 1.0959i | 0.2134 + 0.9134i | 0.2284 + 0.9984i | 0.1399 + 0.9185i | 0.1422 + 1.0060i |

| SNR/w | w144 | w145 | w146 | w147 | w148 | w149 | w150 | w15i |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2279 + 0.4119i | 0.2279 + 0.4119i | 0.2279 + 0.4119i | 0.2279 + 0.4119i | 0.2540 + 0.4692i | 0.2279 + 0.4119i | 0.2540 + 0.4692i | 0.2279 + 0.4119i |
| 8.5 | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i |
| 9 | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i |
| 10 | 0.2442 + 1.0177i | 0.2442 + 1.0177i | 0.2442 + 1.0177i | 0.2442 + 1.0177i | 0.2442 + 1.0177i | 0.2442 + 1.0177i | 0.2442 + 1.0177i | 0.2442 + 1.0177i |
| 10.5 | 0.2325 + 1.0121i | 0.2325 + 1.0121i | 0.2325 + 1.0121i | 0.2325 + 1.0121i | 0.2325 + 1.0121i | 0.2325 + 1.0121i | 0.2325 + 1.0121i | 0.2325 + 1.0121i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i |
| 13 | 0.1625 + 0.8963i | 0.1625 + 0.8963i | 0.1625 + 0.8963i | 0.1625 + 0.8963i | 0.1561 + 0.9541i | 0.1625 + 0.8963i | 0.1561 + 0.9541i | 0.1625 + 0.8963i |
| 13.5 | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i |
| 14 | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i | 0.1397 + 0.4459i |
| 14.5 | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i |
| 15 | 0.1425 + 0.6182i | 0.1425 + 0.6182i | 0.1425 + 0.6182i | 0.1425 + 0.6182i | 0.1425 + 0.6182i | 0.1425 + 0.6182i | 0.1425 + 0.6182i | 0.1425 + 0.6182i |
| 15.5 | 0.1429 + 0.6236i | 0.1429 + 0.6236i | 0.1429 + 0.6236i | 0.1429 + 0.6236i | 0.1429 + 0.6236i | 0.1429 + 0.6236i | 0.1429 + 0.6236i | 0.1429 + 0.6236i |
| 16 | 0.1233 + 0.6305i | 0.1233 + 0.6305i | 0.1233 + 0.6305i | 0.1233 + 0.6305i | 0.1305 + 0.7061i | 0.1305 + 0.7061i | 0.1305 + 0.7061i | 0.1305 + 0.7061i |
| 16.5 | 0.1119 + 0.5862i | 0.1119 + 0.5862i | 0.1119 + 0.5862i | 0.1119 + 0.5862i | 0.1120 + 0.6744i | 0.1120 + 0.6744i | 0.1120 + 0.6744i | 0.1120 + 0.6744i |
| 17 | 0.1116 + 0.5832i | 0.1116 + 0.5832i | 0.1116 + 0.5832i | 0.1116 + 0.5832i | 0.1116 + 0.6804i | 0.1116 + 0.6804i | 0.1116 + 0.6804i | 0.1116 + 0.6804i |
| 17.5 | 0.1111 + 0.5789i | 0.1111 + 0.5789i | 0.1111 + 0.5789i | 0.1111 + 0.5789i | 0.1112 + 0.6913i | 0.1112 + 0.6913i | 0.1112 + 0.6913i | 0.1112 + 0.6913i |
| 18 | 0.1106 + 0.5718i | 0.1106 + 0.5718i | 0.1106 + 0.5718i | 0.1106 + 0.5718i | 0.1104 + 0.7036i | 0.1104 + 0.7036i | 0.1104 + 0.7036i | 0.1104 + 0.7036i |
| 18.5 | 0.1102 + 0.6537i | 0.1102 + 0.6537i | 0.1102 + 0.6537i | 0.1102 + 0.6537i | 0.0920 + 0.8398i | 0.0920 + 0.8398i | 0.0920 + 0.8398i | 0.0920 + 0.8398i |
| 19 | 0.0846 + 0.6736i | 0.0846 + 0.6736i | 0.0846 + 0.6736i | 0.0846 + 0.6736i | 0.0812 + 0.8563i | 0.0812 + 0.8563i | 0.0812 + 0.8563i | 0.0812 + 0.8563i |
| 19.5 | 0.0756 + 0.6874i | 0.0756 + 0.6874i | 0.0756 + 0.6874i | 0.0756 + 0.6874i | 0.0737 + 0.8671i | 0.0737 + 0.8671i | 0.0737 + 0.8671i | 0.0737 + 0.8671i |
| 20 | 0.0686 + 0.4786i | 0.0686 + 0.4786i | 0.0686 + 0.4786i | 0.0686 + 0.4786i | 0.0680 + 0.6150i | 0.0680 + 0.6150i | 0.0680 + 0.6150i | 0.0680 + 0.6150i |
| 20.5 | 0.0633 + 0.6036i | 0.0633 + 0.6036i | 0.0633 + 0.6036i | 0.0633 + 0.6036i | 0.0637 + 0.7697i | 0.0637 + 0.7697i | 0.0637 + 0.7697i | 0.0637 + 0.7697i |
| 21 | 0.0612 + 0.5785i | 0.0612 + 0.5785i | 0.0612 + 0.5785i | 0.0612 + 0.5785i | 0.0626 + 0.7673i | 0.0622 + 0.7241i | 0.0626 + 0.7673i | 0.0622 + 0.7241i |
| 21.5 | 0.0580 + 0.5517i | 0.0580 + 0.5517i | 0.0580 + 0.5517i | 0.0580 + 0.5517i | 0.0579 + 0.7549i | 0.0575 + 0.6950i | 0.0579 + 0.7549i | 0.0575 + 0.6950i |
| 22 | 0.0594 + 0.5713i | 0.0594 + 0.5713i | 0.0594 + 0.5713i | 0.0594 + 0.5713i | 0.0617 + 0.7653i | 0.0609 + 0.7080i | 0.0617 + 0.7653i | 0.0609 + 0.7080i |
| 22.5 | 0.0586 + 0.5613i | 0.0586 + 0.5613i | 0.0586 + 0.5613i | 0.0586 + 0.5613i | 0.0597 + 0.7658i | 0.0589 + 0.6968i | 0.0597 + 0.7658i | 0.0589 + 0.6968i |
| 23 | 0.0582 + 0.5442i | 0.0582 + 0.5442i | 0.0582 + 0.5442i | 0.0582 + 0.5442i | 0.0523 + 0.7605i | 0.0530 + 0.6770i | 0.0523 + 0.7605i | 0.0530 + 0.6770i |
| 23.5 | 0.0579 + 0.5297i | 0.0582 + 0.5729i | 0.0579 + 0.5297i | 0.0582 + 0.5729i | 0.0573 + 0.7643i | 0.0571 + 0.6803i | 0.0573 + 0.7643i | 0.0571 + 0.6803i |
| 24 | 0.0551 + 0.5330i | 0.0552 + 0.6012i | 0.0551 + 0.5330i | 0.0552 + 0.6012i | 0.0562 + 0.8072i | 0.0555 + 0.7029i | 0.0562 + 0.8072i | 0.0555 + 0.7029i |

-continued

| | | | | | | | | |
|---|---|---|---|---|---|---|---|---|
| 24.5 | 0.0588 + 0.5230i | 0.0585 + 0.5848i | 0.0588 + 0.5230i | 0.0585 + 0.5848i | 0.0540 + 0.7694i | 0.0578 + 0.6777i | 0.0540 + 0.7694i | 0.0578 + 0.6777i |
| 25 | 0.0574 + 0.5122i | 0.0570 + 0.5825i | 0.0574 + 0.5122i | 0.0570 + 0.5825i | 0.0528 + 0.7637i | 0.0570 + 0.6711i | 0.0528 + 0.7637i | 0.0570 + 0.6711i |
| 25.5 | 0.0554 + 0.5660i | 0.0546 + 0.6473i | 0.0554 + 0.5660i | 0.0546 + 0.6473i | 0.0422 + 0.8329i | 0.0578 + 0.7393i | 0.0806 + 0.8359i | 0.0578 + 0.7393i |
| 26 | 0.0362 + 0.5516i | 0.0352 + 0.6211i | 0.0930 + 0.5503i | 0.0944 + 0.6214i | 0.0501 + 0.7778i | 0.0354 + 0.7025i | 0.0941 + 0.7686i | 0.0950 + 0.6968i |
| 26.5 | 0.0319 + 0.5344i | 0.0328 + 0.6243i | 0.0702 + 0.5348i | 0.0709 + 0.6199i | 0.0401 + 0.8246i | 0.0334 + 0.7183i | 0.0928 + 0.7983i | 0.0787 + 0.7149i |
| 27 | 0.0308 + 0.5613i | 0.0315 + 0.6418i | 0.0874 + 0.5600i | 0.0899 + 0.6395i | 0.0368 + 0.8194i | 0.0314 + 0.7259i | 0.0953 + 0.8062i | 0.0929 + 0.7245i |
| 27.5 | 0.0313 + 0.5647i | 0.0315 + 0.6436i | 0.0920 + 0.5643i | 0.0922 + 0.6441i | 0.0347 + 0.8220i | 0.0302 + 0.7280i | 0.0933 + 0.8100i | 0.0920 + 0.7282i |
| 28 | 0.0301 + 0.5655i | 0.0298 + 0.6462i | 0.0886 + 0.5661i | 0.0881 + 0.6466i | 0.0319 + 0.8305i | 0.0282 + 0.7314i | 0.0870 + 0.8145i | 0.0878 + 0.7323i |

| SNR/w | w152 | w153 | w154 | w155 | w156 | w157 | w158 | w159 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i |
| 8.5 | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i |
| 9 | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i | 0.2630 + 1.0523i |
| 9.5 | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i | 0.2536 + 1.0304i |
| 10 | 0.2442 + 1.0177i | 0.2442 + 1.0177i | 0.2442 + 1.0177i | 0.2442 + 1.0177i | 0.2442 + 1.0177i | 0.2442 + 1.0177i | 0.2442 + 1.0177i | 0.2442 + 1.0177i |
| 10.5 | 0.2325 + 1.0121i | 0.2325 + 1.0121i | 0.2325 + 1.0121i | 0.2325 + 1.0121i | 0.2325 + 1.0121i | 0.2325 + 1.0121i | 0.2325 + 1.0121i | 0.2325 + 1.0121i |
| 11 | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i | 0.1545 + 0.2823i |
| 11.5 | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i | 0.1510 + 0.2813i |
| 12 | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i | 0.1480 + 0.2778i |
| 12.5 | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i | 0.1416 + 0.3744i |
| 13 | 0.1625 + 0.8963i | 0.1625 + 0.8963i | 0.1625 + 0.8963i | 0.1625 + 0.8963i | 0.1561 + 0.9541i | 0.1561 + 0.9541i | 0.1561 + 0.9541i | 0.1561 + 0.9541i |
| 13.5 | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i | 0.1389 + 0.4236i |
| 14 | 0.1680 + 0.4234i | 0.1397 + 0.4459i | 0.1397 + 0.4459i | 0.1397 + 0.4459i | 0.1680 + 0.4234i | 0.1397 + 0.4459i | 0.1397 + 0.4459i | 0.1397 + 0.4459i |
| 14.5 | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i | 0.1694 + 0.4317i |
| 15 | 0.1425 + 0.6182i | 0.1425 + 0.6182i | 0.1425 + 0.6182i | 0.1425 + 0.6182i | 0.1425 + 0.6182i | 0.1425 + 0.6182i | 0.1425 + 0.6182i | 0.1425 + 0.6182i |
| 15.5 | 0.1429 + 0.6236i | 0.1429 + 0.6236i | 0.1429 + 0.6236i | 0.1429 + 0.6236i | 0.1429 + 0.6236i | 0.1429 + 0.6236i | 0.1429 + 0.6236i | 0.1429 + 0.6236i |
| 16 | 0.1233 + 0.6305i | 0.1233 + 0.6305i | 0.1233 + 0.6305i | 0.1233 + 0.6305i | 0.1305 + 0.7061i | 0.1305 + 0.7061i | 0.1305 + 0.7061i | 0.1305 + 0.7061i |
| 16.5 | 0.1119 + 0.5862i | 0.1119 + 0.5862i | 0.1119 + 0.5862i | 0.1119 + 0.5862i | 0.1120 + 0.6744i | 0.1120 + 0.6744i | 0.1120 + 0.6744i | 0.1120 + 0.6744i |
| 17 | 0.1116 + 0.5832i | 0.1116 + 0.5832i | 0.1116 + 0.5832i | 0.1116 + 0.5832i | 0.1116 + 0.6804i | 0.1116 + 0.6804i | 0.1116 + 0.6804i | 0.1116 + 0.6804i |
| 17.5 | 0.1111 + 0.5789i | 0.1111 + 0.5789i | 0.1111 + 0.5789i | 0.1111 + 0.5789i | 0.1112 + 0.6913i | 0.1112 + 0.6913i | 0.1112 + 0.6913i | 0.1112 + 0.6913i |
| 18 | 0.1106 + 0.5718i | 0.1106 + 0.5718i | 0.1106 + 0.5718i | 0.1106 + 0.5718i | 0.1104 + 0.7036i | 0.1104 + 0.7036i | 0.1104 + 0.7036i | 0.1104 + 0.7036i |
| 18.5 | 0.1102 + 0.6537i | 0.1102 + 0.6537i | 0.1102 + 0.6537i | 0.1102 + 0.6537i | 0.1506 + 0.8340i | 0.1506 + 0.8340i | 0.1506 + 0.8340i | 0.1506 + 0.8340i |
| 19 | 0.1415 + 0.6692i | 0.1415 + 0.6692i | 0.1415 + 0.6692i | 0.1415 + 0.6692i | 0.1746 + 0.8465i | 0.1746 + 0.8465i | 0.1746 + 0.8465i | 0.1746 + 0.8465i |
| 19.5 | 0.1571 + 0.6805i | 0.1571 + 0.6805i | 0.1571 + 0.6805i | 0.1571 + 0.6805i | 0.1891 + 0.8559i | 0.1891 + 0.8559i | 0.1891 + 0.8559i | 0.1891 + 0.8559i |
| 20 | 0.1756 + 0.4881i | 0.1756 + 0.4881i | 0.1756 + 0.4881i | 0.1756 + 0.4881i | 0.1535 + 0.6247i | 0.1535 + 0.6247i | 0.1535 + 0.6247i | 0.1535 + 0.6247i |
| 20.5 | 0.1741 + 0.6024i | 0.1741 + 0.6024i | 0.1741 + 0.6024i | 0.1741 + 0.6024i | 0.1805 + 0.7664i | 0.1805 + 0.7664i | 0.1805 + 0.7664i | 0.1805 + 0.7664i |
| 21 | 0.1729 + 0.5763i | 0.1729 + 0.5763i | 0.1729 + 0.5763i | 0.1729 + 0.5763i | 0.1790 + 0.7657i | 0.1773 + 0.7216i | 0.1790 + 0.7657i | 0.1773 + 0.7216i |
| 21.5 | 0.1679 + 0.5531i | 0.1679 + 0.5531i | 0.1679 + 0.5531i | 0.1679 + 0.5531i | 0.1651 + 0.7527i | 0.1644 + 0.6950i | 0.1651 + 0.7527i | 0.1644 + 0.6950i |

-continued

| | | | | | | | | |
|---|---|---|---|---|---|---|---|---|
| 22 | 0.1768 + 0.5685i | 0.1768 + 0.5685i | 0.1768 + 0.5685i | 0.1768 + 0.5685i | 0.1819 + 0.7649i | 0.1802 + 0.7051i | 0.1819 + 0.7649i | 0.1802 + 0.7051i |
| 22.5 | 0.1728 + 0.5580i | 0.1728 + 0.5580i | 0.1728 + 0.5580i | 0.1728 + 0.5580i | 0.1742 + 0.7575i | 0.1714 + 0.6942i | 0.1742 + 0.7575i | 0.1714 + 0.6942i |
| 23 | 0.1711 + 0.5337i | 0.1696 + 0.5727i | 0.1711 + 0.5337i | 0.1696 + 0.5727i | 0.1663 + 0.7694i | 0.1695 + 0.6852i | 0.1663 + 0.7694i | 0.1695 + 0.6852i |
| 23.5 | 0.1756 + 0.5324i | 0.1748 + 0.5753i | 0.1756 + 0.5324i | 0.1748 + 0.5753i | 0.1727 + 0.7650i | 0.1738 + 0.6824i | 0.1727 + 0.7650i | 0.1738 + 0.6824i |
| 24 | 0.1665 + 0.5324i | 0.1666 + 0.5983i | 0.1665 + 0.5324i | 0.1666 + 0.5983i | 0.1690 + 0.8040i | 0.1674 + 0.7005i | 0.1690 + 0.8040i | 0.1674 + 0.7005i |
| 24.5 | 0.1768 + 0.5229i | 0.1754 + 0.5881i | 0.1768 + 0.5229i | 0.1754 + 0.5881i | 0.1654 + 0.7787i | 0.1713 + 0.6822i | 0.1654 + 0.7787i | 0.1713 + 0.6822i |
| 25 | 0.1734 + 0.5128i | 0.1721 + 0.5855i | 0.1734 + 0.5128i | 0.1721 + 0.5855i | 0.1626 + 0.7732i | 0.1681 + 0.6756i | 0.1626 + 0.7732i | 0.1681 + 0.6756i |
| 25.5 | 0.1691 + 0.5646i | 0.1899 + 0.6415i | 0.1691 + 0.5646i | 0.1527 + 0.6436i | 0.2004 + 0.8274i | 0.1939 + 0.7293i | 0.1615 + 0.8311i | 0.1553 + 0.7315i |
| 26 | 0.2234 + 0.5457i | 0.2245 + 0.6191i | 0.1645 + 0.5475i | 0.1657 + 0.6192i | 0.1748 + 0.8005i | 0.2191 + 0.7001i | 0.1748 + 0.8005i | 0.1706 + 0.6989i |
| 26.5 | 0.1889 + 0.5296i | 0.1889 + 0.6067i | 0.1371 + 0.5320i | 0.1410 + 0.6135i | 0.2034 + 0.7668i | 0.1936 + 0.6930i | 0.1697 + 0.8030i | 0.1474 + 0.6948i |
| 27 | 0.2121 + 0.5552i | 0.2127 + 0.6337i | 0.1515 + 0.5573i | 0.1534 + 0.6358i | 0.2191 + 0.8143i | 0.2146 + 0.7189i | 0.1560 + 0.8180i | 0.1570 + 0.7210i |
| 27.5 | 0.2181 + 0.5647i | 0.2174 + 0.6442i | 0.1553 + 0.5644i | 0.1553 + 0.6440i | 0.2141 + 0.8228i | 0.2166 + 0.7312i | 0.1515 + 0.8243i | 0.1561 + 0.7276i |
| 28 | 0.2101 + 0.5674i | 0.2108 + 0.6469i | 0.1492 + 0.5671i | 0.1491 + 0.6469i | 0.2083 + 0.8201i | 0.2103 + 0.7318i | 0.1448 + 0.8276i | 0.1494 + 0.7302i |

| SNR/w | w160 | w161 | w162 | w163 | w164 | w165 | w166 | w167 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2279 + 0.4119i | 0.2279 + 0.4119i | 0.2279 + 0.4119i | 0.2279 + 0.4119i | 0.2540 + 0.4692i | 0.2279 + 0.4119i | 0.2540 + 0.4692i | 0.2279 + 0.4119i |
| 8.5 | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i |
| 9 | 1.1715 + 1.7495i | 0.8225 + 1.2549i | 0.8225 + 1.2549i | 0.8225 + 1.2549i | 0.8225 + 1.2549i | 0.8225 + 1.2549i | 0.8225 + 1.2549i | 0.7580 + 1.1712i |
| 9.5 | 1.1695 + 1.7496i | 0.8325 + 1.2570i | 0.8325 + 1.2570i | 0.8325 + 1.2570i | 0.8325 + 1.2570i | 0.8325 + 1.2570i | 0.8325 + 1.2570i | 0.7800 + 1.1846i |
| 10 | 1.1664 + 1.7479i | 0.8251 + 1.2380i | 0.8251 + 1.2380i | 0.8251 + 1.2380i | 0.8251 + 1.2380i | 0.8251 + 1.2380i | 0.8251 + 1.2380i | 0.8251 + 1.2380i |
| 10.5 | 1.1809 + 1.7123i | 0.8398 + 1.2493i | 0.8398 + 1.2493i | 0.8398 + 1.2493i | 0.8398 + 1.2493i | 0.8398 + 1.2493i | 0.8398 + 1.2493i | 0.7964 + 1.1875i |
| 11 | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i |
| 13 | 0.7692 + 1.3337i | 0.6950 + 1.2744i | 0.6950 + 1.2744i | 0.6950 + 1.2744i | 0.6337 + 1.1456i | 0.6337 + 1.1456i | 0.6337 + 1.1456i | 0.6337 + 1.1456i |
| 13.5 | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i |
| 14 | 0.1761 + 0.7756i | 0.1761 + 0.7756i | 0.1761 + 0.7756i | 0.1761 + 0.7756i | 0.1761 + 0.7756i | 0.1761 + 0.7756i | 0.1761 + 0.7756i | 0.1761 + 0.7756i |
| 14.5 | 0.1746 + 0.7901i | 0.1746 + 0.7901i | 0.1746 + 0.7901i | 0.1746 + 0.7901i | 0.1746 + 0.7901i | 0.1746 + 0.7901i | 0.1746 + 0.7901i | 0.1746 + 0.7901i |
| 15 | 0.1548 + 1.2438i | 0.2569 + 1.1882i | 0.1548 + 1.2438i | 0.2569 + 1.1882i | 0.3993 + 0.9722i | 0.3993 + 0.9722i | 0.3993 + 0.9722i | 0.3993 + 0.9722i |
| 15.5 | 0.1242 + 1.2740i | 0.1858 + 1.2756i | 0.1242 + 1.2740i | 0.1858 + 1.2756i | 0.4115 + 0.9594i | 0.4115 + 0.9594i | 0.4115 + 0.9594i | 0.4115 + 0.9594i |
| 16 | 0.1921 + 1.5489i | 0.3782 + 1.2966i | 0.2042 + 1.4748i | 0.3782 + 1.2966i | 0.4227 + 0.9434i | 0.4256 + 0.9922i | 0.4227 + 0.9434i | 0.4256 + 0.9922i |
| 16.5 | 0.2958 + 1.5189i | 0.3519 + 1.2468i | 0.3869 + 1.6973i | 0.3519 + 1.2468i | 0.3412 + 0.9152i | 0.3422 + 0.9787i | 0.3412 + 0.9152i | 0.3422 + 0.9787i |
| 17 | 0.2880 + 1.5187i | 0.3502 + 1.2424i | 0.3847 + 1.7131i | 0.3502 + 1.2424i | 0.3424 + 0.9115i | 0.3425 + 0.9769i | 0.3424 + 0.9115i | 0.3425 + 0.9769i |
| 17.5 | 0.2810 + 1.5145i | 0.3496 + 1.2371i | 0.3774 + 1.7181i | 0.3496 + 1.2371i | 0.3445 + 0.9088i | 0.3436 + 0.9769i | 0.3445 + 0.9088i | 0.3436 + 0.9769i |
| 18 | 0.2793 + 1.5139i | 0.3532 + 1.2221i | 0.3797 + 1.7225i | 0.3532 + 1.2221i | 0.3645 + 0.9102i | 0.3621 + 0.9814i | 0.3645 + 0.9102i | 0.3621 + 0.9814i |
| 18.5 | 0.6224 + 1.5379i | 0.5759 + 1.3142i | 0.6038 + 1.8517i | 0.5605 + 1.2517i | 0.4811 + 0.9781i | 0.5045 + 1.0512i | 0.4811 + 0.9781i | 0.5045 + 1.0512i |
| 19 | 0.6136 + 1.5287i | 0.5785 + 1.3124i | 0.6082 + 1.8229i | 0.5656 + 1.2442i | 0.5036 + 0.9733i | 0.5241 + 1.0508i | 0.5036 + 0.9733i | 0.5241 + 1.0508i |

-continued

| | | | | | | | | |
|---|---|---|---|---|---|---|---|---|
| 19.5 | 0.5093 + 1.8272i | 0.5718 + 1.2403i | 0.5904 + 1.5365i | 0.5797 + 1.3019i | 0.5185 + 0.9693i | 0.5365 + 1.0505i | 0.5185 + 0.9693i | 0.5365 + 1.0505i |
| 20 | 0.3901 + 1.8592i | 0.2655 + 1.0853i | 0.2151 + 1.3209i | 0.2464 + 1.1466i | 0.3484 + 0.8442i | 0.3291 + 0.9137i | 0.3484 + 0.8442i | 0.3291 + 0.9137i |
| 20.5 | 0.3779 + 1.6732i | 0.4551 + 1.2071i | 0.4323 + 1.4599i | 0.4551 + 1.2071i | 0.4614 + 0.9212i | 0.4616 + 1.0134i | 0.4614 + 0.9212i | 0.4616 + 1.0134i |
| 21 | 0.4425 + 1.4246i | 0.4497 + 1.2508i | 0.4339 + 1.6179i | 0.4486 + 1.1809i | 0.4403 + 0.9042i | 0.4457 + 1.0301i | 0.4403 + 0.9042i | 0.4457 + 1.0301i |
| 21.5 | 0.4335 + 1.8289i | 0.4421 + 1.1662i | 0.4338 + 1.4210i | 0.4422 + 1.2638i | 0.4033 + 0.8880i | 0.4226 + 1.0373i | 0.4033 + 0.8880i | 0.4137 + 1.0009i |
| 22 | 0.4811 + 1.5692i | 0.4329 + 1.2286i | 0.4113 + 1.4351i | 0.4329 + 1.2286i | 0.4303 + 0.8997i | 0.4340 + 1.0474i | 0.4303 + 0.8997i | 0.4340 + 1.0474i |
| 22.5 | 0.4404 + 1.7644i | 0.4091 + 1.1667i | 0.4579 + 1.4331i | 0.4310 + 1.2944i | 0.4161 + 0.8850i | 0.4141 + 1.0322i | 0.4161 + 0.8850i | 0.4086 + 0.9927i |
| 23 | 0.4242 + 1.7554i | 0.4248 + 1.1691i | 0.4472 + 1.4475i | 0.4330 + 1.2938i | 0.4129 + 0.9003i | 0.4122 + 1.0484i | 0.4129 + 0.9003i | 0.3988 + 1.0072i |
| 23.5 | 0.3933 + 1.5893i | 0.4100 + 1.1638i | 0.4356 + 1.4074i | 0.4278 + 1.2731i | 0.4179 + 0.8922i | 0.4150 + 1.0457i | 0.4179 + 0.8922i | 0.3988 + 1.0007i |
| 24 | 0.4643 + 1.6633i | 0.4653 + 1.1815i | 0.4746 + 1.4795i | 0.4874 + 1.3073i | 0.4187 + 0.9025i | 0.4439 + 1.0768i | 0.4187 + 0.9025i | 0.4296 + 1.0142i |
| 24.5 | 0.4614 + 1.3869i | 0.4192 + 1.2422i | 0.4295 + 1.5513i | 0.3583 + 1.1597i | 0.4108 + 0.9173i | 0.4097 + 1.0235i | 0.3699 + 0.9056i | 0.3567 + 1.0552i |
| 25 | 0.5062 + 1.5466i | 0.3909 + 1.1806i | 0.4561 + 1.3999i | 0.4328 + 1.2778i | 0.3985 + 0.9191i | 0.3847 + 1.0408i | 0.3554 + 0.9098i | 0.3375 + 1.0392i |
| 25.5 | 0.4109 + 1.6213i | 0.4201 + 1.1814i | 0.4176 + 1.4698i | 0.4725 + 1.1133i | 0.4845 + 0.8904i | 0.4948 + 0.9831i | 0.4139 + 0.8984i | 0.4391 + 1.0220i |
| 26 | 0.5441 + 1.3586i | 0.4659 + 1.1498i | 0.4319 + 1.4062i | 0.4167 + 1.2626i | 0.4195 + 0.9309i | 0.4592 + 1.0189i | 0.3573 + 0.9441i | 0.3828 + 1.0426i |
| 26.5 | 0.5122 + 1.4464i | 0.4081 + 1.1447i | 0.4495 + 1.3429i | 0.4100 + 1.2413i | 0.3605 + 0.9756i | 0.3812 + 1.0530i | 0.3762 + 0.9043i | 0.4593 + 0.9010i |
| 27 | 0.5155 + 1.4738i | 0.4056 + 1.2349i | 0.4154 + 1.4035i | 0.4713 + 1.3098i | 0.4513 + 0.9439i | 0.4491 + 1.0353i | 0.4185 + 0.8835i | 0.5363 + 1.0313i |
| 27.5 | 0.4528 + 1.4608i | 0.3983 + 1.2179i | 0.3506 + 1.3699i | 0.4330 + 1.3116i | 0.4947 + 0.9196i | 0.4801 + 1.0177i | 0.4268 + 0.9033i | 0.5624 + 1.0275i |
| 28 | 0.5059 + 1.4670i | 0.5266 + 1.2312i | 0.4108 + 1.2036i | 0.4382 + 1.3162i | 0.4826 + 1.1077i | 0.5122 + 1.0210i | 0.4263 + 0.9068i | 0.4319 + 0.9952i |

| SNR/w | w168 | w169 | w170 | w171 | w172 | w173 | w174 | w175 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i |
| 8.5 | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i |
| 9 | 0.8225 + 1.2549i | 0.8225 + 1.2549i | 0.8225 + 1.2549i | 0.7580 + 1.1712i | 0.8225 + 1.2549i | 0.7580 + 1.1712i | 0.7580 + 1.1712i | 0.7580 + 1.1712i |
| 9.5 | 0.8325 + 1.2570i | 0.8325 + 1.2570i | 0.8325 + 1.2570i | 0.7800 + 1.1846i | 0.8325 + 1.2570i | 0.7800 + 1.1846i | 0.7800 + 1.1846i | 0.7800 + 1.1846i |
| 10 | 0.8251 + 1.2380i | 0.8251 + 1.2380i | 0.8251 + 1.2380i | 0.8251 + 1.2380i | 0.8251 + 1.2380i | 0.8251 + 1.2380i | 0.8251 + 1.2380i | 0.7816 + 1.1728i |
| 10.5 | 0.8398 + 1.2493i | 0.8398 + 1.2493i | 0.8398 + 1.2493i | 0.7964 + 1.1875i | 0.8398 + 1.2493i | 0.7964 + 1.1875i | 0.7964 + 1.1875i | 0.7964 + 1.1875i |
| 11 | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i | 0.1843 + 0.6434i |
| 11.5 | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i | 0.1752 + 0.6570i |
| 12 | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i | 0.1657 + 0.6638i |
| 12.5 | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i | 0.1687 + 0.7342i |
| 13 | 0.6337 + 1.1456i | 0.6337 + 1.1456i | 0.6337 + 1.1456i | 0.5973 + 1.1415i | 0.6337 + 1.1456i | 0.5973 + 1.1415i | 0.6337 + 1.1456i | 0.5973 + 1.1415i |
| 13.5 | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i | 0.1645 + 0.7701i |
| 14 | 0.1761 + 0.7756i | 0.1761 + 0.7756i | 0.1761 + 0.7756i | 0.1761 + 0.7756i | 0.1761 + 0.7756i | 0.1761 + 0.7756i | 0.1761 + 0.7756i | 0.1761 + 0.7756i |
| 14.5 | 0.1746 + 0.7901i | 0.1746 + 0.7901i | 0.1746 + 0.7901i | 0.1746 + 0.7901i | 0.1746 + 0.7901i | 0.1746 + 0.7901i | 0.1746 + 0.7901i | 0.1746 + 0.7901i |
| 15 | 0.1548 + 1.2438i | 0.2569 + 1.1882i | 0.1548 + 1.2438i | 0.2569 + 1.1882i | 0.3993 + 0.9722i | 0.3993 + 0.9722i | 0.3993 + 0.9722i | 0.3993 + 0.9722i |
| 15.5 | 0.1936 + 1.1915i | 0.2544 + 1.2145i | 0.1936 + 1.1915i | 0.2544 + 1.2145i | 0.3981 + 1.0139i | 0.3981 + 1.0139i | 0.3981 + 1.0139i | 0.3981 + 1.0139i |
| 16 | 0.1202 + 1.5524i | 0.3782 + 1.2966i | 0.1458 + 1.4668i | 0.3782 + 1.2966i | 0.4227 + 0.9434i | 0.4256 + 0.9922i | 0.4227 + 0.9434i | 0.4256 + 0.9922i |
| 16.5 | 0.3396 + 1.4835i | 0.3519 + 1.2468i | 0.4480 + 1.5575i | 0.3519 + 1.2468i | 0.3412 + 0.9152i | 0.3422 + 0.9787i | 0.3412 + 0.9152i | 0.3422 + 0.9787i |

-continued

| | | | | | | | | |
|---|---|---|---|---|---|---|---|---|
| 17 | 0.3338 + 1.4825i | 0.3502 + 1.2424i | 0.4573 + 1.5560i | 0.3502 + 1.2424i | 0.3424 + 0.9115i | 0.3425 + 0.9769i | 0.3424 + 0.9115i | 0.3425 + 0.9769i |
| 17.5 | 0.3287 + 1.4767i | 0.3496 + 1.2371i | 0.4622 + 1.5494i | 0.3496 + 1.2371i | 0.3445 + 0.9088i | 0.3436 + 0.9769i | 0.3445 + 0.9088i | 0.3436 + 0.9769i |
| 18 | 0.3273 + 1.4723i | 0.3301 + 1.2672i | 0.4716 + 1.5416i | 0.3532 + 1.2221i | 0.3213 + 0.9082i | 0.3211 + 0.9756i | 0.3213 + 0.9082i | 0.3211 + 0.9756i |
| 18.5 | 0.4160 + 1.5551i | 0.4079 + 1.3496i | 0.3930 + 1.7342i | 0.4025 + 1.2867i | 0.3601 + 1.0064i | 0.3730 + 1.0825i | 0.3601 + 1.0064i | 0.3730 + 1.0825i |
| 19 | 0.4096 + 1.5434i | 0.4091 + 1.3422i | 0.3868 + 1.7355i | 0.4051 + 1.2765i | 0.3667 + 1.0053i | 0.3795 + 1.0813i | 0.3667 + 1.0053i | 0.3795 + 1.0813i |
| 19.5 | 0.1896 + 1.9476i | 0.4173 + 1.2630i | 0.4293 + 1.5290i | 0.4215 + 1.3193i | 0.3717 + 1.0035i | 0.3867 + 1.0802i | 0.3717 + 1.0035i | 0.3867 + 1.0802i |
| 20 | 0.2891 + 1.6189i | 0.2183 + 1.0742i | 0.2287 + 1.4492i | 0.2183 + 1.0742i | 0.2615 + 0.8212i | 0.2485 + 0.8979i | 0.2615 + 0.8212i | 0.2485 + 0.8979i |
| 20.5 | 0.1559 + 1.8551i | 0.3284 + 1.2041i | 0.3245 + 1.4116i | 0.3284 + 1.2041i | 0.3234 + 0.9257i | 0.3264 + 1.0118i | 0.3234 + 0.9257i | 0.3264 + 1.0118i |
| 21 | 0.2900 + 1.4178i | 0.3085 + 1.2507i | 0.2645 + 1.6046i | 0.3133 + 1.1795i | 0.3142 + 0.9074i | 0.3156 + 1.0246i | 0.3142 + 0.9074i | 0.3156 + 1.0246i |
| 21.5 | 0.3087 + 1.6359i | 0.3076 + 1.1747i | 0.3096 + 1.4426i | 0.3112 + 1.2557i | 0.2873 + 0.8921i | 0.2954 + 1.0282i | 0.2873 + 0.8921i | 0.2954 + 1.0282i |
| 22 | 0.2306 + 1.3849i | 0.2809 + 1.2390i | 0.2905 + 1.4691i | 0.2945 + 1.1903i | 0.3077 + 0.9000i | 0.3077 + 1.0367i | 0.3077 + 0.9000i | 0.3077 + 1.0367i |
| 22.5 | 0.3278 + 1.6041i | 0.2970 + 1.1686i | 0.3037 + 1.4425i | 0.2970 + 1.2912i | 0.2944 + 0.8820i | 0.2944 + 1.0396i | 0.2944 + 0.8820i | 0.2951 + 0.9957i |
| 23 | 0.2943 + 1.6238i | 0.2952 + 1.1812i | 0.3204 + 1.4563i | 0.3158 + 1.2876i | 0.2803 + 0.8960i | 0.2822 + 1.0584i | 0.2803 + 0.8960i | 0.2794 + 1.0101i |
| 23.5 | 0.2662 + 1.5264i | 0.2867 + 1.1635i | 0.2847 + 1.3880i | 0.2871 + 1.2790i | 0.2884 + 0.8828i | 0.2818 + 1.0582i | 0.2884 + 0.8828i | 0.2853 + 0.9967i |
| 24 | 0.3157 + 1.8053i | 0.3327 + 1.2080i | 0.3481 + 1.4263i | 0.3796 + 1.3103i | 0.2926 + 0.9175i | 0.3123 + 1.1027i | 0.2926 + 0.9175i | 0.3029 + 1.0334i |
| 24.5 | 0.3338 + 1.3906i | 0.2893 + 1.2934i | 0.2719 + 1.4925i | 0.2628 + 1.1826i | 0.2654 + 0.9066i | 0.2364 + 1.0101i | 0.2654 + 0.9066i | 0.2549 + 1.0649i |
| 25 | 0.2741 + 1.3971i | 0.2823 + 1.2733i | 0.3404 + 1.4960i | 0.2496 + 1.1769i | 0.2551 + 0.9023i | 0.2246 + 1.0063i | 0.2551 + 0.9023i | 0.2459 + 1.0740i |
| 25.5 | 0.3610 + 1.3165i | 0.3191 + 1.2022i | 0.2929 + 1.4100i | 0.2095 + 1.3211i | 0.2809 + 0.9302i | 0.3045 + 1.0609i | 0.3388 + 0.9217i | 0.3581 + 1.0225i |
| 26 | 0.2562 + 1.3168i | 0.2416 + 1.2052i | 0.3169 + 1.4056i | 0.3353 + 1.1847i | 0.2646 + 0.9367i | 0.2466 + 1.0790i | 0.2646 + 0.9367i | 0.3161 + 1.0751i |
| 26.5 | 0.3891 + 1.5208i | 0.2212 + 1.3291i | 0.3380 + 1.3952i | 0.2946 + 1.2451i | 0.2695 + 0.9684i | 0.2704 + 1.0530i | 0.2713 + 0.8960i | 0.2536 + 1.1406i |
| 27 | 0.2908 + 1.3146i | 0.2866 + 1.2128i | 0.3054 + 1.4311i | 0.3265 + 1.1340i | 0.2959 + 0.9159i | 0.3072 + 1.0000i | 0.3513 + 0.8854i | 0.3357 + 1.0591i |
| 27.5 | 0.2183 + 1.3371i | 0.2840 + 1.2244i | 0.2932 + 1.4680i | 0.3445 + 1.1098i | 0.2843 + 0.9156i | 0.2866 + 1.0054i | 0.3594 + 0.9169i | 0.3648 + 1.0180i |
| 28 | 0.2888 + 1.3750i | 0.2811 + 1.1589i | 0.3632 + 1.4529i | 0.3464 + 1.0908i | 0.2807 + 0.8996i | 0.2837 + 1.2544i | 0.3472 + 0.9117i | 0.3452 + 1.0021i |

| SNR/w | w176 | w177 | w178 | w179 | w180 | w181 | w182 | w183 |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i | 0.2495 + 0.4483i |
| 8 | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i | 0.2540 + 0.4692i |
| 8.5 | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i | 0.2175 + 0.3998i |
| 9 | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i |
| 10 | 0.5468 + 0.8978i | 0.5468 + 0.8978i | 0.5468 + 0.8978i | 0.5468 + 0.8978i | 0.5468 + 0.8978i | 0.5468 + 0.8978i | 0.5468 + 0.8978i | 0.5468 + 0.8978i |
| 10.5 | 0.5425 + 0.8879i | 0.5425 + 0.8879i | 0.5425 + 0.8879i | 0.5425 + 0.8879i | 0.5425 + 0.8879i | 0.5425 + 0.8879i | 0.5425 + 0.8879i | 0.5425 + 0.8879i |
| 11 | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i |
| 12 | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i |
| 13 | 0.4648 + 0.8318i | 0.4648 + 0.8318i | 0.4648 + 0.8318i | 0.4648 + 0.8318i | 0.4648 + 0.8318i | 0.4648 + 0.8318i | 0.4648 + 0.8318i | 0.4648 + 0.8318i |
| 13.5 | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i |
| 14 | 0.4093 + 0.6060i | 0.4093 + 0.6060i | 0.4093 + 0.6060i | 0.4093 + 0.6060i | 0.4093 + 0.6060i | 0.4093 + 0.6060i | 0.4093 + 0.6060i | 0.4093 + 0.6060i |

-continued

| | | | | | | | | |
|---|---|---|---|---|---|---|---|---|
| 14.5 | 0.4149 + 0.6037i | 0.4149 + 0.6037i | 0.4149 + 0.6037i | 0.4149 + 0.6037i | 0.4149 + 0.6037i | 0.4149 + 0.6037i | 0.4149 + 0.6037i | 0.4149 + 0.6037i |
| 15 | 0.4058 + 0.6156i | 0.4058 + 0.6156i | 0.4058 + 0.6156i | 0.4058 + 0.6156i | 0.4058 + 0.6156i | 0.4058 + 0.6156i | 0.4058 + 0.6156i | 0.4058 + 0.6156i |
| 15.5 | 0.4071 + 0.5938i | 0.4071 + 0.5938i | 0.4071 + 0.5938i | 0.4071 + 0.5938i | 0.4110 + 0.6470i | 0.4110 + 0.6470i | 0.4110 + 0.6470i | 0.4110 + 0.6470i |
| 16 | 0.3778 + 0.6023i | 0.3778 + 0.6023i | 0.3778 + 0.6023i | 0.3778 + 0.6023i | 0.3868 + 0.6809i | 0.3868 + 0.6809i | 0.3868 + 0.6809i | 0.3868 + 0.6809i |
| 16.5 | 0.3459 + 0.5861i | 0.3459 + 0.5861i | 0.3459 + 0.5861i | 0.3459 + 0.5861i | 0.3454 + 0.6725i | 0.3454 + 0.6725i | 0.3454 + 0.6725i | 0.3454 + 0.6725i |
| 17 | 0.3461 + 0.5834i | 0.3461 + 0.5834i | 0.3461 + 0.5834i | 0.3461 + 0.5834i | 0.3459 + 0.6781i | 0.3459 + 0.6781i | 0.3459 + 0.6781i | 0.3459 + 0.6781i |
| 17.5 | 0.3651 + 0.5790i | 0.3651 + 0.5790i | 0.3651 + 0.5790i | 0.3651 + 0.5790i | 0.3580 + 0.6881i | 0.3580 + 0.6881i | 0.3580 + 0.6881i | 0.3580 + 0.6881i |
| 18 | 0.3699 + 0.5726i | 0.3699 + 0.5726i | 0.3699 + 0.5726i | 0.3699 + 0.5726i | 0.3696 + 0.6985i | 0.3696 + 0.6985i | 0.3696 + 0.6985i | 0.3696 + 0.6985i |
| 18.5 | 0.3738 + 0.6263i | 0.3738 + 0.6263i | 0.3738 + 0.6263i | 0.3738 + 0.6263i | 0.4179 + 0.7902i | 0.4179 + 0.7902i | 0.4179 + 0.7902i | 0.4179 + 0.7902i |
| 19 | 0.3971 + 0.6302i | 0.3971 + 0.6302i | 0.3971 + 0.6302i | 0.3971 + 0.6302i | 0.4486 + 0.7925i | 0.4486 + 0.7925i | 0.4486 + 0.7925i | 0.4486 + 0.7925i |
| 19.5 | 0.4169 + 0.6347i | 0.4169 + 0.6347i | 0.4169 + 0.6347i | 0.4169 + 0.6347i | 0.4691 + 0.7964i | 0.4691 + 0.7964i | 0.4691 + 0.7964i | 0.4691 + 0.7964i |
| 20 | 0.4344 + 0.5383i | 0.4344 + 0.5383i | 0.4344 + 0.5383i | 0.4344 + 0.5383i | 0.3963 + 0.6856i | 0.3963 + 0.6856i | 0.3963 + 0.6856i | 0.3963 + 0.6856i |
| 20.5 | 0.4336 + 0.5920i | 0.4336 + 0.5920i | 0.4336 + 0.5920i | 0.4336 + 0.5920i | 0.4488 + 0.7551i | 0.4488 + 0.7551i | 0.4488 + 0.7551i | 0.4488 + 0.7551i |
| 21 | 0.4211 + 0.5673i | 0.4211 + 0.5673i | 0.4211 + 0.5673i | 0.4211 + 0.5673i | 0.4296 + 0.7571i | 0.4265 + 0.7104i | 0.4296 + 0.7571i | 0.4265 + 0.7104i |
| 21.5 | 0.4148 + 0.5630i | 0.4148 + 0.5630i | 0.4148 + 0.5630i | 0.4148 + 0.5630i | 0.4039 + 0.7447i | 0.4048 + 0.6984i | 0.4039 + 0.7447i | 0.4048 + 0.6984i |
| 22 | 0.4243 + 0.5622i | 0.4243 + 0.5622i | 0.4243 + 0.5622i | 0.4243 + 0.5622i | 0.4277 + 0.7656i | 0.4269 + 0.7001i | 0.4277 + 0.7656i | 0.4269 + 0.7001i |
| 22.5 | 0.4201 + 0.5620i | 0.4201 + 0.5620i | 0.4201 + 0.5620i | 0.4201 + 0.5620i | 0.4166 + 0.7523i | 0.4191 + 0.6937i | 0.4166 + 0.7523i | 0.4191 + 0.6937i |
| 23 | 0.4201 + 0.5417i | 0.4186 + 0.5838i | 0.4201 + 0.5417i | 0.4186 + 0.5838i | 0.4105 + 0.7806i | 0.4110 + 0.6931i | 0.4105 + 0.7806i | 0.4110 + 0.6931i |
| 23.5 | 0.4234 + 0.5374i | 0.4229 + 0.5818i | 0.4234 + 0.5374i | 0.4229 + 0.5818i | 0.4210 + 0.7721i | 0.4238 + 0.6880i | 0.4210 + 0.7721i | 0.4238 + 0.6880i |
| 24 | 0.4100 + 0.5305i | 0.4084 + 0.5910i | 0.4100 + 0.5305i | 0.4084 + 0.5910i | 0.4033 + 0.7824i | 0.4052 + 0.6898i | 0.4033 + 0.7824i | 0.4052 + 0.6898i |
| 24.5 | 0.4217 + 0.5263i | 0.4165 + 0.6027i | 0.4217 + 0.5263i | 0.4165 + 0.6027i | 0.4210 + 0.8001i | 0.4086 + 0.6991i | 0.3823 + 0.8003i | 0.4086 + 0.6991i |
| 25 | 0.4499 + 0.5230i | 0.4394 + 0.6025i | 0.3970 + 0.5187i | 0.3924 + 0.5977i | 0.4127 + 0.8016i | 0.4248 + 0.6985i | 0.3717 + 0.7989i | 0.3841 + 0.6928i |
| 25.5 | 0.4713 + 0.5531i | 0.4766 + 0.6300i | 0.4019 + 0.5558i | 0.4036 + 0.6329i | 0.4825 + 0.7991i | 0.4804 + 0.7133i | 0.4063 + 0.8041i | 0.4045 + 0.7167i |
| 26 | 0.4704 + 0.5396i | 0.4557 + 0.6111i | 0.4115 + 0.5347i | 0.4241 + 0.6454i | 0.4123 + 0.8520i | 0.4554 + 0.8028i | 0.3640 + 0.8375i | 0.4184 + 0.7393i |
| 26.5 | 0.4616 + 0.5519i | 0.4251 + 0.6479i | 0.3986 + 0.5420i | 0.3877 + 0.6124i | 0.3594 + 0.7678i | 0.3969 + 0.7243i | 0.3707 + 0.8267i | 0.4482 + 0.8030i |
| 27 | 0.4932 + 0.5555i | 0.4800 + 0.6280i | 0.4144 + 0.5520i | 0.4124 + 0.6261i | 0.4851 + 0.7848i | 0.4912 + 0.6997i | 0.4214 + 0.7951i | 0.4128 + 0.7066i |
| 27.5 | 0.4887 + 0.5809i | 0.4812 + 0.6491i | 0.4174 + 0.5692i | 0.4122 + 0.6478i | 0.4949 + 0.8030i | 0.4972 + 0.7169i | 0.4243 + 0.8140i | 0.4168 + 0.7278i |
| 28 | 0.4885 + 0.5615i | 0.4738 + 0.6399i | 0.4131 + 0.5615i | 0.4096 + 0.6374i | 0.4750 + 0.8030i | 0.4772 + 0.7164i | 0.4136 + 0.8164i | 0.4073 + 0.7216i |

| SNR/w | w184 | w185 | w186 | w187 | w188 | w189 | w190 | w19i |
|---|---|---|---|---|---|---|---|---|
| 7 | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i | 0.2555 + 0.4501i |
| 7.5 | 0.2495 + 0.4483i | 0.2495 + 0.4483i | 0.2495 + 0.4483i | 0.2495 + 0.4483i | 0.2943 + 0.5156i | 0.2943 + 0.5156i | 0.2495 + 0.4483i | 0.2495 + 0.4483i |
| 8 | 0.2715 + 0.5261i | 0.2715 + 0.5261i | 0.2715 + 0.5261i | 0.2715 + 0.5261i | 0.2715 + 0.5261i | 0.2715 + 0.5261i | 0.2715 + 0.5261i | 0.2715 + 0.5261i |
| 8.5 | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i | 0.2621 + 0.5179i |
| 9 | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i | 0.5588 + 0.9336i |
| 9.5 | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i | 0.5494 + 0.9126i |
| 10 | 0.5468 + 0.8978i | 0.5468 + 0.8978i | 0.5468 + 0.8978i | 0.5468 + 0.8978i | 0.5468 + 0.8978i | 0.5468 + 0.8978i | 0.5468 + 0.8978i | 0.5468 + 0.8978i |
| 10.5 | 0.5425 + 0.8879i | 0.5425 + 0.8879i | 0.5425 + 0.8879i | 0.5425 + 0.8879i | 0.5425 + 0.8879i | 0.5425 + 0.8879i | 0.5425 + 0.8879i | 0.5425 + 0.8879i |
| 11 | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i | 0.2971 + 0.6034i |
| 11.5 | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i | 0.3083 + 0.6075i |

-continued

| | | | | | | | | |
|---|---|---|---|---|---|---|---|---|
| 12 | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i | 0.3151 + 0.6086i |
| 12.5 | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i | 0.3628 + 0.6307i |
| 13 | 0.4648 + 0.8318i | 0.4648 + 0.8318i | 0.4648 + 0.8318i | 0.4648 + 0.8318i | 0.4648 + 0.8318i | 0.4648 + 0.8318i | 0.4648 + 0.8318i | 0.4648 + 0.8318i |
| 13.5 | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i | 0.3865 + 0.6258i |
| 14 | 0.4093 + 0.6060i | 0.4093 + 0.6060i | 0.4093 + 0.6060i | 0.4093 + 0.6060i | 0.4093 + 0.6060i | 0.4093 + 0.6060i | 0.4093 + 0.6060i | 0.4093 + 0.6060i |
| 14.5 | 0.4149 + 0.6037i | 0.4149 + 0.6037i | 0.4149 + 0.6037i | 0.4149 + 0.6037i | 0.4149 + 0.6037i | 0.4149 + 0.6037i | 0.4149 + 0.6037i | 0.4149 + 0.6037i |
| 15 | 0.4058 + 0.6156i | 0.4058 + 0.6156i | 0.4058 + 0.6156i | 0.4058 + 0.6156i | 0.4058 + 0.6156i | 0.4058 + 0.6156i | 0.4058 + 0.6156i | 0.4058 + 0.6156i |
| 15.5 | 0.4071 + 0.5938i | 0.4071 + 0.5938i | 0.4071 + 0.5938i | 0.4071 + 0.5938i | 0.4110 + 0.6470i | 0.4110 + 0.6470i | 0.4110 + 0.6470i | 0.4110 + 0.6470i |
| 16 | 0.3778 + 0.6023i | 0.3778 + 0.6023i | 0.3778 + 0.6023i | 0.3778 + 0.6023i | 0.3868 + 0.6809i | 0.3868 + 0.6809i | 0.3868 + 0.6809i | 0.3868 + 0.6809i |
| 16.5 | 0.3459 + 0.5861i | 0.3459 + 0.5861i | 0.3459 + 0.5861i | 0.3459 + 0.5861i | 0.3454 + 0.6725i | 0.3454 + 0.6725i | 0.3454 + 0.6725i | 0.3454 + 0.6725i |
| 17 | 0.3461 + 0.5834i | 0.3461 + 0.5834i | 0.3461 + 0.5834i | 0.3461 + 0.5834i | 0.3459 + 0.6781i | 0.3459 + 0.6781i | 0.3459 + 0.6781i | 0.3459 + 0.6781i |
| 17.5 | 0.3255 + 0.5796i | 0.3255 + 0.5796i | 0.3255 + 0.5796i | 0.3255 + 0.5796i | 0.3265 + 0.6846i | 0.3265 + 0.6846i | 0.3580 + 0.6881i | 0.3265 + 0.6846i |
| 18 | 0.3175 + 0.5728i | 0.3175 + 0.5728i | 0.3175 + 0.5728i | 0.3175 + 0.5728i | 0.3191 + 0.7014i | 0.3191 + 0.7014i | 0.3191 + 0.7014i | 0.3191 + 0.7014i |
| 18.5 | 0.3101 + 0.6373i | 0.3101 + 0.6373i | 0.3101 + 0.6373i | 0.3101 + 0.6373i | 0.3304 + 0.8123i | 0.3304 + 0.8123i | 0.3304 + 0.8123i | 0.3304 + 0.8123i |
| 19 | 0.3093 + 0.6504i | 0.3093 + 0.6504i | 0.3093 + 0.6504i | 0.3093 + 0.6504i | 0.3348 + 0.8218i | 0.3348 + 0.8218i | 0.3348 + 0.8218i | 0.3348 + 0.8218i |
| 19.5 | 0.3091 + 0.6604i | 0.3091 + 0.6604i | 0.3091 + 0.6604i | 0.3091 + 0.6604i | 0.3379 + 0.8293i | 0.3379 + 0.8293i | 0.3379 + 0.8293i | 0.3379 + 0.8293i |
| 20 | 0.3126 + 0.5103i | 0.3126 + 0.5103i | 0.3126 + 0.5103i | 0.3126 + 0.5103i | 0.2889 + 0.6526i | 0.2889 + 0.6526i | 0.2889 + 0.6526i | 0.2889 + 0.6526i |
| 20.5 | 0.3061 + 0.5984i | 0.3061 + 0.5984i | 0.3061 + 0.5984i | 0.3061 + 0.5984i | 0.3151 + 0.7614i | 0.3151 + 0.7614i | 0.3151 + 0.7614i | 0.3151 + 0.7614i |
| 21 | 0.2981 + 0.5721i | 0.2981 + 0.5721i | 0.2981 + 0.5721i | 0.2981 + 0.5721i | 0.3058 + 0.7624i | 0.3034 + 0.7165i | 0.3058 + 0.7624i | 0.3034 + 0.7165i |
| 21.5 | 0.2894 + 0.5564i | 0.2894 + 0.5564i | 0.2894 + 0.5564i | 0.2894 + 0.5564i | 0.2841 + 0.7489i | 0.2837 + 0.6957i | 0.2841 + 0.7489i | 0.2837 + 0.6957i |
| 22 | 0.2989 + 0.5650i | 0.2989 + 0.5650i | 0.2989 + 0.5650i | 0.2989 + 0.5650i | 0.3037 + 0.7640i | 0.3024 + 0.7019i | 0.3037 + 0.7640i | 0.3024 + 0.7019i |
| 22.5 | 0.2925 + 0.5584i | 0.2925 + 0.5584i | 0.2925 + 0.5584i | 0.2925 + 0.5584i | 0.2931 + 0.7505i | 0.2913 + 0.6920i | 0.2931 + 0.7505i | 0.2913 + 0.6920i |
| 23 | 0.2895 + 0.5356i | 0.2897 + 0.5764i | 0.2895 + 0.5356i | 0.2897 + 0.5764i | 0.2851 + 0.7771i | 0.2883 + 0.6891i | 0.2851 + 0.7771i | 0.2883 + 0.6891i |
| 23.5 | 0.2961 + 0.5344i | 0.2953 + 0.5790i | 0.2961 + 0.5344i | 0.2953 + 0.5790i | 0.2950 + 0.7690i | 0.2948 + 0.6849i | 0.2950 + 0.7690i | 0.2948 + 0.6849i |
| 24 | 0.2837 + 0.5315i | 0.2827 + 0.5939i | 0.2837 + 0.5315i | 0.2827 + 0.5939i | 0.2855 + 0.7974i | 0.2808 + 0.6950i | 0.2855 + 0.7974i | 0.2808 + 0.6950i |
| 24.5 | 0.2963 + 0.5236i | 0.2930 + 0.5942i | 0.2963 + 0.5236i | 0.2930 + 0.5942i | 0.2771 + 0.7889i | 0.2869 + 0.6899i | 0.2771 + 0.7889i | 0.2869 + 0.6899i |
| 25 | 0.2929 + 0.5147i | 0.2893 + 0.5911i | 0.2929 + 0.5147i | 0.2893 + 0.5911i | 0.2718 + 0.7842i | 0.2834 + 0.6839i | 0.2718 + 0.7842i | 0.2834 + 0.6839i |
| 25.5 | 0.2691 + 0.5602i | 0.2701 + 0.6365i | 0.3232 + 0.5582i | 0.3244 + 0.6346i | 0.2749 + 0.8226i | 0.2718 + 0.7235i | 0.3274 + 0.8149i | 0.3244 + 0.7213i |
| 26 | 0.2972 + 0.5451i | 0.2990 + 0.6252i | 0.3472 + 0.5423i | 0.3491 + 0.6333i | 0.2795 + 0.8178i | 0.2862 + 0.7117i | 0.2795 + 0.8178i | 0.3367 + 0.7232i |
| 26.5 | 0.2596 + 0.5290i | 0.2589 + 0.5985i | 0.3256 + 0.5326i | 0.3154 + 0.6039i | 0.2797 + 0.7660i | 0.2874 + 0.6779i | 0.2816 + 0.8277i | 0.2874 + 0.6779i |
| 27 | 0.2766 + 0.5536i | 0.2777 + 0.6319i | 0.3404 + 0.5532i | 0.3419 + 0.6283i | 0.2818 + 0.8033i | 0.2795 + 0.7152i | 0.3469 + 0.7986i | 0.3449 + 0.7116i |
| 27.5 | 0.2828 + 0.5653i | 0.2811 + 0.6456i | 0.3483 + 0.5665i | 0.3451 + 0.6465i | 0.2821 + 0.8240i | 0.2808 + 0.7321i | 0.3509 + 0.8188i | 0.3469 + 0.7317i |
| 28 | 0.2732 + 0.5668i | 0.2746 + 0.6455i | 0.3392 + 0.5659i | 0.3408 + 0.6410i | 0.2773 + 0.8163i | 0.2760 + 0.7294i | 0.3462 + 0.8141i | 0.3422 + 0.7259i |

| SNR/w | w192 | w193 | w194 | w195 | w196 | w197 | w198 | w199 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4119 + 0.2279i | 0.4119 + 0.2279i | 0.4119 + 0.2279i | 0.4119 + 0.2279i | 0.4119 + 0.2279i | 0.4119 + 0.2279i | 0.4119 + 0.2279i | 0.4119 + 0.2279i |
| 8.5 | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |

-continued

| | | | | | | | | |
|---|---|---|---|---|---|---|---|---|
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i |
| 11.5 | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i |
| 12 | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i |
| 12.5 | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i |
| 14 | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i |
| 14.5 | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i |
| 15 | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i |
| 16 | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i |
| 18 | 0.1133 + 0.1114i | 0.1133 + 0.1114i | 0.1133 + 0.1114i | 0.1133 + 0.1114i | 0.1133 + 0.1114i | 0.1133 + 0.1114i | 0.1133 + 0.1114i | 0.1133 + 0.1114i |
| 18.5 | 0.0961 + 0.0854i | 0.0961 + 0.0854i | 0.0961 + 0.0854i | 0.0961 + 0.0854i | 0.0971 + 0.1780i | 0.0971 + 0.1780i | 0.0971 + 0.1780i | 0.0971 + 0.1780i |
| 19 | 0.0921 + 0.0770i | 0.0921 + 0.0770i | 0.0921 + 0.0770i | 0.0921 + 0.0770i | 0.0938 + 0.2028i | 0.0938 + 0.2028i | 0.0938 + 0.2028i | 0.0938 + 0.2028i |
| 19.5 | 0.0905 + 0.0748i | 0.0905 + 0.0748i | 0.0905 + 0.0748i | 0.0905 + 0.0748i | 0.0927 + 0.2157i | 0.0927 + 0.2157i | 0.0927 + 0.2157i | 0.0927 + 0.2157i |
| 20 | 0.0722 + 0.0935i | 0.0722 + 0.0935i | 0.0722 + 0.0935i | 0.0722 + 0.0935i | 0.0722 + 0.0935i | 0.0722 + 0.0935i | 0.0722 + 0.0935i | 0.0722 + 0.0935i |
| 20.5 | 0.0636 + 0.0660i | 0.0636 + 0.0660i | 0.0636 + 0.0660i | 0.0636 + 0.0660i | 0.0638 + 0.1878i | 0.0638 + 0.1878i | 0.0638 + 0.1878i | 0.0638 + 0.1878i |
| 21 | 0.0606 + 0.0613i | 0.0606 + 0.0613i | 0.0606 + 0.0613i | 0.0606 + 0.0613i | 0.0605 + 0.1754i | 0.0605 + 0.1754i | 0.0605 + 0.1754i | 0.0605 + 0.1754i |
| 21.5 | 0.0624 + 0.0575i | 0.0624 + 0.0575i | 0.0624 + 0.0575i | 0.0624 + 0.0575i | 0.0619 + 0.1651i | 0.0619 + 0.1651i | 0.0619 + 0.1651i | 0.0619 + 0.1651i |
| 22 | 0.0583 + 0.0591i | 0.0583 + 0.0591i | 0.0583 + 0.0591i | 0.0583 + 0.0591i | 0.0583 + 0.1759i | 0.0583 + 0.1759i | 0.0583 + 0.1759i | 0.0583 + 0.1759i |
| 22.5 | 0.0593 + 0.0592i | 0.0593 + 0.0592i | 0.0593 + 0.0592i | 0.0593 + 0.0592i | 0.0611 + 0.1735i | 0.0611 + 0.1735i | 0.0611 + 0.1735i | 0.0611 + 0.1735i |
| 23 | 0.0597 + 0.0546i | 0.0597 + 0.0546i | 0.0597 + 0.0546i | 0.0597 + 0.0546i | 0.0589 + 0.1642i | 0.0589 + 0.1642i | 0.0589 + 0.1642i | 0.0589 + 0.1642i |
| 23.5 | 0.0579 + 0.0565i | 0.0579 + 0.0565i | 0.0579 + 0.0565i | 0.0579 + 0.0565i | 0.0585 + 0.1710i | 0.0585 + 0.1710i | 0.0585 + 0.1710i | 0.0585 + 0.1710i |
| 24 | 0.0568 + 0.0565i | 0.0568 + 0.0565i | 0.0568 + 0.0565i | 0.0568 + 0.0565i | 0.0567 + 0.1703i | 0.0567 + 0.1703i | 0.0567 + 0.1703i | 0.0567 + 0.1703i |
| 24.5 | 0.0562 + 0.0569i | 0.0562 + 0.0569i | 0.0562 + 0.0569i | 0.0562 + 0.0569i | 0.0565 + 0.1714i | 0.0565 + 0.1714i | 0.0565 + 0.1714i | 0.0565 + 0.1714i |
| 25 | 0.0573 + 0.0541i | 0.0573 + 0.0541i | 0.0573 + 0.0541i | 0.0573 + 0.0541i | 0.0573 + 0.1634i | 0.0573 + 0.1634i | 0.0573 + 0.1634i | 0.0573 + 0.1634i |
| 25.5 | 0.0539 + 0.0400i | 0.0526 + 0.0822i | 0.0539 + 0.0400i | 0.0526 + 0.0822i | 0.0548 + 0.2082i | 0.0533 + 0.1620i | 0.0548 + 0.2082i | 0.0533 + 0.1620i |
| 26 | 0.0344 + 0.0341i | 0.0353 + 0.0840i | 0.0901 + 0.0333i | 0.0896 + 0.0834i | 0.0350 + 0.2090i | 0.0359 + 0.1529i | 0.0840 + 0.2107i | 0.0864 + 0.1532i |
| 26.5 | 0.0350 + 0.0336i | 0.0344 + 0.0721i | 0.0994 + 0.0336i | 0.0982 + 0.0745i | 0.0332 + 0.1857i | 0.0337 + 0.1391i | 0.0949 + 0.1879i | 0.0967 + 0.1405i |
| 27 | 0.0312 + 0.0312i | 0.0315 + 0.0893i | 0.0899 + 0.0311i | 0.0893 + 0.0896i | 0.0313 + 0.2132i | 0.0316 + 0.1532i | 0.0877 + 0.2140i | 0.0886 + 0.1536i |
| 27.5 | 0.0321 + 0.0316i | 0.0320 + 0.0923i | 0.0944 + 0.0317i | 0.0944 + 0.0924i | 0.0316 + 0.2186i | 0.0319 + 0.1557i | 0.0930 + 0.2195i | 0.0936 + 0.1565i |
| 28 | 0.0325 + 0.0301i | 0.0319 + 0.0893i | 0.0962 + 0.0306i | 0.0959 + 0.0901i | 0.0317 + 0.2134i | 0.0317 + 0.1511i | 0.0943 + 0.2132i | 0.0949 + 0.1513i |

-continued

| SNR/w | w200 | w201 | w202 | w203 | w204 | w205 | w206 | w207 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4119 + 0.2279i | 0.4119 + 0.2279i | 0.4119 + 0.2279i | 0.4119 + 0.2279i | 0.4692 + 0.2540i | 0.4119 + 0.2279i | 0.4692 + 0.2540i | 0.4119 + 0.2279i |
| 8.5 | 0.5179 + 0.2621i | 0.3997 + 0.2175i | 0.5179 + 0.2621i | 0.3997 + 0.2175i | 0.5179 + 0.2621i | 0.5179 + 0.2621i | 0.5179 + 0.2621i | 0.5179 + 0.2621i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i |
| 11.5 | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i |
| 12 | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i |
| 12.5 | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i |
| 14 | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i |
| 14.5 | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i |
| 15 | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i | 0.1206 + 0.1207i |
| 15.5 | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i | 0.1173 + 0.1209i |
| 16 | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i | 0.1099 + 0.1231i |
| 16.5 | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i | 0.1146 + 0.1125i |
| 17 | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i | 0.1142 + 0.1123i |
| 17.5 | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i | 0.1141 + 0.1120i |
| 18 | 0.1133 + 0.1114i | 0.1133 + 0.1114i | 0.1133 + 0.1114i | 0.1133 + 0.1114i | 0.1133 + 0.1114i | 0.1133 + 0.1114i | 0.1133 + 0.1114i | 0.1133 + 0.1114i |
| 18.5 | 0.0961 + 0.0854i | 0.0961 + 0.0854i | 0.0961 + 0.0854i | 0.0961 + 0.0854i | 0.0971 + 0.1780i | 0.0971 + 0.1780i | 0.0971 + 0.1780i | 0.0971 + 0.1780i |
| 19 | 0.0921 + 0.0770i | 0.0921 + 0.0770i | 0.0921 + 0.0770i | 0.0921 + 0.0770i | 0.0938 + 0.2028i | 0.0938 + 0.2028i | 0.0938 + 0.2028i | 0.0938 + 0.2028i |
| 19.5 | 0.0905 + 0.0748i | 0.0905 + 0.0748i | 0.0905 + 0.0748i | 0.0905 + 0.0748i | 0.0927 + 0.2157i | 0.0927 + 0.2157i | 0.0927 + 0.2157i | 0.0927 + 0.2157i |
| 20 | 0.2104 + 0.0757i | 0.2104 + 0.0757i | 0.2104 + 0.0757i | 0.2104 + 0.0757i | 0.2094 + 0.1154i | 0.2094 + 0.1154i | 0.2094 + 0.1154i | 0.2094 + 0.1154i |
| 20.5 | 0.1593 + 0.0657i | 0.1593 + 0.0657i | 0.1593 + 0.0657i | 0.1593 + 0.0657i | 0.1613 + 0.1873i | 0.1613 + 0.1873i | 0.1613 + 0.1873i | 0.1613 + 0.1873i |
| 21 | 0.1708 + 0.0613i | 0.1708 + 0.0613i | 0.1708 + 0.0613i | 0.1708 + 0.0613i | 0.1705 + 0.1750i | 0.1705 + 0.1750i | 0.1705 + 0.1750i | 0.1705 + 0.1750i |
| 21.5 | 0.1850 + 0.0578i | 0.1850 + 0.0578i | 0.1850 + 0.0578i | 0.1850 + 0.0578i | 0.1832 + 0.1667i | 0.1832 + 0.1667i | 0.1832 + 0.1667i | 0.1832 + 0.1667i |
| 22 | 0.1740 + 0.0587i | 0.1740 + 0.0587i | 0.1740 + 0.0587i | 0.1740 + 0.0587i | 0.1739 + 0.1750i | 0.1739 + 0.1750i | 0.1739 + 0.1750i | 0.1739 + 0.1750i |
| 22.5 | 0.1798 + 0.0568i | 0.1798 + 0.0568i | 0.1798 + 0.0568i | 0.1798 + 0.0568i | 0.1797 + 0.1737i | 0.1797 + 0.1737i | 0.1797 + 0.1737i | 0.1797 + 0.1737i |
| 23 | 0.1753 + 0.0566i | 0.1753 + 0.0566i | 0.1753 + 0.0566i | 0.1753 + 0.0566i | 0.1746 + 0.1655i | 0.1746 + 0.1655i | 0.1746 + 0.1655i | 0.1746 + 0.1655i |
| 23.5 | 0.1751 + 0.0567i | 0.1751 + 0.0567i | 0.1751 + 0.0567i | 0.1751 + 0.0567i | 0.1756 + 0.1709i | 0.1756 + 0.1709i | 0.1756 + 0.1709i | 0.1756 + 0.1709i |
| 24 | 0.1711 + 0.0565i | 0.1711 + 0.0565i | 0.1711 + 0.0565i | 0.1711 + 0.0565i | 0.1709 + 0.1707i | 0.1709 + 0.1707i | 0.1709 + 0.1707i | 0.1709 + 0.1707i |
| 24.5 | 0.1692 + 0.0568i | 0.1692 + 0.0568i | 0.1692 + 0.0568i | 0.1692 + 0.0568i | 0.1703 + 0.1710i | 0.1703 + 0.1710i | 0.1703 + 0.1710i | 0.1703 + 0.1710i |
| 25 | 0.1749 + 0.0537i | 0.1749 + 0.0537i | 0.1749 + 0.0537i | 0.1749 + 0.0537i | 0.1745 + 0.1626i | 0.1745 + 0.1626i | 0.1745 + 0.1626i | 0.1745 + 0.1626i |
| 25.5 | 0.1615 + 0.0411i | 0.1623 + 0.0829i | 0.1615 + 0.0411i | 0.1623 + 0.0829i | 0.1638 + 0.2083i | 0.1635 + 0.1621i | 0.1638 + 0.2083i | 0.1635 + 0.1621i |

-continued

| | | | | | | | | |
|---|---|---|---|---|---|---|---|---|
| 26 | 0.2200 + 0.0335i | 0.2157 + 0.0862i | 0.1605 + 0.0334i | 0.1594 + 0.0842i | 0.2057 + 0.2111i | 0.2090 + 0.1567i | 0.1533 + 0.2109i | 0.1556 + 0.1545i |
| 26.5 | 0.2312 + 0.0326i | 0.2301 + 0.0822i | 0.1675 + 0.0333i | 0.1669 + 0.0781i | 0.2213 + 0.2007i | 0.2267 + 0.1480i | 0.1613 + 0.1940i | 0.1643 + 0.1434i |
| 27 | 0.2133 + 0.0321i | 0.2124 + 0.0917i | 0.1539 + 0.0316i | 0.1528 + 0.0907i | 0.2111 + 0.2173i | 0.2112 + 0.1563i | 0.1511 + 0.2158i | 0.1520 + 0.1548i |
| 27.5 | 0.2220 + 0.0325i | 0.2205 + 0.0962i | 0.1593 + 0.0316i | 0.1585 + 0.0936i | 0.2186 + 0.2223i | 0.2194 + 0.1603i | 0.1562 + 0.2208i | 0.1568 + 0.1579i |
| 28 | 0.2272 + 0.0295i | 0.2268 + 0.0890i | 0.1609 + 0.0303i | 0.1613 + 0.0901i | 0.2228 + 0.2150i | 0.2255 + 0.1519i | 0.1587 + 0.2135i | 0.1605 + 0.1517i |

| SNR/w | w208 | w209 | w210 | w211 | w212 | w213 | w214 | w215 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4119 + 0.2279i | 0.4119 + 0.2279i | 0.4119 + 0.2279i | 0.4119 + 0.2279i | 0.4692 + 0.2540i | 0.4119 + 0.2279i | 0.4692 + 0.2540i | 0.4119 + 0.2279i |
| 8.5 | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i |
| 9 | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i |
| 9.5 | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i |
| 10 | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i |
| 10.5 | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i |
| 11 | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i |
| 11.5 | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i |
| 12 | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i |
| 12.5 | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i |
| 13 | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i |
| 13.5 | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i |
| 14 | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i |
| 14.5 | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i |
| 15 | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i |
| 15.5 | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i |
| 16 | 0.1142 + 0.3766i | 0.1142 + 0.3766i | 0.1142 + 0.3766i | 0.1142 + 0.3766i | 0.1142 + 0.3766i | 0.1142 + 0.3766i | 0.1142 + 0.3766i | 0.1142 + 0.3766i |
| 16.5 | 0.1133 + 0.3468i | 0.1133 + 0.3468i | 0.1133 + 0.3468i | 0.1133 + 0.3468i | 0.1133 + 0.3468i | 0.1133 + 0.3468i | 0.1133 + 0.3468i | 0.1133 + 0.3468i |
| 17 | 0.1129 + 0.3473i | 0.1129 + 0.3473i | 0.1129 + 0.3473i | 0.1129 + 0.3473i | 0.1129 + 0.3473i | 0.1129 + 0.3473i | 0.1129 + 0.3473i | 0.1129 + 0.3473i |
| 17.5 | 0.1113 + 0.3593i | 0.1113 + 0.3593i | 0.1113 + 0.3593i | 0.1113 + 0.3593i | 0.1146 + 0.3275i | 0.1113 + 0.3593i | 0.1146 + 0.3275i | 0.1113 + 0.3593i |
| 18 | 0.1118 + 0.3721i | 0.1118 + 0.3721i | 0.1118 + 0.3721i | 0.1118 + 0.3721i | 0.1122 + 0.3197i | 0.1122 + 0.3197i | 0.1122 + 0.3197i | 0.1122 + 0.3197i |
| 18.5 | 0.1033 + 0.4748i | 0.1033 + 0.4748i | 0.1033 + 0.4748i | 0.1033 + 0.4748i | 0.0995 + 0.3488i | 0.0995 + 0.3488i | 0.0995 + 0.3488i | 0.0995 + 0.3488i |
| 19 | 0.1037 + 0.5029i | 0.1037 + 0.5029i | 0.1037 + 0.5029i | 0.1037 + 0.5029i | 0.0979 + 0.3590i | 0.0979 + 0.3590i | 0.0979 + 0.3590i | 0.0979 + 0.3590i |
| 19.5 | 0.0798 + 0.5209i | 0.0798 + 0.5209i | 0.0798 + 0.5209i | 0.0798 + 0.5209i | 0.0976 + 0.3682i | 0.0976 + 0.3682i | 0.0976 + 0.3682i | 0.0976 + 0.3682i |
| 20 | 0.0700 + 0.3244i | 0.0700 + 0.3244i | 0.0700 + 0.3244i | 0.0700 + 0.3244i | 0.0714 + 0.2590i | 0.0714 + 0.2590i | 0.0714 + 0.2590i | 0.0714 + 0.2590i |
| 20.5 | 0.0631 + 0.4551i | 0.0631 + 0.4551i | 0.0631 + 0.4551i | 0.0631 + 0.4551i | 0.0635 + 0.3220i | 0.0635 + 0.3220i | 0.0635 + 0.3220i | 0.0635 + 0.3220i |
| 21 | 0.0606 + 0.4318i | 0.0606 + 0.4318i | 0.0606 + 0.4318i | 0.0606 + 0.4318i | 0.0605 + 0.3029i | 0.0605 + 0.3029i | 0.0605 + 0.3029i | 0.0605 + 0.3029i |
| 21.5 | 0.0595 + 0.4083i | 0.0595 + 0.4083i | 0.0595 + 0.4083i | 0.0595 + 0.4083i | 0.0610 + 0.2852i | 0.0610 + 0.2852i | 0.0610 + 0.2852i | 0.0610 + 0.2852i |
| 22 | 0.0587 + 0.4286i | 0.0587 + 0.4286i | 0.0587 + 0.4286i | 0.0587 + 0.4286i | 0.0588 + 0.2997i | 0.0588 + 0.2997i | 0.0588 + 0.2997i | 0.0588 + 0.2997i |
| 22.5 | 0.0573 + 0.4196i | 0.0573 + 0.4196i | 0.0573 + 0.4196i | 0.0573 + 0.4196i | 0.0591 + 0.2925i | 0.0591 + 0.2925i | 0.0591 + 0.2925i | 0.0591 + 0.2925i |
| 23 | 0.0552 + 0.4065i | 0.0552 + 0.4065i | 0.0552 + 0.4065i | 0.0552 + 0.4065i | 0.0586 + 0.2809i | 0.0586 + 0.2809i | 0.0586 + 0.2809i | 0.0586 + 0.2809i |

-continued

| | | | | | | | | |
|---|---|---|---|---|---|---|---|---|
| 23.5 | 0.0585 + 0.4134i | 0.0585 + 0.4134i | 0.0585 + 0.4134i | 0.0585 + 0.4134i | 0.0586 + 0.2893i | 0.0586 + 0.2893i | 0.0586 + 0.2893i | 0.0586 + 0.2893i |
| 24 | 0.0557 + 0.4158i | 0.0557 + 0.4158i | 0.0557 + 0.4158i | 0.0557 + 0.4158i | 0.0564 + 0.2883i | 0.0564 + 0.2883i | 0.0564 + 0.2883i | 0.0564 + 0.2883i |
| 24.5 | 0.0582 + 0.4127i | 0.0582 + 0.4127i | 0.0582 + 0.4127i | 0.0582 + 0.4127i | 0.0571 + 0.2886i | 0.0571 + 0.2886i | 0.0571 + 0.2886i | 0.0571 + 0.2886i |
| 25 | 0.0575 + 0.4254i | 0.0575 + 0.3805i | 0.0575 + 0.4254i | 0.0575 + 0.3805i | 0.0572 + 0.2775i | 0.0572 + 0.2775i | 0.0572 + 0.2775i | 0.0572 + 0.2775i |
| 25.5 | 0.0564 + 0.4860i | 0.0531 + 0.4193i | 0.0564 + 0.4860i | 0.0531 + 0.4193i | 0.0559 + 0.2861i | 0.0548 + 0.3407i | 0.0559 + 0.2861i | 0.0548 + 0.3407i |
| 26 | 0.0351 + 0.4808i | 0.0342 + 0.4146i | 0.0899 + 0.4781i | 0.0857 + 0.4137i | 0.0349 + 0.2807i | 0.0346 + 0.3432i | 0.0827 + 0.2816i | 0.0843 + 0.3431i |
| 26.5 | 0.0318 + 0.4522i | 0.0321 + 0.3789i | 0.0739 + 0.4533i | 0.0796 + 0.3824i | 0.0325 + 0.2516i | 0.0330 + 0.3088i | 0.0908 + 0.2538i | 0.0850 + 0.3119i |
| 27 | 0.0308 + 0.4850i | 0.0311 + 0.4144i | 0.0873 + 0.4850i | 0.0875 + 0.4142i | 0.0307 + 0.2794i | 0.0310 + 0.3456i | 0.0863 + 0.2798i | 0.0866 + 0.3448i |
| 27.5 | 0.0311 + 0.4893i | 0.0313 + 0.4189i | 0.0920 + 0.4897i | 0.0921 + 0.4194i | 0.0314 + 0.2837i | 0.0311 + 0.3499i | 0.0926 + 0.2848i | 0.0919 + 0.3507i |
| 28 | 0.0302 + 0.4887i | 0.0304 + 0.4150i | 0.0892 + 0.4889i | 0.0900 + 0.4153i | 0.0313 + 0.2777i | 0.0307 + 0.3444i | 0.0933 + 0.2782i | 0.0916 + 0.3449i |

| SNR/w | w216 | w217 | w218 | w219 | w220 | w221 | w222 | w223 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i |
| 8.5 | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i |
| 9 | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i |
| 9.5 | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i |
| 10 | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i |
| 10.5 | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i | 0.2071 + 0.6433i |
| 11 | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i | 0.3169 + 0.1644i |
| 11.5 | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i | 0.3125 + 0.1610i |
| 12 | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i | 0.3170 + 0.1584i |
| 12.5 | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i | 0.2466 + 0.1544i |
| 13 | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i | 0.1500 + 0.5903i |
| 13.5 | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i | 0.2184 + 0.1466i |
| 14 | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i | 0.2033 + 0.1466i |
| 14.5 | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i | 0.1966 + 0.1483i |
| 15 | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i | 0.1264 + 0.3535i |
| 15.5 | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i | 0.1246 + 0.3613i |
| 16 | 0.1142 + 0.3766i | 0.1142 + 0.3766i | 0.1142 + 0.3766i | 0.1142 + 0.3766i | 0.1142 + 0.3766i | 0.1142 + 0.3766i | 0.1142 + 0.3766i | 0.1142 + 0.3766i |
| 16.5 | 0.1133 + 0.3468i | 0.1133 + 0.3468i | 0.1133 + 0.3468i | 0.1133 + 0.3468i | 0.1133 + 0.3468i | 0.1133 + 0.3468i | 0.1133 + 0.3468i | 0.1133 + 0.3468i |
| 17 | 0.1129 + 0.3473i | 0.1129 + 0.3473i | 0.1129 + 0.3473i | 0.1129 + 0.3473i | 0.1129 + 0.3473i | 0.1129 + 0.3473i | 0.1129 + 0.3473i | 0.1129 + 0.3473i |
| 17.5 | 0.1113 + 0.3593i | 0.1113 + 0.3593i | 0.1113 + 0.3593i | 0.1113 + 0.3593i | 0.1146 + 0.3275i | 0.1146 + 0.3275i | 0.1146 + 0.3275i | 0.1146 + 0.3275i |
| 18 | 0.1118 + 0.3721i | 0.1118 + 0.3721i | 0.1118 + 0.3721i | 0.1118 + 0.3721i | 0.1122 + 0.3197i | 0.1122 + 0.3197i | 0.1122 + 0.3197i | 0.1122 + 0.3197i |
| 18.5 | 0.1033 + 0.4748i | 0.1033 + 0.4748i | 0.1033 + 0.4748i | 0.1033 + 0.4748i | 0.0995 + 0.3488i | 0.0995 + 0.3488i | 0.0995 + 0.3488i | 0.0995 + 0.3488i |
| 19 | 0.1037 + 0.5029i | 0.1037 + 0.5029i | 0.1037 + 0.5029i | 0.1037 + 0.5029i | 0.0979 + 0.3590i | 0.0979 + 0.3590i | 0.0979 + 0.3590i | 0.0979 + 0.3590i |
| 19.5 | 0.1298 + 0.5175i | 0.1298 + 0.5175i | 0.1298 + 0.5175i | 0.1298 + 0.5175i | 0.0976 + 0.3682i | 0.0976 + 0.3682i | 0.0976 + 0.3682i | 0.0976 + 0.3682i |
| 20 | 0.1950 + 0.3354i | 0.1950 + 0.3354i | 0.1950 + 0.3354i | 0.1950 + 0.3354i | 0.2030 + 0.2636i | 0.2030 + 0.2636i | 0.2030 + 0.2636i | 0.2030 + 0.2636i |
| 20.5 | 0.1682 + 0.4544i | 0.1682 + 0.4544i | 0.1682 + 0.4544i | 0.1682 + 0.4544i | 0.1644 + 0.3218i | 0.1644 + 0.3218i | 0.1644 + 0.3218i | 0.1644 + 0.3218i |

-continued

| | | | | | | | | |
|---|---|---|---|---|---|---|---|---|
| 21 | 0.1707 + 0.4303i | 0.1707 + 0.4303i | 0.1707 + 0.4303i | 0.1707 + 0.4303i | 0.1703 + 0.3021i | 0.1703 + 0.3021i | 0.1703 + 0.3021i | 0.1703 + 0.3021i |
| 21.5 | 0.1741 + 0.4109i | 0.1741 + 0.4109i | 0.1741 + 0.4109i | 0.1741 + 0.4109i | 0.1795 + 0.2874i | 0.1795 + 0.2874i | 0.1795 + 0.2874i | 0.1795 + 0.2874i |
| 22 | 0.1749 + 0.4271i | 0.1749 + 0.4271i | 0.1749 + 0.4271i | 0.1749 + 0.4271i | 0.1738 + 0.2981i | 0.1738 + 0.2981i | 0.1738 + 0.2981i | 0.1738 + 0.2981i |
| 22.5 | 0.1745 + 0.4185i | 0.1745 + 0.4185i | 0.1745 + 0.4185i | 0.1745 + 0.4185i | 0.1777 + 0.2932i | 0.1777 + 0.2932i | 0.1777 + 0.2932i | 0.1777 + 0.2932i |
| 23 | 0.1713 + 0.4102i | 0.1713 + 0.4102i | 0.1713 + 0.4102i | 0.1713 + 0.4102i | 0.1741 + 0.2862i | 0.1741 + 0.2862i | 0.1741 + 0.2862i | 0.1741 + 0.2862i |
| 23.5 | 0.1756 + 0.4146i | 0.1756 + 0.4146i | 0.1756 + 0.4146i | 0.1756 + 0.4146i | 0.1762 + 0.2899i | 0.1762 + 0.2899i | 0.1762 + 0.2899i | 0.1762 + 0.2899i |
| 24 | 0.1687 + 0.4159i | 0.1687 + 0.4159i | 0.1687 + 0.4159i | 0.1687 + 0.4159i | 0.1702 + 0.2887i | 0.1702 + 0.2887i | 0.1702 + 0.2887i | 0.1702 + 0.2887i |
| 24.5 | 0.1756 + 0.4120i | 0.1756 + 0.4120i | 0.1756 + 0.4120i | 0.1756 + 0.4120i | 0.1726 + 0.2878i | 0.1726 + 0.2878i | 0.1726 + 0.2878i | 0.1726 + 0.2878i |
| 25 | 0.1734 + 0.4261i | 0.1734 + 0.3796i | 0.1734 + 0.4261i | 0.1734 + 0.3796i | 0.1736 + 0.2766i | 0.1736 + 0.2766i | 0.1736 + 0.2766i | 0.1736 + 0.2766i |
| 25.5 | 0.1682 + 0.4846i | 0.1685 + 0.4186i | 0.1682 + 0.4846i | 0.1685 + 0.4186i | 0.1657 + 0.2863i | 0.1678 + 0.3421i | 0.1657 + 0.2863i | 0.1678 + 0.3421i |
| 26 | 0.2196 + 0.4716i | 0.2157 + 0.4087i | 0.1610 + 0.4748i | 0.1570 + 0.4119i | 0.2054 + 0.2809i | 0.2094 + 0.3380i | 0.1524 + 0.2824i | 0.1543 + 0.3418i |
| 26.5 | 0.1932 + 0.4577i | 0.1997 + 0.3933i | 0.1389 + 0.4551i | 0.1435 + 0.3873i | 0.2147 + 0.2666i | 0.2083 + 0.3257i | 0.1555 + 0.2607i | 0.1493 + 0.3184i |
| 27 | 0.2118 + 0.4809i | 0.2110 + 0.4119i | 0.1507 + 0.4836i | 0.1502 + 0.4134i | 0.2109 + 0.2819i | 0.2107 + 0.3441i | 0.1498 + 0.2809i | 0.1497 + 0.3442i |
| 27.5 | 0.2186 + 0.4902i | 0.2189 + 0.4202i | 0.1557 + 0.4902i | 0.1557 + 0.4197i | 0.2185 + 0.2872i | 0.2190 + 0.3526i | 0.1559 + 0.2865i | 0.1554 + 0.3519i |
| 28 | 0.2101 + 0.4919i | 0.2114 + 0.4198i | 0.1496 + 0.4906i | 0.1510 + 0.4173i | 0.2183 + 0.2814i | 0.2142 + 0.3497i | 0.1566 + 0.2788i | 0.1537 + 0.3467i |

| SNR/w | w224 | w225 | w226 | w227 | w228 | w229 | w230 | w231 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4119 + 0.2279i | 0.4119 + 0.2279i | 0.4119 + 0.2279i | 0.4119 + 0.2279i | 0.4692 + 0.2540i | 0.4119 + 0.2279i | 0.4692 + 0.2540i | 0.4119 + 0.2279i |
| 8.5 | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i |
| 15 | 0.3696 + 0.1160i | 0.3696 + 0.1160i | 0.3696 + 0.1160i | 0.3696 + 0.1160i | 0.3696 + 0.1160i | 0.3696 + 0.1160i | 0.3696 + 0.1160i | 0.3696 + 0.1160i |
| 15.5 | 0.3609 + 0.1145i | 0.3609 + 0.1145i | 0.3609 + 0.1145i | 0.3609 + 0.1145i | 0.3609 + 0.1145i | 0.3609 + 0.1145i | 0.3609 + 0.1145i | 0.3609 + 0.1145i |
| 16 | 0.3375 + 0.1176i | 0.3375 + 0.1176i | 0.3375 + 0.1176i | 0.3375 + 0.1176i | 0.3375 + 0.1176i | 0.3375 + 0.1176i | 0.3375 + 0.1176i | 0.3375 + 0.1176i |
| 16.5 | 0.3522 + 0.1139i | 0.3522 + 0.1139i | 0.3522 + 0.1139i | 0.3522 + 0.1139i | 0.3522 + 0.1139i | 0.3522 + 0.1139i | 0.3522 + 0.1139i | 0.3522 + 0.1139i |
| 17 | 0.3521 + 0.1137i | 0.3521 + 0.1137i | 0.3521 + 0.1137i | 0.3521 + 0.1137i | 0.3521 + 0.1137i | 0.3521 + 0.1137i | 0.3521 + 0.1137i | 0.3521 + 0.1137i |
| 17.5 | 0.3638 + 0.1126i | 0.3638 + 0.1126i | 0.3638 + 0.1126i | 0.3638 + 0.1126i | 0.3638 + 0.1126i | 0.3638 + 0.1126i | 0.3638 + 0.1126i | 0.3638 + 0.1126i |
| 18 | 0.3770 + 0.1130i | 0.3770 + 0.1130i | 0.3770 + 0.1130i | 0.3770 + 0.1130i | 0.3770 + 0.1130i | 0.3770 + 0.1130i | 0.3770 + 0.1130i | 0.3770 + 0.1130i |

-continued

| | | | | | | | | |
|---|---|---|---|---|---|---|---|---|
| 18.5 | 0.2978 + 0.0877i | 0.2978 + 0.0877i | 0.2978 + 0.0877i | 0.2978 + 0.0877i | 0.3007 + 0.1662i | 0.3007 + 0.1662i | 0.3007 + 0.1662i | 0.3007 + 0.1662i |
| 19 | 0.2928 + 0.0778i | 0.2928 + 0.0778i | 0.2928 + 0.0778i | 0.2928 + 0.0778i | 0.3114 + 0.1880i | 0.3114 + 0.1880i | 0.3114 + 0.1880i | 0.3114 + 0.1880i |
| 19.5 | 0.3016 + 0.0738i | 0.3016 + 0.0738i | 0.3016 + 0.0738i | 0.3016 + 0.0738i | 0.3110 + 0.2020i | 0.3110 + 0.2020i | 0.3110 + 0.2020i | 0.3110 + 0.2020i |
| 20 | 0.5049 + 0.0708i | 0.5049 + 0.0708i | 0.5049 + 0.0708i | 0.5049 + 0.0708i | 0.4994 + 0.1471i | 0.4994 + 0.1471i | 0.4994 + 0.1471i | 0.4994 + 0.1471i |
| 20.5 | 0.4001 + 0.0654i | 0.4001 + 0.0654i | 0.4001 + 0.0654i | 0.4001 + 0.0654i | 0.4035 + 0.1848i | 0.4035 + 0.1848i | 0.4035 + 0.1848i | 0.4035 + 0.1848i |
| 21 | 0.4216 + 0.0611i | 0.4216 + 0.0611i | 0.4216 + 0.0611i | 0.4216 + 0.0611i | 0.4212 + 0.1733i | 0.4212 + 0.1733i | 0.4212 + 0.1733i | 0.4212 + 0.1733i |
| 21.5 | 0.4460 + 0.0597i | 0.4460 + 0.0597i | 0.4460 + 0.0597i | 0.4460 + 0.0597i | 0.4424 + 0.1748i | 0.4424 + 0.1748i | 0.4424 + 0.1748i | 0.4424 + 0.1748i |
| 22 | 0.4254 + 0.0584i | 0.4254 + 0.0584i | 0.4254 + 0.0584i | 0.4254 + 0.0584i | 0.4248 + 0.1721i | 0.4248 + 0.1721i | 0.4248 + 0.1721i | 0.4248 + 0.1721i |
| 22.5 | 0.4316 + 0.0602i | 0.4316 + 0.0602i | 0.4316 + 0.0602i | 0.4316 + 0.0602i | 0.4324 + 0.1762i | 0.4324 + 0.1762i | 0.4324 + 0.1762i | 0.4324 + 0.1762i |
| 23 | 0.4302 + 0.0540i | 0.4302 + 0.0540i | 0.4302 + 0.0540i | 0.4302 + 0.0540i | 0.4255 + 0.1756i | 0.4255 + 0.1756i | 0.4255 + 0.1756i | 0.4255 + 0.1756i |
| 23.5 | 0.4263 + 0.0573i | 0.4263 + 0.0573i | 0.4263 + 0.0573i | 0.4263 + 0.0573i | 0.4258 + 0.1725i | 0.4258 + 0.1725i | 0.4258 + 0.1725i | 0.4258 + 0.1725i |
| 24 | 0.4158 + 0.0562i | 0.4158 + 0.0562i | 0.4158 + 0.0562i | 0.4158 + 0.0562i | 0.4158 + 0.1696i | 0.4158 + 0.1696i | 0.4158 + 0.1696i | 0.4158 + 0.1696i |
| 24.5 | 0.4391 + 0.0544i | 0.4391 + 0.0544i | 0.3936 + 0.0550i | 0.3936 + 0.0550i | 0.4411 + 0.1644i | 0.4411 + 0.1644i | 0.3963 + 0.1660i | 0.3963 + 0.1660i |
| 25 | 0.4741 + 0.0555i | 0.4741 + 0.0555i | 0.4096 + 0.0551i | 0.4096 + 0.0551i | 0.4732 + 0.1674i | 0.4732 + 0.1674i | 0.4081 + 0.1657i | 0.4081 + 0.1657i |
| 25.5 | 0.4332 + 0.0580i | 0.4332 + 0.0580i | 0.3744 + 0.0411i | 0.3745 + 0.0772i | 0.4411 + 0.1978i | 0.4377 + 0.1570i | 0.3822 + 0.2018i | 0.3792 + 0.1581i |
| 26 | 0.4883 + 0.1036i | 0.4883 + 0.1036i | 0.4269 + 0.0476i | 0.4149 + 0.1052i | 0.4979 + 0.1913i | 0.4979 + 0.1913i | 0.4158 + 0.2122i | 0.4119 + 0.1755i |
| 26.5 | 0.4824 + 0.0289i | 0.4857 + 0.0919i | 0.4205 + 0.0350i | 0.4205 + 0.0961i | 0.4899 + 0.2242i | 0.4866 + 0.1642i | 0.4194 + 0.2229i | 0.4216 + 0.1624i |
| 27 | 0.5079 + 0.0438i | 0.5036 + 0.1009i | 0.4254 + 0.0322i | 0.4167 + 0.1021i | 0.4840 + 0.2135i | 0.4940 + 0.1581i | 0.4139 + 0.2120i | 0.4156 + 0.1554i |
| 27.5 | 0.5112 + 0.0414i | 0.5049 + 0.1036i | 0.4283 + 0.0333i | 0.4231 + 0.1059i | 0.4951 + 0.2253i | 0.4990 + 0.1631i | 0.4241 + 0.2243i | 0.4237 + 0.1622i |
| 28 | 0.6043 + 0.0218i | 0.5006 + 0.1245i | 0.4388 + 0.0377i | 0.4351 + 0.1002i | 0.4847 + 0.2316i | 0.4930 + 0.1739i | 0.4142 + 0.2270i | 0.4205 + 0.1632i |

| SNR/w | w232 | w233 | w234 | w235 | w236 | w237 | w238 | w239 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i |
| 8.5 | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i |
| 9 | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i | 0.1927 + 0.3483i |
| 9.5 | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i | 0.1787 + 0.3253i |
| 10 | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i | 0.1693 + 0.3107i |
| 10.5 | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i | 0.1635 + 0.3005i |
| 11 | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i | 0.6313 + 0.2076i |
| 11.5 | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i | 0.6466 + 0.1969i |
| 12 | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i | 0.6592 + 0.1887i |
| 12.5 | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i | 0.6152 + 0.1639i |
| 13 | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i | 0.1494 + 0.2215i |
| 13.5 | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i | 0.5858 + 0.1463i |
| 14 | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i | 0.5682 + 0.1383i |
| 14.5 | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i | 0.5568 + 0.1330i |
| 15 | 0.3696 + 0.1160i | 0.3696 + 0.1160i | 0.3696 + 0.1160i | 0.3696 + 0.1160i | 0.3696 + 0.1160i | 0.3696 + 0.1160i | 0.3696 + 0.1160i | 0.3696 + 0.1160i |
| 15.5 | 0.3609 + 0.1145i | 0.3609 + 0.1145i | 0.3609 + 0.1145i | 0.3609 + 0.1145i | 0.3609 + 0.1145i | 0.3609 + 0.1145i | 0.3609 + 0.1145i | 0.3609 + 0.1145i |

-continued

| | | | | | | | | |
|---|---|---|---|---|---|---|---|---|
| 16 | 0.3375 + 0.1176i | 0.3375 + 0.1176i | 0.3375 + 0.1176i | 0.3375 + 0.1176i | 0.3375 + 0.1176i | 0.3375 + 0.1176i | 0.3375 + 0.1176i | 0.3375 + 0.1176i |
| 16.5 | 0.3522 + 0.1139i | 0.3522 + 0.1139i | 0.3522 + 0.1139i | 0.3522 + 0.1139i | 0.3522 + 0.1139i | 0.3522 + 0.1139i | 0.3522 + 0.1139i | 0.3522 + 0.1139i |
| 17 | 0.3521 + 0.1137i | 0.3521 + 0.1137i | 0.3521 + 0.1137i | 0.3521 + 0.1137i | 0.3521 + 0.1137i | 0.3521 + 0.1137i | 0.3521 + 0.1137i | 0.3521 + 0.1137i |
| 17.5 | 0.3323 + 0.1152i | 0.3323 + 0.1152i | 0.3638 + 0.1126i | 0.3638 + 0.1126i | 0.3323 + 0.1152i | 0.3323 + 0.1152i | 0.3323 + 0.1152i | 0.3323 + 0.1152i |
| 18 | 0.3243 + 0.1125i | 0.3243 + 0.1125i | 0.3243 + 0.1125i | 0.3243 + 0.1125i | 0.3243 + 0.1125i | 0.3243 + 0.1125i | 0.3243 + 0.1125i | 0.3243 + 0.1125i |
| 18.5 | 0.2978 + 0.0877i | 0.2978 + 0.0877i | 0.2978 + 0.0877i | 0.2978 + 0.0877i | 0.3007 + 0.1662i | 0.3007 + 0.1662i | 0.3007 + 0.1662i | 0.3007 + 0.1662i |
| 19 | 0.2671 + 0.0777i | 0.2671 + 0.0777i | 0.2928 + 0.0778i | 0.2928 + 0.0778i | 0.2719 + 0.1922i | 0.2719 + 0.1922i | 0.2719 + 0.1922i | 0.2719 + 0.1922i |
| 19.5 | 0.2598 + 0.0741i | 0.2598 + 0.0741i | 0.2598 + 0.0741i | 0.2598 + 0.0741i | 0.2641 + 0.2070i | 0.2641 + 0.2070i | 0.2641 + 0.2070i | 0.2641 + 0.2070i |
| 20 | 0.3583 + 0.0733i | 0.3583 + 0.0733i | 0.3583 + 0.0733i | 0.3583 + 0.0733i | 0.3557 + 0.1281i | 0.3557 + 0.1281i | 0.3557 + 0.1281i | 0.3557 + 0.1281i |
| 20.5 | 0.2886 + 0.0655i | 0.2886 + 0.0655i | 0.2886 + 0.0655i | 0.2886 + 0.0655i | 0.2903 + 0.1864i | 0.2903 + 0.1864i | 0.2903 + 0.1864i | 0.2903 + 0.1864i |
| 21 | 0.2964 + 0.0612i | 0.2964 + 0.0612i | 0.2964 + 0.0612i | 0.2964 + 0.0612i | 0.2961 + 0.1741i | 0.2961 + 0.1741i | 0.2961 + 0.1741i | 0.2961 + 0.1741i |
| 21.5 | 0.3136 + 0.0587i | 0.3136 + 0.0587i | 0.3136 + 0.0587i | 0.3136 + 0.0587i | 0.3109 + 0.1701i | 0.3109 + 0.1701i | 0.3109 + 0.1701i | 0.3109 + 0.1701i |
| 22 | 0.2965 + 0.0583i | 0.2965 + 0.0583i | 0.2965 + 0.0583i | 0.2965 + 0.0583i | 0.2961 + 0.1740i | 0.2961 + 0.1740i | 0.2961 + 0.1740i | 0.2961 + 0.1740i |
| 22.5 | 0.3044 + 0.0585i | 0.3044 + 0.0585i | 0.3044 + 0.0585i | 0.3044 + 0.0585i | 0.3022 + 0.1743i | 0.3022 + 0.1743i | 0.3022 + 0.1743i | 0.3022 + 0.1743i |
| 23 | 0.3002 + 0.0559i | 0.3002 + 0.0559i | 0.3002 + 0.0559i | 0.3002 + 0.0559i | 0.3008 + 0.1679i | 0.3008 + 0.1679i | 0.3008 + 0.1679i | 0.3008 + 0.1679i |
| 23.5 | 0.2968 + 0.0565i | 0.2968 + 0.0565i | 0.2968 + 0.0565i | 0.2968 + 0.0565i | 0.2971 + 0.1712i | 0.2971 + 0.1712i | 0.2971 + 0.1712i | 0.2971 + 0.1712i |
| 24 | 0.2891 + 0.0565i | 0.2891 + 0.0565i | 0.2891 + 0.0565i | 0.2891 + 0.0565i | 0.2888 + 0.1706i | 0.2888 + 0.1706i | 0.2888 + 0.1706i | 0.2888 + 0.1706i |
| 24.5 | 0.2864 + 0.0561i | 0.2864 + 0.0561i | 0.2864 + 0.0561i | 0.2864 + 0.0561i | 0.2884 + 0.1691i | 0.2884 + 0.1691i | 0.2884 + 0.1691i | 0.2884 + 0.1691i |
| 25 | 0.2793 + 0.0538i | 0.2793 + 0.0538i | 0.3242 + 0.0543i | 0.3242 + 0.0543i | 0.2783 + 0.1631i | 0.2783 + 0.1631i | 0.3224 + 0.1639i | 0.3224 + 0.1639i |
| 25.5 | 0.2565 + 0.0404i | 0.2580 + 0.0815i | 0.2933 + 0.0406i | 0.2942 + 0.0808i | 0.2624 + 0.2089i | 0.2607 + 0.1620i | 0.3016 + 0.2071i | 0.2979 + 0.1608i |
| 26 | 0.2912 + 0.0349i | 0.2858 + 0.0896i | 0.3531 + 0.0375i | 0.3456 + 0.0944i | 0.2776 + 0.2130i | 0.2797 + 0.1616i | 0.3388 + 0.2141i | 0.3395 + 0.1659i |
| 26.5 | 0.2981 + 0.0330i | 0.2963 + 0.0873i | 0.3583 + 0.0345i | 0.3569 + 0.0932i | 0.2863 + 0.2090i | 0.2920 + 0.1540i | 0.3512 + 0.2175i | 0.3553 + 0.1593i |
| 27 | 0.2788 + 0.0329i | 0.2765 + 0.0939i | 0.3366 + 0.0360i | 0.3386 + 0.0968i | 0.2771 + 0.2176i | 0.2758 + 0.1577i | 0.3431 + 0.2153i | 0.3406 + 0.1566i |
| 27.5 | 0.2859 + 0.0343i | 0.2847 + 0.0994i | 0.3429 + 0.0370i | 0.3476 + 0.1015i | 0.2852 + 0.2242i | 0.2849 + 0.1629i | 0.3535 + 0.2247i | 0.3513 + 0.1631i |
| 28 | 0.2966 + 0.0296i | 0.2938 + 0.0892i | 0.3680 + 0.0313i | 0.3621 + 0.0922i | 0.2866 + 0.2178i | 0.2907 + 0.1527i | 0.3496 + 0.2221i | 0.3560 + 0.1554i |

| SNR/w | w240 | w241 | w242 | w243 | w244 | w245 | w246 | w247 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i | 0.4478 + 0.2496i |
| 8 | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i | 0.4692 + 0.2540i |
| 8.5 | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i | 0.3997 + 0.2175i |
| 9 | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i |
| 9.5 | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i |
| 10 | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i |
| 10.5 | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i |
| 11 | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i |
| 11.5 | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i |

-continued

| | | | | | | | |
|---|---|---|---|---|---|---|---|
| 13.5 | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i |
| 14.5 | 0.5322 + 0.3087i | 0.5322 + 0.3087i | 0.5322 + 0.3087i | 0.5322 + 0.3087i | 0.5322 + 0.3087i | 0.5322 + 0.3087i | 0.5322 + 0.3087i | 0.5322 + 0.3087i |
| 15 | 0.3819 + 0.3404i | 0.3819 + 0.3404i | 0.3819 + 0.3404i | 0.3819 + 0.3404i | 0.3819 + 0.3404i | 0.3819 + 0.3404i | 0.3819 + 0.3404i | 0.3819 + 0.3404i |
| 15.5 | 0.3793 + 0.3446i | 0.3793 + 0.3446i | 0.3793 + 0.3446i | 0.3793 + 0.3446i | 0.3793 + 0.3446i | 0.3793 + 0.3446i | 0.3793 + 0.3446i | 0.3793 + 0.3446i |
| 16 | 0.3517 + 0.3604i | 0.3517 + 0.3604i | 0.3517 + 0.3604i | 0.3517 + 0.3604i | 0.3517 + 0.3604i | 0.3517 + 0.3604i | 0.3517 + 0.3604i | 0.3517 + 0.3604i |
| 16.5 | 0.3493 + 0.3492i | 0.3493 + 0.3492i | 0.3493 + 0.3492i | 0.3493 + 0.3492i | 0.3493 + 0.3492i | 0.3493 + 0.3492i | 0.3493 + 0.3492i | 0.3493 + 0.3492i |
| 17 | 0.3543 + 0.3548i | 0.3543 + 0.3548i | 0.3543 + 0.3548i | 0.3543 + 0.3548i | 0.3543 + 0.3548i | 0.3543 + 0.3548i | 0.3543 + 0.3548i | 0.3543 + 0.3548i |
| 17.5 | 0.3687 + 0.3574i | 0.3687 + 0.3574i | 0.3687 + 0.3574i | 0.3687 + 0.3574i | 0.3697 + 0.3307i | 0.3687 + 0.3574i | 0.3697 + 0.3307i | 0.3687 + 0.3574i |
| 18 | 0.3739 + 0.3746i | 0.3739 + 0.3746i | 0.3739 + 0.3746i | 0.3739 + 0.3746i | 0.3754 + 0.3235i | 0.3754 + 0.3235i | 0.3754 + 0.3235i | 0.3754 + 0.3235i |
| 18.5 | 0.3414 + 0.4506i | 0.3414 + 0.4506i | 0.3414 + 0.4506i | 0.3414 + 0.4506i | 0.3146 + 0.3407i | 0.3146 + 0.3407i | 0.3146 + 0.3407i | 0.3146 + 0.3407i |
| 19 | 0.3529 + 0.4716i | 0.3529 + 0.4716i | 0.3529 + 0.4716i | 0.3529 + 0.4716i | 0.3284 + 0.3442i | 0.3284 + 0.3442i | 0.3284 + 0.3442i | 0.3284 + 0.3442i |
| 19.5 | 0.3681 + 0.4838i | 0.3681 + 0.4838i | 0.3681 + 0.4838i | 0.3681 + 0.4838i | 0.3345 + 0.3493i | 0.3345 + 0.3493i | 0.3345 + 0.3493i | 0.3345 + 0.3493i |
| 20 | 0.4657 + 0.3917i | 0.4657 + 0.3917i | 0.4657 + 0.3917i | 0.4657 + 0.3917i | 0.4846 + 0.2895i | 0.4846 + 0.2895i | 0.4846 + 0.2895i | 0.4846 + 0.2895i |
| 20.5 | 0.4208 + 0.4471i | 0.4208 + 0.4471i | 0.4208 + 0.4471i | 0.4208 + 0.4471i | 0.4110 + 0.3182i | 0.4110 + 0.3182i | 0.4110 + 0.3182i | 0.4110 + 0.3182i |
| 21 | 0.4198 + 0.4245i | 0.4198 + 0.4245i | 0.4198 + 0.4245i | 0.4198 + 0.4245i | 0.4204 + 0.2992i | 0.4204 + 0.2992i | 0.4204 + 0.2992i | 0.4204 + 0.2992i |
| 21.5 | 0.4260 + 0.4246i | 0.4260 + 0.4246i | 0.4260 + 0.4246i | 0.4260 + 0.4246i | 0.4352 + 0.2986i | 0.4352 + 0.2986i | 0.4352 + 0.2986i | 0.4352 + 0.2986i |
| 22 | 0.4231 + 0.4203i | 0.4231 + 0.4203i | 0.4231 + 0.4203i | 0.4231 + 0.4203i | 0.4238 + 0.2942i | 0.4238 + 0.2942i | 0.4238 + 0.2942i | 0.4238 + 0.2942i |
| 22.5 | 0.4230 + 0.4251i | 0.4230 + 0.4251i | 0.4230 + 0.4251i | 0.4230 + 0.4251i | 0.4273 + 0.2986i | 0.4273 + 0.2986i | 0.4273 + 0.2986i | 0.4273 + 0.2986i |
| 23 | 0.4211 + 0.4201i | 0.4211 + 0.4201i | 0.4211 + 0.4201i | 0.4211 + 0.4201i | 0.4266 + 0.2914i | 0.4266 + 0.2914i | 0.4266 + 0.2914i | 0.4266 + 0.2914i |
| 23.5 | 0.4239 + 0.4187i | 0.4239 + 0.4187i | 0.4239 + 0.4187i | 0.4239 + 0.4187i | 0.4248 + 0.2925i | 0.4248 + 0.2925i | 0.4248 + 0.2925i | 0.4248 + 0.2925i |
| 24 | 0.4175 + 0.4190i | 0.4175 + 0.4190i | 0.4175 + 0.4190i | 0.3992 + 0.3999i | 0.4150 + 0.2873i | 0.4150 + 0.2873i | 0.4150 + 0.2873i | 0.4150 + 0.2873i |
| 24.5 | 0.4441 + 0.4330i | 0.4456 + 0.3871i | 0.4061 + 0.4315i | 0.4061 + 0.3880i | 0.4440 + 0.2800i | 0.4440 + 0.2800i | 0.4014 + 0.2816i | 0.4014 + 0.2816i |
| 25 | 0.4605 + 0.4369i | 0.4656 + 0.3853i | 0.4012 + 0.4314i | 0.4034 + 0.3820i | 0.4707 + 0.2825i | 0.4707 + 0.2825i | 0.4058 + 0.2804i | 0.4058 + 0.2804i |
| 25.5 | 0.4659 + 0.4740i | 0.4613 + 0.4078i | 0.3989 + 0.4774i | 0.3958 + 0.4114i | 0.4488 + 0.2770i | 0.4545 + 0.3309i | 0.3879 + 0.2805i | 0.3914 + 0.3357i |
| 26 | 0.4896 + 0.4720i | 0.4932 + 0.4049i | 0.4193 + 0.4606i | 0.4242 + 0.4025i | 0.4987 + 0.2781i | 0.4969 + 0.3245i | 0.4217 + 0.2807i | 0.4195 + 0.3226i |
| 26.5 | 0.4795 + 0.4819i | 0.4925 + 0.4148i | 0.4080 + 0.4687i | 0.4168 + 0.4091i | 0.4942 + 0.2865i | 0.4967 + 0.3440i | 0.4169 + 0.2892i | 0.4181 + 0.3435i |
| 27 | 0.4961 + 0.4776i | 0.4761 + 0.4203i | 0.4122 + 0.4857i | 0.4125 + 0.4173i | 0.4776 + 0.2777i | 0.4790 + 0.3514i | 0.4145 + 0.2787i | 0.4149 + 0.3453i |
| 27.5 | 0.4894 + 0.4920i | 0.4859 + 0.4203i | 0.4207 + 0.4950i | 0.4201 + 0.4209i | 0.4953 + 0.2912i | 0.5006 + 0.3617i | 0.4249 + 0.2903i | 0.4218 + 0.3534i |
| 28 | 0.4912 + 0.4863i | 0.4759 + 0.4288i | 0.4092 + 0.4951i | 0.4078 + 0.4275i | 0.4796 + 0.2942i | 0.4808 + 0.3655i | 0.4118 + 0.2932i | 0.4092 + 0.3590i |

| SNR/w | w248 | w249 | w250 | w251 | w252 | w253 | w254 | w255 |
|---|---|---|---|---|---|---|---|---|
| 7 | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i | 0.4501 + 0.2555i |
| 7.5 | 0.4478 + 0.2496i | 0.4478 + 0.2496i | 0.4478 + 0.2496i | 0.4478 + 0.2496i | 0.5153 + 0.2942i | 0.5153 + 0.2942i | 0.4478 + 0.2496i | 0.4478 + 0.2496i |
| 8 | 0.5261 + 0.2715i | 0.5261 + 0.2715i | 0.5261 + 0.2715i | 0.5261 + 0.2715i | 0.5261 + 0.2715i | 0.5261 + 0.2715i | 0.5261 + 0.2715i | 0.5261 + 0.2715i |
| 8.5 | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i | 0.5179 + 0.2621i |
| 9 | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i | 0.2663 + 0.5591i |
| 9.5 | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i | 0.2673 + 0.5847i |
| 10 | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i | 0.2676 + 0.6045i |
| 10.5 | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i | 0.3254 + 0.5943i |

-continued

| | | | | | | | | |
|---|---|---|---|---|---|---|---|---|
| 11 | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i | 0.5725 + 0.3558i |
| 11.5 | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i | 0.5783 + 0.3674i |
| 12 | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i | 0.5811 + 0.3808i |
| 12.5 | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i | 0.5689 + 0.3410i |
| 13 | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i | 0.3127 + 0.5578i |
| 13.5 | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i | 0.5531 + 0.3261i |
| 14 | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i | 0.5396 + 0.3035i |
| 14.5 | 0.5322 + 0.3087i | 0.5322 + 0.3087i | 0.5322 + 0.3087i | 0.5322 + 0.3087i | 0.5322 + 0.3087i | 0.5322 + 0.3087i | 0.5322 + 0.3087i | 0.5322 + 0.3087i |
| 15 | 0.3819 + 0.3404i | 0.3819 + 0.3404i | 0.3819 + 0.3404i | 0.3819 + 0.3404i | 0.3819 + 0.3404i | 0.3819 + 0.3404i | 0.3819 + 0.3404i | 0.3819 + 0.3404i |
| 15.5 | 0.3793 + 0.3446i | 0.3793 + 0.3446i | 0.3793 + 0.3446i | 0.3793 + 0.3446i | 0.3793 + 0.3446i | 0.3793 + 0.3446i | 0.3793 + 0.3446i | 0.3793 + 0.3446i |
| 16 | 0.3517 + 0.3604i | 0.3517 + 0.3604i | 0.3517 + 0.3604i | 0.3517 + 0.3604i | 0.3517 + 0.3604i | 0.3517 + 0.3604i | 0.3517 + 0.3604i | 0.3517 + 0.3604i |
| 16.5 | 0.3493 + 0.3492i | 0.3493 + 0.3492i | 0.3493 + 0.3492i | 0.3493 + 0.3492i | 0.3493 + 0.3492i | 0.3493 + 0.3492i | 0.3493 + 0.3492i | 0.3493 + 0.3492i |
| 17 | 0.3543 + 0.3548i | 0.3543 + 0.3548i | 0.3543 + 0.3548i | 0.3543 + 0.3548i | 0.3347 + 0.3351i | 0.3347 + 0.3351i | 0.3347 + 0.3351i | 0.3347 + 0.3351i |
| 17.5 | 0.3287 + 0.3561i | 0.3287 + 0.3561i | 0.3287 + 0.3561i | 0.3287 + 0.3561i | 0.3297 + 0.3292i | 0.3287 + 0.3561i | 0.3297 + 0.3292i | 0.3287 + 0.3561i |
| 18 | 0.3203 + 0.3731i | 0.3203 + 0.3731i | 0.3203 + 0.3731i | 0.3203 + 0.3731i | 0.3218 + 0.3219i | 0.3218 + 0.3219i | 0.3218 + 0.3219i | 0.3218 + 0.3219i |
| 18.5 | 0.2964 + 0.4577i | 0.2964 + 0.4577i | 0.2964 + 0.4577i | 0.2964 + 0.4577i | 0.2878 + 0.3423i | 0.2878 + 0.3423i | 0.3146 + 0.3407i | 0.3146 + 0.3407i |
| 19 | 0.2905 + 0.4851i | 0.2905 + 0.4851i | 0.2905 + 0.4851i | 0.2905 + 0.4851i | 0.2795 + 0.3492i | 0.2795 + 0.3492i | 0.2795 + 0.3492i | 0.2795 + 0.3492i |
| 19.5 | 0.2875 + 0.5020i | 0.2875 + 0.5020i | 0.2875 + 0.5020i | 0.2875 + 0.5020i | 0.2736 + 0.3578i | 0.2736 + 0.3578i | 0.2736 + 0.3578i | 0.2736 + 0.3578i |
| 20 | 0.3343 + 0.3601i | 0.3343 + 0.3601i | 0.3343 + 0.3601i | 0.3343 + 0.3601i | 0.3464 + 0.2743i | 0.3464 + 0.2743i | 0.3464 + 0.2743i | 0.3464 + 0.2743i |
| 20.5 | 0.2984 + 0.4519i | 0.2984 + 0.4519i | 0.2984 + 0.4519i | 0.2984 + 0.4519i | 0.2937 + 0.3207i | 0.2937 + 0.3207i | 0.2937 + 0.3207i | 0.2937 + 0.3207i |
| 21 | 0.2958 + 0.4274i | 0.2958 + 0.4274i | 0.2958 + 0.4274i | 0.2958 + 0.4274i | 0.2956 + 0.3006i | 0.2956 + 0.3006i | 0.2956 + 0.3006i | 0.2956 + 0.3006i |
| 21.5 | 0.2982 + 0.4164i | 0.2982 + 0.4164i | 0.2982 + 0.4164i | 0.2982 + 0.4164i | 0.3055 + 0.2919i | 0.3055 + 0.2919i | 0.3055 + 0.2919i | 0.3055 + 0.2919i |
| 22 | 0.2967 + 0.4234i | 0.2967 + 0.4234i | 0.2967 + 0.4234i | 0.2967 + 0.4234i | 0.2960 + 0.2956i | 0.2960 + 0.2956i | 0.2960 + 0.2956i | 0.2960 + 0.2956i |
| 22.5 | 0.2956 + 0.4208i | 0.2956 + 0.4208i | 0.2956 + 0.4208i | 0.2956 + 0.4208i | 0.3008 + 0.2941i | 0.3008 + 0.2941i | 0.3008 + 0.2941i | 0.3008 + 0.2941i |
| 23 | 0.2959 + 0.4148i | 0.2959 + 0.4148i | 0.2959 + 0.4148i | 0.2959 + 0.4148i | 0.2939 + 0.2903i | 0.2939 + 0.2903i | 0.2939 + 0.2903i | 0.2939 + 0.2903i |
| 23.5 | 0.2964 + 0.4164i | 0.2964 + 0.4164i | 0.2964 + 0.4164i | 0.2964 + 0.4164i | 0.2968 + 0.2905i | 0.2968 + 0.2905i | 0.2968 + 0.2905i | 0.2968 + 0.2905i |
| 24 | 0.2865 + 0.4155i | 0.2865 + 0.4155i | 0.2865 + 0.4155i | 0.2865 + 0.4155i | 0.2882 + 0.2887i | 0.2882 + 0.2887i | 0.2882 + 0.2887i | 0.2882 + 0.2887i |
| 24.5 | 0.2967 + 0.4295i | 0.2962 + 0.3915i | 0.2967 + 0.4295i | 0.2962 + 0.3915i | 0.2924 + 0.2853i | 0.2924 + 0.2853i | 0.2924 + 0.2853i | 0.2924 + 0.2853i |
| 25 | 0.2771 + 0.4268i | 0.2768 + 0.3791i | 0.3135 + 0.4278i | 0.3155 + 0.3799i | 0.2771 + 0.2770i | 0.2771 + 0.2770i | 0.3194 + 0.2780i | 0.3194 + 0.2780i |
| 25.5 | 0.2679 + 0.4831i | 0.2671 + 0.4177i | 0.3196 + 0.4813i | 0.3153 + 0.4153i | 0.2642 + 0.2859i | 0.2656 + 0.3405i | 0.3076 + 0.2846i | 0.3109 + 0.3393i |
| 26 | 0.2901 + 0.4652i | 0.2841 + 0.4025i | 0.3477 + 0.4578i | 0.3484 + 0.3989i | 0.2773 + 0.2828i | 0.2787 + 0.3328i | 0.3433 + 0.2843i | 0.3468 + 0.3291i |
| 26.5 | 0.2625 + 0.4607i | 0.2678 + 0.3993i | 0.3331 + 0.4633i | 0.3357 + 0.4044i | 0.2800 + 0.2739i | 0.2750 + 0.3327i | 0.3456 + 0.2833i | 0.3396 + 0.3394i |
| 27 | 0.2775 + 0.4791i | 0.2786 + 0.4104i | 0.3419 + 0.4815i | 0.3447 + 0.4116i | 0.2784 + 0.2816i | 0.2788 + 0.3435i | 0.3453 + 0.2801i | 0.3462 + 0.3431i |
| 27.5 | 0.2845 + 0.4908i | 0.2855 + 0.4209i | 0.3510 + 0.4925i | 0.3519 + 0.4213i | 0.2848 + 0.2876i | 0.2849 + 0.3525i | 0.3530 + 0.2885i | 0.3520 + 0.3524i |
| 28 | 0.2735 + 0.4926i | 0.2751 + 0.4223i | 0.3391 + 0.4945i | 0.3402 + 0.4252i | 0.2814 + 0.2854i | 0.2775 + 0.3535i | 0.3445 + 0.2894i | 0.3418 + 0.3566i. |

6. A receiver comprising demodulation circuitry configured to demodulate cell words from constellation values produced by the coding and modulation apparatus as claimed in claim 5.

7. The coding and modulation apparatus as claimed in claim 1, wherein said encoder circuitry is a forward error correction code encoder.

8. The coding and modulation apparatus as claimed in claim 1, wherein said modulator circuitry is configured to use the non-uniform constellation based on the total number M of constellation points of the constellation and a required signal-to-noise ratio SNR for error free decoding in dB.

9. The coding and modulation apparatus as claimed in claim 1, wherein said modulator circuitry is configured to adaptively select and use the non-uniform constellation based on the total number M of constellation points of the constellation and the signal-to-noise ratio SNR in dB, and said signal-to-noise ratio SNR in dB is received from a receiving device to which data shall be transmitted.

10. A transmission apparatus comprising:

a coding and modulation apparatus as claimed in claim 1 that encodes and modulates input data into constellation values;

converter circuitry configured to convert said constellation values into one or more transmission streams to be transmitted; and a transmitter configured to transmit said one or more transmission streams.

11. A communications system comprising:

one or more transmission apparatuses as claimed in claim 10; and one or more receiving apparatuses.

12. A receiver comprising demodulation circuitry configured to demodulate cell words from constellation values produced by the coding and modulation apparatus as claimed in claim 1.

13. A coding and modulation method comprising:

encoding input data into cell words; and modulating said cell words into constellation values of a non-uniform constellation, including using, based on a total number M of constellation points of the constellation and a signal-to-noise ratio SNR in dB, a non-uniform constellation from a group of constellations comprising one or more constellations defined by a constellation position vector comprising a predetermined number of constellation positions, wherein, in one or more constellation position vectors, two or more constellation positions are identical resulting from a condensation of previously optimized preliminary constellation positions.

14. A transmission method comprising:

a coding and modulation method as claimed in claim 13 that encodes and modulates input data into constellation values;

converting said constellation values into one or more transmission streams to be transmitted; and transmitting said one or more transmission streams.

15. A non-transitory computer-readable medium including computer program instructions, which when executed by a computer, cause the computer to perform the method of claim 13.

16. A receiving method comprising demodulating by demodulation circuitry cell words from constellation values produced by the coding and modulation method as claimed in claim 13.

17. A receiver apparatus comprising:

demodulation circuitry configured to demodulate a received signal into output data, wherein the received signal represents input data encoded into cell words that have modulated into constellation values of a non-uniform constellation, said demodulation circuitry is configured to use, to demodulate the received signal, a non-uniform constellation from a group of constellations comprising one or more constellations defined by a constellation position vector comprising a predetermined number of constellation positions, based on a total number M of constellation points of the constellation and a signal-to-noise ratio SNR in dB, and in one or more constellation position vectors, two or more constellation positions are identical resulting from a condensation of previously optimized preliminary constellation positions.

18. The receiver as claimed in claim 17, further comprising decoder circuitry configured to decode the output data to generate decoded data.

* * * * *